US011778897B2

(12) United States Patent
Feldman et al.

(10) Patent No.: US 11,778,897 B2
(45) Date of Patent: Oct. 3, 2023

(54) ORGANIC ELECTROLUMINESCENT MATERIALS AND DEVICES

(71) Applicant: Universal Display Corporation, Ewing, NJ (US)

(72) Inventors: Jerald Feldman, Wilmington, DE (US); Pierre-Luc T. Boudreault, Pennington, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 1033 days.

(21) Appl. No.: 16/113,587

(22) Filed: Aug. 27, 2018

(65) Prior Publication Data

US 2019/0088887 A1 Mar. 21, 2019

Related U.S. Application Data

(60) Provisional application No. 62/560,902, filed on Sep. 20, 2017.

(51) Int. Cl.
*H10K 85/30* (2023.01)
*C09K 11/06* (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
CPC ... H01L 51/0085; H01L 51/0077–0089; H01L 51/0091–0092; H01L 51/5016;
(Continued)

(56) References Cited

U.S. PATENT DOCUMENTS 4,769,292 A 9/1988 Tang et al.
5,061,569 A 10/1991 VanSlyke et al.
(Continued)

FOREIGN PATENT DOCUMENTS

EP 0650955 5/1995
EP 1725079 11/2006
(Continued)

OTHER PUBLICATIONS

Romaniewska et al. "Synthesis, Structure and Characterization of New Olivacine Derivatives and Their Platinum(II) Complexes" Eur. J. Inorg. Chem. pp. 4043-4054. 2003. (Year: 2003).*
(Continued)

*Primary Examiner* — Dawn L Garrett
(74) *Attorney, Agent, or Firm* — DUANE MORRIS LLP

(57) ABSTRACT

A compound comprising a first ligand $L_A$ having a Formula selected from:

(Continued)

-continued

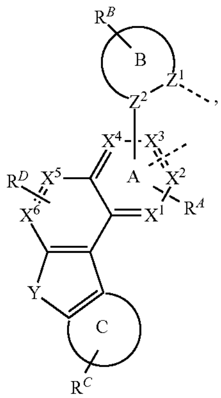

and

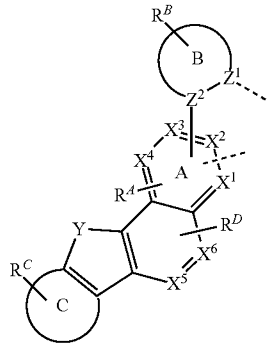

is disclosed. In the Formulas rings B and C are 5-membered or 6-membered aromatic or heteroaromatic ring; $Z^1$, $Z^2$, $X^1$, $X^2$, $X^3$, $X^4$, $X^5$, and $X^6$ are each C or N, but $X^1$, $X^2$, $X^3$, or $X^4$ is C when it forms a direct bond to $Z^2$; Y is selected from CRR', NR', O, S, and Se; R, R', $R^A$, $R^B$, $R^C$, and $R^D$ are each selected from a variety of substituents; the ligand $L_A$ is coordinated to a metal M by the dashed lines, and optionally to other ligands. Organic light emitting devices and consumer products containing the compounds are also disclosed.

19 Claims, 2 Drawing Sheets

(51) Int. Cl.
*C07F 15/00* (2006.01)
*H10K 85/60* (2023.01)
*H10K 50/11* (2023.01)
*H10K 101/10* (2023.01)

(52) U.S. Cl.
CPC ......... *H10K 85/654* (2023.02); *H10K 85/656* (2023.02); *H10K 85/6572* (2023.02); *H10K 85/6574* (2023.02); *H10K 85/6576* (2023.02); *C09K 2211/185* (2013.01); *H10K 50/11* (2023.02); *H10K 2101/10* (2023.02)

(58) Field of Classification Search
CPC ............. H01L 51/0067; H01L 51/0069; H01L 51/0072; H01L 51/0073; H01L 51/0074; H01L 51/50; H01L 51/0071; C07F 15/0033; C09K 11/06; C09K 2211/182–188; C09K 2211/185; H10K 85/342; H10K 85/654; H10K 85/656; H10K 85/6572; H10K 85/6574; H10K 85/6576; H10K 50/11; H10K 2101/10; C07D 401/14; C07D 403/14; C07D 405/14; C07D 407/14; C07D 409/14; C07D 471/04; C07D 491/04
See application file for complete search history.

(56) References Cited

U.S. PATENT DOCUMENTS 5,247,190 A 9/1993 Friend et al.
5,703,436 A 12/1997 Forrest et al.
5,707,745 A 1/1998 Forrest et al.
5,834,893 A 11/1998 Bulovic et al.
5,844,363 A 12/1998 Gu et al.
6,013,982 A 1/2000 Thompson et al.
6,087,196 A 7/2000 Sturm et al.
6,091,195 A 7/2000 Forrest et al.
6,097,147 A 8/2000 Baldo et al.
6,294,398 B1 9/2001 Kim et al.
6,303,238 B1 10/2001 Thompson et al.
6,337,102 B1 1/2002 Forrest et al.
6,468,819 B1 10/2002 Kim et al.
6,528,187 B1 3/2003 Okada
6,687,266 B1 2/2004 Ma et al.
6,835,469 B2 12/2004 Kwong et al.
6,921,915 B2 7/2005 Takiguchi et al.
7,087,321 B2 8/2006 Kwong et al.
7,090,928 B2 8/2006 Thompson et al.
7,154,114 B2 12/2006 Brooks et al.
7,250,226 B2 7/2007 Tokito et al.
7,279,704 B2 10/2007 Walters et al.
7,332,232 B2 2/2008 Ma et al.
7,338,722 B2 3/2008 Thompson et al.
7,393,599 B2 7/2008 Thompson et al.
7,396,598 B2 7/2008 Takeuchi et al.
7,431,968 B1 10/2008 Shtein et al.
7,445,855 B2 11/2008 Mackenzie et al.
7,534,505 B2 5/2009 Lin et al.
8,722,205 B2 5/2014 Xia et al.
10,270,046 B2 * 4/2019 Boudreault .......... C09K 11/025
2002/0034656 A1 3/2002 Thompson et al.
2002/0134984 A1 9/2002 Igarashi
2002/0158242 A1 10/2002 Son et al.
2003/0138657 A1 7/2003 Li et al.
2003/0152802 A1 8/2003 Tsuboyama et al.
2003/0162053 A1 8/2003 Marks et al.
2003/0175553 A1 9/2003 Thompson et al.
2003/0230980 A1 12/2003 Forrest et al.
2004/0036077 A1 2/2004 Ise
2004/0137267 A1 7/2004 Igarashi et al.
2004/0137268 A1 7/2004 Igarashi et al.
2004/0174116 A1 9/2004 Lu et al.
2005/0025993 A1 2/2005 Thompson et al.
2005/0112407 A1 5/2005 Ogasawara et al.
2005/0238919 A1 10/2005 Ogasawara
2005/0244673 A1 11/2005 Satoh et al.
2005/0260441 A1 11/2005 Thompson et al.
2005/0260449 A1 11/2005 Walters et al.
2006/0008670 A1 1/2006 Lin et al.
2006/0202194 A1 9/2006 Jeong et al.
2006/0240279 A1 10/2006 Adamovich et al.
2006/0251923 A1 11/2006 Lin et al.
2006/0263635 A1 11/2006 Ise
2006/0280965 A1 12/2006 Kwong et al.
2007/0190359 A1 8/2007 Knowles et al.
2007/0278938 A1 12/2007 Yabunouchi et al.
2008/0015355 A1 1/2008 Schafer et al.
2008/0018221 A1 1/2008 Egen et al.
2008/0106190 A1 5/2008 Yabunouchi et al.
2008/0124572 A1 5/2008 Mizuki et al.
2008/0220265 A1 9/2008 Xia et al.
2008/0297033 A1 12/2008 Knowles et al.
2009/0008605 A1 1/2009 Kawamura et al.
2009/0009065 A1 1/2009 Nishimura et al.
2009/0017330 A1 1/2009 Iwakuma et al.
2009/0030202 A1 1/2009 Iwakuma et al.
2009/0039776 A1 2/2009 Yamada et al.
2009/0045730 A1 2/2009 Nishimura et al.
2009/0045731 A1 2/2009 Nishimura et al.
2009/0101870 A1 4/2009 Prakash et al.
2009/0108737 A1 4/2009 Kwong et al.
2009/0115316 A1 5/2009 Zheng et al.
2009/0165846 A1 7/2009 Johannes et al.
2009/0167162 A1 7/2009 Lin et al.
2009/0179554 A1 7/2009 Kuma et al.
2010/0187977 A1 * 7/2010 Kai ..................... H01L 51/0072 313/504
2010/0270915 A1 * 10/2010 Cheng ................. H01L 51/0085 313/504
2013/0306940 A1 11/2013 Zeng et al.
2016/0260913 A1 * 9/2016 Boudreault ............ C09K 11/06
2016/0359121 A1 * 12/2016 Ito ....................... H01L 27/3213

(56) References Cited

U.S. PATENT DOCUMENTS

| | | | | |
|---|---|---|---|---|
| 2017/0025619 A1* | 1/2017 | Kim | .................... | H01L 51/0071 |
| 2017/0373259 A1 | 12/2017 | Su et al. | | |
| 2018/0351114 A1* | 12/2018 | Kim | .................... | C07F 15/0033 |

FOREIGN PATENT DOCUMENTS

| | | | |
|---|---|---|---|
| EP | 2034538 | 3/2009 | |
| JP | 200511610 | 1/2005 | |
| JP | 2007123392 | 5/2007 | |
| JP | 2007254297 | 10/2007 | |
| JP | 2008074939 | 4/2008 | |
| JP | 2012074444 | 4/2012 | |
| KR | 20150080966 | 7/2015 | |
| KR | 20170069151 A * | 6/2017 | ............ C09K 11/06 |
| WO | 01/39234 | 5/2001 | |
| WO | 02/02714 | 1/2002 | |
| WO | 02015654 | 2/2002 | |
| WO | 03040257 | 5/2003 | |
| WO | 03060956 | 7/2003 | |
| WO | 2004093207 | 10/2004 | |
| WO | 04107822 | 12/2004 | |
| WO | 2005014551 | 2/2005 | |
| WO | 2005019373 | 3/2005 | |
| WO | 2005030900 | 4/2005 | |
| WO | 2005089025 | 9/2005 | |
| WO | 2005123873 | 12/2005 | |
| WO | 2006009024 | 1/2006 | |
| WO | 2006056418 | 6/2006 | |
| WO | 2006072002 | 7/2006 | |
| WO | 2006082742 | 8/2006 | |
| WO | 2006098120 | 9/2006 | |
| WO | 2006100298 | 9/2006 | |
| WO | 2006103874 | 10/2006 | |
| WO | 2006114966 | 11/2006 | |
| WO | 2006132173 | 12/2006 | |
| WO | 2007002683 | 1/2007 | |
| WO | 2007004380 | 1/2007 | |
| WO | 2007063754 | 6/2007 | |
| WO | 2007063796 | 6/2007 | |
| WO | 2008056746 | 5/2008 | |
| WO | 2008101842 | 8/2008 | |
| WO | 2008132085 | 11/2008 | |
| WO | 2009000673 | 12/2008 | |
| WO | 2009003898 | 1/2009 | |
| WO | 2009008311 | 1/2009 | |
| WO | 2009018009 | 2/2009 | |
| WO | 2009021126 | 2/2009 | |
| WO | 2009050290 | 4/2009 | |
| WO | 2009062578 | 5/2009 | |
| WO | 2009063833 | 5/2009 | |
| WO | 2009066778 | 5/2009 | |
| WO | 2009066779 | 5/2009 | |
| WO | 2009086028 | 7/2009 | |
| WO | 2009100991 | 8/2009 | |
| WO | 2017099516 | 6/2017 | |

OTHER PUBLICATIONS

Shang et al. "DFT/TDDFT Study on the Electronic Structures and Optoelectronic Properties of a Series of Iridium(III) Complexes Based on Quinoline Derivatives in OLEDs" J Phys. Org. Chem. vol. 26, pp. 784-790. (Year: 2013).*

Yang, Xiaolong, Guijiang Zhou, and Wai-Yeung Wong. "Functionalization of phosphorescent emitters and their host materials by main-group elements for phosphorescent organic light-emitting devices." Chemical Society Reviews 44, No. 23 (2015): 8484-8575. (Year: 2015).*

Adachi, Chihaya et al., "Organic Electroluminescent Device Having a Hole Conductor as an Emitting Layer," Appl. Phys. Lett., 55(15): 1489-1491 (1989).

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 1, 4-6 (1999).

Gao, Zhiqiang et al., "Bright-Blue Electroluminescence From a Silyl-Substituted ter-(phenyiene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato) beryllium as an Emitter," Chem. Lett., 905-906 (1993).

Holmes, R.J. et al., "Blue Organic Electrophosphorescence Using Exothermic Host-Guest Energy Transfer," Appl, Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinoiinato-C2,N)iridium(III) Derivatives," Adv. Mater., 19:739-743 (2007).

Huang, Wei-Sheng et al., "Highly Phosphorescent Bis-Gyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi et al., "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffet Layer Having Molybdenum Oxide," SID Symposium Digest, 37:923-926 (2006).

Inada, Hiroshi and SHIROTA, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4'14"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1) 162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Lo, Shih-Chun et al., "Blue Phosphorescence from Iridium(III) Complexes at Room Temperature," Chem. Mater., 18 (21)5119-5129 (2006).

Ma, Yuguang et al., "Triplet Luminescent Dinuclear-Gold(l) Complex-Based Light-Emitting Diodes with Low Turn-On voltage," Appl. Phys. Lett., 74(10):1361-1363 (1999).

(56) References Cited

OTHER PUBLICATIONS

MI, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Elecltuphosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylboryl)-2,2'-bithiophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based On Silole Derivatives And Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing N/\C/\N-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes Of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2- α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69 (15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

* cited by examiner

ORGANIC ELECTROLUMINESCENT MATERIALS AND DEVICES

CROSS-REFERENCE TO RELATED APPLICATIONS

This application claims priority under 35 U.S.C. § 119(e) to U.S. Provisional Application No. 62/560,902, filed Sep. 20, 2017, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

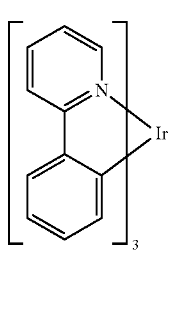

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an aspect of the present disclosure, a compound comprising a first ligand $L_A$ having the Formula selected from the group consisting of Formula IA

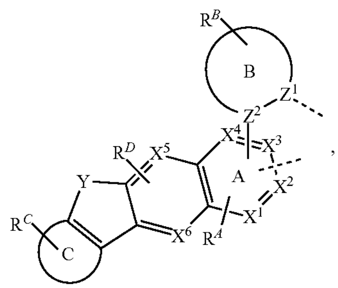

Formula IB

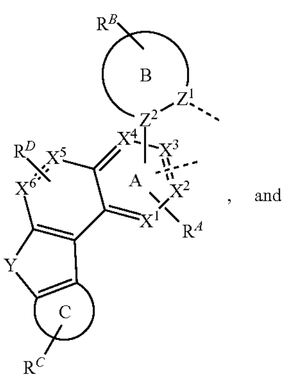

Formula IC

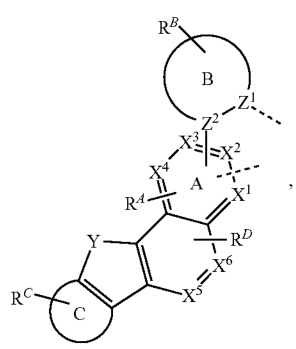

is provided. In Formulae IA, IB, and IC:

ring B and C are each independently a 5-membered or 6-membered aromatic or heteroaromatic ring;

$R^A$, $R^B$, $R^C$, and $R^D$ each independently represent mono to the maximum possible number of substituents, or no substituent;

$Z^1$ and $Z^2$ are each independently selected from the group consisting of C and N;

$X^1$, $X^2$, $X^3$, $X^4$, $X^5$, and $X^6$ are each independently selected from the group consisting of C and N;

$X^1$, $X^2$, $X^3$, or $X^4$ is C when it forms a direct bond to $Z^2$;

Y is selected from the group consisting of CRR', NR', O, S, and Se;

R, R', $R^A$, $R^B$, $R^C$, and $R^D$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

any two substituents are optionally joined or fused into a ring;

the ligand $L_A$ is coordinated to a metal M by the dashed lines to form a 5-membered chelate ring;

wherein M does not form a direct bond to $X^1$ in Formula IB;

wherein M does not form a direct bond to $X^4$ in Formula IC;

the metal M can be coordinated to other ligands; and the ligand $L_A$ is optionally linked with other ligands to comprise a tridentate, tetradentate, pentadentate or hexadentate ligand.

In some embodiments, an organic light emitting device (OLED) is described. The OLED can include an anode; a cathode; and an organic layer, disposed between the anode and the cathode, where the organic layer includes a compound comprising a first ligand $L_A$ of Formula IA, Formula IB, or Formula IC, as described herein.

A consumer product comprising the OLED is also disclosed.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
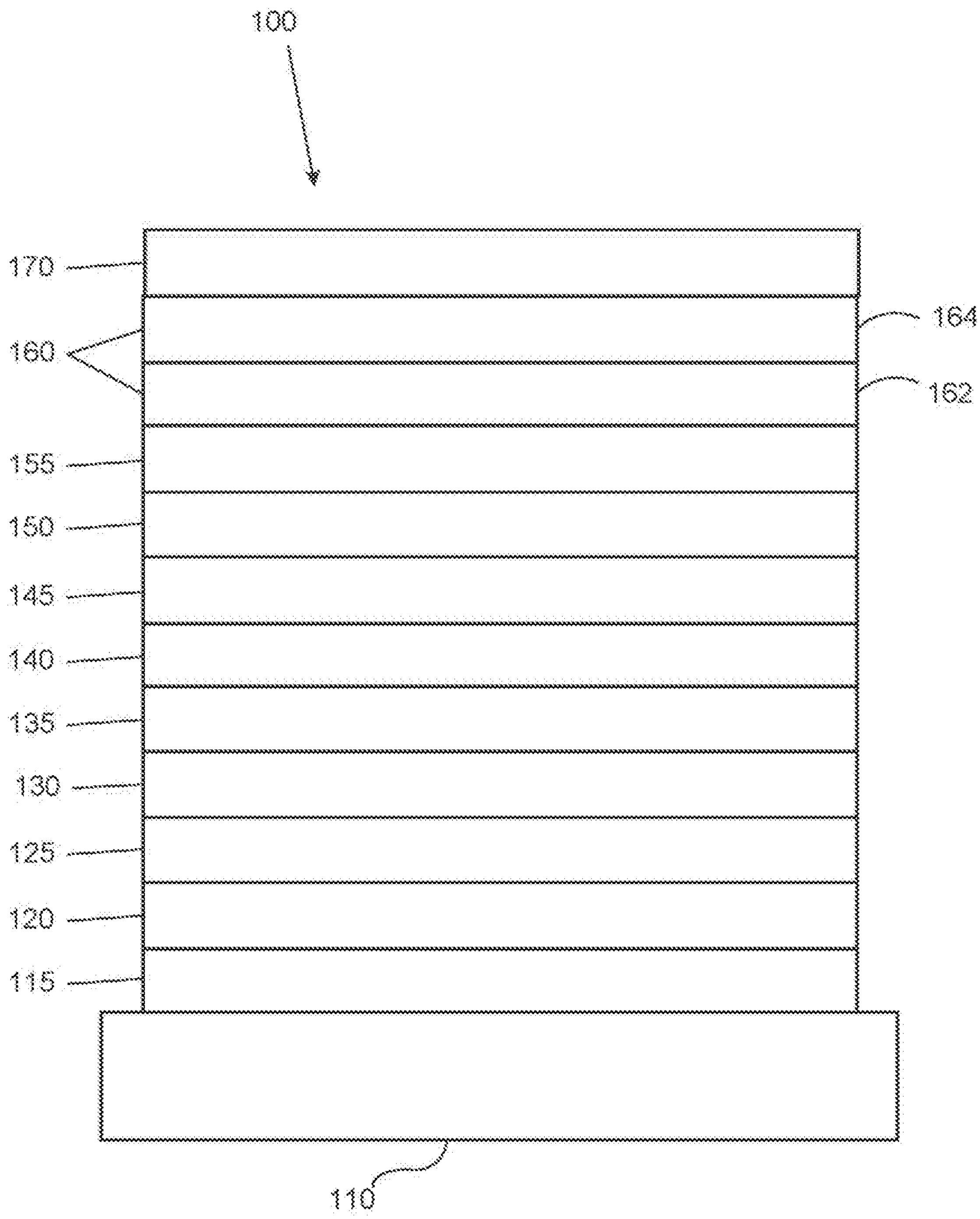
FIG. 1 shows an organic light emitting device.

FIG. 1 shows an organic light emitting device 100. The figures are not necessarily drawn to scale. Device 100 may include a substrate 110, an anode 115, a hole injection layer

120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
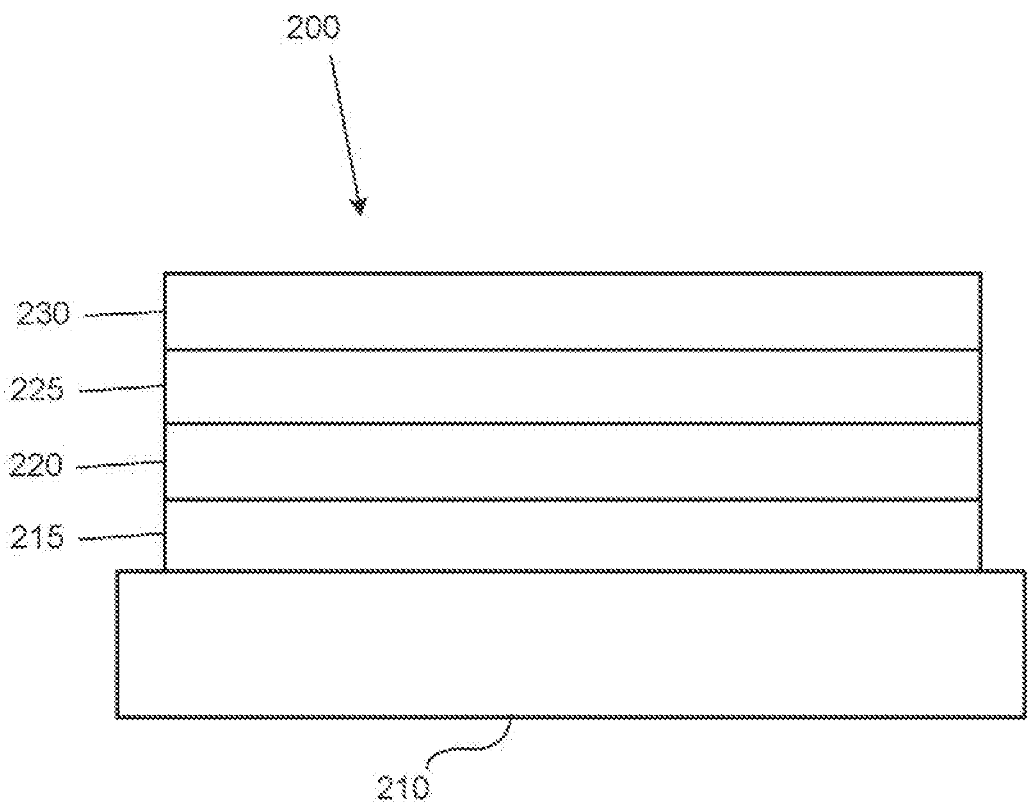
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms "halo," "halogen," and "halide" are used interchangeably and refer to fluorine, chlorine, bromine, and iodine.

The term "acyl" refers to a substituted carbonyl radical (C(O)—$R_s$).

The term "ester" refers to a substituted oxycarbonyl (—O—C(O)—R or —C(O)—O—$R_s$) radical.

The term "ether" refers to an —$OR_s$ radical.

The terms "sulfanyl" or "thio-ether" are used interchangeably and refer to a —$SR_s$ radical.

The term "sulfinyl" refers to a —S(O)—$R_s$ radical.

The term "sulfonyl" refers to a —$SO_2$—$R_s$ radical.

The term "phosphino" refers to a —$P(R_s)_3$ radical, wherein each $R_s$ can be same or different.

The term "silyl" refers to a —$Si(R_s)_3$ radical, wherein each $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The term "substituted" refers to a substituent other than H that is bonded to the relevant position, e.g., a carbon. For example, where $R^1$ represents mono-substituted, then one $R^1$ must be other than H. Similarly, where $R^1$ represents di-substituted, then two of $R^1$ must be other than H. Similarly, where $R^1$ is unsubstituted, $R^1$ is hydrogen for all available positions. The maximum number of substitutions possible in a structure (for example, a particular ring or fused ring system) will depend on the number of atoms with available valencies.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

According to an aspect of the present disclosure, a compound comprising a first ligand $L_A$ having the Formula selected from the group consisting of Formula IA

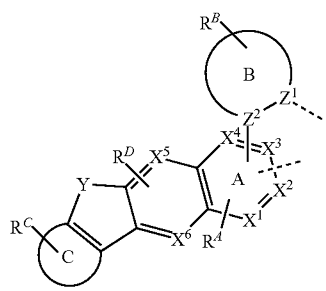

,

Formula IB

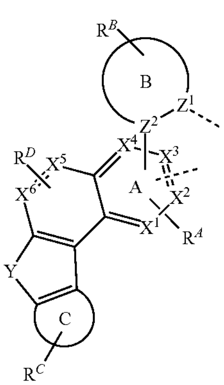

, and

-continued

Formula IC

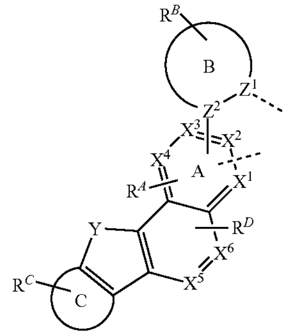

, is provided. In Formulae IA, IB, and IC:

- ring B and C are each independently a 5-membered or 6-membered aromatic or heteroaromatic ring;
- $R^A$, $R^B$, $R^C$, and $R^D$ each independently represent mono to the maximum possible number of substituents, or no substituent;
- $Z^1$ and $Z^2$ are each independently selected from the group consisting of C and N;
- $X^1$, $X^2$, $X^3$, $X^4$, $X^5$, and $X^6$ are each independently selected from the group consisting of C and N;
- $X^1$, $X^2$, $X^3$, or $X^4$ is C when it forms a direct bond to $Z^2$;
- Y is selected from the group consisting of CRR', NR', O, S, and Se;
- R, R', $R^A$, $R_B$, $R^C$, and $R^D$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;
- any two substituents are optionally joined or fused into a ring;
- the ligand $L_A$ is coordinated to a metal M by the dashed lines to form a 5-membered chelate ring;

wherein M does not form a direct bond to $X^1$ in Formula IB;
wherein M does not form a direct bond to $X^4$ in Formula IC;

- the metal M can be coordinated to other ligands; and
- the ligand $L_A$ is optionally linked with other ligands to comprise a tridentate, tetradentate, pentadentate or hexadentate ligand.

In some embodiments, ring B can be a ring system comprising two fused rings, such as naphthalene, benzimidazole, etc. In such instances, the maximum substitutions for $R^B$ could be hexa- or penta-substitutions, respectively.

In some embodiments, metal M is selected from the group consisting of Ir, Rh, Re, Ru, Os, Pt, Pd, Au, and Cu. In some embodiments, metal M is Ir or Pt.

In some embodiments, R, R', $R^A$, $R^B$, $R^C$, and $R^D$ are each independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some embodiments, the compound is homoleptic. In some embodiments, the compound is heteroleptic.

In some embodiments, Y is O.

In some embodiments, $X^1$ through $X^6$ are each independently C. In some embodiments, $X^1$ through $X^4$ are each independently CR.

In some embodiments, ring C is a fused benzene ring.

In some embodiments, ring B is selected from the group consisting of pyridine, pyrimidine, pyrazine, pyridazine, benzene imidazole, pyrazole, triazole, pyrrole, oxazole, thiazole, and imidazole derived carbene. In some embodiments, ring A is benzene and ring B is pyridine with $Z^1$ as N. In some embodiments, ring A is pyridine with N coordinated to metal, and ring B is benzene.

In some embodiments, the first ligand $L_A$ is selected from the group consisting of:

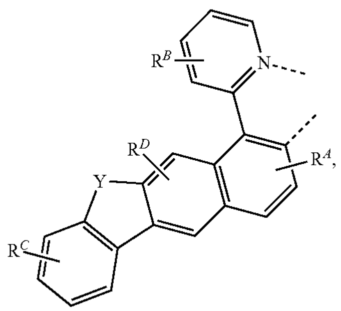

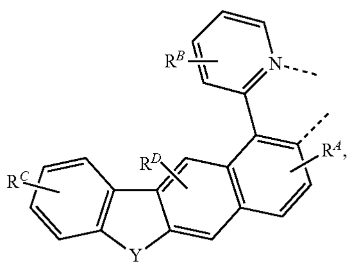

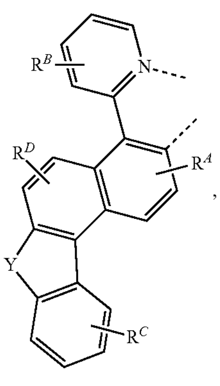
,
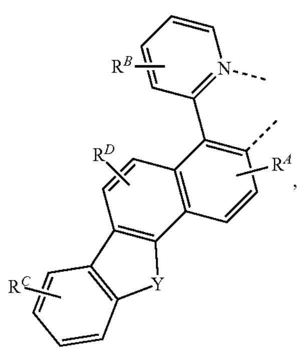
,
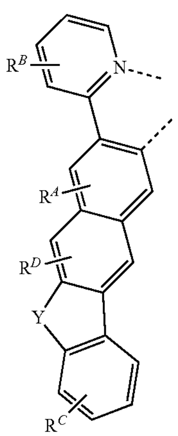
,
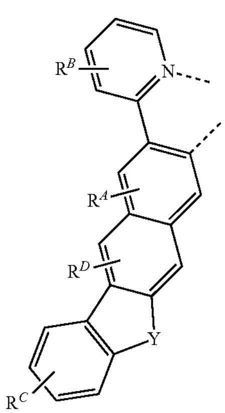
,

-continued

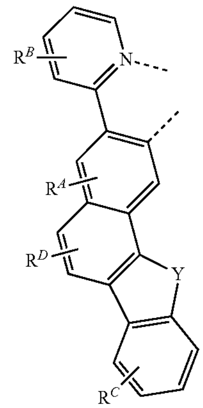
,
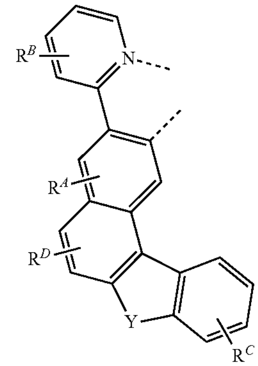
,
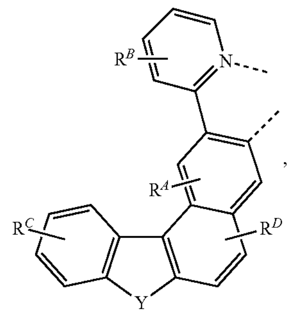
,
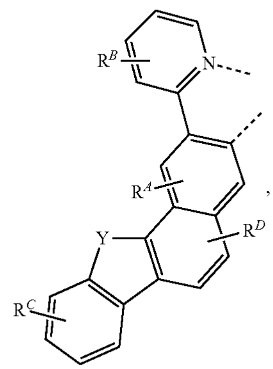
,
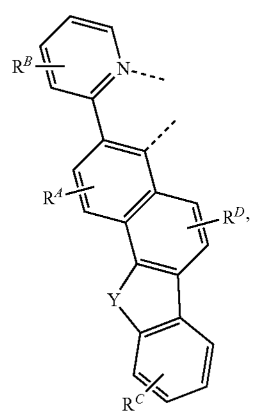

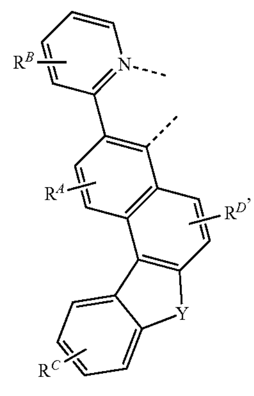

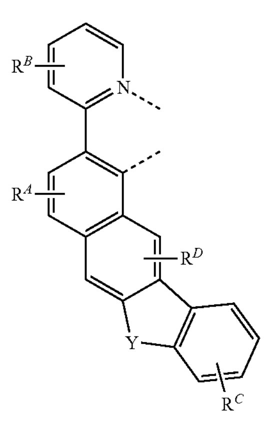
,
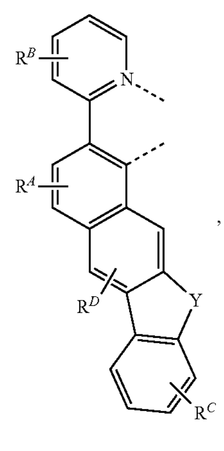
,

-continued
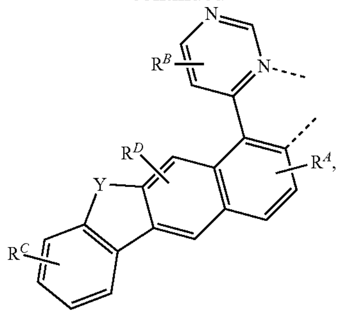
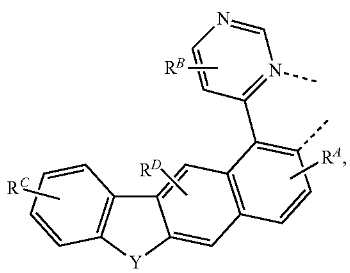
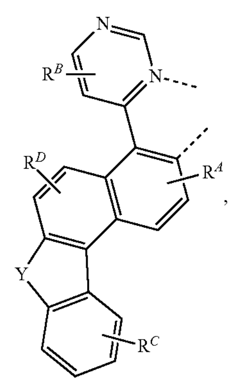
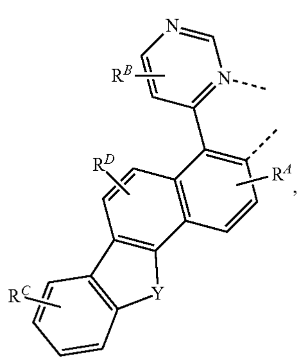
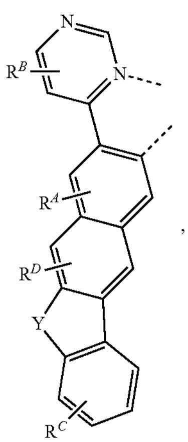
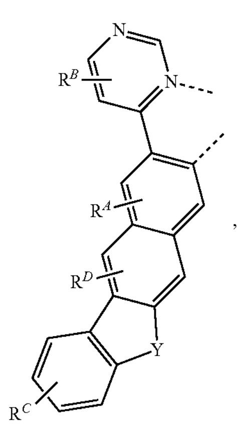
-continued
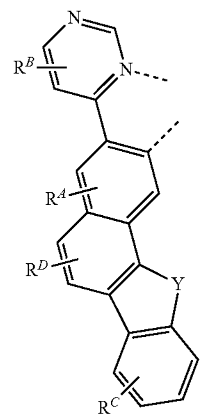
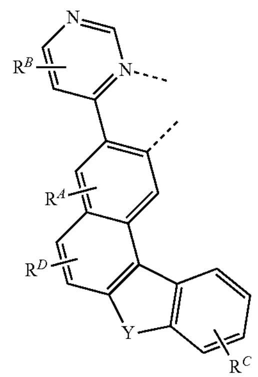
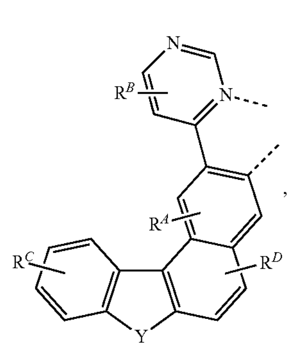
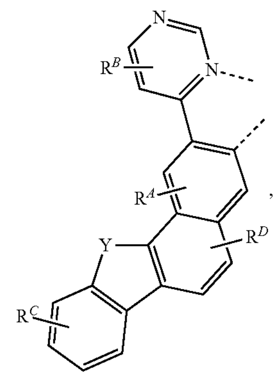
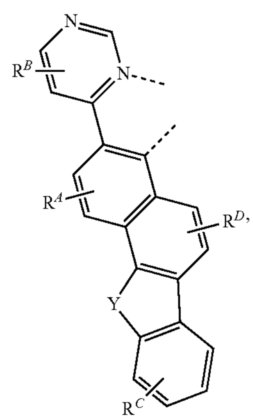
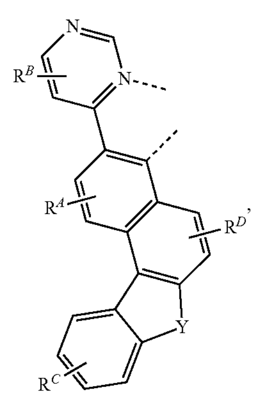
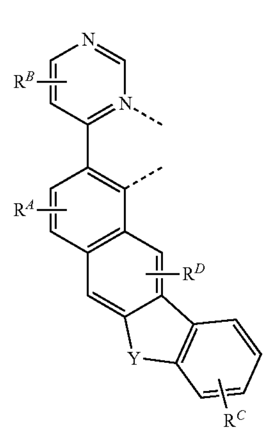
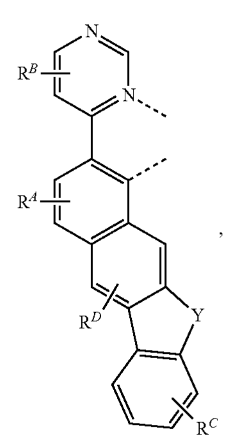

-continued
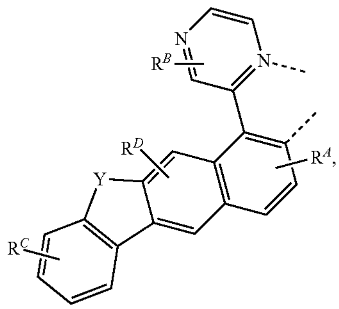
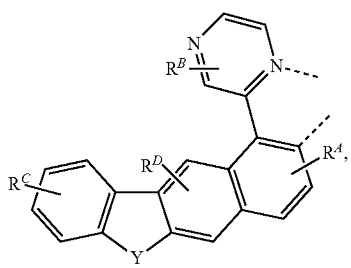
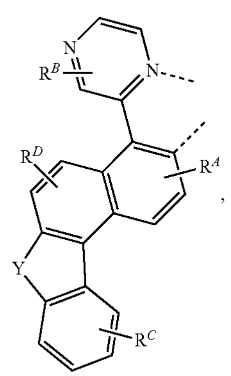
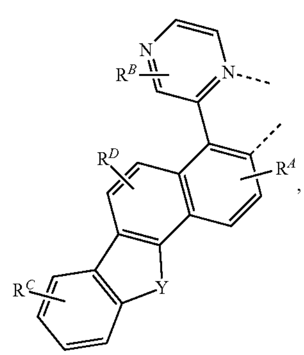
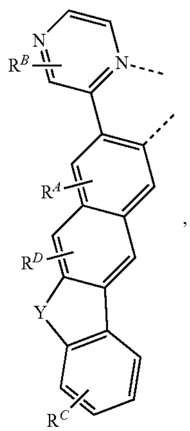
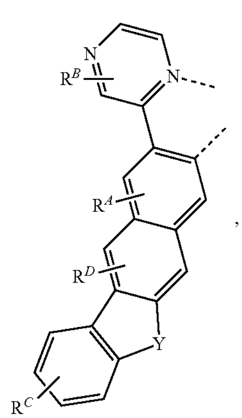
-continued
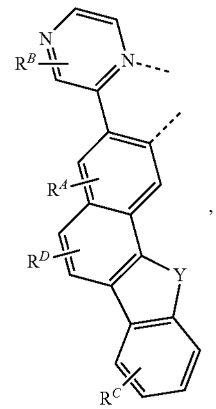
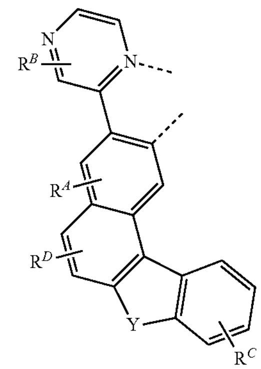
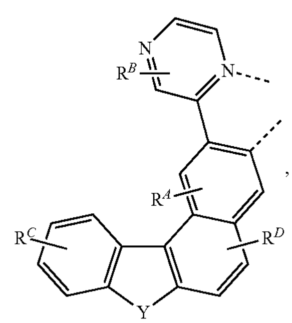
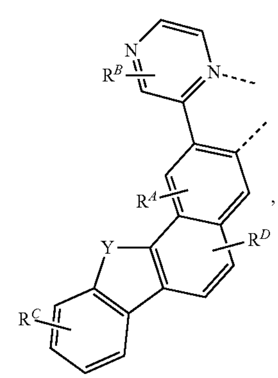
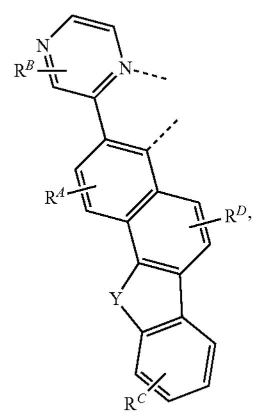
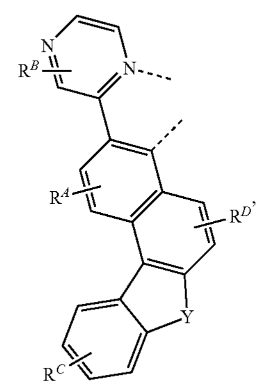
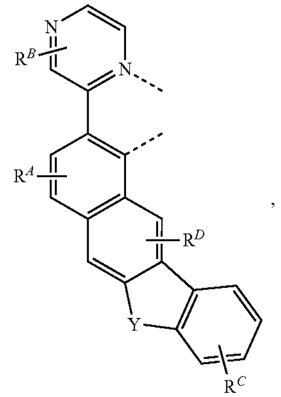
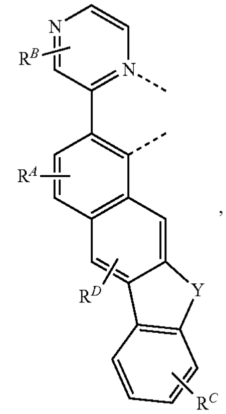

-continued
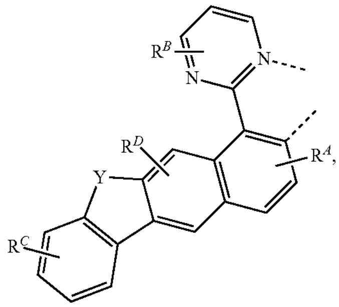
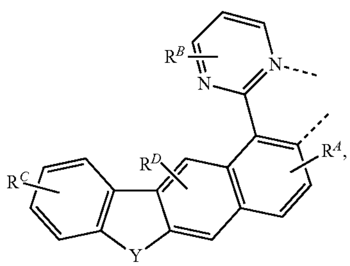
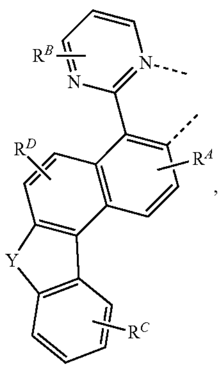
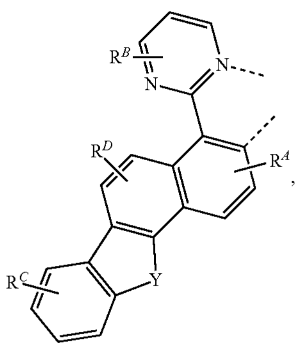
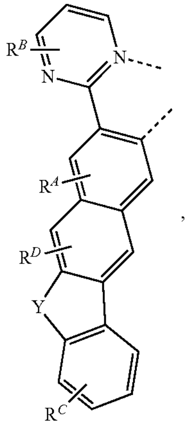
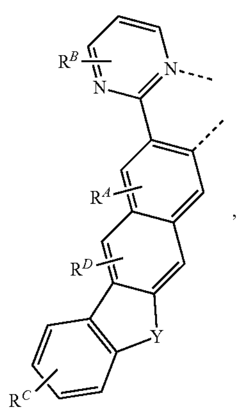
-continued
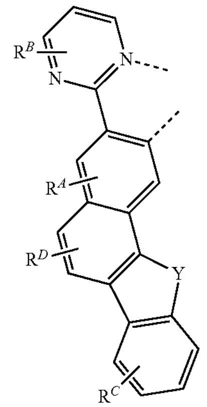
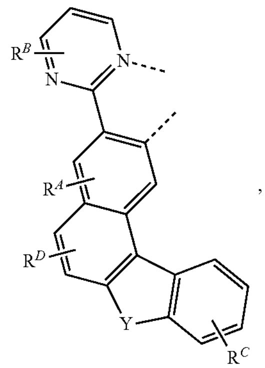
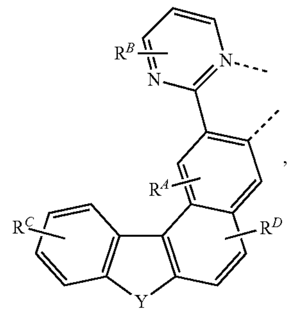
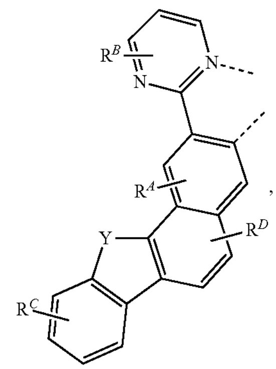
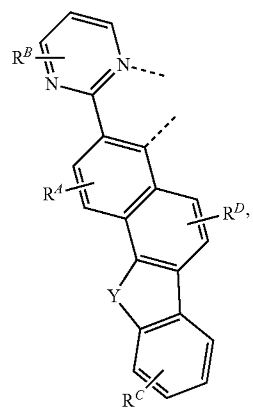
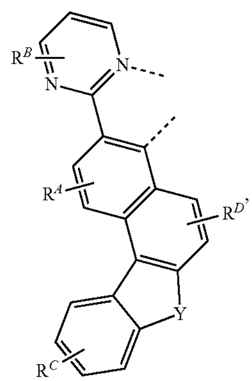
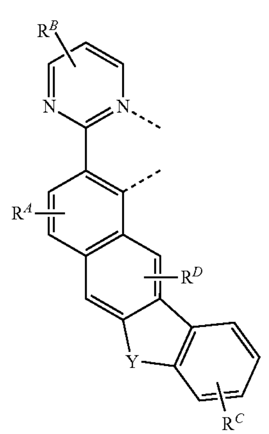
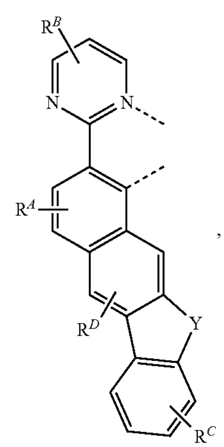

-continued
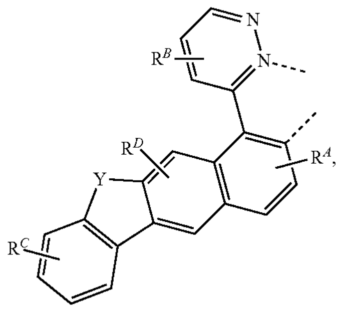
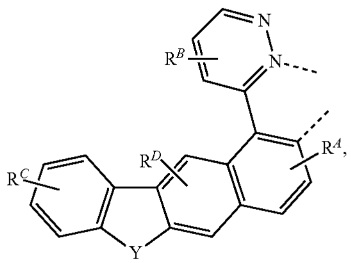
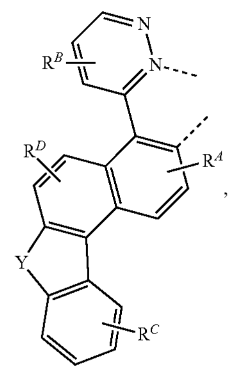
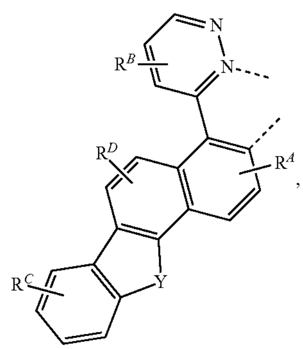
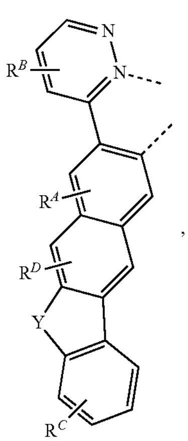
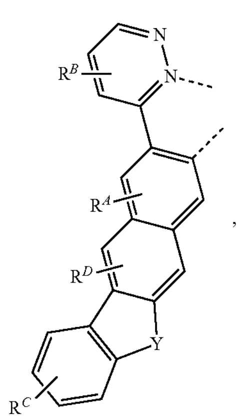
-continued
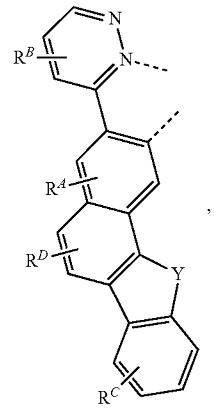
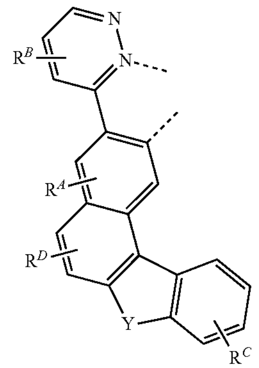
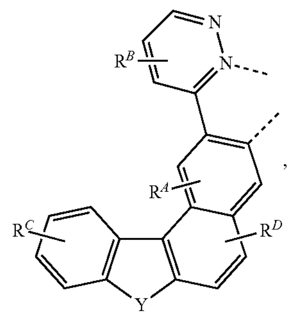
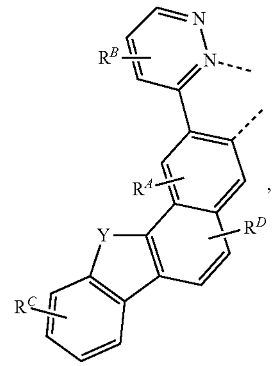
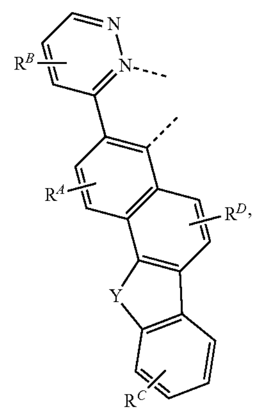
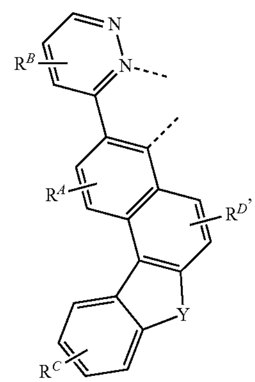
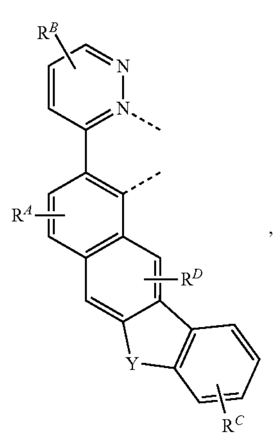
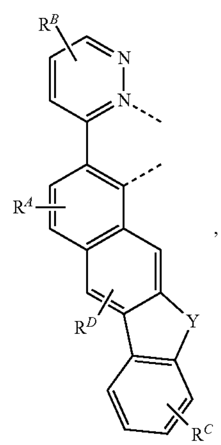

-continued
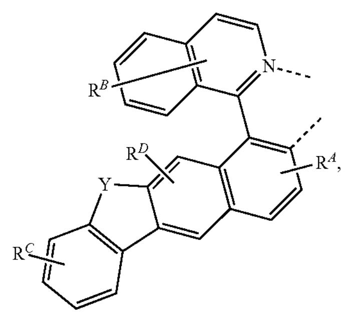
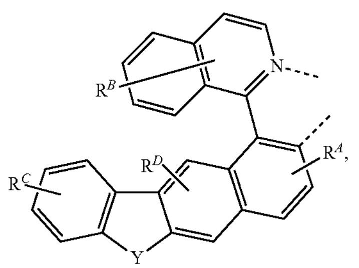
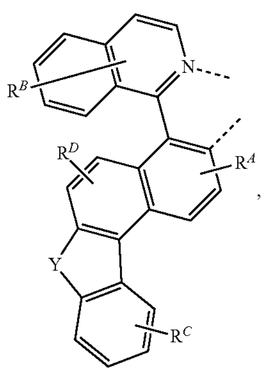
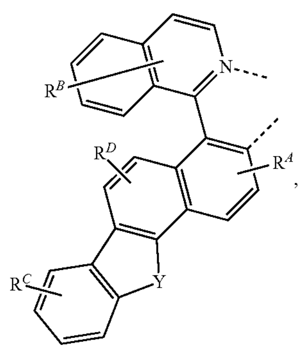
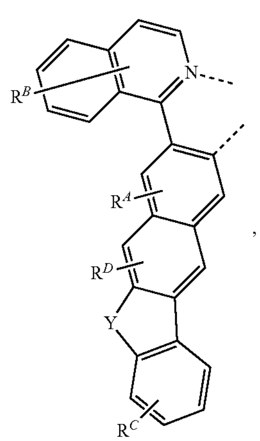
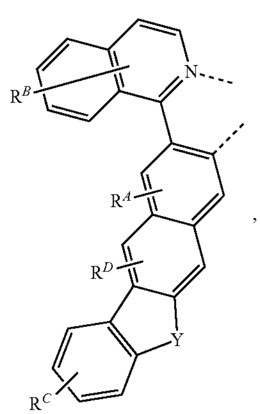
-continued
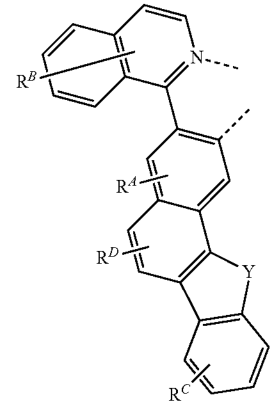
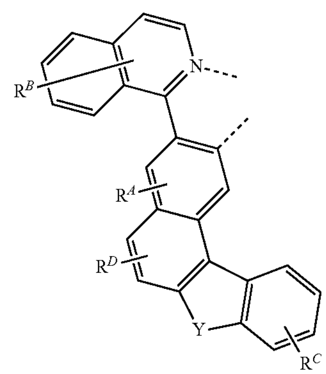
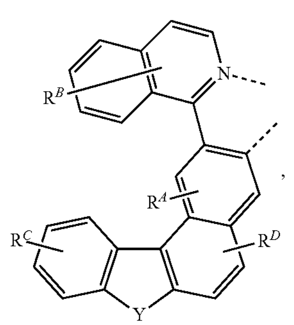
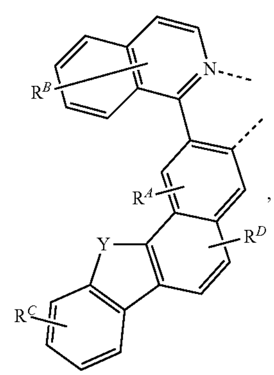
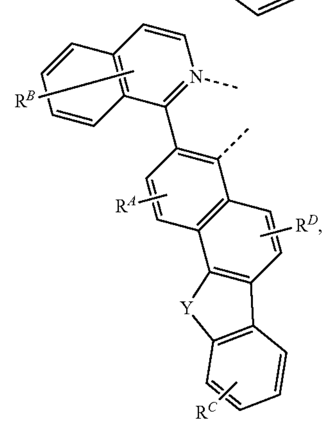

-continued
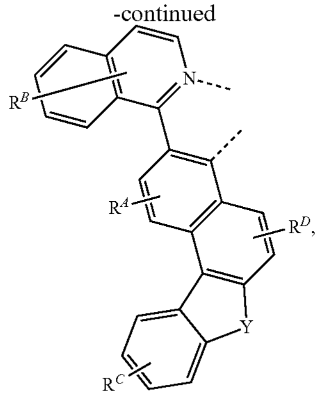
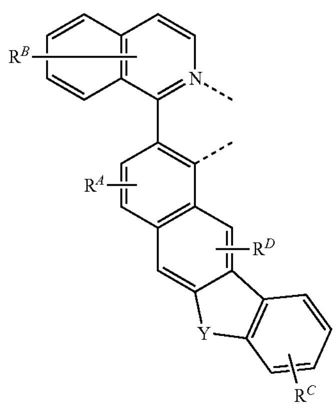
,
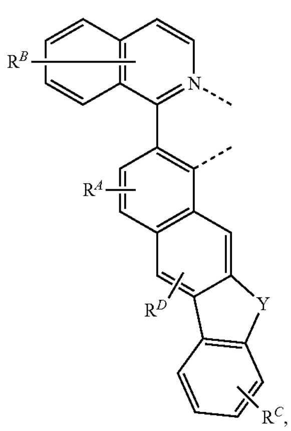
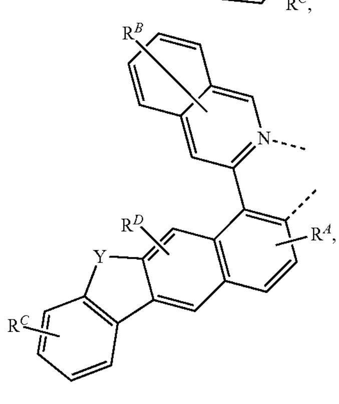
-continued
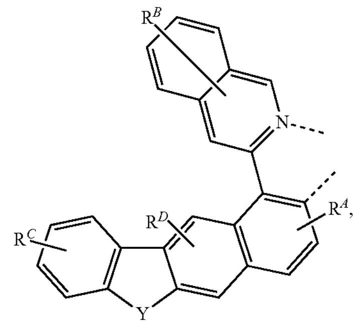
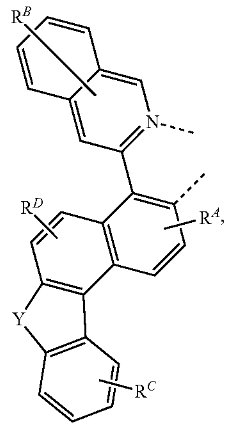
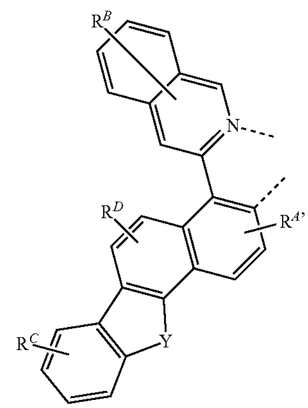
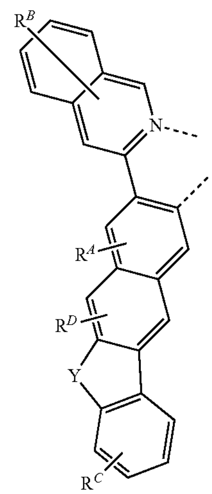
,
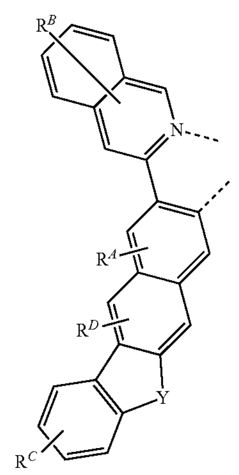
,
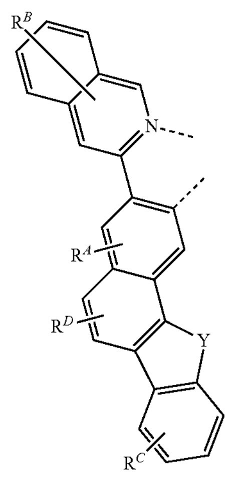
,
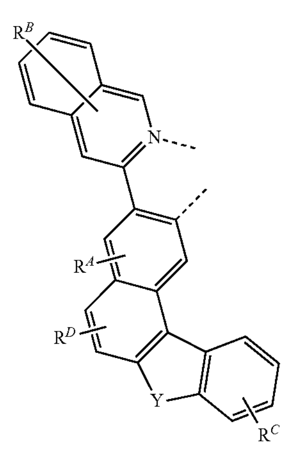
, -continued
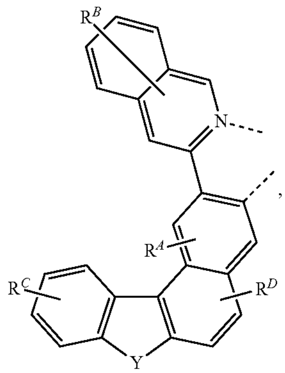
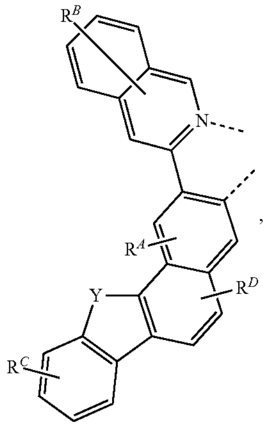
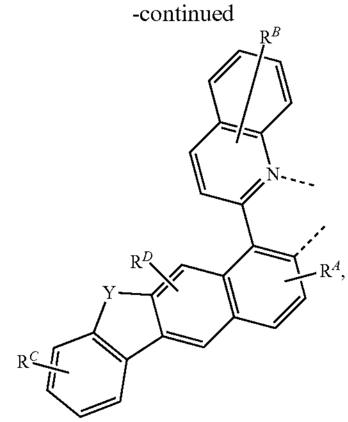
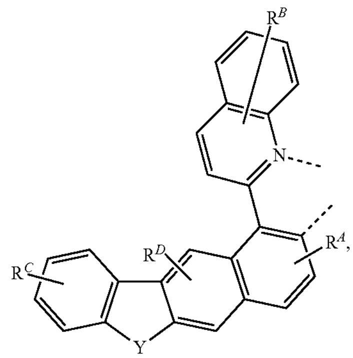
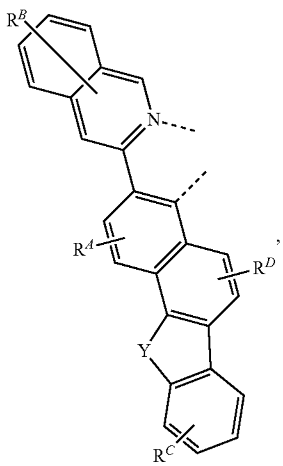
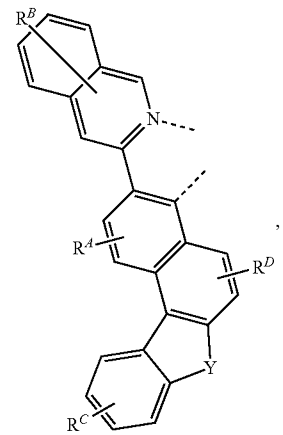
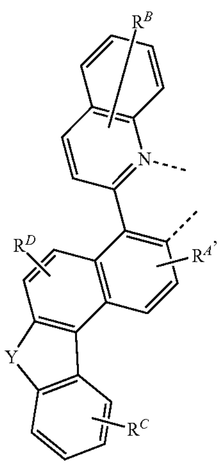
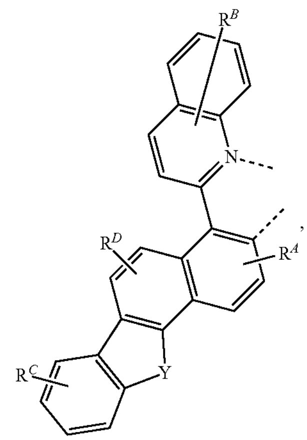
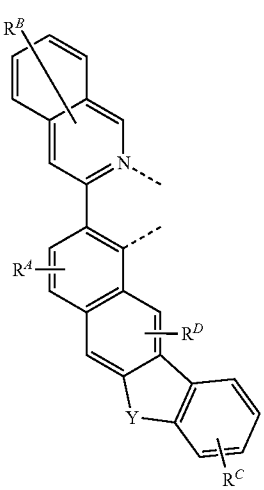
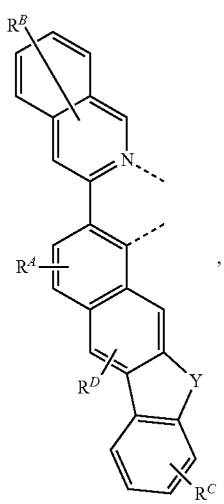
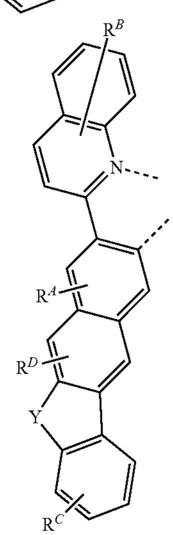
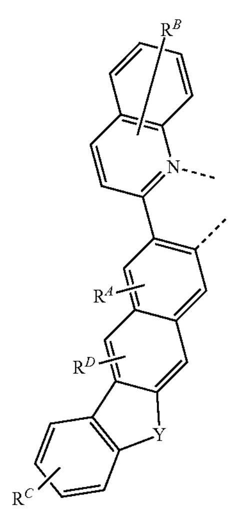

-continued
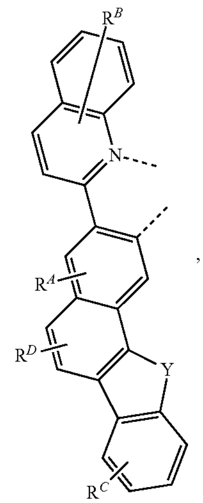
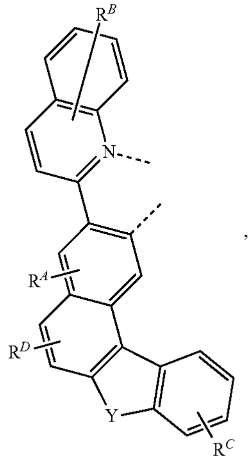
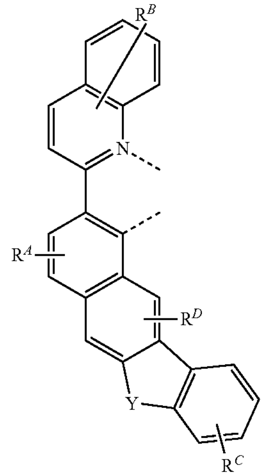
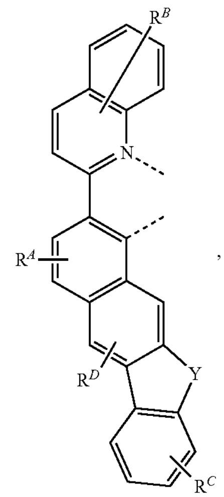
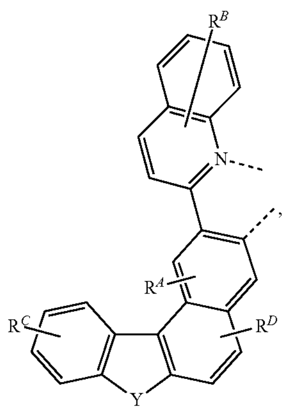
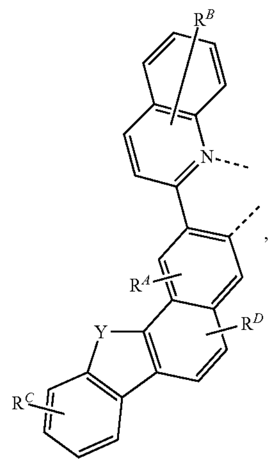
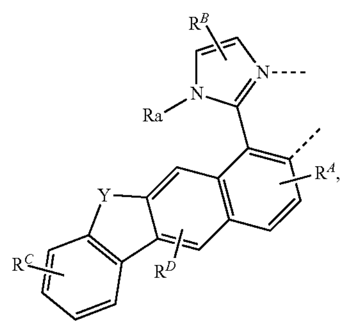
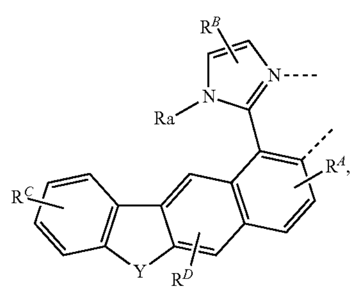
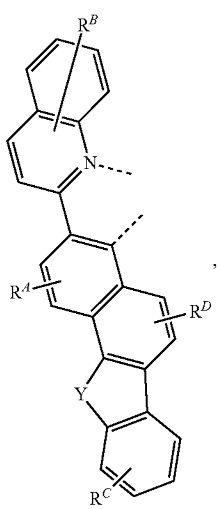
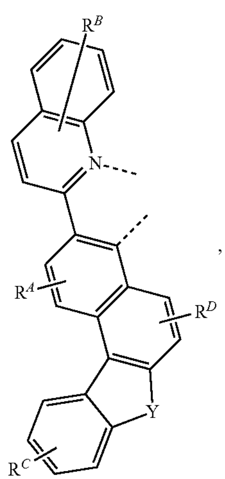
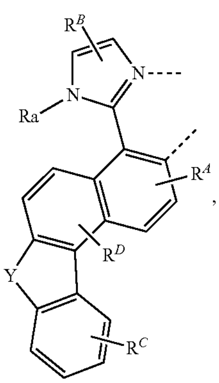
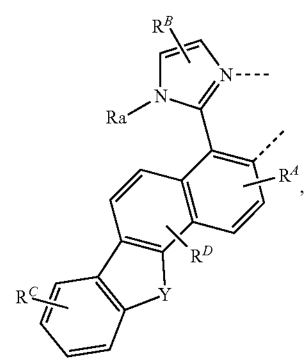

-continued
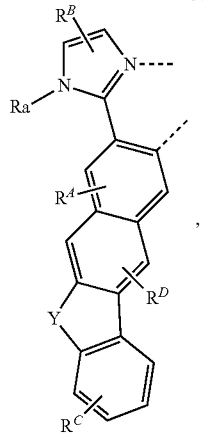
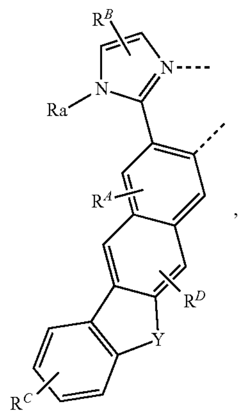
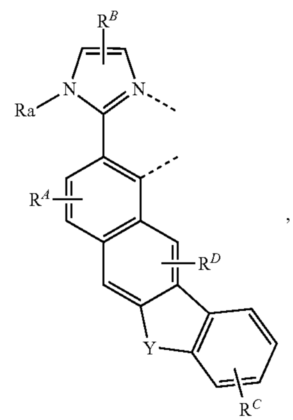
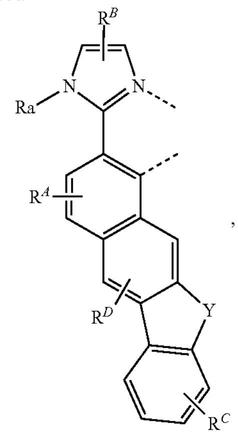
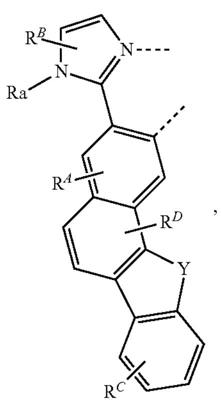
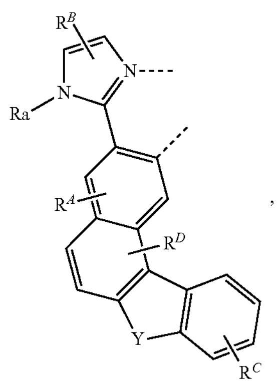
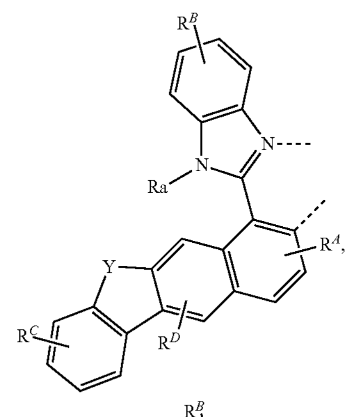
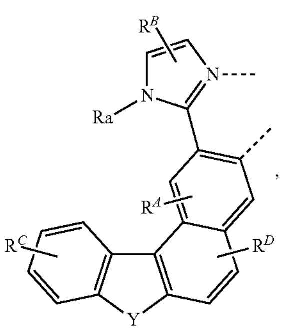
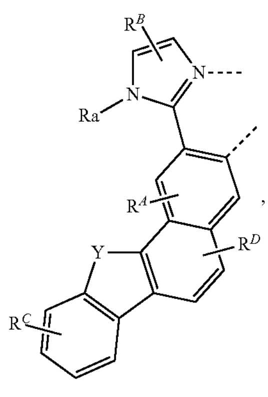
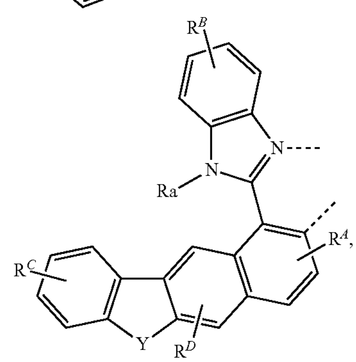
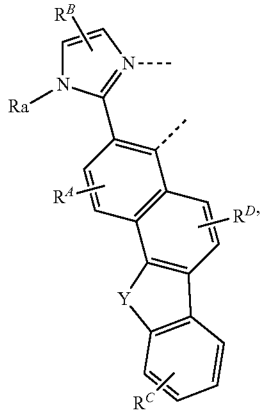
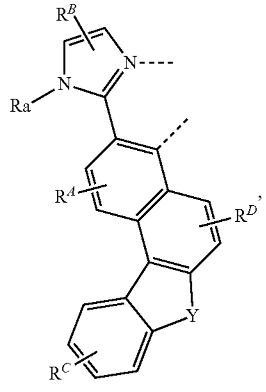
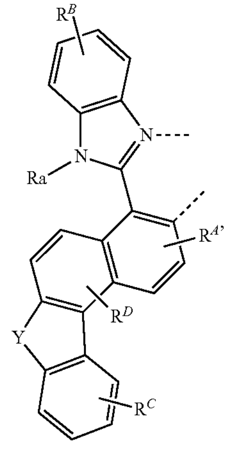
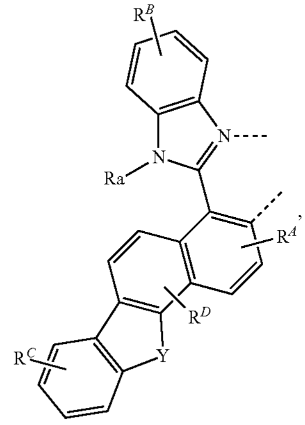

-continued
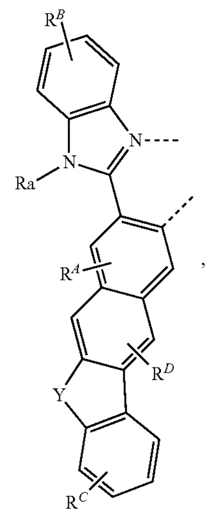
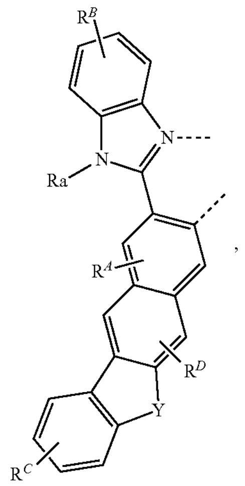
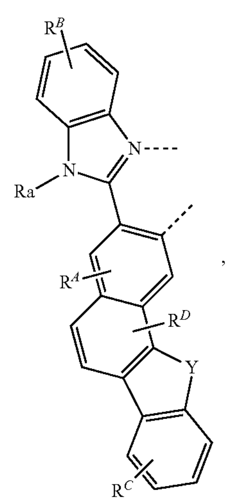
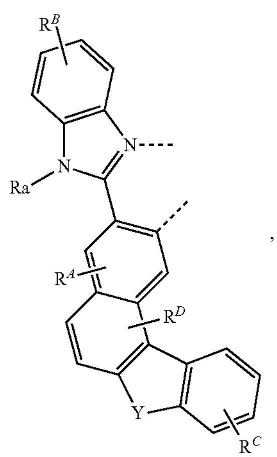
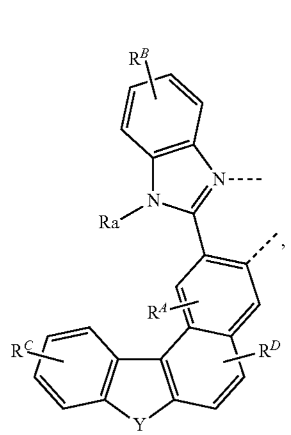
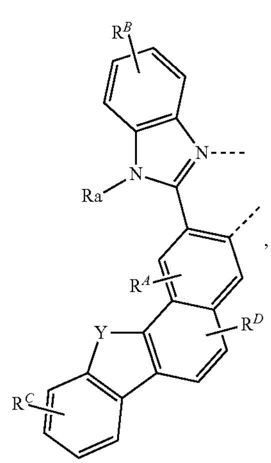
-continued
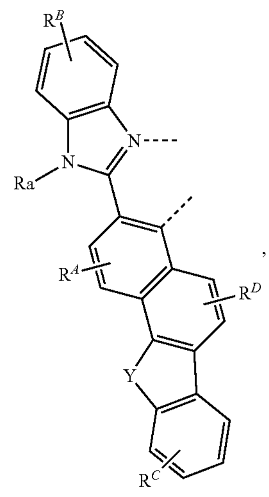
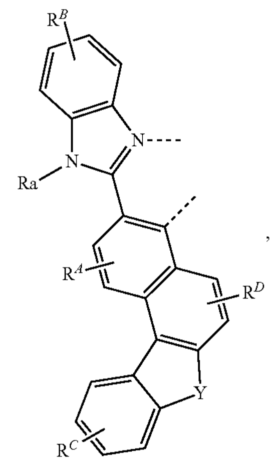
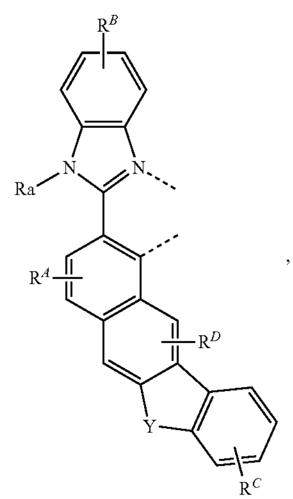
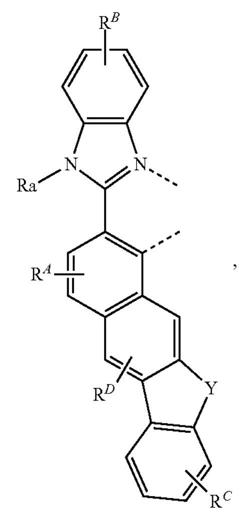
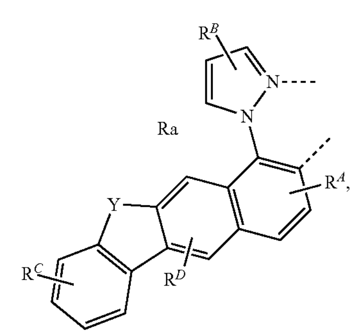
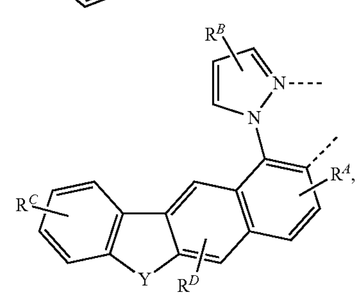

-continued
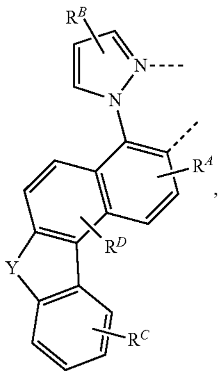
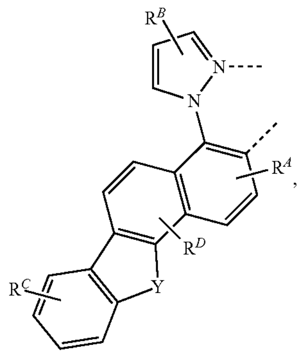
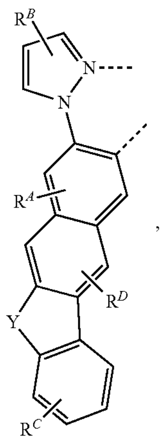
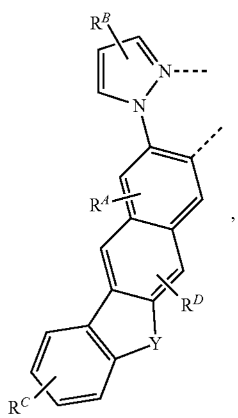
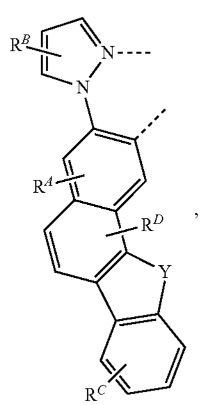
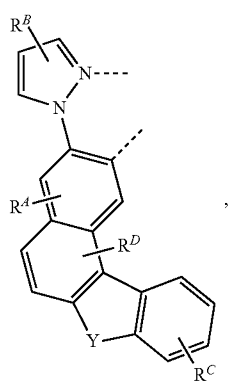
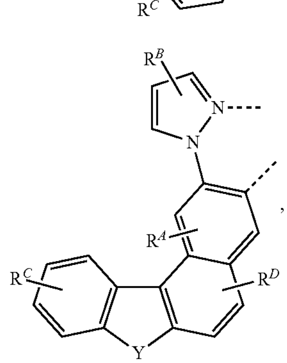
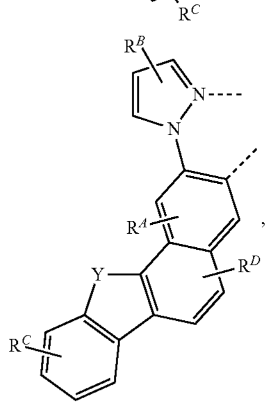
-continued
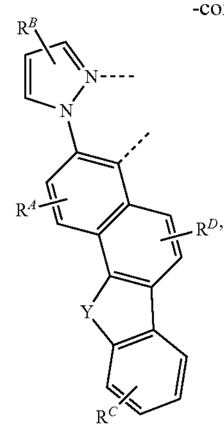
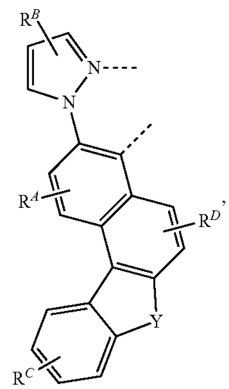
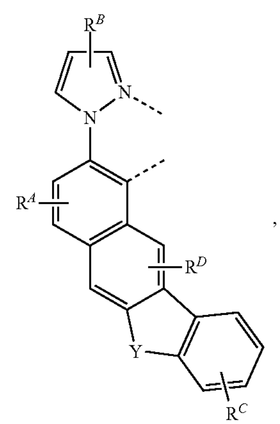
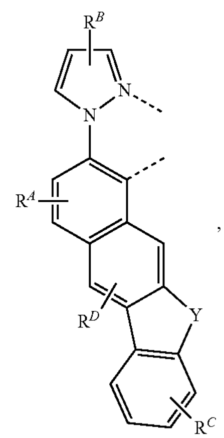
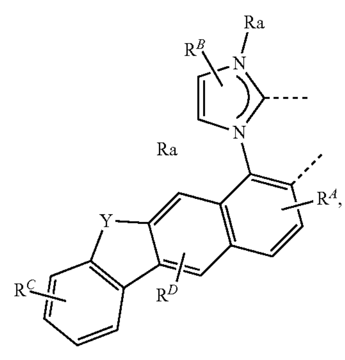
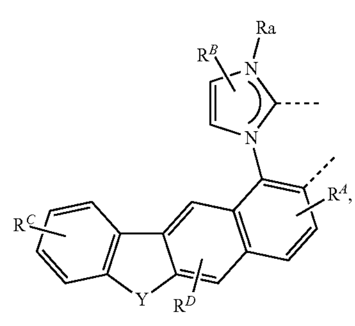

-continued
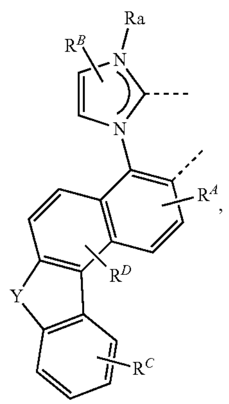
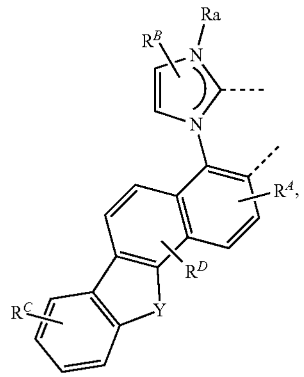
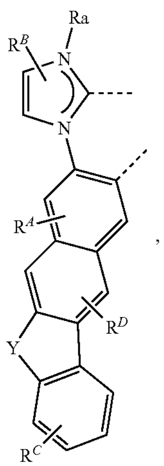
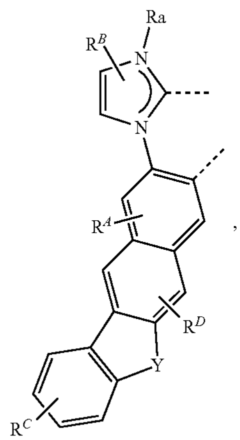
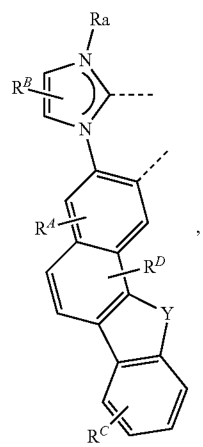
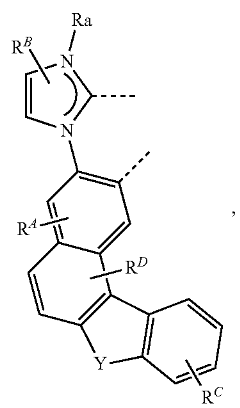
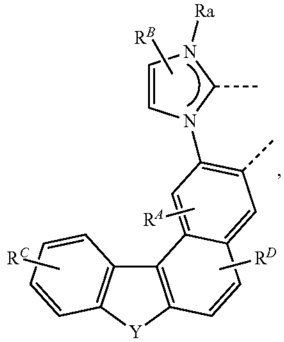
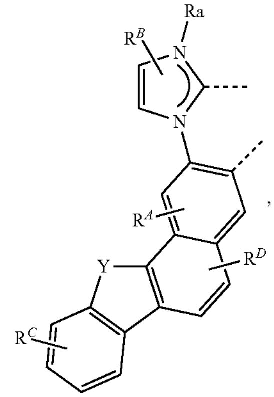
-continued
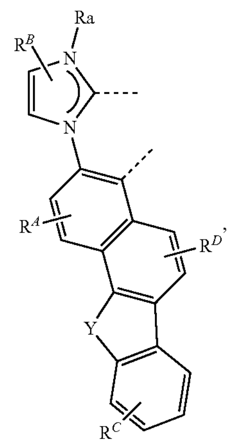
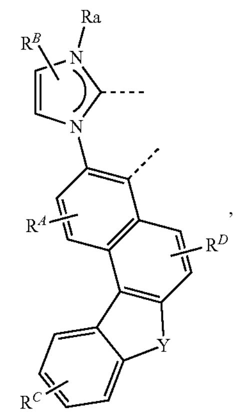
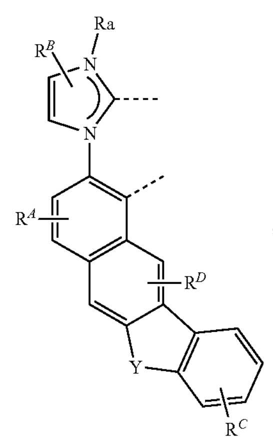
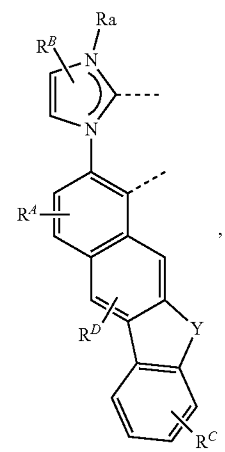
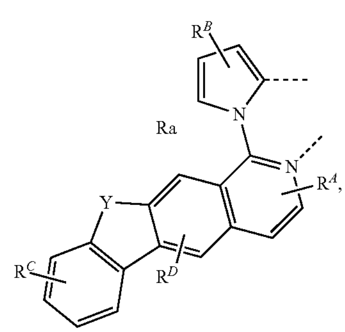
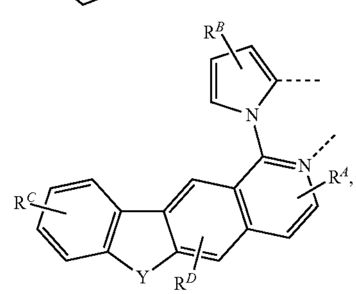

-continued
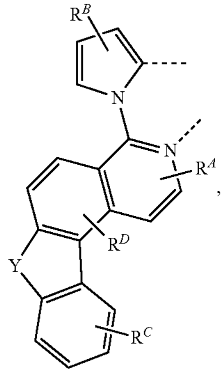
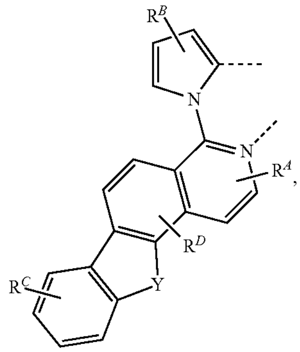
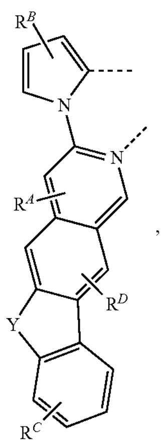
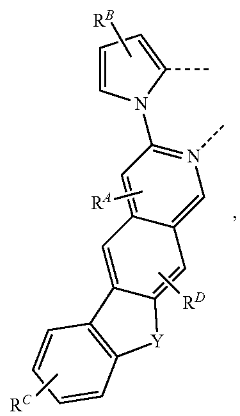
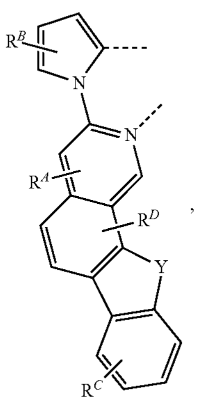
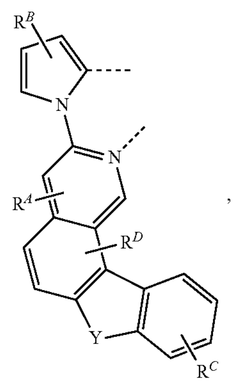
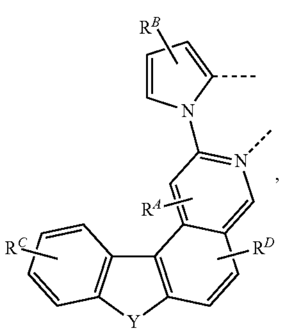
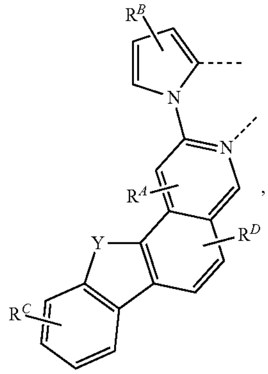
-continued
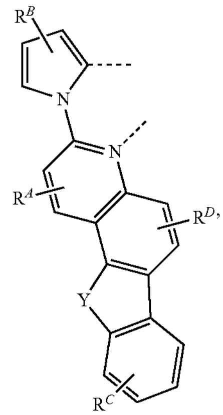
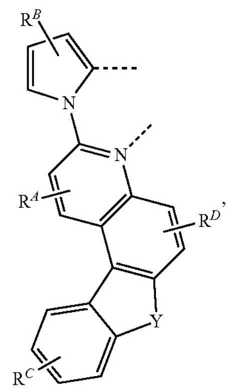
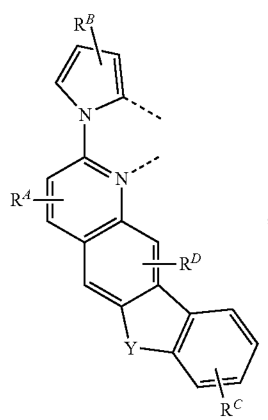
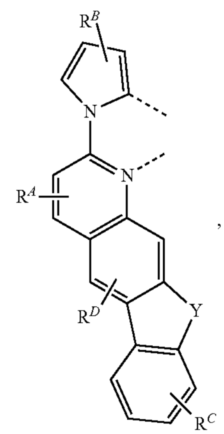
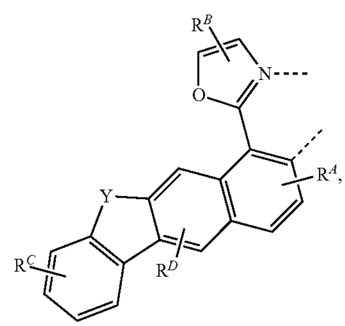
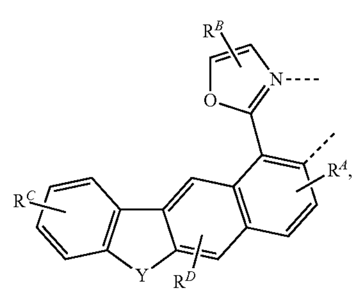

-continued
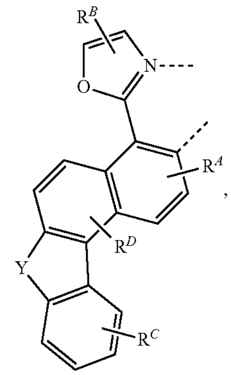
,
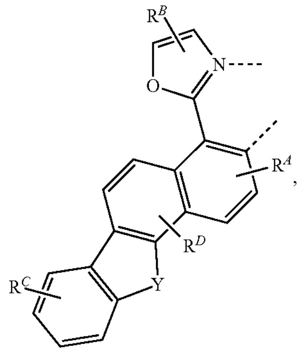
,
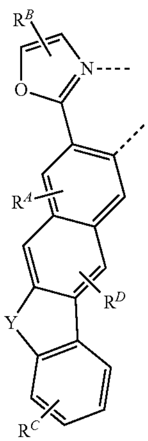
,
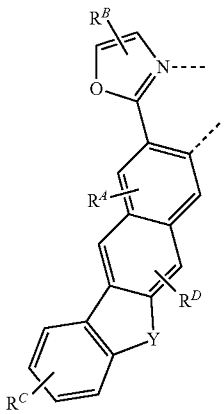
,
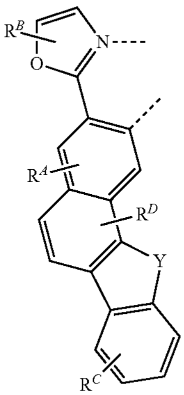
,
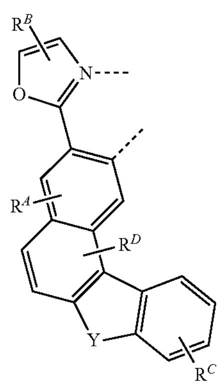
,
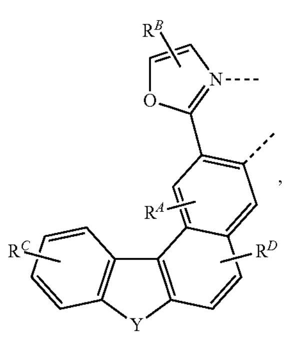
,
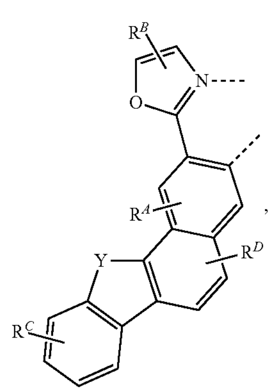
,
-continued
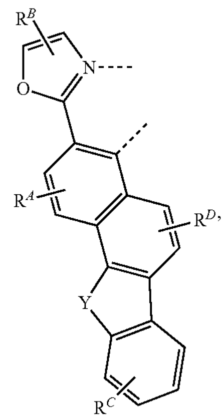
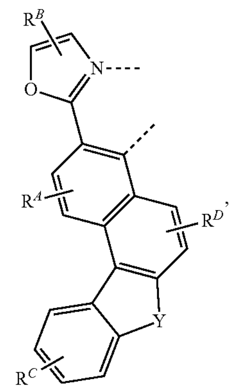
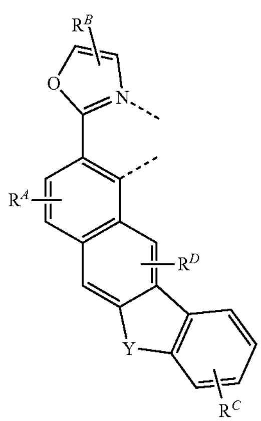
,
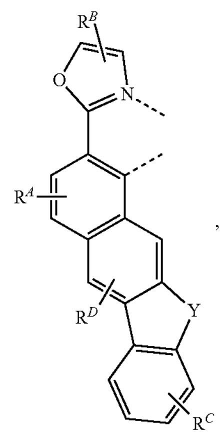
,
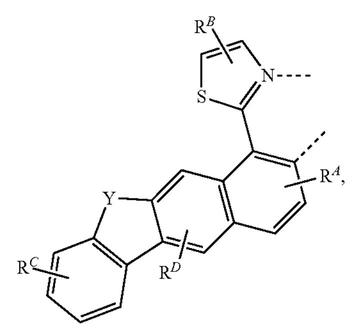
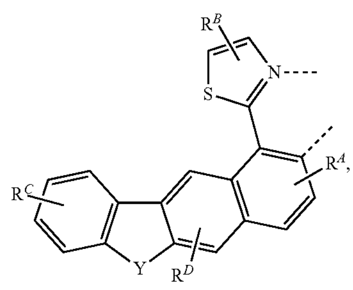

-continued
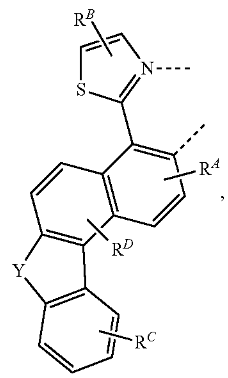
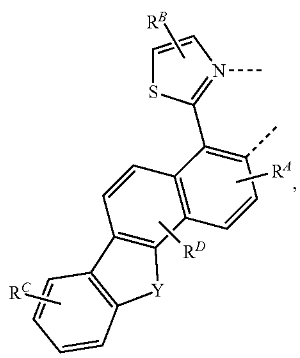
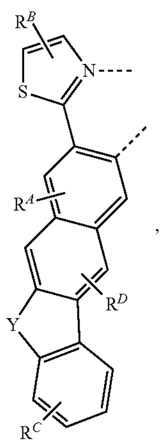
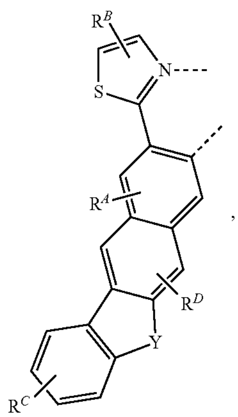
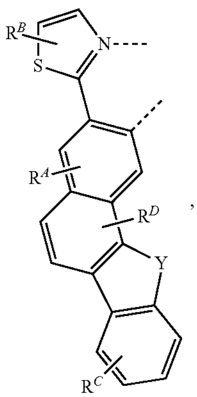
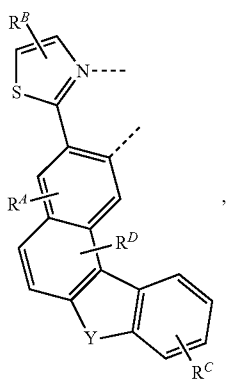
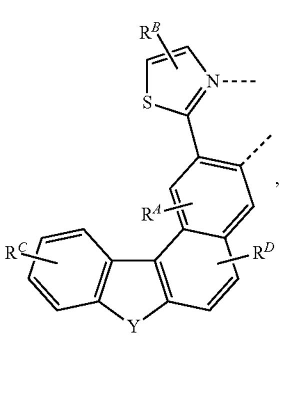
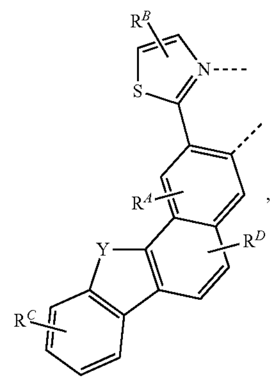
-continued
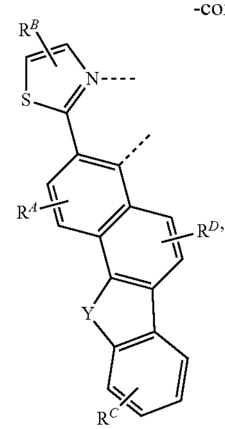
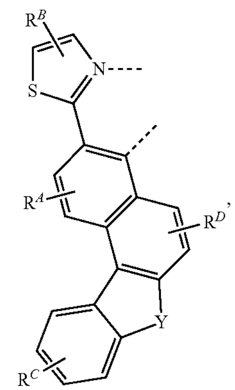
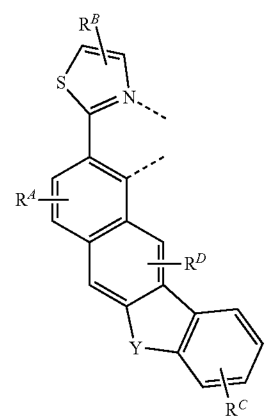
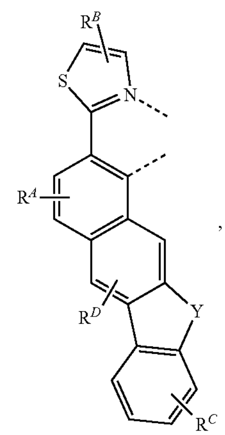
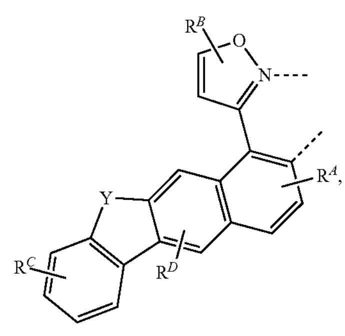
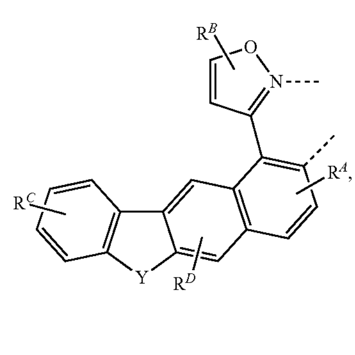

-continued
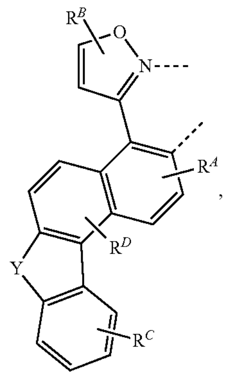
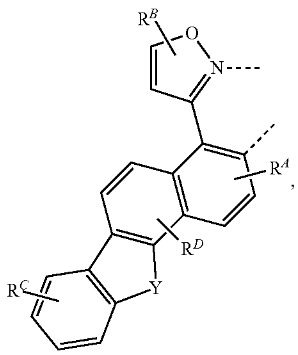
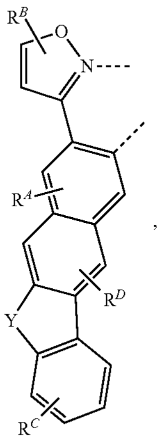
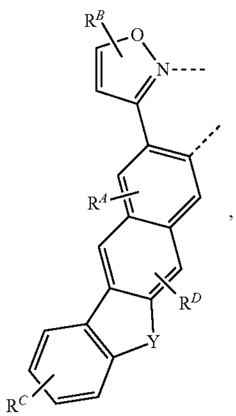
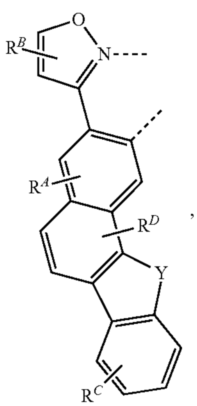
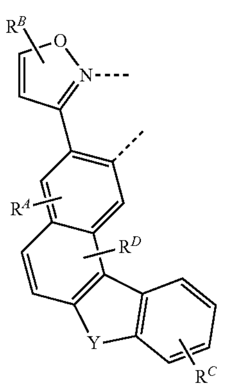
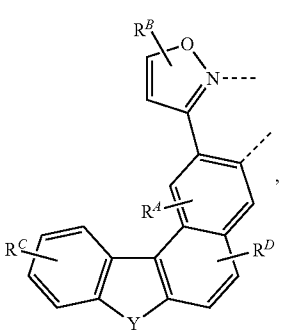
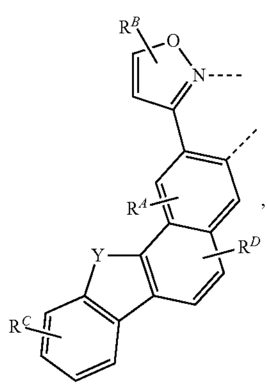
-continued
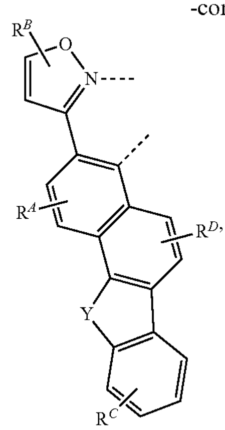
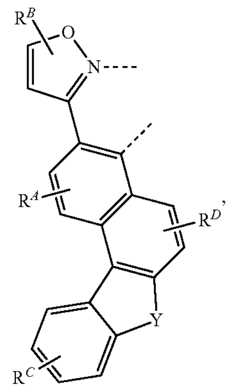
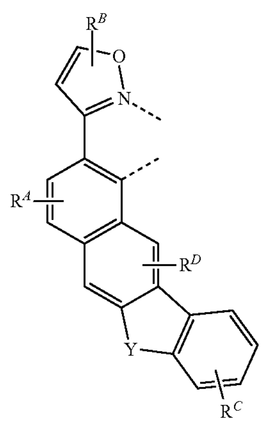
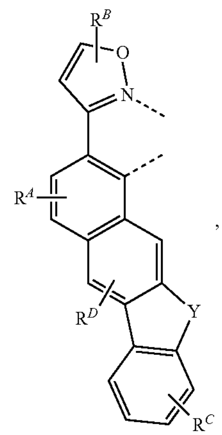
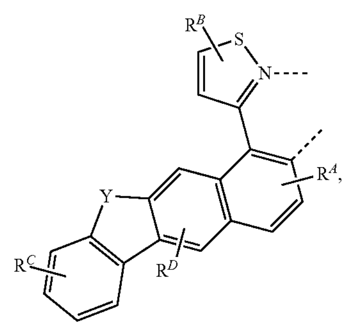
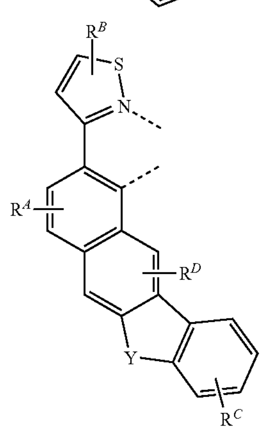
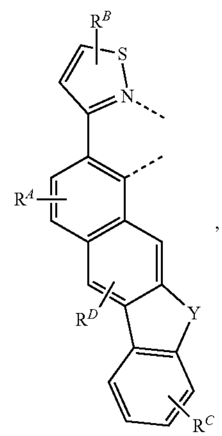

-continued
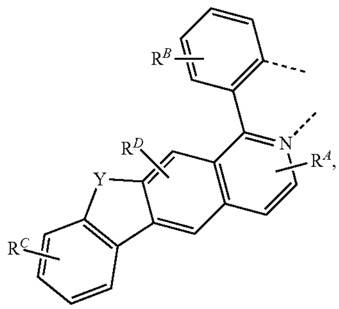
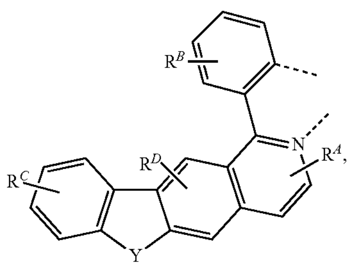
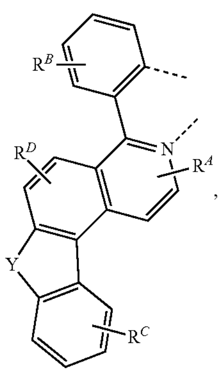
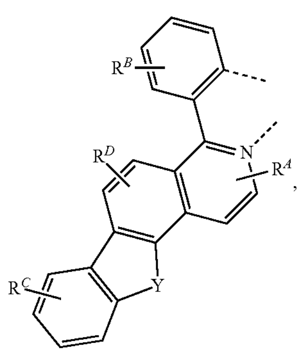
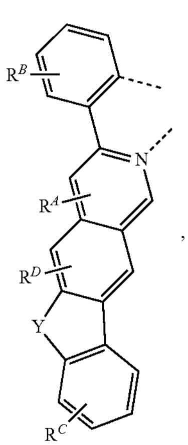
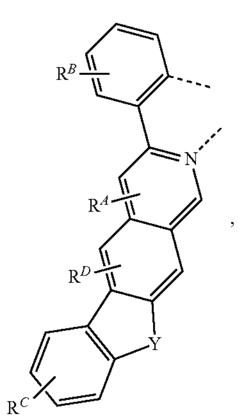
-continued
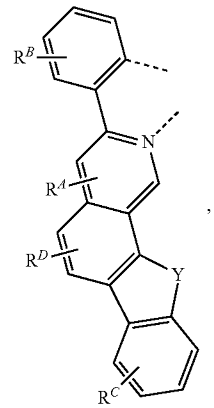
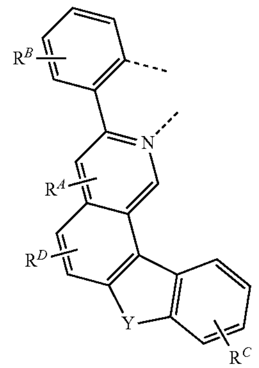
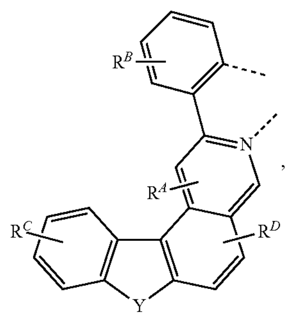
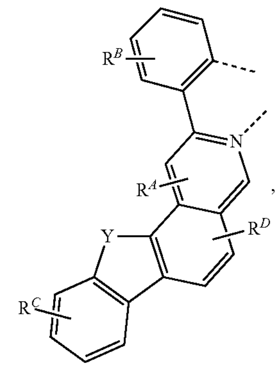
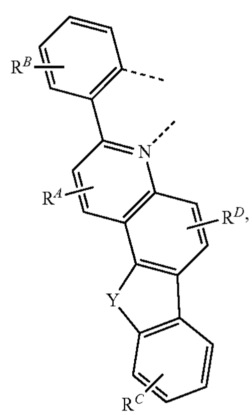
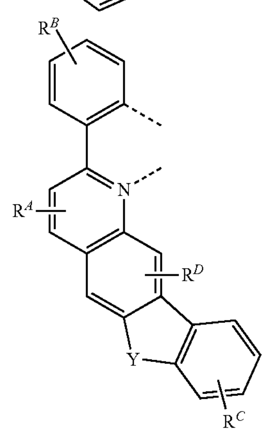
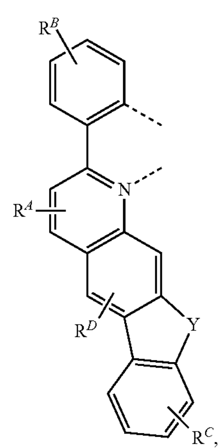
and aza variants thereof; and
wherein Ra is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In some embodiments, the first ligand $L_A$ is selected from the group consisting of $L_{A1}$ through $L_{A4780}$, wherein $L_{A1}$ through $L_{A240}$ have a structure of Formula II:

Formula II

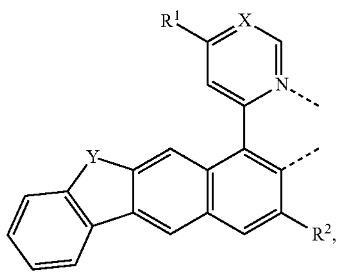

wherein $R^1$, $R^2$, X, and Y are defined as:

| Ligand | $R^1$ | $R^2$ | X | Y |
|---|---|---|---|---|
| $L_{A1}$ | H | H | C | S |
| $L_{A2}$ | $R_{B1}$ | H | C | S |
| $L_{A3}$ | $R_{B3}$ | H | C | S |
| $L_{A4}$ | $R_{B4}$ | H | C | S |
| $L_{A5}$ | $R_{B7}$ | H | C | S |
| $L_{A6}$ | $R_{B10}$ | H | C | S |
| $L_{A7}$ | $R_{A3}$ | H | C | S |
| $L_{A8}$ | $R_{A34}$ | H | C | S |
| $L_{A9}$ | H | H | C | O |
| $L_{A10}$ | $R_{B1}$ | H | C | O |
| $L_{A11}$ | $R_{B3}$ | H | C | O |
| $L_{A12}$ | $R_{B4}$ | H | C | O |
| $L_{A13}$ | $R_{B7}$ | H | C | O |
| $L_{A14}$ | $R_{B10}$ | H | C | O |
| $L_{A15}$ | $R_{A3}$ | H | C | O |
| $L_{A16}$ | $R_{A34}$ | H | C | O |
| $L_{A17}$ | H | H | C | $NCH_3$ |
| $L_{A18}$ | $R_{B1}$ | H | C | $NCH_3$ |
| $L_{A19}$ | $R_{B3}$ | H | C | $NCH_3$ |
| $L_{A20}$ | $R_{B4}$ | H | C | $NCH_3$ |
| $L_{A21}$ | $R_{B7}$ | H | C | $NCH_3$ |
| $L_{A22}$ | $R_{B10}$ | H | C | $NCH_3$ |
| $L_{A23}$ | $R_{A3}$ | H | C | $NCH_3$ |
| $L_{A24}$ | $R_{A34}$ | H | C | $NCH_3$ |
| $L_{A25}$ | H | H | C | $C(CH_3)_2$ |
| $L_{A26}$ | $R_{B1}$ | H | C | $C(CH_3)_2$ |
| $L_{A27}$ | $R_{B3}$ | H | C | $C(CH_3)_2$ |
| $L_{A28}$ | $R_{B4}$ | H | C | $C(CH_3)_2$ |
| $L_{A29}$ | $R_{B7}$ | H | C | $C(CH_3)_2$ |
| $L_{A30}$ | $R_{B10}$ | H | C | $C(CH_3)_2$ |
| $L_{A31}$ | $R_{A3}$ | H | C | $C(CH_3)_2$ |
| $L_{A32}$ | $R_{A34}$ | H | C | $C(CH_3)_2$ |
| $L_{A33}$ | H | H | C | $Si(CH_3)_2$ |
| $L_{A34}$ | $R_{B1}$ | H | C | $Si(CH_3)_2$ |
| $L_{A35}$ | $R_{B3}$ | H | C | $Si(CH_3)_2$ |
| $L_{A36}$ | $R_{B4}$ | H | C | $Si(CH_3)_2$ |
| $L_{A37}$ | $R_{B7}$ | H | C | $Si(CH_3)_2$ |
| $L_{A38}$ | $R_{B10}$ | H | C | $Si(CH_3)_2$ |
| $L_{A39}$ | $R_{A3}$ | H | C | $Si(CH_3)_2$ |
| $L_{A40}$ | $R_{A34}$ | H | C | $Si(CH_3)_2$ |
| $L_{A41}$ | H | $R_{B1}$ | C | S |
| $L_{A42}$ | $R_{B1}$ | $R_{B1}$ | C | S |
| $L_{A43}$ | $R_{B3}$ | $R_{B1}$ | C | S |
| $L_{A44}$ | $R_{B4}$ | $R_{B1}$ | C | S |
| $L_{A45}$ | $R_{B7}$ | $R_{B1}$ | C | S |
| $L_{A46}$ | $R_{B10}$ | $R_{B1}$ | C | S |
| $L_{A47}$ | $R_{A3}$ | $R_{B1}$ | C | S |
| $L_{A48}$ | $R_{A34}$ | $R_{B1}$ | C | S |
| $L_{A49}$ | H | $R_{B1}$ | C | O |

-continued

| Ligand | $R^1$ | $R^2$ | X | Y |
|---|---|---|---|---|
| $L_{A50}$ | $R_{B1}$ | $R_{B1}$ | C | O |
| $L_{A51}$ | $R_{B3}$ | $R_{B1}$ | C | O |
| $L_{A52}$ | $R_{B4}$ | $R_{B1}$ | C | O |
| $L_{A53}$ | $R_{B7}$ | $R_{B1}$ | C | O |
| $L_{A54}$ | $R_{B10}$ | $R_{B1}$ | C | O |
| $L_{A55}$ | $R_{A3}$ | $R_{B1}$ | C | O |
| $L_{A56}$ | $R_{A34}$ | $R_{B1}$ | C | O |
| $L_{A57}$ | H | $R_{B1}$ | C | $NCH_3$ |
| $L_{A58}$ | $R_{B1}$ | $R_{B1}$ | C | $NCH_3$ |
| $L_{A59}$ | $R_{B3}$ | $R_{B1}$ | C | $NCH_3$ |
| $L_{A60}$ | $R_{B4}$ | $R_{B1}$ | C | $NCH_3$ |
| $L_{A61}$ | $R_{B7}$ | $R_{B1}$ | C | $NCH_3$ |
| $L_{A62}$ | $R_{B10}$ | $R_{B1}$ | C | $NCH_3$ |
| $L_{A63}$ | $R_{A3}$ | $R_{B1}$ | C | $NCH_3$ |
| $L_{A64}$ | $R_{A34}$ | $R_{B1}$ | C | $NCH_3$ |
| $L_{A65}$ | H | $R_{B1}$ | C | $C(CH_3)_2$ |
| $L_{A66}$ | $R_{B1}$ | $R_{B1}$ | C | $C(CH_3)_2$ |
| $L_{A67}$ | $R_{B3}$ | $R_{B1}$ | C | $C(CH_3)_2$ |
| $L_{A68}$ | $R_{B4}$ | $R_{B1}$ | C | $C(CH_3)_2$ |
| $L_{A69}$ | $R_{B7}$ | $R_{B1}$ | C | $C(CH_3)_2$ |
| $L_{A70}$ | $R_{B10}$ | $R_{B1}$ | C | $C(CH_3)_2$ |
| $L_{A71}$ | $R_{A3}$ | $R_{B1}$ | C | $C(CH_3)_2$ |
| $L_{A72}$ | $R_{A34}$ | $R_{B1}$ | C | $C(CH_3)_2$ |
| $L_{A73}$ | H | $R_{B1}$ | C | $Si(CH_3)_2$ |
| $L_{A74}$ | $R_{B1}$ | $R_{B1}$ | C | $Si(CH_3)_2$ |
| $L_{A75}$ | $R_{B3}$ | $R_{B1}$ | C | $Si(CH_3)_2$ |
| $L_{A76}$ | $R_{B4}$ | $R_{B1}$ | C | $Si(CH_3)_2$ |
| $L_{A77}$ | $R_{B7}$ | $R_{B1}$ | C | $Si(CH_3)_2$ |
| $L_{A78}$ | $R_{B10}$ | $R_{B1}$ | C | $Si(CH_3)_2$ |
| $L_{A79}$ | $R_{A3}$ | $R_{B1}$ | C | $Si(CH_3)_2$ |
| $L_{A80}$ | $R_{A34}$ | $R_{B1}$ | C | $Si(CH_3)_2$ |
| $L_{A81}$ | H | $R_{B2}$ | C | S |
| $L_{A82}$ | $R_{B1}$ | $R_{B2}$ | C | S |
| $L_{A83}$ | $R_{B3}$ | $R_{B2}$ | C | S |
| $L_{A84}$ | $R_{B4}$ | $R_{B2}$ | C | S |
| $L_{A85}$ | $R_{B7}$ | $R_{B2}$ | C | S |
| $L_{A86}$ | $R_{B10}$ | $R_{B2}$ | C | S |
| $L_{A87}$ | $R_{A3}$ | $R_{B2}$ | C | S |
| $L_{A88}$ | $R_{A34}$ | $R_{B2}$ | C | S |
| $L_{A89}$ | H | $R_{B2}$ | C | O |
| $L_{A90}$ | $R_{B1}$ | $R_{B2}$ | C | O |
| $L_{A91}$ | $R_{B3}$ | $R_{B2}$ | C | O |
| $L_{A92}$ | $R_{B4}$ | $R_{B2}$ | C | O |
| $L_{A93}$ | $R_{B7}$ | $R_{B2}$ | C | O |
| $L_{A94}$ | $R_{B10}$ | $R_{B2}$ | C | O |
| $L_{A95}$ | $R_{A3}$ | $R_{B2}$ | C | O |
| $L_{A96}$ | $R_{A34}$ | $R_{B2}$ | C | O |
| $L_{A97}$ | H | $R_{B2}$ | C | $NCH_3$ |
| $L_{A98}$ | $R_{B1}$ | $R_{B2}$ | C | $NCH_3$ |
| $L_{A99}$ | $R_{B3}$ | $R_{B2}$ | C | $NCH_3$ |
| $L_{A100}$ | $R_{B4}$ | $R_{B2}$ | C | $NCH_3$ |
| $L_{A101}$ | $R_{B7}$ | $R_{B2}$ | C | $NCH_3$ |
| $L_{A102}$ | $R_{B10}$ | $R_{B2}$ | C | $NCH_3$ |
| $L_{A103}$ | $R_{A3}$ | $R_{B2}$ | C | $NCH_3$ |
| $L_{A104}$ | $R_{A34}$ | $R_{B2}$ | C | $NCH_3$ |
| $L_{A105}$ | H | $R_{B2}$ | C | $C(CH_3)_2$ |
| $L_{A106}$ | $R_{B1}$ | $R_{B2}$ | C | $C(CH_3)_2$ |
| $L_{A107}$ | $R_{B3}$ | $R_{B2}$ | C | $C(CH_3)_2$ |
| $L_{A108}$ | $R_{B4}$ | $R_{B2}$ | C | $C(CH_3)_2$ |
| $L_{A109}$ | $R_{B7}$ | $R_{B2}$ | C | $C(CH_3)_2$ |
| $L_{A110}$ | $R_{B10}$ | $R_{B2}$ | C | $C(CH_3)_2$ |
| $L_{A111}$ | $R_{A3}$ | $R_{B2}$ | C | $C(CH_3)_2$ |
| $L_{A112}$ | $R_{A34}$ | $R_{B2}$ | C | $C(CH_3)_2$ |
| $L_{A113}$ | H | $R_{B2}$ | C | $Si(CH_3)_2$ |
| $L_{A114}$ | $R_{B1}$ | $R_{B2}$ | C | $Si(CH_3)_2$ |
| $L_{A115}$ | $R_{B3}$ | $R_{B2}$ | C | $Si(CH_3)_2$ |
| $L_{A116}$ | $R_{B4}$ | $R_{B2}$ | C | $Si(CH_3)_2$ |
| $L_{A117}$ | $R_{B7}$ | $R_{B2}$ | C | $Si(CH_3)_2$ |
| $L_{A118}$ | $R_{B10}$ | $R_{B2}$ | C | $Si(CH_3)_2$ |
| $L_{A119}$ | $R_{A3}$ | $R_{B2}$ | C | $Si(CH_3)_2$ |
| $L_{A120}$ | $R_{A34}$ | $R_{B2}$ | C | $Si(CH_3)_2$ |
| $L_{A121}$ | H | H | N | S |
| $L_{A122}$ | $R_{B1}$ | H | N | S |
| $L_{A123}$ | $R_{B3}$ | H | N | S |
| $L_{A124}$ | $R_{B4}$ | H | N | S |
| $L_{A125}$ | $R_{B7}$ | H | N | S |
| $L_{A126}$ | $R_{B10}$ | H | N | S |

-continued

| Ligand | $R^1$ | $R^2$ | X | Y |
|---|---|---|---|---|
| $L_{A127}$ | $R_{A3}$ | H | N | S |
| $L_{A128}$ | $R_{A34}$ | H | N | S |
| $L_{A129}$ | H | H | N | O |
| $L_{A130}$ | $R_{B1}$ | H | N | O |
| $L_{A131}$ | $R_{B3}$ | H | N | O |
| $L_{A132}$ | $R_{B4}$ | H | N | O |
| $L_{A133}$ | $R_{B7}$ | H | N | O |
| $L_{A134}$ | $R_{B10}$ | H | N | O |
| $L_{A135}$ | $R_{A3}$ | H | N | O |
| $L_{A136}$ | $R_{A34}$ | H | N | O |
| $L_{A137}$ | H | H | N | $NCH_3$ |
| $L_{A138}$ | $R_{B1}$ | H | N | $NCH_3$ |
| $L_{A139}$ | $R_{B3}$ | H | N | $NCH_3$ |
| $L_{A140}$ | $R_{B4}$ | H | N | $NCH_3$ |
| $L_{A141}$ | $R_{B7}$ | H | N | $NCH_3$ |
| $L_{A142}$ | $R_{B10}$ | H | N | $NCH_3$ |
| $L_{A143}$ | $R_{A3}$ | H | N | $NCH_3$ |
| $L_{A144}$ | $R_{A34}$ | H | N | $NCH_3$ |
| $L_{A145}$ | H | H | N | $C(CH_3)_2$ |
| $L_{A146}$ | $R_{B1}$ | H | N | $C(CH_3)_2$ |
| $L_{A147}$ | $R_{B3}$ | H | N | $C(CH_3)_2$ |
| $L_{A148}$ | $R_{B4}$ | H | N | $C(CH_3)_2$ |
| $L_{A149}$ | $R_{B7}$ | H | N | $C(CH_3)_2$ |
| $L_{A150}$ | $R_{B10}$ | H | N | $C(CH_3)_2$ |
| $L_{A151}$ | $R_{A3}$ | H | N | $C(CH_3)_2$ |
| $L_{A152}$ | $R_{A34}$ | H | N | $C(CH_3)_2$ |
| $L_{A153}$ | H | H | N | $Si(CH_3)_2$ |
| $L_{A154}$ | $R_{B1}$ | H | N | $Si(CH_3)_2$ |
| $L_{A155}$ | $R_{B3}$ | H | N | $Si(CH_3)_2$ |
| $L_{A156}$ | $R_{B4}$ | H | N | $Si(CH_3)_2$ |
| $L_{A157}$ | $R_{B7}$ | H | N | $Si(CH_3)_2$ |
| $L_{A158}$ | $R_{B10}$ | H | N | $Si(CH_3)_2$ |
| $L_{A159}$ | $R_{A3}$ | H | N | $Si(CH_3)_2$ |
| $L_{A160}$ | $R_{A34}$ | H | N | $Si(CH_3)_2$ |
| $L_{A161}$ | H | $R_{B1}$ | N | S |
| $L_{A162}$ | $R_{B1}$ | $R_{B1}$ | N | S |
| $L_{A163}$ | $R_{B3}$ | $R_{B1}$ | N | S |
| $L_{A164}$ | $R_{B4}$ | $R_{B1}$ | N | S |
| $L_{A165}$ | $R_{B7}$ | $R_{B1}$ | N | S |
| $L_{A166}$ | $R_{B10}$ | $R_{B1}$ | N | S |
| $L_{A167}$ | $R_{A3}$ | $R_{B1}$ | N | S |
| $L_{A168}$ | $R_{A34}$ | $R_{B1}$ | N | S |
| $L_{A169}$ | H | $R_{B1}$ | N | O |
| $L_{A170}$ | $R_{B1}$ | $R_{B1}$ | N | O |
| $L_{A171}$ | $R_{B3}$ | $R_{B1}$ | N | O |
| $L_{A172}$ | $R_{B4}$ | $R_{B1}$ | N | O |
| $L_{A173}$ | $R_{B7}$ | $R_{B1}$ | N | O |
| $L_{A174}$ | $R_{B10}$ | $R_{B1}$ | N | O |
| $L_{A175}$ | $R_{A3}$ | $R_{B1}$ | N | O |
| $L_{A176}$ | $R_{A34}$ | $R_{B1}$ | N | O |
| $L_{A177}$ | H | $R_{B1}$ | N | $NCH_3$ |
| $L_{A178}$ | $R_{B1}$ | $R_{B1}$ | N | $NCH_3$ |
| $L_{A179}$ | $R_{B3}$ | $R_{B1}$ | N | $NCH_3$ |
| $L_{A180}$ | $R_{B4}$ | $R_{B1}$ | N | $NCH_3$ |
| $L_{A181}$ | $R_{B7}$ | $R_{B1}$ | N | $NCH_3$ |
| $L_{A182}$ | $R_{B10}$ | $R_{B1}$ | N | $NCH_3$ |
| $L_{A183}$ | $R_{A3}$ | $R_{B1}$ | N | $NCH_3$ |
| $L_{A184}$ | $R_{A34}$ | $R_{B1}$ | N | $NCH_3$ |
| $L_{A185}$ | H | $R_{B1}$ | N | $C(CH_3)_2$ |
| $L_{A186}$ | $R_{B1}$ | $R_{B1}$ | N | $C(CH_3)_2$ |
| $L_{A187}$ | $R_{B3}$ | $R_{B1}$ | N | $C(CH_3)_2$ |
| $L_{A188}$ | $R_{B4}$ | $R_{B1}$ | N | $C(CH_3)_2$ |
| $L_{A189}$ | $R_{B7}$ | $R_{B1}$ | N | $C(CH_3)_2$ |
| $L_{A190}$ | $R_{B10}$ | $R_{B1}$ | N | $C(CH_3)_2$ |
| $L_{A191}$ | $R_{A3}$ | $R_{B1}$ | N | $C(CH_3)_2$ |
| $L_{A192}$ | $R_{A34}$ | $R_{B1}$ | N | $C(CH_3)_2$ |
| $L_{A193}$ | H | $R_{B1}$ | N | $Si(CH_3)_2$ |
| $L_{A194}$ | $R_{B1}$ | $R_{B1}$ | N | $Si(CH_3)_2$ |
| $L_{A195}$ | $R_{B3}$ | $R_{B1}$ | N | $Si(CH_3)_2$ |
| $L_{A196}$ | $R_{B4}$ | $R_{B1}$ | N | $Si(CH_3)_2$ |
| $L_{A197}$ | $R_{B7}$ | $R_{B1}$ | N | $Si(CH_3)_2$ |
| $L_{A198}$ | $R_{B10}$ | $R_{B1}$ | N | $Si(CH_3)_2$ |
| $L_{A199}$ | $R_{A3}$ | $R_{B1}$ | N | $Si(CH_3)_2$ |
| $L_{A200}$ | $R_{A34}$ | $R_{B1}$ | N | $Si(CH_3)_2$ |
| $L_{A201}$ | H | $R_{B2}$ | N | S |
| $L_{A202}$ | $R_{B1}$ | $R_{B2}$ | N | S |
| $L_{A203}$ | $R_{B3}$ | $R_{B2}$ | N | S |

-continued

| Ligand | $R^1$ | $R^2$ | X | Y |
|---|---|---|---|---|
| $L_{A204}$ | $R_{B4}$ | $R_{B2}$ | N | S |
| $L_{A205}$ | $R_{B7}$ | $R_{B2}$ | N | S |
| $L_{A206}$ | $R_{B10}$ | $R_{B2}$ | N | S |
| $L_{A207}$ | $R_{A3}$ | $R_{B2}$ | N | S |
| $L_{A208}$ | $R_{A34}$ | $R_{B2}$ | N | S |
| $L_{A209}$ | H | $R_{B2}$ | N | O |
| $L_{A210}$ | $R_{B1}$ | $R_{B2}$ | N | O |
| $L_{A211}$ | $R_{B3}$ | $R_{B2}$ | N | O |
| $L_{A212}$ | $R_{B4}$ | $R_{B2}$ | N | O |
| $L_{A213}$ | $R_{B7}$ | $R_{B2}$ | N | O |
| $L_{A214}$ | $R_{B10}$ | $R_{B2}$ | N | O |
| $L_{A215}$ | $R_{A3}$ | $R_{B2}$ | N | O |
| $L_{A216}$ | $R_{A34}$ | $R_{B2}$ | N | O |
| $L_{A217}$ | H | $R_{B2}$ | N | $NCH_3$ |
| $L_{A218}$ | $R_{B1}$ | $R_{B2}$ | N | $NCH_3$ |
| $L_{A219}$ | $R_{B3}$ | $R_{B2}$ | N | $NCH_3$ |
| $L_{A220}$ | $R_{B4}$ | $R_{B2}$ | N | $NCH_3$ |
| $L_{A221}$ | $R_{B7}$ | $R_{B2}$ | N | $NCH_3$ |
| $L_{A222}$ | $R_{B10}$ | $R_{B2}$ | N | $NCH_3$ |
| $L_{A223}$ | $R_{A3}$ | $R_{B2}$ | N | $NCH_3$ |
| $L_{A224}$ | $R_{A34}$ | $R_{B2}$ | N | $NCH_3$ |
| $L_{A225}$ | H | $R_{B2}$ | N | $C(CH_3)_2$ |
| $L_{A226}$ | $R_{B1}$ | $R_{B2}$ | N | $C(CH_3)_2$ |
| $L_{A227}$ | $R_{B3}$ | $R_{B2}$ | N | $C(CH_3)_2$ |
| $L_{A228}$ | $R_{B4}$ | $R_{B2}$ | N | $C(CH_3)_2$ |
| $L_{A229}$ | $R_{B7}$ | $R_{B2}$ | N | $C(CH_3)_2$ |
| $L_{A230}$ | $R_{B10}$ | $R_{B2}$ | N | $C(CH_3)_2$ |
| $L_{A231}$ | $R_{A3}$ | $R_{B2}$ | N | $C(CH_3)_2$ |
| $L_{A232}$ | $R_{A34}$ | $R_{B2}$ | N | $C(CH_3)_2$ |
| $L_{A233}$ | H | $R_{B2}$ | N | $Si(CH_3)_2$ |
| $L_{A234}$ | $R_{B1}$ | $R_{B2}$ | N | $Si(CH_3)_2$ |
| $L_{A235}$ | $R_{B3}$ | $R_{B2}$ | N | $Si(CH_3)_2$ |
| $L_{A236}$ | $R_{B4}$ | $R_{B2}$ | N | $Si(CH_3)_2$ |
| $L_{A237}$ | $R_{B7}$ | $R_{B2}$ | N | $Si(CH_3)_2$ |
| $L_{A238}$ | $R_{B10}$ | $R_{B2}$ | N | $Si(CH_3)_2$ |
| $L_{A239}$ | $R_{A3}$ | $R_{B2}$ | N | $Si(CH_3)_2$ |
| $L_{A240}$ | $R_{A34}$ | $R_{B2}$ | N | $Si(CH_3)_2$ |

wherein $L_{A241}$ through $L_{A360}$ have a structure of Formula III:

Formula III

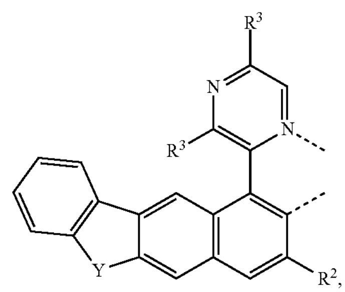

wherein $R^2$, $R^3$ and Y are defined as provided below:

| Ligand | $R^2$ | $R^3$ | Y |
|---|---|---|---|
| $L_{A241}$ | H | H | S |
| $L_{A242}$ | H | $R_{B1}$ | S |
| $L_{A243}$ | H | $R_{B2}$ | S |
| $L_{A244}$ | H | $R_{B3}$ | S |
| $L_{A245}$ | H | $R_{B4}$ | S |
| $L_{A246}$ | H | $R_{B5}$ | S |
| $L_{A247}$ | H | $R_{A34}$ | S |
| $L_{A248}$ | H | $R_{A52}$ | S |
| $L_{A249}$ | H | H | O |
| $L_{A250}$ | H | $R_{B1}$ | O |
| $L_{A251}$ | H | $R_{B2}$ | O |
| $L_{A252}$ | H | $R_{B3}$ | O |
| $L_{A253}$ | H | $R_{B4}$ | O |

-continued

| Ligand | $R^2$ | $R^3$ | Y |
|---|---|---|---|
| $L_{A254}$ | H | $R_{B5}$ | O |
| $L_{A255}$ | H | $R_{A34}$ | O |
| $L_{A256}$ | H | $R_{A52}$ | O |
| $L_{A257}$ | H | H | $NCH_3$ |
| $L_{A258}$ | H | $R_{B1}$ | $NCH_3$ |
| $L_{A259}$ | H | $R_{B2}$ | $NCH_3$ |
| $L_{A260}$ | H | $R_{B3}$ | $NCH_3$ |
| $L_{A261}$ | H | $R_{B4}$ | $NCH_3$ |
| $L_{A262}$ | H | $R_{B5}$ | $NCH_3$ |
| $L_{A263}$ | H | $R_{A34}$ | $NCH_3$ |
| $L_{A264}$ | H | $R_{A52}$ | $NCH_3$ |
| $L_{A265}$ | H | H | $C(CH_3)_2$ |
| $L_{A266}$ | H | $R_{B1}$ | $C(CH_3)_2$ |
| $L_{A267}$ | H | $R_{B2}$ | $C(CH_3)_2$ |
| $L_{A268}$ | H | $R_{B3}$ | $C(CH_3)_2$ |
| $L_{A269}$ | H | $R_{B4}$ | $C(CH_3)_2$ |
| $L_{A270}$ | H | $R_{B5}$ | $C(CH_3)_2$ |
| $L_{A271}$ | H | $R_{A34}$ | $C(CH_3)_2$ |
| $L_{A272}$ | H | $R_{A52}$ | $C(CH_3)_2$ |
| $L_{A273}$ | H | H | $Si(CH_3)_2$ |
| $L_{A274}$ | H | $R_{B1}$ | $Si(CH_3)_2$ |
| $L_{A275}$ | H | $R_{B2}$ | $Si(CH_3)_2$ |
| $L_{A276}$ | H | $R_{B3}$ | $Si(CH_3)_2$ |
| $L_{A277}$ | H | $R_{B4}$ | $Si(CH_3)_2$ |
| $L_{A278}$ | H | $R_{B5}$ | $Si(CH_3)_2$ |
| $L_{A279}$ | H | $R_{A34}$ | $Si(CH_3)_2$ |
| $L_{A280}$ | H | $R_{A52}$ | $Si(CH_3)_2$ |
| $L_{A281}$ | $R_{B1}$ | H | S |
| $L_{A282}$ | $R_{B1}$ | $R_{B1}$ | S |
| $L_{A283}$ | $R_{B1}$ | $R_{B2}$ | S |
| $L_{A284}$ | $R_{B1}$ | $R_{B3}$ | S |
| $L_{A285}$ | $R_{B1}$ | $R_{B4}$ | S |
| $L_{A286}$ | $R_{B1}$ | $R_{B5}$ | S |
| $L_{A287}$ | $R_{B1}$ | $R_{A34}$ | S |
| $L_{A288}$ | $R_{B1}$ | $R_{A52}$ | S |
| $L_{A289}$ | $R_{B1}$ | H | O |
| $L_{A290}$ | $R_{B1}$ | $R_{B1}$ | O |
| $L_{A291}$ | $R_{B1}$ | $R_{B2}$ | O |
| $L_{A292}$ | $R_{B1}$ | $R_{B3}$ | O |
| $L_{A293}$ | $R_{B1}$ | $R_{B4}$ | O |
| $L_{A294}$ | $R_{B1}$ | $R_{B5}$ | O |
| $L_{A295}$ | $R_{B1}$ | $R_{A34}$ | O |
| $L_{A296}$ | $R_{B1}$ | $R_{A52}$ | O |
| $L_{A297}$ | $R_{B1}$ | H | $NCH_3$ |
| $L_{A298}$ | $R_{B1}$ | $R_{B1}$ | $NCH_3$ |
| $L_{A299}$ | $R_{B1}$ | $R_{B2}$ | $NCH_3$ |
| $L_{A300}$ | $R_{B1}$ | $R_{B3}$ | $NCH_3$ |
| $L_{A301}$ | $R_{B1}$ | $R_{B4}$ | $NCH_3$ |
| $L_{A302}$ | $R_{B1}$ | $R_{B5}$ | $NCH_3$ |
| $L_{A303}$ | $R_{B1}$ | $R_{A34}$ | $NCH_3$ |
| $L_{A304}$ | $R_{B1}$ | $R_{A52}$ | $NCH_3$ |
| $L_{A305}$ | $R_{B1}$ | H | $C(CH_3)_2$ |
| $L_{A306}$ | $R_{B1}$ | $R_{B1}$ | $C(CH_3)_2$ |
| $L_{A307}$ | $R_{B1}$ | $R_{B2}$ | $C(CH_3)_2$ |
| $L_{A308}$ | $R_{B1}$ | $R_{B3}$ | $C(CH_3)_2$ |
| $L_{A309}$ | $R_{B1}$ | $R_{B4}$ | $C(CH_3)_2$ |
| $L_{A310}$ | $R_{B1}$ | $R_{B5}$ | $C(CH_3)_2$ |
| $L_{A311}$ | $R_{B1}$ | $R_{A34}$ | $C(CH_3)_2$ |
| $L_{A312}$ | $R_{B1}$ | $R_{A52}$ | $C(CH_3)_2$ |
| $L_{A313}$ | $R_{B1}$ | H | $Si(CH_3)_2$ |
| $L_{A314}$ | $R_{B1}$ | $R_{B1}$ | $Si(CH_3)_2$ |
| $L_{A315}$ | $R_{B1}$ | $R_{B2}$ | $Si(CH_3)_2$ |
| $L_{A316}$ | $R_{B1}$ | $R_{B3}$ | $Si(CH_3)_2$ |
| $L_{A317}$ | $R_{B1}$ | $R_{B4}$ | $Si(CH_3)_2$ |
| $L_{A318}$ | $R_{B1}$ | $R_{B5}$ | $Si(CH_3)_2$ |
| $L_{A319}$ | $R_{B1}$ | $R_{A34}$ | $Si(CH_3)_2$ |
| $L_{A320}$ | $R_{B1}$ | $R_{A52}$ | $Si(CH_3)_2$ |
| $L_{A321}$ | $R_{B2}$ | H | S |
| $L_{A322}$ | $R_{B2}$ | $R_{B1}$ | S |
| $L_{A323}$ | $R_{B2}$ | $R_{B2}$ | S |
| $L_{A324}$ | $R_{B2}$ | $R_{B3}$ | S |
| $L_{A325}$ | $R_{B2}$ | $R_{B4}$ | S |
| $L_{A326}$ | $R_{B2}$ | $R_{B5}$ | S |
| $L_{A327}$ | $R_{B2}$ | $R_{A34}$ | S |
| $L_{A328}$ | $R_{B2}$ | $R_{A52}$ | S |
| $L_{A329}$ | $R_{B2}$ | H | O |
| $L_{A330}$ | $R_{B2}$ | $R_{B1}$ | O |

-continued

| Ligand | $R^2$ | $R^3$ | Y |
|---|---|---|---|
| $L_{A331}$ | $R_{B2}$ | $R_{B2}$ | O |
| $L_{A332}$ | $R_{B2}$ | $R_{B3}$ | O |
| $L_{A333}$ | $R_{B2}$ | $R_{B4}$ | O |
| $L_{A334}$ | $R_{B2}$ | $R_{B5}$ | O |
| $L_{A335}$ | $R_{B2}$ | $R_{A34}$ | O |
| $L_{A336}$ | $R_{B2}$ | $R_{A52}$ | O |
| $L_{A337}$ | $R_{B2}$ | H | $NCH_3$ |
| $L_{A338}$ | $R_{B2}$ | $R_{B1}$ | $NCH_3$ |
| $L_{A339}$ | $R_{B2}$ | $R_{B2}$ | $NCH_3$ |
| $L_{A340}$ | $R_{B2}$ | $R_{B3}$ | $NCH_3$ |
| $L_{A341}$ | $R_{B2}$ | $R_{B4}$ | $NCH_3$ |
| $L_{A342}$ | $R_{B2}$ | $R_{B5}$ | $NCH_3$ |
| $L_{A343}$ | $R_{B2}$ | $R_{A34}$ | $NCH_3$ |
| $L_{A344}$ | $R_{B2}$ | $R_{A52}$ | $NCH_3$ |
| $L_{A345}$ | $R_{B2}$ | H | $C(CH_3)_2$ |
| $L_{A346}$ | $R_{B2}$ | $R_{B1}$ | $C(CH_3)_2$ |
| $L_{A347}$ | $R_{B2}$ | $R_{B2}$ | $C(CH_3)_2$ |
| $L_{A348}$ | $R_{B2}$ | $R_{B3}$ | $C(CH_3)_2$ |
| $L_{A349}$ | $R_{B2}$ | $R_{B4}$ | $C(CH_3)_2$ |
| $L_{A350}$ | $R_{B2}$ | $R_{B5}$ | $C(CH_3)_2$ |
| $L_{A351}$ | $R_{B2}$ | $R_{A34}$ | $C(CH_3)_2$ |
| $L_{A352}$ | $R_{B2}$ | $R_{A52}$ | $C(CH_3)_2$ |
| $L_{A353}$ | $R_{B2}$ | H | $Si(CH_3)_2$ |
| $L_{A354}$ | $R_{B2}$ | $R_{B1}$ | $Si(CH_3)_2$ |
| $L_{A355}$ | $R_{B2}$ | $R_{B2}$ | $Si(CH_3)_2$ |
| $L_{A356}$ | $R_{B2}$ | $R_{B3}$ | $Si(CH_3)_2$ |
| $L_{A357}$ | $R_{B2}$ | $R_{B4}$ | $Si(CH_3)_2$ |
| $L_{A358}$ | $R_{B2}$ | $R_{B5}$ | $Si(CH_3)_2$ |
| $L_{A359}$ | $R_{B2}$ | $R_{A34}$ | $Si(CH_3)_2$ |
| $L_{A360}$ | $R_{B2}$ | $R_{A52}$ | $Si(CH_3)_2$ |

wherein $L_{A361}$ through $L_{A456}$ have a structure of Formula IV,

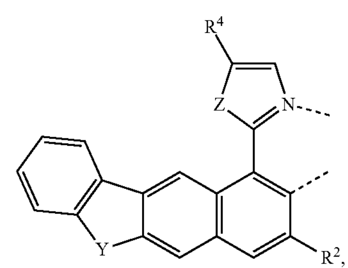

wherein $R^2$, $R^4$, Y, and X are defined as provided below:

| Ligand | $R^2$ | $R^4$ | Y | Z |
|---|---|---|---|---|
| $L_{A361}$ | H | H | S | S |
| $L_{A362}$ | H | $R_{B1}$ | S | S |
| $L_{A363}$ | H | $R_{B3}$ | S | S |
| $L_{A364}$ | H | $R_{B4}$ | S | S |
| $L_{A365}$ | H | $R_{B7}$ | S | S |
| $L_{A366}$ | H | $R_{B10}$ | S | S |
| $L_{A367}$ | H | $R_{A3}$ | S | S |
| $L_{A368}$ | H | $R_{A34}$ | S | S |
| $L_{A369}$ | H | H | S | O |
| $L_{A370}$ | H | $R_{B1}$ | S | O |
| $L_{A371}$ | H | $R_{B3}$ | S | O |
| $L_{A372}$ | H | $R_{B4}$ | S | O |
| $L_{A373}$ | H | $R_{B7}$ | S | O |
| $L_{A374}$ | H | $R_{B10}$ | S | O |
| $L_{A375}$ | H | $R_{A3}$ | S | O |
| $L_{A376}$ | H | $R_{A34}$ | S | O |
| $L_{A377}$ | H | H | S | $NCH_3$ |
| $L_{A378}$ | H | $R_{B1}$ | S | $NCH_3$ |
| $L_{A379}$ | H | $R_{B3}$ | S | $NCH_3$ |
| $L_{A380}$ | H | $R_{B4}$ | S | $NCH_3$ |
| $L_{A381}$ | H | $R_{B7}$ | S | $NCH_3$ |
| $L_{A382}$ | H | $R_{B10}$ | S | $NCH_3$ |

-continued

| Ligand | $R^2$ | $R^4$ | Y | Z |
|---|---|---|---|---|
| $L_{A383}$ | H | $R_{A3}$ | S | $NCH_3$ |
| $L_{A384}$ | H | $R_{A34}$ | S | $NCH_3$ |
| $L_{A385}$ | H | H | O | S |
| $L_{A386}$ | H | $R_{B1}$ | O | S |
| $L_{A387}$ | H | $R_{B3}$ | O | S |
| $L_{A388}$ | H | $R_{B4}$ | O | S |
| $L_{A389}$ | H | $R_{B7}$ | O | S |
| $L_{A390}$ | H | $R_{B10}$ | O | S |
| $L_{A391}$ | H | $R_{A3}$ | O | S |
| $L_{A392}$ | H | $R_{A34}$ | O | S |
| $L_{A393}$ | H | H | O | O |
| $L_{A394}$ | H | $R_{B1}$ | O | O |
| $L_{A395}$ | H | $R_{B3}$ | O | O |
| $L_{A396}$ | H | $R_{B4}$ | O | O |
| $L_{A397}$ | H | $R_{B7}$ | O | O |
| $L_{A398}$ | H | $R_{B10}$ | O | O |
| $L_{A399}$ | H | $R_{A3}$ | O | O |
| $L_{A400}$ | H | $R_{A34}$ | O | O |
| $L_{A401}$ | H | H | O | $NCH_3$ |
| $L_{A402}$ | H | $R_{B1}$ | O | $NCH_3$ |
| $L_{A403}$ | H | $R_{B3}$ | O | $NCH_3$ |
| $L_{A404}$ | H | $R_{B4}$ | O | $NCH_3$ |
| $L_{A405}$ | H | $R_{B7}$ | O | $NCH_3$ |
| $L_{A406}$ | H | $R_{B10}$ | O | $NCH_3$ |
| $L_{A407}$ | H | $R_{A3}$ | O | $NCH_3$ |
| $L_{A408}$ | H | $R_{A34}$ | O | $NCH_3$ |
| $L_{A409}$ | $R_{B1}$ | H | S | S |
| $L_{A410}$ | $R_{B1}$ | $R_{B1}$ | S | S |
| $L_{A411}$ | $R_{B1}$ | $R_{B3}$ | S | S |
| $L_{A412}$ | $R_{B1}$ | $R_{B4}$ | S | S |
| $L_{A413}$ | $R_{B1}$ | $R_{B7}$ | S | S |
| $L_{A414}$ | $R_{B1}$ | $R_{B10}$ | S | S |
| $L_{A415}$ | $R_{B1}$ | $R_{A3}$ | S | S |
| $L_{A416}$ | $R_{B1}$ | $R_{A34}$ | S | S |
| $L_{A417}$ | $R_{B1}$ | H | S | O |
| $L_{A418}$ | $R_{B1}$ | $R_{B1}$ | S | O |
| $L_{A419}$ | $R_{B1}$ | $R_{B3}$ | S | O |
| $L_{A420}$ | $R_{B1}$ | $R_{B4}$ | S | O |
| $L_{A421}$ | $R_{B1}$ | $R_{B7}$ | S | O |
| $L_{A422}$ | $R_{B1}$ | $R_{B10}$ | S | O |
| $L_{A423}$ | $R_{B1}$ | $R_{A3}$ | S | O |
| $L_{A424}$ | $R_{B1}$ | $R_{A34}$ | S | O |
| $L_{A425}$ | $R_{B1}$ | H | S | $NCH_3$ |
| $L_{A426}$ | $R_{B1}$ | $R_{B1}$ | S | $NCH_3$ |
| $L_{A427}$ | $R_{B1}$ | $R_{B3}$ | S | $NCH_3$ |
| $L_{A428}$ | $R_{B1}$ | $R_{B4}$ | S | $NCH_3$ |
| $L_{A429}$ | $R_{B1}$ | $R_{B7}$ | S | $NCH_3$ |
| $L_{A430}$ | $R_{B1}$ | $R_{B10}$ | S | $NCH_3$ |
| $L_{A431}$ | $R_{B1}$ | $R_{A3}$ | S | $NCH_3$ |
| $L_{A432}$ | $R_{B1}$ | $R_{A34}$ | S | $NCH_3$ |
| $L_{A433}$ | $R_{B1}$ | H | O | S |
| $L_{A434}$ | $R_{B1}$ | $R_{B1}$ | O | S |
| $L_{A435}$ | $R_{B1}$ | $R_{B3}$ | O | S |
| $L_{A436}$ | $R_{B1}$ | $R_{B4}$ | O | S |
| $L_{A437}$ | $R_{B1}$ | $R_{B7}$ | O | S |
| $L_{A438}$ | $R_{B1}$ | $R_{B10}$ | O | S |
| $L_{A439}$ | $R_{B1}$ | $R_{A3}$ | O | S |
| $L_{A440}$ | $R_{B1}$ | $R_{A34}$ | O | S |
| $L_{A441}$ | $R_{B1}$ | H | O | O |
| $L_{A442}$ | $R_{B1}$ | $R_{B1}$ | O | O |
| $L_{A443}$ | $R_{B1}$ | $R_{B3}$ | O | O |
| $L_{A444}$ | $R_{B1}$ | $R_{B4}$ | O | O |
| $L_{A445}$ | $R_{B1}$ | $R_{B7}$ | O | O |
| $L_{A446}$ | $R_{B1}$ | $R_{B10}$ | O | O |
| $L_{A447}$ | $R_{B1}$ | $R_{A3}$ | O | O |
| $L_{A448}$ | $R_{B1}$ | $R_{A34}$ | O | O |
| $L_{A449}$ | $R_{B1}$ | H | O | $NCH_3$ |
| $L_{A450}$ | $R_{B1}$ | $R_{B1}$ | O | $NCH_3$ |
| $L_{A451}$ | $R_{B1}$ | $R_{B3}$ | O | $NCH_3$ |
| $L_{A452}$ | $R_{B1}$ | $R_{B4}$ | O | $NCH_3$ |
| $L_{A453}$ | $R_{B1}$ | $R_{B7}$ | O | $NCH_3$ |
| $L_{A454}$ | $R_{B1}$ | $R_{B10}$ | O | $NCH_3$ |
| $L_{A455}$ | $R_{B1}$ | $R_{A3}$ | O | $NCH_3$ |
| $L_{A456}$ | $R_{B1}$ | $R_{A34}$ | O | $NCH_3$ |

wherein $L_{A457}$ through $L_{A696}$ have a structure of Formula V:

Formula V

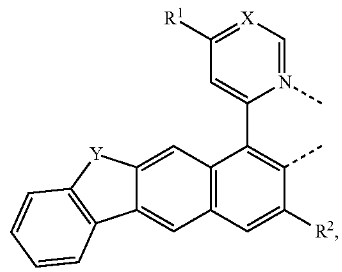

wherein $R^1$, $R^2$, X, and Y are defined as provided below:

| Ligand | $R^1$ | $R^2$ | X | Y |
|---|---|---|---|---|
| $L_{A457}$ | H | H | C | S |
| $L_{A458}$ | $R_{B1}$ | H | C | S |
| $L_{A459}$ | $R_{B3}$ | H | C | S |
| $L_{A460}$ | $R_{B4}$ | H | C | S |
| $L_{A461}$ | $R_{B7}$ | H | C | S |
| $L_{A462}$ | $R_{B10}$ | H | C | S |
| $L_{A463}$ | $R_{A3}$ | H | C | S |
| $L_{A464}$ | $R_{A34}$ | H | C | S |
| $L_{A465}$ | H | H | C | O |
| $L_{A466}$ | $R_{B1}$ | H | C | O |
| $L_{A467}$ | $R_{B3}$ | H | C | O |
| $L_{A468}$ | $R_{B4}$ | H | C | O |
| $L_{A469}$ | $R_{B7}$ | H | C | O |
| $L_{A470}$ | $R_{B10}$ | H | C | O |
| $L_{A471}$ | $R_{A3}$ | H | C | O |
| $L_{A472}$ | $R_{A34}$ | H | C | O |
| $L_{A473}$ | H | H | C | $NCH_3$ |
| $L_{A474}$ | $R_{B1}$ | H | C | $NCH_3$ |
| $L_{A475}$ | $R_{B3}$ | H | C | $NCH_3$ |
| $L_{A476}$ | $R_{B4}$ | H | C | $NCH_3$ |
| $L_{A477}$ | $R_{B7}$ | H | C | $NCH_3$ |
| $L_{A478}$ | $R_{B10}$ | H | C | $NCH_3$ |
| $L_{A479}$ | $R_{A3}$ | H | C | $NCH_3$ |
| $L_{A480}$ | $R_{A34}$ | H | C | $NCH_3$ |
| $L_{A481}$ | H | H | C | $C(CH_3)_2$ |
| $L_{A482}$ | $R_{B1}$ | H | C | $C(CH_3)_2$ |
| $L_{A483}$ | $R_{B3}$ | H | C | $C(CH_3)_2$ |
| $L_{A484}$ | $R_{B4}$ | H | C | $C(CH_3)_2$ |
| $L_{A485}$ | $R_{B7}$ | H | C | $C(CH_3)_2$ |
| $L_{A486}$ | $R_{B10}$ | H | C | $C(CH_3)_2$ |
| $L_{A487}$ | $R_{A3}$ | H | C | $C(CH_3)_2$ |
| $L_{A488}$ | $R_{A34}$ | H | C | $C(CH_3)_2$ |
| $L_{A489}$ | H | H | C | $Si(CH_3)_2$ |
| $L_{A490}$ | $R_{B1}$ | H | C | $Si(CH_3)_2$ |
| $L_{A491}$ | $R_{B3}$ | H | C | $Si(CH_3)_2$ |
| $L_{A492}$ | $R_{B4}$ | H | C | $Si(CH_3)_2$ |
| $L_{A493}$ | $R_{B7}$ | H | C | $Si(CH_3)_2$ |
| $L_{A494}$ | $R_{B10}$ | H | C | $Si(CH_3)_2$ |
| $L_{A495}$ | $R_{A3}$ | H | C | $Si(CH_3)_2$ |
| $L_{A496}$ | $R_{A34}$ | H | C | $Si(CH_3)_2$ |
| $L_{A497}$ | H | $R_{B1}$ | C | S |
| $L_{A498}$ | $R_{B1}$ | $R_{B1}$ | C | S |
| $L_{A499}$ | $R_{B3}$ | $R_{B1}$ | C | S |
| $L_{A500}$ | $R_{B4}$ | $R_{B1}$ | C | S |
| $L_{A501}$ | $R_{B7}$ | $R_{B1}$ | C | S |
| $L_{A502}$ | $R_{B10}$ | $R_{B1}$ | C | S |
| $L_{A503}$ | $R_{A3}$ | $R_{B1}$ | C | S |
| $L_{A504}$ | $R_{A34}$ | $R_{B1}$ | C | S |
| $L_{A505}$ | H | $R_{B1}$ | C | O |
| $L_{A506}$ | $R_{B1}$ | $R_{B1}$ | C | O |
| $L_{A507}$ | $R_{B3}$ | $R_{B1}$ | C | O |
| $L_{A508}$ | $R_{B4}$ | $R_{B1}$ | C | O |
| $L_{A509}$ | $R_{B7}$ | $R_{B1}$ | C | O |
| $L_{A510}$ | $R_{B10}$ | $R_{B1}$ | C | O |
| $L_{A511}$ | $R_{A3}$ | $R_{B1}$ | C | O |
| $L_{A512}$ | $R_{A34}$ | $R_{B1}$ | C | O |
| $L_{A513}$ | H | $R_{B1}$ | C | $NCH_3$ |

-continued

| Ligand | $R^1$ | $R^2$ | X | Y |
|---|---|---|---|---|
| $L_{A514}$ | $R_{B1}$ | $R_{B1}$ | C | $NCH_3$ |
| $L_{A515}$ | $R_{B3}$ | $R_{B1}$ | C | $NCH_3$ |
| $L_{A516}$ | $R_{B4}$ | $R_{B1}$ | C | $NCH_3$ |
| $L_{A517}$ | $R_{B7}$ | $R_{B1}$ | C | $NCH_3$ |
| $L_{A518}$ | $R_{B10}$ | $R_{B1}$ | C | $NCH_3$ |
| $L_{A519}$ | $R_{A3}$ | $R_{B1}$ | C | $NCH_3$ |
| $L_{A520}$ | $R_{A34}$ | $R_{B1}$ | C | $NCH_3$ |
| $L_{A521}$ | H | $R_{B1}$ | C | $C(CH_3)_2$ |
| $L_{A522}$ | $R_{B1}$ | $R_{B1}$ | C | $C(CH_3)_2$ |
| $L_{A523}$ | $R_{B3}$ | $R_{B1}$ | C | $C(CH_3)_2$ |
| $L_{A524}$ | $R_{B4}$ | $R_{B1}$ | C | $C(CH_3)_2$ |
| $L_{A525}$ | $R_{B7}$ | $R_{B1}$ | C | $C(CH_3)_2$ |
| $L_{A526}$ | $R_{B10}$ | $R_{B1}$ | C | $C(CH_3)_2$ |
| $L_{A527}$ | $R_{A3}$ | $R_{B1}$ | C | $C(CH_3)_2$ |
| $L_{A528}$ | $R_{A34}$ | $R_{B1}$ | C | $C(CH_3)_2$ |
| $L_{A529}$ | H | $R_{B1}$ | C | $Si(CH_3)_2$ |
| $L_{A530}$ | $R_{B1}$ | $R_{B1}$ | C | $Si(CH_3)_2$ |
| $L_{A531}$ | $R_{B3}$ | $R_{B1}$ | C | $Si(CH_3)_2$ |
| $L_{A532}$ | $R_{B4}$ | $R_{B1}$ | C | $Si(CH_3)_2$ |
| $L_{A533}$ | $R_{B7}$ | $R_{B1}$ | C | $Si(CH_3)_2$ |
| $L_{A534}$ | $R_{B10}$ | $R_{B1}$ | C | $Si(CH_3)_2$ |
| $L_{A535}$ | $R_{A3}$ | $R_{B1}$ | C | $Si(CH_3)_2$ |
| $L_{A536}$ | $R_{A34}$ | $R_{B1}$ | C | $Si(CH_3)_2$ |
| $L_{A537}$ | H | $R_{B2}$ | C | S |
| $L_{A538}$ | $R_{B1}$ | $R_{B2}$ | C | S |
| $L_{A539}$ | $R_{B3}$ | $R_{B2}$ | C | S |
| $L_{A540}$ | $R_{B4}$ | $R_{B2}$ | C | S |
| $L_{A541}$ | $R_{B7}$ | $R_{B2}$ | C | S |
| $L_{A542}$ | $R_{B10}$ | $R_{B2}$ | C | S |
| $L_{A543}$ | $R_{A3}$ | $R_{B2}$ | C | S |
| $L_{A544}$ | $R_{A34}$ | $R_{B2}$ | C | S |
| $L_{A545}$ | H | $R_{B2}$ | C | O |
| $L_{A546}$ | $R_{B1}$ | $R_{B2}$ | C | O |
| $L_{A547}$ | $R_{B3}$ | $R_{B2}$ | C | O |
| $L_{A548}$ | $R_{B4}$ | $R_{B2}$ | C | O |
| $L_{A549}$ | $R_{B7}$ | $R_{B2}$ | C | O |
| $L_{A550}$ | $R_{B10}$ | $R_{B2}$ | C | O |
| $L_{A551}$ | $R_{A3}$ | $R_{B2}$ | C | O |
| $L_{A552}$ | $R_{A34}$ | $R_{B2}$ | C | O |
| $L_{A553}$ | H | $R_{B2}$ | C | $NCH_3$ |
| $L_{A554}$ | $R_{B1}$ | $R_{B2}$ | C | $NCH_3$ |
| $L_{A555}$ | $R_{B3}$ | $R_{B2}$ | C | $NCH_3$ |
| $L_{A556}$ | $R_{B4}$ | $R_{B2}$ | C | $NCH_3$ |
| $L_{A557}$ | $R_{B7}$ | $R_{B2}$ | C | $NCH_3$ |
| $L_{A558}$ | $R_{B10}$ | $R_{B2}$ | C | $NCH_3$ |
| $L_{A559}$ | $R_{A3}$ | $R_{B2}$ | C | $NCH_3$ |
| $L_{A560}$ | $R_{A34}$ | $R_{B2}$ | C | $NCH_3$ |
| $L_{A561}$ | H | $R_{B2}$ | C | $C(CH_3)_2$ |
| $L_{A562}$ | $R_{B1}$ | $R_{B2}$ | C | $C(CH_3)_2$ |
| $L_{A563}$ | $R_{B3}$ | $R_{B2}$ | C | $C(CH_3)_2$ |
| $L_{A564}$ | $R_{B4}$ | $R_{B2}$ | C | $C(CH_3)_2$ |
| $L_{A565}$ | $R_{B7}$ | $R_{B2}$ | C | $C(CH_3)_2$ |
| $L_{A566}$ | $R_{B10}$ | $R_{B2}$ | C | $C(CH_3)_2$ |
| $L_{A567}$ | $R_{A3}$ | $R_{B2}$ | C | $C(CH_3)_2$ |
| $L_{A568}$ | $R_{A34}$ | $R_{B2}$ | C | $C(CH_3)_2$ |
| $L_{A569}$ | H | $R_{B2}$ | C | $Si(CH_3)_2$ |
| $L_{A570}$ | $R_{B1}$ | $R_{B2}$ | C | $Si(CH_3)_2$ |
| $L_{A571}$ | $R_{B3}$ | $R_{B2}$ | C | $Si(CH_3)_2$ |
| $L_{A572}$ | $R_{B4}$ | $R_{B2}$ | C | $Si(CH_3)_2$ |
| $L_{A573}$ | $R_{B7}$ | $R_{B2}$ | C | $Si(CH_3)_2$ |
| $L_{A574}$ | $R_{B10}$ | $R_{B2}$ | C | $Si(CH_3)_2$ |
| $L_{A575}$ | $R_{A3}$ | $R_{B2}$ | C | $Si(CH_3)_2$ |
| $L_{A576}$ | $R_{A34}$ | $R_{B2}$ | C | $Si(CH_3)_2$ |
| $L_{A577}$ | H | H | N | S |
| $L_{A578}$ | $R_{B1}$ | H | N | S |
| $L_{A579}$ | $R_{B3}$ | H | N | S |
| $L_{A580}$ | $R_{B4}$ | H | N | S |
| $L_{A581}$ | $R_{B7}$ | H | N | S |
| $L_{A582}$ | $R_{B10}$ | H | N | S |
| $L_{A583}$ | $R_{A3}$ | H | N | S |
| $L_{A584}$ | $R_{A34}$ | H | N | S |
| $L_{A585}$ | H | H | N | O |
| $L_{A586}$ | $R_{B1}$ | H | N | O |
| $L_{A587}$ | $R_{B3}$ | H | N | O |
| $L_{A588}$ | $R_{B4}$ | H | N | O |
| $L_{A589}$ | $R_{B7}$ | H | N | O |
| $L_{A590}$ | $R_{B10}$ | H | N | O |

-continued

| Ligand | $R^1$ | $R^2$ | X | Y |
|---|---|---|---|---|
| $L_{A591}$ | $R_{A3}$ | H | N | O |
| $L_{A592}$ | $R_{A34}$ | H | N | O |
| $L_{A593}$ | H | H | N | $NCH_3$ |
| $L_{A594}$ | $R_{B1}$ | H | N | $NCH_3$ |
| $L_{A595}$ | $R_{B3}$ | H | N | $NCH_3$ |
| $L_{A596}$ | $R_{B4}$ | H | N | $NCH_3$ |
| $L_{A597}$ | $R_{B7}$ | H | N | $NCH_3$ |
| $L_{A598}$ | $R_{B10}$ | H | N | $NCH_3$ |
| $L_{A599}$ | $R_{A3}$ | H | N | $NCH_3$ |
| $L_{A600}$ | $R_{A34}$ | H | N | $NCH_3$ |
| $L_{A601}$ | H | H | N | $C(CH_3)_2$ |
| $L_{A602}$ | $R_{B1}$ | H | N | $C(CH_3)_2$ |
| $L_{A603}$ | $R_{B3}$ | H | N | $C(CH_3)_2$ |
| $L_{A604}$ | $R_{B4}$ | H | N | $C(CH_3)_2$ |
| $L_{A605}$ | $R_{B7}$ | H | N | $C(CH_3)_2$ |
| $L_{A606}$ | $R_{B10}$ | H | N | $C(CH_3)_2$ |
| $L_{A607}$ | $R_{A3}$ | H | N | $C(CH_3)_2$ |
| $L_{A608}$ | $R_{A34}$ | H | N | $C(CH_3)_2$ |
| $L_{A609}$ | H | H | N | $Si(CH_3)_2$ |
| $L_{A610}$ | $R_{B1}$ | H | N | $Si(CH_3)_2$ |
| $L_{A611}$ | $R_{B3}$ | H | N | $Si(CH_3)_2$ |
| $L_{A612}$ | $R_{B4}$ | H | N | $Si(CH_3)_2$ |
| $L_{A613}$ | $R_{B7}$ | H | N | $Si(CH_3)_2$ |
| $L_{A614}$ | $R_{B10}$ | H | N | $Si(CH_3)_2$ |
| $L_{A615}$ | $R_{A3}$ | H | N | $Si(CH_3)_2$ |
| $L_{A616}$ | $R_{A34}$ | H | N | $Si(CH_3)_2$ |
| $L_{A617}$ | H | $R_{B1}$ | N | S |
| $L_{A618}$ | $R_{B1}$ | $R_{B1}$ | N | S |
| $L_{A619}$ | $R_{B3}$ | $R_{B1}$ | N | S |
| $L_{A620}$ | $R_{B4}$ | $R_{B1}$ | N | S |
| $L_{A621}$ | $R_{B7}$ | $R_{B1}$ | N | S |
| $L_{A622}$ | $R_{B10}$ | $R_{B1}$ | N | S |
| $L_{A623}$ | $R_{A3}$ | $R_{B1}$ | N | S |
| $L_{A624}$ | $R_{A34}$ | $R_{B1}$ | N | S |
| $L_{A625}$ | H | $R_{B1}$ | N | O |
| $L_{A626}$ | $R_{B1}$ | $R_{B1}$ | N | O |
| $L_{A627}$ | $R_{B3}$ | $R_{B1}$ | N | O |
| $L_{A628}$ | $R_{B4}$ | $R_{B1}$ | N | O |
| $L_{A629}$ | $R_{B7}$ | $R_{B1}$ | N | O |
| $L_{A630}$ | $R_{B10}$ | $R_{B1}$ | N | O |
| $L_{A631}$ | $R_{A3}$ | $R_{B1}$ | N | O |
| $L_{A632}$ | $R_{A34}$ | $R_{B1}$ | N | O |
| $L_{A633}$ | H | $R_{B1}$ | N | $NCH_3$ |
| $L_{A634}$ | $R_{B1}$ | $R_{B1}$ | N | $NCH_3$ |
| $L_{A635}$ | $R_{B3}$ | $R_{B1}$ | N | $NCH_3$ |
| $L_{A636}$ | $R_{B4}$ | $R_{B1}$ | N | $NCH_3$ |
| $L_{A637}$ | $R_{B7}$ | $R_{B1}$ | N | $NCH_3$ |
| $L_{A638}$ | $R_{B10}$ | $R_{B1}$ | N | $NCH_3$ |
| $L_{A639}$ | $R_{A3}$ | $R_{B1}$ | N | $NCH_3$ |
| $L_{A640}$ | $R_{A34}$ | $R_{B1}$ | N | $NCH_3$ |
| $L_{A641}$ | H | $R_{B1}$ | N | $C(CH_3)_2$ |
| $L_{A642}$ | $R_{B1}$ | $R_{B1}$ | N | $C(CH_3)_2$ |
| $L_{A643}$ | $R_{B3}$ | $R_{B1}$ | N | $C(CH_3)_2$ |
| $L_{A644}$ | $R_{B4}$ | $R_{B1}$ | N | $C(CH_3)_2$ |
| $L_{A645}$ | $R_{B7}$ | $R_{B1}$ | N | $C(CH_3)_2$ |
| $L_{A646}$ | $R_{B10}$ | $R_{B1}$ | N | $C(CH_3)_2$ |
| $L_{A647}$ | $R_{A3}$ | $R_{B1}$ | N | $C(CH_3)_2$ |
| $L_{A648}$ | $R_{A34}$ | $R_{B1}$ | N | $C(CH_3)_2$ |
| $L_{A649}$ | H | $R_{B1}$ | N | $Si(CH_3)_2$ |
| $L_{A650}$ | $R_{B1}$ | $R_{B1}$ | N | $Si(CH_3)_2$ |
| $L_{A651}$ | $R_{B3}$ | $R_{B1}$ | N | $Si(CH_3)_2$ |
| $L_{A652}$ | $R_{B4}$ | $R_{B1}$ | N | $Si(CH_3)_2$ |
| $L_{A653}$ | $R_{B7}$ | $R_{B1}$ | N | $Si(CH_3)_2$ |
| $L_{A654}$ | $R_{B10}$ | $R_{B1}$ | N | $Si(CH_3)_2$ |
| $L_{A655}$ | $R_{A3}$ | $R_{B1}$ | N | $Si(CH_3)_2$ |
| $L_{A656}$ | $R_{A34}$ | $R_{B1}$ | N | $Si(CH_3)_2$ |
| $L_{A657}$ | H | $R_{B2}$ | N | S |
| $L_{A658}$ | $R_{B1}$ | $R_{B2}$ | N | S |
| $L_{A659}$ | $R_{B3}$ | $R_{B2}$ | N | S |
| $L_{A660}$ | $R_{B4}$ | $R_{B2}$ | N | S |
| $L_{A661}$ | $R_{B7}$ | $R_{B2}$ | N | S |
| $L_{A662}$ | $R_{B10}$ | $R_{B2}$ | N | S |
| $L_{A663}$ | $R_{A3}$ | $R_{B2}$ | N | S |
| $L_{A664}$ | $R_{A34}$ | $R_{B2}$ | N | S |
| $L_{A665}$ | H | $R_{B2}$ | N | O |
| $L_{A666}$ | $R_{B1}$ | $R_{B2}$ | N | O |
| $L_{A667}$ | $R_{B3}$ | $R_{B2}$ | N | O |

-continued

| Ligand | $R^1$ | $R^2$ | X | Y |
|---|---|---|---|---|
| $L_{A668}$ | $R_{B4}$ | $R_{B2}$ | N | O |
| $L_{A669}$ | $R_{B7}$ | $R_{B2}$ | N | O |
| $L_{A670}$ | $R_{B10}$ | $R_{B2}$ | N | O |
| $L_{A671}$ | $R_{A3}$ | $R_{B2}$ | N | O |
| $L_{A672}$ | $R_{A34}$ | $R_{B2}$ | N | O |
| $L_{A673}$ | H | $R_{B2}$ | N | $NCH_3$ |
| $L_{A674}$ | $R_{B1}$ | $R_{B2}$ | N | $NCH_3$ |
| $L_{A675}$ | $R_{B3}$ | $R_{B2}$ | N | $NCH_3$ |
| $L_{A676}$ | $R_{B4}$ | $R_{B2}$ | N | $NCH_3$ |
| $L_{A677}$ | $R_{B7}$ | $R_{B2}$ | N | $NCH_3$ |
| $L_{A678}$ | $R_{B10}$ | $R_{B2}$ | N | $NCH_3$ |
| $L_{A679}$ | $R_{A3}$ | $R_{B2}$ | N | $NCH_3$ |
| $L_{A680}$ | $R_{A34}$ | $R_{B2}$ | N | $NCH_3$ |
| $L_{A681}$ | H | $R_{B2}$ | N | $C(CH_3)_2$ |
| $L_{A682}$ | $R_{B1}$ | $R_{B2}$ | N | $C(CH_3)_2$ |
| $L_{A683}$ | $R_{B3}$ | $R_{B2}$ | N | $C(CH_3)_2$ |
| $L_{A684}$ | $R_{B4}$ | $R_{B2}$ | N | $C(CH_3)_2$ |
| $L_{A685}$ | $R_{B7}$ | $R_{B2}$ | N | $C(CH_3)_2$ |
| $L_{A686}$ | $R_{B10}$ | $R_{B2}$ | N | $C(CH_3)_2$ |
| $L_{A687}$ | $R_{A3}$ | $R_{B2}$ | N | $C(CH_3)_2$ |
| $L_{A688}$ | $R_{A34}$ | $R_{B2}$ | N | $C(CH_3)_2$ |
| $L_{A689}$ | H | $R_{B2}$ | N | $Si(CH_3)_2$ |
| $L_{A690}$ | $R_{B1}$ | $R_{B2}$ | N | $Si(CH_3)_2$ |
| $L_{A691}$ | $R_{B3}$ | $R_{B2}$ | N | $Si(CH_3)_2$ |
| $L_{A692}$ | $R_{B4}$ | $R_{B2}$ | N | $Si(CH_3)_2$ |
| $L_{A693}$ | $R_{B7}$ | $R_{B2}$ | N | $Si(CH_3)_2$ |
| $L_{A694}$ | $R_{B10}$ | $R_{B2}$ | N | $Si(CH_3)_2$ |
| $L_{A695}$ | $R_{A3}$ | $R_{B2}$ | N | $Si(CH_3)_2$ |
| $L_{A696}$ | $R_{A34}$ | $R_{B2}$ | N | $Si(CH_3)_2$ |

wherein $L_{A697}$ through $L_{A816}$ have a structure of Formula VI:

Formula VI

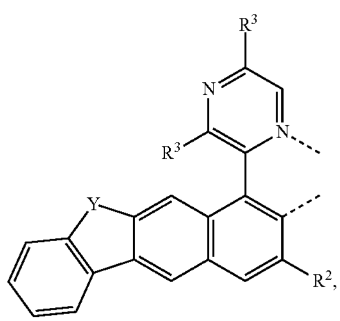

wherein $R^2$, $R^3$, and Y are defined as provided below:

| Ligand | $R^2$ | $R^3$ | Y | Ligand | $R^1$ | $R^2$ | $R^{14}$ |
|---|---|---|---|---|---|---|---|
| $L_{A697}$ | H | H | S | $L_{A757}$ | $R_{B1}$ | $R_{B4}$ | $NCH_3$ |
| $L_{A698}$ | H | $R_{B1}$ | S | $L_{A758}$ | $R_{B1}$ | $R_{B5}$ | $NCH_3$ |
| $L_{A699}$ | H | $R_{B2}$ | S | $L_{A759}$ | $R_{B1}$ | $R_{A34}$ | $NCH_3$ |
| $L_{A700}$ | H | $R_{B3}$ | S | $L_{A760}$ | $R_{B1}$ | $R_{A52}$ | $NCH_3$ |
| $L_{A701}$ | H | $R_{B4}$ | S | $L_{A761}$ | $R_{B1}$ | H | $C(CH_3)_2$ |
| $L_{A702}$ | H | $R_{B5}$ | S | $L_{A762}$ | $R_{B1}$ | $R_{B1}$ | $C(CH_3)_2$ |
| $L_{A703}$ | H | $R_{A34}$ | S | $L_{A763}$ | $R_{B1}$ | $R_{B2}$ | $C(CH_3)_2$ |
| $L_{A704}$ | H | $R_{A52}$ | S | $L_{A764}$ | $R_{B1}$ | $R_{B3}$ | $C(CH_3)_2$ |
| $L_{A705}$ | H | H | O | $L_{A765}$ | $R_{B1}$ | $R_{B4}$ | $C(CH_3)_2$ |
| $L_{A706}$ | H | $R_{B1}$ | O | $L_{A766}$ | $R_{B1}$ | $R_{B5}$ | $C(CH_3)_2$ |
| $L_{A707}$ | H | $R_{B2}$ | O | $L_{A767}$ | $R_{B1}$ | $R_{A34}$ | $C(CH_3)_2$ |
| $L_{A708}$ | H | $R_{B3}$ | O | $L_{A768}$ | $R_{B1}$ | $R_{A52}$ | $C(CH_3)_2$ |
| $L_{A709}$ | H | $R_{B4}$ | O | $L_{A769}$ | $R_{B1}$ | H | $Si(CH_3)_2$ |
| $L_{A710}$ | H | $R_{B5}$ | O | $L_{A770}$ | $R_{B1}$ | $R_{B1}$ | $Si(CH_3)_2$ |
| $L_{A711}$ | H | $R_{A34}$ | O | $L_{A771}$ | $R_{B1}$ | $R_{B2}$ | $Si(CH_3)_2$ |
| $L_{A712}$ | H | $R_{A52}$ | O | $L_{A772}$ | $R_{B1}$ | $R_{B3}$ | $Si(CH_3)_2$ |
| $L_{A713}$ | H | H | $NCH_3$ | $L_{A773}$ | $R_{B1}$ | $R_{B4}$ | $Si(CH_3)_2$ |
| $L_{A714}$ | H | $R_{B1}$ | $NCH_3$ | $L_{A774}$ | $R_{B1}$ | $R_{B5}$ | $Si(CH_3)_2$ |
| $L_{A715}$ | H | $R_{B2}$ | $NCH_3$ | $L_{A775}$ | $R_{B1}$ | $R_{A34}$ | $Si(CH_3)_2$ |
| $L_{A716}$ | H | $R_{B3}$ | $NCH_3$ | $L_{A776}$ | $R_{B1}$ | $R_{A52}$ | $Si(CH_3)_2$ |

-continued

| Ligand | $R^2$ | $R^3$ | Y | Ligand | $R^1$ | $R^2$ | $R^{14}$ |
|---|---|---|---|---|---|---|---|
| $L_{A717}$ | H | $R_{B4}$ | $NCH_3$ | $L_{A777}$ | $R_{B2}$ | H | S |
| $L_{A718}$ | H | $R_{B5}$ | $NCH_3$ | $L_{A778}$ | $R_{B2}$ | $R_{B1}$ | S |
| $L_{A719}$ | H | $R_{A34}$ | $NCH_3$ | $L_{A779}$ | $R_{B2}$ | $R_{B2}$ | S |
| $L_{A720}$ | H | $R_{A52}$ | $NCH_3$ | $L_{A780}$ | $R_{B2}$ | $R_{B3}$ | S |
| $L_{A721}$ | H | H | $C(CH_3)_2$ | $L_{A781}$ | $R_{B2}$ | $R_{B4}$ | S |
| $L_{A722}$ | H | $R_{B1}$ | $C(CH_3)_2$ | $L_{A782}$ | $R_{B2}$ | $R_{B5}$ | S |
| $L_{A723}$ | H | $R_{B2}$ | $C(CH_3)_2$ | $L_{A783}$ | $R_{B2}$ | $R_{A34}$ | S |
| $L_{A724}$ | H | $R_{B3}$ | $C(CH_3)_2$ | $L_{A784}$ | $R_{B2}$ | $R_{A52}$ | S |
| $L_{A725}$ | H | $R_{B4}$ | $C(CH_3)_2$ | $L_{A785}$ | $R_{B2}$ | H | O |
| $L_{A726}$ | H | $R_{B5}$ | $C(CH_3)_2$ | $L_{A786}$ | $R_{B2}$ | $R_{B1}$ | O |
| $L_{A727}$ | H | $R_{A34}$ | $C(CH_3)_2$ | $L_{A787}$ | $R_{B2}$ | $R_{B2}$ | O |
| $L_{A728}$ | H | $R_{A52}$ | $C(CH_3)_2$ | $L_{A788}$ | $R_{B2}$ | $R_{B3}$ | O |
| $L_{A729}$ | H | H | $Si(CH_3)_2$ | $L_{A789}$ | $R_{B2}$ | $R_{B4}$ | O |
| $L_{A730}$ | H | $R_{B1}$ | $Si(CH_3)_2$ | $L_{A790}$ | $R_{B2}$ | $R_{B5}$ | O |
| $L_{A731}$ | H | $R_{B2}$ | $Si(CH_3)_2$ | $L_{A791}$ | $R_{B2}$ | $R_{A34}$ | O |
| $L_{A732}$ | H | $R_{B3}$ | $Si(CH_3)_2$ | $L_{A792}$ | $R_{B2}$ | $R_{A52}$ | O |
| $L_{A733}$ | H | $R_{B4}$ | $Si(CH_3)_2$ | $L_{A793}$ | $R_{B2}$ | H | $NCH_3$ |
| $L_{A734}$ | H | $R_{B5}$ | $Si(CH_3)_2$ | $L_{A794}$ | $R_{B2}$ | $R_{B1}$ | $NCH_3$ |
| $L_{A735}$ | H | $R_{A34}$ | $Si(CH_3)_2$ | $L_{A795}$ | $R_{B2}$ | $R_{B2}$ | $NCH_3$ |
| $L_{A736}$ | H | $R_{A52}$ | $Si(CH_3)_2$ | $L_{A796}$ | $R_{B2}$ | $R_{B3}$ | $NCH_3$ |
| $L_{A737}$ | $R_{B1}$ | H | S | $L_{A797}$ | $R_{B2}$ | $R_{B4}$ | $NCH_3$ |
| $L_{A738}$ | $R_{B1}$ | $R_{B1}$ | S | $L_{A798}$ | $R_{B2}$ | $R_{B5}$ | $NCH_3$ |
| $L_{A739}$ | $R_{B1}$ | $R_{B2}$ | S | $L_{A799}$ | $R_{B2}$ | $R_{A34}$ | $NCH_3$ |
| $L_{A740}$ | $R_{B1}$ | $R_{B3}$ | S | $L_{A800}$ | $R_{B2}$ | $R_{A52}$ | $NCH_3$ |
| $L_{A741}$ | $R_{B1}$ | $R_{B4}$ | S | $L_{A801}$ | $R_{B2}$ | H | $C(CH_3)_2$ |
| $L_{A742}$ | $R_{B1}$ | $R_{B5}$ | S | $L_{A802}$ | $R_{B2}$ | $R_{B1}$ | $C(CH_3)_2$ |
| $L_{A743}$ | $R_{B1}$ | $R_{A34}$ | S | $L_{A803}$ | $R_{B2}$ | $R_{B2}$ | $C(CH_3)_2$ |
| $L_{A744}$ | $R_{B1}$ | $R_{A52}$ | S | $L_{A804}$ | $R_{B2}$ | $R_{B3}$ | $C(CH_3)_2$ |
| $L_{A745}$ | $R_{B1}$ | H | O | $L_{A805}$ | $R_{B2}$ | $R_{B4}$ | $C(CH_3)_2$ |
| $L_{A746}$ | $R_{B1}$ | $R_{B1}$ | O | $L_{A806}$ | $R_{B2}$ | $R_{B5}$ | $C(CH_3)_2$ |
| $L_{A747}$ | $R_{B1}$ | $R_{B2}$ | O | $L_{A807}$ | $R_{B2}$ | $R_{A34}$ | $C(CH_3)_2$ |
| $L_{A748}$ | $R_{B1}$ | $R_{B3}$ | O | $L_{A808}$ | $R_{B2}$ | $R_{A52}$ | $C(CH_3)_2$ |
| $L_{A749}$ | $R_{B1}$ | $R_{B4}$ | O | $L_{A809}$ | $R_{B2}$ | H | $Si(CH_3)_2$ |
| $L_{A750}$ | $R_{B1}$ | $R_{B5}$ | O | $L_{A810}$ | $R_{B2}$ | $R_{B1}$ | $Si(CH_3)_2$ |
| $L_{A751}$ | $R_{B1}$ | $R_{A34}$ | O | $L_{A811}$ | $R_{B2}$ | $R_{B2}$ | $Si(CH_3)_2$ |
| $L_{A752}$ | $R_{B1}$ | $R_{A52}$ | O | $L_{A812}$ | $R_{B2}$ | $R_{B3}$ | $Si(CH_3)_2$ |
| $L_{A753}$ | $R_{B1}$ | H | $NCH_3$ | $L_{A813}$ | $R_{B2}$ | $R_{B4}$ | $Si(CH_3)_2$ |
| $L_{A754}$ | $R_{B1}$ | $R_{B1}$ | $NCH_3$ | $L_{A814}$ | $R_{B2}$ | $R_{B5}$ | $Si(CH_3)_2$ |
| $L_{A755}$ | $R_{B1}$ | $R_{B2}$ | $NCH_3$ | $L_{A815}$ | $R_{B2}$ | $R_{A34}$ | $Si(CH_3)_2$ |
| $L_{A756}$ | $R_{B1}$ | $R_{B3}$ | $NCH_3$ | $L_{A816}$ | $R_{B2}$ | $R_{A52}$ | $Si(CH_3)_2$ |

wherein $L_{A817}$ through $L_{A912}$ have a structure of Formula VII:

Formula VII

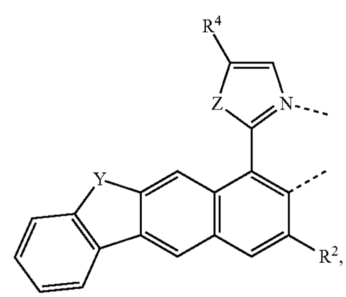

wherein $R^2$, $R^4$, and Y are defined as provided below:

| Ligand | $R^2$ | $R^4$ | Y | Z |
|---|---|---|---|---|
| $L_{A817}$ | H | H | S | S |
| $L_{A818}$ | H | $R_{B1}$ | S | S |
| $L_{A819}$ | H | $R_{B3}$ | S | S |
| $L_{A820}$ | H | $R_{B4}$ | S | S |
| $L_{A821}$ | H | $R_{B7}$ | S | S |
| $L_{A822}$ | H | $R_{B10}$ | S | S |
| $L_{A823}$ | H | $R_{A3}$ | S | S |
| $L_{A824}$ | H | $R_{A34}$ | S | S |
| $L_{A825}$ | H | H | S | O |

-continued

| Ligand | $R^2$ | $R^4$ | Y | Z |
|---|---|---|---|---|
| $L_{A826}$ | H | $R_{B1}$ | S | O |
| $L_{A827}$ | H | $R_{B3}$ | S | O |
| $L_{A828}$ | H | $R_{B4}$ | S | O |
| $L_{A829}$ | H | $R_{B7}$ | S | O |
| $L_{A830}$ | H | $R_{B10}$ | S | O |
| $L_{A831}$ | H | $R_{A3}$ | S | O |
| $L_{A832}$ | H | $R_{A34}$ | S | O |
| $L_{A833}$ | H | H | S | $NCH_3$ |
| $L_{A834}$ | H | $R_{B1}$ | S | $NCH_3$ |
| $L_{A835}$ | H | $R_{B3}$ | S | $NCH_3$ |
| $L_{A836}$ | H | $R_{B4}$ | S | $NCH_3$ |
| $L_{A837}$ | H | $R_{B7}$ | S | $NCH_3$ |
| $L_{A838}$ | H | $R_{B10}$ | S | $NCH_3$ |
| $L_{A839}$ | H | $R_{A3}$ | S | $NCH_3$ |
| $L_{A840}$ | H | $R_{A34}$ | S | $NCH_3$ |
| $L_{A841}$ | H | H | O | S |
| $L_{A842}$ | H | $R_{B1}$ | O | S |
| $L_{A843}$ | H | $R_{B3}$ | O | S |
| $L_{A844}$ | H | $R_{B4}$ | O | S |
| $L_{A845}$ | H | $R_{B7}$ | O | S |
| $L_{A846}$ | H | $R_{B10}$ | O | S |
| $L_{A847}$ | H | $R_{A3}$ | O | S |
| $L_{A848}$ | H | $R_{A34}$ | O | S |
| $L_{A849}$ | H | H | O | O |
| $L_{A850}$ | H | $R_{B1}$ | O | O |
| $L_{A851}$ | H | $R_{B3}$ | O | O |
| $L_{A852}$ | H | $R_{B4}$ | O | O |
| $L_{A853}$ | H | $R_{B7}$ | O | O |
| $L_{A854}$ | H | $R_{B10}$ | O | O |
| $L_{A855}$ | H | $R_{A3}$ | O | O |
| $L_{A856}$ | H | $R_{A34}$ | O | O |
| $L_{A857}$ | H | H | O | $NCH_3$ |
| $L_{A858}$ | H | $R_{B1}$ | O | $NCH_3$ |
| $L_{A859}$ | H | $R_{B3}$ | O | $NCH_3$ |
| $L_{A860}$ | H | $R_{B4}$ | O | $NCH_3$ |
| $L_{A861}$ | H | $R_{B7}$ | O | $NCH_3$ |
| $L_{A862}$ | H | $R_{B10}$ | O | $NCH_3$ |
| $L_{A863}$ | H | $R_{A3}$ | O | $NCH_3$ |
| $L_{A864}$ | H | $R_{A34}$ | O | $NCH_3$ |
| $L_{A865}$ | $R_{B1}$ | H | S | S |
| $L_{A866}$ | $R_{B1}$ | $R_{B1}$ | S | S |
| $L_{A867}$ | $R_{B1}$ | $R_{B3}$ | S | S |
| $L_{A868}$ | $R_{B1}$ | $R_{B4}$ | S | S |
| $L_{A869}$ | $R_{B1}$ | $R_{B7}$ | S | S |
| $L_{A870}$ | $R_{B1}$ | $R_{B10}$ | S | S |
| $L_{A871}$ | $R_{B1}$ | $R_{A3}$ | S | S |
| $L_{A872}$ | $R_{B1}$ | $R_{A34}$ | S | S |
| $L_{A873}$ | $R_{B1}$ | H | S | O |
| $L_{A874}$ | $R_{B1}$ | $R_{B1}$ | S | O |
| $L_{A875}$ | $R_{B1}$ | $R_{B3}$ | S | O |
| $L_{A876}$ | $R_{B1}$ | $R_{B4}$ | S | O |
| $L_{A877}$ | $R_{B1}$ | $R_{B7}$ | S | O |
| $L_{A878}$ | $R_{B1}$ | $R_{B10}$ | S | O |
| $L_{A879}$ | $R_{B1}$ | $R_{A3}$ | S | O |
| $L_{A880}$ | $R_{B1}$ | $R_{A34}$ | S | O |
| $L_{A881}$ | $R_{B1}$ | H | S | $NCH_3$ |
| $L_{A882}$ | $R_{B1}$ | $R_{B1}$ | S | $NCH_3$ |
| $L_{A883}$ | $R_{B1}$ | $R_{B3}$ | S | $NCH_3$ |
| $L_{A884}$ | $R_{B1}$ | $R_{B4}$ | S | $NCH_3$ |
| $L_{A885}$ | $R_{B1}$ | $R_{B7}$ | S | $NCH_3$ |
| $L_{A886}$ | $R_{B1}$ | $R_{B10}$ | S | $NCH_3$ |
| $L_{A887}$ | $R_{B1}$ | $R_{A3}$ | S | $NCH_3$ |
| $L_{A888}$ | $R_{B1}$ | $R_{A34}$ | S | $NCH_3$ |
| $L_{A889}$ | $R_{B1}$ | H | O | S |
| $L_{A890}$ | $R_{B1}$ | $R_{B1}$ | O | S |
| $L_{A891}$ | $R_{B1}$ | $R_{B3}$ | O | S |
| $L_{A892}$ | $R_{B1}$ | $R_{B4}$ | O | S |
| $L_{A893}$ | $R_{B1}$ | $R_{B7}$ | O | S |
| $L_{A894}$ | $R_{B1}$ | $R_{B10}$ | O | S |
| $L_{A895}$ | $R_{B1}$ | $R_{A3}$ | O | S |
| $L_{A896}$ | $R_{B1}$ | $R_{A34}$ | O | S |
| $L_{A897}$ | $R_{B1}$ | H | O | O |
| $L_{A898}$ | $R_{B1}$ | $R_{B1}$ | O | O |
| $L_{A899}$ | $R_{B1}$ | $R_{B3}$ | O | O |
| $L_{A900}$ | $R_{B1}$ | $R_{B4}$ | O | O |
| $L_{A901}$ | $R_{B1}$ | $R_{B7}$ | O | O |
| $L_{A902}$ | $R_{B1}$ | $R_{B10}$ | O | O |

-continued

| Ligand | $R^2$ | $R^4$ | Y | Z |
|---|---|---|---|---|
| $L_{A903}$ | $R_{B1}$ | $R_{A3}$ | O | O |
| $L_{A904}$ | $R_{B1}$ | $R_{A34}$ | O | O |
| $L_{A905}$ | $R_{B1}$ | H | O | $NCH_3$ |
| $L_{A906}$ | $R_{B1}$ | $R_{B1}$ | O | $NCH_3$ |
| $L_{A907}$ | $R_{B1}$ | $R_{B3}$ | O | $NCH_3$ |
| $L_{A908}$ | $R_{B1}$ | $R_{B4}$ | O | $NCH_3$ |
| $L_{A909}$ | $R_{B1}$ | $R_{B7}$ | O | $NCH_3$ |
| $L_{A910}$ | $R_{B1}$ | $R_{B10}$ | O | $NCH_3$ |
| $L_{A911}$ | $R_{B1}$ | $R_{A3}$ | O | $NCH_3$ |
| $L_{A912}$ | $R_{B1}$ | $R_{A34}$ | O | $NCH_3$ |

wherein $L_{A913}$ through $L_{A1152}$ have a structure of Formula VIII:

Formula VIII

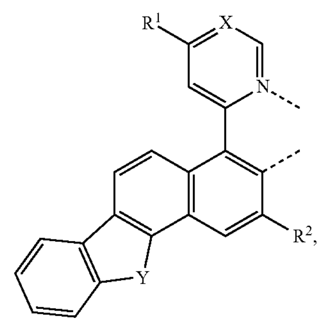

wherein $R^1$, $R^2$, Y, and X are defined as provided below:

| Ligand | $R^1$ | $R^2$ | X | Y |
|---|---|---|---|---|
| $L_{A913}$ | H | H | C | S |
| $L_{A914}$ | $R_{B1}$ | H | C | S |
| $L_{A915}$ | $R_{B3}$ | H | C | S |
| $L_{A916}$ | $R_{B4}$ | H | C | S |
| $L_{A917}$ | $R_{B7}$ | H | C | S |
| $L_{A918}$ | $R_{B10}$ | H | C | S |
| $L_{A919}$ | $R_{A3}$ | H | C | S |
| $L_{A920}$ | $R_{A34}$ | H | C | S |
| $L_{A921}$ | H | H | C | O |
| $L_{A922}$ | $R_{B1}$ | H | C | O |
| $L_{A923}$ | $R_{B3}$ | H | C | O |
| $L_{A924}$ | $R_{B4}$ | H | C | O |
| $L_{A925}$ | $R_{B7}$ | H | C | O |
| $L_{A926}$ | $R_{B10}$ | H | C | O |
| $L_{A927}$ | $R_{A3}$ | H | C | O |
| $L_{A928}$ | $R_{A34}$ | H | C | O |
| $L_{A929}$ | H | H | C | $NCH_3$ |
| $L_{A930}$ | $R_{B1}$ | H | C | $NCH_3$ |
| $L_{A931}$ | $R_{B3}$ | H | C | $NCH_3$ |
| $L_{A932}$ | $R_{B4}$ | H | C | $NCH_3$ |
| $L_{A933}$ | $R_{B7}$ | H | C | $NCH_3$ |
| $L_{A934}$ | $R_{B10}$ | H | C | $NCH_3$ |
| $L_{A935}$ | $R_{A3}$ | H | C | $NCH_3$ |
| $L_{A936}$ | $R_{A34}$ | H | C | $NCH_3$ |
| $L_{A937}$ | H | H | C | $C(CH_3)_2$ |
| $L_{A938}$ | $R_{B1}$ | H | C | $C(CH_3)_2$ |
| $L_{A939}$ | $R_{B3}$ | H | C | $C(CH_3)_2$ |
| $L_{A940}$ | $R_{B4}$ | H | C | $C(CH_3)_2$ |
| $L_{A941}$ | $R_{B7}$ | H | C | $C(CH_3)_2$ |
| $L_{A942}$ | $R_{B10}$ | H | C | $C(CH_3)_2$ |
| $L_{A943}$ | $R_{A3}$ | H | C | $C(CH_3)_2$ |
| $L_{A944}$ | $R_{A34}$ | H | C | $C(CH_3)_2$ |
| $L_{A945}$ | H | H | C | $Si(CH_3)_2$ |
| $L_{A946}$ | $R_{B1}$ | H | C | $Si(CH_3)_2$ |
| $L_{A947}$ | $R_{B3}$ | H | C | $Si(CH_3)_2$ |
| $L_{A948}$ | $R_{B4}$ | H | C | $Si(CH_3)_2$ |
| $L_{A949}$ | $R_{B7}$ | H | C | $Si(CH_3)_2$ |
| $L_{A950}$ | $R_{B10}$ | H | C | $Si(CH_3)_2$ |

-continued

| Ligand | $R^1$ | $R^2$ | X | Y |
|---|---|---|---|---|
| $L_{A951}$ | $R_{A3}$ | H | C | $Si(CH_3)_2$ |
| $L_{A952}$ | $R_{A34}$ | H | C | $Si(CH_3)_2$ |
| $L_{A953}$ | H | $R_{B1}$ | C | S |
| $L_{A954}$ | $R_{B1}$ | $R_{B1}$ | C | S |
| $L_{A955}$ | $R_{B3}$ | $R_{B1}$ | C | S |
| $L_{A956}$ | $R_{B4}$ | $R_{B1}$ | C | S |
| $L_{A957}$ | $R_{B7}$ | $R_{B1}$ | C | S |
| $L_{A958}$ | $R_{B10}$ | $R_{B1}$ | C | S |
| $L_{A959}$ | $R_{A3}$ | $R_{B1}$ | C | S |
| $L_{A960}$ | $R_{A34}$ | $R_{B1}$ | C | S |
| $L_{A961}$ | H | $R_{B1}$ | C | O |
| $L_{A962}$ | $R_{B1}$ | $R_{B1}$ | C | O |
| $L_{A963}$ | $R_{B3}$ | $R_{B1}$ | C | O |
| $L_{A964}$ | $R_{B4}$ | $R_{B1}$ | C | O |
| $L_{A965}$ | $R_{B7}$ | $R_{B1}$ | C | O |
| $L_{A966}$ | $R_{B10}$ | $R_{B1}$ | C | O |
| $L_{A967}$ | $R_{A3}$ | $R_{B1}$ | C | O |
| $L_{A968}$ | $R_{A34}$ | $R_{B1}$ | C | O |
| $L_{A969}$ | H | $R_{B1}$ | C | $NCH_3$ |
| $L_{A970}$ | $R_{B1}$ | $R_{B1}$ | C | $NCH_3$ |
| $L_{A971}$ | $R_{B3}$ | $R_{B1}$ | C | $NCH_3$ |
| $L_{A972}$ | $R_{B4}$ | $R_{B1}$ | C | $NCH_3$ |
| $L_{A973}$ | $R_{B7}$ | $R_{B1}$ | C | $NCH_3$ |
| $L_{A974}$ | $R_{B10}$ | $R_{B1}$ | C | $NCH_3$ |
| $L_{A975}$ | $R_{A3}$ | $R_{B1}$ | C | $NCH_3$ |
| $L_{A976}$ | $R_{A34}$ | $R_{B1}$ | C | $NCH_3$ |
| $L_{A977}$ | H | $R_{B1}$ | C | $C(CH_3)_2$ |
| $L_{A978}$ | $R_{B1}$ | $R_{B1}$ | C | $C(CH_3)_2$ |
| $L_{A979}$ | $R_{B3}$ | $R_{B1}$ | C | $C(CH_3)_2$ |
| $L_{A980}$ | $R_{B4}$ | $R_{B1}$ | C | $C(CH_3)_2$ |
| $L_{A981}$ | $R_{B7}$ | $R_{B1}$ | C | $C(CH_3)_2$ |
| $L_{A982}$ | $R_{B10}$ | $R_{B1}$ | C | $C(CH_3)_2$ |
| $L_{A983}$ | $R_{A3}$ | $R_{B1}$ | C | $C(CH_3)_2$ |
| $L_{A984}$ | $R_{A34}$ | $R_{B1}$ | C | $C(CH_3)_2$ |
| $L_{A985}$ | H | $R_{B1}$ | C | $Si(CH_3)_2$ |
| $L_{A986}$ | $R_{B1}$ | $R_{B1}$ | C | $Si(CH_3)_2$ |
| $L_{A987}$ | $R_{B3}$ | $R_{B1}$ | C | $Si(CH_3)_2$ |
| $L_{A988}$ | $R_{B4}$ | $R_{B1}$ | C | $Si(CH_3)_2$ |
| $L_{A989}$ | $R_{B7}$ | $R_{B1}$ | C | $Si(CH_3)_2$ |
| $L_{A990}$ | $R_{B10}$ | $R_{B1}$ | C | $Si(CH_3)_2$ |
| $L_{A991}$ | $R_{A3}$ | $R_{B1}$ | C | $Si(CH_3)_2$ |
| $L_{A992}$ | $R_{A34}$ | $R_{B1}$ | C | $Si(CH_3)_2$ |
| $L_{A993}$ | H | $R_{B2}$ | C | S |
| $L_{A994}$ | $R_{B1}$ | $R_{B2}$ | C | S |
| $L_{A995}$ | $R_{B3}$ | $R_{B2}$ | C | S |
| $L_{A996}$ | $R_{B4}$ | $R_{B2}$ | C | S |
| $L_{A997}$ | $R_{B7}$ | $R_{B2}$ | C | S |
| $L_{A998}$ | $R_{B10}$ | $R_{B2}$ | C | S |
| $L_{A999}$ | $R_{A3}$ | $R_{B2}$ | C | S |
| $L_{A1000}$ | $R_{A34}$ | $R_{B2}$ | C | S |
| $L_{A1001}$ | H | $R_{B2}$ | C | O |
| $L_{A1002}$ | $R_{B1}$ | $R_{B2}$ | C | O |
| $L_{A1003}$ | $R_{B3}$ | $R_{B2}$ | C | O |
| $L_{A1004}$ | $R_{B4}$ | $R_{B2}$ | C | O |
| $L_{A1005}$ | $R_{B7}$ | $R_{B2}$ | C | O |
| $L_{A1006}$ | $R_{B10}$ | $R_{B2}$ | C | O |
| $L_{A1007}$ | $R_{A3}$ | $R_{B2}$ | C | O |
| $L_{A1008}$ | $R_{A34}$ | $R_{B2}$ | C | O |
| $L_{A1009}$ | H | $R_{B2}$ | C | $NCH_3$ |
| $L_{A1010}$ | $R_{B1}$ | $R_{B2}$ | C | $NCH_3$ |
| $L_{A1011}$ | $R_{B3}$ | $R_{B2}$ | C | $NCH_3$ |
| $L_{A1012}$ | $R_{B4}$ | $R_{B2}$ | C | $NCH_3$ |
| $L_{A1013}$ | $R_{B7}$ | $R_{B2}$ | C | $NCH_3$ |
| $L_{A1014}$ | $R_{B10}$ | $R_{B2}$ | C | $NCH_3$ |
| $L_{A1015}$ | $R_{A3}$ | $R_{B2}$ | C | $NCH_3$ |
| $L_{A1016}$ | $R_{A34}$ | $R_{B2}$ | C | $NCH_3$ |
| $L_{A1017}$ | H | $R_{B2}$ | C | $C(CH_3)_2$ |
| $L_{A1018}$ | $R_{B1}$ | $R_{B2}$ | C | $C(CH_3)_2$ |
| $L_{A1019}$ | $R_{B3}$ | $R_{B2}$ | C | $C(CH_3)_2$ |
| $L_{A1020}$ | $R_{B4}$ | $R_{B2}$ | C | $C(CH_3)_2$ |
| $L_{A1021}$ | $R_{B7}$ | $R_{B2}$ | C | $C(CH_3)_2$ |
| $L_{A1022}$ | $R_{B10}$ | $R_{B2}$ | C | $C(CH_3)_2$ |
| $L_{A1023}$ | $R_{A3}$ | $R_{B2}$ | C | $C(CH_3)_2$ |
| $L_{A1024}$ | $R_{A34}$ | $R_{B2}$ | C | $C(CH_3)_2$ |
| $L_{A1025}$ | H | $R_{B2}$ | C | $Si(CH_3)_2$ |
| $L_{A1026}$ | $R_{B1}$ | $R_{B2}$ | C | $Si(CH_3)_2$ |
| $L_{A1027}$ | $R_{B3}$ | $R_{B2}$ | C | $Si(CH_3)_2$ |
| $L_{A1028}$ | $R_{B4}$ | $R_{B2}$ | C | $Si(CH_3)_2$ |
| $L_{A1029}$ | $R_{B7}$ | $R_{B2}$ | C | $Si(CH_3)_2$ |
| $L_{A1030}$ | $R_{B10}$ | $R_{B2}$ | C | $Si(CH_3)_2$ |
| $L_{A1031}$ | $R_{A3}$ | $R_{B2}$ | C | $Si(CH_3)_2$ |
| $L_{A1032}$ | $R_{A34}$ | $R_{B2}$ | C | $Si(CH_3)_2$ |
| $L_{A1033}$ | H | H | N | S |
| $L_{A1034}$ | $R_{B1}$ | H | N | S |
| $L_{A1035}$ | $R_{B3}$ | H | N | S |
| $L_{A1036}$ | $R_{B4}$ | H | N | S |
| $L_{A1037}$ | $R_{B7}$ | H | N | S |
| $L_{A1038}$ | $R_{B10}$ | H | N | S |
| $L_{A1039}$ | $R_{A3}$ | H | N | S |
| $L_{A1040}$ | $R_{A34}$ | H | N | S |
| $L_{A1041}$ | H | H | N | O |
| $L_{A1042}$ | $R_{B1}$ | H | N | O |
| $L_{A1043}$ | $R_{B3}$ | H | N | O |
| $L_{A1044}$ | $R_{B4}$ | H | N | O |
| $L_{A1045}$ | $R_{B7}$ | H | N | O |
| $L_{A1046}$ | $R_{B10}$ | H | N | O |
| $L_{A1047}$ | $R_{A3}$ | H | N | O |
| $L_{A1048}$ | $R_{A34}$ | H | N | O |
| $L_{A1049}$ | H | H | N | $NCH_3$ |
| $L_{A1050}$ | $R_{B1}$ | H | N | $NCH_3$ |
| $L_{A1051}$ | $R_{B3}$ | H | N | $NCH_3$ |
| $L_{A1052}$ | $R_{B4}$ | H | N | $NCH_3$ |
| $L_{A1053}$ | $R_{B7}$ | H | N | $NCH_3$ |
| $L_{A1054}$ | $R_{B10}$ | H | N | $NCH_3$ |
| $L_{A1055}$ | $R_{A3}$ | H | N | $NCH_3$ |
| $L_{A1056}$ | $R_{A34}$ | H | N | $NCH_3$ |
| $L_{A1057}$ | H | H | N | $C(CH_3)_2$ |
| $L_{A1058}$ | $R_{B1}$ | H | N | $C(CH_3)_2$ |
| $L_{A1059}$ | $R_{B3}$ | H | N | $C(CH_3)_2$ |
| $L_{A1060}$ | $R_{B4}$ | H | N | $C(CH_3)_2$ |
| $L_{A1061}$ | $R_{B7}$ | H | N | $C(CH_3)_2$ |
| $L_{A1062}$ | $R_{B10}$ | H | N | $C(CH_3)_2$ |
| $L_{A1063}$ | $R_{A3}$ | H | N | $C(CH_3)_2$ |
| $L_{A1064}$ | $R_{A34}$ | H | N | $C(CH_3)_2$ |
| $L_{A1065}$ | H | H | N | $Si(CH_3)_2$ |
| $L_{A1066}$ | $R_{B1}$ | H | N | $Si(CH_3)_2$ |
| $L_{A1067}$ | $R_{B3}$ | H | N | $Si(CH_3)_2$ |
| $L_{A1068}$ | $R_{B4}$ | H | N | $Si(CH_3)_2$ |
| $L_{A1069}$ | $R_{B7}$ | H | N | $Si(CH_3)_2$ |
| $L_{A1070}$ | $R_{B10}$ | H | N | $Si(CH_3)_2$ |
| $L_{A1071}$ | $R_{A3}$ | H | N | $Si(CH_3)_2$ |
| $L_{A1072}$ | $R_{A34}$ | H | N | $Si(CH_3)_2$ |
| $L_{A1073}$ | H | $R_{B1}$ | N | S |
| $L_{A1074}$ | $R_{B1}$ | $R_{B1}$ | N | S |
| $L_{A1075}$ | $R_{B3}$ | $R_{B1}$ | N | S |
| $L_{A1076}$ | $R_{B4}$ | $R_{B1}$ | N | S |
| $L_{A1077}$ | $R_{B7}$ | $R_{B1}$ | N | S |
| $L_{A1078}$ | $R_{B10}$ | $R_{B1}$ | N | S |
| $L_{A1079}$ | $R_{A3}$ | $R_{B1}$ | N | S |
| $L_{A1080}$ | $R_{A34}$ | $R_{B1}$ | N | S |
| $L_{A1081}$ | H | $R_{B1}$ | N | O |
| $L_{A1082}$ | $R_{B1}$ | $R_{B1}$ | N | O |
| $L_{A1083}$ | $R_{B3}$ | $R_{B1}$ | N | O |
| $L_{A1084}$ | $R_{B4}$ | $R_{B1}$ | N | O |
| $L_{A1085}$ | $R_{B7}$ | $R_{B1}$ | N | O |
| $L_{A1086}$ | $R_{B10}$ | $R_{B1}$ | N | O |
| $L_{A1087}$ | $R_{A3}$ | $R_{B1}$ | N | O |
| $L_{A1088}$ | $R_{A34}$ | $R_{B1}$ | N | O |
| $L_{A1089}$ | H | $R_{B1}$ | N | $NCH_3$ |
| $L_{A1090}$ | $R_{B1}$ | $R_{B1}$ | N | $NCH_3$ |
| $L_{A1091}$ | $R_{B3}$ | $R_{B1}$ | N | $NCH_3$ |
| $L_{A1092}$ | $R_{B4}$ | $R_{B1}$ | N | $NCH_3$ |
| $L_{A1093}$ | $R_{B7}$ | $R_{B1}$ | N | $NCH_3$ |
| $L_{A1094}$ | $R_{B10}$ | $R_{B1}$ | N | $NCH_3$ |
| $L_{A1095}$ | $R_{A3}$ | $R_{B1}$ | N | $NCH_3$ |
| $L_{A1096}$ | $R_{A34}$ | $R_{B1}$ | N | $NCH_3$ |
| $L_{A1097}$ | H | $R_{B1}$ | N | $C(CH_3)_2$ |
| $L_{A1098}$ | $R_{B1}$ | $R_{B1}$ | N | $C(CH_3)_2$ |
| $L_{A1099}$ | $R_{B3}$ | $R_{B1}$ | N | $C(CH_3)_2$ |
| $L_{A1100}$ | $R_{B4}$ | $R_{B1}$ | N | $C(CH_3)_2$ |
| $L_{A1101}$ | $R_{B7}$ | $R_{B1}$ | N | $C(CH_3)_2$ |
| $L_{A1102}$ | $R_{B10}$ | $R_{B1}$ | N | $C(CH_3)_2$ |
| $L_{A1103}$ | $R_{A3}$ | $R_{B1}$ | N | $C(CH_3)_2$ |
| $L_{A1104}$ | $R_{A34}$ | $R_{B1}$ | N | $C(CH_3)_2$ |

-continued

| Ligand | $R^1$ | $R^2$ | X | Y |
|---|---|---|---|---|
| $L_{A1105}$ | H | $R_{B1}$ | N | $Si(CH_3)_2$ |
| $L_{A1106}$ | $R_{B1}$ | $R_{B1}$ | N | $Si(CH_3)_2$ |
| $L_{A1107}$ | $R_{B3}$ | $R_{B1}$ | N | $Si(CH_3)_2$ |
| $L_{A1108}$ | $R_{B4}$ | $R_{B1}$ | N | $Si(CH_3)_2$ |
| $L_{A1109}$ | $R_{B7}$ | $R_{B1}$ | N | $Si(CH_3)_2$ |
| $L_{A1110}$ | $R_{B10}$ | $R_{B1}$ | N | $Si(CH_3)_2$ |
| $L_{A1111}$ | $R_{A3}$ | $R_{B1}$ | N | $Si(CH_3)_2$ |
| $L_{A1112}$ | $R_{A34}$ | $R_{B1}$ | N | $Si(CH_3)_2$ |
| $L_{A1113}$ | H | $R_{B2}$ | N | S |
| $L_{A1114}$ | $R_{B1}$ | $R_{B2}$ | N | S |
| $L_{A1115}$ | $R_{B3}$ | $R_{B2}$ | N | S |
| $L_{A1116}$ | $R_{B4}$ | $R_{B2}$ | N | S |
| $L_{A1117}$ | $R_{B7}$ | $R_{B2}$ | N | S |
| $L_{A1118}$ | $R_{B10}$ | $R_{B2}$ | N | S |
| $L_{A1119}$ | $R_{A3}$ | $R_{B2}$ | N | S |
| $L_{A1120}$ | $R_{A34}$ | $R_{B2}$ | N | S |
| $L_{A1121}$ | H | $R_{B2}$ | N | O |
| $L_{A1122}$ | $R_{B1}$ | $R_{B2}$ | N | O |
| $L_{A1123}$ | $R_{B3}$ | $R_{B2}$ | N | O |
| $L_{A1124}$ | $R_{B4}$ | $R_{B2}$ | N | O |
| $L_{A1125}$ | $R_{B7}$ | $R_{B2}$ | N | O |
| $L_{A1126}$ | $R_{B10}$ | $R_{B2}$ | N | O |
| $L_{A1127}$ | $R_{A3}$ | $R_{B2}$ | N | O |
| $L_{A1128}$ | $R_{A34}$ | $R_{B2}$ | N | O |
| $L_{A1129}$ | H | $R_{B2}$ | N | $NCH_3$ |
| $L_{A1130}$ | $R_{B1}$ | $R_{B2}$ | N | $NCH_3$ |
| $L_{A1131}$ | $R_{B3}$ | $R_{B2}$ | N | $NCH_3$ |
| $L_{A1132}$ | $R_{B4}$ | $R_{B2}$ | N | $NCH_3$ |
| $L_{A1133}$ | $R_{B7}$ | $R_{B2}$ | N | $NCH_3$ |
| $L_{A1134}$ | $R_{B10}$ | $R_{B2}$ | N | $NCH_3$ |
| $L_{A1135}$ | $R_{A3}$ | $R_{B2}$ | N | $NCH_3$ |
| $L_{A1136}$ | $R_{A34}$ | $R_{B2}$ | N | $NCH_3$ |
| $L_{A1137}$ | H | $R_{B2}$ | N | $C(CH_3)_2$ |
| $L_{A1138}$ | $R_{B1}$ | $R_{B2}$ | N | $C(CH_3)_2$ |
| $L_{A1139}$ | $R_{B3}$ | $R_{B2}$ | N | $C(CH_3)_2$ |
| $L_{A1140}$ | $R_{B4}$ | $R_{B2}$ | N | $C(CH_3)_2$ |
| $L_{A1141}$ | $R_{B7}$ | $R_{B2}$ | N | $C(CH_3)_2$ |
| $L_{A1142}$ | $R_{B10}$ | $R_{B2}$ | N | $C(CH_3)_2$ |
| $L_{A1143}$ | $R_{A3}$ | $R_{B2}$ | N | $C(CH_3)_2$ |
| $L_{A1144}$ | $R_{A34}$ | $R_{B2}$ | N | $C(CH_3)_2$ |
| $L_{A1145}$ | H | $R_{B2}$ | N | $Si(CH_3)_2$ |
| $L_{A1146}$ | $R_{B1}$ | $R_{B2}$ | N | $Si(CH_3)_2$ |
| $L_{A1147}$ | $R_{B3}$ | $R_{B2}$ | N | $Si(CH_3)_2$ |
| $L_{A1148}$ | $R_{B4}$ | $R_{B2}$ | N | $Si(CH_3)_2$ |
| $L_{A1149}$ | $R_{B7}$ | $R_{B2}$ | N | $Si(CH_3)_2$ |
| $L_{A1150}$ | $R_{B10}$ | $R_{B2}$ | N | $Si(CH_3)_2$ |
| $L_{A1151}$ | $R_{A3}$ | $R_{B2}$ | N | $Si(CH_3)_2$ |
| $L_{A1152}$ | $R_{A34}$ | $R_{B2}$ | N | $Si(CH_3)_2$ |

wherein $L_{A1153}$ through $L_{A1272}$ have a structure of Formula IX:

Formula IX

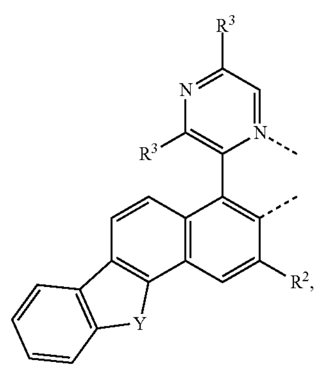

wherein $R^2$, $R^3$, and Y are defined as provided below:

| Ligand | $R^2$ | $R^3$ | Y | Ligand | $R^1$ | $R^2$ | $R^{14}$ |
|---|---|---|---|---|---|---|---|
| $L_{A1153}$ | H | H | S | $L_{A1213}$ | $R_{B1}$ | $R_{B4}$ | $NCH_3$ |
| $L_{A1154}$ | H | $R_{B1}$ | S | $L_{A1214}$ | $R_{B1}$ | $R_{B5}$ | $NCH_3$ |
| $L_{A1155}$ | H | $R_{B2}$ | S | $L_{A1215}$ | $R_{B1}$ | $R_{A34}$ | $NCH_3$ |
| $L_{A1156}$ | H | $R_{B3}$ | S | $L_{A1216}$ | $R_{B1}$ | $R_{A52}$ | $NCH_3$ |
| $L_{A1157}$ | H | $R_{B4}$ | S | $L_{A1217}$ | $R_{B1}$ | H | $C(CH_3)_2$ |
| $L_{A1158}$ | H | $R_{B5}$ | S | $L_{A1218}$ | $R_{B1}$ | $R_{B1}$ | $C(CH_3)_2$ |
| $L_{A1159}$ | H | $R_{A34}$ | S | $L_{A1219}$ | $R_{B1}$ | $R_{B2}$ | $C(CH_3)_2$ |
| $L_{A1160}$ | H | $R_{A52}$ | S | $L_{A1220}$ | $R_{B1}$ | $R_{B3}$ | $C(CH_3)_2$ |
| $L_{A1161}$ | H | H | O | $L_{A1221}$ | $R_{B1}$ | $R_{B4}$ | $C(CH_3)_2$ |
| $L_{A1162}$ | H | $R_{B1}$ | O | $L_{A1222}$ | $R_{B1}$ | $R_{B5}$ | $C(CH_3)_2$ |
| $L_{A1163}$ | H | $R_{B2}$ | O | $L_{A1223}$ | $R_{B1}$ | $R_{A34}$ | $C(CH_3)_2$ |
| $L_{A1164}$ | H | $R_{B3}$ | O | $L_{A1224}$ | $R_{B1}$ | $R_{A52}$ | $C(CH_3)_2$ |
| $L_{A1165}$ | H | $R_{B4}$ | O | $L_{A1225}$ | $R_{B1}$ | H | $Si(CH_3)_2$ |
| $L_{A1166}$ | H | $R_{B5}$ | O | $L_{A1226}$ | $R_{B1}$ | $R_{B1}$ | $Si(CH_3)_2$ |
| $L_{A1167}$ | H | $R_{A34}$ | O | $L_{A1227}$ | $R_{B1}$ | $R_{B2}$ | $Si(CH_3)_2$ |
| $L_{A1168}$ | H | $R_{A52}$ | O | $L_{A1228}$ | $R_{B1}$ | $R_{B3}$ | $Si(CH_3)_2$ |
| $L_{A1169}$ | H | H | $NCH_3$ | $L_{A1229}$ | $R_{B1}$ | $R_{B4}$ | $Si(CH_3)_2$ |
| $L_{A1170}$ | H | $R_{B1}$ | $NCH_3$ | $L_{A1230}$ | $R_{B1}$ | $R_{B5}$ | $Si(CH_3)_2$ |
| $L_{A1171}$ | H | $R_{B2}$ | $NCH_3$ | $L_{A1231}$ | $R_{B1}$ | $R_{A34}$ | $Si(CH_3)_2$ |
| $L_{A1172}$ | H | $R_{B3}$ | $NCH_3$ | $L_{A1232}$ | $R_{B1}$ | $R_{A52}$ | $Si(CH_3)_2$ |
| $L_{A1173}$ | H | $R_{B4}$ | $NCH_3$ | $L_{A1233}$ | $R_{B2}$ | H | S |
| $L_{A1174}$ | H | $R_{B5}$ | $NCH_3$ | $L_{A1234}$ | $R_{B2}$ | $R_{B1}$ | S |
| $L_{A1175}$ | H | $R_{A34}$ | $NCH_3$ | $L_{A1235}$ | $R_{B2}$ | $R_{B2}$ | S |
| $L_{A1176}$ | H | $R_{A52}$ | $NCH_3$ | $L_{A1236}$ | $R_{B2}$ | $R_{B3}$ | S |
| $L_{A1177}$ | H | H | $C(CH_3)_2$ | $L_{A1237}$ | $R_{B2}$ | $R_{B4}$ | S |
| $L_{A1178}$ | H | $R_{B1}$ | $C(CH_3)_2$ | $L_{A1238}$ | $R_{B2}$ | $R_{B5}$ | S |
| $L_{A1179}$ | H | $R_{B2}$ | $C(CH_3)_2$ | $L_{A1239}$ | $R_{B2}$ | $R_{A34}$ | S |
| $L_{A1180}$ | H | $R_{B3}$ | $C(CH_3)_2$ | $L_{A1240}$ | $R_{B2}$ | $R_{A52}$ | S |
| $L_{A1181}$ | H | $R_{B4}$ | $C(CH_3)_2$ | $L_{A1241}$ | $R_{B2}$ | H | O |
| $L_{A1182}$ | H | $R_{B5}$ | $C(CH_3)_2$ | $L_{A1242}$ | $R_{B2}$ | $R_{B1}$ | O |
| $L_{A1183}$ | H | $R_{A34}$ | $C(CH_3)_2$ | $L_{A1243}$ | $R_{B2}$ | $R_{B2}$ | O |
| $L_{A1184}$ | H | $R_{A52}$ | $C(CH_3)_2$ | $L_{A1244}$ | $R_{B2}$ | $R_{B3}$ | O |
| $L_{A1185}$ | H | H | $Si(CH_3)_2$ | $L_{A1245}$ | $R_{B2}$ | $R_{B4}$ | O |
| $L_{A1186}$ | H | $R_{B1}$ | $Si(CH_3)_2$ | $L_{A1246}$ | $R_{B2}$ | $R_{B5}$ | O |
| $L_{A1187}$ | H | $R_{B2}$ | $Si(CH_3)_2$ | $L_{A1247}$ | $R_{B2}$ | $R_{A34}$ | O |
| $L_{A1188}$ | H | $R_{B3}$ | $Si(CH_3)_2$ | $L_{A1248}$ | $R_{B2}$ | $R_{A52}$ | O |
| $L_{A1189}$ | H | $R_{B4}$ | $Si(CH_3)_2$ | $L_{A1249}$ | $R_{B2}$ | H | $NCH_3$ |
| $L_{A1190}$ | H | $R_{B5}$ | $Si(CH_3)_2$ | $L_{A1250}$ | $R_{B2}$ | $R_{B1}$ | $NCH_3$ |
| $L_{A1191}$ | H | $R_{A34}$ | $Si(CH_3)_2$ | $L_{A1251}$ | $R_{B2}$ | $R_{B2}$ | $NCH_3$ |
| $L_{A1192}$ | H | $R_{A52}$ | $Si(CH_3)_2$ | $L_{A1252}$ | $R_{B2}$ | $R_{B3}$ | $NCH_3$ |
| $L_{A1193}$ | $R_{B1}$ | H | S | $L_{A1253}$ | $R_{B2}$ | $R_{B4}$ | $NCH_3$ |
| $L_{A1194}$ | $R_{B1}$ | $R_{B1}$ | S | $L_{A1254}$ | $R_{B2}$ | $R_{B5}$ | $NCH_3$ |
| $L_{A1195}$ | $R_{B1}$ | $R_{B2}$ | S | $L_{A1255}$ | $R_{B2}$ | $R_{A34}$ | $NCH_3$ |
| $L_{A1196}$ | $R_{B1}$ | $R_{B3}$ | S | $L_{A1256}$ | $R_{B2}$ | $R_{A52}$ | $NCH_3$ |
| $L_{A1197}$ | $R_{B1}$ | $R_{B4}$ | S | $L_{A1257}$ | $R_{B2}$ | H | $C(CH_3)_2$ |
| $L_{A1198}$ | $R_{B1}$ | $R_{B5}$ | S | $L_{A1258}$ | $R_{B2}$ | $R_{B1}$ | $C(CH_3)_2$ |
| $L_{A1199}$ | $R_{B1}$ | $R_{A34}$ | S | $L_{A1259}$ | $R_{B2}$ | $R_{B2}$ | $C(CH_3)_2$ |
| $L_{A1200}$ | $R_{B1}$ | $R_{A52}$ | S | $L_{A1260}$ | $R_{B2}$ | $R_{B3}$ | $C(CH_3)_2$ |
| $L_{A1201}$ | $R_{B1}$ | H | O | $L_{A1261}$ | $R_{B2}$ | $R_{B4}$ | $C(CH_3)_2$ |
| $L_{A1202}$ | $R_{B1}$ | $R_{B1}$ | O | $L_{A1262}$ | $R_{B2}$ | $R_{B5}$ | $C(CH_3)_2$ |
| $L_{A1203}$ | $R_{B1}$ | $R_{B2}$ | O | $L_{A1263}$ | $R_{B2}$ | $R_{A34}$ | $C(CH_3)_2$ |
| $L_{A1204}$ | $R_{B1}$ | $R_{B3}$ | O | $L_{A1264}$ | $R_{B2}$ | $R_{A52}$ | $C(CH_3)_2$ |
| $L_{A1205}$ | $R_{B1}$ | $R_{B4}$ | O | $L_{A1265}$ | $R_{B2}$ | H | $Si(CH_3)_2$ |
| $L_{A1206}$ | $R_{B1}$ | $R_{B5}$ | O | $L_{A1266}$ | $R_{B2}$ | $R_{B1}$ | $Si(CH_3)_2$ |
| $L_{A1207}$ | $R_{B1}$ | $R_{A34}$ | O | $L_{A1267}$ | $R_{B2}$ | $R_{B2}$ | $Si(CH_3)_2$ |
| $L_{A1208}$ | $R_{B1}$ | $R_{A52}$ | O | $L_{A1268}$ | $R_{B2}$ | $R_{B3}$ | $Si(CH_3)_2$ |
| $L_{A1209}$ | $R_{B1}$ | H | $NCH_3$ | $L_{A1269}$ | $R_{B2}$ | $R_{B4}$ | $Si(CH_3)_2$ |
| $L_{A1210}$ | $R_{B1}$ | $R_{B1}$ | $NCH_3$ | $L_{A1270}$ | $R_{B2}$ | $R_{B5}$ | $Si(CH_3)_2$ |
| $L_{A1211}$ | $R_{B1}$ | $R_{B2}$ | $NCH_3$ | $L_{A1271}$ | $R_{B2}$ | $R_{A34}$ | $Si(CH_3)_2$ |
| $L_{A1212}$ | $R_{B1}$ | $R_{B3}$ | $NCH_3$ | $L_{A1272}$ | $R_{B2}$ | $R_{A52}$ | $Si(CH_3)_2$ |

wherein $L_{A1273}$ through $L_{A1368}$ have a structure of Formula X:

Formula X

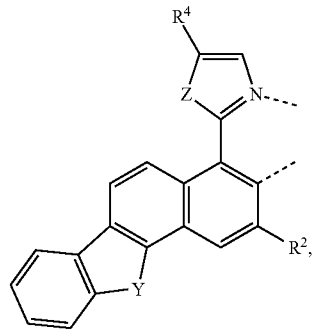

wherein $R^2$, $R^4$, Y, and Z are defined as provided below:

| Ligand | $R^2$ | $R^4$ | Y | Z |
|---|---|---|---|---|
| $L_{A1273}$ | H | H | S | S |
| $L_{A1274}$ | H | $R_{B1}$ | S | S |
| $L_{A1275}$ | H | $R_{B3}$ | S | S |
| $L_{A1276}$ | H | $R_{B4}$ | S | S |
| $L_{A1277}$ | H | $R_{B7}$ | S | S |
| $L_{A1278}$ | H | $R_{B10}$ | S | S |
| $L_{A1279}$ | H | $R_{A3}$ | S | S |
| $L_{A1280}$ | H | $R_{A34}$ | S | S |
| $L_{A1281}$ | H | H | S | O |
| $L_{A1282}$ | H | $R_{B1}$ | S | O |
| $L_{A1283}$ | H | $R_{B3}$ | S | O |
| $L_{A1284}$ | H | $R_{B4}$ | S | O |
| $L_{A1285}$ | H | $R_{B7}$ | S | O |
| $L_{A1286}$ | H | $R_{B10}$ | S | O |
| $L_{A1287}$ | H | $R_{A3}$ | S | O |
| $L_{A1288}$ | H | $R_{A34}$ | S | O |
| $L_{A1289}$ | H | H | S | $NCH_3$ |
| $L_{A1290}$ | H | $R_{B1}$ | S | $NCH_3$ |
| $L_{A1291}$ | H | $R_{B3}$ | S | $NCH_3$ |
| $L_{A1292}$ | H | $R_{B4}$ | S | $NCH_3$ |
| $L_{A1293}$ | H | $R_{B7}$ | S | $NCH_3$ |
| $L_{A1294}$ | H | $R_{B10}$ | S | $NCH_3$ |
| $L_{A1295}$ | H | $R_{A3}$ | S | $NCH_3$ |
| $L_{A1296}$ | H | $R_{A34}$ | S | $NCH_3$ |
| $L_{A1297}$ | H | H | O | S |
| $L_{A1298}$ | H | $R_{B1}$ | O | S |
| $L_{A1299}$ | H | $R_{B3}$ | O | S |
| $L_{A1300}$ | H | $R_{B4}$ | O | S |
| $L_{A1301}$ | H | $R_{B7}$ | O | S |
| $L_{A1302}$ | H | $R_{B10}$ | O | S |
| $L_{A1303}$ | H | $R_{A3}$ | O | S |
| $L_{A1304}$ | H | $R_{A34}$ | O | S |
| $L_{A1305}$ | H | H | O | O |
| $L_{A1306}$ | H | $R_{B1}$ | O | O |
| $L_{A1307}$ | H | $R_{B3}$ | O | O |
| $L_{A1308}$ | H | $R_{B4}$ | O | O |
| $L_{A1309}$ | H | $R_{B7}$ | O | O |
| $L_{A1310}$ | H | $R_{B10}$ | O | O |
| $L_{A1311}$ | H | $R_{A3}$ | O | O |
| $L_{A1312}$ | H | $R_{A34}$ | O | O |
| $L_{A1313}$ | H | H | O | $NCH_3$ |
| $L_{A1314}$ | H | $R_{B1}$ | O | $NCH_3$ |
| $L_{A1315}$ | H | $R_{B3}$ | O | $NCH_3$ |
| $L_{A1316}$ | H | $R_{B4}$ | O | $NCH_3$ |
| $L_{A1317}$ | H | $R_{B7}$ | O | $NCH_3$ |
| $L_{A1318}$ | H | $R_{B10}$ | O | $NCH_3$ |
| $L_{A1319}$ | H | $R_{A3}$ | O | $NCH_3$ |
| $L_{A1320}$ | H | $R_{A34}$ | O | $NCH_3$ |
| $L_{A1321}$ | $R_{B1}$ | H | S | S |
| $L_{A1322}$ | $R_{B1}$ | $R_{B1}$ | S | S |
| $L_{A1323}$ | $R_{B1}$ | $R_{B3}$ | S | S |
| $L_{A1324}$ | $R_{B1}$ | $R_{B4}$ | S | S |
| $L_{A1325}$ | $R_{B1}$ | $R_{B7}$ | S | S |

-continued

| Ligand | $R^2$ | $R^4$ | Y | Z |
|---|---|---|---|---|
| $L_{A1326}$ | $R_{B1}$ | $R_{B10}$ | S | S |
| $L_{A1327}$ | $R_{B1}$ | $R_{A3}$ | S | S |
| $L_{A1328}$ | $R_{B1}$ | $R_{A34}$ | S | S |
| $L_{A1329}$ | $R_{B1}$ | H | S | O |
| $L_{A1330}$ | $R_{B1}$ | $R_{B1}$ | S | O |
| $L_{A1331}$ | $R_{B1}$ | $R_{B3}$ | S | O |
| $L_{A1332}$ | $R_{B1}$ | $R_{B4}$ | S | O |
| $L_{A1333}$ | $R_{B1}$ | $R_{B7}$ | S | O |
| $L_{A1334}$ | $R_{B1}$ | $R_{B10}$ | S | O |
| $L_{A1335}$ | $R_{B1}$ | $R_{A3}$ | S | O |
| $L_{A1336}$ | $R_{B1}$ | $R_{A34}$ | S | O |
| $L_{A1337}$ | $R_{B1}$ | H | S | $NCH_3$ |
| $L_{A1338}$ | $R_{B1}$ | $R_{B1}$ | S | $NCH_3$ |
| $L_{A1339}$ | $R_{B1}$ | $R_{B3}$ | S | $NCH_3$ |
| $L_{A1340}$ | $R_{B1}$ | $R_{B4}$ | S | $NCH_3$ |
| $L_{A1341}$ | $R_{B1}$ | $R_{B7}$ | S | $NCH_3$ |
| $L_{A1342}$ | $R_{B1}$ | $R_{B10}$ | S | $NCH_3$ |
| $L_{A1343}$ | $R_{B1}$ | $R_{A3}$ | S | $NCH_3$ |
| $L_{A1344}$ | $R_{B1}$ | $R_{A34}$ | S | $NCH_3$ |
| $L_{A1345}$ | $R_{B1}$ | H | O | S |
| $L_{A1346}$ | $R_{B1}$ | $R_{B1}$ | O | S |
| $L_{A1347}$ | $R_{B1}$ | $R_{B3}$ | O | S |
| $L_{A1348}$ | $R_{B1}$ | $R_{B4}$ | O | S |
| $L_{A1349}$ | $R_{B1}$ | $R_{B7}$ | O | S |
| $L_{A1350}$ | $R_{B1}$ | $R_{B10}$ | O | S |
| $L_{A1351}$ | $R_{B1}$ | $R_{A3}$ | O | S |
| $L_{A1352}$ | $R_{B1}$ | $R_{A34}$ | O | S |
| $L_{A1353}$ | $R_{B1}$ | H | O | O |
| $L_{A1354}$ | $R_{B1}$ | $R_{B1}$ | O | O |
| $L_{A1355}$ | $R_{B1}$ | $R_{B3}$ | O | O |
| $L_{A1356}$ | $R_{B1}$ | $R_{B4}$ | O | O |
| $L_{A1357}$ | $R_{B1}$ | $R_{B7}$ | O | O |
| $L_{A1358}$ | $R_{B1}$ | $R_{B10}$ | O | O |
| $L_{A1359}$ | $R_{B1}$ | $R_{A3}$ | O | O |
| $L_{A1360}$ | $R_{B1}$ | $R_{A34}$ | O | O |
| $L_{A1361}$ | $R_{B1}$ | H | O | $NCH_3$ |
| $L_{A1362}$ | $R_{B1}$ | $R_{B1}$ | O | $NCH_3$ |
| $L_{A1363}$ | $R_{B1}$ | $R_{B3}$ | O | $NCH_3$ |
| $L_{A1364}$ | $R_{B1}$ | $R_{B4}$ | O | $NCH_3$ |
| $L_{A1365}$ | $R_{B1}$ | $R_{B7}$ | O | $NCH_3$ |
| $L_{A1366}$ | $R_{B1}$ | $R_{B10}$ | O | $NCH_3$ |
| $L_{A1367}$ | $R_{B1}$ | $R_{A3}$ | O | $NCH_3$ |
| $L_{A1368}$ | $R_{B1}$ | $R_{A34}$ | O | $NCH_3$ |

wherein $L_{A1369}$ through $L_{A1608}$ have a structure of Formula XI:

Formula XI

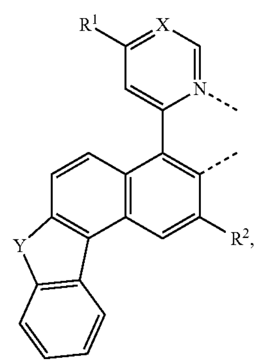

wherein $R^1$, $R^2$, X, and Y are defined as provided below:

| Ligand | $R^1$ | $R^2$ | X | Y |
|---|---|---|---|---|
| $L_{A1369}$ | H | H | C | S |
| $L_{A1370}$ | $R_{B1}$ | H | C | S |
| $L_{A1371}$ | $R_{B3}$ | H | C | S |

-continued

| Ligand | $R^1$ | $R^2$ | X | Y |
|---|---|---|---|---|
| $L_{A1372}$ | $R_{B4}$ | H | C | S |
| $L_{A1373}$ | $R_{B7}$ | H | C | S |
| $L_{A1374}$ | $R_{B10}$ | H | C | S |
| $L_{A1375}$ | $R_{A3}$ | H | C | S |
| $L_{A1376}$ | $R_{A34}$ | H | C | S |
| $L_{A1377}$ | H | H | C | O |
| $L_{A1378}$ | $R_{B1}$ | H | C | O |
| $L_{A1379}$ | $R_{B3}$ | H | C | O |
| $L_{A1380}$ | $R_{B4}$ | H | C | O |
| $L_{A1381}$ | $R_{B7}$ | H | C | O |
| $L_{A1382}$ | $R_{B10}$ | H | C | O |
| $L_{A1383}$ | $R_{A3}$ | H | C | O |
| $L_{A1384}$ | $R_{A34}$ | H | C | O |
| $L_{A1385}$ | H | H | C | $NCH_3$ |
| $L_{A1386}$ | $R_{B1}$ | H | C | $NCH_3$ |
| $L_{A1387}$ | $R_{B3}$ | H | C | $NCH_3$ |
| $L_{A1388}$ | $R_{B4}$ | H | C | $NCH_3$ |
| $L_{A1389}$ | $R_{B7}$ | H | C | $NCH_3$ |
| $L_{A1390}$ | $R_{B10}$ | H | C | $NCH_3$ |
| $L_{A1391}$ | $R_{A3}$ | H | C | $NCH_3$ |
| $L_{A1392}$ | $R_{A34}$ | H | C | $NCH_3$ |
| $L_{A1393}$ | H | H | C | $C(CH_3)_2$ |
| $L_{A1394}$ | $R_{B1}$ | H | C | $C(CH_3)_2$ |
| $L_{A1395}$ | $R_{B3}$ | H | C | $C(CH_3)_2$ |
| $L_{A1396}$ | $R_{B4}$ | H | C | $C(CH_3)_2$ |
| $L_{A1397}$ | $R_{B7}$ | H | C | $C(CH_3)_2$ |
| $L_{A1398}$ | $R_{B10}$ | H | C | $C(CH_3)_2$ |
| $L_{A1399}$ | $R_{A3}$ | H | C | $C(CH_3)_2$ |
| $L_{A1400}$ | $R_{A34}$ | H | C | $C(CH_3)_2$ |
| $L_{A1401}$ | H | H | C | $Si(CH_3)_2$ |
| $L_{A1402}$ | $R_{B1}$ | H | C | $Si(CH_3)_2$ |
| $L_{A1403}$ | $R_{B3}$ | H | C | $Si(CH_3)_2$ |
| $L_{A1404}$ | $R_{B4}$ | H | C | $Si(CH_3)_2$ |
| $L_{A1405}$ | $R_{B7}$ | H | C | $Si(CH_3)_2$ |
| $L_{A1406}$ | $R_{B10}$ | H | C | $Si(CH_3)_2$ |
| $L_{A1407}$ | $R_{A3}$ | H | C | $Si(CH_3)_2$ |
| $L_{A1408}$ | $R_{A34}$ | H | C | $Si(CH_3)_2$ |
| $L_{A1409}$ | H | $R_{B1}$ | C | S |
| $L_{A1410}$ | $R_{B1}$ | $R_{B1}$ | C | S |
| $L_{A1411}$ | $R_{B3}$ | $R_{B1}$ | C | S |
| $L_{A1412}$ | $R_{B4}$ | $R_{B1}$ | C | S |
| $L_{A1413}$ | $R_{B7}$ | $R_{B1}$ | C | S |
| $L_{A1414}$ | $R_{B10}$ | $R_{B1}$ | C | S |
| $L_{A1415}$ | $R_{A3}$ | $R_{B1}$ | C | S |
| $L_{A1416}$ | $R_{A34}$ | $R_{B1}$ | C | S |
| $L_{A1417}$ | H | $R_{B1}$ | C | O |
| $L_{A1418}$ | $R_{B1}$ | $R_{B1}$ | C | O |
| $L_{A1419}$ | $R_{B3}$ | $R_{B1}$ | C | O |
| $L_{A1420}$ | $R_{B4}$ | $R_{B1}$ | C | O |
| $L_{A1421}$ | $R_{B7}$ | $R_{B1}$ | C | O |
| $L_{A1422}$ | $R_{B10}$ | $R_{B1}$ | C | O |
| $L_{A1423}$ | $R_{A3}$ | $R_{B1}$ | C | O |
| $L_{A1424}$ | $R_{A34}$ | $R_{B1}$ | C | O |
| $L_{A1425}$ | H | $R_{B1}$ | C | $NCH_3$ |
| $L_{A1426}$ | $R_{B1}$ | $R_{B1}$ | C | $NCH_3$ |
| $L_{A1427}$ | $R_{B3}$ | $R_{B1}$ | C | $NCH_3$ |
| $L_{A1428}$ | $R_{B4}$ | $R_{B1}$ | C | $NCH_3$ |
| $L_{A1429}$ | $R_{B7}$ | $R_{B1}$ | C | $NCH_3$ |
| $L_{A1430}$ | $R_{B10}$ | $R_{B1}$ | C | $NCH_3$ |
| $L_{A1431}$ | $R_{A3}$ | $R_{B1}$ | C | $NCH_3$ |
| $L_{A1432}$ | $R_{A34}$ | $R_{B1}$ | C | $NCH_3$ |
| $L_{A1433}$ | H | $R_{B1}$ | C | $C(CH_3)_2$ |
| $L_{A1434}$ | $R_{B1}$ | $R_{B1}$ | C | $C(CH_3)_2$ |
| $L_{A1435}$ | $R_{B3}$ | $R_{B1}$ | C | $C(CH_3)_2$ |
| $L_{A1436}$ | $R_{B4}$ | $R_{B1}$ | C | $C(CH_3)_2$ |
| $L_{A1437}$ | $R_{B7}$ | $R_{B1}$ | C | $C(CH_3)_2$ |
| $L_{A1438}$ | $R_{B10}$ | $R_{B1}$ | C | $C(CH_3)_2$ |
| $L_{A1439}$ | $R_{A3}$ | $R_{B1}$ | C | $C(CH_3)_2$ |
| $L_{A1440}$ | $R_{A34}$ | $R_{B1}$ | C | $C(CH_3)_2$ |
| $L_{A1441}$ | H | $R_{B1}$ | C | $Si(CH_3)_2$ |
| $L_{A1442}$ | $R_{B1}$ | $R_{B1}$ | C | $Si(CH_3)_2$ |
| $L_{A1443}$ | $R_{B3}$ | $R_{B1}$ | C | $Si(CH_3)_2$ |
| $L_{A1444}$ | $R_{B4}$ | $R_{B1}$ | C | $Si(CH_3)_2$ |
| $L_{A1445}$ | $R_{B7}$ | $R_{B1}$ | C | $Si(CH_3)_2$ |
| $L_{A1446}$ | $R_{B10}$ | $R_{B1}$ | C | $Si(CH_3)_2$ |
| $L_{A1447}$ | $R_{A3}$ | $R_{B1}$ | C | $Si(CH_3)_2$ |
| $L_{A1448}$ | $R_{A34}$ | $R_{B1}$ | C | $Si(CH_3)_2$ |

-continued

| Ligand | $R^1$ | $R^2$ | X | Y |
|---|---|---|---|---|
| $L_{A1449}$ | H | $R_{B2}$ | C | S |
| $L_{A1450}$ | $R_{B1}$ | $R_{B2}$ | C | S |
| $L_{A1451}$ | $R_{B3}$ | $R_{B2}$ | C | S |
| $L_{A1452}$ | $R_{B4}$ | $R_{B2}$ | C | S |
| $L_{A1453}$ | $R_{B7}$ | $R_{B2}$ | C | S |
| $L_{A1454}$ | $R_{B10}$ | $R_{B2}$ | C | S |
| $L_{A1455}$ | $R_{A3}$ | $R_{B2}$ | C | S |
| $L_{A1456}$ | $R_{A34}$ | $R_{B2}$ | C | S |
| $L_{A1457}$ | H | $R_{B2}$ | C | O |
| $L_{A1458}$ | $R_{B1}$ | $R_{B2}$ | C | O |
| $L_{A1459}$ | $R_{B3}$ | $R_{B2}$ | C | O |
| $L_{A1460}$ | $R_{B4}$ | $R_{B2}$ | C | O |
| $L_{A1461}$ | $R_{B7}$ | $R_{B2}$ | C | O |
| $L_{A1462}$ | $R_{B10}$ | $R_{B2}$ | C | O |
| $L_{A1463}$ | $R_{A3}$ | $R_{B2}$ | C | O |
| $L_{A1464}$ | $R_{A34}$ | $R_{B2}$ | C | O |
| $L_{A1465}$ | H | $R_{B2}$ | C | $NCH_3$ |
| $L_{A1466}$ | $R_{B1}$ | $R_{B2}$ | C | $NCH_3$ |
| $L_{A1467}$ | $R_{B3}$ | $R_{B2}$ | C | $NCH_3$ |
| $L_{A1468}$ | $R_{B4}$ | $R_{B2}$ | C | $NCH_3$ |
| $L_{A1469}$ | $R_{B7}$ | $R_{B2}$ | C | $NCH_3$ |
| $L_{A1470}$ | $R_{B10}$ | $R_{B2}$ | C | $NCH_3$ |
| $L_{A1471}$ | $R_{A3}$ | $R_{B2}$ | C | $NCH_3$ |
| $L_{A1472}$ | $R_{A34}$ | $R_{B2}$ | C | $NCH_3$ |
| $L_{A1473}$ | H | $R_{B2}$ | C | $C(CH_3)_2$ |
| $L_{A1474}$ | $R_{B1}$ | $R_{B2}$ | C | $C(CH_3)_2$ |
| $L_{A1475}$ | $R_{B3}$ | $R_{B2}$ | C | $C(CH_3)_2$ |
| $L_{A1476}$ | $R_{B4}$ | $R_{B2}$ | C | $C(CH_3)_2$ |
| $L_{A1477}$ | $R_{B7}$ | $R_{B2}$ | C | $C(CH_3)_2$ |
| $L_{A1478}$ | $R_{B10}$ | $R_{B2}$ | C | $C(CH_3)_2$ |
| $L_{A1479}$ | $R_{A3}$ | $R_{B2}$ | C | $C(CH_3)_2$ |
| $L_{A1480}$ | $R_{A34}$ | $R_{B2}$ | C | $C(CH_3)_2$ |
| $L_{A1481}$ | H | $R_{B2}$ | C | $Si(CH_3)_2$ |
| $L_{A1482}$ | $R_{B1}$ | $R_{B2}$ | C | $Si(CH_3)_2$ |
| $L_{A1483}$ | $R_{B3}$ | $R_{B2}$ | C | $Si(CH_3)_2$ |
| $L_{A1484}$ | $R_{B4}$ | $R_{B2}$ | C | $Si(CH_3)_2$ |
| $L_{A1485}$ | $R_{B7}$ | $R_{B2}$ | C | $Si(CH_3)_2$ |
| $L_{A1486}$ | $R_{B10}$ | $R_{B2}$ | C | $Si(CH_3)_2$ |
| $L_{A1487}$ | $R_{A3}$ | $R_{B2}$ | C | $Si(CH_3)_2$ |
| $L_{A1488}$ | $R_{A34}$ | $R_{B2}$ | C | $Si(CH_3)_2$ |
| $L_{A1489}$ | H | H | N | S |
| $L_{A1490}$ | $R_{B1}$ | H | N | S |
| $L_{A1491}$ | $R_{B3}$ | H | N | S |
| $L_{A1492}$ | $R_{B4}$ | H | N | S |
| $L_{A1493}$ | $R_{B7}$ | H | N | S |
| $L_{A1494}$ | $R_{B10}$ | H | N | S |
| $L_{A1495}$ | $R_{A3}$ | H | N | S |
| $L_{A1496}$ | $R_{A34}$ | H | N | S |
| $L_{A1497}$ | H | H | N | O |
| $L_{A1498}$ | $R_{B1}$ | H | N | O |
| $L_{A1499}$ | $R_{B3}$ | H | N | O |
| $L_{A1500}$ | $R_{B4}$ | H | N | O |
| $L_{A1501}$ | $R_{B7}$ | H | N | O |
| $L_{A1502}$ | $R_{B10}$ | H | N | O |
| $L_{A1503}$ | $R_{A3}$ | H | N | O |
| $L_{A1504}$ | $R_{A34}$ | H | N | O |
| $L_{A1505}$ | H | H | N | $NCH_3$ |
| $L_{A1506}$ | $R_{B1}$ | H | N | $NCH_3$ |
| $L_{A1507}$ | $R_{B3}$ | H | N | $NCH_3$ |
| $L_{A1508}$ | $R_{B4}$ | H | N | $NCH_3$ |
| $L_{A1509}$ | $R_{B7}$ | H | N | $NCH_3$ |
| $L_{A1510}$ | $R_{B10}$ | H | N | $NCH_3$ |
| $L_{A1511}$ | $R_{A3}$ | H | N | $NCH_3$ |
| $L_{A1512}$ | $R_{A34}$ | H | N | $NCH_3$ |
| $L_{A1513}$ | H | H | N | $C(CH_3)_2$ |
| $L_{A1514}$ | $R_{B1}$ | H | N | $C(CH_3)_2$ |
| $L_{A1515}$ | $R_{B3}$ | H | N | $C(CH_3)_2$ |
| $L_{A1516}$ | $R_{B4}$ | H | N | $C(CH_3)_2$ |
| $L_{A1517}$ | $R_{B7}$ | H | N | $C(CH_3)_2$ |
| $L_{A1518}$ | $R_{B10}$ | H | N | $C(CH_3)_2$ |
| $L_{A1519}$ | $R_{A3}$ | H | N | $C(CH_3)_2$ |
| $L_{A1520}$ | $R_{A34}$ | H | N | $C(CH_3)_2$ |
| $L_{A1521}$ | H | H | N | $Si(CH_3)_2$ |
| $L_{A1522}$ | $R_{B1}$ | H | N | $Si(CH_3)_2$ |
| $L_{A1523}$ | $R_{B3}$ | H | N | $Si(CH_3)_2$ |
| $L_{A1524}$ | $R_{B4}$ | H | N | $Si(CH_3)_2$ |
| $L_{A1525}$ | $R_{B7}$ | H | N | $Si(CH_3)_2$ |

-continued

| Ligand | $R^1$ | $R^2$ | X | Y |
|---|---|---|---|---|
| $L_{A1526}$ | $R_{B10}$ | H | N | $Si(CH_3)_2$ |
| $L_{A1527}$ | $R_{A3}$ | H | N | $Si(CH_3)_2$ |
| $L_{A1528}$ | $R_{A434}$ | H | N | $Si(CH_3)_2$ |
| $L_{A1529}$ | H | $R_{B1}$ | N | S |
| $L_{A1530}$ | $R_{B1}$ | $R_{B1}$ | N | S |
| $L_{A1531}$ | $R_{B3}$ | $R_{B1}$ | N | S |
| $L_{A1532}$ | $R_{B4}$ | $R_{B1}$ | N | S |
| $L_{A1533}$ | $R_{B7}$ | $R_{B1}$ | N | S |
| $L_{A1534}$ | $R_{B10}$ | $R_{B1}$ | N | S |
| $L_{A1535}$ | $R_{A3}$ | $R_{B1}$ | N | S |
| $L_{A1536}$ | $R_{A434}$ | $R_{B1}$ | N | S |
| $L_{A1537}$ | H | $R_{B1}$ | N | O |
| $L_{A1538}$ | $R_{B1}$ | $R_{B1}$ | N | O |
| $L_{A1539}$ | $R_{B3}$ | $R_{B1}$ | N | O |
| $L_{A1540}$ | $R_{B4}$ | $R_{B1}$ | N | O |
| $L_{A1541}$ | $R_{B7}$ | $R_{B1}$ | N | O |
| $L_{A1542}$ | $R_{B10}$ | $R_{B1}$ | N | O |
| $L_{A1543}$ | $R_{A3}$ | $R_{B1}$ | N | O |
| $L_{A1544}$ | $R_{A434}$ | $R_{B1}$ | N | O |
| $L_{A1545}$ | H | $R_{B1}$ | N | $NCH_3$ |
| $L_{A1546}$ | $R_{B1}$ | $R_{B1}$ | N | $NCH_3$ |
| $L_{A1547}$ | $R_{B3}$ | $R_{B1}$ | N | $NCH_3$ |
| $L_{A1548}$ | $R_{B4}$ | $R_{B1}$ | N | $NCH_3$ |
| $L_{A1549}$ | $R_{B7}$ | $R_{B1}$ | N | $NCH_3$ |
| $L_{A1550}$ | $R_{B10}$ | $R_{B1}$ | N | $NCH_3$ |
| $L_{A1551}$ | $R_{A3}$ | $R_{B1}$ | N | $NCH_3$ |
| $L_{A1552}$ | $R_{A434}$ | $R_{B1}$ | N | $NCH_3$ |
| $L_{A1553}$ | H | $R_{B1}$ | N | $C(CH_3)_2$ |
| $L_{A1554}$ | $R_{B1}$ | $R_{B1}$ | N | $C(CH_3)_2$ |
| $L_{A1555}$ | $R_{B3}$ | $R_{B1}$ | N | $C(CH_3)_2$ |
| $L_{A1556}$ | $R_{B4}$ | $R_{B1}$ | N | $C(CH_3)_2$ |
| $L_{A1557}$ | $R_{B7}$ | $R_{B1}$ | N | $C(CH_3)_2$ |
| $L_{A1558}$ | $R_{B10}$ | $R_{B1}$ | N | $C(CH_3)_2$ |
| $L_{A1559}$ | $R_{A3}$ | $R_{B1}$ | N | $C(CH_3)_2$ |
| $L_{A1560}$ | $R_{A434}$ | $R_{B1}$ | N | $C(CH_3)_2$ |
| $L_{A1561}$ | H | $R_{B1}$ | N | $Si(CH_3)_2$ |
| $L_{A1562}$ | $R_{B1}$ | $R_{B1}$ | N | $Si(CH_3)_2$ |
| $L_{A1563}$ | $R_{B3}$ | $R_{B1}$ | N | $Si(CH_3)_2$ |
| $L_{A1564}$ | $R_{B4}$ | $R_{B1}$ | N | $Si(CH_3)_2$ |
| $L_{A1565}$ | $R_{B7}$ | $R_{B1}$ | N | $Si(CH_3)_2$ |
| $L_{A1566}$ | $R_{B10}$ | $R_{B1}$ | N | $Si(CH_3)_2$ |
| $L_{A1567}$ | $R_{A3}$ | $R_{B1}$ | N | $Si(CH_3)_2$ |
| $L_{A1568}$ | $R_{A434}$ | $R_{B1}$ | N | $Si(CH_3)_2$ |
| $L_{A1569}$ | H | $R_{B2}$ | N | S |
| $L_{A1570}$ | $R_{B1}$ | $R_{B2}$ | N | S |
| $L_{A1571}$ | $R_{B3}$ | $R_{B2}$ | N | S |
| $L_{A1572}$ | $R_{B4}$ | $R_{B2}$ | N | S |
| $L_{A1573}$ | $R_{B7}$ | $R_{B2}$ | N | S |
| $L_{A1574}$ | $R_{B10}$ | $R_{B2}$ | N | S |
| $L_{A1575}$ | $R_{A3}$ | $R_{B2}$ | N | S |
| $L_{A1576}$ | $R_{A434}$ | $R_{B2}$ | N | S |
| $L_{A1577}$ | H | $R_{B2}$ | N | O |
| $L_{A1578}$ | $R_{B1}$ | $R_{B2}$ | N | O |
| $L_{A1579}$ | $R_{B3}$ | $R_{B2}$ | N | O |
| $L_{A1580}$ | $R_{B4}$ | $R_{B2}$ | N | O |
| $L_{A1581}$ | $R_{B7}$ | $R_{B2}$ | N | O |
| $L_{A1582}$ | $R_{B10}$ | $R_{B2}$ | N | O |
| $L_{A1583}$ | $R_{A3}$ | $R_{B2}$ | N | O |
| $L_{A1584}$ | $R_{A434}$ | $R_{B2}$ | N | O |
| $L_{A1585}$ | H | $R_{B2}$ | N | $NCH_3$ |
| $L_{A1586}$ | $R_{B1}$ | $R_{B2}$ | N | $NCH_3$ |
| $L_{A1587}$ | $R_{B3}$ | $R_{B2}$ | N | $NCH_3$ |
| $L_{A1588}$ | $R_{B4}$ | $R_{B2}$ | N | $NCH_3$ |
| $L_{A1589}$ | $R_{B7}$ | $R_{B2}$ | N | $NCH_3$ |
| $L_{A1590}$ | $R_{B10}$ | $R_{B2}$ | N | $NCH_3$ |
| $L_{A1591}$ | $R_{A3}$ | $R_{B2}$ | N | $NCH_3$ |
| $L_{A1592}$ | $R_{A434}$ | $R_{B2}$ | N | $NCH_3$ |
| $L_{A1593}$ | H | $R_{B2}$ | N | $C(CH_3)_2$ |
| $L_{A1594}$ | $R_{B1}$ | $R_{B2}$ | N | $C(CH_3)_2$ |
| $L_{A1595}$ | $R_{B3}$ | $R_{B2}$ | N | $C(CH_3)_2$ |
| $L_{A1596}$ | $R_{B4}$ | $R_{B2}$ | N | $C(CH_3)_2$ |
| $L_{A1597}$ | $R_{B7}$ | $R_{B2}$ | N | $C(CH_3)_2$ |
| $L_{A1598}$ | $R_{B10}$ | $R_{B2}$ | N | $C(CH_3)_2$ |
| $L_{A1599}$ | $R_{A3}$ | $R_{B2}$ | N | $C(CH_3)_2$ |
| $L_{A1600}$ | $R_{A434}$ | $R_{B2}$ | N | $C(CH_3)_2$ |
| $L_{A1601}$ | H | $R_{B2}$ | N | $Si(CH_3)_2$ |
| $L_{A1602}$ | $R_{B1}$ | $R_{B2}$ | N | $Si(CH_3)_2$ |
| $L_{A1603}$ | $R_{B3}$ | $R_{B2}$ | N | $Si(CH_3)_2$ |
| $L_{A1604}$ | $R_{B4}$ | $R_{B2}$ | N | $Si(CH_3)_2$ |
| $L_{A1605}$ | $R_{B7}$ | $R_{B2}$ | N | $Si(CH_3)_2$ |
| $L_{A1606}$ | $R_{B10}$ | $R_{B2}$ | N | $Si(CH_3)_2$ |
| $L_{A1607}$ | $R_{A3}$ | $R_{B2}$ | N | $Si(CH_3)_2$ |
| $L_{A1608}$ | $R_{A434}$ | $R_{B2}$ | N | $Si(CH_3)_2$ |

wherein $L_{A1609}$ through $L_{A1728}$ have a structure of Formula XII:

Formula XII

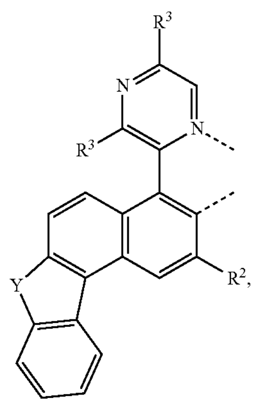

wherein $R^2$, $R_3$, and Y are defined as provided below:

| Ligand | $R^2$ | $R^3$ | Y |
|---|---|---|---|
| $L_{A1609}$ | H | H | S |
| $L_{A1610}$ | H | $R_{B1}$ | S |
| $L_{A1611}$ | H | $R_{B2}$ | S |
| $L_{A1612}$ | H | $R_{B3}$ | S |
| $L_{A1613}$ | H | $R_{B4}$ | S |
| $L_{A1614}$ | H | $R_{B5}$ | S |
| $L_{A1615}$ | H | $R_{A434}$ | S |
| $L_{A1616}$ | H | $R_{A452}$ | S |
| $L_{A1617}$ | H | H | O |
| $L_{A1618}$ | H | $R_{B1}$ | O |
| $L_{A1619}$ | H | $R_{B2}$ | O |
| $L_{A1620}$ | H | $R_{B3}$ | O |
| $L_{A1621}$ | H | $R_{B4}$ | O |
| $L_{A1622}$ | H | $R_{B5}$ | O |
| $L_{A1623}$ | H | $R_{A434}$ | O |
| $L_{A1624}$ | H | $R_{A452}$ | O |
| $L_{A1625}$ | H | H | $NCH_3$ |
| $L_{A1626}$ | H | $R_{B1}$ | $NCH_3$ |
| $L_{A1627}$ | H | $R_{B2}$ | $NCH_3$ |
| $L_{A1628}$ | H | $R_{B3}$ | $NCH_3$ |
| $L_{A1629}$ | H | $R_{B4}$ | $NCH_3$ |
| $L_{A1630}$ | H | $R_{B5}$ | $NCH_3$ |
| $L_{A1631}$ | H | $R_{A434}$ | $NCH_3$ |
| $L_{A1632}$ | H | $R_{A452}$ | $NCH_3$ |
| $L_{A1633}$ | H | H | $C(CH_3)_2$ |
| $L_{A1634}$ | H | $R_{B1}$ | $C(CH_3)_2$ |
| $L_{A1635}$ | H | $R_{B2}$ | $C(CH_3)_2$ |
| $L_{A1636}$ | H | $R_{B3}$ | $C(CH_3)_2$ |
| $L_{A1637}$ | H | $R_{B4}$ | $C(CH_3)_2$ |
| $L_{A1638}$ | H | $R_{B5}$ | $C(CH_3)_2$ |
| $L_{A1639}$ | H | $R_{A434}$ | $C(CH_3)_2$ |
| $L_{A1640}$ | H | $R_{A452}$ | $C(CH_3)_2$ |
| $L_{A1641}$ | H | H | $Si(CH_3)_2$ |
| $L_{A1642}$ | H | $R_{B1}$ | $Si(CH_3)_2$ |
| $L_{A1643}$ | H | $R_{B2}$ | $Si(CH_3)_2$ |
| $L_{A1644}$ | H | $R_{B3}$ | $Si(CH_3)_2$ |
| $L_{A1645}$ | H | $R_{B4}$ | $Si(CH_3)_2$ |
| $L_{A1646}$ | H | $R_{B5}$ | $Si(CH_3)_2$ |

-continued

| Ligand | $R^2$ | $R^3$ | Y |
|---|---|---|---|
| $L_{A1647}$ | H | $R_{A34}$ | $Si(CH_3)_2$ |
| $L_{A1648}$ | H | $R_{A52}$ | $Si(CH_3)_2$ |
| $L_{A1649}$ | $R_{B1}$ | H | S |
| $L_{A1650}$ | $R_{B1}$ | $R_{B1}$ | S |
| $L_{A1651}$ | $R_{B1}$ | $R_{B2}$ | S |
| $L_{A1652}$ | $R_{B1}$ | $R_{B3}$ | S |
| $L_{A1653}$ | $R_{B1}$ | $R_{B4}$ | S |
| $L_{A1654}$ | $R_{B1}$ | $R_{B5}$ | S |
| $L_{A1655}$ | $R_{B1}$ | $R_{A34}$ | S |
| $L_{A1656}$ | $R_{B1}$ | $R_{A52}$ | S |
| $L_{A1657}$ | $R_{B1}$ | H | O |
| $L_{A1658}$ | $R_{B1}$ | $R_{B1}$ | O |
| $L_{A1659}$ | $R_{B1}$ | $R_{B2}$ | O |
| $L_{A1660}$ | $R_{B1}$ | $R_{B3}$ | O |
| $L_{A1661}$ | $R_{B1}$ | $R_{B4}$ | O |
| $L_{A1662}$ | $R_{B1}$ | $R_{B5}$ | O |
| $L_{A1663}$ | $R_{B1}$ | $R_{A34}$ | O |
| $L_{A1664}$ | $R_{B1}$ | $R_{A52}$ | O |
| $L_{A1665}$ | $R_{B1}$ | H | $NCH_3$ |
| $L_{A1666}$ | $R_{B1}$ | $R_{B1}$ | $NCH_3$ |
| $L_{A1667}$ | $R_{B1}$ | $R_{B2}$ | $NCH_3$ |
| $L_{A1668}$ | $R_{B1}$ | $R_{B3}$ | $NCH_3$ |
| $L_{A1669}$ | $R_{B1}$ | $R_{B4}$ | $NCH_3$ |
| $L_{A1670}$ | $R_{B1}$ | $R_{B5}$ | $NCH_3$ |
| $L_{A1671}$ | $R_{B1}$ | $R_{A34}$ | $NCH_3$ |
| $L_{A1672}$ | $R_{B1}$ | $R_{A52}$ | $NCH_3$ |
| $L_{A1673}$ | $R_{B1}$ | H | $C(CH_3)_2$ |
| $L_{A1674}$ | $R_{B1}$ | $R_{B1}$ | $C(CH_3)_2$ |
| $L_{A1675}$ | $R_{B1}$ | $R_{B2}$ | $C(CH_3)_2$ |
| $L_{A1676}$ | $R_{B1}$ | $R_{B3}$ | $C(CH_3)_2$ |
| $L_{A1677}$ | $R_{B1}$ | $R_{B4}$ | $C(CH_3)_2$ |
| $L_{A1678}$ | $R_{B1}$ | $R_{B5}$ | $C(CH_3)_2$ |
| $L_{A1679}$ | $R_{B1}$ | $R_{A34}$ | $C(CH_3)_2$ |
| $L_{A1680}$ | $R_{B1}$ | $R_{A52}$ | $C(CH_3)_2$ |
| $L_{A1681}$ | $R_{B1}$ | H | $Si(CH_3)_2$ |
| $L_{A1682}$ | $R_{B1}$ | $R_{B1}$ | $Si(CH_3)_2$ |
| $L_{A1683}$ | $R_{B1}$ | $R_{B2}$ | $Si(CH_3)_2$ |
| $L_{A1684}$ | $R_{B1}$ | $R_{B3}$ | $Si(CH_3)_2$ |
| $L_{A1685}$ | $R_{B1}$ | $R_{B4}$ | $Si(CH_3)_2$ |
| $L_{A1686}$ | $R_{B1}$ | $R_{B5}$ | $Si(CH_3)_2$ |
| $L_{A1687}$ | $R_{B1}$ | $R_{A34}$ | $Si(CH_3)_2$ |
| $L_{A1688}$ | $R_{B1}$ | $R_{A52}$ | $Si(CH_3)_2$ |
| $L_{A1689}$ | $R_{B2}$ | H | S |
| $L_{A1690}$ | $R_{B2}$ | $R_{B1}$ | S |
| $L_{A1691}$ | $R_{B2}$ | $R_{B2}$ | S |
| $L_{A1692}$ | $R_{B2}$ | $R_{B3}$ | S |
| $L_{A1693}$ | $R_{B2}$ | $R_{B4}$ | S |
| $L_{A1694}$ | $R_{B2}$ | $R_{B5}$ | S |
| $L_{A1695}$ | $R_{B2}$ | $R_{A34}$ | S |
| $L_{A1696}$ | $R_{B2}$ | $R_{A52}$ | S |
| $L_{A1697}$ | $R_{B2}$ | H | O |
| $L_{A1698}$ | $R_{B2}$ | $R_{B1}$ | O |
| $L_{A1699}$ | $R_{B2}$ | $R_{B2}$ | O |
| $L_{A1700}$ | $R_{B2}$ | $R_{B3}$ | O |
| $L_{A1701}$ | $R_{B2}$ | $R_{B4}$ | O |
| $L_{A1702}$ | $R_{B2}$ | $R_{B5}$ | O |
| $L_{A1703}$ | $R_{B2}$ | $R_{A34}$ | O |
| $L_{A1704}$ | $R_{B2}$ | $R_{A52}$ | O |
| $L_{A1705}$ | $R_{B2}$ | H | $NCH_3$ |
| $L_{A1706}$ | $R_{B2}$ | $R_{B1}$ | $NCH_3$ |
| $L_{A1707}$ | $R_{B2}$ | $R_{B2}$ | $NCH_3$ |
| $L_{A1708}$ | $R_{B2}$ | $R_{B3}$ | $NCH_3$ |
| $L_{A1709}$ | $R_{B2}$ | $R_{B4}$ | $NCH_3$ |
| $L_{A1710}$ | $R_{B2}$ | $R_{B5}$ | $NCH_3$ |
| $L_{A1711}$ | $R_{B2}$ | $R_{A34}$ | $NCH_3$ |
| $L_{A1712}$ | $R_{B2}$ | $R_{A52}$ | $NCH_3$ |
| $L_{A1713}$ | $R_{B2}$ | H | $C(CH_3)_2$ |
| $L_{A1714}$ | $R_{B2}$ | $R_{B1}$ | $C(CH_3)_2$ |
| $L_{A1715}$ | $R_{B2}$ | $R_{B2}$ | $C(CH_3)_2$ |
| $L_{A1716}$ | $R_{B2}$ | $R_{B3}$ | $C(CH_3)_2$ |
| $L_{A1717}$ | $R_{B2}$ | $R_{B4}$ | $C(CH_3)_2$ |
| $L_{A1718}$ | $R_{B2}$ | $R_{B5}$ | $C(CH_3)_2$ |
| $L_{A1719}$ | $R_{B2}$ | $R_{A34}$ | $C(CH_3)_2$ |
| $L_{A1720}$ | $R_{B2}$ | $R_{A52}$ | $C(CH_3)_2$ |
| $L_{A1721}$ | $R_{B2}$ | H | $Si(CH_3)_2$ |
| $L_{A1722}$ | $R_{B2}$ | $R_{B1}$ | $Si(CH_3)_2$ |
| $L_{A1723}$ | $R_{B2}$ | $R_{B2}$ | $Si(CH_3)_2$ |
| $L_{A1724}$ | $R_{B2}$ | $R_{B3}$ | $Si(CH_3)_2$ |
| $L_{A1725}$ | $R_{B2}$ | $R_{B4}$ | $Si(CH_3)_2$ |
| $L_{A1726}$ | $R_{B2}$ | $R_{B5}$ | $Si(CH_3)_2$ |
| $L_{A1727}$ | $R_{B2}$ | $R_{A34}$ | $Si(CH_3)_2$ |
| $L_{A1728}$ | $R_{B2}$ | $R_{A52}$ | $Si(CH_3)_2$ |

wherein $L_{A1729}$ through $L_{A1824}$ have a structure of Formula XIII:

Formula XIII

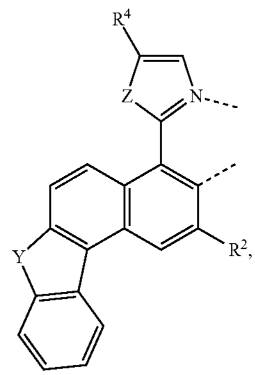

wherein $R_2$, $R_4$, Y, and Z are defined as provided below:

| Ligand | $R^2$ | $R^4$ | Y | Z |
|---|---|---|---|---|
| $L_{A1729}$ | H | H | S | S |
| $L_{A1730}$ | H | $R_{B1}$ | S | S |
| $L_{A1731}$ | H | $R_{B3}$ | S | S |
| $L_{A1732}$ | H | $R_{B4}$ | S | S |
| $L_{A1733}$ | H | $R_{B7}$ | S | S |
| $L_{A1734}$ | H | $R_{B10}$ | S | S |
| $L_{A1735}$ | H | $R_{A3}$ | S | S |
| $L_{A1736}$ | H | $R_{A34}$ | S | S |
| $L_{A1737}$ | H | H | S | O |
| $L_{A1738}$ | H | $R_{B1}$ | S | O |
| $L_{A1739}$ | H | $R_{B3}$ | S | O |
| $L_{A1740}$ | H | $R_{B4}$ | S | O |
| $L_{A1741}$ | H | $R_{B7}$ | S | O |
| $L_{A1742}$ | H | $R_{B10}$ | S | O |
| $L_{A1743}$ | H | $R_{A3}$ | S | O |
| $L_{A1744}$ | H | $R_{A34}$ | S | O |
| $L_{A1745}$ | H | H | S | $NCH_3$ |
| $L_{A1746}$ | H | $R_{B1}$ | S | $NCH_3$ |
| $L_{A1747}$ | H | $R_{B3}$ | S | $NCH_3$ |
| $L_{A1748}$ | H | $R_{B4}$ | S | $NCH_3$ |
| $L_{A1749}$ | H | $R_{B7}$ | S | $NCH_3$ |
| $L_{A1750}$ | H | $R_{B10}$ | S | $NCH_3$ |
| $L_{A1751}$ | H | $R_{A3}$ | S | $NCH_3$ |
| $L_{A1752}$ | H | $R_{A34}$ | S | $NCH_3$ |
| $L_{A1753}$ | H | H | O | S |
| $L_{A1754}$ | H | $R_{B1}$ | O | S |
| $L_{A1755}$ | H | $R_{B3}$ | O | S |
| $L_{A1756}$ | H | $R_{B4}$ | O | S |
| $L_{A1757}$ | H | $R_{B7}$ | O | S |
| $L_{A1758}$ | H | $R_{B10}$ | O | S |
| $L_{A1759}$ | H | $R_{A3}$ | O | S |
| $L_{A1760}$ | H | $R_{A34}$ | O | S |
| $L_{A1761}$ | H | H | O | O |
| $L_{A1762}$ | H | $R_{B1}$ | O | O |
| $L_{A1763}$ | H | $R_{B3}$ | O | O |
| $L_{A1764}$ | H | $R_{B4}$ | O | O |
| $L_{A1765}$ | H | $R_{B7}$ | O | O |
| $L_{A1766}$ | H | $R_{B10}$ | O | O |
| $L_{A1767}$ | H | $R_{A3}$ | O | O |
| $L_{A1768}$ | H | $R_{A34}$ | O | O |

-continued

| Ligand | $R^2$ | $R^4$ | Y | Z |
|---|---|---|---|---|
| $L_{A1769}$ | H | H | O | $NCH_3$ |
| $L_{A1770}$ | H | $R_{B1}$ | O | $NCH_3$ |
| $L_{A1771}$ | H | $R_{B3}$ | O | $NCH_3$ |
| $L_{A1772}$ | H | $R_{B4}$ | O | $NCH_3$ |
| $L_{A1773}$ | H | $R_{B7}$ | O | $NCH_3$ |
| $L_{A1774}$ | H | $R_{B10}$ | O | $NCH_3$ |
| $L_{A1775}$ | H | $R_{A3}$ | O | $NCH_3$ |
| $L_{A1776}$ | H | $R_{A34}$ | O | $NCH_3$ |
| $L_{A1777}$ | $R_{B1}$ | H | S | S |
| $L_{A1778}$ | $R_{B1}$ | $R_{B1}$ | S | S |
| $L_{A1779}$ | $R_{B1}$ | $R_{B3}$ | S | S |
| $L_{A1780}$ | $R_{B1}$ | $R_{B4}$ | S | S |
| $L_{A1781}$ | $R_{B1}$ | $R_{B7}$ | S | S |
| $L_{A1782}$ | $R_{B1}$ | $R_{B10}$ | S | S |
| $L_{A1783}$ | $R_{B1}$ | $R_{A3}$ | S | S |
| $L_{A1784}$ | $R_{B1}$ | $R_{A34}$ | S | S |
| $L_{A1785}$ | $R_{B1}$ | H | S | O |
| $L_{A1786}$ | $R_{B1}$ | $R_{B1}$ | S | O |
| $L_{A1787}$ | $R_{B1}$ | $R_{B3}$ | S | O |
| $L_{A1788}$ | $R_{B1}$ | $R_{B4}$ | S | O |
| $L_{A1789}$ | $R_{B1}$ | $R_{B7}$ | S | O |
| $L_{A1790}$ | $R_{B1}$ | $R_{B10}$ | S | O |
| $L_{A1791}$ | $R_{B1}$ | $R_{A3}$ | S | O |
| $L_{A1792}$ | $R_{B1}$ | $R_{A34}$ | S | O |
| $L_{A1793}$ | $R_{B1}$ | H | S | $NCH_3$ |
| $L_{A1794}$ | $R_{B1}$ | $R_{B1}$ | S | $NCH_3$ |
| $L_{A1795}$ | $R_{B1}$ | $R_{B3}$ | S | $NCH_3$ |
| $L_{A1796}$ | $R_{B1}$ | $R_{B4}$ | S | $NCH_3$ |
| $L_{A1797}$ | $R_{B1}$ | $R_{B7}$ | S | $NCH_3$ |
| $L_{A1798}$ | $R_{B1}$ | $R_{B10}$ | S | $NCH_3$ |
| $L_{A1799}$ | $R_{B1}$ | $R_{A3}$ | S | $NCH_3$ |
| $L_{A1800}$ | $R_{B1}$ | $R_{A34}$ | S | $NCH_3$ |
| $L_{A1801}$ | $R_{B1}$ | H | O | S |
| $L_{A1802}$ | $R_{B1}$ | $R_{B1}$ | O | S |
| $L_{A1803}$ | $R_{B1}$ | $R_{B3}$ | O | S |
| $L_{A1804}$ | $R_{B1}$ | $R_{B4}$ | O | S |
| $L_{A1805}$ | $R_{B1}$ | $R_{B7}$ | O | S |
| $L_{A1806}$ | $R_{B1}$ | $R_{B10}$ | O | S |
| $L_{A1807}$ | $R_{B1}$ | $R_{A3}$ | O | S |
| $L_{A1808}$ | $R_{B1}$ | $R_{A34}$ | O | S |
| $L_{A1809}$ | $R_{B1}$ | H | O | O |
| $L_{A1810}$ | $R_{B1}$ | $R_{B1}$ | O | O |
| $L_{A1811}$ | $R_{B1}$ | $R_{B3}$ | O | O |
| $L_{A1812}$ | $R_{B1}$ | $R_{B4}$ | O | O |
| $L_{A1813}$ | $R_{B1}$ | $R_{B7}$ | O | O |
| $L_{A1814}$ | $R_{B1}$ | $R_{B10}$ | O | O |
| $L_{A1815}$ | $R_{B1}$ | $R_{A3}$ | O | O |
| $L_{A1816}$ | $R_{B1}$ | $R_{A34}$ | O | O |
| $L_{A1817}$ | $R_{B1}$ | H | O | $NCH_3$ |
| $L_{A1818}$ | $R_{B1}$ | $R_{B1}$ | O | $NCH_3$ |
| $L_{A1819}$ | $R_{B1}$ | $R_{B3}$ | O | $NCH_3$ |
| $L_{A1820}$ | $R_{B1}$ | $R_{B4}$ | O | $NCH_3$ |
| $L_{A1821}$ | $R_{B1}$ | $R_{B7}$ | O | $NCH_3$ |
| $L_{A1822}$ | $R_{B1}$ | $R_{B10}$ | O | $NCH_3$ |
| $L_{A1823}$ | $R_{B1}$ | $R_{A3}$ | O | $NCH_3$ |
| $L_{A1824}$ | $R_{B1}$ | $R_{A34}$ | O | $NCH_3$ |

wherein $L_{A1825}$ through $L_{A2064}$ have a structure of Formula XIV:

Formula XIV

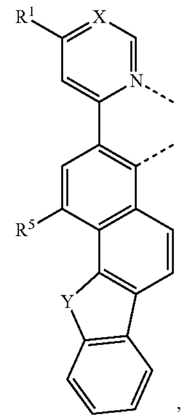

wherein $R^1$, $R^5$, X, and Y are defined as provided below:

| Ligand | $R^1$ | $R^5$ | X | Y |
|---|---|---|---|---|
| $L_{A1825}$ | H | H | C | S |
| $L_{A1826}$ | $R_{B1}$ | H | C | S |
| $L_{A1827}$ | $R_{B3}$ | H | C | S |
| $L_{A1828}$ | $R_{B4}$ | H | C | S |
| $L_{A1829}$ | $R_{B7}$ | H | C | S |
| $L_{A1830}$ | $R_{B10}$ | H | C | S |
| $L_{A1831}$ | $R_{A3}$ | H | C | S |
| $L_{A1832}$ | $R_{A34}$ | H | C | S |
| $L_{A1833}$ | H | H | C | O |
| $L_{A1834}$ | $R_{B1}$ | H | C | O |
| $L_{A1835}$ | $R_{B3}$ | H | C | O |
| $L_{A1836}$ | $R_{B4}$ | H | C | O |
| $L_{A1837}$ | $R_{B7}$ | H | C | O |
| $L_{A1838}$ | $R_{B10}$ | H | C | O |
| $L_{A1839}$ | $R_{A3}$ | H | C | O |
| $L_{A1840}$ | $R_{A34}$ | H | C | O |
| $L_{A1841}$ | H | H | C | $NCH_3$ |
| $L_{A1842}$ | $R_{B1}$ | H | C | $NCH_3$ |
| $L_{A1843}$ | $R_{B3}$ | H | C | $NCH_3$ |
| $L_{A1844}$ | $R_{B4}$ | H | C | $NCH_3$ |
| $L_{A1845}$ | $R_{B7}$ | H | C | $NCH_3$ |
| $L_{A1846}$ | $R_{B10}$ | H | C | $NCH_3$ |
| $L_{A1847}$ | $R_{A3}$ | H | C | $NCH_3$ |
| $L_{A1848}$ | $R_{A34}$ | H | C | $NCH_3$ |
| $L_{A1849}$ | H | H | C | $C(CH_3)_2$ |
| $L_{A1850}$ | $R_{B1}$ | H | C | $C(CH_3)_2$ |
| $L_{A1851}$ | $R_{B3}$ | H | C | $C(CH_3)_2$ |
| $L_{A1852}$ | $R_{B4}$ | H | C | $C(CH_3)_2$ |
| $L_{A1853}$ | $R_{B7}$ | H | C | $C(CH_3)_2$ |
| $L_{A1854}$ | $R_{B10}$ | H | C | $C(CH_3)_2$ |
| $L_{A1855}$ | $R_{A3}$ | H | C | $C(CH_3)_2$ |
| $L_{A1856}$ | $R_{A34}$ | H | C | $C(CH_3)_2$ |
| $L_{A1857}$ | H | H | C | $Si(CH_3)_2$ |
| $L_{A1858}$ | $R_{B1}$ | H | C | $Si(CH_3)_2$ |
| $L_{A1859}$ | $R_{B3}$ | H | C | $Si(CH_3)_2$ |
| $L_{A1860}$ | $R_{B4}$ | H | C | $Si(CH_3)_2$ |
| $L_{A1861}$ | $R_{B7}$ | H | C | $Si(CH_3)_2$ |
| $L_{A1862}$ | $R_{B10}$ | H | C | $Si(CH_3)_2$ |
| $L_{A1863}$ | $R_{A3}$ | H | C | $Si(CH_3)_2$ |
| $L_{A1864}$ | $R_{A34}$ | H | C | $Si(CH_3)_2$ |
| $L_{A1865}$ | H | $R_{B1}$ | C | S |
| $L_{A1866}$ | $R_{B1}$ | $R_{B1}$ | C | S |
| $L_{A1867}$ | $R_{B3}$ | $R_{B1}$ | C | S |
| $L_{A1868}$ | $R_{B4}$ | $R_{B1}$ | C | S |
| $L_{A1869}$ | $R_{B7}$ | $R_{B1}$ | C | S |
| $L_{A1870}$ | $R_{B10}$ | $R_{B1}$ | C | S |
| $L_{A1871}$ | $R_{A3}$ | $R_{B1}$ | C | S |
| $L_{A1872}$ | $R_{A34}$ | $R_{B1}$ | C | S |
| $L_{A1873}$ | H | $R_{B1}$ | C | O |

| Ligand | $R^1$ | $R^5$ | X | Y |
|---|---|---|---|---|
| $L_{A1874}$ | $R_{B1}$ | $R_{B1}$ | C | O |
| $L_{A1875}$ | $R_{B3}$ | $R_{B1}$ | C | O |
| $L_{A1876}$ | $R_{B4}$ | $R_{B1}$ | C | O |
| $L_{A1877}$ | $R_{B7}$ | $R_{B1}$ | C | O |
| $L_{A1878}$ | $R_{B10}$ | $R_{B1}$ | C | O |
| $L_{A1879}$ | $R_{A3}$ | $R_{B1}$ | C | O |
| $L_{A1880}$ | $R_{A34}$ | $R_{B1}$ | C | O |
| $L_{A1881}$ | H | $R_{B1}$ | C | $NCH_3$ |
| $L_{A1882}$ | $R_{B1}$ | $R_{B1}$ | C | $NCH_3$ |
| $L_{A1883}$ | $R_{B3}$ | $R_{B1}$ | C | $NCH_3$ |
| $L_{A1884}$ | $R_{B4}$ | $R_{B1}$ | C | $NCH_3$ |
| $L_{A1885}$ | $R_{B7}$ | $R_{B1}$ | C | $NCH_3$ |
| $L_{A1886}$ | $R_{B10}$ | $R_{B1}$ | C | $NCH_3$ |
| $L_{A1887}$ | $R_{A3}$ | $R_{B1}$ | C | $NCH_3$ |
| $L_{A1888}$ | $R_{A34}$ | $R_{B1}$ | C | $NCH_3$ |
| $L_{A1889}$ | H | $R_{B1}$ | C | $C(CH_3)_2$ |
| $L_{A1890}$ | $R_{B1}$ | $R_{B1}$ | C | $C(CH_3)_2$ |
| $L_{A1891}$ | $R_{B3}$ | $R_{B1}$ | C | $C(CH_3)_2$ |
| $L_{A1892}$ | $R_{B4}$ | $R_{B1}$ | C | $C(CH_3)_2$ |
| $L_{A1893}$ | $R_{B7}$ | $R_{B1}$ | C | $C(CH_3)_2$ |
| $L_{A1894}$ | $R_{B10}$ | $R_{B1}$ | C | $C(CH_3)_2$ |
| $L_{A1895}$ | $R_{A3}$ | $R_{B1}$ | C | $C(CH_3)_2$ |
| $L_{A1896}$ | $R_{A34}$ | $R_{B1}$ | C | $C(CH_3)_2$ |
| $L_{A1897}$ | H | $R_{B1}$ | C | $Si(CH_3)_2$ |
| $L_{A1898}$ | $R_{B1}$ | $R_{B1}$ | C | $Si(CH_3)_2$ |
| $L_{A1899}$ | $R_{B3}$ | $R_{B1}$ | C | $Si(CH_3)_2$ |
| $L_{A1900}$ | $R_{B4}$ | $R_{B1}$ | C | $Si(CH_3)_2$ |
| $L_{A1901}$ | $R_{B7}$ | $R_{B1}$ | C | $Si(CH_3)_2$ |
| $L_{A1902}$ | $R_{B10}$ | $R_{B1}$ | C | $Si(CH_3)_2$ |
| $L_{A1903}$ | $R_{A3}$ | $R_{B1}$ | C | $Si(CH_3)_2$ |
| $L_{A1904}$ | $R_{A34}$ | $R_{B1}$ | C | $Si(CH_3)_2$ |
| $L_{A1905}$ | H | $R_{B6}$ | C | S |
| $L_{A1906}$ | $R_{B1}$ | $R_{B6}$ | C | S |
| $L_{A1907}$ | $R_{B3}$ | $R_{B6}$ | C | S |
| $L_{A1908}$ | $R_{B4}$ | $R_{B6}$ | C | S |
| $L_{A1909}$ | $R_{B7}$ | $R_{B6}$ | C | S |
| $L_{A1910}$ | $R_{B10}$ | $R_{B6}$ | C | S |
| $L_{A1911}$ | $R_{A3}$ | $R_{B6}$ | C | S |
| $L_{A1912}$ | $R_{A34}$ | $R_{B6}$ | C | S |
| $L_{A1913}$ | H | $R_{B6}$ | C | O |
| $L_{A1914}$ | $R_{B1}$ | $R_{B6}$ | C | O |
| $L_{A1915}$ | $R_{B3}$ | $R_{B6}$ | C | O |
| $L_{A1916}$ | $R_{B4}$ | $R_{B6}$ | C | O |
| $L_{A1917}$ | $R_{B7}$ | $R_{B6}$ | C | O |
| $L_{A1918}$ | $R_{B10}$ | $R_{B6}$ | C | O |
| $L_{A1919}$ | $R_{A3}$ | $R_{B6}$ | C | O |
| $L_{A1920}$ | $R_{A34}$ | $R_{B6}$ | C | O |
| $L_{A1921}$ | H | $R_{B6}$ | C | $NCH_3$ |
| $L_{A1922}$ | $R_{B1}$ | $R_{B6}$ | C | $NCH_3$ |
| $L_{A1923}$ | $R_{B3}$ | $R_{B6}$ | C | $NCH_3$ |
| $L_{A1924}$ | $R_{B4}$ | $R_{B6}$ | C | $NCH_3$ |
| $L_{A1925}$ | $R_{B7}$ | $R_{B6}$ | C | $NCH_3$ |
| $L_{A1926}$ | $R_{B10}$ | $R_{B6}$ | C | $NCH_3$ |
| $L_{A1927}$ | $R_{A3}$ | $R_{B6}$ | C | $NCH_3$ |
| $L_{A1928}$ | $R_{A34}$ | $R_{B6}$ | C | $NCH_3$ |
| $L_{A1929}$ | H | $R_{B6}$ | C | $C(CH_3)_2$ |
| $L_{A1930}$ | $R_{B1}$ | $R_{B6}$ | C | $C(CH_3)_2$ |
| $L_{A1931}$ | $R_{B3}$ | $R_{B6}$ | C | $C(CH_3)_2$ |
| $L_{A1932}$ | $R_{B4}$ | $R_{B6}$ | C | $C(CH_3)_2$ |
| $L_{A1933}$ | $R_{B7}$ | $R_{B6}$ | C | $C(CH_3)_2$ |
| $L_{A1934}$ | $R_{B10}$ | $R_{B6}$ | C | $C(CH_3)_2$ |
| $L_{A1935}$ | $R_{A3}$ | $R_{B6}$ | C | $C(CH_3)_2$ |
| $L_{A1936}$ | $R_{A34}$ | $R_{B6}$ | C | $C(CH_3)_2$ |
| $L_{A1937}$ | H | $R_{B6}$ | C | $Si(CH_3)_2$ |
| $L_{A1938}$ | $R_{B1}$ | $R_{B6}$ | C | $Si(CH_3)_2$ |
| $L_{A1939}$ | $R_{B3}$ | $R_{B6}$ | C | $Si(CH_3)_2$ |
| $L_{A1940}$ | $R_{B4}$ | $R_{B6}$ | C | $Si(CH_3)_2$ |
| $L_{A1941}$ | $R_{B7}$ | $R_{B6}$ | C | $Si(CH_3)_2$ |
| $L_{A1942}$ | $R_{B10}$ | $R_{B6}$ | C | $Si(CH_3)_2$ |
| $L_{A1943}$ | $R_{A3}$ | $R_{B6}$ | C | $Si(CH_3)_2$ |
| $L_{A1944}$ | $R_{A34}$ | $R_{B6}$ | C | $Si(CH_3)_2$ |
| $L_{A1945}$ | H | H | N | S |
| $L_{A1946}$ | $R_{B1}$ | H | N | S |
| $L_{A1947}$ | $R_{B3}$ | H | N | S |
| $L_{A1948}$ | $R_{B4}$ | H | N | S |
| $L_{A1949}$ | $R_{B7}$ | H | N | S |
| $L_{A1950}$ | $R_{B10}$ | H | N | S |

| Ligand | $R^1$ | $R^5$ | X | Y |
|---|---|---|---|---|
| $L_{A1951}$ | $R_{A3}$ | H | N | S |
| $L_{A1952}$ | $R_{A34}$ | H | N | S |
| $L_{A1953}$ | H | H | N | O |
| $L_{A1954}$ | $R_{B1}$ | H | N | O |
| $L_{A1955}$ | $R_{B3}$ | H | N | O |
| $L_{A1956}$ | $R_{B4}$ | H | N | O |
| $L_{A1957}$ | $R_{B7}$ | H | N | O |
| $L_{A1958}$ | $R_{B10}$ | H | N | O |
| $L_{A1959}$ | $R_{A3}$ | H | N | O |
| $L_{A1960}$ | $R_{A34}$ | H | N | O |
| $L_{A1961}$ | H | H | N | $NCH_3$ |
| $L_{A1962}$ | $R_{B1}$ | H | N | $NCH_3$ |
| $L_{A1963}$ | $R_{B3}$ | H | N | $NCH_3$ |
| $L_{A1964}$ | $R_{B4}$ | H | N | $NCH_3$ |
| $L_{A1965}$ | $R_{B7}$ | H | N | $NCH_3$ |
| $L_{A1966}$ | $R_{B10}$ | H | N | $NCH_3$ |
| $L_{A1967}$ | $R_{A3}$ | H | N | $NCH_3$ |
| $L_{A1968}$ | $R_{A34}$ | H | N | $NCH_3$ |
| $L_{A1969}$ | H | H | N | $C(CH_3)_2$ |
| $L_{A1970}$ | $R_{B1}$ | H | N | $C(CH_3)_2$ |
| $L_{A1971}$ | $R_{B3}$ | H | N | $C(CH_3)_2$ |
| $L_{A1972}$ | $R_{B4}$ | H | N | $C(CH_3)_2$ |
| $L_{A1973}$ | $R_{B7}$ | H | N | $C(CH_3)_2$ |
| $L_{A1974}$ | $R_{B10}$ | H | N | $C(CH_3)_2$ |
| $L_{A1975}$ | $R_{A3}$ | H | N | $C(CH_3)_2$ |
| $L_{A1976}$ | $R_{A34}$ | H | N | $C(CH_3)_2$ |
| $L_{A1977}$ | H | H | N | $Si(CH_3)_2$ |
| $L_{A1978}$ | $R_{B1}$ | H | N | $Si(CH_3)_2$ |
| $L_{A1979}$ | $R_{B3}$ | H | N | $Si(CH_3)_2$ |
| $L_{A1980}$ | $R_{B4}$ | H | N | $Si(CH_3)_2$ |
| $L_{A1981}$ | $R_{B7}$ | H | N | $Si(CH_3)_2$ |
| $L_{A1982}$ | $R_{B10}$ | H | N | $Si(CH_3)_2$ |
| $L_{A1983}$ | $R_{A3}$ | H | N | $Si(CH_3)_2$ |
| $L_{A1984}$ | $R_{A34}$ | H | N | $Si(CH_3)_2$ |
| $L_{A1985}$ | H | $R_{B1}$ | N | S |
| $L_{A1986}$ | $R_{B1}$ | $R_{B1}$ | N | S |
| $L_{A1987}$ | $R_{B3}$ | $R_{B1}$ | N | S |
| $L_{A1988}$ | $R_{B4}$ | $R_{B1}$ | N | S |
| $L_{A1989}$ | $R_{B7}$ | $R_{B1}$ | N | S |
| $L_{A1990}$ | $R_{B10}$ | $R_{B1}$ | N | S |
| $L_{A1991}$ | $R_{A3}$ | $R_{B1}$ | N | S |
| $L_{A1992}$ | $R_{A34}$ | $R_{B1}$ | N | S |
| $L_{A1993}$ | H | $R_{B1}$ | N | O |
| $L_{A1994}$ | $R_{B1}$ | $R_{B1}$ | N | O |
| $L_{A1995}$ | $R_{B3}$ | $R_{B1}$ | N | O |
| $L_{A1996}$ | $R_{B4}$ | $R_{B1}$ | N | O |
| $L_{A1997}$ | $R_{B7}$ | $R_{B1}$ | N | O |
| $L_{A1998}$ | $R_{B10}$ | $R_{B1}$ | N | O |
| $L_{A1999}$ | $R_{A3}$ | $R_{B1}$ | N | O |
| $L_{A2000}$ | $R_{A34}$ | $R_{B1}$ | N | O |
| $L_{A2001}$ | H | $R_{B1}$ | N | $NCH_3$ |
| $L_{A2002}$ | $R_{B1}$ | $R_{B1}$ | N | $NCH_3$ |
| $L_{A2003}$ | $R_{B3}$ | $R_{B1}$ | N | $NCH_3$ |
| $L_{A2004}$ | $R_{B4}$ | $R_{B1}$ | N | $NCH_3$ |
| $L_{A2005}$ | $R_{B7}$ | $R_{B1}$ | N | $NCH_3$ |
| $L_{A2006}$ | $R_{B10}$ | $R_{B1}$ | N | $NCH_3$ |
| $L_{A2007}$ | $R_{A3}$ | $R_{B1}$ | N | $NCH_3$ |
| $L_{A2008}$ | $R_{A34}$ | $R_{B1}$ | N | $NCH_3$ |
| $L_{A2009}$ | H | $R_{B1}$ | N | $C(CH_3)_2$ |
| $L_{A2010}$ | $R_{B1}$ | $R_{B1}$ | N | $C(CH_3)_2$ |
| $L_{A2011}$ | $R_{B3}$ | $R_{B1}$ | N | $C(CH_3)_2$ |
| $L_{A2012}$ | $R_{B4}$ | $R_{B1}$ | N | $C(CH_3)_2$ |
| $L_{A2013}$ | $R_{B7}$ | $R_{B1}$ | N | $C(CH_3)_2$ |
| $L_{A2014}$ | $R_{B10}$ | $R_{B1}$ | N | $C(CH_3)_2$ |
| $L_{A2015}$ | $R_{A3}$ | $R_{B1}$ | N | $C(CH_3)_2$ |
| $L_{A2016}$ | $R_{A34}$ | $R_{B1}$ | N | $C(CH_3)_2$ |
| $L_{A2017}$ | H | $R_{B1}$ | N | $Si(CH_3)_2$ |
| $L_{A2018}$ | $R_{B1}$ | $R_{B1}$ | N | $Si(CH_3)_2$ |
| $L_{A2019}$ | $R_{B3}$ | $R_{B1}$ | N | $Si(CH_3)_2$ |
| $L_{A2020}$ | $R_{B4}$ | $R_{B1}$ | N | $Si(CH_3)_2$ |
| $L_{A2021}$ | $R_{B7}$ | $R_{B1}$ | N | $Si(CH_3)_2$ |
| $L_{A2022}$ | $R_{B10}$ | $R_{B1}$ | N | $Si(CH_3)_2$ |
| $L_{A2023}$ | $R_{A3}$ | $R_{B1}$ | N | $Si(CH_3)_2$ |
| $L_{A2024}$ | $R_{A34}$ | $R_{B1}$ | N | $Si(CH_3)_2$ |
| $L_{A2025}$ | H | $R_{B6}$ | N | S |
| $L_{A2026}$ | $R_{B1}$ | $R_{B6}$ | N | S |
| $L_{A2027}$ | $R_{B3}$ | $R_{B6}$ | N | S |

-continued

| Ligand | $R^1$ | $R^5$ | X | Y |
|---|---|---|---|---|
| $L_{A2028}$ | $R_{B4}$ | $R_{B6}$ | N | S |
| $L_{A2029}$ | $R_{B7}$ | $R_{B6}$ | N | S |
| $L_{A2030}$ | $R_{B10}$ | $R_{B6}$ | N | S |
| $L_{A2031}$ | $R_{A3}$ | $R_{B6}$ | N | S |
| $L_{A2032}$ | $R_{A34}$ | $R_{B6}$ | N | S |
| $L_{A2033}$ | H | $R_{B6}$ | N | O |
| $L_{A2034}$ | $R_{B1}$ | $R_{B6}$ | N | O |
| $L_{A2035}$ | $R_{B3}$ | $R_{B6}$ | N | O |
| $L_{A2036}$ | $R_{B4}$ | $R_{B6}$ | N | O |
| $L_{A2037}$ | $R_{B7}$ | $R_{B6}$ | N | O |
| $L_{A2038}$ | $R_{B10}$ | $R_{B6}$ | N | O |
| $L_{A2039}$ | $R_{A3}$ | $R_{B6}$ | N | O |
| $L_{A2040}$ | $R_{A34}$ | $R_{B6}$ | N | O |
| $L_{A2041}$ | H | $R_{B6}$ | N | $NCH_3$ |
| $L_{A2042}$ | $R_{B1}$ | $R_{B6}$ | N | $NCH_3$ |
| $L_{A2043}$ | $R_{B3}$ | $R_{B6}$ | N | $NCH_3$ |
| $L_{A2044}$ | $R_{B4}$ | $R_{B6}$ | N | $NCH_3$ |
| $L_{A2045}$ | $R_{B7}$ | $R_{B6}$ | N | $NCH_3$ |
| $L_{A2046}$ | $R_{B10}$ | $R_{B6}$ | N | $NCH_3$ |
| $L_{A2047}$ | $R_{A3}$ | $R_{B6}$ | N | $NCH_3$ |
| $L_{A2048}$ | $R_{A34}$ | $R_{B6}$ | N | $NCH_3$ |
| $L_{A2049}$ | H | $R_{B6}$ | N | $C(CH_3)_2$ |
| $L_{A2050}$ | $R_{B1}$ | $R_{B6}$ | N | $C(CH_3)_2$ |
| $L_{A2051}$ | $R_{B3}$ | $R_{B6}$ | N | $C(CH_3)_2$ |
| $L_{A2052}$ | $R_{B4}$ | $R_{B6}$ | N | $C(CH_3)_2$ |
| $L_{A2053}$ | $R_{B7}$ | $R_{B6}$ | N | $C(CH_3)_2$ |
| $L_{A2054}$ | $R_{B10}$ | $R_{B6}$ | N | $C(CH_3)_2$ |
| $L_{A2055}$ | $R_{A3}$ | $R_{B6}$ | N | $C(CH_3)_2$ |
| $L_{A2056}$ | $R_{A34}$ | $R_{B6}$ | N | $C(CH_3)_2$ |
| $L_{A2057}$ | H | $R_{B6}$ | N | $Si(CH_3)_2$ |
| $L_{A2058}$ | $R_{B1}$ | $R_{B6}$ | N | $Si(CH_3)_2$ |
| $L_{A2059}$ | $R_{B3}$ | $R_{B6}$ | N | $Si(CH_3)_2$ |
| $L_{A2060}$ | $R_{B4}$ | $R_{B6}$ | N | $Si(CH_3)_2$ |
| $L_{A2061}$ | $R_{B7}$ | $R_{B6}$ | N | $Si(CH_3)_2$ |
| $L_{A2062}$ | $R_{B10}$ | $R_{B6}$ | N | $Si(CH_3)_2$ |
| $L_{A2063}$ | $R_{A3}$ | $R_{B6}$ | N | $Si(CH_3)_2$ |
| $L_{A2064}$ | $R_{A34}$ | $R_{B6}$ | N | $Si(CH_3)_2$ |

wherein $L_{A2065}$ through $L_{A2184}$ have a structure of Formula XV:

Formula XV

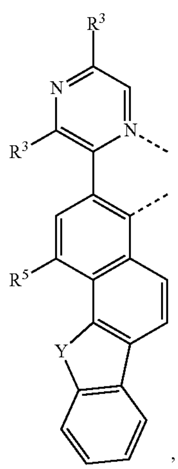

wherein $R^3$, $R^5$, and Y are defined as provided below:

| Ligand | $R^5$ | $R^3$ | Y | Ligand | $R^5$ | $R^3$ | $R^{14}$ |
|---|---|---|---|---|---|---|---|
| $L_{A2065}$ | H | H | S | $L_{A2125}$ | $R_{B1}$ | $R_{B4}$ | $NCH_3$ |
| $L_{A2066}$ | H | $R_{B1}$ | S | $L_{A2126}$ | $R_{B1}$ | $R_{B5}$ | $NCH_3$ |
| $L_{A2067}$ | H | $R_{B2}$ | S | $L_{A2127}$ | $R_{B1}$ | $R_{A34}$ | $NCH_3$ |
| $L_{A2068}$ | H | $R_{B3}$ | S | $L_{A2128}$ | $R_{B1}$ | $R_{A52}$ | $NCH_3$ |

-continued

| Ligand | $R^5$ | $R^3$ | Y | Ligand | $R^5$ | $R^3$ | $R^{14}$ |
|---|---|---|---|---|---|---|---|
| $L_{A2069}$ | H | $R_{B4}$ | S | $L_{A2129}$ | $R_{B1}$ | H | $C(CH_3)_2$ |
| $L_{A2070}$ | H | $R_{B5}$ | S | $L_{A2130}$ | $R_{B1}$ | $R_{B1}$ | $C(CH_3)_2$ |
| $L_{A2071}$ | H | $R_{A34}$ | S | $L_{A2131}$ | $R_{B1}$ | $R_{B2}$ | $C(CH_3)_2$ |
| $L_{A2072}$ | H | $R_{A52}$ | S | $L_{A2132}$ | $R_{B1}$ | $R_{B3}$ | $C(CH_3)_2$ |
| $L_{A2073}$ | H | H | O | $L_{A2133}$ | $R_{B1}$ | $R_{B4}$ | $C(CH_3)_2$ |
| $L_{A2074}$ | H | $R_{B1}$ | O | $L_{A2134}$ | $R_{B1}$ | $R_{B5}$ | $C(CH_3)_2$ |
| $L_{A2075}$ | H | $R_{B2}$ | O | $L_{A2135}$ | $R_{B1}$ | $R_{A34}$ | $C(CH_3)_2$ |
| $L_{A2076}$ | H | $R_{B3}$ | O | $L_{A2136}$ | $R_{B1}$ | $R_{A52}$ | $C(CH_3)_2$ |
| $L_{A2077}$ | H | $R_{B4}$ | O | $L_{A2137}$ | $R_{B1}$ | H | $Si(CH_3)_2$ |
| $L_{A2078}$ | H | $R_{B5}$ | O | $L_{A2138}$ | $R_{B1}$ | $R_{B1}$ | $Si(CH_3)_2$ |
| $L_{A2079}$ | H | $R_{A34}$ | O | $L_{A2139}$ | $R_{B1}$ | $R_{B2}$ | $Si(CH_3)_2$ |
| $L_{A2080}$ | H | $R_{A52}$ | O | $L_{A2140}$ | $R_{B1}$ | $R_{B3}$ | $Si(CH_3)_2$ |
| $L_{A2081}$ | H | H | $NCH_3$ | $L_{A2141}$ | $R_{B1}$ | $R_{B4}$ | $Si(CH_3)_2$ |
| $L_{A2082}$ | H | $R_{B1}$ | $NCH_3$ | $L_{A2142}$ | $R_{B1}$ | $R_{B5}$ | $Si(CH_3)_2$ |
| $L_{A2083}$ | H | $R_{B2}$ | $NCH_3$ | $L_{A2143}$ | $R_{B1}$ | $R_{A34}$ | $Si(CH_3)_2$ |
| $L_{A2084}$ | H | $R_{B3}$ | $NCH_3$ | $L_{A2144}$ | $R_{B1}$ | $R_{A52}$ | $Si(CH_3)_2$ |
| $L_{A2085}$ | H | $R_{B4}$ | $NCH_3$ | $L_{A2145}$ | $R_{B6}$ | H | S |
| $L_{A2086}$ | H | $R_{B5}$ | $NCH_3$ | $L_{A2146}$ | $R_{B6}$ | $R_{B1}$ | S |
| $L_{A2087}$ | H | $R_{A34}$ | $NCH_3$ | $L_{A2147}$ | $R_{B6}$ | $R_{B2}$ | S |
| $L_{A2088}$ | H | $R_{A52}$ | $NCH_3$ | $L_{A2148}$ | $R_{B6}$ | $R_{B3}$ | S |
| $L_{A2089}$ | H | H | $C(CH_3)_2$ | $L_{A2149}$ | $R_{B6}$ | $R_{B4}$ | S |
| $L_{A2090}$ | H | $R_{B1}$ | $C(CH_3)_2$ | $L_{A2150}$ | $R_{B6}$ | $R_{B5}$ | S |
| $L_{A2091}$ | H | $R_{B2}$ | $C(CH_3)_2$ | $L_{A2151}$ | $R_{B6}$ | $R_{A34}$ | S |
| $L_{A2092}$ | H | $R_{B3}$ | $C(CH_3)_2$ | $L_{A2152}$ | $R_{B6}$ | $R_{A52}$ | S |
| $L_{A2093}$ | H | $R_{B4}$ | $C(CH_3)_2$ | $L_{A2153}$ | $R_{B6}$ | H | O |
| $L_{A2094}$ | H | $R_{B5}$ | $C(CH_3)_2$ | $L_{A2154}$ | $R_{B6}$ | $R_{B1}$ | O |
| $L_{A2095}$ | H | $R_{A34}$ | $C(CH_3)_2$ | $L_{A2155}$ | $R_{B6}$ | $R_{B2}$ | O |
| $L_{A2096}$ | H | $R_{A52}$ | $C(CH_3)_2$ | $L_{A2156}$ | $R_{B6}$ | $R_{B3}$ | O |
| $L_{A2097}$ | H | H | $Si(CH_3)_2$ | $L_{A2157}$ | $R_{B6}$ | $R_{B4}$ | O |
| $L_{A2098}$ | H | $R_{B1}$ | $Si(CH_3)_2$ | $L_{A2158}$ | $R_{B6}$ | $R_{B5}$ | O |
| $L_{A2099}$ | H | $R_{B2}$ | $Si(CH_3)_2$ | $L_{A2159}$ | $R_{B6}$ | $R_{A34}$ | O |
| $L_{A2100}$ | H | $R_{B3}$ | $Si(CH_3)_2$ | $L_{A2160}$ | $R_{B6}$ | $R_{A52}$ | O |
| $L_{A2101}$ | H | $R_{B4}$ | $Si(CH_3)_2$ | $L_{A2161}$ | $R_{B6}$ | H | $NCH_3$ |
| $L_{A2102}$ | H | $R_{B5}$ | $Si(CH_3)_2$ | $L_{A2162}$ | $R_{B6}$ | $R_{B1}$ | $NCH_3$ |
| $L_{A2103}$ | H | $R_{A34}$ | $Si(CH_3)_2$ | $L_{A2163}$ | $R_{B6}$ | $R_{B2}$ | $NCH_3$ |
| $L_{A2104}$ | H | $R_{A52}$ | $Si(CH_3)_2$ | $L_{A2164}$ | $R_{B6}$ | $R_{B3}$ | $NCH_3$ |
| $L_{A2105}$ | $R_{B1}$ | H | S | $L_{A2165}$ | $R_{B6}$ | $R_{B4}$ | $NCH_3$ |
| $L_{A2106}$ | $R_{B1}$ | $R_{B1}$ | S | $L_{A2166}$ | $R_{B6}$ | $R_{B5}$ | $NCH_3$ |
| $L_{A2107}$ | $R_{B1}$ | $R_{B2}$ | S | $L_{A2167}$ | $R_{B6}$ | $R_{A34}$ | $NCH_3$ |
| $L_{A2108}$ | $R_{B1}$ | $R_{B3}$ | S | $L_{A2168}$ | $R_{B6}$ | $R_{A52}$ | $NCH_3$ |
| $L_{A2109}$ | $R_{B1}$ | $R_{B4}$ | S | $L_{A2169}$ | $R_{B6}$ | H | $C(CH_3)_2$ |
| $L_{A2110}$ | $R_{B1}$ | $R_{B5}$ | S | $L_{A2170}$ | $R_{B6}$ | $R_{B1}$ | $C(CH_3)_2$ |
| $L_{A2111}$ | $R_{B1}$ | $R_{A34}$ | S | $L_{A2171}$ | $R_{B6}$ | $R_{B2}$ | $C(CH_3)_2$ |
| $L_{A2112}$ | $R_{B1}$ | $R_{A52}$ | S | $L_{A2172}$ | $R_{B6}$ | $R_{B3}$ | $C(CH_3)_2$ |
| $L_{A2113}$ | $R_{B1}$ | H | O | $L_{A2173}$ | $R_{B6}$ | $R_{B4}$ | $C(CH_3)_2$ |
| $L_{A2114}$ | $R_{B1}$ | $R_{B1}$ | O | $L_{A2174}$ | $R_{B6}$ | $R_{B5}$ | $C(CH_3)_2$ |
| $L_{A2115}$ | $R_{B1}$ | $R_{B2}$ | O | $L_{A2175}$ | $R_{B6}$ | $R_{A34}$ | $C(CH_3)_2$ |
| $L_{A2116}$ | $R_{B1}$ | $R_{B3}$ | O | $L_{A2176}$ | $R_{B6}$ | $R_{A52}$ | $C(CH_3)_2$ |
| $L_{A2117}$ | $R_{B1}$ | $R_{B4}$ | O | $L_{A2177}$ | $R_{B6}$ | H | $Si(CH_3)_2$ |
| $L_{A2118}$ | $R_{B1}$ | $R_{B5}$ | O | $L_{A2178}$ | $R_{B6}$ | $R_{B1}$ | $Si(CH_3)_2$ |
| $L_{A2119}$ | $R_{B1}$ | $R_{A34}$ | O | $L_{A2179}$ | $R_{B6}$ | $R_{B2}$ | $Si(CH_3)_2$ |
| $L_{A2120}$ | $R_{B1}$ | $R_{A52}$ | O | $L_{A2180}$ | $R_{B6}$ | $R_{B3}$ | $Si(CH_3)_2$ |
| $L_{A2121}$ | $R_{B1}$ | H | $NCH_3$ | $L_{A2181}$ | $R_{B6}$ | $R_{B4}$ | $Si(CH_3)_2$ |
| $L_{A2122}$ | $R_{B1}$ | $R_{B1}$ | $NCH_3$ | $L_{A2182}$ | $R_{B6}$ | $R_{B5}$ | $Si(CH_3)_2$ |
| $L_{A2123}$ | $R_{B1}$ | $R_{B2}$ | $NCH_3$ | $L_{A2183}$ | $R_{B6}$ | $R_{A34}$ | $Si(CH_3)_2$ |
| $L_{A2124}$ | $R_{B1}$ | $R_{B3}$ | $NCH_3$ | $L_{A2184}$ | $R_{B6}$ | $R_{A52}$ | $Si(CH_3)_2$ |

wherein $L_{A2185}$ through $L_{A2280}$ have a structure of Formula XVI:

Formula XVI

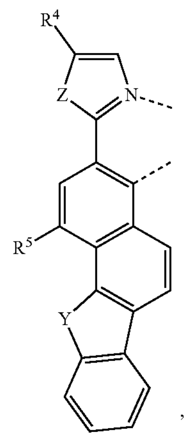

wherein $R^4$, $R^5$, Y, and Z are defined as provided below:

| Ligand | $R^5$ | $R^4$ | Y | Z |
|---|---|---|---|---|
| $L_{A2185}$ | H | H | S | S |
| $L_{A2186}$ | H | $R_{B1}$ | S | S |
| $L_{A2187}$ | H | $R_{B3}$ | S | S |
| $L_{A2188}$ | H | $R_{B4}$ | S | S |
| $L_{A2189}$ | H | $R_{B7}$ | S | S |
| $L_{A2190}$ | H | $R_{B10}$ | S | S |
| $L_{A2191}$ | H | $R_{A3}$ | S | S |
| $L_{A2192}$ | H | $R_{A34}$ | S | S |
| $L_{A2193}$ | H | H | S | O |
| $L_{A2194}$ | H | $R_{B1}$ | S | O |
| $L_{A2195}$ | H | $R_{B3}$ | S | O |
| $L_{A2196}$ | H | $R_{B4}$ | S | O |
| $L_{A2197}$ | H | $R_{B7}$ | S | O |
| $L_{A2198}$ | H | $R_{B10}$ | S | O |
| $L_{A2199}$ | H | $R_{A3}$ | S | O |
| $L_{A2200}$ | H | $R_{A34}$ | S | O |
| $L_{A2201}$ | H | H | S | $NCH_3$ |
| $L_{A2202}$ | H | $R_{B1}$ | S | $NCH_3$ |
| $L_{A2203}$ | H | $R_{B3}$ | S | $NCH_3$ |
| $L_{A2204}$ | H | $R_{B4}$ | S | $NCH_3$ |
| $L_{A2205}$ | H | $R_{B7}$ | S | $NCH_3$ |
| $L_{A2206}$ | H | $R_{B10}$ | S | $NCH_3$ |
| $L_{A2207}$ | H | $R_{A3}$ | S | $NCH_3$ |
| $L_{A2208}$ | H | $R_{A34}$ | S | $NCH_3$ |
| $L_{A2209}$ | H | H | O | S |
| $L_{A2210}$ | H | $R_{B1}$ | O | S |
| $L_{A2211}$ | H | $R_{B3}$ | O | S |
| $L_{A2212}$ | H | $R_{B4}$ | O | S |
| $L_{A2213}$ | H | $R_{B7}$ | O | S |
| $L_{A2214}$ | H | $R_{B10}$ | O | S |
| $L_{A2215}$ | H | $R_{A3}$ | O | S |
| $L_{A2216}$ | H | $R_{A34}$ | O | S |
| $L_{A2217}$ | H | H | O | O |
| $L_{A2218}$ | H | $R_{B1}$ | O | O |
| $L_{A2219}$ | H | $R_{B3}$ | O | O |
| $L_{A2220}$ | H | $R_{B4}$ | O | O |
| $L_{A2221}$ | H | $R_{B7}$ | O | O |
| $L_{A2222}$ | H | $R_{B10}$ | O | O |
| $L_{A2223}$ | H | $R_{A3}$ | O | O |
| $L_{A2224}$ | H | $R_{A34}$ | O | O |
| $L_{A2225}$ | H | H | O | $NCH_3$ |
| $L_{A2226}$ | H | $R_{B1}$ | O | $NCH_3$ |
| $L_{A2227}$ | H | $R_{B3}$ | O | $NCH_3$ |
| $L_{A2228}$ | H | $R_{B4}$ | O | $NCH_3$ |
| $L_{A2229}$ | H | $R_{B7}$ | O | $NCH_3$ |
| $L_{A2230}$ | H | $R_{B10}$ | O | $NCH_3$ |
| $L_{A2231}$ | H | $R_{A3}$ | O | $NCH_3$ |
| $L_{A2232}$ | H | $R_{A34}$ | O | $NCH_3$ |

-continued

| Ligand | $R^5$ | $R^4$ | Y | Z |
|---|---|---|---|---|
| $L_{A2233}$ | $R_{B6}$ | H | S | S |
| $L_{A2234}$ | $R_{B6}$ | $R_{B1}$ | S | S |
| $L_{A2235}$ | $R_{B6}$ | $R_{B3}$ | S | S |
| $L_{A2236}$ | $R_{B6}$ | $R_{B4}$ | S | S |
| $L_{A2237}$ | $R_{B6}$ | $R_{B7}$ | S | S |
| $L_{A2238}$ | $R_{B6}$ | $R_{B10}$ | S | S |
| $L_{A2239}$ | $R_{B6}$ | $R_{A3}$ | S | S |
| $L_{A2240}$ | $R_{B6}$ | $R_{A34}$ | S | S |
| $L_{A2241}$ | $R_{B6}$ | H | S | O |
| $L_{A2242}$ | $R_{B6}$ | $R_{B1}$ | S | O |
| $L_{A2243}$ | $R_{B6}$ | $R_{B3}$ | S | O |
| $L_{A2244}$ | $R_{B6}$ | $R_{B4}$ | S | O |
| $L_{A2245}$ | $R_{B6}$ | $R_{B7}$ | S | O |
| $L_{A2246}$ | $R_{B6}$ | $R_{B10}$ | S | O |
| $L_{A2247}$ | $R_{B6}$ | $R_{A3}$ | S | O |
| $L_{A2248}$ | $R_{B6}$ | $R_{A34}$ | S | O |
| $L_{A2249}$ | $R_{B6}$ | H | S | $NCH_3$ |
| $L_{A2250}$ | $R_{B6}$ | $R_{B1}$ | S | $NCH_3$ |
| $L_{A2251}$ | $R_{B6}$ | $R_{B3}$ | S | $NCH_3$ |
| $L_{A2252}$ | $R_{B6}$ | $R_{B4}$ | S | $NCH_3$ |
| $L_{A2253}$ | $R_{B6}$ | $R_{B7}$ | S | $NCH_3$ |
| $L_{A2254}$ | $R_{B6}$ | $R_{B10}$ | S | $NCH_3$ |
| $L_{A2255}$ | $R_{B6}$ | $R_{A3}$ | S | $NCH_3$ |
| $L_{A2256}$ | $R_{B6}$ | $R_{A34}$ | S | $NCH_3$ |
| $L_{A2257}$ | $R_{B6}$ | H | O | S |
| $L_{A2258}$ | $R_{B6}$ | $R_{B1}$ | O | S |
| $L_{A2259}$ | $R_{B6}$ | $R_{B3}$ | O | S |
| $L_{A2260}$ | $R_{B6}$ | $R_{B4}$ | O | S |
| $L_{A2261}$ | $R_{B6}$ | $R_{B7}$ | O | S |
| $L_{A2262}$ | $R_{B6}$ | $R_{B10}$ | O | S |
| $L_{A2263}$ | $R_{B6}$ | $R_{A3}$ | O | S |
| $L_{A2264}$ | $R_{B6}$ | $R_{A34}$ | O | S |
| $L_{A2265}$ | $R_{B6}$ | H | O | O |
| $L_{A2266}$ | $R_{B6}$ | $R_{B1}$ | O | O |
| $L_{A2267}$ | $R_{B6}$ | $R_{B3}$ | O | O |
| $L_{A2268}$ | $R_{B6}$ | $R_{B4}$ | O | O |
| $L_{A2269}$ | $R_{B6}$ | $R_{B7}$ | O | O |
| $L_{A2270}$ | $R_{B6}$ | $R_{B10}$ | O | O |
| $L_{A2271}$ | $R_{B6}$ | $R_{A3}$ | O | O |
| $L_{A2272}$ | $R_{B6}$ | $R_{A34}$ | O | O |
| $L_{A2273}$ | $R_{B6}$ | H | O | $NCH_3$ |
| $L_{A2274}$ | $R_{B6}$ | $R_{B1}$ | O | $NCH_3$ |
| $L_{A2275}$ | $R_{B6}$ | $R_{B3}$ | O | $NCH_3$ |
| $L_{A2276}$ | $R_{B6}$ | $R_{B4}$ | O | $NCH_3$ |
| $L_{A2277}$ | $R_{B6}$ | $R_{B7}$ | O | $NCH_3$ |
| $L_{A2278}$ | $R_{B6}$ | $R_{B10}$ | O | $NCH_3$ |
| $L_{A2279}$ | $R_{B6}$ | $R_{A3}$ | O | $NCH_3$ |
| $L_{A2280}$ | $R_{B6}$ | $R_{A34}$ | O | $NCH_3$ |

wherein $L_{A2281}$ through $L_{A2520}$ have a structure of Formula XVII:

Formula XVII

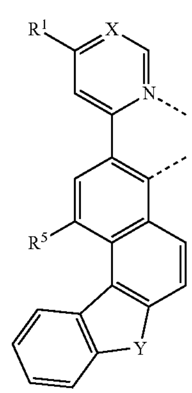

wherein $R^1$, $R^5$, X, and Y are defined as provided below:

| Ligand | $R^1$ | $R^5$ | X | Y |
|---|---|---|---|---|
| $L_{A2281}$ | H | H | C | S |
| $L_{A2282}$ | $R_{B1}$ | H | C | S |
| $L_{A2283}$ | $R_{B3}$ | H | C | S |
| $L_{A2284}$ | $R_{B4}$ | H | C | S |
| $L_{A2285}$ | $R_{B7}$ | H | C | S |
| $L_{A2286}$ | $R_{B10}$ | H | C | S |
| $L_{A2287}$ | $R_{A3}$ | H | C | S |
| $L_{A2288}$ | $R_{A34}$ | H | C | S |
| $L_{A2289}$ | H | H | C | O |
| $L_{A2290}$ | $R_{B1}$ | H | C | O |
| $L_{A2291}$ | $R_{B3}$ | H | C | O |
| $L_{A2292}$ | $R_{B4}$ | H | C | O |
| $L_{A2293}$ | $R_{B7}$ | H | C | O |
| $L_{A2294}$ | $R_{B10}$ | H | C | O |
| $L_{A2295}$ | $R_{A3}$ | H | C | O |
| $L_{A2296}$ | $R_{A34}$ | H | C | O |
| $L_{A2297}$ | H | H | C | $NCH_3$ |
| $L_{A2298}$ | $R_{B1}$ | H | C | $NCH_3$ |
| $L_{A2299}$ | $R_{B3}$ | H | C | $NCH_3$ |
| $L_{A2300}$ | $R_{B4}$ | H | C | $NCH_3$ |
| $L_{A2301}$ | $R_{B7}$ | H | C | $NCH_3$ |
| $L_{A2302}$ | $R_{B10}$ | H | C | $NCH_3$ |
| $L_{A2303}$ | $R_{A3}$ | H | C | $NCH_3$ |
| $L_{A2304}$ | $R_{A34}$ | H | C | $NCH_3$ |
| $L_{A2305}$ | H | H | C | $C(CH_3)_2$ |
| $L_{A2306}$ | $R_{B1}$ | H | C | $C(CH_3)_2$ |
| $L_{A2307}$ | $R_{B3}$ | H | C | $C(CH_3)_2$ |
| $L_{A2308}$ | $R_{B4}$ | H | C | $C(CH_3)_2$ |
| $L_{A2309}$ | $R_{B7}$ | H | C | $C(CH_3)_2$ |
| $L_{A2310}$ | $R_{B10}$ | H | C | $C(CH_3)_2$ |
| $L_{A2311}$ | $R_{A3}$ | H | C | $C(CH_3)_2$ |
| $L_{A2312}$ | $R_{A34}$ | H | C | $C(CH_3)_2$ |
| $L_{A2313}$ | H | H | C | $Si(CH_3)_2$ |
| $L_{A2314}$ | $R_{B1}$ | H | C | $Si(CH_3)_2$ |
| $L_{A2315}$ | $R_{B3}$ | H | C | $Si(CH_3)_2$ |
| $L_{A2316}$ | $R_{B4}$ | H | C | $Si(CH_3)_2$ |
| $L_{A2317}$ | $R_{B7}$ | H | C | $Si(CH_3)_2$ |
| $L_{A2318}$ | $R_{B10}$ | H | C | $Si(CH_3)_2$ |
| $L_{A2319}$ | $R_{A3}$ | H | C | $Si(CH_3)_2$ |
| $L_{A2320}$ | $R_{A34}$ | H | C | $Si(CH_3)_2$ |
| $L_{A2321}$ | H | $R_{B1}$ | C | S |
| $L_{A2322}$ | $R_{B1}$ | $R_{B1}$ | C | S |
| $L_{A2323}$ | $R_{B3}$ | $R_{B1}$ | C | S |
| $L_{A2324}$ | $R_{B4}$ | $R_{B1}$ | C | S |
| $L_{A2325}$ | $R_{B7}$ | $R_{B1}$ | C | S |
| $L_{A2326}$ | $R_{B10}$ | $R_{B1}$ | C | S |
| $L_{A2327}$ | $R_{A3}$ | $R_{B1}$ | C | S |
| $L_{A2328}$ | $R_{A34}$ | $R_{B1}$ | C | S |
| $L_{A2329}$ | H | $R_{B1}$ | C | O |
| $L_{A2330}$ | $R_{B1}$ | $R_{B1}$ | C | O |
| $L_{A2331}$ | $R_{B3}$ | $R_{B1}$ | C | O |
| $L_{A2332}$ | $R_{B4}$ | $R_{B1}$ | C | O |
| $L_{A2333}$ | $R_{B7}$ | $R_{B1}$ | C | O |
| $L_{A2334}$ | $R_{B10}$ | $R_{B1}$ | C | O |
| $L_{A2335}$ | $R_{A3}$ | $R_{B1}$ | C | O |
| $L_{A2336}$ | $R_{A34}$ | $R_{B1}$ | C | O |
| $L_{A2337}$ | H | $R_{B1}$ | C | $NCH_3$ |
| $L_{A2338}$ | $R_{B1}$ | $R_{B1}$ | C | $NCH_3$ |
| $L_{A2339}$ | $R_{B3}$ | $R_{B1}$ | C | $NCH_3$ |
| $L_{A2340}$ | $R_{B4}$ | $R_{B1}$ | C | $NCH_3$ |
| $L_{A2341}$ | $R_{B7}$ | $R_{B1}$ | C | $NCH_3$ |
| $L_{A2342}$ | $R_{B10}$ | $R_{B1}$ | C | $NCH_3$ |
| $L_{A2343}$ | $R_{A3}$ | $R_{B1}$ | C | $NCH_3$ |
| $L_{A2344}$ | $R_{A34}$ | $R_{B1}$ | C | $NCH_3$ |
| $L_{A2345}$ | H | $R_{B1}$ | C | $C(CH_3)_2$ |
| $L_{A2346}$ | $R_{B1}$ | $R_{B1}$ | C | $C(CH_3)_2$ |
| $L_{A2347}$ | $R_{B3}$ | $R_{B1}$ | C | $C(CH_3)_2$ |
| $L_{A2348}$ | $R_{B4}$ | $R_{B1}$ | C | $C(CH_3)_2$ |
| $L_{A2349}$ | $R_{B7}$ | $R_{B1}$ | C | $C(CH_3)_2$ |
| $L_{A2350}$ | $R_{B10}$ | $R_{B1}$ | C | $C(CH_3)_2$ |
| $L_{A2351}$ | $R_{A3}$ | $R_{B1}$ | C | $C(CH_3)_2$ |
| $L_{A2352}$ | $R_{A34}$ | $R_{B1}$ | C | $C(CH_3)_2$ |
| $L_{A2353}$ | H | $R_{B1}$ | C | $Si(CH_3)_2$ |
| $L_{A2354}$ | $R_{B1}$ | $R_{B1}$ | C | $Si(CH_3)_2$ |
| $L_{A2355}$ | $R_{B3}$ | $R_{B1}$ | C | $Si(CH_3)_2$ |
| $L_{A2356}$ | $R_{B4}$ | $R_{B1}$ | C | $Si(CH_3)_2$ |

-continued

| Ligand | $R^1$ | $R^5$ | X | Y |
|---|---|---|---|---|
| $L_{A2357}$ | $R_{B7}$ | $R_{B1}$ | C | $Si(CH_3)_2$ |
| $L_{A2358}$ | $R_{B10}$ | $R_{B1}$ | C | $Si(CH_3)_2$ |
| $L_{A2359}$ | $R_{A3}$ | $R_{B1}$ | C | $Si(CH_3)_2$ |
| $L_{A2360}$ | $R_{A34}$ | $R_{B1}$ | C | $Si(CH_3)_2$ |
| $L_{A2361}$ | H | $R_{B6}$ | C | S |
| $L_{A2362}$ | $R_{B1}$ | $R_{B6}$ | C | S |
| $L_{A2363}$ | $R_{B3}$ | $R_{B6}$ | C | S |
| $L_{A2364}$ | $R_{B4}$ | $R_{B6}$ | C | S |
| $L_{A2365}$ | $R_{B7}$ | $R_{B6}$ | C | S |
| $L_{A2366}$ | $R_{B10}$ | $R_{B6}$ | C | S |
| $L_{A2367}$ | $R_{A3}$ | $R_{B6}$ | C | S |
| $L_{A2368}$ | $R_{A34}$ | $R_{B6}$ | C | S |
| $L_{A2369}$ | H | $R_{B6}$ | C | O |
| $L_{A2370}$ | $R_{B1}$ | $R_{B6}$ | C | O |
| $L_{A2371}$ | $R_{B3}$ | $R_{B6}$ | C | O |
| $L_{A2372}$ | $R_{B4}$ | $R_{B6}$ | C | O |
| $L_{A2373}$ | $R_{B7}$ | $R_{B6}$ | C | O |
| $L_{A2374}$ | $R_{B10}$ | $R_{B6}$ | C | O |
| $L_{A2375}$ | $R_{A3}$ | $R_{B6}$ | C | O |
| $L_{A2376}$ | $R_{A34}$ | $R_{B6}$ | C | O |
| $L_{A2377}$ | H | $R_{B6}$ | C | $NCH_3$ |
| $L_{A2378}$ | $R_{B1}$ | $R_{B6}$ | C | $NCH_3$ |
| $L_{A2379}$ | $R_{B3}$ | $R_{B6}$ | C | $NCH_3$ |
| $L_{A2380}$ | $R_{B4}$ | $R_{B6}$ | C | $NCH_3$ |
| $L_{A2381}$ | $R_{B7}$ | $R_{B6}$ | C | $NCH_3$ |
| $L_{A2382}$ | $R_{B10}$ | $R_{B6}$ | C | $NCH_3$ |
| $L_{A2383}$ | $R_{A3}$ | $R_{B6}$ | C | $NCH_3$ |
| $L_{A2384}$ | $R_{A34}$ | $R_{B6}$ | C | $NCH_3$ |
| $L_{A2385}$ | H | $R_{B6}$ | C | $C(CH_3)_2$ |
| $L_{A2386}$ | $R_{B1}$ | $R_{B6}$ | C | $C(CH_3)_2$ |
| $L_{A2387}$ | $R_{B3}$ | $R_{B6}$ | C | $C(CH_3)_2$ |
| $L_{A2388}$ | $R_{B4}$ | $R_{B6}$ | C | $C(CH_3)_2$ |
| $L_{A2389}$ | $R_{B7}$ | $R_{B6}$ | C | $C(CH_3)_2$ |
| $L_{A2390}$ | $R_{B10}$ | $R_{B6}$ | C | $C(CH_3)_2$ |
| $L_{A2391}$ | $R_{A3}$ | $R_{B6}$ | C | $C(CH_3)_2$ |
| $L_{A2392}$ | $R_{A34}$ | $R_{B6}$ | C | $C(CH_3)_2$ |
| $L_{A2393}$ | H | $R_{B6}$ | C | $Si(CH_3)_2$ |
| $L_{A2394}$ | $R_{B1}$ | $R_{B6}$ | C | $Si(CH_3)_2$ |
| $L_{A2395}$ | $R_{B3}$ | $R_{B6}$ | C | $Si(CH_3)_2$ |
| $L_{A2396}$ | $R_{B4}$ | $R_{B6}$ | C | $Si(CH_3)_2$ |
| $L_{A2397}$ | $R_{B7}$ | $R_{B6}$ | C | $Si(CH_3)_2$ |
| $L_{A2398}$ | $R_{B10}$ | $R_{B6}$ | C | $Si(CH_3)_2$ |
| $L_{A2399}$ | $R_{A3}$ | $R_{B6}$ | C | $Si(CH_3)_2$ |
| $L_{A2400}$ | $R_{A34}$ | $R_{B6}$ | C | $Si(CH_3)_2$ |
| $L_{A2401}$ | H | H | N | S |
| $L_{A2402}$ | $R_{B1}$ | H | N | S |
| $L_{A2403}$ | $R_{B3}$ | H | N | S |
| $L_{A2404}$ | $R_{B4}$ | H | N | S |
| $L_{A2405}$ | $R_{B7}$ | H | N | S |
| $L_{A2406}$ | $R_{B10}$ | H | N | S |
| $L_{A2407}$ | $R_{A3}$ | H | N | S |
| $L_{A2408}$ | $R_{A34}$ | H | N | S |
| $L_{A2409}$ | H | H | N | O |
| $L_{A2410}$ | $R_{B1}$ | H | N | O |
| $L_{A2411}$ | $R_{B3}$ | H | N | O |
| $L_{A2412}$ | $R_{B4}$ | H | N | O |
| $L_{A2413}$ | $R_{B7}$ | H | N | O |
| $L_{A2414}$ | $R_{B10}$ | H | N | O |
| $L_{A2415}$ | $R_{A3}$ | H | N | O |
| $L_{A2416}$ | $R_{A34}$ | H | N | O |
| $L_{A2417}$ | H | H | N | $NCH_3$ |
| $L_{A2418}$ | $R_{B1}$ | H | N | $NCH_3$ |
| $L_{A2419}$ | $R_{B3}$ | H | N | $NCH_3$ |
| $L_{A2420}$ | $R_{B4}$ | H | N | $NCH_3$ |
| $L_{A2421}$ | $R_{B7}$ | H | N | $NCH_3$ |
| $L_{A2422}$ | $R_{B10}$ | H | N | $NCH_3$ |
| $L_{A2423}$ | $R_{A3}$ | H | N | $NCH_3$ |
| $L_{A2424}$ | $R_{A34}$ | H | N | $NCH_3$ |
| $L_{A2425}$ | H | H | N | $C(CH_3)_2$ |
| $L_{A2426}$ | $R_{B1}$ | H | N | $C(CH_3)_2$ |
| $L_{A2427}$ | $R_{B3}$ | H | N | $C(CH_3)_2$ |
| $L_{A2428}$ | $R_{B4}$ | H | N | $C(CH_3)_2$ |
| $L_{A2429}$ | $R_{B7}$ | H | N | $C(CH_3)_2$ |
| $L_{A2430}$ | $R_{B10}$ | H | N | $C(CH_3)_2$ |
| $L_{A2431}$ | $R_{A3}$ | H | N | $C(CH_3)_2$ |
| $L_{A2432}$ | $R_{A34}$ | H | N | $C(CH_3)_2$ |
| $L_{A2433}$ | H | H | N | $Si(CH_3)_2$ |

-continued

| Ligand | $R^1$ | $R^5$ | X | Y |
|---|---|---|---|---|
| $L_{A2434}$ | $R_{B1}$ | H | N | $Si(CH_3)_2$ |
| $L_{A2435}$ | $R_{B3}$ | H | N | $Si(CH_3)_2$ |
| $L_{A2436}$ | $R_{B4}$ | H | N | $Si(CH_3)_2$ |
| $L_{A2437}$ | $R_{B7}$ | H | N | $Si(CH_3)_2$ |
| $L_{A2438}$ | $R_{B10}$ | H | N | $Si(CH_3)_2$ |
| $L_{A2439}$ | $R_{A3}$ | H | N | $Si(CH_3)_2$ |
| $L_{A2440}$ | $R_{A434}$ | H | N | $Si(CH_3)_2$ |
| $L_{A2441}$ | H | $R_{B1}$ | N | S |
| $L_{A2442}$ | $R_{B1}$ | $R_{B1}$ | N | S |
| $L_{A2443}$ | $R_{B3}$ | $R_{B1}$ | N | S |
| $L_{A2444}$ | $R_{B4}$ | $R_{B1}$ | N | S |
| $L_{A2445}$ | $R_{B7}$ | $R_{B1}$ | N | S |
| $L_{A2446}$ | $R_{B10}$ | $R_{B1}$ | N | S |
| $L_{A2447}$ | $R_{A3}$ | $R_{B1}$ | N | S |
| $L_{A2448}$ | $R_{A434}$ | $R_{B1}$ | N | S |
| $L_{A2449}$ | H | $R_{B1}$ | N | O |
| $L_{A2450}$ | $R_{B1}$ | $R_{B1}$ | N | O |
| $L_{A2451}$ | $R_{B3}$ | $R_{B1}$ | N | O |
| $L_{A2452}$ | $R_{B4}$ | $R_{B1}$ | N | O |
| $L_{A2453}$ | $R_{B7}$ | $R_{B1}$ | N | O |
| $L_{A2454}$ | $R_{B10}$ | $R_{B1}$ | N | O |
| $L_{A2455}$ | $R_{A3}$ | $R_{B1}$ | N | O |
| $L_{A2456}$ | $R_{A434}$ | $R_{B1}$ | N | O |
| $L_{A2457}$ | H | $R_{B1}$ | N | $NCH_3$ |
| $L_{A2458}$ | $R_{B1}$ | $R_{B1}$ | N | $NCH_3$ |
| $L_{A2459}$ | $R_{B3}$ | $R_{B1}$ | N | $NCH_3$ |
| $L_{A2460}$ | $R_{B4}$ | $R_{B1}$ | N | $NCH_3$ |
| $L_{A2461}$ | $R_{B7}$ | $R_{B1}$ | N | $NCH_3$ |
| $L_{A2462}$ | $R_{B10}$ | $R_{B1}$ | N | $NCH_3$ |
| $L_{A2463}$ | $R_{A3}$ | $R_{B1}$ | N | $NCH_3$ |
| $L_{A2464}$ | $R_{A434}$ | $R_{B1}$ | N | $NCH_3$ |
| $L_{A2465}$ | H | $R_{B1}$ | N | $C(CH_3)_2$ |
| $L_{A2466}$ | $R_{B1}$ | $R_{B1}$ | N | $C(CH_3)_2$ |
| $L_{A2467}$ | $R_{B3}$ | $R_{B1}$ | N | $C(CH_3)_2$ |
| $L_{A2468}$ | $R_{B4}$ | $R_{B1}$ | N | $C(CH_3)_2$ |
| $L_{A2469}$ | $R_{B7}$ | $R_{B1}$ | N | $C(CH_3)_2$ |
| $L_{A2470}$ | $R_{B10}$ | $R_{B1}$ | N | $C(CH_3)_2$ |
| $L_{A2471}$ | $R_{A3}$ | $R_{B1}$ | N | $C(CH_3)_2$ |
| $L_{A2472}$ | $R_{A434}$ | $R_{B1}$ | N | $C(CH_3)_2$ |
| $L_{A2473}$ | H | $R_{B1}$ | N | $Si(CH_3)_2$ |
| $L_{A2474}$ | $R_{B1}$ | $R_{B1}$ | N | $Si(CH_3)_2$ |
| $L_{A2475}$ | $R_{B3}$ | $R_{B1}$ | N | $Si(CH_3)_2$ |
| $L_{A2476}$ | $R_{B4}$ | $R_{B1}$ | N | $Si(CH_3)_2$ |
| $L_{A2477}$ | $R_{B7}$ | $R_{B1}$ | N | $Si(CH_3)_2$ |
| $L_{A2478}$ | $R_{B10}$ | $R_{B1}$ | N | $Si(CH_3)_2$ |
| $L_{A2479}$ | $R_{A3}$ | $R_{B1}$ | N | $Si(CH_3)_2$ |
| $L_{A2480}$ | $R_{A434}$ | $R_{B1}$ | N | $Si(CH_3)_2$ |
| $L_{A2481}$ | H | $R_{B6}$ | N | S |
| $L_{A2482}$ | $R_{B1}$ | $R_{B6}$ | N | S |
| $L_{A2483}$ | $R_{B3}$ | $R_{B6}$ | N | S |
| $L_{A2484}$ | $R_{B4}$ | $R_{B6}$ | N | S |
| $L_{A2485}$ | $R_{B7}$ | $R_{B6}$ | N | S |
| $L_{A2486}$ | $R_{B10}$ | $R_{B6}$ | N | S |
| $L_{A2487}$ | $R_{A3}$ | $R_{B6}$ | N | S |
| $L_{A2488}$ | $R_{A434}$ | $R_{B6}$ | N | S |
| $L_{A2489}$ | H | $R_{B6}$ | N | O |
| $L_{A2490}$ | $R_{B1}$ | $R_{B6}$ | N | O |
| $L_{A2491}$ | $R_{B3}$ | $R_{B6}$ | N | O |
| $L_{A2492}$ | $R_{B4}$ | $R_{B6}$ | N | O |
| $L_{A2493}$ | $R_{B7}$ | $R_{B6}$ | N | O |
| $L_{A2494}$ | $R_{B10}$ | $R_{B6}$ | N | O |
| $L_{A2495}$ | $R_{A3}$ | $R_{B6}$ | N | O |
| $L_{A2496}$ | $R_{A434}$ | $R_{B6}$ | N | O |
| $L_{A2497}$ | H | $R_{B6}$ | N | $NCH_3$ |
| $L_{A2498}$ | $R_{B1}$ | $R_{B6}$ | N | $NCH_3$ |
| $L_{A2499}$ | $R_{B3}$ | $R_{B6}$ | N | $NCH_3$ |
| $L_{A2500}$ | $R_{B4}$ | $R_{B6}$ | N | $NCH_3$ |
| $L_{A2501}$ | $R_{B7}$ | $R_{B6}$ | N | $NCH_3$ |
| $L_{A2502}$ | $R_{B10}$ | $R_{B6}$ | N | $NCH_3$ |
| $L_{A2503}$ | $R_{A3}$ | $R_{B6}$ | N | $NCH_3$ |
| $L_{A2504}$ | $R_{A434}$ | $R_{B6}$ | N | $NCH_3$ |
| $L_{A2505}$ | H | $R_{B6}$ | N | $C(CH_3)_2$ |
| $L_{A2506}$ | $R_{B1}$ | $R_{B6}$ | N | $C(CH_3)_2$ |
| $L_{A2507}$ | $R_{B3}$ | $R_{B6}$ | N | $C(CH_3)_2$ |
| $L_{A2508}$ | $R_{B4}$ | $R_{B6}$ | N | $C(CH_3)_2$ |
| $L_{A2509}$ | $R_{B7}$ | $R_{B6}$ | N | $C(CH_3)_2$ |
| $L_{A2510}$ | $R_{B10}$ | $R_{B6}$ | N | $C(CH_3)_2$ |

-continued

| Ligand | $R^1$ | $R^5$ | X | Y |
|---|---|---|---|---|
| $L_{A2511}$ | $R_{A3}$ | $R_{B6}$ | N | $C(CH_3)_2$ |
| $L_{A2512}$ | $R_{A434}$ | $R_{B6}$ | N | $C(CH_3)_2$ |
| $L_{A2513}$ | H | $R_{B6}$ | N | $Si(CH_3)_2$ |
| $L_{A2514}$ | $R_{B1}$ | $R_{B6}$ | N | $Si(CH_3)_2$ |
| $L_{A2515}$ | $R_{B3}$ | $R_{B6}$ | N | $Si(CH_3)_2$ |
| $L_{A2516}$ | $R_{B4}$ | $R_{B6}$ | N | $Si(CH_3)_2$ |
| $L_{A2517}$ | $R_{B7}$ | $R_{B6}$ | N | $Si(CH_3)_2$ |
| $L_{A2518}$ | $R_{B10}$ | $R_{B6}$ | N | $Si(CH_3)_2$ |
| $L_{A2519}$ | $R_{A3}$ | $R_{B6}$ | N | $Si(CH_3)_2$ |
| $L_{A2520}$ | $R_{A434}$ | $R_{B6}$ | N | $Si(CH_3)_2$ |

wherein $L_{A2521}$ through $L_{A2640}$ have a structure of Formula XVIII:

Formula XVIII

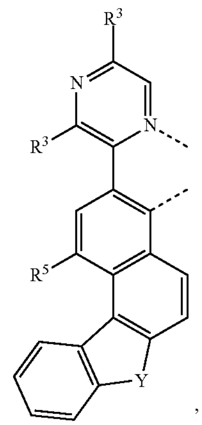

, wherein $R^3$, $R^5$, and Y are defined as provided below:

| Ligand | $R^5$ | $R^3$ | Y | Ligand | $R^5$ | $R^3$ | Y |
|---|---|---|---|---|---|---|---|
| $L_{A2521}$ | H | H | S | $L_{A2581}$ | $R_{B1}$ | $R_{B4}$ | $NCH_3$ |
| $L_{A2522}$ | H | $R_{B1}$ | S | $L_{A2582}$ | $R_{B1}$ | $R_{B5}$ | $NCH_3$ |
| $L_{A2523}$ | H | $R_{B2}$ | S | $L_{A2583}$ | $R_{B1}$ | $R_{A434}$ | $NCH_3$ |
| $L_{A2524}$ | H | $R_{B3}$ | S | $L_{A2584}$ | $R_{B1}$ | $R_{A452}$ | $NCH_3$ |
| $L_{A2525}$ | H | $R_{B4}$ | S | $L_{A2585}$ | $R_{B1}$ | H | $C(CH_3)_2$ |
| $L_{A2526}$ | H | $R_{B5}$ | S | $L_{A2586}$ | $R_{B1}$ | $R_{B1}$ | $C(CH_3)_2$ |
| $L_{A2527}$ | H | $R_{A434}$ | S | $L_{A2587}$ | $R_{B1}$ | $R_{B2}$ | $C(CH_3)_2$ |
| $L_{A2528}$ | H | $R_{A452}$ | S | $L_{A2588}$ | $R_{B1}$ | $R_{B3}$ | $C(CH_3)_2$ |
| $L_{A2529}$ | H | H | O | $L_{A2589}$ | $R_{B1}$ | $R_{B4}$ | $C(CH_3)_2$ |
| $L_{A2530}$ | H | $R_{B1}$ | O | $L_{A2590}$ | $R_{B1}$ | $R_{B5}$ | $C(CH_3)_2$ |
| $L_{A2531}$ | H | $R_{B2}$ | O | $L_{A2591}$ | $R_{B1}$ | $R_{A434}$ | $C(CH_3)_2$ |
| $L_{A2532}$ | H | $R_{B3}$ | O | $L_{A2592}$ | $R_{B1}$ | $R_{A452}$ | $C(CH_3)_2$ |
| $L_{A2533}$ | H | $R_{B4}$ | O | $L_{A2593}$ | $R_{B1}$ | H | $Si(CH_3)_2$ |
| $L_{A2534}$ | H | $R_{B5}$ | O | $L_{A2594}$ | $R_{B1}$ | $R_{B1}$ | $Si(CH_3)_2$ |
| $L_{A2535}$ | H | $R_{A434}$ | O | $L_{A2595}$ | $R_{B1}$ | $R_{B2}$ | $Si(CH_3)_2$ |
| $L_{A2536}$ | H | $R_{A452}$ | O | $L_{A2596}$ | $R_{B1}$ | $R_{B3}$ | $Si(CH_3)_2$ |
| $L_{A2537}$ | H | H | $NCH_3$ | $L_{A2597}$ | $R_{B1}$ | $R_{B4}$ | $Si(CH_3)_2$ |
| $L_{A2538}$ | H | $R_{B1}$ | $NCH_3$ | $L_{A2598}$ | $R_{B1}$ | $R_{B5}$ | $Si(CH_3)_2$ |
| $L_{A2539}$ | H | $R_{B2}$ | $NCH_3$ | $L_{A2599}$ | $R_{B1}$ | $R_{A434}$ | $Si(CH_3)_2$ |
| $L_{A2540}$ | H | $R_{B3}$ | $NCH_3$ | $L_{A2600}$ | $R_{B1}$ | $R_{A452}$ | $Si(CH_3)_2$ |
| $L_{A2541}$ | H | $R_{B4}$ | $NCH_3$ | $L_{A2601}$ | $R_{B6}$ | H | S |
| $L_{A2542}$ | H | $R_{B5}$ | $NCH_3$ | $L_{A2602}$ | $R_{B6}$ | $R_{B1}$ | S |
| $L_{A2543}$ | H | $R_{A434}$ | $NCH_3$ | $L_{A2603}$ | $R_{B6}$ | $R_{B2}$ | S |
| $L_{A2544}$ | H | $R_{A452}$ | $NCH_3$ | $L_{A2604}$ | $R_{B6}$ | $R_{B3}$ | S |
| $L_{A2545}$ | H | H | $C(CH_3)_2$ | $L_{A2605}$ | $R_{B6}$ | $R_{B4}$ | S |
| $L_{A2546}$ | H | $R_{B1}$ | $C(CH_3)_2$ | $L_{A2606}$ | $R_{B6}$ | $R_{B5}$ | S |
| $L_{A2547}$ | H | $R_{B2}$ | $C(CH_3)_2$ | $L_{A2607}$ | $R_{B6}$ | $R_{A434}$ | S |
| $L_{A2548}$ | H | $R_{B3}$ | $C(CH_3)_2$ | $L_{A2608}$ | $R_{B6}$ | $R_{A452}$ | S |
| $L_{A2549}$ | H | $R_{B4}$ | $C(CH_3)_2$ | $L_{A2609}$ | $R_{B6}$ | H | O |
| $L_{A2550}$ | H | $R_{B5}$ | $C(CH_3)_2$ | $L_{A2610}$ | $R_{B6}$ | $R_{B1}$ | O |
| $L_{A2551}$ | H | $R_{A434}$ | $C(CH_3)_2$ | $L_{A2611}$ | $R_{B6}$ | $R_{B2}$ | O |
| $L_{A2552}$ | H | $R_{A452}$ | $C(CH_3)_2$ | $L_{A2612}$ | $R_{B6}$ | $R_{B3}$ | O |
| $L_{A2553}$ | H | H | $Si(CH_3)_2$ | $L_{A2613}$ | $R_{B6}$ | $R_{B4}$ | O |

-continued

| Ligand | R5 | R3 | Y | Ligand | R5 | R3 | Y |
|---|---|---|---|---|---|---|---|
| $L_{A2554}$ | H | $R_{B1}$ | $Si(CH_3)_2$ | $L_{A2614}$ | $R_{B6}$ | $R_{B5}$ | O |
| $L_{A2555}$ | H | $R_{B2}$ | $Si(CH_3)_2$ | $L_{A2615}$ | $R_{B6}$ | $R_{A34}$ | O |
| $L_{A2556}$ | H | $R_{B3}$ | $Si(CH_3)_2$ | $L_{A2616}$ | $R_{B6}$ | $R_{A52}$ | O |
| $L_{A2557}$ | H | $R_{B4}$ | $Si(CH_3)_2$ | $L_{A2617}$ | $R_{B6}$ | H | $NCH_3$ |
| $L_{A2558}$ | H | $R_{B5}$ | $Si(CH_3)_2$ | $L_{A2618}$ | $R_{B6}$ | $R_{B1}$ | $NCH_3$ |
| $L_{A2559}$ | H | $R_{A34}$ | $Si(CH_3)_2$ | $L_{A2619}$ | $R_{B6}$ | $R_{B2}$ | $NCH_3$ |
| $L_{A2560}$ | H | $R_{A52}$ | $Si(CH_3)_2$ | $L_{A2620}$ | $R_{B6}$ | $R_{B3}$ | $NCH_3$ |
| $L_{A2561}$ | $R_{B1}$ | H | S | $L_{A2621}$ | $R_{B6}$ | $R_{B4}$ | $NCH_3$ |
| $L_{A2562}$ | $R_{B1}$ | $R_{B1}$ | S | $L_{A2622}$ | $R_{B6}$ | $R_{B5}$ | $NCH_3$ |
| $L_{A2563}$ | $R_{B1}$ | $R_{B2}$ | S | $L_{A2623}$ | $R_{B6}$ | $R_{A34}$ | $NCH_3$ |
| $L_{A2564}$ | $R_{B1}$ | $R_{B3}$ | S | $L_{A2624}$ | $R_{B6}$ | $R_{A52}$ | $NCH_3$ |
| $L_{A2565}$ | $R_{B1}$ | $R_{B4}$ | S | $L_{A2625}$ | $R_{B6}$ | H | $C(CH_3)_2$ |
| $L_{A2566}$ | $R_{B1}$ | $R_{B5}$ | S | $L_{A2626}$ | $R_{B6}$ | $R_{B1}$ | $C(CH_3)_2$ |
| $L_{A2567}$ | $R_{B1}$ | $R_{A34}$ | S | $L_{A2627}$ | $R_{B6}$ | $R_{B2}$ | $C(CH_3)_2$ |
| $L_{A2568}$ | $R_{B1}$ | $R_{A52}$ | S | $L_{A2628}$ | $R_{B6}$ | $R_{B3}$ | $C(CH_3)_2$ |
| $L_{A2569}$ | $R_{B1}$ | H | O | $L_{A2629}$ | $R_{B6}$ | $R_{B4}$ | $C(CH_3)_2$ |
| $L_{A2570}$ | $R_{B1}$ | $R_{B1}$ | O | $L_{A2630}$ | $R_{B6}$ | $R_{B5}$ | $C(CH_3)_2$ |
| $L_{A2571}$ | $R_{B1}$ | $R_{B2}$ | O | $L_{A2631}$ | $R_{B6}$ | $R_{A34}$ | $C(CH_3)_2$ |
| $L_{A2572}$ | $R_{B1}$ | $R_{B3}$ | O | $L_{A2632}$ | $R_{B6}$ | $R_{A52}$ | $C(CH_3)_2$ |
| $L_{A2573}$ | $R_{B1}$ | $R_{B4}$ | O | $L_{A2633}$ | $R_{B6}$ | H | $Si(CH_3)_2$ |
| $L_{A2574}$ | $R_{B1}$ | $R_{B5}$ | O | $L_{A2634}$ | $R_{B6}$ | $R_{B1}$ | $Si(CH_3)_2$ |
| $L_{A2575}$ | $R_{B1}$ | $R_{A34}$ | O | $L_{A2635}$ | $R_{B6}$ | $R_{B2}$ | $Si(CH_3)_2$ |
| $L_{A2576}$ | $R_{B1}$ | $R_{A52}$ | O | $L_{A2636}$ | $R_{B6}$ | $R_{B3}$ | $Si(CH_3)_2$ |
| $L_{A2577}$ | $R_{B1}$ | H | $NCH_3$ | $L_{A2637}$ | $R_{B6}$ | $R_{B4}$ | $Si(CH_3)_2$ |
| $L_{A2578}$ | $R_{B1}$ | $R_{B1}$ | $NCH_3$ | $L_{A2638}$ | $R_{B6}$ | $R_{B5}$ | $Si(CH_3)_2$ |
| $L_{A2579}$ | $R_{B1}$ | $R_{B2}$ | $NCH_3$ | $L_{A2639}$ | $R_{B6}$ | $R_{A34}$ | $Si(CH_3)_2$ |
| $L_{A2580}$ | $R_{B1}$ | $R_{B3}$ | $NCH_3$ | $L_{A2640}$ | $R_{B6}$ | $R_{A52}$ | $Si(CH_3)_2$ |

wherein $L_{A2641}$ through $L_{A2736}$ have a structure of Formula XIX:

Formula XIX

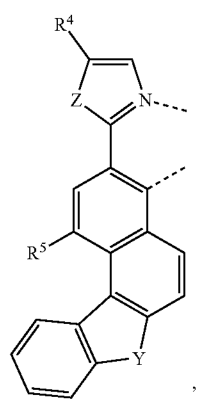

wherein $R^4$, $R^5$, Y, and Z are defined as provided below:

| Ligand | R5 | R4 | Y | Z | Ligand | R5 | R4 | Y | Z |
|---|---|---|---|---|---|---|---|---|---|
| $L_{A2641}$ | H | H | S | S | $L_{A2689}$ | $R_{B6}$ | H | S | S |
| $L_{A2642}$ | H | $R_{B1}$ | S | S | $L_{A2690}$ | $R_{B6}$ | $R_{B1}$ | S | S |
| $L_{A2643}$ | H | $R_{B3}$ | S | S | $L_{A2691}$ | $R_{B6}$ | $R_{B3}$ | S | S |
| $L_{A2644}$ | H | $R_{B4}$ | S | S | $L_{A2692}$ | $R_{B6}$ | $R_{B4}$ | S | S |
| $L_{A2645}$ | H | $R_{B7}$ | S | S | $L_{A2693}$ | $R_{B6}$ | $R_{B7}$ | S | S |
| $L_{A2646}$ | H | $R_{B10}$ | S | S | $L_{A2694}$ | $R_{B6}$ | $R_{B10}$ | S | S |
| $L_{A2647}$ | H | $R_{A3}$ | S | S | $L_{A2695}$ | $R_{B6}$ | $R_{A3}$ | S | S |
| $L_{A2648}$ | H | $R_{A34}$ | S | S | $L_{A2696}$ | $R_{B6}$ | $R_{A34}$ | S | S |
| $L_{A2649}$ | H | H | S | O | $L_{A2697}$ | $R_{B6}$ | H | S | O |
| $L_{A2650}$ | H | $R_{B1}$ | S | O | $L_{A2698}$ | $R_{B6}$ | $R_{B1}$ | S | O |
| $L_{A2651}$ | H | $R_{B3}$ | S | O | $L_{A2699}$ | $R_{B6}$ | $R_{B3}$ | S | O |
| $L_{A2652}$ | H | $R_{B4}$ | S | O | $L_{A2700}$ | $R_{B6}$ | $R_{B4}$ | S | O |
| $L_{A2653}$ | H | $R_{B7}$ | S | O | $L_{A2701}$ | $R_{B6}$ | $R_{B7}$ | S | O |
| $L_{A2654}$ | H | $R_{B10}$ | S | O | $L_{A2702}$ | $R_{B6}$ | $R_{B10}$ | S | O |
| $L_{A2655}$ | H | $R_{A3}$ | S | O | $L_{A2703}$ | $R_{B6}$ | $R_{A3}$ | S | O |
| $L_{A2656}$ | H | $R_{A34}$ | S | O | $L_{A2704}$ | $R_{B6}$ | $R_{A34}$ | S | O |
| $L_{A2657}$ | H | H | S | $NCH_3$ | $L_{A2705}$ | $R_{B6}$ | H | S | $NCH_3$ |

-continued

| Ligand | R5 | R4 | Y | Z | Ligand | R5 | R4 | Y | Z |
|---|---|---|---|---|---|---|---|---|---|
| $L_{A2658}$ | H | $R_{B1}$ | S | $NCH_3$ | $L_{A2706}$ | $R_{B6}$ | $R_{B1}$ | S | $NCH_3$ |
| $L_{A2659}$ | H | $R_{B3}$ | S | $NCH_3$ | $L_{A2707}$ | $R_{B6}$ | $R_{B3}$ | S | $NCH_3$ |
| $L_{A2660}$ | H | $R_{B4}$ | S | $NCH_3$ | $L_{A2708}$ | $R_{B6}$ | $R_{B4}$ | S | $NCH_3$ |
| $L_{A2661}$ | H | $R_{B7}$ | S | $NCH_3$ | $L_{A2709}$ | $R_{B6}$ | $R_{B7}$ | S | $NCH_3$ |
| $L_{A2662}$ | H | $R_{B10}$ | S | $NCH_3$ | $L_{A2710}$ | $R_{B6}$ | $R_{B10}$ | S | $NCH_3$ |
| $L_{A2663}$ | H | $R_{A3}$ | S | $NCH_3$ | $L_{A2711}$ | $R_{B6}$ | $R_{A3}$ | S | $NCH_3$ |
| $L_{A2664}$ | H | $R_{A34}$ | S | $NCH_3$ | $L_{A2712}$ | $R_{B6}$ | $R_{A34}$ | S | $NCH_3$ |
| $L_{A2665}$ | H | H | O | S | $L_{A2713}$ | $R_{B6}$ | H | O | S |
| $L_{A2666}$ | H | $R_{B1}$ | O | S | $L_{A2714}$ | $R_{B6}$ | $R_{B1}$ | O | S |
| $L_{A2667}$ | H | $R_{B3}$ | O | S | $L_{A2715}$ | $R_{B6}$ | $R_{B3}$ | O | S |
| $L_{A2668}$ | H | $R_{B4}$ | O | S | $L_{A2716}$ | $R_{B6}$ | $R_{B4}$ | O | S |
| $L_{A2669}$ | H | $R_{B7}$ | O | S | $L_{A2717}$ | $R_{B6}$ | $R_{B7}$ | O | S |
| $L_{A2670}$ | H | $R_{B10}$ | O | S | $L_{A2718}$ | $R_{B6}$ | $R_{B10}$ | O | S |
| $L_{A2671}$ | H | $R_{A3}$ | O | S | $L_{A2719}$ | $R_{B6}$ | $R_{A3}$ | O | S |
| $L_{A2672}$ | H | $R_{A34}$ | O | S | $L_{A2720}$ | $R_{B6}$ | $R_{A34}$ | O | S |
| $L_{A2673}$ | H | H | O | O | $L_{A2721}$ | $R_{B6}$ | H | O | O |
| $L_{A2674}$ | H | $R_{B1}$ | O | O | $L_{A2722}$ | $R_{B6}$ | $R_{B1}$ | O | O |
| $L_{A2675}$ | H | $R_{B3}$ | O | O | $L_{A2723}$ | $R_{B6}$ | $R_{B3}$ | O | O |
| $L_{A2676}$ | H | $R_{B4}$ | O | O | $L_{A2724}$ | $R_{B6}$ | $R_{B4}$ | O | O |
| $L_{A2677}$ | H | $R_{B7}$ | O | O | $L_{A2725}$ | $R_{B6}$ | $R_{B7}$ | O | O |
| $L_{A2678}$ | H | $R_{B10}$ | O | O | $L_{A2726}$ | $R_{B6}$ | $R_{B10}$ | O | O |
| $L_{A2679}$ | H | $R_{A3}$ | O | O | $L_{A2727}$ | $R_{B6}$ | $R_{A3}$ | O | O |
| $L_{A2680}$ | H | $R_{A34}$ | O | O | $L_{A2728}$ | $R_{B6}$ | $R_{A34}$ | O | O |
| $L_{A2681}$ | H | H | O | $NCH_3$ | $L_{A2729}$ | $R_{B6}$ | H | O | $NCH_3$ |
| $L_{A2682}$ | H | $R_{B1}$ | O | $NCH_3$ | $L_{A2730}$ | $R_{B6}$ | $R_{B1}$ | O | $NCH_3$ |
| $L_{A2683}$ | H | $R_{B3}$ | O | $NCH_3$ | $L_{A2731}$ | $R_{B6}$ | $R_{B3}$ | O | $NCH_3$ |
| $L_{A2684}$ | H | $R_{B4}$ | O | $NCH_3$ | $L_{A2732}$ | $R_{B6}$ | $R_{B4}$ | O | $NCH_3$ |
| $L_{A2685}$ | H | $R_{B7}$ | O | $NCH_3$ | $L_{A2733}$ | $R_{B6}$ | $R_{B7}$ | O | $NCH_3$ |
| $L_{A2686}$ | H | $R_{B10}$ | O | $NCH_3$ | $L_{A2734}$ | $R_{B6}$ | $R_{B10}$ | O | $NCH_3$ |
| $L_{A2687}$ | H | $R_{A3}$ | O | $NCH_3$ | $L_{A2735}$ | $R_{B6}$ | $R_{A3}$ | O | $NCH_3$ |
| $L_{A2688}$ | H | $R_{A34}$ | O | $NCH_3$ | $L_{A2736}$ | $R_{B6}$ | $R_{A34}$ | O | $NCH_3$ |

wherein $L_{A2737}$ through $L_{A2976}$ have a structure of Formula XX:

Formula XX

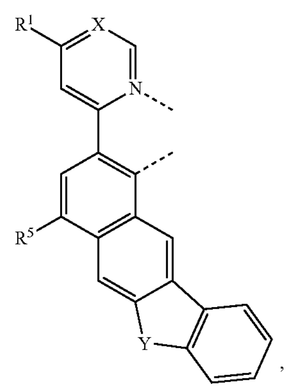

wherein $R^1$, $R^5$, Y, and X are defined as provided below:

| Ligand | R1 | R5 | X | Y | Ligand | R1 | R5 | X | Y |
|---|---|---|---|---|---|---|---|---|---|
| $L_{A2737}$ | H | H | C | S | $L_{A2857}$ | H | H | N | S |
| $L_{A2738}$ | $R_{B1}$ | H | C | S | $L_{A2858}$ | $R_{B1}$ | H | N | S |
| $L_{A2739}$ | $R_{B3}$ | H | C | S | $L_{A2859}$ | $R_{B3}$ | H | N | S |
| $L_{A2740}$ | $R_{B4}$ | H | C | S | $L_{A2860}$ | $R_{B4}$ | H | N | S |
| $L_{A2741}$ | $R_{B7}$ | H | C | S | $L_{A2861}$ | $R_{B7}$ | H | N | S |
| $L_{A2742}$ | $R_{B10}$ | H | C | S | $L_{A2862}$ | $R_{B10}$ | H | N | S |
| $L_{A2743}$ | $R_{A3}$ | H | C | S | $L_{A2863}$ | $R_{A3}$ | H | N | S |
| $L_{A2744}$ | $R_{A34}$ | H | C | S | $L_{A2864}$ | $R_{A34}$ | H | N | S |
| $L_{A2745}$ | H | H | C | O | $L_{A2865}$ | H | H | N | O |
| $L_{A2746}$ | $R_{B1}$ | H | C | O | $L_{A2866}$ | $R_{B1}$ | H | N | O |
| $L_{A2747}$ | $R_{B3}$ | H | C | O | $L_{A2867}$ | $R_{B3}$ | H | N | O |
| $L_{A2748}$ | $R_{B4}$ | H | C | O | $L_{A2868}$ | $R_{B4}$ | H | N | O |
| $L_{A2749}$ | $R_{B7}$ | H | C | O | $L_{A2869}$ | $R_{B7}$ | H | N | O |
| $L_{A2750}$ | $R_{B10}$ | H | C | O | $L_{A2870}$ | $R_{B10}$ | H | N | O |

-continued

| Ligand | $R^1$ | $R^5$ | X | Y | Ligand | $R^1$ | $R^5$ | X | Y |
|---|---|---|---|---|---|---|---|---|---|
| $L_{A42751}$ | $R_{A3}$ | H | C | O | $L_{A42871}$ | $R_{A3}$ | H | N | O |
| $L_{A42752}$ | $R_{A434}$ | H | C | O | $L_{A42872}$ | $R_{A434}$ | H | N | O |
| $L_{A42753}$ | H | H | C | $NCH_3$ | $L_{A42873}$ | H | H | N | $NCH_3$ |
| $L_{A42754}$ | $R_{B1}$ | H | C | $NCH_3$ | $L_{A42874}$ | $R_{B1}$ | H | N | $NCH_3$ |
| $L_{A42755}$ | $R_{B3}$ | H | C | $NCH_3$ | $L_{A42875}$ | $R_{B3}$ | H | N | $NCH_3$ |
| $L_{A42756}$ | $R_{B4}$ | H | C | $NCH_3$ | $L_{A42876}$ | $R_{B4}$ | H | N | $NCH_3$ |
| $L_{A42757}$ | $R_{B7}$ | H | C | $NCH_3$ | $L_{A42877}$ | $R_{B7}$ | H | N | $NCH_3$ |
| $L_{A42758}$ | $R_{B10}$ | H | C | $NCH_3$ | $L_{A42878}$ | $R_{B10}$ | H | N | $NCH_3$ |
| $L_{A42759}$ | $R_{A3}$ | H | C | $NCH_3$ | $L_{A42879}$ | $R_{A3}$ | H | N | $NCH_3$ |
| $L_{A42760}$ | $R_{A434}$ | H | C | $NCH_3$ | $L_{A42880}$ | $R_{A434}$ | H | N | $NCH_3$ |
| $L_{A42761}$ | H | H | C | $C(CH_3)_2$ | $L_{A42881}$ | H | H | N | $C(CH_3)_2$ |
| $L_{A42762}$ | $R_{B1}$ | H | C | $C(CH_3)_2$ | $L_{A42882}$ | $R_{B1}$ | H | N | $C(CH_3)_2$ |
| $L_{A42763}$ | $R_{B3}$ | H | C | $C(CH_3)_2$ | $L_{A42883}$ | $R_{B3}$ | H | N | $C(CH_3)_2$ |
| $L_{A42764}$ | $R_{B4}$ | H | C | $C(CH_3)_2$ | $L_{A42884}$ | $R_{B4}$ | H | N | $C(CH_3)_2$ |
| $L_{A42765}$ | $R_{B7}$ | H | C | $C(CH_3)_2$ | $L_{A42885}$ | $R_{B7}$ | H | N | $C(CH_3)_2$ |
| $L_{A42766}$ | $R_{B10}$ | H | C | $C(CH_3)_2$ | $L_{A42886}$ | $R_{B10}$ | H | N | $C(CH_3)_2$ |
| $L_{A42767}$ | $R_{A3}$ | H | C | $C(CH_3)_2$ | $L_{A42887}$ | $R_{A3}$ | H | N | $C(CH_3)_2$ |
| $L_{A42768}$ | $R_{A434}$ | H | C | $C(CH_3)_2$ | $L_{A42888}$ | $R_{A434}$ | H | N | $C(CH_3)_2$ |
| $L_{A42769}$ | H | H | C | $Si(CH_3)_2$ | $L_{A42889}$ | H | H | N | $Si(CH_3)_2$ |
| $L_{A42770}$ | $R_{B1}$ | H | C | $Si(CH_3)_2$ | $L_{A42890}$ | $R_{B1}$ | H | N | $Si(CH_3)_2$ |
| $L_{A42771}$ | $R_{B3}$ | H | C | $Si(CH_3)_2$ | $L_{A42891}$ | $R_{B3}$ | H | N | $Si(CH_3)_2$ |
| $L_{A42772}$ | $R_{B4}$ | H | C | $Si(CH_3)_2$ | $L_{A42892}$ | $R_{B4}$ | H | N | $Si(CH_3)_2$ |
| $L_{A42773}$ | $R_{B7}$ | H | C | $Si(CH_3)_2$ | $L_{A42893}$ | $R_{B7}$ | H | N | $Si(CH_3)_2$ |
| $L_{A42774}$ | $R_{B10}$ | H | C | $Si(CH_3)_2$ | $L_{A42894}$ | $R_{B10}$ | H | N | $Si(CH_3)_2$ |
| $L_{A42775}$ | $R_{A3}$ | H | C | $Si(CH_3)_2$ | $L_{A42895}$ | $R_{A3}$ | H | N | $Si(CH_3)_2$ |
| $L_{A42776}$ | $R_{A434}$ | H | C | $Si(CH_3)_2$ | $L_{A42896}$ | $R_{A434}$ | H | N | $Si(CH_3)_2$ |
| $L_{A42777}$ | H | $R_{B1}$ | C | S | $L_{A42897}$ | H | $R_{B1}$ | N | S |
| $L_{A42778}$ | $R_{B1}$ | $R_{B1}$ | C | S | $L_{A42898}$ | $R_{B1}$ | $R_{B1}$ | N | S |
| $L_{A42779}$ | $R_{B3}$ | $R_{B1}$ | C | S | $L_{A42899}$ | $R_{B3}$ | $R_{B1}$ | N | S |
| $L_{A42780}$ | $R_{B4}$ | $R_{B1}$ | C | S | $L_{A42900}$ | $R_{B4}$ | $R_{B1}$ | N | S |
| $L_{A42781}$ | $R_{B7}$ | $R_{B1}$ | C | S | $L_{A42901}$ | $R_{B7}$ | $R_{B1}$ | N | S |
| $L_{A42782}$ | $R_{B10}$ | $R_{B1}$ | C | S | $L_{A42902}$ | $R_{B10}$ | $R_{B1}$ | N | S |
| $L_{A42783}$ | $R_{A3}$ | $R_{B1}$ | C | S | $L_{A42903}$ | $R_{A3}$ | $R_{B1}$ | N | S |
| $L_{A42784}$ | $R_{A434}$ | $R_{B1}$ | C | S | $L_{A42904}$ | $R_{A434}$ | $R_{B1}$ | N | S |
| $L_{A42785}$ | H | $R_{B1}$ | C | O | $L_{A42905}$ | H | $R_{B1}$ | N | O |
| $L_{A42786}$ | $R_{B1}$ | $R_{B1}$ | C | O | $L_{A42906}$ | $R_{B1}$ | $R_{B1}$ | N | O |
| $L_{A42787}$ | $R_{B3}$ | $R_{B1}$ | C | O | $L_{A42907}$ | $R_{B3}$ | $R_{B1}$ | N | O |
| $L_{A42788}$ | $R_{B4}$ | $R_{B1}$ | C | O | $L_{A42908}$ | $R_{B4}$ | $R_{B1}$ | N | O |
| $L_{A42789}$ | $R_{B7}$ | $R_{B1}$ | C | O | $L_{A42909}$ | $R_{B7}$ | $R_{B1}$ | N | O |
| $L_{A42790}$ | $R_{B10}$ | $R_{B1}$ | C | O | $L_{A42910}$ | $R_{B10}$ | $R_{B1}$ | N | O |
| $L_{A42791}$ | $R_{A3}$ | $R_{B1}$ | C | O | $L_{A42911}$ | $R_{A3}$ | $R_{B1}$ | N | O |
| $L_{A42792}$ | $R_{A434}$ | $R_{B1}$ | C | O | $L_{A42912}$ | $R_{A434}$ | $R_{B1}$ | N | O |
| $L_{A42793}$ | H | $R_{B1}$ | C | $NCH_3$ | $L_{A42913}$ | H | $R_{B1}$ | N | $NCH_3$ |
| $L_{A42794}$ | $R_{B1}$ | $R_{B1}$ | C | $NCH_3$ | $L_{A42914}$ | $R_{B1}$ | $R_{B1}$ | N | $NCH_3$ |
| $L_{A42795}$ | $R_{B3}$ | $R_{B1}$ | C | $NCH_3$ | $L_{A42915}$ | $R_{B3}$ | $R_{B1}$ | N | $NCH_3$ |
| $L_{A42796}$ | $R_{B4}$ | $R_{B1}$ | C | $NCH_3$ | $L_{A42916}$ | $R_{B4}$ | $R_{B1}$ | N | $NCH_3$ |
| $L_{A42797}$ | $R_{B7}$ | $R_{B1}$ | C | $NCH_3$ | $L_{A42917}$ | $R_{B7}$ | $R_{B1}$ | N | $NCH_3$ |
| $L_{A42798}$ | $R_{B10}$ | $R_{B1}$ | C | $NCH_3$ | $L_{A42918}$ | $R_{B10}$ | $R_{B1}$ | N | $NCH_3$ |
| $L_{A42799}$ | $R_{A3}$ | $R_{B1}$ | C | $NCH_3$ | $L_{A42919}$ | $R_{A3}$ | $R_{B1}$ | N | $NCH_3$ |
| $L_{A42800}$ | $R_{A434}$ | $R_{B1}$ | C | $NCH_3$ | $L_{A42920}$ | $R_{A434}$ | $R_{B1}$ | N | $NCH_3$ |
| $L_{A42801}$ | H | $R_{B1}$ | C | $C(CH_3)_2$ | $L_{A42921}$ | H | $R_{B1}$ | N | $C(CH_3)_2$ |
| $L_{A42802}$ | $R_{B1}$ | $R_{B1}$ | C | $C(CH_3)_2$ | $L_{A42922}$ | $R_{B1}$ | $R_{B1}$ | N | $C(CH_3)_2$ |
| $L_{A42803}$ | $R_{B3}$ | $R_{B1}$ | C | $C(CH_3)_2$ | $L_{A42923}$ | $R_{B3}$ | $R_{B1}$ | N | $C(CH_3)_2$ |
| $L_{A42804}$ | $R_{B4}$ | $R_{B1}$ | C | $C(CH_3)_2$ | $L_{A42924}$ | $R_{B4}$ | $R_{B1}$ | N | $C(CH_3)_2$ |
| $L_{A42805}$ | $R_{B7}$ | $R_{B1}$ | C | $C(CH_3)_2$ | $L_{A42925}$ | $R_{B7}$ | $R_{B1}$ | N | $C(CH_3)_2$ |
| $L_{A42806}$ | $R_{B10}$ | $R_{B1}$ | C | $C(CH_3)_2$ | $L_{A42926}$ | $R_{B10}$ | $R_{B1}$ | N | $C(CH_3)_2$ |
| $L_{A42807}$ | $R_{A3}$ | $R_{B1}$ | C | $C(CH_3)_2$ | $L_{A42927}$ | $R_{A3}$ | $R_{B1}$ | N | $C(CH_3)_2$ |
| $L_{A42808}$ | $R_{A434}$ | $R_{B1}$ | C | $C(CH_3)_2$ | $L_{A42928}$ | $R_{A434}$ | $R_{B1}$ | N | $C(CH_3)_2$ |
| $L_{A42809}$ | H | $R_{B1}$ | C | $Si(CH_3)_2$ | $L_{A42929}$ | H | $R_{B1}$ | N | $Si(CH_3)_2$ |
| $L_{A42810}$ | $R_{B1}$ | $R_{B1}$ | C | $Si(CH_3)_2$ | $L_{A42930}$ | $R_{B1}$ | $R_{B1}$ | N | $Si(CH_3)_2$ |
| $L_{A42811}$ | $R_{B3}$ | $R_{B1}$ | C | $Si(CH_3)_2$ | $L_{A42931}$ | $R_{B3}$ | $R_{B1}$ | N | $Si(CH_3)_2$ |
| $L_{A42812}$ | $R_{B4}$ | $R_{B1}$ | C | $Si(CH_3)_2$ | $L_{A42932}$ | $R_{B4}$ | $R_{B1}$ | N | $Si(CH_3)_2$ |
| $L_{A42813}$ | $R_{B7}$ | $R_{B1}$ | C | $Si(CH_3)_2$ | $L_{A42933}$ | $R_{B7}$ | $R_{B1}$ | N | $Si(CH_3)_2$ |
| $L_{A42814}$ | $R_{B10}$ | $R_{B1}$ | C | $Si(CH_3)_2$ | $L_{A42934}$ | $R_{B10}$ | $R_{B1}$ | N | $Si(CH_3)_2$ |
| $L_{A42815}$ | $R_{A3}$ | $R_{B1}$ | C | $Si(CH_3)_2$ | $L_{A42935}$ | $R_{A3}$ | $R_{B1}$ | N | $Si(CH_3)_2$ |
| $L_{A42816}$ | $R_{A434}$ | $R_{B1}$ | C | $Si(CH_3)_2$ | $L_{A42936}$ | $R_{A434}$ | $R_{B1}$ | N | $Si(CH_3)_2$ |
| $L_{A42817}$ | H | $R_{B6}$ | C | S | $L_{A42937}$ | H | $R_{B6}$ | N | S |
| $L_{A42818}$ | $R_{B1}$ | $R_{B6}$ | C | S | $L_{A42938}$ | $R_{B1}$ | $R_{B6}$ | N | S |
| $L_{A42819}$ | $R_{B3}$ | $R_{B6}$ | C | S | $L_{A42939}$ | $R_{B3}$ | $R_{B6}$ | N | S |
| $L_{A42820}$ | $R_{B4}$ | $R_{B6}$ | C | S | $L_{A42940}$ | $R_{B4}$ | $R_{B6}$ | N | S |
| $L_{A42821}$ | $R_{B7}$ | $R_{B6}$ | C | S | $L_{A42941}$ | $R_{B7}$ | $R_{B6}$ | N | S |
| $L_{A42822}$ | $R_{B10}$ | $R_{B6}$ | C | S | $L_{A42942}$ | $R_{B10}$ | $R_{B6}$ | N | S |
| $L_{A42823}$ | $R_{A3}$ | $R_{B6}$ | C | S | $L_{A42943}$ | $R_{A3}$ | $R_{B6}$ | N | S |
| $L_{A42824}$ | $R_{A434}$ | $R_{B6}$ | C | S | $L_{A42944}$ | $R_{A434}$ | $R_{B6}$ | N | S |
| $L_{A42825}$ | H | $R_{B6}$ | C | O | $L_{A42945}$ | H | $R_{B6}$ | N | O |
| $L_{A42826}$ | $R_{B1}$ | $R_{B6}$ | C | O | $L_{A42946}$ | $R_{B1}$ | $R_{B6}$ | N | O |
| $L_{A42827}$ | $R_{B3}$ | $R_{B6}$ | C | O | $L_{A42947}$ | $R_{B3}$ | $R_{B6}$ | N | O |

-continued

| Ligand | $R^1$ | $R^5$ | X | Y | Ligand | $R^1$ | $R^5$ | X | Y |
|---|---|---|---|---|---|---|---|---|---|
| $L_{A42828}$ | $R_{B4}$ | $R_{B6}$ | C | O | $L_{A42948}$ | $R_{B4}$ | $R_{B6}$ | N | O |
| $L_{A42829}$ | $R_{B7}$ | $R_{B6}$ | C | O | $L_{A42949}$ | $R_{B7}$ | $R_{B6}$ | N | O |
| $L_{A42830}$ | $R_{B10}$ | $R_{B6}$ | C | O | $L_{A42950}$ | $R_{B10}$ | $R_{B6}$ | N | O |
| $L_{A42831}$ | $R_{A3}$ | $R_{B6}$ | C | O | $L_{A42951}$ | $R_{A3}$ | $R_{B6}$ | N | O |
| $L_{A42832}$ | $R_{A434}$ | $R_{B6}$ | C | O | $L_{A42952}$ | $R_{A434}$ | $R_{B6}$ | N | O |
| $L_{A42833}$ | H | $R_{B6}$ | C | $NCH_3$ | $L_{A42953}$ | H | $R_{B6}$ | N | $NCH_3$ |
| $L_{A42834}$ | $R_{B1}$ | $R_{B6}$ | C | $NCH_3$ | $L_{A42954}$ | $R_{B1}$ | $R_{B6}$ | N | $NCH_3$ |
| $L_{A42835}$ | $R_{B3}$ | $R_{B6}$ | C | $NCH_3$ | $L_{A42955}$ | $R_{B3}$ | $R_{B6}$ | N | $NCH_3$ |
| $L_{A42836}$ | $R_{B4}$ | $R_{B6}$ | C | $NCH_3$ | $L_{A42956}$ | $R_{B4}$ | $R_{B6}$ | N | $NCH_3$ |
| $L_{A42837}$ | $R_{B7}$ | $R_{B6}$ | C | $NCH_3$ | $L_{A42957}$ | $R_{B7}$ | $R_{B6}$ | N | $NCH_3$ |
| $L_{A42838}$ | $R_{B10}$ | $R_{B6}$ | C | $NCH_3$ | $L_{A42958}$ | $R_{B10}$ | $R_{B6}$ | N | $NCH_3$ |
| $L_{A42839}$ | $R_{A3}$ | $R_{B6}$ | C | $NCH_3$ | $L_{A42959}$ | $R_{A3}$ | $R_{B6}$ | N | $NCH_3$ |
| $L_{A42840}$ | $R_{A434}$ | $R_{B6}$ | C | $NCH_3$ | $L_{A42960}$ | $R_{A434}$ | $R_{B6}$ | N | $NCH_3$ |
| $L_{A42841}$ | H | $R_{B6}$ | C | $C(CH_3)_2$ | $L_{A42961}$ | H | $R_{B6}$ | N | $C(CH_3)_2$ |
| $L_{A42842}$ | $R_{B1}$ | $R_{B6}$ | C | $C(CH_3)_2$ | $L_{A42962}$ | $R_{B1}$ | $R_{B6}$ | N | $C(CH_3)_2$ |
| $L_{A42843}$ | $R_{B3}$ | $R_{B6}$ | C | $C(CH_3)_2$ | $L_{A42963}$ | $R_{B3}$ | $R_{B6}$ | N | $C(CH_3)_2$ |
| $L_{A42844}$ | $R_{B4}$ | $R_{B6}$ | C | $C(CH_3)_2$ | $L_{A42964}$ | $R_{B4}$ | $R_{B6}$ | N | $C(CH_3)_2$ |
| $L_{A42845}$ | $R_{B7}$ | $R_{B6}$ | C | $C(CH_3)_2$ | $L_{A42965}$ | $R_{B7}$ | $R_{B6}$ | N | $C(CH_3)_2$ |
| $L_{A42846}$ | $R_{B10}$ | $R_{B6}$ | C | $C(CH_3)_2$ | $L_{A42966}$ | $R_{B10}$ | $R_{B6}$ | N | $C(CH_3)_2$ |
| $L_{A42847}$ | $R_{A3}$ | $R_{B6}$ | C | $C(CH_3)_2$ | $L_{A42967}$ | $R_{A3}$ | $R_{B6}$ | N | $C(CH_3)_2$ |
| $L_{A42848}$ | $R_{A434}$ | $R_{B6}$ | C | $C(CH_3)_2$ | $L_{A42968}$ | $R_{A434}$ | $R_{B6}$ | N | $C(CH_3)_2$ |
| $L_{A42849}$ | H | $R_{B6}$ | C | $Si(CH_3)_2$ | $L_{A42969}$ | H | $R_{B6}$ | N | $Si(CH_3)_2$ |
| $L_{A42850}$ | $R_{B1}$ | $R_{B6}$ | C | $Si(CH_3)_2$ | $L_{A42970}$ | $R_{B1}$ | $R_{B6}$ | N | $Si(CH_3)_2$ |
| $L_{A42851}$ | $R_{B3}$ | $R_{B6}$ | C | $Si(CH_3)_2$ | $L_{A42971}$ | $R_{B3}$ | $R_{B6}$ | N | $Si(CH_3)_2$ |
| $L_{A42852}$ | $R_{B4}$ | $R_{B6}$ | C | $Si(CH_3)_2$ | $L_{A42972}$ | $R_{B4}$ | $R_{B6}$ | N | $Si(CH_3)_2$ |
| $L_{A42853}$ | $R_{B7}$ | $R_{B6}$ | C | $Si(CH_3)_2$ | $L_{A42973}$ | $R_{B7}$ | $R_{B6}$ | N | $Si(CH_3)_2$ |
| $L_{A42854}$ | $R_{B10}$ | $R_{B6}$ | C | $Si(CH_3)_2$ | $L_{A42974}$ | $R_{B10}$ | $R_{B6}$ | N | $Si(CH_3)_2$ |
| $L_{A42855}$ | $R_{A3}$ | $R_{B6}$ | C | $Si(CH_3)_2$ | $L_{A42975}$ | $R_{A3}$ | $R_{B6}$ | N | $Si(CH_3)_2$ |
| $L_{A42856}$ | $R_{A434}$ | $R_{B6}$ | C | $Si(CH_3)_2$ | $L_{A42976}$ | $R_{A434}$ | $R_{B6}$ | N | $Si(CH_3)_2$ |

wherein $L_{A2977}$ through $L_{A3096}$ have a structure of Formula XXI:

Formula XXI

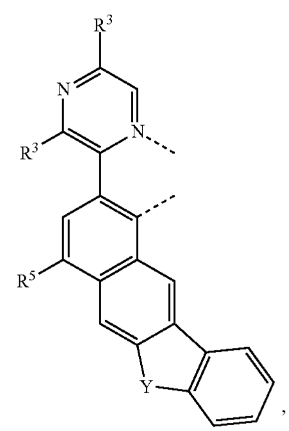

wherein $R^3$, $R^5$, and Y are defined as provided below:

| Ligand | $R^5$ | $R^3$ | Y | Ligand | $R^5$ | $R^3$ | Y |
|---|---|---|---|---|---|---|---|
| $L_{A2977}$ | H | H | S | $L_{A3037}$ | $R_{B1}$ | $R_{B4}$ | $NCH_3$ |
| $L_{A2978}$ | H | $R_{B1}$ | S | $L_{A3038}$ | $R_{B1}$ | $R_{B5}$ | $NCH_3$ |
| $L_{A2979}$ | H | $R_{B2}$ | S | $L_{A3039}$ | $R_{B1}$ | $R_{A434}$ | $NCH_3$ |
| $L_{A2980}$ | H | $R_{B3}$ | S | $L_{A3040}$ | $R_{B1}$ | $R_{A452}$ | $NCH_3$ |
| $L_{A2981}$ | H | $R_{B4}$ | S | $L_{A3041}$ | $R_{B1}$ | H | $C(CH_3)_2$ |
| $L_{A2982}$ | H | $R_{B5}$ | S | $L_{A3042}$ | $R_{B1}$ | $R_{B1}$ | $C(CH_3)_2$ |
| $L_{A2983}$ | H | $R_{A434}$ | S | $L_{A3043}$ | $R_{B1}$ | $R_{B2}$ | $C(CH_3)_2$ |
| $L_{A2984}$ | H | $R_{A452}$ | S | $L_{A3044}$ | $R_{B1}$ | $R_{B3}$ | $C(CH_3)_2$ |
| $L_{A2985}$ | H | H | O | $L_{A3045}$ | $R_{B1}$ | $R_{B4}$ | $C(CH_3)_2$ |
| $L_{A2986}$ | H | $R_{B1}$ | O | $L_{A3046}$ | $R_{B1}$ | $R_{B5}$ | $C(CH_3)_2$ |
| $L_{A2987}$ | H | $R_{B2}$ | O | $L_{A3047}$ | $R_{B1}$ | $R_{A434}$ | $C(CH_3)_2$ |
| $L_{A2988}$ | H | $R_{B3}$ | O | $L_{A3048}$ | $R_{B1}$ | $R_{A452}$ | $C(CH_3)_2$ |
| $L_{A2989}$ | H | $R_{B4}$ | O | $L_{A3049}$ | $R_{B1}$ | H | $Si(CH_3)_2$ |
| $L_{A2990}$ | H | $R_{B5}$ | O | $L_{A3050}$ | $R_{B1}$ | $R_{B1}$ | $Si(CH_3)_2$ |

-continued

| Ligand | $R^5$ | $R^3$ | Y | Ligand | $R^5$ | $R^3$ | Y |
|---|---|---|---|---|---|---|---|
| $L_{A2991}$ | H | $R_{A434}$ | O | $L_{A3051}$ | $R_{B1}$ | $R_{B2}$ | $Si(CH_3)_2$ |
| $L_{A2992}$ | H | $R_{A452}$ | O | $L_{A3052}$ | $R_{B1}$ | $R_{B3}$ | $Si(CH_3)_2$ |
| $L_{A2993}$ | H | H | $NCH_3$ | $L_{A3053}$ | $R_{B1}$ | $R_{B4}$ | $Si(CH_3)_2$ |
| $L_{A2994}$ | H | $R_{B1}$ | $NCH_3$ | $L_{A3054}$ | $R_{B1}$ | $R_{B5}$ | $Si(CH_3)_2$ |
| $L_{A2995}$ | H | $R_{B2}$ | $NCH_3$ | $L_{A3055}$ | $R_{B1}$ | $R_{A434}$ | $Si(CH_3)_2$ |
| $L_{A2996}$ | H | $R_{B3}$ | $NCH_3$ | $L_{A3056}$ | $R_{B1}$ | $R_{A452}$ | $Si(CH_3)_2$ |
| $L_{A2997}$ | H | $R_{B4}$ | $NCH_3$ | $L_{A3057}$ | $R_{B6}$ | H | S |
| $L_{A2998}$ | H | $R_{B5}$ | $NCH_3$ | $L_{A3058}$ | $R_{B6}$ | $R_{B1}$ | S |
| $L_{A2999}$ | H | $R_{A434}$ | $NCH_3$ | $L_{A3059}$ | $R_{B6}$ | $R_{B2}$ | S |
| $L_{A3000}$ | H | $R_{A452}$ | $NCH_3$ | $L_{A3060}$ | $R_{B6}$ | $R_{B3}$ | S |
| $L_{A3001}$ | H | H | $C(CH_3)_2$ | $L_{A3061}$ | $R_{B6}$ | $R_{B4}$ | S |
| $L_{A3002}$ | H | $R_{B1}$ | $C(CH_3)_2$ | $L_{A3062}$ | $R_{B6}$ | $R_{B5}$ | S |
| $L_{A3003}$ | H | $R_{B2}$ | $C(CH_3)_2$ | $L_{A3063}$ | $R_{B6}$ | $R_{A434}$ | S |
| $L_{A3004}$ | H | $R_{B3}$ | $C(CH_3)_2$ | $L_{A3064}$ | $R_{B6}$ | $R_{A452}$ | S |
| $L_{A3005}$ | H | $R_{B4}$ | $C(CH_3)_2$ | $L_{A3065}$ | $R_{B6}$ | H | O |
| $L_{A3006}$ | H | $R_{B5}$ | $C(CH_3)_2$ | $L_{A3066}$ | $R_{B6}$ | $R_{B1}$ | O |
| $L_{A3007}$ | H | $R_{A434}$ | $C(CH_3)_2$ | $L_{A3067}$ | $R_{B6}$ | $R_{B2}$ | O |
| $L_{A3008}$ | H | $R_{A452}$ | $C(CH_3)_2$ | $L_{A3068}$ | $R_{B6}$ | $R_{B3}$ | O |
| $L_{A3009}$ | H | H | $Si(CH_3)_2$ | $L_{A3069}$ | $R_{B6}$ | $R_{B4}$ | O |
| $L_{A3010}$ | H | $R_{B1}$ | $Si(CH_3)_2$ | $L_{A3070}$ | $R_{B6}$ | $R_{B5}$ | O |
| $L_{A3011}$ | H | $R_{B2}$ | $Si(CH_3)_2$ | $L_{A3071}$ | $R_{B6}$ | $R_{A434}$ | O |
| $L_{A3012}$ | H | $R_{B3}$ | $Si(CH_3)_2$ | $L_{A3072}$ | $R_{B6}$ | $R_{A452}$ | O |
| $L_{A3013}$ | H | $R_{B4}$ | $Si(CH_3)_2$ | $L_{A3073}$ | $R_{B6}$ | H | $NCH_3$ |
| $L_{A3014}$ | H | $R_{B5}$ | $Si(CH_3)_2$ | $L_{A3074}$ | $R_{B6}$ | $R_{B1}$ | $NCH_3$ |
| $L_{A3015}$ | H | $R_{A434}$ | $Si(CH_3)_2$ | $L_{A3075}$ | $R_{B6}$ | $R_{B2}$ | $NCH_3$ |
| $L_{A3016}$ | H | $R_{A452}$ | $Si(CH_3)_2$ | $L_{A3076}$ | $R_{B6}$ | $R_{B3}$ | $NCH_3$ |
| $L_{A3017}$ | $R_{B1}$ | H | S | $L_{A3077}$ | $R_{B6}$ | $R_{B4}$ | $NCH_3$ |
| $L_{A3018}$ | $R_{B1}$ | $R_{B1}$ | S | $L_{A3078}$ | $R_{B6}$ | $R_{B5}$ | $NCH_3$ |
| $L_{A3019}$ | $R_{B1}$ | $R_{B2}$ | S | $L_{A3079}$ | $R_{B6}$ | $R_{A434}$ | $NCH_3$ |
| $L_{A3020}$ | $R_{B1}$ | $R_{B3}$ | S | $L_{A3080}$ | $R_{B6}$ | $R_{A452}$ | $NCH_3$ |
| $L_{A3021}$ | $R_{B1}$ | $R_{B4}$ | S | $L_{A3081}$ | $R_{B6}$ | H | $C(CH_3)_2$ |
| $L_{A3022}$ | $R_{B1}$ | $R_{B5}$ | S | $L_{A3082}$ | $R_{B6}$ | $R_{B1}$ | $C(CH_3)_2$ |
| $L_{A3023}$ | $R_{B1}$ | $R_{A434}$ | S | $L_{A3083}$ | $R_{B6}$ | $R_{B2}$ | $C(CH_3)_2$ |
| $L_{A3024}$ | $R_{B1}$ | $R_{A452}$ | S | $L_{A3084}$ | $R_{B6}$ | $R_{B3}$ | $C(CH_3)_2$ |
| $L_{A3025}$ | $R_{B1}$ | H | O | $L_{A3085}$ | $R_{B6}$ | $R_{B4}$ | $C(CH_3)_2$ |
| $L_{A3026}$ | $R_{B1}$ | $R_{B1}$ | O | $L_{A3086}$ | $R_{B6}$ | $R_{B5}$ | $C(CH_3)_2$ |
| $L_{A3027}$ | $R_{B1}$ | $R_{B2}$ | O | $L_{A3087}$ | $R_{B6}$ | $R_{A434}$ | $C(CH_3)_2$ |
| $L_{A3028}$ | $R_{B1}$ | $R_{B3}$ | O | $L_{A3088}$ | $R_{B6}$ | $R_{A452}$ | $C(CH_3)_2$ |
| $L_{A3029}$ | $R_{B1}$ | $R_{B4}$ | O | $L_{A3089}$ | $R_{B6}$ | H | $Si(CH_3)_2$ |
| $L_{A3030}$ | $R_{B1}$ | $R_{B5}$ | O | $L_{A3090}$ | $R_{B6}$ | $R_{B1}$ | $Si(CH_3)_2$ |
| $L_{A3031}$ | $R_{B1}$ | $R_{A434}$ | O | $L_{A3091}$ | $R_{B6}$ | $R_{B2}$ | $Si(CH_3)_2$ |
| $L_{A3032}$ | $R_{B1}$ | $R_{A452}$ | O | $L_{A3092}$ | $R_{B6}$ | $R_{B3}$ | $Si(CH_3)_2$ |
| $L_{A3033}$ | $R_{B1}$ | H | $NCH_3$ | $L_{A3093}$ | $R_{B6}$ | $R_{B4}$ | $Si(CH_3)_2$ |
| $L_{A3034}$ | $R_{B1}$ | $R_{B1}$ | $NCH_3$ | $L_{A3094}$ | $R_{B6}$ | $R_{B5}$ | $Si(CH_3)_2$ |
| $L_{A3035}$ | $R_{B1}$ | $R_{B2}$ | $NCH_3$ | $L_{A3095}$ | $R_{B6}$ | $R_{A434}$ | $Si(CH_3)_2$ |
| $L_{A3036}$ | $R_{B1}$ | $R_{B3}$ | $NCH_3$ | $L_{A3096}$ | $R_{B6}$ | $R_{A452}$ | $Si(CH_3)_2$ |

wherein $L_{A3097}$ through $L_{A3192}$ have a structure of Formula XXII:

Formula XXII

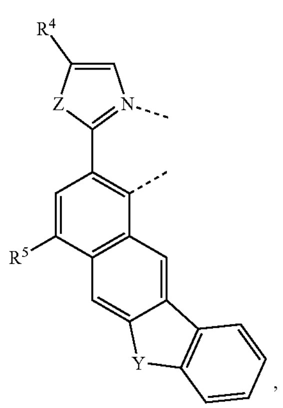

wherein $R^4$, $R^5$, Y, and Z are defined as provided below:

| Ligand | $R^5$ | $R^4$ | Y | Z | Ligand | $R^5$ | $R^4$ | Y | Z |
|---|---|---|---|---|---|---|---|---|---|
| $L_{A3097}$ | H | H | S | S | $L_{A3145}$ | $R_{B6}$ | H | S | S |
| $L_{A3098}$ | H | $R_{B1}$ | S | S | $L_{A3146}$ | $R_{B6}$ | $R_{B1}$ | S | S |
| $L_{A3099}$ | H | $R_{B3}$ | S | S | $L_{A3147}$ | $R_{B6}$ | $R_{B3}$ | S | S |
| $L_{A3100}$ | H | $R_{B4}$ | S | S | $L_{A3148}$ | $R_{B6}$ | $R_{B4}$ | S | S |
| $L_{A3101}$ | H | $R_{B7}$ | S | S | $L_{A3149}$ | $R_{B6}$ | $R_{B7}$ | S | S |
| $L_{A3102}$ | H | $R_{B10}$ | S | S | $L_{A3150}$ | $R_{B6}$ | $R_{B10}$ | S | S |
| $L_{A3103}$ | H | $R_{A3}$ | S | S | $L_{A3151}$ | $R_{B6}$ | $R_{A3}$ | S | S |
| $L_{A3104}$ | H | $R_{A34}$ | S | S | $L_{A3152}$ | $R_{B6}$ | $R_{A34}$ | S | S |
| $L_{A3105}$ | H | H | S | O | $L_{A3153}$ | $R_{B6}$ | H | S | O |
| $L_{A3106}$ | H | $R_{B1}$ | S | O | $L_{A3154}$ | $R_{B6}$ | $R_{B1}$ | S | O |
| $L_{A3107}$ | H | $R_{B3}$ | S | O | $L_{A3155}$ | $R_{B6}$ | $R_{B3}$ | S | O |
| $L_{A3108}$ | H | $R_{B4}$ | S | O | $L_{A3156}$ | $R_{B6}$ | $R_{B4}$ | S | O |
| $L_{A3109}$ | H | $R_{B7}$ | S | O | $L_{A3157}$ | $R_{B6}$ | $R_{B7}$ | S | O |
| $L_{A3110}$ | H | $R_{B10}$ | S | O | $L_{A3158}$ | $R_{B6}$ | $R_{B10}$ | S | O |
| $L_{A3111}$ | H | $R_{A3}$ | S | O | $L_{A3159}$ | $R_{B6}$ | $R_{A3}$ | S | O |
| $L_{A3112}$ | H | $R_{A34}$ | S | O | $L_{A3160}$ | $R_{B6}$ | $R_{A34}$ | S | O |
| $L_{A3113}$ | H | H | S | $NCH_3$ | $L_{A3161}$ | $R_{B6}$ | H | S | $NCH_3$ |
| $L_{A3114}$ | H | $R_{B1}$ | S | $NCH_3$ | $L_{A3162}$ | $R_{B6}$ | $R_{B1}$ | S | $NCH_3$ |
| $L_{A3115}$ | H | $R_{B3}$ | S | $NCH_3$ | $L_{A3163}$ | $R_{B6}$ | $R_{B3}$ | S | $NCH_3$ |
| $L_{A3116}$ | H | $R_{B4}$ | S | $NCH_3$ | $L_{A3164}$ | $R_{B6}$ | $R_{B4}$ | S | $NCH_3$ |
| $L_{A3117}$ | H | $R_{B7}$ | S | $NCH_3$ | $L_{A3165}$ | $R_{B6}$ | $R_{B7}$ | S | $NCH_3$ |
| $L_{A3118}$ | H | $R_{B10}$ | S | $NCH_3$ | $L_{A3166}$ | $R_{B6}$ | $R_{B10}$ | S | $NCH_3$ |
| $L_{A3119}$ | H | $R_{A3}$ | S | $NCH_3$ | $L_{A3167}$ | $R_{B6}$ | $R_{A3}$ | S | $NCH_3$ |
| $L_{A3120}$ | H | $R_{A34}$ | S | $NCH_3$ | $L_{A3168}$ | $R_{B6}$ | $R_{A34}$ | S | $NCH_3$ |
| $L_{A3121}$ | H | H | O | S | $L_{A3169}$ | $R_{B6}$ | H | O | S |
| $L_{A3122}$ | H | $R_{B1}$ | O | S | $L_{A3170}$ | $R_{B6}$ | $R_{B1}$ | O | S |
| $L_{A3123}$ | H | $R_{B3}$ | O | S | $L_{A3171}$ | $R_{B6}$ | $R_{B3}$ | O | S |
| $L_{A3124}$ | H | $R_{B4}$ | O | S | $L_{A3172}$ | $R_{B6}$ | $R_{B4}$ | O | S |
| $L_{A3125}$ | H | $R_{B7}$ | O | S | $L_{A3173}$ | $R_{B6}$ | $R_{B7}$ | O | S |
| $L_{A3126}$ | H | $R_{B10}$ | O | S | $L_{A3174}$ | $R_{B6}$ | $R_{B10}$ | O | S |
| $L_{A3127}$ | H | $R_{A3}$ | O | S | $L_{A3175}$ | $R_{B6}$ | $R_{A3}$ | O | S |
| $L_{A3128}$ | H | $R_{A34}$ | O | S | $L_{A3176}$ | $R_{B6}$ | $R_{A34}$ | O | S |
| $L_{A3129}$ | H | H | O | O | $L_{A3177}$ | $R_{B6}$ | H | O | O |
| $L_{A3130}$ | H | $R_{B1}$ | O | O | $L_{A3178}$ | $R_{B6}$ | $R_{B1}$ | O | O |
| $L_{A3131}$ | H | $R_{B3}$ | O | O | $L_{A3179}$ | $R_{B6}$ | $R_{B3}$ | O | O |
| $L_{A3132}$ | H | $R_{B4}$ | O | O | $L_{A3180}$ | $R_{B6}$ | $R_{B4}$ | O | O |
| $L_{A3133}$ | H | $R_{B7}$ | O | O | $L_{A3181}$ | $R_{B6}$ | $R_{B7}$ | O | O |
| $L_{A3134}$ | H | $R_{B10}$ | O | O | $L_{A3182}$ | $R_{B6}$ | $R_{B10}$ | O | O |
| $L_{A3135}$ | H | $R_{A3}$ | O | O | $L_{A3183}$ | $R_{B6}$ | $R_{A3}$ | O | O |
| $L_{A3136}$ | H | $R_{A34}$ | O | O | $L_{A3184}$ | $R_{B6}$ | $R_{A34}$ | O | O |
| $L_{A3137}$ | H | H | O | $NCH_3$ | $L_{A3185}$ | $R_{B6}$ | H | O | $NCH_3$ |
| $L_{A3138}$ | H | $R_{B1}$ | O | $NCH_3$ | $L_{A3186}$ | $R_{B6}$ | $R_{B1}$ | O | $NCH_3$ |
| $L_{A3139}$ | H | $R_{B3}$ | O | $NCH_3$ | $L_{A3187}$ | $R_{B6}$ | $R_{B3}$ | O | $NCH_3$ |
| $L_{A3140}$ | H | $R_{B4}$ | O | $NCH_3$ | $L_{A3188}$ | $R_{B6}$ | $R_{B4}$ | O | $NCH_3$ |
| $L_{A3141}$ | H | $R_{B7}$ | O | $NCH_3$ | $L_{A3189}$ | $R_{B6}$ | $R_{B7}$ | O | $NCH_3$ |
| $L_{A3142}$ | H | $R_{B10}$ | O | $NCH_3$ | $L_{A3190}$ | $R_{B6}$ | $R_{B10}$ | O | $NCH_3$ |
| $L_{A3143}$ | H | $R_{A3}$ | O | $NCH_3$ | $L_{A3191}$ | $R_{B6}$ | $R_{A3}$ | O | $NCH_3$ |
| $L_{A3144}$ | H | $R_{A34}$ | O | $NCH_3$ | $L_{A3192}$ | $R_{B6}$ | $R_{A34}$ | O | $NCH_3$ |

wherein $L_{A3193}$ through $L_{A3432}$ have a structure of Formula XXIII:

Formula XXIII

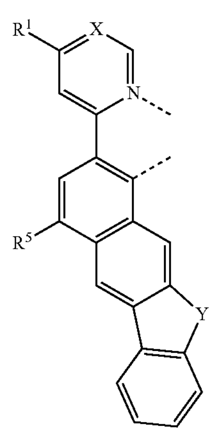

wherein $R^1$, $R^5$, X, and Y are defined as provided below:

| Ligand | $R^1$ | $R^5$ | X | Y | Ligand | $R^1$ | $R^5$ | X | Y |
|---|---|---|---|---|---|---|---|---|---|
| $L_{A3193}$ | H | H | C | S | $L_{A3313}$ | H | H | N | S |
| $L_{A3194}$ | $R_{B1}$ | H | C | S | $L_{A3314}$ | $R_{B1}$ | H | N | S |
| $L_{A3195}$ | $R_{B3}$ | H | C | S | $L_{A3315}$ | $R_{B3}$ | H | N | S |
| $L_{A3196}$ | $R_{B4}$ | H | C | S | $L_{A3316}$ | $R_{B4}$ | H | N | S |
| $L_{A3197}$ | $R_{B7}$ | H | C | S | $L_{A3317}$ | $R_{B7}$ | H | N | S |
| $L_{A3198}$ | $R_{B10}$ | H | C | S | $L_{A3318}$ | $R_{B10}$ | H | N | S |
| $L_{A3199}$ | $R_{A3}$ | H | C | S | $L_{A3319}$ | $R_{A3}$ | H | N | S |
| $L_{A3200}$ | $R_{A34}$ | H | C | S | $L_{A3320}$ | $R_{A34}$ | H | N | S |
| $L_{A3201}$ | H | H | C | O | $L_{A3321}$ | H | H | N | O |
| $L_{A3202}$ | $R_{B1}$ | H | C | O | $L_{A3322}$ | $R_{B1}$ | H | N | O |
| $L_{A3203}$ | $R_{B3}$ | H | C | O | $L_{A3323}$ | $R_{B3}$ | H | N | O |
| $L_{A3204}$ | $R_{B4}$ | H | C | O | $L_{A3324}$ | $R_{B4}$ | H | N | O |
| $L_{A3205}$ | $R_{B7}$ | H | C | O | $L_{A3325}$ | $R_{B7}$ | H | N | O |
| $L_{A3206}$ | $R_{B10}$ | H | C | O | $L_{A3326}$ | $R_{B10}$ | H | N | O |
| $L_{A3207}$ | $R_{A3}$ | H | C | O | $L_{A3327}$ | $R_{A3}$ | H | N | O |
| $L_{A3208}$ | $R_{A34}$ | H | C | O | $L_{A3328}$ | $R_{A34}$ | H | N | O |
| $L_{A3209}$ | H | H | C | $NCH_3$ | $L_{A3329}$ | H | H | N | $NCH_3$ |
| $L_{A3210}$ | $R_{B1}$ | H | C | $NCH_3$ | $L_{A3330}$ | $R_{B1}$ | H | N | $NCH_3$ |
| $L_{A3211}$ | $R_{B3}$ | H | C | $NCH_3$ | $L_{A3331}$ | $R_{B3}$ | H | N | $NCH_3$ |
| $L_{A3212}$ | $R_{B4}$ | H | C | $NCH_3$ | $L_{A3332}$ | $R_{B4}$ | H | N | $NCH_3$ |
| $L_{A3213}$ | $R_{B7}$ | H | C | $NCH_3$ | $L_{A3333}$ | $R_{B7}$ | H | N | $NCH_3$ |
| $L_{A3214}$ | $R_{B10}$ | H | C | $NCH_3$ | $L_{A3334}$ | $R_{B10}$ | H | N | $NCH_3$ |
| $L_{A3215}$ | $R_{A3}$ | H | C | $NCH_3$ | $L_{A3335}$ | $R_{A3}$ | H | N | $NCH_3$ |
| $L_{A3216}$ | $R_{A34}$ | H | C | $NCH_3$ | $L_{A3336}$ | $R_{A34}$ | H | N | $NCH_3$ |
| $L_{A3217}$ | H | H | C | $C(CH_3)_2$ | $L_{A3337}$ | H | H | N | $C(CH_3)_2$ |
| $L_{A3218}$ | $R_{B1}$ | H | C | $C(CH_3)_2$ | $L_{A3338}$ | $R_{B1}$ | H | N | $C(CH_3)_2$ |
| $L_{A3219}$ | $R_{B3}$ | H | C | $C(CH_3)_2$ | $L_{A3339}$ | $R_{B3}$ | H | N | $C(CH_3)_2$ |
| $L_{A3220}$ | $R_{B4}$ | H | C | $C(CH_3)_2$ | $L_{A3340}$ | $R_{B4}$ | H | N | $C(CH_3)_2$ |
| $L_{A3221}$ | $R_{B7}$ | H | C | $C(CH_3)_2$ | $L_{A3341}$ | $R_{B7}$ | H | N | $C(CH_3)_2$ |
| $L_{A3222}$ | $R_{B10}$ | H | C | $C(CH_3)_2$ | $L_{A3342}$ | $R_{B10}$ | H | N | $C(CH_3)_2$ |
| $L_{A3223}$ | $R_{A3}$ | H | C | $C(CH_3)_2$ | $L_{A3343}$ | $R_{A3}$ | H | N | $C(CH_3)_2$ |
| $L_{A3224}$ | $R_{A34}$ | H | C | $C(CH_3)_2$ | $L_{A3344}$ | $R_{A34}$ | H | N | $C(CH_3)_2$ |
| $L_{A3225}$ | H | H | C | $Si(CH_3)_2$ | $L_{A3345}$ | H | H | N | $Si(CH_3)_2$ |
| $L_{A3226}$ | $R_{B1}$ | H | C | $Si(CH_3)_2$ | $L_{A3346}$ | $R_{B1}$ | H | N | $Si(CH_3)_2$ |
| $L_{A3227}$ | $R_{B3}$ | H | C | $Si(CH_3)_2$ | $L_{A3347}$ | $R_{B3}$ | H | N | $Si(CH_3)_2$ |
| $L_{A3228}$ | $R_{B4}$ | H | C | $Si(CH_3)_2$ | $L_{A3348}$ | $R_{B4}$ | H | N | $Si(CH_3)_2$ |
| $L_{A3229}$ | $R_{B7}$ | H | C | $Si(CH_3)_2$ | $L_{A3349}$ | $R_{B7}$ | H | N | $Si(CH_3)_2$ |
| $L_{A3230}$ | $R_{B10}$ | H | C | $Si(CH_3)_2$ | $L_{A3350}$ | $R_{B10}$ | H | N | $Si(CH_3)_2$ |
| $L_{A3231}$ | $R_{A3}$ | H | C | $Si(CH_3)_2$ | $L_{A3351}$ | $R_{A3}$ | H | N | $Si(CH_3)_2$ |
| $L_{A3232}$ | $R_{A34}$ | H | C | $Si(CH_3)_2$ | $L_{A3352}$ | $R_{A34}$ | H | N | $Si(CH_3)_2$ |
| $L_{A3233}$ | H | $R_{B1}$ | C | S | $L_{A3353}$ | H | $R_{B1}$ | N | S |
| $L_{A3234}$ | $R_{B1}$ | $R_{B1}$ | C | S | $L_{A3354}$ | $R_{B1}$ | $R_{B1}$ | N | S |
| $L_{A3235}$ | $R_{B3}$ | $R_{B1}$ | C | S | $L_{A3355}$ | $R_{B3}$ | $R_{B1}$ | N | S |
| $L_{A3236}$ | $R_{B4}$ | $R_{B1}$ | C | S | $L_{A3356}$ | $R_{B4}$ | $R_{B1}$ | N | S |
| $L_{A3237}$ | $R_{B7}$ | $R_{B1}$ | C | S | $L_{A3357}$ | $R_{B7}$ | $R_{B1}$ | N | S |
| $L_{A3238}$ | $R_{B10}$ | $R_{B1}$ | C | S | $L_{A3358}$ | $R_{B10}$ | $R_{B1}$ | N | S |
| $L_{A3239}$ | $R_{A3}$ | $R_{B1}$ | C | S | $L_{A3359}$ | $R_{A3}$ | $R_{B1}$ | N | S |
| $L_{A3240}$ | $R_{A34}$ | $R_{B1}$ | C | S | $L_{A3360}$ | $R_{A34}$ | $R_{B1}$ | N | S |
| $L_{A3241}$ | H | $R_{B1}$ | C | O | $L_{A3361}$ | H | $R_{B1}$ | N | O |
| $L_{A3242}$ | $R_{B1}$ | $R_{B1}$ | C | O | $L_{A3362}$ | $R_{B1}$ | $R_{B1}$ | N | O |
| $L_{A3243}$ | $R_{B3}$ | $R_{B1}$ | C | O | $L_{A3363}$ | $R_{B3}$ | $R_{B1}$ | N | O |
| $L_{A3244}$ | $R_{B4}$ | $R_{B1}$ | C | O | $L_{A3364}$ | $R_{B4}$ | $R_{B1}$ | N | O |
| $L_{A3245}$ | $R_{B7}$ | $R_{B1}$ | C | O | $L_{A3365}$ | $R_{B7}$ | $R_{B1}$ | N | O |
| $L_{A3246}$ | $R_{B10}$ | $R_{B1}$ | C | O | $L_{A3366}$ | $R_{B10}$ | $R_{B1}$ | N | O |
| $L_{A3247}$ | $R_{A3}$ | $R_{B1}$ | C | O | $L_{A3367}$ | $R_{A3}$ | $R_{B1}$ | N | O |
| $L_{A3248}$ | $R_{A34}$ | $R_{B1}$ | C | O | $L_{A3368}$ | $R_{A34}$ | $R_{B1}$ | N | O |
| $L_{A3249}$ | H | $R_{B1}$ | C | $NCH_3$ | $L_{A3369}$ | H | $R_{B1}$ | N | $NCH_3$ |
| $L_{A3250}$ | $R_{B1}$ | $R_{B1}$ | C | $NCH_3$ | $L_{A3370}$ | $R_{B1}$ | $R_{B1}$ | N | $NCH_3$ |
| $L_{A3251}$ | $R_{B3}$ | $R_{B1}$ | C | $NCH_3$ | $L_{A3371}$ | $R_{B3}$ | $R_{B1}$ | N | $NCH_3$ |
| $L_{A3252}$ | $R_{B4}$ | $R_{B1}$ | C | $NCH_3$ | $L_{A3372}$ | $R_{B4}$ | $R_{B1}$ | N | $NCH_3$ |
| $L_{A3253}$ | $R_{B7}$ | $R_{B1}$ | C | $NCH_3$ | $L_{A3373}$ | $R_{B7}$ | $R_{B1}$ | N | $NCH_3$ |
| $L_{A3254}$ | $R_{B10}$ | $R_{B1}$ | C | $NCH_3$ | $L_{A3374}$ | $R_{B10}$ | $R_{B1}$ | N | $NCH_3$ |
| $L_{A3255}$ | $R_{A3}$ | $R_{B1}$ | C | $NCH_3$ | $L_{A3375}$ | $R_{A3}$ | $R_{B1}$ | N | $NCH_3$ |
| $L_{A3256}$ | $R_{A34}$ | $R_{B1}$ | C | $NCH_3$ | $L_{A3376}$ | $R_{A34}$ | $R_{B1}$ | N | $NCH_3$ |
| $L_{A3257}$ | H | $R_{B1}$ | C | $C(CH_3)_2$ | $L_{A3377}$ | H | $R_{B1}$ | N | $C(CH_3)_2$ |
| $L_{A3258}$ | $R_{B1}$ | $R_{B1}$ | C | $C(CH_3)_2$ | $L_{A3378}$ | $R_{B1}$ | $R_{B1}$ | N | $C(CH_3)_2$ |
| $L_{A3259}$ | $R_{B3}$ | $R_{B1}$ | C | $C(CH_3)_2$ | $L_{A3379}$ | $R_{B3}$ | $R_{B1}$ | N | $C(CH_3)_2$ |
| $L_{A3260}$ | $R_{B4}$ | $R_{B1}$ | C | $C(CH_3)_2$ | $L_{A3380}$ | $R_{B4}$ | $R_{B1}$ | N | $C(CH_3)_2$ |
| $L_{A3261}$ | $R_{B7}$ | $R_{B1}$ | C | $C(CH_3)_2$ | $L_{A3381}$ | $R_{B7}$ | $R_{B1}$ | N | $C(CH_3)_2$ |
| $L_{A3262}$ | $R_{B10}$ | $R_{B1}$ | C | $C(CH_3)_2$ | $L_{A3382}$ | $R_{B10}$ | $R_{B1}$ | N | $C(CH_3)_2$ |
| $L_{A3263}$ | $R_{A3}$ | $R_{B1}$ | C | $C(CH_3)_2$ | $L_{A3383}$ | $R_{A3}$ | $R_{B1}$ | N | $C(CH_3)_2$ |
| $L_{A3264}$ | $R_{A34}$ | $R_{B1}$ | C | $C(CH_3)_2$ | $L_{A3384}$ | $R_{A34}$ | $R_{B1}$ | N | $C(CH_3)_2$ |
| $L_{A3265}$ | H | $R_{B1}$ | C | $Si(CH_3)_2$ | $L_{A3385}$ | H | $R_{B1}$ | N | $Si(CH_3)_2$ |
| $L_{A3266}$ | $R_{B1}$ | $R_{B1}$ | C | $Si(CH_3)_2$ | $L_{A3386}$ | $R_{B1}$ | $R_{B1}$ | N | $Si(CH_3)_2$ |
| $L_{A3267}$ | $R_{B3}$ | $R_{B1}$ | C | $Si(CH_3)_2$ | $L_{A3387}$ | $R_{B3}$ | $R_{B1}$ | N | $Si(CH_3)_2$ |
| $L_{A3268}$ | $R_{B4}$ | $R_{B1}$ | C | $Si(CH_3)_2$ | $L_{A3388}$ | $R_{B4}$ | $R_{B1}$ | N | $Si(CH_3)_2$ |

-continued

| Ligand | $R^1$ | $R^5$ | X | Y | Ligand | $R^1$ | $R^5$ | X | Y |
|---|---|---|---|---|---|---|---|---|---|
| $L_{A3269}$ | $R_{B7}$ | $R_{B1}$ | C | $Si(CH_3)_2$ | $L_{A3389}$ | $R_{B7}$ | $R_{B1}$ | N | $Si(CH_3)_2$ |
| $L_{A3270}$ | $R_{B10}$ | $R_{B1}$ | C | $Si(CH_3)_2$ | $L_{A3390}$ | $R_{B10}$ | $R_{B1}$ | N | $Si(CH_3)_2$ |
| $L_{A3271}$ | $R_{A3}$ | $R_{B1}$ | C | $Si(CH_3)_2$ | $L_{A3391}$ | $R_{A3}$ | $R_{B1}$ | N | $Si(CH_3)_2$ |
| $L_{A3272}$ | $R_{A34}$ | $R_{B1}$ | C | $Si(CH_3)_2$ | $L_{A3392}$ | $R_{A34}$ | $R_{B1}$ | N | $Si(CH_3)_2$ |
| $L_{A3273}$ | H | $R_{B6}$ | C | S | $L_{A3393}$ | H | $R_{B6}$ | N | S |
| $L_{A3274}$ | $R_{B1}$ | $R_{B6}$ | C | S | $L_{A3394}$ | $R_{B1}$ | $R_{B6}$ | N | S |
| $L_{A3275}$ | $R_{B3}$ | $R_{B6}$ | C | S | $L_{A3395}$ | $R_{B3}$ | $R_{B6}$ | N | S |
| $L_{A3276}$ | $R_{B4}$ | $R_{B6}$ | C | S | $L_{A3396}$ | $R_{B4}$ | $R_{B6}$ | N | S |
| $L_{A3277}$ | $R_{B7}$ | $R_{B6}$ | C | S | $L_{A3397}$ | $R_{B7}$ | $R_{B6}$ | N | S |
| $L_{A3278}$ | $R_{B10}$ | $R_{B6}$ | C | S | $L_{A3398}$ | $R_{B10}$ | $R_{B6}$ | N | S |
| $L_{A3279}$ | $R_{A3}$ | $R_{B6}$ | C | S | $L_{A3399}$ | $R_{A3}$ | $R_{B6}$ | N | S |
| $L_{A3280}$ | $R_{A34}$ | $R_{B6}$ | C | S | $L_{A3400}$ | $R_{A34}$ | $R_{B6}$ | N | S |
| $L_{A3281}$ | H | $R_{B6}$ | C | O | $L_{A3401}$ | H | $R_{B6}$ | N | O |
| $L_{A3282}$ | $R_{B1}$ | $R_{B6}$ | C | O | $L_{A3402}$ | $R_{B1}$ | $R_{B6}$ | N | O |
| $L_{A3283}$ | $R_{B3}$ | $R_{B6}$ | C | O | $L_{A3403}$ | $R_{B3}$ | $R_{B6}$ | N | O |
| $L_{A3284}$ | $R_{B4}$ | $R_{B6}$ | C | O | $L_{A3404}$ | $R_{B4}$ | $R_{B6}$ | N | O |
| $L_{A3285}$ | $R_{B7}$ | $R_{B6}$ | C | O | $L_{A3405}$ | $R_{B7}$ | $R_{B6}$ | N | O |
| $L_{A3286}$ | $R_{B10}$ | $R_{B6}$ | C | O | $L_{A3406}$ | $R_{B10}$ | $R_{B6}$ | N | O |
| $L_{A3287}$ | $R_{A3}$ | $R_{B6}$ | C | O | $L_{A3407}$ | $R_{A3}$ | $R_{B6}$ | N | O |
| $L_{A3288}$ | $R_{A34}$ | $R_{B6}$ | C | O | $L_{A3408}$ | $R_{A34}$ | $R_{B6}$ | N | O |
| $L_{A3289}$ | H | $R_{B6}$ | C | $NCH_3$ | $L_{A3409}$ | H | $R_{B6}$ | N | $NCH_3$ |
| $L_{A3290}$ | $R_{B1}$ | $R_{B6}$ | C | $NCH_3$ | $L_{A3410}$ | $R_{B1}$ | $R_{B6}$ | N | $NCH_3$ |
| $L_{A3291}$ | $R_{B3}$ | $R_{B6}$ | C | $NCH_3$ | $L_{A3411}$ | $R_{B3}$ | $R_{B6}$ | N | NCH3 |
| $L_{A3292}$ | $R_{B4}$ | $R_{B6}$ | C | $NCH_3$ | $L_{A3412}$ | $R_{B4}$ | $R_{B6}$ | N | $NCH_3$ |
| $L_{A3293}$ | $R_{B7}$ | $R_{B6}$ | C | $NCH_3$ | $L_{A3413}$ | $R_{B7}$ | $R_{B6}$ | N | $NCH_3$ |
| $L_{A3294}$ | $R_{B10}$ | $R_{B6}$ | C | $NCH_3$ | $L_{A3414}$ | $R_{B10}$ | $R_{B6}$ | N | $NCH_3$ |
| $L_{A3295}$ | $R_{A3}$ | $R_{B6}$ | C | $NCH_3$ | $L_{A3415}$ | $R_{A3}$ | $R_{B6}$ | N | $NCH_3$ |
| $L_{A3296}$ | $R_{A34}$ | $R_{B6}$ | C | $NCH_3$ | $L_{A3416}$ | $R_{A34}$ | $R_{B6}$ | N | $NCH_3$ |
| $L_{A3297}$ | H | $R_{B6}$ | C | $C(CH_3)_2$ | $L_{A3417}$ | H | $R_{B6}$ | N | $C(CH_3)_2$ |
| $L_{A3298}$ | $R_{B1}$ | $R_{B6}$ | C | $C(CH_3)_2$ | $L_{A3418}$ | $R_{B1}$ | $R_{B6}$ | N | $C(CH_3)_2$ |
| $L_{A3299}$ | $R_{B3}$ | $R_{B6}$ | C | $C(CH_3)_2$ | $L_{A3419}$ | $R_{B3}$ | $R_{B6}$ | N | $C(CH_3)_2$ |
| $L_{A3300}$ | $R_{B4}$ | $R_{B6}$ | C | $C(CH_3)_2$ | $L_{A3420}$ | $R_{B4}$ | $R_{B6}$ | N | $C(CH_3)_2$ |
| $L_{A3301}$ | $R_{B7}$ | $R_{B6}$ | C | $C(CH_3)_2$ | $L_{A3421}$ | $R_{B7}$ | $R_{B6}$ | N | $C(CH_3)_2$ |
| $L_{A3302}$ | $R_{B10}$ | $R_{B6}$ | C | $C(CH_3)_2$ | $L_{A3422}$ | $R_{B10}$ | $R_{B6}$ | N | $C(CH_3)_2$ |
| $L_{A3303}$ | $R_{A3}$ | $R_{B6}$ | C | $C(CH_3)_2$ | $L_{A3423}$ | $R_{A3}$ | $R_{B6}$ | N | $C(CH_3)_2$ |
| $L_{A3304}$ | $R_{A34}$ | $R_{B6}$ | C | $C(CH_3)_2$ | $L_{A3424}$ | $R_{A34}$ | $R_{B6}$ | N | $C(CH_3)_2$ |
| $L_{A3305}$ | H | $R_{B6}$ | C | $Si(CH_3)_2$ | $L_{A3425}$ | H | $R_{B6}$ | N | $Si(CH_3)_2$ |
| $L_{A3306}$ | $R_{B1}$ | $R_{B6}$ | C | $Si(CH_3)_2$ | $L_{A3426}$ | $R_{B1}$ | $R_{B6}$ | N | $Si(CH_3)_2$ |
| $L_{A3307}$ | $R_{B3}$ | $R_{B6}$ | C | $Si(CH_3)_2$ | $L_{A3427}$ | $R_{B3}$ | $R_{B6}$ | N | $Si(CH_3)_2$ |
| $L_{A3308}$ | $R_{B4}$ | $R_{B6}$ | C | $Si(CH_3)_2$ | $L_{A3428}$ | $R_{B4}$ | $R_{B6}$ | N | $Si(CH_3)_2$ |
| $L_{A3309}$ | $R_{B7}$ | $R_{B6}$ | C | $Si(CH_3)_2$ | $L_{A3429}$ | $R_{B7}$ | $R_{B6}$ | N | $Si(CH_3)_2$ |
| $L_{A3310}$ | $R_{B10}$ | $R_{B6}$ | C | $Si(CH_3)_2$ | $L_{A3430}$ | $R_{B10}$ | $R_{B6}$ | N | $Si(CH_3)_2$ |
| $L_{A3311}$ | $R_{A3}$ | $R_{B6}$ | C | $Si(CH_3)_2$ | $L_{A3431}$ | $R_{A3}$ | $R_{B6}$ | N | $Si(CH_3)_2$ |
| $L_{A3312}$ | $R_{A34}$ | $R_{B6}$ | C | $Si(CH_3)_2$ | $L_{A3432}$ | $R_{A34}$ | $R_{B6}$ | N | |

wherein $L_{A3433}$ through $L_{A3552}$ have a structure of Formula XXIV:

Formula XXIV

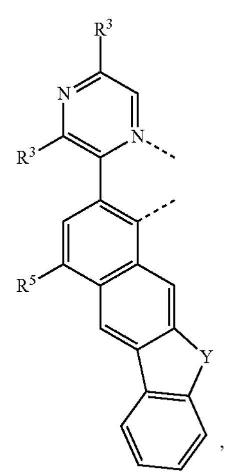

wherein $R^3$, $R^5$, and Y are defined as provided below:

| Ligand | $R^5$ | $R^3$ | Y | Ligand | $R^5$ | $R^3$ | Y |
|---|---|---|---|---|---|---|---|
| $L_{A3433}$ | H | H | S | $L_{A3493}$ | $R_{B1}$ | $R_{B4}$ | $NCH_3$ |
| $L_{A3434}$ | H | $R_{B1}$ | S | $L_{A3494}$ | $R_{B1}$ | $R_{B5}$ | $NCH_3$ |
| $L_{A3435}$ | H | $R_{B2}$ | S | $L_{A3495}$ | $R_{B1}$ | $R_{A34}$ | $NCH_3$ |
| $L_{A3436}$ | H | $R_{B3}$ | S | $L_{A3496}$ | $R_{B1}$ | $R_{A52}$ | $NCH_3$ |
| $L_{A3437}$ | H | $R_{B4}$ | S | $L_{A3497}$ | $R_{B1}$ | H | $C(CH_3)_2$ |
| $L_{A3438}$ | H | $R_{B5}$ | S | $L_{A3498}$ | $R_{B1}$ | $R_{B1}$ | $C(CH_3)_2$ |
| $L_{A3439}$ | H | $R_{A34}$ | S | $L_{A3499}$ | $R_{B1}$ | $R_{B2}$ | $C(CH_3)_2$ |
| $L_{A3440}$ | H | $R_{A52}$ | S | $L_{A3500}$ | $R_{B1}$ | $R_{B3}$ | $C(CH_3)_2$ |
| $L_{A3441}$ | H | H | O | $L_{A3501}$ | $R_{B1}$ | $R_{B4}$ | $C(CH_3)_2$ |
| $L_{A3442}$ | H | $R_{B1}$ | O | $L_{A3502}$ | $R_{B1}$ | $R_{B5}$ | $C(CH_3)_2$ |
| $L_{A3443}$ | H | $R_{B2}$ | O | $L_{A3503}$ | $R_{B1}$ | $R_{A34}$ | $C(CH_3)_2$ |
| $L_{A3444}$ | H | $R_{B3}$ | O | $L_{A3504}$ | $R_{B1}$ | $R_{A52}$ | $C(CH_3)_2$ |
| $L_{A3445}$ | H | $R_{B4}$ | O | $L_{A3505}$ | $R_{B1}$ | H | $Si(CH_3)_2$ |
| $L_{A3446}$ | H | $R_{B5}$ | O | $L_{A3506}$ | $R_{B1}$ | $R_{B1}$ | $Si(CH_3)_2$ |
| $L_{A3447}$ | H | $R_{A34}$ | O | $L_{A3507}$ | $R_{B1}$ | $R_{B2}$ | $Si(CH_3)_2$ |
| $L_{A3448}$ | H | $R_{A52}$ | O | $L_{A3508}$ | $R_{B1}$ | $R_{B3}$ | $Si(CH_3)_2$ |
| $L_{A3449}$ | H | H | $NCH_3$ | $L_{A3509}$ | $R_{B1}$ | $R_{B4}$ | $Si(CH_3)_2$ |
| $L_{A3450}$ | H | $R_{B1}$ | $NCH_3$ | $L_{A3510}$ | $R_{B1}$ | $R_{B5}$ | $Si(CH_3)_2$ |
| $L_{A3451}$ | H | $R_{B2}$ | $NCH_3$ | $L_{A3511}$ | $R_{B1}$ | $R_{A34}$ | $Si(CH_3)_2$ |
| $L_{A3452}$ | H | $R_{B3}$ | $NCH_3$ | $L_{A3512}$ | $R_{B1}$ | $R_{A52}$ | $Si(CH_3)_2$ |
| $L_{A3453}$ | H | $R_{B4}$ | $NCH_3$ | $L_{A3513}$ | $R_{B6}$ | H | S |
| $L_{A3454}$ | H | $R_{B5}$ | $NCH_3$ | $L_{A3514}$ | $R_{B6}$ | $R_{B1}$ | S |
| $L_{A3455}$ | H | $R_{A34}$ | $NCH_3$ | $L_{A3515}$ | $R_{B6}$ | $R_{B2}$ | S |
| $L_{A3456}$ | H | $R_{A52}$ | $NCH_3$ | $L_{A3516}$ | $R_{B6}$ | $R_{B3}$ | S |
| $L_{A3457}$ | H | H | $C(CH_3)_2$ | $L_{A3517}$ | $R_{B6}$ | $R_{B4}$ | S |
| $L_{A3458}$ | H | $R_{B1}$ | $C(CH_3)_2$ | $L_{A3518}$ | $R_{B6}$ | $R_{B5}$ | S |
| $L_{A3459}$ | H | $R_{B2}$ | $C(CH_3)_2$ | $L_{A3519}$ | $R_{B6}$ | $R_{A34}$ | S |
| $L_{A3460}$ | H | $R_{B3}$ | $C(CH_3)_2$ | $L_{A3520}$ | $R_{B6}$ | $R_{A52}$ | S |
| $L_{A3461}$ | H | $R_{B4}$ | $C(CH_3)_2$ | $L_{A3521}$ | $R_{B6}$ | H | O |
| $L_{A3462}$ | H | $R_{B5}$ | $C(CH_3)_2$ | $L_{A3522}$ | $R_{B6}$ | $R_{B1}$ | O |
| $L_{A3463}$ | H | $R_{A34}$ | $C(CH_3)_2$ | $L_{A3523}$ | $R_{B6}$ | $R_{B2}$ | O |
| $L_{A3464}$ | H | $R_{A52}$ | $C(CH_3)_2$ | $L_{A3524}$ | $R_{B6}$ | $R_{B3}$ | O |
| $L_{A3465}$ | H | H | $Si(CH_3)_2$ | $L_{A3525}$ | $R_{B6}$ | $R_{B4}$ | O |
| $L_{A3466}$ | H | $R_{B1}$ | $Si(CH_3)_2$ | $L_{A3526}$ | $R_{B6}$ | $R_{B5}$ | O |
| $L_{A3467}$ | H | $R_{B2}$ | $Si(CH_3)_2$ | $L_{A3527}$ | $R_{B6}$ | $R_{A34}$ | O |
| $L_{A3468}$ | H | $R_{B3}$ | $Si(CH_3)_2$ | $L_{A3528}$ | $R_{B6}$ | $R_{A52}$ | O |
| $L_{A3469}$ | H | $R_{B4}$ | $Si(CH_3)_2$ | $L_{A3529}$ | $R_{B6}$ | H | $NCH_3$ |
| $L_{A3470}$ | H | $R_{B5}$ | $Si(CH_3)_2$ | $L_{A3530}$ | $R_{B6}$ | $R_{B1}$ | $NCH_3$ |
| $L_{A3471}$ | H | $R_{A34}$ | Si(CH3)2 | $L_{A3531}$ | $R_{B6}$ | $R_{B2}$ | $NCH_3$ |
| $L_{A3472}$ | H | $R_{A52}$ | Si(CH3)2 | $L_{A3532}$ | $R_{B6}$ | $R_{B3}$ | $NCH_3$ |
| $L_{A3473}$ | $R_{B1}$ | H | S | $L_{A3533}$ | $R_{B6}$ | $R_{B4}$ | $NCH_3$ |
| $L_{A3474}$ | $R_{B1}$ | $R_{B1}$ | S | $L_{A3534}$ | $R_{B6}$ | $R_{B5}$ | $NCH_3$ |
| $L_{A3475}$ | $R_{B1}$ | $R_{B2}$ | S | $L_{A3535}$ | $R_{B6}$ | $R_{A34}$ | $NCH_3$ |
| $L_{A3476}$ | $R_{B1}$ | $R_{B3}$ | S | $L_{A3536}$ | $R_{B6}$ | $R_{A52}$ | $NCH_3$ |
| $L_{A3477}$ | $R_{B1}$ | $R_{B4}$ | S | $L_{A3537}$ | $R_{B6}$ | H | $C(CH_3)_2$ |
| $L_{A3478}$ | $R_{B1}$ | $R_{B5}$ | S | $L_{A3538}$ | $R_{B6}$ | $R_{B1}$ | $C(CH_3)_2$ |
| $L_{A3479}$ | $R_{B1}$ | $R_{A34}$ | S | $L_{A3539}$ | $R_{B6}$ | $R_{B2}$ | $C(CH_3)_2$ |
| $L_{A3480}$ | $R_{B1}$ | $R_{A52}$ | S | $L_{A3540}$ | $R_{B6}$ | $R_{B3}$ | $C(CH_3)_2$ |
| $L_{A3481}$ | $R_{B1}$ | H | O | $L_{A3541}$ | $R_{B6}$ | $R_{B4}$ | $C(CH_3)_2$ |
| $L_{A3482}$ | $R_{B1}$ | $R_{B1}$ | O | $L_{A3542}$ | $R_{B6}$ | $R_{B5}$ | $C(CH_3)_2$ |
| $L_{A3483}$ | $R_{B1}$ | $R_{B2}$ | O | $L_{A3543}$ | $R_{B6}$ | $R_{A34}$ | $C(CH_3)_2$ |
| $L_{A3484}$ | $R_{B1}$ | $R_{B3}$ | O | $L_{A3544}$ | $R_{B6}$ | $R_{A52}$ | $C(CH_3)_2$ |
| $L_{A3485}$ | $R_{B1}$ | $R_{B4}$ | O | $L_{A3545}$ | $R_{B6}$ | H | $Si(CH_3)_2$ |
| $L_{A3486}$ | $R_{B1}$ | $R_{B5}$ | O | $L_{A3546}$ | $R_{B6}$ | $R_{B1}$ | $Si(CH_3)_2$ |
| $L_{A3487}$ | $R_{B1}$ | $R_{A34}$ | O | $L_{A3547}$ | $R_{B6}$ | $R_{B2}$ | $Si(CH_3)_2$ |
| $L_{A3488}$ | $R_{B1}$ | $R_{A52}$ | O | $L_{A3548}$ | $R_{B6}$ | $R_{B3}$ | $Si(CH_3)_2$ |
| $L_{A3489}$ | $R_{B1}$ | H | $NCH_3$ | $L_{A3549}$ | $R_{B6}$ | $R_{B4}$ | $Si(CH_3)_2$ |
| $L_{A3490}$ | $R_{B1}$ | $R_{B1}$ | $NCH_3$ | $L_{A3550}$ | $R_{B6}$ | $R_{B5}$ | $Si(CH_3)_2$ |
| $L_{A3491}$ | $R_{B1}$ | $R_{B2}$ | $NCH_3$ | $L_{A3551}$ | $R_{B6}$ | $R_{A34}$ | $Si(CH_3)_2$ |
| $L_{A3492}$ | $R_{B1}$ | $R_{B3}$ | $NCH_3$ | $L_{A3552}$ | $R_{B6}$ | $R_{A52}$ | $Si(CH_3)_2$ |

wherein $L_{A3553}$ through $L_{A3648}$ have a structure of Formula XXV:

Formula XXV

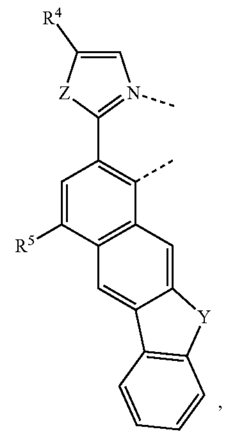

wherein $R^4$, $R^5$, Y, and Z are defined as provided below:

| Ligand | $R^5$ | $R^4$ | Y | Z | Ligand | $R^5$ | $R^4$ | Y | Z |
|---|---|---|---|---|---|---|---|---|---|
| $L_{A3553}$ | H | H | S | S | $L_{A3601}$ | $R_{B6}$ | H | S | S |
| $L_{A3554}$ | H | $R_{B1}$ | S | S | $L_{A3602}$ | $R_{B6}$ | $R_{B1}$ | S | S |
| $L_{A3555}$ | H | $R_{B3}$ | S | S | $L_{A3603}$ | $R_{B6}$ | $R_{B3}$ | S | S |
| $L_{A3556}$ | H | $R_{B4}$ | S | S | $L_{A3604}$ | $R_{B6}$ | $R_{B4}$ | S | S |
| $L_{A3557}$ | H | $R_{B7}$ | S | S | $L_{A3605}$ | $R_{B6}$ | $R_{B7}$ | S | S |
| $L_{A3558}$ | H | $R_{B10}$ | S | S | $L_{A3606}$ | $R_{B6}$ | $R_{B10}$ | S | S |
| $L_{A3559}$ | H | $R_{A3}$ | S | S | $L_{A3607}$ | $R_{B6}$ | $R_{A3}$ | S | S |
| $L_{A3560}$ | H | $R_{A34}$ | S | S | $L_{A3608}$ | $R_{B6}$ | $R_{A34}$ | S | S |
| $L_{A3561}$ | H | H | S | O | $L_{A3609}$ | $R_{B6}$ | H | S | O |
| $L_{A3562}$ | H | $R_{B1}$ | S | O | $L_{A3610}$ | $R_{B6}$ | $R_{B1}$ | S | O |
| $L_{A3563}$ | H | $R_{B3}$ | S | O | $L_{A3611}$ | $R_{B6}$ | $R_{B3}$ | S | O |
| $L_{A3564}$ | H | $R_{B4}$ | S | O | $L_{A3612}$ | $R_{B6}$ | $R_{B4}$ | S | O |
| $L_{A3565}$ | H | $R_{B7}$ | S | O | $L_{A3613}$ | $R_{B6}$ | $R_{B7}$ | S | O |
| $L_{A3566}$ | H | $R_{B10}$ | S | O | $L_{A3614}$ | $R_{B6}$ | $R_{B10}$ | S | O |
| $L_{A3567}$ | H | $R_{A3}$ | S | O | $L_{A3615}$ | $R_{B6}$ | $R_{A3}$ | S | O |
| $L_{A3568}$ | H | $R_{A34}$ | S | O | $L_{A3616}$ | $R_{B6}$ | $R_{A34}$ | S | O |
| $L_{A3569}$ | H | H | S | $NCH_3$ | $L_{A3617}$ | $R_{B6}$ | H | S | $NCH_3$ |
| $L_{A3570}$ | H | $R_{B1}$ | S | $NCH_3$ | $L_{A3618}$ | $R_{B6}$ | $R_{B1}$ | S | $NCH_3$ |
| $L_{A3571}$ | H | $R_{B3}$ | S | $NCH_3$ | $L_{A3619}$ | $R_{B6}$ | $R_{B3}$ | S | $NCH_3$ |
| $L_{A3572}$ | H | $R_{B4}$ | S | $NCH_3$ | $L_{A3620}$ | $R_{B6}$ | $R_{B4}$ | S | $NCH_3$ |
| $L_{A3573}$ | H | $R_{B7}$ | S | $NCH_3$ | $L_{A3621}$ | $R_{B6}$ | $R_{B7}$ | S | $NCH_3$ |
| $L_{A3574}$ | H | $R_{B10}$ | S | $NCH_3$ | $L_{A3622}$ | $R_{B6}$ | $R_{B10}$ | S | $NCH_3$ |
| $L_{A3575}$ | H | $R_{A3}$ | S | $NCH_3$ | $L_{A3623}$ | $R_{B6}$ | $R_{A3}$ | S | $NCH_3$ |
| $L_{A3576}$ | H | $R_{A34}$ | S | NCH3 | $L_{A3624}$ | $R_{B6}$ | $R_{A34}$ | S | NCH3 |
| $L_{A3577}$ | H | H | O | S | $L_{A3625}$ | $R_{B6}$ | H | O | S |
| $L_{A3578}$ | H | $R_{B1}$ | O | S | $L_{A3626}$ | $R_{B6}$ | $R_{B1}$ | O | S |
| $L_{A3579}$ | H | $R_{B3}$ | O | S | $L_{A3627}$ | $R_{B6}$ | $R_{B3}$ | O | S |
| $L_{A3580}$ | H | $R_{B4}$ | O | S | $L_{A3628}$ | $R_{B6}$ | $R_{B4}$ | O | S |
| $L_{A3581}$ | H | $R_{B7}$ | O | S | $L_{A3629}$ | $R_{B6}$ | $R_{B7}$ | O | S |
| $L_{A3582}$ | H | $R_{B10}$ | O | S | $L_{A3630}$ | $R_{B6}$ | $R_{B10}$ | O | S |
| $L_{A3583}$ | H | $R_{A3}$ | O | S | $L_{A3631}$ | $R_{B6}$ | $R_{A3}$ | O | S |
| $L_{A3584}$ | H | $R_{A34}$ | O | S | $L_{A3632}$ | $R_{B6}$ | $R_{A34}$ | O | S |
| $L_{A3585}$ | H | H | O | O | $L_{A3633}$ | $R_{B6}$ | H | O | O |
| $L_{A3586}$ | H | $R_{B1}$ | O | O | $L_{A3634}$ | $R_{B6}$ | $R_{B1}$ | O | O |
| $L_{A3587}$ | H | $R_{B3}$ | O | O | $L_{A3635}$ | $R_{B6}$ | $R_{B3}$ | O | O |
| $L_{A3588}$ | H | $R_{B4}$ | O | O | $L_{A3636}$ | $R_{B6}$ | $R_{B4}$ | O | O |
| $L_{A3589}$ | H | $R_{B7}$ | O | O | $L_{A3637}$ | $R_{B6}$ | $R_{B7}$ | O | O |
| $L_{A3590}$ | H | $R_{B10}$ | O | O | $L_{A3638}$ | $R_{B6}$ | $R_{B10}$ | O | O |
| $L_{A3591}$ | H | $R_{A3}$ | O | O | $L_{A3639}$ | $R_{B6}$ | $R_{A3}$ | O | O |
| $L_{A3592}$ | H | $R_{A34}$ | O | O | $L_{A3640}$ | $R_{B6}$ | $R_{A34}$ | O | O |
| $L_{A3593}$ | H | H | O | $NCH_3$ | $L_{A3641}$ | $R_{B6}$ | H | O | $NCH_3$ |
| $L_{A3594}$ | H | $R_{B1}$ | O | $NCH_3$ | $L_{A3642}$ | $R_{B6}$ | $R_{B1}$ | O | $NCH_3$ |
| $L_{A3595}$ | H | $R_{B3}$ | O | $NCH_3$ | $L_{A3643}$ | $R_{B6}$ | $R_{B3}$ | O | $NCH_3$ |
| $L_{A3596}$ | H | $R_{B4}$ | O | $NCH_3$ | $L_{A3644}$ | $R_{B6}$ | $R_{B4}$ | O | $NCH_3$ |
| $L_{A3597}$ | H | $R_{B7}$ | O | $NCH_3$ | $L_{A3645}$ | $R_{B6}$ | $R_{B7}$ | O | $NCH_3$ |

-continued

| Ligand | $R^5$ | $R^4$ | Y | Z | Ligand | $R^5$ | $R^4$ | Y | Z |
|---|---|---|---|---|---|---|---|---|---|
| $L_{A3598}$ | H | $R_{B10}$ | O | $NCH_3$ | $L_{A3646}$ | $R_{B6}$ | $R_{B10}$ | O | $NCH_3$ |
| $L_{A3599}$ | H | $R_{A3}$ | O | $NCH_3$ | $L_{A3647}$ | $R_{B6}$ | $R_{A3}$ | O | $NCH_3$ |
| $L_{A3600}$ | H | $R_{A34}$ | O | $NCH_3$ | $L_{A3648}$ | $R_{B6}$ | $R_{A34}$ | O | $NCH_3$ |

wherein $L_{A3649}$ through $L_{A3888}$ have a structure of Formula XXVI:

Formula XXVI

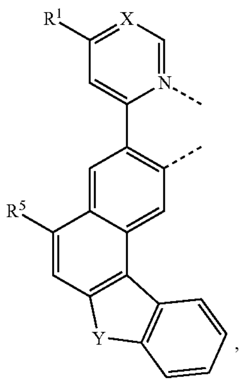

wherein $R^1$, $R^5$, X, and Y are defined as provided below:

| Ligand | $R^1$ | $R^5$ | X | Y | Ligand | $R^1$ | $R^5$ | X | Y |
|---|---|---|---|---|---|---|---|---|---|
| $L_{A3649}$ | H | H | C | S | $L_{A3769}$ | H | H | N | S |
| $L_{A3650}$ | $R_{B1}$ | H | C | S | $L_{A3770}$ | $R_{B1}$ | H | N | S |
| $L_{A3651}$ | $R_{B3}$ | H | C | S | $L_{A3771}$ | $R_{B3}$ | H | N | S |
| $L_{A3652}$ | $R_{B4}$ | H | C | S | $L_{A3772}$ | $R_{B4}$ | H | N | S |
| $L_{A3653}$ | $R_{B7}$ | H | C | S | $L_{A3773}$ | $R_{B7}$ | H | N | S |
| $L_{A3654}$ | $R_{B10}$ | H | C | S | $L_{A3774}$ | $R_{B10}$ | H | N | S |
| $L_{A3655}$ | $R_{A3}$ | H | C | S | $L_{A3775}$ | $R_{A3}$ | H | N | S |
| $L_{A3656}$ | $R_{A34}$ | H | C | S | $L_{A3776}$ | $R_{A34}$ | H | N | S |
| $L_{A3657}$ | H | H | C | O | $L_{A3777}$ | H | H | N | O |
| $L_{A3658}$ | $R_{B1}$ | H | C | O | $L_{A3778}$ | $R_{B1}$ | H | N | O |
| $L_{A3659}$ | $R_{B3}$ | H | C | O | $L_{A3779}$ | $R_{B3}$ | H | N | O |
| $L_{A3660}$ | $R_{B4}$ | H | C | O | $L_{A3780}$ | $R_{B4}$ | H | N | O |
| $L_{A3661}$ | $R_{B7}$ | H | C | O | $L_{A3781}$ | $R_{B7}$ | H | N | O |
| $L_{A3662}$ | $R_{B10}$ | H | C | O | $L_{A3782}$ | $R_{B10}$ | H | N | O |
| $L_{A3663}$ | $R_{A3}$ | H | C | O | $L_{A3783}$ | $R_{A3}$ | H | N | O |
| $L_{A3664}$ | $R_{A34}$ | H | C | O | $L_{A3784}$ | $R_{A34}$ | H | N | O |
| $L_{A3665}$ | H | H | C | $NCH_3$ | $L_{A3785}$ | H | H | N | $NCH_3$ |
| $L_{A3666}$ | $R_{B1}$ | H | C | $NCH_3$ | $L_{A3786}$ | $R_{B1}$ | H | N | $NCH_3$ |
| $L_{A3667}$ | $R_{B3}$ | H | C | $NCH_3$ | $L_{A3787}$ | $R_{B3}$ | H | N | $NCH_3$ |
| $L_{A3668}$ | $R_{B4}$ | H | C | $NCH_3$ | $L_{A3788}$ | $R_{B4}$ | H | N | $NCH_3$ |
| $L_{A3669}$ | $R_{B7}$ | H | C | $NCH_3$ | $L_{A3789}$ | $R_{B7}$ | H | N | $NCH_3$ |
| $L_{A3670}$ | $R_{B10}$ | H | C | $NCH_3$ | $L_{A3790}$ | $R_{B10}$ | H | N | $NCH_3$ |
| $L_{A3671}$ | $R_{A3}$ | H | C | $NCH_3$ | $L_{A3791}$ | $R_{A3}$ | H | N | $NCH_3$ |
| $L_{A3672}$ | $R_{A34}$ | H | C | $NCH_3$ | $L_{A3792}$ | $R_{A34}$ | H | N | $NCH_3$ |
| $L_{A3673}$ | H | H | C | $C(CH_3)_2$ | $L_{A3793}$ | H | H | N | $C(CH_3)_2$ |
| $L_{A3674}$ | $R_{B1}$ | H | C | $C(CH_3)_2$ | $L_{A3794}$ | $R_{B1}$ | H | N | $C(CH_3)_2$ |
| $L_{A3675}$ | $R_{B3}$ | H | C | $C(CH_3)_2$ | $L_{A3795}$ | $R_{B3}$ | H | N | $C(CH_3)_2$ |
| $L_{A3676}$ | $R_{B4}$ | H | C | $C(CH_3)_2$ | $L_{A3796}$ | $R_{B4}$ | H | N | $C(CH_3)_2$ |
| $L_{A3677}$ | $R_{B7}$ | H | C | $C(CH_3)_2$ | $L_{A3797}$ | $R_{B7}$ | H | N | $C(CH_3)_2$ |
| $L_{A3678}$ | $R_{B10}$ | H | C | $C(CH_3)_2$ | $L_{A3798}$ | $R_{B10}$ | H | N | $C(CH_3)_2$ |
| $L_{A3679}$ | $R_{A3}$ | H | C | $C(CH_3)_2$ | $L_{A3799}$ | $R_{A3}$ | H | N | $C(CH_3)_2$ |
| $L_{A3680}$ | $R_{A34}$ | H | C | $C(CH_3)_2$ | $L_{A3800}$ | $R_{A34}$ | H | N | $C(CH_3)_2$ |
| $L_{A3681}$ | H | H | C | $Si(CH_3)_2$ | $L_{A3801}$ | H | H | N | $Si(CH_3)_2$ |
| $L_{A3682}$ | $R_{B1}$ | H | C | $Si(CH_3)_2$ | $L_{A3802}$ | $R_{B1}$ | H | N | $Si(CH_3)_2$ |
| $L_{A3683}$ | $R_{B3}$ | H | C | $Si(CH_3)_2$ | $L_{A3803}$ | $R_{B3}$ | H | N | $Si(CH_3)_2$ |
| $L_{A3684}$ | $R_{B4}$ | H | C | $Si(CH_3)_2$ | $L_{A3804}$ | $R_{B4}$ | H | N | $Si(CH_3)_2$ |
| $L_{A3685}$ | $R_{B7}$ | H | C | $Si(CH_3)_2$ | $L_{A3805}$ | $R_{B7}$ | H | N | $Si(CH_3)_2$ |
| $L_{A3686}$ | $R_{B10}$ | H | C | $Si(CH_3)_2$ | $L_{A3806}$ | $R_{B10}$ | H | N | $Si(CH_3)_2$ |
| $L_{A3687}$ | $R_{A3}$ | H | C | $Si(CH_3)_2$ | $L_{A3807}$ | $R_{A3}$ | H | N | $Si(CH_3)_2$ |
| $L_{A3688}$ | $R_{A34}$ | H | C | $Si(CH_3)_2$ | $L_{A3808}$ | $R_{A34}$ | H | N | $Si(CH_3)_2$ |
| $L_{A3689}$ | H | $R_{B1}$ | C | S | $L_{A3809}$ | H | $R_{B1}$ | N | S |
| $L_{A3690}$ | $R_{B1}$ | $R_{B1}$ | C | S | $L_{A3810}$ | $R_{B1}$ | $R_{B1}$ | N | S |

-continued

| Ligand | $R^1$ | $R^5$ | X | Y | Ligand | $R^1$ | $R^5$ | X | Y |
|---|---|---|---|---|---|---|---|---|---|
| $L_{A3691}$ | $R_{B3}$ | $R_{B1}$ | C | S | $L_{A3811}$ | $R_{B3}$ | $R_{B1}$ | N | S |
| $L_{A3692}$ | $R_{B4}$ | $R_{B1}$ | C | S | $L_{A3812}$ | $R_{B4}$ | $R_{B1}$ | N | S |
| $L_{A3693}$ | $R_{B7}$ | $R_{B1}$ | C | S | $L_{A3813}$ | $R_{B7}$ | $R_{B1}$ | N | S |
| $L_{A3694}$ | $R_{B10}$ | $R_{B1}$ | C | S | $L_{A3814}$ | $R_{B10}$ | $R_{B1}$ | N | S |
| $L_{A3695}$ | $R_{A3}$ | $R_{B1}$ | C | S | $L_{A3815}$ | $R_{A3}$ | $R_{B1}$ | N | S |
| $L_{A3696}$ | $R_{A34}$ | $R_{B1}$ | C | S | $L_{A3816}$ | $R_{A34}$ | $R_{B1}$ | N | S |
| $L_{A3697}$ | H | $R_{B1}$ | C | O | $L_{A3817}$ | H | $R_{B1}$ | N | O |
| $L_{A3698}$ | $R_{B1}$ | $R_{B1}$ | C | O | $L_{A3818}$ | $R_{B1}$ | $R_{B1}$ | N | O |
| $L_{A3699}$ | $R_{B3}$ | $R_{B1}$ | C | O | $L_{A3819}$ | $R_{B3}$ | $R_{B1}$ | N | O |
| $L_{A3700}$ | $R_{B4}$ | $R_{B1}$ | C | O | $L_{A3820}$ | $R_{B4}$ | $R_{B1}$ | N | O |
| $L_{A3701}$ | $R_{B7}$ | $R_{B1}$ | C | O | $L_{A3821}$ | $R_{B7}$ | $R_{B1}$ | N | O |
| $L_{A3702}$ | $R_{B10}$ | $R_{B1}$ | C | O | $L_{A3822}$ | $R_{B10}$ | $R_{B1}$ | N | O |
| $L_{A3703}$ | $R_{A3}$ | $R_{B1}$ | C | O | $L_{A3823}$ | $R_{A3}$ | $R_{B1}$ | N | O |
| $L_{A3704}$ | $R_{A34}$ | $R_{B1}$ | C | O | $L_{A3824}$ | $R_{A34}$ | $R_{B1}$ | N | O |
| $L_{A3705}$ | H | $R_{B1}$ | C | $NCH_3$ | $L_{A3825}$ | H | $R_{B1}$ | N | $NCH_3$ |
| $L_{A3706}$ | $R_{B1}$ | $R_{B1}$ | C | $NCH_3$ | $L_{A3826}$ | $R_{B1}$ | $R_{B1}$ | N | $NCH_3$ |
| $L_{A3707}$ | $R_{B3}$ | $R_{B1}$ | C | $NCH_3$ | $L_{A3827}$ | $R_{B3}$ | $R_{B1}$ | N | $NCH_3$ |
| $L_{A3708}$ | $R_{B4}$ | $R_{B1}$ | C | $NCH_3$ | $L_{A3828}$ | $R_{B4}$ | $R_{B1}$ | N | $NCH_3$ |
| $L_{A3709}$ | $R_{B7}$ | $R_{B1}$ | C | $NCH_3$ | $L_{A3829}$ | $R_{B7}$ | $R_{B1}$ | N | $NCH_3$ |
| $L_{A3710}$ | $R_{B10}$ | $R_{B1}$ | C | $NCH_3$ | $L_{A3830}$ | $R_{B10}$ | $R_{B1}$ | N | $NCH_3$ |
| $L_{A3711}$ | $R_{A3}$ | $R_{B1}$ | C | $NCH_3$ | $L_{A3831}$ | $R_{A3}$ | $R_{B1}$ | N | $NCH_3$ |
| $L_{A3712}$ | $R_{A34}$ | $R_{B1}$ | C | $NCH_3$ | $L_{A3832}$ | $R_{A34}$ | $R_{B1}$ | N | $NCH_3$ |
| $L_{A3713}$ | H | $R_{B1}$ | C | $C(CH_3)_2$ | $L_{A3833}$ | H | $R_{B1}$ | N | $C(CH_3)_2$ |
| $L_{A3714}$ | $R_{B1}$ | $R_{B1}$ | C | $C(CH_3)_2$ | $L_{A3834}$ | $R_{B1}$ | $R_{B1}$ | N | $C(CH_3)_2$ |
| $L_{A3715}$ | $R_{B3}$ | $R_{B1}$ | C | $C(CH_3)_2$ | $L_{A3835}$ | $R_{B3}$ | $R_{B1}$ | N | $C(CH_3)_2$ |
| $L_{A3716}$ | $R_{B4}$ | $R_{B1}$ | C | $C(CH_3)_2$ | $L_{A3836}$ | $R_{B4}$ | $R_{B1}$ | N | $C(CH_3)_2$ |
| $L_{A3717}$ | $R_{B7}$ | $R_{B1}$ | C | $C(CH_3)_2$ | $L_{A3837}$ | $R_{B7}$ | $R_{B1}$ | N | $C(CH_3)_2$ |
| $L_{A3718}$ | $R_{B10}$ | $R_{B1}$ | C | $C(CH_3)_2$ | $L_{A3838}$ | $R_{B10}$ | $R_{B1}$ | N | $C(CH_3)_2$ |
| $L_{A3719}$ | $R_{A3}$ | $R_{B1}$ | C | $C(CH_3)_2$ | $L_{A3839}$ | $R_{A3}$ | $R_{B1}$ | N | $C(CH_3)_2$ |
| $L_{A3720}$ | $R_{A34}$ | $R_{B1}$ | C | $C(CH_3)_2$ | $L_{A3840}$ | $R_{A34}$ | $R_{B1}$ | N | $C(CH_3)_2$ |
| $L_{A3721}$ | H | $R_{B1}$ | C | $Si(CH_3)_2$ | $L_{A3841}$ | H | $R_{B1}$ | N | $Si(CH_3)_2$ |
| $L_{A3722}$ | $R_{B1}$ | $R_{B1}$ | C | $Si(CH_3)_2$ | $L_{A3842}$ | $R_{B1}$ | $R_{B1}$ | N | $Si(CH_3)_2$ |
| $L_{A3723}$ | $R_{B3}$ | $R_{B1}$ | C | $Si(CH_3)_2$ | $L_{A3843}$ | $R_{B3}$ | $R_{B1}$ | N | $Si(CH_3)_2$ |
| $L_{A3724}$ | $R_{B4}$ | $R_{B1}$ | C | $Si(CH_3)_2$ | $L_{A3844}$ | $R_{B4}$ | $R_{B1}$ | N | $Si(CH_3)_2$ |
| $L_{A3725}$ | $R_{B7}$ | $R_{B1}$ | C | $Si(CH_3)_2$ | $L_{A3845}$ | $R_{B7}$ | $R_{B1}$ | N | $Si(CH_3)_2$ |
| $L_{A3726}$ | $R_{B10}$ | $R_{B1}$ | C | $Si(CH_3)_2$ | $L_{A3846}$ | $R_{B10}$ | $R_{B1}$ | N | $Si(CH_3)_2$ |
| $L_{A3727}$ | $R_{A3}$ | $R_{B1}$ | C | $Si(CH_3)_2$ | $L_{A3847}$ | $R_{A3}$ | $R_{B1}$ | N | $Si(CH_3)_2$ |
| $L_{A3728}$ | $R_{A34}$ | $R_{B1}$ | C | $Si(CH_3)_2$ | $L_{A3848}$ | $R_{A34}$ | $R_{B1}$ | N | $Si(CH3)_2$ |
| $L_{A3729}$ | H | $R_{B6}$ | C | S | $L_{A3849}$ | H | $R_{B6}$ | N | S |
| $L_{A3730}$ | $R_{B1}$ | $R_{B6}$ | C | S | $L_{A3850}$ | $R_{B1}$ | $R_{B6}$ | N | S |
| $L_{A3731}$ | $R_{B3}$ | $R_{B6}$ | C | S | $L_{A3851}$ | $R_{B3}$ | $R_{B6}$ | N | S |
| $L_{A3732}$ | $R_{B4}$ | $R_{B6}$ | C | S | $L_{A3852}$ | $R_{B4}$ | $R_{B6}$ | N | S |
| $L_{A3733}$ | $R_{B7}$ | $R_{B6}$ | C | S | $L_{A3853}$ | $R_{B7}$ | $R_{B6}$ | N | S |
| $L_{A3734}$ | $R_{B10}$ | $R_{B6}$ | C | S | $L_{A3854}$ | $R_{B10}$ | $R_{B6}$ | N | S |
| $L_{A3735}$ | $R_{A3}$ | $R_{B6}$ | C | S | $L_{A3855}$ | $R_{A3}$ | $R_{B6}$ | N | S |
| $L_{A3736}$ | $R_{A34}$ | $R_{B6}$ | C | S | $L_{A3856}$ | $R_{A34}$ | $R_{B6}$ | N | S |
| $L_{A3737}$ | H | $R_{B6}$ | C | O | $L_{A3857}$ | H | $R_{B6}$ | N | O |
| $L_{A3738}$ | $R_{B1}$ | $R_{B6}$ | C | O | $L_{A3858}$ | $R_{B1}$ | $R_{B6}$ | N | O |
| $L_{A3739}$ | $R_{B3}$ | $R_{B6}$ | C | O | $L_{A3859}$ | $R_{B3}$ | $R_{B6}$ | N | O |
| $L_{A3740}$ | $R_{B4}$ | $R_{B6}$ | C | O | $L_{A3860}$ | $R_{B4}$ | $R_{B6}$ | N | O |
| $L_{A3741}$ | $R_{B7}$ | $R_{B6}$ | C | O | $L_{A3861}$ | $R_{B7}$ | $R_{B6}$ | N | O |
| $L_{A3742}$ | $R_{B10}$ | $R_{B6}$ | C | O | $L_{A3862}$ | $R_{B10}$ | $R_{B6}$ | N | O |
| $L_{A3743}$ | $R_{A3}$ | $R_{B6}$ | C | O | $L_{A3863}$ | $R_{A3}$ | $R_{B6}$ | N | O |
| $L_{A3744}$ | $R_{A34}$ | $R_{B6}$ | C | O | $L_{A3864}$ | $R_{A34}$ | $R_{B6}$ | N | O |
| $L_{A3745}$ | H | $R_{B6}$ | C | $NCH_3$ | $L_{A3865}$ | H | $R_{B6}$ | N | $NCH_3$ |
| $L_{A3746}$ | $R_{B1}$ | $R_{B6}$ | C | $NCH_3$ | $L_{A3866}$ | $R_{B1}$ | $R_{B6}$ | N | $NCH_3$ |
| $L_{A3747}$ | $R_{B3}$ | $R_{B6}$ | C | $NCH_3$ | $L_{A3867}$ | $R_{B3}$ | $R_{B6}$ | N | $NCH_3$ |
| $L_{A3748}$ | $R_{B4}$ | $R_{B6}$ | C | $NCH_3$ | $L_{A3868}$ | $R_{B4}$ | $R_{B6}$ | N | $NCH_3$ |
| $L_{A3749}$ | $R_{B7}$ | $R_{B6}$ | C | $NCH_3$ | $L_{A3869}$ | $R_{B7}$ | $R_{B6}$ | N | $NCH_3$ |
| $L_{A3750}$ | $R_{B10}$ | $R_{B6}$ | C | $NCH_3$ | $L_{A3870}$ | $R_{B10}$ | $R_{B6}$ | N | $NCH_3$ |
| $L_{A3751}$ | $R_{A3}$ | $R_{B6}$ | C | $NCH_3$ | $L_{A3871}$ | $R_{A3}$ | $R_{B6}$ | N | $NCH_3$ |
| $L_{A3752}$ | $R_{A34}$ | $R_{B6}$ | C | $NCH_3$ | $L_{A3872}$ | $R_{A34}$ | $R_{B6}$ | N | $NCH_3$ |
| $L_{A3753}$ | H | $R_{B6}$ | C | $C(CH_3)_2$ | $L_{A3873}$ | H | $R_{B6}$ | N | $C(CH_3)_2$ |
| $L_{A3754}$ | $R_{B1}$ | $R_{B6}$ | C | $C(CH_3)_2$ | $L_{A3874}$ | $R_{B1}$ | $R_{B6}$ | N | $C(CH_3)_2$ |
| $L_{A3755}$ | $R_{B3}$ | $R_{B6}$ | C | $C(CH_3)_2$ | $L_{A3875}$ | $R_{B3}$ | $R_{B6}$ | N | $C(CH_3)_2$ |
| $L_{A3756}$ | $R_{B4}$ | $R_{B6}$ | C | $C(CH_3)_2$ | $L_{A3876}$ | $R_{B4}$ | $R_{B6}$ | N | $C(CH_3)_2$ |
| $L_{A3757}$ | $R_{B7}$ | $R_{B6}$ | C | $C(CH_3)_2$ | $L_{A3877}$ | $R_{B7}$ | $R_{B6}$ | N | $C(CH_3)_2$ |
| $L_{A3758}$ | $R_{B10}$ | $R_{B6}$ | C | $C(CH_3)_2$ | $L_{A3878}$ | $R_{B10}$ | $R_{B6}$ | N | $C(CH_3)_2$ |
| $L_{A3759}$ | $R_{A3}$ | $R_{B6}$ | C | $C(CH_3)_2$ | $L_{A3879}$ | $R_{A3}$ | $R_{B6}$ | N | $C(CH_3)_2$ |
| $L_{A3760}$ | $R_{A34}$ | $R_{B6}$ | C | $C(CH_3)_2$ | $L_{A3880}$ | $R_{A34}$ | $R_{B6}$ | N | $C(CH_3)_2$ |
| $L_{A3761}$ | H | $R_{B6}$ | C | $Si(CH_3)_2$ | $L_{A3881}$ | H | $R_{B6}$ | N | $Si(CH_3)_2$ |
| $L_{A3762}$ | $R_{B1}$ | $R_{B6}$ | C | $Si(CH_3)_2$ | $L_{A3882}$ | $R_{B1}$ | $R_{B6}$ | N | $Si(CH_3)_2$ |
| $L_{A3763}$ | $R_{B3}$ | $R_{B6}$ | C | $Si(CH_3)_2$ | $L_{A3883}$ | $R_{B3}$ | $R_{B6}$ | N | $Si(CH_3)_2$ |

-continued

| Ligand | $R^1$ | $R^5$ | X | Y | Ligand | $R^1$ | $R^5$ | X | Y |
|---|---|---|---|---|---|---|---|---|---|
| $L_{A3764}$ | $R_{B4}$ | $R_{B6}$ | C | $Si(CH_3)_2$ | $L_{A3884}$ | $R_{B4}$ | $R_{B6}$ | N | $Si(CH_3)_2$ |
| $L_{A3765}$ | $R_{B7}$ | $R_{B6}$ | C | $Si(CH_3)_2$ | $L_{A3885}$ | $R_{B7}$ | $R_{B6}$ | N | $Si(CH_3)_2$ |
| $L_{A3766}$ | $R_{B10}$ | $R_{B6}$ | C | $Si(CH_3)_2$ | $L_{A3886}$ | $R_{B10}$ | $R_{B6}$ | N | $Si(CH_3)_2$ |
| $L_{A3767}$ | $R_{A3}$ | $R_{B6}$ | C | $Si(CH_3)_2$ | $L_{A3887}$ | $R_{A3}$ | $R_{B6}$ | N | $Si(CH_3)_2$ |
| $L_{A3768}$ | $R_{A34}$ | $R_{B6}$ | C | $Si(CH_3)_2$ | $L_{A3888}$ | $R_{A34}$ | $R_{B6}$ | N | $Si(CH_3)_2$ |

wherein $L_{A3889}$ through $L_{A4008}$ have a structure of Formula XXVII:

Formula XXVII

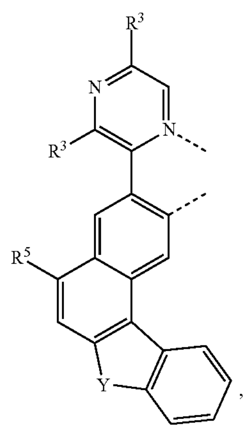

wherein $R^3$, $R^5$, and Y are defined as provided below:

| Ligand | $R^5$ | $R^3$ | Y |
|---|---|---|---|
| $L_{A3889}$ | H | H | S |
| $L_{A3890}$ | H | $R_{B1}$ | S |
| $L_{A3891}$ | H | $R_{B2}$ | S |
| $L_{A3892}$ | H | $R_{B3}$ | S |
| $L_{A3893}$ | H | $R_{B4}$ | S |
| $L_{A3894}$ | H | $R_{B5}$ | S |
| $L_{A3895}$ | H | $R_{A34}$ | S |
| $L_{A3896}$ | H | $R_{A52}$ | S |
| $L_{A3897}$ | H | H | O |
| $L_{A3898}$ | H | $R_{B1}$ | O |
| $L_{A3899}$ | H | $R_{B2}$ | O |
| $L_{A3900}$ | H | $R_{B3}$ | O |
| $L_{A3901}$ | H | $R_{B4}$ | O |
| $L_{A3902}$ | H | $R_{B5}$ | O |
| $L_{A3903}$ | H | $R_{A34}$ | O |
| $L_{A3904}$ | H | $R_{A52}$ | O |
| $L_{A3905}$ | H | H | $NCH_3$ |
| $L_{A3906}$ | H | $R_{B1}$ | $NCH_3$ |
| $L_{A3907}$ | H | $R_{B2}$ | $NCH_3$ |
| $L_{A3908}$ | H | $R_{B3}$ | $NCH_3$ |
| $L_{A3909}$ | H | $R_{B4}$ | $NCH_3$ |
| $L_{A3910}$ | H | $R_{B5}$ | $NCH_3$ |
| $L_{A3911}$ | H | $R_{A34}$ | $NCH_3$ |
| $L_{A3912}$ | H | $R_{A52}$ | $NCH_3$ |
| $L_{A3913}$ | H | H | $C(CH_3)_2$ |
| $L_{A3914}$ | H | $R_{B1}$ | $C(CH_3)_2$ |
| $L_{A3915}$ | H | $R_{B2}$ | $C(CH_3)_2$ |
| $L_{A3916}$ | H | $R_{B3}$ | $C(CH_3)_2$ |
| $L_{A3917}$ | H | $R_{B4}$ | $C(CH_3)_2$ |
| $L_{A3918}$ | H | $R_{B5}$ | $C(CH_3)_2$ |
| $L_{A3919}$ | H | $R_{A34}$ | $C(CH_3)_2$ |
| $L_{A3920}$ | H | $R_{A52}$ | $C(CH_3)_2$ |
| $L_{A3921}$ | H | H | $Si(CH_3)_2$ |
| $L_{A3922}$ | H | $R_{B1}$ | $Si(CH_3)_2$ |
| $L_{A3923}$ | H | $R_{B2}$ | $Si(CH_3)_2$ |
| $L_{A3924}$ | H | $R_{B3}$ | $Si(CH_3)_2$ |
| $L_{A3925}$ | H | $R_{B4}$ | $Si(CH_3)_2$ |
| $L_{A3926}$ | H | $R_{B5}$ | $Si(CH_3)_2$ |

-continued

| Ligand | $R^5$ | $R^3$ | Y |
|---|---|---|---|
| $L_{A3927}$ | H | $R_{A34}$ | $Si(CH_3)_2$ |
| $L_{A3928}$ | H | $R_{A52}$ | $Si(CH_3)_2$ |
| $L_{A3929}$ | $R_{B1}$ | H | S |
| $L_{A3930}$ | $R_{B1}$ | $R_{B1}$ | S |
| $L_{A3931}$ | $R_{B1}$ | $R_{B2}$ | S |
| $L_{A3932}$ | $R_{B1}$ | $R_{B3}$ | S |
| $L_{A3933}$ | $R_{B1}$ | $R_{B4}$ | S |
| $L_{A3934}$ | $R_{B1}$ | $R_{B5}$ | S |
| $L_{A3935}$ | $R_{B1}$ | $R_{A34}$ | S |
| $L_{A3936}$ | $R_{B1}$ | $R_{A52}$ | S |
| $L_{A3937}$ | $R_{B1}$ | H | O |
| $L_{A3938}$ | $R_{B1}$ | $R_{B1}$ | O |
| $L_{A3939}$ | $R_{B1}$ | $R_{B2}$ | O |
| $L_{A3940}$ | $R_{B1}$ | $R_{B3}$ | O |
| $L_{A3941}$ | $R_{B1}$ | $R_{B4}$ | O |
| $L_{A3942}$ | $R_{B1}$ | $R_{B5}$ | O |
| $L_{A3943}$ | $R_{B1}$ | $R_{A34}$ | O |
| $L_{A3944}$ | $R_{B1}$ | $R_{A52}$ | O |
| $L_{A3945}$ | $R_{B1}$ | H | $NCH_3$ |
| $L_{A3946}$ | $R_{B1}$ | $R_{B1}$ | $NCH_3$ |
| $L_{A3947}$ | $R_{B1}$ | $R_{B2}$ | $NCH_3$ |
| $L_{A3948}$ | $R_{B1}$ | $R_{B3}$ | $NCH_3$ |
| $L_{A3949}$ | $R_{B1}$ | $R_{B4}$ | $NCH_3$ |
| $L_{A3950}$ | $R_{B1}$ | $R_{B5}$ | $NCH_3$ |
| $L_{A3951}$ | $R_{B1}$ | $R_{A34}$ | $NCH_3$ |
| $L_{A3952}$ | $R_{B1}$ | $R_{A52}$ | $NCH_3$ |
| $L_{A3953}$ | $R_{B1}$ | H | $C(CH_3)_2$ |
| $L_{A3954}$ | $R_{B1}$ | $R_{B1}$ | $C(CH_3)_2$ |
| $L_{A3955}$ | $R_{B1}$ | $R_{B2}$ | $C(CH_3)_2$ |
| $L_{A3956}$ | $R_{B1}$ | $R_{B3}$ | $C(CH_3)_2$ |
| $L_{A3957}$ | $R_{B1}$ | $R_{B4}$ | $C(CH_3)_2$ |
| $L_{A3958}$ | $R_{B1}$ | $R_{B5}$ | $C(CH_3)_2$ |
| $L_{A3959}$ | $R_{B1}$ | $R_{A34}$ | $C(CH_3)_2$ |
| $L_{A3960}$ | $R_{B1}$ | $R_{A52}$ | $C(CH_3)_2$ |
| $L_{A3961}$ | $R_{B1}$ | H | $Si(CH_3)_2$ |
| $L_{A3962}$ | $R_{B1}$ | $R_{B1}$ | $Si(CH_3)_2$ |
| $L_{A3963}$ | $R_{B1}$ | $R_{B2}$ | $Si(CH_3)_2$ |
| $L_{A3964}$ | $R_{B1}$ | $R_{B3}$ | $Si(CH_3)_2$ |
| $L_{A3965}$ | $R_{B1}$ | $R_{B4}$ | $Si(CH_3)_2$ |
| $L_{A3966}$ | $R_{B1}$ | $R_{B5}$ | $Si(CH_3)_2$ |
| $L_{A3967}$ | $R_{B1}$ | $R_{A34}$ | $Si(CH_3)_2$ |
| $L_{A3968}$ | $R_{B1}$ | $R_{A52}$ | $Si(CH_3)_2$ |
| $L_{A3969}$ | $R_{B6}$ | H | S |
| $L_{A3970}$ | $R_{B6}$ | $R_{B1}$ | S |
| $L_{A3971}$ | $R_{B6}$ | $R_{B2}$ | S |
| $L_{A3972}$ | $R_{B6}$ | $R_{B3}$ | S |
| $L_{A3973}$ | $R_{B6}$ | $R_{B4}$ | S |
| $L_{A3974}$ | $R_{B6}$ | $R_{B5}$ | S |
| $L_{A3975}$ | $R_{B6}$ | $R_{A34}$ | S |
| $L_{A3976}$ | $R_{B6}$ | $R_{A52}$ | S |
| $L_{A3977}$ | $R_{B6}$ | H | O |
| $L_{A3978}$ | $R_{B6}$ | $R_{B1}$ | O |
| $L_{A3979}$ | $R_{B6}$ | $R_{B2}$ | O |
| $L_{A3980}$ | $R_{B6}$ | $R_{B3}$ | O |
| $L_{A3981}$ | $R_{B6}$ | $R_{B4}$ | O |
| $L_{A3982}$ | $R_{B6}$ | $R_{B5}$ | O |
| $L_{A3983}$ | $R_{B6}$ | $R_{A34}$ | O |
| $L_{A3984}$ | $R_{B6}$ | $R_{A52}$ | O |
| $L_{A3985}$ | $R_{B6}$ | H | $NCH_3$ |
| $L_{A3986}$ | $R_{B6}$ | $R_{B1}$ | $NCH_3$ |
| $L_{A3987}$ | $R_{B6}$ | $R_{B2}$ | $NCH_3$ |
| $L_{A3988}$ | $R_{B6}$ | $R_{B3}$ | $NCH_3$ |
| $L_{A3989}$ | $R_{B6}$ | $R_{B4}$ | $NCH_3$ |
| $L_{A3990}$ | $R_{B6}$ | $R_{B5}$ | $NCH_3$ |
| $L_{A3991}$ | $R_{B6}$ | $R_{A34}$ | $NCH_3$ |
| $L_{A3992}$ | $R_{B6}$ | $R_{A52}$ | $NCH_3$ |
| $L_{A3993}$ | $R_{B6}$ | H | $C(CH_3)_2$ |
| $L_{A3994}$ | $R_{B6}$ | $R_{B1}$ | $C(CH_3)_2$ |
| $L_{A3995}$ | $R_{B6}$ | $R_{B2}$ | $C(CH_3)_2$ |
| $L_{A3996}$ | $R_{B6}$ | $R_{B3}$ | $C(CH_3)_2$ |
| $L_{A3997}$ | $R_{B6}$ | $R_{B4}$ | $C(CH_3)_2$ |
| $L_{A3998}$ | $R_{B6}$ | $R_{B5}$ | $C(CH_3)_2$ |
| $L_{A3999}$ | $R_{B6}$ | $R_{A34}$ | $C(CH_3)_2$ |
| $L_{A4000}$ | $R_{B6}$ | $R_{A52}$ | $C(CH_3)_2$ |
| $L_{A4001}$ | $R_{B6}$ | H | $Si(CH_3)_2$ |
| $L_{A4002}$ | $R_{B6}$ | $R_{B1}$ | $Si(CH_3)_2$ |
| $L_{A4003}$ | $R_{B6}$ | $R_{B2}$ | $Si(CH_3)_2$ |

-continued

| Ligand | $R^5$ | $R^3$ | Y |
|---|---|---|---|
| $L_{A4004}$ | $R_{B6}$ | $R_{B3}$ | $Si(CH_3)_2$ |
| $L_{A4005}$ | $R_{B6}$ | $R_{B4}$ | $Si(CH_3)_2$ |
| $L_{A4006}$ | $R_{B6}$ | $R_{B5}$ | $Si(CH_3)_2$ |
| $L_{A4007}$ | $R_{B6}$ | $R_{A34}$ | $Si(CH_3)_2$ |
| $L_{A4008}$ | $R_{B6}$ | $R_{A52}$ | $Si(CH_3)_2$ |

wherein $L_{A4009}$ through $L_{A4104}$ have a structure of Formula XXVIII:

Formula XXVIII

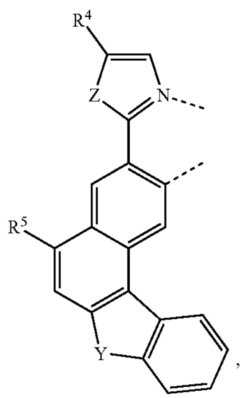

wherein $R^4$, $R^5$, Y, and Z are defined as provided below:

| Ligand | $R^5$ | $R^4$ | Y | Z |
|---|---|---|---|---|
| $L_{A4009}$ | H | H | S | S |
| $L_{A4010}$ | H | $R_{B1}$ | S | S |
| $L_{A4011}$ | H | $R_{B3}$ | S | S |
| $L_{A4012}$ | H | $R_{B4}$ | S | S |
| $L_{A4013}$ | H | $R_{B7}$ | S | S |
| $L_{A4014}$ | H | $R_{B10}$ | S | S |
| $L_{A4015}$ | H | $R_{A3}$ | S | S |
| $L_{A4016}$ | H | $R_{A34}$ | S | S |
| $L_{A4017}$ | H | H | S | O |
| $L_{A4018}$ | H | $R_{B1}$ | S | O |
| $L_{A4019}$ | H | $R_{B3}$ | S | O |
| $L_{A4020}$ | H | $R_{B4}$ | S | O |
| $L_{A4021}$ | H | $R_{B7}$ | S | O |
| $L_{A4022}$ | H | $R_{B10}$ | S | O |
| $L_{A4023}$ | H | $R_{A3}$ | S | O |
| $L_{A4024}$ | H | $R_{A34}$ | S | O |
| $L_{A4025}$ | H | H | S | $NCH_3$ |
| $L_{A4026}$ | H | $R_{B1}$ | S | $NCH_3$ |
| $L_{A4027}$ | H | $R_{B3}$ | S | $NCH_3$ |
| $L_{A4028}$ | H | $R_{B4}$ | S | $NCH_3$ |
| $L_{A4029}$ | H | $R_{B7}$ | S | $NCH_3$ |
| $L_{A4030}$ | H | $R_{B10}$ | S | $NCH_3$ |
| $L_{A4031}$ | H | $R_{A3}$ | S | $NCH_3$ |
| $L_{A4032}$ | H | $R_{A34}$ | S | $NCH_3$ |
| $L_{A4033}$ | H | H | O | S |
| $L_{A4034}$ | H | $R_{B1}$ | O | S |
| $L_{A4035}$ | H | $R_{B3}$ | O | S |
| $L_{A4036}$ | H | $R_{B4}$ | O | S |
| $L_{A4037}$ | H | $R_{B7}$ | O | S |
| $L_{A4038}$ | H | $R_{B10}$ | O | S |
| $L_{A4039}$ | H | $R_{A3}$ | O | S |
| $L_{A4040}$ | H | $R_{A34}$ | O | S |
| $L_{A4041}$ | H | H | O | O |
| $L_{A4042}$ | H | $R_{B1}$ | O | O |
| $L_{A4043}$ | H | $R_{B3}$ | O | O |
| $L_{A4044}$ | H | $R_{B4}$ | O | O |
| $L_{A4045}$ | H | $R_{B7}$ | O | O |
| $L_{A4046}$ | H | $R_{B10}$ | O | O |
| $L_{A4047}$ | H | $R_{A3}$ | O | O |

-continued

| Ligand | $R^5$ | $R^4$ | Y | Z |
|---|---|---|---|---|
| $L_{A4048}$ | H | $R_{A34}$ | O | O |
| $L_{A4049}$ | H | H | O | $NCH_3$ |
| $L_{A4050}$ | H | $R_{B1}$ | O | $NCH_3$ |
| $L_{A4051}$ | H | $R_{B3}$ | O | $NCH_3$ |
| $L_{A4052}$ | H | $R_{B4}$ | O | $NCH_3$ |
| $L_{A4053}$ | H | $R_{B7}$ | O | $NCH_3$ |
| $L_{A4054}$ | H | $R_{B10}$ | O | $NCH_3$ |
| $L_{A4055}$ | H | $R_{A3}$ | O | $NCH_3$ |
| $L_{A4056}$ | H | $R_{A34}$ | O | $NCH_3$ |
| $L_{A4057}$ | $R_{B6}$ | H | S | S |
| $L_{A4058}$ | $R_{B6}$ | $R_{B1}$ | S | S |
| $L_{A4059}$ | $R_{B6}$ | $R_{B3}$ | S | S |
| $L_{A4060}$ | $R_{B6}$ | $R_{B4}$ | S | S |
| $L_{A4061}$ | $R_{B6}$ | $R_{B7}$ | S | S |
| $L_{A4062}$ | $R_{B6}$ | $R_{B10}$ | S | S |
| $L_{A4063}$ | $R_{B6}$ | $R_{A3}$ | S | S |
| $L_{A4064}$ | $R_{B6}$ | $R_{A34}$ | S | S |
| $L_{A4065}$ | $R_{B6}$ | H | S | O |
| $L_{A4066}$ | $R_{B6}$ | $R_{B1}$ | S | O |
| $L_{A4067}$ | $R_{B6}$ | $R_{B3}$ | S | O |
| $L_{A4068}$ | $R_{B6}$ | $R_{B4}$ | S | O |
| $L_{A4069}$ | $R_{B6}$ | $R_{B7}$ | S | O |
| $L_{A4070}$ | $R_{B6}$ | $R_{B10}$ | S | O |
| $L_{A4071}$ | $R_{B6}$ | $R_{A3}$ | S | O |
| $L_{A4072}$ | $R_{B6}$ | $R_{A34}$ | S | O |
| $L_{A4073}$ | $R_{B6}$ | H | S | $NCH_3$ |
| $L_{A4074}$ | $R_{B6}$ | $R_{B1}$ | S | $NCH_3$ |
| $L_{A4075}$ | $R_{B6}$ | $R_{B3}$ | S | $NCH_3$ |
| $L_{A4076}$ | $R_{B6}$ | $R_{B4}$ | S | $NCH_3$ |
| $L_{A4077}$ | $R_{B6}$ | $R_{B7}$ | S | $NCH_3$ |
| $L_{A4078}$ | $R_{B6}$ | $R_{B10}$ | S | $NCH_3$ |
| $L_{A4079}$ | $R_{B6}$ | $R_{A3}$ | S | $NCH_3$ |
| $L_{A4080}$ | $R_{B6}$ | $R_{A34}$ | S | $NCH_3$ |
| $L_{A4081}$ | $R_{B6}$ | H | O | S |
| $L_{A4082}$ | $R_{B6}$ | $R_{B1}$ | O | S |
| $L_{A4083}$ | $R_{B6}$ | $R_{B3}$ | O | S |
| $L_{A4084}$ | $R_{B6}$ | $R_{B4}$ | O | S |
| $L_{A4085}$ | $R_{B6}$ | $R_{B7}$ | O | S |
| $L_{A4086}$ | $R_{B6}$ | $R_{B10}$ | O | S |
| $L_{A4087}$ | $R_{B6}$ | $R_{A3}$ | O | S |
| $L_{A4088}$ | $R_{B6}$ | $R_{A34}$ | O | S |
| $L_{A4089}$ | $R_{B6}$ | H | O | O |
| $L_{A4090}$ | $R_{B6}$ | $R_{B1}$ | O | O |
| $L_{A4091}$ | $R_{B6}$ | $R_{B3}$ | O | O |
| $L_{A4092}$ | $R_{B6}$ | $R_{B4}$ | O | O |
| $L_{A4093}$ | $R_{B6}$ | $R_{B7}$ | O | O |
| $L_{A4094}$ | $R_{B6}$ | $R_{B10}$ | O | O |
| $L_{A4095}$ | $R_{B6}$ | $R_{A3}$ | O | O |
| $L_{A4096}$ | $R_{B6}$ | $R_{A34}$ | O | O |
| $L_{A4097}$ | $R_{B6}$ | H | O | $NCH_3$ |
| $L_{A4098}$ | $R_{B6}$ | $R_{B1}$ | O | $NCH_3$ |
| $L_{A4099}$ | $R_{B6}$ | $R_{B3}$ | O | $NCH_3$ |
| $L_{A4100}$ | $R_{B6}$ | $R_{B4}$ | O | $NCH_3$ |
| $L_{A4101}$ | $R_{B6}$ | $R_{B7}$ | O | $NCH_3$ |
| $L_{A4102}$ | $R_{B6}$ | $R_{B10}$ | O | $NCH_3$ |
| $L_{A4103}$ | $R_{B6}$ | $R_{A3}$ | O | $NCH_3$ |
| $L_{A4104}$ | $R_{B6}$ | $R_{A34}$ | O | $NCH_3$ |

wherein $L_{A4105}$ through $L_{A4344}$ have a structure of Formula XXIX:

Formula XXIX

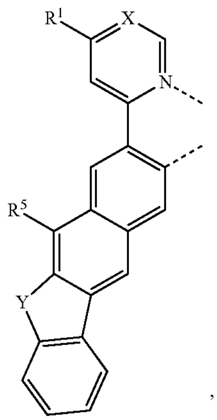

wherein $R^1$, $R^5$, X, and Y are defined as provided below:

| Ligand | $R^1$ | $R^5$ | X | Y |
|---|---|---|---|---|
| $L_{A4105}$ | H | H | C | S |
| $L_{A4106}$ | $R_{B1}$ | H | C | S |
| $L_{A4107}$ | $R_{B3}$ | H | C | S |
| $L_{A4108}$ | $R_{B4}$ | H | C | S |
| $L_{A4109}$ | $R_{B7}$ | H | C | S |
| $L_{A4110}$ | $R_{B10}$ | H | C | S |
| $L_{A4111}$ | $R_{A3}$ | H | C | S |
| $L_{A4112}$ | $R_{A34}$ | H | C | S |
| $L_{A4113}$ | H | H | C | O |
| $L_{A4114}$ | $R_{B1}$ | H | C | O |
| $L_{A4115}$ | $R_{B3}$ | H | C | O |
| $L_{A4116}$ | $R_{B4}$ | H | C | O |
| $L_{A4117}$ | $R_{B7}$ | H | C | O |
| $L_{A4118}$ | $R_{B10}$ | H | C | O |
| $L_{A4119}$ | $R_{A3}$ | H | C | O |
| $L_{A4120}$ | $R_{A34}$ | H | C | O |
| $L_{A4121}$ | H | H | C | $NCH_3$ |
| $L_{A4122}$ | $R_{B1}$ | H | C | $NCH_3$ |
| $L_{A4123}$ | $R_{B3}$ | H | C | $NCH_3$ |
| $L_{A4124}$ | $R_{B4}$ | H | C | $NCH_3$ |
| $L_{A4125}$ | $R_{B7}$ | H | C | $NCH_3$ |
| $L_{A4126}$ | $R_{B10}$ | H | C | $NCH_3$ |
| $L_{A4127}$ | $R_{A3}$ | H | C | $NCH_3$ |
| $L_{A4128}$ | $R_{A34}$ | H | C | $NCH_3$ |
| $L_{A4129}$ | H | H | C | $C(CH_3)_2$ |
| $L_{A4130}$ | $R_{B1}$ | H | C | $C(CH_3)_2$ |
| $L_{A4131}$ | $R_{B3}$ | H | C | $C(CH_3)_2$ |
| $L_{A4132}$ | $R_{B4}$ | H | C | $C(CH_3)_2$ |
| $L_{A4133}$ | $R_{B7}$ | H | C | $C(CH_3)_2$ |
| $L_{A4134}$ | $R_{B10}$ | H | C | $C(CH_3)_2$ |
| $L_{A4135}$ | $R_{A3}$ | H | C | $C(CH_3)_2$ |
| $L_{A4136}$ | $R_{A34}$ | H | C | $C(CH_3)_2$ |
| $L_{A4137}$ | H | H | C | $Si(CH_3)_2$ |
| $L_{A4138}$ | $R_{B1}$ | H | C | $Si(CH_3)_2$ |
| $L_{A4139}$ | $R_{B3}$ | H | C | $Si(CH_3)_2$ |
| $L_{A4140}$ | $R_{B4}$ | H | C | $Si(CH_3)_2$ |
| $L_{A4141}$ | $R_{B7}$ | H | C | $Si(CH_3)_2$ |
| $L_{A4142}$ | $R_{B10}$ | H | C | $Si(CH_3)_2$ |
| $L_{A4143}$ | $R_{A3}$ | H | C | $Si(CH_3)_2$ |
| $L_{A4144}$ | $R_{A34}$ | H | C | $Si(CH_3)_2$ |
| $L_{A4145}$ | H | $R_{B1}$ | C | S |
| $L_{A4146}$ | $R_{B1}$ | $R_{B1}$ | C | S |
| $L_{A4147}$ | $R_{B3}$ | $R_{B1}$ | C | S |
| $L_{A4148}$ | $R_{B4}$ | $R_{B1}$ | C | S |
| $L_{A4149}$ | $R_{B7}$ | $R_{B1}$ | C | S |
| $L_{A4150}$ | $R_{B10}$ | $R_{B1}$ | C | S |
| $L_{A4151}$ | $R_{A3}$ | $R_{B1}$ | C | S |
| $L_{A4152}$ | $R_{A34}$ | $R_{B1}$ | C | S |
| $L_{A4153}$ | H | $R_{B1}$ | C | O |

-continued

| Ligand | $R^1$ | $R^5$ | X | Y |
|---|---|---|---|---|
| $L_{A4154}$ | $R_{B1}$ | $R_{B1}$ | C | O |
| $L_{A4155}$ | $R_{B3}$ | $R_{B1}$ | C | O |
| $L_{A4156}$ | $R_{B4}$ | $R_{B1}$ | C | O |
| $L_{A4157}$ | $R_{B7}$ | $R_{B1}$ | C | O |
| $L_{A4158}$ | $R_{B10}$ | $R_{B1}$ | C | O |
| $L_{A4159}$ | $R_{A3}$ | $R_{B1}$ | C | O |
| $L_{A4160}$ | $R_{A34}$ | $R_{B1}$ | C | O |
| $L_{A4161}$ | H | $R_{B1}$ | C | $NCH_3$ |
| $L_{A4162}$ | $R_{B1}$ | $R_{B1}$ | C | $NCH_3$ |
| $L_{A4163}$ | $R_{B3}$ | $R_{B1}$ | C | $NCH_3$ |
| $L_{A4164}$ | $R_{B4}$ | $R_{B1}$ | C | $NCH_3$ |
| $L_{A4165}$ | $R_{B7}$ | $R_{B1}$ | C | $NCH_3$ |
| $L_{A4166}$ | $R_{B10}$ | $R_{B1}$ | C | $NCH_3$ |
| $L_{A4167}$ | $R_{A3}$ | $R_{B1}$ | C | $NCH_3$ |
| $L_{A4168}$ | $R_{A34}$ | $R_{B1}$ | C | $NCH_3$ |
| $L_{A4169}$ | H | $R_{B1}$ | C | $C(CH_3)_2$ |
| $L_{A4170}$ | $R_{B1}$ | $R_{B1}$ | C | $C(CH_3)_2$ |
| $L_{A4171}$ | $R_{B3}$ | $R_{B1}$ | C | $C(CH_3)_2$ |
| $L_{A4172}$ | $R_{B4}$ | $R_{B1}$ | C | $C(CH_3)_2$ |
| $L_{A4173}$ | $R_{B7}$ | $R_{B1}$ | C | $C(CH_3)_2$ |
| $L_{A4174}$ | $R_{B10}$ | $R_{B1}$ | C | $C(CH_3)_2$ |
| $L_{A4175}$ | $R_{A3}$ | $R_{B1}$ | C | $C(CH_3)_2$ |
| $L_{A4176}$ | $R_{A34}$ | $R_{B1}$ | C | $C(CH_3)_2$ |
| $L_{A4177}$ | H | $R_{B1}$ | C | $Si(CH_3)_2$ |
| $L_{A4178}$ | $R_{B1}$ | $R_{B1}$ | C | $Si(CH_3)_2$ |
| $L_{A4179}$ | $R_{B3}$ | $R_{B1}$ | C | $Si(CH_3)_2$ |
| $L_{A4180}$ | $R_{B4}$ | $R_{B1}$ | C | $Si(CH_3)_2$ |
| $L_{A4181}$ | $R_{B7}$ | $R_{B1}$ | C | $Si(CH_3)_2$ |
| $L_{A4182}$ | $R_{B10}$ | $R_{B1}$ | C | $Si(CH_3)_2$ |
| $L_{A4183}$ | $R_{A3}$ | $R_{B1}$ | C | $Si(CH_3)_2$ |
| $L_{A4184}$ | $R_{A34}$ | $R_{B1}$ | C | $Si(CH_3)_2$ |
| $L_{A4185}$ | H | $R_{B6}$ | C | S |
| $L_{A4186}$ | $R_{B1}$ | $R_{B6}$ | C | S |
| $L_{A4187}$ | $R_{B3}$ | $R_{B6}$ | C | S |
| $L_{A4188}$ | $R_{B4}$ | $R_{B6}$ | C | S |
| $L_{A4189}$ | $R_{B7}$ | $R_{B6}$ | C | S |
| $L_{A4190}$ | $R_{B10}$ | $R_{B6}$ | C | S |
| $L_{A4191}$ | $R_{A3}$ | $R_{B6}$ | C | S |
| $L_{A4192}$ | $R_{A34}$ | $R_{B6}$ | C | S |
| $L_{A4193}$ | H | $R_{B6}$ | C | O |
| $L_{A4194}$ | $R_{B1}$ | $R_{B6}$ | C | O |
| $L_{A4195}$ | $R_{B3}$ | $R_{B6}$ | C | O |
| $L_{A4196}$ | $R_{B4}$ | $R_{B6}$ | C | O |
| $L_{A4197}$ | $R_{B7}$ | $R_{B6}$ | C | O |
| $L_{A4198}$ | $R_{B10}$ | $R_{B6}$ | C | O |
| $L_{A4199}$ | $R_{A3}$ | $R_{B6}$ | C | O |
| $L_{A4200}$ | $R_{A34}$ | $R_{B6}$ | C | O |
| $L_{A4201}$ | H | $R_{B6}$ | C | $NCH_3$ |
| $L_{A4202}$ | $R_{B1}$ | $R_{B6}$ | C | $NCH_3$ |
| $L_{A4203}$ | $R_{B3}$ | $R_{B6}$ | C | $NCH_3$ |
| $L_{A4204}$ | $R_{B4}$ | $R_{B6}$ | C | $NCH_3$ |
| $L_{A4205}$ | $R_{B7}$ | $R_{B6}$ | C | $NCH_3$ |
| $L_{A4206}$ | $R_{B10}$ | $R_{B6}$ | C | $NCH_3$ |
| $L_{A4207}$ | $R_{A3}$ | $R_{B6}$ | C | $NCH_3$ |
| $L_{A4208}$ | $R_{A34}$ | $R_{B6}$ | C | $NCH_3$ |
| $L_{A4209}$ | H | $R_{B6}$ | C | $C(CH_3)_2$ |
| $L_{A4210}$ | $R_{B1}$ | $R_{B6}$ | C | $C(CH_3)_2$ |
| $L_{A4211}$ | $R_{B3}$ | $R_{B6}$ | C | $C(CH_3)_2$ |
| $L_{A4212}$ | $R_{B4}$ | $R_{B6}$ | C | $C(CH_3)_2$ |
| $L_{A4213}$ | $R_{B7}$ | $R_{B6}$ | C | $C(CH_3)_2$ |
| $L_{A4214}$ | $R_{B10}$ | $R_{B6}$ | C | $C(CH_3)_2$ |
| $L_{A4215}$ | $R_{A3}$ | $R_{B6}$ | C | $C(CH_3)_2$ |
| $L_{A4216}$ | $R_{A34}$ | $R_{B6}$ | C | $C(CH_3)_2$ |
| $L_{A4217}$ | H | $R_{B6}$ | C | $Si(CH_3)_2$ |
| $L_{A4218}$ | $R_{B1}$ | $R_{B6}$ | C | $Si(CH_3)_2$ |
| $L_{A4219}$ | $R_{B3}$ | $R_{B6}$ | C | $Si(CH_3)_2$ |
| $L_{A4220}$ | $R_{B4}$ | $R_{B6}$ | C | $Si(CH_3)_2$ |
| $L_{A4221}$ | $R_{B7}$ | $R_{B6}$ | C | $Si(CH_3)_2$ |
| $L_{A4222}$ | $R_{B10}$ | $R_{B6}$ | C | $Si(CH_3)_2$ |
| $L_{A4223}$ | $R_{A3}$ | $R_{B6}$ | C | $Si(CH_3)_2$ |
| $L_{A4224}$ | $R_{A34}$ | $R_{B6}$ | C | $Si(CH_3)_2$ |
| $L_{A4225}$ | H | H | N | S |
| $L_{A4226}$ | $R_{B1}$ | H | N | S |
| $L_{A4227}$ | $R_{B3}$ | H | N | S |
| $L_{A4228}$ | $R_{B4}$ | H | N | S |
| $L_{A4229}$ | $R_{B7}$ | H | N | S |
| $L_{A4230}$ | $R_{B10}$ | H | N | S |

-continued

| Ligand | $R^1$ | $R^5$ | X | Y |
|---|---|---|---|---|
| $L_{A4231}$ | $R_{A3}$ | H | N | S |
| $L_{A4232}$ | $R_{A34}$ | H | N | S |
| $L_{A4233}$ | H | H | N | O |
| $L_{A4234}$ | $R_{B1}$ | H | N | O |
| $L_{A4235}$ | $R_{B3}$ | H | N | O |
| $L_{A4236}$ | $R_{B4}$ | H | N | O |
| $L_{A4237}$ | $R_{B7}$ | H | N | O |
| $L_{A4238}$ | $R_{B10}$ | H | N | O |
| $L_{A4239}$ | $R_{A3}$ | H | N | O |
| $L_{A4240}$ | $R_{A34}$ | H | N | O |
| $L_{A4241}$ | H | H | N | $NCH_3$ |
| $L_{A4242}$ | $R_{B1}$ | H | N | $NCH_3$ |
| $L_{A4243}$ | $R_{B3}$ | H | N | $NCH_3$ |
| $L_{A4244}$ | $R_{B4}$ | H | N | $NCH_3$ |
| $L_{A4245}$ | $R_{B7}$ | H | N | $NCH_3$ |
| $L_{A4246}$ | $R_{B10}$ | H | N | $NCH_3$ |
| $L_{A4247}$ | $R_{A3}$ | H | N | $NCH_3$ |
| $L_{A4248}$ | $R_{A34}$ | H | N | $NCH_3$ |
| $L_{A4249}$ | H | H | N | $C(CH_3)_2$ |
| $L_{A4250}$ | $R_{B1}$ | H | N | $C(CH_3)_2$ |
| $L_{A4251}$ | $R_{B3}$ | H | N | $C(CH_3)_2$ |
| $L_{A4252}$ | $R_{B4}$ | H | N | $C(CH_3)_2$ |
| $L_{A4253}$ | $R_{B7}$ | H | N | $C(CH_3)_2$ |
| $L_{A4254}$ | $R_{B10}$ | H | N | $C(CH_3)_2$ |
| $L_{A4255}$ | $R_{A3}$ | H | N | $C(CH_3)_2$ |
| $L_{A4256}$ | $R_{A34}$ | H | N | $C(CH_3)_2$ |
| $L_{A4257}$ | H | H | N | $Si(CH_3)_2$ |
| $L_{A4258}$ | $R_{B1}$ | H | N | $Si(CH_3)_2$ |
| $L_{A4259}$ | $R_{B3}$ | H | N | $Si(CH_3)_2$ |
| $L_{A4260}$ | $R_{B4}$ | H | N | $Si(CH_3)_2$ |
| $L_{A4261}$ | $R_{B7}$ | H | N | $Si(CH_3)_2$ |
| $L_{A4262}$ | $R_{B10}$ | H | N | $Si(CH_3)_2$ |
| $L_{A4263}$ | $R_{A3}$ | H | N | $Si(CH_3)_2$ |
| $L_{A4264}$ | $R_{A34}$ | H | N | $Si(CH_3)_2$ |
| $L_{A4265}$ | H | $R_{B1}$ | N | S |
| $L_{A4266}$ | $R_{B1}$ | $R_{B1}$ | N | S |
| $L_{A4267}$ | $R_{B3}$ | $R_{B1}$ | N | S |
| $L_{A4268}$ | $R_{B4}$ | $R_{B1}$ | N | S |
| $L_{A4269}$ | $R_{B7}$ | $R_{B1}$ | N | S |
| $L_{A4270}$ | $R_{B10}$ | $R_{B1}$ | N | S |
| $L_{A4271}$ | $R_{A3}$ | $R_{B1}$ | N | S |
| $L_{A4272}$ | $R_{A34}$ | $R_{B1}$ | N | S |
| $L_{A4273}$ | H | $R_{B1}$ | N | O |
| $L_{A4274}$ | $R_{B1}$ | $R_{B1}$ | N | O |
| $L_{A4275}$ | $R_{B3}$ | $R_{B1}$ | N | O |
| $L_{A4276}$ | $R_{B4}$ | $R_{B1}$ | N | O |
| $L_{A4277}$ | $R_{B7}$ | $R_{B1}$ | N | O |
| $L_{A4278}$ | $R_{B10}$ | $R_{B1}$ | N | O |
| $L_{A4279}$ | $R_{A3}$ | $R_{B1}$ | N | O |
| $L_{A4280}$ | $R_{A34}$ | $R_{B1}$ | N | O |
| $L_{A4281}$ | H | $R_{B1}$ | N | $NCH_3$ |
| $L_{A4282}$ | $R_{B1}$ | $R_{B1}$ | N | $NCH_3$ |
| $L_{A4283}$ | $R_{B3}$ | $R_{B1}$ | N | $NCH_3$ |
| $L_{A4284}$ | $R_{B4}$ | $R_{B1}$ | N | $NCH_3$ |
| $L_{A4285}$ | $R_{B7}$ | $R_{B1}$ | N | $NCH_3$ |
| $L_{A4286}$ | $R_{B10}$ | $R_{B1}$ | N | $NCH_3$ |
| $L_{A4287}$ | $R_{A3}$ | $R_{B1}$ | N | $NCH_3$ |
| $L_{A4288}$ | $R_{A34}$ | $R_{B1}$ | N | $NCH_3$ |
| $L_{A4289}$ | H | $R_{B1}$ | N | $C(CH_3)_2$ |
| $L_{A4290}$ | $R_{B1}$ | $R_{B1}$ | N | $C(CH_3)_2$ |
| $L_{A4291}$ | $R_{B3}$ | $R_{B1}$ | N | $C(CH_3)_2$ |
| $L_{A4292}$ | $R_{B4}$ | $R_{B1}$ | N | $C(CH_3)_2$ |
| $L_{A4293}$ | $R_{B7}$ | $R_{B1}$ | N | $C(CH_3)_2$ |
| $L_{A4294}$ | $R_{B10}$ | $R_{B1}$ | N | $C(CH_3)_2$ |
| $L_{A4295}$ | $R_{A3}$ | $R_{B1}$ | N | $C(CH_3)_2$ |
| $L_{A4296}$ | $R_{A34}$ | $R_{B1}$ | N | $C(CH_3)_2$ |
| $L_{A4297}$ | H | $R_{B1}$ | N | $Si(CH_3)_2$ |
| $L_{A4298}$ | $R_{B1}$ | $R_{B1}$ | N | $Si(CH_3)_2$ |
| $L_{A4299}$ | $R_{B3}$ | $R_{B1}$ | N | $Si(CH_3)_2$ |
| $L_{A4300}$ | $R_{B4}$ | $R_{B1}$ | N | $Si(CH_3)_2$ |
| $L_{A4301}$ | $R_{B7}$ | $R_{B1}$ | N | $Si(CH_3)_2$ |
| $L_{A4302}$ | $R_{B10}$ | $R_{B1}$ | N | $Si(CH_3)_2$ |
| $L_{A4303}$ | $R_{A3}$ | $R_{B1}$ | N | $Si(CH_3)_2$ |
| $L_{A4304}$ | $R_{A34}$ | $R_{B1}$ | N | $Si(CH_3)_2$ |
| $L_{A4305}$ | H | $R_{B6}$ | N | S |
| $L_{A4306}$ | $R_{B1}$ | $R_{B6}$ | N | S |
| $L_{A4307}$ | $R_{B3}$ | $R_{B6}$ | N | S |

-continued

| Ligand | $R^1$ | $R^5$ | X | Y |
|---|---|---|---|---|
| $L_{A4308}$ | $R_{B4}$ | $R_{B6}$ | N | S |
| $L_{A4309}$ | $R_{B7}$ | $R_{B6}$ | N | S |
| $L_{A4310}$ | $R_{B10}$ | $R_{B6}$ | N | S |
| $L_{A4311}$ | $R_{A3}$ | $R_{B6}$ | N | S |
| $L_{A4312}$ | $R_{A34}$ | $R_{B6}$ | N | S |
| $L_{A4313}$ | H | $R_{B6}$ | N | O |
| $L_{A4314}$ | $R_{B1}$ | $R_{B6}$ | N | O |
| $L_{A4315}$ | $R_{B3}$ | $R_{B6}$ | N | O |
| $L_{A4316}$ | $R_{B4}$ | $R_{B6}$ | N | O |
| $L_{A4317}$ | $R_{B7}$ | $R_{B6}$ | N | O |
| $L_{A4318}$ | $R_{B10}$ | $R_{B6}$ | N | O |
| $L_{A4319}$ | $R_{A3}$ | $R_{B6}$ | N | O |
| $L_{A4320}$ | $R_{A34}$ | $R_{B6}$ | N | O |
| $L_{A4321}$ | H | $R_{B6}$ | N | $NCH_3$ |
| $L_{A4322}$ | $R_{B1}$ | $R_{B6}$ | N | $NCH_3$ |
| $L_{A4323}$ | $R_{B3}$ | $R_{B6}$ | N | $NCH_3$ |
| $L_{A4324}$ | $R_{B4}$ | $R_{B6}$ | N | $NCH_3$ |
| $L_{A4325}$ | $R_{B7}$ | $R_{B6}$ | N | $NCH_3$ |
| $L_{A4326}$ | $R_{B10}$ | $R_{B6}$ | N | $NCH_3$ |
| $L_{A4327}$ | $R_{A3}$ | $R_{B6}$ | N | $NCH_3$ |
| $L_{A4328}$ | $R_{A34}$ | $R_{B6}$ | N | $NCH_3$ |
| $L_{A4329}$ | H | $R_{B6}$ | N | $C(CH_3)_2$ |
| $L_{A4330}$ | $R_{B1}$ | $R_{B6}$ | N | $C(CH_3)_2$ |
| $L_{A4331}$ | $R_{B3}$ | $R_{B6}$ | N | $C(CH_3)_2$ |
| $L_{A4332}$ | $R_{B4}$ | $R_{B6}$ | N | $C(CH_3)_2$ |
| $L_{A4333}$ | $R_{B7}$ | $R_{B6}$ | N | $C(CH_3)_2$ |
| $L_{A4334}$ | $R_{B10}$ | $R_{B6}$ | N | $C(CH_3)_2$ |
| $L_{A4335}$ | $R_{A3}$ | $R_{B6}$ | N | $C(CH_3)_2$ |
| $L_{A4336}$ | $R_{A34}$ | $R_{B6}$ | N | $C(CH_3)_2$ |
| $L_{A4337}$ | H | $R_{B6}$ | N | $Si(CH_3)_2$ |
| $L_{A4338}$ | $R_{B1}$ | $R_{B6}$ | N | $Si(CH_3)_2$ |
| $L_{A4339}$ | $R_{B3}$ | $R_{B6}$ | N | $Si(CH_3)_2$ |
| $L_{A4340}$ | $R_{B4}$ | $R_{B6}$ | N | $Si(CH_3)_2$ |
| $L_{A4341}$ | $R_{B7}$ | $R_{B6}$ | N | $Si(CH_3)_2$ |
| $L_{A4342}$ | $R_{B10}$ | $R_{B6}$ | N | $Si(CH_3)_2$ |
| $L_{A4343}$ | $R_{A3}$ | $R_{B6}$ | N | $Si(CH_3)_2$ |
| $L_{A4344}$ | $R_{A34}$ | $R_{B6}$ | N | $Si(CH_3)_2$ |

wherein $L_{A4345}$ through $L_{A4464}$ have a structure of Formula XXX:

Formula XXX

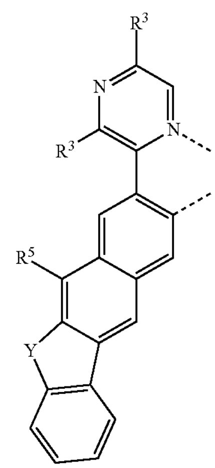

, wherein $R^3$, $R^5$, and Y are defined as provided below:

| Ligand | $R^5$ | $R^3$ | Y |
|---|---|---|---|
| $L_{A4345}$ | H | H | S |
| $L_{A4346}$ | H | $R_{B1}$ | S |
| $L_{A4347}$ | H | $R_{B2}$ | S |
| $L_{A4348}$ | H | $R_{B3}$ | S |

-continued

| Ligand | $R^5$ | $R^3$ | Y |
|---|---|---|---|
| $L_{A4349}$ | H | $R_{B4}$ | S |
| $L_{A4350}$ | H | $R_{B5}$ | S |
| $L_{A4351}$ | H | $R_{A34}$ | S |
| $L_{A4352}$ | H | $R_{A52}$ | S |
| $L_{A4353}$ | H | H | O |
| $L_{A4354}$ | H | $R_{B1}$ | O |
| $L_{A4355}$ | H | $R_{B2}$ | O |
| $L_{A4356}$ | H | $R_{B3}$ | O |
| $L_{A4357}$ | H | $R_{B4}$ | O |
| $L_{A4358}$ | H | $R_{B5}$ | O |
| $L_{A4359}$ | H | $R_{A34}$ | O |
| $L_{A4360}$ | H | $R_{A52}$ | O |
| $L_{A4361}$ | H | H | $NCH_3$ |
| $L_{A4362}$ | H | $R_{B1}$ | $NCH_3$ |
| $L_{A4363}$ | H | $R_{B2}$ | $NCH_3$ |
| $L_{A4364}$ | H | $R_{B3}$ | $NCH_3$ |
| $L_{A4365}$ | H | $R_{B4}$ | $NCH_3$ |
| $L_{A4366}$ | H | $R_{B5}$ | $NCH_3$ |
| $L_{A4367}$ | H | $R_{A34}$ | $NCH_3$ |
| $L_{A4368}$ | H | $R_{A52}$ | $NCH_3$ |
| $L_{A4369}$ | H | H | $C(CH_3)_2$ |
| $L_{A4370}$ | H | $R_{B1}$ | $C(CH_3)_2$ |
| $L_{A4371}$ | H | $R_{B2}$ | $C(CH_3)_2$ |
| $L_{A4372}$ | H | $R_{B3}$ | $C(CH_3)_2$ |
| $L_{A4373}$ | H | $R_{B4}$ | $C(CH_3)_2$ |
| $L_{A4374}$ | H | $R_{B5}$ | $C(CH_3)_2$ |
| $L_{A4375}$ | H | $R_{A34}$ | $C(CH_3)_2$ |
| $L_{A4376}$ | H | $R_{A52}$ | $C(CH_3)_2$ |
| $L_{A4377}$ | H | H | $Si(CH_3)_2$ |
| $L_{A4378}$ | H | $R_{B1}$ | $Si(CH_3)_2$ |
| $L_{A4379}$ | H | $R_{B2}$ | $Si(CH_3)_2$ |
| $L_{A4380}$ | H | $R_{B3}$ | $Si(CH_3)_2$ |
| $L_{A4381}$ | H | $R_{B4}$ | $Si(CH_3)_2$ |
| $L_{A4382}$ | H | $R_{B5}$ | $Si(CH_3)_2$ |
| $L_{A4383}$ | H | $R_{A34}$ | $Si(CH_3)_2$ |
| $L_{A4384}$ | H | $R_{A52}$ | $Si(CH_3)_2$ |
| $L_{A4385}$ | $R_{B1}$ | H | S |
| $L_{A4386}$ | $R_{B1}$ | $R_{B1}$ | S |
| $L_{A4387}$ | $R_{B1}$ | $R_{B2}$ | S |
| $L_{A4388}$ | $R_{B1}$ | $R_{B3}$ | S |
| $L_{A4389}$ | $R_{B1}$ | $R_{B4}$ | S |
| $L_{A4390}$ | $R_{B1}$ | $R_{B5}$ | S |
| $L_{A4391}$ | $R_{B1}$ | $R_{A34}$ | S |
| $L_{A4392}$ | $R_{B1}$ | $R_{A52}$ | S |
| $L_{A4393}$ | $R_{B1}$ | H | O |
| $L_{A4394}$ | $R_{B1}$ | $R_{B1}$ | O |
| $L_{A4395}$ | $R_{B1}$ | $R_{B2}$ | O |
| $L_{A4396}$ | $R_{B1}$ | $R_{B3}$ | O |
| $L_{A4397}$ | $R_{B1}$ | $R_{B4}$ | O |
| $L_{A4398}$ | $R_{B1}$ | $R_{B5}$ | O |
| $L_{A4399}$ | $R_{B1}$ | $R_{A34}$ | O |
| $L_{A4400}$ | $R_{B1}$ | $R_{A52}$ | O |
| $L_{A4401}$ | $R_{B1}$ | H | $NCH_3$ |
| $L_{A4402}$ | $R_{B1}$ | $R_{B1}$ | $NCH_3$ |
| $L_{A4403}$ | $R_{B1}$ | $R_{B2}$ | $NCH_3$ |
| $L_{A4404}$ | $R_{B1}$ | $R_{B3}$ | $NCH_3$ |
| $L_{A4405}$ | $R_{B1}$ | $R_{B4}$ | $NCH_3$ |
| $L_{A4406}$ | $R_{B1}$ | $R_{B5}$ | $NCH_3$ |
| $L_{A4407}$ | $R_{B1}$ | $R_{A34}$ | $NCH_3$ |
| $L_{A4408}$ | $R_{B1}$ | $R_{A52}$ | $NCH_3$ |
| $L_{A4409}$ | $R_{B1}$ | H | $C(CH_3)_2$ |
| $L_{A4410}$ | $R_{B1}$ | $R_{B1}$ | $C(CH_3)_2$ |
| $L_{A4411}$ | $R_{B1}$ | $R_{B2}$ | $C(CH_3)_2$ |
| $L_{A4412}$ | $R_{B1}$ | $R_{B3}$ | $C(CH_3)_2$ |
| $L_{A4413}$ | $R_{B1}$ | $R_{B4}$ | $C(CH_3)_2$ |
| $L_{A4414}$ | $R_{B1}$ | $R_{B5}$ | $C(CH_3)_2$ |
| $L_{A4415}$ | $R_{B1}$ | $R_{A34}$ | $C(CH_3)_2$ |
| $L_{A4416}$ | $R_{B1}$ | $R_{A52}$ | $C(CH_3)_2$ |
| $L_{A4417}$ | $R_{B1}$ | H | $Si(CH_3)_2$ |
| $L_{A4418}$ | $R_{B1}$ | $R_{B1}$ | $Si(CH_3)_2$ |
| $L_{A4419}$ | $R_{B1}$ | $R_{B2}$ | $Si(CH_3)_2$ |
| $L_{A4420}$ | $R_{B1}$ | $R_{B3}$ | $Si(CH_3)_2$ |
| $L_{A4421}$ | $R_{B1}$ | $R_{B4}$ | $Si(CH_3)_2$ |
| $L_{A4422}$ | $R_{B1}$ | $R_{B5}$ | $Si(CH_3)_2$ |
| $L_{A4423}$ | $R_{B1}$ | $R_{A34}$ | $Si(CH_3)_2$ |
| $L_{A4424}$ | $R_{B1}$ | $R_{A52}$ | $Si(CH_3)_2$ |
| $L_{A4425}$ | $R_{B6}$ | H | S |

-continued

| Ligand | $R^5$ | $R^3$ | Y |
|---|---|---|---|
| $L_{A4426}$ | $R_{B6}$ | $R_{B1}$ | S |
| $L_{A4427}$ | $R_{B6}$ | $R_{B2}$ | S |
| $L_{A4428}$ | $R_{B6}$ | $R_{B3}$ | S |
| $L_{A4429}$ | $R_{B6}$ | $R_{B4}$ | S |
| $L_{A4430}$ | $R_{B6}$ | $R_{B5}$ | S |
| $L_{A4431}$ | $R_{B6}$ | $R_{A34}$ | S |
| $L_{A4432}$ | $R_{B6}$ | $R_{A52}$ | S |
| $L_{A4433}$ | $R_{B6}$ | H | O |
| $L_{A4434}$ | $R_{B6}$ | $R_{B1}$ | O |
| $L_{A4435}$ | $R_{B6}$ | $R_{B2}$ | O |
| $L_{A4436}$ | $R_{B6}$ | $R_{B3}$ | O |
| $L_{A4437}$ | $R_{B6}$ | $R_{B4}$ | O |
| $L_{A4438}$ | $R_{B6}$ | $R_{B5}$ | O |
| $L_{A4439}$ | $R_{B6}$ | $R_{A34}$ | O |
| $L_{A4440}$ | $R_{B6}$ | $R_{A52}$ | O |
| $L_{A4441}$ | $R_{B6}$ | H | $NCH_3$ |
| $L_{A4442}$ | $R_{B6}$ | $R_{B1}$ | $NCH_3$ |
| $L_{A4443}$ | $R_{B6}$ | $R_{B2}$ | $NCH_3$ |
| $L_{A4444}$ | $R_{B6}$ | $R_{B3}$ | $NCH_3$ |
| $L_{A4445}$ | $R_{B6}$ | $R_{B4}$ | $NCH_3$ |
| $L_{A4446}$ | $R_{B6}$ | $R_{B5}$ | $NCH_3$ |
| $L_{A4447}$ | $R_{B6}$ | $R_{A34}$ | $NCH_3$ |
| $L_{A4448}$ | $R_{B6}$ | $R_{A52}$ | $NCH_3$ |
| $L_{A4449}$ | $R_{B6}$ | H | $C(CH_3)_2$ |
| $L_{A4450}$ | $R_{B6}$ | $R_{B1}$ | $C(CH_3)_2$ |
| $L_{A4451}$ | $R_{B6}$ | $R_{B2}$ | $C(CH_3)_2$ |
| $L_{A4452}$ | $R_{B6}$ | $R_{B3}$ | $C(CH_3)_2$ |
| $L_{A4453}$ | $R_{B6}$ | $R_{B4}$ | $C(CH_3)_2$ |
| $L_{A4454}$ | $R_{B6}$ | $R_{B5}$ | $C(CH_3)_2$ |
| $L_{A4455}$ | $R_{B6}$ | $R_{A34}$ | $C(CH_3)_2$ |
| $L_{A4456}$ | $R_{B6}$ | $R_{A52}$ | $C(CH_3)_2$ |
| $L_{A4457}$ | $R_{B6}$ | H | $Si(CH_3)_2$ |
| $L_{A4458}$ | $R_{B6}$ | $R_{B1}$ | $Si(CH_3)_2$ |
| $L_{A4459}$ | $R_{B6}$ | $R_{B2}$ | $Si(CH_3)_2$ |
| $L_{A4460}$ | $R_{B6}$ | $R_{B3}$ | $Si(CH_3)_2$ |
| $L_{A4461}$ | $R_{B6}$ | $R_{B4}$ | $Si(CH_3)_2$ |
| $L_{A4462}$ | $R_{B6}$ | $R_{B5}$ | $Si(CH_3)_2$ |
| $L_{A4463}$ | $R_{B6}$ | $R_{A34}$ | $Si(CH_3)_2$ |
| $L_{A4464}$ | $R_{B6}$ | $R_{A52}$ | $Si(CH_3)_2$ |

wherein $L_{A4465}$ through $L_{A4560}$ have a structure of Formula XXXI:

Formula XXXI

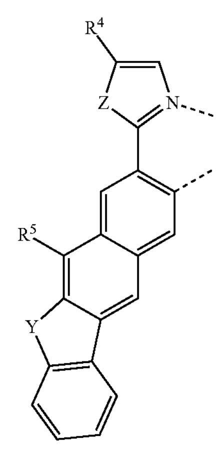

, wherein $R^4$, $R^5$, Y, and Z are defined as provided below:

| Ligand | $R^5$ | $R^4$ | Y | Z |
|---|---|---|---|---|
| $L_{A4465}$ | H | H | S | S |
| $L_{A4466}$ | H | $R_{B1}$ | S | S |
| $L_{A4467}$ | H | $R_{B3}$ | S | S |

-continued

| Ligand | $R^5$ | $R^4$ | Y | Z |
|---|---|---|---|---|
| $L_{A4468}$ | H | $R_{B4}$ | S | S |
| $L_{A4469}$ | H | $R_{B7}$ | S | S |
| $L_{A4470}$ | H | $R_{B10}$ | S | S |
| $L_{A4471}$ | H | $R_{A3}$ | S | S |
| $L_{A4472}$ | H | $R_{A34}$ | S | S |
| $L_{A4473}$ | H | H | S | O |
| $L_{A4474}$ | H | $R_{B1}$ | S | O |
| $L_{A4475}$ | H | $R_{B3}$ | S | O |
| $L_{A4476}$ | H | $R_{B4}$ | S | O |
| $L_{A4477}$ | H | $R_{B7}$ | S | O |
| $L_{A4478}$ | H | $R_{B10}$ | S | O |
| $L_{A4479}$ | H | $R_{A3}$ | S | O |
| $L_{A4480}$ | H | $R_{A34}$ | S | O |
| $L_{A4481}$ | H | H | S | $NCH_3$ |
| $L_{A4482}$ | H | $R_{B1}$ | S | $NCH_3$ |
| $L_{A4483}$ | H | $R_{B3}$ | S | $NCH_3$ |
| $L_{A4484}$ | H | $R_{B4}$ | S | $NCH_3$ |
| $L_{A4485}$ | H | $R_{B7}$ | S | $NCH_3$ |
| $L_{A4486}$ | H | $R_{B10}$ | S | $NCH_3$ |
| $L_{A4487}$ | H | $R_{A3}$ | S | $NCH_3$ |
| $L_{A4488}$ | H | $R_{A34}$ | S | $NCH_3$ |
| $L_{A4489}$ | H | H | O | S |
| $L_{A4490}$ | H | $R_{B1}$ | O | S |
| $L_{A4491}$ | H | $R_{B3}$ | O | S |
| $L_{A4492}$ | H | $R_{B4}$ | O | S |
| $L_{A4493}$ | H | $R_{B7}$ | O | S |
| $L_{A4494}$ | H | $R_{B10}$ | O | S |
| $L_{A4495}$ | H | $R_{A3}$ | O | S |
| $L_{A4496}$ | H | $R_{A34}$ | O | S |
| $L_{A4497}$ | H | H | O | O |
| $L_{A4498}$ | H | $R_{B1}$ | O | O |
| $L_{A4499}$ | H | $R_{B3}$ | O | O |
| $L_{A4500}$ | H | $R_{B4}$ | O | O |
| $L_{A4501}$ | H | $R_{B7}$ | O | O |
| $L_{A4502}$ | H | $R_{B10}$ | O | O |
| $L_{A4503}$ | H | $R_{A3}$ | O | O |
| $L_{A4504}$ | H | $R_{A34}$ | O | O |
| $L_{A4505}$ | H | H | O | $NCH_3$ |
| $L_{A4506}$ | H | $R_{B1}$ | O | $NCH_3$ |
| $L_{A4507}$ | H | $R_{B3}$ | O | $NCH_3$ |
| $L_{A4508}$ | H | $R_{B4}$ | O | $NCH_3$ |
| $L_{A4509}$ | H | $R_{B7}$ | O | $NCH_3$ |
| $L_{A4510}$ | H | $R_{B10}$ | O | $NCH_3$ |
| $L_{A4511}$ | H | $R_{A3}$ | O | $NCH_3$ |
| $L_{A4512}$ | H | $R_{A34}$ | O | $NCH_3$ |
| $L_{A4513}$ | $R_{B6}$ | H | S | S |
| $L_{A4514}$ | $R_{B6}$ | $R_{B1}$ | S | S |
| $L_{A4515}$ | $R_{B6}$ | $R_{B3}$ | S | S |
| $L_{A4516}$ | $R_{B6}$ | $R_{B4}$ | S | S |
| $L_{A4517}$ | $R_{B6}$ | $R_{B7}$ | S | S |
| $L_{A4518}$ | $R_{B6}$ | $R_{B10}$ | S | S |
| $L_{A4519}$ | $R_{B6}$ | $R_{A3}$ | S | S |
| $L_{A4520}$ | $R_{B6}$ | $R_{A34}$ | S | S |
| $L_{A4521}$ | $R_{B6}$ | H | S | O |
| $L_{A4522}$ | $R_{B6}$ | $R_{B1}$ | S | O |
| $L_{A4523}$ | $R_{B6}$ | $R_{B3}$ | S | O |
| $L_{A4524}$ | $R_{B6}$ | $R_{B4}$ | S | O |
| $L_{A4525}$ | $R_{B6}$ | $R_{B7}$ | S | O |
| $L_{A4526}$ | $R_{B6}$ | $R_{B10}$ | S | O |
| $L_{A4527}$ | $R_{B6}$ | $R_{A3}$ | S | O |
| $L_{A4528}$ | $R_{B6}$ | $R_{A34}$ | S | O |
| $L_{A4529}$ | $R_{B6}$ | H | S | $NCH_3$ |
| $L_{A4530}$ | $R_{B6}$ | $R_{B1}$ | S | $NCH_3$ |
| $L_{A4531}$ | $R_{B6}$ | $R_{B3}$ | S | $NCH_3$ |
| $L_{A4532}$ | $R_{B6}$ | $R_{B4}$ | S | $NCH_3$ |
| $L_{A4533}$ | $R_{B6}$ | $R_{B7}$ | S | $NCH_3$ |
| $L_{A4534}$ | $R_{B6}$ | $R_{B10}$ | S | $NCH_3$ |
| $L_{A4535}$ | $R_{B6}$ | $R_{A3}$ | S | $NCH_3$ |
| $L_{A4536}$ | $R_{B6}$ | $R_{A34}$ | S | $NCH_3$ |
| $L_{A4537}$ | $R_{B6}$ | H | O | S |
| $L_{A4538}$ | $R_{B6}$ | $R_{B1}$ | O | S |
| $L_{A4539}$ | $R_{B6}$ | $R_{B3}$ | O | S |
| $L_{A4540}$ | $R_{B6}$ | $R_{B4}$ | O | S |
| $L_{A4541}$ | $R_{B6}$ | $R_{B7}$ | O | S |
| $L_{A4542}$ | $R_{B6}$ | $R_{B10}$ | O | S |
| $L_{A4543}$ | $R_{B6}$ | $R_{A3}$ | O | S |
| $L_{A4544}$ | $R_{B6}$ | $R_{A34}$ | O | S |

-continued

| Ligand | $R^5$ | $R^4$ | Y | Z |
|---|---|---|---|---|
| $L_{A4545}$ | $R_{B6}$ | H | O | O |
| $L_{A4546}$ | $R_{B6}$ | $R_{B1}$ | O | O |
| $L_{A4547}$ | $R_{B6}$ | $R_{B3}$ | O | O |
| $L_{A4548}$ | $R_{B6}$ | $R_{B4}$ | O | O |
| $L_{A4549}$ | $R_{B6}$ | $R_{B7}$ | O | O |
| $L_{A4550}$ | $R_{B6}$ | $R_{B10}$ | O | O |
| $L_{A4551}$ | $R_{B6}$ | $R_{A3}$ | O | O |
| $L_{A4552}$ | $R_{B6}$ | $R_{A34}$ | O | O |
| $L_{A4553}$ | $R_{B6}$ | H | O | $NCH_3$ |
| $L_{A4554}$ | $R_{B6}$ | $R_{B1}$ | O | $NCH_3$ |
| $L_{A4555}$ | $R_{B6}$ | $R_{B3}$ | O | $NCH_3$ |
| $L_{A4556}$ | $R_{B6}$ | $R_{B4}$ | O | $NCH_3$ |
| $L_{A4557}$ | $R_{B6}$ | $R_{B7}$ | O | $NCH_3$ |
| $L_{A4558}$ | $R_{B6}$ | $R_{B10}$ | O | $NCH_3$ |
| $L_{A4559}$ | $R_{B6}$ | $R_{A3}$ | O | $NCH_3$ |
| $L_{A4560}$ | $R_{B6}$ | $R_{A34}$ | O | $NCH_3$ |

wherein $L_{A4561}$ through $L_{A4780}$ have a structure of Formula XXXII:

Formula XXXII

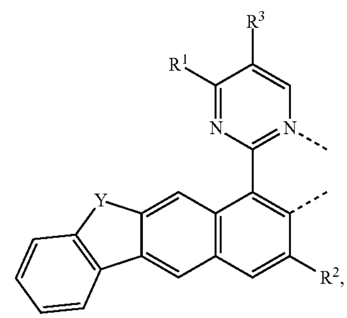

wherein $R^1$, $R^2$, $R^3$, and Y are defined as provided below:

| Ligand | $R^1$ | $R^3$ | $R^2$ | Y |
|---|---|---|---|---|
| $L_{A4561}$ | H | H | H | O |
| $L_{A4562}$ | $R_{B1}$ | $R_{B1}$ | H | O |
| $L_{A4563}$ | $R_{B3}$ | $R_{B3}$ | H | O |
| $L_{A4564}$ | $R_{B4}$ | $R_{B4}$ | H | O |
| $L_{A4565}$ | $R_{B7}$ | $R_{B7}$ | H | O |
| $L_{A4566}$ | $R_{B10}$ | $R_{B10}$ | H | O |
| $L_{A4567}$ | $R_{A3}$ | $R_{A3}$ | H | O |
| $L_{A4568}$ | $R_{A34}$ | $R_{A34}$ | H | O |
| $L_{A4569}$ | $R_{B1}$ | H | H | O |
| $L_{A4570}$ | $R_{B3}$ | H | H | O |
| $L_{A4571}$ | $R_{B4}$ | H | H | O |
| $L_{A4572}$ | $R_{B7}$ | H | H | O |
| $L_{A4573}$ | $R_{B10}$ | H | H | O |
| $L_{A4574}$ | $R_{A3}$ | H | H | O |
| $L_{A4575}$ | $R_{A34}$ | H | H | O |
| $L_{A4576}$ | H | $R_{B1}$ | H | O |
| $L_{A4577}$ | H | $R_{B3}$ | H | O |
| $L_{A4578}$ | H | $R_{B4}$ | H | O |
| $L_{A4579}$ | H | $R_{B7}$ | H | O |
| $L_{A4580}$ | H | $R_{B10}$ | H | O |
| $L_{A4581}$ | H | $R_{A3}$ | H | O |
| $L_{A4582}$ | H | $R_{A34}$ | H | O |
| $L_{A4583}$ | H | H | H | S |
| $L_{A4584}$ | $R_{B1}$ | $R_{B1}$ | H | S |
| $L_{A4585}$ | $R_{B3}$ | $R_{B3}$ | H | S |
| $L_{A4586}$ | $R_{B4}$ | $R_{B4}$ | H | S |
| $L_{A4587}$ | $R_{B7}$ | $R_{B7}$ | H | S |
| $L_{A4588}$ | $R_{B10}$ | $R_{B10}$ | H | S |
| $L_{A4589}$ | $R_{A3}$ | $R_{A3}$ | H | S |
| $L_{A4590}$ | $R_{A34}$ | $R_{A34}$ | H | S |
| $L_{A4591}$ | $R_{B1}$ | H | H | S |
| $L_{A4592}$ | $R_{B3}$ | H | H | S |

-continued

| Ligand | $R^1$ | $R^3$ | $R^2$ | Y |
|---|---|---|---|---|
| $L_{A4593}$ | $R_{B4}$ | H | H | S |
| $L_{A4594}$ | $R_{B7}$ | H | H | S |
| $L_{A4595}$ | $R_{B10}$ | H | H | S |
| $L_{A4596}$ | $R_{A3}$ | H | H | S |
| $L_{A4597}$ | $R_{A34}$ | H | H | S |
| $L_{A4598}$ | H | $R_{B1}$ | H | S |
| $L_{A4599}$ | H | $R_{B3}$ | H | S |
| $L_{A4600}$ | H | $R_{B4}$ | H | S |
| $L_{A4601}$ | H | $R_{B7}$ | H | S |
| $L_{A4602}$ | H | $R_{B10}$ | H | S |
| $L_{A4603}$ | H | $R_{A3}$ | H | S |
| $L_{A4604}$ | H | $R_{A34}$ | H | S |
| $L_{A4605}$ | H | H | H | $NCH_3$ |
| $L_{A4606}$ | $R_{B1}$ | $R_{B1}$ | H | $NCH_3$ |
| $L_{A4607}$ | $R_{B3}$ | $R_{B3}$ | H | $NCH_3$ |
| $L_{A4608}$ | $R_{B4}$ | $R_{B4}$ | H | $NCH_3$ |
| $L_{A4609}$ | $R_{B7}$ | $R_{B7}$ | H | $NCH_3$ |
| $L_{A4610}$ | $R_{B10}$ | $R_{B10}$ | H | $NCH_3$ |
| $L_{A4611}$ | $R_{A3}$ | $R_{A3}$ | H | $NCH_3$ |
| $L_{A4612}$ | $R_{A34}$ | $R_{A34}$ | H | $NCH_3$ |
| $L_{A4613}$ | $R_{B1}$ | H | H | $NCH_3$ |
| $L_{A4614}$ | $R_{B3}$ | H | H | $NCH_3$ |
| $L_{A4615}$ | $R_{B4}$ | H | H | $NCH_3$ |
| $L_{A4616}$ | $R_{B7}$ | H | H | $NCH_3$ |
| $L_{A4617}$ | $R_{B10}$ | H | H | $NCH_3$ |
| $L_{A4618}$ | $R_{A3}$ | H | H | $NCH_3$ |
| $L_{A4619}$ | $R_{A34}$ | H | H | $NCH_3$ |
| $L_{A4620}$ | H | $R_{B1}$ | H | $NCH_3$ |
| $L_{A4621}$ | H | $R_{B3}$ | H | $NCH_3$ |
| $L_{A4622}$ | H | $R_{B4}$ | H | $NCH_3$ |
| $L_{A4623}$ | H | $R_{B7}$ | H | $NCH_3$ |
| $L_{A4624}$ | H | $R_{B10}$ | H | $NCH_3$ |
| $L_{A4625}$ | H | $R_{A3}$ | H | $NCH_3$ |
| $L_{A4626}$ | H | $R_{A34}$ | H | $NCH_3$ |
| $L_{A4627}$ | H | H | H | $C(CH_3)_2$ |
| $L_{A4628}$ | $R_{B1}$ | $R_{B1}$ | H | $C(CH_3)_2$ |
| $L_{A4629}$ | $R_{B3}$ | $R_{B3}$ | H | $C(CH_3)_2$ |
| $L_{A4630}$ | $R_{B4}$ | $R_{B4}$ | H | $C(CH_3)_2$ |
| $L_{A4631}$ | $R_{B7}$ | $R_{B7}$ | H | $C(CH_3)_2$ |
| $L_{A4632}$ | $R_{B10}$ | $R_{B10}$ | H | $C(CH_3)_2$ |
| $L_{A4633}$ | $R_{A3}$ | $R_{A3}$ | H | $C(CH_3)_2$ |
| $L_{A4634}$ | $R_{A34}$ | $R_{A34}$ | H | $C(CH_3)_2$ |
| $L_{A4635}$ | $R_{B1}$ | H | H | $C(CH_3)_2$ |
| $L_{A4636}$ | $R_{B3}$ | H | H | $C(CH_3)_2$ |
| $L_{A4637}$ | $R_{B4}$ | H | H | $C(CH_3)_2$ |
| $L_{A4638}$ | $R_{B7}$ | H | H | $C(CH_3)_2$ |
| $L_{A4639}$ | $R_{B10}$ | H | H | $C(CH_3)_2$ |
| $L_{A4640}$ | $R_{A3}$ | H | H | $C(CH_3)_2$ |
| $L_{A4641}$ | $R_{A34}$ | H | H | $C(CH_3)_2$ |
| $L_{A4642}$ | H | $R_{B1}$ | H | $C(CH_3)_2$ |
| $L_{A4643}$ | H | $R_{B3}$ | H | $C(CH_3)_2$ |
| $L_{A4644}$ | H | $R_{B4}$ | H | $C(CH_3)_2$ |
| $L_{A4645}$ | H | $R_{B7}$ | H | $C(CH_3)_2$ |
| $L_{A4646}$ | H | $R_{B10}$ | H | $C(CH_3)_2$ |
| $L_{A4647}$ | H | $R_{A3}$ | H | $C(CH_3)_2$ |
| $L_{A4648}$ | H | $R_{A34}$ | H | $C(CH_3)_2$ |
| $L_{A4649}$ | H | H | H | $Si(CH_3)_2$ |
| $L_{A4650}$ | $R_{B1}$ | $R_{B1}$ | H | $Si(CH_3)_2$ |
| $L_{A4651}$ | $R_{B3}$ | $R_{B3}$ | H | $Si(CH_3)_2$ |
| $L_{A4652}$ | $R_{B4}$ | $R_{B4}$ | H | $Si(CH_3)_2$ |
| $L_{A4653}$ | $R_{B7}$ | $R_{B7}$ | H | $Si(CH_3)_2$ |
| $L_{A4654}$ | $R_{B10}$ | $R_{B10}$ | H | $Si(CH_3)_2$ |
| $L_{A4655}$ | $R_{A3}$ | $R_{A3}$ | H | $Si(CH_3)_2$ |
| $L_{A4656}$ | $R_{A34}$ | $R_{A34}$ | H | $Si(CH_3)_2$ |
| $L_{A4657}$ | $R_{B1}$ | H | H | $Si(CH_3)_2$ |
| $L_{A4658}$ | $R_{B3}$ | H | H | $Si(CH_3)_2$ |
| $L_{A4659}$ | $R_{B4}$ | H | H | $Si(CH_3)_2$ |
| $L_{A4660}$ | $R_{B7}$ | H | H | $Si(CH_3)_2$ |
| $L_{A4661}$ | $R_{B10}$ | H | H | $Si(CH_3)_2$ |
| $L_{A4662}$ | $R_{A3}$ | H | H | $Si(CH_3)_2$ |
| $L_{A4663}$ | $R_{A34}$ | H | H | $Si(CH_3)_2$ |
| $L_{A4664}$ | H | $R_{B1}$ | H | $Si(CH_3)_2$ |
| $L_{A4665}$ | H | $R_{B3}$ | H | $Si(CH_3)_2$ |
| $L_{A4666}$ | H | $R_{B4}$ | H | $Si(CH_3)_2$ |
| $L_{A4667}$ | H | $R_{B7}$ | H | $Si(CH_3)_2$ |
| $L_{A4668}$ | H | $R_{B10}$ | H | $Si(CH_3)_2$ |
| $L_{A4669}$ | H | $R_{A3}$ | H | $Si(CH_3)_2$ |

-continued

| Ligand | $R^1$ | $R^3$ | $R^2$ | Y |
|---|---|---|---|---|
| $L_{A4670}$ | H | $R_{A34}$ | H | $Si(CH_3)_2$ |
| $L_{A4671}$ | H | H | $R_{B1}$ | O |
| $L_{A4672}$ | $R_{B1}$ | $R_{B1}$ | $R_{B1}$ | O |
| $L_{A4673}$ | $R_{B3}$ | $R_{B3}$ | $R_{B1}$ | O |
| $L_{A4674}$ | $R_{B4}$ | $R_{B4}$ | $R_{B1}$ | O |
| $L_{A4675}$ | $R_{B7}$ | $R_{B7}$ | $R_{B1}$ | O |
| $L_{A4676}$ | $R_{B10}$ | $R_{B10}$ | $R_{B1}$ | O |
| $L_{A4677}$ | $R_{A3}$ | $R_{A3}$ | $R_{B1}$ | O |
| $L_{A4678}$ | $R_{A34}$ | $R_{A34}$ | $R_{B1}$ | O |
| $L_{A4679}$ | $R_{B1}$ | H | $R_{B1}$ | O |
| $L_{A4680}$ | $R_{B3}$ | H | $R_{B1}$ | O |
| $L_{A4681}$ | $R_{B4}$ | H | $R_{B1}$ | O |
| $L_{A4682}$ | $R_{B7}$ | H | $R_{B1}$ | O |
| $L_{A4683}$ | $R_{B10}$ | H | $R_{B1}$ | O |
| $L_{A4684}$ | $R_{A3}$ | H | $R_{B1}$ | O |
| $L_{A4685}$ | $R_{A34}$ | H | $R_{B1}$ | O |
| $L_{A4686}$ | H | $R_{B1}$ | $R_{B1}$ | O |
| $L_{A4687}$ | H | $R_{B3}$ | $R_{B1}$ | O |
| $L_{A4688}$ | H | $R_{B4}$ | $R_{B1}$ | O |
| $L_{A4689}$ | H | $R_{B7}$ | $R_{B1}$ | O |
| $L_{A4690}$ | H | $R_{B10}$ | $R_{B1}$ | O |
| $L_{A4691}$ | H | $R_{A3}$ | $R_{B1}$ | O |
| $L_{A4692}$ | H | $R_{A34}$ | $R_{B1}$ | O |
| $L_{A4693}$ | H | H | $R_{B1}$ | S |
| $L_{A4694}$ | $R_{B1}$ | $R_{B1}$ | $R_{B1}$ | S |
| $L_{A4695}$ | $R_{B3}$ | $R_{B3}$ | $R_{B1}$ | S |
| $L_{A4696}$ | $R_{B4}$ | $R_{B4}$ | $R_{B1}$ | S |
| $L_{A4697}$ | $R_{B7}$ | $R_{B7}$ | $R_{B1}$ | S |
| $L_{A4698}$ | $R_{B10}$ | $R_{B10}$ | $R_{B1}$ | S |
| $L_{A4699}$ | $R_{A3}$ | $R_{A3}$ | $R_{B1}$ | S |
| $L_{A4700}$ | $R_{A34}$ | $R_{A34}$ | $R_{B1}$ | S |
| $L_{A4701}$ | $R_{B1}$ | H | $R_{B1}$ | S |
| $L_{A4702}$ | $R_{B3}$ | H | $R_{B1}$ | S |
| $L_{A4703}$ | $R_{B4}$ | H | $R_{B1}$ | S |
| $L_{A4704}$ | $R_{B7}$ | H | $R_{B1}$ | S |
| $L_{A4705}$ | $R_{B10}$ | H | $R_{B1}$ | S |
| $L_{A4706}$ | $R_{A3}$ | H | $R_{B1}$ | S |
| $L_{A4707}$ | $R_{A34}$ | H | $R_{B1}$ | S |
| $L_{A4708}$ | H | $R_{B1}$ | $R_{B1}$ | S |
| $L_{A4709}$ | H | $R_{B3}$ | $R_{B1}$ | S |
| $L_{A4710}$ | H | $R_{B4}$ | $R_{B1}$ | S |
| $L_{A4711}$ | H | $R_{B7}$ | $R_{B1}$ | S |
| $L_{A4712}$ | H | $R_{B10}$ | $R_{B1}$ | S |
| $L_{A4713}$ | H | $R_{A3}$ | $R_{B1}$ | S |
| $L_{A4714}$ | H | $R_{A34}$ | $R_{B1}$ | S |
| $L_{A4715}$ | H | H | $R_{B1}$ | $NCH_3$ |
| $L_{A4716}$ | $R_{B1}$ | $R_{B1}$ | $R_{B1}$ | $NCH_3$ |
| $L_{A4717}$ | $R_{B3}$ | $R_{B3}$ | $R_{B1}$ | $NCH_3$ |
| $L_{A4718}$ | $R_{B4}$ | $R_{B4}$ | $R_{B1}$ | $NCH_3$ |
| $L_{A4719}$ | $R_{B7}$ | $R_{B7}$ | $R_{B1}$ | $NCH_3$ |
| $L_{A4720}$ | $R_{B10}$ | $R_{B10}$ | $R_{B1}$ | $NCH_3$ |
| $L_{A4721}$ | $R_{A3}$ | $R_{A3}$ | $R_{B1}$ | $NCH_3$ |
| $L_{A4722}$ | $R_{A34}$ | $R_{A34}$ | $R_{B1}$ | $NCH_3$ |
| $L_{A4723}$ | $R_{B1}$ | H | $R_{B1}$ | $NCH_3$ |
| $L_{A4724}$ | $R_{B3}$ | H | $R_{B1}$ | $NCH_3$ |
| $L_{A4725}$ | $R_{B4}$ | H | $R_{B1}$ | $NCH_3$ |
| $L_{A4726}$ | $R_{B7}$ | H | $R_{B1}$ | $NCH_3$ |
| $L_{A4727}$ | $R_{B10}$ | H | $R_{B1}$ | $NCH_3$ |
| $L_{A4728}$ | $R_{A3}$ | H | $R_{B1}$ | $NCH_3$ |
| $L_{A4729}$ | $R_{A34}$ | H | $R_{B1}$ | $NCH_3$ |
| $L_{A4730}$ | H | $R_{B1}$ | $R_{B1}$ | $NCH_3$ |
| $L_{A4731}$ | H | $R_{B3}$ | $R_{B1}$ | $NCH_3$ |
| $L_{A4732}$ | H | $R_{B4}$ | $R_{B1}$ | $NCH_3$ |
| $L_{A4733}$ | H | $R_{B7}$ | $R_{B1}$ | $NCH_3$ |
| $L_{A4734}$ | H | $R_{B10}$ | $R_{B1}$ | $NCH_3$ |
| $L_{A4735}$ | H | $R_{A3}$ | $R_{B1}$ | $NCH_3$ |
| $L_{A4736}$ | H | $R_{A34}$ | $R_{B1}$ | $NCH_3$ |
| $L_{A4737}$ | H | H | $R_{B1}$ | $C(CH_3)_2$ |
| $L_{A4738}$ | $R_{B1}$ | $R_{B1}$ | $R_{B1}$ | $C(CH_3)_2$ |
| $L_{A4739}$ | $R_{B3}$ | $R_{B3}$ | $R_{B1}$ | $C(CH_3)_2$ |
| $L_{A4740}$ | $R_{B4}$ | $R_{B4}$ | $R_{B1}$ | $C(CH_3)_2$ |
| $L_{A4741}$ | $R_{B7}$ | $R_{B7}$ | $R_{B1}$ | $C(CH_3)_2$ |
| $L_{A4742}$ | $R_{B10}$ | $R_{B10}$ | $R_{B1}$ | $C(CH_3)_2$ |
| $L_{A4743}$ | $R_{A3}$ | $R_{A3}$ | $R_{B1}$ | $C(CH_3)_2$ |
| $L_{A4744}$ | $R_{A34}$ | $R_{A34}$ | $R_{B1}$ | $C(CH_3)_2$ |
| $L_{A4745}$ | $R_{B1}$ | H | $R_{B1}$ | $C(CH_3)_2$ |
| $L_{A4746}$ | $R_{B3}$ | H | $R_{B1}$ | $C(CH_3)_2$ |

-continued

| Ligand | $R^1$ | $R^3$ | $R^2$ | Y |
|---|---|---|---|---|
| $L_{A4747}$ | $R_{B4}$ | H | $R_{B1}$ | $C(CH_3)_2$ |
| $L_{A4748}$ | $R_{B7}$ | H | $R_{B1}$ | $C(CH_3)_2$ |
| $L_{A4749}$ | $R_{B10}$ | H | $R_{B1}$ | $C(CH_3)_2$ |
| $L_{A4750}$ | $R_{A3}$ | H | $R_{B1}$ | $C(CH_3)_2$ |
| $L_{A4751}$ | $R_{A34}$ | H | $R_{B1}$ | $C(CH_3)_2$ |
| $L_{A4752}$ | H | $R_{B1}$ | $R_{B1}$ | $C(CH_3)_2$ |
| $L_{A4753}$ | H | $R_{B3}$ | $R_{B1}$ | $C(CH_3)_2$ |
| $L_{A4754}$ | H | $R_{B4}$ | $R_{B1}$ | $C(CH_3)_2$ |
| $L_{A4755}$ | H | $R_{B7}$ | $R_{B1}$ | $C(CH_3)_2$ |
| $L_{A4756}$ | H | $R_{B10}$ | $R_{B1}$ | $C(CH_3)_2$ |
| $L_{A4757}$ | H | $R_{A3}$ | $R_{B1}$ | $C(CH_3)_2$ |
| $L_{A4758}$ | H | $R_{A34}$ | $R_{B1}$ | $C(CH_3)_2$ |
| $L_{A4759}$ | H | H | $R_{B1}$ | $Si(CH_3)_2$ |
| $L_{A4760}$ | $R_{B1}$ | $R_{B1}$ | $R_{B1}$ | $Si(CH_3)_2$ |
| $L_{A4761}$ | $R_{B3}$ | $R_{B3}$ | $R_{B1}$ | $Si(CH_3)_2$ |
| $L_{A4762}$ | $R_{B4}$ | $R_{B4}$ | $R_{B1}$ | $Si(CH_3)_2$ |
| $L_{A4763}$ | $R_{B7}$ | $R_{B7}$ | $R_{B1}$ | $Si(CH_3)_2$ |
| $L_{A4764}$ | $R_{B10}$ | $R_{B10}$ | $R_{B1}$ | $Si(CH_3)_2$ |
| $L_{A4765}$ | $R_{A3}$ | $R_{A3}$ | $R_{B1}$ | $Si(CH_3)_2$ |
| $L_{A4766}$ | $R_{A34}$ | $R_{A34}$ | $R_{B1}$ | $Si(CH_3)_2$ |
| $L_{A4767}$ | $R_{B1}$ | H | $R_{B1}$ | $Si(CH_3)_2$ |
| $L_{A4768}$ | $R_{B3}$ | H | $R_{B1}$ | $Si(CH_3)_2$ |
| $L_{A4769}$ | $R_{B4}$ | H | $R_{B1}$ | $Si(CH_3)_2$ |
| $L_{A4770}$ | $R_{B7}$ | H | $R_{B1}$ | $Si(CH_3)_2$ |
| $L_{A4771}$ | $R_{B10}$ | H | $R_{B1}$ | $Si(CH_3)_2$ |
| $L_{A4772}$ | $R_{A3}$ | H | $R_{B1}$ | $Si(CH_3)_2$ |
| $L_{A4773}$ | $R_{A34}$ | H | $R_{B1}$ | $Si(CH_3)_2$ |
| $L_{A4774}$ | H | $R_{B1}$ | $R_{B1}$ | $Si(CH_3)_2$ |
| $L_{A4775}$ | H | $R_{B3}$ | $R_{B1}$ | $Si(CH_3)_2$ |
| $L_{A4776}$ | H | $R_{B4}$ | $R_{B1}$ | $Si(CH_3)_2$ |
| $L_{A4777}$ | H | $R_{B7}$ | $R_{B1}$ | $Si(CH_3)_2$ |
| $L_{A4778}$ | H | $R_{B10}$ | $R_{B1}$ | $Si(CH_3)_2$ |
| $L_{A4779}$ | H | $R_{A3}$ | $R_{B1}$ | $Si(CH_3)_2$ |
| $L_{A4780}$ | H | $R_{A34}$ | $R_{B1}$ | $Si(CH_3)_2$, |

wherein $R_{B1}$ to $R_{B23}$ have the following structures:

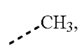

$R_{B1}$

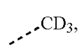

$R_{B2}$

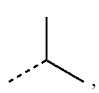

$R_{B3}$

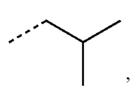

$R_{B4}$

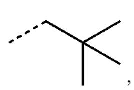

$R_{B5}$

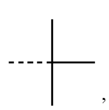

$R_{B6}$

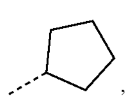

$R_{B7}$

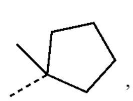

$R_{B8}$

-continued

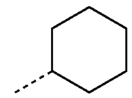

$R_{B9}$

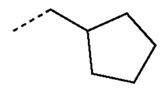

$R_{B10}$

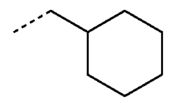

$R_{B11}$

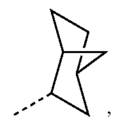

$R_{B12}$

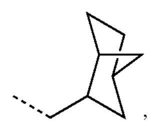

$R_{B13}$

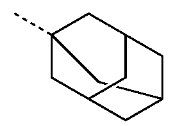

$R_{B14}$

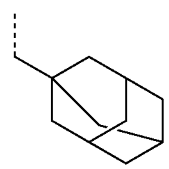

$R_{B15}$

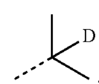

$R_{B16}$

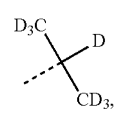

$R_{B17}$

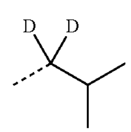

$R_{B18}$

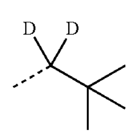

$R_{B19}$

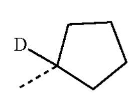

$R_{B20}$

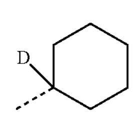

$R_{B21}$

-continued
$R_{B22}$
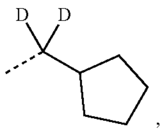
, and
$R_{B23}$
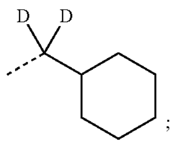
;
and
wherein $R_{A1}$ to $R_{A52}$ have the following structures:
$R_{A1}$
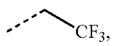
$R_{A2}$
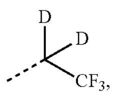
$R_{A3}$
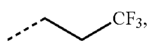
$R_{A4}$
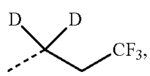
$R_{A5}$
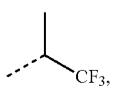
$R_{A6}$
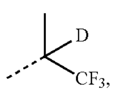
$R_{A7}$
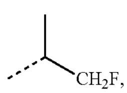
$R_{A8}$
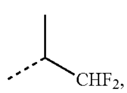
$R_{A9}$
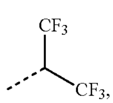
$R_{A10}$
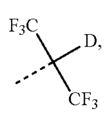
$R_{A11}$
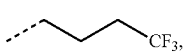
$R_{A12}$
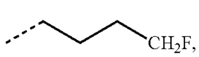
$R_{A13}$
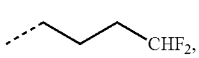
-continued
$R_{A14}$
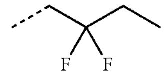
$R_{A15}$
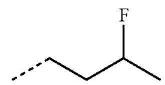
$R_{A16}$
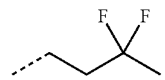
$R_{A17}$
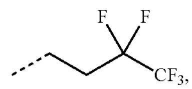
$R_{A18}$
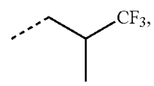
$R_{A19}$
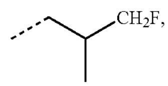
$R_{A20}$
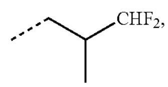
$R_{A21}$
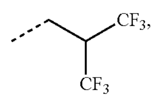
$R_{A22}$
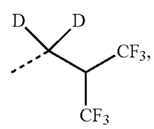
$R_{A23}$
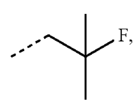
$R_{A24}$
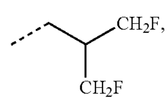
$R_{A25}$
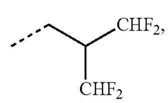
$R_{A26}$
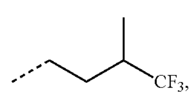
$R_{A27}$
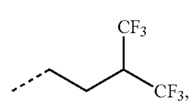
$R_{A28}$
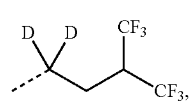

-continued
$R_{A29}$
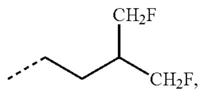
$R_{A30}$
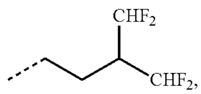
$R_{A31}$
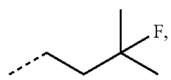
$R_{A32}$
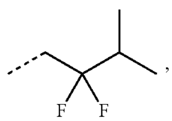
$R_{A33}$
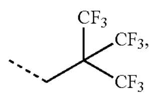
$R_{A34}$
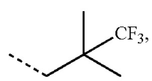
$R_{A35}$
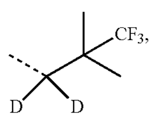
$R_{A36}$
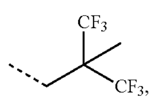
$R_{A37}$
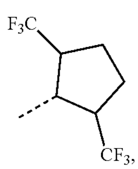
$R_{A38}$
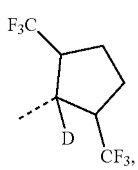
$R_{A39}$
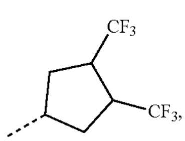
$R_{A40}$
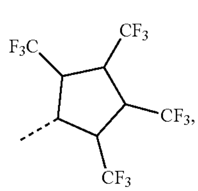
-continued
$R_{A41}$
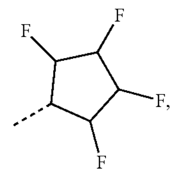
$R_{A42}$
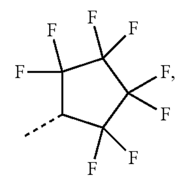
$R_{A43}$
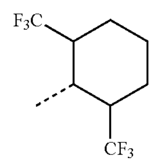
$R_{A44}$
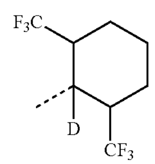
$R_{A45}$
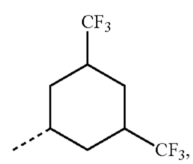
$R_{A46}$
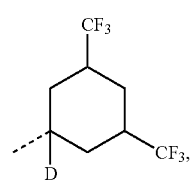
$R_{A47}$
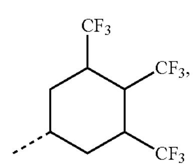
$R_{A48}$
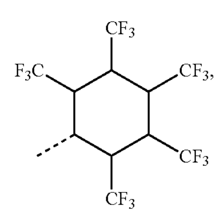

-continued $R_{A49}$

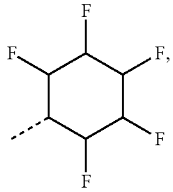

$R_{A50}$

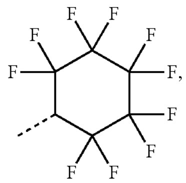

$R_{A51}$

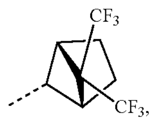

and $R_{A52}$

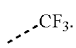

In some embodiments, the compound has a formula of $M(L_A)_x(L_B)_y(L_C)_z$ where $L_B$ and $L_C$ are each a bidentate ligand; x is 1, 2, or 3; y is 0, 1, or 2; z is 0, 1, or 2; and x+y+z is the oxidation state of the metal M.

In some embodiments, the compound has a formula selected from the group consisting of $Ir(L_A)_3$, $Ir(L_A)(L_B)_2$, $Ir(L_A)_2(L_B)$, $Ir(L_A)_2(L_C)$, and $Ir(L_A)(L_B)(L_C)$; and ligands $L_A$, $L_B$, and $L_C$ are different from each other.

In some embodiments, the compound has a formula of $Pt(L_A)(L_B)$, where $L_A$ and $L_B$ can be the same or different. In some such embodiments, $L_A$ and $L_B$ are connected to form a tetradentate ligand. In some such embodiments, $L_A$ and $L_B$ are connected at two places to form a macrocyclic tetradentate ligand.

In some embodiments where the compound has the formula $M(L_A)_x(L_B)_y(L_C)_z$, ligands $L_B$ and $L_C$ are each independently selected from the group consisting of

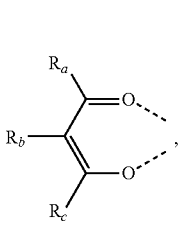

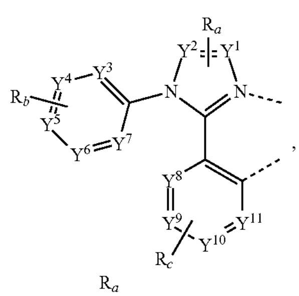

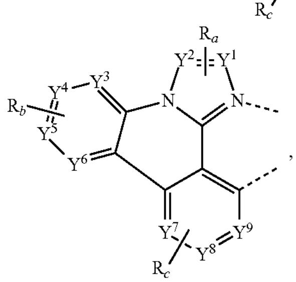

-continued

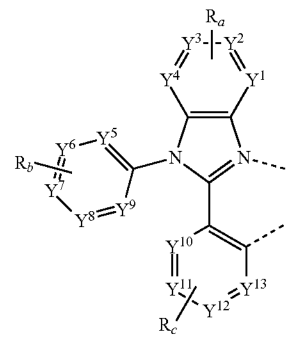

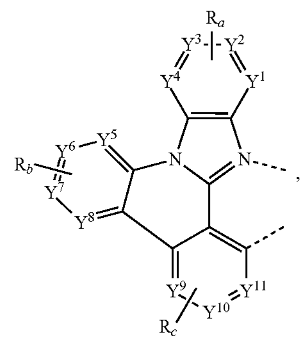

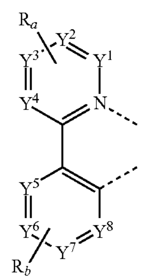

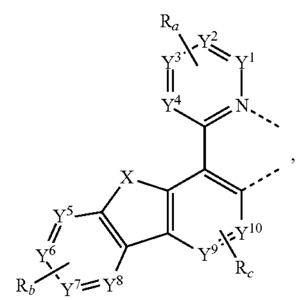

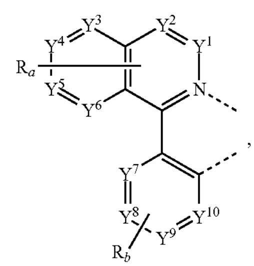

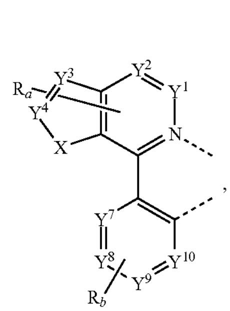

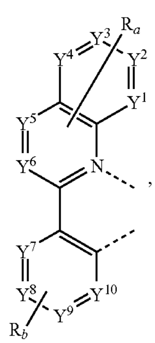

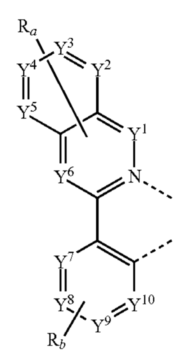

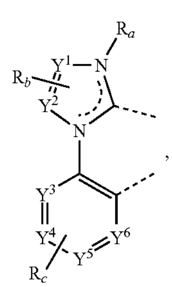

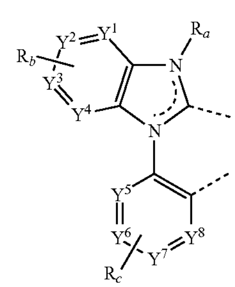

-continued

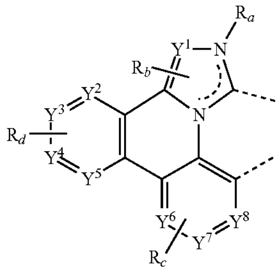

,

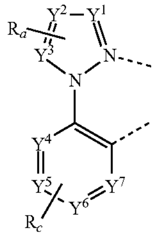

,

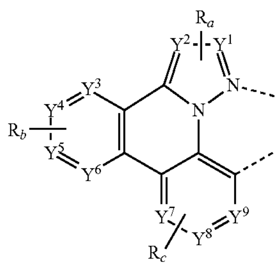

,

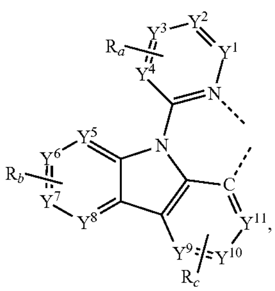

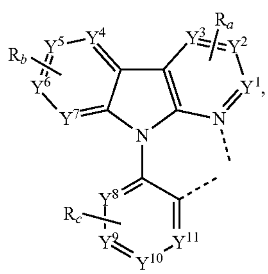

and

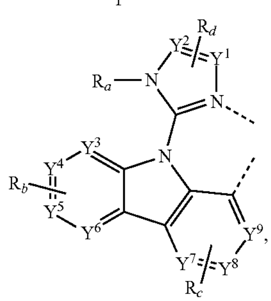

where:

each $Y^1$ to $Y^{13}$ is independently selected from the group consisting of carbon and nitrogen;

X is selected from the group consisting of BR', NR', PR', O, S, Se, C═O, S═O, $SO_2$, $CR^1R^2$, $SiR^1R^2$, and $GeR^1R^2$;

$R^1$ and $R^2$ are optionally fused or joined to form a ring;

each $R_a$, $R_b$, $R_c$, and $R_d$ may represent from mono substitution to the possible maximum number of substitution, or no substitution;

$R^1$, $R^2$, $R_a$, $R_b$, $R_c$, and $R_d$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and any two adjacent substituents of $R_a$, $R_b$, $R_c$, and $R_d$ are optionally fused or joined to form a ring or form a multidentate ligand.

In some such embodiments where the compound has the formula $M(L_A)_x(L_B)_y(L_C)_z$, ligands $L_B$ and $L_C$ are each independently selected from the group consisting of

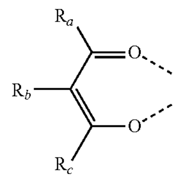

,

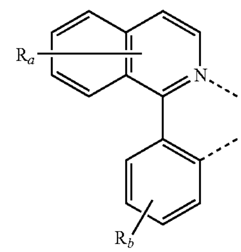

,

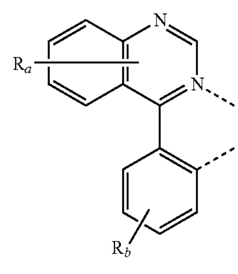

,

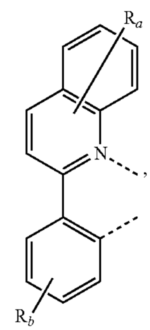

,

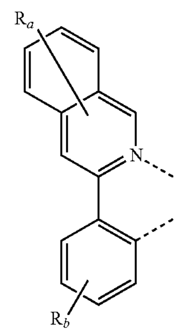

,

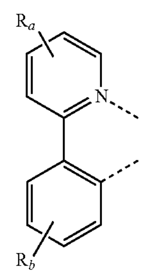

,

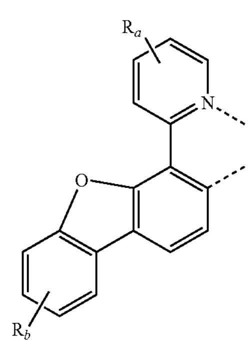

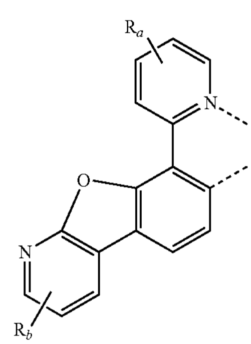

,

-continued
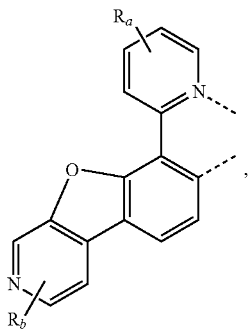
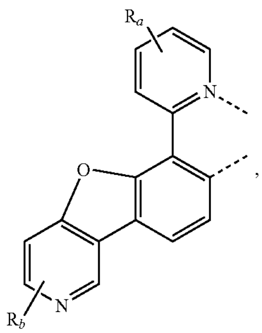
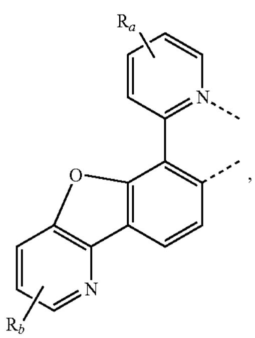
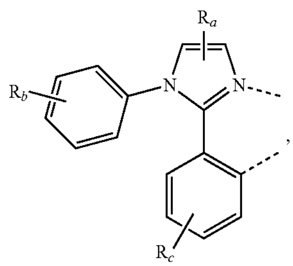
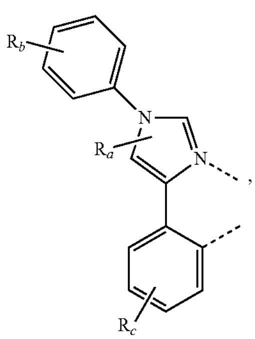
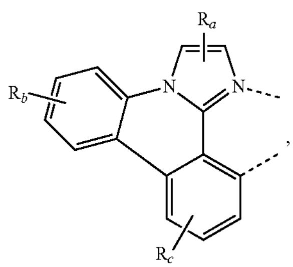
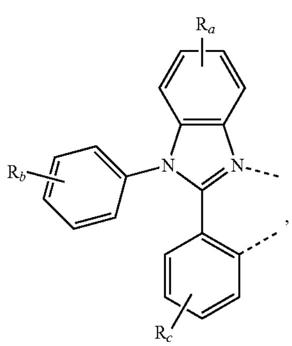
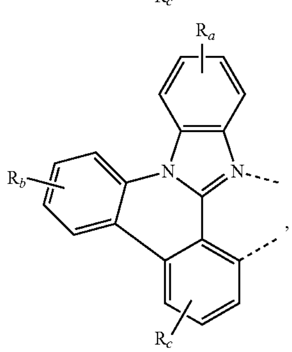
-continued
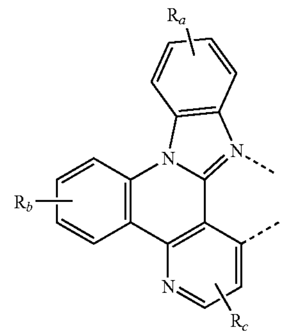
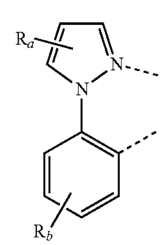
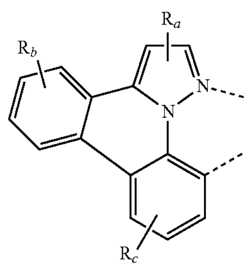
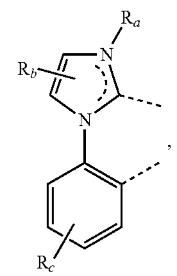
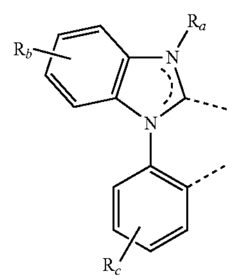
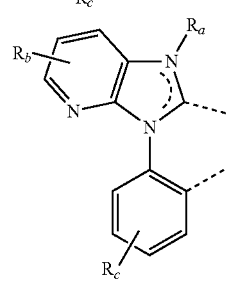
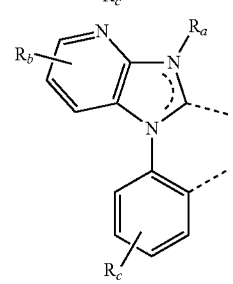
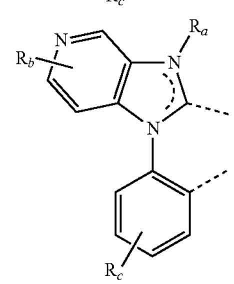
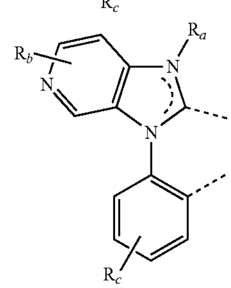
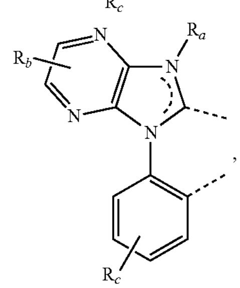
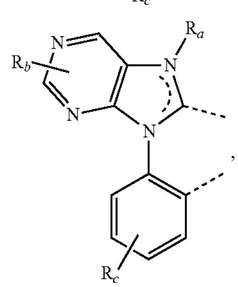
and
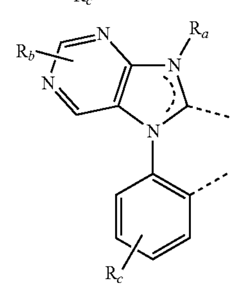

In some embodiments, the compound is Compound Ax having the formula $Ir(L_{Ai})_3$; where x=i; i is an integer from 1 to 4780, and $L_{A1}$ to $L_{A4780}$ are defined as set forth above.

In some embodiments, the compound is Compound By having the formula $Ir(L_{A1})(L_{Bk})_2$; where y=468i+k−468; i is an integer from 1 to 4780, and k is an integer from 1 to 468; and ligand $L_{Bk}$ has the following structures $L_{B1}$

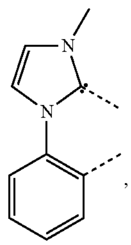

$L_{B2}$

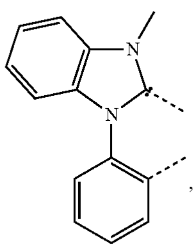

$L_{B3}$

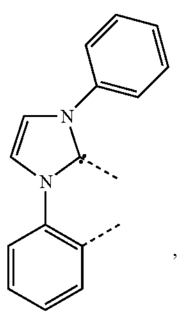

$L_{B4}$

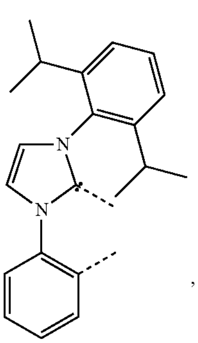

-continued $L_{B5}$

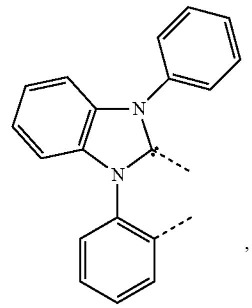

$L_{B6}$

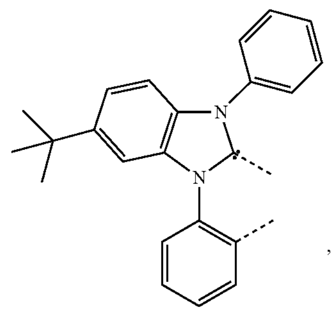

$L_{B7}$

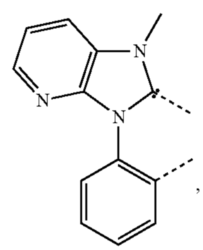

$L_{B8}$

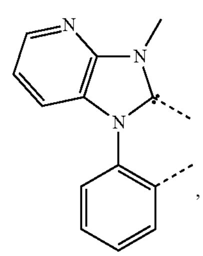

$L_{B9}$

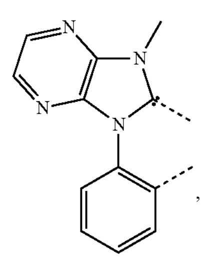

$L_{B10}$
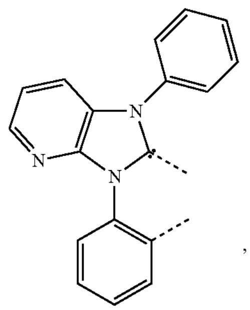
$L_{B11}$
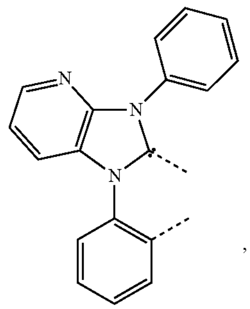
$L_{B12}$
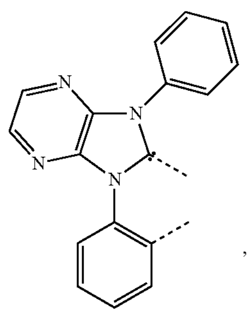
$L_{B13}$
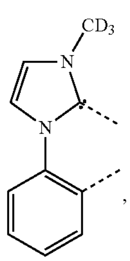
$L_{B14}$
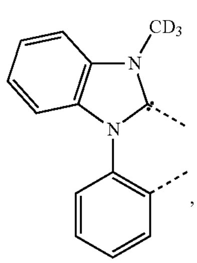
$L_{B15}$
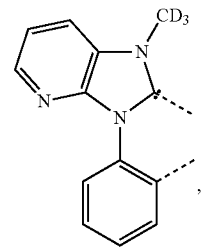
$L_{B16}$
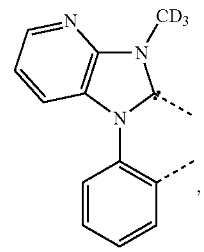
$L_{B17}$
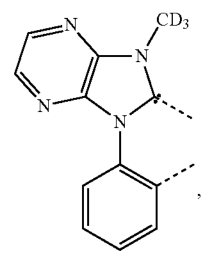
$L_{B18}$
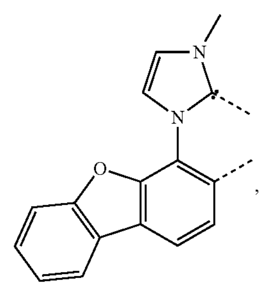
$L_{B19}$
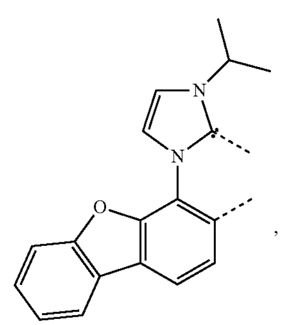

-continued
$L_{B20}$
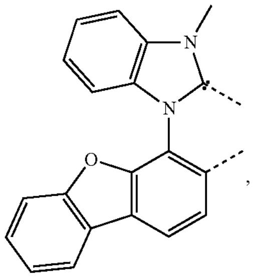
$L_{B21}$
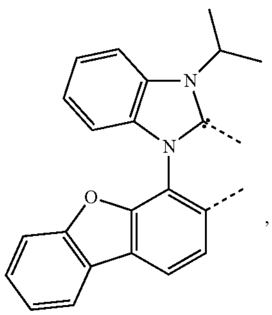
$L_{B22}$
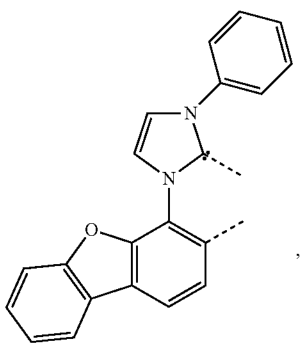
$L_{B23}$
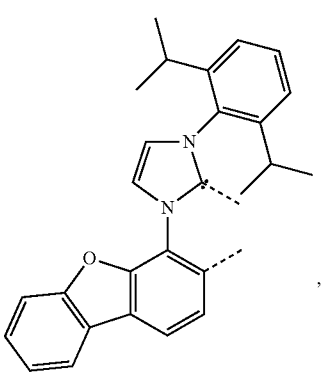
-continued
$L_{B24}$
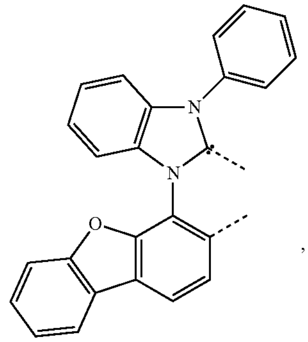
$L_{B25}$
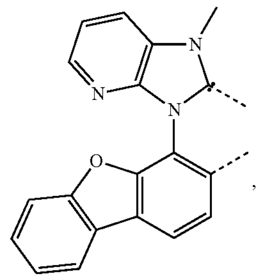
$L_{B26}$
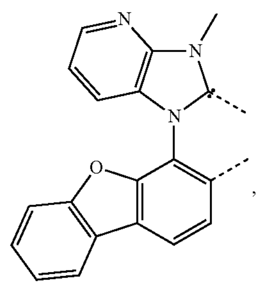
$L_{B27}$
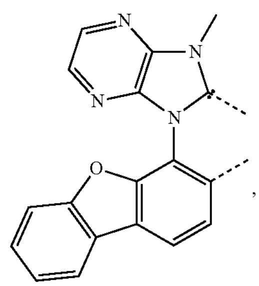
$L_{B28}$
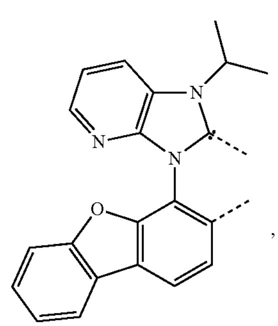

$L_{B29}$
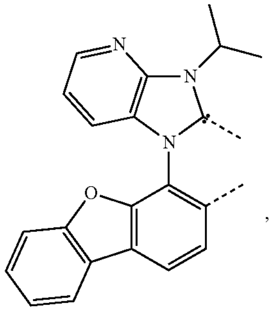
$L_{B30}$
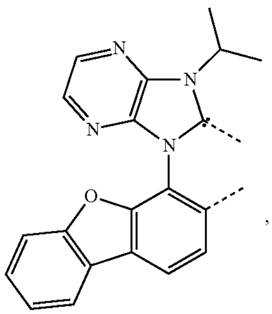
$L_{B31}$
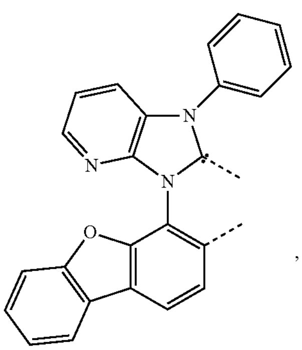
$L_{B32}$
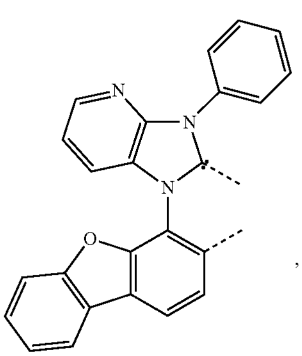
$L_{B33}$
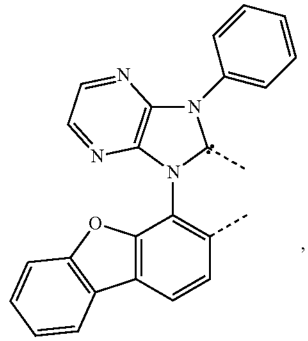
$L_{B34}$
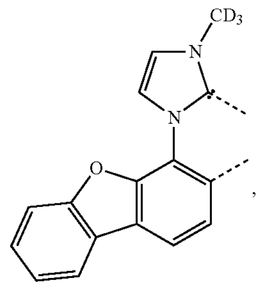
$L_{B35}$
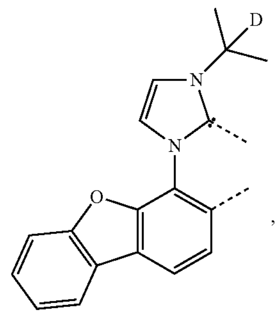
$L_{B36}$
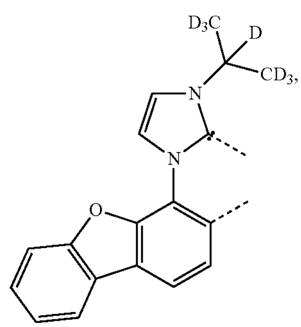
$L_{B37}$
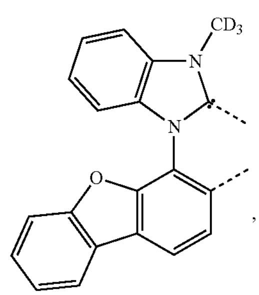

$L_{B38}$
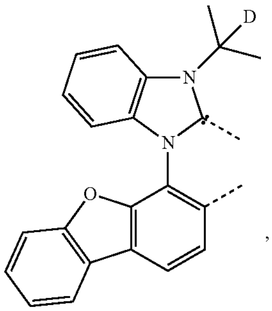
$L_{B39}$
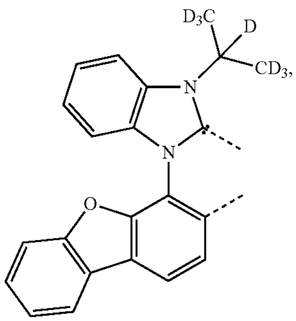
$L_{B40}$
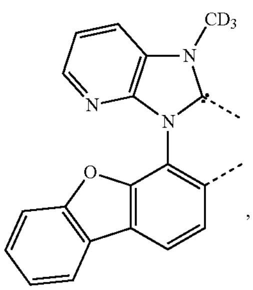
$L_{B41}$
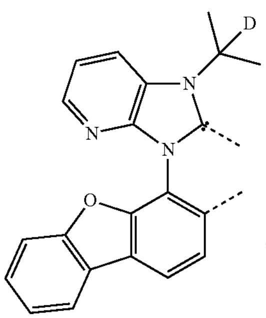
$L_{B42}$
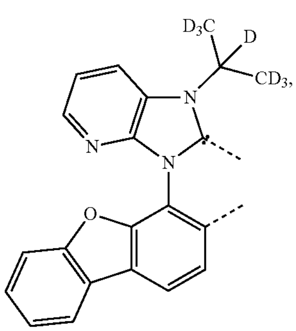
$L_{B43}$
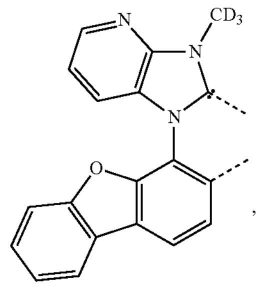
$L_{B44}$
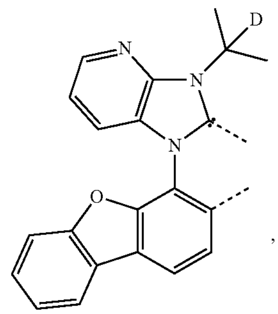
$L_{B45}$
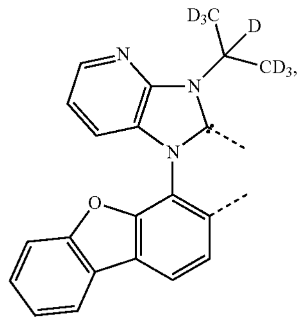
$L_{B46}$
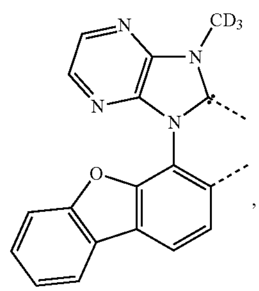
$L_{B47}$
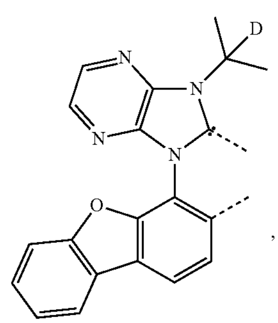

$L_{B48}$
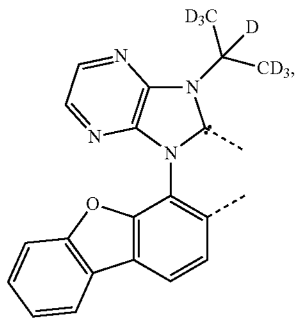
$L_{B49}$
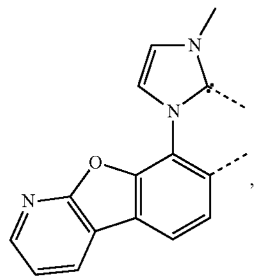
$L_{B50}$
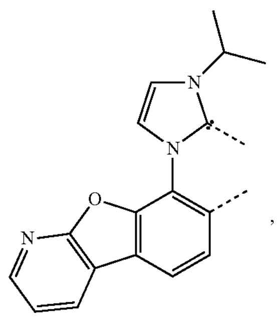
$L_{B51}$
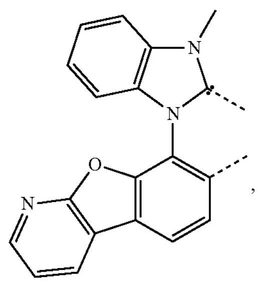
$L_{B52}$
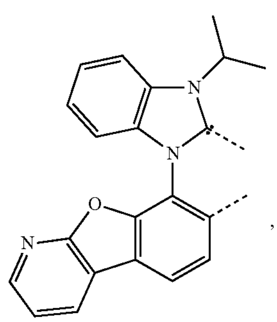
$L_{B53}$
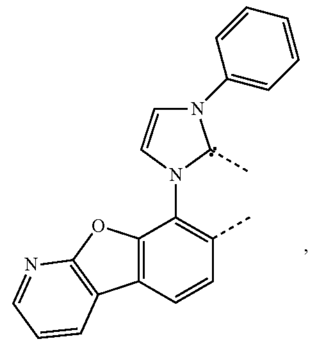
$L_{B54}$
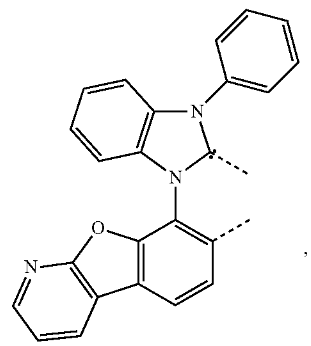
$L_{B55}$
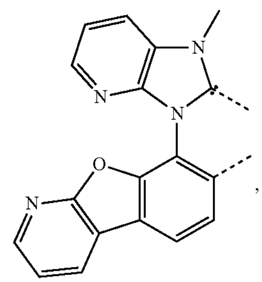
$L_{B56}$
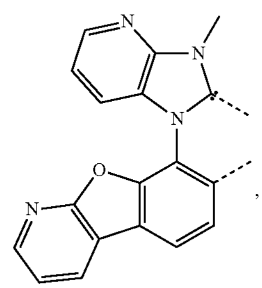
$L_{B57}$
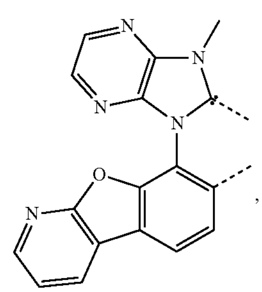

-continued
$L_{B58}$
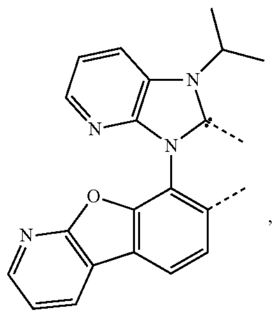
,
$L_{B59}$
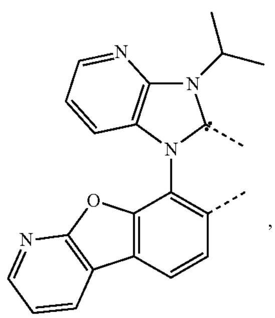
,
$L_{B60}$
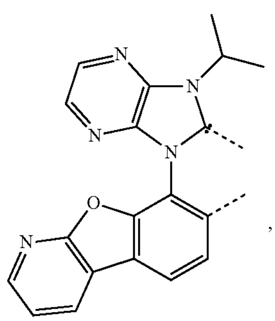
,
$L_{B61}$
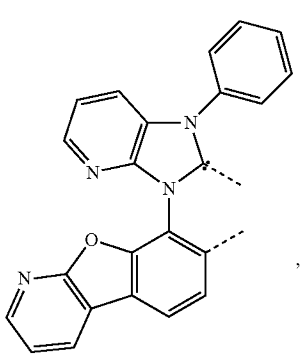
,
-continued
$L_{B62}$
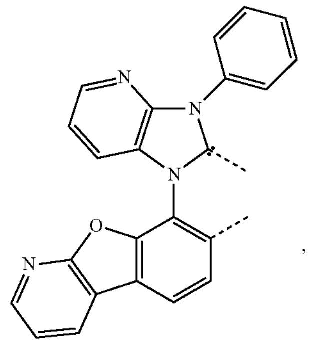
,
$L_{B63}$
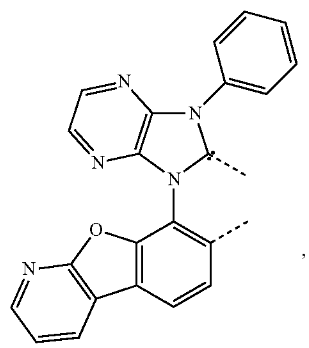
,
$L_{B64}$
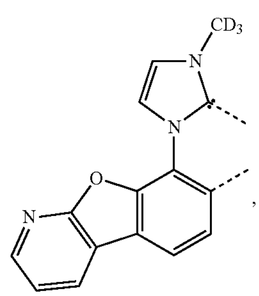
,
$L_{B65}$
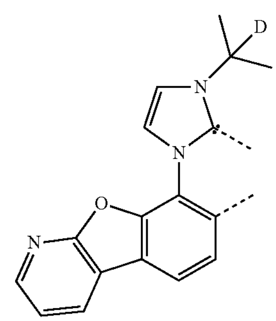
,
$L_{B66}$
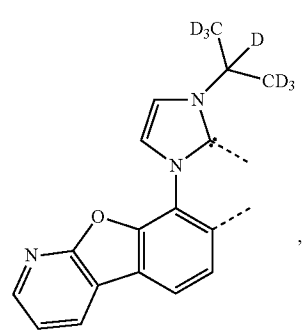
, -continued
$L_{B67}$
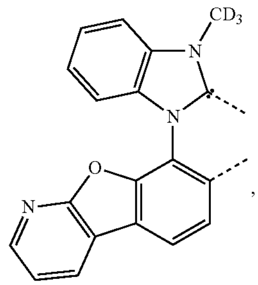
$L_{B68}$
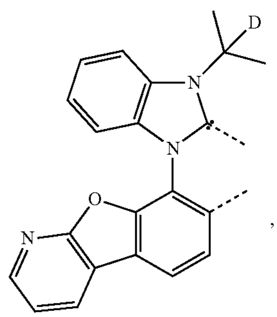
$L_{B69}$
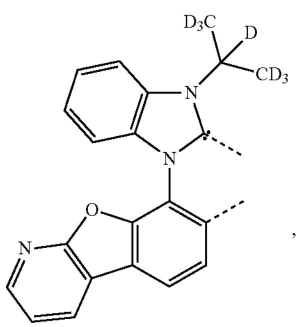
$L_{B70}$
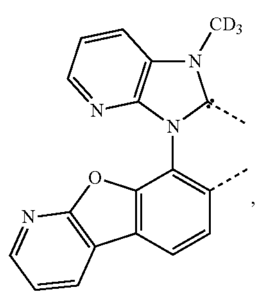
$L_{B71}$
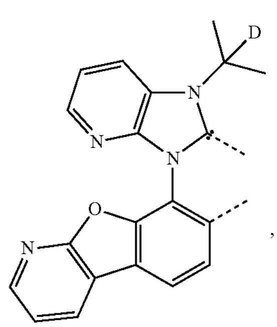
-continued
$L_{B72}$
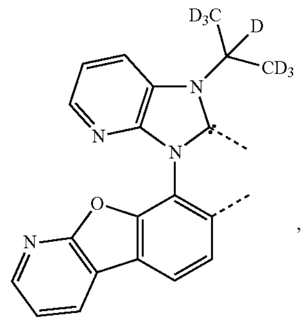
$L_{B73}$
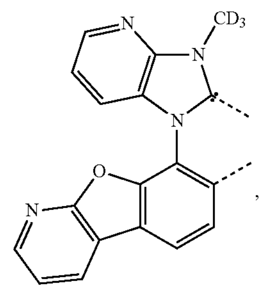
$L_{B74}$
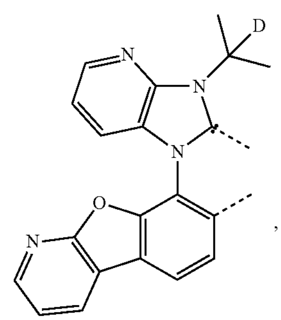
$L_{B75}$
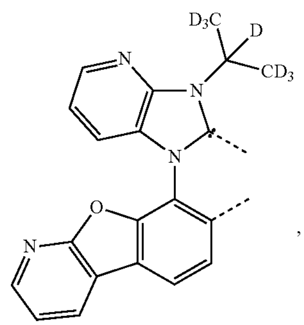
$L_{B76}$
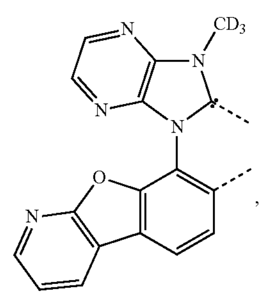

-continued
$L_{B77}$
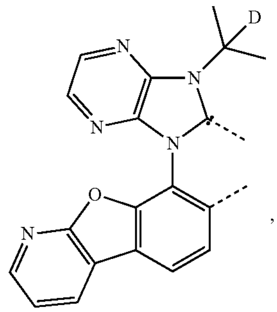
$L_{B78}$
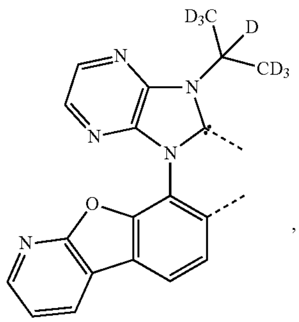
$L_{B79}$
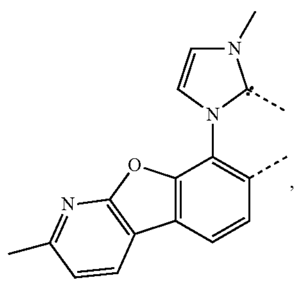
$L_{B80}$
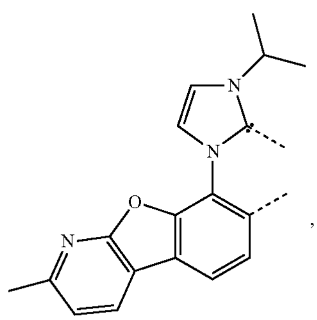
$L_{B81}$
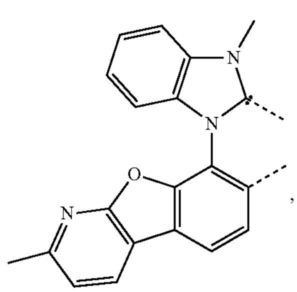
-continued
$L_{B82}$
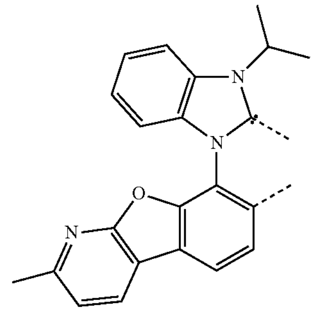
$L_{B83}$
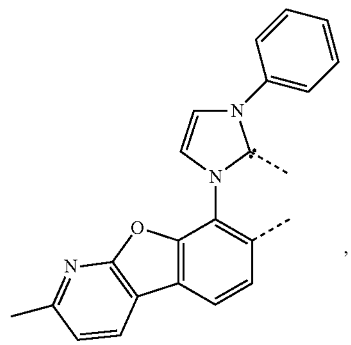
$L_{B84}$
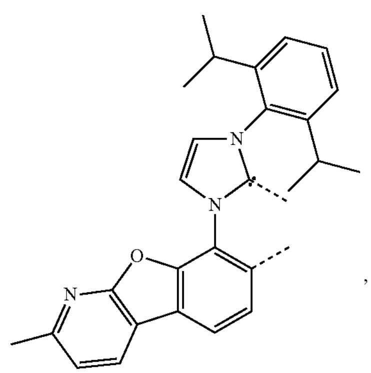
$L_{B85}$
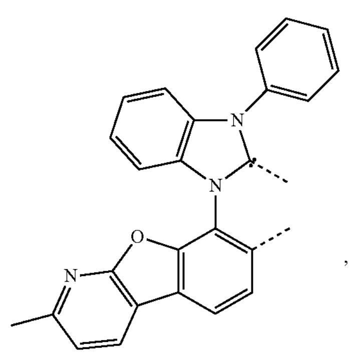

-continued
$L_{B86}$
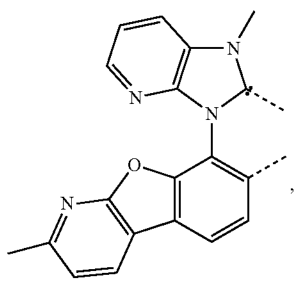
$L_{B87}$
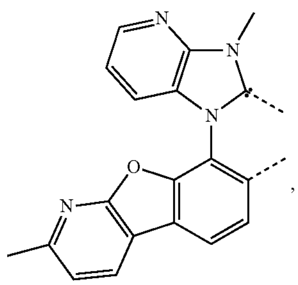
$L_{B88}$
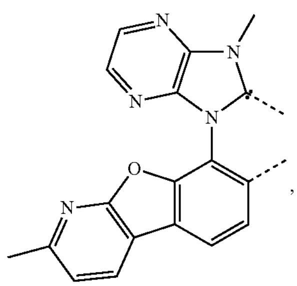
$L_{B89}$
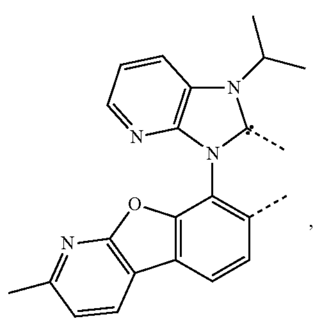
$L_{B90}$
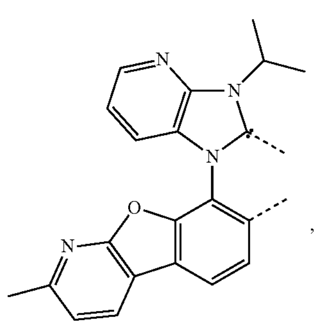
-continued
$L_{B91}$
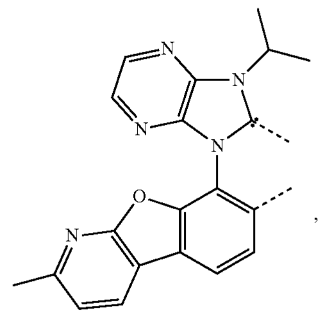
$L_{B92}$
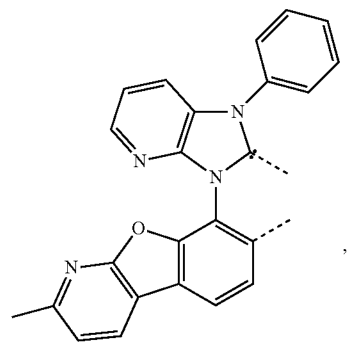
$L_{B93}$
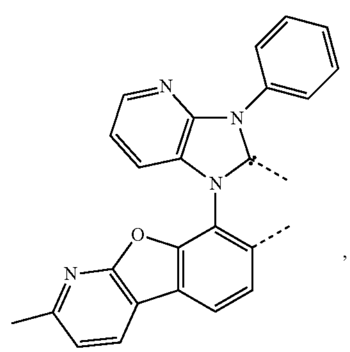
$L_{B94}$
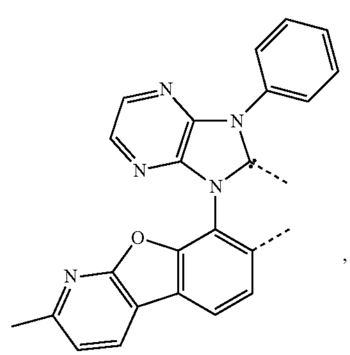

-continued
$L_{B95}$
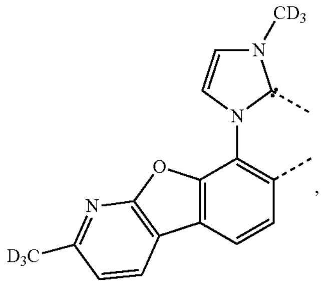
$L_{B96}$
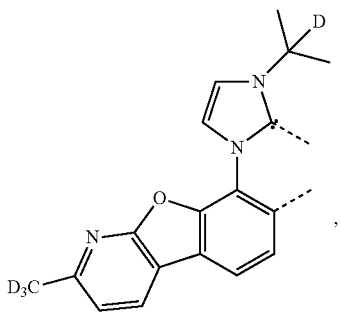
$L_{B97}$
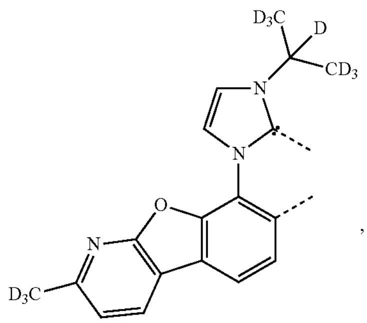
$L_{B98}$
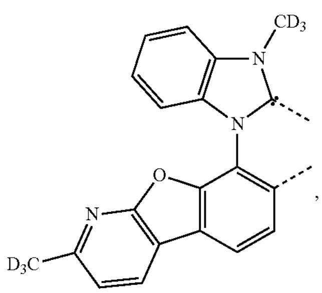
$L_{B99}$
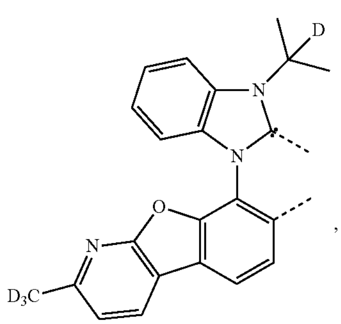
-continued
$L_{B100}$
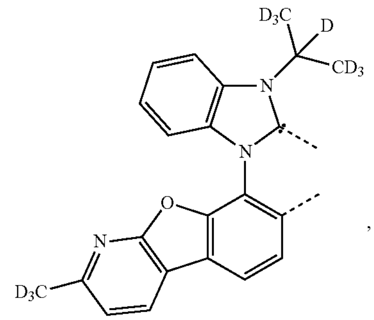
$L_{B101}$
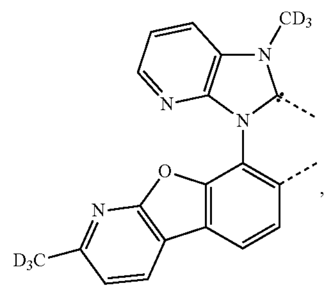
$L_{B102}$
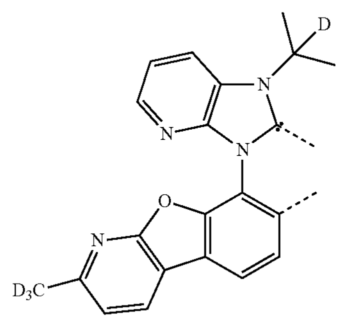
$L_{B103}$
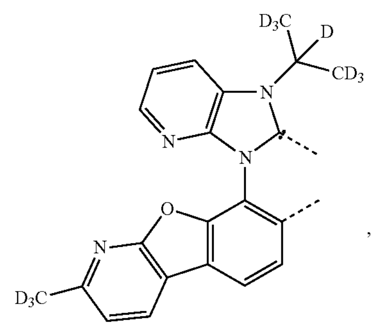
$L_{B104}$
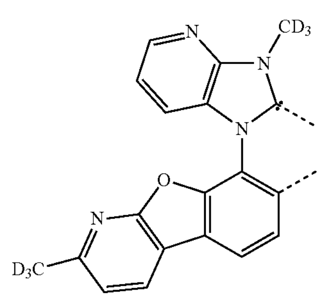

-continued
$L_{B105}$
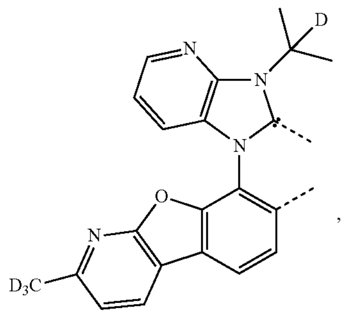
$L_{B106}$
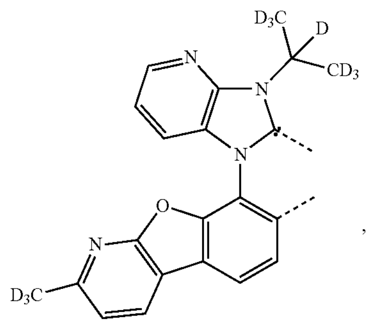
$L_{B107}$
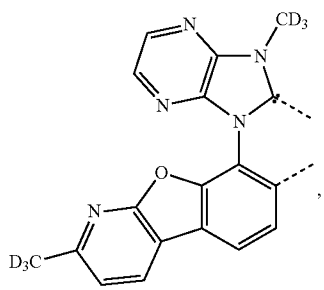
$L_{B108}$
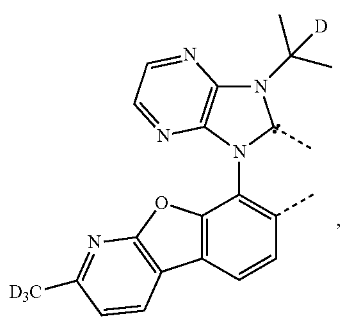
$L_{B109}$
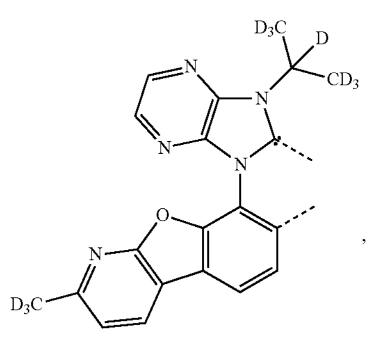
-continued
$L_{B110}$
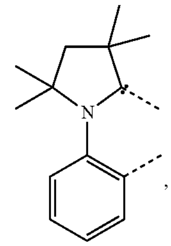
$L_{B111}$
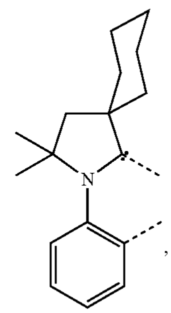
$L_{B112}$
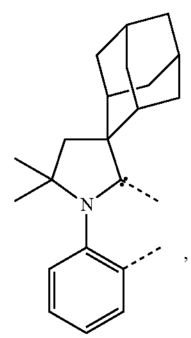
$L_{B113}$
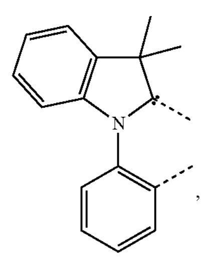
$L_{B114}$
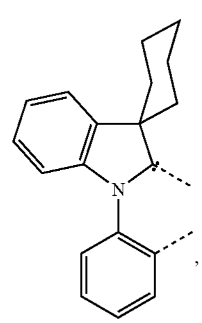

-continued
$L_{B115}$
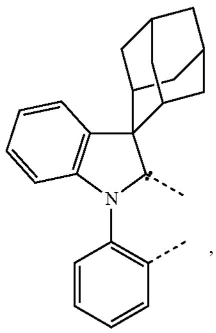
$L_{B116}$
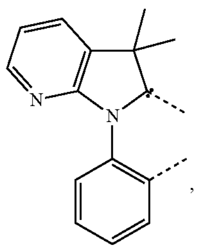
$L_{B117}$
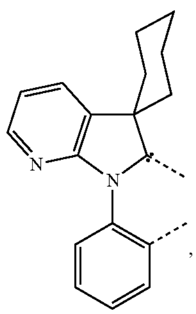
$L_{B118}$
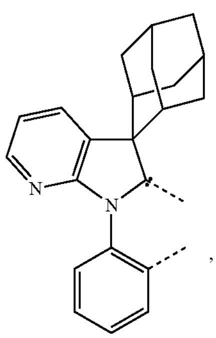
$L_{B119}$
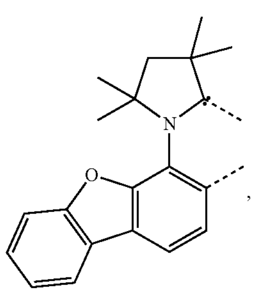
-continued
$L_{B120}$
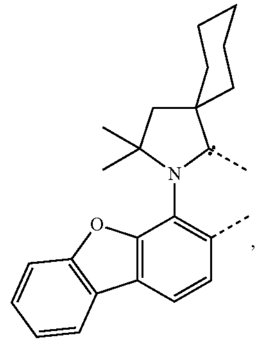
$L_{B121}$
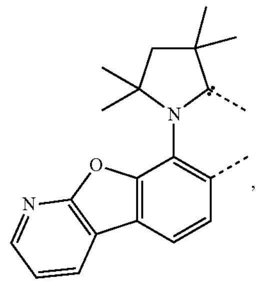
$L_{B122}$
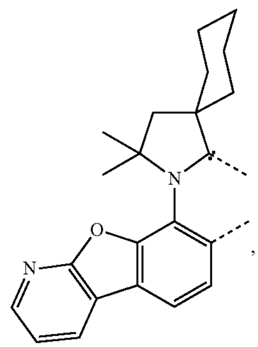
$L_{B123}$
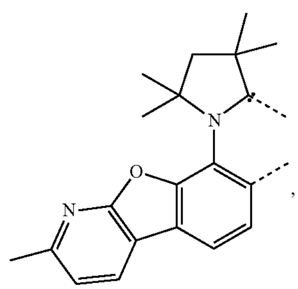
$L_{B124}$
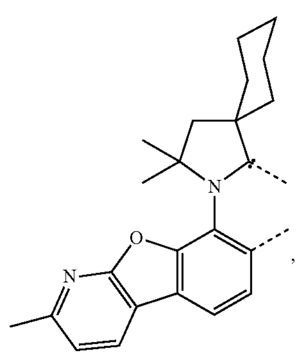

-continued
$L_{B125}$
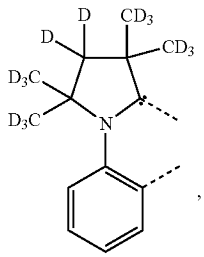
$L_{B126}$
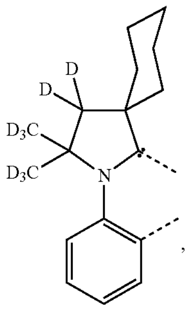
$L_{B127}$
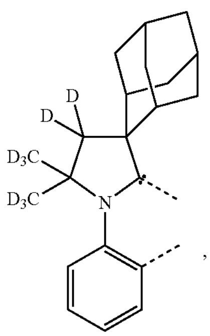
$L_{B128}$
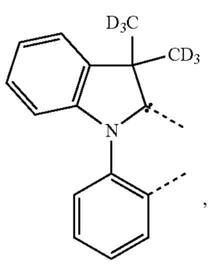
$L_{B129}$
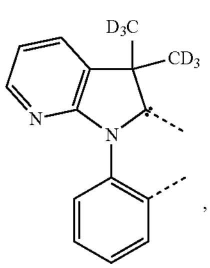
-continued
$L_{B130}$
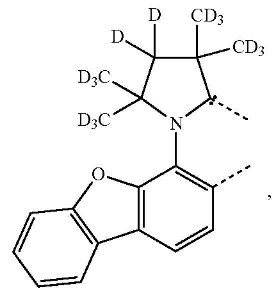
$L_{B131}$
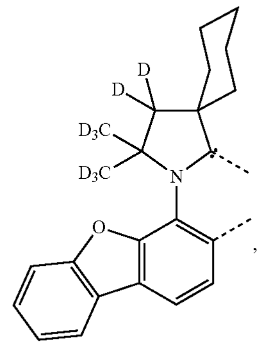
$L_{B132}$
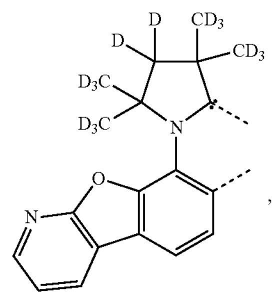
$L_{B133}$
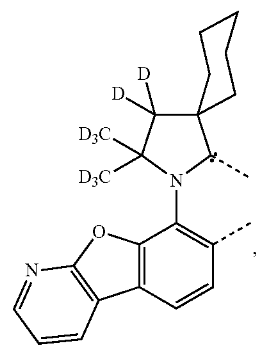
$L_{B134}$
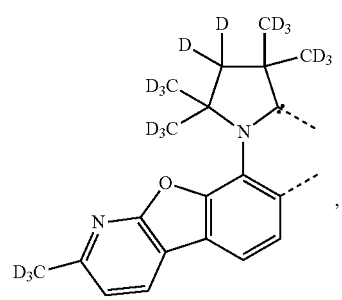

-continued
$L_{B135}$
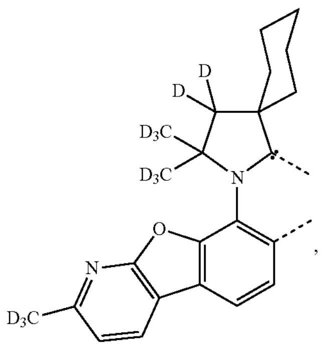
$L_{B136}$
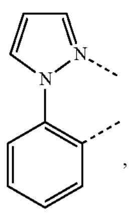
$L_{B137}$
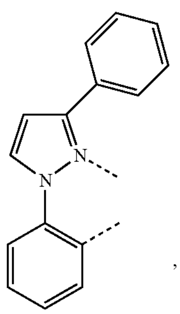
$L_{B138}$
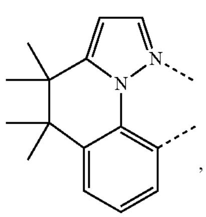
$L_{B139}$
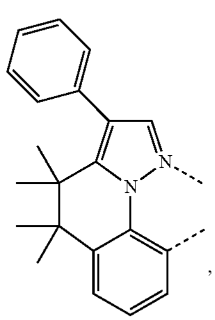
-continued
$L_{B140}$
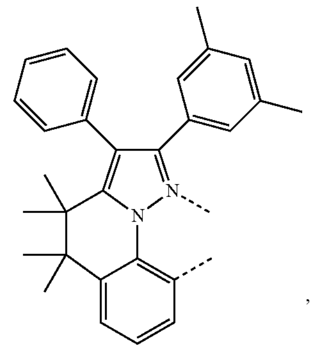
$L_{B141}$
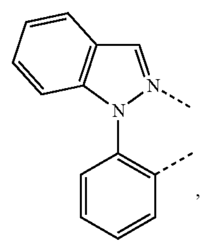
$L_{B142}$
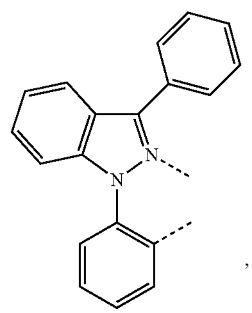
$L_{B143}$
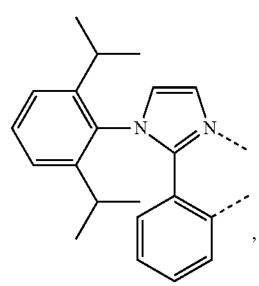
$L_{B144}$
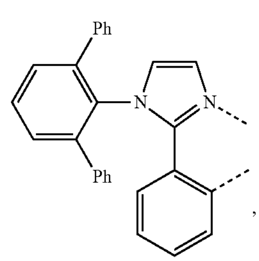

-continued
$L_{B145}$
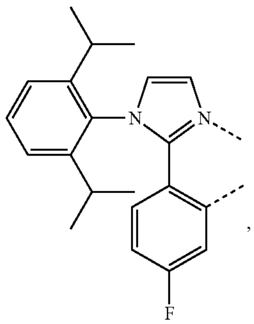
$L_{B146}$
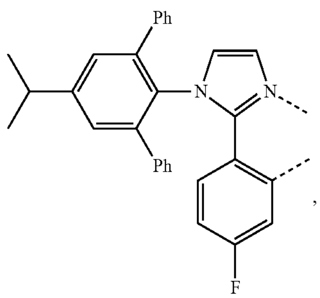
$L_{B147}$
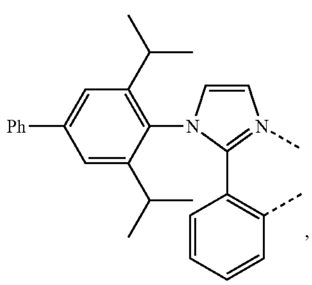
$L_{B148}$
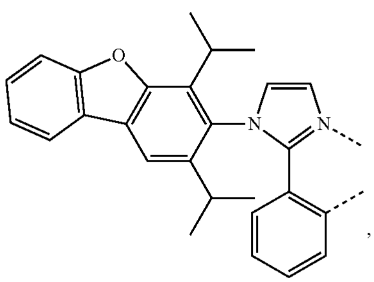
$L_{B149}$
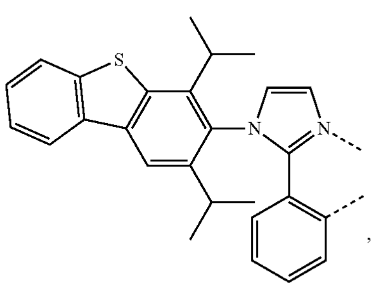
-continued
$L_{B150}$
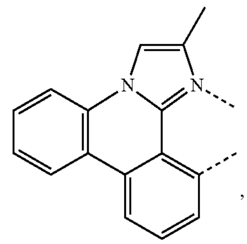
$L_{B151}$
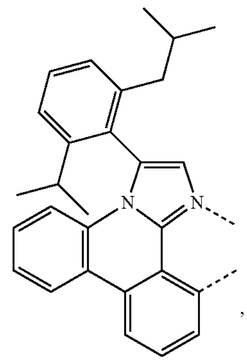
$L_{B152}$
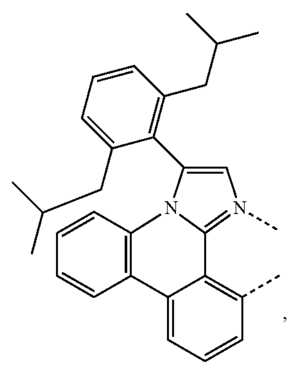
$L_{B153}$
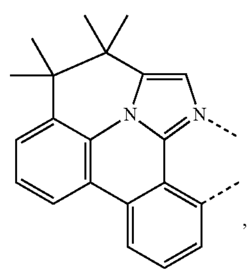
$L_{B154}$
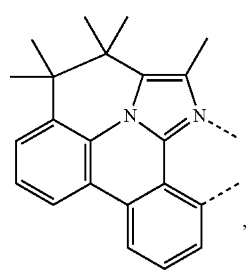

-continued
$L_{B155}$
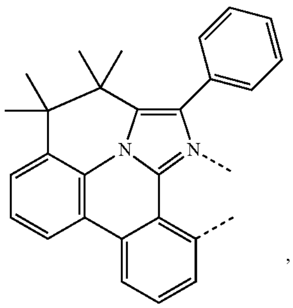
$L_{B156}$
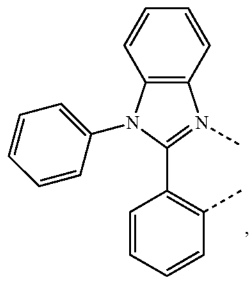
$L_{B157}$
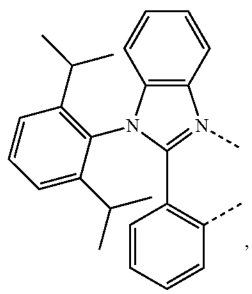
$L_{B158}$
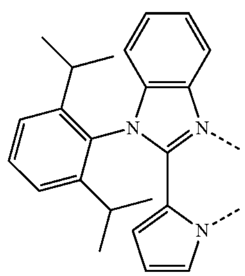
$L_{B159}$
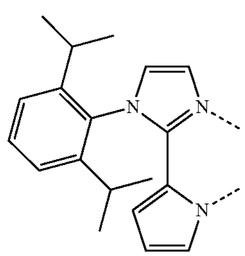
$L_{B160}$
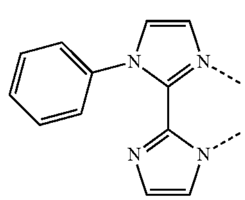
-continued
$L_{B161}$
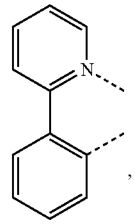
$L_{B162}$
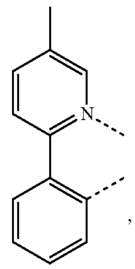
$L_{B163}$
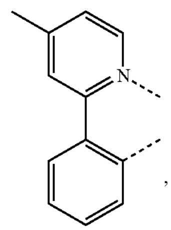
$L_{B164}$
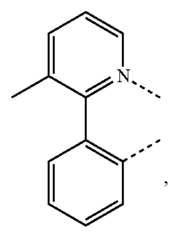
$L_{B165}$
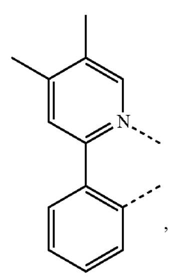
$L_{B166}$
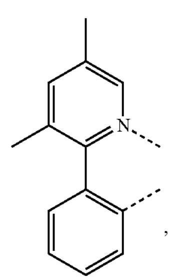

-continued
$L_{B167}$
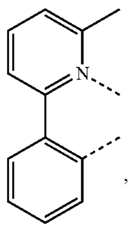
$L_{B168}$
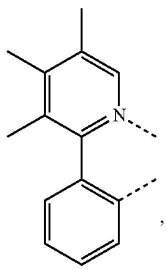
$L_{B169}$
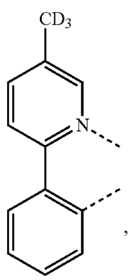
$L_{B170}$
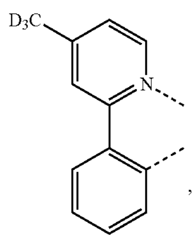
$L_{B171}$
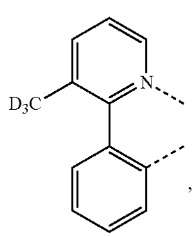
$L_{B172}$
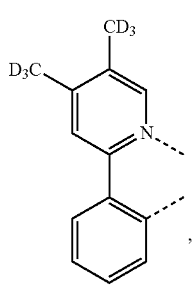
-continued
$L_{B173}$
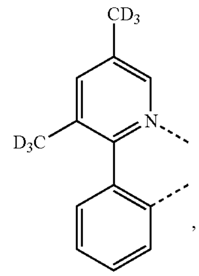
$L_{B174}$
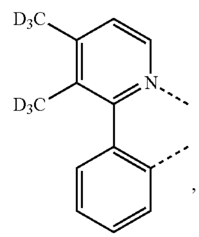
$L_{B175}$
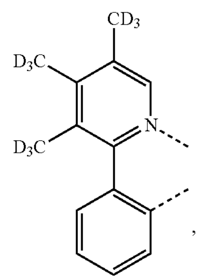
$L_{B176}$
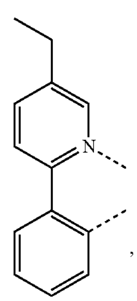
$L_{B177}$
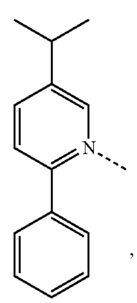

-continued
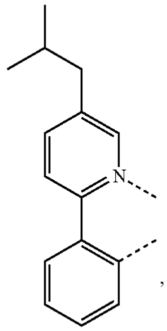
$L_{B178}$
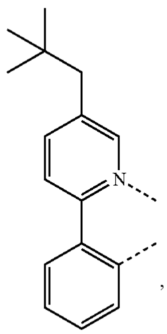
$L_{B179}$
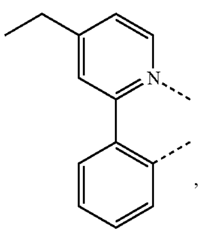
$L_{B180}$
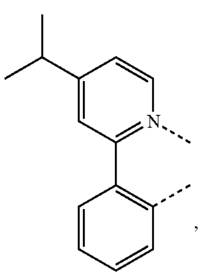
$L_{B181}$
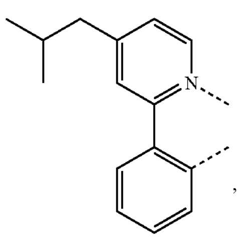
$L_{B182}$
-continued
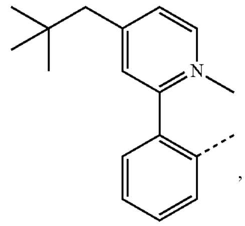
$L_{B183}$
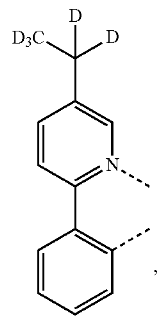
$L_{B184}$
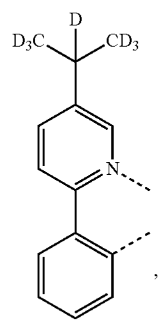
$L_{B185}$
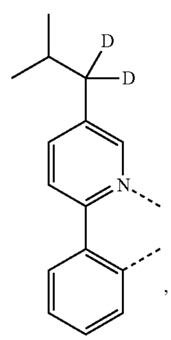
$L_{B186}$
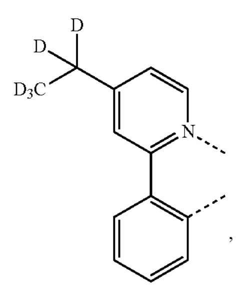
$L_{B187}$ -continued
$L_{B188}$
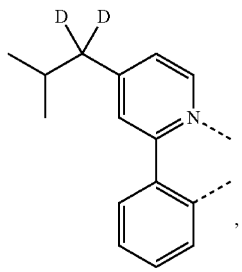
$L_{B189}$
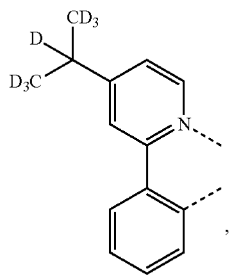
$L_{B190}$
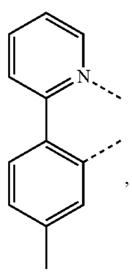
$L_{B191}$
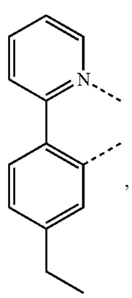
$L_{B192}$
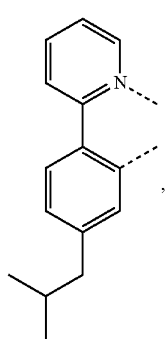
-continued
$L_{B193}$
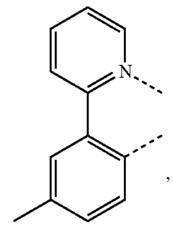
$L_{B194}$
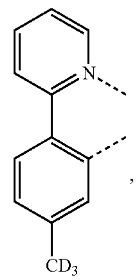
$L_{B195}$
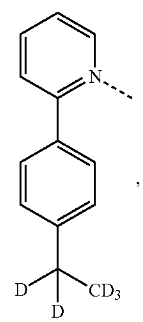
$L_{B196}$
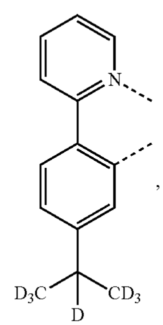
$L_{B197}$
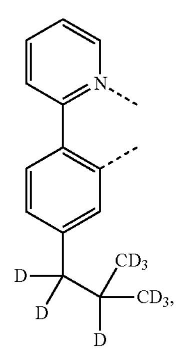

-continued
$L_{B198}$
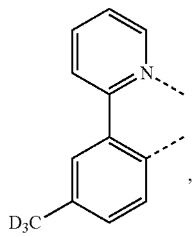
$L_{B199}$
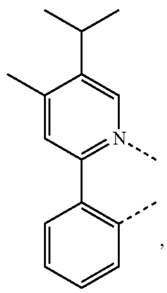
$L_{B200}$
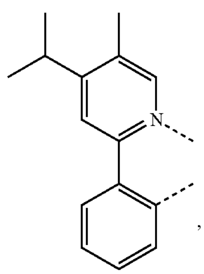
$L_{B201}$
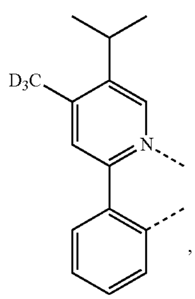
$L_{B202}$
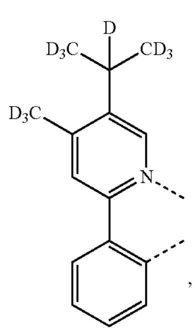
-continued
$L_{B203}$
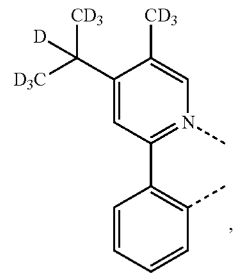
$L_{B204}$
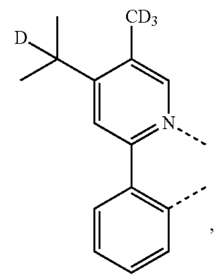
$L_{B205}$
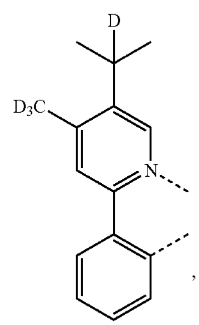
$L_{B206}$
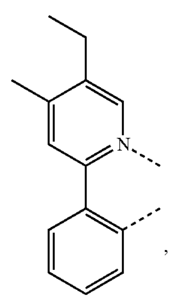
$L_{B207}$
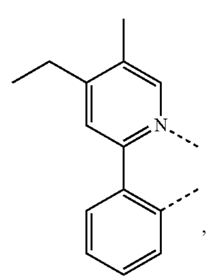

-continued
$L_{B208}$
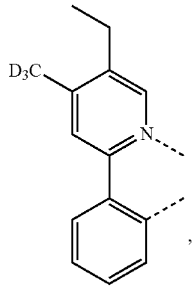
$L_{B209}$
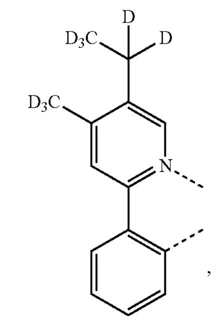
$L_{B210}$
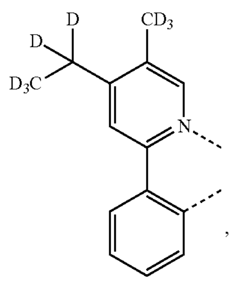
$L_{B211}$
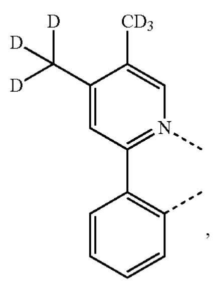
$L_{B212}$
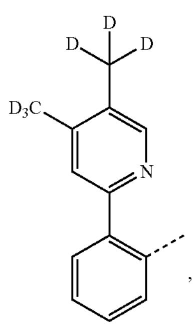
-continued
$L_{B213}$
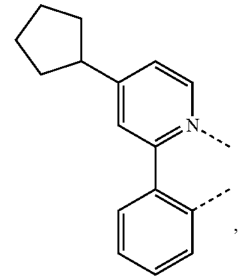
$L_{B214}$
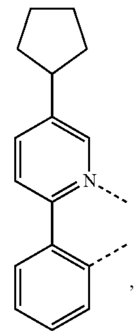
$L_{B215}$
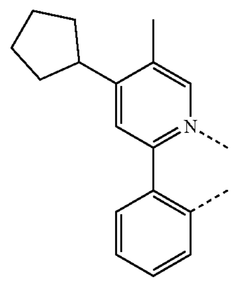
$L_{B216}$
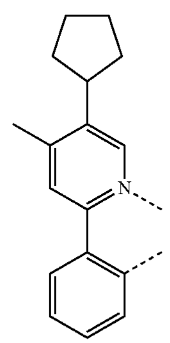
$L_{B217}$
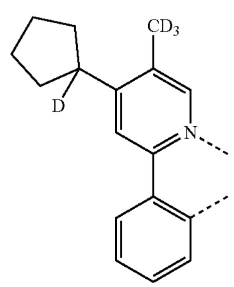

-continued
$L_{B218}$
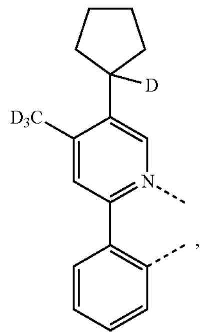
$L_{B219}$
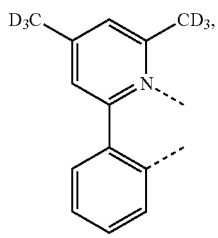
$L_{B220}$
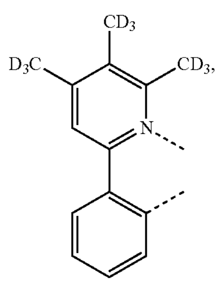
$L_{B221}$
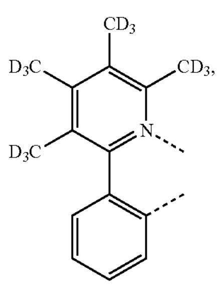
$L_{B222}$
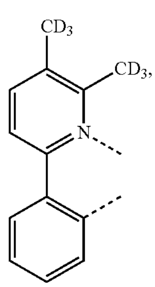
-continued
$L_{B223}$
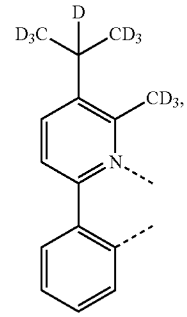
$L_{B224}$
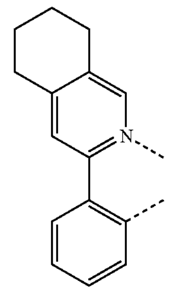
$L_{B225}$
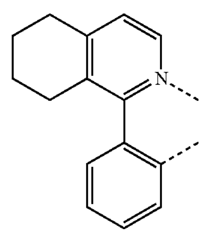
$L_{B226}$
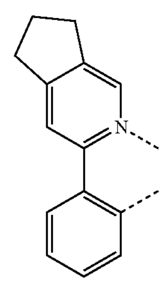
$L_{B227}$
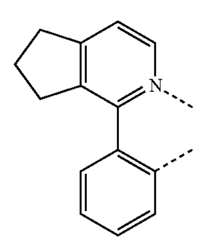

-continued
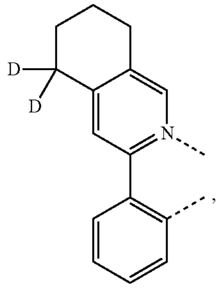
$L_{B228}$
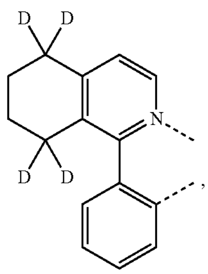
$L_{B229}$
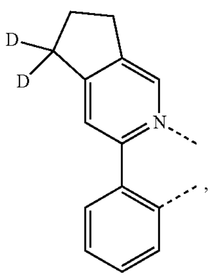
$L_{B230}$
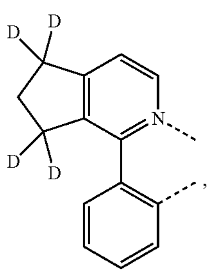
$L_{B231}$
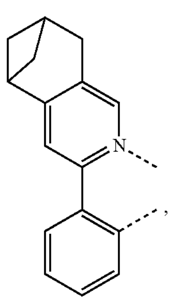
$L_{B232}$
-continued
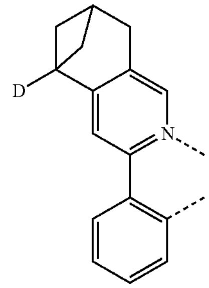
$L_{B233}$
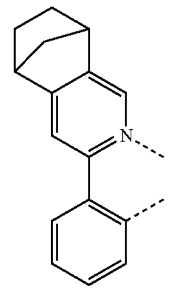
$L_{B234}$
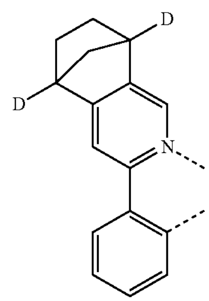
$L_{B235}$
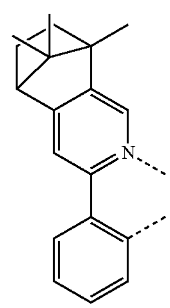
$L_{B236}$
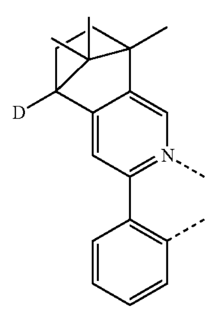
$L_{B237}$ L$_{B238}$
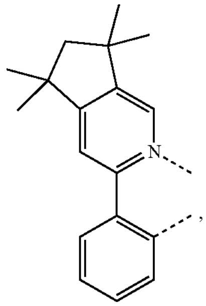
L$_{B239}$
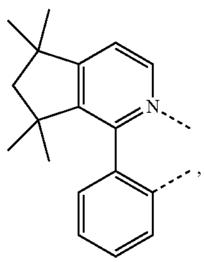
L$_{B240}$
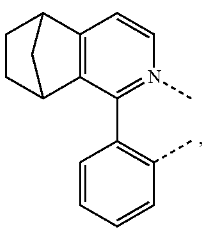
L$_{B241}$
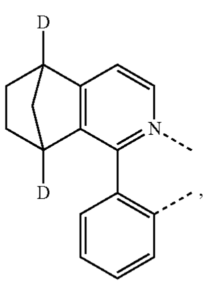
L$_{B242}$
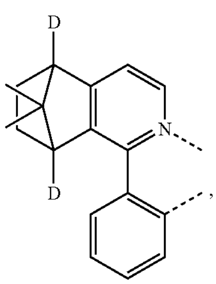
L$_{B243}$
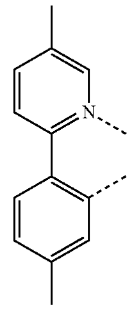
L$_{B244}$
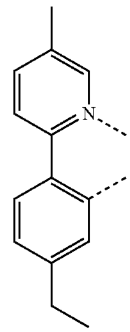
L$_{B245}$
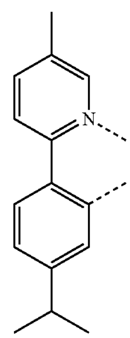
L$_{B246}$
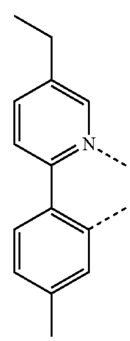

-continued
$L_{B247}$
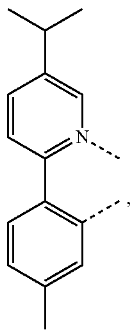
$L_{B248}$
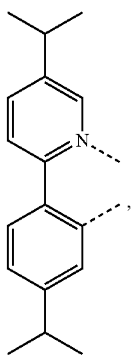
$L_{B249}$
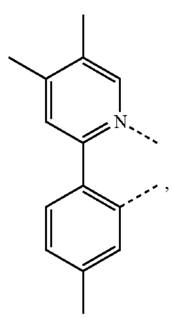
$L_{B250}$
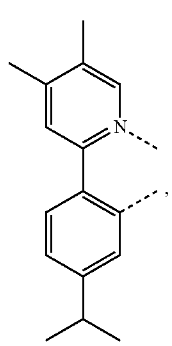
-continued
$L_{B251}$
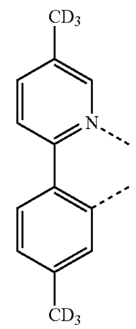
$L_{B252}$
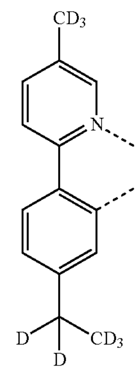
$L_{B253}$
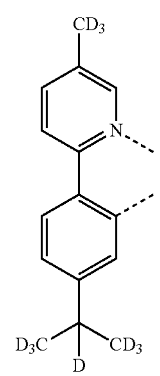
$L_{B254}$
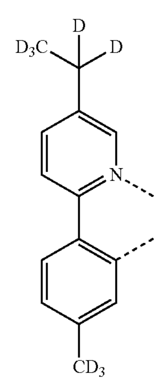

$L_{B255}$
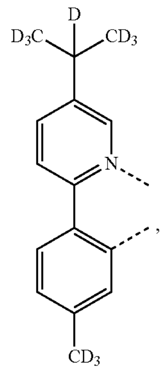
$L_{B256}$
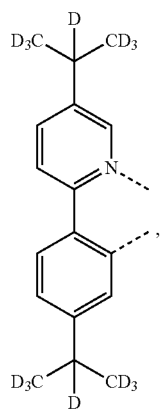
$L_{B257}$
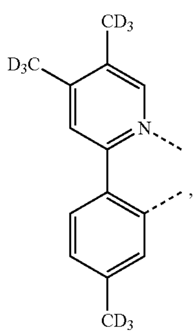
$L_{B258}$
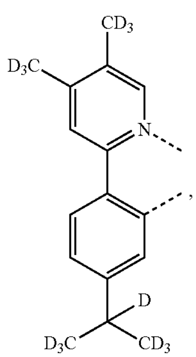
$L_{B259}$
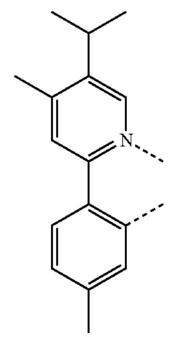
$L_{B260}$
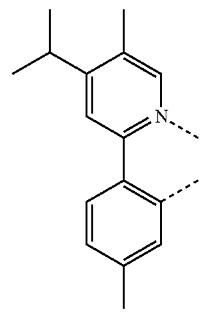
$L_{B261}$
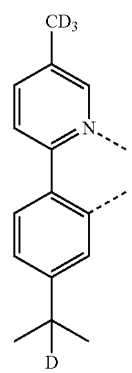
$L_{B262}$
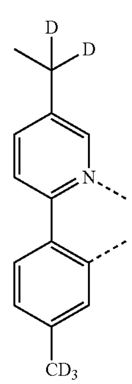

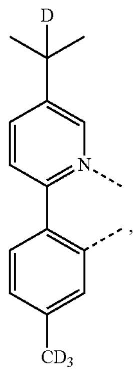
$L_{B263}$
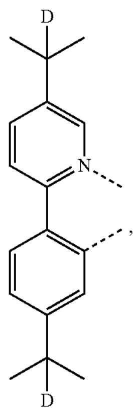
$L_{B264}$
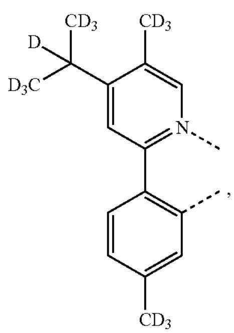
$L_{B265}$
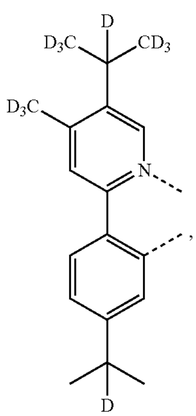
$L_{B266}$
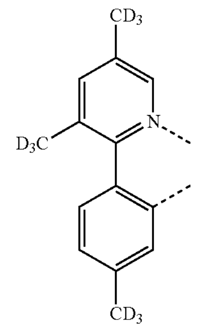
$L_{B267}$
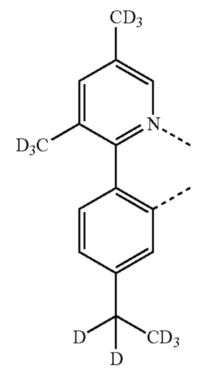
$L_{B268}$
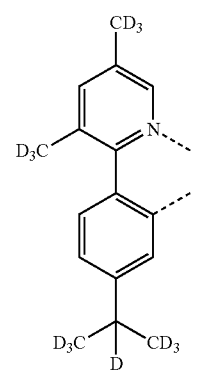
$L_{B269}$
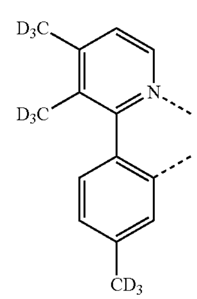
$L_{B270}$ -continued
$L_{B271}$
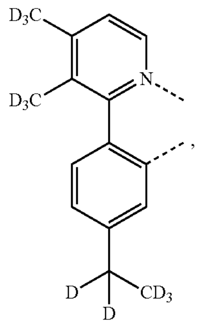
$L_{B272}$
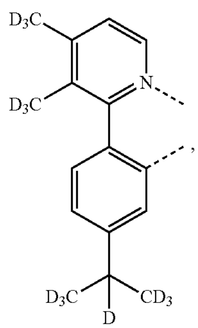
$L_{B273}$
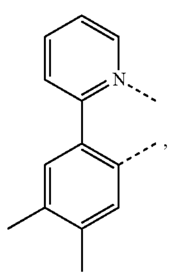
$L_{B274}$
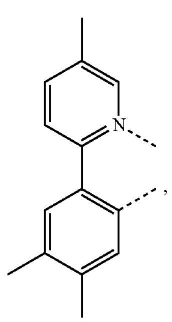
$L_{B275}$
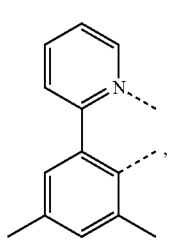
-continued
$L_{B276}$
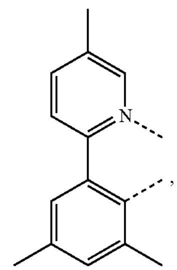
$L_{B277}$
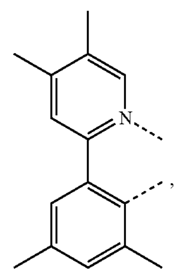
$L_{B278}$
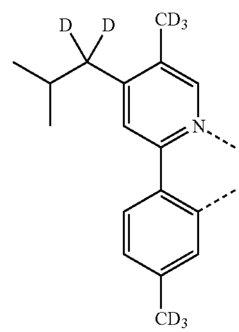
$L_{B279}$
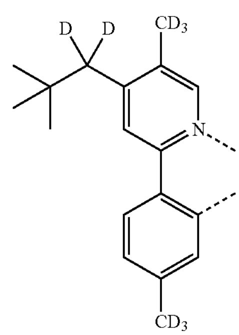
$L_{B280}$
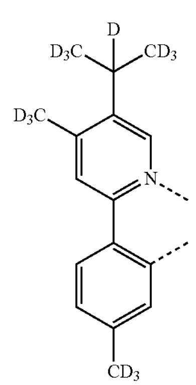

-continued
$L_{B281}$
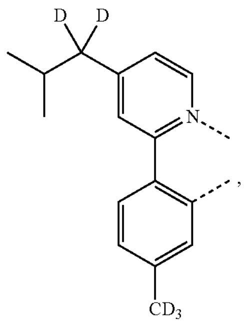
$L_{B282}$
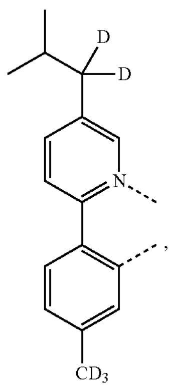
$L_{B283}$
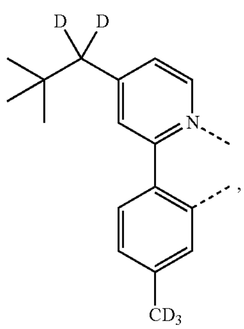
$L_{B284}$
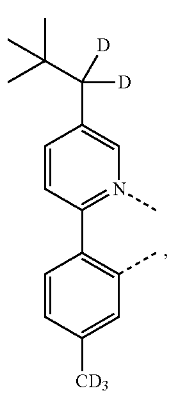
-continued
$L_{B285}$
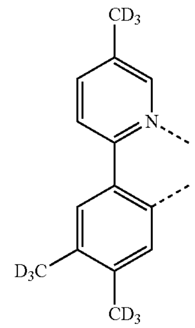
$L_{B286}$
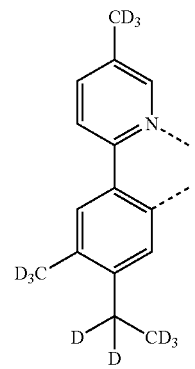
$L_{B287}$
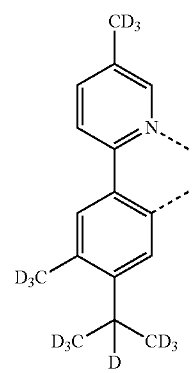
$L_{B288}$
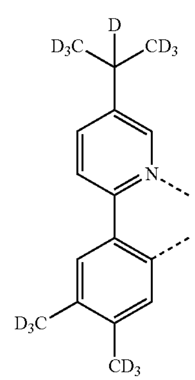

-continued
L$_{B289}$
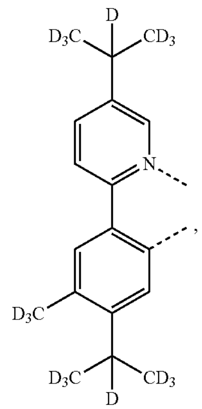
L$_{B290}$
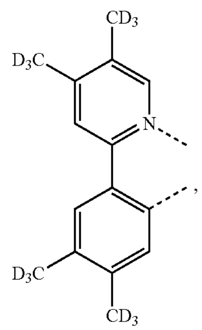
L$_{B291}$
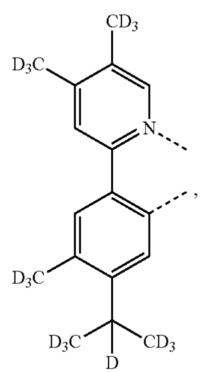
L$_{B292}$
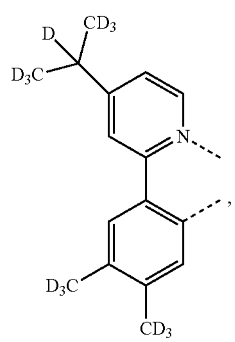
-continued
L$_{B293}$
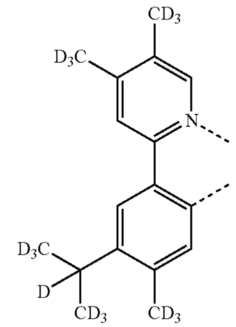
L$_{B294}$
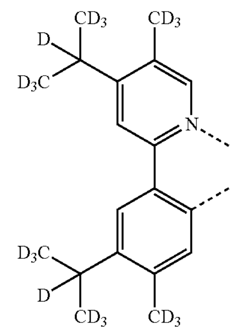
L$_{B295}$
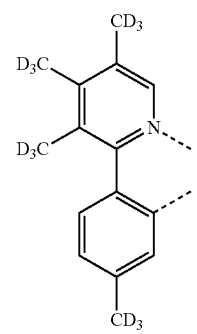
L$_{B296}$
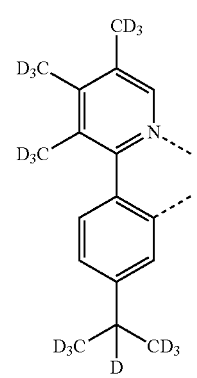

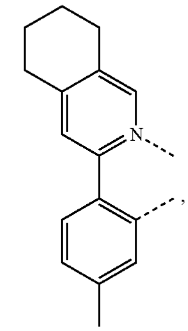
$L_{B297}$
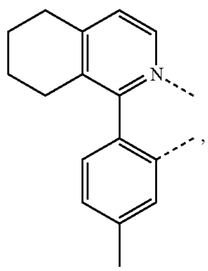
$L_{B298}$
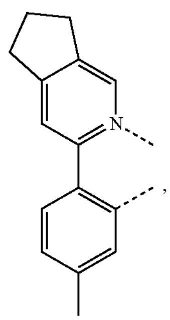
$L_{B299}$
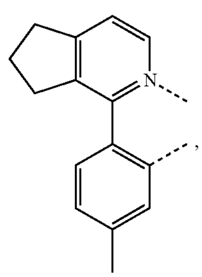
$L_{B300}$
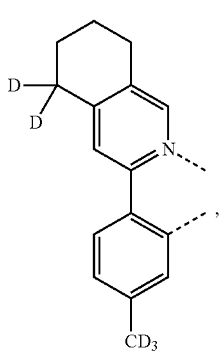
$L_{B301}$
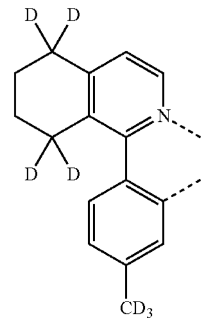
$L_{B302}$
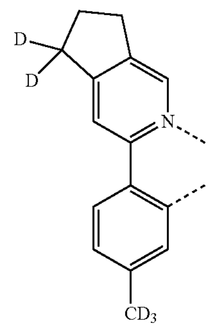
$L_{B303}$
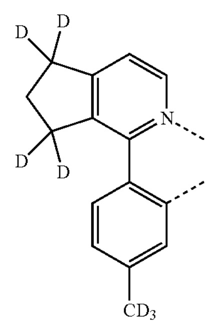
$L_{B304}$
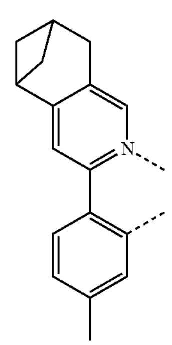
$L_{B305}$ -continued
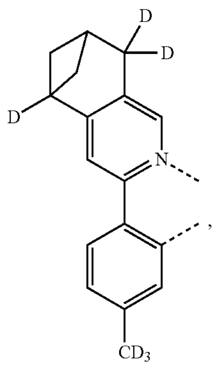
$L_{B306}$
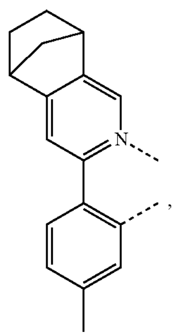
$L_{B307}$
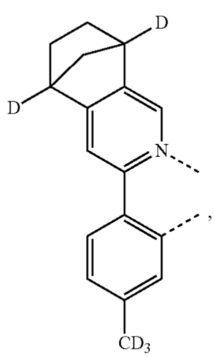
$L_{B308}$
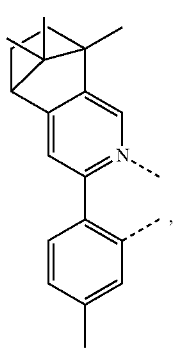
$L_{B309}$
-continued
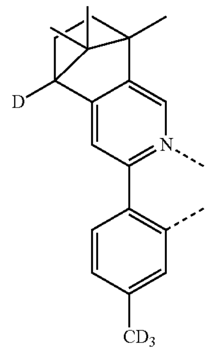
$L_{B310}$
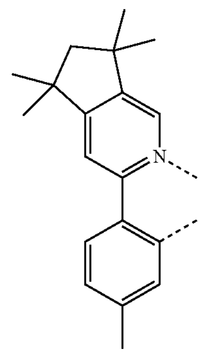
$L_{B311}$
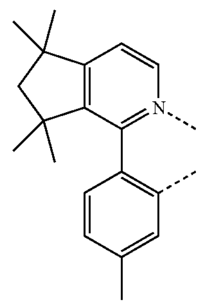
$L_{B312}$
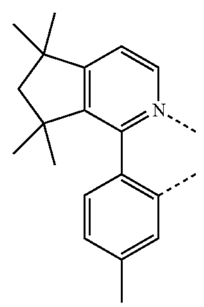
$L_{B312}$
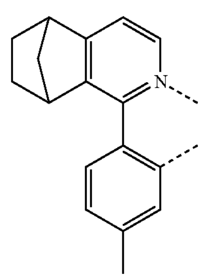
$L_{B313}$ -continued
$L_{B314}$
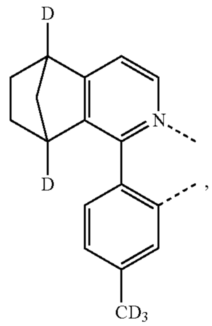
$L_{B315}$
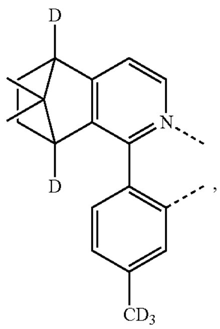
$L_{B316}$
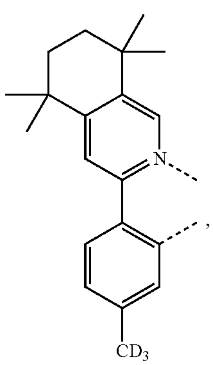
$L_{B317}$
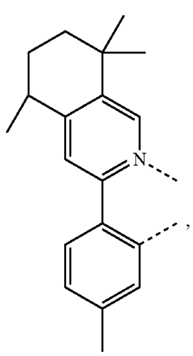
-continued
$L_{B318}$
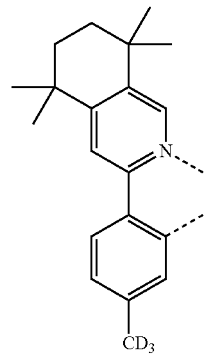
$L_{B319}$
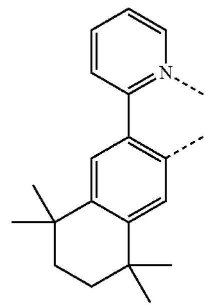
$L_{B320}$
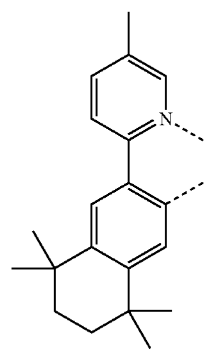
$L_{B321}$
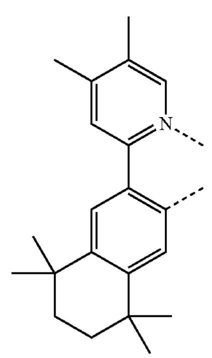

$L_{B322}$
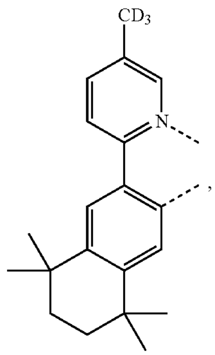
$L_{B323}$
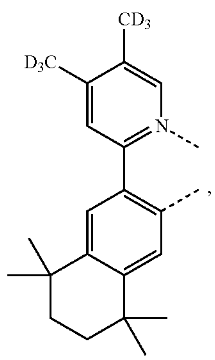
$L_{B324}$
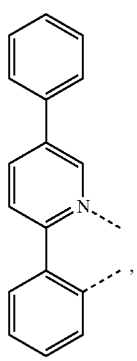
$L_{B325}$
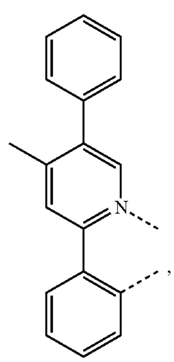
$L_{B326}$
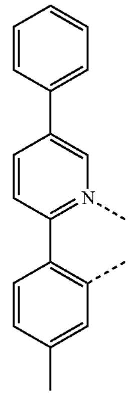
$L_{B327}$
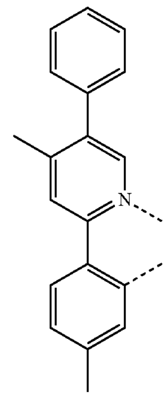
$L_{B328}$
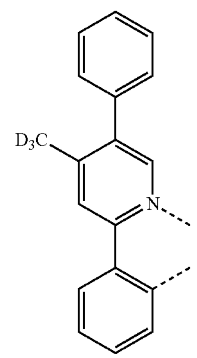
$L_{B329}$
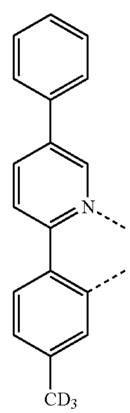

-continued
L_B330
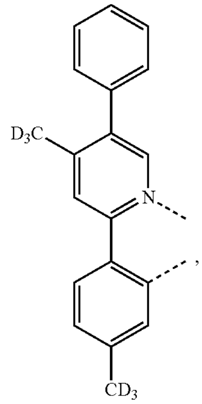
L_B331
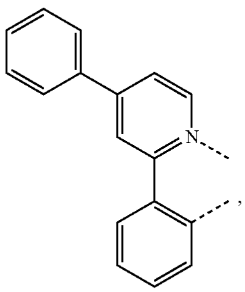
L_B332
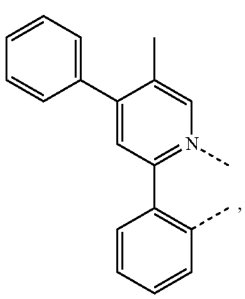
L_B333
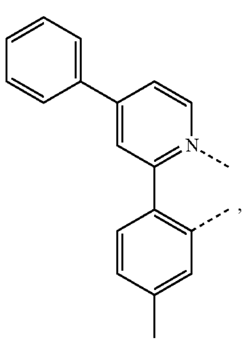
-continued
L_B334
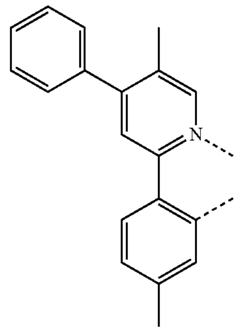
L_B335
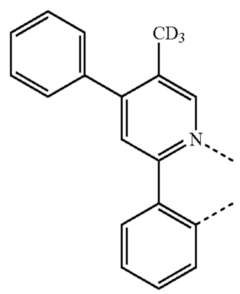
L_B336
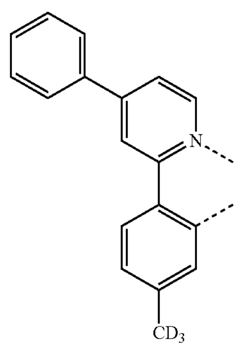
L_B337
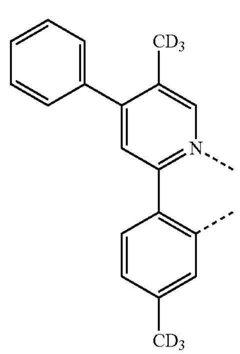

-continued
$L_{B338}$
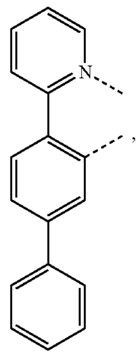
$L_{B339}$
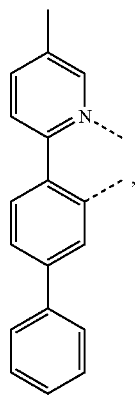
$L_{B340}$
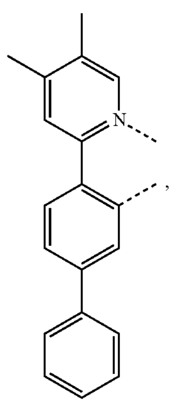
$L_{B341}$
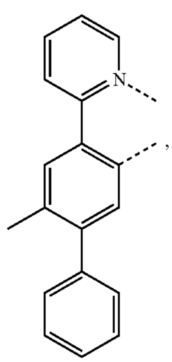
-continued
$L_{B342}$
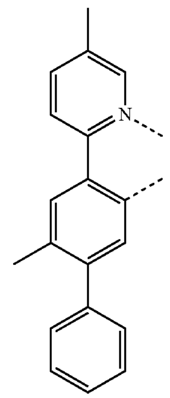
$L_{B343}$
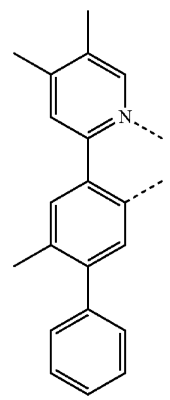
$L_{B344}$
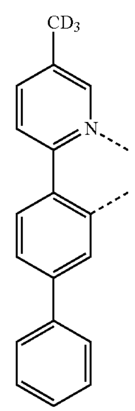
$L_{B345}$
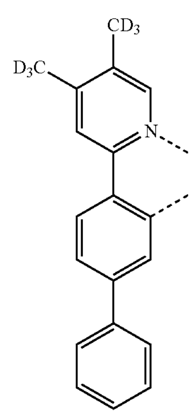

-continued
$L_{B346}$
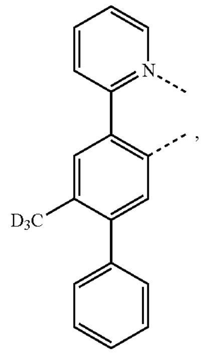
$L_{B347}$
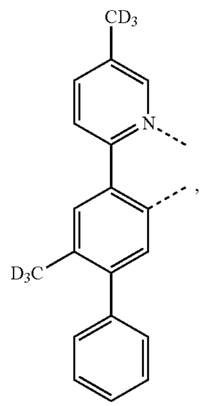
$L_{B348}$
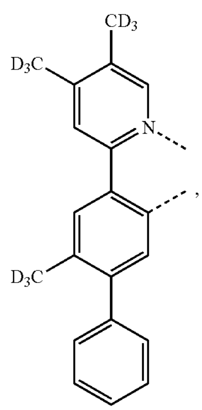
$L_{B349}$
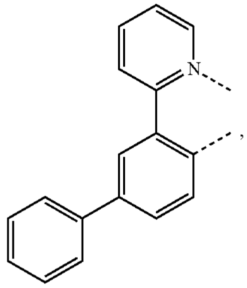
-continued
$L_{B350}$
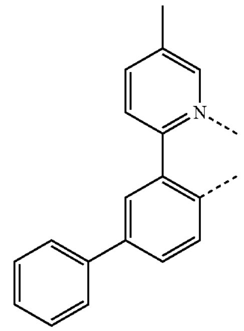
$L_{B351}$
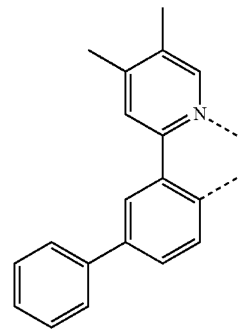
$L_{B352}$
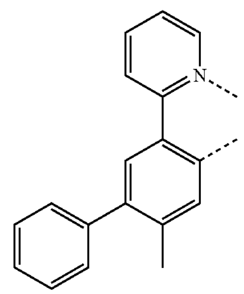
$L_{B353}$
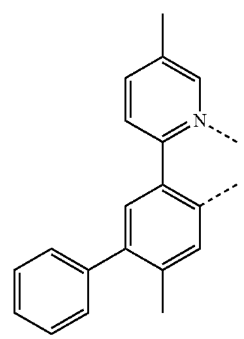
$L_{B354}$
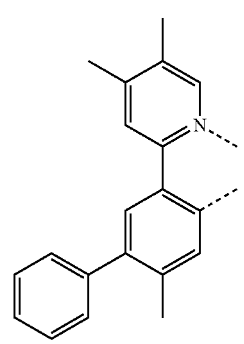

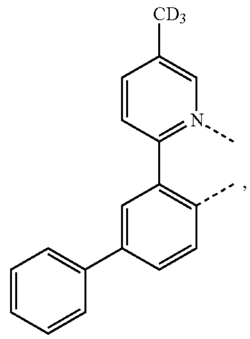
$L_{B355}$
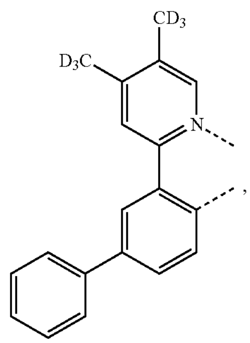
$L_{B356}$
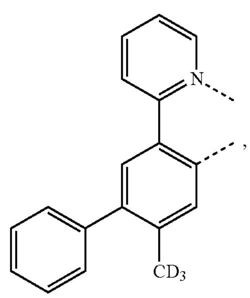
$L_{B357}$
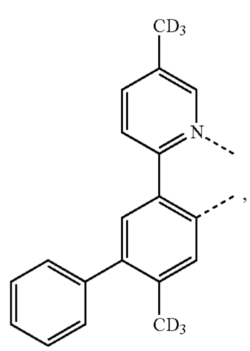
$L_{B358}$
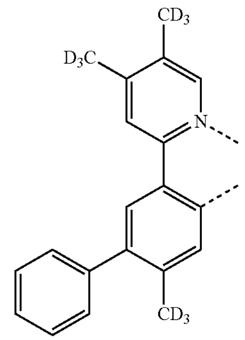
$L_{B359}$
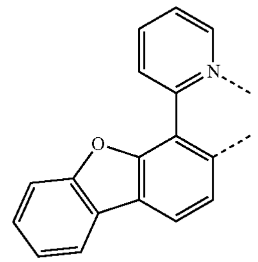
$L_{B360}$
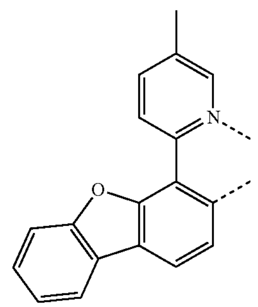
$L_{B361}$
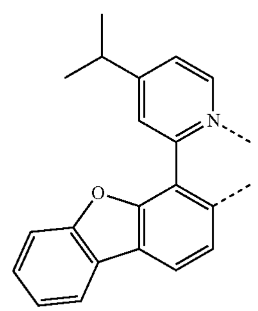
$L_{B362}$
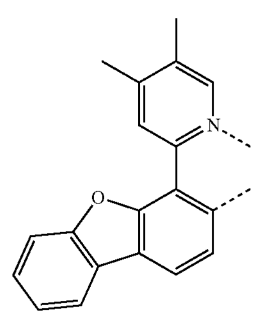
$L_{B363}$ $L_{B364}$
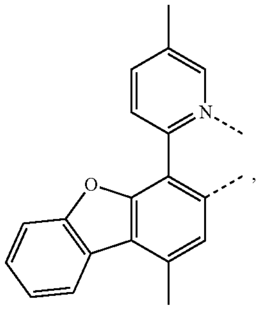
$L_{B365}$
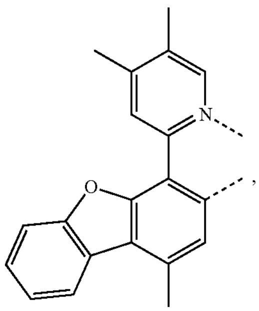
$L_{B366}$
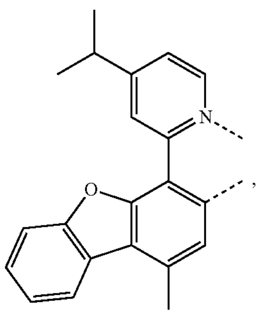
$L_{B367}$
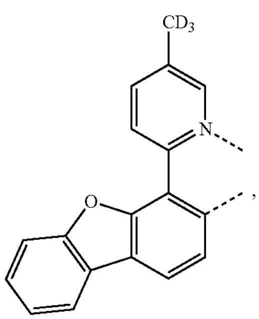
$L_{B368}$
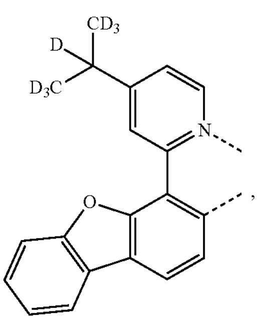
$L_{B369}$
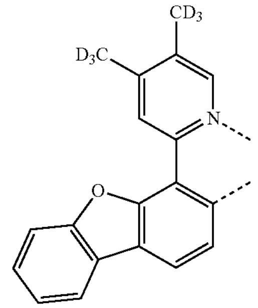
$L_{B370}$
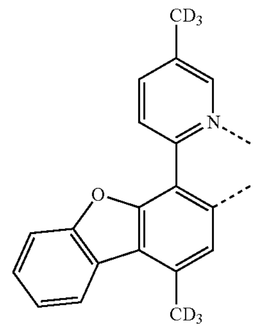
$L_{B371}$
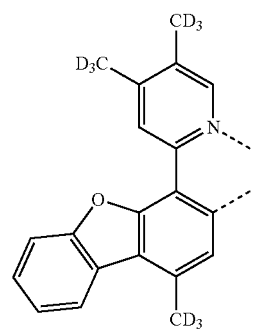
$L_{B372}$
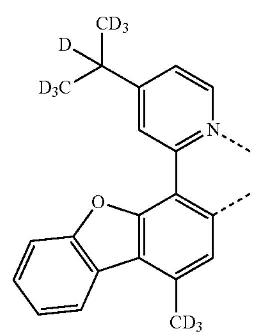
$L_{B373}$
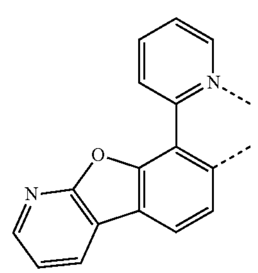

-continued
$L_{B374}$
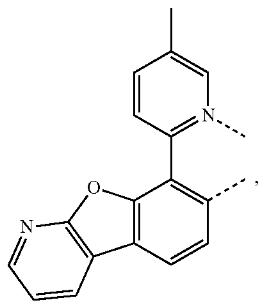
$L_{B375}$
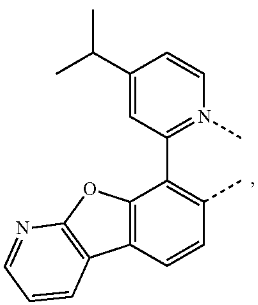
$L_{B376}$
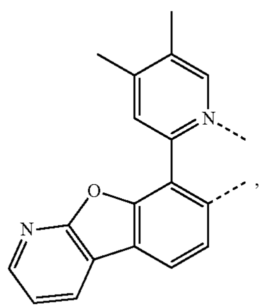
$L_{B377}$
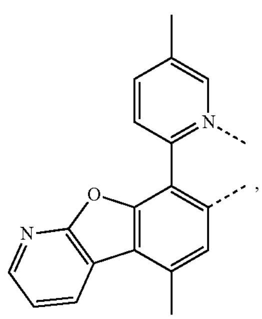
$L_{B378}$
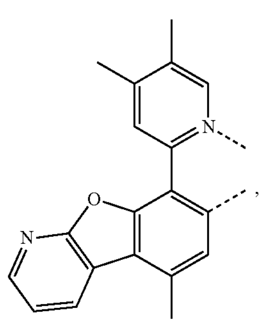
-continued
$L_{B379}$
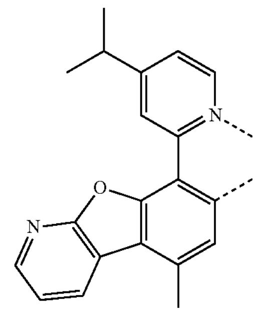
$L_{B380}$
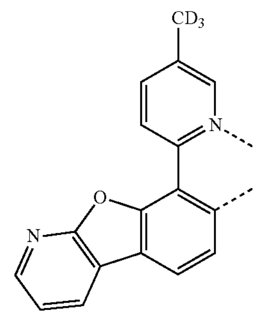
$L_{B381}$
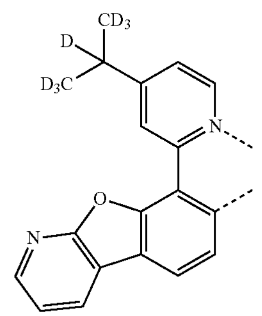
$L_{B382}$
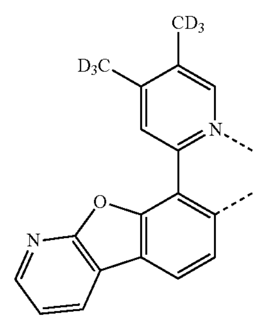
$L_{B383}$
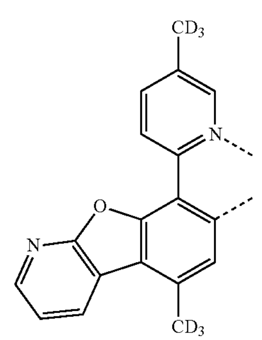

$L_{B384}$
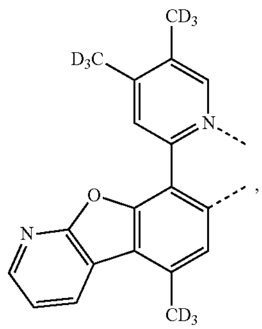
$L_{B385}$
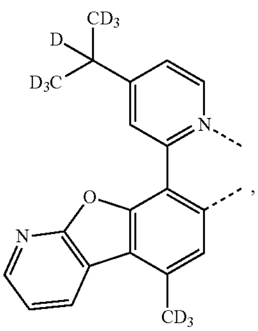
$L_{B386}$
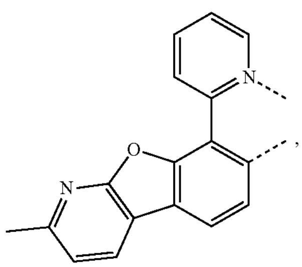
$L_{B387}$
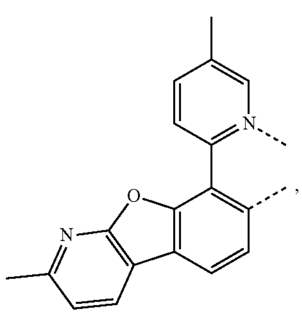
$L_{B388}$
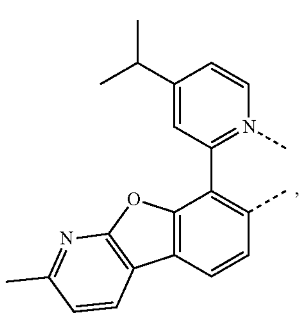
$L_{B389}$
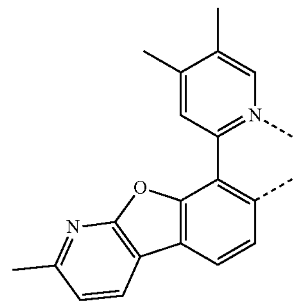
$L_{B390}$
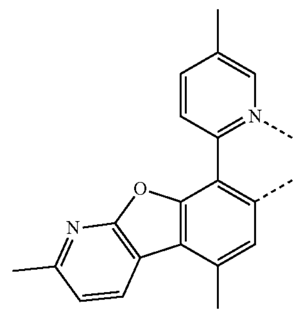
$L_{B391}$
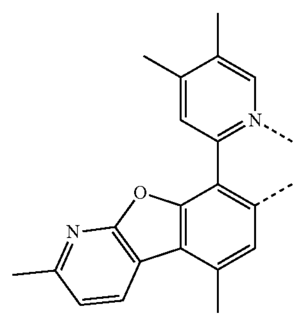
$L_{B392}$
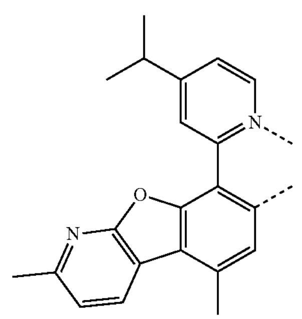
$L_{B393}$
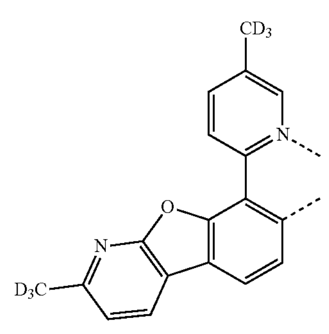

-continued
$L_{B394}$
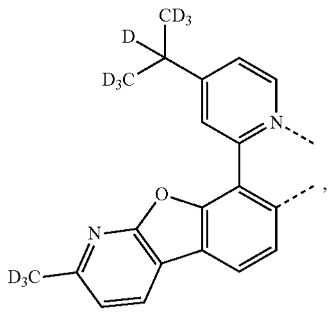
$L_{B395}$
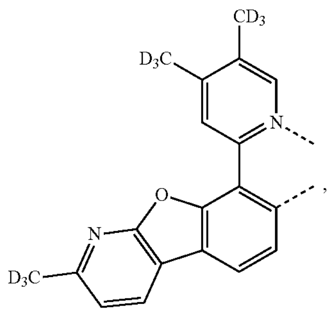
$L_{B396}$
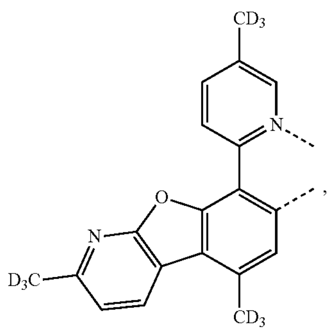
$L_{B397}$
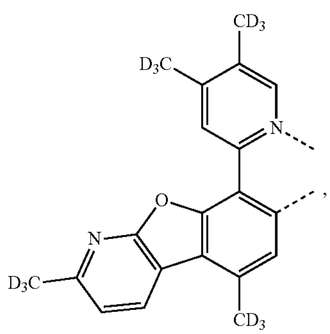
$L_{B398}$
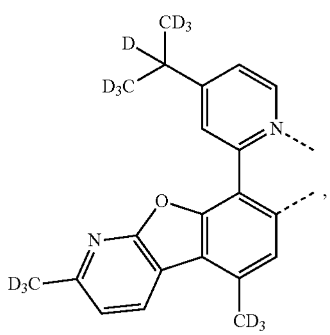
-continued
$L_{B399}$
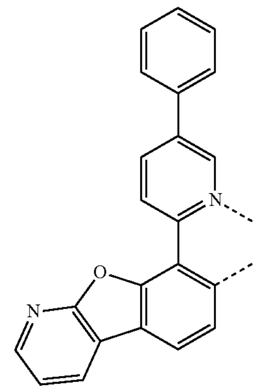
$L_{B400}$
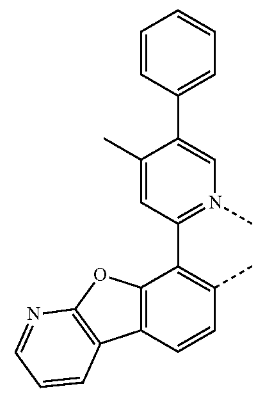
$L_{B401}$
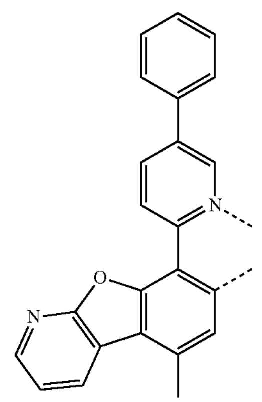
$L_{B402}$
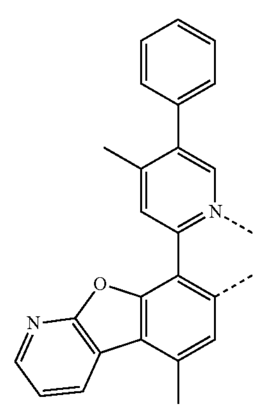

-continued
$L_{B403}$
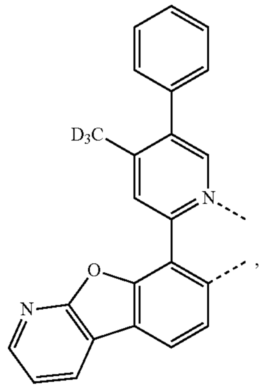
$L_{B404}$
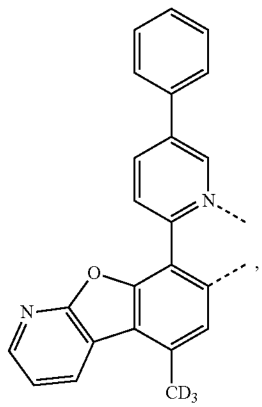
$L_{B405}$
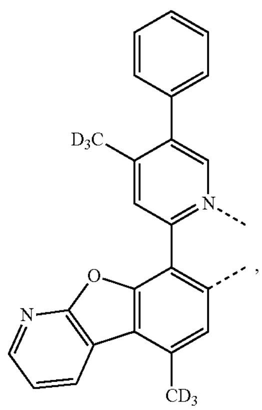
$L_{B406}$
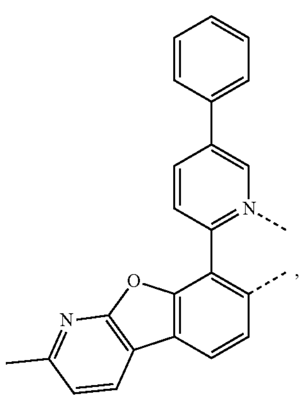
-continued
$L_{B407}$
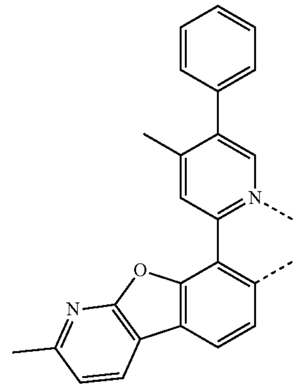
$L_{B408}$
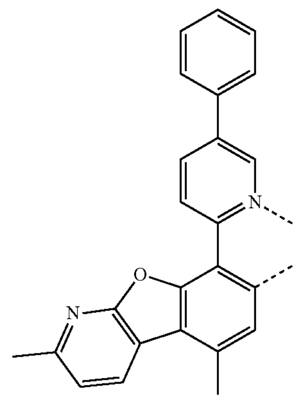
$L_{B409}$
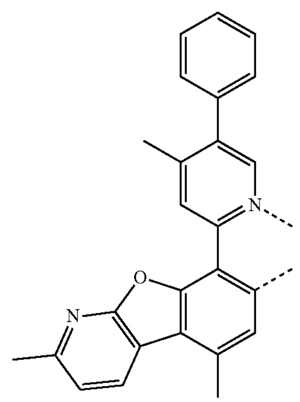
$L_{B410}$
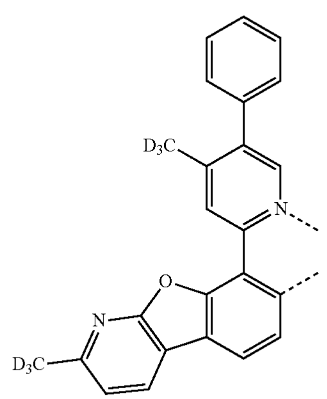

-continued
$L_{B411}$
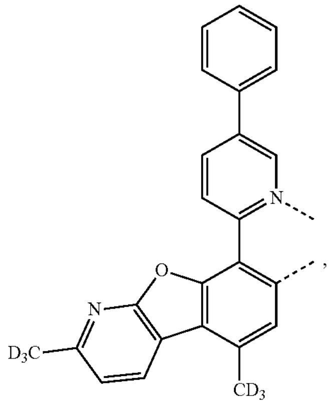
$L_{B412}$
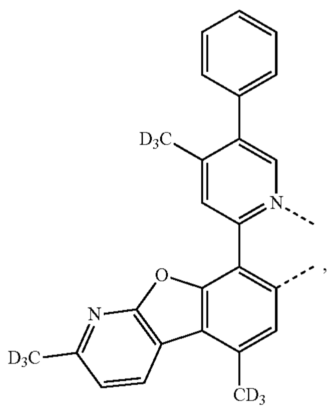
$L_{B413}$
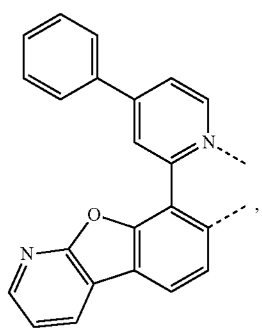
$L_{B414}$
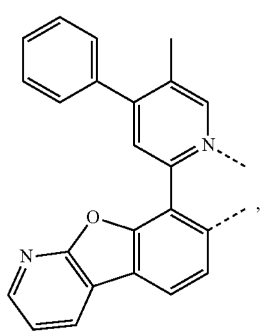
-continued
$L_{B415}$
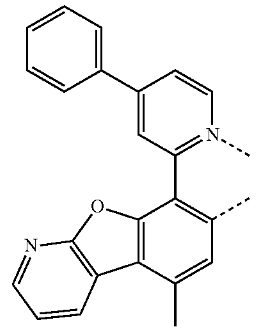
$L_{B416}$
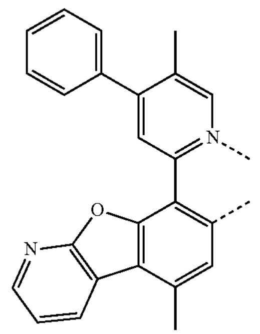
$L_{B417}$
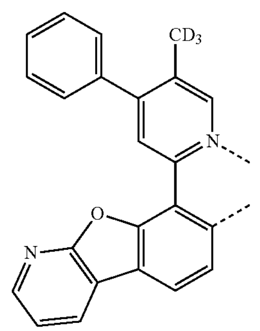
$L_{B418}$
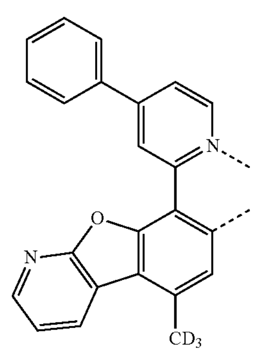

-continued
$L_{B419}$
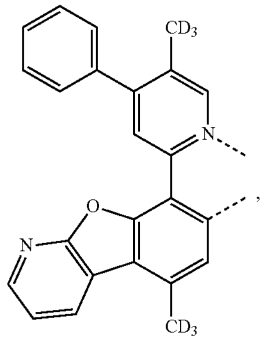
$L_{B420}$
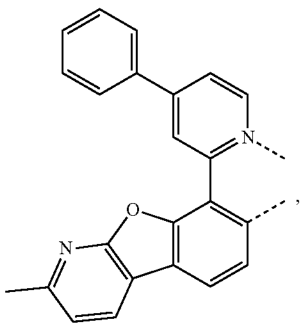
$L_{B421}$
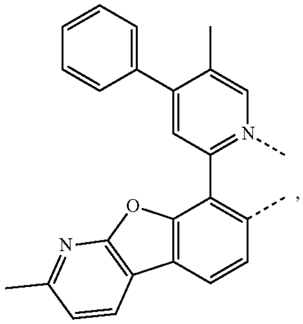
$L_{B422}$
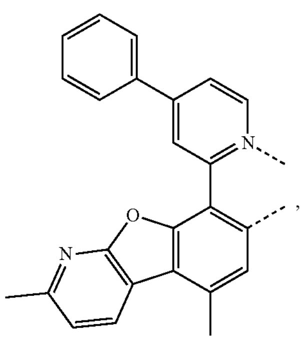
-continued
$L_{B423}$
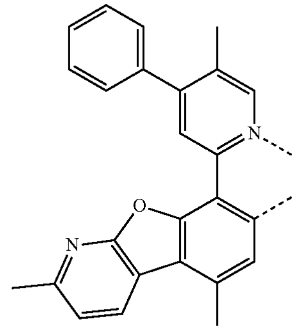
$L_{B424}$
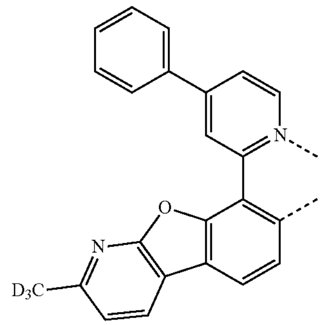
$L_{B425}$
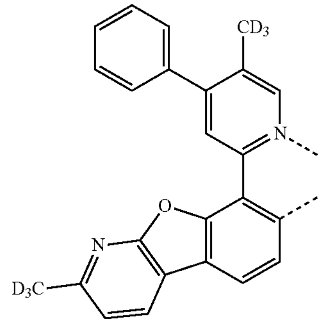
$L_{B426}$
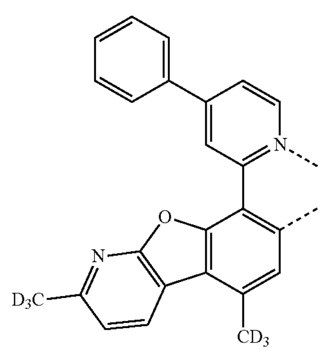

-continued
$L_{B427}$
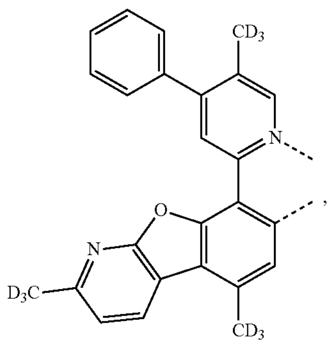
$L_{B428}$
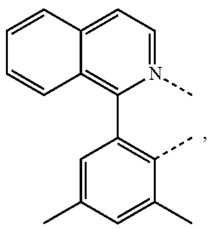
$L_{B429}$
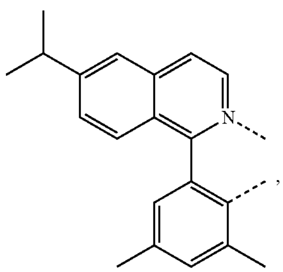
$L_{B430}$
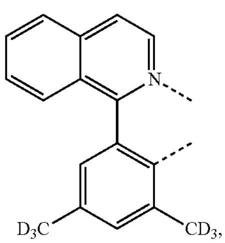
$L_{B431}$
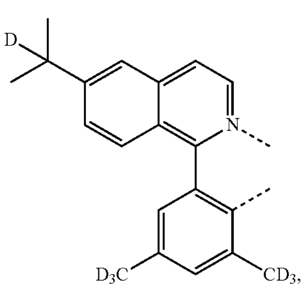
-continued
$L_{B432}$
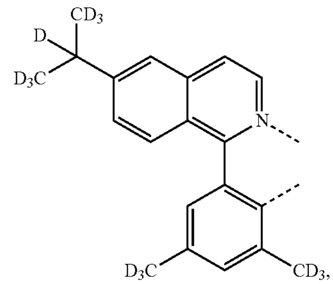
$L_{B433}$
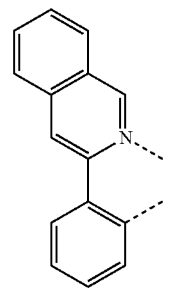
$L_{B434}$
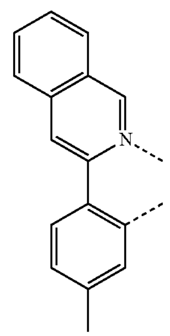
$L_{B435}$
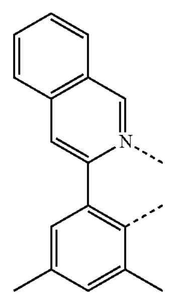
$L_{B436}$
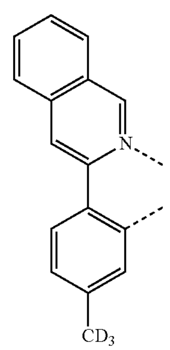

-continued
$L_{B437}$
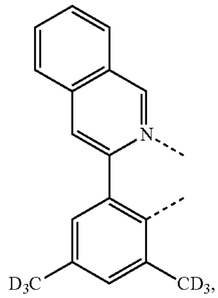
$L_{B438}$
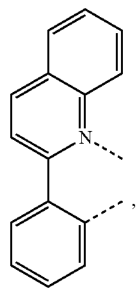
$L_{B439}$
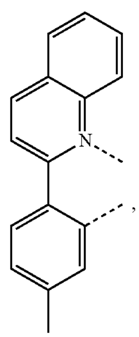
$L_{B440}$
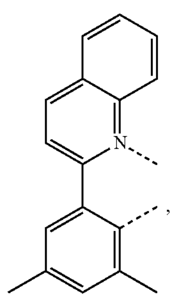
$L_{B441}$
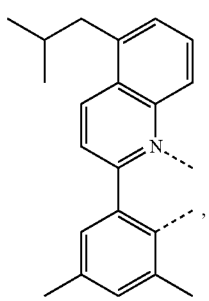
-continued
$L_{B442}$
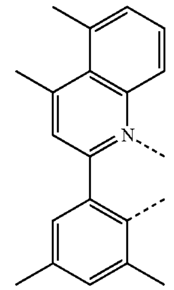
$L_{B443}$
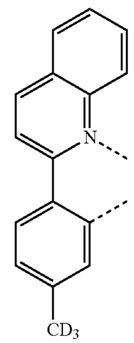
$L_{B444}$
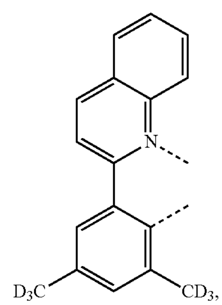
$L_{B445}$
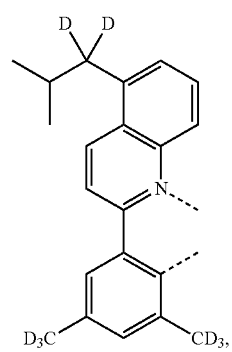
$L_{B446}$
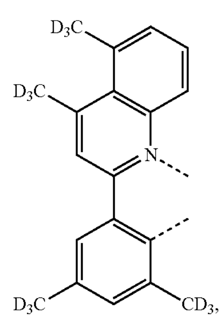

-continued
$L_{B447}$
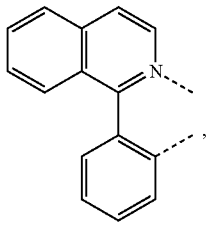
$L_{B448}$
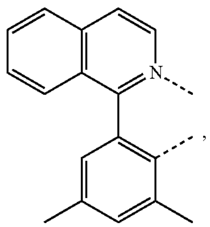
$L_{B449}$
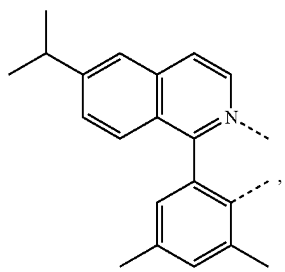
$L_{B450}$
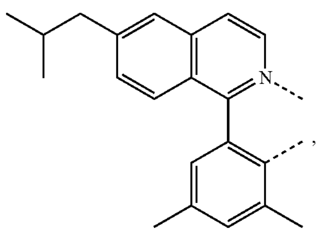
$L_{B451}$
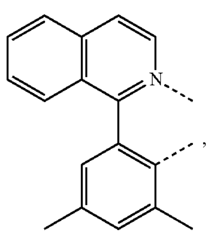
$L_{B452}$
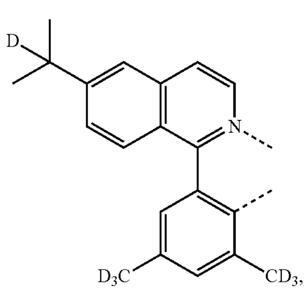
-continued
$L_{B453}$
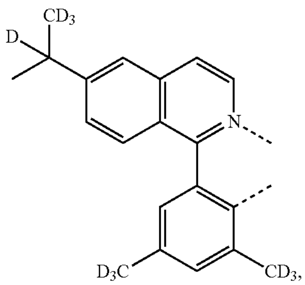
$L_{B454}$
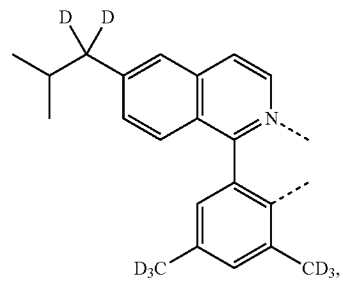
$L_{B455}$
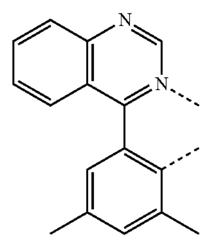
$L_{B456}$
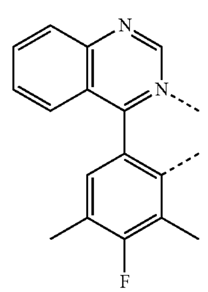
$L_{B457}$
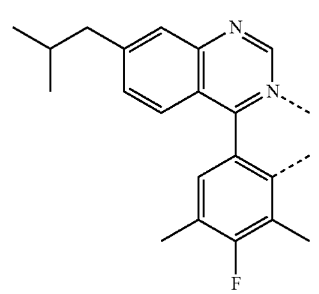

-continued
$L_{B458}$
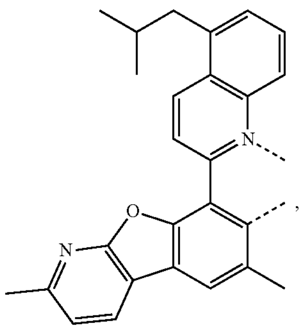
$L_{B459}$
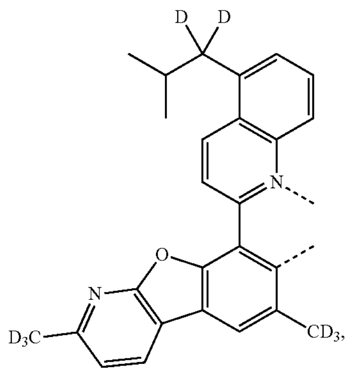
$L_{B460}$
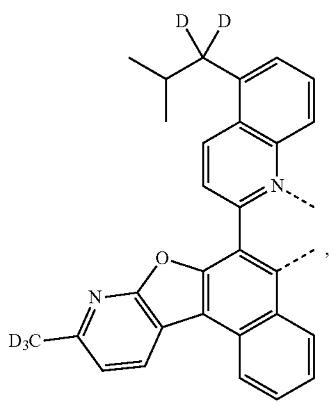
$L_{B461}$
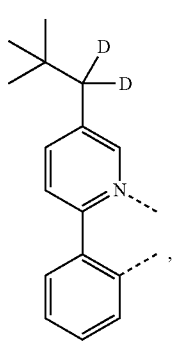
-continued
$L_{B462}$
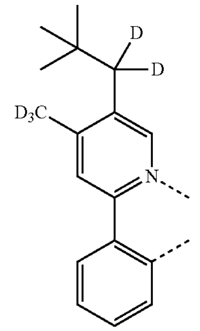
$L_{B463}$
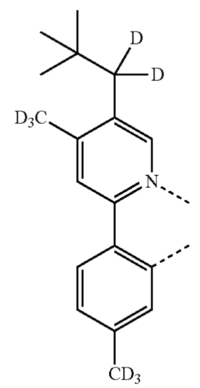
$L_{B464}$
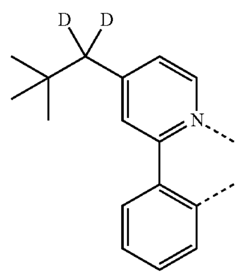
$L_{B465}$
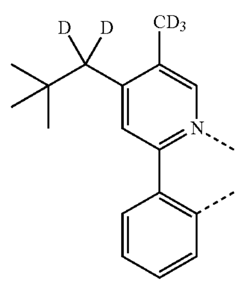
$L_{B466}$
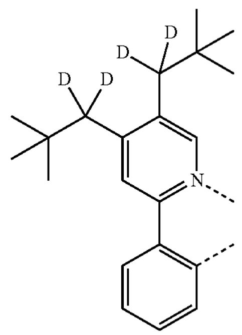

-continued

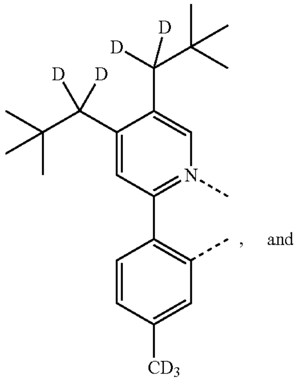

$L_{B467}$

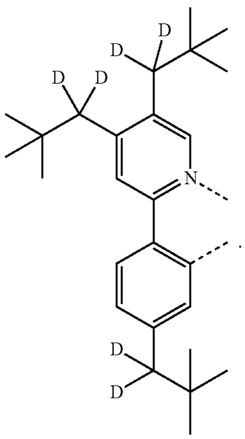

$L_{B468}$

In some embodiments, the compound is the Compound Cz having the formula $Ir(L_{Ai})_2(L_{Cj})$; where z=1260i+j−1260; i is an integer from 1 to 4780; j is an integer from 1 to 1260; and ligand $L_{Ci}$ is selected from the group consisting of the following structures:

$L_{C1}$ through $L_{C1260}$ are based on a structure of Formula X,

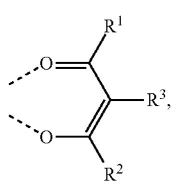

in which $R^1$, $R^2$, and $R^3$ are defined as:

| Ligand | $R^1$ | $R^2$ | $R^3$ |
|---|---|---|---|
| $L_{C1}$ | $R^{D1}$ | $R^{D1}$ | H |
| $L_{C2}$ | $R^{D2}$ | $R^{D2}$ | H |
| $L_{C3}$ | $R^{D3}$ | $R^{D3}$ | H |
| $L_{C4}$ | $R^{D4}$ | $R^{D4}$ | H |
| $L_{C5}$ | $R^{D5}$ | $R^{D5}$ | H |
| $L_{C6}$ | $R^{D6}$ | $R^{D6}$ | H |
| $L_{C7}$ | $R^{D7}$ | $R^{D7}$ | H |
| $L_{C8}$ | $R^{D8}$ | $R^{D8}$ | H |
| $L_{C9}$ | $R^{D9}$ | $R^{D9}$ | H |
| $L_{C10}$ | $R^{D10}$ | $R^{D10}$ | H |
| $L_{C11}$ | $R^{D11}$ | $R^{D11}$ | H |
| $L_{C12}$ | $R^{D12}$ | $R^{D12}$ | H |
| $L_{C13}$ | $R^{D13}$ | $R^{D13}$ | H |

-continued

| Ligand | $R^1$ | $R^2$ | $R^3$ |
|---|---|---|---|
| $L_{C14}$ | $R^{D14}$ | $R^{D14}$ | H |
| $L_{C15}$ | $R^{D15}$ | $R^{D15}$ | H |
| $L_{C16}$ | $R^{D16}$ | $R^{D16}$ | H |
| $L_{C17}$ | $R^{D17}$ | $R^{D17}$ | H |
| $L_{C18}$ | $R^{D18}$ | $R^{D18}$ | H |
| $L_{C19}$ | $R^{D19}$ | $R^{D19}$ | H |
| $L_{C20}$ | $R^{D20}$ | $R^{D20}$ | H |
| $L_{C21}$ | $R^{D21}$ | $R^{D21}$ | H |
| $L_{C22}$ | $R^{D22}$ | $R^{D22}$ | H |
| $L_{C23}$ | $R^{D23}$ | $R^{D23}$ | H |
| $L_{C24}$ | $R^{D24}$ | $R^{D24}$ | H |
| $L_{C25}$ | $R^{D25}$ | $R^{D25}$ | H |
| $L_{C26}$ | $R^{D26}$ | $R^{D26}$ | H |
| $L_{C27}$ | $R^{D27}$ | $R^{D27}$ | H |
| $L_{C28}$ | $R^{D28}$ | $R^{D28}$ | H |
| $L_{C29}$ | $R^{D29}$ | $R^{D29}$ | H |
| $L_{C30}$ | $R^{D30}$ | $R^{D30}$ | H |
| $L_{C31}$ | $R^{D31}$ | $R^{D31}$ | H |
| $L_{C32}$ | $R^{D32}$ | $R^{D32}$ | H |
| $L_{C33}$ | $R^{D33}$ | $R^{D33}$ | H |
| $L_{C34}$ | $R^{D34}$ | $R^{D34}$ | H |
| $L_{C35}$ | $R^{D35}$ | $R^{D35}$ | H |
| $L_{C36}$ | $R^{D40}$ | $R^{D40}$ | H |
| $L_{C37}$ | $R^{D41}$ | $R^{D41}$ | H |
| $L_{C38}$ | $R^{D42}$ | $R^{D42}$ | H |
| $L_{C39}$ | $R^{D64}$ | $R^{D64}$ | H |
| $L_{C40}$ | $R^{D66}$ | $R^{D66}$ | H |
| $L_{C41}$ | $R^{D68}$ | $R^{D68}$ | H |
| $L_{C42}$ | $R^{D76}$ | $R^{D76}$ | H |
| $L_{C43}$ | $R^{D1}$ | $R^{D2}$ | H |
| $L_{C44}$ | $R^{D1}$ | $R^{D3}$ | H |
| $L_{C45}$ | $R^{D1}$ | $R^{D4}$ | H |
| $L_{C46}$ | $R^{D1}$ | $R^{D5}$ | H |
| $L_{C47}$ | $R^{D1}$ | $R^{D6}$ | H |
| $L_{C48}$ | $R^{D1}$ | $R^{D7}$ | H |
| $L_{C49}$ | $R^{D1}$ | $R^{D8}$ | H |
| $L_{C50}$ | $R^{D1}$ | $R^{D9}$ | H |
| $L_{C51}$ | $R^{D1}$ | $R^{D10}$ | H |
| $L_{C52}$ | $R^{D1}$ | $R^{D11}$ | H |
| $L_{C53}$ | $R^{D1}$ | $R^{D12}$ | H |
| $L_{C54}$ | $R^{D1}$ | $R^{D13}$ | H |
| $L_{C55}$ | $R^{D1}$ | $R^{D14}$ | H |
| $L_{C56}$ | $R^{D1}$ | $R^{D15}$ | H |
| $L_{C57}$ | $R^{D1}$ | $R^{D16}$ | H |
| $L_{C58}$ | $R^{D1}$ | $R^{D17}$ | H |
| $L_{C59}$ | $R^{D1}$ | $R^{D18}$ | H |
| $L_{C60}$ | $R^{D1}$ | $R^{D19}$ | H |
| $L_{C61}$ | $R^{D1}$ | $R^{D20}$ | H |
| $L_{C62}$ | $R^{D1}$ | $R^{D21}$ | H |
| $L_{C63}$ | $R^{D1}$ | $R^{D22}$ | H |
| $L_{C64}$ | $R^{D1}$ | $R^{D23}$ | H |
| $L_{C65}$ | $R^{D1}$ | $R^{D24}$ | H |
| $L_{C66}$ | $R^{D1}$ | $R^{D25}$ | H |
| $L_{C67}$ | $R^{D1}$ | $R^{D26}$ | H |
| $L_{C68}$ | $R^{D1}$ | $R^{D27}$ | H |
| $L_{C69}$ | $R^{D1}$ | $R^{D28}$ | H |
| $L_{C70}$ | $R^{D1}$ | $R^{D29}$ | H |
| $L_{C71}$ | $R^{D1}$ | $R^{D30}$ | H |
| $L_{C72}$ | $R^{D1}$ | $R^{D31}$ | H |
| $L_{C73}$ | $R^{D1}$ | $R^{D32}$ | H |
| $L_{C74}$ | $R^{D1}$ | $R^{D33}$ | H |
| $L_{C75}$ | $R^{D1}$ | $R^{D34}$ | H |
| $L_{C76}$ | $R^{D1}$ | $R^{D35}$ | H |
| $L_{C77}$ | $R^{D1}$ | $R^{D40}$ | H |
| $L_{C78}$ | $R^{D1}$ | $R^{D41}$ | H |
| $L_{C79}$ | $R^{D1}$ | $R^{D42}$ | H |
| $L_{C80}$ | $R^{D1}$ | $R^{D64}$ | H |
| $L_{C81}$ | $R^{D1}$ | $R^{D66}$ | H |
| $L_{C82}$ | $R^{D1}$ | $R^{D68}$ | H |
| $L_{C83}$ | $R^{D1}$ | $R^{D76}$ | H |
| $L_{C84}$ | $R^{D2}$ | $R^{D1}$ | H |
| $L_{C85}$ | $R^{D2}$ | $R^{D3}$ | H |
| $L_{C86}$ | $R^{D2}$ | $R^{D4}$ | H |
| $L_{C87}$ | $R^{D2}$ | $R^{D5}$ | H |
| $L_{C88}$ | $R^{D2}$ | $R^{D6}$ | H |
| $L_{C89}$ | $R^{D2}$ | $R^{D7}$ | H |
| $L_{C90}$ | $R^{D2}$ | $R^{D8}$ | H |

-continued

| Ligand | $R^1$ | $R^2$ | $R^3$ |
|---|---|---|---|
| $L_{C91}$ | $R^{D2}$ | $R^{D9}$ | H |
| $L_{C92}$ | $R^{D2}$ | $R^{D10}$ | H |
| $L_{C93}$ | $R^{D2}$ | $R^{D11}$ | H |
| $L_{C94}$ | $R^{D2}$ | $R^{D12}$ | H |
| $L_{C95}$ | $R^{D2}$ | $R^{D13}$ | H |
| $L_{C96}$ | $R^{D2}$ | $R^{D14}$ | H |
| $L_{C97}$ | $R^{D2}$ | $R^{D15}$ | H |
| $L_{C98}$ | $R^{D2}$ | $R^{D16}$ | H |
| $L_{C99}$ | $R^{D2}$ | $R^{D17}$ | H |
| $L_{C100}$ | $R^{D2}$ | $R^{D18}$ | H |
| $L_{C101}$ | $R^{D2}$ | $R^{D19}$ | H |
| $L_{C102}$ | $R^{D2}$ | $R^{D20}$ | H |
| $L_{C103}$ | $R^{D2}$ | $R^{D21}$ | H |
| $L_{C104}$ | $R^{D2}$ | $R^{D22}$ | H |
| $L_{C105}$ | $R^{D2}$ | $R^{D23}$ | H |
| $L_{C106}$ | $R^{D2}$ | $R^{D24}$ | H |
| $L_{C107}$ | $R^{D2}$ | $R^{D25}$ | H |
| $L_{C108}$ | $R^{D2}$ | $R^{D26}$ | H |
| $L_{C109}$ | $R^{D2}$ | $R^{D27}$ | H |
| $L_{C110}$ | $R^{D2}$ | $R^{D28}$ | H |
| $L_{C111}$ | $R^{D2}$ | $R^{D29}$ | H |
| $L_{C112}$ | $R^{D2}$ | $R^{D30}$ | H |
| $L_{C113}$ | $R^{D2}$ | $R^{D31}$ | H |
| $L_{C114}$ | $R^{D2}$ | $R^{D32}$ | H |
| $L_{C115}$ | $R^{D2}$ | $R^{D33}$ | H |
| $L_{C116}$ | $R^{D2}$ | $R^{D34}$ | H |
| $L_{C117}$ | $R^{D2}$ | $R^{D35}$ | H |
| $L_{C118}$ | $R^{D2}$ | $R^{D40}$ | H |
| $L_{C119}$ | $R^{D2}$ | $R^{D41}$ | H |
| $L_{C120}$ | $R^{D2}$ | $R^{D42}$ | H |
| $L_{C121}$ | $R^{D2}$ | $R^{D64}$ | H |
| $L_{C122}$ | $R^{D2}$ | $R^{D66}$ | H |
| $L_{C123}$ | $R^{D2}$ | $R^{D68}$ | H |
| $L_{C124}$ | $R^{D2}$ | $R^{D76}$ | H |
| $L_{C125}$ | $R^{D3}$ | $R^{D4}$ | H |
| $L_{C126}$ | $R^{D3}$ | $R^{D5}$ | H |
| $L_{C127}$ | $R^{D3}$ | $R^{D6}$ | H |
| $L_{C128}$ | $R^{D3}$ | $R^{D7}$ | H |
| $L_{C129}$ | $R^{D3}$ | $R^{D8}$ | H |
| $L_{C130}$ | $R^{D3}$ | $R^{D9}$ | H |
| $L_{C131}$ | $R^{D3}$ | $R^{D10}$ | H |
| $L_{C132}$ | $R^{D3}$ | $R^{D11}$ | H |
| $L_{C133}$ | $R^{D3}$ | $R^{D12}$ | H |
| $L_{C134}$ | $R^{D3}$ | $R^{D13}$ | H |
| $L_{C135}$ | $R^{D3}$ | $R^{D14}$ | H |
| $L_{C136}$ | $R^{D3}$ | $R^{D15}$ | H |
| $L_{C137}$ | $R^{D3}$ | $R^{D16}$ | H |
| $L_{C138}$ | $R^{D3}$ | $R^{D17}$ | H |
| $L_{C139}$ | $R^{D3}$ | $R^{D18}$ | H |
| $L_{C140}$ | $R^{D3}$ | $R^{D19}$ | H |
| $L_{C141}$ | $R^{D3}$ | $R^{D20}$ | H |
| $L_{C142}$ | $R^{D3}$ | $R^{D21}$ | H |
| $L_{C143}$ | $R^{D3}$ | $R^{D22}$ | H |
| $L_{C144}$ | $R^{D3}$ | $R^{D23}$ | H |
| $L_{C145}$ | $R^{D3}$ | $R^{D24}$ | H |
| $L_{C146}$ | $R^{D3}$ | $R^{D25}$ | H |
| $L_{C147}$ | $R^{D3}$ | $R^{D26}$ | H |
| $L_{C148}$ | $R^{D3}$ | $R^{D27}$ | H |
| $L_{C149}$ | $R^{D3}$ | $R^{D28}$ | H |
| $L_{C150}$ | $R^{D3}$ | $R^{D29}$ | H |
| $L_{C151}$ | $R^{D3}$ | $R^{D30}$ | H |
| $L_{C152}$ | $R^{D3}$ | $R^{D31}$ | H |
| $L_{C153}$ | $R^{D3}$ | $R^{D32}$ | H |
| $L_{C154}$ | $R^{D3}$ | $R^{D33}$ | H |
| $L_{C155}$ | $R^{D3}$ | $R^{D34}$ | H |
| $L_{C156}$ | $R^{D3}$ | $R^{D35}$ | H |
| $L_{C157}$ | $R^{D3}$ | $R^{D40}$ | H |
| $L_{C158}$ | $R^{D3}$ | $R^{D41}$ | H |
| $L_{C159}$ | $R^{D3}$ | $R^{D42}$ | H |
| $L_{C160}$ | $R^{D3}$ | $R^{D64}$ | H |
| $L_{C161}$ | $R^{D3}$ | $R^{D66}$ | H |
| $L_{C162}$ | $R^{D3}$ | $R^{D68}$ | H |
| $L_{C163}$ | $R^{D3}$ | $R^{D76}$ | H |
| $L_{C164}$ | $R^{D4}$ | $R^{D5}$ | H |
| $L_{C165}$ | $R^{D4}$ | $R^{D6}$ | H |
| $L_{C166}$ | $R^{D4}$ | $R^{D7}$ | H |
| $L_{C167}$ | $R^{D4}$ | $R^{D8}$ | H |

-continued

| Ligand | $R^1$ | $R^2$ | $R^3$ |
|---|---|---|---|
| $L_{C168}$ | $R^{D4}$ | $R^{D9}$ | H |
| $L_{C169}$ | $R^{D4}$ | $R^{D10}$ | H |
| $L_{C170}$ | $R^{D4}$ | $R^{D11}$ | H |
| $L_{C171}$ | $R^{D4}$ | $R^{D12}$ | H |
| $L_{C172}$ | $R^{D4}$ | $R^{D13}$ | H |
| $L_{C173}$ | $R^{D4}$ | $R^{D14}$ | H |
| $L_{C174}$ | $R^{D4}$ | $R^{D15}$ | H |
| $L_{C175}$ | $R^{D4}$ | $R^{D16}$ | H |
| $L_{D176}$ | $R^{D4}$ | $R^{D17}$ | H |
| $L_{C177}$ | $R^{D4}$ | $R^{D18}$ | H |
| $L_{C178}$ | $R^{D4}$ | $R^{D19}$ | H |
| $L_{C179}$ | $R^{D4}$ | $R^{D20}$ | H |
| $L_{C180}$ | $R^{D4}$ | $R^{D21}$ | H |
| $L_{C181}$ | $R^{D4}$ | $R^{D22}$ | H |
| $L_{C182}$ | $R^{D4}$ | $R^{D23}$ | H |
| $L_{C183}$ | $R^{D4}$ | $R^{D24}$ | H |
| $L_{C184}$ | $R^{D4}$ | $R^{D25}$ | H |
| $L_{C185}$ | $R^{D4}$ | $R^{D26}$ | H |
| $L_{C186}$ | $R^{D4}$ | $R^{D27}$ | H |
| $L_{C187}$ | $R^{D4}$ | $R^{D28}$ | H |
| $L_{C188}$ | $R^{D4}$ | $R^{D29}$ | H |
| $L_{C189}$ | $R^{D4}$ | $R^{D30}$ | H |
| $L_{C190}$ | $R^{D4}$ | $R^{D31}$ | H |
| $L_{C191}$ | $R^{D4}$ | $R^{D32}$ | H |
| $L_{C192}$ | $R^{D4}$ | $R^{D33}$ | H |
| $L_{C193}$ | $R^{D4}$ | $R^{D34}$ | H |
| $L_{C194}$ | $R^{D4}$ | $R^{D35}$ | H |
| $L_{C195}$ | $R^{D4}$ | $R^{D40}$ | H |
| $L_{C196}$ | $R^{D4}$ | $R^{D41}$ | H |
| $L_{C197}$ | $R^{D4}$ | $R^{D42}$ | H |
| $L_{C198}$ | $R^{D4}$ | $R^{D64}$ | H |
| $L_{C199}$ | $R^{D4}$ | $R^{D66}$ | H |
| $L_{C200}$ | $R^{D4}$ | $R^{D68}$ | H |
| $L_{C201}$ | $R^{D4}$ | $R^{D76}$ | H |
| $L_{C202}$ | $R^{D4}$ | $R^{D1}$ | H |
| $L_{C203}$ | $R^{D7}$ | $R^{D5}$ | H |
| $L_{C204}$ | $R^{D7}$ | $R^{D6}$ | H |
| $L_{C205}$ | $R^{D7}$ | $R^{D8}$ | H |
| $L_{C206}$ | $R^{D7}$ | $R^{D9}$ | H |
| $L_{C207}$ | $R^{D7}$ | $R^{D10}$ | H |
| $L_{C208}$ | $R^{D7}$ | $R^{D11}$ | H |
| $L_{C209}$ | $R^{D7}$ | $R^{D12}$ | H |
| $L_{C210}$ | $R^{D7}$ | $R^{D13}$ | H |
| $L_{C211}$ | $R^{D7}$ | $R^{D14}$ | H |
| $L_{C212}$ | $R^{D7}$ | $R^{D15}$ | H |
| $L_{C213}$ | $R^{D7}$ | $R^{D16}$ | H |
| $L_{C214}$ | $R^{D7}$ | $R^{D17}$ | H |
| $L_{C215}$ | $R^{D7}$ | $R^{D18}$ | H |
| $L_{C216}$ | $R^{D7}$ | $R^{D19}$ | H |
| $L_{C217}$ | $R^{D7}$ | $R^{D20}$ | H |
| $L_{C218}$ | $R^{D7}$ | $R^{D21}$ | H |
| $L_{C219}$ | $R^{D7}$ | $R^{D22}$ | H |
| $L_{C220}$ | $R^{D7}$ | $R^{D23}$ | H |
| $L_{C221}$ | $R^{D7}$ | $R^{D24}$ | H |
| $L_{C222}$ | $R^{D7}$ | $R^{D25}$ | H |
| $L_{C223}$ | $R^{D7}$ | $R^{D26}$ | H |
| $L_{C224}$ | $R^{D7}$ | $R^{D27}$ | H |
| $L_{C225}$ | $R^{D7}$ | $R^{D28}$ | H |
| $L_{C226}$ | $R^{D7}$ | $R^{D29}$ | H |
| $L_{C227}$ | $R^{D7}$ | $R^{D30}$ | H |
| $L_{C228}$ | $R^{D7}$ | $R^{D31}$ | H |
| $L_{C229}$ | $R^{D7}$ | $R^{D32}$ | H |
| $L_{C230}$ | $R^{D7}$ | $R^{D33}$ | H |
| $L_{C231}$ | $R^{D7}$ | $R^{D34}$ | H |
| $L_{C232}$ | $R^{D7}$ | $R^{D35}$ | H |
| $L_{C233}$ | $R^{D7}$ | $R^{D40}$ | H |
| $L_{C234}$ | $R^{D7}$ | $R^{D41}$ | H |
| $L_{C235}$ | $R^{D7}$ | $R^{D42}$ | H |
| $L_{C236}$ | $R^{D7}$ | $R^{D64}$ | H |
| $L_{C237}$ | $R^{D7}$ | $R^{D66}$ | H |
| $L_{C238}$ | $R^{D7}$ | $R^{D68}$ | H |
| $L_{C239}$ | $R^{D7}$ | $R^{D76}$ | H |
| $L_{C240}$ | $R^{D8}$ | $R^{D5}$ | H |
| $L_{C241}$ | $R^{D8}$ | $R^{D6}$ | H |
| $L_{C242}$ | $R^{D8}$ | $R^{D9}$ | H |
| $L_{C243}$ | $R^{D8}$ | $R^{D10}$ | H |
| $L_{C244}$ | $R^{D8}$ | $R^{D11}$ | H |

-continued

| Ligand | $R^1$ | $R^2$ | $R^3$ |
|---|---|---|---|
| $L_{C245}$ | $R^{D8}$ | $R^{D12}$ | H |
| $L_{C246}$ | $R^{D8}$ | $R^{D13}$ | H |
| $L_{C247}$ | $R^{D8}$ | $R^{D14}$ | H |
| $L_{C248}$ | $R^{D8}$ | $R^{D15}$ | H |
| $L_{C249}$ | $R^{D8}$ | $R^{D16}$ | H |
| $L_{C250}$ | $R^{D8}$ | $R^{D17}$ | H |
| $L_{C251}$ | $R^{D8}$ | $R^{D18}$ | H |
| $L_{C252}$ | $R^{D8}$ | $R^{D19}$ | H |
| $L_{C253}$ | $R^{D8}$ | $R^{D20}$ | H |
| $L_{C254}$ | $R^{D8}$ | $R^{D21}$ | H |
| $L_{C255}$ | $R^{D8}$ | $R^{D22}$ | H |
| $L_{C256}$ | $R^{D8}$ | $R^{D23}$ | H |
| $L_{C257}$ | $R^{D8}$ | $R^{D24}$ | H |
| $L_{C258}$ | $R^{D8}$ | $R^{D25}$ | H |
| $L_{C259}$ | $R^{D8}$ | $R^{D26}$ | H |
| $L_{C260}$ | $R^{D8}$ | $R^{D27}$ | H |
| $L_{C261}$ | $R^{D8}$ | $R^{D28}$ | H |
| $L_{C262}$ | $R^{D8}$ | $R^{D29}$ | H |
| $L_{C263}$ | $R^{D8}$ | $R^{D30}$ | H |
| $L_{C264}$ | $R^{D8}$ | $R^{D31}$ | H |
| $L_{C265}$ | $R^{D8}$ | $R^{D32}$ | H |
| $L_{C266}$ | $R^{D8}$ | $R^{D33}$ | H |
| $L_{C267}$ | $R^{D8}$ | $R^{D34}$ | H |
| $L_{C268}$ | $R^{D8}$ | $R^{D35}$ | H |
| $L_{C269}$ | $R^{D8}$ | $R^{D40}$ | H |
| $L_{C270}$ | $R^{D8}$ | $R^{D41}$ | H |
| $L_{C271}$ | $R^{D8}$ | $R^{D42}$ | H |
| $L_{C272}$ | $R^{D8}$ | $R^{D64}$ | H |
| $L_{C273}$ | $R^{D8}$ | $R^{D66}$ | H |
| $L_{C274}$ | $R^{D8}$ | $R^{D68}$ | H |
| $L_{C275}$ | $R^{D8}$ | $R^{D76}$ | H |
| $L_{C276}$ | $R^{D11}$ | $R^{D5}$ | H |
| $L_{C277}$ | $R^{D11}$ | $R^{D6}$ | H |
| $L_{C278}$ | $R^{D11}$ | $R^{D9}$ | H |
| $L_{C279}$ | $R^{D11}$ | $R^{D10}$ | H |
| $L_{C280}$ | $R^{D11}$ | $R^{D12}$ | H |
| $L_{C281}$ | $R^{D11}$ | $R^{D13}$ | H |
| $L_{C282}$ | $R^{D11}$ | $R^{D14}$ | H |
| $L_{C283}$ | $R^{D11}$ | $R^{D15}$ | H |
| $L_{C284}$ | $R^{D11}$ | $R^{D16}$ | H |
| $L_{C285}$ | $R^{D11}$ | $R^{D17}$ | H |
| $L_{C286}$ | $R^{D11}$ | $R^{D18}$ | H |
| $L_{C287}$ | $R^{D11}$ | $R^{D19}$ | H |
| $L_{C288}$ | $R^{D11}$ | $R^{D20}$ | H |
| $L_{C289}$ | $R^{D11}$ | $R^{D21}$ | H |
| $L_{C290}$ | $R^{D11}$ | $R^{D22}$ | H |
| $L_{C291}$ | $R^{D11}$ | $R^{D23}$ | H |
| $L_{C292}$ | $R^{D11}$ | $R^{D24}$ | H |
| $L_{C293}$ | $R^{D11}$ | $R^{D25}$ | H |
| $L_{C294}$ | $R^{D11}$ | $R^{D26}$ | H |
| $L_{C295}$ | $R^{D11}$ | $R^{D27}$ | H |
| $L_{C296}$ | $R^{D11}$ | $R^{D28}$ | H |
| $L_{C297}$ | $R^{D11}$ | $R^{D29}$ | H |
| $L_{C298}$ | $R^{D11}$ | $R^{D30}$ | H |
| $L_{C299}$ | $R^{D11}$ | $R^{D31}$ | H |
| $L_{C300}$ | $R^{D11}$ | $R^{D32}$ | H |
| $L_{C301}$ | $R^{D11}$ | $R^{D33}$ | H |
| $L_{C302}$ | $R^{D11}$ | $R^{D34}$ | H |
| $L_{C303}$ | $R^{D11}$ | $R^{D35}$ | H |
| $L_{C304}$ | $R^{D11}$ | $R^{D40}$ | H |
| $L_{C305}$ | $R^{D11}$ | $R^{D41}$ | H |
| $L_{C306}$ | $R^{D11}$ | $R^{D42}$ | H |
| $L_{C307}$ | $R^{D11}$ | $R^{D64}$ | H |
| $L_{C308}$ | $R^{D11}$ | $R^{D66}$ | H |
| $L_{C309}$ | $R^{D11}$ | $R^{D68}$ | H |
| $L_{C310}$ | $R^{D11}$ | $R^{D76}$ | H |
| $L_{C311}$ | $R^{D13}$ | $R^{D5}$ | H |
| $L_{C312}$ | $R^{D13}$ | $R^{D6}$ | H |
| $L_{C313}$ | $R^{D13}$ | $R^{D9}$ | H |
| $L_{C314}$ | $R^{D13}$ | $R^{D10}$ | H |
| $L_{C315}$ | $R^{D13}$ | $R^{D12}$ | H |
| $L_{C316}$ | $R^{D13}$ | $R^{D14}$ | H |
| $L_{C317}$ | $R^{D13}$ | $R^{D15}$ | H |
| $L_{C318}$ | $R^{D13}$ | $R^{D16}$ | H |
| $L_{C319}$ | $R^{D13}$ | $R^{D17}$ | H |
| $L_{C320}$ | $R^{D13}$ | $R^{D18}$ | H |
| $L_{C321}$ | $R^{D13}$ | $R^{D19}$ | H |

-continued

| Ligand | $R^1$ | $R^2$ | $R^3$ |
|---|---|---|---|
| $L_{C322}$ | $R^{D13}$ | $R^{D20}$ | H |
| $L_{C323}$ | $R^{D13}$ | $R^{D21}$ | H |
| $L_{C324}$ | $R^{D13}$ | $R^{D22}$ | H |
| $L_{C325}$ | $R^{D13}$ | $R^{D23}$ | H |
| $L_{C326}$ | $R^{D13}$ | $R^{D24}$ | H |
| $L_{C327}$ | $R^{D13}$ | $R^{D25}$ | H |
| $L_{C328}$ | $R^{D13}$ | $R^{D26}$ | H |
| $L_{C329}$ | $R^{D13}$ | $R^{D27}$ | H |
| $L_{C330}$ | $R^{D13}$ | $R^{D28}$ | H |
| $L_{C331}$ | $R^{D13}$ | $R^{D29}$ | H |
| $L_{C332}$ | $R^{D13}$ | $R^{D30}$ | H |
| $L_{C333}$ | $R^{D13}$ | $R^{D31}$ | H |
| $L_{C334}$ | $R^{D13}$ | $R^{D32}$ | H |
| $L_{C335}$ | $R^{D13}$ | $R^{D33}$ | H |
| $L_{C336}$ | $R^{D13}$ | $R^{D34}$ | H |
| $L_{C337}$ | $R^{D13}$ | $R^{D35}$ | H |
| $L_{C338}$ | $R^{D13}$ | $R^{D40}$ | H |
| $L_{C339}$ | $R^{D13}$ | $R^{D41}$ | H |
| $L_{C340}$ | $R^{D13}$ | $R^{D42}$ | H |
| $L_{C341}$ | $R^{D13}$ | $R^{D64}$ | H |
| $L_{C342}$ | $R^{D13}$ | $R^{D66}$ | H |
| $L_{C343}$ | $R^{D13}$ | $R^{D68}$ | H |
| $L_{C344}$ | $R^{D13}$ | $R^{D76}$ | H |
| $L_{C345}$ | $R^{D14}$ | $R^{D5}$ | H |
| $L_{C346}$ | $R^{D14}$ | $R^{D6}$ | H |
| $L_{C347}$ | $R^{D14}$ | $R^{D9}$ | H |
| $L_{C348}$ | $R^{D14}$ | $R^{D10}$ | H |
| $L_{C349}$ | $R^{D14}$ | $R^{D12}$ | H |
| $L_{C350}$ | $R^{D14}$ | $R^{D15}$ | H |
| $L_{C351}$ | $R^{D14}$ | $R^{D16}$ | H |
| $L_{C352}$ | $R^{D14}$ | $R^{D17}$ | H |
| $L_{C353}$ | $R^{D14}$ | $R^{D18}$ | H |
| $L_{C354}$ | $R^{D14}$ | $R^{D19}$ | H |
| $L_{C355}$ | $R^{D14}$ | $R^{D20}$ | H |
| $L_{C356}$ | $R^{D14}$ | $R^{D21}$ | H |
| $L_{C357}$ | $R^{D14}$ | $R^{D22}$ | H |
| $L_{C358}$ | $R^{D14}$ | $R^{D23}$ | H |
| $L_{C359}$ | $R^{D14}$ | $R^{D24}$ | H |
| $L_{C360}$ | $R^{D14}$ | $R^{D25}$ | H |
| $L_{C361}$ | $R^{D14}$ | $R^{D26}$ | H |
| $L_{C362}$ | $R^{D14}$ | $R^{D27}$ | H |
| $L_{C363}$ | $R^{D14}$ | $R^{D28}$ | H |
| $L_{C364}$ | $R^{D14}$ | $R^{D29}$ | H |
| $L_{C365}$ | $R^{D14}$ | $R^{D30}$ | H |
| $L_{C366}$ | $R^{D14}$ | $R^{D31}$ | H |
| $L_{C367}$ | $R^{D14}$ | $R^{D32}$ | H |
| $L_{C368}$ | $R^{D14}$ | $R^{D33}$ | H |
| $L_{C369}$ | $R^{D14}$ | $R^{D34}$ | H |
| $L_{C370}$ | $R^{D14}$ | $R^{D35}$ | H |
| $L_{C371}$ | $R^{D14}$ | $R^{D40}$ | H |
| $L_{C372}$ | $R^{D14}$ | $R^{D41}$ | H |
| $L_{C373}$ | $R^{D14}$ | $R^{D42}$ | H |
| $L_{C374}$ | $R^{D14}$ | $R^{D64}$ | H |
| $L_{C375}$ | $R^{D14}$ | $R^{D66}$ | H |
| $L_{C376}$ | $R^{D14}$ | $R^{D68}$ | H |
| $L_{C377}$ | $R^{D14}$ | $R^{D76}$ | H |
| $L_{C378}$ | $R^{D22}$ | $R^{D5}$ | H |
| $L_{C379}$ | $R^{D22}$ | $R^{D6}$ | H |
| $L_{C380}$ | $R^{D22}$ | $R^{D9}$ | H |
| $L_{C381}$ | $R^{D22}$ | $R^{D10}$ | H |
| $L_{C382}$ | $R^{D22}$ | $R^{D12}$ | H |
| $L_{C383}$ | $R^{D22}$ | $R^{D15}$ | H |
| $L_{C384}$ | $R^{D22}$ | $R^{D16}$ | H |
| $L_{C385}$ | $R^{D22}$ | $R^{D17}$ | H |
| $L_{C386}$ | $R^{D22}$ | $R^{D18}$ | H |
| $L_{C387}$ | $R^{D22}$ | $R^{D19}$ | H |
| $L_{C388}$ | $R^{D22}$ | $R^{D20}$ | H |
| $L_{C389}$ | $R^{D22}$ | $R^{D21}$ | H |
| $L_{C390}$ | $R^{D22}$ | $R^{D23}$ | H |
| $L_{C391}$ | $R^{D22}$ | $R^{D24}$ | H |
| $L_{C392}$ | $R^{D22}$ | $R^{D25}$ | H |
| $L_{C393}$ | $R^{D22}$ | $R^{D26}$ | H |
| $L_{C394}$ | $R^{D22}$ | $R^{D27}$ | H |
| $L_{C395}$ | $R^{D22}$ | $R^{D28}$ | H |
| $L_{C396}$ | $R^{D22}$ | $R^{D29}$ | H |
| $L_{C397}$ | $R^{D22}$ | $R^{D30}$ | H |
| $L_{C398}$ | $R^{D22}$ | $R^{D31}$ | H |

-continued

| Ligand | $R^1$ | $R^2$ | $R^3$ |
|---|---|---|---|
| $L_{C399}$ | $R^{D22}$ | $R^{D32}$ | H |
| $L_{C400}$ | $R^{D22}$ | $R^{D33}$ | H |
| $L_{C401}$ | $R^{D22}$ | $R^{D34}$ | H |
| $L_{C402}$ | $R^{D22}$ | $R^{D35}$ | H |
| $L_{C403}$ | $R^{D22}$ | $R^{D40}$ | H |
| $L_{C404}$ | $R^{D22}$ | $R^{D41}$ | H |
| $L_{C405}$ | $R^{D22}$ | $R^{D42}$ | H |
| $L_{C406}$ | $R^{D22}$ | $R^{D64}$ | H |
| $L_{C407}$ | $R^{D22}$ | $R^{D66}$ | H |
| $L_{C408}$ | $R^{D22}$ | $R^{D68}$ | H |
| $L_{C409}$ | $R^{D22}$ | $R^{D76}$ | H |
| $L_{C410}$ | $R^{D26}$ | $R^{D5}$ | H |
| $L_{C411}$ | $R^{D26}$ | $R^{D6}$ | H |
| $L_{C412}$ | $R^{D26}$ | $R^{D9}$ | H |
| $L_{C413}$ | $R^{D26}$ | $R^{D10}$ | H |
| $L_{C414}$ | $R^{D26}$ | $R^{D12}$ | H |
| $L_{C415}$ | $R^{D26}$ | $R^{D15}$ | H |
| $L_{C416}$ | $R^{D26}$ | $R^{D16}$ | H |
| $L_{C417}$ | $R^{D26}$ | $R^{D17}$ | H |
| $L_{C418}$ | $R^{D26}$ | $R^{D18}$ | H |
| $L_{C419}$ | $R^{D26}$ | $R^{D19}$ | H |
| $L_{C420}$ | $R^{D26}$ | $R^{D20}$ | H |
| $L_{C421}$ | $R^{D26}$ | $R^{D21}$ | H |
| $L_{C422}$ | $R^{D26}$ | $R^{D23}$ | H |
| $L_{C423}$ | $R^{D26}$ | $R^{D24}$ | H |
| $L_{C424}$ | $R^{D26}$ | $R^{D25}$ | H |
| $L_{C425}$ | $R^{D26}$ | $R^{D27}$ | H |
| $L_{C426}$ | $R^{D26}$ | $R^{D28}$ | H |
| $L_{C427}$ | $R^{D26}$ | $R^{D29}$ | H |
| $L_{C428}$ | $R^{D26}$ | $R^{D30}$ | H |
| $L_{C429}$ | $R^{D26}$ | $R^{D31}$ | H |
| $L_{C430}$ | $R^{D26}$ | $R^{D32}$ | H |
| $L_{C431}$ | $R^{D26}$ | $R^{D33}$ | H |
| $L_{C432}$ | $R^{D26}$ | $R^{D34}$ | H |
| $L_{C433}$ | $R^{D26}$ | $R^{D35}$ | H |
| $L_{C434}$ | $R^{D26}$ | $R^{D40}$ | H |
| $L_{C435}$ | $R^{D26}$ | $R^{D41}$ | H |
| $L_{C436}$ | $R^{D26}$ | $R^{D42}$ | H |
| $L_{C437}$ | $R^{D26}$ | $R^{D64}$ | H |
| $L_{C438}$ | $R^{D26}$ | $R^{D66}$ | H |
| $L_{C439}$ | $R^{D26}$ | $R^{D68}$ | H |
| $L_{C440}$ | $R^{D26}$ | $R^{D76}$ | H |
| $L_{C441}$ | $R^{D35}$ | $R^{D5}$ | H |
| $L_{C442}$ | $R^{D35}$ | $R^{D6}$ | H |
| $L_{C443}$ | $R^{D35}$ | $R^{D9}$ | H |
| $L_{C444}$ | $R^{D35}$ | $R^{D10}$ | H |
| $L_{C445}$ | $R^{D35}$ | $R^{D12}$ | H |
| $L_{C446}$ | $R^{D35}$ | $R^{D15}$ | H |
| $L_{C447}$ | $R^{D35}$ | $R^{D16}$ | H |
| $L_{C448}$ | $R^{D35}$ | $R^{D17}$ | H |
| $L_{C449}$ | $R^{D35}$ | $R^{D18}$ | H |
| $L_{C450}$ | $R^{D35}$ | $R^{D19}$ | H |
| $L_{C451}$ | $R^{D35}$ | $R^{D20}$ | H |
| $L_{C452}$ | $R^{D35}$ | $R^{D21}$ | H |
| $L_{C453}$ | $R^{D35}$ | $R^{D23}$ | H |
| $L_{C454}$ | $R^{D35}$ | $R^{D24}$ | H |
| $L_{C455}$ | $R^{D35}$ | $R^{D25}$ | H |
| $L_{C456}$ | $R^{D35}$ | $R^{D27}$ | H |
| $L_{C457}$ | $R^{D35}$ | $R^{D28}$ | H |
| $L_{C458}$ | $R^{D35}$ | $R^{D29}$ | H |
| $L_{C459}$ | $R^{D35}$ | $R^{D30}$ | H |
| $L_{C460}$ | $R^{D35}$ | $R^{D31}$ | H |
| $L_{C461}$ | $R^{D35}$ | $R^{D32}$ | H |
| $L_{C462}$ | $R^{D35}$ | $R^{D33}$ | H |
| $L_{C463}$ | $R^{D35}$ | $R^{D34}$ | H |
| $L_{C464}$ | $R^{D35}$ | $R^{D40}$ | H |
| $L_{C465}$ | $R^{D35}$ | $R^{D41}$ | H |
| $L_{C466}$ | $R^{D35}$ | $R^{D42}$ | H |
| $L_{C467}$ | $R^{D35}$ | $R^{D64}$ | H |
| $L_{C468}$ | $R^{D35}$ | $R^{D66}$ | H |
| $L_{C469}$ | $R^{D35}$ | $R^{D68}$ | H |
| $L_{C470}$ | $R^{D35}$ | $R^{D76}$ | H |
| $L_{C471}$ | $R^{D40}$ | $R^{D5}$ | H |
| $L_{C472}$ | $R^{D40}$ | $R^{D6}$ | H |
| $L_{C473}$ | $R^{D40}$ | $R^{D9}$ | H |
| $L_{C474}$ | $R^{D40}$ | $R^{D10}$ | H |
| $L_{C475}$ | $R^{D40}$ | $R^{D12}$ | H |

-continued

| Ligand | $R^1$ | $R^2$ | $R^3$ |
|---|---|---|---|
| $L_{C476}$ | $R^{D40}$ | $R^{D15}$ | H |
| $L_{C477}$ | $R^{D40}$ | $R^{D16}$ | H |
| $L_{C478}$ | $R^{D40}$ | $R^{D17}$ | H |
| $L_{C479}$ | $R^{D40}$ | $R^{D18}$ | H |
| $L_{C480}$ | $R^{D40}$ | $R^{D19}$ | H |
| $L_{C481}$ | $R^{D40}$ | $R^{D20}$ | H |
| $L_{C482}$ | $R^{D40}$ | $R^{D21}$ | H |
| $L_{C483}$ | $R^{D40}$ | $R^{D23}$ | H |
| $L_{C484}$ | $R^{D40}$ | $R^{D24}$ | H |
| $L_{C485}$ | $R^{D40}$ | $R^{D25}$ | H |
| $L_{C486}$ | $R^{D40}$ | $R^{D27}$ | H |
| $L_{C487}$ | $R^{D40}$ | $R^{D28}$ | H |
| $L_{C488}$ | $R^{D40}$ | $R^{D29}$ | H |
| $L_{C489}$ | $R^{D40}$ | $R^{D30}$ | H |
| $L_{C490}$ | $R^{D40}$ | $R^{D31}$ | H |
| $L_{C491}$ | $R^{D40}$ | $R^{D32}$ | H |
| $L_{C492}$ | $R^{D40}$ | $R^{D33}$ | H |
| $L_{C493}$ | $R^{D40}$ | $R^{D34}$ | H |
| $L_{C494}$ | $R^{D40}$ | $R^{D41}$ | H |
| $L_{C495}$ | $R^{D40}$ | $R^{D42}$ | H |
| $L_{C496}$ | $R^{D40}$ | $R^{D64}$ | H |
| $L_{C497}$ | $R^{D40}$ | $R^{D66}$ | H |
| $L_{C498}$ | $R^{D40}$ | $R^{D68}$ | H |
| $L_{C499}$ | $R^{D40}$ | $R^{D76}$ | H |
| $L_{C500}$ | $R^{D41}$ | $R^{D5}$ | H |
| $L_{C501}$ | $R^{D41}$ | $R^{D6}$ | H |
| $L_{C502}$ | $R^{D41}$ | $R^{D9}$ | H |
| $L_{C503}$ | $R^{D41}$ | $R^{D10}$ | H |
| $L_{C504}$ | $R^{D41}$ | $R^{D12}$ | H |
| $L_{C505}$ | $R^{D41}$ | $R^{D15}$ | H |
| $L_{C506}$ | $R^{D41}$ | $R^{D16}$ | H |
| $L_{C507}$ | $R^{D41}$ | $R^{D17}$ | H |
| $L_{C508}$ | $R^{D41}$ | $R^{D18}$ | H |
| $L_{C509}$ | $R^{D41}$ | $R^{D19}$ | H |
| $L_{C510}$ | $R^{D41}$ | $R^{D20}$ | H |
| $L_{C511}$ | $R^{D41}$ | $R^{D21}$ | H |
| $L_{C512}$ | $R^{D41}$ | $R^{D23}$ | H |
| $L_{C513}$ | $R^{D41}$ | $R^{D24}$ | H |
| $L_{C514}$ | $R^{D41}$ | $R^{D25}$ | H |
| $L_{C515}$ | $R^{D41}$ | $R^{D27}$ | H |
| $L_{C516}$ | $R^{D41}$ | $R^{D28}$ | H |
| $L_{C517}$ | $R^{D41}$ | $R^{D29}$ | H |
| $L_{C518}$ | $R^{D41}$ | $R^{D30}$ | H |
| $L_{C519}$ | $R^{D41}$ | $R^{D31}$ | H |
| $L_{C520}$ | $R^{D41}$ | $R^{D32}$ | H |
| $L_{C521}$ | $R^{D41}$ | $R^{D33}$ | H |
| $L_{C522}$ | $R^{D41}$ | $R^{D34}$ | H |
| $L_{C523}$ | $R^{D41}$ | $R^{D42}$ | H |
| $L_{C524}$ | $R^{D41}$ | $R^{D64}$ | H |
| $L_{C525}$ | $R^{D41}$ | $R^{D66}$ | H |
| $L_{C526}$ | $R^{D41}$ | $R^{D68}$ | H |
| $L_{C527}$ | $R^{D41}$ | $R^{D76}$ | H |
| $L_{C528}$ | $R^{D64}$ | $R^{D5}$ | H |
| $L_{C529}$ | $R^{D64}$ | $R^{D6}$ | H |
| $L_{C530}$ | $R^{D64}$ | $R^{D9}$ | H |
| $L_{C531}$ | $R^{D64}$ | $R^{D10}$ | H |
| $L_{C532}$ | $R^{D64}$ | $R^{D12}$ | H |
| $L_{C533}$ | $R^{D64}$ | $R^{D15}$ | H |
| $L_{C534}$ | $R^{D64}$ | $R^{D16}$ | H |
| $L_{C535}$ | $R^{D64}$ | $R^{D17}$ | H |
| $L_{C536}$ | $R^{D64}$ | $R^{D18}$ | H |
| $L_{C537}$ | $R^{D64}$ | $R^{D19}$ | H |
| $L_{C538}$ | $R^{D64}$ | $R^{D20}$ | H |
| $L_{C539}$ | $R^{D64}$ | $R^{D21}$ | H |
| $L_{C540}$ | $R^{D64}$ | $R^{D23}$ | H |
| $L_{C541}$ | $R^{D64}$ | $R^{D24}$ | H |
| $L_{C542}$ | $R^{D64}$ | $R^{D25}$ | H |
| $L_{C543}$ | $R^{D64}$ | $R^{D27}$ | H |
| $L_{C544}$ | $R^{D64}$ | $R^{D28}$ | H |
| $L_{C545}$ | $R^{D64}$ | $R^{D29}$ | H |
| $L_{C546}$ | $R^{D64}$ | $R^{D30}$ | H |
| $L_{C547}$ | $R^{D64}$ | $R^{D31}$ | H |
| $L_{C548}$ | $R^{D64}$ | $R^{D32}$ | H |
| $L_{C549}$ | $R^{D64}$ | $R^{D33}$ | H |
| $L_{C550}$ | $R^{D54}$ | $R^{D34}$ | H |
| $L_{C551}$ | $R^{D64}$ | $R^{D42}$ | H |
| $L_{C552}$ | $R^{D64}$ | $R^{D64}$ | H |

-continued

| Ligand | $R^1$ | $R^2$ | $R^3$ |
|---|---|---|---|
| $L_{C553}$ | $R^{D64}$ | $R^{D66}$ | H |
| $L_{C554}$ | $R^{D64}$ | $R^{D68}$ | H |
| $L_{C555}$ | $R^{D64}$ | $R^{D76}$ | H |
| $L_{C556}$ | $R^{D66}$ | $R^{D5}$ | H |
| $L_{C557}$ | $R^{D66}$ | $R^{D6}$ | H |
| $L_{C558}$ | $R^{D66}$ | $R^{D9}$ | H |
| $L_{C559}$ | $R^{D66}$ | $R^{D10}$ | H |
| $L_{C560}$ | $R^{D66}$ | $R^{D12}$ | H |
| $L_{C561}$ | $R^{D66}$ | $R^{D15}$ | H |
| $L_{C562}$ | $R^{D66}$ | $R^{D16}$ | H |
| $L_{C563}$ | $R^{D66}$ | $R^{D17}$ | H |
| $L_{C564}$ | $R^{D66}$ | $R^{D18}$ | H |
| $L_{C565}$ | $R^{D66}$ | $R^{D19}$ | H |
| $L_{C566}$ | $R^{D66}$ | $R^{D20}$ | H |
| $L_{C567}$ | $R^{D66}$ | $R^{D21}$ | H |
| $L_{C568}$ | $R^{D66}$ | $R^{D23}$ | H |
| $L_{C569}$ | $R^{D66}$ | $R^{D24}$ | H |
| $L_{C570}$ | $R^{D66}$ | $R^{D25}$ | H |
| $L_{C571}$ | $R^{D66}$ | $R^{D27}$ | H |
| $L_{C572}$ | $R^{D66}$ | $R^{D28}$ | H |
| $L_{C573}$ | $R^{D66}$ | $R^{D29}$ | H |
| $L_{C574}$ | $R^{D66}$ | $R^{D30}$ | H |
| $L_{C575}$ | $R^{D66}$ | $R^{D31}$ | H |
| $L_{C576}$ | $R^{D66}$ | $R^{D32}$ | H |
| $L_{C577}$ | $R^{D66}$ | $R^{D33}$ | H |
| $L_{C578}$ | $R^{D66}$ | $R^{D34}$ | H |
| $L_{C579}$ | $R^{D66}$ | $R^{D42}$ | H |
| $L_{C580}$ | $R^{D66}$ | $R^{D68}$ | H |
| $L_{C581}$ | $R^{D66}$ | $R^{D76}$ | H |
| $L_{C582}$ | $R^{D68}$ | $R^{D5}$ | H |
| $L_{C583}$ | $R^{D68}$ | $R^{D6}$ | H |
| $L_{C584}$ | $R^{D68}$ | $R^{D9}$ | H |
| $L_{C585}$ | $R^{D68}$ | $R^{D10}$ | H |
| $L_{C586}$ | $R^{D68}$ | $R^{D12}$ | H |
| $L_{C587}$ | $R^{D68}$ | $R^{D15}$ | H |
| $L_{C588}$ | $R^{D68}$ | $R^{D16}$ | H |
| $L_{C589}$ | $R^{D68}$ | $R^{D17}$ | H |
| $L_{C590}$ | $R^{D68}$ | $R^{D18}$ | H |
| $L_{C591}$ | $R^{D68}$ | $R^{D19}$ | H |
| $L_{C592}$ | $R^{D68}$ | $R^{D20}$ | H |
| $L_{C593}$ | $R^{D68}$ | $R^{D21}$ | H |
| $L_{C594}$ | $R^{D68}$ | $R^{D23}$ | H |
| $L_{C595}$ | $R^{D68}$ | $R^{D24}$ | H |
| $L_{C596}$ | $R^{D68}$ | $R^{D25}$ | H |
| $L_{C597}$ | $R^{D68}$ | $R^{D27}$ | H |
| $L_{C598}$ | $R^{D68}$ | $R^{D28}$ | H |
| $L_{C599}$ | $R^{D68}$ | $R^{D29}$ | H |
| $L_{C600}$ | $R^{D68}$ | $R^{D30}$ | H |
| $L_{C601}$ | $R^{D68}$ | $R^{D31}$ | H |
| $L_{C602}$ | $R^{D68}$ | $R^{D32}$ | H |
| $L_{C603}$ | $R^{D68}$ | $R^{D33}$ | H |
| $L_{C604}$ | $R^{D68}$ | $R^{D34}$ | H |
| $L_{C605}$ | $R^{D68}$ | $R^{D42}$ | H |
| $L_{C606}$ | $R^{D68}$ | $R^{D76}$ | H |
| $L_{C607}$ | $R^{D76}$ | $R^{D5}$ | H |
| $L_{C608}$ | $R^{D76}$ | $R^{D6}$ | H |
| $L_{C609}$ | $R^{D76}$ | $R^{D9}$ | H |
| $L_{C610}$ | $R^{D76}$ | $R^{D10}$ | H |
| $L_{C611}$ | $R^{D76}$ | $R^{D12}$ | H |
| $L_{C612}$ | $R^{D76}$ | $R^{D15}$ | H |
| $L_{C613}$ | $R^{D76}$ | $R^{D16}$ | H |
| $L_{C614}$ | $R^{D76}$ | $R^{D17}$ | H |
| $L_{C615}$ | $R^{D76}$ | $R^{D18}$ | H |
| $L_{C616}$ | $R^{D76}$ | $R^{D19}$ | H |
| $L_{C617}$ | $R^{D76}$ | $R^{D20}$ | H |
| $L_{C618}$ | $R^{D76}$ | $R^{D21}$ | H |
| $L_{C619}$ | $R^{D76}$ | $R^{D23}$ | H |
| $L_{C620}$ | $R^{D76}$ | $R^{D24}$ | H |
| $L_{C621}$ | $R^{D76}$ | $R^{D25}$ | H |
| $L_{C622}$ | $R^{D76}$ | $R^{D27}$ | H |
| $L_{C623}$ | $R^{D76}$ | $R^{D28}$ | H |
| $L_{C624}$ | $R^{D76}$ | $R^{D29}$ | H |
| $L_{C625}$ | $R^{D76}$ | $R^{D30}$ | H |
| $L_{C626}$ | $R^{D76}$ | $R^{D31}$ | H |
| $L_{C627}$ | $R^{D76}$ | $R^{D32}$ | H |
| $L_{C628}$ | $R^{D76}$ | $R^{D33}$ | H |
| $L_{C629}$ | $R^{D76}$ | $R^{D34}$ | H |

-continued

| Ligand | $R^1$ | $R^2$ | $R^3$ |
|---|---|---|---|
| $L_{C630}$ | $R^{D76}$ | $R^{D42}$ | H |
| $L_{C631}$ | $R^{D1}$ | $R^{D1}$ | $R^{D1}$ |
| $L_{C632}$ | $R^{D2}$ | $R^{D2}$ | $R^{D1}$ |
| $L_{C633}$ | $R^{D3}$ | $R^{D3}$ | $R^{D1}$ |
| $L_{C634}$ | $R^{D4}$ | $R^{D4}$ | $R^{D1}$ |
| $L_{C635}$ | $R^{D5}$ | $R^{D5}$ | $R^{D1}$ |
| $L_{C636}$ | $R^{D6}$ | $R^{D6}$ | $R^{D1}$ |
| $L_{C637}$ | $R^{D7}$ | $R^{D7}$ | $R^{D1}$ |
| $L_{C638}$ | $R^{D8}$ | $R^{D8}$ | $R^{D1}$ |
| $L_{C639}$ | $R^{D9}$ | $R^{D9}$ | $R^{D1}$ |
| $L_{C640}$ | $R^{D10}$ | $R^{D10}$ | $R^{D1}$ |
| $L_{C641}$ | $R^{D11}$ | $R^{D11}$ | $R^{D1}$ |
| $L_{C642}$ | $R^{D12}$ | $R^{D12}$ | $R^{D1}$ |
| $L_{C643}$ | $R^{D13}$ | $R^{D13}$ | $R^{D1}$ |
| $L_{C644}$ | $R^{D14}$ | $R^{D14}$ | $R^{D1}$ |
| $L_{C645}$ | $R^{D15}$ | $R^{D15}$ | $R^{D1}$ |
| $L_{C646}$ | $R^{D16}$ | $R^{D16}$ | $R^{D1}$ |
| $L_{C647}$ | $R^{D17}$ | $R^{D17}$ | $R^{D1}$ |
| $L_{C648}$ | $R^{D18}$ | $R^{D18}$ | $R^{D1}$ |
| $L_{C649}$ | $R^{D19}$ | $R^{D19}$ | $R^{D1}$ |
| $L_{C650}$ | $R^{D20}$ | $R^{D20}$ | $R^{D1}$ |
| $L_{C651}$ | $R^{D21}$ | $R^{D21}$ | $R^{D1}$ |
| $L_{C652}$ | $R^{D22}$ | $R^{D22}$ | $R^{D1}$ |
| $L_{C653}$ | $R^{D23}$ | $R^{D23}$ | $R^{D1}$ |
| $L_{C654}$ | $R^{D24}$ | $R^{D24}$ | $R^{D1}$ |
| $L_{C655}$ | $R^{D25}$ | $R^{D25}$ | $R^{D1}$ |
| $L_{C656}$ | $R^{D26}$ | $R^{D26}$ | $R^{D1}$ |
| $L_{C657}$ | $R^{D27}$ | $R^{D27}$ | $R^{D1}$ |
| $L_{C658}$ | $R^{D28}$ | $R^{D28}$ | $R^{D1}$ |
| $L_{C659}$ | $R^{D29}$ | $R^{D29}$ | $R^{D1}$ |
| $L_{C660}$ | $R^{D30}$ | $R^{D30}$ | $R^{D1}$ |
| $L_{C661}$ | $R^{D31}$ | $R^{D31}$ | $R^{D1}$ |
| $L_{C662}$ | $R^{D32}$ | $R^{D32}$ | $R^{D1}$ |
| $L_{C663}$ | $R^{D33}$ | $R^{D33}$ | $R^{D1}$ |
| $L_{C664}$ | $R^{D34}$ | $R^{D34}$ | $R^{D1}$ |
| $L_{C665}$ | $R^{D35}$ | $R^{D35}$ | $R^{D1}$ |
| $L_{C666}$ | $R^{D40}$ | $R^{D40}$ | $R^{D1}$ |
| $L_{C667}$ | $R^{D41}$ | $R^{D41}$ | $R^{D1}$ |
| $L_{C668}$ | $R^{D42}$ | $R^{D42}$ | $R^{D1}$ |
| $L_{C669}$ | $R^{D64}$ | $R^{D64}$ | $R^{D1}$ |
| $L_{C670}$ | $R^{D66}$ | $R^{D66}$ | $R^{D1}$ |
| $L_{C671}$ | $R^{D68}$ | $R^{D68}$ | $R^{D1}$ |
| $L_{C672}$ | $R^{D76}$ | $R^{D76}$ | $R^{D1}$ |
| $L_{C673}$ | $R^{D1}$ | $R^{D2}$ | $R^{D1}$ |
| $L_{C674}$ | $R^{D1}$ | $R^{D3}$ | $R^{D1}$ |
| $L_{C675}$ | $R^{D1}$ | $R^{D4}$ | $R^{D1}$ |
| $L_{C676}$ | $R^{D1}$ | $R^{D5}$ | $R^{D1}$ |
| $L_{C677}$ | $R^{D1}$ | $R^{D6}$ | $R^{D1}$ |
| $L_{C678}$ | $R^{D1}$ | $R^{D7}$ | $R^{D1}$ |
| $L_{C679}$ | $R^{D1}$ | $R^{D8}$ | $R^{D1}$ |
| $L_{C680}$ | $R^{D1}$ | $R^{D9}$ | $R^{D1}$ |
| $L_{C681}$ | $R^{D1}$ | $R^{D10}$ | $R^{D1}$ |
| $L_{C682}$ | $R^{D1}$ | $R^{D11}$ | $R^{D1}$ |
| $L_{C683}$ | $R^{D1}$ | $R^{D12}$ | $R^{D1}$ |
| $L_{C684}$ | $R^{D1}$ | $R^{D13}$ | $R^{D1}$ |
| $L_{C685}$ | $R^{D1}$ | $R^{D14}$ | $R^{D1}$ |
| $L_{C686}$ | $R^{D1}$ | $R^{D15}$ | $R^{D1}$ |
| $L_{C687}$ | $R^{D1}$ | $R^{D16}$ | $R^{D1}$ |
| $L_{C688}$ | $R^{D1}$ | $R^{D17}$ | $R^{D1}$ |
| $L_{C689}$ | $R^{D1}$ | $R^{D18}$ | $R^{D1}$ |
| $L_{C690}$ | $R^{D1}$ | $R^{D19}$ | $R^{D1}$ |
| $L_{C691}$ | $R^{D1}$ | $R^{D20}$ | $R^{D1}$ |
| $L_{C692}$ | $R^{D1}$ | $R^{D21}$ | $R^{D1}$ |
| $L_{C693}$ | $R^{D1}$ | $R^{D22}$ | $R^{D1}$ |
| $L_{C694}$ | $R^{D1}$ | $R^{D23}$ | $R^{D1}$ |
| $L_{C695}$ | $R^{D1}$ | $R^{D24}$ | $R^{D1}$ |
| $L_{C696}$ | $R^{D1}$ | $R^{D25}$ | $R^{D1}$ |
| $L_{C697}$ | $R^{D1}$ | $R^{D26}$ | $R^{D1}$ |
| $L_{C698}$ | $R^{D1}$ | $R^{D27}$ | $R^{D1}$ |
| $L_{C699}$ | $R^{D1}$ | $R^{D28}$ | $R^{D1}$ |
| $L_{1700}$ | $R^{D1}$ | $R^{D29}$ | $R^{D1}$ |
| $L_{C701}$ | $R^{D1}$ | $R^{D30}$ | $R^{D1}$ |
| $L_{C702}$ | $R^{D1}$ | $R^{D31}$ | $R^{D1}$ |
| $L_{C703}$ | $R^{D1}$ | $R^{D32}$ | $R^{D1}$ |
| $L_{C704}$ | $R^{D1}$ | $R^{D33}$ | $R^{D1}$ |
| $L_{C705}$ | $R^{D1}$ | $R^{D34}$ | $R^{D1}$ |
| $L_{C706}$ | $R^{D1}$ | $R^{D35}$ | $R^{D1}$ |

-continued

| Ligand | $R^1$ | $R^2$ | $R^3$ |
|---|---|---|---|
| $L_{C707}$ | $R^{D1}$ | $R^{D40}$ | $R^{D1}$ |
| $L_{C708}$ | $R^{D1}$ | $R^{D41}$ | $R^{D1}$ |
| $L_{C709}$ | $R^{D1}$ | $R^{D42}$ | $R^{D1}$ |
| $L_{C710}$ | $R^{D1}$ | $R^{D64}$ | $R^{D1}$ |
| $L_{C711}$ | $R^{D1}$ | $R^{D66}$ | $R^{D1}$ |
| $L_{C712}$ | $R^{D1}$ | $R^{D68}$ | $R^{D1}$ |
| $L_{C713}$ | $R^{D1}$ | $R^{D76}$ | $R^{D1}$ |
| $L_{C714}$ | $R^{D2}$ | $R^{D1}$ | $R^{D1}$ |
| $L_{C715}$ | $R^{D2}$ | $R^{D3}$ | $R^{D1}$ |
| $L_{C716}$ | $R^{D2}$ | $R^{D4}$ | $R^{D1}$ |
| $L_{C717}$ | $R^{D2}$ | $R^{D5}$ | $R^{D1}$ |
| $L_{C718}$ | $R^{D2}$ | $R^{D6}$ | $R^{D1}$ |
| $L_{C719}$ | $R^{D2}$ | $R^{D7}$ | $R^{D1}$ |
| $L_{C720}$ | $R^{D2}$ | $R^{D8}$ | $R^{D1}$ |
| $L_{C721}$ | $R^{D2}$ | $R^{D9}$ | $R^{D1}$ |
| $L_{C722}$ | $R^{D2}$ | $R^{D10}$ | $R^{D1}$ |
| $L_{C723}$ | $R^{D2}$ | $R^{D11}$ | $R^{D1}$ |
| $L_{C724}$ | $R^{D2}$ | $R^{D12}$ | $R^{D1}$ |
| $L_{C725}$ | $R^{D2}$ | $R^{D13}$ | $R^{D1}$ |
| $L_{C726}$ | $R^{D2}$ | $R^{D14}$ | $R^{D1}$ |
| $L_{C727}$ | $R^{D2}$ | $R^{D15}$ | $R^{D1}$ |
| $L_{C728}$ | $R^{D2}$ | $R^{D16}$ | $R^{D1}$ |
| $L_{C729}$ | $R^{D2}$ | $R^{D17}$ | $R^{D1}$ |
| $L_{C730}$ | $R^{D2}$ | $R^{D18}$ | $R^{D1}$ |
| $L_{C731}$ | $R^{D2}$ | $R^{D19}$ | $R^{D1}$ |
| $L_{C732}$ | $R^{D2}$ | $R^{D20}$ | $R^{D1}$ |
| $L_{C733}$ | $R^{D2}$ | $R^{D21}$ | $R^{D1}$ |
| $L_{C734}$ | $R^{D2}$ | $R^{D22}$ | $R^{D1}$ |
| $L_{C735}$ | $R^{D2}$ | $R^{D23}$ | $R^{D1}$ |
| $L_{C736}$ | $R^{D2}$ | $R^{D24}$ | $R^{D1}$ |
| $L_{C737}$ | $R^{D2}$ | $R^{D25}$ | $R^{D1}$ |
| $L_{C738}$ | $R^{D2}$ | $R^{D26}$ | $R^{D1}$ |
| $L_{C739}$ | $R^{D2}$ | $R^{D27}$ | $R^{D1}$ |
| $L_{C740}$ | $R^{D2}$ | $R^{D28}$ | $R^{D1}$ |
| $L_{C741}$ | $R^{D2}$ | $R^{D29}$ | $R^{D1}$ |
| $L_{C742}$ | $R^{D2}$ | $R^{D30}$ | $R^{D1}$ |
| $L_{C743}$ | $R^{D2}$ | $R^{D31}$ | $R^{D1}$ |
| $L_{C744}$ | $R^{D2}$ | $R^{D32}$ | $R^{D1}$ |
| $L_{C745}$ | $R^{D2}$ | $R^{D33}$ | $R^{D1}$ |
| $L_{C746}$ | $R^{D2}$ | $R^{D34}$ | $R^{D1}$ |
| $L_{C747}$ | $R^{D2}$ | $R^{D35}$ | $R^{D1}$ |
| $L_{C748}$ | $R^{D2}$ | $R^{D40}$ | $R^{D1}$ |
| $L_{C749}$ | $R^{D2}$ | $R^{D41}$ | $R^{D1}$ |
| $L_{C750}$ | $R^{D2}$ | $R^{D42}$ | $R^{D1}$ |
| $L_{C751}$ | $R^{D2}$ | $R^{D64}$ | $R^{D1}$ |
| $L_{C752}$ | $R^{D2}$ | $R^{D66}$ | $R^{D1}$ |
| $L_{C753}$ | $R^{D2}$ | $R^{D68}$ | $R^{D1}$ |
| $L_{C754}$ | $R^{D2}$ | $R^{D76}$ | $R^{D1}$ |
| $L_{C755}$ | $R^{D3}$ | $R^{D4}$ | $R^{D1}$ |
| $L_{C756}$ | $R^{D3}$ | $R^{D5}$ | $R^{D1}$ |
| $L_{C757}$ | $R^{D3}$ | $R^{D6}$ | $R^{D1}$ |
| $L_{C758}$ | $R^{D3}$ | $R^{D7}$ | $R^{D1}$ |
| $L_{C759}$ | $R^{D3}$ | $R^{D8}$ | $R^{D1}$ |
| $L_{C760}$ | $R^{D3}$ | $R^{D9}$ | $R^{D1}$ |
| $L_{C761}$ | $R^{D3}$ | $R^{D10}$ | $R^{D1}$ |
| $L_{C762}$ | $R^{D3}$ | $R^{D11}$ | $R^{D1}$ |
| $L_{C763}$ | $R^{D3}$ | $R^{D12}$ | $R^{D1}$ |
| $L_{C764}$ | $R^{D3}$ | $R^{D13}$ | $R^{D1}$ |
| $L_{C765}$ | $R^{D3}$ | $R^{D14}$ | $R^{D1}$ |
| $L_{C766}$ | $R^{D3}$ | $R^{D15}$ | $R^{D1}$ |
| $L_{C767}$ | $R^{D3}$ | $R^{D16}$ | $R^{D1}$ |
| $L_{C768}$ | $R^{D3}$ | $R^{D17}$ | $R^{D1}$ |
| $L_{C769}$ | $R^{D3}$ | $R^{D18}$ | $R^{D1}$ |
| $L_{C770}$ | $R^{D3}$ | $R^{D19}$ | $R^{D1}$ |
| $L_{C771}$ | $R^{D3}$ | $R^{D20}$ | $R^{D1}$ |
| $L_{C772}$ | $R^{D3}$ | $R^{D21}$ | $R^{D1}$ |
| $L_{C773}$ | $R^{D3}$ | $R^{D22}$ | $R^{D1}$ |
| $L_{C774}$ | $R^{D3}$ | $R^{D23}$ | $R^{D1}$ |
| $L_{C775}$ | $R^{D3}$ | $R^{D24}$ | $R^{D1}$ |
| $L_{C776}$ | $R^{D3}$ | $R^{D25}$ | $R^{D1}$ |
| $L_{C777}$ | $R^{D3}$ | $R^{D26}$ | $R^{D1}$ |
| $L_{C778}$ | $R^{D3}$ | $R^{D27}$ | $R^{D1}$ |
| $L_{C779}$ | $R^{D3}$ | $R^{D28}$ | $R^{D1}$ |
| $L_{C780}$ | $R^{D3}$ | $R^{D29}$ | $R^{D1}$ |
| $L_{C781}$ | $R^{D3}$ | $R^{D30}$ | $R^{D1}$ |
| $L_{C782}$ | $R^{D3}$ | $R^{D31}$ | $R^{D1}$ |
| $L_{C783}$ | $R^{D3}$ | $R^{D32}$ | $R^{D1}$ |

-continued

| Ligand | $R^1$ | $R^2$ | $R^3$ |
|---|---|---|---|
| $L_{C784}$ | $R^{D3}$ | $R^{D33}$ | $R^{D1}$ |
| $L_{C785}$ | $R^{D3}$ | $R^{D34}$ | $R^{D1}$ |
| $L_{C786}$ | $R^{D3}$ | $R^{D35}$ | $R^{D1}$ |
| $L_{C787}$ | $R^{D3}$ | $R^{D40}$ | $R^{D1}$ |
| $L_{C788}$ | $R^{D3}$ | $R^{D41}$ | $R^{D1}$ |
| $L_{C789}$ | $R^{D3}$ | $R^{D42}$ | $R^{D1}$ |
| $L_{C790}$ | $R^{D3}$ | $R^{D64}$ | $R^{D1}$ |
| $L_{C791}$ | $R^{D3}$ | $R^{D66}$ | $R^{D1}$ |
| $L_{C792}$ | $R^{D3}$ | $R^{D68}$ | $R^{D1}$ |
| $L_{C793}$ | $R^{D3}$ | $R^{D76}$ | $R^{D1}$ |
| $L_{C794}$ | $R^{D4}$ | $R^{D5}$ | $R^{D1}$ |
| $L_{C795}$ | $R^{D4}$ | $R^{D6}$ | $R^{D1}$ |
| $L_{C796}$ | $R^{D4}$ | $R^{D7}$ | $R^{D1}$ |
| $L_{C797}$ | $R^{D4}$ | $R^{D8}$ | $R^{D1}$ |
| $L_{C798}$ | $R^{D4}$ | $R^{D9}$ | $R^{D1}$ |
| $L_{C799}$ | $R^{D4}$ | $R^{D10}$ | $R^{D1}$ |
| $L_{C800}$ | $R^{D4}$ | $R^{D11}$ | $R^{D1}$ |
| $L_{C801}$ | $R^{D4}$ | $R^{D12}$ | $R^{D1}$ |
| $L_{C802}$ | $R^{D4}$ | $R^{D13}$ | $R^{D1}$ |
| $L_{C803}$ | $R^{D4}$ | $R^{D14}$ | $R^{D1}$ |
| $L_{C804}$ | $R^{D4}$ | $R^{D15}$ | $R^{D1}$ |
| $L_{C805}$ | $R^{D4}$ | $R^{D16}$ | $R^{D1}$ |
| $L_{C806}$ | $R^{D4}$ | $R^{D17}$ | $R^{D1}$ |
| $L_{C807}$ | $R^{D4}$ | $R^{D18}$ | $R^{D1}$ |
| $L_{C808}$ | $R^{D4}$ | $R^{D19}$ | $R^{D1}$ |
| $L_{C809}$ | $R^{D4}$ | $R^{D20}$ | $R^{D1}$ |
| $L_{C810}$ | $R^{D4}$ | $R^{D21}$ | $R^{D1}$ |
| $L_{C811}$ | $R^{D4}$ | $R^{D22}$ | $R^{D1}$ |
| $L_{C812}$ | $R^{D4}$ | $R^{D23}$ | $R^{D1}$ |
| $L_{C813}$ | $R^{D4}$ | $R^{D24}$ | $R^{D1}$ |
| $L_{C814}$ | $R^{D4}$ | $R^{D25}$ | $R^{D1}$ |
| $L_{C815}$ | $R^{D4}$ | $R^{D26}$ | $R^{D1}$ |
| $L_{C816}$ | $R^{D4}$ | $R^{D27}$ | $R^{D1}$ |
| $L_{C817}$ | $R^{D4}$ | $R^{D28}$ | $R^{D1}$ |
| $L_{C818}$ | $R^{D4}$ | $R^{D29}$ | $R^{D1}$ |
| $L_{C819}$ | $R^{D4}$ | $R^{D30}$ | $R^{D1}$ |
| $L_{C820}$ | $R^{D4}$ | $R^{D31}$ | $R^{D1}$ |
| $L_{C821}$ | $R^{D4}$ | $R^{D32}$ | $R^{D1}$ |
| $L_{C822}$ | $R^{D4}$ | $R^{D33}$ | $R^{D1}$ |
| $L_{C823}$ | $R^{D4}$ | $R^{D34}$ | $R^{D1}$ |
| $L_{C824}$ | $R^{D4}$ | $R^{D35}$ | $R^{D1}$ |
| $L_{C825}$ | $R^{D4}$ | $R^{D40}$ | $R^{D1}$ |
| $L_{C826}$ | $R^{D4}$ | $R^{D41}$ | $R^{D1}$ |
| $L_{C827}$ | $R^{D4}$ | $R^{D42}$ | $R^{D1}$ |
| $L_{C828}$ | $R^{D4}$ | $R^{D64}$ | $R^{D1}$ |
| $L_{C829}$ | $R^{D4}$ | $R^{D66}$ | $R^{D1}$ |
| $L_{C830}$ | $R^{D4}$ | $R^{D68}$ | $R^{D1}$ |
| $L_{C831}$ | $R^{D4}$ | $R^{D76}$ | $R^{D1}$ |
| $L_{C832}$ | $R^{D4}$ | $R^{D1}$ | $R^{D1}$ |
| $L_{C833}$ | $R^{D7}$ | $R^{D5}$ | $R^{D1}$ |
| $L_{C834}$ | $R^{D7}$ | $R^{D6}$ | $R^{D1}$ |
| $L_{C835}$ | $R^{D7}$ | $R^{D8}$ | $R^{D1}$ |
| $L_{C836}$ | $R^{D7}$ | $R^{D9}$ | $R^{D1}$ |
| $L_{C837}$ | $R^{D7}$ | $R^{D10}$ | $R^{D1}$ |
| $L_{C838}$ | $R^{D7}$ | $R^{D11}$ | $R^{D1}$ |
| $L_{C839}$ | $R^{D7}$ | $R^{D12}$ | $R^{D1}$ |
| $L_{C840}$ | $R^{D7}$ | $R^{D13}$ | $R^{D1}$ |
| $L_{C841}$ | $R^{D7}$ | $R^{D14}$ | $R^{D1}$ |
| $L_{C842}$ | $R^{D7}$ | $R^{D15}$ | $R^{D1}$ |
| $L_{C843}$ | $R^{D7}$ | $R^{D16}$ | $R^{D1}$ |
| $L_{C844}$ | $R^{D7}$ | $R^{D17}$ | $R^{D1}$ |
| $L_{C845}$ | $R^{D7}$ | $R^{D18}$ | $R^{D1}$ |
| $L_{C846}$ | $R^{D7}$ | $R^{D19}$ | $R^{D1}$ |
| $L_{C847}$ | $R^{D7}$ | $R^{D20}$ | $R^{D1}$ |
| $L_{C848}$ | $R^{D7}$ | $R^{D21}$ | $R^{D1}$ |
| $L_{C849}$ | $R^{D7}$ | $R^{D22}$ | $R^{D1}$ |
| $L_{C850}$ | $R^{D7}$ | $R^{D23}$ | $R^{D1}$ |
| $L_{C851}$ | $R^{D7}$ | $R^{D24}$ | $R^{D1}$ |
| $L_{C852}$ | $R^{D7}$ | $R^{D25}$ | $R^{D1}$ |
| $L_{C853}$ | $R^{D7}$ | $R^{D26}$ | $R^{D1}$ |
| $L_{C854}$ | $R^{D7}$ | $R^{D27}$ | $R^{D1}$ |
| $L_{C855}$ | $R^{D7}$ | $R^{D28}$ | $R^{D1}$ |
| $L_{C856}$ | $R^{D7}$ | $R^{D29}$ | $R^{D1}$ |
| $L_{C857}$ | $R^{D7}$ | $R^{D30}$ | $R^{D1}$ |
| $L_{C858}$ | $R^{D7}$ | $R^{D31}$ | $R^{D1}$ |
| $L_{C859}$ | $R^{D7}$ | $R^{D32}$ | $R^{D1}$ |
| $L_{C860}$ | $R^{D7}$ | $R^{D33}$ | $R^{D1}$ |

| Ligand | $R^1$ | $R^2$ | $R^3$ |
|---|---|---|---|
| $L_{C861}$ | $R^{D7}$ | $R^{D34}$ | $R^{D1}$ |
| $L_{C862}$ | $R^{D7}$ | $R^{D35}$ | $R^{D1}$ |
| $L_{C863}$ | $R^{D7}$ | $R^{D40}$ | $R^{D1}$ |
| $L_{C864}$ | $R^{D7}$ | $R^{D41}$ | $R^{D1}$ |
| $L_{C865}$ | $R^{D7}$ | $R^{D42}$ | $R^{D1}$ |
| $L_{C866}$ | $R^{D7}$ | $R^{D64}$ | $R^{D1}$ |
| $L_{C867}$ | $R^{D7}$ | $R^{D66}$ | $R^{D1}$ |
| $L_{C868}$ | $R^{D7}$ | $R^{D68}$ | $R^{D1}$ |
| $L_{C869}$ | $R^{D7}$ | $R^{D76}$ | $R^{D1}$ |
| $L_{C870}$ | $R^{D8}$ | $R^{D5}$ | $R^{D1}$ |
| $L_{C871}$ | $R^{D8}$ | $R^{D6}$ | $R^{D1}$ |
| $L_{C872}$ | $R^{D8}$ | $R^{D9}$ | $R^{D1}$ |
| $L_{C873}$ | $R^{D8}$ | $R^{D10}$ | $R^{D1}$ |
| $L_{C874}$ | $R^{D8}$ | $R^{D11}$ | $R^{D1}$ |
| $L_{C875}$ | $R^{D8}$ | $R^{D12}$ | $R^{D1}$ |
| $L_{C876}$ | $R^{D8}$ | $R^{D13}$ | $R^{D1}$ |
| $L_{C877}$ | $R^{D8}$ | $R^{D14}$ | $R^{D1}$ |
| $L_{C878}$ | $R^{D8}$ | $R^{D15}$ | $R^{D1}$ |
| $L_{C879}$ | $R^{D8}$ | $R^{D16}$ | $R^{D1}$ |
| $L_{C880}$ | $R^{D8}$ | $R^{D17}$ | $R^{D1}$ |
| $L_{C881}$ | $R^{D8}$ | $R^{D18}$ | $R^{D1}$ |
| $L_{C882}$ | $R^{D8}$ | $R^{D19}$ | $R^{D1}$ |
| $L_{C883}$ | $R^{D8}$ | $R^{D20}$ | $R^{D1}$ |
| $L_{C884}$ | $R^{D8}$ | $R^{D21}$ | $R^{D1}$ |
| $L_{C885}$ | $R^{D8}$ | $R^{D22}$ | $R^{D1}$ |
| $L_{C886}$ | $R^{D8}$ | $R^{D23}$ | $R^{D1}$ |
| $L_{C887}$ | $R^{D8}$ | $R^{D24}$ | $R^{D1}$ |
| $L_{C888}$ | $R^{D8}$ | $R^{D25}$ | $R^{D1}$ |
| $L_{C889}$ | $R^{D8}$ | $R^{D26}$ | $R^{D1}$ |
| $L_{C890}$ | $R^{D8}$ | $R^{D27}$ | $R^{D1}$ |
| $L_{C891}$ | $R^{D8}$ | $R^{D28}$ | $R^{D1}$ |
| $L_{C892}$ | $R^{D8}$ | $R^{D29}$ | $R^{D1}$ |
| $L_{C893}$ | $R^{D8}$ | $R^{D30}$ | $R^{D1}$ |
| $L_{C894}$ | $R^{D8}$ | $R^{D31}$ | $R^{D1}$ |
| $L_{C895}$ | $R^{D8}$ | $R^{D32}$ | $R^{D1}$ |
| $L_{C896}$ | $R^{D8}$ | $R^{D33}$ | $R^{D1}$ |
| $L_{C897}$ | $R^{D8}$ | $R^{D34}$ | $R^{D1}$ |
| $L_{C898}$ | $R^{D8}$ | $R^{D35}$ | $R^{D1}$ |
| $L_{C899}$ | $R^{D8}$ | $R^{D40}$ | $R^{D1}$ |
| $L_{C900}$ | $R^{D8}$ | $R^{D41}$ | $R^{D1}$ |
| $L_{C901}$ | $R^{D8}$ | $R^{D42}$ | $R^{D1}$ |
| $L_{C902}$ | $R^{D8}$ | $R^{D64}$ | $R^{D1}$ |
| $L_{C903}$ | $R^{D8}$ | $R^{D66}$ | $R^{D1}$ |
| $L_{C904}$ | $R^{D8}$ | $R^{D68}$ | $R^{D1}$ |
| $L_{C905}$ | $R^{D8}$ | $R^{D76}$ | $R^{D1}$ |
| $L_{C906}$ | $R^{D11}$ | $R^{D5}$ | $R^{D1}$ |
| $L_{C907}$ | $R^{D11}$ | $R^{D6}$ | $R^{D1}$ |
| $L_{C908}$ | $R^{D11}$ | $R^{D9}$ | $R^{D1}$ |
| $L_{C909}$ | $R^{D11}$ | $R^{D10}$ | $R^{D1}$ |
| $L_{C910}$ | $R^{D11}$ | $R^{D12}$ | $R^{D1}$ |
| $L_{C911}$ | $R^{D11}$ | $R^{D13}$ | $R^{D1}$ |
| $L_{C912}$ | $R^{D11}$ | $R^{D14}$ | $R^{D1}$ |
| $L_{C913}$ | $R^{D11}$ | $R^{D15}$ | $R^{D1}$ |
| $L_{C914}$ | $R^{D11}$ | $R^{D16}$ | $R^{D1}$ |
| $L_{C915}$ | $R^{D11}$ | $R^{D17}$ | $R^{D1}$ |
| $L_{C916}$ | $R^{D11}$ | $R^{D18}$ | $R^{D1}$ |
| $L_{C917}$ | $R^{D11}$ | $R^{D19}$ | $R^{D1}$ |
| $L_{C918}$ | $R^{D11}$ | $R^{D20}$ | $R^{D1}$ |
| $L_{C919}$ | $R^{D11}$ | $R^{D21}$ | $R^{D1}$ |
| $L_{C920}$ | $R^{D11}$ | $R^{D22}$ | $R^{D1}$ |
| $L_{C921}$ | $R^{D11}$ | $R^{D23}$ | $R^{D1}$ |
| $L_{C922}$ | $R^{D11}$ | $R^{D24}$ | $R^{D1}$ |
| $L_{C923}$ | $R^{D11}$ | $R^{D25}$ | $R^{D1}$ |
| $L_{C924}$ | $R^{D11}$ | $R^{D26}$ | $R^{D1}$ |
| $L_{C925}$ | $R^{D11}$ | $R^{D27}$ | $R^{D1}$ |
| $L_{C926}$ | $R^{D11}$ | $R^{D28}$ | $R^{D1}$ |
| $L_{C927}$ | $R^{D11}$ | $R^{D29}$ | $R^{D1}$ |
| $L_{C928}$ | $R^{D11}$ | $R^{D30}$ | $R^{D1}$ |
| $L_{C929}$ | $R^{D11}$ | $R^{D31}$ | $R^{D1}$ |
| $L_{C930}$ | $R^{D11}$ | $R^{D32}$ | $R^{D1}$ |
| $L_{C931}$ | $R^{D11}$ | $R^{D33}$ | $R^{D1}$ |
| $L_{C932}$ | $R^{D11}$ | $R^{D34}$ | $R^{D1}$ |
| $L_{C933}$ | $R^{D11}$ | $R^{D35}$ | $R^{D1}$ |
| $L_{C934}$ | $R^{D11}$ | $R^{D40}$ | $R^{D1}$ |
| $L_{C935}$ | $R^{D11}$ | $R^{D41}$ | $R^{D1}$ |
| $L_{C936}$ | $R^{D11}$ | $R^{D42}$ | $R^{D1}$ |
| $L_{C937}$ | $R^{D11}$ | $R^{D64}$ | $R^{D1}$ |

| Ligand | $R^1$ | $R^2$ | $R^3$ |
|---|---|---|---|
| $L_{C938}$ | $R^{D11}$ | $R^{D66}$ | $R^{D1}$ |
| $L_{C939}$ | $R^{D11}$ | $R^{D68}$ | $R^{D1}$ |
| $L_{C940}$ | $R^{D11}$ | $R^{D76}$ | $R^{D1}$ |
| $L_{C941}$ | $R^{D13}$ | $R^{D5}$ | $R^{D1}$ |
| $L_{C942}$ | $R^{D13}$ | $R^{D6}$ | $R^{D1}$ |
| $L_{C943}$ | $R^{D13}$ | $R^{D9}$ | $R^{D1}$ |
| $L_{C944}$ | $R^{D13}$ | $R^{D10}$ | $R^{D1}$ |
| $L_{C945}$ | $R^{D13}$ | $R^{D12}$ | $R^{D1}$ |
| $L_{C946}$ | $R^{D13}$ | $R^{D14}$ | $R^{D1}$ |
| $L_{C947}$ | $R^{D13}$ | $R^{D15}$ | $R^{D1}$ |
| $L_{C948}$ | $R^{D13}$ | $R^{D16}$ | $R^{D1}$ |
| $L_{C949}$ | $R^{D13}$ | $R^{D17}$ | $R^{D1}$ |
| $L_{C950}$ | $R^{D13}$ | $R^{D18}$ | $R^{D1}$ |
| $L_{C951}$ | $R^{D13}$ | $R^{D19}$ | $R^{D1}$ |
| $L_{C952}$ | $R^{D13}$ | $R^{D20}$ | $R^{D1}$ |
| $L_{C953}$ | $R^{D13}$ | $R^{D21}$ | $R^{D1}$ |
| $L_{C954}$ | $R^{D13}$ | $R^{D22}$ | $R^{D1}$ |
| $L_{C955}$ | $R^{D13}$ | $R^{D23}$ | $R^{D1}$ |
| $L_{C956}$ | $R^{D13}$ | $R^{D24}$ | $R^{D1}$ |
| $L_{C957}$ | $R^{D13}$ | $R^{D25}$ | $R^{D1}$ |
| $L_{C958}$ | $R^{D13}$ | $R^{D26}$ | $R^{D1}$ |
| $L_{C959}$ | $R^{D13}$ | $R^{D27}$ | $R^{D1}$ |
| $L_{C960}$ | $R^{D13}$ | $R^{D28}$ | $R^{D1}$ |
| $L_{C961}$ | $R^{D13}$ | $R^{D29}$ | $R^{D1}$ |
| $L_{C962}$ | $R^{D13}$ | $R^{D30}$ | $R^{D1}$ |
| $L_{C963}$ | $R^{D13}$ | $R^{D31}$ | $R^{D1}$ |
| $L_{C964}$ | $R^{D13}$ | $R^{D32}$ | $R^{D1}$ |
| $L_{C965}$ | $R^{D13}$ | $R^{D33}$ | $R^{D1}$ |
| $L_{C966}$ | $R^{D13}$ | $R^{D34}$ | $R^{D1}$ |
| $L_{C967}$ | $R^{D13}$ | $R^{D35}$ | $R^{D1}$ |
| $L_{C968}$ | $R^{D13}$ | $R^{D40}$ | $R^{D1}$ |
| $L_{C969}$ | $R^{D13}$ | $R^{D41}$ | $R^{D1}$ |
| $L_{C970}$ | $R^{D13}$ | $R^{D42}$ | $R^{D1}$ |
| $L_{C971}$ | $R^{D13}$ | $R^{D64}$ | $R^{D1}$ |
| $L_{C972}$ | $R^{D13}$ | $R^{D66}$ | $R^{D1}$ |
| $L_{C973}$ | $R^{D13}$ | $R^{D68}$ | $R^{D1}$ |
| $L_{C974}$ | $R^{D13}$ | $R^{D76}$ | $R^{D1}$ |
| $L_{C975}$ | $R^{D14}$ | $R^{D5}$ | $R^{D1}$ |
| $L_{C976}$ | $R^{D14}$ | $R^{D6}$ | $R^{D1}$ |
| $L_{C977}$ | $R^{D14}$ | $R^{D9}$ | $R^{D1}$ |
| $L_{C978}$ | $R^{D14}$ | $R^{D10}$ | $R^{D1}$ |
| $L_{C979}$ | $R^{D14}$ | $R^{D12}$ | $R^{D1}$ |
| $L_{C980}$ | $R^{D14}$ | $R^{D15}$ | $R^{D1}$ |
| $L_{C981}$ | $R^{D14}$ | $R^{D11}$ | $R^{D1}$ |
| $L_{C982}$ | $R^{D14}$ | $R^{D17}$ | $R^{D1}$ |
| $L_{C983}$ | $R^{D14}$ | $R^{D18}$ | $R^{D1}$ |
| $L_{C984}$ | $R^{D14}$ | $R^{D19}$ | $R^{D1}$ |
| $L_{C985}$ | $R^{D14}$ | $R^{D20}$ | $R^{D1}$ |
| $L_{C986}$ | $R^{D14}$ | $R^{D21}$ | $R^{D1}$ |
| $L_{C987}$ | $R^{D14}$ | $R^{D22}$ | $R^{D1}$ |
| $L_{C988}$ | $R^{D14}$ | $R^{D23}$ | $R^{D1}$ |
| $L_{C989}$ | $R^{D14}$ | $R^{D24}$ | $R^{D1}$ |
| $L_{C990}$ | $R^{D14}$ | $R^{D25}$ | $R^{D1}$ |
| $L_{C991}$ | $R^{D14}$ | $R^{D26}$ | $R^{D1}$ |
| $L_{C992}$ | $R^{D14}$ | $R^{D27}$ | $R^{D1}$ |
| $L_{C993}$ | $R^{D14}$ | $R^{D28}$ | $R^{D1}$ |
| $L_{C994}$ | $R^{D14}$ | $R^{D29}$ | $R^{D1}$ |
| $L_{C995}$ | $R^{D14}$ | $R^{D30}$ | $R^{D1}$ |
| $L_{C996}$ | $R^{D14}$ | $R^{D31}$ | $R^{D1}$ |
| $L_{C997}$ | $R^{D14}$ | $R^{D32}$ | $R^{D1}$ |
| $L_{C998}$ | $R^{D14}$ | $R^{D33}$ | $R^{D1}$ |
| $L_{C999}$ | $R^{D14}$ | $R^{D34}$ | $R^{D1}$ |
| $L_{C1000}$ | $R^{D14}$ | $R^{D35}$ | $R^{D1}$ |
| $L_{C1001}$ | $R^{D14}$ | $R^{D40}$ | $R^{D1}$ |
| $L_{C1002}$ | $R^{D14}$ | $R^{D41}$ | $R^{D1}$ |
| $L_{C1003}$ | $R^{D14}$ | $R^{D42}$ | $R^{D1}$ |
| $L_{C1004}$ | $R^{D14}$ | $R^{D64}$ | $R^{D1}$ |
| $L_{C1005}$ | $R^{D14}$ | $R^{D66}$ | $R^{D1}$ |
| $L_{C1006}$ | $R^{D14}$ | $R^{D68}$ | $R^{D1}$ |
| $L_{C1007}$ | $R^{D14}$ | $R^{D76}$ | $R^{D1}$ |
| $L_{C1008}$ | $R^{D22}$ | $R^{D5}$ | $R^{D1}$ |
| $L_{C1009}$ | $R^{D22}$ | $R^{D6}$ | $R^{D1}$ |
| $L_{C1010}$ | $R^{D22}$ | $R^{D9}$ | $R^{D1}$ |
| $L_{C1011}$ | $R^{D22}$ | $R^{D10}$ | $R^{D1}$ |
| $L_{C1012}$ | $R^{D22}$ | $R^{D12}$ | $R^{D1}$ |
| $L_{C1013}$ | $R^{D22}$ | $R^{D15}$ | $R^{D1}$ |
| $L_{C1014}$ | $R^{D22}$ | $R^{D16}$ | $R^{D1}$ |

-continued

| Ligand | $R^1$ | $R^2$ | $R^3$ |
|---|---|---|---|
| $L_{C1015}$ | $R^{D22}$ | $R^{D17}$ | $R^{D1}$ |
| $L_{C1016}$ | $R^{D22}$ | $R^{D18}$ | $R^{D1}$ |
| $L_{C1017}$ | $R^{D22}$ | $R^{D19}$ | $R^{D1}$ |
| $L_{C1018}$ | $R^{D22}$ | $R^{D20}$ | $R^{D1}$ |
| $L_{C1019}$ | $R^{D22}$ | $R^{D21}$ | $R^{D1}$ |
| $L_{C1020}$ | $R^{D22}$ | $R^{D23}$ | $R^{D1}$ |
| $L_{C1021}$ | $R^{D22}$ | $R^{D24}$ | $R^{D1}$ |
| $L_{C1022}$ | $R^{D22}$ | $R^{D25}$ | $R^{D1}$ |
| $L_{C1023}$ | $R^{D22}$ | $R^{D26}$ | $R^{D1}$ |
| $L_{C1024}$ | $R^{D22}$ | $R^{D27}$ | $R^{D1}$ |
| $L_{C1025}$ | $R^{D22}$ | $R^{D28}$ | $R^{D1}$ |
| $L_{C1026}$ | $R^{D22}$ | $R^{D29}$ | $R^{D1}$ |
| $L_{C1027}$ | $R^{D22}$ | $R^{D30}$ | $R^{D1}$ |
| $L_{C1028}$ | $R^{D22}$ | $R^{D31}$ | $R^{D1}$ |
| $L_{C1029}$ | $R^{D22}$ | $R^{D32}$ | $R^{D1}$ |
| $L_{C1030}$ | $R^{D22}$ | $R^{D33}$ | $R^{D1}$ |
| $L_{C1031}$ | $R^{D22}$ | $R^{D34}$ | $R^{D1}$ |
| $L_{C1032}$ | $R^{D22}$ | $R^{D35}$ | $R^{D1}$ |
| $L_{C1033}$ | $R^{D22}$ | $R^{D40}$ | $R^{D1}$ |
| $L_{C1034}$ | $R^{D22}$ | $R^{D41}$ | $R^{D1}$ |
| $L_{C1035}$ | $R^{D22}$ | $R^{D42}$ | $R^{D1}$ |
| $L_{C1036}$ | $R^{D22}$ | $R^{D64}$ | $R^{D1}$ |
| $L_{C1037}$ | $R^{D22}$ | $R^{D66}$ | $R^{D1}$ |
| $L_{C1038}$ | $R^{D22}$ | $R^{D68}$ | $R^{D1}$ |
| $L_{C1039}$ | $R^{D22}$ | $R^{D76}$ | $R^{D1}$ |
| $L_{C1040}$ | $R^{D26}$ | $R^{D5}$ | $R^{D1}$ |
| $L_{C1041}$ | $R^{D26}$ | $R^{D6}$ | $R^{D1}$ |
| $L_{C1042}$ | $R^{D26}$ | $R^{D9}$ | $R^{D1}$ |
| $L_{C1043}$ | $R^{D26}$ | $R^{D10}$ | $R^{D1}$ |
| $L_{C1044}$ | $R^{D26}$ | $R^{D12}$ | $R^{D1}$ |
| $L_{C1045}$ | $R^{D26}$ | $R^{D15}$ | $R^{D1}$ |
| $L_{C1046}$ | $R^{D26}$ | $R^{D16}$ | $R^{D1}$ |
| $L_{C1047}$ | $R^{D26}$ | $R^{D17}$ | $R^{D1}$ |
| $L_{C1048}$ | $R^{D26}$ | $R^{D18}$ | $R^{D1}$ |
| $L_{C1049}$ | $R^{D26}$ | $R^{D19}$ | $R^{D1}$ |
| $L_{C1050}$ | $R^{D26}$ | $R^{D20}$ | $R^{D1}$ |
| $L_{C1051}$ | $R^{D26}$ | $R^{D21}$ | $R^{D1}$ |
| $L_{C1052}$ | $R^{D26}$ | $R^{D23}$ | $R^{D1}$ |
| $L_{C1053}$ | $R^{D26}$ | $R^{D24}$ | $R^{D1}$ |
| $L_{C1054}$ | $R^{D26}$ | $R^{D25}$ | $R^{D1}$ |
| $L_{C1055}$ | $R^{D26}$ | $R^{D27}$ | $R^{D1}$ |
| $L_{C1056}$ | $R^{D26}$ | $R^{D28}$ | $R^{D1}$ |
| $L_{C1057}$ | $R^{D26}$ | $R^{D29}$ | $R^{D1}$ |
| $L_{C1058}$ | $R^{D26}$ | $R^{D30}$ | $R^{D1}$ |
| $L_{C1059}$ | $R^{D26}$ | $R^{D31}$ | $R^{D1}$ |
| $L_{C1060}$ | $R^{D26}$ | $R^{D32}$ | $R^{D1}$ |
| $L_{C1061}$ | $R^{D26}$ | $R^{D33}$ | $R^{D1}$ |
| $L_{C1062}$ | $R^{D26}$ | $R^{D34}$ | $R^{D1}$ |
| $L_{C1063}$ | $R^{D26}$ | $R^{D35}$ | $R^{D1}$ |
| $L_{C1064}$ | $R^{D26}$ | $R^{D40}$ | $R^{D1}$ |
| $L_{C1065}$ | $R^{D26}$ | $R^{D41}$ | $R^{D1}$ |
| $L_{C1066}$ | $R^{D26}$ | $R^{D42}$ | $R^{D1}$ |
| $L_{C1067}$ | $R^{D26}$ | $R^{D64}$ | $R^{D1}$ |
| $L_{C1068}$ | $R^{D26}$ | $R^{D66}$ | $R^{D1}$ |
| $L_{C1069}$ | $R^{D26}$ | $R^{D68}$ | $R^{D1}$ |
| $L_{C1070}$ | $R^{D26}$ | $R^{D76}$ | $R^{D1}$ |
| $L_{C1071}$ | $R^{D35}$ | $R^{D5}$ | $R^{D1}$ |
| $L_{C1072}$ | $R^{D35}$ | $R^{D6}$ | $R^{D1}$ |
| $L_{C1073}$ | $R^{D35}$ | $R^{D9}$ | $R^{D1}$ |
| $L_{C1074}$ | $R^{D35}$ | $R^{D10}$ | $R^{D1}$ |
| $L_{C1075}$ | $R^{D35}$ | $R^{D12}$ | $R^{D1}$ |
| $L_{C1076}$ | $R^{D35}$ | $R^{D15}$ | $R^{D1}$ |
| $L_{C1077}$ | $R^{D35}$ | $R^{D16}$ | $R^{D1}$ |
| $L_{C1078}$ | $R^{D35}$ | $R^{D17}$ | $R^{D1}$ |
| $L_{C1079}$ | $R^{D35}$ | $R^{D18}$ | $R^{D1}$ |
| $L_{C1080}$ | $R^{D35}$ | $R^{D19}$ | $R^{D1}$ |
| $L_{C1081}$ | $R^{D35}$ | $R^{D20}$ | $R^{D1}$ |
| $L_{C1082}$ | $R^{D35}$ | $R^{D21}$ | $R^{D1}$ |
| $L_{C1083}$ | $R^{D35}$ | $R^{D23}$ | $R^{D1}$ |
| $L_{C1084}$ | $R^{D35}$ | $R^{D24}$ | $R^{D1}$ |
| $L_{C1085}$ | $R^{D35}$ | $R^{D25}$ | $R^{D1}$ |
| $L_{C1086}$ | $R^{D35}$ | $R^{D27}$ | $R^{D1}$ |
| $L_{C1087}$ | $R^{D35}$ | $R^{D28}$ | $R^{D1}$ |
| $L_{C1088}$ | $R^{D35}$ | $R^{D29}$ | $R^{D1}$ |
| $L_{C1089}$ | $R^{D35}$ | $R^{D30}$ | $R^{D1}$ |
| $L_{C1090}$ | $R^{D35}$ | $R^{D31}$ | $R^{D1}$ |
| $L_{C1091}$ | $R^{D35}$ | $R^{D32}$ | $R^{D1}$ |

-continued

| Ligand | $R^1$ | $R^2$ | $R^3$ |
|---|---|---|---|
| $L_{C1092}$ | $R^{D35}$ | $R^{D33}$ | $R^{D1}$ |
| $L_{C1093}$ | $R^{D35}$ | $R^{D34}$ | $R^{D1}$ |
| $L_{C1094}$ | $R^{D35}$ | $R^{D40}$ | $R^{D1}$ |
| $L_{C1095}$ | $R^{D35}$ | $R^{D41}$ | $R^{D1}$ |
| $L_{C1096}$ | $R^{D35}$ | $R^{D42}$ | $R^{D1}$ |
| $L_{C1097}$ | $R^{D35}$ | $R^{D64}$ | $R^{D1}$ |
| $L_{C1098}$ | $R^{D35}$ | $R^{D66}$ | $R^{D1}$ |
| $L_{C1099}$ | $R^{D35}$ | $R^{D68}$ | $R^{D1}$ |
| $L_{C1100}$ | $R^{D35}$ | $R^{D76}$ | $R^{D1}$ |
| $L_{C1101}$ | $R^{D40}$ | $R^{D5}$ | $R^{D1}$ |
| $L_{C1102}$ | $R^{D40}$ | $R^{D6}$ | $R^{D1}$ |
| $L_{C1103}$ | $R^{D40}$ | $R^{D9}$ | $R^{D1}$ |
| $L_{C1104}$ | $R^{D40}$ | $R^{D10}$ | $R^{D1}$ |
| $L_{C1105}$ | $R^{D40}$ | $R^{D12}$ | $R^{D1}$ |
| $L_{C1106}$ | $R^{D40}$ | $R^{D15}$ | $R^{D1}$ |
| $L_{C1107}$ | $R^{D40}$ | $R^{D16}$ | $R^{D1}$ |
| $L_{C1108}$ | $R^{D40}$ | $R^{D17}$ | $R^{D1}$ |
| $L_{C1109}$ | $R^{D40}$ | $R^{D18}$ | $R^{D1}$ |
| $L_{C1110}$ | $R^{D40}$ | $R^{D19}$ | $R^{D1}$ |
| $L_{C1111}$ | $R^{D40}$ | $R^{D20}$ | $R^{D1}$ |
| $L_{C1112}$ | $R^{D40}$ | $R^{D21}$ | $R^{D1}$ |
| $L_{C1113}$ | $R^{D40}$ | $R^{D23}$ | $R^{D1}$ |
| $L_{C1114}$ | $R^{D40}$ | $R^{D24}$ | $R^{D1}$ |
| $L_{C1115}$ | $R^{D40}$ | $R^{D25}$ | $R^{D1}$ |
| $L_{C1116}$ | $R^{D40}$ | $R^{D27}$ | $R^{D1}$ |
| $L_{C1117}$ | $R^{D40}$ | $R^{D28}$ | $R^{D1}$ |
| $L_{C1118}$ | $R^{D40}$ | $R^{D29}$ | $R^{D1}$ |
| $L_{C1119}$ | $R^{D40}$ | $R^{D30}$ | $R^{D1}$ |
| $L_{C1120}$ | $R^{D40}$ | $R^{D31}$ | $R^{D1}$ |
| $L_{C1121}$ | $R^{D40}$ | $R^{D32}$ | $R^{D1}$ |
| $L_{C1122}$ | $R^{D40}$ | $R^{D33}$ | $R^{D1}$ |
| $L_{C1123}$ | $R^{D40}$ | $R^{D34}$ | $R^{D1}$ |
| $L_{C1124}$ | $R^{D40}$ | $R^{D41}$ | $R^{D1}$ |
| $L_{C1125}$ | $R^{D40}$ | $R^{D42}$ | $R^{D1}$ |
| $L_{C1126}$ | $R^{D40}$ | $R^{D64}$ | $R^{D1}$ |
| $L_{C1127}$ | $R^{D40}$ | $R^{D66}$ | $R^{D1}$ |
| $L_{C1128}$ | $R^{D40}$ | $R^{D68}$ | $R^{D1}$ |
| $L_{C1129}$ | $R^{D40}$ | $R^{D76}$ | $R^{D1}$ |
| $L_{C1130}$ | $R^{D41}$ | $R^{D5}$ | $R^{D1}$ |
| $L_{C1131}$ | $R^{D41}$ | $R^{D6}$ | $R^{D1}$ |
| $L_{C1132}$ | $R^{D41}$ | $R^{D9}$ | $R^{D1}$ |
| $L_{C1133}$ | $R^{D41}$ | $R^{D10}$ | $R^{D1}$ |
| $L_{C1134}$ | $R^{D41}$ | $R^{D12}$ | $R^{D1}$ |
| $L_{C1135}$ | $R^{D41}$ | $R^{D15}$ | $R^{D1}$ |
| $L_{C1136}$ | $R^{D41}$ | $R^{D16}$ | $R^{D1}$ |
| $L_{C1137}$ | $R^{D41}$ | $R^{D17}$ | $R^{D1}$ |
| $L_{C1138}$ | $R^{D41}$ | $R^{D18}$ | $R^{D1}$ |
| $L_{C1139}$ | $R^{D41}$ | $R^{D19}$ | $R^{D1}$ |
| $L_{C1140}$ | $R^{D41}$ | $R^{D20}$ | $R^{D1}$ |
| $L_{C1141}$ | $R^{D41}$ | $R^{D21}$ | $R^{D1}$ |
| $L_{C1142}$ | $R^{D41}$ | $R^{D23}$ | $R^{D1}$ |
| $L_{C1143}$ | $R^{D41}$ | $R^{D24}$ | $R^{D1}$ |
| $L_{C1144}$ | $R^{D41}$ | $R^{D25}$ | $R^{D1}$ |
| $L_{C1145}$ | $R^{D41}$ | $R^{D27}$ | $R^{D1}$ |
| $L_{C1146}$ | $R^{D41}$ | $R^{D28}$ | $R^{D1}$ |
| $L_{C1147}$ | $R^{D41}$ | $R^{D29}$ | $R^{D1}$ |
| $L_{C1148}$ | $R^{D41}$ | $R^{D30}$ | $R^{D1}$ |
| $L_{C1149}$ | $R^{D41}$ | $R^{D31}$ | $R^{D1}$ |
| $L_{C1150}$ | $R^{D41}$ | $R^{D32}$ | $R^{D1}$ |
| $L_{C1151}$ | $R^{D41}$ | $R^{D33}$ | $R^{D1}$ |
| $L_{C1152}$ | $R^{D41}$ | $R^{D34}$ | $R^{D1}$ |
| $L_{C153}$ | $R^{D41}$ | $R^{D42}$ | $R^{D1}$ |
| $L_{C1154}$ | $R^{D41}$ | $R^{D64}$ | $R^{D1}$ |
| $L_{C1155}$ | $R^{D41}$ | $R^{D66}$ | $R^{D1}$ |
| $L_{C1156}$ | $R^{D41}$ | $R^{D68}$ | $R^{D1}$ |
| $L_{C1157}$ | $R^{D41}$ | $R^{D76}$ | $R^{D1}$ |
| $L_{C1158}$ | $R^{D64}$ | $R^{D5}$ | $R^{D1}$ |
| $L_{C1159}$ | $R^{D64}$ | $R^{D6}$ | $R^{D1}$ |
| $L_{C1160}$ | $R^{D64}$ | $R^{D9}$ | $R^{D1}$ |
| $L_{C1161}$ | $R^{D64}$ | $R^{D10}$ | $R^{D1}$ |
| $L_{C1162}$ | $R^{D64}$ | $R^{D12}$ | $R^{D1}$ |
| $L_{C1163}$ | $R^{D64}$ | $R^{D15}$ | $R^{D1}$ |
| $L_{C1164}$ | $R^{D64}$ | $R^{D16}$ | $R^{D1}$ |
| $L_{C1165}$ | $R^{D64}$ | $R^{D17}$ | $R^{D1}$ |
| $L_{C1166}$ | $R^{D64}$ | $R^{D18}$ | $R^{D1}$ |
| $L_{C1167}$ | $R^{D64}$ | $R^{D19}$ | $R^{D1}$ |
| $L_{C1168}$ | $R^{D64}$ | $R^{D20}$ | $R^{D1}$ |

-continued

| Ligand | $R^1$ | $R^2$ | $R^3$ |
|---|---|---|---|
| $L_{C1169}$ | $R^{D64}$ | $R^{D21}$ | $R^{D1}$ |
| $L_{C1170}$ | $R^{D64}$ | $R^{D23}$ | $R^{D1}$ |
| $L_{C1171}$ | $R^{D64}$ | $R^{D24}$ | $R^{D1}$ |
| $L_{C1172}$ | $R^{D64}$ | $R^{D25}$ | $R^{D1}$ |
| $L_{C1173}$ | $R^{D64}$ | $R^{D27}$ | $R^{D1}$ |
| $L_{C1174}$ | $R^{D64}$ | $R^{D28}$ | $R^{D1}$ |
| $L_{C1175}$ | $R^{D64}$ | $R^{D29}$ | $R^{D1}$ |
| $L_{C1176}$ | $R^{D64}$ | $R^{D30}$ | $R^{D1}$ |
| $L_{C1177}$ | $R^{D64}$ | $R^{D31}$ | $R^{D1}$ |
| $L_{C1178}$ | $R^{D64}$ | $R^{D32}$ | $R^{D1}$ |
| $L_{C1179}$ | $R^{D64}$ | $R^{D33}$ | $R^{D1}$ |
| $L_{C1180}$ | $R^{D64}$ | $R^{D34}$ | $R^{D1}$ |
| $L_{C1181}$ | $R^{D64}$ | $R^{D42}$ | $R^{D1}$ |
| $L_{C1182}$ | $R^{D64}$ | $R^{D64}$ | $R^{D1}$ |
| $L_{C1183}$ | $R^{D64}$ | $R^{D66}$ | $R^{D1}$ |
| $L_{C1184}$ | $R^{D64}$ | $R^{D68}$ | $R^{D1}$ |
| $L_{C1185}$ | $R^{D64}$ | $R^{D76}$ | $R^{D1}$ |
| $L_{C1186}$ | $R^{D66}$ | $R^{D5}$ | $R^{D1}$ |
| $L_{C1187}$ | $R^{D66}$ | $R^{D6}$ | $R^{D1}$ |
| $L_{C1188}$ | $R^{D66}$ | $R^{D9}$ | $R^{D1}$ |
| $L_{C1189}$ | $R^{D66}$ | $R^{D10}$ | $R^{D1}$ |
| $L_{C1190}$ | $R^{D66}$ | $R^{D12}$ | $R^{D1}$ |
| $L_{C1191}$ | $R^{D66}$ | $R^{D15}$ | $R^{D1}$ |
| $L_{C1192}$ | $R^{D66}$ | $R^{D16}$ | $R^{D1}$ |
| $L_{C1193}$ | $R^{D66}$ | $R^{D17}$ | $R^{D1}$ |
| $L_{C1194}$ | $R^{D66}$ | $R^{D18}$ | $R^{D1}$ |
| $L_{C1195}$ | $R^{D66}$ | $R^{D19}$ | $R^{D1}$ |
| $L_{C1196}$ | $R^{D66}$ | $R^{D20}$ | $R^{D1}$ |
| $L_{C1197}$ | $R^{D66}$ | $R^{D21}$ | $R^{D1}$ |
| $L_{C1198}$ | $R^{D66}$ | $R^{D23}$ | $R^{D1}$ |
| $L_{C1199}$ | $R^{D66}$ | $R^{D24}$ | $R^{D1}$ |
| $L_{C1200}$ | $R^{D66}$ | $R^{D25}$ | $R^{D1}$ |
| $L_{C1201}$ | $R^{D66}$ | $R^{D27}$ | $R^{D1}$ |
| $L_{C1202}$ | $R^{D66}$ | $R^{D28}$ | $R^{D1}$ |
| $L_{C1203}$ | $R^{D66}$ | $R^{D29}$ | $R^{D1}$ |
| $L_{C1204}$ | $R^{D66}$ | $R^{D30}$ | $R^{D1}$ |
| $L_{C1205}$ | $R^{D66}$ | $R^{D31}$ | $R^{D1}$ |
| $L_{C1206}$ | $R^{D66}$ | $R^{D32}$ | $R^{D1}$ |
| $L_{C1207}$ | $R^{D66}$ | $R^{D33}$ | $R^{D1}$ |
| $L_{C1208}$ | $R^{D66}$ | $R^{D34}$ | $R^{D1}$ |
| $L_{C1209}$ | $R^{D66}$ | $R^{D42}$ | $R^{D1}$ |
| $L_{C1210}$ | $R^{D66}$ | $R^{D68}$ | $R^{D1}$ |
| $L_{C1211}$ | $R^{D66}$ | $R^{D76}$ | $R^{D1}$ |
| $L_{C1212}$ | $R^{D68}$ | $R^{D5}$ | $R^{D1}$ |
| $L_{C1213}$ | $R^{D68}$ | $R^{D6}$ | $R^{D1}$ |
| $L_{C1214}$ | $R^{D68}$ | $R^{D9}$ | $R^{D1}$ |
| $L_{C1215}$ | $R^{D68}$ | $R^{D10}$ | $R^{D1}$ |
| $L_{C1216}$ | $R^{D68}$ | $R^{D12}$ | $R^{D1}$ |
| $L_{C1217}$ | $R^{D68}$ | $R^{D15}$ | $R^{D1}$ |
| $L_{C1218}$ | $R^{D68}$ | $R^{D16}$ | $R^{D1}$ |
| $L_{C1219}$ | $R^{D68}$ | $R^{D17}$ | $R^{D1}$ |
| $L_{C1220}$ | $R^{D68}$ | $R^{D18}$ | $R^{D1}$ |
| $L_{C1221}$ | $R^{D68}$ | $R^{D19}$ | $R^{D1}$ |
| $L_{C1222}$ | $R^{D68}$ | $R^{D20}$ | $R^{D1}$ |
| $L_{C1223}$ | $R^{D68}$ | $R^{D21}$ | $R^{D1}$ |
| $L_{C1224}$ | $R^{D68}$ | $R^{D23}$ | $R^{D1}$ |
| $L_{C1225}$ | $R^{D68}$ | $R^{D24}$ | $R^{D1}$ |
| $L_{C1226}$ | $R^{D68}$ | $R^{D25}$ | $R^{D1}$ |
| $L_{C1227}$ | $R^{D68}$ | $R^{D27}$ | $R^{D1}$ |
| $L_{C1228}$ | $R^{D68}$ | $R^{D28}$ | $R^{D1}$ |
| $L_{C1229}$ | $R^{D68}$ | $R^{D29}$ | $R^{D1}$ |
| $L_{C1230}$ | $R^{D68}$ | $R^{D30}$ | $R^{D1}$ |
| $L_{C1231}$ | $R^{D68}$ | $R^{D31}$ | $R^{D1}$ |
| $L_{C1232}$ | $R^{D68}$ | $R^{D32}$ | $R^{D1}$ |
| $L_{C1233}$ | $R^{D68}$ | $R^{D33}$ | $R^{D1}$ |
| $L_{C1234}$ | $R^{D68}$ | $R^{D34}$ | $R^{D1}$ |
| $L_{C1235}$ | $R^{D68}$ | $R^{D42}$ | $R^{D1}$ |
| $L_{C1236}$ | $R^{D68}$ | $R^{D76}$ | $R^{D1}$ |
| $L_{C1237}$ | $R^{D76}$ | $R^{D5}$ | $R^{D1}$ |
| $L_{C1238}$ | $R^{D76}$ | $R^{D6}$ | $R^{D1}$ |
| $L_{C1239}$ | $R^{D76}$ | $R^{D9}$ | $R^{D1}$ |
| $L_{C1240}$ | $R^{D76}$ | $R^{D10}$ | $R^{D1}$ |
| $L_{C1241}$ | $R^{D76}$ | $R^{D12}$ | $R^{D1}$ |
| $L_{C1242}$ | $R^{D76}$ | $R^{D15}$ | $R^{D1}$ |
| $L_{C1243}$ | $R^{D76}$ | $R^{D16}$ | $R^{D1}$ |
| $L_{C1244}$ | $R^{D76}$ | $R^{D17}$ | $R^{D1}$ |
| $L_{C1245}$ | $R^{D76}$ | $R^{D18}$ | $R^{D1}$ |

-continued

| Ligand | $R^1$ | $R^2$ | $R^3$ |
|---|---|---|---|
| $L_{C1246}$ | $R^{D76}$ | $R^{D19}$ | $R^{D1}$ |
| $L_{C1247}$ | $R^{D76}$ | $R^{D20}$ | $R^{D1}$ |
| $L_{C1248}$ | $R^{D76}$ | $R^{D21}$ | $R^{D1}$ |
| $L_{C1249}$ | $R^{D76}$ | $R^{D23}$ | $R^{D1}$ |
| $L_{C1250}$ | $R^{D76}$ | $R^{D24}$ | $R^{D1}$ |
| $L_{C1251}$ | $R^{D76}$ | $R^{D25}$ | $R^{D1}$ |
| $L_{C1252}$ | $R^{D76}$ | $R^{D27}$ | $R^{D1}$ |
| $L_{C1253}$ | $R^{D76}$ | $R^{D28}$ | $R^{D1}$ |
| $L_{C1254}$ | $R^{D76}$ | $R^{D29}$ | $R^{D1}$ |
| $L_{C1255}$ | $R^{D76}$ | $R^{D30}$ | $R^{D1}$ |
| $L_{C1256}$ | $R^{D76}$ | $R^{D31}$ | $R^{D1}$ |
| $L_{C1257}$ | $R^{D76}$ | $R^{D32}$ | $R^{D1}$ |
| $L_{C1258}$ | $R^{D76}$ | $R^{D33}$ | $R^{D1}$ |
| $L_{C1259}$ | $R^{D76}$ | $R^{D34}$ | $R^{D1}$ |
| $L_{C1260}$ | $R^{D76}$ | $R^{D42}$ | $R^{D1}$ |

and wherein $R^{D1}$ to $R^{D81}$ has the following structures:

$R^{D1}$

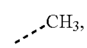

$R^{D2}$

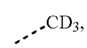

$R^{D3}$

$R^{D4}$

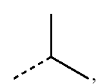

$R^{D5}$

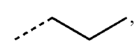

$R^{D6}$

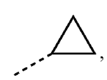

$R^{D7}$

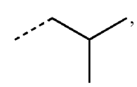

$R^{D8}$

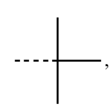

$R^{D9}$

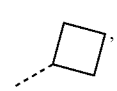

$R^{D10}$

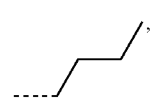

$R^{D11}$

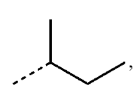

$R^{D12}$

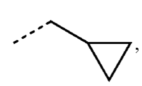

-continued
$R^{D13}$
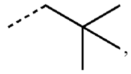
$R^{D14}$
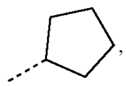
$R^{D15}$
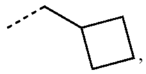
$R^{D16}$
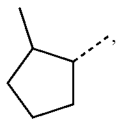
$R^{D17}$
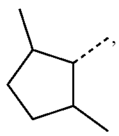
$R^{D18}$
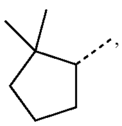
$R^{D19}$
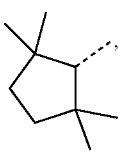
$R^{D20}$
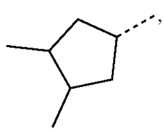
$R^{D21}$
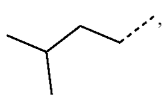
$R^{D22}$
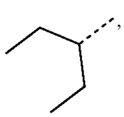
$R^{D23}$
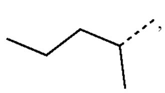
$R^{D24}$
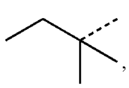
$R^{D25}$
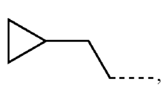
-continued
$R^{D26}$
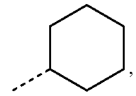
$R^{D27}$
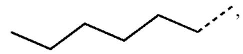
$R^{D28}$
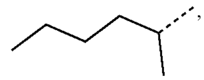
$R^{D29}$
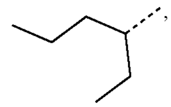
$R^{D30}$
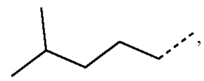
$R^{D31}$
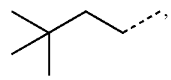
$R^{D32}$
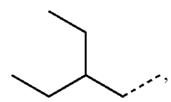
$R^{D33}$
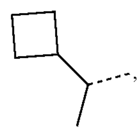
$R^{D34}$
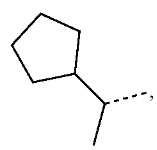
$R^{D35}$
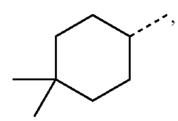
$R^{D36}$
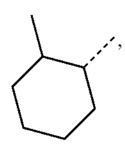
$R^{D37}$
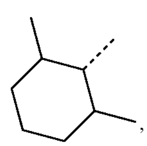
$R^{D38}$
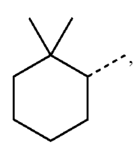

-continued
$R^{D39}$
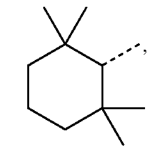
$R^{D40}$
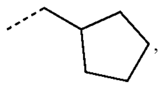
$R^{D41}$
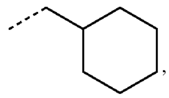
$R^{D42}$
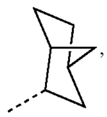
$R^{D43}$
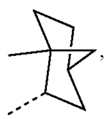
$R^{D44}$
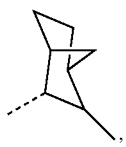
$R^{D45}$
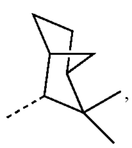
$R^{D46}$
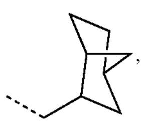
$R^{D47}$
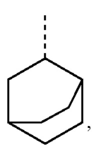
$R^{D48}$
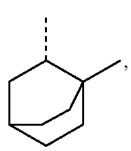
$R^{D49}$
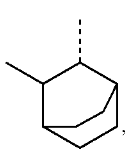
-continued
$R^{D50}$
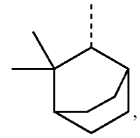
$R^{D51}$
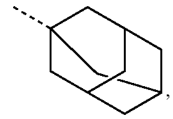
$R^{D52}$
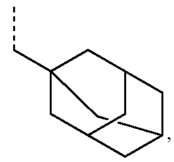
$R^{D53}$
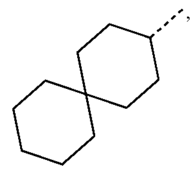
$R^{D54}$
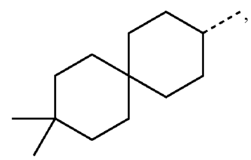
$R^{D55}$
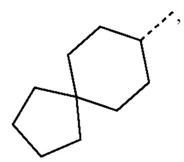
$R^{D56}$
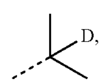
$R^{D57}$
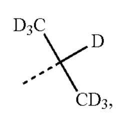
$R^{D58}$
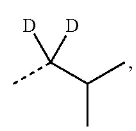
$R^{D59}$
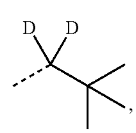
$R^{D60}$
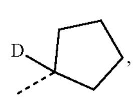

-continued $R^{D61}$

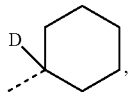

$R^{D62}$

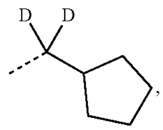

$R^{D63}$

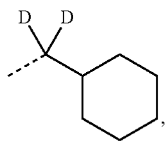

$R^{D64}$

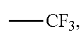

$R^{D65}$

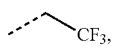

$R^{D66}$

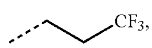

$R^{D67}$

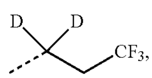

$R^{D68}$

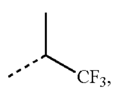

$R^{D69}$

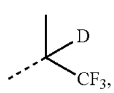

$R^{D70}$

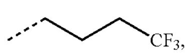

$R^{D71}$

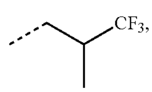

$R^{D72}$

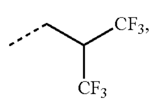

$R^{D73}$

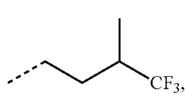

$R^{D74}$

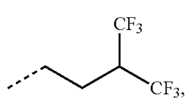

$R^{D75}$

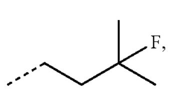

$R^{D76}$

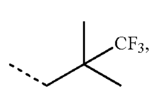

-continued $R^{D77}$

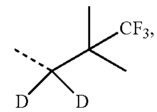

$R^{D78}$

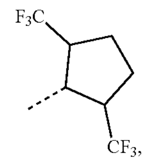

$R^{D79}$

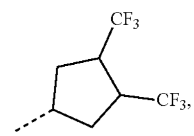

$R^{D80}$

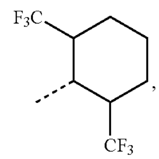

and $R^{D81}$

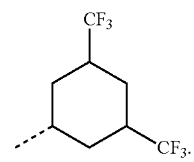

In some embodiments, an organic light emitting device (OLED) is described. The OLED can include an anode; a cathode; and an organic layer, disposed between the anode and the cathode, where the organic layer includes a compound comprising a first ligand $L_A$ of Formula IA, Formula IB, or Formula IC, as described herein.

In some embodiments, a consumer product comprising an OLED as described herein is described.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

According to another aspect, an emissive region in an OLED (e.g., the organic layer described herein) is disclosed. The emissive region comprises a compound comprising a first ligand $L_A$ of Formula IA, Formula IB, or Formula IC, as described herein.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1{-}Ar_2$, and $C_nH_{2n}{-}Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the group consisting of:

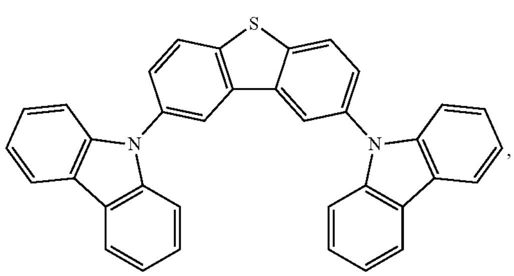

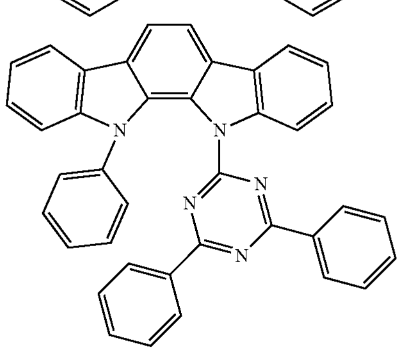

-continued

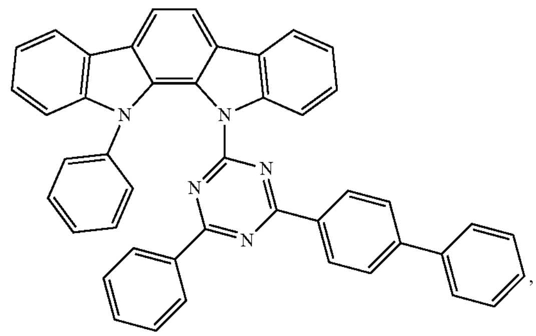

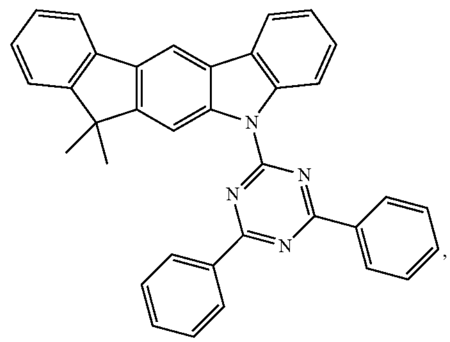

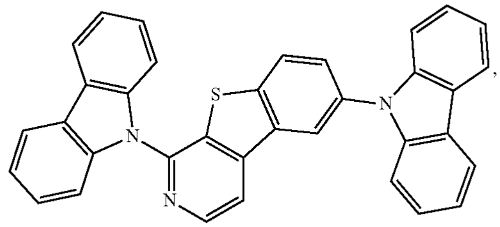

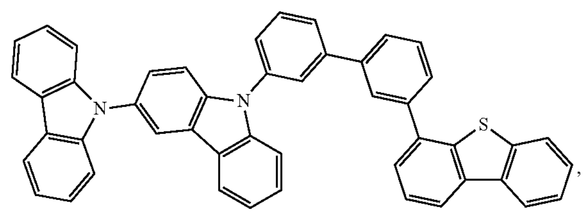

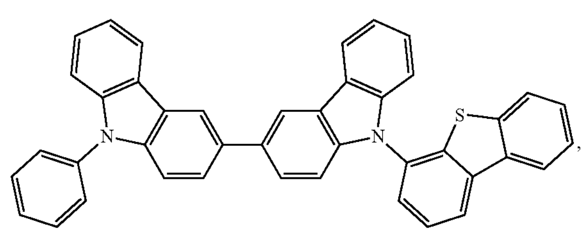

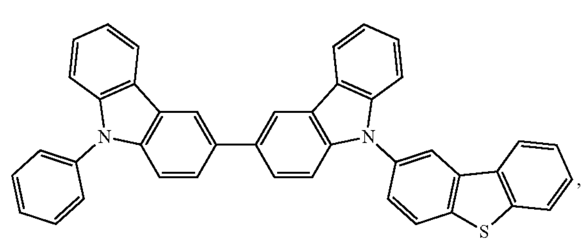

-continued
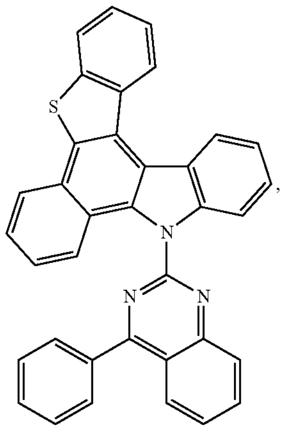
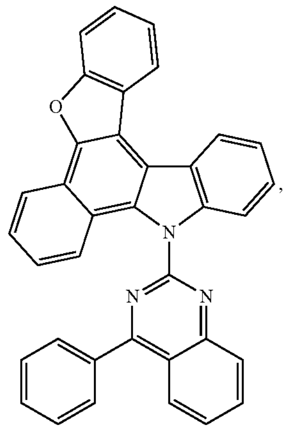
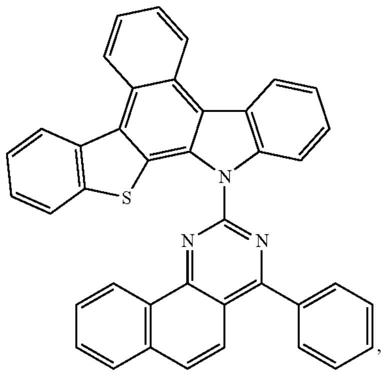
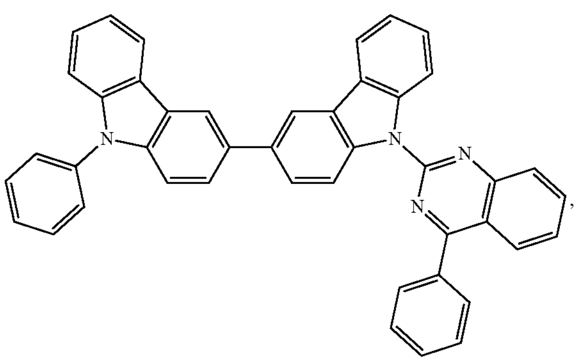
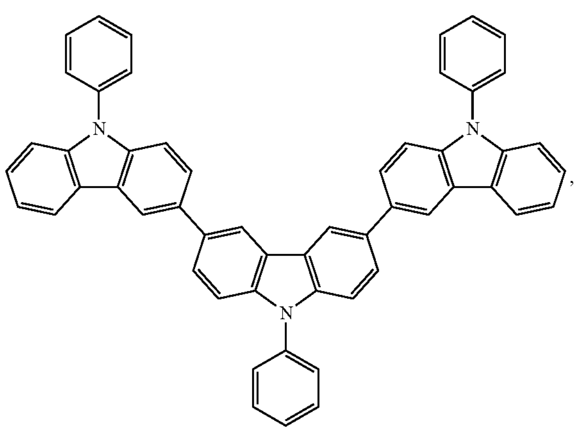
-continued
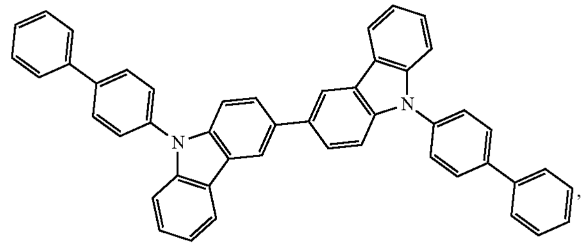
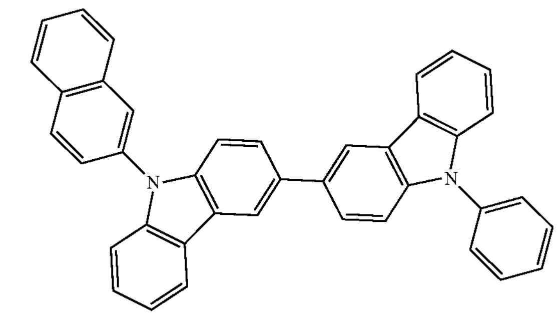
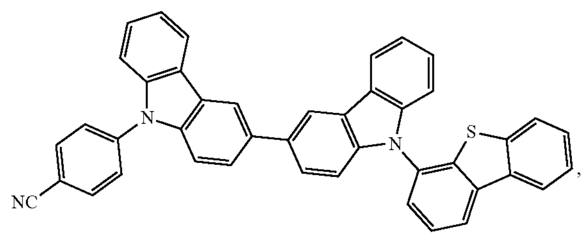
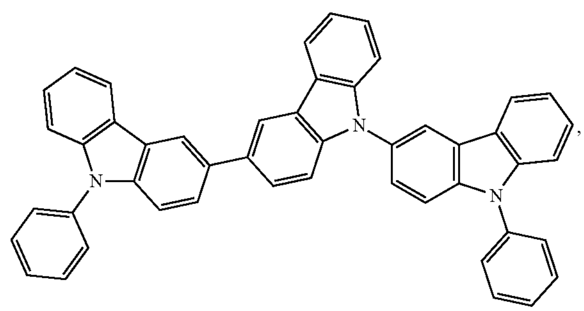
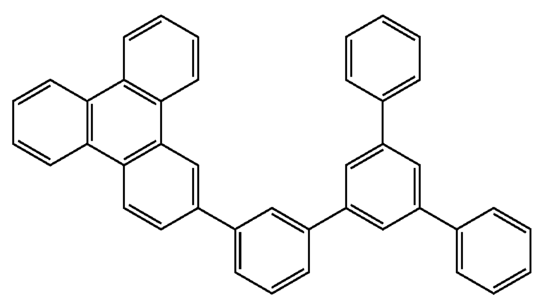
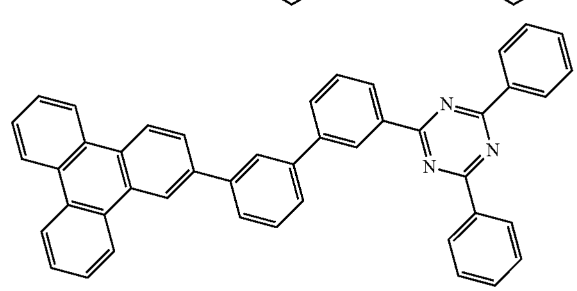

-continued

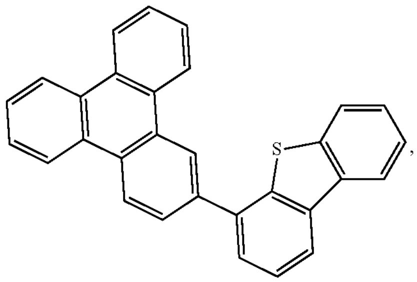

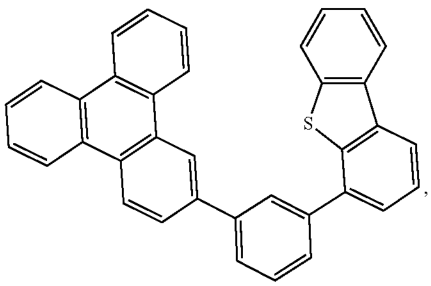

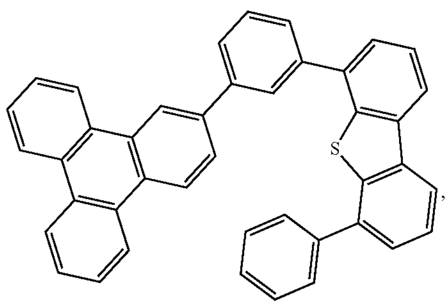

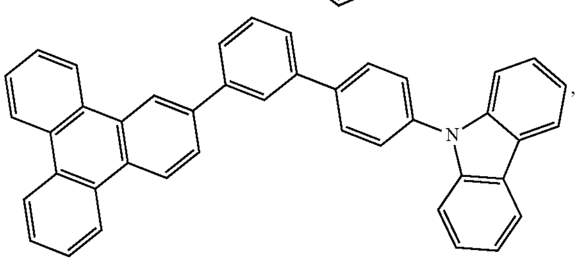

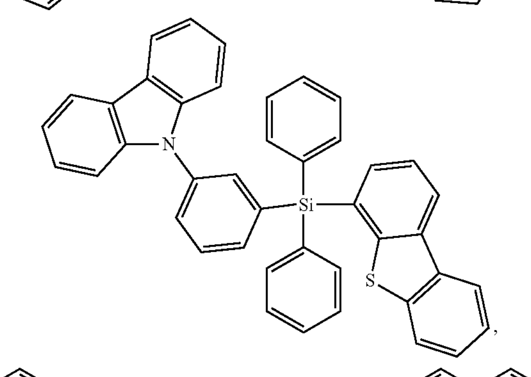

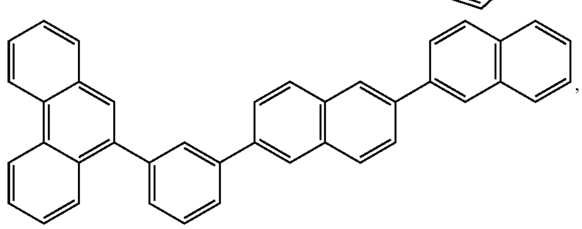

and combinations thereof.

Additional information on possible hosts is provided below.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

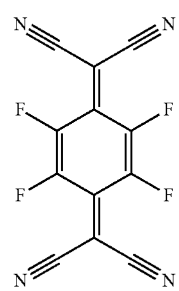

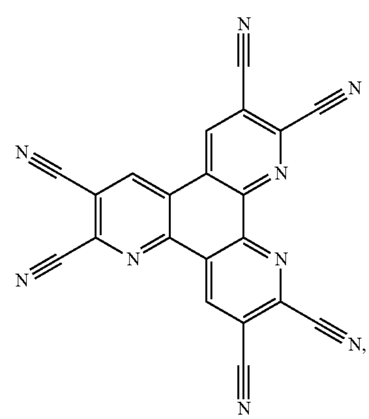

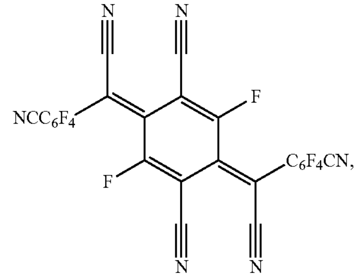

-continued

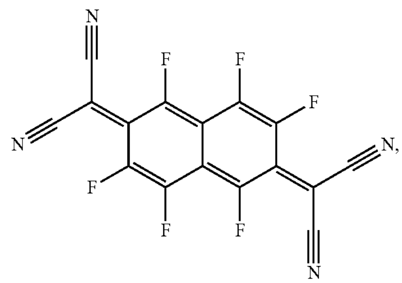

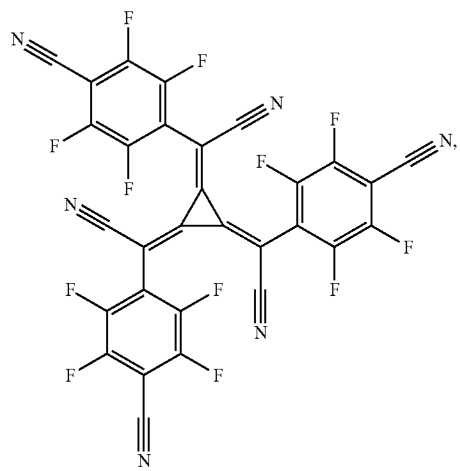

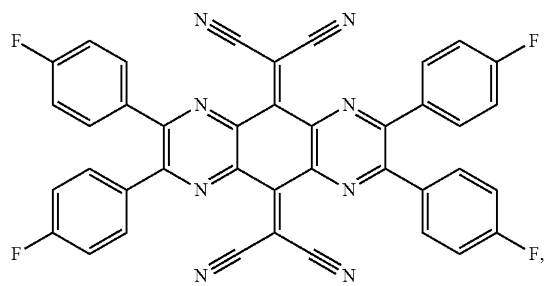

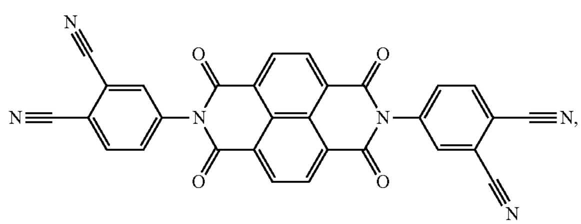

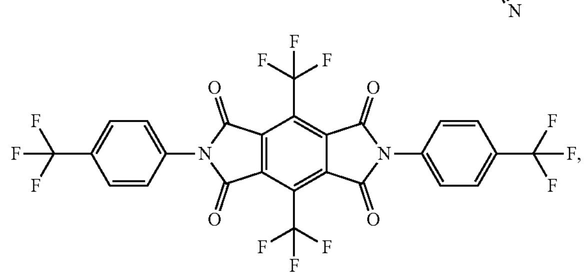

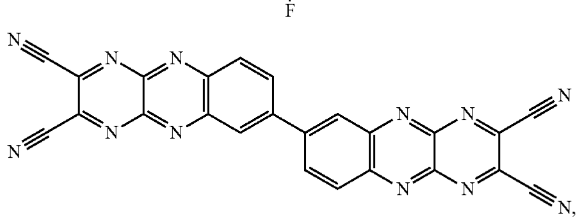

-continued

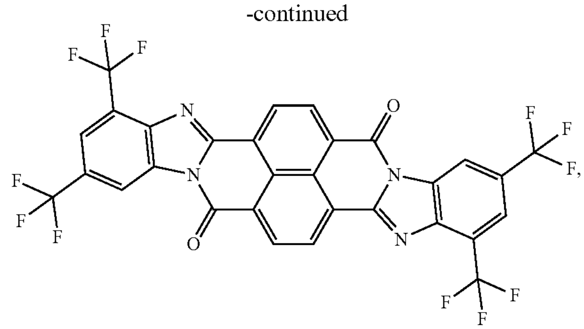

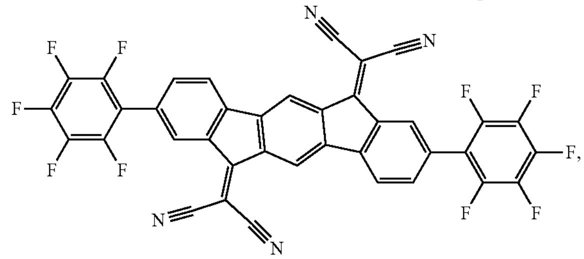

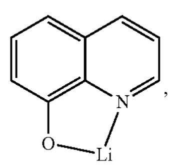
, and
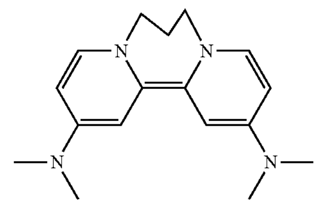

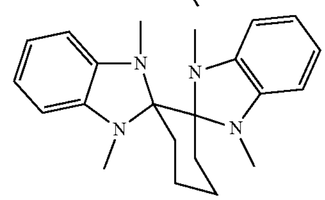

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

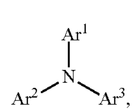

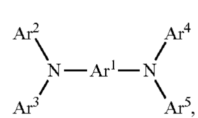

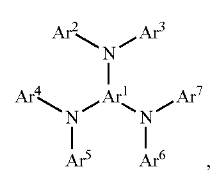
,

-continued

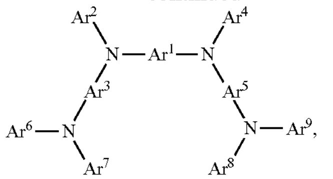

and

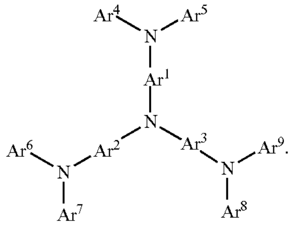

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

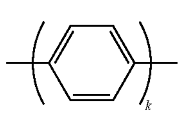

,

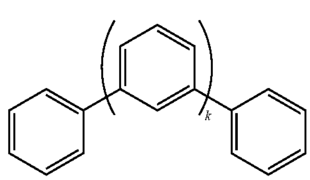

,

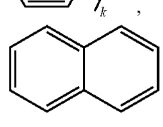

,

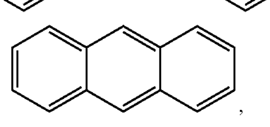

,

-continued

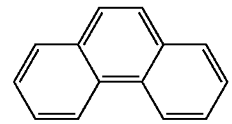

,

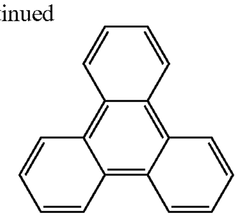

,

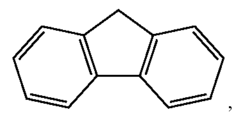

, and

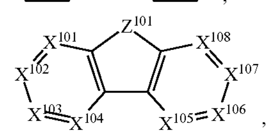

, wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

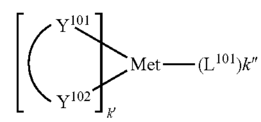

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

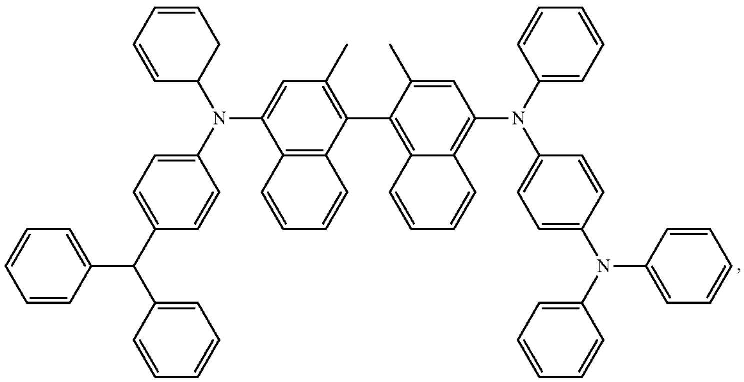
N
N
N
,
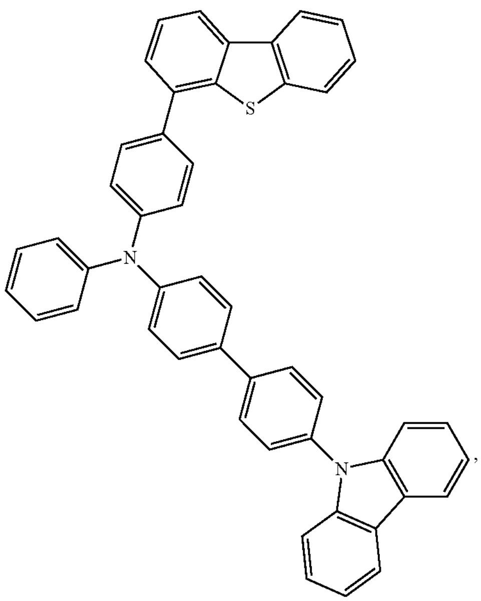
S
N
N
,
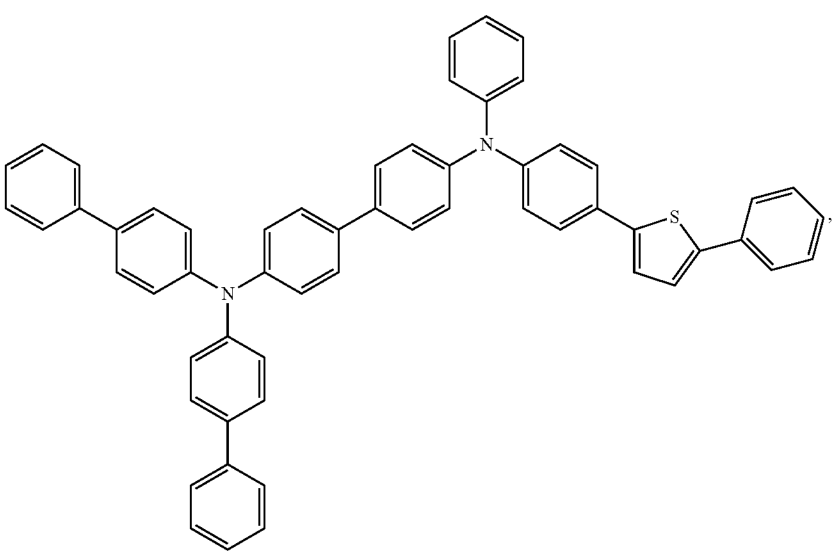
N
N
S
,

-continued
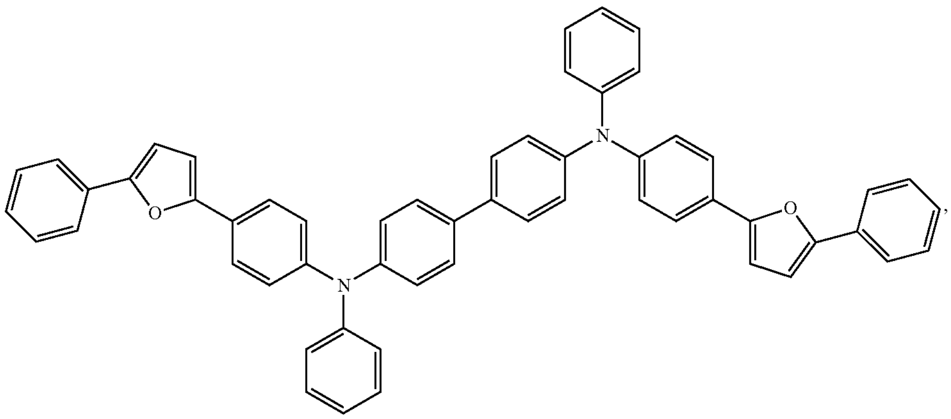
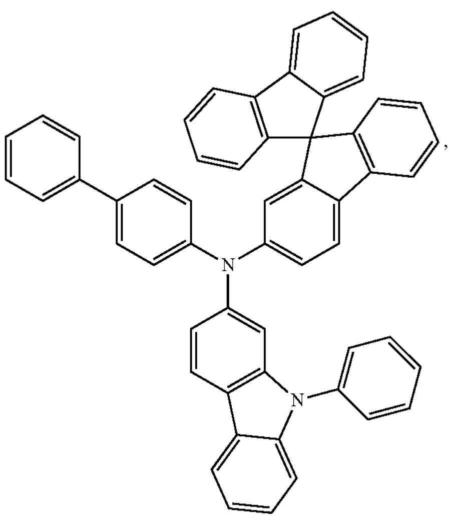
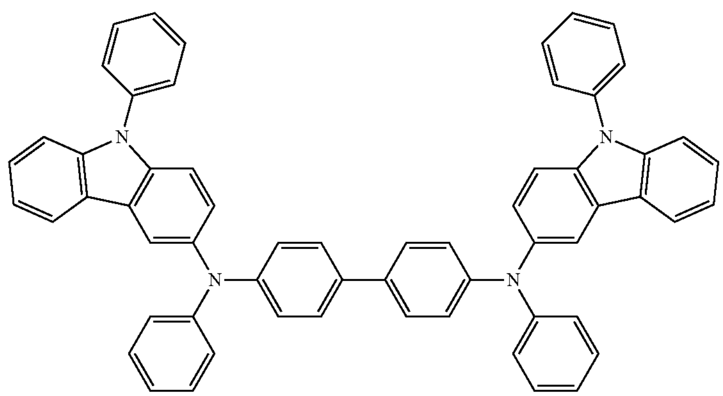
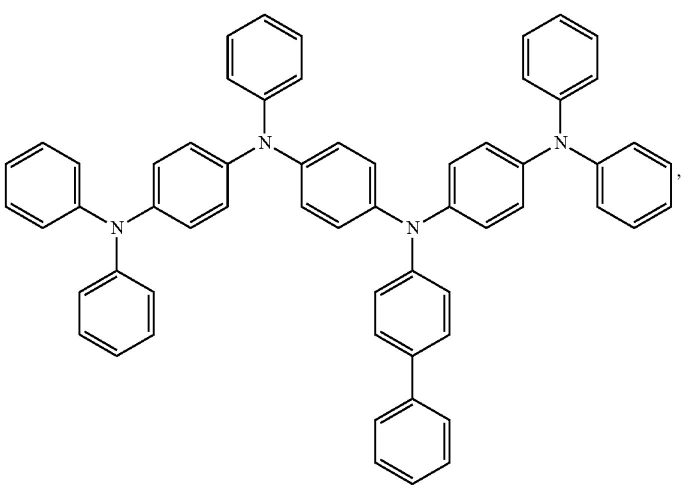

-continued
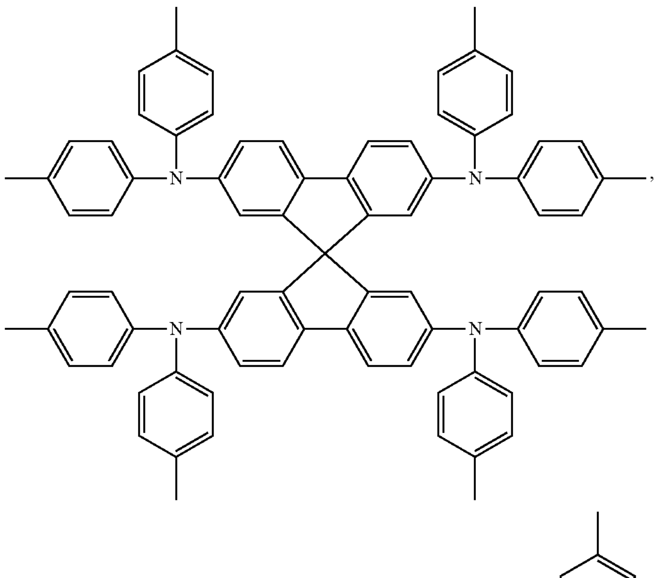
,
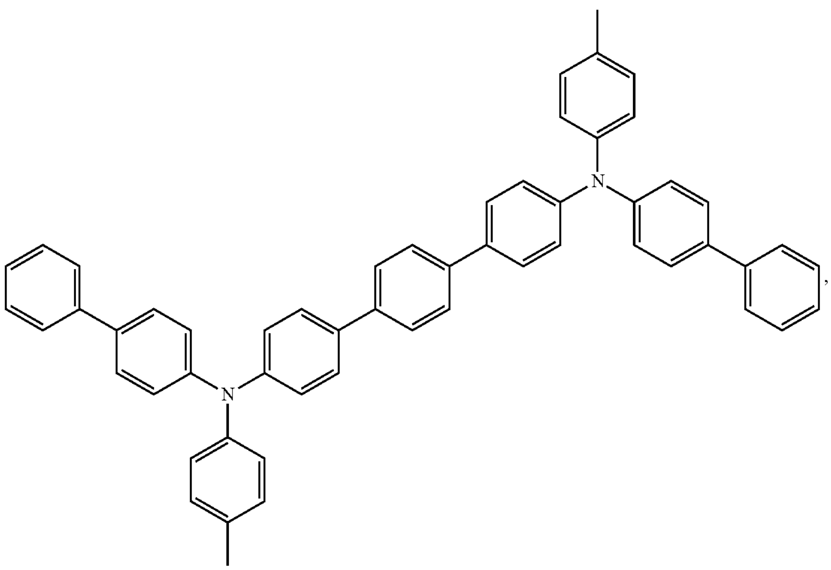
,
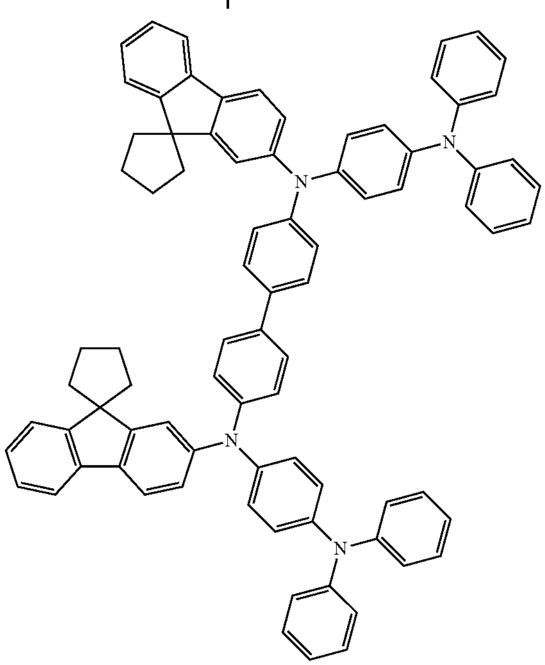
,

-continued
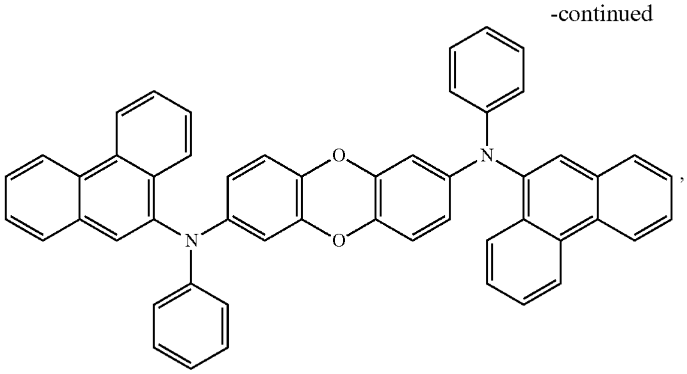
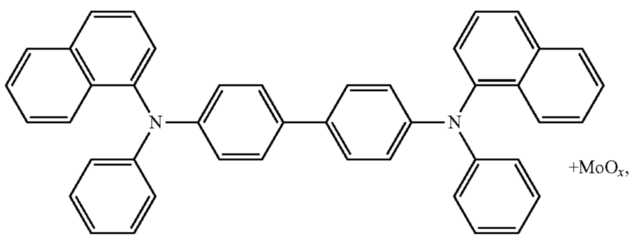
+MoO$_x$,
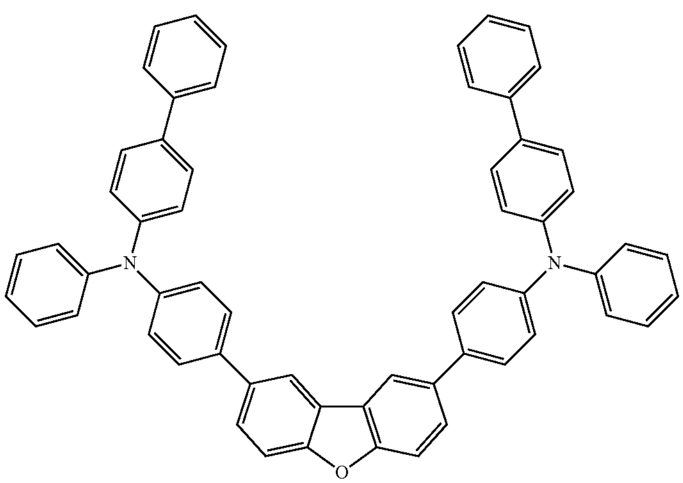
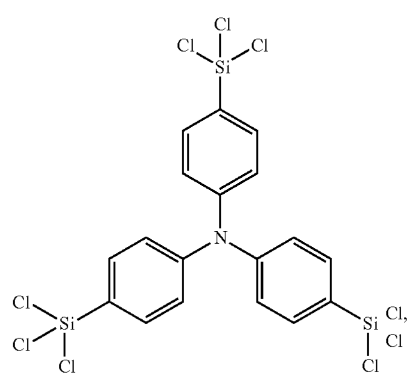
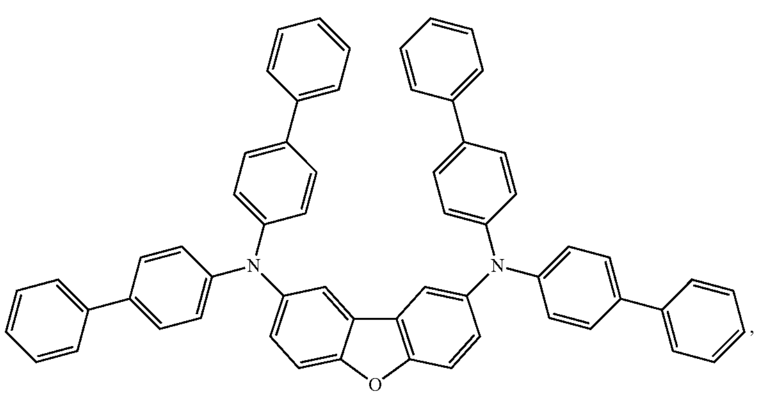
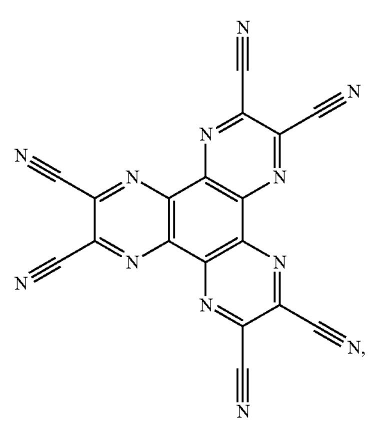

-continued
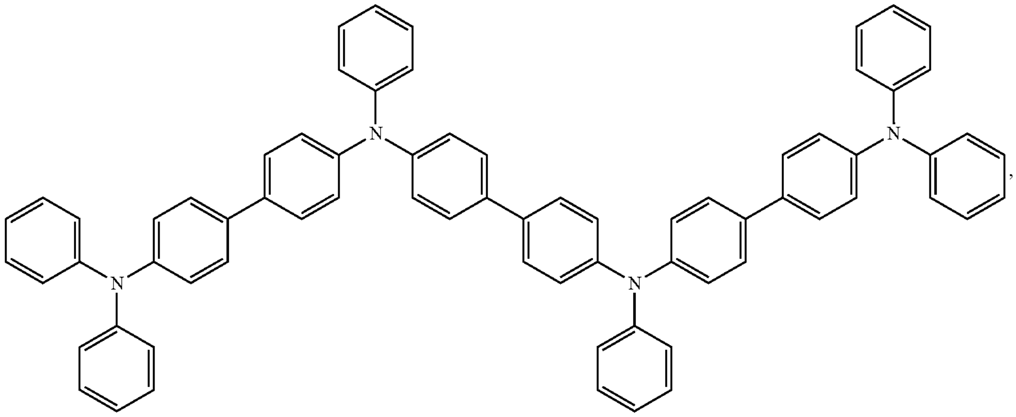
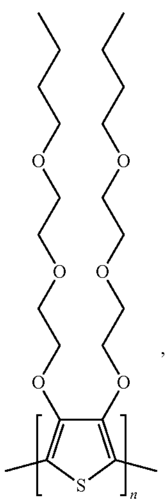
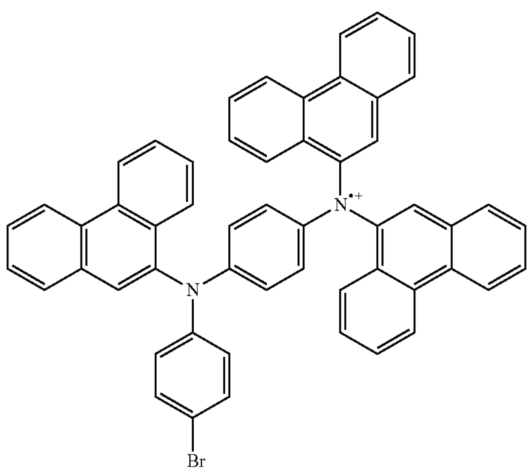
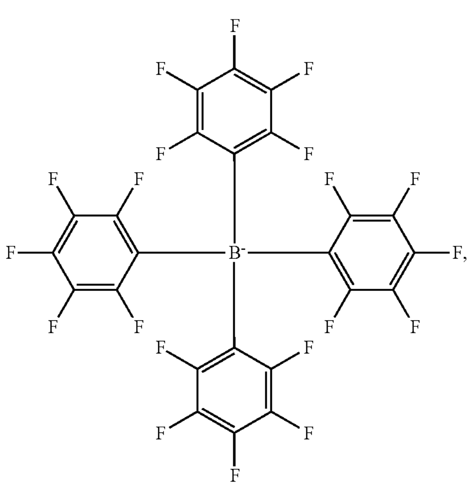
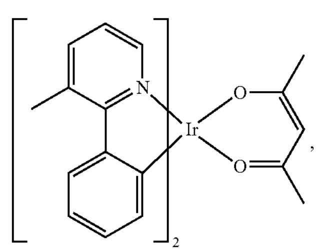

-continued
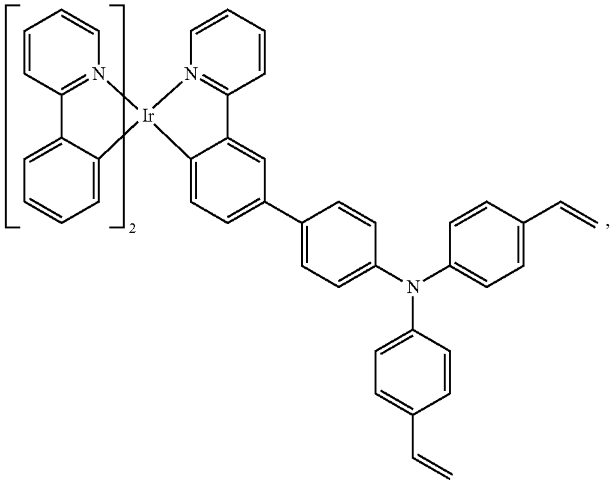
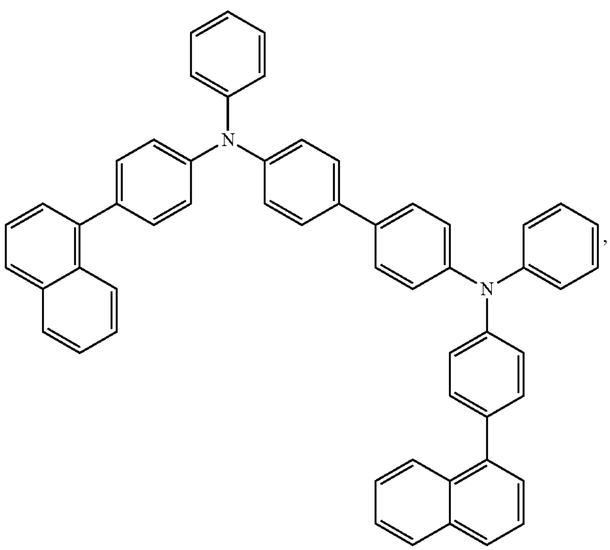
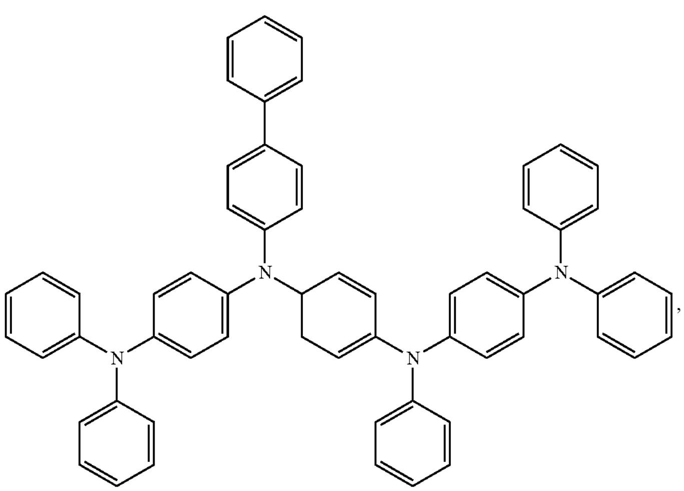

-continued
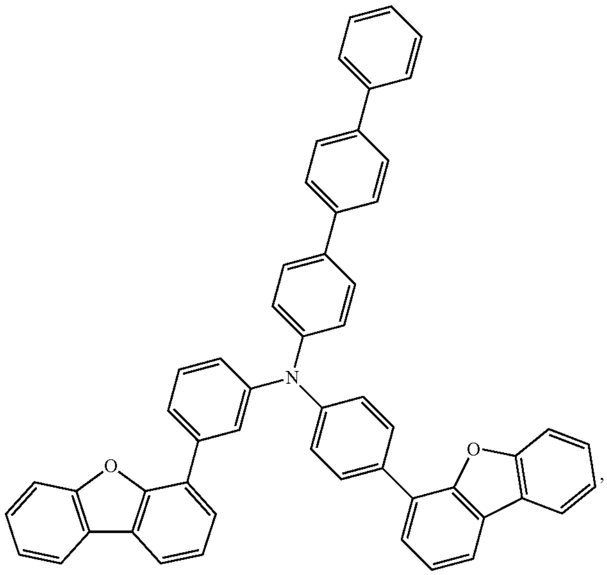
,
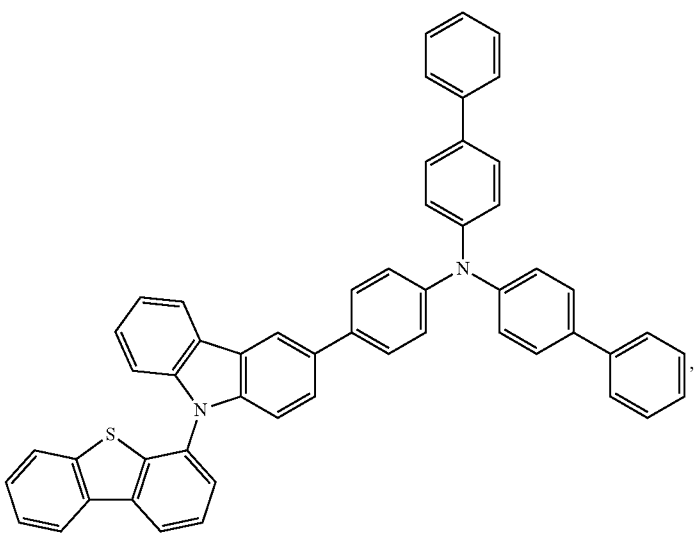
,
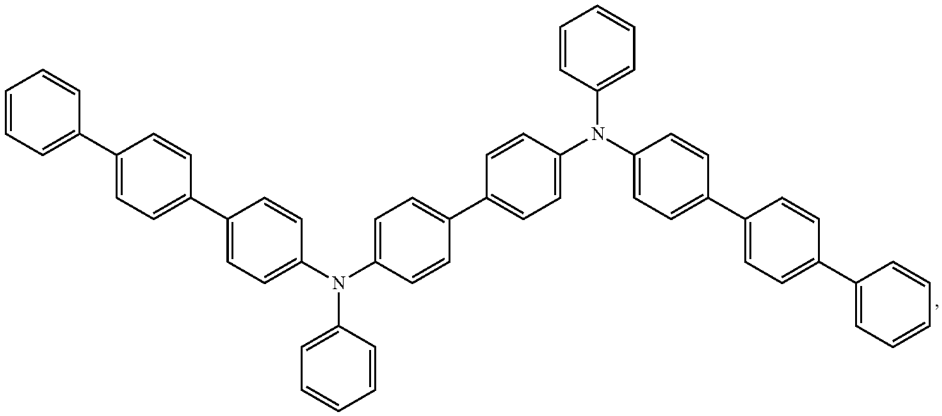
,

-continued
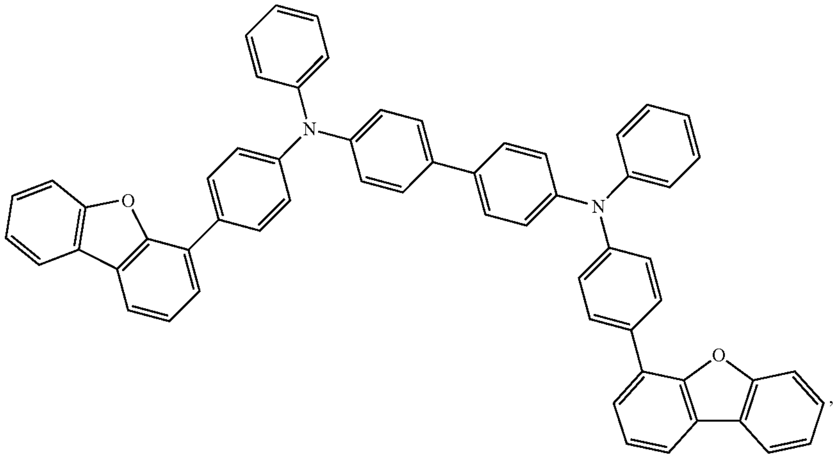
,
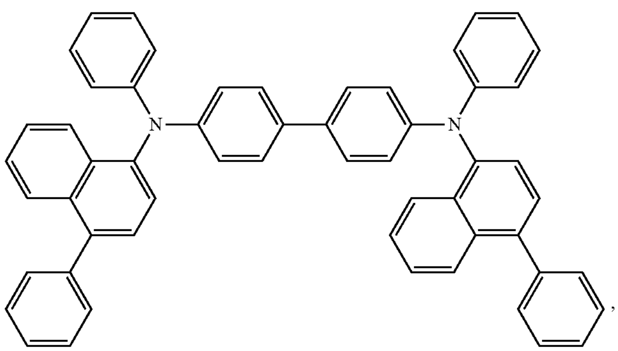
,
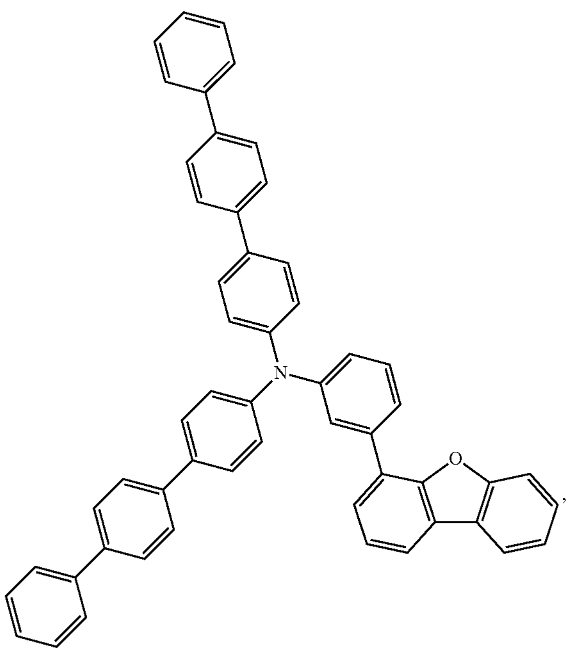
,
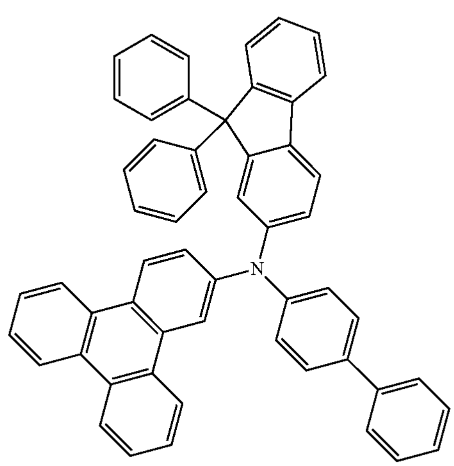
,

-continued
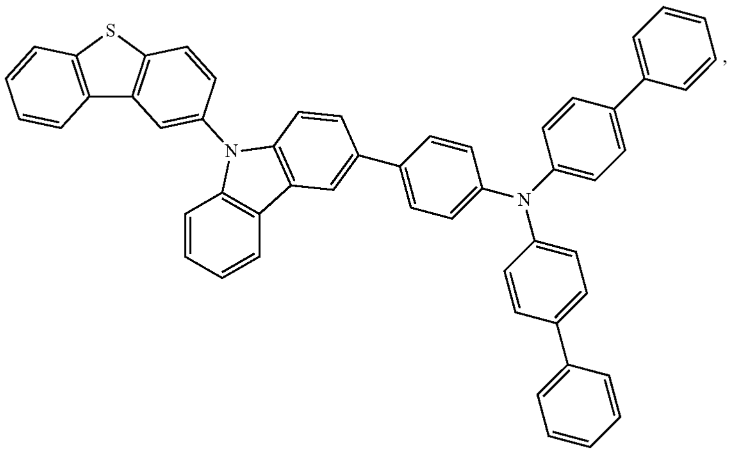
,
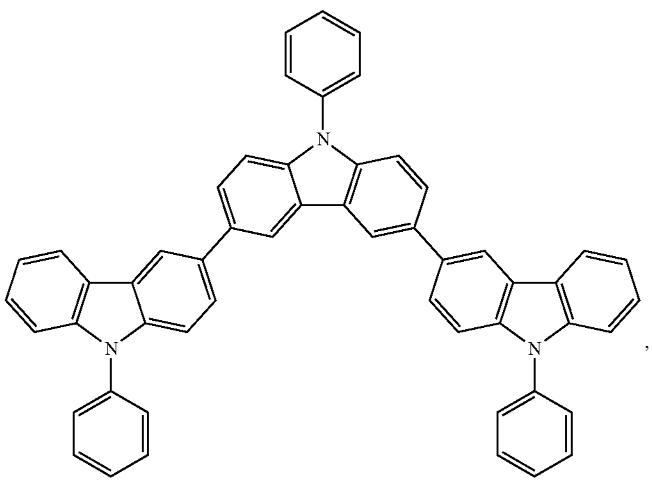
,
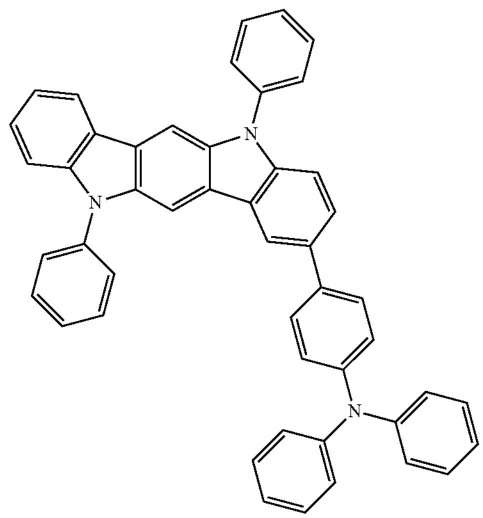
,
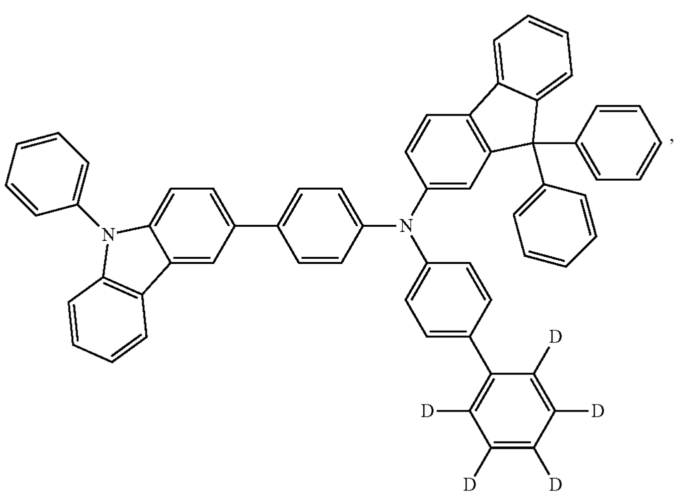
,

-continued
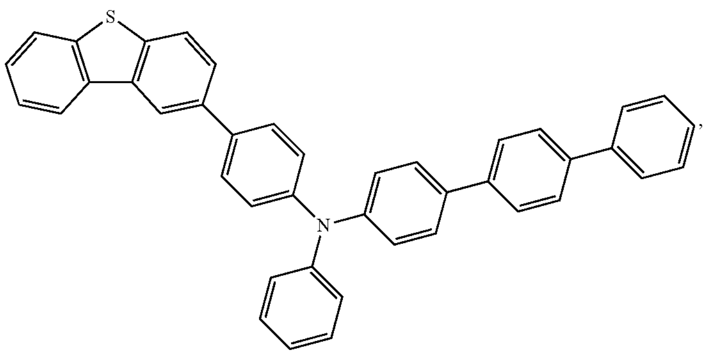
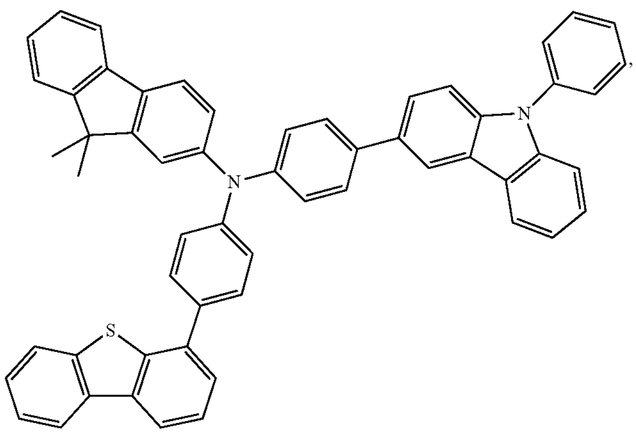
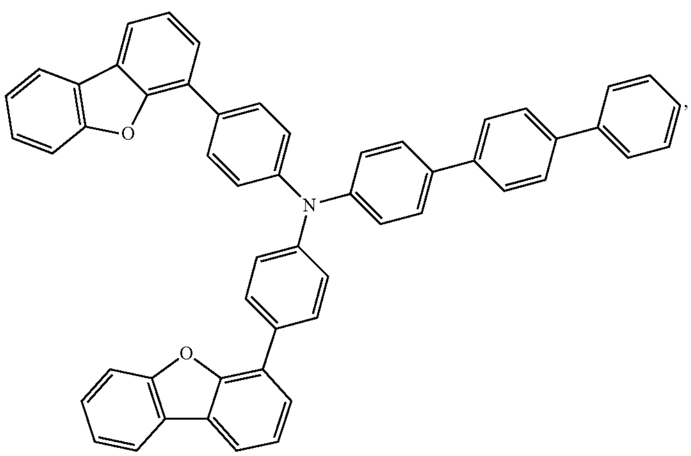
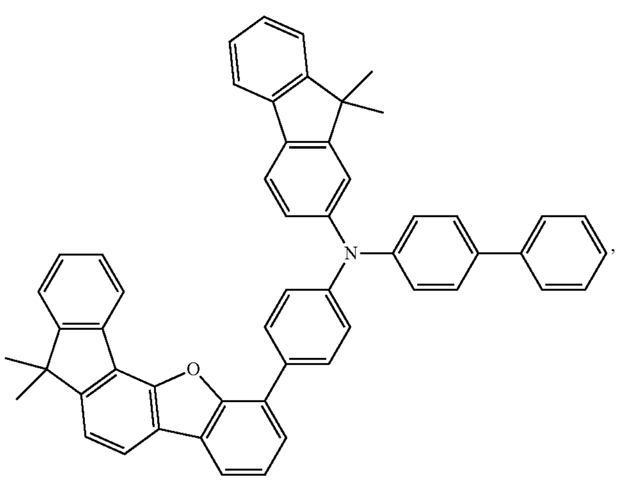 [SMILES: CC1(C)c2ccccc2-c2ccc(N(c3ccc(-c4ccccc4)cc3)c3ccc(-c4cccc5c4oc4c6c(ccc45)C(C)(C)c4ccccc4-6)cc3)cc21]

-continued
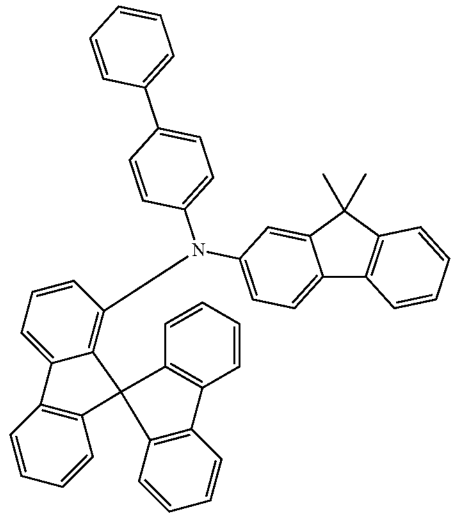
,
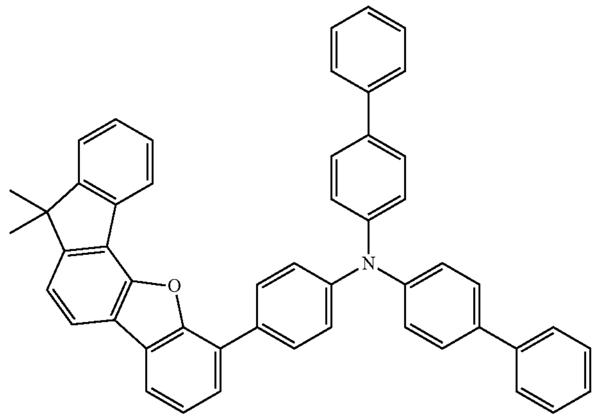
,
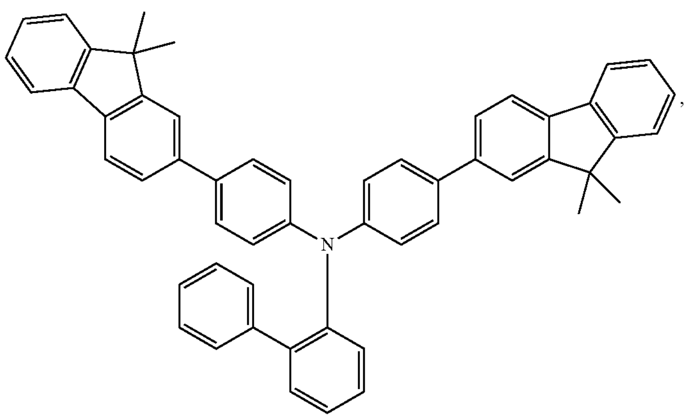
,
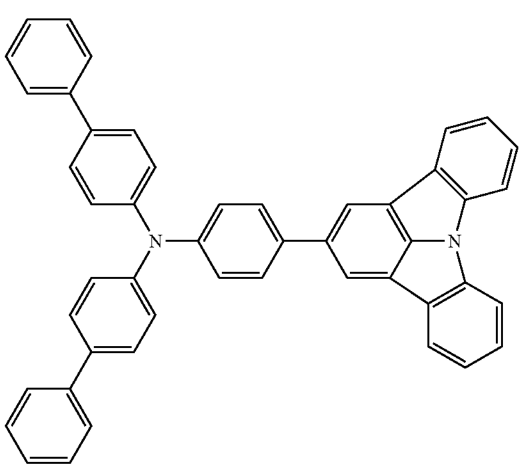
,
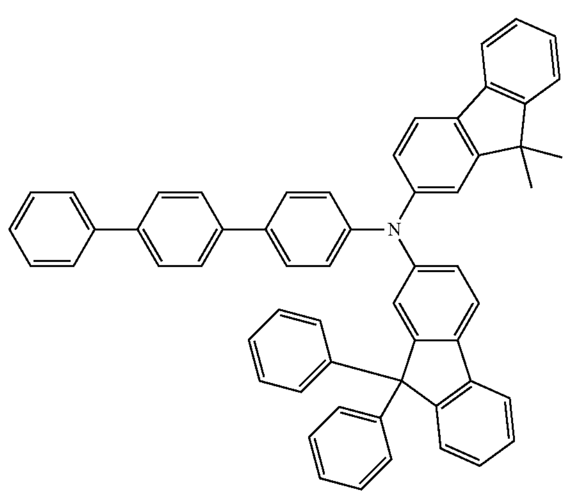
, -continued
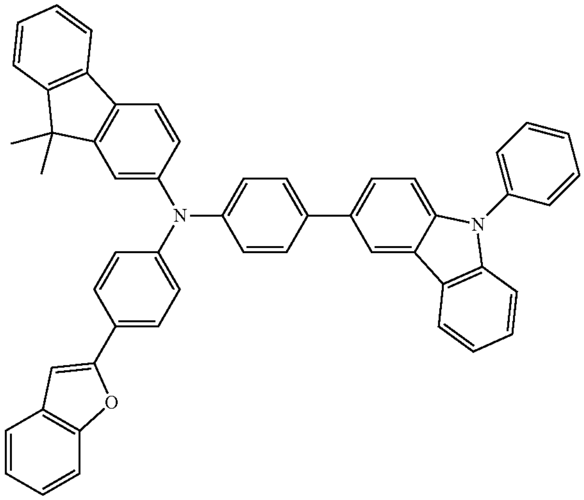
,
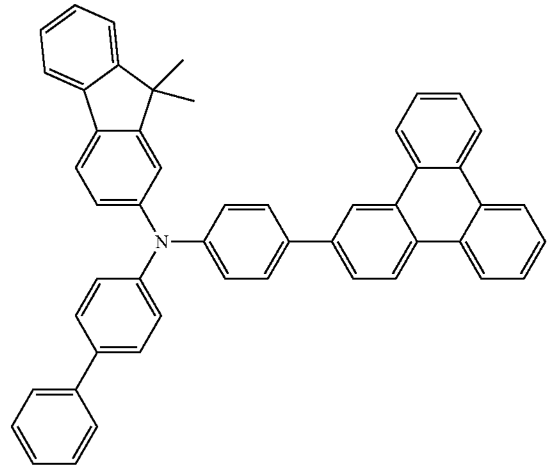
,
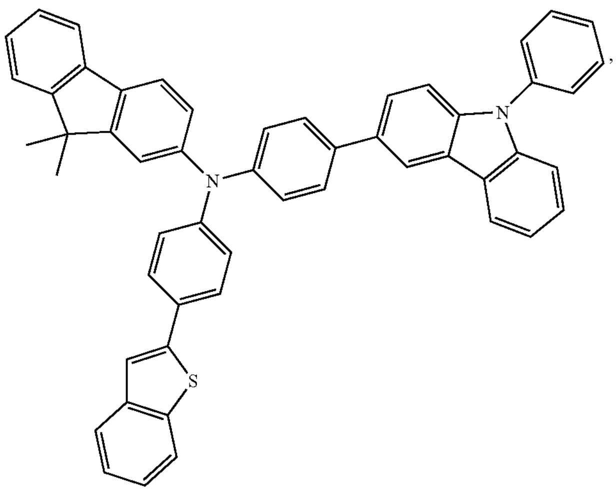
,
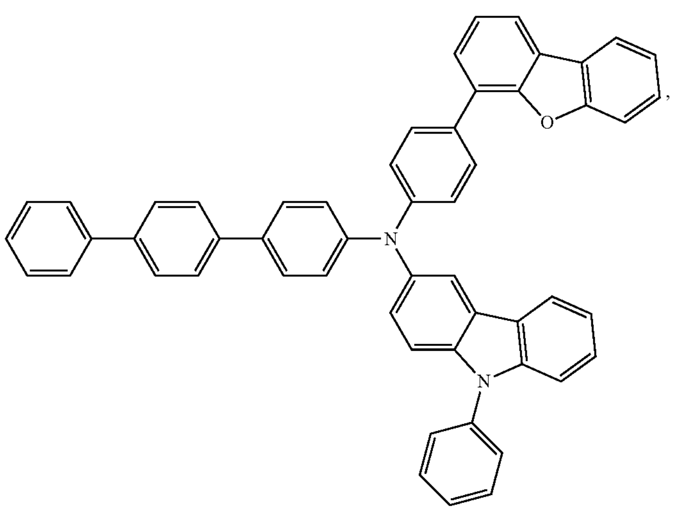
, -continued
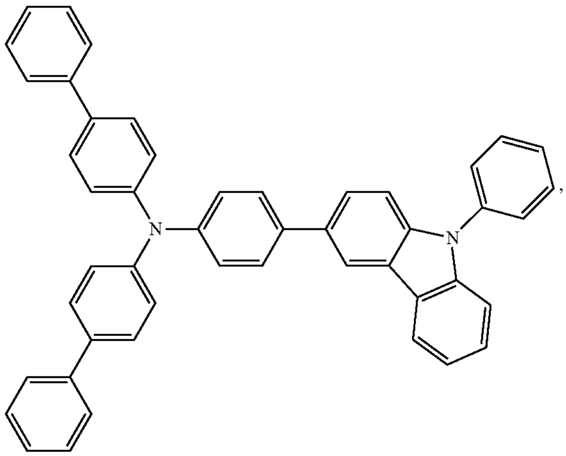 [SMILES: c1ccc(-c2ccc(N(c3ccc(-c4ccccc4)cc3)c3ccc(-c4ccc5c(c4)c4ccccc4n5-c4ccccc4)cc3)cc2)cc1]
,
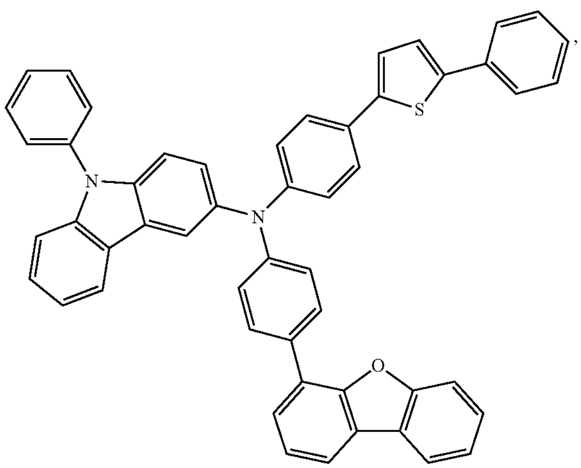
,
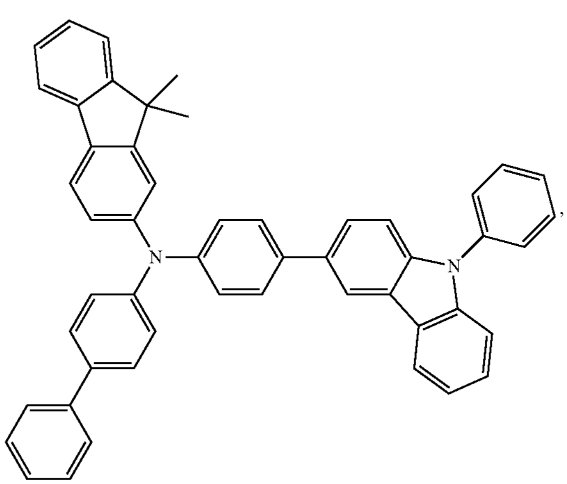
, -continued
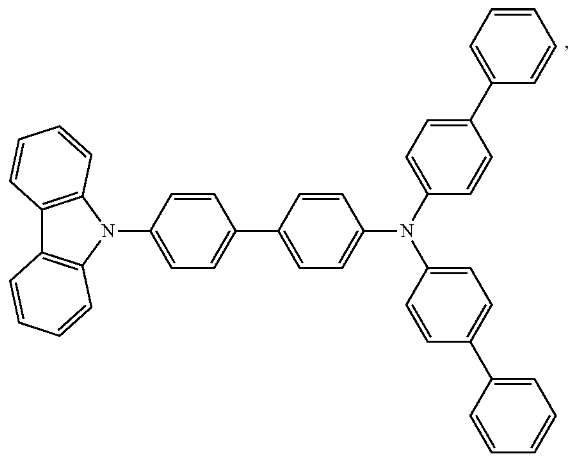
,
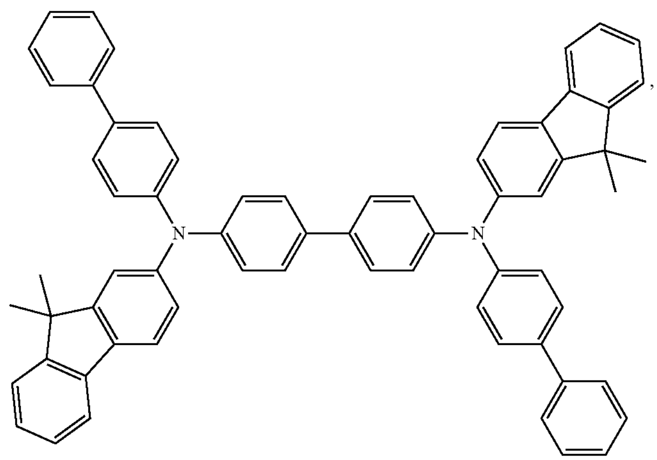
,
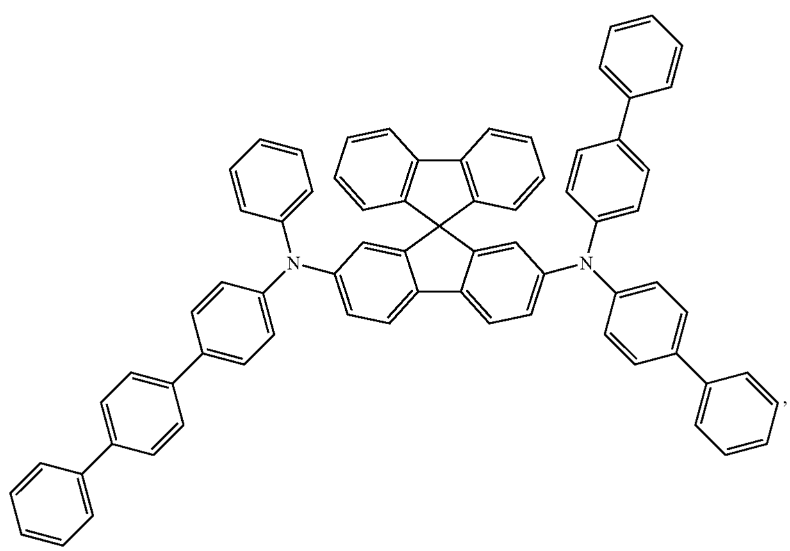
, -continued
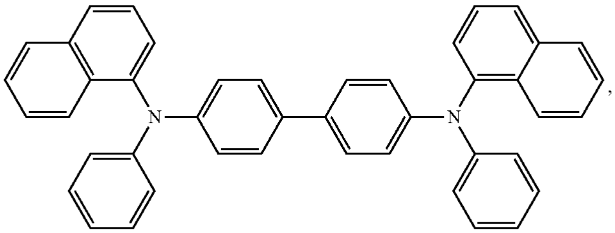,
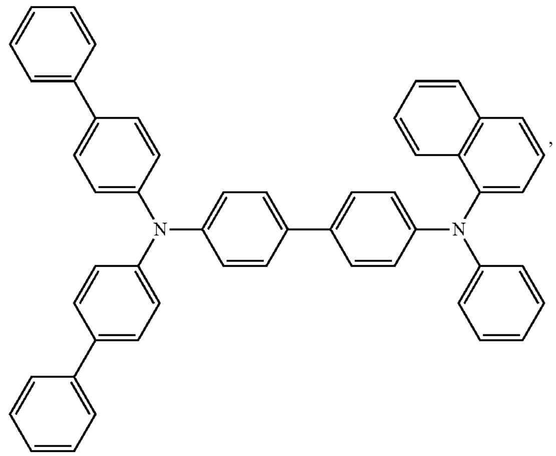,
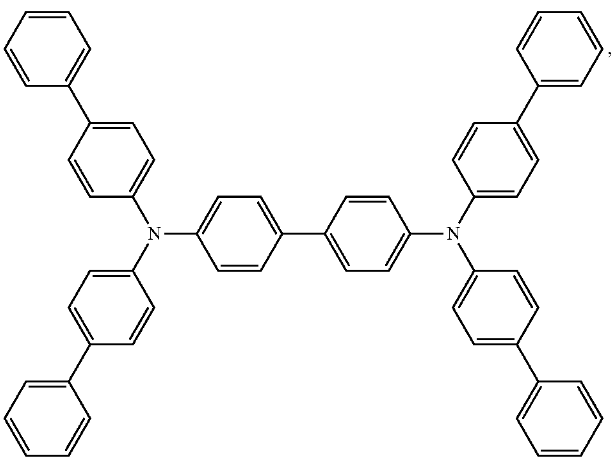,
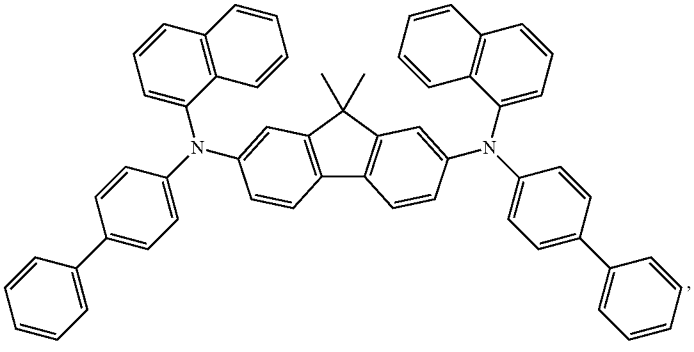, -continued
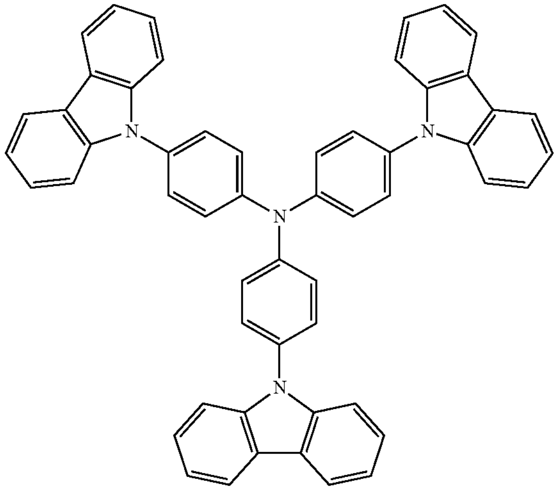,
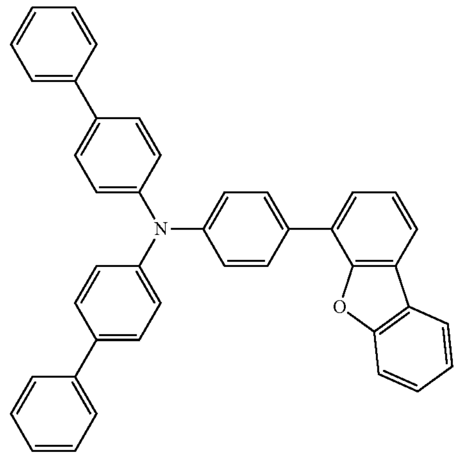,
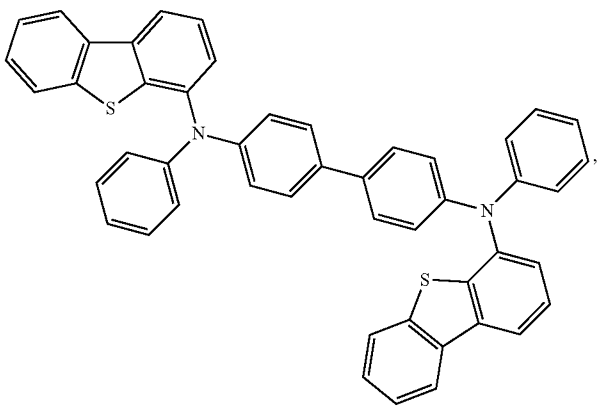,
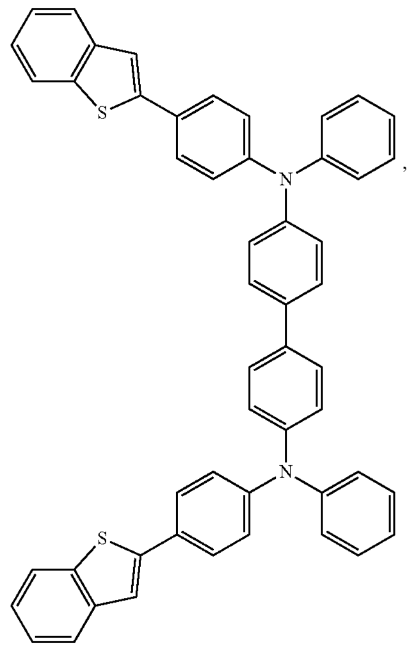, and
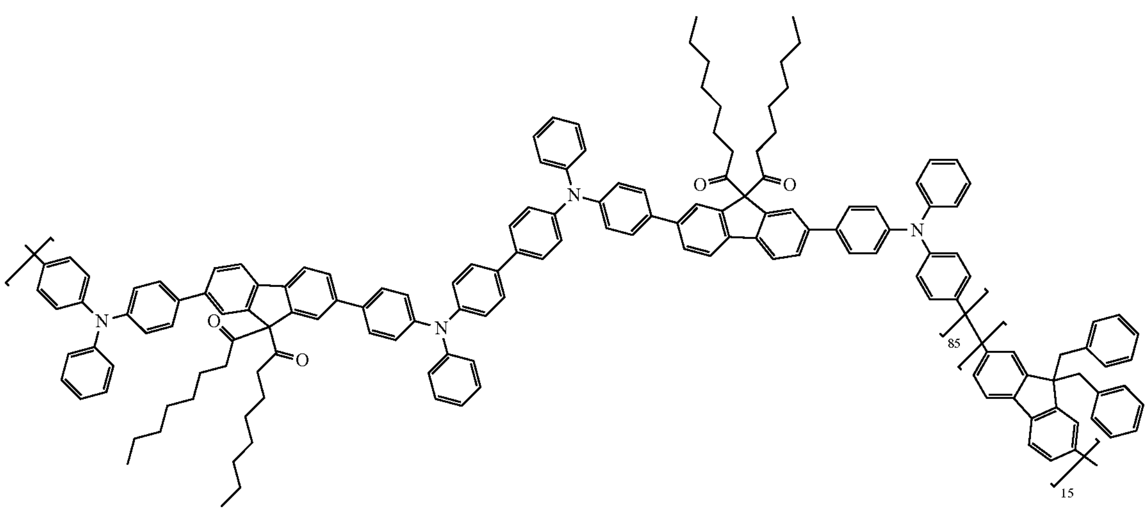

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

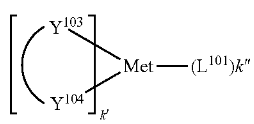

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

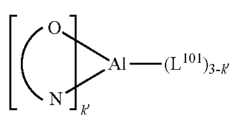

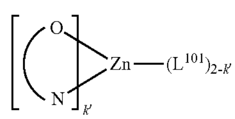

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of other organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

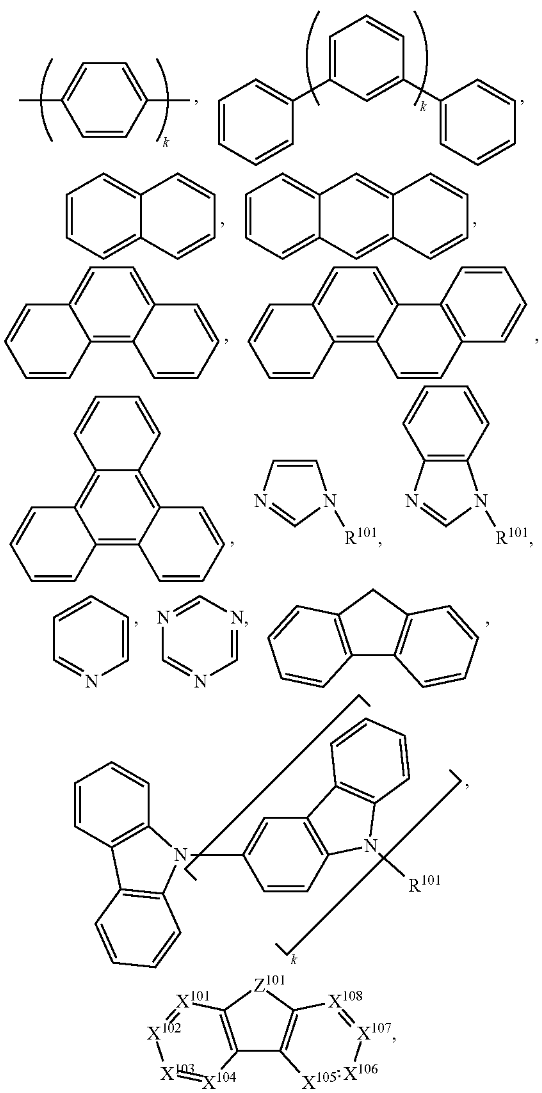

-continued

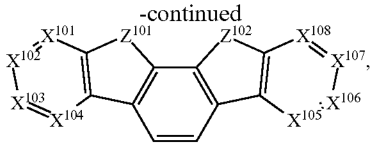

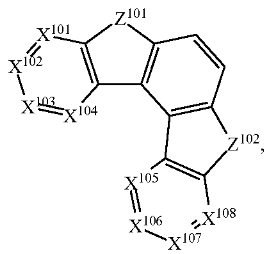

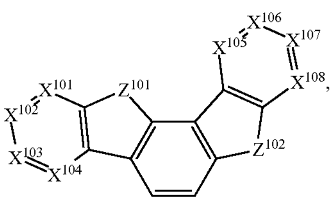

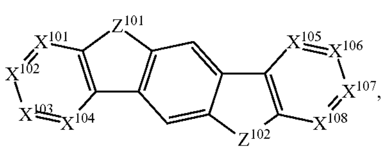

and

-continued

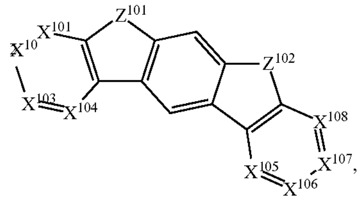

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

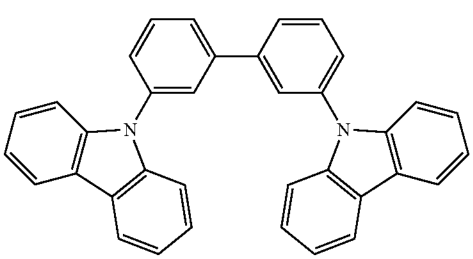

,

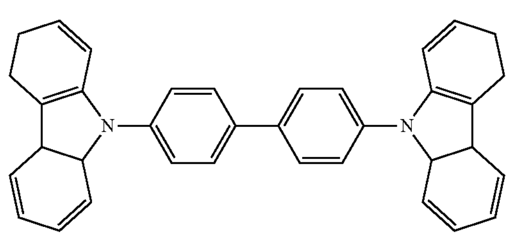

,

-continued
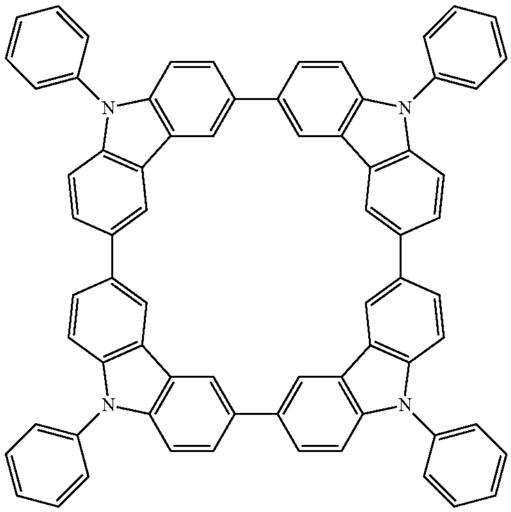
,
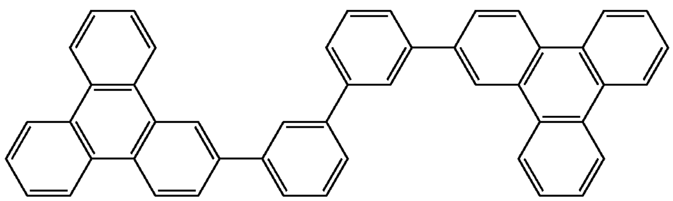
,
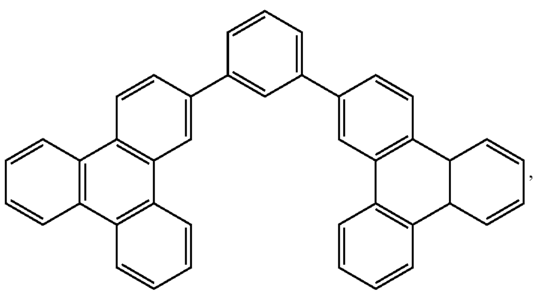
,
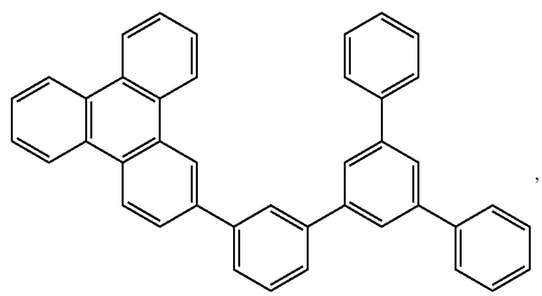
,
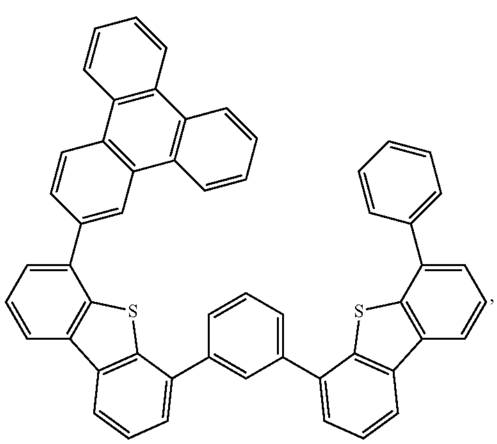
,
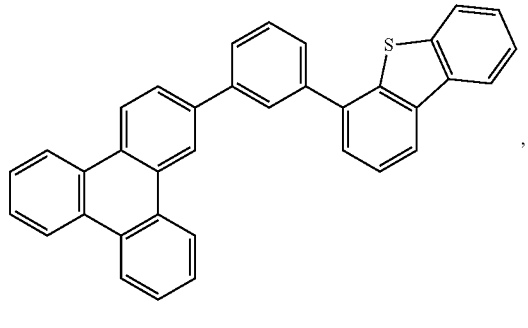
, -continued
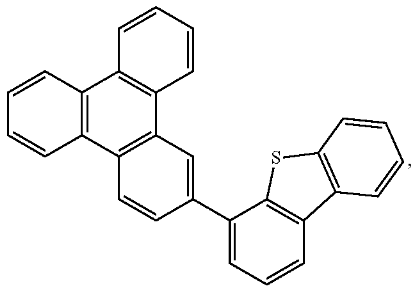,
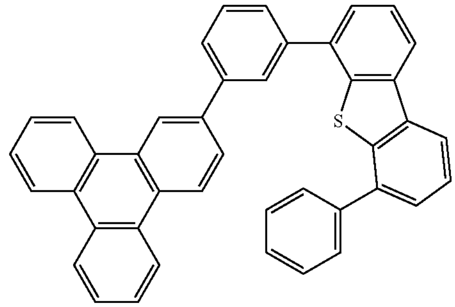,
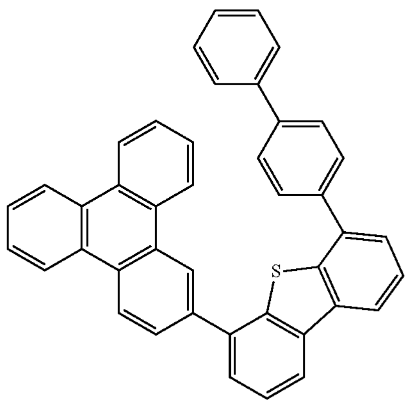,
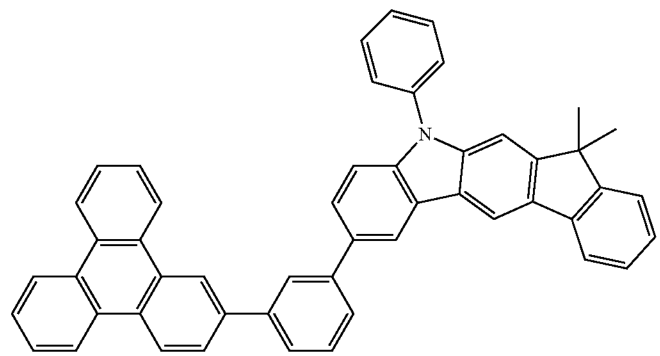,
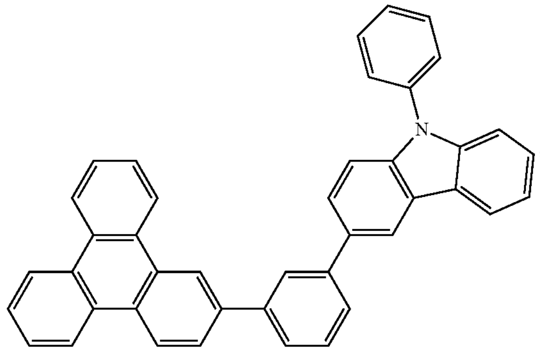,
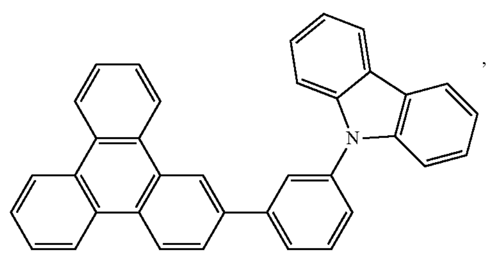,
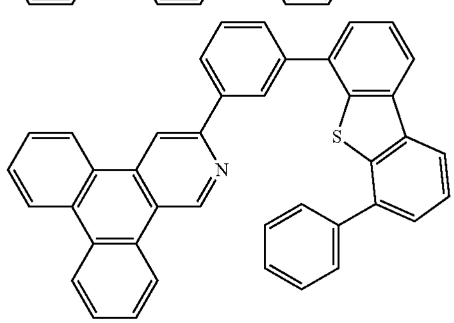,
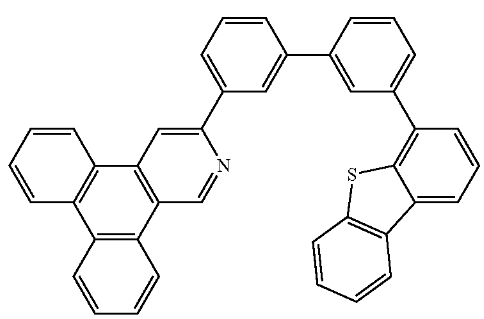,
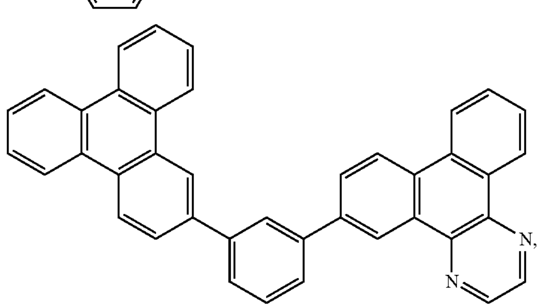,
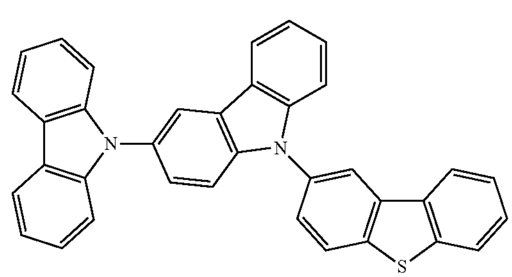, -continued
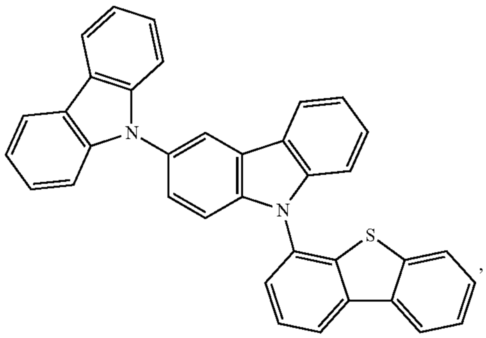,
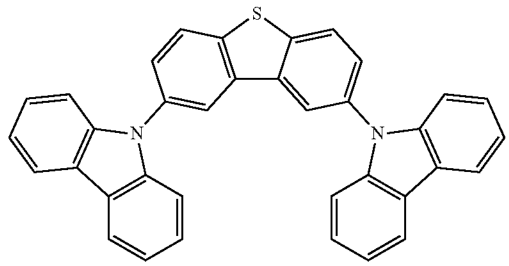,
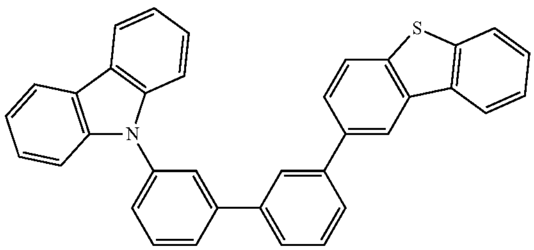,
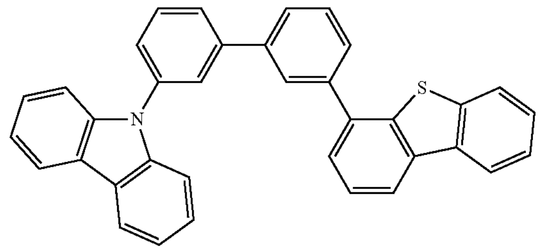,
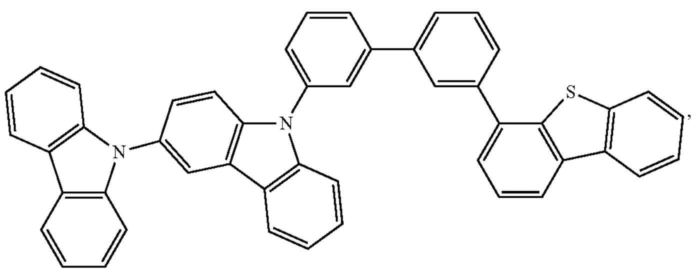,
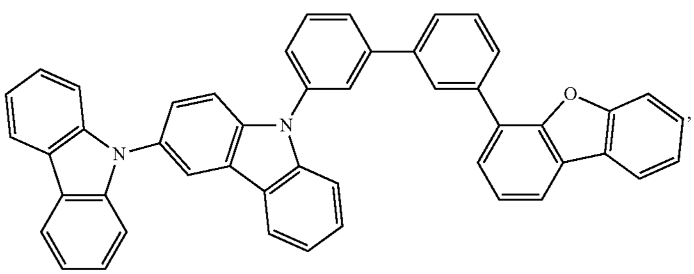,
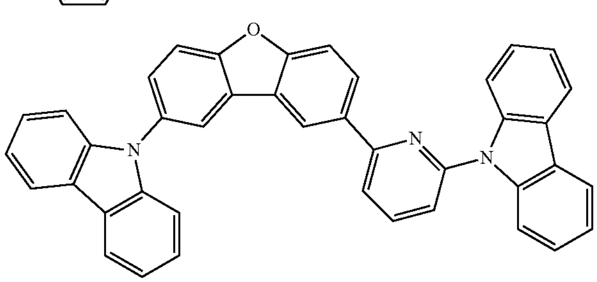,
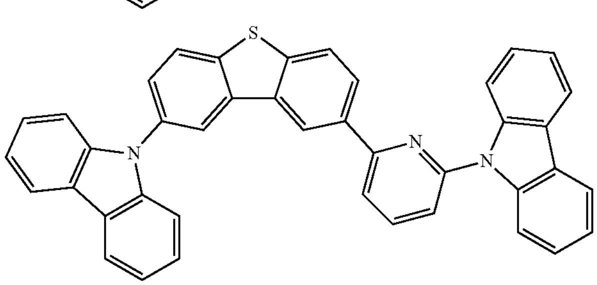, -continued
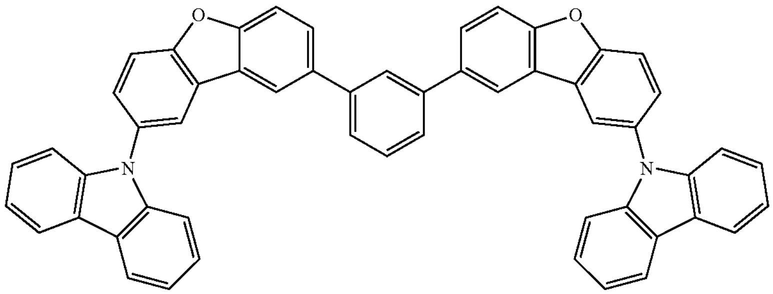
,
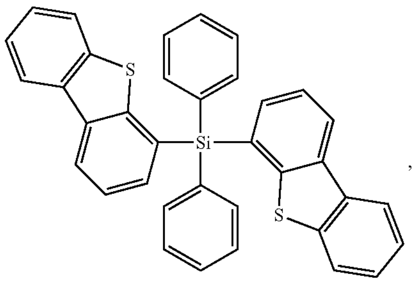
,
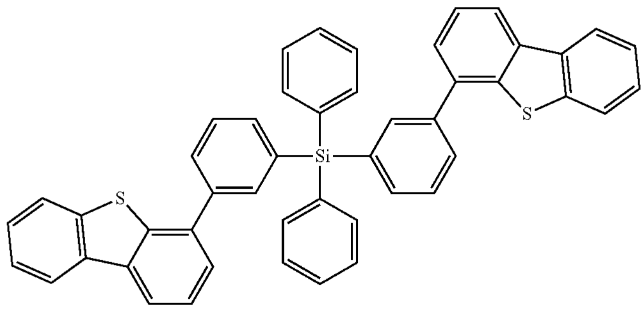
,
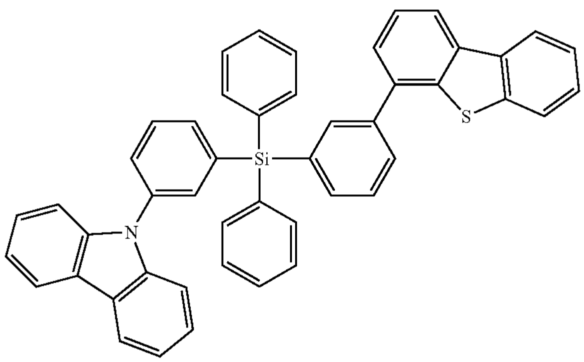
,
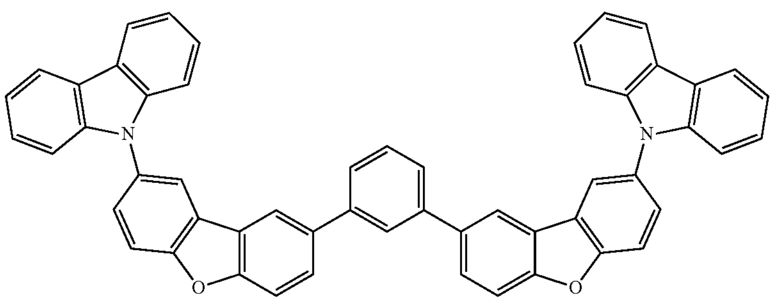
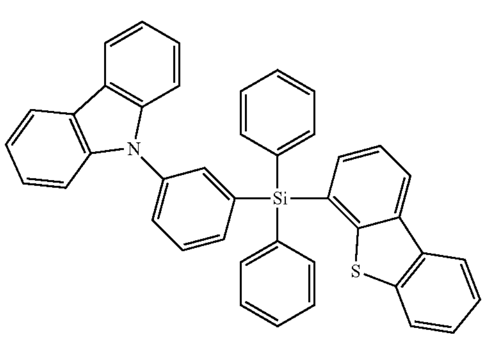
,
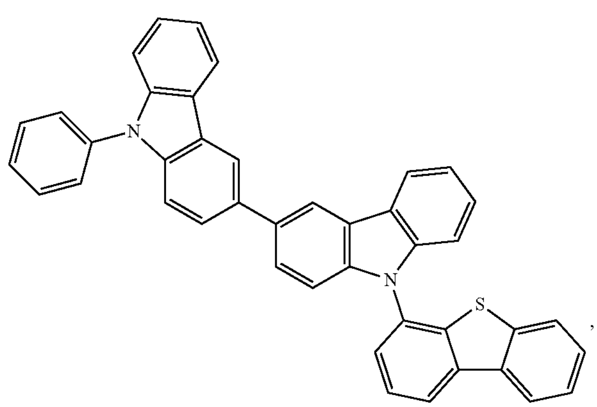
, -continued
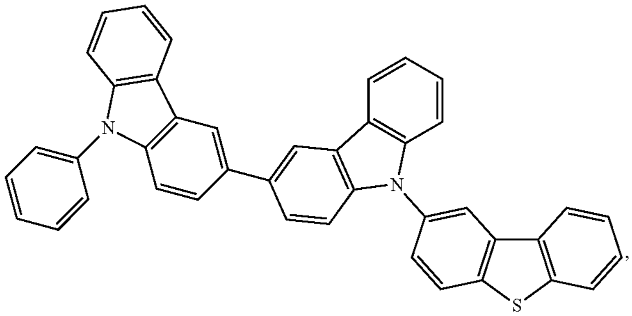
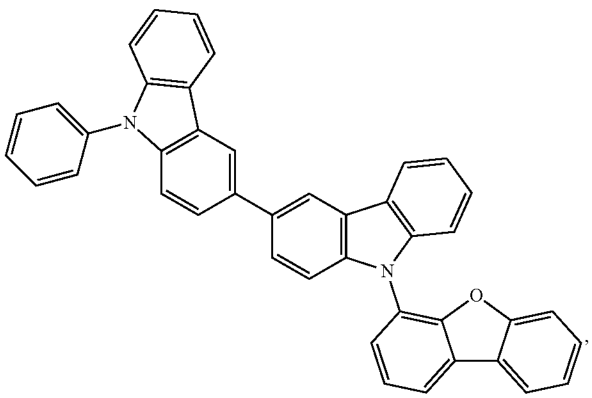
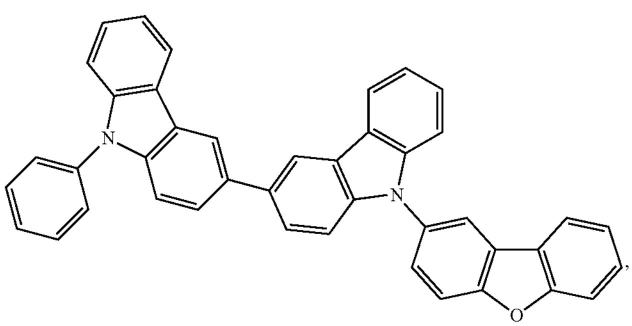
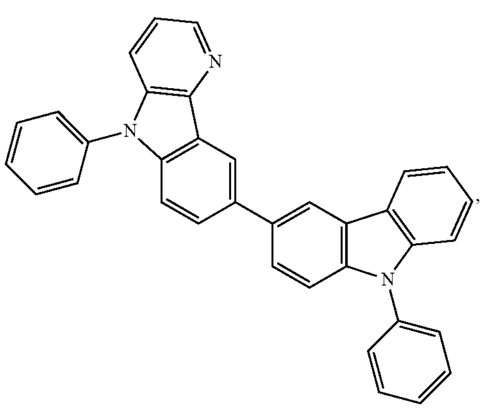
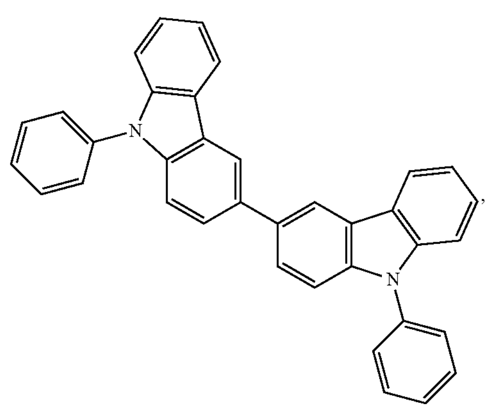

-continued
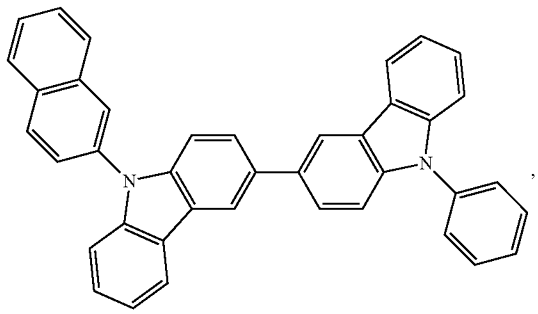
,
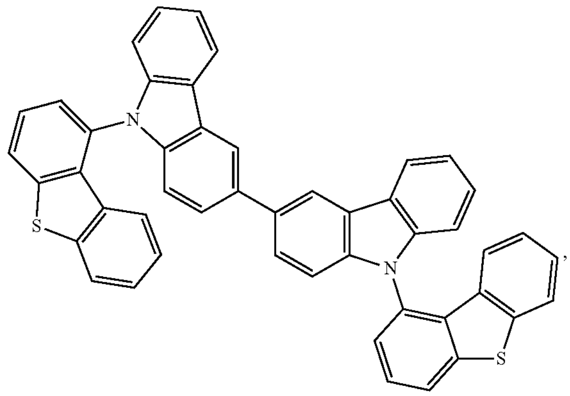
,
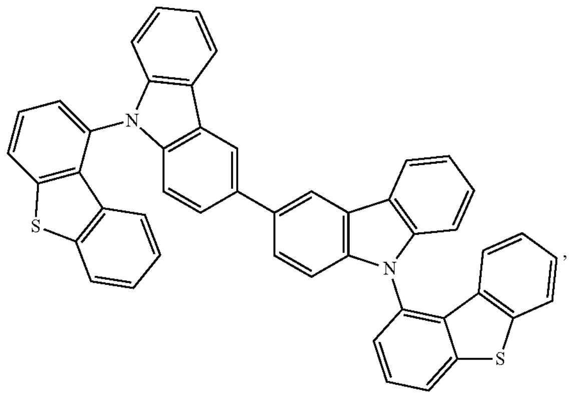
,
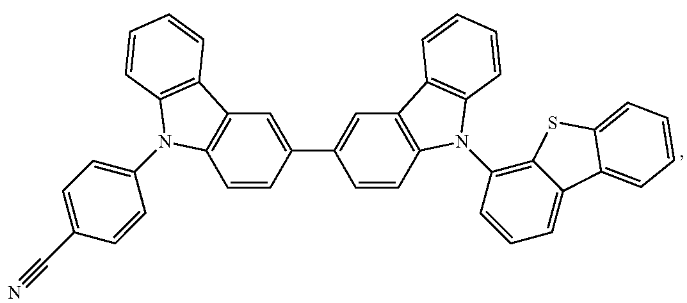
,
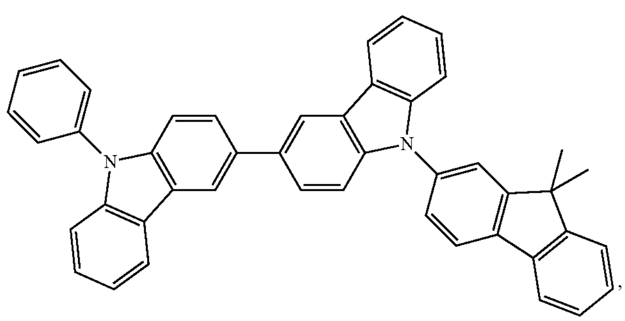
, -continued
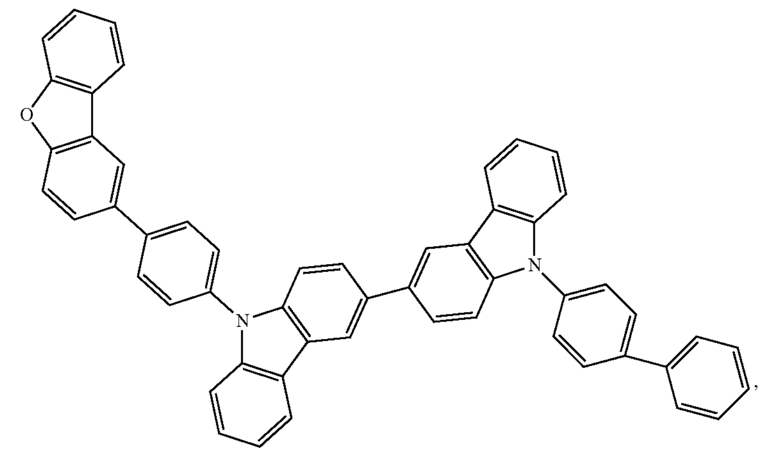
,
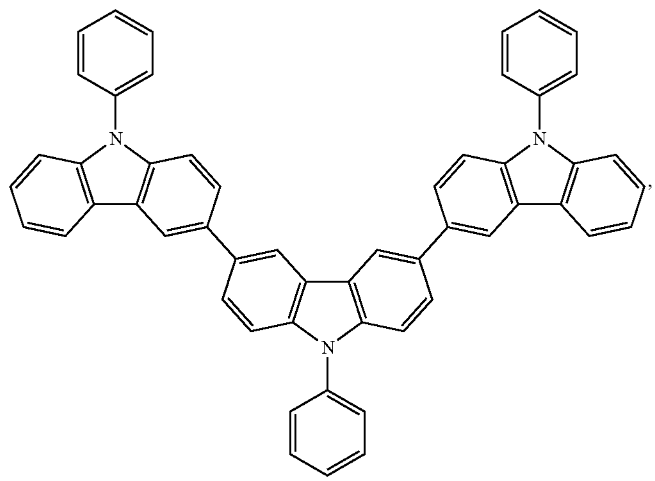
,
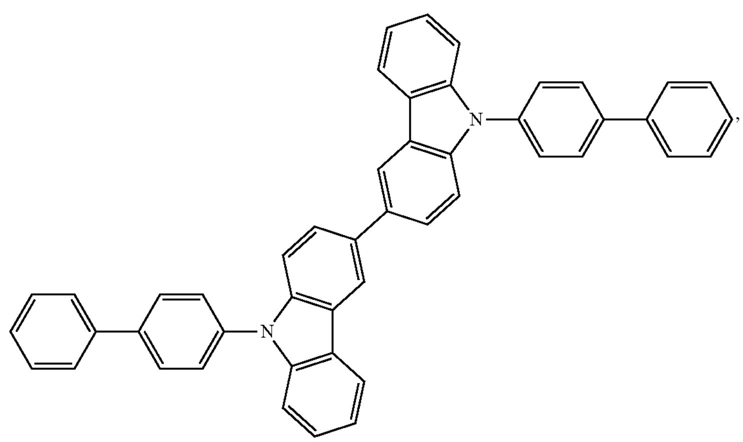
,
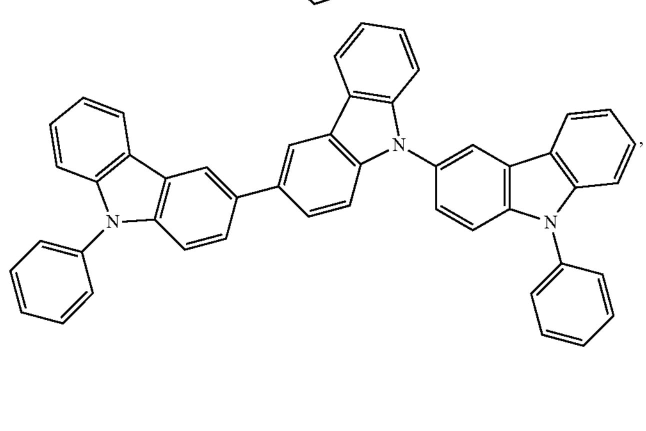
, -continued
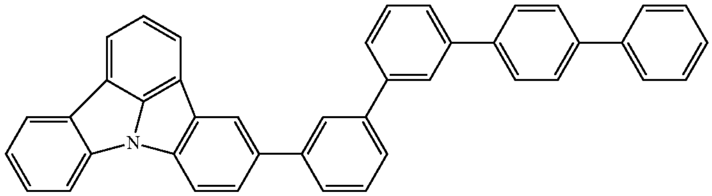
,
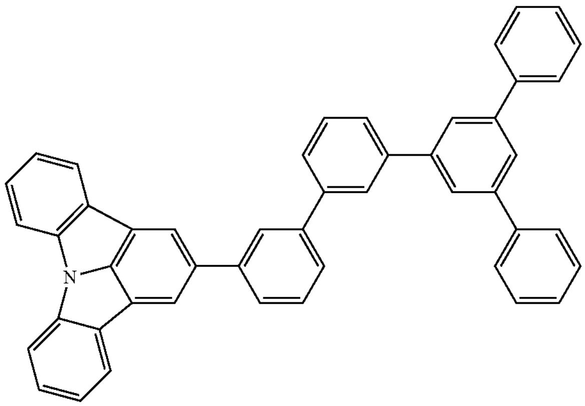
,
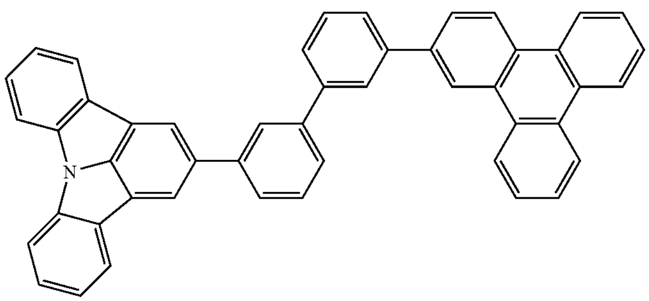
,
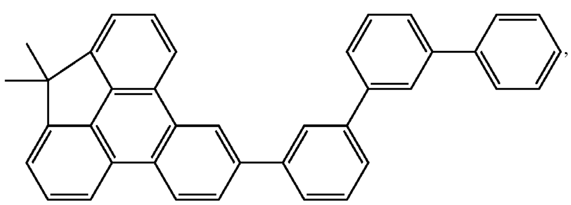
,
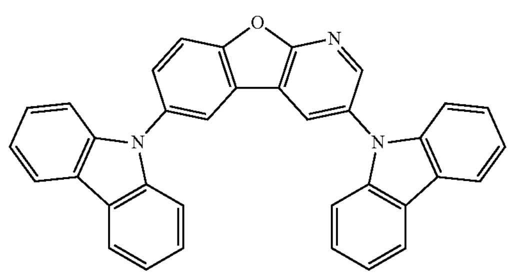
,
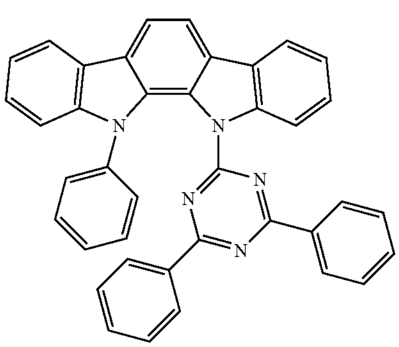
,
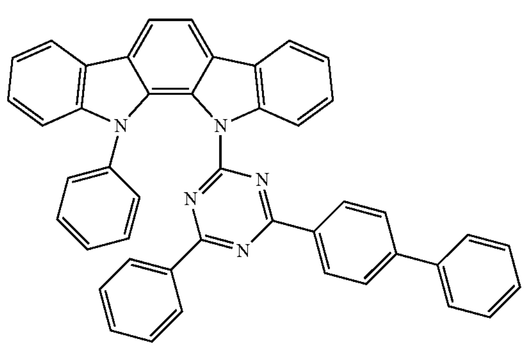
, -continued
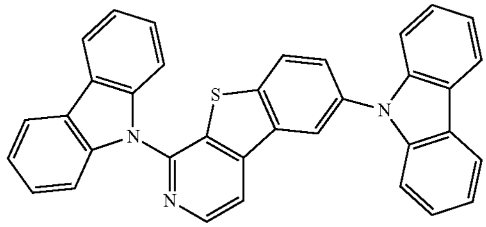
,
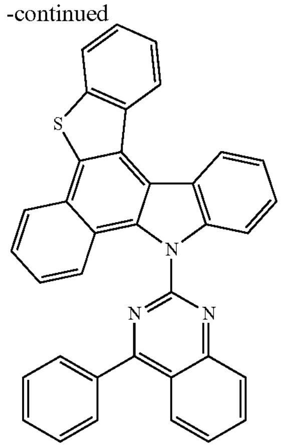
,
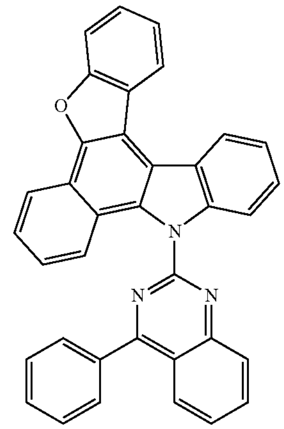
,
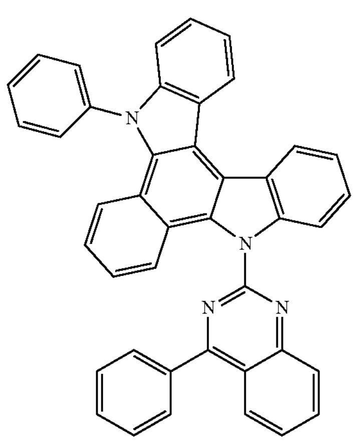
,
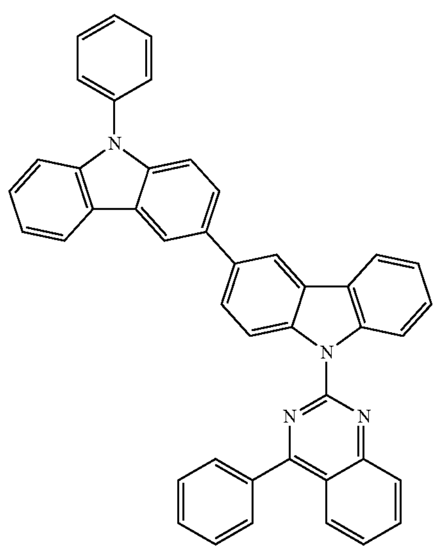
,
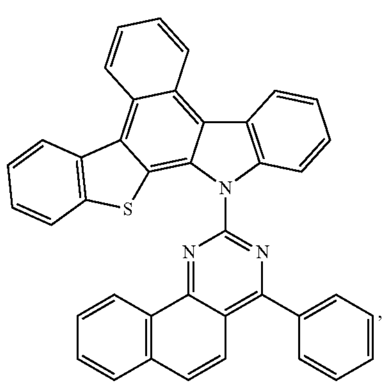
,
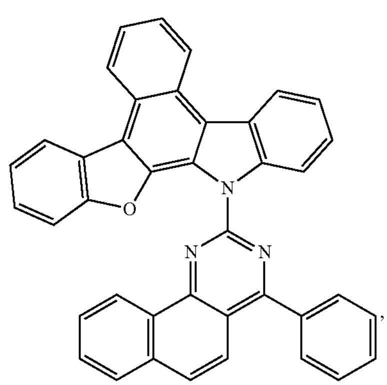
, -continued
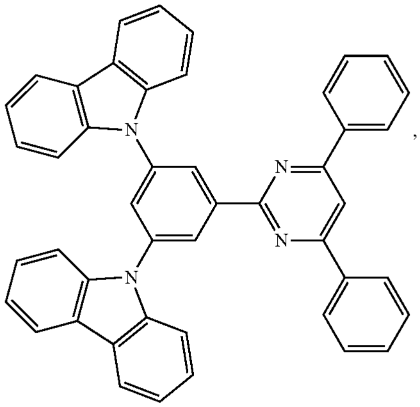
,
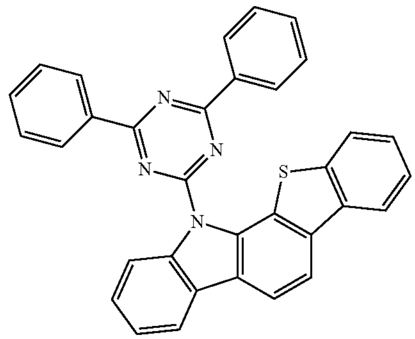
,
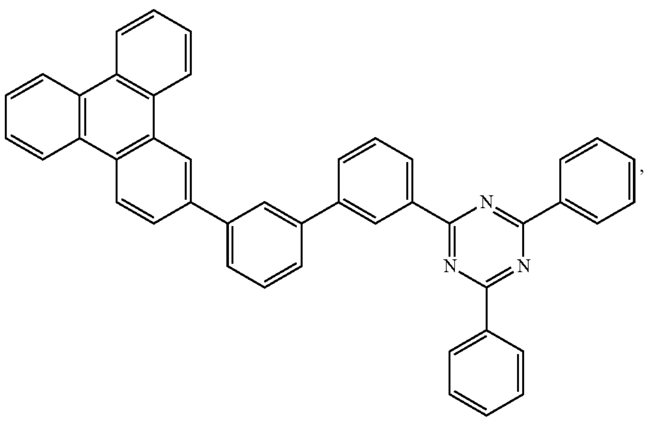
,
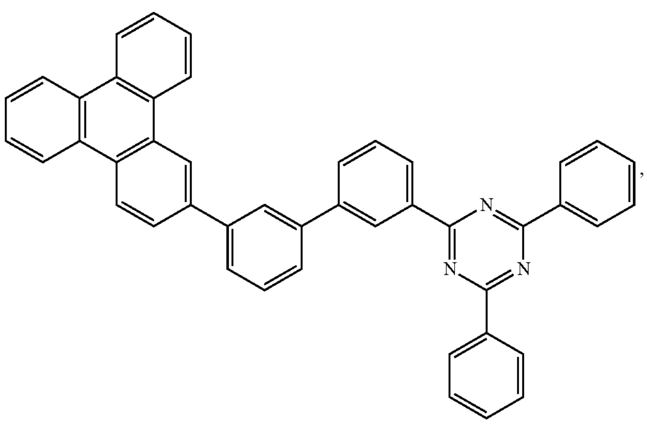
,
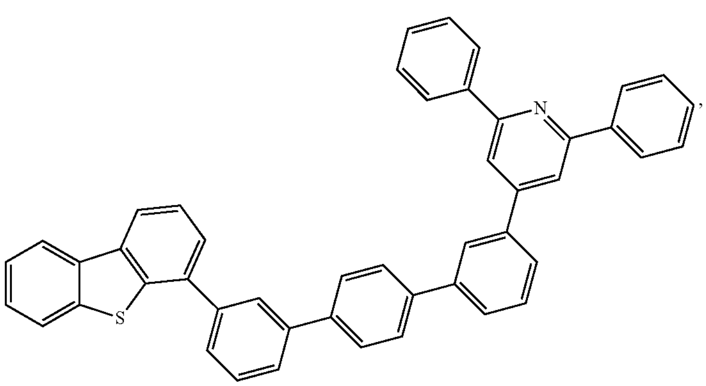
, -continued
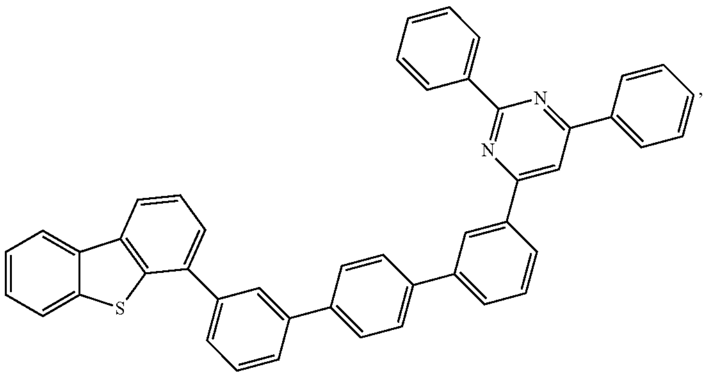
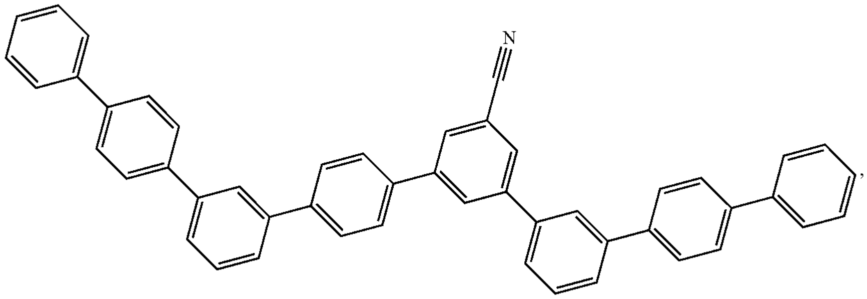
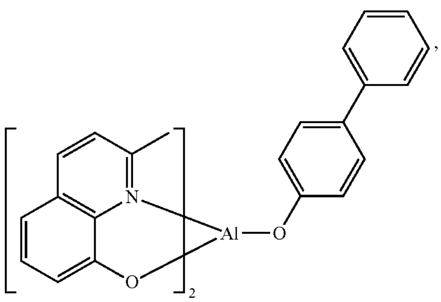
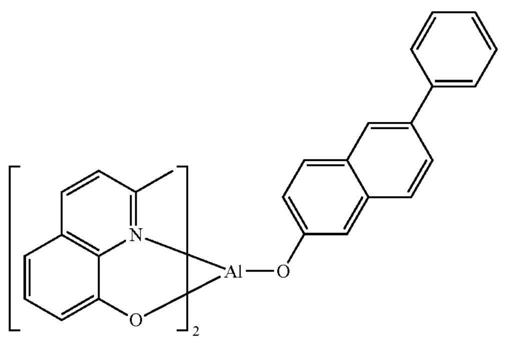
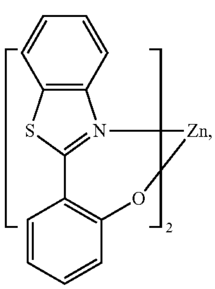
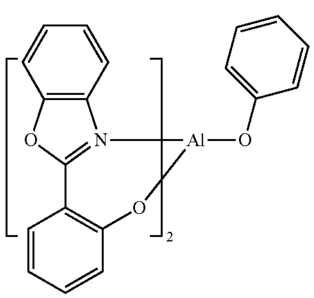
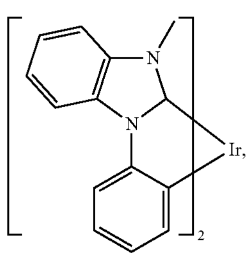
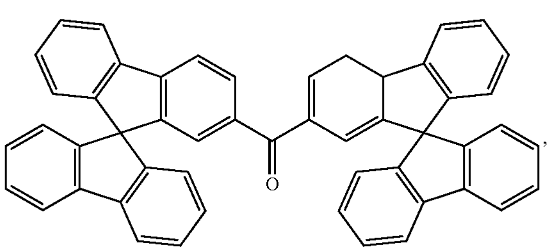

-continued

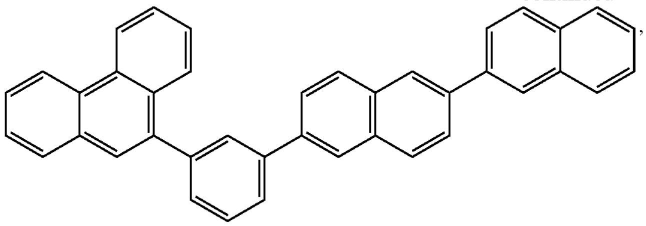

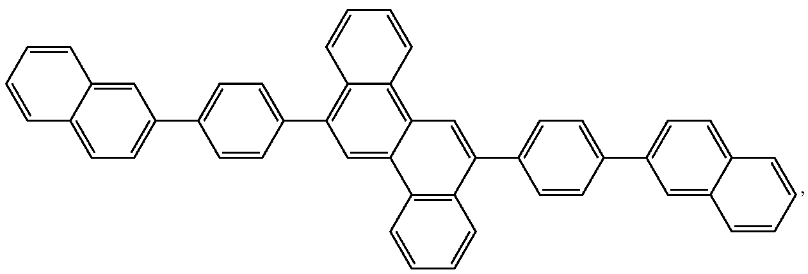

and

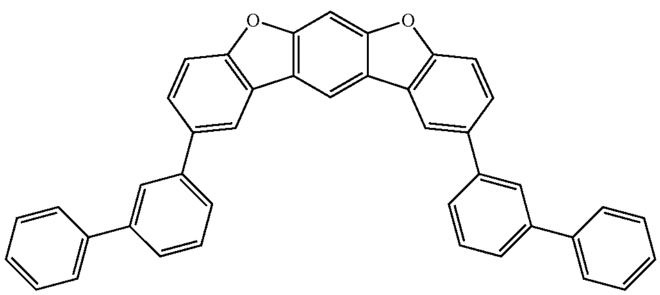

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

-continued
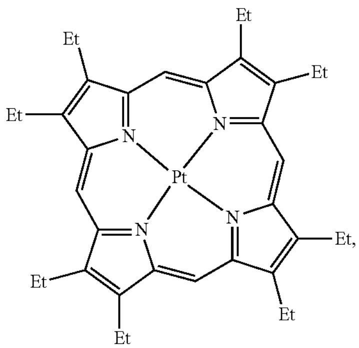
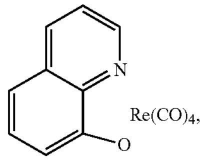
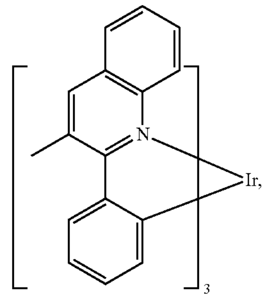
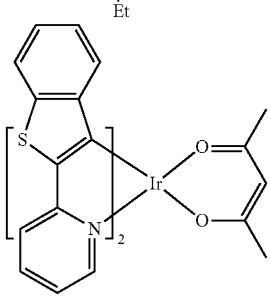
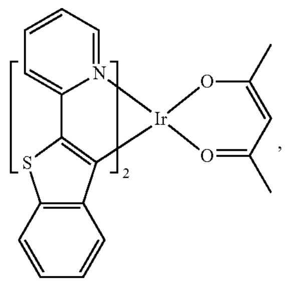
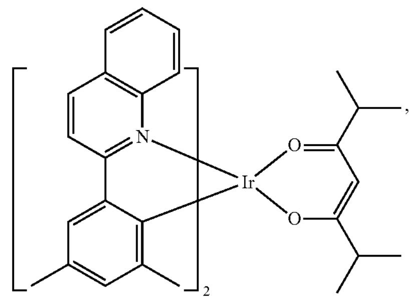
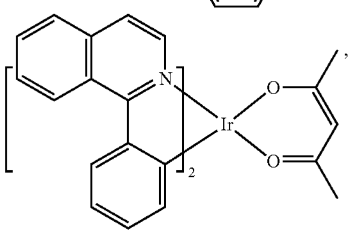
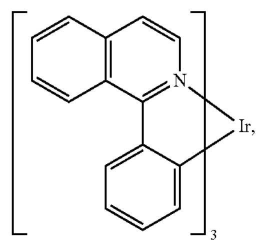
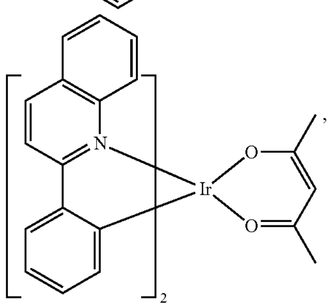
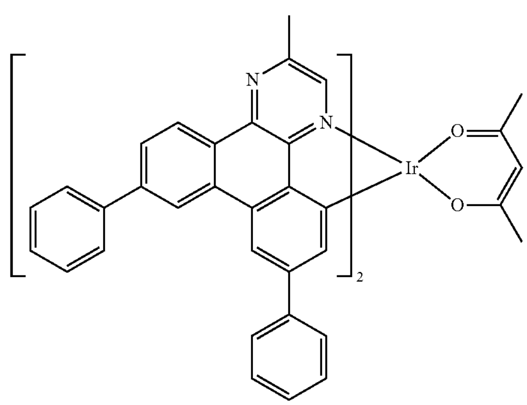
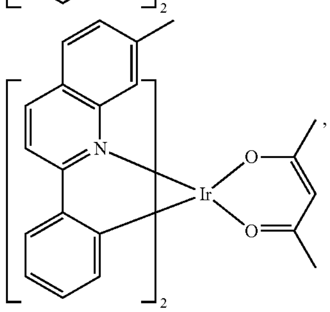
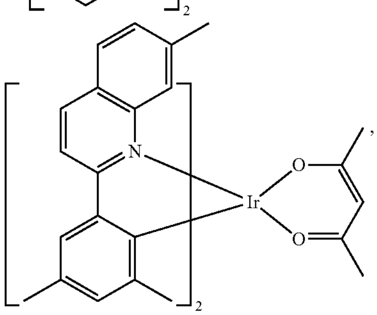
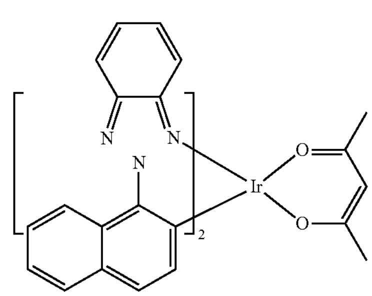

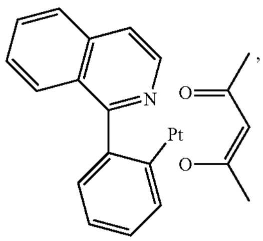
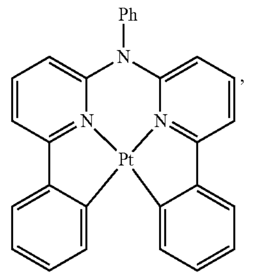
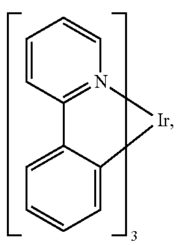
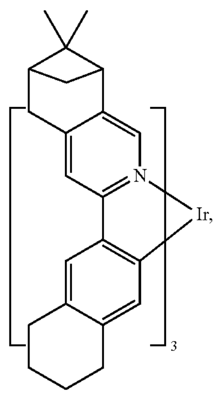
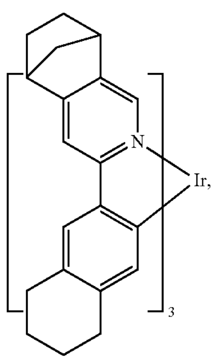
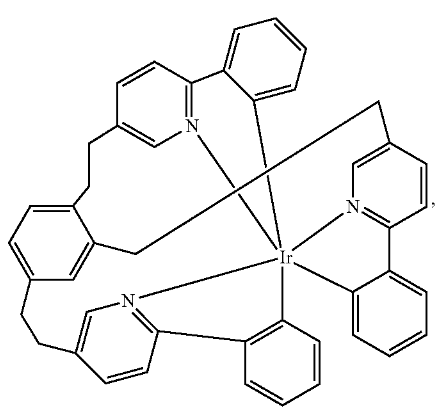
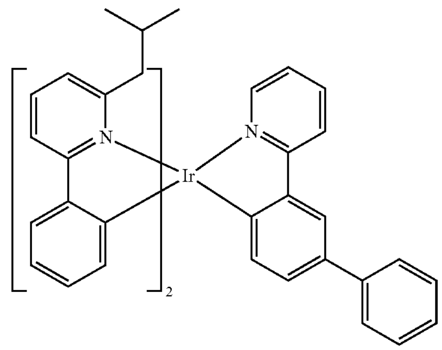
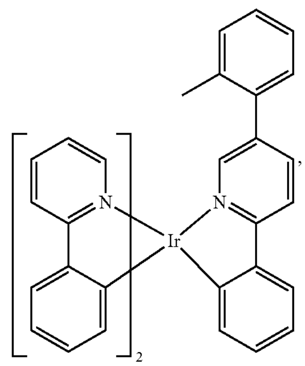
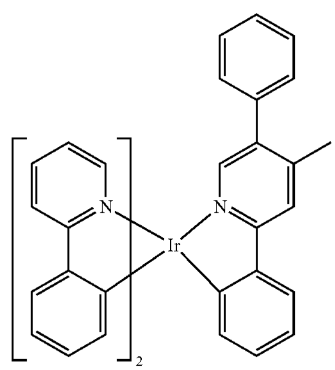
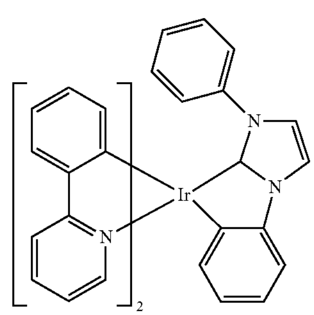
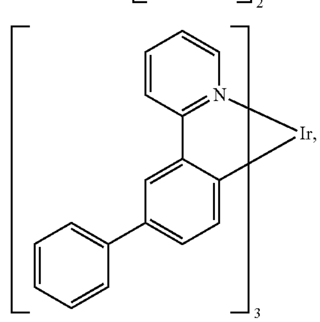
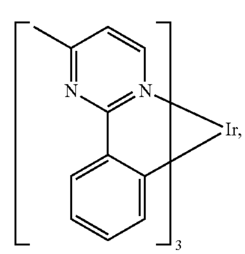

-continued
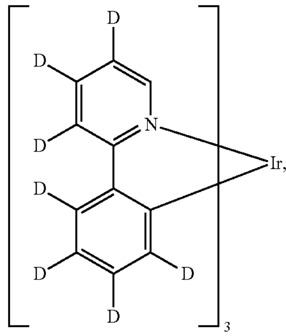
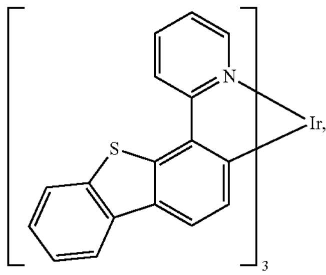
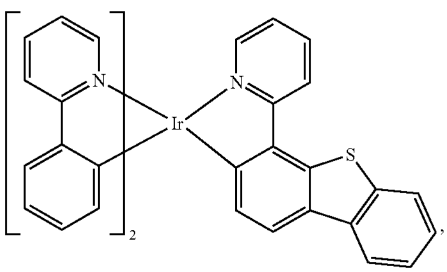
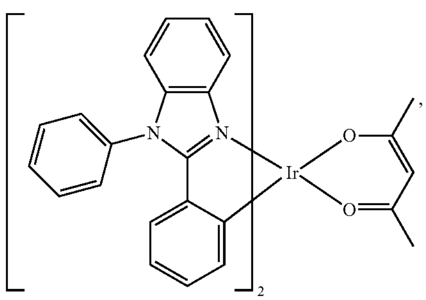
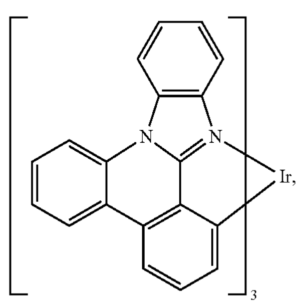
-continued
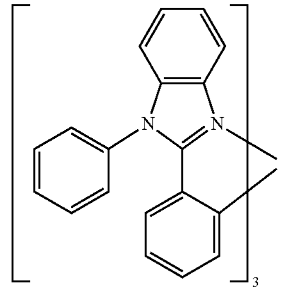
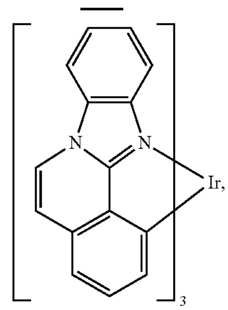
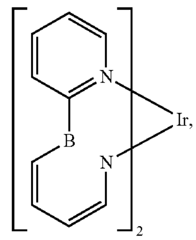
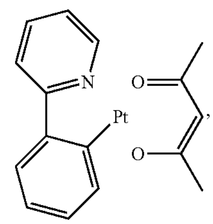
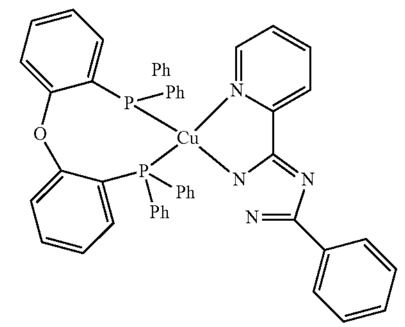
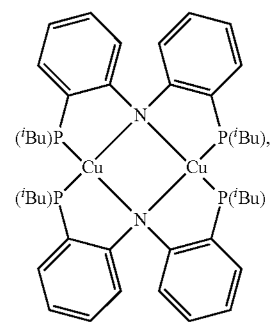
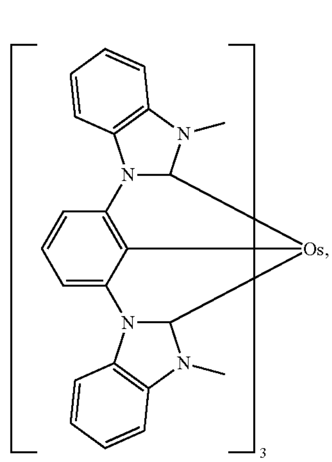
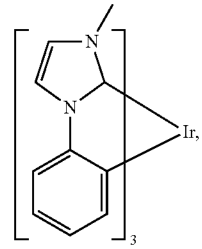

-continued
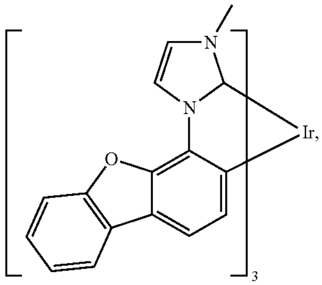
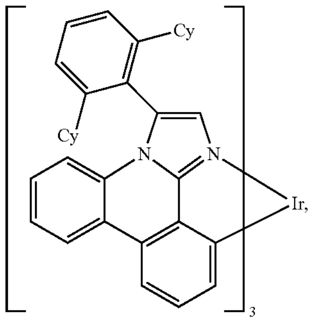
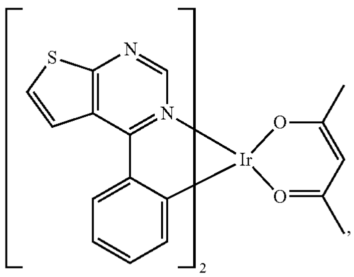
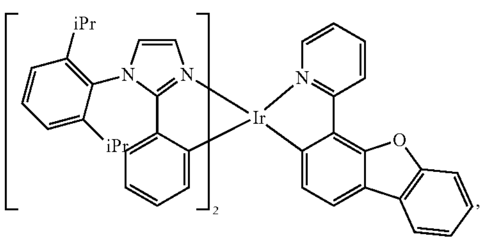
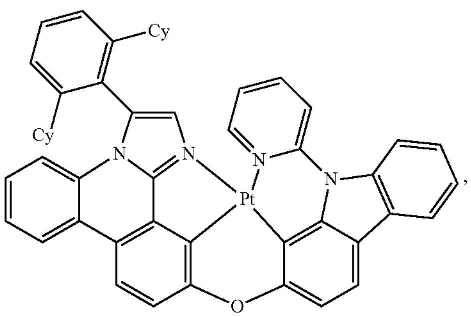
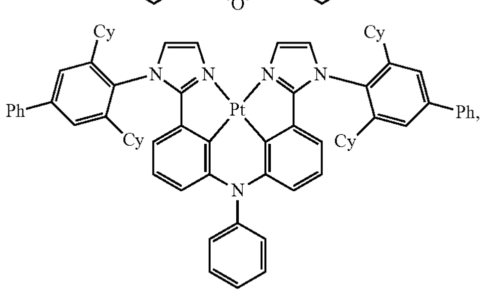
-continued
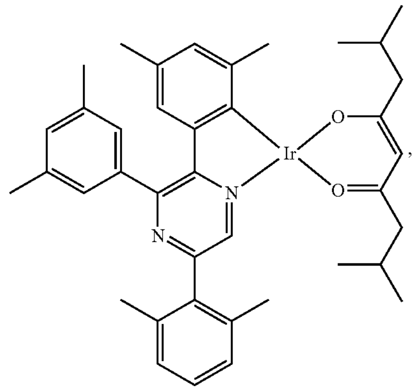
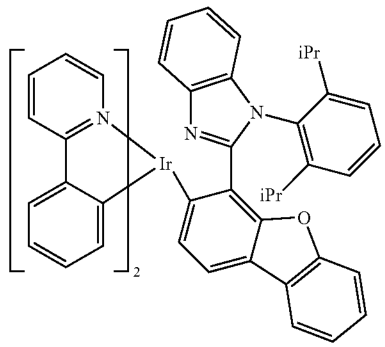
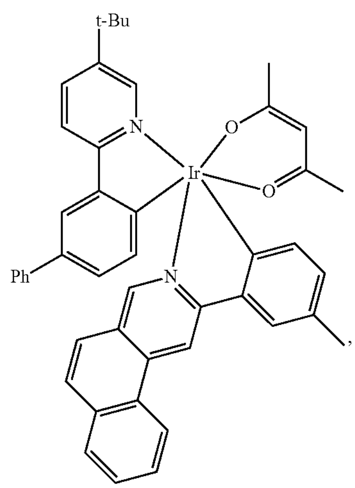
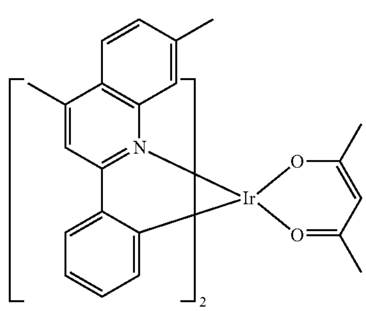

-continued
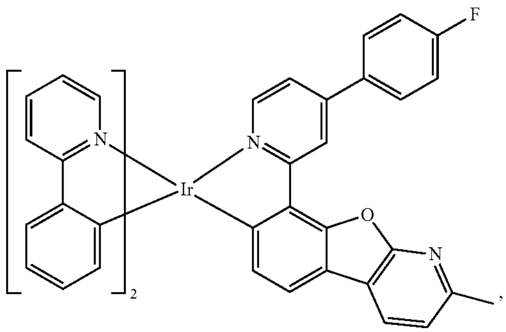
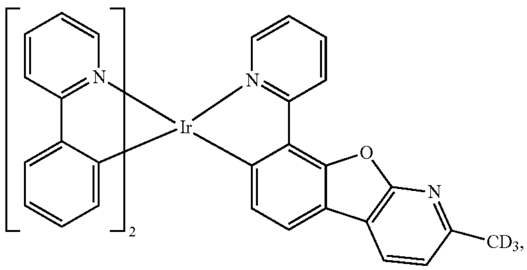
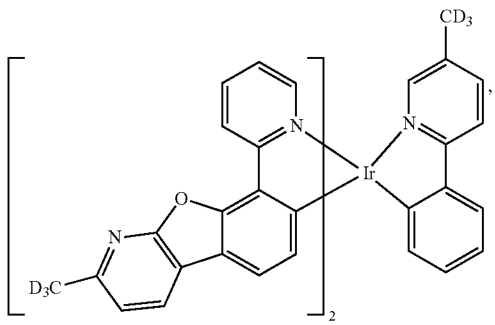
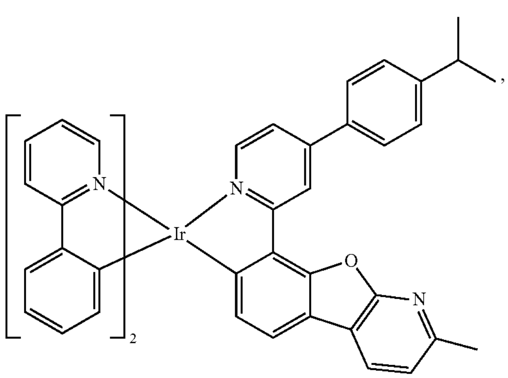
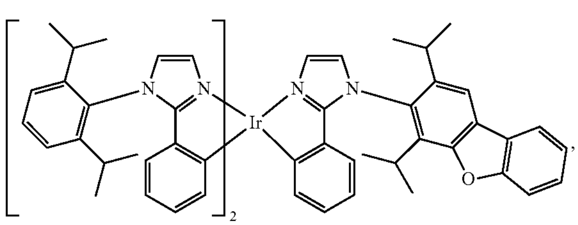
-continued
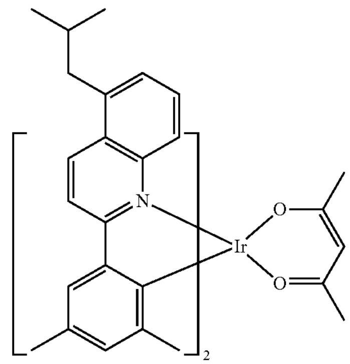
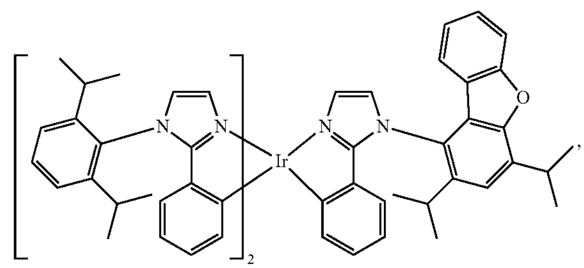
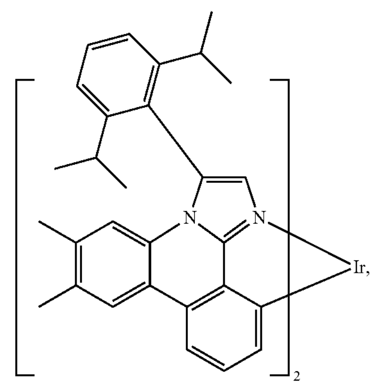
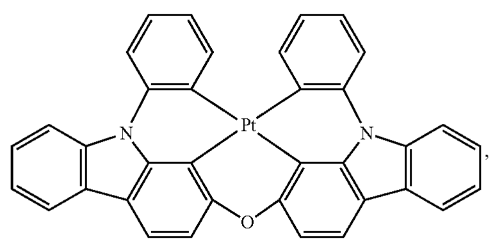
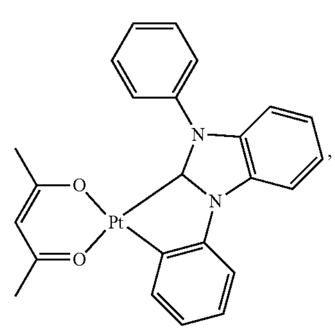

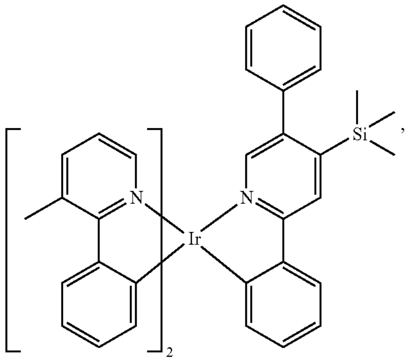
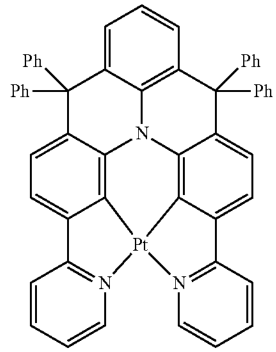
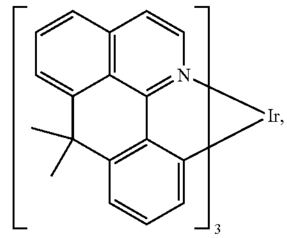
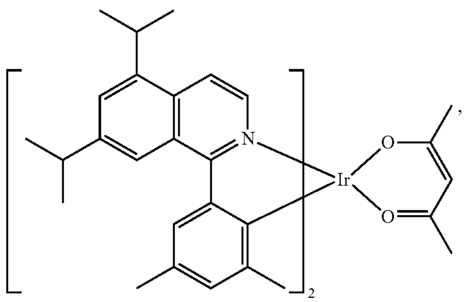
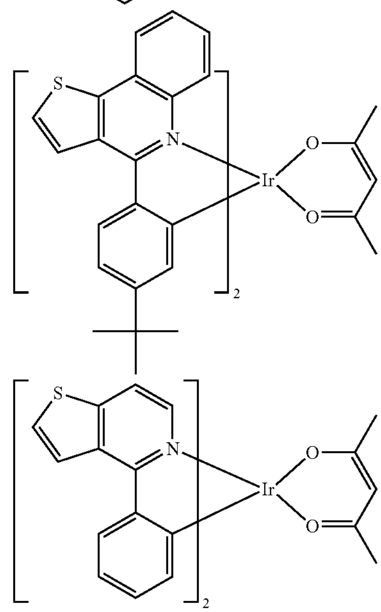
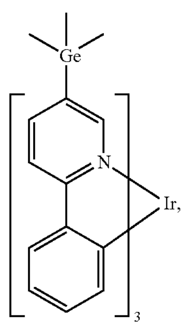
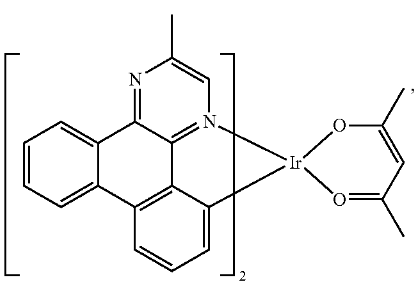
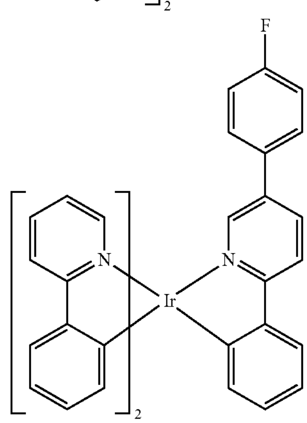
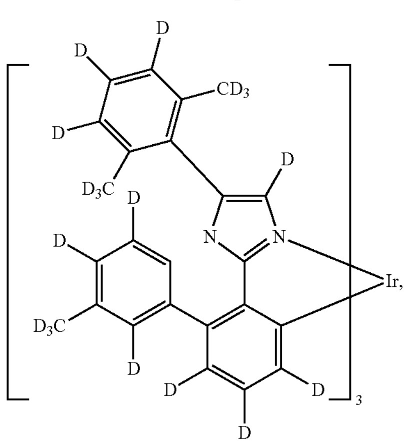
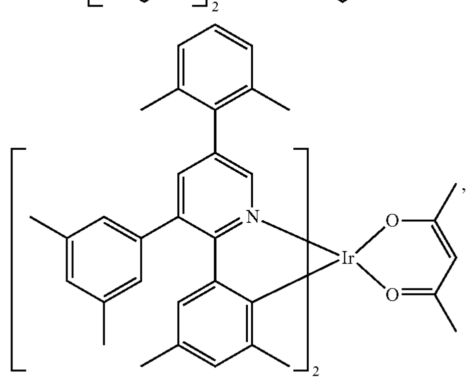

-continued
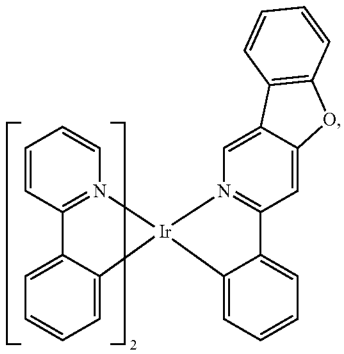
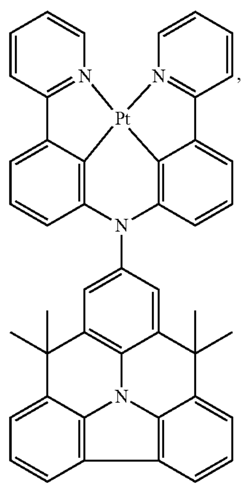
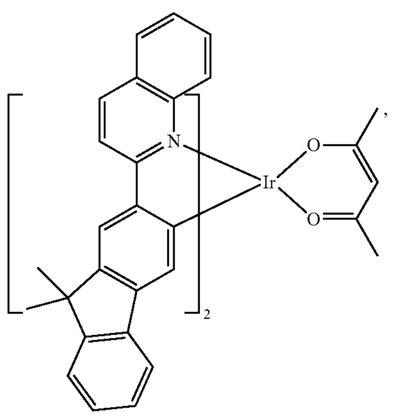
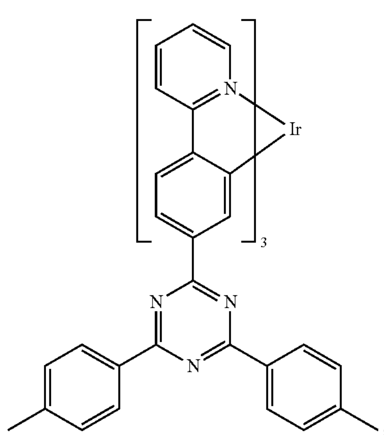
-continued
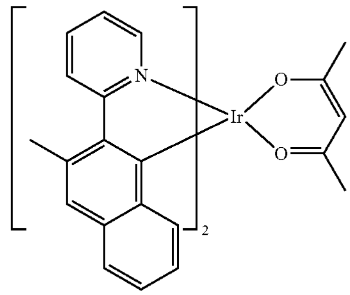
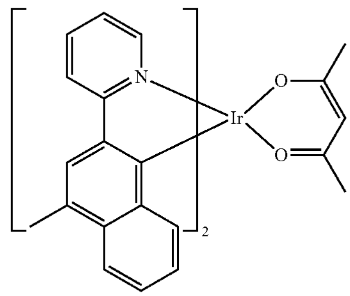
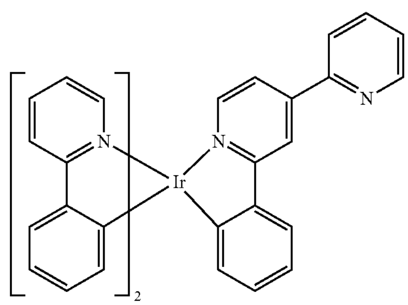
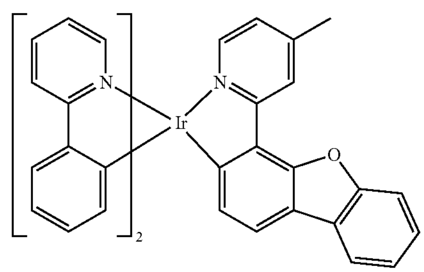
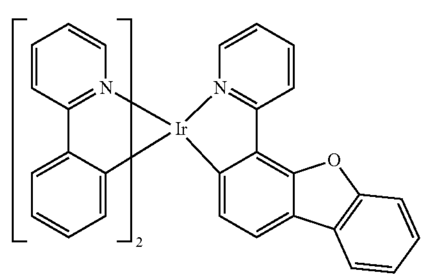
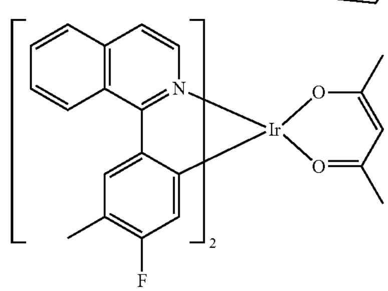

-continued
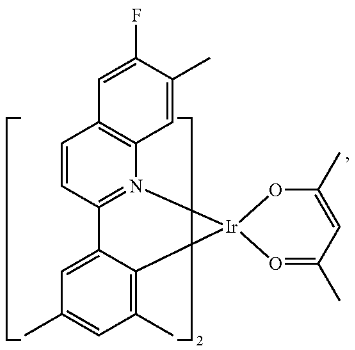
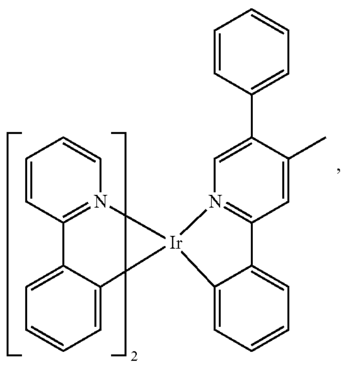
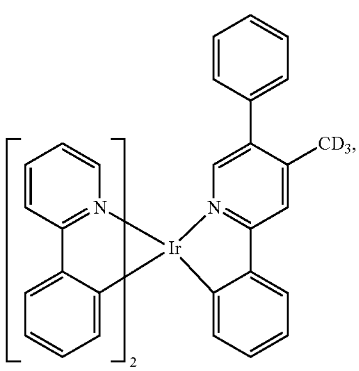
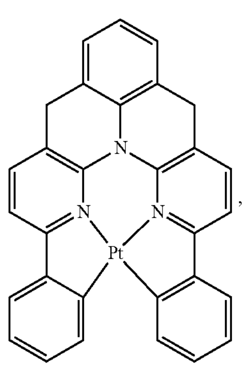
-continued
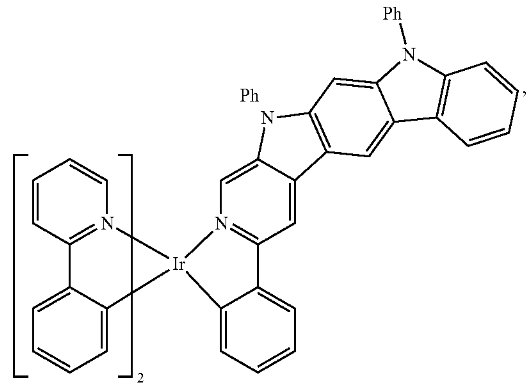
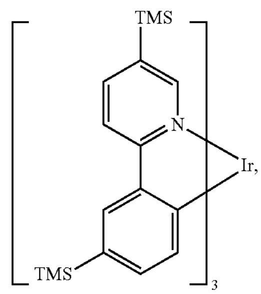
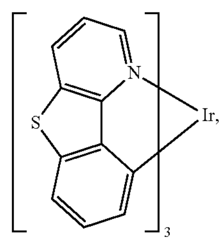
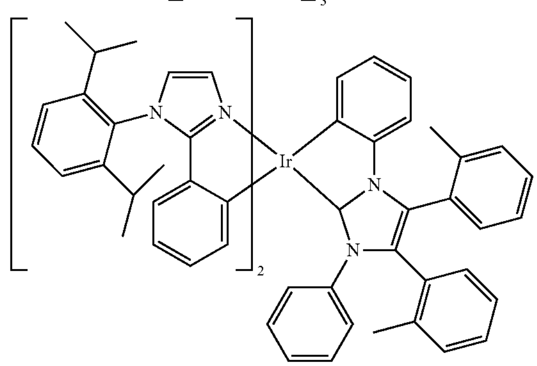
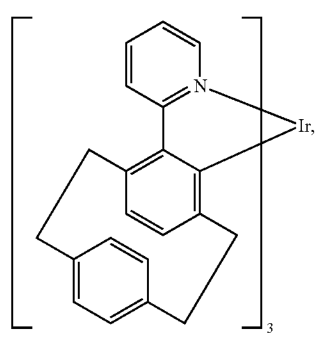

-continued
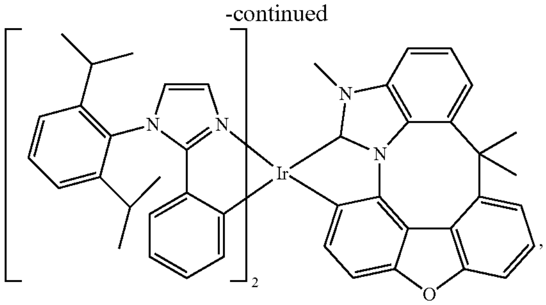
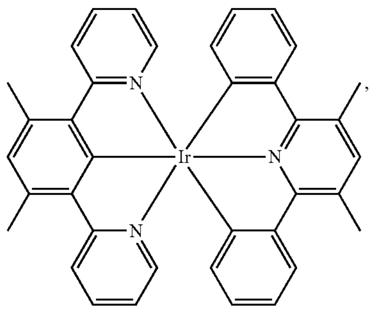
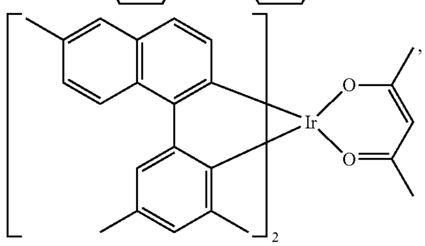
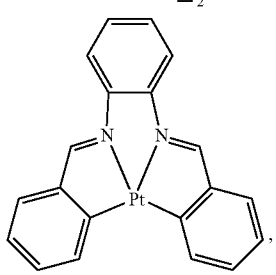
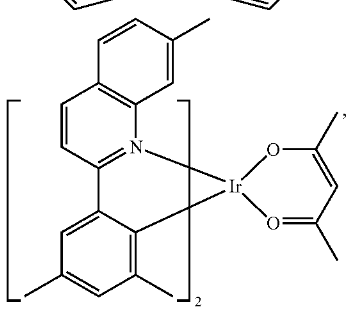
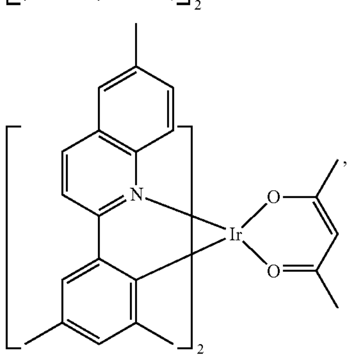
-continued
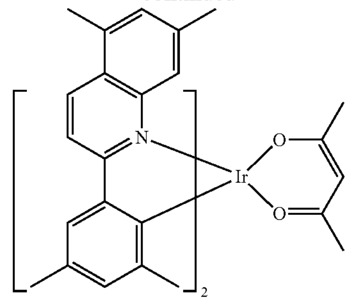
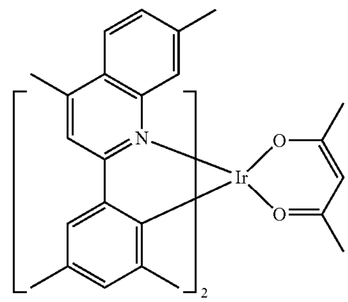
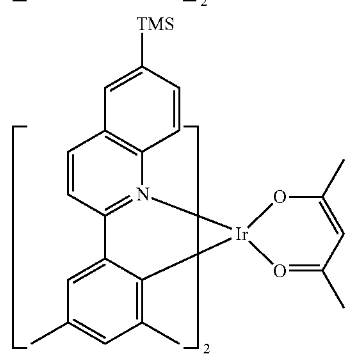
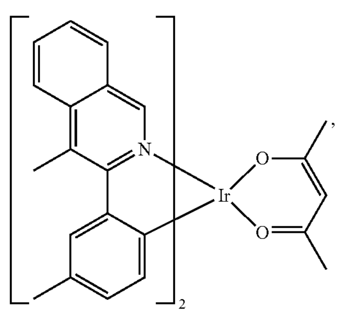
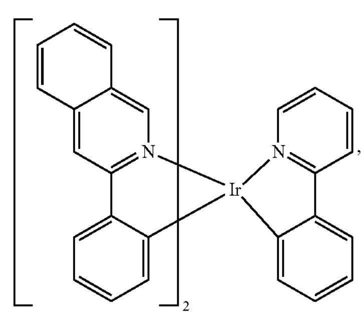

-continued
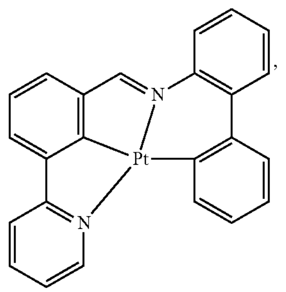
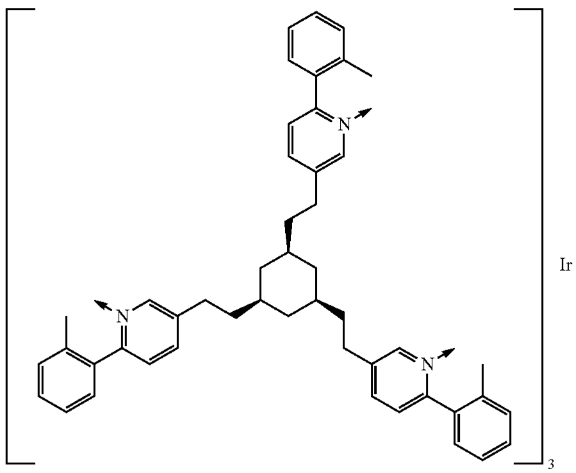
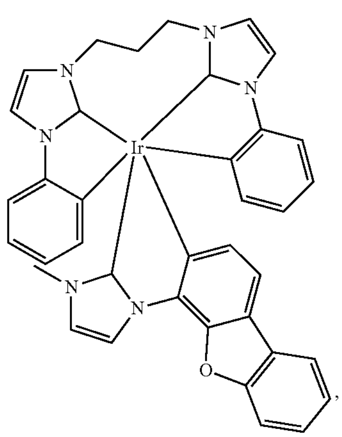
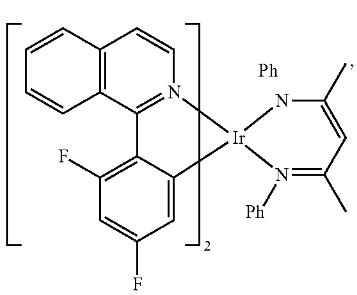
-continued
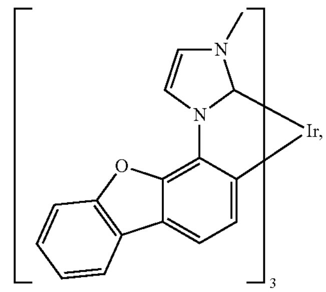
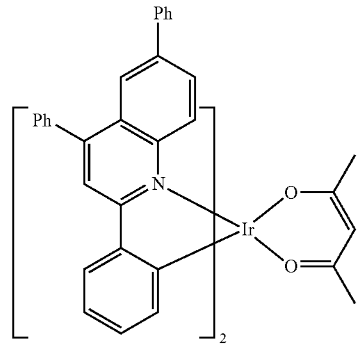
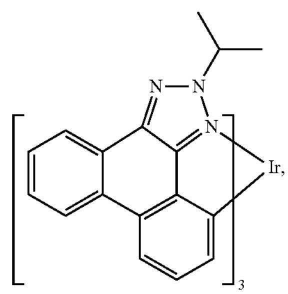
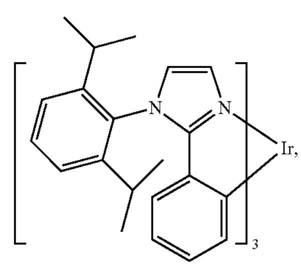
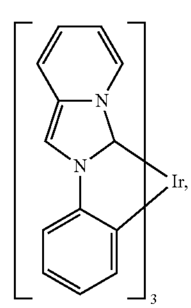

-continued

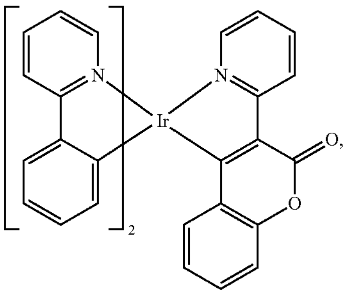

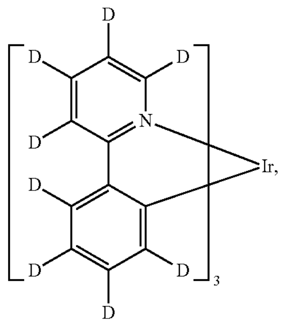

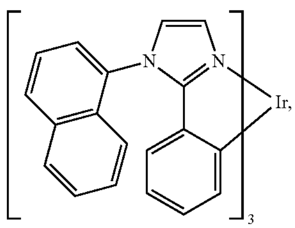

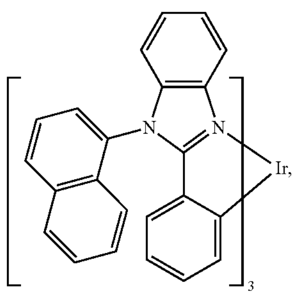

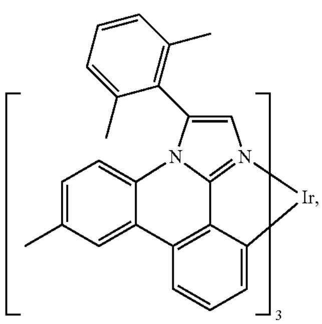

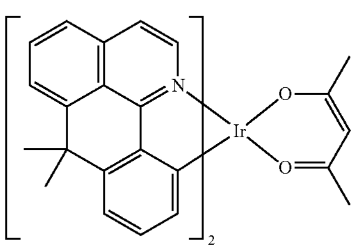

-continued

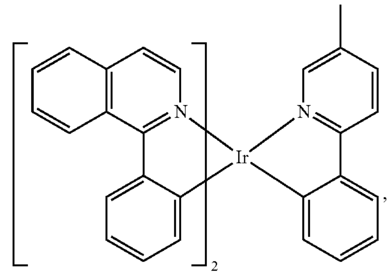

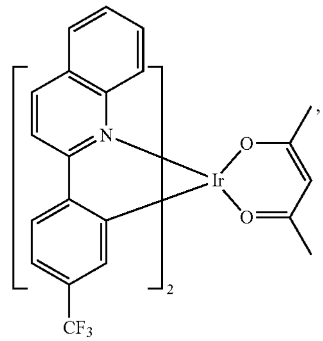

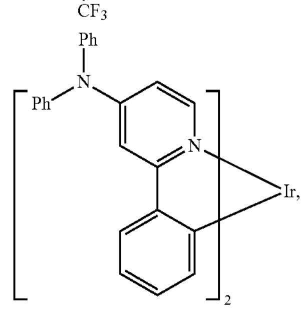

and

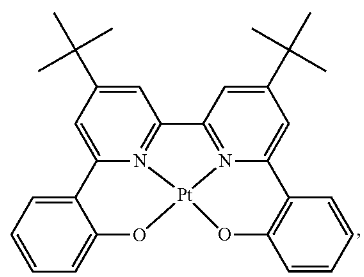

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

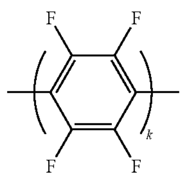
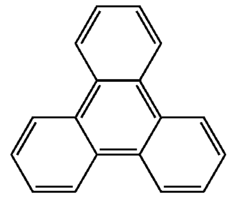
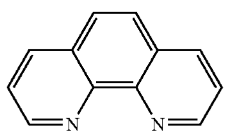
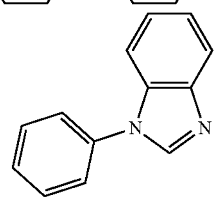
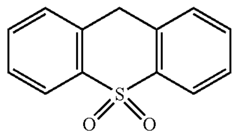
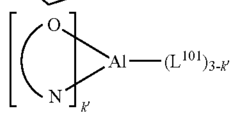

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

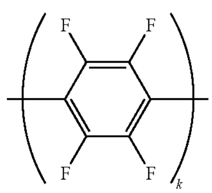
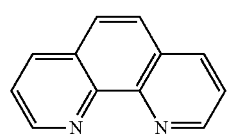
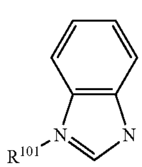
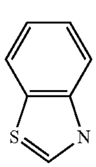
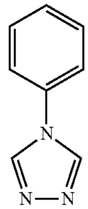
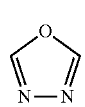
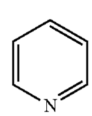
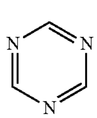
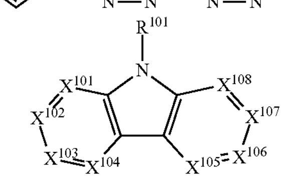
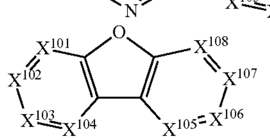
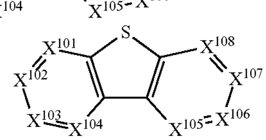

-continued

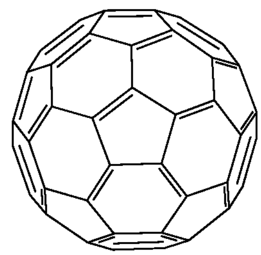
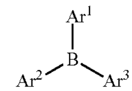

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

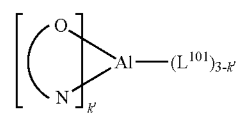
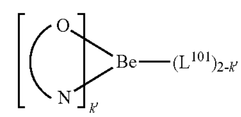
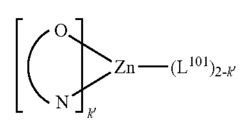
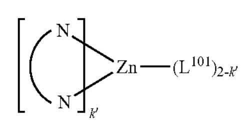

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535, -continued
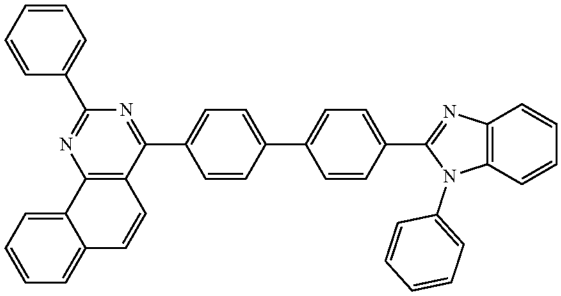
,
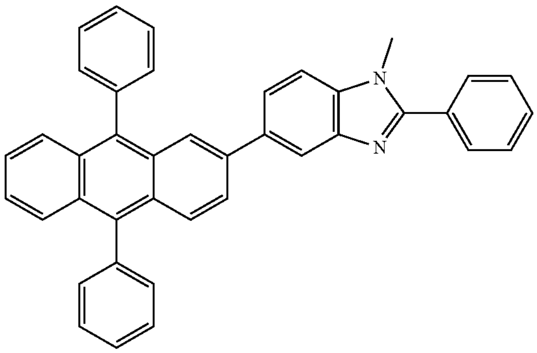
,
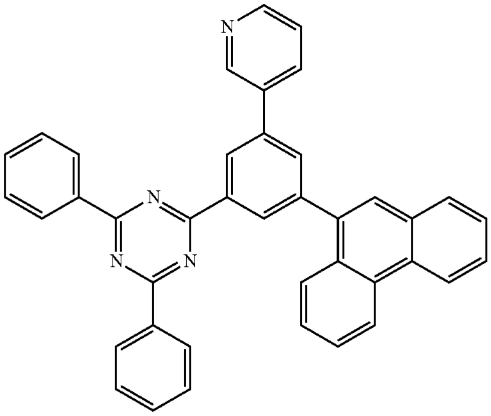
,
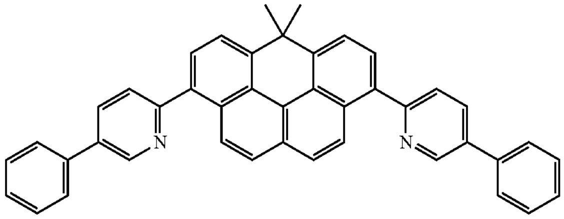
,
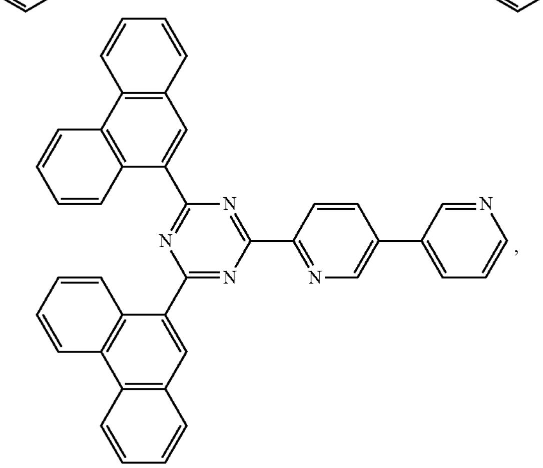
,
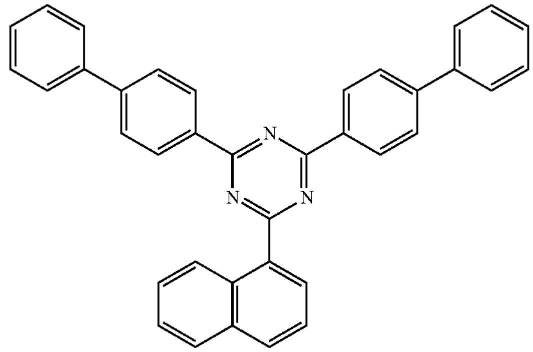
,
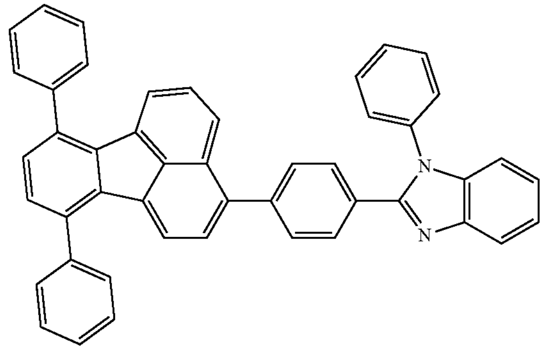
,
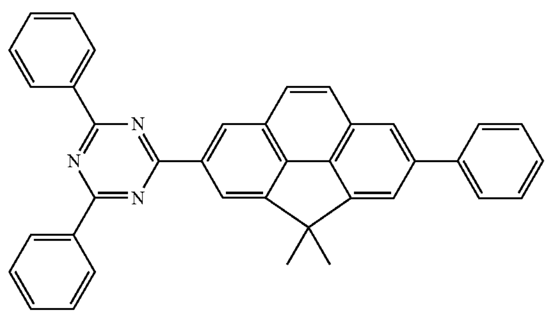
,
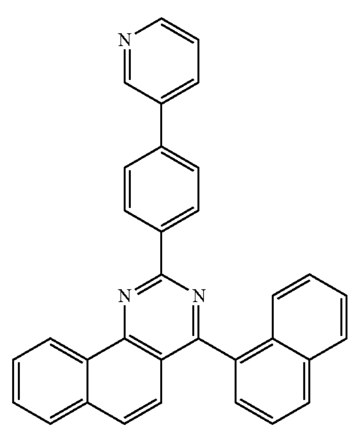
, -continued
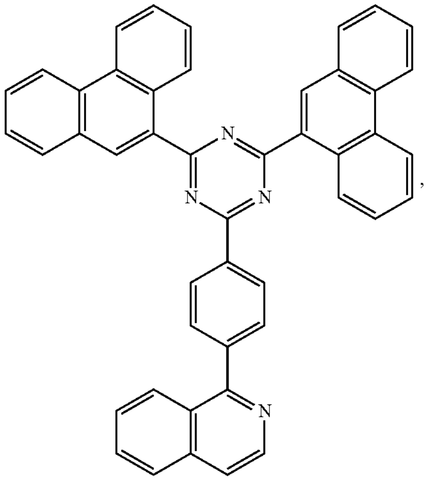
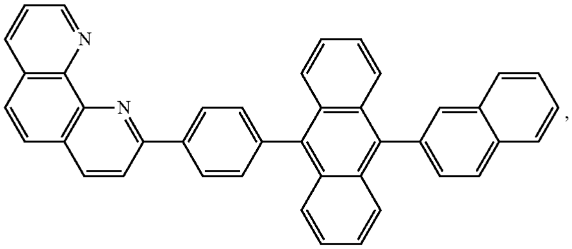
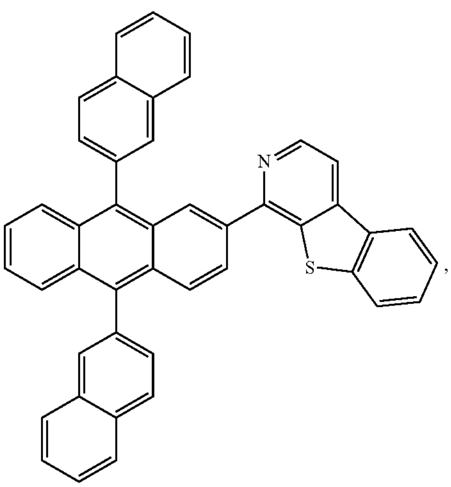
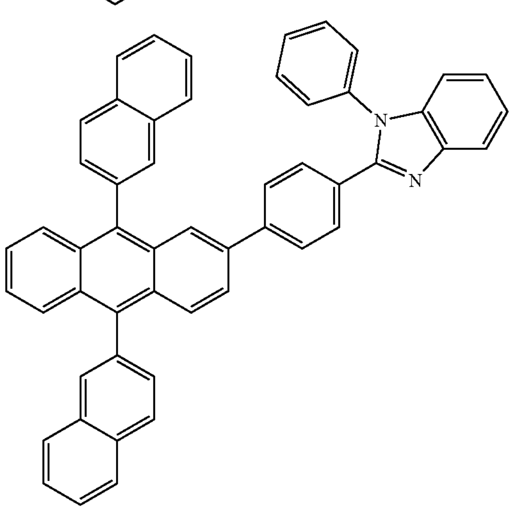
-continued
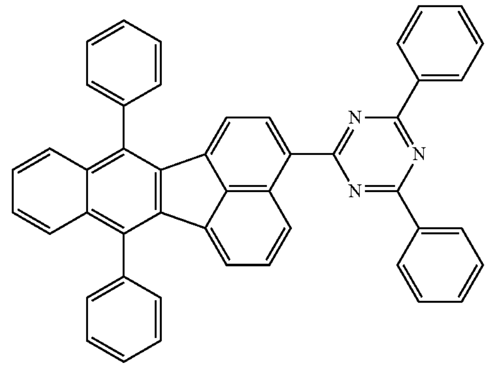
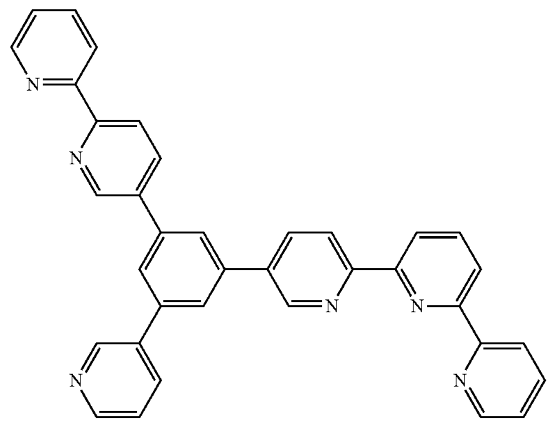
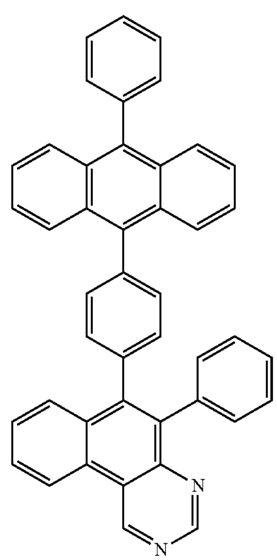

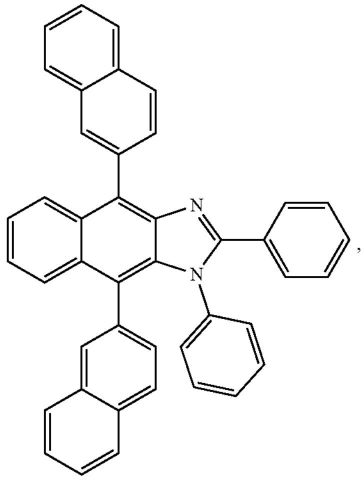
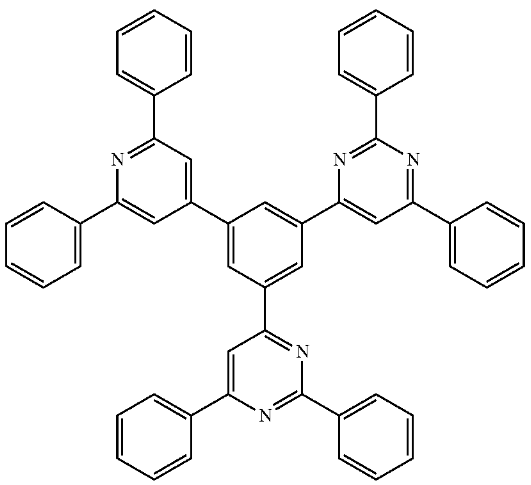
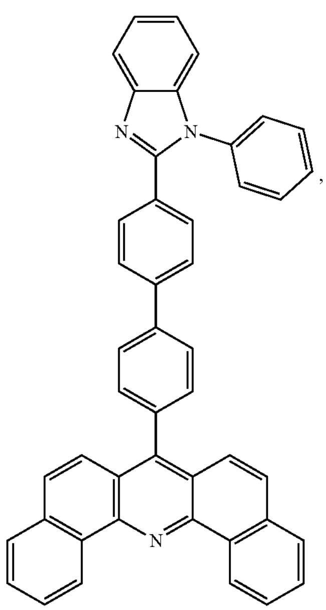
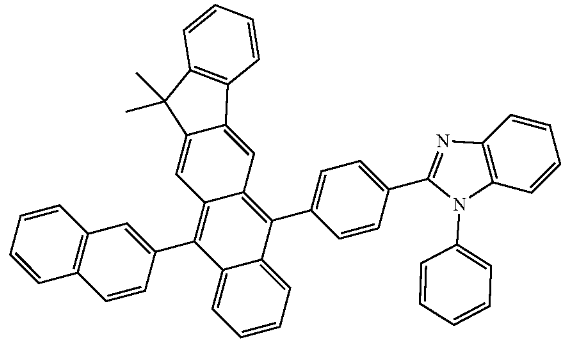
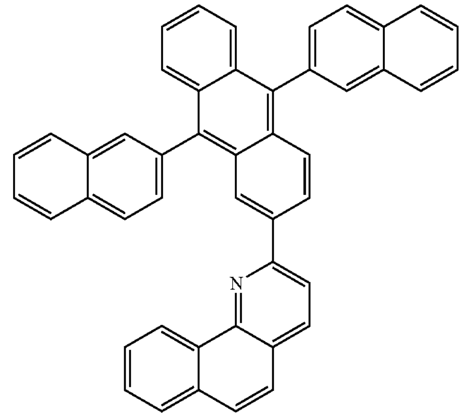
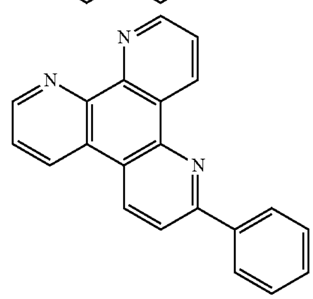
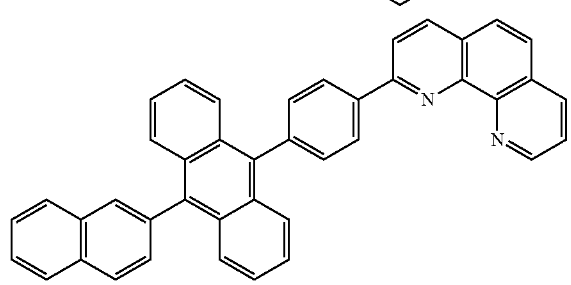
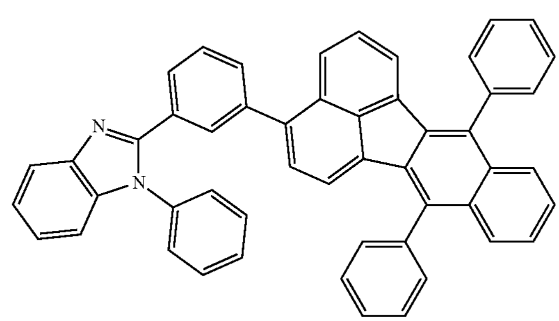

-continued
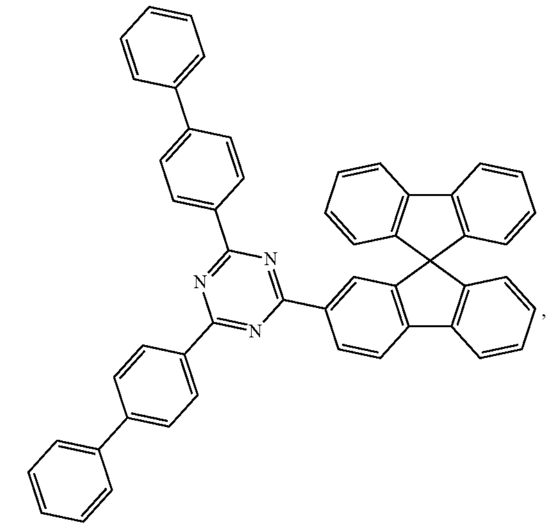
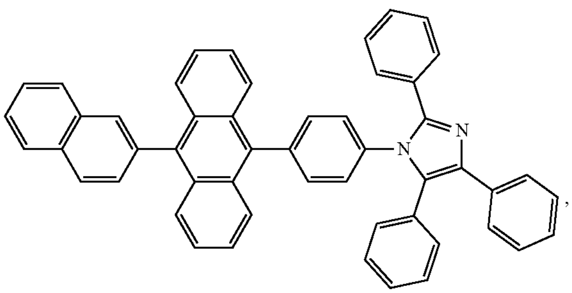
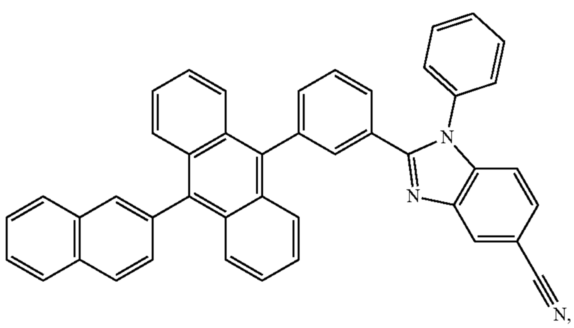
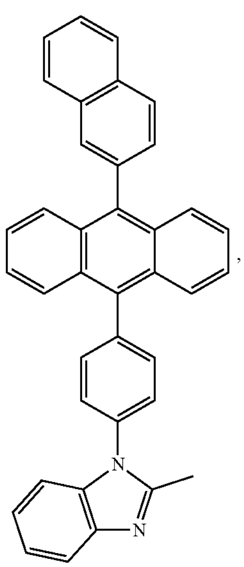
-continued
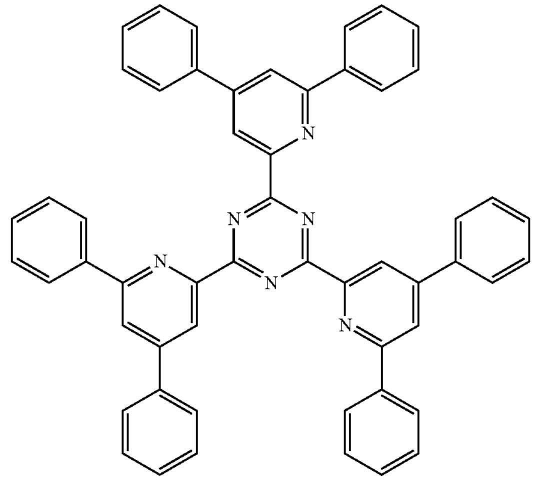
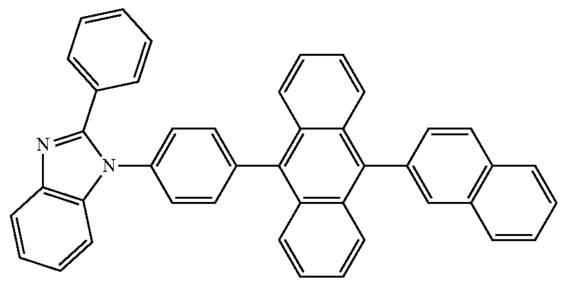
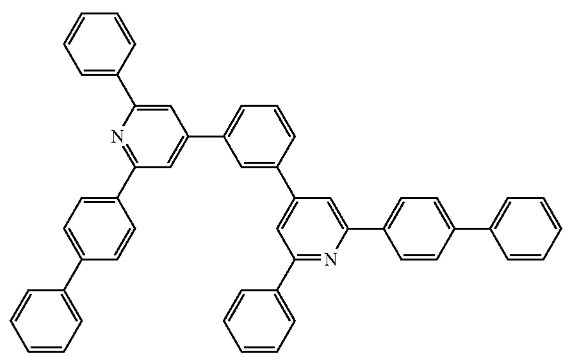
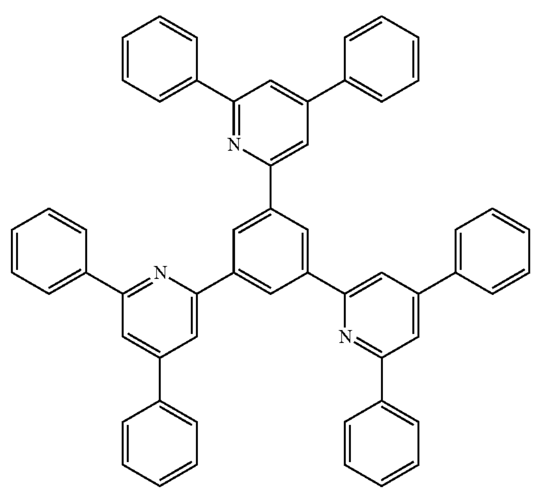

-continued

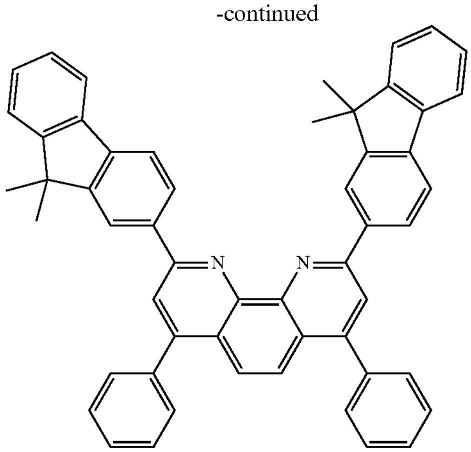

, and

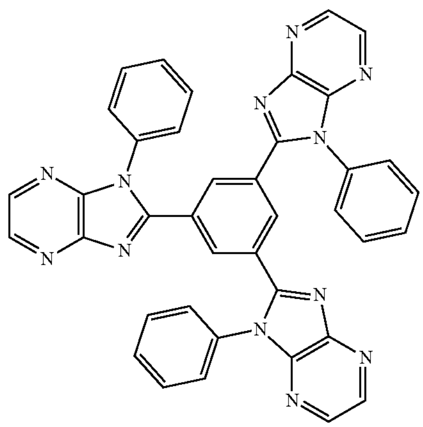

.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTAL

Dopant Synthesis

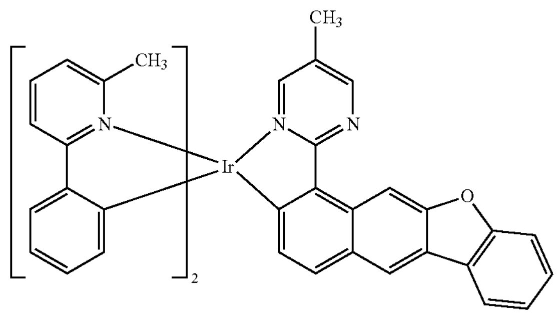

Dopant A

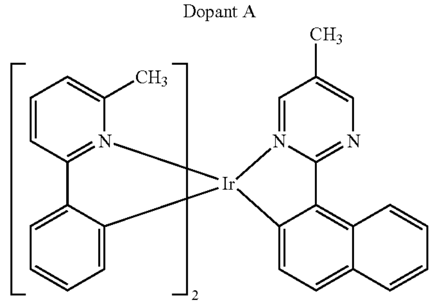

Dopant B

Compound 10, the ligand used to synthesize Dopant A, was prepared in seven steps according to Scheme I.

Scheme I

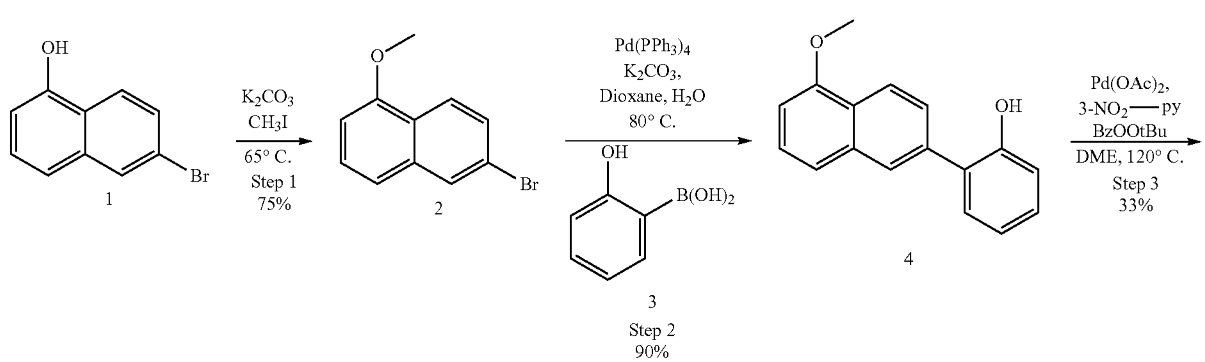

-continued

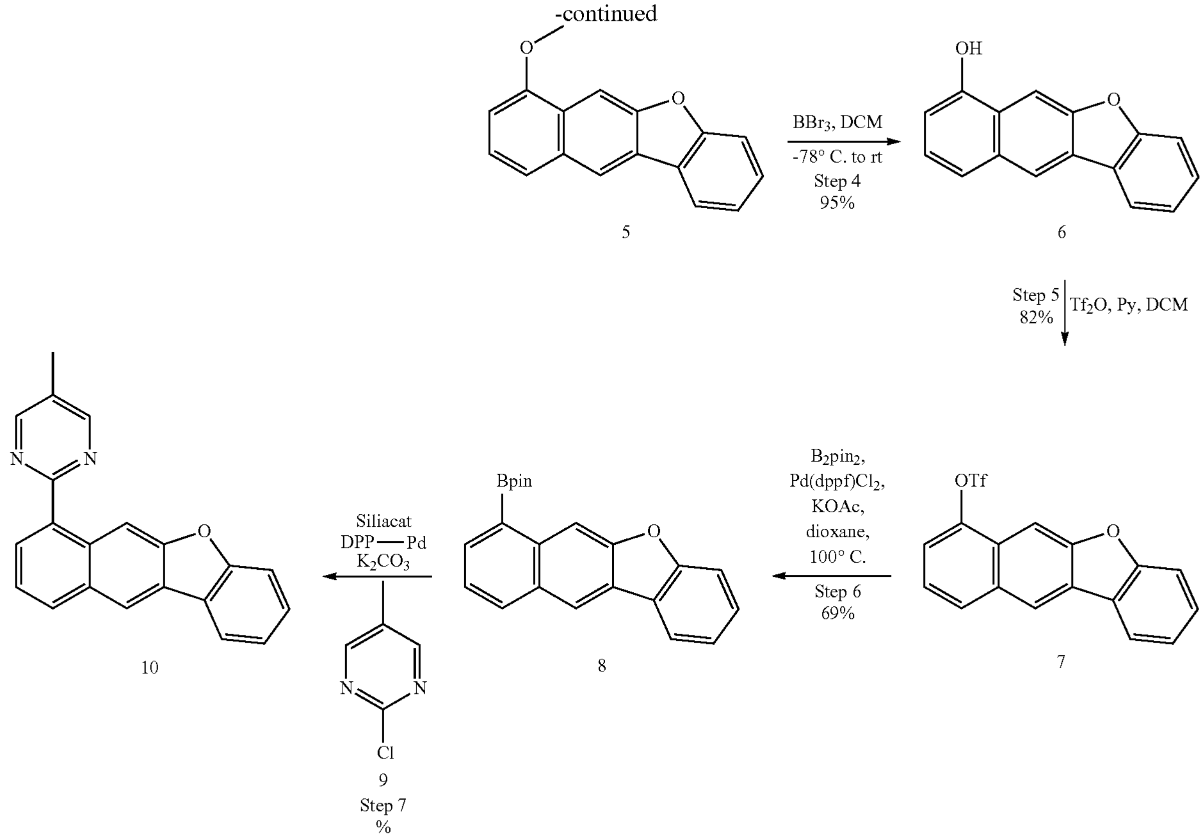

Step 1: Synthesis of 6-bromo-1-methoxynaphthalene (2)

6-Bromonaphthalen-1-ol (compound 1, 10 g, 44.8 mmol) was dissolved in dry acetone (180 mL) under a room temperature (~22° C.) atmosphere in a 500 mL, 3-necked round bottomed flask topped with a reflux condenser. Then, potassium carbonate (12.39 g, 90 mmol) and methyl iodide (5.61 ml, 90 mmol) were added and the reaction mixture was stirred at 65° C. for 18 hours. The reaction was cooled to room temperature (~22° C.), causing a white solid to precipitate from the reaction mixture. The precipitate was then was filtered off and the filtrate was concentrated under vacuum. The reaction mixture was partitioned between EtOAc and brine (200 mL) and the organics were separated and washed with brine (2×50 mL), dried over $MgSO_4$, and the solvents removed to afford an orange oil. Recrystallization from iso-hexane afforded compound 2 of Scheme I as a white solid (8.0 g, 33.7 mmol, 75% yield).

Step 2: Synthesis of 2-(5-methoxynaphthalen-2-yl)phenol (4)

Potassium carbonate (9.97 g, 72.1 mmol), 6-bromo-1-methoxynaphthalene (5.7 g, 24.04 mmol) and (2-hydroxyphenyl)boronic acid (compound 3, 4.97 g, 36.1 mmol) were dissolved in a 4.5:1 mixture of dioxane:water (300 mL) in a 500 mL three-necked round bottomed flask topped with a reflux condenser. The mixture was sparged with $N_2$ for 15 min, and then tetrakis(triphenylphosphine)palladium(0) (1.389 g, 1.202 mmol) was added, and the mixture was sparged with $N_2$ for additional 5 min. The reaction was stirred for 18 h at 80° C. The reaction mixture was taken to pH 7 using HCl 2N and partitioned between EtOAc and brine. The organics were separated and washed with brine (2×200 mL), dried over $MgSO_4$, and the solvents removed. The crude was purified by flash chromatography using mixtures of iso-hexane/dichloromethane to afford compound 4 of Scheme I as a yellow solid (5.50 g, 21.75 mmol, 90% yield).

Step 3: Synthesis of 7-methoxynaphtho[2,3-b]benzofuran (5)

Palladium(II) acetate (0.484 g, 2.157 mmol) and 3-nitropyridine (0.268 g, 2.157 mmol) were placed in a 500 mL high-pressure ACE brand reaction vessel topped with a rubber septum and evacuated/backfilled with $N_2$ three times. Then 2-(5-methoxynaphthalen-2-yl)phenol (5.40 g, 21.57 mmol) dissolved in dry 1,2-dimethoxyethane (150.0 ml) was added under $N_2$ via cannula followed by tert-butyl peroxybenzoate (8.14 ml, 43.1 mmol). The ACE reaction vessel was sealed and the reaction mixture stirred at 120° C. for 40 min. The reaction mixture was allowed to cool to room temperature (~22° C.), then filtered through a plug of Celite® (diatomaceous earth) eluting with dichloromethane. Solvents were removed in vacuo to afford a brown solid. The crude was purified by flash chromatography using mixtures of iso-hexane/acetone to afford compound 5 of Scheme I as a white solid (1.8 g, 7.25 mmol, 33% yield).

Step 4: Synthesis of naphtho[2,3-b]benzofuran-7-ol (6)

7-methoxynaphtho[2,3-b]benzofuran (16.0 g, 64.4 mmol) was dissolved in dry dichloromethane (120.0 ml) under $N_2$ in a 250 mL three-necked round bottomed flask fitted with an addition funnel. The mixture was cooled down to −78° C. before tribromoborane (1M in dichloromethane, 97 ml, 97 mmol) was added dropwise. The reaction mixture was allowed to warm to room temperature (~22° C.) and stirred for two hours. The reaction mixture was then poured into water-ice and extracted with dichloromethane (3×100 mL), with 10 mL of acetone to facilitate solubility, dried over $MgSO_4$, and the solvents removed. A red solid was obtained which was further triturated with iso-hexane to afford compound 6 of Scheme I as an off-white solid (14.42 g, 60.9 mmol, 95% yield).

Step 5: Synthesis of naphtho[2,3-b]benzofuran-7-yl trifluoromethanesulfonate (7)

Naphtho[2,3-b]benzofuran-7-ol (14.4 g, 61.5 mmol) and pyridine (7.46 ml, 92 mmol) were dissolved in dry dichloromethane (300 mL) under $N_2$ in a 3-necked round bottomed flask fitted with an addition funnel. The mixture was cooled down to 0° C. and trifluoromethanesulfonic anhydride (12.46 ml, 73.8 mmol) was added dropwise. The reaction mixture was slowly allowed to warm to room temperature (~22° C.) and stirred for an additional 16 h. The reaction mixture was partitioned between dichlormethane (100 mL) and saturated aqueous $NaHCO_3$ (200 mL), the organics were then separated, dried over $MgSO_4$ and the solvents removed to afford a brown solid that further triturated with iso-hexane to afford compound 7 of Scheme I as an off-white solid (18.63 g, 50.3 mmol, 82% yield).

Step 6: Synthesis of 4,4,5,5-tetramethyl-2-(naphtho[2,3-b]benzofuran-7-yl)-1,3,2-dioxaborolane (8)

Bis(pinacolato)diboron (15.34 g, 60.4 mmol), naphtho[2,3-b]benzofuran-7-yl trifluoromethanesulfonate (18.44 g, 50.3 mmol), potassium acetate (9.88 g, 101 mmol) and 1,1'-bis(diphenylphosphino)ferrocenepalladium(II)dichloride dichloromethane complex (1.23 g, 1.51 mmol) were dissolved in dry dioxane (200 mL) in a 3-necked round bottomed flask fitted with a reflux condenser. The mixture was sparged with nitrogen for 15 min then the reaction was stirred for 18 h at 100° C. The reaction mixture was partitioned between ethyl acetate (EtOAc) (200 mL) and brine (200 mL), the organics were separated, washed with brine (2×200 mL), dried over $MgSO_4$ and the solvents removed. The crude was purified by flash chromatography using mixtures of iso-hexane/dichloromethane to afford compound 8 of Scheme I as a yellow solid (12.0 g, 34.7 mmol, 68.9%).

Step 7: Synthesis of 5-methyl-2-(naphtho[2,3-b]benzofuran-7-yl)pyrimidine (10)

A mixture of 4,4,5,5-tetramethyl-2-(naphtho[2,3-b]benzofuran-7-yl)-1,3,2-dioxaborolane (2.02 g, 5.9 mmol), 5-methyl-2-chloropyrimidine (compound 9, 0.93 g, 7.2 mmol), 2 M aq. potassium carbonate (6 mL, 12 mmol) and ethanol (30 mL) were sparged with nitrogen for 10 min. Silicate DPP-Pd silica-based catalyst (0.404 g, 0.12 mmol) was added and the reaction mixture heated at 76° C. for 18 h. The solvent was removed under reduced pressure. The residue was dry-loaded onto silica gel and purified on an Interchim automated system (80 g column) eluting with 0-30% ethyl acetate in heptanes. The product containing fractions were concentrated under reduced pressure and the solid dried in a vacuum oven for 4 hours to afford compound 10 of Scheme I (5-methyl-2-(naphtho[2,3-b]benzofuran-7-yl)-pyrimidine) (1.33 g, 99.3% UPLC purity) as an off-white solid.

Synthesis of Dopant A

Dopant A was synthesized according to the reaction below.

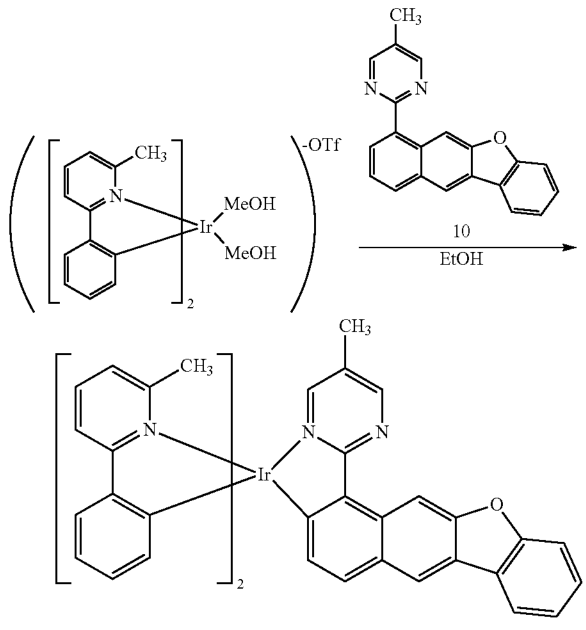

Dopant A

Synthesis of bis[(6-methyl-2-phenylpyridin-2-yl)]-5-methyl-2-(naphtho[2,3-b]benzofuran-7-yl)pyrimidin-2-yl]iridium(III) (Dopant A)

A solution of 5-methyl-2-(naphtho[2,3-b]benzofuran-7-yl)pyrimidine (1.48 g, 4.75 mmol, 1.76 equiv) in ethanol (75 mL) was sparged with nitrogen for 10 min. [Ir(2-phenyl-6-methyl-pyridin-2-yl(−1H))$_2$-(MeOH)$_2$](trifluororethanesulfonate) (2.0 g, 2.7 mmol, 1.0 equiv) was added and the reaction mixture was heated 78° C. for 36 h. The mixture was cooled to room temperature (~22° C.), filtered, the solids washed with methanol (2×25 mL), and air dried. The crude material was chromatographed on silica gel (135 g) layered with basic alumina (43 g), eluting with 20% hexanes in dichloromethane. Product containing fractions were concentrated under reduced pressure and the solid dried in a vacuum oven for 9 h to afford Dopant A (1.8 g, 82% yield 99.3% HPLC purity) as an orange solid.

The ligand used to synthesize Dopant B, 5-methyl-2-(naphthalen-1-yl)pyrimidine, was prepared according to the synthesis scheme below.

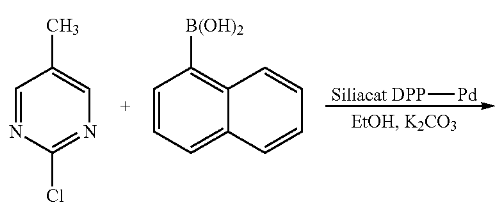

-continued

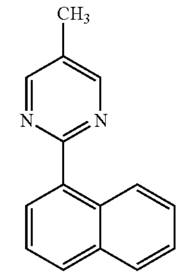

Synthesis of 5-Methyl-2-(naphthalen-1-yl)pyrimidine

A mixture of naphthalen-1-ylboronic acid (15 g, 96 mmol), 2-chloro-5-methylpyrimidine (9 g, 70 mmol), 2 M aq. potassium carbonate (58 mL, 116 mmol) and ethanol (300 mL) was sparged with nitrogen for 15 min. Silicate DPP-Pd silica-based catalyst (3.87 g, 1.16 mmol, 0.17 equiv) was added and the reaction mixture heated at 78° C. for 48 h. The reaction mixture was cooled to room temperature (~22° C.) filtered and the filtrate was concentrated under reduced pressure. The residue was diluted with ethyl acetate and washed with saturated brine. The organic layer was dried over sodium sulfate, filtered and concentrated under reduced pressure. The residue was purified by chromatography on silica gel, eluting with 0-20% ethyl acetate in heptanes to afford 5-methyl-2-(naphthalen-1-yl)pyrimidine (12.65 g, 82% yield, 99.8% UPLC purity) as a white solid.

Dopant B was synthesized according to the equation below.

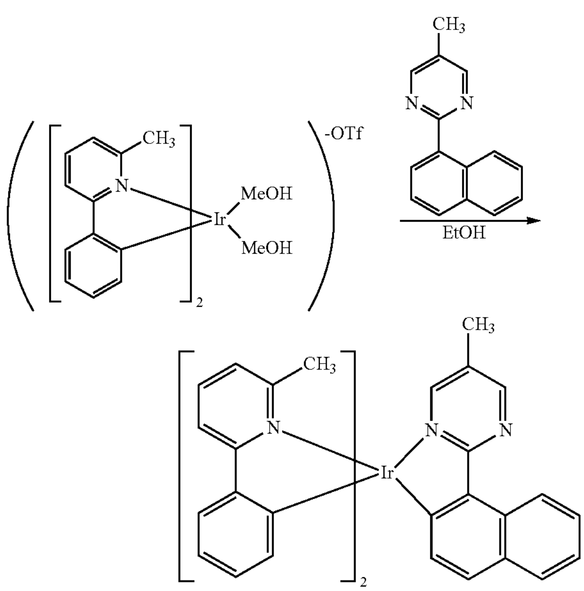

Dopant B

Synthesis of bis[((2-phenyl-2'-yl)-6-methylpyridin)-1-yl]-((5-methyl-2-(naphthalen-1-yl)-2-'yl)pyrimidin-1-yl)iridium(III) (Dopant B)

A solution of 5-methyl-2-(naphthalen-1-yl)pyrimidine (1.19 g, 5.39 mmol) in ethanol (75 mL) was sparged with nitrogen for 15 minutes, then Ir(2-phenyl-6-methylpyridin-2-yl(-1H))$_2$-(MeOH)$_2$](trifluoromethanesulfonate) (1.0 g, 2.7 mmol) was added and the reaction mixture heated at 78° C. for 30 h. The mixture was cooled to room temperature (~22° C.), filtered and the solids dissolved in a minimum amount of dichloromethane (traces of insoluble material remained). The crude material was chromatographed on silica gel (100 g) layered with basic alumina (30 g), eluting with 20% hexanes in dichloromethane. Product containing fractions were concentrated under reduced pressure and the solid dried in a vacuum oven for 14 h to afford bis[((2-phenyl-2'-yl)-6-methylpyridin)-1-yl]-((5-methyl-2-(naphthalen-1-yl)-2-'yl)pyrimidin-1-yl) iridium(II) (1.52 g, 75% yield, 99.2% HPLC purity) as an orange solid.

Device Examples

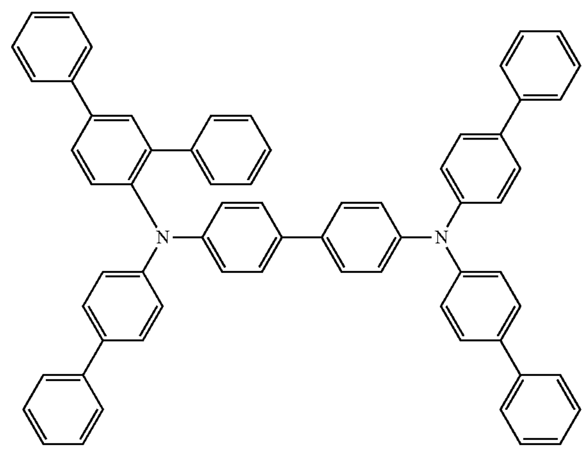

HTL-1

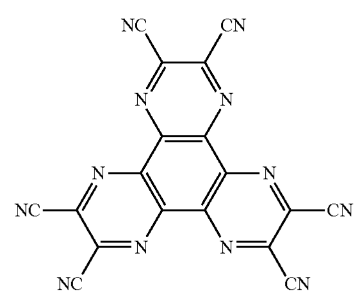

HATCN

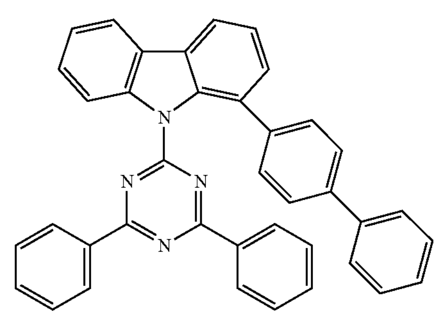

Host-1

-continued

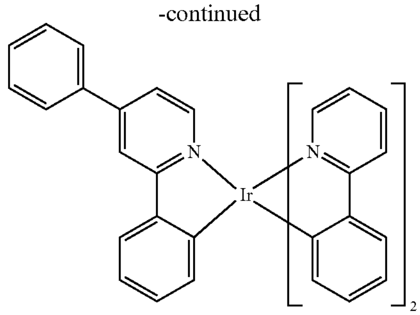

SD-1

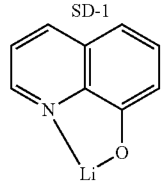

Liq

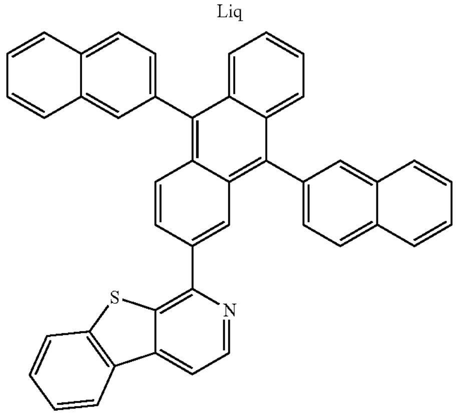

ETM-1

All example devices were fabricated by high vacuum (<$10^{-7}$ Torr) thermal evaporation. The anode electrode was 1150 Å of indium tin oxide (ITO). The cathode consisted of 10 Å of Liq (8-hydroxyquinoline lithium) followed by 1,000 Å of Al. All devices were encapsulated with a glass lid sealed with an epoxy resin in a nitrogen glove box (<1 ppm of $H_2O$ and $O_2$) immediately after fabrication, and a moisture getter was incorporated inside the package. The organic stack of the device examples consisted of sequentially, from the ITO surface, 100 Å of HATCN as the hole injection layer (HIL); 450 Å of HTL-1 as the hole transporting layer (HTL); 400 Å of an emissive layer (EML) comprising Host-1 as a host, SD-1 as a stability dopant (18%), and Dopant A or Dopant B as the emitter (3%); 350 Å of Liq doped with 35% of ETM-1 as the ETL; and 10 Å of Liq as the electron injection layer (EIL). The stability dopant was added to the electron-transporting host to help transport positive charge in the emissive layer.

Upon fabrication, the electroluminescence (EL) and current density-voltage-luminance (JVL) performance of the devices was measured. The device lifetimes were evaluated at a current density of 80 mA/$cm^2$. The results are summarized in Table I and compare the performance of Dopant A in Example 1 vs. Dopant B in Comparative Example 2. Both dopants afford devices with identical voltages and external quantum efficiencies. However, Dopant A provides narrower line width (full width at half maximum, FWHM) and significantly longer device lifetime than Dopant B. The emission wavelength of Dopant A is also red-shifted versus Dopant B, which is desirable for application of the dopants of the present invention as red emissive materials in OLED devices.

TABLE 1

| Device Example | Emitter | 1931 CIE x | 1931 CIE y | λ max [nm] | FWHM [au] | At 10 mA/$cm^2$ Voltage [au] | At 10 mA/$cm^2$ EQE [au] | At 80 mA/cm2 $LT_{95\%}$ [au] |
|---|---|---|---|---|---|---|---|---|
| Inventive Example 1 | Dopant A | 0.550 | 0.448 | 580 | 0.91 | 1.00 | 1.00 | 1.62 |
| Comparative Example 2 | Dopant B | 0.518 | 0.479 | 567 | 1.00 | 1.00 | 1.00 | 1.00 |

au = normalized units

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound comprising a first ligand $L_A$ having the Formula selected from the group consisting of:

Formula IA

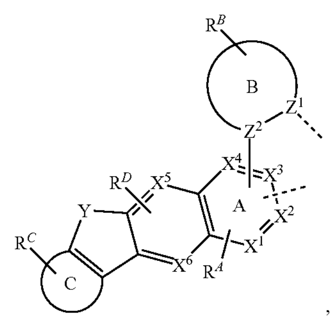

,

Formula IB

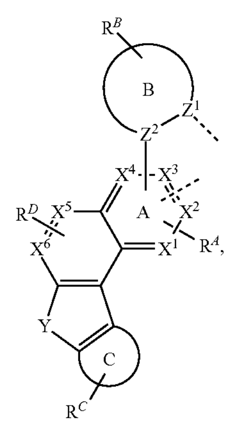

and

-continued

Formula IC

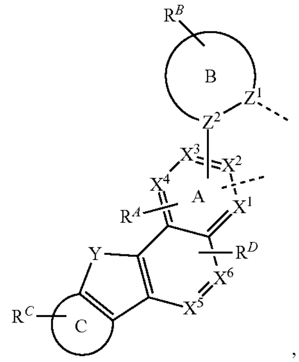

wherein ring B and C are each independently a 5-membered or 6-membered aromatic or heteroaromatic ring;

wherein $R^A$, $R^B$, $R^C$, and $R^D$ each independently represent mono to the maximum possible number of substituents, or no substituent;

wherein $Z^1$ and $Z^2$ are each independently selected from the group consisting of C and N;

wherein $X^1$, $X^2$, $X^3$, $X^4$, $X^5$, and $X^6$ are each C;

wherein when the first ligand $L_A$ has the Formula of Formula IA, ring B is a 5-membered ring or ring B contains two nitrogen atoms;

wherein Y is selected from the group consisting of CRR', NR', O, S, SiRR', and Se;

wherein when ring B is phenyl in Formula IB, Y is selected from the group consisting of NR', S, SiRR', and Se;

wherein R, R', $R^A$, $R^B$, $R^C$, and $R^D$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two substituents are optionally joined or fused into a ring;

wherein the ligand $L_A$ is coordinated to a metal M by the dashed lines to form a 5-membered chelate ring;

wherein M does not form a direct bond to $X^1$ in Formula IB;

wherein M does not form a direct bond to $X^4$ in Formula IC;

wherein the metal M can be coordinated to other ligands; and wherein the ligand $L_A$ is optionally linked with other ligands to comprise a tridentate, tetradentate, pentadentate or hexadentate ligand.

2. The compound of claim 1, wherein M is selected from the group consisting of Ir, Rh, Re, Ru, Os, Pt, Pd, Au, and Cu.

3. The compound of claim 1, wherein M is Ir or Pt.

4. The compound of claim 1, wherein R, R', $R^A$, $R^B$, $R^C$, and $R^D$ are each independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

5. The compound of claim 1, wherein Y is O.

6. The compound of claim 1, wherein ring C is a fused benzene ring.

7. The compound of claim 1, wherein when the first ligand $L_A$ has the Formula of Formula IA, ring B is selected from the group consisting of pyrimidine, pyrazine, pyridazine, imidazole, pyrazole, triazole, pyrrole, oxazole, thiazole, and imidazole derived carbene; and when the first ligand $L_A$ has the Formula of Formula IB or IC, ring B is selected from the group consisting of pyridine, pyrimidine, pyrazine, pyridazine, benzene, imidazole, pyrazole, triazole, pyrrole, oxazole, thiazole, and imidazole derived carbene.

8. The compound of claim 1, wherein the first ligand $L_A$ is selected from the group consisting of:

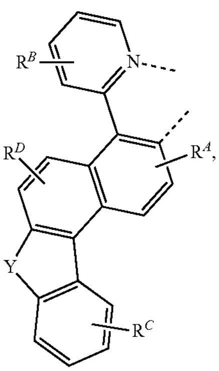

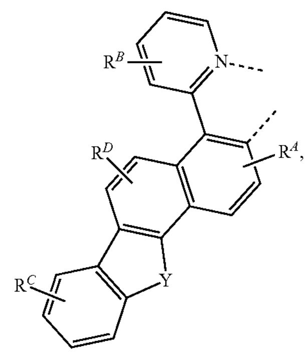

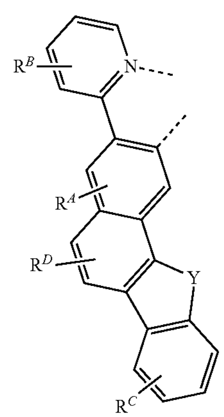

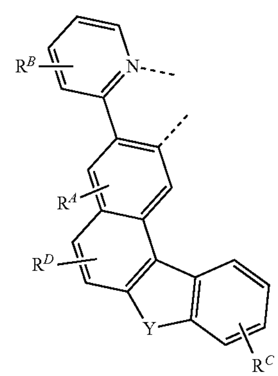

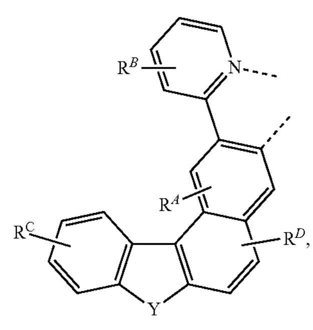

-continued
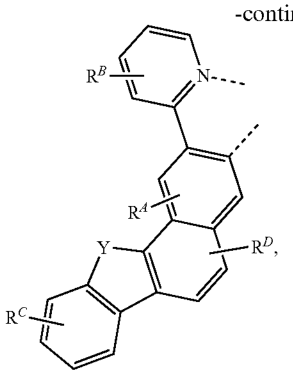
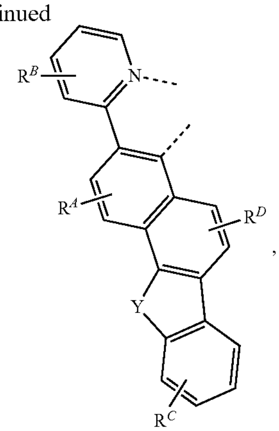
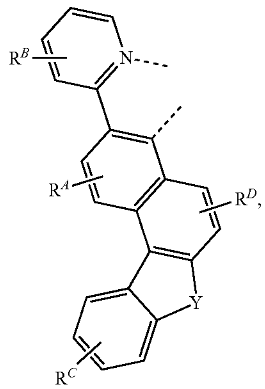
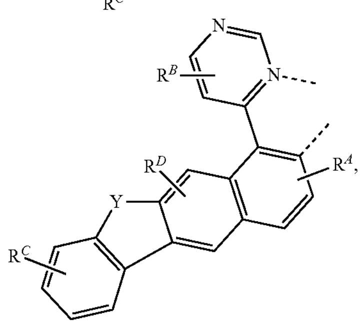
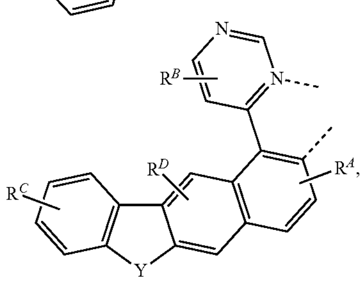
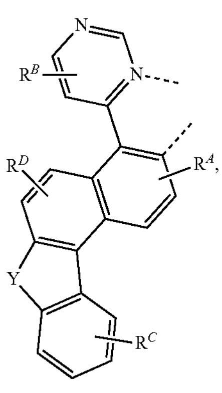
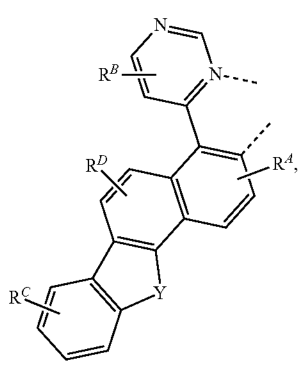
-continued
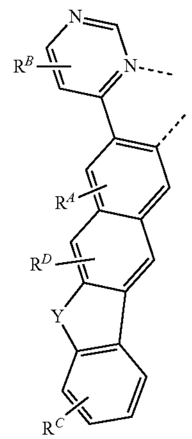
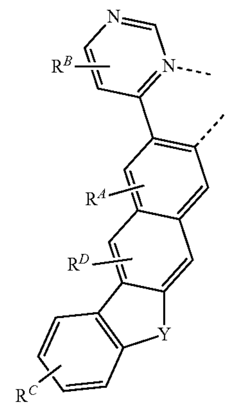
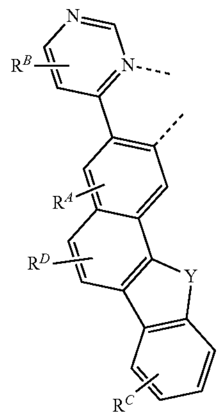
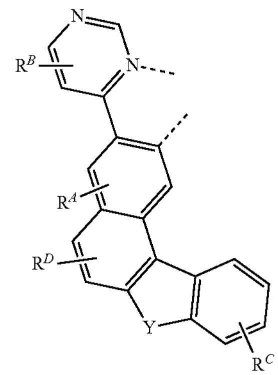
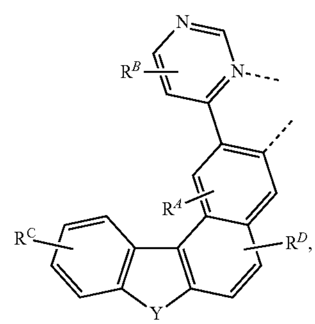
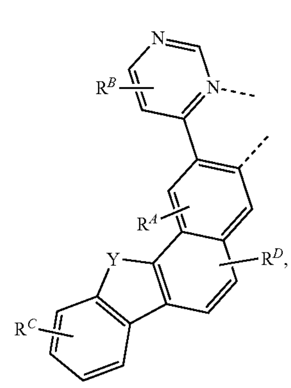
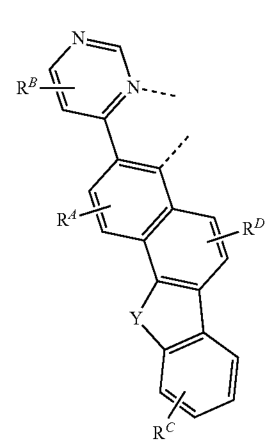

-continued
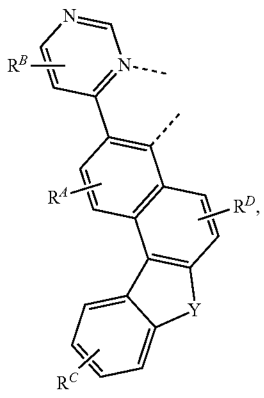
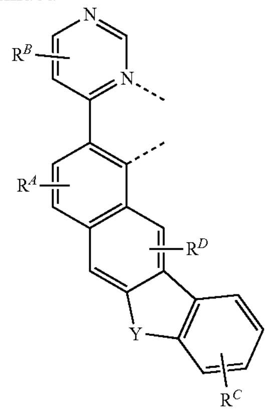
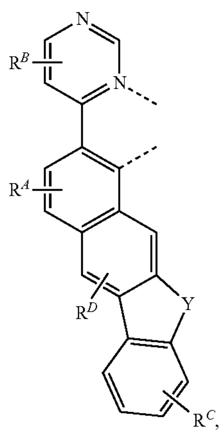
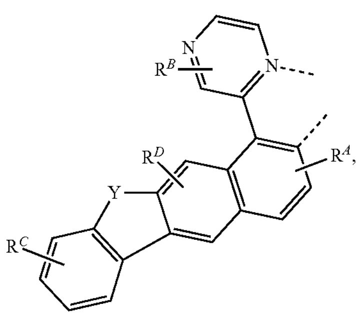
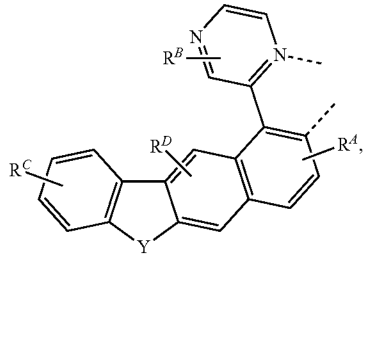
-continued
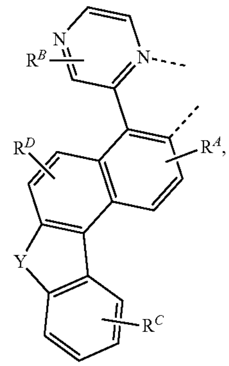
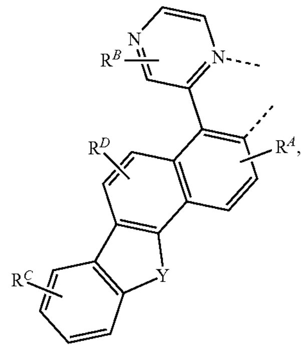
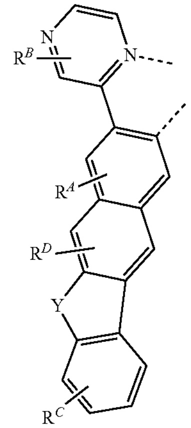
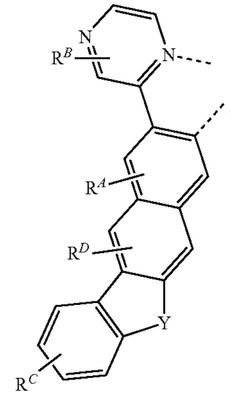
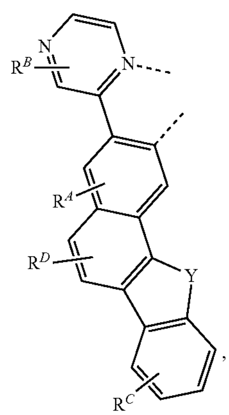
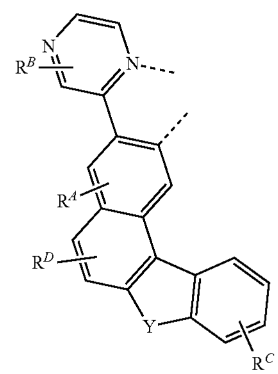
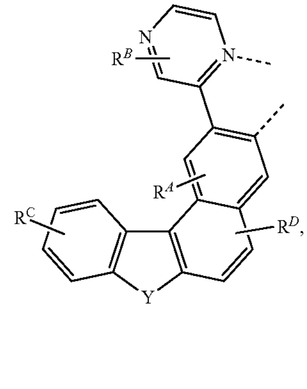

-continued
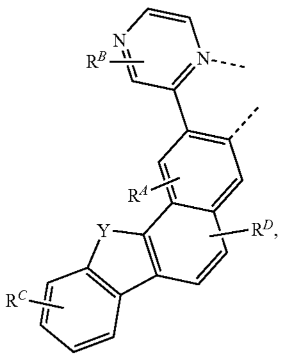
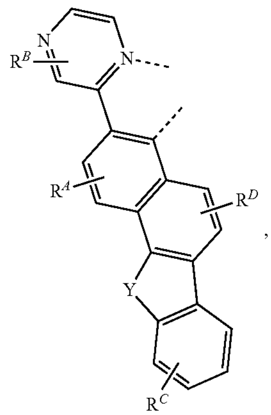
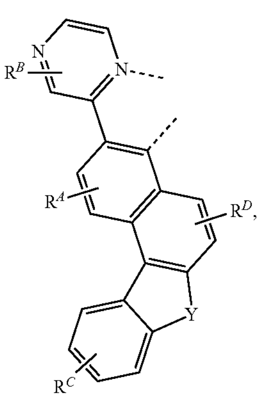
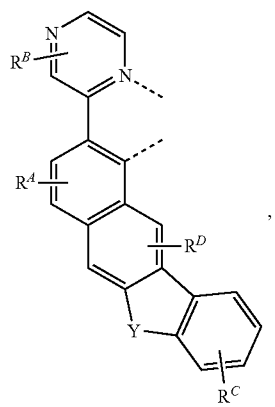
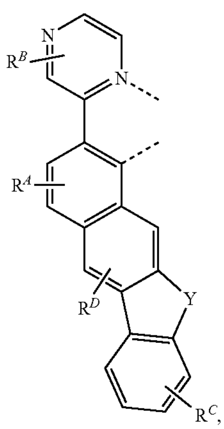
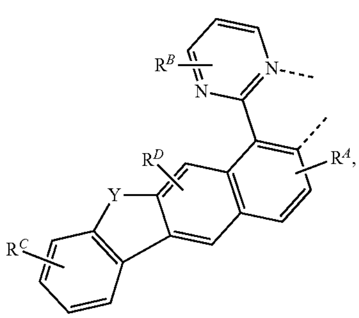
-continued
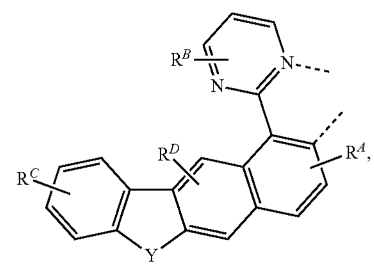
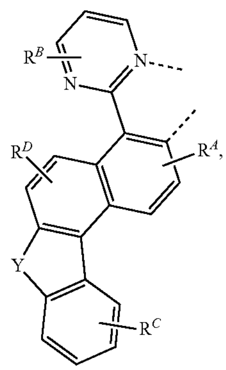
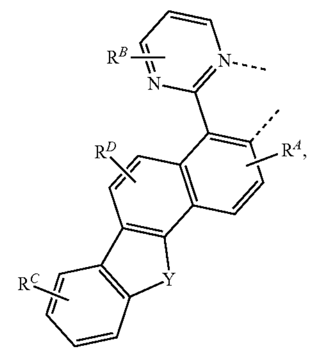
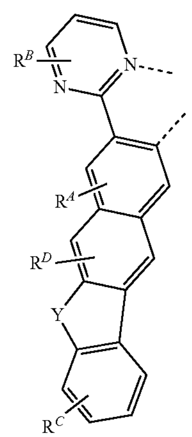
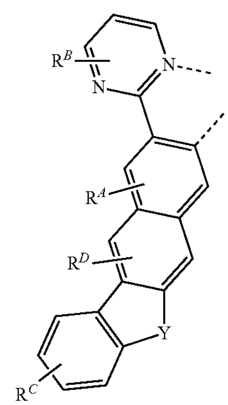
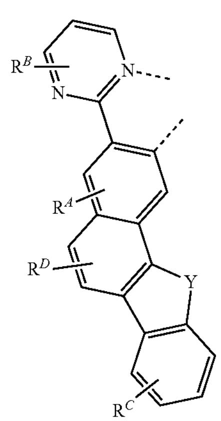
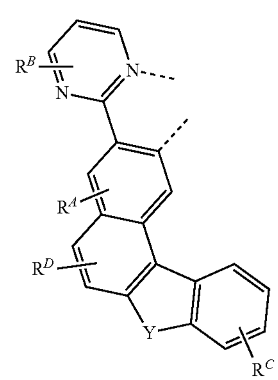

-continued
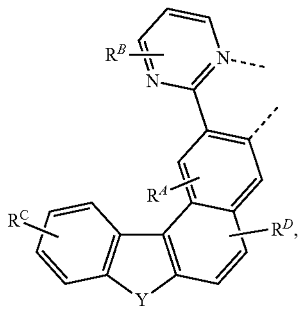
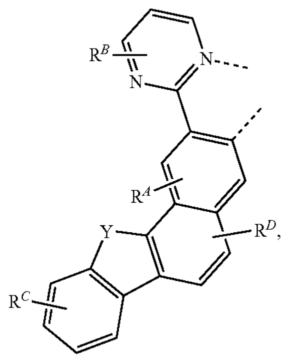
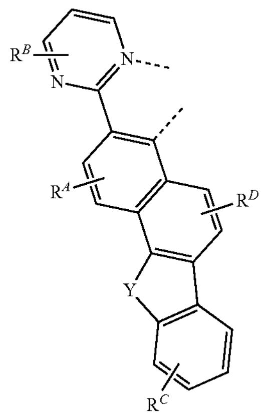
,
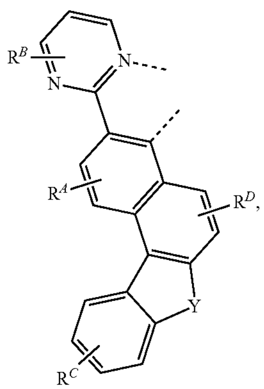
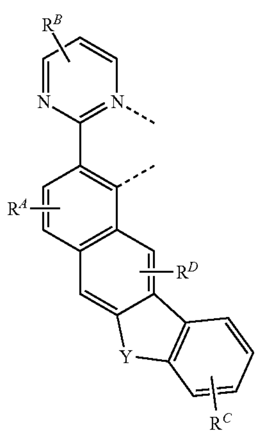
,
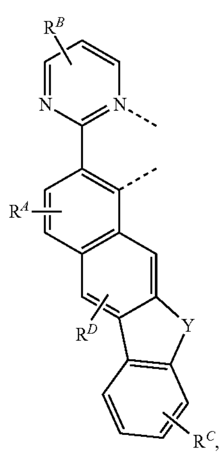
-continued
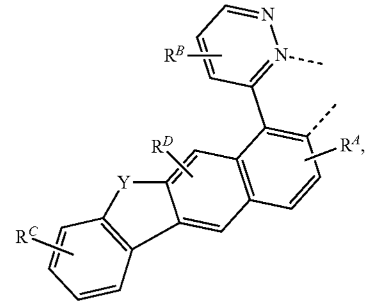
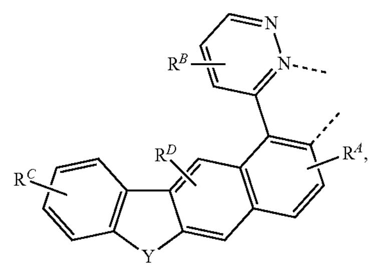
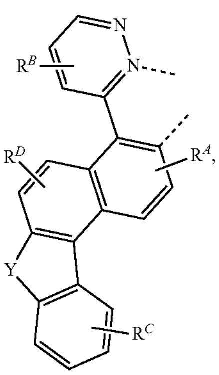
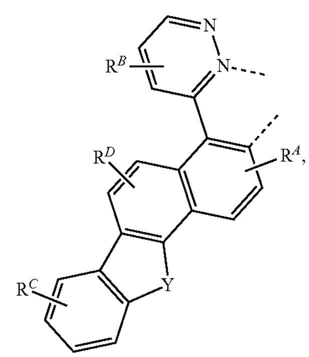
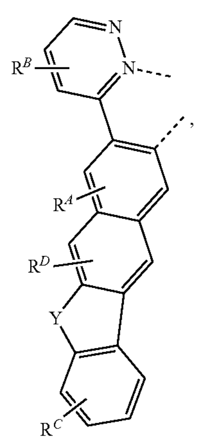
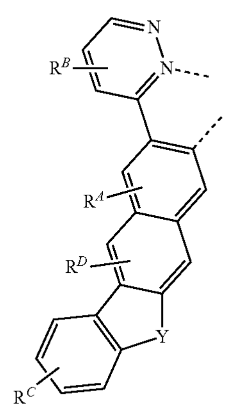

-continued
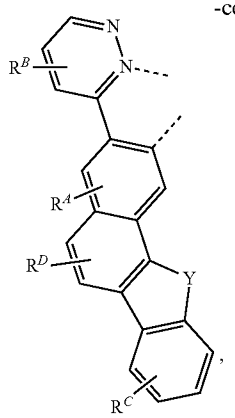
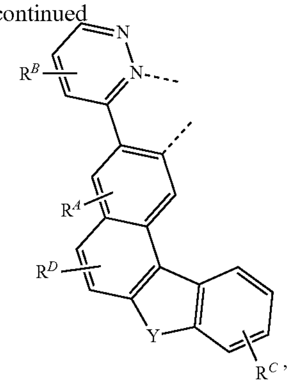
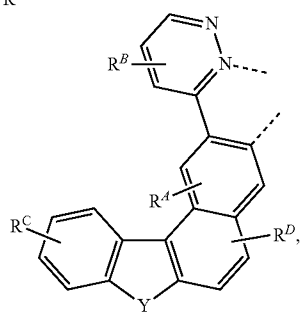
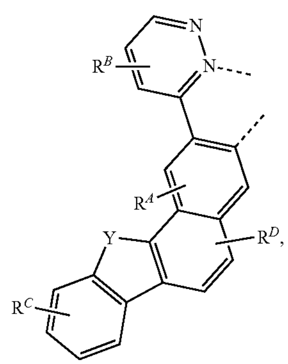
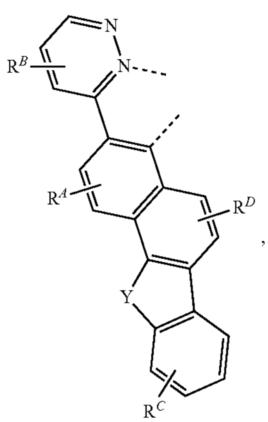
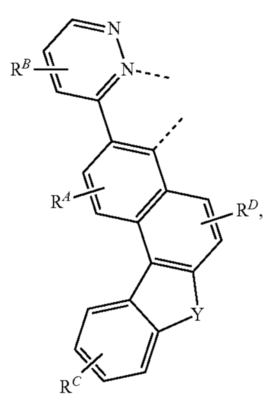
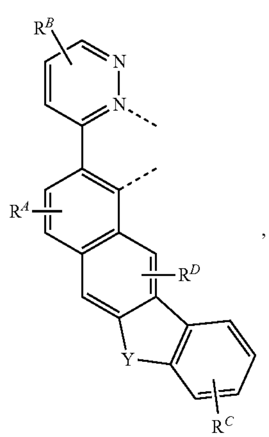
-continued
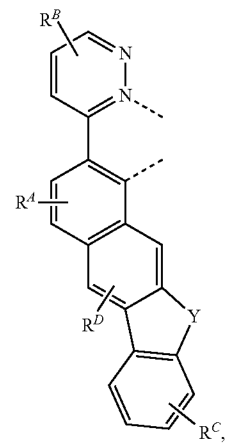
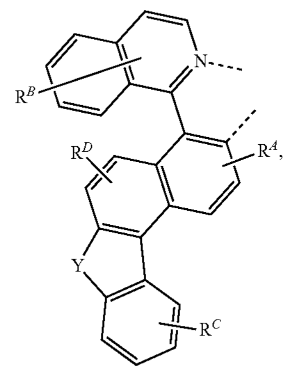
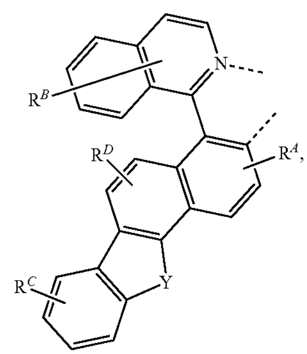
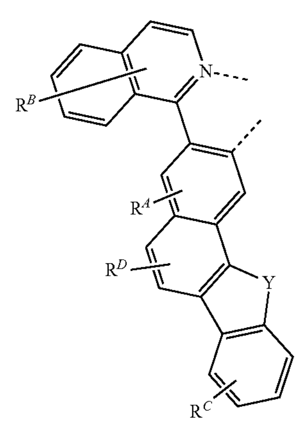

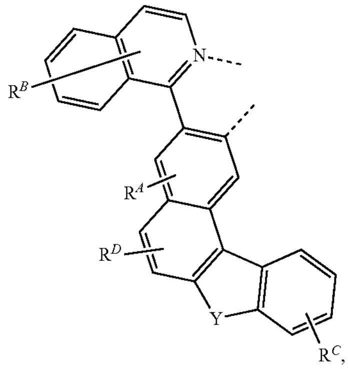
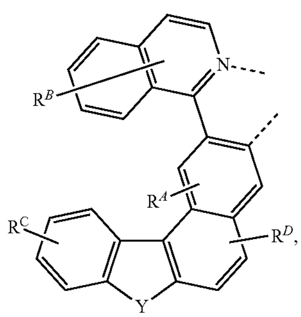
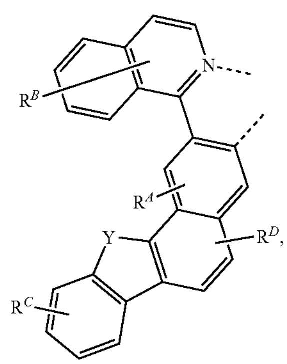
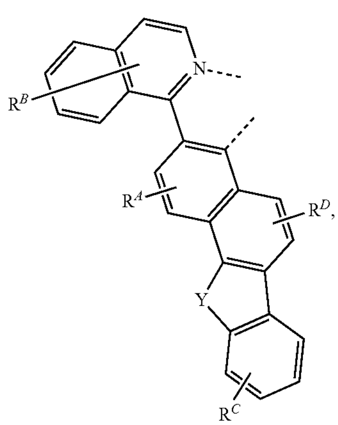
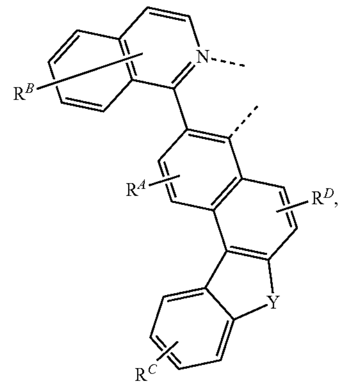
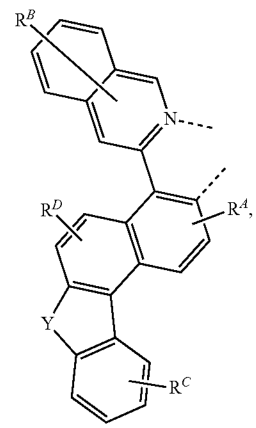
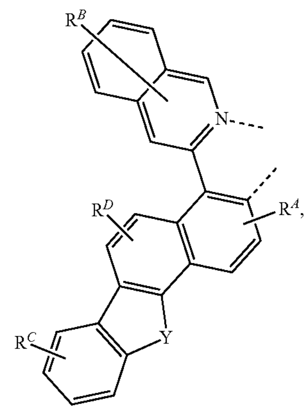
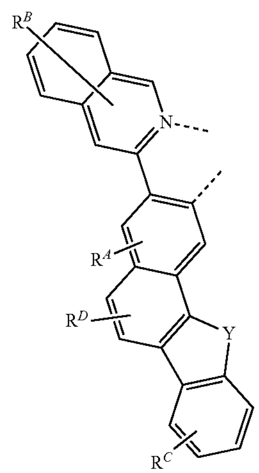
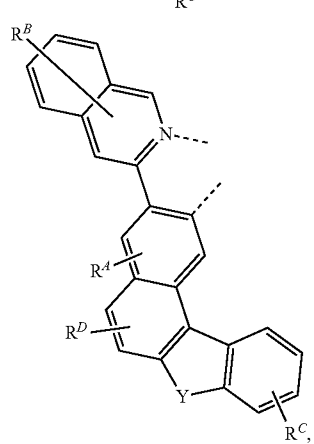

-continued
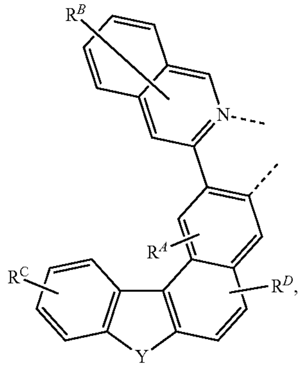
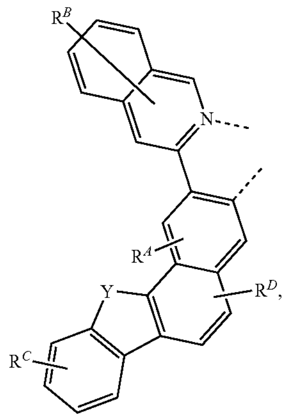
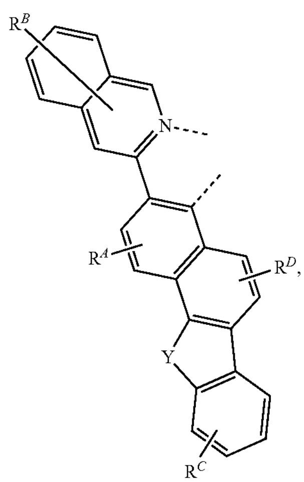
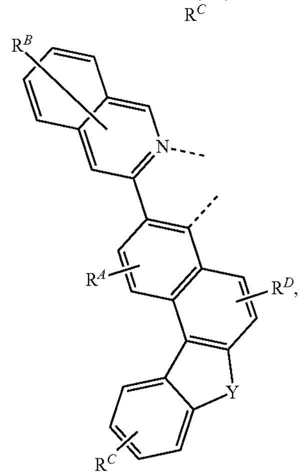
-continued
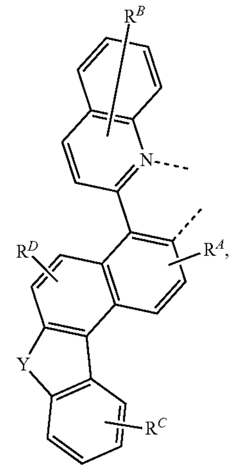
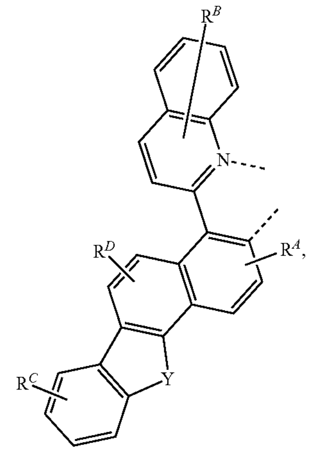
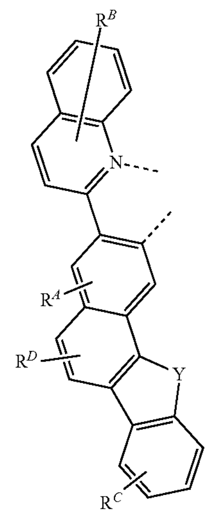
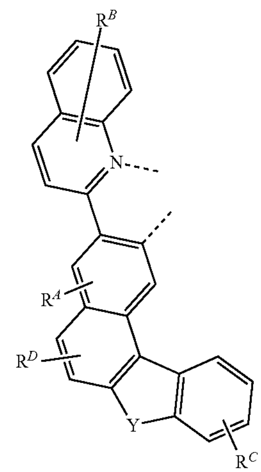
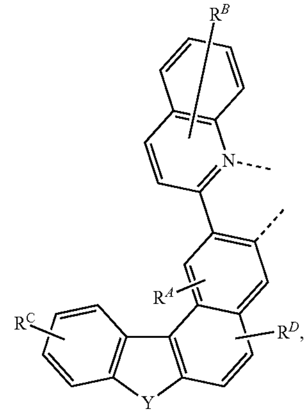

-continued
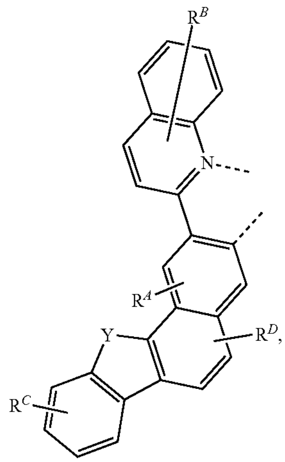
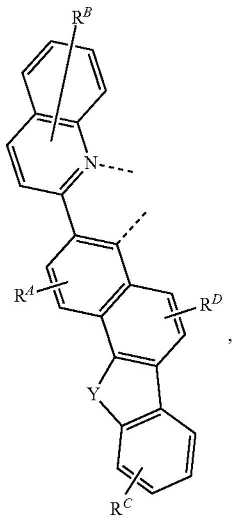
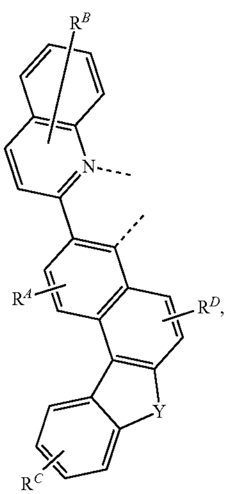
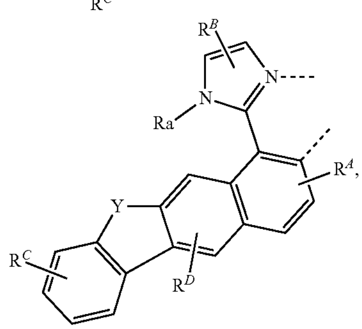
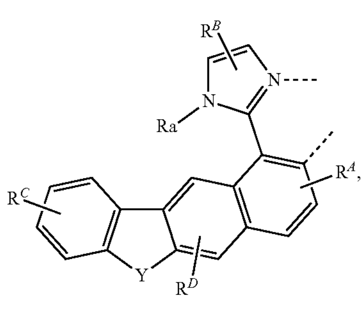
-continued
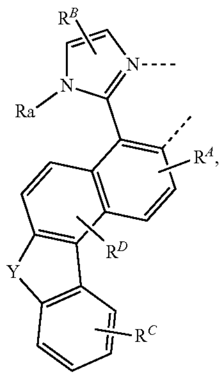
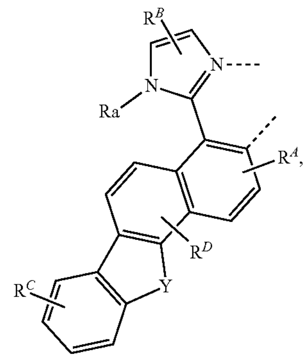
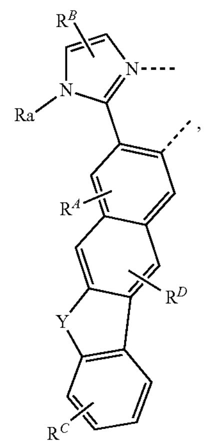
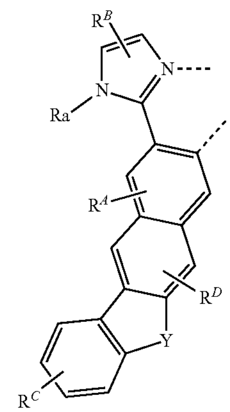
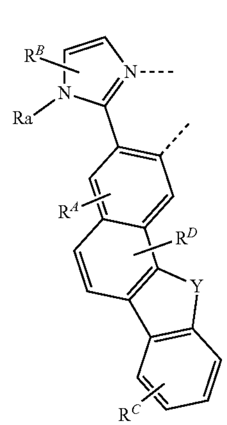
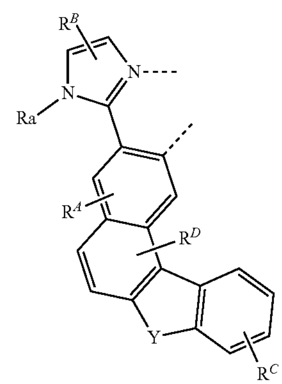
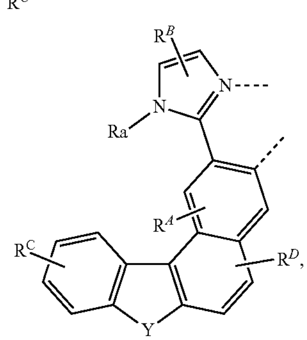

-continued
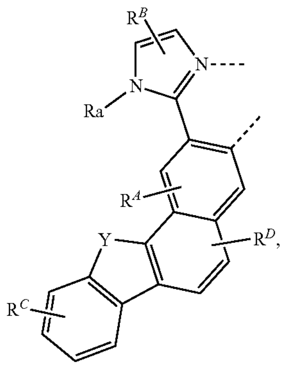
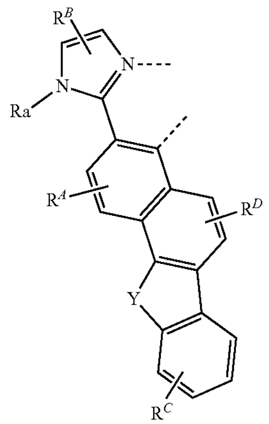
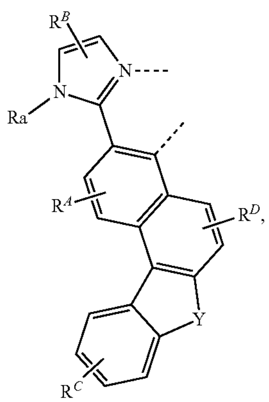
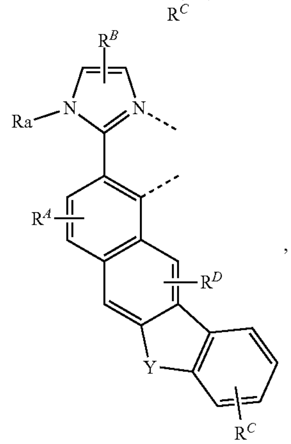
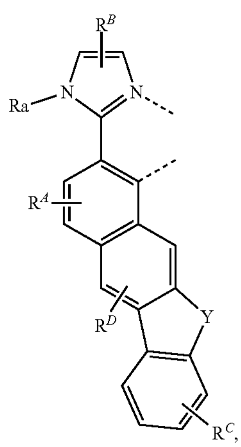
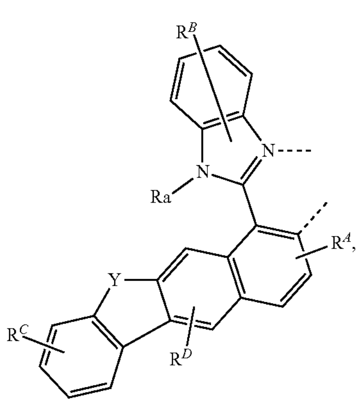
-continued
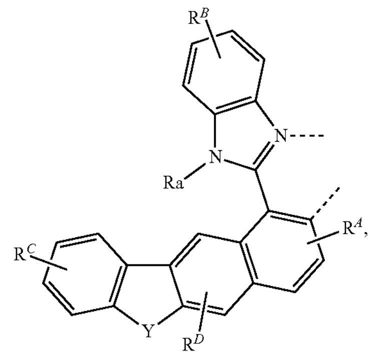
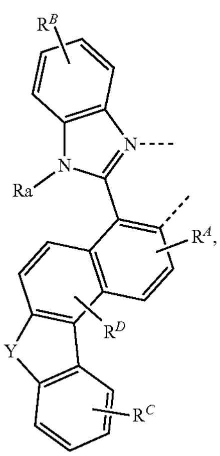
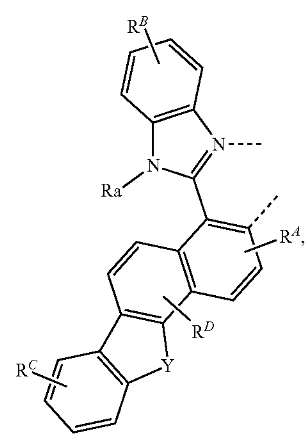
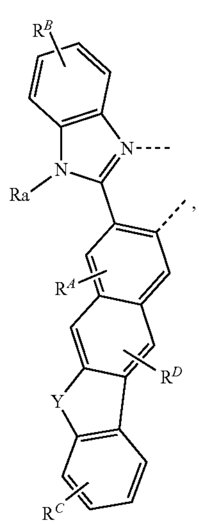
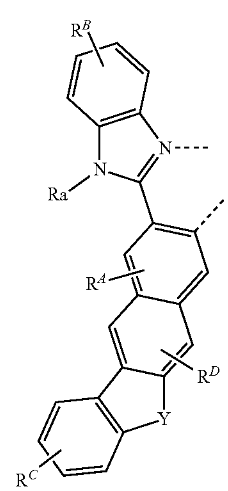

-continued
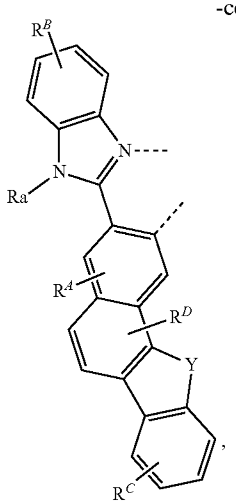
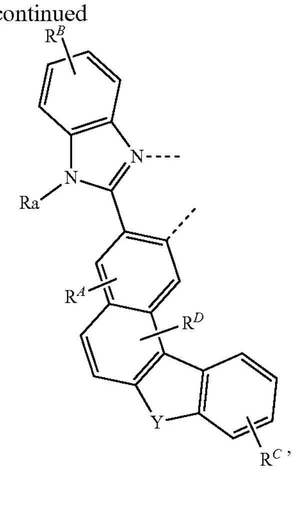
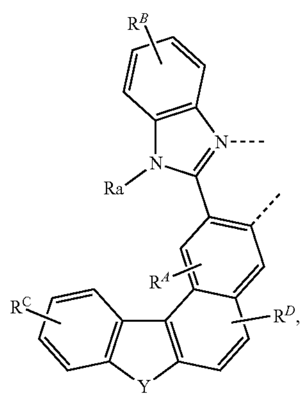
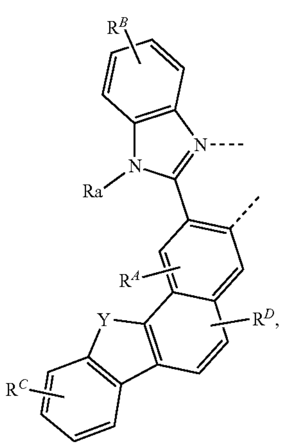
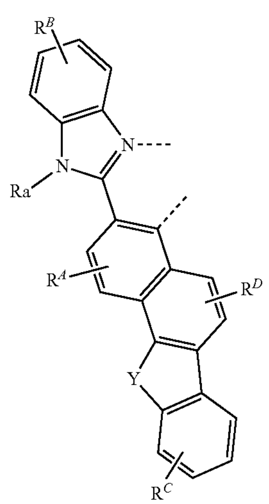
-continued
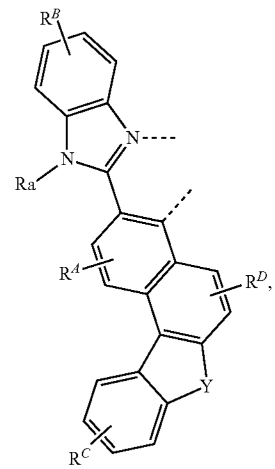
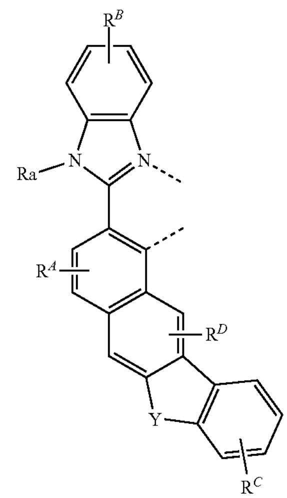
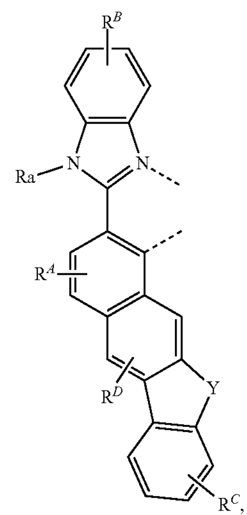
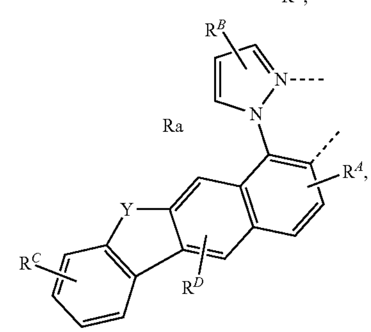
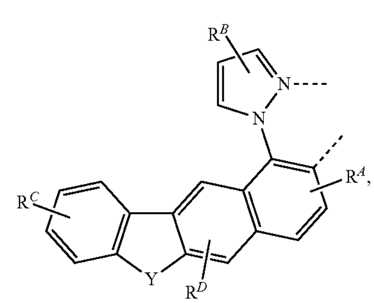

-continued
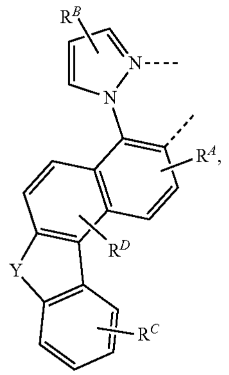
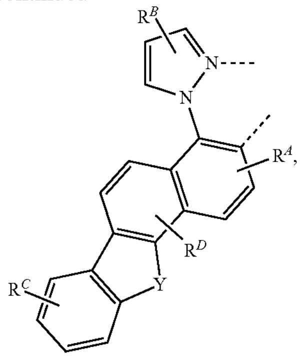
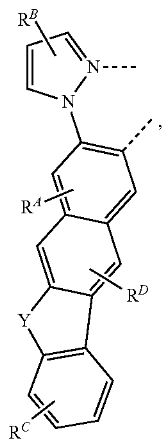
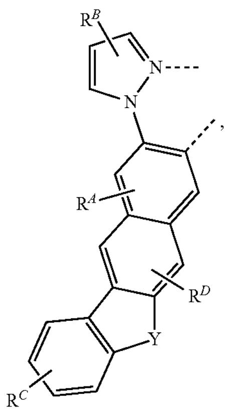
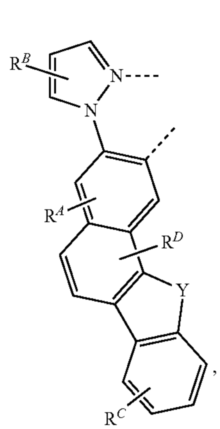
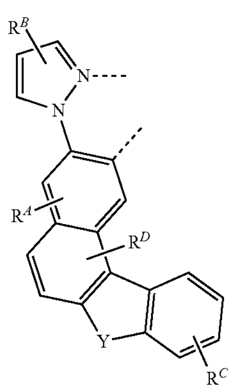
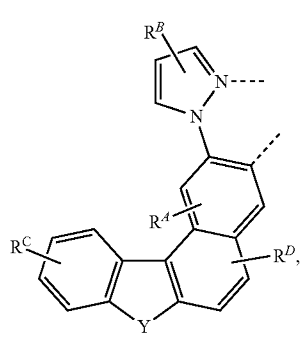
-continued
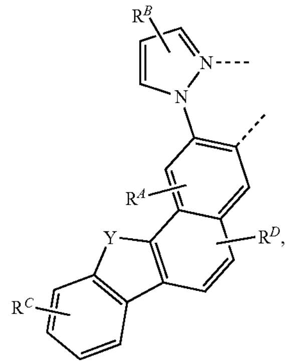
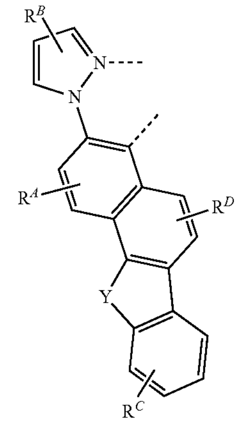
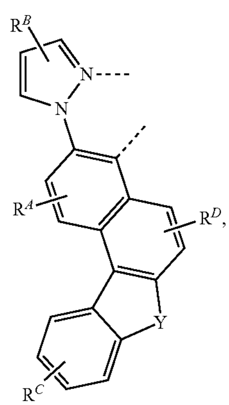
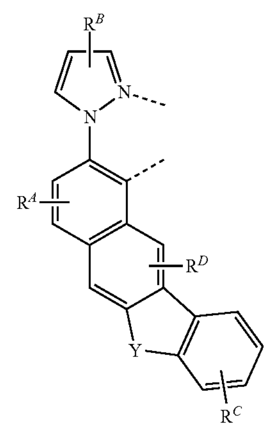
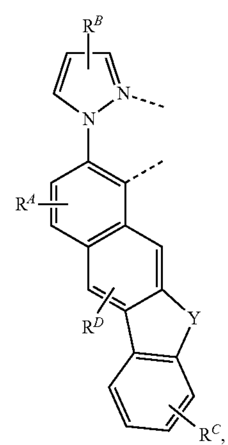
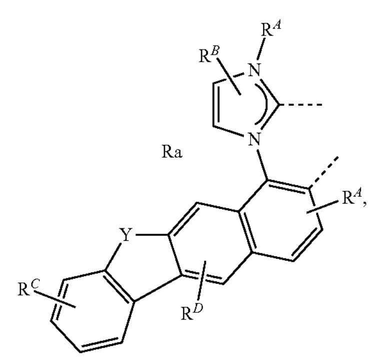

-continued
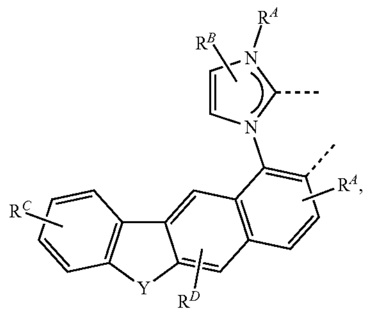
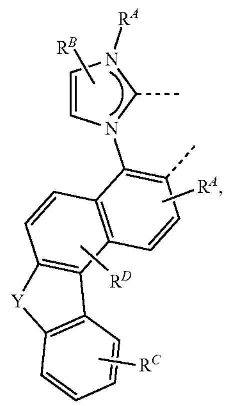
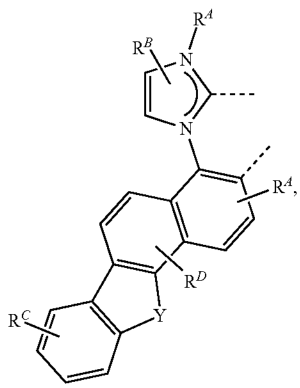
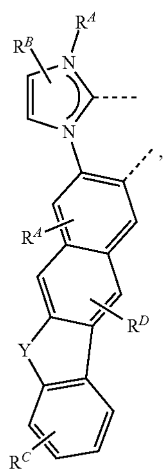
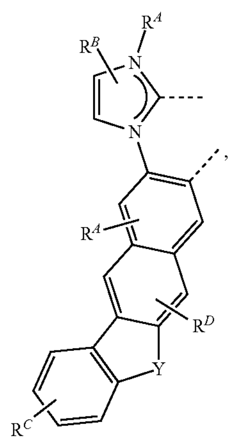
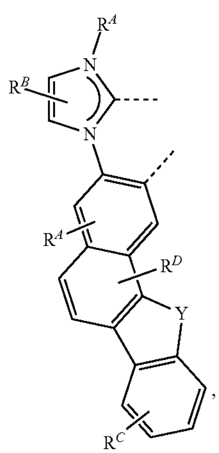
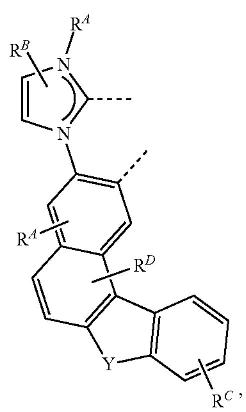
-continued
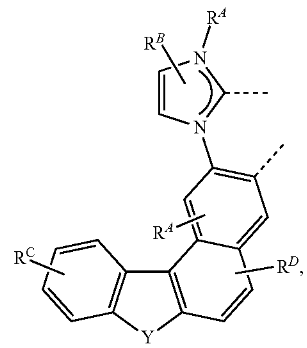
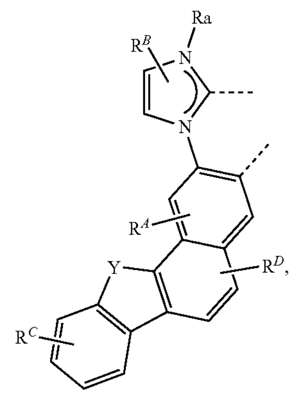
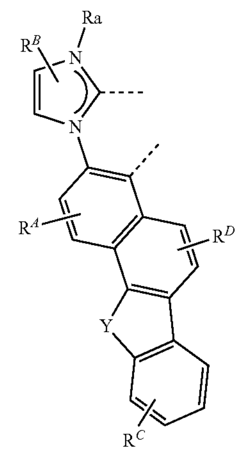
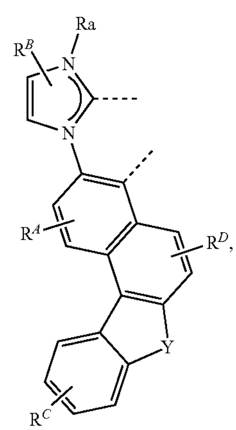
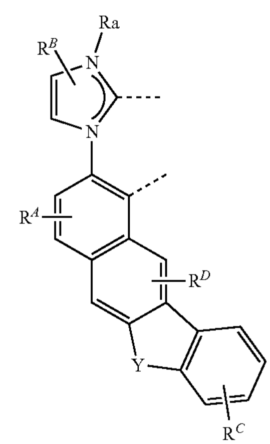
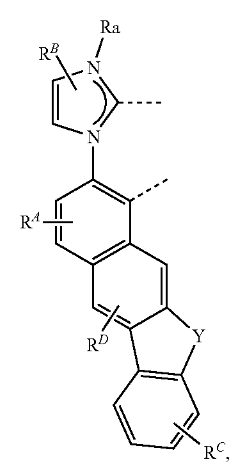

-continued
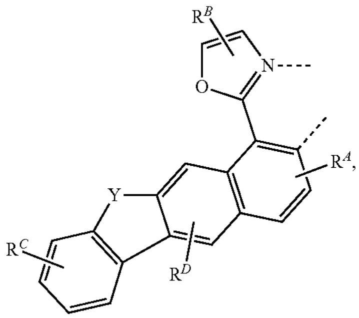
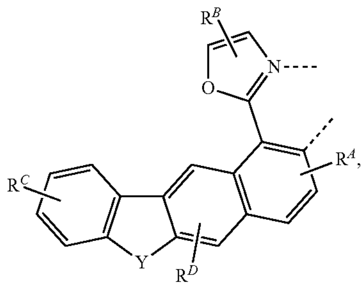
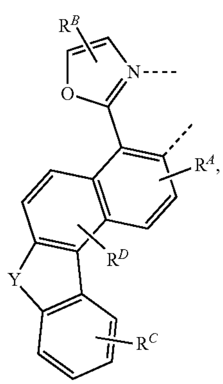
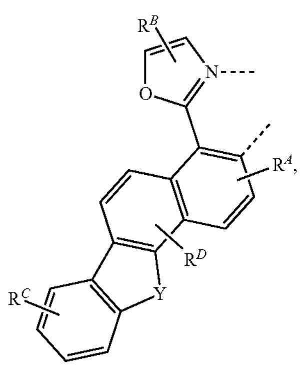
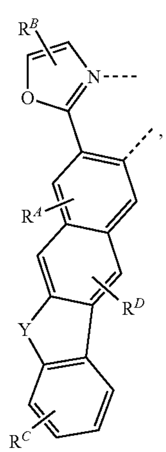
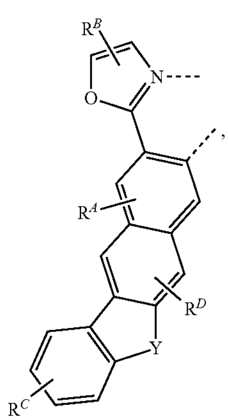
-continued
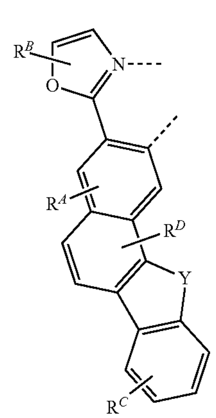
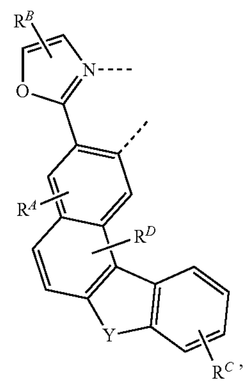
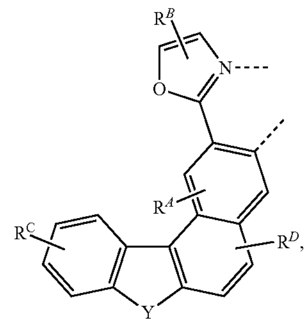
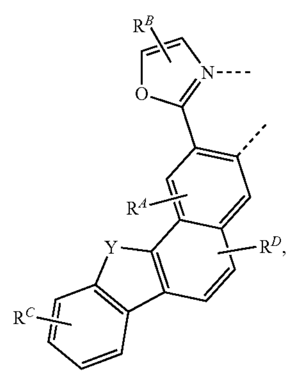
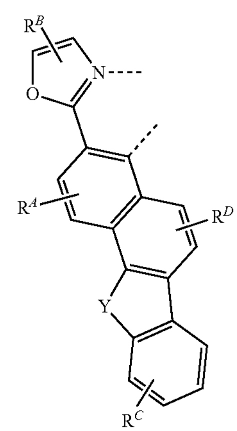
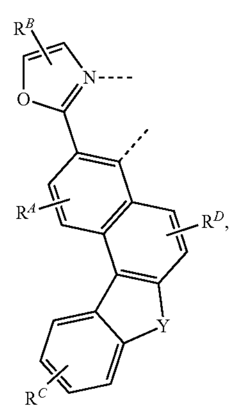
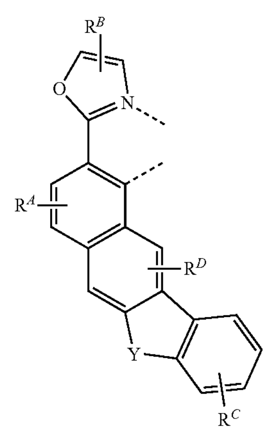

-continued
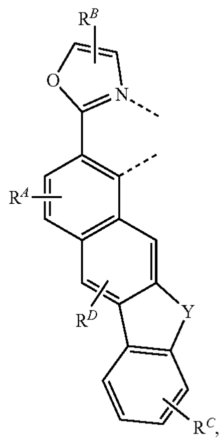
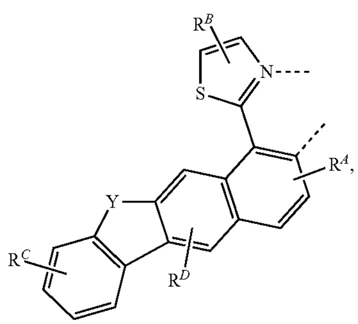
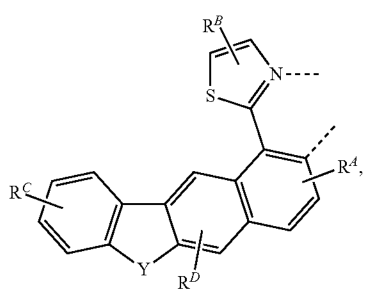
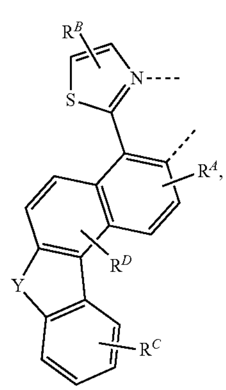
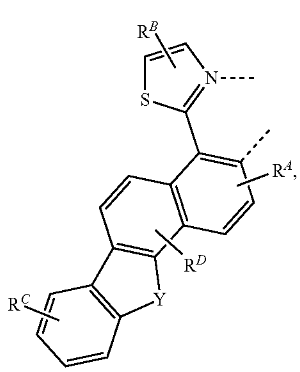
-continued
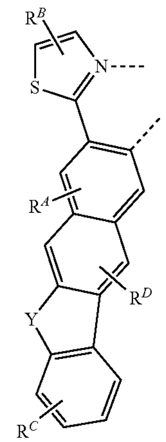
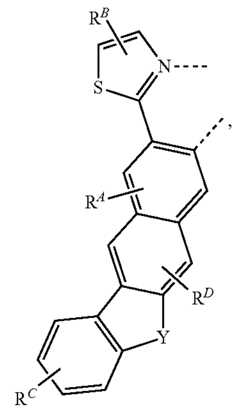
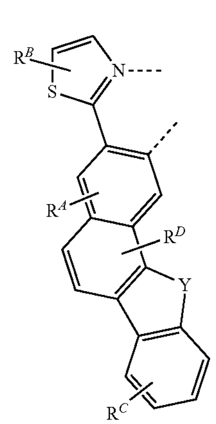
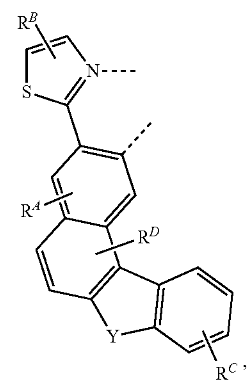
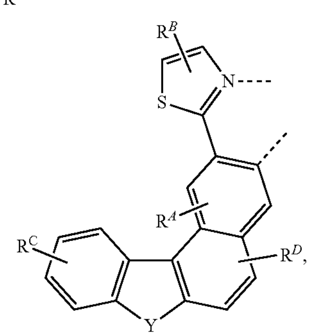
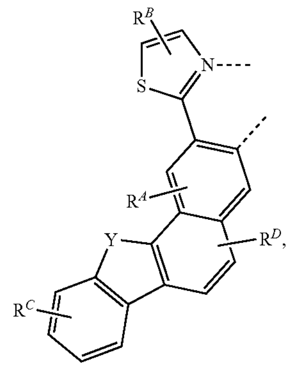
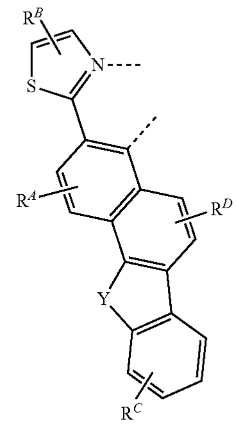

-continued
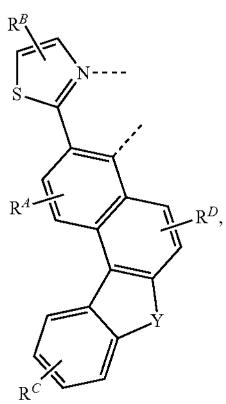
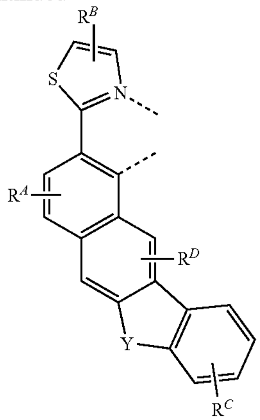
,
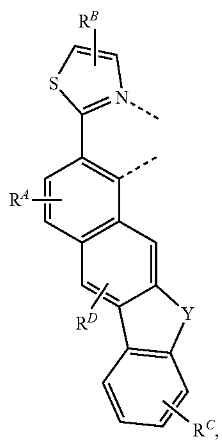
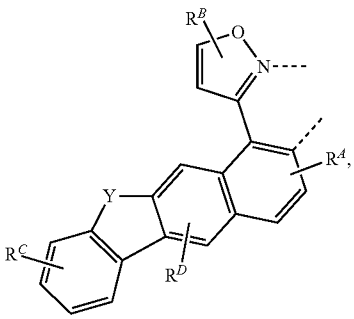
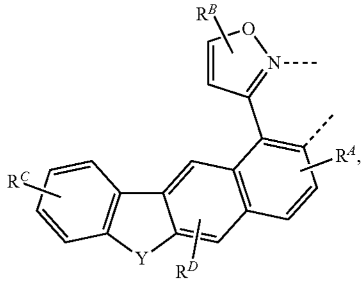
-continued
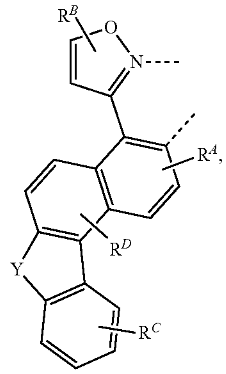
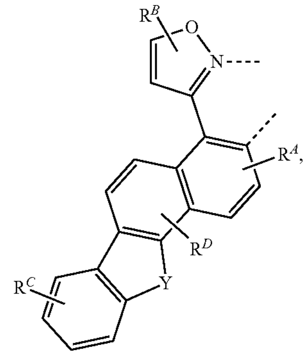
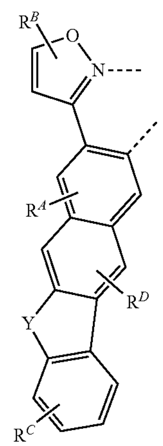
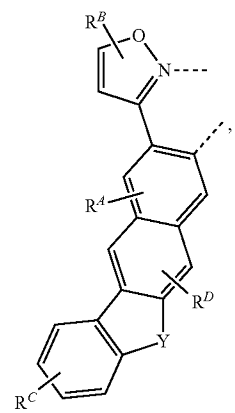
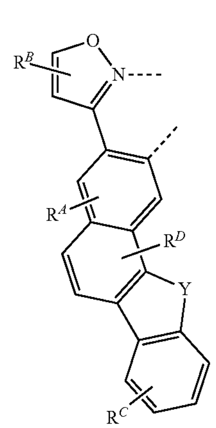
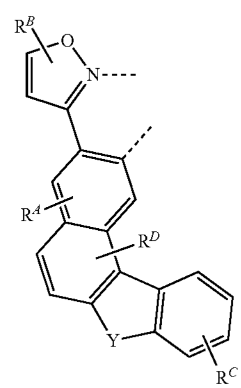
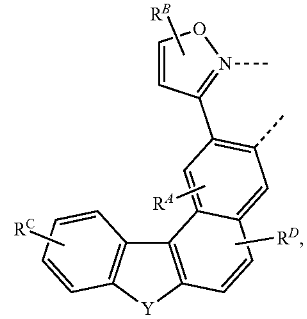

-continued

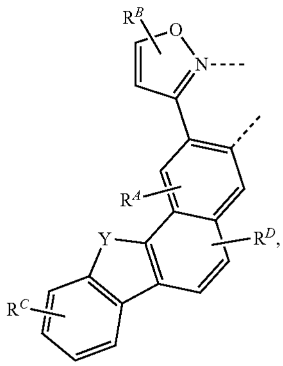

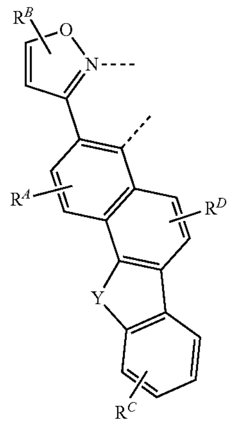

,

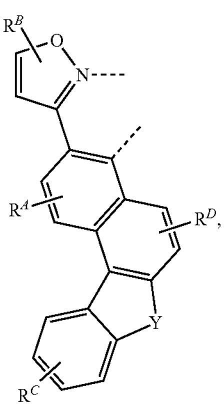

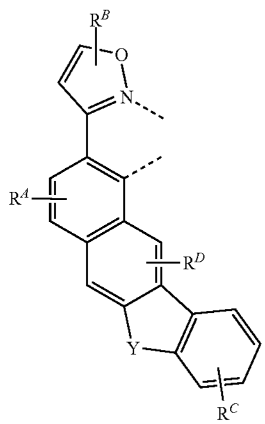

,

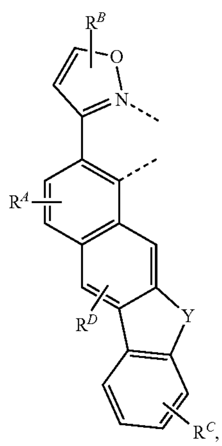

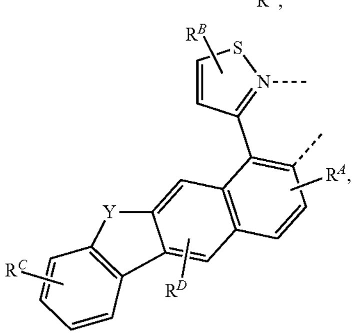

-continued

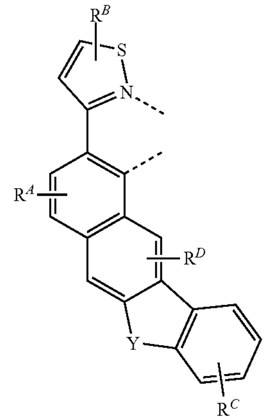

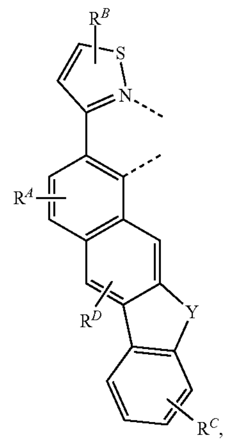

and aza variants thereof; and wherein Ra is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

9. The compound of claim 1, wherein the first ligand $L_A$ is selected from the group consisting of $L_{A121}$ through $L_{A456}$, $L_{A577}$ through $L_{A2736}$, $L_{A2857}$ through $L_{A4104}$, and $L_{A4225}$ through $L_{A4780}$, wherein $L_{A121}$ through $L_{A240}$ have a structure of Formula II:

Formula II

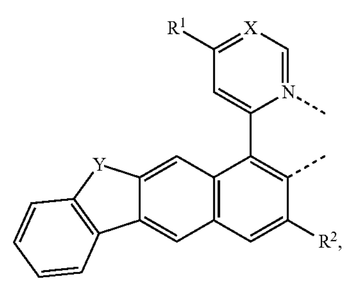

wherein $R^1$, $R^2$, X, and Y are defined as:

| Ligand | $R^1$ | $R^2$ | X | Y |
|---|---|---|---|---|
| $L_{A121}$ | H | H | N | S |
| $L_{A122}$ | $R_{B1}$ | H | N | S |
| $L_{A123}$ | $R_{B3}$ | H | N | S |
| $L_{A124}$ | $R_{B4}$ | H | N | S |
| $L_{A125}$ | $R_{B7}$ | H | N | S |
| $L_{A126}$ | $R_{B10}$ | H | N | S |
| $L_{A127}$ | $R_{A3}$ | H | N | S |
| $L_{A128}$ | $R_{A34}$ | H | N | S |
| $L_{A129}$ | H | H | N | O |
| $L_{A130}$ | $R_{B1}$ | H | N | O |
| $L_{A131}$ | $R_{B3}$ | H | N | O |
| $L_{A132}$ | $R_{B4}$ | H | N | O |
| $L_{A133}$ | $R_{B7}$ | H | N | O |
| $L_{A134}$ | $R_{B10}$ | H | N | O |
| $L_{A135}$ | $R_{A3}$ | H | N | O |
| $L_{A136}$ | $R_{A34}$ | H | N | O |
| $L_{A137}$ | H | H | N | $NCH_3$ |
| $L_{A138}$ | $R_{B1}$ | H | N | $NCH_3$ |
| $L_{A139}$ | $R_{B3}$ | H | N | $NCH_3$ |
| $L_{A140}$ | $R_{B4}$ | H | N | $NCH_3$ |
| $L_{A141}$ | $R_{B7}$ | H | N | $NCH_3$ |
| $L_{A142}$ | $R_{B10}$ | H | N | $NCH_3$ |
| $L_{A143}$ | $R_{A3}$ | H | N | $NCH_3$ |
| $L_{A144}$ | $R_{A34}$ | H | N | $NCH_3$ |
| $L_{A145}$ | H | H | N | $C(CH_3)_2$ |
| $L_{A146}$ | $R_{B1}$ | H | N | $C(CH_3)_2$ |
| $L_{A147}$ | $R_{B3}$ | H | N | $C(CH_3)_2$ |
| $L_{A148}$ | $R_{B4}$ | H | N | $C(CH_3)_2$ |
| $L_{A149}$ | $R_{B7}$ | H | N | $C(CH_3)_2$ |
| $L_{A150}$ | $R_{B10}$ | H | N | $C(CH_3)_2$ |
| $L_{A151}$ | $R_{A3}$ | H | N | $C(CH_3)_2$ |
| $L_{A152}$ | $R_{A34}$ | H | N | $C(CH_3)_2$ |
| $L_{A153}$ | H | H | N | $Si(CH_3)_2$ |
| $L_{A154}$ | $R_{B1}$ | H | N | $Si(CH_3)_2$ |
| $L_{A155}$ | $R_{B3}$ | H | N | $Si(CH_3)_2$ |
| $L_{A156}$ | $R_{B4}$ | H | N | $Si(CH_3)_2$ |
| $L_{A157}$ | $R_{B7}$ | H | N | $Si(CH_3)_2$ |
| $L_{A158}$ | $R_{B10}$ | H | N | $Si(CH_3)_2$ |
| $L_{A159}$ | $R_{A3}$ | H | N | $Si(CH_3)_2$ |
| $L_{A160}$ | $R_{A34}$ | H | N | $Si(CH_3)_2$ |
| $L_{A161}$ | H | $R_{B1}$ | N | S |
| $L_{A162}$ | $R_{B1}$ | $R_{B1}$ | N | S |
| $L_{A163}$ | $R_{B3}$ | $R_{B1}$ | N | S |
| $L_{A164}$ | $R_{B4}$ | $R_{B1}$ | N | S |
| $L_{A165}$ | $R_{B7}$ | $R_{B1}$ | N | S |
| $L_{A166}$ | $R_{B10}$ | $R_{B1}$ | N | S |
| $L_{A167}$ | $R_{A3}$ | $R_{B1}$ | N | S |
| $L_{A168}$ | $R_{A34}$ | $R_{B1}$ | N | S |
| $L_{A169}$ | H | $R_{B1}$ | N | O |
| $L_{A170}$ | $R_{B1}$ | $R_{B1}$ | N | O |
| $L_{A171}$ | $R_{B3}$ | $R_{B1}$ | N | O |
| $L_{A172}$ | $R_{B4}$ | $R_{B1}$ | N | O |
| $L_{A173}$ | $R_{B7}$ | $R_{B1}$ | N | O |
| $L_{A174}$ | $R_{B10}$ | $R_{B1}$ | N | O |
| $L_{A175}$ | $R_{A3}$ | $R_{B1}$ | N | O |
| $L_{A176}$ | $R_{A34}$ | $R_{B1}$ | N | O |
| $L_{A177}$ | H | $R_{B1}$ | N | $NCH_3$ |
| $L_{A178}$ | $R_{B1}$ | $R_{B1}$ | N | $NCH_3$ |
| $L_{A179}$ | $R_{B3}$ | $R_{B1}$ | N | $NCH_3$ |
| $L_{A180}$ | $R_{B4}$ | $R_{B1}$ | N | $NCH_3$ |
| $L_{A181}$ | $R_{B7}$ | $R_{B1}$ | N | $NCH_3$ |
| $L_{A182}$ | $R_{B10}$ | $R_{B1}$ | N | $NCH_3$ |
| $L_{A183}$ | $R_{A3}$ | $R_{B1}$ | N | $NCH_3$ |
| $L_{A184}$ | $R_{A34}$ | $R_{B1}$ | N | $NCH_3$ |
| $L_{A185}$ | H | $R_{B1}$ | N | $C(CH_3)_2$ |
| $L_{A186}$ | $R_{B1}$ | $R_{B1}$ | N | $C(CH_3)_2$ |
| $L_{A187}$ | $R_{B3}$ | $R_{B1}$ | N | $C(CH_3)_2$ |
| $L_{A188}$ | $R_{B4}$ | $R_{B1}$ | N | $C(CH_3)_2$ |
| $L_{A189}$ | $R_{B7}$ | $R_{B1}$ | N | $C(CH_3)_2$ |
| $L_{A190}$ | $R_{B10}$ | $R_{B1}$ | N | $C(CH_3)_2$ |
| $L_{A191}$ | $R_{A3}$ | $R_{B1}$ | N | $C(CH_3)_2$ |
| $L_{A192}$ | $R_{A34}$ | $R_{B1}$ | N | $C(CH_3)_2$ |
| $L_{A193}$ | H | $R_{B1}$ | N | $Si(CH_3)_2$ |
| $L_{A194}$ | $R_{B1}$ | $R_{B1}$ | N | $Si(CH_3)_2$ |
| $L_{A195}$ | $R_{B3}$ | $R_{B1}$ | N | $Si(CH_3)_2$ |
| $L_{A196}$ | $R_{B4}$ | $R_{B1}$ | N | $Si(CH_3)_2$ |

-continued

| Ligand | $R^1$ | $R^2$ | X | Y |
|---|---|---|---|---|
| $L_{A197}$ | $R_{B7}$ | $R_{B1}$ | N | $Si(CH_3)_2$ |
| $L_{A198}$ | $R_{B10}$ | $R_{B1}$ | N | $Si(CH_3)_2$ |
| $L_{A199}$ | $R_{A3}$ | $R_{B1}$ | N | $Si(CH_3)_2$ |
| $L_{A200}$ | $R_{A34}$ | $R_{B1}$ | N | $Si(CH_3)_2$ |
| $L_{A201}$ | H | $R_{B2}$ | N | S |
| $L_{A202}$ | $R_{B1}$ | $R_{B2}$ | N | S |
| $L_{A203}$ | $R_{B3}$ | $R_{B2}$ | N | S |
| $L_{A204}$ | $R_{B4}$ | $R_{B2}$ | N | S |
| $L_{A205}$ | $R_{B7}$ | $R_{B2}$ | N | S |
| $L_{A206}$ | $R_{B10}$ | $R_{B2}$ | N | S |
| $L_{A207}$ | $R_{A3}$ | $R_{B2}$ | N | S |
| $L_{A208}$ | $R_{A34}$ | $R_{B2}$ | N | S |
| $L_{A209}$ | H | $R_{B2}$ | N | O |
| $L_{A210}$ | $R_{B1}$ | $R_{B2}$ | N | O |
| $L_{A211}$ | $R_{B3}$ | $R_{B2}$ | N | O |
| $L_{A212}$ | $R_{B4}$ | $R_{B2}$ | N | O |
| $L_{A213}$ | $R_{B7}$ | $R_{B2}$ | N | O |
| $L_{A214}$ | $R_{B10}$ | $R_{B2}$ | N | O |
| $L_{A215}$ | $R_{A3}$ | $R_{B2}$ | N | O |
| $L_{A216}$ | $R_{A34}$ | $R_{B2}$ | N | O |
| $L_{A217}$ | H | $R_{B2}$ | N | $NCH_3$ |
| $L_{A218}$ | $R_{B1}$ | $R_{B2}$ | N | $NCH_3$ |
| $L_{A219}$ | $R_{B3}$ | $R_{B2}$ | N | $NCH_3$ |
| $L_{A220}$ | $R_{B4}$ | $R_{B2}$ | N | $NCH_3$ |
| $L_{A221}$ | $R_{B7}$ | $R_{B2}$ | N | $NCH_3$ |
| $L_{A222}$ | $R_{B10}$ | $R_{B2}$ | N | $NCH_3$ |
| $L_{A223}$ | $R_{A3}$ | $R_{B2}$ | N | $NCH_3$ |
| $L_{A224}$ | $R_{A34}$ | $R_{B2}$ | N | $NCH_3$ |
| $L_{A225}$ | H | $R_{B2}$ | N | $C(CH_3)_2$ |
| $L_{A226}$ | $R_{B1}$ | $R_{B2}$ | N | $C(CH_3)_2$ |
| $L_{A227}$ | $R_{B3}$ | $R_{B2}$ | N | $C(CH_3)_2$ |
| $L_{A228}$ | $R_{B4}$ | $R_{B2}$ | N | $C(CH_3)_2$ |
| $L_{A229}$ | $R_{B7}$ | $R_{B2}$ | N | $C(CH_3)_2$ |
| $L_{A230}$ | $R_{B10}$ | $R_{B2}$ | N | $C(CH_3)_2$ |
| $L_{A231}$ | $R_{A3}$ | $R_{B2}$ | N | $C(CH_3)_2$ |
| $L_{A232}$ | $R_{A34}$ | $R_{B2}$ | N | $C(CH_3)_2$ |
| $L_{A233}$ | H | $R_{B2}$ | N | $Si(CH_3)_2$ |
| $L_{A234}$ | $R_{B1}$ | $R_{B2}$ | N | $Si(CH_3)_2$ |
| $L_{A235}$ | $R_{B3}$ | $R_{B2}$ | N | $Si(CH_3)_2$ |
| $L_{A236}$ | $R_{B4}$ | $R_{B2}$ | N | $Si(CH_3)_2$ |
| $L_{A237}$ | $R_{B7}$ | $R_{B2}$ | N | $Si(CH_3)_2$ |
| $L_{A238}$ | $R_{B10}$ | $R_{B2}$ | N | $Si(CH_3)_2$ |
| $L_{A239}$ | $R_{A3}$ | $R_{B2}$ | N | $Si(CH_3)_2$ |
| $L_{A240}$ | $R_{A34}$ | $R_{B2}$ | N | $Si(CH_3)_2$ |

wherein $L_{A241}$ through $L_{A360}$ have a structure of Formula III:

Formula III

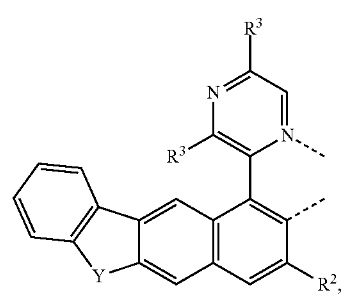

wherein $R^2$, $R^3$ and Y are defined as provided below:

| Ligand | $R^2$ | $R^3$ | Y |
|---|---|---|---|
| $L_{A241}$ | H | H | S |
| $L_{A242}$ | H | $R_{B1}$ | S |
| $L_{A243}$ | H | $R_{B2}$ | S |
| $L_{A244}$ | H | $R_{B3}$ | S |
| $L_{A245}$ | H | $R_{B4}$ | S |

-continued

| Ligand | $R^2$ | $R^3$ | Y |
|---|---|---|---|
| $L_{A246}$ | H | $R_{B5}$ | S |
| $L_{A247}$ | H | $R_{A34}$ | S |
| $L_{A248}$ | H | $R_{A52}$ | S |
| $L_{A249}$ | H | H | O |
| $L_{A250}$ | H | $R_{B1}$ | O |
| $L_{A251}$ | H | $R_{B2}$ | O |
| $L_{A252}$ | H | $R_{B3}$ | O |
| $L_{A253}$ | H | $R_{B4}$ | O |
| $L_{A254}$ | H | $R_{B5}$ | O |
| $L_{A255}$ | H | $R_{A34}$ | O |
| $L_{A256}$ | H | $R_{A52}$ | O |
| $L_{A257}$ | H | H | $NCH_3$ |
| $L_{A258}$ | H | $R_{B1}$ | $NCH_3$ |
| $L_{A259}$ | H | $R_{B2}$ | $NCH_3$ |
| $L_{A260}$ | H | $R_{B3}$ | $NCH_3$ |
| $L_{A261}$ | H | $R_{B4}$ | $NCH_3$ |
| $L_{A262}$ | H | $R_{B5}$ | $NCH_3$ |
| $L_{A263}$ | H | $R_{A34}$ | $NCH_3$ |
| $L_{A264}$ | H | $R_{A52}$ | $NCH_3$ |
| $L_{A265}$ | H | H | $C(CH_3)_2$ |
| $L_{A266}$ | H | $R_{B1}$ | $C(CH_3)_2$ |
| $L_{A267}$ | H | $R_{B2}$ | $C(CH_3)_2$ |
| $L_{A268}$ | H | $R_{B3}$ | $C(CH_3)_2$ |
| $L_{A269}$ | H | $R_{B4}$ | $C(CH_3)_2$ |
| $L_{A270}$ | H | $R_{B5}$ | $C(CH_3)_2$ |
| $L_{A271}$ | H | $R_{A34}$ | $C(CH_3)_2$ |
| $L_{A272}$ | H | $R_{A52}$ | $C(CH_3)_2$ |
| $L_{A273}$ | H | H | $Si(CH_3)_2$ |
| $L_{A274}$ | H | $R_{B1}$ | $Si(CH_3)_2$ |
| $L_{A275}$ | H | $R_{B2}$ | $Si(CH_3)_2$ |
| $L_{A276}$ | H | $R_{B3}$ | $Si(CH_3)_2$ |
| $L_{A277}$ | H | $R_{B4}$ | $Si(CH_3)_2$ |
| $L_{A278}$ | H | $R_{B5}$ | $Si(CH_3)_2$ |
| $L_{A279}$ | H | $R_{A34}$ | $Si(CH_3)_2$ |
| $L_{A280}$ | H | $R_{A52}$ | $Si(CH_3)_2$ |
| $L_{A281}$ | $R_{B1}$ | H | S |
| $L_{A282}$ | $R_{B1}$ | $R_{B1}$ | S |
| $L_{A283}$ | $R_{B1}$ | $R_{B2}$ | S |
| $L_{A284}$ | $R_{B1}$ | $R_{B3}$ | S |
| $L_{A285}$ | $R_{B1}$ | $R_{B4}$ | S |
| $L_{A286}$ | $R_{B1}$ | $R_{B5}$ | S |
| $L_{A287}$ | $R_{B1}$ | $R_{A34}$ | S |
| $L_{A288}$ | $R_{B1}$ | $R_{A52}$ | S |
| $L_{A289}$ | $R_{B1}$ | H | O |
| $L_{A290}$ | $R_{B1}$ | $R_{B1}$ | O |
| $L_{A291}$ | $R_{B1}$ | $R_{B2}$ | O |
| $L_{A292}$ | $R_{B1}$ | $R_{B3}$ | O |
| $L_{A293}$ | $R_{B1}$ | $R_{B4}$ | O |
| $L_{A294}$ | $R_{B1}$ | $R_{B5}$ | O |
| $L_{A295}$ | $R_{B1}$ | $R_{A34}$ | O |
| $L_{A296}$ | $R_{B1}$ | $R_{A52}$ | O |
| $L_{A297}$ | $R_{B1}$ | H | $NCH_3$ |
| $L_{A298}$ | $R_{B1}$ | $R_{B1}$ | $NCH_3$ |
| $L_{A299}$ | $R_{B1}$ | $R_{B2}$ | $NCH_3$ |
| $L_{A300}$ | $R_{B1}$ | $R_{B3}$ | $NCH_3$ |
| $L_{A301}$ | $R_{B1}$ | $R_{B4}$ | $NCH_3$ |
| $L_{A302}$ | $R_{B1}$ | $R_{B5}$ | $NCH_3$ |
| $L_{A303}$ | $R_{B1}$ | $R_{A34}$ | $NCH_3$ |
| $L_{A304}$ | $R_{B1}$ | $R_{A52}$ | $NCH_3$ |
| $L_{A305}$ | $R_{B1}$ | H | $C(CH_3)_2$ |
| $L_{A306}$ | $R_{B1}$ | $R_{B1}$ | $C(CH_3)_2$ |
| $L_{A307}$ | $R_{B1}$ | $R_{B2}$ | $C(CH_3)_2$ |
| $L_{A308}$ | $R_{B1}$ | $R_{B3}$ | $C(CH_3)_2$ |
| $L_{A309}$ | $R_{B1}$ | $R_{B4}$ | $C(CH_3)_2$ |
| $L_{A310}$ | $R_{B1}$ | $R_{B5}$ | $C(CH_3)_2$ |
| $L_{A311}$ | $R_{B1}$ | $R_{A34}$ | $C(CH_3)_2$ |
| $L_{A312}$ | $R_{B1}$ | $R_{A52}$ | $C(CH_3)_2$ |
| $L_{A313}$ | $R_{B1}$ | H | $Si(CH_3)_2$ |
| $L_{A314}$ | $R_{B1}$ | $R_{B1}$ | $Si(CH_3)_2$ |
| $L_{A315}$ | $R_{B1}$ | $R_{B2}$ | $Si(CH_3)_2$ |
| $L_{A316}$ | $R_{B1}$ | $R_{B3}$ | $Si(CH_3)_2$ |
| $L_{A317}$ | $R_{B1}$ | $R_{B4}$ | $Si(CH_3)_2$ |
| $L_{A318}$ | $R_{B1}$ | $R_{B5}$ | $Si(CH_3)_2$ |
| $L_{A319}$ | $R_{B1}$ | $R_{A34}$ | $Si(CH_3)_2$ |
| $L_{A320}$ | $R_{B1}$ | $R_{A52}$ | $Si(CH_3)_2$ |
| $L_{A321}$ | $R_{B2}$ | H | S |
| $L_{A322}$ | $R_{B2}$ | $R_{B1}$ | S |

-continued

| Ligand | $R^2$ | $R^3$ | Y |
|---|---|---|---|
| $L_{A323}$ | $R_{B2}$ | $R_{B2}$ | S |
| $L_{A324}$ | $R_{B2}$ | $R_{B3}$ | S |
| $L_{A325}$ | $R_{B2}$ | $R_{B4}$ | S |
| $L_{A326}$ | $R_{B2}$ | $R_{B5}$ | S |
| $L_{A327}$ | $R_{B2}$ | $R_{A34}$ | S |
| $L_{A328}$ | $R_{B2}$ | $R_{A52}$ | S |
| $L_{A329}$ | $R_{B2}$ | H | O |
| $L_{A330}$ | $R_{B2}$ | $R_{B1}$ | O |
| $L_{A331}$ | $R_{B2}$ | $R_{B2}$ | O |
| $L_{A332}$ | $R_{B2}$ | $R_{B3}$ | O |
| $L_{A333}$ | $R_{B2}$ | $R_{B4}$ | O |
| $L_{A334}$ | $R_{B2}$ | $R_{B5}$ | O |
| $L_{A335}$ | $R_{B2}$ | $R_{A34}$ | O |
| $L_{A336}$ | $R_{B2}$ | $R_{A52}$ | O |
| $L_{A337}$ | $R_{B2}$ | H | $NCH_3$ |
| $L_{A338}$ | $R_{B2}$ | $R_{B1}$ | $NCH_3$ |
| $L_{A339}$ | $R_{B2}$ | $R_{B2}$ | $NCH_3$ |
| $L_{A340}$ | $R_{B2}$ | $R_{B3}$ | $NCH_3$ |
| $L_{A341}$ | $R_{B2}$ | $R_{B4}$ | $NCH_3$ |
| $L_{A342}$ | $R_{B2}$ | $R_{B5}$ | $NCH_3$ |
| $L_{A343}$ | $R_{B2}$ | $R_{A34}$ | $NCH_3$ |
| $L_{A344}$ | $R_{B2}$ | $R_{A52}$ | $NCH_3$ |
| $L_{A345}$ | $R_{B2}$ | H | $C(CH_3)_2$ |
| $L_{A346}$ | $R_{B2}$ | $R_{B1}$ | $C(CH_3)_2$ |
| $L_{A347}$ | $R_{B2}$ | $R_{B2}$ | $C(CH_3)_2$ |
| $L_{A348}$ | $R_{B2}$ | $R_{B3}$ | $C(CH_3)_2$ |
| $L_{A349}$ | $R_{B2}$ | $R_{B4}$ | $C(CH_3)_2$ |
| $L_{A350}$ | $R_{B2}$ | $R_{B5}$ | $C(CH_3)_2$ |
| $L_{A351}$ | $R_{B2}$ | $R_{A34}$ | $C(CH_3)_2$ |
| $L_{A352}$ | $R_{B2}$ | $R_{A52}$ | $C(CH_3)_2$ |
| $L_{A353}$ | $R_{B2}$ | H | $Si(CH_3)_2$ |
| $L_{A354}$ | $R_{B2}$ | $R_{B1}$ | $Si(CH_3)_2$ |
| $L_{A355}$ | $R_{B2}$ | $R_{B2}$ | $Si(CH_3)_2$ |
| $L_{A356}$ | $R_{B2}$ | $R_{B3}$ | $Si(CH_3)_2$ |
| $L_{A357}$ | $R_{B2}$ | $R_{B4}$ | $Si(CH_3)_2$ |
| $L_{A358}$ | $R_{B2}$ | $R_{B5}$ | $Si(CH_3)_2$ |
| $L_{A359}$ | $R_{B2}$ | $R_{A34}$ | $Si(CH_3)_2$ |
| $L_{A360}$ | $R_{B2}$ | $R_{A52}$ | $Si(CH_3)_2$ |

wherein $L_{A361}$ through $L_{A456}$ have a structure of Formula IV,

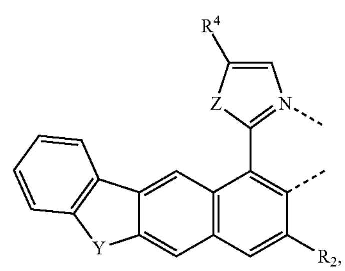

wherein $R^2$, $R^4$, Y, and X are defined as provided below:

| Ligand | $R^2$ | $R^4$ | Y | Z |
|---|---|---|---|---|
| $L_{A361}$ | H | H | S | S |
| $L_{A362}$ | H | $R_{B1}$ | S | S |
| $L_{A363}$ | H | $R_{B3}$ | S | S |
| $L_{A364}$ | H | $R_{B4}$ | S | S |
| $L_{A365}$ | H | $R_{B7}$ | S | S |
| $L_{A366}$ | H | $R_{B10}$ | S | S |
| $L_{A367}$ | H | $R_{A3}$ | S | S |
| $L_{A368}$ | H | $R_{A34}$ | S | S |
| $L_{A369}$ | H | H | S | O |
| $L_{A370}$ | H | $R_{B1}$ | S | O |
| $L_{A371}$ | H | $R_{B3}$ | S | O |
| $L_{A372}$ | H | $R_{B4}$ | S | O |
| $L_{A373}$ | H | $R_{B7}$ | S | O |

-continued

| Ligand | $R^2$ | $R^4$ | Y | Z |
|---|---|---|---|---|
| $L_{A374}$ | H | $R_{B10}$ | S | O |
| $L_{A375}$ | H | $R_{A3}$ | S | O |
| $L_{A376}$ | H | $R_{A34}$ | S | O |
| $L_{A377}$ | H | H | S | $NCH_3$ |
| $L_{A378}$ | H | $R_{B1}$ | S | $NCH_3$ |
| $L_{A379}$ | H | $R_{B3}$ | S | $NCH_3$ |
| $L_{A380}$ | H | $R_{B4}$ | S | $NCH_3$ |
| $L_{A381}$ | H | $R_{B7}$ | S | $NCH_3$ |
| $L_{A382}$ | H | $R_{B10}$ | S | $NCH_3$ |
| $L_{A383}$ | H | $R_{A3}$ | S | $NCH_3$ |
| $L_{A384}$ | H | $R_{A34}$ | S | $NCH_3$ |
| $L_{A385}$ | H | H | O | S |
| $L_{A386}$ | H | $R_{B1}$ | O | S |
| $L_{A387}$ | H | $R_{B3}$ | O | S |
| $L_{A388}$ | H | $R_{B4}$ | O | S |
| $L_{A389}$ | H | $R_{B7}$ | O | S |
| $L_{A390}$ | H | $R_{B10}$ | O | S |
| $L_{A391}$ | H | $R_{A3}$ | O | S |
| $L_{A392}$ | H | $R_{A34}$ | O | S |
| $L_{A393}$ | H | H | O | O |
| $L_{A394}$ | H | $R_{B1}$ | O | O |
| $L_{A395}$ | H | $R_{B3}$ | O | O |
| $L_{A396}$ | H | $R_{B4}$ | O | O |
| $L_{A397}$ | H | $R_{B7}$ | O | O |
| $L_{A398}$ | H | $R_{B10}$ | O | O |
| $L_{A399}$ | H | $R_{A3}$ | O | O |
| $L_{A400}$ | H | $R_{A34}$ | O | O |
| $L_{A401}$ | H | H | O | $NCH_3$ |
| $L_{A402}$ | H | $R_{B1}$ | O | $NCH_3$ |
| $L_{A403}$ | H | $R_{B3}$ | O | $NCH_3$ |
| $L_{A404}$ | H | $R_{B4}$ | O | $NCH_3$ |
| $L_{A405}$ | H | $R_{B7}$ | O | $NCH_3$ |
| $L_{A406}$ | H | $R_{B10}$ | O | $NCH_3$ |
| $L_{A407}$ | H | $R_{A3}$ | O | $NCH_3$ |
| $L_{A408}$ | H | $R_{A34}$ | O | $NCH_3$ |
| $L_{A409}$ | $R_{B1}$ | H | S | S |
| $L_{A410}$ | $R_{B1}$ | $R_{B1}$ | S | S |
| $L_{A411}$ | $R_{B1}$ | $R_{B3}$ | S | S |
| $L_{A412}$ | $R_{B1}$ | $R_{B4}$ | S | S |
| $L_{A413}$ | $R_{B1}$ | $R_{B7}$ | S | S |
| $L_{A414}$ | $R_{B1}$ | $R_{B10}$ | S | S |
| $L_{A415}$ | $R_{B1}$ | $R_{A3}$ | S | S |
| $L_{A416}$ | $R_{B1}$ | $R_{A34}$ | S | S |
| $L_{A417}$ | $R_{B1}$ | H | S | O |
| $L_{A418}$ | $R_{B1}$ | $R_{B1}$ | S | O |
| $L_{A419}$ | $R_{B1}$ | $R_{B3}$ | S | O |
| $L_{A420}$ | $R_{B1}$ | $R_{B4}$ | S | O |
| $L_{A421}$ | $R_{B1}$ | $R_{B7}$ | S | O |
| $L_{A422}$ | $R_{B1}$ | $R_{B10}$ | S | O |
| $L_{A423}$ | $R_{B1}$ | $R_{A3}$ | S | O |
| $L_{A424}$ | $R_{B1}$ | $R_{A34}$ | S | O |
| $L_{A425}$ | $R_{B1}$ | H | S | $NCH_3$ |
| $L_{A426}$ | $R_{B1}$ | $R_{B1}$ | S | $NCH_3$ |
| $L_{A427}$ | $R_{B1}$ | $R_{B3}$ | S | $NCH_3$ |
| $L_{A428}$ | $R_{B1}$ | $R_{B4}$ | S | $NCH_3$ |
| $L_{A429}$ | $R_{B1}$ | $R_{B7}$ | S | $NCH_3$ |
| $L_{A430}$ | $R_{B1}$ | $R_{B10}$ | S | $NCH_3$ |
| $L_{A431}$ | $R_{B1}$ | $R_{A3}$ | S | $NCH_3$ |
| $L_{A432}$ | $R_{B1}$ | $R_{A34}$ | S | $NCH_3$ |
| $L_{A433}$ | $R_{B1}$ | H | O | S |
| $L_{A434}$ | $R_{B1}$ | $R_{B1}$ | O | S |
| $L_{A435}$ | $R_{B1}$ | $R_{B3}$ | O | S |
| $L_{A436}$ | $R_{B1}$ | $R_{B4}$ | O | S |
| $L_{A437}$ | $R_{B1}$ | $R_{B7}$ | O | S |
| $L_{A438}$ | $R_{B1}$ | $R_{B10}$ | O | S |
| $L_{A439}$ | $R_{B1}$ | $R_{A3}$ | O | S |
| $L_{A440}$ | $R_{B1}$ | $R_{A34}$ | O | S |
| $L_{A441}$ | $R_{B1}$ | H | O | O |
| $L_{A442}$ | $R_{B1}$ | $R_{B1}$ | O | O |
| $L_{A443}$ | $R_{B1}$ | $R_{B3}$ | O | O |
| $L_{A444}$ | $R_{B1}$ | $R_{B4}$ | O | O |
| $L_{A445}$ | $R_{B1}$ | $R_{B7}$ | O | O |
| $L_{A446}$ | $R_{B1}$ | $R_{B10}$ | O | O |
| $L_{A447}$ | $R_{B1}$ | $R_{A3}$ | O | O |
| $L_{A448}$ | $R_{B1}$ | $R_{A34}$ | O | O |
| $L_{A449}$ | $R_{B1}$ | H | O | $NCH_3$ |
| $L_{A450}$ | $R_{B1}$ | $R_{B1}$ | O | $NCH_3$ |
| $L_{A451}$ | $R_{B1}$ | $R_{B3}$ | O | $NCH_3$ |
| $L_{A452}$ | $R_{B1}$ | $R_{B4}$ | O | $NCH_3$ |
| $L_{A453}$ | $R_{B1}$ | $R_{B7}$ | O | $NCH_3$ |
| $L_{A454}$ | $R_{B1}$ | $R_{B10}$ | O | $NCH_3$ |
| $L_{A455}$ | $R_{B1}$ | $R_{A3}$ | O | $NCH_3$ |
| $L_{A456}$ | $R_{B1}$ | $R_{A34}$ | O | $NCH_3$ |

wherein $L_{A577}$ through $L_{A696}$ have a structure of Formula V:

Formula V

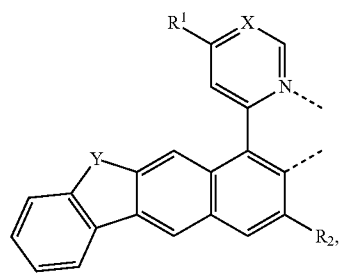

wherein $R^1$, $R^2$, X, and Y are defined as provided below:

| Ligand | $R^1$ | $R^2$ | X | Y |
|---|---|---|---|---|
| $L_{A577}$ | H | H | N | S |
| $L_{A578}$ | $R_{B1}$ | H | N | S |
| $L_{A579}$ | $R_{B3}$ | H | N | S |
| $L_{A580}$ | $R_{B4}$ | H | N | S |
| $L_{A581}$ | $R_{B7}$ | H | N | S |
| $L_{A582}$ | $R_{B10}$ | H | N | S |
| $L_{A583}$ | $R_{A3}$ | H | N | S |
| $L_{A584}$ | $R_{A34}$ | H | N | S |
| $L_{A585}$ | H | H | N | O |
| $L_{A586}$ | $R_{B1}$ | H | N | O |
| $L_{A587}$ | $R_{B3}$ | H | N | O |
| $L_{A588}$ | $R_{B4}$ | H | N | O |
| $L_{A589}$ | $R_{B7}$ | H | N | O |
| $L_{A590}$ | $R_{B10}$ | H | N | O |
| $L_{A591}$ | $R_{A3}$ | H | N | O |
| $L_{A592}$ | $R_{A34}$ | H | N | O |
| $L_{A593}$ | H | H | N | $NCH_3$ |
| $L_{A594}$ | $R_{B1}$ | H | N | $NCH_3$ |
| $L_{A595}$ | $R_{B3}$ | H | N | $NCH_3$ |
| $L_{A596}$ | $R_{B4}$ | H | N | $NCH_3$ |
| $L_{A597}$ | $R_{B7}$ | H | N | $NCH_3$ |
| $L_{A598}$ | $R_{B10}$ | H | N | $NCH_3$ |
| $L_{A599}$ | $R_{A3}$ | H | N | $NCH_3$ |
| $L_{A600}$ | $R_{A34}$ | H | N | $NCH_3$ |
| $L_{A601}$ | H | H | N | $C(CH_3)_2$ |
| $L_{A602}$ | $R_{B1}$ | H | N | $C(CH_3)_2$ |
| $L_{A603}$ | $R_{B3}$ | H | N | $C(CH_3)_2$ |
| $L_{A604}$ | $R_{B4}$ | H | N | $C(CH_3)_2$ |
| $L_{A605}$ | $R_{B7}$ | H | N | $C(CH_3)_2$ |
| $L_{A606}$ | $R_{B10}$ | H | N | $C(CH_3)_2$ |
| $L_{A607}$ | $R_{A3}$ | H | N | $C(CH_3)_2$ |
| $L_{A608}$ | $R_{A34}$ | H | N | $C(CH_3)_2$ |
| $L_{A609}$ | H | H | N | $Si(CH_3)_2$ |
| $L_{A610}$ | $R_{B1}$ | H | N | $Si(CH_3)_2$ |
| $L_{A611}$ | $R_{B3}$ | H | N | $Si(CH_3)_2$ |
| $L_{A612}$ | $R_{B4}$ | H | N | $Si(CH_3)_2$ |
| $L_{A613}$ | $R_{B7}$ | H | N | $Si(CH_3)_2$ |
| $L_{A614}$ | $R_{B10}$ | H | N | $Si(CH_3)_2$ |
| $L_{A615}$ | $R_{A3}$ | H | N | $Si(CH_3)_2$ |
| $L_{A616}$ | $R_{A34}$ | H | N | $Si(CH_3)_2$ |
| $L_{A617}$ | H | $R_{B1}$ | N | S |
| $L_{A618}$ | $R_{B1}$ | $R_{B1}$ | N | S |
| $L_{A619}$ | $R_{B3}$ | $R_{B1}$ | N | S |
| $L_{A620}$ | $R_{B4}$ | $R_{B1}$ | N | S |

-continued

| Ligand | $R^1$ | $R^2$ | X | Y |
|---|---|---|---|---|
| $L_{A621}$ | $R_{B7}$ | $R_{B1}$ | N | S |
| $L_{A622}$ | $R_{B10}$ | $R_{B1}$ | N | S |
| $L_{A623}$ | $R_{A3}$ | $R_{B1}$ | N | S |
| $L_{A624}$ | $R_{A34}$ | $R_{B1}$ | N | S |
| $L_{A625}$ | H | $R_{B1}$ | N | O |
| $L_{A626}$ | $R_{B1}$ | $R_{B1}$ | N | O |
| $L_{A627}$ | $R_{B3}$ | $R_{B1}$ | N | O |
| $L_{A628}$ | $R_{B4}$ | $R_{B1}$ | N | O |
| $L_{A629}$ | $R_{B7}$ | $R_{B1}$ | N | O |
| $L_{A630}$ | $R_{B10}$ | $R_{B1}$ | N | O |
| $L_{A631}$ | $R_{A3}$ | $R_{B1}$ | N | O |
| $L_{A632}$ | $R_{A34}$ | $R_{B1}$ | N | O |
| $L_{A633}$ | H | $R_{B1}$ | N | $NCH_3$ |
| $L_{A634}$ | $R_{B1}$ | $R_{B1}$ | N | $NCH_3$ |
| $L_{A635}$ | $R_{B3}$ | $R_{B1}$ | N | $NCH_3$ |
| $L_{A636}$ | $R_{B4}$ | $R_{B1}$ | N | $NCH_3$ |
| $L_{A637}$ | $R_{B7}$ | $R_{B1}$ | N | $NCH_3$ |
| $L_{A638}$ | $R_{B10}$ | $R_{B1}$ | N | $NCH_3$ |
| $L_{A639}$ | $R_{A3}$ | $R_{B1}$ | N | $NCH_3$ |
| $L_{A640}$ | $R_{A34}$ | $R_{B1}$ | N | $NCH_3$ |
| $L_{A641}$ | H | $R_{B1}$ | N | $C(CH_3)_2$ |
| $L_{A642}$ | $R_{B1}$ | $R_{B1}$ | N | $C(CH_3)_2$ |
| $L_{A643}$ | $R_{B3}$ | $R_{B1}$ | N | $C(CH_3)_2$ |
| $L_{A644}$ | $R_{B4}$ | $R_{B1}$ | N | $C(CH_3)_2$ |
| $L_{A645}$ | $R_{B7}$ | $R_{B1}$ | N | $C(CH_3)_2$ |
| $L_{A646}$ | $R_{B10}$ | $R_{B1}$ | N | $C(CH_3)_2$ |
| $L_{A647}$ | $R_{A3}$ | $R_{B1}$ | N | $C(CH_3)_2$ |
| $L_{A648}$ | $R_{A34}$ | $R_{B1}$ | N | $C(CH_3)_2$ |
| $L_{A649}$ | H | $R_{B1}$ | N | $Si(CH_3)_2$ |
| $L_{A650}$ | $R_{B1}$ | $R_{B1}$ | N | $Si(CH_3)_2$ |
| $L_{A651}$ | $R_{B3}$ | $R_{B1}$ | N | $Si(CH_3)_2$ |
| $L_{A652}$ | $R_{B4}$ | $R_{B1}$ | N | $Si(CH_3)_2$ |
| $L_{A653}$ | $R_{B7}$ | $R_{B1}$ | N | $Si(CH_3)_2$ |
| $L_{A654}$ | $R_{B10}$ | $R_{B1}$ | N | $Si(CH_3)_2$ |
| $L_{A655}$ | $R_{A3}$ | $R_{B1}$ | N | $Si(CH_3)_2$ |
| $L_{A656}$ | $R_{A34}$ | $R_{B1}$ | N | $Si(CH_3)_2$ |
| $L_{A657}$ | H | $R_{B2}$ | N | S |
| $L_{A658}$ | $R_{B1}$ | $R_{B2}$ | N | S |
| $L_{A659}$ | $R_{B3}$ | $R_{B2}$ | N | S |
| $L_{A660}$ | $R_{B4}$ | $R_{B2}$ | N | S |
| $L_{A661}$ | $R_{B7}$ | $R_{B2}$ | N | S |
| $L_{A662}$ | $R_{B10}$ | $R_{B2}$ | N | S |
| $L_{A663}$ | $R_{A3}$ | $R_{B2}$ | N | S |
| $L_{A664}$ | $R_{A34}$ | $R_{B2}$ | N | S |
| $L_{A665}$ | H | $R_{B2}$ | N | O |
| $L_{A666}$ | $R_{B1}$ | $R_{B2}$ | N | O |
| $L_{A667}$ | $R_{B3}$ | $R_{B2}$ | N | O |
| $L_{A668}$ | $R_{B4}$ | $R_{B2}$ | N | O |
| $L_{A669}$ | $R_{B7}$ | $R_{B2}$ | N | O |
| $L_{A670}$ | $R_{B10}$ | $R_{B2}$ | N | O |
| $L_{A671}$ | $R_{A3}$ | $R_{B2}$ | N | O |
| $L_{A672}$ | $R_{A34}$ | $R_{B2}$ | N | O |
| $L_{A673}$ | H | $R_{B2}$ | N | $NCH_3$ |
| $L_{A674}$ | $R_{B1}$ | $R_{B2}$ | N | $NCH_3$ |
| $L_{A675}$ | $R_{B3}$ | $R_{B2}$ | N | $NCH_3$ |
| $L_{A676}$ | $R_{B4}$ | $R_{B2}$ | N | $NCH_3$ |
| $L_{A677}$ | $R_{B7}$ | $R_{B2}$ | N | $NCH_3$ |
| $L_{A678}$ | $R_{B10}$ | $R_{B2}$ | N | $NCH_3$ |
| $L_{A679}$ | $R_{A3}$ | $R_{B2}$ | N | $NCH_3$ |
| $L_{A680}$ | $R_{A34}$ | $R_{B2}$ | N | $NCH_3$ |
| $L_{A681}$ | H | $R_{B2}$ | N | $C(CH_3)_2$ |
| $L_{A682}$ | $R_{B1}$ | $R_{B2}$ | N | $C(CH_3)_2$ |
| $L_{A683}$ | $R_{B3}$ | $R_{B2}$ | N | $C(CH_3)_2$ |
| $L_{A684}$ | $R_{B4}$ | $R_{B2}$ | N | $C(CH_3)_2$ |
| $L_{A685}$ | $R_{B7}$ | $R_{B2}$ | N | $C(CH_3)_2$ |
| $L_{A686}$ | $R_{B10}$ | $R_{B2}$ | N | $C(CH_3)_2$ |
| $L_{A687}$ | $R_{A3}$ | $R_{B2}$ | N | $C(CH_3)_2$ |
| $L_{A688}$ | $R_{A34}$ | $R_{B2}$ | N | $C(CH_3)_2$ |
| $L_{A689}$ | H | $R_{B2}$ | N | $Si(CH_3)_2$ |
| $L_{A690}$ | $R_{B1}$ | $R_{B2}$ | N | $Si(CH_3)_2$ |
| $L_{A691}$ | $R_{B3}$ | $R_{B2}$ | N | $Si(CH_3)_2$ |
| $L_{A692}$ | $R_{B4}$ | $R_{B2}$ | N | $Si(CH_3)_2$ |
| $L_{A693}$ | $R_{B7}$ | $R_{B2}$ | N | $Si(CH_3)_2$ |
| $L_{A694}$ | $R_{B10}$ | $R_{B2}$ | N | $Si(CH_3)_2$ |
| $L_{A695}$ | $R_{A3}$ | $R_{B2}$ | N | $Si(CH_3)_2$ |
| $L_{A696}$ | $R_{A34}$ | $R_{B2}$ | N | $Si(CH_3)_2$ |

wherein $L_{A697}$ through $L_{A816}$ have a structure of Formula VI:

Formula VI

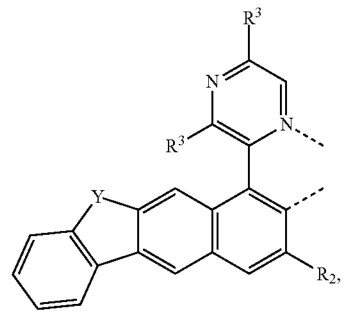

wherein $R^2$, $R^3$, and Y are defined as provided below:

| Ligand | $R^2$ | $R^3$ | Y | Ligand | $R^1$ | $R^2$ | $R^{14}$ |
|---|---|---|---|---|---|---|---|
| $L_{A697}$ | H | H | S | $L_{A757}$ | $R_{B1}$ | $R_{B4}$ | $NCH_3$ |
| $L_{A698}$ | H | $R_{B1}$ | S | $L_{A758}$ | $R_{B1}$ | $R_{B5}$ | $NCH_3$ |
| $L_{A699}$ | H | $R_{B2}$ | S | $L_{A759}$ | $R_{B1}$ | $R_{A34}$ | $NCH_3$ |
| $L_{A700}$ | H | $R_{B3}$ | S | $L_{A760}$ | $R_{B1}$ | $R_{A52}$ | $NCH_3$ |
| $L_{A701}$ | H | $R_{B4}$ | S | $L_{A761}$ | $R_{B1}$ | H | $C(CH_3)_2$ |
| $L_{A702}$ | H | $R_{B5}$ | S | $L_{A762}$ | $R_{B1}$ | $R_{B1}$ | $C(CH_3)_2$ |
| $L_{A703}$ | H | $R_{A34}$ | S | $L_{A763}$ | $R_{B1}$ | $R_{B2}$ | $C(CH_3)_2$ |
| $L_{A704}$ | H | $R_{A52}$ | S | $L_{A764}$ | $R_{B1}$ | $R_{B3}$ | $C(CH_3)_2$ |
| $L_{A705}$ | H | H | O | $L_{A765}$ | $R_{B1}$ | $R_{B4}$ | $C(CH_3)_2$ |
| $L_{A706}$ | H | $R_{B1}$ | O | $L_{A766}$ | $R_{B1}$ | $R_{B5}$ | $C(CH_3)_2$ |
| $L_{A707}$ | H | $R_{B2}$ | O | $L_{A767}$ | $R_{B1}$ | $R_{A34}$ | $C(CH_3)_2$ |
| $L_{A708}$ | H | $R_{B3}$ | O | $L_{A768}$ | $R_{B1}$ | $R_{A52}$ | $C(CH_3)_2$ |
| $L_{A709}$ | H | $R_{B4}$ | O | $L_{A769}$ | $R_{B1}$ | H | $Si(CH_3)_2$ |
| $L_{A710}$ | H | $R_{B5}$ | O | $L_{A770}$ | $R_{B1}$ | $R_{B1}$ | $Si(CH_3)_2$ |
| $L_{A711}$ | H | $R_{A34}$ | O | $L_{A771}$ | $R_{B1}$ | $R_{B2}$ | $Si(CH_3)_2$ |
| $L_{A712}$ | H | $R_{A52}$ | O | $L_{A772}$ | $R_{B1}$ | $R_{B3}$ | $Si(CH_3)_2$ |
| $L_{A713}$ | H | H | $NCH_3$ | $L_{A773}$ | $R_{B1}$ | $R_{B4}$ | $Si(CH_3)_2$ |
| $L_{A714}$ | H | $R_{B1}$ | $NCH_3$ | $L_{A774}$ | $R_{B1}$ | $R_{B5}$ | $Si(CH_3)_2$ |
| $L_{A715}$ | H | $R_{B2}$ | $NCH_3$ | $L_{A775}$ | $R_{B1}$ | $R_{A34}$ | $Si(CH_3)_2$ |
| $L_{A716}$ | H | $R_{B3}$ | $NCH_3$ | $L_{A776}$ | $R_{B1}$ | $R_{A52}$ | $Si(CH_3)_2$ |
| $L_{A717}$ | H | $R_{B4}$ | $NCH_3$ | $L_{A777}$ | $R_{B2}$ | H | S |
| $L_{A718}$ | H | $R_{B5}$ | $NCH_3$ | $L_{A778}$ | $R_{B2}$ | $R_{B1}$ | S |
| $L_{A719}$ | H | $R_{A34}$ | $NCH_3$ | $L_{A779}$ | $R_{B2}$ | $R_{B2}$ | S |
| $L_{A720}$ | H | $R_{A52}$ | $NCH_3$ | $L_{A780}$ | $R_{B2}$ | $R_{B3}$ | S |
| $L_{A721}$ | H | H | $C(CH_3)_2$ | $L_{A781}$ | $R_{B2}$ | $R_{B4}$ | S |
| $L_{A722}$ | H | $R_{B1}$ | $C(CH_3)_2$ | $L_{A782}$ | $R_{B2}$ | $R_{B5}$ | S |
| $L_{A723}$ | H | $R_{B2}$ | $C(CH_3)_2$ | $L_{A783}$ | $R_{B2}$ | $R_{A34}$ | S |
| $L_{A724}$ | H | $R_{B3}$ | $C(CH_3)_2$ | $L_{A784}$ | $R_{B2}$ | $R_{A52}$ | S |
| $L_{A725}$ | H | $R_{B4}$ | $C(CH_3)_2$ | $L_{A785}$ | $R_{B2}$ | H | O |
| $L_{A726}$ | H | $R_{B5}$ | $C(CH_3)_2$ | $L_{A786}$ | $R_{B2}$ | $R_{B1}$ | O |
| $L_{A727}$ | H | $R_{A34}$ | $C(CH_3)_2$ | $L_{A787}$ | $R_{B2}$ | $R_{B2}$ | O |
| $L_{A728}$ | H | $R_{A52}$ | $C(CH_3)_2$ | $L_{A788}$ | $R_{B2}$ | $R_{B3}$ | O |
| $L_{A729}$ | H | H | $Si(CH_3)_2$ | $L_{A789}$ | $R_{B2}$ | $R_{B4}$ | O |
| $L_{A730}$ | H | $R_{B1}$ | $Si(CH_3)_2$ | $L_{A790}$ | $R_{B2}$ | $R_{B5}$ | O |
| $L_{A731}$ | H | $R_{B2}$ | $Si(CH_3)_2$ | $L_{A791}$ | $R_{B2}$ | $R_{A34}$ | O |
| $L_{A732}$ | H | $R_{B3}$ | $Si(CH_3)_2$ | $L_{A792}$ | $R_{B2}$ | $R_{A52}$ | O |
| $L_{A733}$ | H | $R_{B4}$ | $Si(CH_3)_2$ | $L_{A793}$ | $R_{B2}$ | H | $NCH_3$ |
| $L_{A734}$ | H | $R_{B5}$ | $Si(CH_3)_2$ | $L_{A794}$ | $R_{B2}$ | $R_{B1}$ | $NCH_3$ |
| $L_{A735}$ | H | $R_{A34}$ | $Si(CH_3)_2$ | $L_{A795}$ | $R_{B2}$ | $R_{B2}$ | $NCH_3$ |
| $L_{A736}$ | H | $R_{A52}$ | $Si(CH_3)_2$ | $L_{A796}$ | $R_{B2}$ | $R_{B3}$ | $NCH_3$ |
| $L_{A737}$ | $R_{B1}$ | H | S | $L_{A797}$ | $R_{B2}$ | $R_{B4}$ | $NCH_3$ |
| $L_{A738}$ | $R_{B1}$ | $R_{B1}$ | S | $L_{A798}$ | $R_{B2}$ | $R_{B5}$ | $NCH_3$ |
| $L_{A739}$ | $R_{B1}$ | $R_{B2}$ | S | $L_{A799}$ | $R_{B2}$ | $R_{A34}$ | $NCH_3$ |
| $L_{A740}$ | $R_{B1}$ | $R_{B3}$ | S | $L_{A800}$ | $R_{B2}$ | $R_{A52}$ | $NCH_3$ |
| $L_{A741}$ | $R_{B1}$ | $R_{B4}$ | S | $L_{A801}$ | $R_{B2}$ | H | $C(CH_3)_2$ |
| $L_{A742}$ | $R_{B1}$ | $R_{B5}$ | S | $L_{A802}$ | $R_{B2}$ | $R_{B1}$ | $C(CH_3)_2$ |
| $L_{A743}$ | $R_{B1}$ | $R_{A34}$ | S | $L_{A803}$ | $R_{B2}$ | $R_{B2}$ | $C(CH_3)_2$ |
| $L_{A744}$ | $R_{B1}$ | $R_{A52}$ | S | $L_{A804}$ | $R_{B2}$ | $R_{B3}$ | $C(CH_3)_2$ |
| $L_{A745}$ | $R_{B1}$ | H | O | $L_{A805}$ | $R_{B2}$ | $R_{B4}$ | $C(CH_3)_2$ |
| $L_{A746}$ | $R_{B1}$ | $R_{B1}$ | O | $L_{A806}$ | $R_{B2}$ | $R_{B5}$ | $C(CH_3)_2$ |
| $L_{A747}$ | $R_{B1}$ | $R_{B2}$ | O | $L_{A807}$ | $R_{B2}$ | $R_{A34}$ | $C(CH_3)_2$ |
| $L_{A748}$ | $R_{B1}$ | $R_{B3}$ | O | $L_{A808}$ | $R_{B2}$ | $R_{A52}$ | $C(CH_3)_2$ |
| $L_{A749}$ | $R_{B1}$ | $R_{B4}$ | O | $L_{A809}$ | $R_{B2}$ | H | $Si(CH_3)_2$ |
| $L_{A750}$ | $R_{B1}$ | $R_{B5}$ | O | $L_{A810}$ | $R_{B2}$ | $R_{B1}$ | $Si(CH_3)_2$ |

-continued

| Ligand | $R^2$ | $R^3$ | Y | Ligand | $R^1$ | $R^2$ | $R^{14}$ |
|---|---|---|---|---|---|---|---|
| $L_{A751}$ | $R_{B1}$ | $R_{A34}$ | O | $L_{A811}$ | $R_{B2}$ | $R_{B2}$ | $Si(CH_3)_2$ |
| $L_{A752}$ | $R_{B1}$ | $R_{A52}$ | O | $L_{A812}$ | $R_{B2}$ | $R_{B3}$ | $Si(CH_3)_2$ |
| $L_{A753}$ | $R_{B1}$ | H | $NCH_3$ | $L_{A813}$ | $R_{B2}$ | $R_{B4}$ | $Si(CH_3)_2$ |
| $L_{A754}$ | $R_{B1}$ | $R_{B1}$ | $NCH_3$ | $L_{A814}$ | $R_{B2}$ | $R_{B5}$ | $Si(CH_3)_2$ |
| $L_{A755}$ | $R_{B1}$ | $R_{B2}$ | $NCH_3$ | $L_{A815}$ | $R_{B2}$ | $R_{A34}$ | $Si(CH_3)_2$ |
| $L_{A756}$ | $R_{B1}$ | $R_{B3}$ | $NCH_3$ | $L_{A816}$ | $R_{B2}$ | $R_{A52}$ | $Si(CH_3)_2$ |

wherein $L_{A817}$ through $L_{A912}$ have a structure of Formula VII:

Formula VII

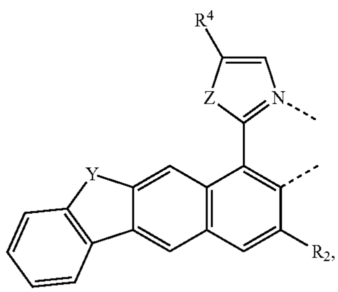

wherein $R^2$, $R^4$, and Y are defined as provided below:

| Ligand | $R^2$ | $R^4$ | Y | Z |
|---|---|---|---|---|
| $L_{A817}$ | H | H | S | S |
| $L_{A818}$ | H | $R_{B1}$ | S | S |
| $L_{A819}$ | H | $R_{B3}$ | S | S |
| $L_{A820}$ | H | $R_{B4}$ | S | S |
| $L_{A821}$ | H | $R_{B7}$ | S | S |
| $L_{A822}$ | H | $R_{B10}$ | S | S |
| $L_{A823}$ | H | $R_{A3}$ | S | S |
| $L_{A824}$ | H | $R_{A34}$ | S | S |
| $L_{A825}$ | H | H | S | O |
| $L_{A826}$ | H | $R_{B1}$ | S | O |
| $L_{A827}$ | H | $R_{B3}$ | S | O |
| $L_{A828}$ | H | $R_{B4}$ | S | O |
| $L_{A829}$ | H | $R_{B7}$ | S | O |
| $L_{A830}$ | H | $R_{B10}$ | S | O |
| $L_{A831}$ | H | $R_{A3}$ | S | O |
| $L_{A832}$ | H | $R_{A34}$ | S | O |
| $L_{A833}$ | H | H | S | $NCH_3$ |
| $L_{A834}$ | H | $R_{B1}$ | S | $NCH_3$ |
| $L_{A835}$ | H | $R_{B3}$ | S | $NCH_3$ |
| $L_{A836}$ | H | $R_{B4}$ | S | $NCH_3$ |
| $L_{A837}$ | H | $R_{B7}$ | S | $NCH_3$ |
| $L_{A838}$ | H | $R_{B10}$ | S | $NCH_3$ |
| $L_{A839}$ | H | $R_{A3}$ | S | $NCH_3$ |
| $L_{A840}$ | H | $R_{A34}$ | S | $NCH_3$ |
| $L_{A841}$ | H | H | O | S |
| $L_{A842}$ | H | $R_{B1}$ | O | S |
| $L_{A843}$ | H | $R_{B3}$ | O | S |
| $L_{A844}$ | H | $R_{B4}$ | O | S |
| $L_{A845}$ | H | $R_{B7}$ | O | S |
| $L_{A846}$ | H | $R_{B10}$ | O | S |
| $L_{A847}$ | H | $R_{A3}$ | O | S |
| $L_{A848}$ | H | $R_{A34}$ | O | S |
| $L_{A849}$ | H | H | O | O |
| $L_{A850}$ | H | $R_{B1}$ | O | O |
| $L_{A851}$ | H | $R_{B3}$ | O | O |
| $L_{A852}$ | H | $R_{B4}$ | O | O |
| $L_{A853}$ | H | $R_{B7}$ | O | O |
| $L_{A854}$ | H | $R_{B10}$ | O | O |
| $L_{A855}$ | H | $R_{A3}$ | O | O |
| $L_{A856}$ | H | $R_{A34}$ | O | O |
| $L_{A857}$ | H | H | O | $NCH_3$ |
| $L_{A858}$ | H | $R_{B1}$ | O | $NCH_3$ |
| $L_{A859}$ | H | $R_{B3}$ | O | $NCH_3$ |

-continued

| Ligand | $R^2$ | $R^4$ | Y | Z |
|---|---|---|---|---|
| $L_{A860}$ | H | $R_{B4}$ | O | $NCH_3$ |
| $L_{A861}$ | H | $R_{B7}$ | O | $NCH_3$ |
| $L_{A862}$ | H | $R_{B10}$ | O | $NCH_3$ |
| $L_{A863}$ | H | $R_{A3}$ | O | $NCH_3$ |
| $L_{A864}$ | H | $R_{A34}$ | O | $NCH_3$ |
| $L_{A865}$ | $R_{B1}$ | H | S | S |
| $L_{A866}$ | $R_{B1}$ | $R_{B1}$ | S | S |
| $L_{A867}$ | $R_{B1}$ | $R_{B3}$ | S | S |
| $L_{A868}$ | $R_{B1}$ | $R_{B4}$ | S | S |
| $L_{A869}$ | $R_{B1}$ | $R_{B7}$ | S | S |
| $L_{A870}$ | $R_{B1}$ | $R_{B10}$ | S | S |
| $L_{A871}$ | $R_{B1}$ | $R_{A3}$ | S | S |
| $L_{A872}$ | $R_{B1}$ | $R_{A34}$ | S | S |
| $L_{A873}$ | $R_{B1}$ | H | S | O |
| $L_{A874}$ | $R_{B1}$ | $R_{B1}$ | S | O |
| $L_{A875}$ | $R_{B1}$ | $R_{B3}$ | S | O |
| $L_{A876}$ | $R_{B1}$ | $R_{B4}$ | S | O |
| $L_{A877}$ | $R_{B1}$ | $R_{B7}$ | S | O |
| $L_{A878}$ | $R_{B1}$ | $R_{B10}$ | S | O |
| $L_{A879}$ | $R_{B1}$ | $R_{A3}$ | S | O |
| $L_{A880}$ | $R_{B1}$ | $R_{A34}$ | S | O |
| $L_{A881}$ | $R_{B1}$ | H | S | $NCH_3$ |
| $L_{A882}$ | $R_{B1}$ | $R_{B1}$ | S | $NCH_3$ |
| $L_{A883}$ | $R_{B1}$ | $R_{B3}$ | S | $NCH_3$ |
| $L_{A884}$ | $R_{B1}$ | $R_{B4}$ | S | $NCH_3$ |
| $L_{A885}$ | $R_{B1}$ | $R_{B7}$ | S | $NCH_3$ |
| $L_{A886}$ | $R_{B1}$ | $R_{B10}$ | S | $NCH_3$ |
| $L_{A887}$ | $R_{B1}$ | $R_{A3}$ | S | $NCH_3$ |
| $L_{A888}$ | $R_{B1}$ | $R_{A34}$ | S | $NCH_3$ |
| $L_{A889}$ | $R_{B1}$ | H | O | S |
| $L_{A890}$ | $R_{B1}$ | $R_{B1}$ | O | S |
| $L_{A891}$ | $R_{B1}$ | $R_{B3}$ | O | S |
| $L_{A892}$ | $R_{B1}$ | $R_{B4}$ | O | S |
| $L_{A893}$ | $R_{B1}$ | $R_{B7}$ | O | S |
| $L_{A894}$ | $R_{B1}$ | $R_{B10}$ | O | S |
| $L_{A895}$ | $R_{B1}$ | $R_{A3}$ | O | S |
| $L_{A896}$ | $R_{B1}$ | $R_{A34}$ | O | S |
| $L_{A897}$ | $R_{B1}$ | H | O | O |
| $L_{A898}$ | $R_{B1}$ | $R_{B1}$ | O | O |
| $L_{A899}$ | $R_{B1}$ | $R_{B3}$ | O | O |
| $L_{A900}$ | $R_{B1}$ | $R_{B4}$ | O | O |
| $L_{A901}$ | $R_{B1}$ | $R_{B7}$ | O | O |
| $L_{A902}$ | $R_{B1}$ | $R_{B10}$ | O | O |
| $L_{A903}$ | $R_{B1}$ | $R_{A3}$ | O | O |
| $L_{A904}$ | $R_{B1}$ | $R_{A34}$ | O | O |
| $L_{A905}$ | $R_{B1}$ | H | O | $NCH_3$ |
| $L_{A906}$ | $R_{B1}$ | $R_{B1}$ | O | $NCH_3$ |
| $L_{A907}$ | $R_{B1}$ | $R_{B3}$ | O | $NCH_3$ |
| $L_{A908}$ | $R_{B1}$ | $R_{B4}$ | O | $NCH_3$ |
| $L_{A909}$ | $R_{B1}$ | $R_{B7}$ | O | $NCH_3$ |
| $L_{A910}$ | $R_{B1}$ | $R_{B10}$ | O | $NCH_3$ |
| $L_{A911}$ | $R_{B1}$ | $R_{A3}$ | O | $NCH_3$ |
| $L_{A912}$ | $R_{B1}$ | $R_{A34}$ | O | $NCH_3$ |

wherein $L_{A913}$ through $L_{A1152}$ have a structure of Formula VIII:

Formula VIII

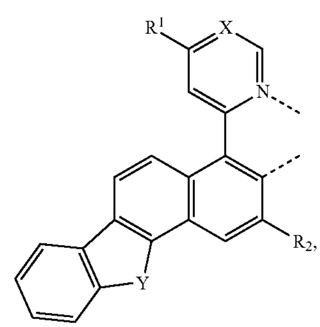

wherein $R^1$, $R^2$, Y, and X are defined as provided below:

| Ligand | $R^1$ | $R^2$ | X | Y |
|---|---|---|---|---|
| $L_{A913}$ | H | H | C | S |
| $L_{A914}$ | $R_{B1}$ | H | C | S |
| $L_{A915}$ | $R_{B3}$ | H | C | S |
| $L_{A916}$ | $R_{B4}$ | H | C | S |
| $L_{A917}$ | $R_{B7}$ | H | C | S |
| $L_{A918}$ | $R_{B10}$ | H | C | S |
| $L_{A919}$ | $R_{A3}$ | H | C | S |
| $L_{A920}$ | $R_{A34}$ | H | C | S |
| $L_{A921}$ | H | H | C | O |
| $L_{A922}$ | $R_{B1}$ | H | C | O |
| $L_{A923}$ | $R_{B3}$ | H | C | O |
| $L_{A924}$ | $R_{B4}$ | H | C | O |
| $L_{A925}$ | $R_{B7}$ | H | C | O |
| $L_{A926}$ | $R_{B10}$ | H | C | O |
| $L_{A927}$ | $R_{A3}$ | H | C | O |
| $L_{A928}$ | $R_{A34}$ | H | C | O |
| $L_{A929}$ | H | H | C | $NCH_3$ |
| $L_{A930}$ | $R_{B1}$ | H | C | $NCH_3$ |
| $L_{A931}$ | $R_{B3}$ | H | C | $NCH_3$ |
| $L_{A932}$ | $R_{B4}$ | H | C | $NCH_3$ |
| $L_{A933}$ | $R_{B7}$ | H | C | $NCH_3$ |
| $L_{A934}$ | $R_{B10}$ | H | C | $NCH_3$ |
| $L_{A935}$ | $R_{A3}$ | H | C | $NCH_3$ |
| $L_{A936}$ | $R_{A34}$ | H | C | $NCH_3$ |
| $L_{A937}$ | H | H | C | $C(CH_3)_2$ |
| $L_{A938}$ | $R_{B1}$ | H | C | $C(CH_3)_2$ |
| $L_{A939}$ | $R_{B3}$ | H | C | $C(CH_3)_2$ |
| $L_{A940}$ | $R_{B4}$ | H | C | $C(CH_3)_2$ |
| $L_{A941}$ | $R_{B7}$ | H | C | $C(CH_3)_2$ |
| $L_{A942}$ | $R_{B10}$ | H | C | $C(CH_3)_2$ |
| $L_{A943}$ | $R_{A3}$ | H | C | $C(CH_3)_2$ |
| $L_{A944}$ | $R_{A34}$ | H | C | $C(CH_3)_2$ |
| $L_{A945}$ | H | H | C | $Si(CH_3)_2$ |
| $L_{A946}$ | $R_{B1}$ | H | C | $Si(CH_3)_2$ |
| $L_{A947}$ | $R_{B3}$ | H | C | $Si(CH_3)_2$ |
| $L_{A948}$ | $R_{B4}$ | H | C | $Si(CH_3)_2$ |
| $L_{A949}$ | $R_{B7}$ | H | C | $Si(CH_3)_2$ |
| $L_{A950}$ | $R_{B10}$ | H | C | $Si(CH_3)_2$ |
| $L_{A951}$ | $R_{A3}$ | H | C | $Si(CH_3)_2$ |
| $L_{A952}$ | $R_{A34}$ | H | C | $Si(CH_3)_2$ |
| $L_{A953}$ | H | $R_{B1}$ | C | S |
| $L_{A954}$ | $R_{B1}$ | $R_{B1}$ | C | S |
| $L_{A955}$ | $R_{B3}$ | $R_{B1}$ | C | S |
| $L_{A956}$ | $R_{B4}$ | $R_{B1}$ | C | S |
| $L_{A957}$ | $R_{B7}$ | $R_{B1}$ | C | S |
| $L_{A958}$ | $R_{B10}$ | $R_{B1}$ | C | S |
| $L_{A959}$ | $R_{A3}$ | $R_{B1}$ | C | S |
| $L_{A960}$ | $R_{A34}$ | $R_{B1}$ | C | S |
| $L_{A961}$ | H | $R_{B1}$ | C | O |
| $L_{A962}$ | $R_{B1}$ | $R_{B1}$ | C | O |
| $L_{A963}$ | $R_{B3}$ | $R_{B1}$ | C | O |
| $L_{A964}$ | $R_{B4}$ | $R_{B1}$ | C | O |
| $L_{A965}$ | $R_{B7}$ | $R_{B1}$ | C | O |
| $L_{A966}$ | $R_{B10}$ | $R_{B1}$ | C | O |
| $L_{A967}$ | $R_{A3}$ | $R_{B1}$ | C | O |
| $L_{A968}$ | $R_{A34}$ | $R_{B1}$ | C | O |
| $L_{A969}$ | H | $R_{B1}$ | C | $NCH_3$ |
| $L_{A970}$ | $R_{B1}$ | $R_{B1}$ | C | $NCH_3$ |
| $L_{A971}$ | $R_{B3}$ | $R_{B1}$ | C | $NCH_3$ |
| $L_{A972}$ | $R_{B4}$ | $R_{B1}$ | C | $NCH_3$ |
| $L_{A973}$ | $R_{B7}$ | $R_{B1}$ | C | $NCH_3$ |
| $L_{A974}$ | $R_{B10}$ | $R_{B1}$ | C | $NCH_3$ |
| $L_{A975}$ | $R_{A3}$ | $R_{B1}$ | C | $NCH_3$ |
| $L_{A976}$ | $R_{A34}$ | $R_{B1}$ | C | $NCH_3$ |
| $L_{A977}$ | H | $R_{B1}$ | C | $C(CH_3)_2$ |
| $L_{A978}$ | $R_{B1}$ | $R_{B1}$ | C | $C(CH_3)_2$ |
| $L_{A979}$ | $R_{B3}$ | $R_{B1}$ | C | $C(CH_3)_2$ |
| $L_{A980}$ | $R_{B4}$ | $R_{B1}$ | C | $C(CH_3)_2$ |
| $L_{A981}$ | $R_{B7}$ | $R_{B1}$ | C | $C(CH_3)_2$ |
| $L_{A982}$ | $R_{B10}$ | $R_{B1}$ | C | $C(CH_3)_2$ |
| $L_{A983}$ | $R_{A3}$ | $R_{B1}$ | C | $C(CH_3)_2$ |
| $L_{A984}$ | $R_{A34}$ | $R_{B1}$ | C | $C(CH_3)_2$ |
| $L_{A985}$ | H | $R_{B1}$ | C | $Si(CH_3)_2$ |
| $L_{A986}$ | $R_{B1}$ | $R_{B1}$ | C | $Si(CH_3)_2$ |
| $L_{A987}$ | $R_{B3}$ | $R_{B1}$ | C | $Si(CH_3)_2$ |
| $L_{A988}$ | $R_{B4}$ | $R_{B1}$ | C | $Si(CH_3)_2$ |

-continued

| Ligand | $R^1$ | $R^2$ | X | Y |
|---|---|---|---|---|
| $L_{A989}$ | $R_{B7}$ | $R_{B1}$ | C | $Si(CH_3)_2$ |
| $L_{A990}$ | $R_{B10}$ | $R_{B1}$ | C | $Si(CH_3)_2$ |
| $L_{A991}$ | $R_{A3}$ | $R_{B1}$ | C | $Si(CH_3)_2$ |
| $L_{A992}$ | $R_{A34}$ | $R_{B1}$ | C | $Si(CH_3)_2$ |
| $L_{A993}$ | H | $R_{B2}$ | C | S |
| $L_{A994}$ | $R_{B1}$ | $R_{B2}$ | C | S |
| $L_{A995}$ | $R_{B3}$ | $R_{B2}$ | C | S |
| $L_{A996}$ | $R_{B4}$ | $R_{B2}$ | C | S |
| $L_{A997}$ | $R_{B7}$ | $R_{B2}$ | C | S |
| $L_{A998}$ | $R_{B10}$ | $R_{B2}$ | C | S |
| $L_{A999}$ | $R_{A3}$ | $R_{B2}$ | C | S |
| $L_{A1000}$ | $R_{A34}$ | $R_{B2}$ | C | S |
| $L_{A1001}$ | H | $R_{B2}$ | C | O |
| $L_{A1002}$ | $R_{B1}$ | $R_{B2}$ | C | O |
| $L_{A1003}$ | $R_{B3}$ | $R_{B2}$ | C | O |
| $L_{A1004}$ | $R_{B4}$ | $R_{B2}$ | C | O |
| $L_{A1005}$ | $R_{B7}$ | $R_{B2}$ | C | O |
| $L_{A1006}$ | $R_{B10}$ | $R_{B2}$ | C | O |
| $L_{A1007}$ | $R_{A3}$ | $R_{B2}$ | C | O |
| $L_{A1008}$ | $R_{A34}$ | $R_{B2}$ | C | O |
| $L_{A1009}$ | H | $R_{B2}$ | C | $NCH_3$ |
| $L_{A1010}$ | $R_{B1}$ | $R_{B2}$ | C | $NCH_3$ |
| $L_{A1011}$ | $R_{B3}$ | $R_{B2}$ | C | $NCH_3$ |
| $L_{A1012}$ | $R_{B4}$ | $R_{B2}$ | C | $NCH_3$ |
| $L_{A1013}$ | $R_{B7}$ | $R_{B2}$ | C | $NCH_3$ |
| $L_{A1014}$ | $R_{B10}$ | $R_{B2}$ | C | $NCH_3$ |
| $L_{A1015}$ | $R_{A3}$ | $R_{B2}$ | C | $NCH_3$ |
| $L_{A1016}$ | $R_{A34}$ | $R_{B2}$ | C | $NCH_3$ |
| $L_{A1017}$ | H | $R_{B2}$ | C | $C(CH_3)_2$ |
| $L_{A1018}$ | $R_{B1}$ | $R_{B2}$ | C | $C(CH_3)_2$ |
| $L_{A1019}$ | $R_{B3}$ | $R_{B2}$ | C | $C(CH_3)_2$ |
| $L_{A1020}$ | $R_{B4}$ | $R_{B2}$ | C | $C(CH_3)_2$ |
| $L_{A1021}$ | $R_{B7}$ | $R_{B2}$ | C | $C(CH_3)_2$ |
| $L_{A1022}$ | $R_{B10}$ | $R_{B2}$ | C | $C(CH_3)_2$ |
| $L_{A1023}$ | $R_{A3}$ | $R_{B2}$ | C | $C(CH_3)_2$ |
| $L_{A1024}$ | $R_{A34}$ | $R_{B2}$ | C | $C(CH_3)_2$ |
| $L_{A1025}$ | H | $R_{B2}$ | C | $Si(CH_3)_2$ |
| $L_{A1026}$ | $R_{B1}$ | $R_{B2}$ | C | $Si(CH_3)_2$ |
| $L_{A1027}$ | $R_{B3}$ | $R_{B2}$ | C | $Si(CH_3)_2$ |
| $L_{A1028}$ | $R_{B4}$ | $R_{B2}$ | C | $Si(CH_3)_2$ |
| $L_{A1029}$ | $R_{B7}$ | $R_{B2}$ | C | $Si(CH_3)_2$ |
| $L_{A1030}$ | $R_{B10}$ | $R_{B2}$ | C | $Si(CH_3)_2$ |
| $L_{A1031}$ | $R_{A3}$ | $R_{B2}$ | C | $Si(CH_3)_2$ |
| $L_{A1032}$ | $R_{A34}$ | $R_{B2}$ | C | $Si(CH_3)_2$ |
| $L_{A1033}$ | H | H | N | S |
| $L_{A1034}$ | $R_{B1}$ | H | N | S |
| $L_{A1035}$ | $R_{B3}$ | H | N | S |
| $L_{A1036}$ | $R_{B4}$ | H | N | S |
| $L_{A1037}$ | $R_{B7}$ | H | N | S |
| $L_{A1038}$ | $R_{B10}$ | H | N | S |
| $L_{A1039}$ | $R_{A3}$ | H | N | S |
| $L_{A1040}$ | $R_{A34}$ | H | N | S |
| $L_{A1041}$ | H | H | N | O |
| $L_{A1042}$ | $R_{B1}$ | H | N | O |
| $L_{A1043}$ | $R_{B3}$ | H | N | O |
| $L_{A1044}$ | $R_{B4}$ | H | N | O |
| $L_{A1045}$ | $R_{B7}$ | H | N | O |
| $L_{A1046}$ | $R_{B10}$ | H | N | O |
| $L_{A1047}$ | $R_{A3}$ | H | N | O |
| $L_{A1048}$ | $R_{A34}$ | H | N | O |
| $L_{A1049}$ | H | H | N | $NCH_3$ |
| $L_{A1050}$ | $R_{B1}$ | H | N | $NCH_3$ |
| $L_{A1051}$ | $R_{B3}$ | H | N | $NCH_3$ |
| $L_{A1052}$ | $R_{B4}$ | H | N | $NCH_3$ |
| $L_{A1053}$ | $R_{B7}$ | H | N | $NCH_3$ |
| $L_{A1054}$ | $R_{B10}$ | H | N | $NCH_3$ |
| $L_{A1055}$ | $R_{A3}$ | H | N | $NCH_3$ |
| $L_{A1056}$ | $R_{A34}$ | H | N | $NCH_3$ |
| $L_{A1057}$ | H | H | N | $C(CH_3)_2$ |
| $L_{A1058}$ | $R_{B1}$ | H | N | $C(CH_3)_2$ |
| $L_{A1059}$ | $R_{B3}$ | H | N | $C(CH_3)_2$ |
| $L_{A1060}$ | $R_{B4}$ | H | N | $C(CH_3)_2$ |
| $L_{A1061}$ | $R_{B7}$ | H | N | $C(CH_3)_2$ |
| $L_{A1062}$ | $R_{B10}$ | H | N | $C(CH_3)_2$ |
| $L_{A1063}$ | $R_{A3}$ | H | N | $C(CH_3)_2$ |
| $L_{A1064}$ | $R_{A34}$ | H | N | $C(CH_3)_2$ |
| $L_{A1065}$ | H | H | N | $Si(CH_3)_2$ |

-continued

| Ligand | $R^1$ | $R^2$ | X | Y |
|---|---|---|---|---|
| $L_{A1066}$ | $R_{B1}$ | H | N | $Si(CH_3)_2$ |
| $L_{A1067}$ | $R_{B3}$ | H | N | $Si(CH_3)_2$ |
| $L_{A1068}$ | $R_{B4}$ | H | N | $Si(CH_3)_2$ |
| $L_{A1069}$ | $R_{B7}$ | H | N | $Si(CH_3)_2$ |
| $L_{A1070}$ | $R_{B10}$ | H | N | $Si(CH_3)_2$ |
| $L_{A1071}$ | $R_{A3}$ | H | N | $Si(CH_3)_2$ |
| $L_{A1072}$ | $R_{A434}$ | H | N | $Si(CH_3)_2$ |
| $L_{A1073}$ | H | $R_{B1}$ | N | S |
| $L_{A1074}$ | $R_{B1}$ | $R_{B1}$ | N | S |
| $L_{A1075}$ | $R_{B3}$ | $R_{B1}$ | N | S |
| $L_{A1076}$ | $R_{B4}$ | $R_{B1}$ | N | S |
| $L_{A1077}$ | $R_{B7}$ | $R_{B1}$ | N | S |
| $L_{A1078}$ | $R_{B10}$ | $R_{B1}$ | N | S |
| $L_{A1079}$ | $R_{A3}$ | $R_{B1}$ | N | S |
| $L_{A1080}$ | $R_{A434}$ | $R_{B1}$ | N | S |
| $L_{A1081}$ | H | $R_{B1}$ | N | O |
| $L_{A1082}$ | $R_{B1}$ | $R_{B1}$ | N | O |
| $L_{A1083}$ | $R_{B3}$ | $R_{B1}$ | N | O |
| $L_{A1084}$ | $R_{B4}$ | $R_{B1}$ | N | O |
| $L_{A1085}$ | $R_{B7}$ | $R_{B1}$ | N | O |
| $L_{A1086}$ | $R_{B10}$ | $R_{B1}$ | N | O |
| $L_{A1087}$ | $R_{A3}$ | $R_{B1}$ | N | O |
| $L_{A1088}$ | $R_{A434}$ | $R_{B1}$ | N | O |
| $L_{A1089}$ | H | $R_{B1}$ | N | $NCH_3$ |
| $L_{A1090}$ | $R_{B1}$ | $R_{B1}$ | N | $NCH_3$ |
| $L_{A1091}$ | $R_{B3}$ | $R_{B1}$ | N | $NCH_3$ |
| $L_{A1092}$ | $R_{B4}$ | $R_{B1}$ | N | $NCH_3$ |
| $L_{A1093}$ | $R_{B7}$ | $R_{B1}$ | N | $NCH_3$ |
| $L_{A1094}$ | $R_{B10}$ | $R_{B1}$ | N | $NCH_3$ |
| $L_{A1095}$ | $R_{A3}$ | $R_{B1}$ | N | $NCH_3$ |
| $L_{A1096}$ | $R_{A434}$ | $R_{B1}$ | N | $NCH_3$ |
| $L_{A1097}$ | H | $R_{B1}$ | N | $C(CH_3)_2$ |
| $L_{A1098}$ | $R_{B1}$ | $R_{B1}$ | N | $C(CH_3)_2$ |
| $L_{A1099}$ | $R_{B3}$ | $R_{B1}$ | N | $C(CH_3)_2$ |
| $L_{A1100}$ | $R_{B4}$ | $R_{B1}$ | N | $C(CH_3)_2$ |
| $L_{A1101}$ | $R_{B7}$ | $R_{B1}$ | N | $C(CH_3)_2$ |
| $L_{A1102}$ | $R_{B10}$ | $R_{B1}$ | N | $C(CH_3)_2$ |
| $L_{A1103}$ | $R_{A3}$ | $R_{B1}$ | N | $C(CH_3)_2$ |
| $L_{A1104}$ | $R_{A434}$ | $R_{B1}$ | N | $C(CH_3)_2$ |
| $L_{A1105}$ | H | $R_{B1}$ | N | $Si(CH_3)_2$ |
| $L_{A1106}$ | $R_{B1}$ | $R_{B1}$ | N | $Si(CH_3)_2$ |
| $L_{A1107}$ | $R_{B3}$ | $R_{B1}$ | N | $Si(CH_3)_2$ |
| $L_{A1108}$ | $R_{B4}$ | $R_{B1}$ | N | $Si(CH_3)_2$ |
| $L_{A1109}$ | $R_{B7}$ | $R_{B1}$ | N | $Si(CH_3)_2$ |
| $L_{A1110}$ | $R_{B10}$ | $R_{B1}$ | N | $Si(CH_3)_2$ |
| $L_{A1111}$ | $R_{A3}$ | $R_{B1}$ | N | $Si(CH_3)_2$ |
| $L_{A1112}$ | $R_{A434}$ | $R_{B1}$ | N | $Si(CH_3)_2$ |
| $L_{A1113}$ | H | $R_{B2}$ | N | S |
| $L_{A1114}$ | $R_{B1}$ | $R_{B2}$ | N | S |
| $L_{A1115}$ | $R_{B3}$ | $R_{B2}$ | N | S |
| $L_{A1116}$ | $R_{B4}$ | $R_{B2}$ | N | S |
| $L_{A1117}$ | $R_{B7}$ | $R_{B2}$ | N | S |
| $L_{A1118}$ | $R_{B10}$ | $R_{B2}$ | N | S |
| $L_{A1119}$ | $R_{A3}$ | $R_{B2}$ | N | S |
| $L_{A1120}$ | $R_{A434}$ | $R_{B2}$ | N | S |
| $L_{A1121}$ | H | $R_{B2}$ | N | O |
| $L_{A1122}$ | $R_{B1}$ | $R_{B2}$ | N | O |
| $L_{A1123}$ | $R_{B3}$ | $R_{B2}$ | N | O |
| $L_{A1124}$ | $R_{B4}$ | $R_{B2}$ | N | O |
| $L_{A1125}$ | $R_{B7}$ | $R_{B2}$ | N | O |
| $L_{A1126}$ | $R_{B10}$ | $R_{B2}$ | N | O |
| $L_{A1127}$ | $R_{A3}$ | $R_{B2}$ | N | O |
| $L_{A1128}$ | $R_{A434}$ | $R_{B2}$ | N | O |
| $L_{A1129}$ | H | $R_{B2}$ | N | $NCH_3$ |
| $L_{A1130}$ | $R_{B1}$ | $R_{B2}$ | N | $NCH_3$ |
| $L_{A1131}$ | $R_{B3}$ | $R_{B2}$ | N | $NCH_3$ |
| $L_{A1132}$ | $R_{B4}$ | $R_{B2}$ | N | $NCH_3$ |
| $L_{A1133}$ | $R_{B7}$ | $R_{B2}$ | N | $NCH_3$ |
| $L_{A1134}$ | $R_{B10}$ | $R_{B2}$ | N | $NCH_3$ |
| $L_{A1135}$ | $R_{A3}$ | $R_{B2}$ | N | $NCH_3$ |
| $L_{A1136}$ | $R_{A434}$ | $R_{B2}$ | N | $NCH_3$ |
| $L_{A1137}$ | H | $R_{B2}$ | N | $C(CH_3)_2$ |
| $L_{A1138}$ | $R_{B1}$ | $R_{B2}$ | N | $C(CH_3)_2$ |
| $L_{A1139}$ | $R_{B3}$ | $R_{B2}$ | N | $C(CH_3)_2$ |
| $L_{A1140}$ | $R_{B4}$ | $R_{B2}$ | N | $C(CH_3)_2$ |
| $L_{A1141}$ | $R_{B7}$ | $R_{B2}$ | N | $C(CH_3)_2$ |
| $L_{A1142}$ | $R_{B10}$ | $R_{B2}$ | N | $C(CH_3)_2$ |

-continued

| Ligand | $R^1$ | $R^2$ | X | Y |
|---|---|---|---|---|
| $L_{A1143}$ | $R_{A3}$ | $R_{B2}$ | N | $C(CH_3)_2$ |
| $L_{A1144}$ | $R_{A434}$ | $R_{B2}$ | N | $C(CH_3)_2$ |
| $L_{A1145}$ | H | $R_{B2}$ | N | $Si(CH_3)_2$ |
| $L_{A1146}$ | $R_{B1}$ | $R_{B2}$ | N | $Si(CH_3)_2$ |
| $L_{A1147}$ | $R_{B3}$ | $R_{B2}$ | N | $Si(CH_3)_2$ |
| $L_{A1148}$ | $R_{B4}$ | $R_{B2}$ | N | $Si(CH_3)_2$ |
| $L_{A1149}$ | $R_{B7}$ | $R_{B2}$ | N | $Si(CH_3)_2$ |
| $L_{A1150}$ | $R_{B10}$ | $R_{B2}$ | N | $Si(CH_3)_2$ |
| $L_{A1151}$ | $R_{A3}$ | $R_{B2}$ | N | $Si(CH_3)_2$ |
| $L_{A1152}$ | $R_{A434}$ | $R_{B2}$ | N | $Si(CH_3)_2$ |

wherein $L_{A1153}$ through $L_{A1272}$ have a structure of Formula IX:

Formula IX

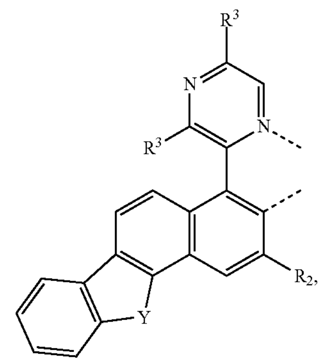

wherein $R^2$, $R^3$, and Y are defined as provided below:

| Ligand | $R^2$ | $R^3$ | Y | Ligand | $R^1$ | $R^2$ | $R^{14}$ |
|---|---|---|---|---|---|---|---|
| $L_{A1153}$ | H | H | S | $L_{A1213}$ | $R_{B1}$ | $R_{B4}$ | $NCH_3$ |
| $L_{A1154}$ | H | $R_{B1}$ | S | $L_{A1214}$ | $R_{B1}$ | $R_{B5}$ | $NCH_3$ |
| $L_{A1155}$ | H | $R_{B2}$ | S | $L_{A1215}$ | $R_{B1}$ | $R_{A434}$ | $NCH_3$ |
| $L_{A1156}$ | H | $R_{B3}$ | S | $L_{A1216}$ | $R_{B1}$ | $R_{A452}$ | $NCH_3$ |
| $L_{A1157}$ | H | $R_{B4}$ | S | $L_{A1217}$ | $R_{B1}$ | H | $C(CH_3)_2$ |
| $L_{A1158}$ | H | $R_{B5}$ | S | $L_{A1218}$ | $R_{B1}$ | $R_{B1}$ | $C(CH_3)_2$ |
| $L_{A1159}$ | H | $R_{A434}$ | S | $L_{A1219}$ | $R_{B1}$ | $R_{B2}$ | $C(CH_3)_2$ |
| $L_{A1160}$ | H | $R_{A452}$ | S | $L_{A1220}$ | $R_{B1}$ | $R_{B3}$ | $C(CH_3)_2$ |
| $L_{A1161}$ | H | H | O | $L_{A1221}$ | $R_{B1}$ | $R_{B4}$ | $C(CH_3)_2$ |
| $L_{A1162}$ | H | $R_{B1}$ | O | $L_{A1222}$ | $R_{B1}$ | $R_{B5}$ | $C(CH_3)_2$ |
| $L_{A1163}$ | H | $R_{B2}$ | O | $L_{A1223}$ | $R_{B1}$ | $R_{A434}$ | $C(CH_3)_2$ |
| $L_{A1164}$ | H | $R_{B3}$ | O | $L_{A1224}$ | $R_{B1}$ | $R_{A452}$ | $C(CH_3)_2$ |
| $L_{A1165}$ | H | $R_{B4}$ | O | $L_{A1225}$ | $R_{B1}$ | H | $Si(CH_3)_2$ |
| $L_{A1166}$ | H | $R_{B5}$ | O | $L_{A1226}$ | $R_{B1}$ | $R_{B1}$ | $Si(CH_3)_2$ |
| $L_{A1167}$ | H | $R_{A434}$ | O | $L_{A1227}$ | $R_{B1}$ | $R_{B2}$ | $Si(CH_3)_2$ |
| $L_{A1168}$ | H | $R_{A452}$ | O | $L_{A1228}$ | $R_{B1}$ | $R_{B3}$ | $Si(CH_3)_2$ |
| $L_{A1169}$ | H | H | $NCH_3$ | $L_{A1229}$ | $R_{B1}$ | $R_{B4}$ | $Si(CH_3)_2$ |
| $L_{A1170}$ | H | $R_{B1}$ | $NCH_3$ | $L_{A1230}$ | $R_{B1}$ | $R_{B5}$ | $Si(CH_3)_2$ |
| $L_{A1171}$ | H | $R_{B2}$ | $NCH_3$ | $L_{A1231}$ | $R_{B1}$ | $R_{A434}$ | $Si(CH_3)_2$ |
| $L_{A1172}$ | H | $R_{B3}$ | $NCH_3$ | $L_{A1232}$ | $R_{B1}$ | $R_{A452}$ | $Si(CH_3)_2$ |
| $L_{A1173}$ | H | $R_{B4}$ | $NCH_3$ | $L_{A1233}$ | $R_{B2}$ | H | S |
| $L_{A1174}$ | H | $R_{B5}$ | $NCH_3$ | $L_{A1234}$ | $R_{B2}$ | $R_{B1}$ | S |
| $L_{A1175}$ | H | $R_{A434}$ | $NCH_3$ | $L_{A1235}$ | $R_{B2}$ | $R_{B2}$ | S |
| $L_{A1176}$ | H | $R_{A452}$ | $NCH_3$ | $L_{A1236}$ | $R_{B2}$ | $R_{B3}$ | S |
| $L_{A1177}$ | H | H | $C(CH_3)_2$ | $L_{A1237}$ | $R_{B2}$ | $R_{B4}$ | S |
| $L_{A1178}$ | H | $R_{B1}$ | $C(CH_3)_2$ | $L_{A1238}$ | $R_{B2}$ | $R_{B5}$ | S |
| $L_{A1179}$ | H | $R_{B2}$ | $C(CH_3)_2$ | $L_{A1239}$ | $R_{B2}$ | $R_{A434}$ | S |
| $L_{A1180}$ | H | $R_{B3}$ | $C(CH_3)_2$ | $L_{A1240}$ | $R_{B2}$ | $R_{A452}$ | S |
| $L_{A1181}$ | H | $R_{B4}$ | $C(CH_3)_2$ | $L_{A1241}$ | $R_{B2}$ | H | O |
| $L_{A1182}$ | H | $R_{B5}$ | $C(CH_3)_2$ | $L_{A1242}$ | $R_{B2}$ | $R_{B1}$ | O |
| $L_{A1183}$ | H | $R_{A434}$ | $C(CH_3)_2$ | $L_{A1243}$ | $R_{B2}$ | $R_{B2}$ | O |
| $L_{A1184}$ | H | $R_{A452}$ | $C(CH_3)_2$ | $L_{A1244}$ | $R_{B2}$ | $R_{B3}$ | O |
| $L_{A1185}$ | H | H | $Si(CH_3)_2$ | $L_{A1245}$ | $R_{B2}$ | $R_{B4}$ | O |
| $L_{A1186}$ | H | $R_{B1}$ | $Si(CH_3)_2$ | $L_{A1246}$ | $R_{B2}$ | $R_{B5}$ | O |
| $L_{A1187}$ | H | $R_{B2}$ | $Si(CH_3)_2$ | $L_{A1247}$ | $R_{B2}$ | $R_{A434}$ | O |
| $L_{A1188}$ | H | $R_{B3}$ | $Si(CH_3)_2$ | $L_{A1248}$ | $R_{B2}$ | $R_{A452}$ | O |

-continued

| Ligand | $R^2$ | $R^3$ | Y | Ligand | $R^1$ | $R^2$ | $R^{14}$ |
|---|---|---|---|---|---|---|---|
| $L_{A1189}$ | H | $R_{B4}$ | $Si(CH_3)_2$ | $L_{A1249}$ | $R_{B2}$ | H | $NCH_3$ |
| $L_{A1190}$ | H | $R_{B5}$ | $Si(CH_3)_2$ | $L_{A1250}$ | $R_{B2}$ | $R_{B1}$ | $NCH_3$ |
| $L_{A1191}$ | H | $R_{A34}$ | $Si(CH_3)_2$ | $L_{A1251}$ | $R_{B2}$ | $R_{B2}$ | $NCH_3$ |
| $L_{A1192}$ | H | $R_{A52}$ | $Si(CH_3)_2$ | $L_{A1252}$ | $R_{B2}$ | $R_{B3}$ | $NCH_3$ |
| $L_{A1193}$ | $R_{B1}$ | H | S | $L_{A1253}$ | $R_{B2}$ | $R_{B4}$ | $NCH_3$ |
| $L_{A1194}$ | $R_{B1}$ | $R_{B1}$ | S | $L_{A1254}$ | $R_{B2}$ | $R_{B5}$ | $NCH_3$ |
| $L_{A1195}$ | $R_{B1}$ | $R_{B2}$ | S | $L_{A1255}$ | $R_{B2}$ | $R_{A34}$ | $NCH_3$ |
| $L_{A1196}$ | $R_{B1}$ | $R_{B3}$ | S | $L_{A1256}$ | $R_{B2}$ | $R_{A52}$ | $NCH_3$ |
| $L_{A1197}$ | $R_{B1}$ | $R_{B4}$ | S | $L_{A1257}$ | $R_{B2}$ | H | $C(CH_3)_2$ |
| $L_{A1198}$ | $R_{B1}$ | $R_{B5}$ | S | $L_{A1258}$ | $R_{B2}$ | $R_{B1}$ | $C(CH_3)_2$ |
| $L_{A1199}$ | $R_{B1}$ | $R_{A34}$ | S | $L_{A1259}$ | $R_{B2}$ | $R_{B2}$ | $C(CH_3)_2$ |
| $L_{A1200}$ | $R_{B1}$ | $R_{A52}$ | S | $L_{A1260}$ | $R_{B2}$ | $R_{B3}$ | $C(CH_3)_2$ |
| $L_{A1201}$ | $R_{B1}$ | H | O | $L_{A1261}$ | $R_{B2}$ | $R_{B4}$ | $C(CH_3)_2$ |
| $L_{A1202}$ | $R_{B1}$ | $R_{B1}$ | O | $L_{A1262}$ | $R_{B2}$ | $R_{B5}$ | $C(CH_3)_2$ |
| $L_{A1203}$ | $R_{B1}$ | $R_{B2}$ | O | $L_{A1263}$ | $R_{B2}$ | $R_{A34}$ | $C(CH_3)_2$ |
| $L_{A1204}$ | $R_{B1}$ | $R_{B3}$ | O | $L_{A1264}$ | $R_{B2}$ | $R_{A52}$ | $C(CH_3)_2$ |
| $L_{A1205}$ | $R_{B1}$ | $R_{B4}$ | O | $L_{A1265}$ | $R_{B2}$ | H | $Si(CH_3)_2$ |
| $L_{A1206}$ | $R_{B1}$ | $R_{B5}$ | O | $L_{A1266}$ | $R_{B2}$ | $R_{B1}$ | $Si(CH_3)_2$ |
| $L_{A1207}$ | $R_{B1}$ | $R_{A34}$ | O | $L_{A1267}$ | $R_{B2}$ | $R_{B2}$ | $Si(CH_3)_2$ |
| $L_{A1208}$ | $R_{B1}$ | $R_{A52}$ | O | $L_{A1268}$ | $R_{B2}$ | $R_{B3}$ | $Si(CH_3)_2$ |
| $L_{A1209}$ | $R_{B1}$ | H | $NCH_3$ | $L_{A1269}$ | $R_{B2}$ | $R_{B4}$ | $Si(CH_3)_2$ |
| $L_{A1210}$ | $R_{B1}$ | $R_{B1}$ | $NCH_3$ | $L_{A1270}$ | $R_{B2}$ | $R_{B5}$ | $Si(CH_3)_2$ |
| $L_{A1211}$ | $R_{B1}$ | $R_{B2}$ | $NCH_3$ | $L_{A1271}$ | $R_{B2}$ | $R_{A34}$ | $Si(CH_3)_2$ |
| $L_{A1212}$ | $R_{B1}$ | $R_{B3}$ | $NCH_3$ | $L_{A1272}$ | $R_{B2}$ | $R_{A52}$ | $Si(CH_3)_2$ |

wherein $L_{A1273}$ through $L_{A1368}$ have a structure of Formula X:

Formula X

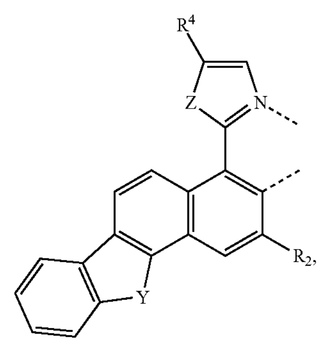

wherein $R^2$, $R^4$, Y, and Z are defined as provided below:

| Ligand | $R^2$ | $R^4$ | Y | Z |
|---|---|---|---|---|
| $L_{A1273}$ | H | H | S | S |
| $L_{A1274}$ | H | $R_{B1}$ | S | S |
| $L_{A1275}$ | H | $R_{B3}$ | S | S |
| $L_{A1276}$ | H | $R_{B4}$ | S | S |
| $L_{A1277}$ | H | $R_{B7}$ | S | S |
| $L_{A1278}$ | H | $R_{B10}$ | S | S |
| $L_{A1279}$ | H | $R_{A3}$ | S | S |
| $L_{A1280}$ | H | $R_{A34}$ | S | S |
| $L_{A1281}$ | H | H | S | O |
| $L_{A1282}$ | H | $R_{B1}$ | S | O |
| $L_{A1283}$ | H | $R_{B3}$ | S | O |
| $L_{A1284}$ | H | $R_{B4}$ | S | O |
| $L_{A1285}$ | H | $R_{B7}$ | S | O |
| $L_{A1286}$ | H | $R_{B10}$ | S | O |
| $L_{A1287}$ | H | $R_{A3}$ | S | O |
| $L_{A1288}$ | H | $R_{A34}$ | S | O |
| $L_{A1289}$ | H | H | S | $NCH_3$ |
| $L_{A1290}$ | H | $R_{B1}$ | S | $NCH_3$ |
| $L_{A1291}$ | H | $R_{B3}$ | S | $NCH_3$ |
| $L_{A1292}$ | H | $R_{B4}$ | S | $NCH_3$ |
| $L_{A1293}$ | H | $R_{B7}$ | S | $NCH_3$ |
| $L_{A1294}$ | H | $R_{B10}$ | S | $NCH_3$ |
| $L_{A1295}$ | H | $R_{A3}$ | S | $NCH_3$ |

-continued

| Ligand | $R^2$ | $R^4$ | Y | Z |
|---|---|---|---|---|
| $L_{A1296}$ | H | $R_{A34}$ | S | $NCH_3$ |
| $L_{A1297}$ | H | H | O | S |
| $L_{A1298}$ | H | $R_{B1}$ | O | S |
| $L_{A1299}$ | H | $R_{B3}$ | O | S |
| $L_{A1300}$ | H | $R_{B4}$ | O | S |
| $L_{A1301}$ | H | $R_{B7}$ | O | S |
| $L_{A1302}$ | H | $R_{B10}$ | O | S |
| $L_{A1303}$ | H | $R_{A3}$ | O | S |
| $L_{A1304}$ | H | $R_{A34}$ | O | S |
| $L_{A1305}$ | H | H | O | O |
| $L_{A1306}$ | H | $R_{B1}$ | O | O |
| $L_{A1307}$ | H | $R_{B3}$ | O | O |
| $L_{A1308}$ | H | $R_{B4}$ | O | O |
| $L_{A1309}$ | H | $R_{B7}$ | O | O |
| $L_{A1310}$ | H | $R_{B10}$ | O | O |
| $L_{A1311}$ | H | $R_{A3}$ | O | O |
| $L_{A1312}$ | H | $R_{A34}$ | O | O |
| $L_{A1313}$ | H | H | O | $NCH_3$ |
| $L_{A1314}$ | H | $R_{B1}$ | O | $NCH_3$ |
| $L_{A1315}$ | H | $R_{B3}$ | O | $NCH_3$ |
| $L_{A1316}$ | H | $R_{B4}$ | O | $NCH_3$ |
| $L_{A1317}$ | H | $R_{B7}$ | O | $NCH_3$ |
| $L_{A1318}$ | H | $R_{B10}$ | O | $NCH_3$ |
| $L_{A1319}$ | H | $R_{A3}$ | O | $NCH_3$ |
| $L_{A1320}$ | H | $R_{A34}$ | O | $NCH_3$ |
| $L_{A1321}$ | $R_{B1}$ | H | S | S |
| $L_{A1322}$ | $R_{B1}$ | $R_{B1}$ | S | S |
| $L_{A1323}$ | $R_{B1}$ | $R_{B3}$ | S | S |
| $L_{A1324}$ | $R_{B1}$ | $R_{B4}$ | S | S |
| $L_{A1325}$ | $R_{B1}$ | $R_{B7}$ | S | S |
| $L_{A1326}$ | $R_{B1}$ | $R_{B10}$ | S | S |
| $L_{A1327}$ | $R_{B1}$ | $R_{A3}$ | S | S |
| $L_{A1328}$ | $R_{B1}$ | $R_{A34}$ | S | S |
| $L_{A1329}$ | $R_{B1}$ | H | S | O |
| $L_{A1330}$ | $R_{B1}$ | $R_{B1}$ | S | O |
| $L_{A1331}$ | $R_{B1}$ | $R_{B3}$ | S | O |
| $L_{A1332}$ | $R_{B1}$ | $R_{B4}$ | S | O |
| $L_{A1333}$ | $R_{B1}$ | $R_{B7}$ | S | O |
| $L_{A1334}$ | $R_{B1}$ | $R_{B10}$ | S | O |
| $L_{A1335}$ | $R_{B1}$ | $R_{A3}$ | S | O |
| $L_{A1336}$ | $R_{B1}$ | $R_{A34}$ | S | O |
| $L_{A1337}$ | $R_{B1}$ | H | S | $NCH_3$ |
| $L_{A1338}$ | $R_{B1}$ | $R_{B1}$ | S | $NCH_3$ |
| $L_{A1339}$ | $R_{B1}$ | $R_{B3}$ | S | $NCH_3$ |
| $L_{A1340}$ | $R_{B1}$ | $R_{B4}$ | S | $NCH_3$ |
| $L_{A1341}$ | $R_{B1}$ | $R_{B7}$ | S | $NCH_3$ |
| $L_{A1342}$ | $R_{B1}$ | $R_{B10}$ | S | $NCH_3$ |
| $L_{A1343}$ | $R_{B1}$ | $R_{A3}$ | S | $NCH_3$ |
| $L_{A1344}$ | $R_{B1}$ | $R_{A34}$ | S | $NCH_3$ |
| $L_{A1345}$ | $R_{B1}$ | H | O | S |
| $L_{A1346}$ | $R_{B1}$ | $R_{B1}$ | O | S |
| $L_{A1347}$ | $R_{B1}$ | $R_{B3}$ | O | S |
| $L_{A1348}$ | $R_{B1}$ | $R_{B4}$ | O | S |
| $L_{A1349}$ | $R_{B1}$ | $R_{B7}$ | O | S |
| $L_{A1350}$ | $R_{B1}$ | $R_{B10}$ | O | S |
| $L_{A1351}$ | $R_{B1}$ | $R_{A3}$ | O | S |
| $L_{A1352}$ | $R_{B1}$ | $R_{A34}$ | O | S |
| $L_{A1353}$ | $R_{B1}$ | H | O | O |
| $L_{A1354}$ | $R_{B1}$ | $R_{B1}$ | O | O |
| $L_{A1355}$ | $R_{B1}$ | $R_{B3}$ | O | O |
| $L_{A1356}$ | $R_{B1}$ | $R_{B4}$ | O | O |
| $L_{A1357}$ | $R_{B1}$ | $R_{B7}$ | O | O |
| $L_{A1358}$ | $R_{B1}$ | $R_{B10}$ | O | O |
| $L_{A1359}$ | $R_{B1}$ | $R_{A3}$ | O | O |
| $L_{A1360}$ | $R_{B1}$ | $R_{A34}$ | O | O |
| $L_{A1361}$ | $R_{B1}$ | H | O | $NCH_3$ |
| $L_{A1362}$ | $R_{B1}$ | $R_{B1}$ | O | $NCH_3$ |
| $L_{A1363}$ | $R_{B1}$ | $R_{B3}$ | O | $NCH_3$ |
| $L_{A1364}$ | $R_{B1}$ | $R_{B4}$ | O | $NCH_3$ |
| $L_{A1365}$ | $R_{B1}$ | $R_{B7}$ | O | $NCH_3$ |
| $L_{A1366}$ | $R_{B1}$ | $R_{B10}$ | O | $NCH_3$ |
| $L_{A1367}$ | $R_{B1}$ | $R_{A3}$ | O | $NCH_3$ |
| $L_{A1368}$ | $R_{B1}$ | $R_{A34}$ | O | $NCH_3$ |

wherein $L_{A1369}$ through $L_{A1608}$ have a structure of Formula XI:

Formula XI

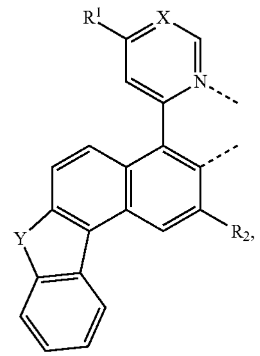

wherein $R^1$, $R^2$, X, and Y are defined as provided below:

| Ligand | $R^1$ | $R^2$ | X | Y |
| --- | --- | --- | --- | --- |
| $L_{A1369}$ | H | H | C | S |
| $L_{A1370}$ | $R_{B1}$ | H | C | S |
| $L_{A1371}$ | $R_{B3}$ | H | C | S |
| $L_{A1372}$ | $R_{B4}$ | H | C | S |
| $L_{A1373}$ | $R_{B7}$ | H | C | S |
| $L_{A1374}$ | $R_{B10}$ | H | C | S |
| $L_{A1375}$ | $R_{A3}$ | H | C | S |
| $L_{A1376}$ | $R_{A34}$ | H | C | S |
| $L_{A1377}$ | H | H | C | O |
| $L_{A1378}$ | $R_{B1}$ | H | C | O |
| $L_{A1379}$ | $R_{B3}$ | H | C | O |
| $L_{A1380}$ | $R_{B4}$ | H | C | O |
| $L_{A1381}$ | $R_{B7}$ | H | C | O |
| $L_{A1382}$ | $R_{B10}$ | H | C | O |
| $L_{A1383}$ | $R_{A3}$ | H | C | O |
| $L_{A1384}$ | $R_{A34}$ | H | C | O |
| $L_{A1385}$ | H | H | C | $NCH_3$ |
| $L_{A1386}$ | $R_{B1}$ | H | C | $NCH_3$ |
| $L_{A1387}$ | $R_{B3}$ | H | C | $NCH_3$ |
| $L_{A1388}$ | $R_{B4}$ | H | C | $NCH_3$ |
| $L_{A1389}$ | $R_{B7}$ | H | C | $NCH_3$ |
| $L_{A1390}$ | $R_{B10}$ | H | C | $NCH_3$ |
| $L_{A1391}$ | $R_{A3}$ | H | C | $NCH_3$ |
| $L_{A1392}$ | $R_{A34}$ | H | C | $NCH_3$ |
| $L_{A1393}$ | H | H | C | $C(CH_3)_2$ |
| $L_{A1394}$ | $R_{B1}$ | H | C | $C(CH_3)_2$ |
| $L_{A1395}$ | $R_{B3}$ | H | C | $C(CH_3)_2$ |
| $L_{A1396}$ | $R_{B4}$ | H | C | $C(CH_3)_2$ |
| $L_{A1397}$ | $R_{B7}$ | H | C | $C(CH_3)_2$ |
| $L_{A1398}$ | $R_{B10}$ | H | C | $C(CH_3)_2$ |
| $L_{A1399}$ | $R_{A3}$ | H | C | $C(CH_3)_2$ |
| $L_{A1400}$ | $R_{A34}$ | H | C | $C(CH_3)_2$ |
| $L_{A1401}$ | H | H | C | $Si(CH_3)_2$ |
| $L_{A1402}$ | $R_{B1}$ | H | C | $Si(CH_3)_2$ |
| $L_{A1403}$ | $R_{B3}$ | H | C | $Si(CH_3)_2$ |
| $L_{A1404}$ | $R_{B4}$ | H | C | $Si(CH_3)_2$ |
| $L_{A1405}$ | $R_{B7}$ | H | C | $Si(CH_3)_2$ |
| $L_{A1406}$ | $R_{B10}$ | H | C | $Si(CH_3)_2$ |
| $L_{A1407}$ | $R_{A3}$ | H | C | $Si(CH_3)_2$ |
| $L_{A1408}$ | $R_{A34}$ | H | C | $Si(CH_3)_2$ |
| $L_{A1409}$ | H | $R_{B1}$ | C | S |
| $L_{A1410}$ | $R_{B1}$ | $R_{B1}$ | C | S |
| $L_{A1411}$ | $R_{B3}$ | $R_{B1}$ | C | S |
| $L_{A1412}$ | $R_{B4}$ | $R_{B1}$ | C | S |
| $L_{A1413}$ | $R_{B7}$ | $R_{B1}$ | C | S |
| $L_{A1414}$ | $R_{B10}$ | $R_{B1}$ | C | S |
| $L_{A1415}$ | $R_{A3}$ | $R_{B1}$ | C | S |
| $L_{A1416}$ | $R_{A34}$ | $R_{B1}$ | C | S |
| $L_{A1417}$ | H | $R_{B1}$ | C | O |
| $L_{A1418}$ | $R_{B1}$ | $R_{B1}$ | C | O |
| $L_{A1419}$ | $R_{B3}$ | $R_{B1}$ | C | O |
| $L_{A1420}$ | $R_{B4}$ | $R_{B1}$ | C | O |

-continued

| Ligand | $R^1$ | $R^2$ | X | Y |
| --- | --- | --- | --- | --- |
| $L_{A1421}$ | $R_{B7}$ | $R_{B1}$ | C | O |
| $L_{A1422}$ | $R_{B10}$ | $R_{B1}$ | C | O |
| $L_{A1423}$ | $R_{A3}$ | $R_{B1}$ | C | O |
| $L_{A1424}$ | $R_{A34}$ | $R_{B1}$ | C | O |
| $L_{A1425}$ | H | $R_{B1}$ | C | $NCH_3$ |
| $L_{A1426}$ | $R_{B1}$ | $R_{B1}$ | C | $NCH_3$ |
| $L_{A1427}$ | $R_{B3}$ | $R_{B1}$ | C | $NCH_3$ |
| $L_{A1428}$ | $R_{B4}$ | $R_{B1}$ | C | $NCH_3$ |
| $L_{A1429}$ | $R_{B7}$ | $R_{B1}$ | C | $NCH_3$ |
| $L_{A1430}$ | $R_{B10}$ | $R_{B1}$ | C | $NCH_3$ |
| $L_{A1431}$ | $R_{A3}$ | $R_{B1}$ | C | $NCH_3$ |
| $L_{A1432}$ | $R_{A34}$ | $R_{B1}$ | C | $NCH_3$ |
| $L_{A1433}$ | H | $R_{B1}$ | C | $C(CH_3)_2$ |
| $L_{A1434}$ | $R_{B1}$ | $R_{B1}$ | C | $C(CH_3)_2$ |
| $L_{A1435}$ | $R_{B3}$ | $R_{B1}$ | C | $C(CH_3)_2$ |
| $L_{A1436}$ | $R_{B4}$ | $R_{B1}$ | C | $C(CH_3)_2$ |
| $L_{A1437}$ | $R_{B7}$ | $R_{B1}$ | C | $C(CH_3)_2$ |
| $L_{A1438}$ | $R_{B10}$ | $R_{B1}$ | C | $C(CH_3)_2$ |
| $L_{A1439}$ | $R_{A3}$ | $R_{B1}$ | C | $C(CH_3)_2$ |
| $L_{A1440}$ | $R_{A34}$ | $R_{B1}$ | C | $C(CH_3)_2$ |
| $L_{A1441}$ | H | $R_{B1}$ | C | $Si(CH_3)_2$ |
| $L_{A1442}$ | $R_{B1}$ | $R_{B1}$ | C | $Si(CH_3)_2$ |
| $L_{A1443}$ | $R_{B3}$ | $R_{B1}$ | C | $Si(CH_3)_2$ |
| $L_{A1444}$ | $R_{B4}$ | $R_{B1}$ | C | $Si(CH_3)_2$ |
| $L_{A1445}$ | $R_{B7}$ | $R_{B1}$ | C | $Si(CH_3)_2$ |
| $L_{A1446}$ | $R_{B10}$ | $R_{B1}$ | C | $Si(CH_3)_2$ |
| $L_{A1447}$ | $R_{A3}$ | $R_{B1}$ | C | $Si(CH_3)_2$ |
| $L_{A1448}$ | $R_{A34}$ | $R_{B1}$ | C | $Si(CH_3)_2$ |
| $L_{A1449}$ | H | $R_{B2}$ | C | S |
| $L_{A1450}$ | $R_{B1}$ | $R_{B2}$ | C | S |
| $L_{A1451}$ | $R_{B3}$ | $R_{B2}$ | C | S |
| $L_{A1452}$ | $R_{B4}$ | $R_{B2}$ | C | S |
| $L_{A1453}$ | $R_{B7}$ | $R_{B2}$ | C | S |
| $L_{A1454}$ | $R_{B10}$ | $R_{B2}$ | C | S |
| $L_{A1455}$ | $R_{A3}$ | $R_{B2}$ | C | S |
| $L_{A1456}$ | $R_{A34}$ | $R_{B2}$ | C | S |
| $L_{A1457}$ | H | $R_{B2}$ | C | O |
| $L_{A1458}$ | $R_{B1}$ | $R_{B2}$ | C | O |
| $L_{A1459}$ | $R_{B3}$ | $R_{B2}$ | C | O |
| $L_{A1460}$ | $R_{B4}$ | $R_{B2}$ | C | O |
| $L_{A1461}$ | $R_{B7}$ | $R_{B2}$ | C | O |
| $L_{A1462}$ | $R_{B10}$ | $R_{B2}$ | C | O |
| $L_{A1463}$ | $R_{A3}$ | $R_{B2}$ | C | O |
| $L_{A1464}$ | $R_{A34}$ | $R_{B2}$ | C | O |
| $L_{A1465}$ | H | $R_{B2}$ | C | $NCH_3$ |
| $L_{A1466}$ | $R_{B1}$ | $R_{B2}$ | C | $NCH_3$ |
| $L_{A1467}$ | $R_{B3}$ | $R_{B2}$ | C | $NCH_3$ |
| $L_{A1468}$ | $R_{B4}$ | $R_{B2}$ | C | $NCH_3$ |
| $L_{A1469}$ | $R_{B7}$ | $R_{B2}$ | C | $NCH_3$ |
| $L_{A1470}$ | $R_{B10}$ | $R_{B2}$ | C | $NCH_3$ |
| $L_{A1471}$ | $R_{A3}$ | $R_{B2}$ | C | $NCH_3$ |
| $L_{A1472}$ | $R_{A34}$ | $R_{B2}$ | C | $NCH_3$ |
| $L_{A1473}$ | H | $R_{B2}$ | C | $C(CH_3)_2$ |
| $L_{A1474}$ | $R_{B1}$ | $R_{B2}$ | C | $C(CH_3)_2$ |
| $L_{A1475}$ | $R_{B3}$ | $R_{B2}$ | C | $C(CH_3)_2$ |
| $L_{A1476}$ | $R_{B4}$ | $R_{B2}$ | C | $C(CH_3)_2$ |
| $L_{A1477}$ | $R_{B7}$ | $R_{B2}$ | C | $C(CH_3)_2$ |
| $L_{A1478}$ | $R_{B10}$ | $R_{B2}$ | C | $C(CH_3)_2$ |
| $L_{A1479}$ | $R_{A3}$ | $R_{B2}$ | C | $C(CH_3)_2$ |
| $L_{A1480}$ | $R_{A34}$ | $R_{B2}$ | C | $C(CH_3)_2$ |
| $L_{A1481}$ | H | $R_{B2}$ | C | $Si(CH_3)_2$ |
| $L_{A1482}$ | $R_{B1}$ | $R_{B2}$ | C | $Si(CH_3)_2$ |
| $L_{A1483}$ | $R_{B3}$ | $R_{B2}$ | C | $Si(CH_3)_2$ |
| $L_{A1484}$ | $R_{B4}$ | $R_{B2}$ | C | $Si(CH_3)_2$ |
| $L_{A1485}$ | $R_{B7}$ | $R_{B2}$ | C | $Si(CH_3)_2$ |
| $L_{A1486}$ | $R_{B10}$ | $R_{B2}$ | C | $Si(CH_3)_2$ |
| $L_{A1487}$ | $R_{A3}$ | $R_{B2}$ | C | $Si(CH_3)_2$ |
| $L_{A1488}$ | $R_{A34}$ | $R_{B2}$ | C | $Si(CH_3)_2$ |
| $L_{A1489}$ | H | H | N | S |
| $L_{A1490}$ | $R_{B1}$ | H | N | S |
| $L_{A1491}$ | $R_{B3}$ | H | N | S |
| $L_{A1492}$ | $R_{B4}$ | H | N | S |
| $L_{A1493}$ | $R_{B7}$ | H | N | S |
| $L_{A1494}$ | $R_{B10}$ | H | N | S |
| $L_{A1495}$ | $R_{A3}$ | H | N | S |
| $L_{A1496}$ | $R_{A34}$ | H | N | S |
| $L_{A1497}$ | H | H | N | O |

| Ligand | $R^1$ | $R^2$ | X | Y |
|---|---|---|---|---|
| $L_{A1498}$ | $R_{B1}$ | H | N | O |
| $L_{A1499}$ | $R_{B3}$ | H | N | O |
| $L_{A1500}$ | $R_{B4}$ | H | N | O |
| $L_{A1501}$ | $R_{B7}$ | H | N | O |
| $L_{A1502}$ | $R_{B10}$ | H | N | O |
| $L_{A1503}$ | $R_{A3}$ | H | N | O |
| $L_{A1504}$ | $R_{A34}$ | H | N | O |
| $L_{A1505}$ | H | H | N | $NCH_3$ |
| $L_{A1506}$ | $R_{B1}$ | H | N | $NCH_3$ |
| $L_{A1507}$ | $R_{B3}$ | H | N | $NCH_3$ |
| $L_{A1508}$ | $R_{B4}$ | H | N | $NCH_3$ |
| $L_{A1509}$ | $R_{B7}$ | H | N | $NCH_3$ |
| $L_{A1510}$ | $R_{B10}$ | H | N | $NCH_3$ |
| $L_{A1511}$ | $R_{A3}$ | H | N | $NCH_3$ |
| $L_{A1512}$ | $R_{A34}$ | H | N | $NCH_3$ |
| $L_{A1513}$ | H | H | N | $C(CH_3)_2$ |
| $L_{A1514}$ | $R_{B1}$ | H | N | $C(CH_3)_2$ |
| $L_{A1515}$ | $R_{B3}$ | H | N | $C(CH_3)_2$ |
| $L_{A1516}$ | $R_{B4}$ | H | N | $C(CH_3)_2$ |
| $L_{A1517}$ | $R_{B7}$ | H | N | $C(CH_3)_2$ |
| $L_{A1518}$ | $R_{B10}$ | H | N | $C(CH_3)_2$ |
| $L_{A1519}$ | $R_{A3}$ | H | N | $C(CH_3)_2$ |
| $L_{A1520}$ | $R_{A34}$ | H | N | $C(CH_3)_2$ |
| $L_{A1521}$ | H | H | N | $Si(CH_3)_2$ |
| $L_{A1522}$ | $R_{B1}$ | H | N | $Si(CH_3)_2$ |
| $L_{A1523}$ | $R_{B3}$ | H | N | $Si(CH_3)_2$ |
| $L_{A1524}$ | $R_{B4}$ | H | N | $Si(CH_3)_2$ |
| $L_{A1525}$ | $R_{B7}$ | H | N | $Si(CH_3)_2$ |
| $L_{A1526}$ | $R_{B10}$ | H | N | $Si(CH_3)_2$ |
| $L_{A1527}$ | $R_{A3}$ | H | N | $Si(CH_3)_2$ |
| $L_{A1528}$ | $R_{A34}$ | H | N | $Si(CH_3)_2$ |
| $L_{A1529}$ | H | $R_{B1}$ | N | S |
| $L_{A1530}$ | $R_{B1}$ | $R_{B1}$ | N | S |
| $L_{A1531}$ | $R_{B3}$ | $R_{B1}$ | N | S |
| $L_{A1532}$ | $R_{B4}$ | $R_{B1}$ | N | S |
| $L_{A1533}$ | $R_{B7}$ | $R_{B1}$ | N | S |
| $L_{A1534}$ | $R_{B10}$ | $R_{B1}$ | N | S |
| $L_{A1535}$ | $R_{A3}$ | $R_{B1}$ | N | S |
| $L_{A1536}$ | $R_{A34}$ | $R_{B1}$ | N | S |
| $L_{A1537}$ | H | $R_{B1}$ | N | O |
| $L_{A1538}$ | $R_{B1}$ | $R_{B1}$ | N | O |
| $L_{A1539}$ | $R_{B3}$ | $R_{B1}$ | N | O |
| $L_{A1540}$ | $R_{B4}$ | $R_{B1}$ | N | O |
| $L_{A1541}$ | $R_{B7}$ | $R_{B1}$ | N | O |
| $L_{A1542}$ | $R_{B10}$ | $R_{B1}$ | N | O |
| $L_{A1543}$ | $R_{A3}$ | $R_{B1}$ | N | O |
| $L_{A1544}$ | $R_{A34}$ | $R_{B1}$ | N | O |
| $L_{A1545}$ | H | $R_{B1}$ | N | $NCH_3$ |
| $L_{A1546}$ | $R_{B1}$ | $R_{B1}$ | N | $NCH_3$ |
| $L_{A1547}$ | $R_{B3}$ | $R_{B1}$ | N | $NCH_3$ |
| $L_{A1548}$ | $R_{B4}$ | $R_{B1}$ | N | $NCH_3$ |
| $L_{A1549}$ | $R_{B7}$ | $R_{B1}$ | N | $NCH_3$ |
| $L_{A1550}$ | $R_{B10}$ | $R_{B1}$ | N | $NCH_3$ |
| $L_{A1551}$ | $R_{A3}$ | $R_{B1}$ | N | $NCH_3$ |
| $L_{A1552}$ | $R_{A34}$ | $R_{B1}$ | N | $NCH_3$ |
| $L_{A1553}$ | H | $R_{B1}$ | N | $C(CH_3)_2$ |
| $L_{A1554}$ | $R_{B1}$ | $R_{B1}$ | N | $C(CH_3)_2$ |
| $L_{A1555}$ | $R_{B3}$ | $R_{B1}$ | N | $C(CH_3)_2$ |
| $L_{A1556}$ | $R_{B4}$ | $R_{B1}$ | N | $C(CH_3)_2$ |
| $L_{A1557}$ | $R_{B7}$ | $R_{B1}$ | N | $C(CH_3)_2$ |
| $L_{A1558}$ | $R_{B10}$ | $R_{B1}$ | N | $C(CH_3)_2$ |
| $L_{A1559}$ | $R_{A3}$ | $R_{B1}$ | N | $C(CH_3)_2$ |
| $L_{A1560}$ | $R_{A34}$ | $R_{B1}$ | N | $C(CH_3)_2$ |
| $L_{A1561}$ | H | $R_{B1}$ | N | $Si(CH_3)_2$ |
| $L_{A1562}$ | $R_{B1}$ | $R_{B1}$ | N | $Si(CH_3)_2$ |
| $L_{A1563}$ | $R_{B3}$ | $R_{B1}$ | N | $Si(CH_3)_2$ |
| $L_{A1564}$ | $R_{B4}$ | $R_{B1}$ | N | $Si(CH_3)_2$ |
| $L_{A1565}$ | $R_{B7}$ | $R_{B1}$ | N | $Si(CH_3)_2$ |
| $L_{A1566}$ | $R_{B10}$ | $R_{B1}$ | N | $Si(CH_3)_2$ |
| $L_{A1567}$ | $R_{A3}$ | $R_{B1}$ | N | $Si(CH_3)_2$ |
| $L_{A1568}$ | $R_{A34}$ | $R_{B1}$ | N | $Si(CH_3)_2$ |
| $L_{A1569}$ | H | $R_{B2}$ | N | S |
| $L_{A1570}$ | $R_{B1}$ | $R_{B2}$ | N | S |
| $L_{A1571}$ | $R_{B3}$ | $R_{B2}$ | N | S |
| $L_{A1572}$ | $R_{B4}$ | $R_{B2}$ | N | S |
| $L_{A1573}$ | $R_{B7}$ | $R_{B2}$ | N | S |
| $L_{A1574}$ | $R_{B10}$ | $R_{B2}$ | N | S |

| Ligand | $R^1$ | $R^2$ | X | Y |
|---|---|---|---|---|
| $L_{A1575}$ | $R_{A3}$ | $R_{B2}$ | N | S |
| $L_{A1576}$ | $R_{A34}$ | $R_{B2}$ | N | S |
| $L_{A1577}$ | H | $R_{B2}$ | N | O |
| $L_{A1578}$ | $R_{B1}$ | $R_{B2}$ | N | O |
| $L_{A1579}$ | $R_{B3}$ | $R_{B2}$ | N | O |
| $L_{A1580}$ | $R_{B4}$ | $R_{B2}$ | N | O |
| $L_{A1581}$ | $R_{B7}$ | $R_{B2}$ | N | O |
| $L_{A1582}$ | $R_{B10}$ | $R_{B2}$ | N | O |
| $L_{A1583}$ | $R_{A3}$ | $R_{B2}$ | N | O |
| $L_{A1584}$ | $R_{A34}$ | $R_{B2}$ | N | O |
| $L_{A1585}$ | H | $R_{B2}$ | N | $NCH_3$ |
| $L_{A1586}$ | $R_{B1}$ | $R_{B2}$ | N | $NCH_3$ |
| $L_{A1587}$ | $R_{B3}$ | $R_{B2}$ | N | $NCH_3$ |
| $L_{A1588}$ | $R_{B4}$ | $R_{B2}$ | N | $NCH_3$ |
| $L_{A1589}$ | $R_{B7}$ | $R_{B2}$ | N | $NCH_3$ |
| $L_{A1590}$ | $R_{B10}$ | $R_{B2}$ | N | $NCH_3$ |
| $L_{A1591}$ | $R_{A3}$ | $R_{B2}$ | N | $NCH_3$ |
| $L_{A1592}$ | $R_{A34}$ | $R_{B2}$ | N | $NCH_3$ |
| $L_{A1593}$ | H | $R_{B2}$ | N | $C(CH_3)_2$ |
| $L_{A1594}$ | $R_{B1}$ | $R_{B2}$ | N | $C(CH_3)_2$ |
| $L_{A1595}$ | $R_{B3}$ | $R_{B2}$ | N | $C(CH_3)_2$ |
| $L_{A1596}$ | $R_{B4}$ | $R_{B2}$ | N | $C(CH_3)_2$ |
| $L_{A1597}$ | $R_{B7}$ | $R_{B2}$ | N | $C(CH_3)_2$ |
| $L_{A1598}$ | $R_{B10}$ | $R_{B2}$ | N | $C(CH_3)_2$ |
| $L_{A1599}$ | $R_{A3}$ | $R_{B2}$ | N | $C(CH_3)_2$ |
| $L_{A1600}$ | $R_{A34}$ | $R_{B2}$ | N | $C(CH_3)_2$ |
| $L_{A1601}$ | H | $R_{B2}$ | N | $Si(CH_3)_2$ |
| $L_{A1602}$ | $R_{B1}$ | $R_{B2}$ | N | $Si(CH_3)_2$ |
| $L_{A1603}$ | $R_{B3}$ | $R_{B2}$ | N | $Si(CH_3)_2$ |
| $L_{A1604}$ | $R_{B4}$ | $R_{B2}$ | N | $Si(CH_3)_2$ |
| $L_{A1605}$ | $R_{B7}$ | $R_{B2}$ | N | $Si(CH_3)_2$ |
| $L_{A1606}$ | $R_{B10}$ | $R_{B2}$ | N | $Si(CH_3)_2$ |
| $L_{A1607}$ | $R_{A3}$ | $R_{B2}$ | N | $Si(CH_3)_2$ |
| $L_{A1608}$ | $R_{A34}$ | $R_{B2}$ | N | $Si(CH_3)_2$ |

wherein $L_{A1609}$ through $L_{A1728}$ have a structure of Formula XII:

Formula XII

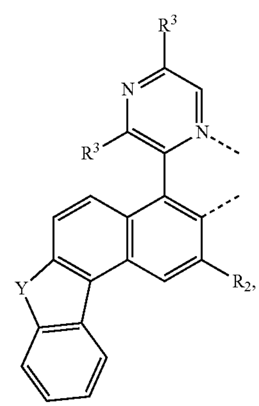

wherein $R^2$, $R^3$, and Y are defined as provided below:

| Ligand | $R^2$ | $R^3$ | Y |
|---|---|---|---|
| $L_{A1609}$ | H | H | S |
| $L_{A1610}$ | H | $R_{B1}$ | S |
| $L_{A1611}$ | H | $R_{B2}$ | S |
| $L_{A1612}$ | H | $R_{B3}$ | S |
| $L_{A1613}$ | H | $R_{B4}$ | S |
| $L_{A1614}$ | H | $R_{B5}$ | S |
| $L_{A1615}$ | H | $R_{A34}$ | S |
| $L_{A1616}$ | H | $R_{A52}$ | S |
| $L_{A1617}$ | H | H | O |
| $L_{A1618}$ | H | $R_{B1}$ | O |

-continued

| Ligand | $R^2$ | $R^3$ | Y |
|---|---|---|---|
| $L_{A1619}$ | H | $R_{B2}$ | O |
| $L_{A1620}$ | H | $R_{B3}$ | O |
| $L_{A1621}$ | H | $R_{B4}$ | O |
| $L_{A1622}$ | H | $R_{B5}$ | O |
| $L_{A1623}$ | H | $R_{A34}$ | O |
| $L_{A1624}$ | H | $R_{A52}$ | O |
| $L_{A1625}$ | H | H | $NCH_3$ |
| $L_{A1626}$ | H | $R_{B1}$ | $NCH_3$ |
| $L_{A1627}$ | H | $R_{B2}$ | $NCH_3$ |
| $L_{A1628}$ | H | $R_{B3}$ | $NCH_3$ |
| $L_{A1629}$ | H | $R_{B4}$ | $NCH_3$ |
| $L_{A1630}$ | H | $R_{B5}$ | $NCH_3$ |
| $L_{A1631}$ | H | $R_{A34}$ | $NCH_3$ |
| $L_{A1632}$ | H | $R_{A52}$ | $NCH_3$ |
| $L_{A1633}$ | H | H | $C(CH_3)_2$ |
| $L_{A1634}$ | H | $R_{B1}$ | $C(CH_3)_2$ |
| $L_{A1635}$ | H | $R_{B2}$ | $C(CH_3)_2$ |
| $L_{A1636}$ | H | $R_{B3}$ | $C(CH_3)_2$ |
| $L_{A1637}$ | H | $R_{B4}$ | $C(CH_3)_2$ |
| $L_{A1638}$ | H | $R_{B5}$ | $C(CH_3)_2$ |
| $L_{A1639}$ | H | $R_{A34}$ | $C(CH_3)_2$ |
| $L_{A1640}$ | H | $R_{A52}$ | $C(CH_3)_2$ |
| $L_{A1641}$ | H | H | $Si(CH_3)_2$ |
| $L_{A1642}$ | H | $R_{B1}$ | $Si(CH_3)_2$ |
| $L_{A1643}$ | H | $R_{B2}$ | $Si(CH_3)_2$ |
| $L_{A1644}$ | H | $R_{B3}$ | $Si(CH_3)_2$ |
| $L_{A1645}$ | H | $R_{B4}$ | $Si(CH_3)_2$ |
| $L_{A1646}$ | H | $R_{B5}$ | $Si(CH_3)_2$ |
| $L_{A1647}$ | H | $R_{A34}$ | $Si(CH_3)_2$ |
| $L_{A1648}$ | H | $R_{A52}$ | $Si(CH_3)_2$ |
| $L_{A1649}$ | $R_{B1}$ | H | S |
| $L_{A1650}$ | $R_{B1}$ | $R_{B1}$ | S |
| $L_{A1651}$ | $R_{B1}$ | $R_{B2}$ | S |
| $L_{A1652}$ | $R_{B1}$ | $R_{B3}$ | S |
| $L_{A1653}$ | $R_{B1}$ | $R_{B4}$ | S |
| $L_{A1654}$ | $R_{B1}$ | $R_{B5}$ | S |
| $L_{A1655}$ | $R_{B1}$ | $R_{A34}$ | S |
| $L_{A1656}$ | $R_{B1}$ | $R_{A52}$ | S |
| $L_{A1657}$ | $R_{B1}$ | H | O |
| $L_{A1658}$ | $R_{B1}$ | $R_{B1}$ | O |
| $L_{A1659}$ | $R_{B1}$ | $R_{B2}$ | O |
| $L_{A1660}$ | $R_{B1}$ | $R_{B3}$ | O |
| $L_{A1661}$ | $R_{B1}$ | $R_{B4}$ | O |
| $L_{A1662}$ | $R_{B1}$ | $R_{B5}$ | O |
| $L_{A1663}$ | $R_{B1}$ | $R_{A34}$ | O |
| $L_{A1664}$ | $R_{B1}$ | $R_{A52}$ | O |
| $L_{A1665}$ | $R_{B1}$ | H | $NCH_3$ |
| $L_{A1666}$ | $R_{B1}$ | $R_{B1}$ | $NCH_3$ |
| $L_{A1667}$ | $R_{B1}$ | $R_{B2}$ | $NCH_3$ |
| $L_{A1668}$ | $R_{B1}$ | $R_{B3}$ | $NCH_3$ |
| $L_{A1669}$ | $R_{B1}$ | $R_{B4}$ | $NCH_3$ |
| $L_{A1670}$ | $R_{B1}$ | $R_{B5}$ | $NCH_3$ |
| $L_{A1671}$ | $R_{B1}$ | $R_{A34}$ | $NCH_3$ |
| $L_{A1672}$ | $R_{B1}$ | $R_{A52}$ | $NCH_3$ |
| $L_{A1673}$ | $R_{B1}$ | H | $C(CH_3)_2$ |
| $L_{A1674}$ | $R_{B1}$ | $R_{B1}$ | $C(CH_3)_2$ |
| $L_{A1675}$ | $R_{B1}$ | $R_{B2}$ | $C(CH_3)_2$ |
| $L_{A1676}$ | $R_{B1}$ | $R_{B3}$ | $C(CH_3)_2$ |
| $L_{A1677}$ | $R_{B1}$ | $R_{B4}$ | $C(CH_3)_2$ |
| $L_{A1678}$ | $R_{B1}$ | $R_{B5}$ | $C(CH_3)_2$ |
| $L_{A1679}$ | $R_{B1}$ | $R_{A34}$ | $C(CH_3)_2$ |
| $L_{A1680}$ | $R_{B1}$ | $R_{A52}$ | $C(CH_3)_2$ |
| $L_{A1681}$ | $R_{B1}$ | H | $Si(CH_3)_2$ |
| $L_{A1682}$ | $R_{B1}$ | $R_{B1}$ | $Si(CH_3)_2$ |
| $L_{A1683}$ | $R_{B1}$ | $R_{B2}$ | $Si(CH_3)_2$ |
| $L_{A1684}$ | $R_{B1}$ | $R_{B3}$ | $Si(CH_3)_2$ |
| $L_{A1685}$ | $R_{B1}$ | $R_{B4}$ | $Si(CH_3)_2$ |
| $L_{A1686}$ | $R_{B1}$ | $R_{B5}$ | $Si(CH_3)_2$ |
| $L_{A1687}$ | $R_{B1}$ | $R_{A34}$ | $Si(CH_3)_2$ |
| $L_{A1688}$ | $R_{B1}$ | $R_{A52}$ | $Si(CH_3)_2$ |
| $L_{A1689}$ | $R_{B2}$ | H | S |
| $L_{A1690}$ | $R_{B2}$ | $R_{B1}$ | S |
| $L_{A1691}$ | $R_{B2}$ | $R_{B2}$ | S |
| $L_{A1692}$ | $R_{B2}$ | $R_{B3}$ | S |
| $L_{A1693}$ | $R_{B2}$ | $R_{B4}$ | S |
| $L_{A1694}$ | $R_{B2}$ | $R_{B5}$ | S |
| $L_{A1695}$ | $R_{B2}$ | $R_{A34}$ | S |

-continued

| Ligand | $R^2$ | $R^3$ | Y |
|---|---|---|---|
| $L_{A1696}$ | $R_{B2}$ | $R_{A52}$ | S |
| $L_{A1697}$ | $R_{B2}$ | H | O |
| $L_{A1698}$ | $R_{B2}$ | $R_{B1}$ | O |
| $L_{A1699}$ | $R_{B2}$ | $R_{B2}$ | O |
| $L_{A1700}$ | $R_{B2}$ | $R_{B3}$ | O |
| $L_{A1701}$ | $R_{B2}$ | $R_{B4}$ | O |
| $L_{A1702}$ | $R_{B2}$ | $R_{B5}$ | O |
| $L_{A1703}$ | $R_{B2}$ | $R_{A34}$ | O |
| $L_{A1704}$ | $R_{B2}$ | $R_{A52}$ | O |
| $L_{A1705}$ | $R_{B2}$ | H | $NCH_3$ |
| $L_{A1706}$ | $R_{B2}$ | $R_{B1}$ | $NCH_3$ |
| $L_{A1707}$ | $R_{B2}$ | $R_{B2}$ | $NCH_3$ |
| $L_{A1708}$ | $R_{B2}$ | $R_{B3}$ | $NCH_3$ |
| $L_{A1709}$ | $R_{B2}$ | $R_{B4}$ | $NCH_3$ |
| $L_{A1710}$ | $R_{B2}$ | $R_{B5}$ | $NCH_3$ |
| $L_{A1711}$ | $R_{B2}$ | $R_{A34}$ | $NCH_3$ |
| $L_{A1712}$ | $R_{B2}$ | $R_{A52}$ | $NCH_3$ |
| $L_{A1713}$ | $R_{B2}$ | H | $C(CH_3)_2$ |
| $L_{A1714}$ | $R_{B2}$ | $R_{B1}$ | $C(CH_3)_2$ |
| $L_{A1715}$ | $R_{B2}$ | $R_{B2}$ | $C(CH_3)_2$ |
| $L_{A1716}$ | $R_{B2}$ | $R_{B3}$ | $C(CH_3)_2$ |
| $L_{A1717}$ | $R_{B2}$ | $R_{B4}$ | $C(CH_3)_2$ |
| $L_{A1718}$ | $R_{B2}$ | $R_{B5}$ | $C(CH_3)_2$ |
| $L_{A1719}$ | $R_{B2}$ | $R_{A34}$ | $C(CH_3)_2$ |
| $L_{A1720}$ | $R_{B2}$ | $R_{A52}$ | $C(CH_3)_2$ |
| $L_{A1721}$ | $R_{B2}$ | H | $Si(CH_3)_2$ |
| $L_{A1722}$ | $R_{B2}$ | $R_{B1}$ | $Si(CH_3)_2$ |
| $L_{A1723}$ | $R_{B2}$ | $R_{B2}$ | $Si(CH_3)_2$ |
| $L_{A1724}$ | $R_{B2}$ | $R_{B3}$ | $Si(CH_3)_2$ |
| $L_{A1725}$ | $R_{B2}$ | $R_{B4}$ | $Si(CH_3)_2$ |
| $L_{A1726}$ | $R_{B2}$ | $R_{B5}$ | $Si(CH_3)_2$ |
| $L_{A1727}$ | $R_{B2}$ | $R_{A34}$ | $Si(CH_3)_2$ |
| $L_{A1728}$ | $R_{B2}$ | $R_{A52}$ | $Si(CH_3)_2$ |

wherein $L_{A1729}$ through $L_{A1824}$ have a structure of Formula XIII:

Formula XIII

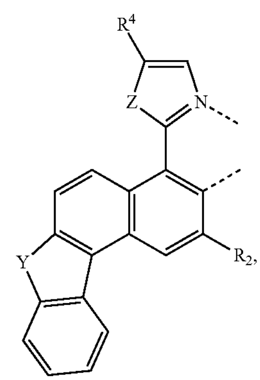

wherein $R^2$, $R^4$, Y, and Z are defined as provided below:

| Ligand | $R^2$ | $R^4$ | Y | Z |
|---|---|---|---|---|
| $L_{A1729}$ | H | H | S | S |
| $L_{A1730}$ | H | $R_{B1}$ | S | S |
| $L_{A1731}$ | H | $R_{B3}$ | S | S |
| $L_{A1732}$ | H | $R_{B4}$ | S | S |
| $L_{A1733}$ | H | $R_{B7}$ | S | S |
| $L_{A1734}$ | H | $R_{B10}$ | S | S |
| $L_{A1735}$ | H | $R_{A3}$ | S | S |
| $L_{A1736}$ | H | $R_{A34}$ | S | S |
| $L_{A1737}$ | H | H | S | O |
| $L_{A1738}$ | H | $R_{B1}$ | S | O |
| $L_{A1739}$ | H | $R_{B3}$ | S | O |
| $L_{A1740}$ | H | $R_{B4}$ | S | O |

| Ligand | $R^2$ | $R^4$ | Y | Z |
|---|---|---|---|---|
| $L_{A1741}$ | H | $R_{B7}$ | S | O |
| $L_{A1742}$ | H | $R_{B10}$ | S | O |
| $L_{A1743}$ | H | $R_{A3}$ | S | O |
| $L_{A1744}$ | H | $R_{A34}$ | S | O |
| $L_{A1745}$ | H | H | S | $NCH_3$ |
| $L_{A1746}$ | H | $R_{B1}$ | S | $NCH_3$ |
| $L_{A1747}$ | H | $R_{B3}$ | S | $NCH_3$ |
| $L_{A1748}$ | H | $R_{B4}$ | S | $NCH_3$ |
| $L_{A1749}$ | H | $R_{B7}$ | S | $NCH_3$ |
| $L_{A1750}$ | H | $R_{B10}$ | S | $NCH_3$ |
| $L_{A1751}$ | H | $R_{A3}$ | S | $NCH_3$ |
| $L_{A1752}$ | H | $R_{A34}$ | S | $NCH_3$ |
| $L_{A1753}$ | H | H | O | S |
| $L_{A1754}$ | H | $R_{B1}$ | O | S |
| $L_{A1755}$ | H | $R_{B3}$ | O | S |
| $L_{A1756}$ | H | $R_{B4}$ | O | S |
| $L_{A1757}$ | H | $R_{B7}$ | O | S |
| $L_{A1758}$ | H | $R_{B10}$ | O | S |
| $L_{A1759}$ | H | $R_{A3}$ | O | S |
| $L_{A1760}$ | H | $R_{A34}$ | O | S |
| $L_{A1761}$ | H | H | O | O |
| $L_{A1762}$ | H | $R_{B1}$ | O | O |
| $L_{A1763}$ | H | $R_{B3}$ | O | O |
| $L_{A1764}$ | H | $R_{B4}$ | O | O |
| $L_{A1765}$ | H | $R_{B7}$ | O | O |
| $L_{A1766}$ | H | $R_{B10}$ | O | O |
| $L_{A1767}$ | H | $R_{A3}$ | O | O |
| $L_{A1768}$ | H | $R_{A34}$ | O | O |
| $L_{A1769}$ | H | H | O | $NCH_3$ |
| $L_{A1770}$ | H | $R_{B1}$ | O | $NCH_3$ |
| $L_{A1771}$ | H | $R_{B3}$ | O | $NCH_3$ |
| $L_{A1772}$ | H | $R_{B4}$ | O | $NCH_3$ |
| $L_{A1773}$ | H | $R_{B7}$ | O | $NCH_3$ |
| $L_{A1774}$ | H | $R_{B10}$ | O | $NCH_3$ |
| $L_{A1775}$ | H | $R_{A3}$ | O | $NCH_3$ |
| $L_{A1776}$ | H | $R_{A34}$ | O | $NCH_3$ |
| $L_{A1777}$ | $R_{B1}$ | H | S | S |
| $L_{A1778}$ | $R_{B1}$ | $R_{B1}$ | S | S |
| $L_{A1779}$ | $R_{B1}$ | $R_{B3}$ | S | S |
| $L_{A1780}$ | $R_{B1}$ | $R_{B4}$ | S | S |
| $L_{A1781}$ | $R_{B1}$ | $R_{B7}$ | S | S |
| $L_{A1782}$ | $R_{B1}$ | $R_{B10}$ | S | S |
| $L_{A1783}$ | $R_{B1}$ | $R_{A3}$ | S | S |
| $L_{A1784}$ | $R_{B1}$ | $R_{A34}$ | S | S |
| $L_{A1785}$ | $R_{B1}$ | H | S | O |
| $L_{A1786}$ | $R_{B1}$ | $R_{B1}$ | S | O |
| $L_{A1787}$ | $R_{B1}$ | $R_{B3}$ | S | O |
| $L_{A1788}$ | $R_{B1}$ | $R_{B4}$ | S | O |
| $L_{A1789}$ | $R_{B1}$ | $R_{B7}$ | S | O |
| $L_{A1790}$ | $R_{B1}$ | $R_{B10}$ | S | O |
| $L_{A1791}$ | $R_{B1}$ | $R_{A3}$ | S | O |
| $L_{A1792}$ | $R_{B1}$ | $R_{A34}$ | S | O |
| $L_{A1793}$ | $R_{B1}$ | H | S | $NCH_3$ |
| $L_{A1794}$ | $R_{B1}$ | $R_{B1}$ | S | $NCH_3$ |
| $L_{A1795}$ | $R_{B1}$ | $R_{B3}$ | S | $NCH_3$ |
| $L_{A1796}$ | $R_{B1}$ | $R_{B4}$ | S | $NCH_3$ |
| $L_{A1797}$ | $R_{B1}$ | $R_{B7}$ | S | $NCH_3$ |
| $L_{A1798}$ | $R_{B1}$ | $R_{B10}$ | S | $NCH_3$ |
| $L_{A1799}$ | $R_{B1}$ | $R_{A3}$ | S | $NCH_3$ |
| $L_{A1800}$ | $R_{B1}$ | $R_{A34}$ | S | $NCH_3$ |
| $L_{A1801}$ | $R_{B1}$ | H | O | S |
| $L_{A1802}$ | $R_{B1}$ | $R_{B1}$ | O | S |
| $L_{A1803}$ | $R_{B1}$ | $R_{B3}$ | O | S |
| $L_{A1804}$ | $R_{B1}$ | $R_{B4}$ | O | S |
| $L_{A1805}$ | $R_{B1}$ | $R_{B7}$ | O | S |
| $L_{A1806}$ | $R_{B1}$ | $R_{B10}$ | O | S |
| $L_{A1807}$ | $R_{B1}$ | $R_{A3}$ | O | S |
| $L_{A1808}$ | $R_{B1}$ | $R_{A34}$ | O | S |
| $L_{A1809}$ | $R_{B1}$ | H | O | O |
| $L_{A1810}$ | $R_{B1}$ | $R_{B1}$ | O | O |
| $L_{A1811}$ | $R_{B1}$ | $R_{B3}$ | O | O |
| $L_{A1812}$ | $R_{B1}$ | $R_{B4}$ | O | O |
| $L_{A1813}$ | $R_{B1}$ | $R_{B7}$ | O | O |
| $L_{A1814}$ | $R_{B1}$ | $R_{B10}$ | O | O |
| $L_{A1815}$ | $R_{B1}$ | $R_{A3}$ | O | O |
| $L_{A1816}$ | $R_{B1}$ | $R_{A34}$ | O | O |
| $L_{A1817}$ | $R_{B1}$ | H | O | $NCH_3$ |

| Ligand | $R^2$ | $R^4$ | Y | Z |
|---|---|---|---|---|
| $L_{A1818}$ | $R_{B1}$ | $R_{B1}$ | O | $NCH_3$ |
| $L_{A1819}$ | $R_{B1}$ | $R_{B3}$ | O | $NCH_3$ |
| $L_{A1820}$ | $R_{B1}$ | $R_{B4}$ | O | $NCH_3$ |
| $L_{A1821}$ | $R_{B1}$ | $R_{B7}$ | O | $NCH_3$ |
| $L_{A1822}$ | $R_{B1}$ | $R_{B10}$ | O | $NCH_3$ |
| $L_{A1823}$ | $R_{B1}$ | $R_{A3}$ | O | $NCH_3$ |
| $L_{A1824}$ | $R_{B1}$ | $R_{A34}$ | O | $NCH_3$ |

wherein $L_{A1825}$ through $L_{A2064}$ have a structure of Formula XIV:

Formula XIV

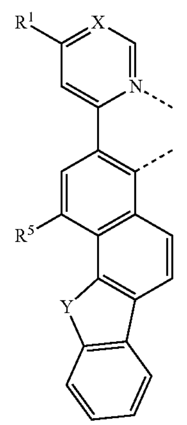

wherein $R^1$, $R^5$, X, and Y are defined as provided below:

| Ligand | $R^1$ | $R^5$ | X | Y |
|---|---|---|---|---|
| $L_{A1825}$ | H | H | C | S |
| $L_{A1826}$ | $R_{B1}$ | H | C | S |
| $L_{A1827}$ | $R_{B3}$ | H | C | S |
| $L_{A1828}$ | $R_{B4}$ | H | C | S |
| $L_{A1829}$ | $R_{B7}$ | H | C | S |
| $L_{A1830}$ | $R_{B10}$ | H | C | S |
| $L_{A1831}$ | $R_{A3}$ | H | C | S |
| $L_{A1832}$ | $R_{A34}$ | H | C | S |
| $L_{A1833}$ | H | H | C | O |
| $L_{A1834}$ | $R_{B1}$ | H | C | O |
| $L_{A1835}$ | $R_{B3}$ | H | C | O |
| $L_{A1836}$ | $R_{B4}$ | H | C | O |
| $L_{A1837}$ | $R_{B7}$ | H | C | O |
| $L_{A1838}$ | $R_{B10}$ | H | C | O |
| $L_{A1839}$ | $R_{A3}$ | H | C | O |
| $L_{A1840}$ | $R_{A34}$ | H | C | O |
| $L_{A1841}$ | H | H | C | $NCH_3$ |
| $L_{A1842}$ | $R_{B1}$ | H | C | $NCH_3$ |
| $L_{A1843}$ | $R_{B3}$ | H | C | $NCH_3$ |
| $L_{A1844}$ | $R_{B4}$ | H | C | $NCH_3$ |
| $L_{A1845}$ | $R_{B7}$ | H | C | $NCH_3$ |
| $L_{A1846}$ | $R_{B10}$ | H | C | $NCH_3$ |
| $L_{A1847}$ | $R_{A3}$ | H | C | $NCH_3$ |
| $L_{A1848}$ | $R_{A34}$ | H | C | $NCH_3$ |
| $L_{A1849}$ | H | H | C | $C(CH_3)_2$ |
| $L_{A1850}$ | $R_{B1}$ | H | C | $C(CH_3)_2$ |
| $L_{A1851}$ | $R_{B3}$ | H | C | $C(CH_3)_2$ |
| $L_{A1852}$ | $R_{B4}$ | H | C | $C(CH_3)_2$ |
| $L_{A1853}$ | $R_{B7}$ | H | C | $C(CH_3)_2$ |
| $L_{A1854}$ | $R_{B10}$ | H | C | $C(CH_3)_2$ |
| $L_{A1855}$ | $R_{A3}$ | H | C | $C(CH_3)_2$ |
| $L_{A1856}$ | $R_{A34}$ | H | C | $C(CH_3)_2$ |
| $L_{A1857}$ | H | H | C | $Si(CH_3)_2$ |
| $L_{A1858}$ | $R_{B1}$ | H | C | $Si(CH_3)_2$ |
| $L_{A1859}$ | $R_{B3}$ | H | C | $Si(CH_3)_2$ |
| $L_{A1860}$ | $R_{B4}$ | H | C | $Si(CH_3)_2$ |

-continued

| Ligand | $R^1$ | $R^5$ | X | Y |
|---|---|---|---|---|
| $L_{A1861}$ | $R_{B7}$ | H | C | $Si(CH_3)_2$ |
| $L_{A1862}$ | $R_{B10}$ | H | C | $Si(CH_3)_2$ |
| $L_{A1863}$ | $R_{A3}$ | H | C | $Si(CH_3)_2$ |
| $L_{A1864}$ | $R_{A34}$ | H | C | $Si(CH_3)_2$ |
| $L_{A1865}$ | H | $R_{B1}$ | C | S |
| $L_{A1866}$ | $R_{B1}$ | $R_{B1}$ | C | S |
| $L_{A1867}$ | $R_{B3}$ | $R_{B1}$ | C | S |
| $L_{A1868}$ | $R_{B4}$ | $R_{B1}$ | C | S |
| $L_{A1869}$ | $R_{B7}$ | $R_{B1}$ | C | S |
| $L_{A1870}$ | $R_{B10}$ | $R_{B1}$ | C | S |
| $L_{A1871}$ | $R_{A3}$ | $R_{B1}$ | C | S |
| $L_{A1872}$ | $R_{A34}$ | $R_{B1}$ | C | S |
| $L_{A1873}$ | H | $R_{B1}$ | C | O |
| $L_{A1874}$ | $R_{B1}$ | $R_{B1}$ | C | O |
| $L_{A1875}$ | $R_{B3}$ | $R_{B1}$ | C | O |
| $L_{A1876}$ | $R_{B4}$ | $R_{B1}$ | C | O |
| $L_{A1877}$ | $R_{B7}$ | $R_{B1}$ | C | O |
| $L_{A1878}$ | $R_{B10}$ | $R_{B1}$ | C | O |
| $L_{A1879}$ | $R_{A3}$ | $R_{B1}$ | C | O |
| $L_{A1880}$ | $R_{A34}$ | $R_{B1}$ | C | O |
| $L_{A1881}$ | H | $R_{B1}$ | C | $NCH_3$ |
| $L_{A1882}$ | $R_{B1}$ | $R_{B1}$ | C | $NCH_3$ |
| $L_{A1883}$ | $R_{B3}$ | $R_{B1}$ | C | $NCH_3$ |
| $L_{A1884}$ | $R_{B4}$ | $R_{B1}$ | C | $NCH_3$ |
| $L_{A1885}$ | $R_{B7}$ | $R_{B1}$ | C | $NCH_3$ |
| $L_{A1886}$ | $R_{B10}$ | $R_{B1}$ | C | $NCH_3$ |
| $L_{A1887}$ | $R_{A3}$ | $R_{B1}$ | C | $NCH_3$ |
| $L_{A1888}$ | $R_{A34}$ | $R_{B1}$ | C | $NCH_3$ |
| $L_{A1889}$ | H | $R_{B1}$ | C | $C(CH_3)_2$ |
| $L_{A1890}$ | $R_{B1}$ | $R_{B1}$ | C | $C(CH_3)_2$ |
| $L_{A1891}$ | $R_{B3}$ | $R_{B1}$ | C | $C(CH_3)_2$ |
| $L_{A1892}$ | $R_{B4}$ | $R_{B1}$ | C | $C(CH_3)_2$ |
| $L_{A1893}$ | $R_{B7}$ | $R_{B1}$ | C | $C(CH_3)_2$ |
| $L_{A1894}$ | $R_{B10}$ | $R_{B1}$ | C | $C(CH_3)_2$ |
| $L_{A1895}$ | $R_{A3}$ | $R_{B1}$ | C | $C(CH_3)_2$ |
| $L_{A1896}$ | $R_{A34}$ | $R_{B1}$ | C | $C(CH_3)_2$ |
| $L_{A1897}$ | H | $R_{B1}$ | C | $Si(CH_3)_2$ |
| $L_{A1898}$ | $R_{B1}$ | $R_{B1}$ | C | $Si(CH_3)_2$ |
| $L_{A1899}$ | $R_{B3}$ | $R_{B1}$ | C | $Si(CH_3)_2$ |
| $L_{A1900}$ | $R_{B4}$ | $R_{B1}$ | C | $Si(CH_3)_2$ |
| $L_{A1901}$ | $R_{B7}$ | $R_{B1}$ | C | $Si(CH_3)_2$ |
| $L_{A1902}$ | $R_{B10}$ | $R_{B1}$ | C | $Si(CH_3)_2$ |
| $L_{A1903}$ | $R_{A3}$ | $R_{B1}$ | C | $Si(CH_3)_2$ |
| $L_{A1904}$ | $R_{A34}$ | $R_{B1}$ | C | $Si(CH_3)_2$ |
| $L_{A1905}$ | H | $R_{B6}$ | C | S |
| $L_{A1906}$ | $R_{B1}$ | $R_{B6}$ | C | S |
| $L_{A1907}$ | $R_{B3}$ | $R_{B6}$ | C | S |
| $L_{A1908}$ | $R_{B4}$ | $R_{B6}$ | C | S |
| $L_{A1909}$ | $R_{B7}$ | $R_{B6}$ | C | S |
| $L_{A1910}$ | $R_{B10}$ | $R_{B6}$ | C | S |
| $L_{A1911}$ | $R_{A3}$ | $R_{B6}$ | C | S |
| $L_{A1912}$ | $R_{A34}$ | $R_{B6}$ | C | S |
| $L_{A1913}$ | H | $R_{B6}$ | C | O |
| $L_{A1914}$ | $R_{B1}$ | $R_{B6}$ | C | O |
| $L_{A1915}$ | $R_{B3}$ | $R_{B6}$ | C | O |
| $L_{A1916}$ | $R_{B4}$ | $R_{B6}$ | C | O |
| $L_{A1917}$ | $R_{B7}$ | $R_{B6}$ | C | O |
| $L_{A1918}$ | $R_{B10}$ | $R_{B6}$ | C | O |
| $L_{A1919}$ | $R_{A3}$ | $R_{B6}$ | C | O |
| $L_{A1920}$ | $R_{A34}$ | $R_{B6}$ | C | O |
| $L_{A1921}$ | H | $R_{B6}$ | C | $NCH_3$ |
| $L_{A1922}$ | $R_{B1}$ | $R_{B6}$ | C | $NCH_3$ |
| $L_{A1923}$ | $R_{B3}$ | $R_{B6}$ | C | $NCH_3$ |
| $L_{A1924}$ | $R_{B4}$ | $R_{B6}$ | C | $NCH_3$ |
| $L_{A1925}$ | $R_{B7}$ | $R_{B6}$ | C | $NCH_3$ |
| $L_{A1926}$ | $R_{B10}$ | $R_{B6}$ | C | $NCH_3$ |
| $L_{A1927}$ | $R_{A3}$ | $R_{B6}$ | C | $NCH_3$ |
| $L_{A1928}$ | $R_{A34}$ | $R_{B6}$ | C | $NCH_3$ |
| $L_{A1929}$ | H | $R_{B6}$ | C | $C(CH_3)_2$ |
| $L_{A1930}$ | $R_{B1}$ | $R_{B6}$ | C | $C(CH_3)_2$ |
| $L_{A1931}$ | $R_{B3}$ | $R_{B6}$ | C | $C(CH_3)_2$ |
| $L_{A1932}$ | $R_{B4}$ | $R_{B6}$ | C | $C(CH_3)_2$ |
| $L_{A1933}$ | $R_{B7}$ | $R_{B6}$ | C | $C(CH_3)_2$ |
| $L_{A1934}$ | $R_{B10}$ | $R_{B6}$ | C | $C(CH_3)_2$ |
| $L_{A1935}$ | $R_{A3}$ | $R_{B6}$ | C | $C(CH_3)_2$ |
| $L_{A1936}$ | $R_{A34}$ | $R_{B6}$ | C | $C(CH_3)_2$ |
| $L_{A1937}$ | H | $R_{B6}$ | C | $Si(CH_3)_2$ |

-continued

| Ligand | $R^1$ | $R^5$ | X | Y |
|---|---|---|---|---|
| $L_{A1938}$ | $R_{B1}$ | $R_{B6}$ | C | $Si(CH_3)_2$ |
| $L_{A1939}$ | $R_{B3}$ | $R_{B6}$ | C | $Si(CH_3)_2$ |
| $L_{A1940}$ | $R_{B4}$ | $R_{B6}$ | C | $Si(CH_3)_2$ |
| $L_{A1941}$ | $R_{B7}$ | $R_{B6}$ | C | $Si(CH_3)_2$ |
| $L_{A1942}$ | $R_{B10}$ | $R_{B6}$ | C | $Si(CH_3)_2$ |
| $L_{A1943}$ | $R_{A3}$ | $R_{B6}$ | C | $Si(CH_3)_2$ |
| $L_{A1944}$ | $R_{A34}$ | $R_{B6}$ | C | $Si(CH_3)_2$ |
| $L_{A1945}$ | H | H | N | S |
| $L_{A1946}$ | $R_{B1}$ | H | N | S |
| $L_{A1947}$ | $R_{B3}$ | H | N | S |
| $L_{A1948}$ | $R_{B4}$ | H | N | S |
| $L_{A1949}$ | $R_{B7}$ | H | N | S |
| $L_{A1950}$ | $R_{B10}$ | H | N | S |
| $L_{A1951}$ | $R_{A3}$ | H | N | S |
| $L_{A1952}$ | $R_{A34}$ | H | N | S |
| $L_{A1953}$ | H | H | N | O |
| $L_{A1954}$ | $R_{B1}$ | H | N | O |
| $L_{A1955}$ | $R_{B3}$ | H | N | O |
| $L_{A1956}$ | $R_{B4}$ | H | N | O |
| $L_{A1957}$ | $R_{B7}$ | H | N | O |
| $L_{A1958}$ | $R_{B10}$ | H | N | O |
| $L_{A1959}$ | $R_{A3}$ | H | N | O |
| $L_{A1960}$ | $R_{A34}$ | H | N | O |
| $L_{A1961}$ | H | H | N | $NCH_3$ |
| $L_{A1962}$ | $R_{B1}$ | H | N | $NCH_3$ |
| $L_{A1963}$ | $R_{B3}$ | H | N | $NCH_3$ |
| $L_{A1964}$ | $R_{B4}$ | H | N | $NCH_3$ |
| $L_{A1965}$ | $R_{B7}$ | H | N | $NCH_3$ |
| $L_{A1966}$ | $R_{B10}$ | H | N | $NCH_3$ |
| $L_{A1967}$ | $R_{A3}$ | H | N | $NCH_3$ |
| $L_{A1968}$ | $R_{A34}$ | H | N | $NCH_3$ |
| $L_{A1969}$ | H | H | N | $C(CH_3)_2$ |
| $L_{A1970}$ | $R_{B1}$ | H | N | $C(CH_3)_2$ |
| $L_{A1971}$ | $R_{B3}$ | H | N | $C(CH_3)_2$ |
| $L_{A1972}$ | $R_{B4}$ | H | N | $C(CH_3)_2$ |
| $L_{A1973}$ | $R_{B7}$ | H | N | $C(CH_3)_2$ |
| $L_{A1974}$ | $R_{B10}$ | H | N | $C(CH_3)_2$ |
| $L_{A1975}$ | $R_{A3}$ | H | N | $C(CH_3)_2$ |
| $L_{A1976}$ | $R_{A34}$ | H | N | $C(CH_3)_2$ |
| $L_{A1977}$ | H | H | N | $Si(CH_3)_2$ |
| $L_{A1978}$ | $R_{B1}$ | H | N | $Si(CH_3)_2$ |
| $L_{A1979}$ | $R_{B3}$ | H | N | $Si(CH_3)_2$ |
| $L_{A1980}$ | $R_{B4}$ | H | N | $Si(CH_3)_2$ |
| $L_{A1981}$ | $R_{B7}$ | H | N | $Si(CH_3)_2$ |
| $L_{A1982}$ | $R_{B10}$ | H | N | $Si(CH_3)_2$ |
| $L_{A1983}$ | $R_{A3}$ | H | N | $Si(CH_3)_2$ |
| $L_{A1984}$ | $R_{A34}$ | H | N | $Si(CH_3)_2$ |
| $L_{A1985}$ | H | $R_{B1}$ | N | S |
| $L_{A1986}$ | $R_{B1}$ | $R_{B1}$ | N | S |
| $L_{A1987}$ | $R_{B3}$ | $R_{B1}$ | N | S |
| $L_{A1988}$ | $R_{B4}$ | $R_{B1}$ | N | S |
| $L_{A1989}$ | $R_{B7}$ | $R_{B1}$ | N | S |
| $L_{A1990}$ | $R_{B10}$ | $R_{B1}$ | N | S |
| $L_{A1991}$ | $R_{A3}$ | $R_{B1}$ | N | S |
| $L_{A1992}$ | $R_{A34}$ | $R_{B1}$ | N | S |
| $L_{A1993}$ | H | $R_{B1}$ | N | O |
| $L_{A1994}$ | $R_{B1}$ | $R_{B1}$ | N | O |
| $L_{A1995}$ | $R_{B3}$ | $R_{B1}$ | N | O |
| $L_{A1996}$ | $R_{B4}$ | $R_{B1}$ | N | O |
| $L_{A1997}$ | $R_{B7}$ | $R_{B1}$ | N | O |
| $L_{A1998}$ | $R_{B10}$ | $R_{B1}$ | N | O |
| $L_{A1999}$ | $R_{A3}$ | $R_{B1}$ | N | O |
| $L_{A2000}$ | $R_{A34}$ | $R_{B1}$ | N | O |
| $L_{A2001}$ | H | $R_{B1}$ | N | $NCH_3$ |
| $L_{A2002}$ | $R_{B1}$ | $R_{B1}$ | N | $NCH_3$ |
| $L_{A2003}$ | $R_{B3}$ | $R_{B1}$ | N | $NCH_3$ |
| $L_{A2004}$ | $R_{B4}$ | $R_{B1}$ | N | $NCH_3$ |
| $L_{A2005}$ | $R_{B7}$ | $R_{B1}$ | N | $NCH_3$ |
| $L_{A2006}$ | $R_{B10}$ | $R_{B1}$ | N | $NCH_3$ |
| $L_{A2007}$ | $R_{A3}$ | $R_{B1}$ | N | $NCH_3$ |
| $L_{A2008}$ | $R_{A34}$ | $R_{B1}$ | N | $NCH_3$ |
| $L_{A2009}$ | H | $R_{B1}$ | N | $C(CH_3)_2$ |
| $L_{A2010}$ | $R_{B1}$ | $R_{B1}$ | N | $C(CH_3)_2$ |
| $L_{A2011}$ | $R_{B3}$ | $R_{B1}$ | N | $C(CH_3)_2$ |
| $L_{A2012}$ | $R_{B4}$ | $R_{B1}$ | N | $C(CH_3)_2$ |
| $L_{A2013}$ | $R_{B7}$ | $R_{B1}$ | N | $C(CH_3)_2$ |
| $L_{A2014}$ | $R_{B10}$ | $R_{B1}$ | N | $C(CH_3)_2$ |

-continued

| Ligand | $R^1$ | $R^5$ | X | Y |
|---|---|---|---|---|
| $L_{A2015}$ | $R_{A3}$ | $R_{B1}$ | N | $C(CH_3)_2$ |
| $L_{A2016}$ | $R_{A34}$ | $R_{B1}$ | N | $C(CH_3)_2$ |
| $L_{A2017}$ | H | $R_{B1}$ | N | $Si(CH_3)_2$ |
| $L_{A2018}$ | $R_{B1}$ | $R_{B1}$ | N | $Si(CH_3)_2$ |
| $L_{A2019}$ | $R_{B3}$ | $R_{B1}$ | N | $Si(CH_3)_2$ |
| $L_{A2020}$ | $R_{B4}$ | $R_{B1}$ | N | $Si(CH_3)_2$ |
| $L_{A2021}$ | $R_{B7}$ | $R_{B1}$ | N | $Si(CH_3)_2$ |
| $L_{A2022}$ | $R_{B10}$ | $R_{B1}$ | N | $Si(CH_3)_2$ |
| $L_{A2023}$ | $R_{A3}$ | $R_{B1}$ | N | $Si(CH_3)_2$ |
| $L_{A2024}$ | $R_{A34}$ | $R_{B1}$ | N | $Si(CH_3)_2$ |
| $L_{A2025}$ | H | $R_{B6}$ | N | S |
| $L_{A2026}$ | $R_{B1}$ | $R_{B6}$ | N | S |
| $L_{A2027}$ | $R_{B3}$ | $R_{B6}$ | N | S |
| $L_{A2028}$ | $R_{B4}$ | $R_{B6}$ | N | S |
| $L_{A2029}$ | $R_{B7}$ | $R_{B6}$ | N | S |
| $L_{A2030}$ | $R_{B10}$ | $R_{B6}$ | N | S |
| $L_{A2031}$ | $R_{A3}$ | $R_{B6}$ | N | S |
| $L_{A2032}$ | $R_{A34}$ | $R_{B6}$ | N | S |
| $L_{A2033}$ | H | $R_{B6}$ | N | O |
| $L_{A2034}$ | $R_{B1}$ | $R_{B6}$ | N | O |
| $L_{A2035}$ | $R_{B3}$ | $R_{B6}$ | N | O |
| $L_{A2036}$ | $R_{B4}$ | $R_{B6}$ | N | O |
| $L_{A2037}$ | $R_{B7}$ | $R_{B6}$ | N | O |
| $L_{A2038}$ | $R_{B10}$ | $R_{B6}$ | N | O |
| $L_{A2039}$ | $R_{A3}$ | $R_{B6}$ | N | O |
| $L_{A2040}$ | $R_{A34}$ | $R_{B6}$ | N | O |
| $L_{A2041}$ | H | $R_{B6}$ | N | $NCH_3$ |
| $L_{A2042}$ | $R_{B1}$ | $R_{B6}$ | N | $NCH_3$ |
| $L_{A2043}$ | $R_{B3}$ | $R_{B6}$ | N | $NCH_3$ |
| $L_{A2044}$ | $R_{B4}$ | $R_{B6}$ | N | $NCH_3$ |
| $L_{A2045}$ | $R_{B7}$ | $R_{B6}$ | N | $NCH_3$ |
| $L_{A2046}$ | $R_{B10}$ | $R_{B6}$ | N | $NCH_3$ |
| $L_{A2047}$ | $R_{A3}$ | $R_{B6}$ | N | $NCH_3$ |
| $L_{A2048}$ | $R_{A34}$ | $R_{B6}$ | N | $NCH_3$ |
| $L_{A2049}$ | H | $R_{B6}$ | N | $C(CH_3)_2$ |
| $L_{A2050}$ | $R_{B1}$ | $R_{B6}$ | N | $C(CH_3)_2$ |
| $L_{A2051}$ | $R_{B3}$ | $R_{B6}$ | N | $C(CH_3)_2$ |
| $L_{A2052}$ | $R_{B4}$ | $R_{B6}$ | N | $C(CH_3)_2$ |
| $L_{A2053}$ | $R_{B7}$ | $R_{B6}$ | N | $C(CH_3)_2$ |
| $L_{A2054}$ | $R_{B10}$ | $R_{B6}$ | N | $C(CH_3)_2$ |
| $L_{A2055}$ | $R_{A3}$ | $R_{B6}$ | N | $C(CH_3)_2$ |
| $L_{A2056}$ | $R_{A34}$ | $R_{B6}$ | N | $C(CH_3)_2$ |
| $L_{A2057}$ | H | $R_{B6}$ | N | $Si(CH_3)_2$ |
| $L_{A2058}$ | $R_{B1}$ | $R_{B6}$ | N | $Si(CH_3)_2$ |
| $L_{A2059}$ | $R_{B3}$ | $R_{B6}$ | N | $Si(CH_3)_2$ |
| $L_{A2060}$ | $R_{B4}$ | $R_{B6}$ | N | $Si(CH_3)_2$ |
| $L_{A2061}$ | $R_{B7}$ | $R_{B6}$ | N | $Si(CH_3)_2$ |
| $L_{A2062}$ | $R_{B10}$ | $R_{B6}$ | N | $Si(CH_3)_2$ |
| $L_{A2063}$ | $R_{A3}$ | $R_{B6}$ | N | $Si(CH_3)_2$ |
| $L_{A2064}$ | $R_{A34}$ | $R_{B6}$ | N | $Si(CH_3)_2$ |

wherein $L_{A2065}$ through $L_{A2184}$ have a structure of Formula XV:

Formula XV

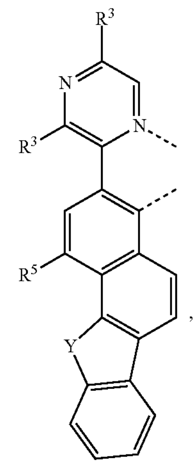

wherein $R^3$, $R^5$, and Y are defined as provided below:

| Ligand | $R^5$ | $R^3$ | Y | Ligand | $R^5$ | $R^3$ | $R^{14}$ |
|---|---|---|---|---|---|---|---|
| $L_{A2065}$ | H | H | S | $L_{A2125}$ | $R_{B1}$ | $R_{B4}$ | $NCH_3$ |
| $L_{A2066}$ | H | $R_{B1}$ | S | $L_{A2126}$ | $R_{B1}$ | $R_{B5}$ | $NCH_3$ |
| $L_{A2067}$ | H | $R_{B2}$ | S | $L_{A2127}$ | $R_{B1}$ | $R_{A34}$ | $NCH_3$ |
| $L_{A2068}$ | H | $R_{B3}$ | S | $L_{A2128}$ | $R_{B1}$ | $R_{A52}$ | $NCH_3$ |
| $L_{A2069}$ | H | $R_{B4}$ | S | $L_{A2129}$ | $R_{B1}$ | H | $C(CH_3)_2$ |
| $L_{A2070}$ | H | $R_{B5}$ | S | $L_{A2130}$ | $R_{B1}$ | $R_{B1}$ | $C(CH_3)_2$ |
| $L_{A2071}$ | H | $R_{A34}$ | S | $L_{A2131}$ | $R_{B1}$ | $R_{B2}$ | $C(CH_3)_2$ |
| $L_{A2072}$ | H | $R_{A52}$ | S | $L_{A2132}$ | $R_{B1}$ | $R_{B3}$ | $C(CH_3)_2$ |
| $L_{A2073}$ | H | H | O | $L_{A2133}$ | $R_{B1}$ | $R_{B4}$ | $C(CH_3)_2$ |
| $L_{A2074}$ | H | $R_{B1}$ | O | $L_{A2134}$ | $R_{B1}$ | $R_{B5}$ | $C(CH_3)_2$ |
| $L_{A2075}$ | H | $R_{B2}$ | O | $L_{A2135}$ | $R_{B1}$ | $R_{A34}$ | $C(CH_3)_2$ |
| $L_{A2076}$ | H | $R_{B3}$ | O | $L_{A2136}$ | $R_{B1}$ | $R_{A52}$ | $C(CH_3)_2$ |
| $L_{A2077}$ | H | $R_{B4}$ | O | $L_{A2137}$ | $R_{B1}$ | H | $Si(CH_3)_2$ |
| $L_{A2078}$ | H | $R_{B5}$ | O | $L_{A2138}$ | $R_{B1}$ | $R_{B1}$ | $Si(CH_3)_2$ |
| $L_{A2079}$ | H | $R_{A34}$ | O | $L_{A2139}$ | $R_{B1}$ | $R_{B2}$ | $Si(CH_3)_2$ |
| $L_{A2080}$ | H | $R_{A52}$ | O | $L_{A2140}$ | $R_{B1}$ | $R_{B3}$ | $Si(CH_3)_2$ |
| $L_{A2081}$ | H | H | $NCH_3$ | $L_{A2141}$ | $R_{B1}$ | $R_{B4}$ | $Si(CH_3)_2$ |
| $L_{A2082}$ | H | $R_{B1}$ | $NCH_3$ | $L_{A2142}$ | $R_{B1}$ | $R_{B5}$ | $Si(CH_3)_2$ |
| $L_{A2083}$ | H | $R_{B2}$ | $NCH_3$ | $L_{A2143}$ | $R_{B1}$ | $R_{A34}$ | $Si(CH_3)_2$ |
| $L_{A2084}$ | H | $R_{B3}$ | $NCH_3$ | $L_{A2144}$ | $R_{B1}$ | $R_{A52}$ | $Si(CH_3)_2$ |
| $L_{A2085}$ | H | $R_{B4}$ | $NCH_3$ | $L_{A2145}$ | $R_{B6}$ | H | S |
| $L_{A2086}$ | H | $R_{B5}$ | $NCH_3$ | $L_{A2146}$ | $R_{B6}$ | $R_{B1}$ | S |
| $L_{A2087}$ | H | $R_{A34}$ | $NCH_3$ | $L_{A2147}$ | $R_{B6}$ | $R_{B2}$ | S |
| $L_{A2088}$ | H | $R_{A52}$ | $NCH_3$ | $L_{A2148}$ | $R_{B6}$ | $R_{B3}$ | S |
| $L_{A2089}$ | H | H | $C(CH_3)_2$ | $L_{A2149}$ | $R_{B6}$ | $R_{B4}$ | S |
| $L_{A2090}$ | H | $R_{B1}$ | $C(CH_3)_2$ | $L_{A2150}$ | $R_{B6}$ | $R_{B5}$ | S |
| $L_{A2091}$ | H | $R_{B2}$ | $C(CH_3)_2$ | $L_{A2151}$ | $R_{B6}$ | $R_{A34}$ | S |
| $L_{A2092}$ | H | $R_{B3}$ | $C(CH_3)_2$ | $L_{A2152}$ | $R_{B6}$ | $R_{A52}$ | S |
| $L_{A2093}$ | H | $R_{B4}$ | $C(CH_3)_2$ | $L_{A2153}$ | $R_{B6}$ | H | O |
| $L_{A2094}$ | H | $R_{B5}$ | $C(CH_3)_2$ | $L_{A2154}$ | $R_{B6}$ | $R_{B1}$ | O |
| $L_{A2095}$ | H | $R_{A34}$ | $C(CH_3)_2$ | $L_{A2155}$ | $R_{B6}$ | $R_{B2}$ | O |
| $L_{A2096}$ | H | $R_{A52}$ | $C(CH_3)_2$ | $L_{A2156}$ | $R_{B6}$ | $R_{B3}$ | O |
| $L_{A2097}$ | H | H | $Si(CH_3)_2$ | $L_{A2157}$ | $R_{B6}$ | $R_{B4}$ | O |
| $L_{A2098}$ | H | $R_{B1}$ | $Si(CH_3)_2$ | $L_{A2158}$ | $R_{B6}$ | $R_{B5}$ | O |
| $L_{A2099}$ | H | $R_{B2}$ | $Si(CH_3)_2$ | $L_{A2159}$ | $R_{B6}$ | $R_{A34}$ | O |
| $L_{A2100}$ | H | $R_{B3}$ | $Si(CH_3)_2$ | $L_{A2160}$ | $R_{B6}$ | $R_{A52}$ | O |
| $L_{A2101}$ | H | $R_{B4}$ | $Si(CH_3)_2$ | $L_{A2161}$ | $R_{B6}$ | H | $NCH_3$ |
| $L_{A2102}$ | H | $R_{B5}$ | $Si(CH_3)_2$ | $L_{A2162}$ | $R_{B6}$ | $R_{B1}$ | $NCH_3$ |
| $L_{A2103}$ | H | $R_{A34}$ | $Si(CH_3)_2$ | $L_{A2163}$ | $R_{B6}$ | $R_{B2}$ | $NCH_3$ |
| $L_{A2104}$ | H | $R_{A52}$ | $Si(CH_3)_2$ | $L_{A2164}$ | $R_{B6}$ | $R_{B3}$ | $NCH_3$ |
| $L_{A2105}$ | $R_{B1}$ | H | S | $L_{A2165}$ | $R_{B6}$ | $R_{B4}$ | $NCH_3$ |
| $L_{A2106}$ | $R_{B1}$ | $R_{B1}$ | S | $L_{A2166}$ | $R_{B6}$ | $R_{B5}$ | $NCH_3$ |
| $L_{A2107}$ | $R_{B1}$ | $R_{B2}$ | S | $L_{A2167}$ | $R_{B6}$ | $R_{A34}$ | $NCH_3$ |
| $L_{A2108}$ | $R_{B1}$ | $R_{B3}$ | S | $L_{A2168}$ | $R_{B6}$ | $R_{A52}$ | $NCH_3$ |
| $L_{A2109}$ | $R_{B1}$ | $R_{B4}$ | S | $L_{A2169}$ | $R_{B6}$ | H | $C(CH_3)_2$ |
| $L_{A2110}$ | $R_{B1}$ | $R_{B5}$ | S | $L_{A2170}$ | $R_{B6}$ | $R_{B1}$ | $C(CH_3)_2$ |
| $L_{A2111}$ | $R_{B1}$ | $R_{A34}$ | S | $L_{A2171}$ | $R_{B6}$ | $R_{B2}$ | $C(CH_3)_2$ |

-continued

| Ligand | $R^5$ | $R^3$ | Y | Ligand | $R^5$ | $R^3$ | $R^{14}$ |
|---|---|---|---|---|---|---|---|
| $L_{A2112}$ | $R_{B1}$ | $R_{A52}$ | S | $L_{A2172}$ | $R_{B6}$ | $R_{B3}$ | $C(CH_3)_2$ |
| $L_{A2113}$ | $R_{B1}$ | H | O | $L_{A2173}$ | $R_{B6}$ | $R_{B4}$ | $C(CH_3)_2$ |
| $L_{A2114}$ | $R_{B1}$ | $R_{B1}$ | O | $L_{A2174}$ | $R_{B6}$ | $R_{B5}$ | $C(CH_3)_2$ |
| $L_{A2115}$ | $R_{B1}$ | $R_{B2}$ | O | $L_{A2175}$ | $R_{B6}$ | $R_{A34}$ | $C(CH_3)_2$ |
| $L_{A2116}$ | $R_{B1}$ | $R_{B3}$ | O | $L_{A2176}$ | $R_{B6}$ | $R_{A52}$ | $C(CH_3)_2$ |
| $L_{A2117}$ | $R_{B1}$ | $R_{B4}$ | O | $L_{A2177}$ | $R_{B6}$ | H | $Si(CH_3)_2$ |
| $L_{A2118}$ | $R_{B1}$ | $R_{B5}$ | O | $L_{A2178}$ | $R_{B6}$ | $R_{B1}$ | $Si(CH_3)_2$ |
| $L_{A2119}$ | $R_{B1}$ | $R_{A34}$ | O | $L_{A2179}$ | $R_{B6}$ | $R_{B2}$ | $Si(CH_3)_2$ |
| $L_{A2120}$ | $R_{B1}$ | $R_{A52}$ | O | $L_{A2180}$ | $R_{B6}$ | $R_{B3}$ | $Si(CH_3)_2$ |
| $L_{A2121}$ | $R_{B1}$ | H | $NCH_3$ | $L_{A2181}$ | $R_{B6}$ | $R_{B4}$ | $Si(CH_3)_2$ |
| $L_{A2122}$ | $R_{B1}$ | $R_{B1}$ | $NCH_3$ | $L_{A2182}$ | $R_{B6}$ | $R_{B5}$ | $Si(CH_3)_2$ |
| $L_{A2123}$ | $R_{B1}$ | $R_{B2}$ | $NCH_3$ | $L_{A2183}$ | $R_{B6}$ | $R_{A34}$ | $Si(CH_3)_2$ |
| $L_{A2124}$ | $R_{B1}$ | $R_{B3}$ | $NCH_3$ | $L_{A2184}$ | $R_{B6}$ | $R_{A52}$ | $Si(CH_3)_2$ |

wherein $L_{A2185}$ through $L_{A2280}$ have a structure of Formula XVI:

Formula XVI

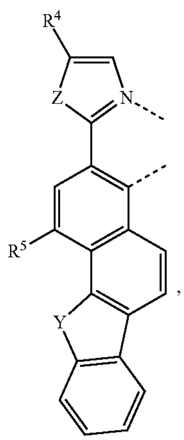

wherein $R^4$, $R^5$, Y, and Z are defined as provided below:

| Ligand | $R^5$ | $R^4$ | Y | Z |
|---|---|---|---|---|
| $L_{A2185}$ | H | H | S | S |
| $L_{A2186}$ | H | $R_{B1}$ | S | S |
| $L_{A2187}$ | H | $R_{B3}$ | S | S |
| $L_{A2188}$ | H | $R_{B4}$ | S | S |
| $L_{A2189}$ | H | $R_{B7}$ | S | S |
| $L_{A2190}$ | H | $R_{B10}$ | S | S |
| $L_{A2191}$ | H | $R_{A3}$ | S | S |
| $L_{A2192}$ | H | $R_{A34}$ | S | S |
| $L_{A2193}$ | H | H | S | O |
| $L_{A2194}$ | H | $R_{B1}$ | S | O |
| $L_{A2195}$ | H | $R_{B3}$ | S | O |
| $L_{A2196}$ | H | $R_{B4}$ | S | O |
| $L_{A2197}$ | H | $R_{B7}$ | S | O |
| $L_{A2198}$ | H | $R_{B10}$ | S | O |
| $L_{A2199}$ | H | $R_{A3}$ | S | O |
| $L_{A2200}$ | H | $R_{A34}$ | 5 | O |
| $L_{A2201}$ | H | H | S | $NCH_3$ |
| $L_{A2202}$ | H | $R_{B1}$ | S | $NCH_3$ |
| $L_{A2203}$ | H | $R_{B3}$ | S | $NCH_3$ |
| $L_{A2204}$ | H | $R_{B4}$ | S | $NCH_3$ |
| $L_{A2205}$ | H | $R_{B7}$ | S | $NCH_3$ |
| $L_{A2206}$ | H | $R_{B10}$ | S | $NCH_3$ |
| $L_{A2207}$ | H | $R_{A3}$ | S | $NCH_3$ |
| $L_{A2208}$ | H | $R_{A34}$ | S | $NCH_3$ |
| $L_{A2209}$ | H | H | O | S |
| $L_{A2210}$ | H | $R_{B1}$ | O | S |
| $L_{A2211}$ | H | $R_{B3}$ | O | S |
| $L_{A2212}$ | H | $R_{B4}$ | O | S |
| $L_{A2213}$ | H | $R_{B7}$ | O | S |

-continued

| Ligand | $R^5$ | $R^4$ | Y | Z |
|---|---|---|---|---|
| $L_{A2214}$ | H | $R_{B10}$ | O | S |
| $L_{A2215}$ | H | $R_{A3}$ | O | S |
| $L_{A2216}$ | H | $R_{A34}$ | O | S |
| $L_{A2217}$ | H | H | O | O |
| $L_{A2218}$ | H | $R_{B1}$ | O | O |
| $L_{A2219}$ | H | $R_{B3}$ | O | O |
| $L_{A2220}$ | H | $R_{B4}$ | O | O |
| $L_{A2221}$ | H | $R_{B7}$ | O | O |
| $L_{A2222}$ | H | $R_{B10}$ | O | O |
| $L_{A2223}$ | H | $R_{A3}$ | O | O |
| $L_{A2224}$ | H | $R_{A34}$ | O | O |
| $L_{A2225}$ | H | H | O | $NCH_3$ |
| $L_{A2226}$ | H | $R_{B1}$ | O | $NCH_3$ |
| $L_{A2227}$ | H | $R_{B3}$ | O | $NCH_3$ |
| $L_{A2228}$ | H | $R_{B4}$ | O | $NCH_3$ |
| $L_{A2229}$ | H | $R_{B7}$ | O | $NCH_3$ |
| $L_{A2230}$ | H | $R_{B10}$ | O | $NCH_3$ |
| $L_{A2231}$ | H | $R_{A3}$ | O | $NCH_3$ |
| $L_{A2232}$ | H | $R_{A34}$ | O | $NCH_3$ |
| $L_{A2233}$ | $R_{B6}$ | H | S | S |
| $L_{A2234}$ | $R_{B6}$ | $R_{B1}$ | S | S |
| $L_{A2235}$ | $R_{B6}$ | $R_{B3}$ | S | S |
| $L_{A2236}$ | $R_{B6}$ | $R_{B4}$ | S | S |
| $L_{A2237}$ | $R_{B6}$ | $R_{B7}$ | S | S |
| $L_{A2238}$ | $R_{B6}$ | $R_{B10}$ | S | S |
| $L_{A2239}$ | $R_{B6}$ | $R_{A3}$ | S | S |
| $L_{A2240}$ | $R_{B6}$ | $R_{A34}$ | S | S |
| $L_{A2241}$ | $R_{B6}$ | H | S | O |
| $L_{A2242}$ | $R_{B6}$ | $R_{B1}$ | S | O |
| $L_{A2243}$ | $R_{B6}$ | $R_{B3}$ | S | O |
| $L_{A2244}$ | $R_{B6}$ | $R_{B4}$ | S | O |
| $L_{A2245}$ | $R_{B6}$ | $R_{B7}$ | S | O |
| $L_{A2246}$ | $R_{B6}$ | $R_{B10}$ | S | O |
| $L_{A2247}$ | $R_{B6}$ | $R_{A3}$ | S | O |
| $L_{A2248}$ | $R_{B6}$ | $R_{A34}$ | 5 | O |
| $L_{A2249}$ | $R_{B6}$ | H | S | $NCH_3$ |
| $L_{A2250}$ | $R_{B6}$ | $R_{B1}$ | S | $NCH_3$ |
| $L_{A2251}$ | $R_{B6}$ | $R_{B3}$ | S | $NCH_3$ |
| $L_{A2252}$ | $R_{B6}$ | $R_{B4}$ | S | $NCH_3$ |
| $L_{A2253}$ | $R_{B6}$ | $R_{B7}$ | S | $NCH_3$ |
| $L_{A2254}$ | $R_{B6}$ | $R_{B10}$ | S | $NCH_3$ |
| $L_{A2255}$ | $R_{B6}$ | $R_{A3}$ | S | $NCH_3$ |
| $L_{A2256}$ | $R_{B6}$ | $R_{A34}$ | S | $NCH_3$ |
| $L_{A2257}$ | $R_{B6}$ | H | O | S |
| $L_{A2258}$ | $R_{B6}$ | $R_{B1}$ | O | S |
| $L_{A2259}$ | $R_{B6}$ | $R_{B3}$ | O | S |
| $L_{A2260}$ | $R_{B6}$ | $R_{B4}$ | O | S |
| $L_{A2261}$ | $R_{B6}$ | $R_{B7}$ | O | S |
| $L_{A2262}$ | $R_{B6}$ | $R_{B10}$ | O | S |
| $L_{A2263}$ | $R_{B6}$ | $R_{A3}$ | O | S |
| $L_{A2264}$ | $R_{B6}$ | $R_{A34}$ | O | S |
| $L_{A2265}$ | $R_{B6}$ | H | O | O |
| $L_{A2266}$ | $R_{B6}$ | $R_{B1}$ | O | O |
| $L_{A2267}$ | $R_{B6}$ | $R_{B3}$ | O | O |
| $L_{A2268}$ | $R_{B6}$ | $R_{B4}$ | O | O |
| $L_{A2269}$ | $R_{B6}$ | $R_{B7}$ | O | O |
| $L_{A2270}$ | $R_{B6}$ | $R_{B10}$ | O | O |
| $L_{A2271}$ | $R_{B6}$ | $R_{A3}$ | O | O |
| $L_{A2272}$ | $R_{B6}$ | $R_{A34}$ | O | O |
| $L_{A2273}$ | $R_{B6}$ | H | O | $NCH_3$ |
| $L_{A2274}$ | $R_{B6}$ | $R_{B1}$ | O | $NCH_3$ |
| $L_{A2275}$ | $R_{B6}$ | $R_{B3}$ | O | $NCH_3$ |
| $L_{A2276}$ | $R_{B6}$ | $R_{B4}$ | O | $NCH_3$ |
| $L_{A2277}$ | $R_{B6}$ | $R_{B7}$ | O | $NCH_3$ |
| $L_{A2278}$ | $R_{B6}$ | $R_{B10}$ | O | $NCH_3$ |
| $L_{A2279}$ | $R_{B6}$ | $R_{A3}$ | O | $NCH_3$ |
| $L_{A2280}$ | $R_{B6}$ | $R_{A34}$ | O | $NCH_3$ |

wherein $L_{A2281}$ through $L_{A2520}$ have a structure of Formula XVII:

Formula XVII

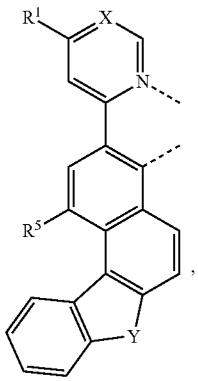

wherein $R^1$, $R^5$, X, and Y are defined as provided below:

| Ligand | $R^1$ | $R^5$ | X | Y |
|---|---|---|---|---|
| $L_{A2281}$ | H | H | C | S |
| $L_{A2282}$ | $R_{B1}$ | H | C | S |
| $L_{A2283}$ | $R_{B3}$ | H | C | S |
| $L_{A2284}$ | $R_{B4}$ | H | C | S |
| $L_{A2285}$ | $R_{B7}$ | H | C | S |
| $L_{A2286}$ | $R_{B10}$ | H | C | S |
| $L_{A2287}$ | $R_{A3}$ | H | C | S |
| $L_{A2288}$ | $R_{A34}$ | H | C | S |
| $L_{A2289}$ | H | H | C | O |
| $L_{A2290}$ | $R_{B1}$ | H | C | O |
| $L_{A2291}$ | $R_{B3}$ | H | C | O |
| $L_{A2292}$ | $R_{B4}$ | H | C | O |
| $L_{A2293}$ | $R_{B7}$ | H | C | O |
| $L_{A2294}$ | $R_{B10}$ | H | C | O |
| $L_{A2295}$ | $R_{A3}$ | H | C | O |
| $L_{A2296}$ | $R_{A34}$ | H | C | O |
| $L_{A2297}$ | H | H | C | $NCH_3$ |
| $L_{A2298}$ | $R_{B1}$ | H | C | $NCH_3$ |
| $L_{A2299}$ | $R_{B3}$ | H | C | $NCH_3$ |
| $L_{A2300}$ | $R_{B4}$ | H | C | $NCH_3$ |
| $L_{A2301}$ | $R_{B7}$ | H | C | $NCH_3$ |
| $L_{A2302}$ | $R_{B10}$ | H | C | $NCH_3$ |
| $L_{A2303}$ | $R_{A3}$ | H | C | $NCH_3$ |
| $L_{A2304}$ | $R_{A34}$ | H | C | $NCH_3$ |
| $L_{A2305}$ | H | H | C | $C(CH_3)_2$ |
| $L_{A2306}$ | $R_{B1}$ | H | C | $C(CH_3)_2$ |
| $L_{A2307}$ | $R_{B3}$ | H | C | $C(CH_3)_2$ |
| $L_{A2308}$ | $R_{B4}$ | H | C | $C(CH_3)_2$ |
| $L_{A2309}$ | $R_{B7}$ | H | C | $C(CH_3)_2$ |
| $L_{A2310}$ | $R_{B10}$ | H | C | $C(CH_3)_2$ |
| $L_{A2311}$ | $R_{A3}$ | H | C | $C(CH_3)_2$ |
| $L_{A2312}$ | $R_{A34}$ | H | C | $C(CH_3)_2$ |
| $L_{A2313}$ | H | H | C | $Si(CH_3)_2$ |
| $L_{A2314}$ | $R_{B1}$ | H | C | $Si(CH_3)_2$ |
| $L_{A2315}$ | $R_{B3}$ | H | C | $Si(CH_3)_2$ |
| $L_{A2316}$ | $R_{B4}$ | H | C | $Si(CH_3)_2$ |
| $L_{A2317}$ | $R_{B7}$ | H | C | $Si(CH_3)_2$ |
| $L_{A2318}$ | $R_{B10}$ | H | C | $Si(CH_3)_2$ |
| $L_{A2319}$ | $R_{A3}$ | H | C | $Si(CH_3)_2$ |
| $L_{A2320}$ | $R_{A34}$ | H | C | $Si(CH_3)_2$ |
| $L_{A2321}$ | H | $R_{B1}$ | C | S |
| $L_{A2322}$ | $R_{B1}$ | $R_{B1}$ | C | S |
| $L_{A2323}$ | $R_{B3}$ | $R_{B1}$ | C | S |
| $L_{A2324}$ | $R_{B4}$ | $R_{B1}$ | C | S |
| $L_{A2325}$ | $R_{B7}$ | $R_{B1}$ | C | S |
| $L_{A2326}$ | $R_{B10}$ | $R_{B1}$ | C | S |
| $L_{A2327}$ | $R_{A3}$ | $R_{B1}$ | C | S |
| $L_{A2328}$ | $R_{A34}$ | $R_{B1}$ | C | S |
| $L_{A2329}$ | H | $R_{B1}$ | C | O |
| $L_{A2330}$ | $R_{B1}$ | $R_{B1}$ | C | O |
| $L_{A2331}$ | $R_{B3}$ | $R_{B1}$ | C | O |

-continued

| Ligand | $R^1$ | $R^5$ | X | Y |
|---|---|---|---|---|
| $L_{A2332}$ | $R_{B4}$ | $R_{B1}$ | C | O |
| $L_{A2333}$ | $R_{B7}$ | $R_{B1}$ | C | O |
| $L_{A2334}$ | $R_{B10}$ | $R_{B1}$ | C | O |
| $L_{A2335}$ | $R_{A3}$ | $R_{B1}$ | C | O |
| $L_{A2336}$ | $R_{A34}$ | $R_{B1}$ | C | O |
| $L_{A2337}$ | H | $R_{B1}$ | C | $NCH_3$ |
| $L_{A2338}$ | $R_{B1}$ | $R_{B1}$ | C | $NCH_3$ |
| $L_{A2339}$ | $R_{B3}$ | $R_{B1}$ | C | $NCH_3$ |
| $L_{A2340}$ | $R_{B4}$ | $R_{B1}$ | C | $NCH_3$ |
| $L_{A2341}$ | $R_{B7}$ | $R_{B1}$ | C | $NCH_3$ |
| $L_{A2342}$ | $R_{B10}$ | $R_{B1}$ | C | $NCH_3$ |
| $L_{A2343}$ | $R_{A3}$ | $R_{B1}$ | C | $NCH_3$ |
| $L_{A2344}$ | $R_{A34}$ | $R_{B1}$ | C | $NCH_3$ |
| $L_{A2345}$ | H | $R_{B1}$ | C | $C(CH_3)_2$ |
| $L_{A2346}$ | $R_{B1}$ | $R_{B1}$ | C | $C(CH_3)_2$ |
| $L_{A2347}$ | $R_{B3}$ | $R_{B1}$ | C | $C(CH_3)_2$ |
| $L_{A2348}$ | $R_{B4}$ | $R_{B1}$ | C | $C(CH_3)_2$ |
| $L_{A2349}$ | $R_{B7}$ | $R_{B1}$ | C | $C(CH_3)_2$ |
| $L_{A2350}$ | $R_{B10}$ | $R_{B1}$ | C | $C(CH_3)_2$ |
| $L_{A2351}$ | $R_{A3}$ | $R_{B1}$ | C | $C(CH_3)_2$ |
| $L_{A2352}$ | $R_{A34}$ | $R_{B1}$ | C | $C(CH_3)_2$ |
| $L_{A2353}$ | H | $R_{B1}$ | C | $Si(CH_3)_2$ |
| $L_{A2354}$ | $R_{B1}$ | $R_{B1}$ | C | $Si(CH_3)_2$ |
| $L_{A2355}$ | $R_{B3}$ | $R_{B1}$ | C | $Si(CH_3)_2$ |
| $L_{A2356}$ | $R_{B4}$ | $R_{B1}$ | C | $Si(CH_3)_2$ |
| $L_{A2357}$ | $R_{B7}$ | $R_{B1}$ | C | $Si(CH_3)_2$ |
| $L_{A2358}$ | $R_{B10}$ | $R_{B1}$ | C | $Si(CH_3)_2$ |
| $L_{A2359}$ | $R_{A3}$ | $R_{B1}$ | C | $Si(CH_3)_2$ |
| $L_{A2360}$ | $R_{A34}$ | $R_{B1}$ | C | $Si(CH_3)_2$ |
| $L_{A2361}$ | H | $R_{B6}$ | C | S |
| $L_{A2362}$ | $R_{B1}$ | $R_{B6}$ | C | S |
| $L_{A2363}$ | $R_{B3}$ | $R_{B6}$ | C | S |
| $L_{A2364}$ | $R_{B4}$ | $R_{B6}$ | C | S |
| $L_{A2365}$ | $R_{B7}$ | $R_{B6}$ | C | S |
| $L_{A2366}$ | $R_{B10}$ | $R_{B6}$ | C | S |
| $L_{A2367}$ | $R_{A3}$ | $R_{B6}$ | C | S |
| $L_{A2368}$ | $R_{A34}$ | $R_{B6}$ | C | S |
| $L_{A2369}$ | H | $R_{B6}$ | C | O |
| $L_{A2370}$ | $R_{B1}$ | $R_{B6}$ | C | O |
| $L_{A2371}$ | $R_{B3}$ | $R_{B6}$ | C | O |
| $L_{A2372}$ | $R_{B4}$ | $R_{B6}$ | C | O |
| $L_{A2373}$ | $R_{B7}$ | $R_{B6}$ | C | O |
| $L_{A2374}$ | $R_{B10}$ | $R_{B6}$ | C | O |
| $L_{A2375}$ | $R_{A3}$ | $R_{B6}$ | C | O |
| $L_{A2376}$ | $R_{A34}$ | $R_{B6}$ | C | O |
| $L_{A2377}$ | H | $R_{B6}$ | C | $NCH_3$ |
| $L_{A2378}$ | $R_{B1}$ | $R_{B6}$ | C | $NCH_3$ |
| $L_{A2379}$ | $R_{B3}$ | $R_{B6}$ | C | $NCH_3$ |
| $L_{A2380}$ | $R_{B4}$ | $R_{B6}$ | C | $NCH_3$ |
| $L_{A2381}$ | $R_{B7}$ | $R_{B6}$ | C | $NCH_3$ |
| $L_{A2382}$ | $R_{B10}$ | $R_{B6}$ | C | $NCH_3$ |
| $L_{A2383}$ | $R_{A3}$ | $R_{B6}$ | C | $NCH_3$ |
| $L_{A2384}$ | $R_{A34}$ | $R_{B6}$ | C | $NCH_3$ |
| $L_{A2385}$ | H | $R_{B6}$ | C | $C(CH_3)_2$ |
| $L_{A2386}$ | $R_{B1}$ | $R_{B6}$ | C | $C(CH_3)_2$ |
| $L_{A2387}$ | $R_{B3}$ | $R_{B6}$ | C | $C(CH_3)_2$ |
| $L_{A2388}$ | $R_{B4}$ | $R_{B6}$ | C | $C(CH_3)_2$ |
| $L_{A2389}$ | $R_{B7}$ | $R_{B6}$ | C | $C(CH_3)_2$ |
| $L_{A2390}$ | $R_{B10}$ | $R_{B6}$ | C | $C(CH_3)_2$ |
| $L_{A2391}$ | $R_{A3}$ | $R_{B6}$ | C | $C(CH_3)_2$ |
| $L_{A2392}$ | $R_{A34}$ | $R_{B6}$ | C | $C(CH_3)_2$ |
| $L_{A2393}$ | H | $R_{B6}$ | C | $Si(CH_3)_2$ |
| $L_{A2394}$ | $R_{B1}$ | $R_{B6}$ | C | $Si(CH_3)_2$ |
| $L_{A2395}$ | $R_{B3}$ | $R_{B6}$ | C | $Si(CH_3)_2$ |
| $L_{A2396}$ | $R_{B4}$ | $R_{B6}$ | C | $Si(CH_3)_2$ |
| $L_{A2397}$ | $R_{B7}$ | $R_{B6}$ | C | $Si(CH_3)_2$ |
| $L_{A2398}$ | $R_{B10}$ | $R_{B6}$ | C | $Si(CH_3)_2$ |
| $L_{A2399}$ | $R_{A3}$ | $R_{B6}$ | C | $Si(CH_3)_2$ |
| $L_{A2400}$ | $R_{A34}$ | $R_{B6}$ | C | $Si(CH_3)_2$ |
| $L_{A2401}$ | H | H | N | S |
| $L_{A2402}$ | $R_{B1}$ | H | N | S |
| $L_{A2403}$ | $R_{B3}$ | H | N | S |
| $L_{A2404}$ | $R_{B4}$ | H | N | S |
| $L_{A2405}$ | $R_{B7}$ | H | N | S |
| $L_{A2406}$ | $R_{B10}$ | H | N | S |
| $L_{A2407}$ | $R_{A3}$ | H | N | S |
| $L_{A2408}$ | $R_{A34}$ | H | N | S |

-continued

| Ligand | $R^1$ | $R^5$ | X | Y |
|---|---|---|---|---|
| $L_{A2409}$ | H | H | N | O |
| $L_{A2410}$ | $R_{B1}$ | H | N | O |
| $L_{A2411}$ | $R_{B3}$ | H | N | O |
| $L_{A2412}$ | $R_{B4}$ | H | N | O |
| $L_{A2413}$ | $R_{B7}$ | H | N | O |
| $L_{A2414}$ | $R_{B10}$ | H | N | O |
| $L_{A2415}$ | $R_{A3}$ | H | N | O |
| $L_{A2416}$ | $R_{A34}$ | H | N | O |
| $L_{A2417}$ | H | H | N | $NCH_3$ |
| $L_{A2418}$ | $R_{B1}$ | H | N | $NCH_3$ |
| $L_{A2419}$ | $R_{B3}$ | H | N | $NCH_3$ |
| $L_{A2420}$ | $R_{B4}$ | H | N | $NCH_3$ |
| $L_{A2421}$ | $R_{B7}$ | H | N | $NCH_3$ |
| $L_{A2422}$ | $R_{B10}$ | H | N | $NCH_3$ |
| $L_{A2423}$ | $R_{A3}$ | H | N | $NCH_3$ |
| $L_{A2424}$ | $R_{A34}$ | H | N | $NCH_3$ |
| $L_{A2425}$ | H | H | N | $C(CH_3)_2$ |
| $L_{A2426}$ | $R_{B1}$ | H | N | $C(CH_3)_2$ |
| $L_{A2427}$ | $R_{B3}$ | H | N | $C(CH_3)_2$ |
| $L_{A2428}$ | $R_{B4}$ | H | N | $C(CH_3)_2$ |
| $L_{A2429}$ | $R_{B7}$ | H | N | $C(CH_3)_2$ |
| $L_{A2430}$ | $R_{B10}$ | H | N | $C(CH_3)_2$ |
| $L_{A2431}$ | $R_{A3}$ | H | N | $C(CH_3)_2$ |
| $L_{A2432}$ | $R_{A34}$ | H | N | $C(CH_3)_2$ |
| $L_{A2433}$ | H | H | N | $Si(CH_3)_2$ |
| $L_{A2434}$ | $R_{B1}$ | H | N | $Si(CH_3)_2$ |
| $L_{A2435}$ | $R_{B3}$ | H | N | $Si(CH_3)_2$ |
| $L_{A2436}$ | $R_{B4}$ | H | N | $Si(CH_3)_2$ |
| $L_{A2437}$ | $R_{B7}$ | H | N | $Si(CH_3)_2$ |
| $L_{A2438}$ | $R_{B10}$ | H | N | $Si(CH_3)_2$ |
| $L_{A2439}$ | $R_{A3}$ | H | N | $Si(CH_3)_2$ |
| $L_{A2440}$ | $R_{A34}$ | H | N | $Si(CH_3)_2$ |
| $L_{A2441}$ | H | $R_{B1}$ | N | S |
| $L_{A2442}$ | $R_{B1}$ | $R_{B1}$ | N | S |
| $L_{A2443}$ | $R_{B3}$ | $R_{B1}$ | N | S |
| $L_{A2444}$ | $R_{B4}$ | $R_{B1}$ | N | S |
| $L_{A2445}$ | $R_{B7}$ | $R_{B1}$ | N | S |
| $L_{A2446}$ | $R_{B10}$ | $R_{B1}$ | N | S |
| $L_{A2447}$ | $R_{A3}$ | $R_{B1}$ | N | S |
| $L_{A2448}$ | $R_{A34}$ | $R_{B1}$ | N | S |
| $L_{A2449}$ | H | $R_{B1}$ | N | O |
| $L_{A2450}$ | $R_{B1}$ | $R_{B1}$ | N | O |
| $L_{A2451}$ | $R_{B3}$ | $R_{B1}$ | N | O |
| $L_{A2452}$ | $R_{B4}$ | $R_{B1}$ | N | O |
| $L_{A2453}$ | $R_{B7}$ | $R_{B1}$ | N | O |
| $L_{A2454}$ | $R_{B10}$ | $R_{B1}$ | N | O |
| $L_{A2455}$ | $R_{A3}$ | $R_{B1}$ | N | O |
| $L_{A2456}$ | $R_{A34}$ | $R_{B1}$ | N | O |
| $L_{A2457}$ | H | $R_{B1}$ | N | $NCH_3$ |
| $L_{A2458}$ | $R_{B1}$ | $R_{B1}$ | N | $NCH_3$ |
| $L_{A2459}$ | $R_{B3}$ | $R_{B1}$ | N | $NCH_3$ |
| $L_{A2460}$ | $R_{B4}$ | $R_{B1}$ | N | $NCH_3$ |
| $L_{A2461}$ | $R_{B7}$ | $R_{B1}$ | N | $NCH_3$ |
| $L_{A2462}$ | $R_{B10}$ | $R_{B1}$ | N | $NCH_3$ |
| $L_{A2463}$ | $R_{A3}$ | $R_{B1}$ | N | $NCH_3$ |
| $L_{A2464}$ | $R_{A34}$ | $R_{B1}$ | N | $NCH_3$ |
| $L_{A2465}$ | H | $R_{B1}$ | N | $C(CH_3)_2$ |
| $L_{A2466}$ | $R_{B1}$ | $R_{B1}$ | N | $C(CH_3)_2$ |
| $L_{A2467}$ | $R_{B3}$ | $R_{B1}$ | N | $C(CH_3)_2$ |
| $L_{A2468}$ | $R_{B4}$ | $R_{B1}$ | N | $C(CH_3)_2$ |
| $L_{A2469}$ | $R_{B7}$ | $R_{B1}$ | N | $C(CH_3)_2$ |
| $L_{A2470}$ | $R_{B10}$ | $R_{B1}$ | N | $C(CH_3)_2$ |
| $L_{A2471}$ | $R_{A3}$ | $R_{B1}$ | N | $C(CH_3)_2$ |
| $L_{A2472}$ | $R_{A34}$ | $R_{B1}$ | N | $C(CH_3)_2$ |
| $L_{A2473}$ | H | $R_{B1}$ | N | $Si(CH_3)_2$ |
| $L_{A2474}$ | $R_{B1}$ | $R_{B1}$ | N | $Si(CH_3)_2$ |
| $L_{A2475}$ | $R_{B3}$ | $R_{B1}$ | N | $Si(CH_3)_2$ |
| $L_{A2476}$ | $R_{B4}$ | $R_{B1}$ | N | $Si(CH_3)_2$ |
| $L_{A2477}$ | $R_{B7}$ | $R_{B1}$ | N | $Si(CH_3)_2$ |
| $L_{A2478}$ | $R_{B10}$ | $R_{B1}$ | N | $Si(CH_3)_2$ |
| $L_{A2479}$ | $R_{A3}$ | $R_{B1}$ | N | $Si(CH_3)_2$ |
| $L_{A2480}$ | $R_{A34}$ | $R_{B1}$ | N | $Si(CH_3)_2$ |
| $L_{A2481}$ | H | $R_{B6}$ | N | S |
| $L_{A2482}$ | $R_{B1}$ | $R_{B6}$ | N | S |
| $L_{A2483}$ | $R_{B3}$ | $R_{B6}$ | N | S |
| $L_{A2484}$ | $R_{B4}$ | $R_{B6}$ | N | S |
| $L_{A2485}$ | $R_{B7}$ | $R_{B6}$ | N | S |

-continued

| Ligand | $R^1$ | $R^5$ | X | Y |
|---|---|---|---|---|
| $L_{A2486}$ | $R_{B10}$ | $R_{B6}$ | N | S |
| $L_{A2487}$ | $R_{A3}$ | $R_{B6}$ | N | S |
| $L_{A2488}$ | $R_{A34}$ | $R_{B6}$ | N | S |
| $L_{A2489}$ | H | $R_{B6}$ | N | O |
| $L_{A2490}$ | $R_{B1}$ | $R_{B6}$ | N | O |
| $L_{A2491}$ | $R_{B3}$ | $R_{B6}$ | N | O |
| $L_{A2492}$ | $R_{B4}$ | $R_{B6}$ | N | O |
| $L_{A2493}$ | $R_{B7}$ | $R_{B6}$ | N | O |
| $L_{A2494}$ | $R_{B10}$ | $R_{B6}$ | N | O |
| $L_{A2495}$ | $R_{A3}$ | $R_{B6}$ | N | O |
| $L_{A2496}$ | $R_{A34}$ | $R_{B6}$ | N | O |
| $L_{A2497}$ | H | $R_{B6}$ | N | $NCH_3$ |
| $L_{A2498}$ | $R_{B1}$ | $R_{B6}$ | N | $NCH_3$ |
| $L_{A2499}$ | $R_{B3}$ | $R_{B6}$ | N | $NCH_3$ |
| $L_{A2500}$ | $R_{B4}$ | $R_{B6}$ | N | $NCH_3$ |
| $L_{A2501}$ | $R_{B7}$ | $R_{B6}$ | N | $NCH_3$ |
| $L_{A2502}$ | $R_{B10}$ | $R_{B6}$ | N | $NCH_3$ |
| $L_{A2503}$ | $R_{A3}$ | $R_{B6}$ | N | $NCH_3$ |
| $L_{A2504}$ | $R_{A34}$ | $R_{B6}$ | N | $NCH_3$ |
| $L_{A2505}$ | H | $R_{B6}$ | N | $C(CH_3)_2$ |
| $L_{A2506}$ | $R_{B1}$ | $R_{B6}$ | N | $C(CH_3)_2$ |
| $L_{A2507}$ | $R_{B3}$ | $R_{B6}$ | N | $C(CH_3)_2$ |
| $L_{A2508}$ | $R_{B4}$ | $R_{B6}$ | N | $C(CH_3)_2$ |
| $L_{A2509}$ | $R_{B7}$ | $R_{B6}$ | N | $C(CH_3)_2$ |
| $L_{A2510}$ | $R_{B10}$ | $R_{B6}$ | N | $C(CH_3)_2$ |
| $L_{A2511}$ | $R_{A3}$ | $R_{B6}$ | N | $C(CH_3)_2$ |
| $L_{A2512}$ | $R_{A34}$ | $R_{B6}$ | N | $C(CH_3)_2$ |
| $L_{A2513}$ | H | $R_{B6}$ | N | $Si(CH_3)_2$ |
| $L_{A2514}$ | $R_{B1}$ | $R_{B6}$ | N | $Si(CH_3)_2$ |
| $L_{A2515}$ | $R_{B3}$ | $R_{B6}$ | N | $Si(CH_3)_2$ |
| $L_{A2516}$ | $R_{B4}$ | $R_{B6}$ | N | $Si(CH_3)_2$ |
| $L_{A2517}$ | $R_{B7}$ | $R_{B6}$ | N | $Si(CH_3)_2$ |
| $L_{A2518}$ | $R_{B10}$ | $R_{B6}$ | N | $Si(CH_3)_2$ |
| $L_{A2519}$ | $R_{A3}$ | $R_{B6}$ | N | $Si(CH_3)_2$ |
| $L_{A2520}$ | $R_{A34}$ | $R_{B6}$ | N | $Si(CH_3)_2$ |

wherein $L_{A2521}$ through $L_{A2640}$ have a structure of Formula XVIII:

Formula XVIII

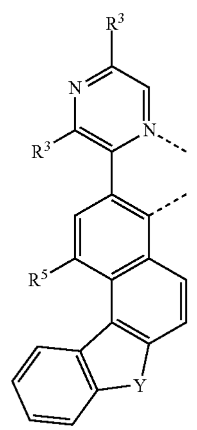

wherein $R^3$, $R^5$, and Y are defined as provided below:

| Ligand | $R^5$ | $R^3$ | Y | Ligand | $R^5$ | $R^3$ | Y |
|---|---|---|---|---|---|---|---|
| $L_{A2521}$ | H | H | S | $L_{A2581}$ | $R_{B1}$ | $R_{B4}$ | $NCH_3$ |
| $L_{A2522}$ | H | $R_{B1}$ | S | $L_{A2582}$ | $R_{B1}$ | $R_{B5}$ | $NCH_3$ |
| $L_{A2523}$ | H | $R_{B2}$ | S | $L_{A2583}$ | $R_{B1}$ | $R_{A34}$ | $NCH_3$ |
| $L_{A2524}$ | H | $R_{B3}$ | S | $L_{A2584}$ | $R_{B1}$ | $R_{A52}$ | $NCH_3$ |
| $L_{A2525}$ | H | $R_{B4}$ | S | $L_{A2585}$ | $R_{B1}$ | H | $C(CH_3)_2$ |
| $L_{A2526}$ | H | $R_{B5}$ | S | $L_{A2586}$ | $R_{B1}$ | $R_{B1}$ | $C(CH_3)_2$ |
| $L_{A2527}$ | H | $R_{A34}$ | S | $L_{A2587}$ | $R_{B1}$ | $R_{B2}$ | $C(CH_3)_2$ |
| $L_{A2528}$ | H | $R_{A52}$ | S | $L_{A2588}$ | $R_{B1}$ | $R_{B3}$ | $C(CH_3)_2$ |

-continued

| Ligand | $R^5$ | $R^3$ | Y | Ligand | $R^5$ | $R^3$ | Y |
|---|---|---|---|---|---|---|---|
| $L_{A2529}$ | H | H | O | $L_{A2589}$ | $R_{B1}$ | $R_{B4}$ | $C(CH_3)_2$ |
| $L_{A2530}$ | H | $R_{B1}$ | O | $L_{A2590}$ | $R_{B1}$ | $R_{B5}$ | $C(CH_3)_2$ |
| $L_{A2531}$ | H | $R_{B2}$ | O | $L_{A2591}$ | $R_{B1}$ | $R_{A34}$ | $C(CH_3)_2$ |
| $L_{A2532}$ | H | $R_{B3}$ | O | $L_{A2592}$ | $R_{B1}$ | $R_{A52}$ | $C(CH_3)_2$ |
| $L_{A2533}$ | H | $R_{B4}$ | O | $L_{A2593}$ | $R_{B1}$ | H | $Si(CH_3)_2$ |
| $L_{A2534}$ | H | $R_{B5}$ | O | $L_{A2594}$ | $R_{B1}$ | $R_{B1}$ | $Si(CH_3)_2$ |
| $L_{A2535}$ | H | $R_{A34}$ | O | $L_{A2595}$ | $R_{B1}$ | $R_{B2}$ | $Si(CH_3)_2$ |
| $L_{A2536}$ | H | $R_{A52}$ | O | $L_{A2596}$ | $R_{B1}$ | $R_{B3}$ | $Si(CH_3)_2$ |
| $L_{A2537}$ | H | H | $NCH_3$ | $L_{A2597}$ | $R_{B1}$ | $R_{B4}$ | $Si(CH_3)_2$ |
| $L_{A2538}$ | H | $R_{B1}$ | $NCH_3$ | $L_{A2598}$ | $R_{B1}$ | $R_{B5}$ | $Si(CH_3)_2$ |
| $L_{A2539}$ | H | $R_{B2}$ | $NCH_3$ | $L_{A2599}$ | $R_{B1}$ | $R_{A34}$ | $Si(CH_3)_2$ |
| $L_{A2540}$ | H | $R_{B3}$ | $NCH_3$ | $L_{A2600}$ | $R_{B1}$ | $R_{A52}$ | $Si(CH_3)_2$ |
| $L_{A2541}$ | H | $R_{B4}$ | $NCH_3$ | $L_{A2601}$ | $R_{B6}$ | H | S |
| $L_{A2542}$ | H | $R_{B5}$ | $NCH_3$ | $L_{A2602}$ | $R_{B6}$ | $R_{B1}$ | S |
| $L_{A2543}$ | H | $R_{A34}$ | $NCH_3$ | $L_{A2603}$ | $R_{B6}$ | $R_{B2}$ | S |
| $L_{A2544}$ | H | $R_{A52}$ | $NCH_3$ | $L_{A2604}$ | $R_{B6}$ | $R_{B3}$ | S |
| $L_{A2545}$ | H | H | $C(CH_3)_2$ | $L_{A2605}$ | $R_{B6}$ | $R_{B4}$ | S |
| $L_{A2546}$ | H | $R_{B1}$ | $C(CH_3)_2$ | $L_{A2606}$ | $R_{B6}$ | $R_{B5}$ | S |
| $L_{A2547}$ | H | $R_{B2}$ | $C(CH_3)_2$ | $L_{A2607}$ | $R_{B6}$ | $R_{A34}$ | S |
| $L_{A2548}$ | H | $R_{B3}$ | $C(CH_3)_2$ | $L_{A2608}$ | $R_{B6}$ | $R_{A52}$ | S |
| $L_{A2549}$ | H | $R_{B4}$ | $C(CH_3)_2$ | $L_{A2609}$ | $R_{B6}$ | H | O |
| $L_{A2550}$ | H | $R_{B5}$ | $C(CH_3)_2$ | $L_{A2610}$ | $R_{B6}$ | $R_{B1}$ | O |
| $L_{A2551}$ | H | $R_{A34}$ | $C(CH_3)_2$ | $L_{A2611}$ | $R_{B6}$ | $R_{B2}$ | O |
| $L_{A2552}$ | H | $R_{A52}$ | $C(CH_3)_2$ | $L_{A2612}$ | $R_{B6}$ | $R_{B3}$ | O |
| $L_{A2553}$ | H | H | $Si(CH_3)_2$ | $L_{A2613}$ | $R_{B6}$ | $R_{B4}$ | O |
| $L_{A2554}$ | H | $R_{B1}$ | $Si(CH_3)_2$ | $L_{A2614}$ | $R_{B6}$ | $R_{B5}$ | O |
| $L_{A2555}$ | H | $R_{B2}$ | $Si(CH_3)_2$ | $L_{A2615}$ | $R_{B6}$ | $R_{A34}$ | O |
| $L_{A2556}$ | H | $R_{B3}$ | $Si(CH_3)_2$ | $L_{A2616}$ | $R_{B6}$ | $R_{A52}$ | O |
| $L_{A2557}$ | H | $R_{B4}$ | $Si(CH_3)_2$ | $L_{A2617}$ | $R_{B6}$ | H | $NCH_3$ |
| $L_{A2558}$ | H | $R_{B5}$ | $Si(CH_3)_2$ | $L_{A2618}$ | $R_{B6}$ | $R_{B1}$ | $NCH_3$ |
| $L_{A2559}$ | H | $R_{A34}$ | $Si(CH_3)_2$ | $L_{A2619}$ | $R_{B6}$ | $R_{B2}$ | $NCH_3$ |
| $L_{A2560}$ | H | $R_{A52}$ | $Si(CH_3)_2$ | $L_{A2620}$ | $R_{B6}$ | $R_{B3}$ | $NCH_3$ |
| $L_{A2561}$ | $R_{B1}$ | H | S | $L_{A2621}$ | $R_{B6}$ | $R_{B4}$ | $NCH_3$ |
| $L_{A2562}$ | $R_{B1}$ | $R_{B1}$ | S | $L_{A2622}$ | $R_{B6}$ | $R_{B5}$ | $NCH_3$ |
| $L_{A2563}$ | $R_{B1}$ | $R_{B2}$ | S | $L_{A2623}$ | $R_{B6}$ | $R_{A34}$ | $NCH_3$ |
| $L_{A2564}$ | $R_{B1}$ | $R_{B3}$ | S | $L_{A2624}$ | $R_{B6}$ | $R_{A52}$ | $NCH_3$ |
| $L_{A2565}$ | $R_{B1}$ | $R_{B4}$ | S | $L_{A2625}$ | $R_{B6}$ | H | $C(CH_3)_2$ |
| $L_{A2566}$ | $R_{B1}$ | $R_{B5}$ | S | $L_{A2626}$ | $R_{B6}$ | $R_{B1}$ | $C(CH_3)_2$ |
| $L_{A2567}$ | $R_{B1}$ | $R_{A34}$ | S | $L_{A2627}$ | $R_{B6}$ | $R_{B2}$ | $C(CH_3)_2$ |
| $L_{A2568}$ | $R_{B1}$ | $R_{A52}$ | S | $L_{A2628}$ | $R_{B6}$ | $R_{B3}$ | $C(CH_3)_2$ |
| $L_{A2569}$ | $R_{B1}$ | H | O | $L_{A2629}$ | $R_{B6}$ | $R_{B4}$ | $C(CH_3)_2$ |
| $L_{A2570}$ | $R_{B1}$ | $R_{B1}$ | O | $L_{A2630}$ | $R_{B6}$ | $R_{B5}$ | $C(CH_3)_2$ |
| $L_{A2571}$ | $R_{B1}$ | $R_{B2}$ | O | $L_{A2631}$ | $R_{B6}$ | $R_{A34}$ | $C(CH_3)_2$ |
| $L_{A2572}$ | $R_{B1}$ | $R_{B3}$ | O | $L_{A2632}$ | $R_{B6}$ | $R_{A52}$ | $C(CH_3)_2$ |
| $L_{A2573}$ | $R_{B1}$ | $R_{B4}$ | O | $L_{A2633}$ | $R_{B6}$ | H | $Si(CH_3)$ |
| $L_{A2574}$ | $R_{B1}$ | $R_{B5}$ | O | $L_{A2634}$ | $R_{B6}$ | $R_{B1}$ | $Si(CH_3)$ |
| $L_{A2575}$ | $R_{B1}$ | $R_{A34}$ | O | $L_{A2635}$ | $R_{B6}$ | $R_{B2}$ | $Si(CH_3)$ |
| $L_{A2576}$ | $R_{B1}$ | $R_{A52}$ | O | $L_{A2636}$ | $R_{B6}$ | $R_{B3}$ | $Si(CH_3)$ |
| $L_{A2577}$ | $R_{B1}$ | H | $NCH_3$ | $L_{A2637}$ | $R_{B6}$ | $R_{B4}$ | $Si(CH_3)$ |
| $L_{A2578}$ | $R_{B1}$ | $R_{B1}$ | $NCH_3$ | $L_{A2638}$ | $R_{B6}$ | $R_{B5}$ | $Si(CH_3)$ |
| $L_{A2579}$ | $R_{B1}$ | $R_{B2}$ | $NCH_3$ | $L_{A2639}$ | $R_{B6}$ | $R_{A34}$ | $Si(CH_3)$ |
| $L_{A2580}$ | $R_{B1}$ | $R_{B3}$ | $NCH_3$ | $L_{A2640}$ | $R_{B6}$ | $R_{A52}$ | $Si(CH_3)$ |

wherein $L_{A2641}$ through $L_{A2736}$ have a structure of Formula XIX:

Formula XIX

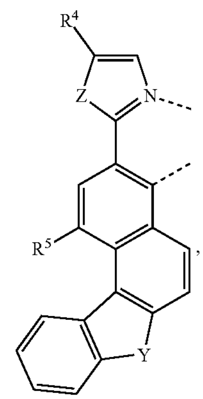

wherein $R^4$, $R^5$, Y, and Z are defined as provided below:

| Ligand | $R^5$ | $R^4$ | Y | Z | Ligand | $R^5$ | $R^4$ | Y | Z |
|---|---|---|---|---|---|---|---|---|---|
| $L_{A2641}$ | H | H | S | S | $L_{A2689}$ | $R_{B6}$ | H | S | S |
| $L_{A2642}$ | H | $R_{B1}$ | S | S | $L_{A2690}$ | $R_{B6}$ | $R_{B1}$ | S | S |
| $L_{A2643}$ | H | $R_{B3}$ | S | S | $L_{A2691}$ | $R_{B6}$ | $R_{B3}$ | S | S |
| $L_{A2644}$ | H | $R_{B4}$ | S | S | $L_{A2692}$ | $R_{B6}$ | $R_{B4}$ | S | S |
| $L_{A2645}$ | H | $R_{B7}$ | S | S | $L_{A2693}$ | $R_{B6}$ | $R_{B7}$ | S | S |
| $L_{A2646}$ | H | $R_{B10}$ | S | S | $L_{A2694}$ | $R_{B6}$ | $R_{B10}$ | S | S |
| $L_{A2647}$ | H | $R_{A3}$ | S | S | $L_{A2695}$ | $R_{B6}$ | $R_{A3}$ | S | S |
| $L_{A2648}$ | H | $R_{A34}$ | S | S | $L_{A2696}$ | $R_{B6}$ | $R_{A34}$ | S | S |
| $L_{A2649}$ | H | H | S | O | $L_{A2697}$ | $R_{B6}$ | H | S | O |
| $L_{A2650}$ | H | $R_{B1}$ | S | O | $L_{A2698}$ | $R_{B6}$ | $R_{B1}$ | S | O |
| $L_{A2651}$ | H | $R_{B3}$ | S | O | $L_{A2699}$ | $R_{B6}$ | $R_{B3}$ | S | O |
| $L_{A2652}$ | H | $R_{B4}$ | S | O | $L_{A2700}$ | $R_{B6}$ | $R_{B4}$ | S | O |
| $L_{A2653}$ | H | $R_{B7}$ | S | O | $L_{A2701}$ | $R_{B6}$ | $R_{B7}$ | S | O |
| $L_{A2654}$ | H | $R_{B10}$ | S | O | $L_{A2702}$ | $R_{B6}$ | $R_{B10}$ | S | O |
| $L_{A2655}$ | H | $R_{A3}$ | S | O | $L_{A2703}$ | $R_{B6}$ | $R_{A3}$ | S | O |
| $L_{A2656}$ | H | $R_{A34}$ | S | O | $L_{A2704}$ | $R_{B6}$ | $R_{A34}$ | S | O |
| $L_{A2657}$ | H | H | S | $NCH_3$ | $L_{A2705}$ | $R_{B6}$ | H | S | $NCH_3$ |
| $L_{A2658}$ | H | $R_{B1}$ | S | $NCH_3$ | $L_{A2706}$ | $R_{B6}$ | $R_{B1}$ | S | $NCH_3$ |
| $L_{A2659}$ | H | $R_{B3}$ | S | $NCH_3$ | $L_{A2707}$ | $R_{B6}$ | $R_{B3}$ | S | $NCH_3$ |
| $L_{A2660}$ | H | $R_{B4}$ | S | $NCH_3$ | $L_{A2708}$ | $R_{B6}$ | $R_{B4}$ | S | $NCH_3$ |
| $L_{A2661}$ | H | $R_{B7}$ | S | $NCH_3$ | $L_{A2709}$ | $R_{B6}$ | $R_{B7}$ | S | $NCH_3$ |
| $L_{A2662}$ | H | $R_{B10}$ | S | $NCH_3$ | $L_{A2710}$ | $R_{B6}$ | $R_{B10}$ | S | $NCH_3$ |
| $L_{A2663}$ | H | $R_{A3}$ | S | $NCH_3$ | $L_{A2711}$ | $R_{B6}$ | $R_{A3}$ | S | $NCH_3$ |
| $L_{A2664}$ | H | $R_{A34}$ | S | $NCH_3$ | $L_{A2712}$ | $R_{B6}$ | $R_{A34}$ | S | $NCH_3$ |
| $L_{A2665}$ | H | H | O | S | $L_{A2713}$ | $R_{B6}$ | H | O | S |
| $L_{A2666}$ | H | $R_{B1}$ | O | S | $L_{A2714}$ | $R_{B6}$ | $R_{B1}$ | O | S |
| $L_{A2667}$ | H | $R_{B3}$ | O | S | $L_{A2715}$ | $R_{B6}$ | $R_{B3}$ | O | S |
| $L_{A2668}$ | H | $R_{B4}$ | O | S | $L_{A2716}$ | $R_{B6}$ | $R_{B4}$ | O | S |
| $L_{A2669}$ | H | $R_{B7}$ | O | S | $L_{A2717}$ | $R_{B6}$ | $R_{B7}$ | O | S |
| $L_{A2670}$ | H | $R_{B10}$ | O | S | $L_{A2718}$ | $R_{B6}$ | $R_{B10}$ | O | S |
| $L_{A2671}$ | H | $R_{A3}$ | O | S | $L_{A2719}$ | $R_{B6}$ | $R_{A3}$ | O | S |
| $L_{A2672}$ | H | $R_{A34}$ | O | S | $L_{A2720}$ | $R_{B6}$ | $R_{A34}$ | O | S |
| $L_{A2673}$ | H | H | O | O | $L_{A2721}$ | $R_{B6}$ | H | O | O |
| $L_{A2674}$ | H | $R_{B1}$ | O | O | $L_{A2722}$ | $R_{B6}$ | $R_{B1}$ | O | O |
| $L_{A2675}$ | H | $R_{B3}$ | O | O | $L_{A2723}$ | $R_{B6}$ | $R_{B3}$ | O | O |
| $L_{A2676}$ | H | $R_{B4}$ | O | O | $L_{A2724}$ | $R_{B6}$ | $R_{B4}$ | O | O |
| $L_{A2677}$ | H | $R_{B7}$ | O | O | $L_{A2725}$ | $R_{B6}$ | $R_{B7}$ | O | O |
| $L_{A2678}$ | H | $R_{B10}$ | O | O | $L_{A2726}$ | $R_{B6}$ | $R_{B10}$ | O | O |
| $L_{A2679}$ | H | $R_{A3}$ | O | O | $L_{A2727}$ | $R_{B6}$ | $R_{A3}$ | O | O |
| $L_{A2680}$ | H | $R_{A34}$ | O | O | $L_{A2728}$ | $R_{B6}$ | $R_{A34}$ | O | O |
| $L_{A2681}$ | H | H | O | $NCH_3$ | $L_{A2729}$ | $R_{B6}$ | H | O | $NCH_3$ |
| $L_{A2682}$ | H | $R_{B1}$ | O | $NCH_3$ | $L_{A2730}$ | $R_{B6}$ | $R_{B1}$ | O | $NCH_3$ |
| $L_{A2683}$ | H | $R_{B3}$ | O | $NCH_3$ | $L_{A2731}$ | $R_{B6}$ | $R_{B3}$ | O | $NCH_3$ |
| $L_{A2684}$ | H | $R_{B4}$ | O | $NCH_3$ | $L_{A2732}$ | $R_{B6}$ | $R_{B4}$ | O | $NCH_3$ |
| $L_{A2685}$ | H | $R_{B7}$ | O | $NCH_3$ | $L_{A2733}$ | $R_{B6}$ | $R_{B7}$ | O | $NCH_3$ |
| $L_{A2686}$ | H | $R_{B10}$ | O | $NCH_3$ | $L_{A2734}$ | $R_{B6}$ | $R_{B10}$ | O | $NCH_3$ |
| $L_{A2687}$ | H | $R_{A3}$ | O | $NCH_3$ | $L_{A2735}$ | $R_{B6}$ | $R_{A3}$ | O | $NCH_3$ |
| $L_{A2688}$ | H | $R_{A34}$ | O | $NCH_3$ | $L_{A2736}$ | $R_{B6}$ | $R_{A34}$ | O | $NCH_3$ |

wherein $L_{A2857}$ through $L_{A2976}$ have a structure of Formula XX:

Formula XX

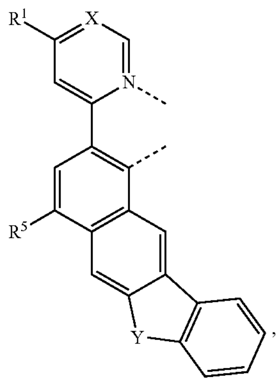

wherein $R^1$, $R^5$, Y, and X are defined as provided below:

| Ligand | $R^1$ | $R^5$ | X | Y |
|---|---|---|---|---|
| $L_{A2857}$ | H | H | N | S |
| $L_{A2858}$ | $R_{B1}$ | H | N | S |
| $L_{A2859}$ | $R_{B3}$ | H | N | S |
| $L_{A2860}$ | $R_{B4}$ | H | N | S |
| $L_{A2861}$ | $R_{B7}$ | H | N | S |
| $L_{A2862}$ | $R_{B10}$ | H | N | S |
| $L_{A2863}$ | $R_{A3}$ | H | N | S |
| $L_{A2864}$ | $R_{A34}$ | H | N | S |
| $L_{A2865}$ | H | H | N | O |
| $L_{A2866}$ | $R_{B1}$ | H | N | O |
| $L_{A2867}$ | $R_{B3}$ | H | N | O |
| $L_{A2868}$ | $R_{B4}$ | H | N | O |
| $L_{A2869}$ | $R_{B7}$ | H | N | O |
| $L_{A2870}$ | $R_{B10}$ | H | N | O |
| $L_{A2871}$ | $R_{A3}$ | H | N | O |
| $L_{A2872}$ | $R_{A34}$ | H | N | O |
| $L_{A2873}$ | H | H | N | $NCH_3$ |
| $L_{A2874}$ | $R_{B1}$ | H | N | $NCH_3$ |
| $L_{A2875}$ | $R_{B3}$ | H | N | $NCH_3$ |
| $L_{A2876}$ | $R_{B4}$ | H | N | $NCH_3$ |
| $L_{A2877}$ | $R_{B7}$ | H | N | $NCH_3$ |
| $L_{A2878}$ | $R_{B10}$ | H | N | $NCH_3$ |
| $L_{A2879}$ | $R_{A3}$ | H | N | $NCH_3$ |
| $L_{A2880}$ | $R_{A34}$ | H | N | $NCH_3$ |
| $L_{A2881}$ | H | H | N | $C(CH_3)_2$ |
| $L_{A2882}$ | $R_{B1}$ | H | N | $C(CH_3)_2$ |
| $L_{A2883}$ | $R_{B3}$ | H | N | $C(CH_3)_2$ |
| $L_{A2884}$ | $R_{B4}$ | H | N | $C(CH_3)_2$ |
| $L_{A2885}$ | $R_{B7}$ | H | N | $C(CH_3)_2$ |
| $L_{A2886}$ | $R_{B10}$ | H | N | $C(CH_3)_2$ |
| $L_{A2887}$ | $R_{A3}$ | H | N | $C(CH_3)_2$ |
| $L_{A2888}$ | $R_{A34}$ | H | N | $C(CH_3)_2$ |
| $L_{A2889}$ | H | H | N | $Si(CH_3)_2$ |
| $L_{A2890}$ | $R_{B1}$ | H | N | $Si(CH_3)_2$ |
| $L_{A2891}$ | $R_{B3}$ | H | N | $Si(CH_3)_2$ |
| $L_{A2892}$ | $R_{B4}$ | H | N | $Si(CH_3)_2$ |
| $L_{A2893}$ | $R_{B7}$ | H | N | $Si(CH_3)_2$ |
| $L_{A2894}$ | $R_{B10}$ | H | N | $Si(CH_3)_2$ |
| $L_{A2895}$ | $R_{A3}$ | H | N | $Si(CH_3)_2$ |
| $L_{A2896}$ | $R_{A34}$ | H | N | $Si(CH_3)_2$ |
| $L_{A2897}$ | H | $R_{B1}$ | N | S |
| $L_{A2898}$ | $R_{B1}$ | $R_{B1}$ | N | S |
| $L_{A2899}$ | $R_{B3}$ | $R_{B1}$ | N | S |
| $L_{A2900}$ | $R_{B4}$ | $R_{B1}$ | N | S |
| $L_{A2901}$ | $R_{B7}$ | $R_{B1}$ | N | S |
| $L_{A2902}$ | $R_{B10}$ | $R_{B1}$ | N | S |
| $L_{A2903}$ | $R_{A3}$ | $R_{B1}$ | N | S |
| $L_{A2904}$ | $R_{A34}$ | $R_{B1}$ | N | S |
| $L_{A2905}$ | H | $R_{B1}$ | N | O |
| $L_{A2906}$ | $R_{B1}$ | $R_{B1}$ | N | O |
| $L_{A2907}$ | $R_{B3}$ | $R_{B1}$ | N | O |
| $L_{A2908}$ | $R_{B4}$ | $R_{B1}$ | N | O |
| $L_{A2909}$ | $R_{B7}$ | $R_{B1}$ | N | O |
| $L_{A2910}$ | $R_{B10}$ | $R_{B1}$ | N | O |
| $L_{A2911}$ | $R_{A3}$ | $R_{B1}$ | N | O |
| $L_{A2912}$ | $R_{A34}$ | $R_{B1}$ | N | O |
| $L_{A2913}$ | H | $R_{B1}$ | N | $NCH_3$ |
| $L_{A2914}$ | $R_{B1}$ | $R_{B1}$ | N | $NCH_3$ |
| $L_{A2915}$ | $R_{B3}$ | $R_{B1}$ | N | $NCH_3$ |
| $L_{A2916}$ | $R_{B4}$ | $R_{B1}$ | N | $NCH_3$ |
| $L_{A2917}$ | $R_{B7}$ | $R_{B1}$ | N | $NCH_3$ |
| $L_{A2918}$ | $R_{B10}$ | $R_{B1}$ | N | $NCH_3$ |
| $L_{A2919}$ | $R_{A3}$ | $R_{B1}$ | N | $NCH_3$ |
| $L_{A2920}$ | $R_{A34}$ | $R_{B1}$ | N | $NCH_3$ |
| $L_{A2921}$ | H | $R_{B1}$ | N | $C(CH_3)_2$ |
| $L_{A2922}$ | $R_{B1}$ | $R_{B1}$ | N | $C(CH_3)_2$ |
| $L_{A2923}$ | $R_{B3}$ | $R_{B1}$ | N | $C(CH_3)_2$ |
| $L_{A2924}$ | $R_{B4}$ | $R_{B1}$ | N | $C(CH_3)_2$ |
| $L_{A2925}$ | $R_{B7}$ | $R_{B1}$ | N | $C(CH_3)_2$ |
| $L_{A2926}$ | $R_{B10}$ | $R_{B1}$ | N | $C(CH_3)_2$ |
| $L_{A2927}$ | $R_{A3}$ | $R_{B1}$ | N | $C(CH_3)_2$ |
| $L_{A2928}$ | $R_{A34}$ | $R_{B1}$ | N | $C(CH_3)_2$ |
| $L_{A2929}$ | H | $R_{B1}$ | N | $Si(CH_3)_2$ |
| $L_{A2930}$ | $R_{B1}$ | $R_{B1}$ | N | $Si(CH_3)_2$ |
| $L_{A2931}$ | $R_{B3}$ | $R_{B1}$ | N | $Si(CH_3)_2$ |
| $L_{A2932}$ | $R_{B4}$ | $R_{B1}$ | N | $Si(CH_3)_2$ |
| $L_{A2933}$ | $R_{B7}$ | $R_{B1}$ | N | $Si(CH_3)_2$ |
| $L_{A2934}$ | $R_{B10}$ | $R_{B1}$ | N | $Si(CH_3)_2$ |
| $L_{A2935}$ | $R_{A3}$ | $R_{B1}$ | N | $Si(CH_3)_2$ |
| $L_{A2936}$ | $R_{A34}$ | $R_{B1}$ | N | $Si(CH_3)_2$ |
| $L_{A2937}$ | H | $R_{B6}$ | N | S |
| $L_{A2938}$ | $R_{B1}$ | $R_{B6}$ | N | S |
| $L_{A2939}$ | $R_{B3}$ | $R_{B6}$ | N | S |
| $L_{A2940}$ | $R_{B4}$ | $R_{B6}$ | N | S |
| $L_{A2941}$ | $R_{B7}$ | $R_{B6}$ | N | S |
| $L_{A2942}$ | $R_{B10}$ | $R_{B6}$ | N | S |
| $L_{A2943}$ | $R_{A3}$ | $R_{B6}$ | N | S |
| $L_{A2944}$ | $R_{A34}$ | $R_{B6}$ | N | S |
| $L_{A2945}$ | H | $R_{B6}$ | N | O |
| $L_{A2946}$ | $R_{B1}$ | $R_{B6}$ | N | O |
| $L_{A2947}$ | $R_{B3}$ | $R_{B6}$ | N | O |
| $L_{A2948}$ | $R_{B4}$ | $R_{B6}$ | N | O |
| $L_{A2949}$ | $R_{B7}$ | $R_{B6}$ | N | O |
| $L_{A2950}$ | $R_{B10}$ | $R_{B6}$ | N | O |
| $L_{A2951}$ | $R_{A3}$ | $R_{B6}$ | N | O |
| $L_{A2952}$ | $R_{A34}$ | $R_{B6}$ | N | O |
| $L_{A2953}$ | H | $R_{B6}$ | N | $NCH_3$ |
| $L_{A2954}$ | $R_{B1}$ | $R_{B6}$ | N | $NCH_3$ |
| $L_{A2955}$ | $R_{B3}$ | $R_{B6}$ | N | $NCH_3$ |
| $L_{A2956}$ | $R_{B4}$ | $R_{B6}$ | N | $NCH_3$ |
| $L_{A2957}$ | $R_{B7}$ | $R_{B6}$ | N | $NCH_3$ |
| $L_{A2958}$ | $R_{B10}$ | $R_{B6}$ | N | $NCH_3$ |
| $L_{A2959}$ | $R_{A3}$ | $R_{B6}$ | N | $NCH_3$ |
| $L_{A2960}$ | $R_{A34}$ | $R_{B6}$ | N | $NCH_3$ |
| $L_{A2961}$ | H | $R_{B6}$ | N | $C(CH_3)_2$ |
| $L_{A2962}$ | $R_{B1}$ | $R_{B6}$ | N | $C(CH_3)_2$ |
| $L_{A2963}$ | $R_{B3}$ | $R_{B6}$ | N | $C(CH_3)_2$ |
| $L_{A2964}$ | $R_{B4}$ | $R_{B6}$ | N | $C(CH_3)_2$ |
| $L_{A2965}$ | $R_{B7}$ | $R_{B6}$ | N | $C(CH_3)_2$ |
| $L_{A2966}$ | $R_{B10}$ | $R_{B6}$ | N | $C(CH_3)_2$ |
| $L_{A2967}$ | $R_{A3}$ | $R_{B6}$ | N | $C(CH_3)_2$ |
| $L_{A2968}$ | $R_{A34}$ | $R_{B6}$ | N | $C(CH_3)_2$ |
| $L_{A2969}$ | H | $R_{B6}$ | N | $Si(CH_3)_2$ |
| $L_{A2970}$ | $R_{B1}$ | $R_{B6}$ | N | $Si(CH_3)_2$ |
| $L_{A2971}$ | $R_{B3}$ | $R_{B6}$ | N | $Si(CH_3)_2$ |
| $L_{A2972}$ | $R_{B4}$ | $R_{B6}$ | N | $Si(CH_3)_2$ |
| $L_{A2973}$ | $R_{B7}$ | $R_{B6}$ | N | $Si(CH_3)_2$ |
| $L_{A2974}$ | $R_{B10}$ | $R_{B6}$ | N | $Si(CH_3)_2$ |
| $L_{A2975}$ | $R_{A3}$ | $R_{B6}$ | N | $Si(CH_3)_2$ |
| $L_{A2976}$ | $R_{A34}$ | $R_{B6}$ | N | $Si(CH_3)_2$ |

wherein $L_{A2977}$ through $L_{A3096}$ have a structure of Formula XXI:

Formula XXI

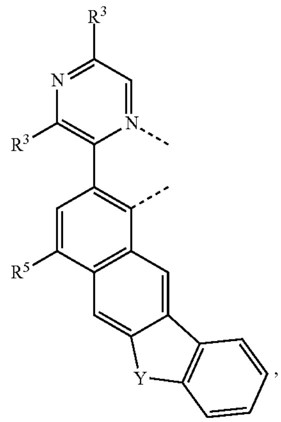

wherein $R^3$, $R^5$, and Y are defined as provided below:

| Ligand | $R^5$ | $R^3$ | Y | Ligand | $R^5$ | $R^3$ | Y |
|---|---|---|---|---|---|---|---|
| $L_{A2977}$ | H | H | S | $L_{A3037}$ | $R_{B1}$ | $R_{B4}$ | $NCH_3$ |
| $L_{A2978}$ | H | $R_{B1}$ | S | $L_{A3038}$ | $R_{B1}$ | $R_{B5}$ | $NCH_3$ |
| $L_{A2979}$ | H | $R_{B2}$ | S | $L_{A3039}$ | $R_{B1}$ | $R_{A34}$ | $NCH_3$ |
| $L_{A2980}$ | H | $R_{B3}$ | S | $L_{A3040}$ | $R_{B1}$ | $R_{A52}$ | $NCH_3$ |
| $L_{A2981}$ | H | $R_{B4}$ | S | $L_{A3041}$ | $R_{B1}$ | H | $C(CH_3)_2$ |
| $L_{A2982}$ | H | $R_{B5}$ | S | $L_{A3042}$ | $R_{B1}$ | $R_{B1}$ | $C(CH_3)_2$ |
| $L_{A2983}$ | H | $R_{A34}$ | S | $L_{A3043}$ | $R_{B1}$ | $R_{B2}$ | $C(CH_3)_2$ |
| $L_{A2984}$ | H | $R_{A52}$ | S | $L_{A3044}$ | $R_{B1}$ | $R_{B3}$ | $C(CH_3)_2$ |
| $L_{A2985}$ | H | H | O | $L_{A3045}$ | $R_{B1}$ | $R_{B4}$ | $C(CH_3)_2$ |
| $L_{A2986}$ | H | $R_{B1}$ | O | $L_{A3046}$ | $R_{B1}$ | $R_{B5}$ | $C(CH_3)_2$ |
| $L_{A2987}$ | H | $R_{B2}$ | O | $L_{A3047}$ | $R_{B1}$ | $R_{A34}$ | $C(CH_3)_2$ |
| $L_{A2988}$ | H | $R_{B3}$ | O | $L_{A3048}$ | $R_{B1}$ | $R_{A52}$ | $C(CH_3)_2$ |
| $L_{A2989}$ | H | $R_{B4}$ | O | $L_{A3049}$ | $R_{B1}$ | H | $Si(CH_3)_2$ |
| $L_{A2990}$ | H | $R_{B5}$ | O | $L_{A3050}$ | $R_{B1}$ | $R_{B1}$ | $Si(CH_3)_2$ |
| $L_{A2991}$ | H | $R_{A34}$ | O | $L_{A3051}$ | $R_{B1}$ | $R_{B2}$ | $Si(CH_3)_2$ |
| $L_{A2992}$ | H | $R_{A52}$ | O | $L_{A3052}$ | $R_{B1}$ | $R_{B3}$ | $Si(CH_3)_2$ |
| $L_{A2993}$ | H | H | $NCH_3$ | $L_{A3053}$ | $R_{B1}$ | $R_{B4}$ | $Si(CH_3)_2$ |
| $L_{A2994}$ | H | $R_{B1}$ | $NCH_3$ | $L_{A3054}$ | $R_{B1}$ | $R_{B5}$ | $Si(CH_3)_2$ |
| $L_{A2995}$ | H | $R_{B2}$ | $NCH_3$ | $L_{A3055}$ | $R_{B1}$ | $R_{A34}$ | $Si(CH_3)_2$ |
| $L_{A2996}$ | H | $R_{B3}$ | $NCH_3$ | $L_{A3056}$ | $R_{B1}$ | $R_{A52}$ | $Si(CH_3)_2$ |
| $L_{A2997}$ | H | $R_{B4}$ | $NCH_3$ | $L_{A3057}$ | $R_{B6}$ | H | S |
| $L_{A2998}$ | H | $R_{B5}$ | $NCH_3$ | $L_{A3058}$ | $R_{B6}$ | $R_{B1}$ | S |
| $L_{A2999}$ | H | $R_{A34}$ | $NCH_3$ | $L_{A3059}$ | $R_{B6}$ | $R_{B2}$ | S |
| $L_{A3000}$ | H | $R_{A52}$ | $NCH_3$ | $L_{A3060}$ | $R_{B6}$ | $R_{B3}$ | S |
| $L_{A3001}$ | H | H | $C(CH_3)_2$ | $L_{A3061}$ | $R_{B6}$ | $R_{B4}$ | S |
| $L_{A3002}$ | H | $R_{B1}$ | $C(CH_3)_2$ | $L_{A3062}$ | $R_{B6}$ | $R_{B5}$ | S |
| $L_{A3003}$ | H | $R_{B2}$ | $C(CH_3)_2$ | $L_{A3063}$ | $R_{B6}$ | $R_{A34}$ | S |
| $L_{A3004}$ | H | $R_{B3}$ | $C(CH_3)_2$ | $L_{A3064}$ | $R_{B6}$ | $R_{A52}$ | S |
| $L_{A3005}$ | H | $R_{B4}$ | $C(CH_3)_2$ | $L_{A3065}$ | $R_{B6}$ | H | O |
| $L_{A3006}$ | H | $R_{B5}$ | $C(CH_3)_2$ | $L_{A3066}$ | $R_{B6}$ | $R_{B1}$ | O |
| $L_{A3007}$ | H | $R_{A34}$ | $C(CH_3)_2$ | $L_{A3067}$ | $R_{B6}$ | $R_{B2}$ | O |
| $L_{A3008}$ | H | $R_{A52}$ | $C(CH_3)_2$ | $L_{A3068}$ | $R_{B6}$ | $R_{B3}$ | O |
| $L_{A3009}$ | H | H | $Si(CH_3)_2$ | $L_{A3069}$ | $R_{B6}$ | $R_{B4}$ | O |
| $L_{A3010}$ | H | $R_{B1}$ | $Si(CH_3)_2$ | $L_{A3070}$ | $R_{B6}$ | $R_{B5}$ | O |
| $L_{A3011}$ | H | $R_{B2}$ | $Si(CH_3)_2$ | $L_{A3071}$ | $R_{B6}$ | $R_{A34}$ | O |
| $L_{A3012}$ | H | $R_{B3}$ | $Si(CH_3)_2$ | $L_{A3072}$ | $R_{B6}$ | $R_{A52}$ | O |
| $L_{A3013}$ | H | $R_{B4}$ | $Si(CH_3)_2$ | $L_{A3073}$ | $R_{B6}$ | H | $NCH_3$ |
| $L_{A3014}$ | H | $R_{B5}$ | $Si(CH_3)_2$ | $L_{A3074}$ | $R_{B6}$ | $R_{B1}$ | $NCH_3$ |
| $L_{A3015}$ | H | $R_{A34}$ | $Si(CH_3)_2$ | $L_{A3075}$ | $R_{B6}$ | $R_{B2}$ | $NCH_3$ |
| $L_{A3016}$ | H | $R_{A52}$ | $Si(CH_3)_2$ | $L_{A3076}$ | $R_{B6}$ | $R_{B3}$ | $NCH_3$ |
| $L_{A3017}$ | $R_{B1}$ | H | S | $L_{A3077}$ | $R_{B6}$ | $R_{B4}$ | $NCH_3$ |
| $L_{A3018}$ | $R_{B1}$ | $R_{B1}$ | S | $L_{A3078}$ | $R_{B6}$ | $R_{B5}$ | $NCH_3$ |
| $L_{A3019}$ | $R_{B1}$ | $R_{B2}$ | S | $L_{A3079}$ | $R_{B6}$ | $R_{A34}$ | $NCH_3$ |
| $L_{A3020}$ | $R_{B1}$ | $R_{B3}$ | S | $L_{A3080}$ | $R_{B6}$ | $R_{A52}$ | $NCH_3$ |
| $L_{A3021}$ | $R_{B1}$ | $R_{B4}$ | S | $L_{A3081}$ | $R_{B6}$ | H | $C(CH_3)_2$ |
| $L_{A3022}$ | $R_{B1}$ | $R_{B5}$ | S | $L_{A3082}$ | $R_{B6}$ | $R_{B1}$ | $C(CH_3)_2$ |
| $L_{A3023}$ | $R_{B1}$ | $R_{A34}$ | S | $L_{A3083}$ | $R_{B6}$ | $R_{B2}$ | $C(CH_3)_2$ |
| $L_{A3024}$ | $R_{B1}$ | $R_{A52}$ | S | $L_{A3084}$ | $R_{B6}$ | $R_{B3}$ | $C(CH_3)_2$ |
| $L_{A3025}$ | $R_{B1}$ | H | O | $L_{A3085}$ | $R_{B6}$ | $R_{B4}$ | $C(CH_3)_2$ |

-continued

| Ligand | $R^5$ | $R^3$ | Y | Ligand | $R^5$ | $R^3$ | Y |
|---|---|---|---|---|---|---|---|
| $L_{A3026}$ | $R_{B1}$ | $R_{B1}$ | O | $L_{A3086}$ | $R_{B6}$ | $R_{B5}$ | $C(CH_3)_2$ |
| $L_{A3027}$ | $R_{B1}$ | $R_{B2}$ | O | $L_{A3087}$ | $R_{B6}$ | $R_{A34}$ | $C(CH_3)_2$ |
| $L_{A3028}$ | $R_{B1}$ | $R_{B3}$ | O | $L_{A3088}$ | $R_{B6}$ | $R_{A52}$ | $C(CH_3)_2$ |
| $L_{A3029}$ | $R_{B1}$ | $R_{B4}$ | O | $L_{A3089}$ | $R_{B6}$ | H | $Si(CH_3)_2$ |
| $L_{A3030}$ | $R_{B1}$ | $R_{B5}$ | O | $L_{A3090}$ | $R_{B6}$ | $R_{B1}$ | $Si(CH_3)_2$ |
| $L_{A3031}$ | $R_{B1}$ | $R_{A34}$ | O | $L_{A3091}$ | $R_{B6}$ | $R_{B2}$ | $Si(CH_3)_2$ |
| $L_{A3032}$ | $R_{B1}$ | $R_{A52}$ | O | $L_{A3092}$ | $R_{B6}$ | $R_{B3}$ | $Si(CH_3)_2$ |
| $L_{A3033}$ | $R_{B1}$ | H | $NCH_3$ | $L_{A3093}$ | $R_{B6}$ | $R_{B4}$ | $Si(CH_3)_2$ |
| $L_{A3034}$ | $R_{B1}$ | $R_{B1}$ | $NCH_3$ | $L_{A3094}$ | $R_{B6}$ | $R_{B5}$ | $Si(CH_3)_2$ |
| $L_{A3035}$ | $R_{B1}$ | $R_{B2}$ | $NCH_3$ | $L_{A3095}$ | $R_{B6}$ | $R_{A34}$ | $Si(CH_3)_2$ |
| $L_{A3036}$ | $R_{B1}$ | $R_{B3}$ | $NCH_3$ | $L_{A3096}$ | $R_{B6}$ | $R_{A52}$ | $Si(CH_3)_2$ |

wherein $L_{A3097}$ through $L_{A3192}$ have a structure of Formula XXII:

Formula XXII

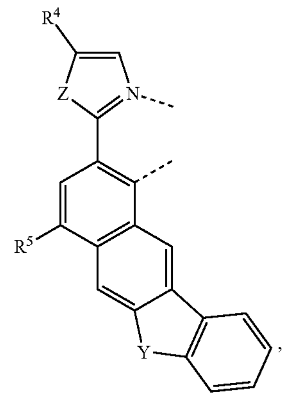

wherein $R^4$, $R^5$, Y, and Z are defined as provided below:

| Ligand | $R^5$ | $R^4$ | Y | Z | Ligand | $R^5$ | $R^4$ | Y | Z |
|---|---|---|---|---|---|---|---|---|---|
| $L_{A3097}$ | H | H | S | S | $L_{A3145}$ | $R_{B6}$ | H | S | S |
| $L_{A3098}$ | H | $R_{B1}$ | S | S | $L_{A3146}$ | $R_{B6}$ | $R_{B1}$ | S | S |
| $L_{A3099}$ | H | $R_{B3}$ | S | S | $L_{A3147}$ | $R_{B6}$ | $R_{B3}$ | S | S |
| $L_{A3100}$ | H | $R_{B4}$ | S | S | $L_{A3148}$ | $R_{B6}$ | $R_{B4}$ | S | S |
| $L_{A3101}$ | H | $R_{B7}$ | S | S | $L_{A3149}$ | $R_{B6}$ | $R_{B7}$ | S | S |
| $L_{A3102}$ | H | $R_{B10}$ | S | S | $L_{A3150}$ | $R_{B6}$ | $R_{B10}$ | S | S |
| $L_{A3103}$ | H | $R_{A3}$ | S | S | $L_{A3151}$ | $R_{B6}$ | $R_{A3}$ | S | S |
| $L_{A3104}$ | H | $R_{A34}$ | S | S | $L_{A3152}$ | $R_{B6}$ | $R_{A34}$ | S | S |
| $L_{A3105}$ | H | H | S | O | $L_{A3153}$ | $R_{B6}$ | H | S | O |
| $L_{A3106}$ | H | $R_{B1}$ | S | O | $L_{A3154}$ | $R_{B6}$ | $R_{B1}$ | S | O |
| $L_{A3107}$ | H | $R_{B3}$ | S | O | $L_{A3155}$ | $R_{B6}$ | $R_{B3}$ | S | O |
| $L_{A3108}$ | H | $R_{B4}$ | S | O | $L_{A3156}$ | $R_{B6}$ | $R_{B4}$ | S | O |
| $L_{A3109}$ | H | $R_{B7}$ | S | O | $L_{A3157}$ | $R_{B6}$ | $R_{B7}$ | S | O |
| $L_{A3110}$ | H | $R_{B10}$ | S | O | $L_{A3158}$ | $R_{B6}$ | $R_{B10}$ | S | O |
| $L_{A3111}$ | H | $R_{A3}$ | S | O | $L_{A3159}$ | $R_{B6}$ | $R_{A3}$ | S | O |
| $L_{A3112}$ | H | $R_{A34}$ | S | O | $L_{A3160}$ | $R_{B6}$ | $R_{A34}$ | S | O |
| $L_{A3113}$ | H | H | S | $NCH_3$ | $L_{A3161}$ | $R_{B6}$ | H | S | $NCH_3$ |
| $L_{A3114}$ | H | $R_{B1}$ | S | $NCH_3$ | $L_{A3162}$ | $R_{B6}$ | $R_{B1}$ | S | $NCH_3$ |
| $L_{A3115}$ | H | $R_{B3}$ | S | $NCH_3$ | $L_{A3163}$ | $R_{B6}$ | $R_{B3}$ | S | $NCH_3$ |
| $L_{A3116}$ | H | $R_{B4}$ | S | $NCH_3$ | $L_{A3164}$ | $R_{B6}$ | $R_{B4}$ | S | $NCH_3$ |
| $L_{A3117}$ | H | $R_{B7}$ | S | $NCH_3$ | $L_{A3165}$ | $R_{B6}$ | $R_{B7}$ | S | $NCH_3$ |
| $L_{A3118}$ | H | $R_{B10}$ | S | $NCH_3$ | $L_{A3166}$ | $R_{B6}$ | $R_{B10}$ | S | $NCH_3$ |
| $L_{A3119}$ | H | $R_{A3}$ | S | $NCH_3$ | $L_{A3167}$ | $R_{B6}$ | $R_{A3}$ | S | $NCH_3$ |
| $L_{A3120}$ | H | $R_{A34}$ | S | $NCH_3$ | $L_{A3168}$ | $R_{B6}$ | $R_{A34}$ | S | $NCH_3$ |
| $L_{A3121}$ | H | H | O | S | $L_{A3169}$ | $R_{B6}$ | H | O | S |
| $L_{A3122}$ | H | $R_{B1}$ | O | S | $L_{A3170}$ | $R_{B6}$ | $R_{B1}$ | O | S |
| $L_{A3123}$ | H | $R_{B3}$ | O | S | $L_{A3171}$ | $R_{B6}$ | $R_{B3}$ | O | S |
| $L_{A3124}$ | H | $R_{B4}$ | O | S | $L_{A3172}$ | $R_{B6}$ | $R_{B4}$ | O | S |
| $L_{A3125}$ | H | $R_{B7}$ | O | S | $L_{A3173}$ | $R_{B6}$ | $R_{B7}$ | O | S |
| $L_{A3126}$ | H | $R_{B10}$ | O | S | $L_{A3174}$ | $R_{B6}$ | $R_{B10}$ | O | S |
| $L_{A3127}$ | H | $R_{A3}$ | O | S | $L_{A3175}$ | $R_{B6}$ | $R_{A3}$ | O | S |
| $L_{A3128}$ | H | $R_{A34}$ | O | S | $L_{A3176}$ | $R_{B6}$ | $R_{A34}$ | O | S |
| $L_{A3129}$ | H | H | O | O | $L_{A3177}$ | $R_{B6}$ | H | O | O |

-continued

| Ligand | $R^5$ | $R^4$ | Y | Z | Ligand | $R^5$ | $R^4$ | Y | Z |
|---|---|---|---|---|---|---|---|---|---|
| $L_{A43130}$ | H | $R_{B1}$ | O | O | $L_{A43178}$ | $R_{B6}$ | $R_{B1}$ | O | O |
| $L_{A43131}$ | H | $R_{B3}$ | O | O | $L_{A43179}$ | $R_{B6}$ | $R_{B3}$ | O | O |
| $L_{A43132}$ | H | $R_{B4}$ | O | O | $L_{A43180}$ | $R_{B6}$ | $R_{B4}$ | O | O |
| $L_{A43133}$ | H | $R_{B7}$ | O | O | $L_{A43181}$ | $R_{B6}$ | $R_{B7}$ | O | O |
| $L_{A43134}$ | H | $R_{B10}$ | O | O | $L_{A43182}$ | $R_{B6}$ | $R_{B10}$ | O | O |
| $L_{A43135}$ | H | $R_{A3}$ | O | O | $L_{A43183}$ | $R_{B6}$ | $R_{A3}$ | O | O |
| $L_{A43136}$ | H | $R_{A34}$ | O | O | $L_{A43184}$ | $R_{B6}$ | $R_{A34}$ | O | O |
| $L_{A43137}$ | H | H | O | $NCH_3$ | $L_{A43185}$ | $R_{B6}$ | H | O | $NCH_3$ |
| $L_{A43138}$ | H | $R_{B1}$ | O | $NCH_3$ | $L_{A43186}$ | $R_{B6}$ | $R_{B1}$ | O | $NCH_3$ |
| $L_{A43139}$ | H | $R_{B3}$ | O | $NCH_3$ | $L_{A43187}$ | $R_{B6}$ | $R_{B3}$ | O | $NCH_3$ |
| $L_{A43140}$ | H | $R_{B4}$ | O | $NCH_3$ | $L_{A43188}$ | $R_{B6}$ | $R_{B4}$ | O | $NCH_3$ |
| $L_{A43141}$ | H | $R_{B7}$ | O | $NCH_3$ | $L_{A43189}$ | $R_{B6}$ | $R_{B7}$ | O | $NCH_3$ |
| $L_{A43142}$ | H | $R_{B10}$ | O | $NCH_3$ | $L_{A43190}$ | $R_{B6}$ | $R_{B10}$ | O | $NCH_3$ |
| $L_{A43143}$ | H | $R_{A3}$ | O | $NCH_3$ | $L_{A43191}$ | $R_{B6}$ | $R_{A3}$ | O | $NCH_3$ |
| $L_{A43144}$ | H | $R_{A34}$ | O | $NCH_3$ | $L_{A43192}$ | $R_{B6}$ | $R_{A34}$ | O | $NCH_3$ |

wherein $L_{A43193}$ through $L_{A43432}$ have a structure of Formula XXIII:

Formula XXIII

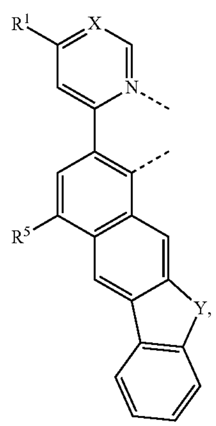

wherein $R^1$, $R^5$, X, and Y are defined as provided below:

| Ligand | $R^1$ | $R^5$ | X | Y | Ligand | $R^1$ | $R^5$ | X | Y |
|---|---|---|---|---|---|---|---|---|---|
| $L_{A43193}$ | H | H | C | S | $L_{A43313}$ | H | H | N | S |
| $L_{A43194}$ | $R_{B1}$ | H | C | S | $L_{A43314}$ | $R_{B1}$ | H | N | S |
| $L_{A43195}$ | $R_{B3}$ | H | C | S | $L_{A43315}$ | $R_{B3}$ | H | N | S |
| $L_{A43196}$ | $R_{B4}$ | H | C | S | $L_{A43316}$ | $R_{B4}$ | H | N | S |
| $L_{A43197}$ | $R_{B7}$ | H | C | S | $L_{A43317}$ | $R_{B7}$ | H | N | S |
| $L_{A43198}$ | $R_{B10}$ | H | C | S | $L_{A43318}$ | $R_{B10}$ | H | N | S |
| $L_{A43199}$ | $R_{A3}$ | H | C | S | $L_{A43319}$ | $R_{A3}$ | H | N | S |
| $L_{A43200}$ | $R_{A34}$ | H | C | S | $L_{A43320}$ | $R_{A34}$ | H | N | S |
| $L_{A43201}$ | H | H | C | O | $L_{A43321}$ | H | H | N | O |
| $L_{A43202}$ | $R_{B1}$ | H | C | O | $L_{A43322}$ | $R_{B1}$ | H | N | O |
| $L_{A43203}$ | $R_{B3}$ | H | C | O | $L_{A43323}$ | $R_{B3}$ | H | N | O |
| $L_{A43204}$ | $R_{B4}$ | H | C | O | $L_{A43324}$ | $R_{B4}$ | H | N | O |
| $L_{A43205}$ | $R_{B7}$ | H | C | O | $L_{A43325}$ | $R_{B7}$ | H | N | O |
| $L_{A43206}$ | $R_{B10}$ | H | C | O | $L_{A43326}$ | $R_{B10}$ | H | N | O |
| $L_{A43207}$ | $R_{A3}$ | H | C | O | $L_{A43327}$ | $R_{A3}$ | H | N | O |
| $L_{A43208}$ | $R_{A34}$ | H | C | O | $L_{A43328}$ | $R_{A34}$ | H | N | O |
| $L_{A43209}$ | H | H | C | $NCH_3$ | $L_{A43329}$ | H | H | N | $NCH_3$ |
| $L_{A43210}$ | $R_{B1}$ | H | C | $NCH_3$ | $L_{A43330}$ | $R_{B1}$ | H | N | $NCH_3$ |
| $L_{A43211}$ | $R_{B3}$ | H | C | $NCH_3$ | $L_{A43331}$ | $R_{B3}$ | H | N | $NCH_3$ |
| $L_{A43212}$ | $R_{B4}$ | H | C | $NCH_3$ | $L_{A43332}$ | $R_{B4}$ | H | N | $NCH_3$ |
| $L_{A43213}$ | $R_{B7}$ | H | C | $NCH_3$ | $L_{A43333}$ | $R_{B7}$ | H | N | $NCH_3$ |
| $L_{A43214}$ | $R_{B10}$ | H | C | $NCH_3$ | $L_{A43334}$ | $R_{B10}$ | H | N | $NCH_3$ |
| $L_{A43215}$ | $R_{A3}$ | H | C | $NCH_3$ | $L_{A43335}$ | $R_{A3}$ | H | N | $NCH_3$ |
| $L_{A43216}$ | $R_{A34}$ | H | C | $NCH_3$ | $L_{A43336}$ | $R_{A34}$ | H | N | $NCH_3$ |
| $L_{A43217}$ | H | H | C | $C(CH_3)_2$ | $L_{A43337}$ | H | H | N | $C(CH_3)_2$ |
| $L_{A43218}$ | $R_{B1}$ | H | C | $C(CH_3)_2$ | $L_{A43338}$ | $R_{B1}$ | H | N | $C(CH_3)_2$ |
| $L_{A43219}$ | $R_{B3}$ | H | C | $C(CH_3)_2$ | $L_{A43339}$ | $R_{B3}$ | H | N | $C(CH_3)_2$ |
| $L_{A43220}$ | $R_{B4}$ | H | C | $C(CH_3)_2$ | $L_{A43340}$ | $R_{B4}$ | H | N | $C(CH_3)_2$ |

-continued

| Ligand | $R^1$ | $R^5$ | X | Y | Ligand | $R^1$ | $R^5$ | X | Y |
|---|---|---|---|---|---|---|---|---|---|
| $L_{A43221}$ | $R_{B7}$ | H | C | $C(CH_3)_2$ | $L_{A43341}$ | $R_{B7}$ | H | N | $C(CH_3)_2$ |
| $L_{A43222}$ | $R_{B10}$ | H | C | $C(CH_3)_2$ | $L_{A43342}$ | $R_{B10}$ | H | N | $C(CH_3)_2$ |
| $L_{A43223}$ | $R_{A3}$ | H | C | $C(CH_3)_2$ | $L_{A43343}$ | $R_{A3}$ | H | N | $C(CH_3)_2$ |
| $L_{A43224}$ | $R_{A34}$ | H | C | $C(CH_3)_2$ | $L_{A43344}$ | $R_{A34}$ | H | N | $C(CH_3)_2$ |
| $L_{A43225}$ | H | H | C | $Si(CH_3)_2$ | $L_{A43345}$ | H | H | N | $Si(CH_3)_2$ |
| $L_{A43226}$ | $R_{B1}$ | H | C | $Si(CH_3)_2$ | $L_{A43346}$ | $R_{B1}$ | H | N | $Si(CH_3)_2$ |
| $L_{A43227}$ | $R_{B3}$ | H | C | $Si(CH_3)_2$ | $L_{A43347}$ | $R_{B3}$ | H | N | $Si(CH_3)_2$ |
| $L_{A43228}$ | $R_{B4}$ | H | C | $Si(CH_3)_2$ | $L_{A43348}$ | $R_{B4}$ | H | N | $Si(CH_3)_2$ |
| $L_{A43229}$ | $R_{B7}$ | H | C | $Si(CH_3)_2$ | $L_{A43349}$ | $R_{B7}$ | H | N | $Si(CH_3)_2$ |
| $L_{A43230}$ | $R_{B10}$ | H | C | $Si(CH_3)_2$ | $L_{A43350}$ | $R_{B10}$ | H | N | $Si(CH_3)_2$ |
| $L_{A43231}$ | $R_{A3}$ | H | C | $Si(CH_3)_2$ | $L_{A43351}$ | $R_{A3}$ | H | N | $Si(CH_3)_2$ |
| $L_{A43232}$ | $R_{A34}$ | H | C | $Si(CH_3)_2$ | $L_{A43352}$ | $R_{A34}$ | H | N | $Si(CH_3)_2$ |
| $L_{A43233}$ | H | $R_{B1}$ | C | S | $L_{A43353}$ | H | $R_{B1}$ | N | S |
| $L_{A43234}$ | $R_{B1}$ | $R_{B1}$ | C | S | $L_{A43354}$ | $R_{B1}$ | $R_{B1}$ | N | S |
| $L_{A43235}$ | $R_{B3}$ | $R_{B1}$ | C | S | $L_{A43355}$ | $R_{B3}$ | $R_{B1}$ | N | S |
| $L_{A43236}$ | $R_{B4}$ | $R_{B1}$ | C | S | $L_{A43356}$ | $R_{B4}$ | $R_{B1}$ | N | S |
| $L_{A43237}$ | $R_{B7}$ | $R_{B1}$ | C | S | $L_{A43357}$ | $R_{B7}$ | $R_{B1}$ | N | S |
| $L_{A43238}$ | $R_{B10}$ | $R_{B1}$ | C | S | $L_{A43358}$ | $R_{B10}$ | $R_{B1}$ | N | S |
| $L_{A43239}$ | $R_{A3}$ | $R_{B1}$ | C | S | $L_{A43359}$ | $R_{A3}$ | $R_{B1}$ | N | S |
| $L_{A43240}$ | $R_{A34}$ | $R_{B1}$ | C | S | $L_{A43360}$ | $R_{A34}$ | $R_{B1}$ | N | S |
| $L_{A43241}$ | H | $R_{B1}$ | C | O | $L_{A43361}$ | H | $R_{B1}$ | N | O |
| $L_{A43242}$ | $R_{B1}$ | $R_{B1}$ | C | O | $L_{A43362}$ | $R_{B1}$ | $R_{B1}$ | N | O |
| $L_{A43243}$ | $R_{B3}$ | $R_{B1}$ | C | O | $L_{A43363}$ | $R_{B3}$ | $R_{B1}$ | N | O |
| $L_{A43244}$ | $R_{B4}$ | $R_{B1}$ | C | O | $L_{A43364}$ | $R_{B4}$ | $R_{B1}$ | N | O |
| $L_{A43245}$ | $R_{B7}$ | $R_{B1}$ | C | O | $L_{A43365}$ | $R_{B7}$ | $R_{B1}$ | N | O |
| $L_{A43246}$ | $R_{B10}$ | $R_{B1}$ | C | O | $L_{A43366}$ | $R_{B10}$ | $R_{B1}$ | N | O |
| $L_{A43247}$ | $R_{A3}$ | $R_{B1}$ | C | O | $L_{A43367}$ | $R_{A3}$ | $R_{B1}$ | N | O |
| $L_{A43248}$ | $R_{A34}$ | $R_{B1}$ | C | O | $L_{A43368}$ | $R_{A34}$ | $R_{B1}$ | N | O |
| $L_{A43249}$ | H | $R_{B1}$ | C | $NCH_3$ | $L_{A43369}$ | H | $R_{B1}$ | N | $NCH_3$ |
| $L_{A43250}$ | $R_{B1}$ | $R_{B1}$ | C | $NCH_3$ | $L_{A43370}$ | $R_{B1}$ | $R_{B1}$ | N | $NCH_3$ |
| $L_{A43251}$ | $R_{B3}$ | $R_{B1}$ | C | $NCH_3$ | $L_{A43371}$ | $R_{B3}$ | $R_{B1}$ | N | $NCH_3$ |
| $L_{A43252}$ | $R_{B4}$ | $R_{B1}$ | C | $NCH_3$ | $L_{A43372}$ | $R_{B4}$ | $R_{B1}$ | N | $NCH_3$ |
| $L_{A43253}$ | $R_{B7}$ | $R_{B1}$ | C | $NCH_3$ | $L_{A43373}$ | $R_{B7}$ | $R_{B1}$ | N | $NCH_3$ |
| $L_{A43254}$ | $R_{B10}$ | $R_{B1}$ | C | $NCH_3$ | $L_{A43374}$ | $R_{B10}$ | $R_{B1}$ | N | $NCH_3$ |
| $L_{A43255}$ | $R_{A3}$ | $R_{B1}$ | C | $NCH_3$ | $L_{A43375}$ | $R_{A3}$ | $R_{B1}$ | N | $NCH_3$ |
| $L_{A43256}$ | $R_{A34}$ | $R_{B1}$ | C | $NCH_3$ | $L_{A43376}$ | $R_{A34}$ | $R_{B1}$ | N | $NCH_3$ |
| $L_{A43257}$ | H | $R_{B1}$ | C | $C(CH_3)_2$ | $L_{A43377}$ | H | $R_{B1}$ | N | $C(CH_3)_2$ |
| $L_{A43258}$ | $R_{B1}$ | $R_{B1}$ | C | $C(CH_3)_2$ | $L_{A43378}$ | $R_{B1}$ | $R_{B1}$ | N | $C(CH_3)_2$ |
| $L_{A43259}$ | $R_{B3}$ | $R_{B1}$ | C | $C(CH_3)_2$ | $L_{A43379}$ | $R_{B3}$ | $R_{B1}$ | N | $C(CH_3)_2$ |
| $L_{A43260}$ | $R_{B4}$ | $R_{B1}$ | C | $C(CH_3)_2$ | $L_{A43380}$ | $R_{B4}$ | $R_{B1}$ | N | $C(CH_3)_2$ |
| $L_{A43261}$ | $R_{B7}$ | $R_{B1}$ | C | $C(CH_3)_2$ | $L_{A43381}$ | $R_{B7}$ | $R_{B1}$ | N | $C(CH_3)_2$ |
| $L_{A43262}$ | $R_{B10}$ | $R_{B1}$ | C | $C(CH_3)_2$ | $L_{A43382}$ | $R_{B10}$ | $R_{B1}$ | N | $C(CH_3)_2$ |
| $L_{A43263}$ | $R_{A3}$ | $R_{B1}$ | C | $C(CH_3)_2$ | $L_{A43383}$ | $R_{A3}$ | $R_{B1}$ | N | $C(CH_3)_2$ |
| $L_{A43264}$ | $R_{A34}$ | $R_{B1}$ | C | $C(CH_3)_2$ | $L_{A43384}$ | $R_{A34}$ | $R_{B1}$ | N | $C(CH_3)_2$ |
| $L_{A43265}$ | H | $R_{B1}$ | C | $Si(CH_3)_2$ | $L_{A43385}$ | H | $R_{B1}$ | N | $Si(CH_3)_2$ |
| $L_{A43266}$ | $R_{B1}$ | $R_{B1}$ | C | $Si(CH_3)_2$ | $L_{A43386}$ | $R_{B1}$ | $R_{B1}$ | N | $Si(CH_3)_2$ |
| $L_{A43267}$ | $R_{B3}$ | $R_{B1}$ | C | $Si(CH_3)_2$ | $L_{A43387}$ | $R_{B3}$ | $R_{B1}$ | N | $Si(CH_3)_2$ |
| $L_{A43268}$ | $R_{B4}$ | $R_{B1}$ | C | $Si(CH_3)_2$ | $L_{A43388}$ | $R_{B4}$ | $R_{B1}$ | N | $Si(CH_3)_2$ |
| $L_{A43269}$ | $R_{B7}$ | $R_{B1}$ | C | $Si(CH_3)_2$ | $L_{A43389}$ | $R_{B7}$ | $R_{B1}$ | N | $Si(CH_3)_2$ |
| $L_{A43270}$ | $R_{B10}$ | $R_{B1}$ | C | $Si(CH_3)_2$ | $L_{A43390}$ | $R_{B10}$ | $R_{B1}$ | N | $Si(CH_3)_2$ |
| $L_{A43271}$ | $R_{A3}$ | $R_{B1}$ | C | $Si(CH_3)_2$ | $L_{A43391}$ | $R_{A3}$ | $R_{B1}$ | N | $Si(CH_3)_2$ |
| $L_{A43272}$ | $R_{A34}$ | $R_{B1}$ | C | $Si(CH_3)_2$ | $L_{A43392}$ | $R_{A34}$ | $R_{B1}$ | N | $Si(CH_3)_2$ |
| $L_{A43273}$ | H | $R_{B6}$ | C | S | $L_{A43393}$ | H | $R_{B6}$ | N | S |
| $L_{A43274}$ | $R_{B1}$ | $R_{B6}$ | C | S | $L_{A43394}$ | $R_{B1}$ | $R_{B6}$ | N | S |
| $L_{A43275}$ | $R_{B3}$ | $R_{B6}$ | C | S | $L_{A43395}$ | $R_{B3}$ | $R_{B6}$ | N | S |
| $L_{A43276}$ | $R_{B4}$ | $R_{B6}$ | C | S | $L_{A43396}$ | $R_{B4}$ | $R_{B6}$ | N | S |
| $L_{A43277}$ | $R_{B7}$ | $R_{B6}$ | C | S | $L_{A43397}$ | $R_{B7}$ | $R_{B6}$ | N | S |
| $L_{A43278}$ | $R_{B10}$ | $R_{B6}$ | C | S | $L_{A43398}$ | $R_{B10}$ | $R_{B6}$ | N | S |
| $L_{A43279}$ | $R_{A3}$ | $R_{B6}$ | C | S | $L_{A43399}$ | $R_{A3}$ | $R_{B6}$ | N | S |
| $L_{A43280}$ | $R_{A34}$ | $R_{B6}$ | C | S | $L_{A43400}$ | $R_{A34}$ | $R_{B6}$ | N | S |
| $L_{A43281}$ | H | $R_{B6}$ | C | O | $L_{A43401}$ | H | $R_{B6}$ | N | O |
| $L_{A43282}$ | $R_{B1}$ | $R_{B6}$ | C | O | $L_{A43402}$ | $R_{B1}$ | $R_{B6}$ | N | O |
| $L_{A43283}$ | $R_{B3}$ | $R_{B6}$ | C | O | $L_{A43403}$ | $R_{B3}$ | $R_{B6}$ | N | O |
| $L_{A43284}$ | $R_{B4}$ | $R_{B6}$ | C | O | $L_{A43404}$ | $R_{B4}$ | $R_{B6}$ | N | O |
| $L_{A43285}$ | $R_{B7}$ | $R_{B6}$ | C | O | $L_{A43405}$ | $R_{B7}$ | $R_{B6}$ | N | O |
| $L_{A43286}$ | $R_{B10}$ | $R_{B6}$ | C | O | $L_{A43406}$ | $R_{B10}$ | $R_{B6}$ | N | O |
| $L_{A43287}$ | $R_{A3}$ | $R_{B6}$ | C | O | $L_{A43407}$ | $R_{A3}$ | $R_{B6}$ | N | O |
| $L_{A43288}$ | $R_{A34}$ | $R_{B6}$ | C | O | $L_{A43408}$ | $R_{A34}$ | $R_{B6}$ | N | O |
| $L_{A43289}$ | H | $R_{B6}$ | C | $NCH_3$ | $L_{A43409}$ | H | $R_{B6}$ | N | $NCH_3$ |
| $L_{A43290}$ | $R_{B1}$ | $R_{B6}$ | C | $NCH_3$ | $L_{A43410}$ | $R_{B1}$ | $R_{B6}$ | N | $NCH_3$ |
| $L_{A43291}$ | $R_{B3}$ | $R_{B6}$ | C | $NCH_3$ | $L_{A43411}$ | $R_{B3}$ | $R_{B6}$ | N | $NCH_3$ |
| $L_{A43292}$ | $R_{B4}$ | $R_{B6}$ | C | $NCH_3$ | $L_{A43412}$ | $R_{B4}$ | $R_{B6}$ | N | $NCH_3$ |
| $L_{A43293}$ | $R_{B7}$ | $R_{B6}$ | C | $NCH_3$ | $L_{A43413}$ | $R_{B7}$ | $R_{B6}$ | N | $NCH_3$ |
| $L_{A43294}$ | $R_{B10}$ | $R_{B6}$ | C | $NCH_3$ | $L_{A43414}$ | $R_{B10}$ | $R_{B6}$ | N | $NCH_3$ |
| $L_{A43295}$ | $R_{A3}$ | $R_{B6}$ | C | $NCH_3$ | $L_{A43415}$ | $R_{A3}$ | $R_{B6}$ | N | $NCH_3$ |
| $L_{A43296}$ | $R_{A34}$ | $R_{B6}$ | C | $NCH_3$ | $L_{A43416}$ | $R_{A34}$ | $R_{B6}$ | N | $NCH_3$ |
| $L_{A43297}$ | H | $R_{B6}$ | C | $C(CH_3)_2$ | $L_{A43417}$ | H | $R_{B6}$ | N | $C(CH_3)_2$ |

-continued

| Ligand | $R^1$ | $R^5$ | X | Y | Ligand | $R^1$ | $R^5$ | X | Y |
|---|---|---|---|---|---|---|---|---|---|
| $L_{A43298}$ | $R_{B1}$ | $R_{B6}$ | C | $C(CH_3)_2$ | $L_{A43418}$ | $R_{B1}$ | $R_{B6}$ | N | $C(CH_3)_2$ |
| $L_{A43299}$ | $R_{B3}$ | $R_{B6}$ | C | $C(CH_3)_2$ | $L_{A43419}$ | $R_{B3}$ | $R_{B6}$ | N | $C(CH_3)_2$ |
| $L_{A43300}$ | $R_{B4}$ | $R_{B6}$ | C | $C(CH_3)_2$ | $L_{A43420}$ | $R_{B4}$ | $R_{B6}$ | N | $C(CH_3)_2$ |
| $L_{A43301}$ | $R_{B7}$ | $R_{B6}$ | C | $C(CH_3)_2$ | $L_{A43421}$ | $R_{B7}$ | $R_{B6}$ | N | $C(CH_3)_2$ |
| $L_{A43302}$ | $R_{B10}$ | $R_{B6}$ | C | $C(CH_3)_2$ | $L_{A43422}$ | $R_{B10}$ | $R_{B6}$ | N | $C(CH_3)_2$ |
| $L_{A43303}$ | $R_{A3}$ | $R_{B6}$ | C | $C(CH_3)_2$ | $L_{A43423}$ | $R_{A3}$ | $R_{B6}$ | N | $C(CH_3)_2$ |
| $L_{A43304}$ | $R_{A34}$ | $R_{B6}$ | C | $C(CH_3)_2$ | $L_{A43424}$ | $R_{A34}$ | $R_{B6}$ | N | $C(CH_3)_2$ |
| $L_{A43305}$ | H | $R_{B6}$ | C | $Si(CH_3)_2$ | $L_{A43425}$ | H | $R_{B6}$ | N | $Si(CH_3)_2$ |
| $L_{A43306}$ | $R_{B1}$ | $R_{B6}$ | C | $Si(CH_3)_2$ | $L_{A43426}$ | $R_{B1}$ | $R_{B6}$ | N | $Si(CH_3)_2$ |
| $L_{A43307}$ | $R_{B3}$ | $R_{B6}$ | C | $Si(CH_3)_2$ | $L_{A43427}$ | $R_{B3}$ | $R_{B6}$ | N | $Si(CH_3)_2$ |
| $L_{A43308}$ | $R_{B4}$ | $R_{B6}$ | C | $Si(CH_3)_2$ | $L_{A43428}$ | $R_{B4}$ | $R_{B6}$ | N | $Si(CH_3)_2$ |
| $L_{A43309}$ | $R_{B7}$ | $R_{B6}$ | C | $Si(CH_3)_2$ | $L_{A43429}$ | $R_{B7}$ | $R_{B6}$ | N | $Si(CH_3)_2$ |
| $L_{A43310}$ | $R_{B10}$ | $R_{B6}$ | C | $Si(CH_3)_2$ | $L_{A43430}$ | $R_{B10}$ | $R_{B6}$ | N | $Si(CH_3)_2$ |
| $L_{A43311}$ | $R_{A3}$ | $R_{B6}$ | C | $Si(CH_3)_2$ | $L_{A43431}$ | $R_{A3}$ | $R_{B6}$ | N | $Si(CH_3)_2$ |
| $L_{A43312}$ | $R_{A34}$ | $R_{B6}$ | C | $Si(CH_3)_2$ | $L_{A43432}$ | $R_{A34}$ | $R_{B6}$ | N | |

wherein $L_{A43433}$ through $L_{A43552}$ have a structure of Formula XXIV:

Formula XXIV

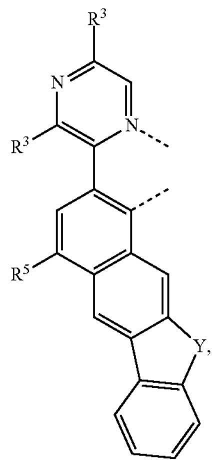

wherein $R^3$, $R^5$, and Y are defined as provided below:

| Ligand | $R^5$ | $R^3$ | Y | Ligand | $R^5$ | $R^3$ | Y |
|---|---|---|---|---|---|---|---|
| $L_{A43433}$ | H | H | S | $L_{A43493}$ | $R_{B1}$ | $R_{B4}$ | $NCH_3$ |
| $L_{A43434}$ | H | $R_{B1}$ | S | $L_{A43494}$ | $R_{B1}$ | $R_{B5}$ | $NCH_3$ |
| $L_{A43435}$ | H | $R_{B2}$ | S | $L_{A43495}$ | $R_{B1}$ | $R_{A34}$ | $NCH_3$ |
| $L_{A43436}$ | H | $R_{B3}$ | S | $L_{A43496}$ | $R_{B1}$ | $R_{A52}$ | $NCH_3$ |
| $L_{A43437}$ | H | $R_{B4}$ | S | $L_{A43497}$ | $R_{B1}$ | H | $C(CH_3)_2$ |
| $L_{A43438}$ | H | $R_{B5}$ | S | $L_{A43498}$ | $R_{B1}$ | $R_{B1}$ | $C(CH_3)_2$ |
| $L_{A43439}$ | H | $R_{A34}$ | S | $L_{A43499}$ | $R_{B1}$ | $R_{B2}$ | $C(CH_3)_2$ |
| $L_{A43440}$ | H | $R_{A52}$ | S | $L_{A43500}$ | $R_{B1}$ | $R_{B3}$ | $C(CH_3)_2$ |
| $L_{A43441}$ | H | H | O | $L_{A43501}$ | $R_{B1}$ | $R_{B4}$ | $C(CH_3)_2$ |
| $L_{A43442}$ | H | $R_{B1}$ | O | $L_{A43502}$ | $R_{B1}$ | $R_{B5}$ | $C(CH_3)_2$ |
| $L_{A43443}$ | H | $R_{B2}$ | O | $L_{A43503}$ | $R_{B1}$ | $R_{A34}$ | $C(CH_3)_2$ |
| $L_{A43444}$ | H | $R_{B3}$ | O | $L_{A43504}$ | $R_{B1}$ | $R_{A52}$ | $C(CH_3)_2$ |
| $L_{A43445}$ | H | $R_{B4}$ | O | $L_{A43505}$ | $R_{B1}$ | H | $Si(CH_3)_2$ |
| $L_{A43446}$ | H | $R_{B5}$ | O | $L_{A43506}$ | $R_{B1}$ | $R_{B1}$ | $Si(CH_3)_2$ |
| $L_{A43447}$ | H | $R_{A34}$ | O | $L_{A43507}$ | $R_{B1}$ | $R_{B2}$ | $Si(CH_3)_2$ |
| $L_{A43448}$ | H | $R_{A52}$ | O | $L_{A43508}$ | $R_{B1}$ | $R_{B3}$ | $Si(CH_3)_2$ |
| $L_{A43449}$ | H | H | $NCH_3$ | $L_{A43509}$ | $R_{B1}$ | $R_{B4}$ | $Si(CH_3)_2$ |
| $L_{A43450}$ | H | $R_{B1}$ | $NCH_3$ | $L_{A43510}$ | $R_{B1}$ | $R_{B5}$ | $Si(CH_3)_2$ |
| $L_{A43451}$ | H | $R_{B2}$ | $NCH_3$ | $L_{A43511}$ | $R_{B1}$ | $R_{A34}$ | $Si(CH_3)_2$ |
| $L_{A43452}$ | H | $R_{B3}$ | $NCH_3$ | $L_{A43512}$ | $R_{B1}$ | $R_{A52}$ | $Si(CH_3)_2$ |
| $L_{A43453}$ | H | $R_{B4}$ | $NCH_3$ | $L_{A43513}$ | $R_{B6}$ | H | S |
| $L_{A43454}$ | H | $R_{B5}$ | $NCH_3$ | $L_{A43514}$ | $R_{B6}$ | $R_{B1}$ | S |
| $L_{A43455}$ | H | $R_{A34}$ | $NCH_3$ | $L_{A43515}$ | $R_{B6}$ | $R_{B2}$ | S |
| $L_{A43456}$ | H | $R_{A52}$ | $NCH_3$ | $L_{A43516}$ | $R_{B6}$ | $R_{B3}$ | S |
| $L_{A43457}$ | H | H | $C(CH_3)_2$ | $L_{A43517}$ | $R_{B6}$ | $R_{B4}$ | S |
| $L_{A43458}$ | H | $R_{B1}$ | $C(CH_3)_2$ | $L_{A43518}$ | $R_{B6}$ | $R_{B5}$ | S |

-continued

| Ligand | $R^5$ | $R^3$ | Y | Ligand | $R^5$ | $R^3$ | Y |
|---|---|---|---|---|---|---|---|
| $L_{A43459}$ | H | $R_{B2}$ | $C(CH_3)_2$ | $L_{A43519}$ | $R_{B6}$ | $R_{A34}$ | S |
| $L_{A43460}$ | H | $R_{B3}$ | $C(CH_3)_2$ | $L_{A43520}$ | $R_{B6}$ | $R_{A52}$ | S |
| $L_{A43461}$ | H | $R_{B4}$ | $C(CH_3)_2$ | $L_{A43521}$ | $R_{B6}$ | H | O |
| $L_{A43462}$ | H | $R_{B5}$ | $C(CH_3)_2$ | $L_{A43522}$ | $R_{B6}$ | $R_{B1}$ | O |
| $L_{A43463}$ | H | $R_{A34}$ | $C(CH_3)_2$ | $L_{A43523}$ | $R_{B6}$ | $R_{B2}$ | O |
| $L_{A43464}$ | H | $R_{A52}$ | $C(CH_3)_2$ | $L_{A43524}$ | $R_{B6}$ | $R_{B3}$ | O |
| $L_{A43465}$ | H | H | $Si(CH_3)_2$ | $L_{A43525}$ | $R_{B6}$ | $R_{B4}$ | O |
| $L_{A43466}$ | H | $R_{B1}$ | $Si(CH_3)_2$ | $L_{A43526}$ | $R_{B6}$ | $R_{B5}$ | O |
| $L_{A43467}$ | H | $R_{B2}$ | $Si(CH_3)_2$ | $L_{A43527}$ | $R_{B6}$ | $R_{A34}$ | O |
| $L_{A43468}$ | H | $R_{B3}$ | $Si(CH_3)_2$ | $L_{A43528}$ | $R_{B6}$ | $R_{A52}$ | O |
| $L_{A43469}$ | H | $R_{B4}$ | $Si(CH_3)_2$ | $L_{A43529}$ | $R_{B6}$ | H | $NCH_3$ |
| $L_{A43470}$ | H | $R_{B5}$ | $Si(CH_3)_2$ | $L_{A43530}$ | $R_{B6}$ | $R_{B1}$ | $NCH_3$ |
| $L_{A43471}$ | H | $R_{A34}$ | $Si(CH_3)_2$ | $L_{A43531}$ | $R_{B6}$ | $R_{B2}$ | $NCH_3$ |
| $L_{A43472}$ | H | $R_{A52}$ | $Si(CH_3)_2$ | $L_{A43532}$ | $R_{B6}$ | $R_{B3}$ | $NCH_3$ |
| $L_{A43473}$ | $R_{B1}$ | H | S | $L_{A43533}$ | $R_{B6}$ | $R_{B4}$ | $NCH_3$ |
| $L_{A43474}$ | $R_{B1}$ | $R_{B1}$ | S | $L_{A43534}$ | $R_{B6}$ | $R_{B5}$ | $NCH_3$ |
| $L_{A43475}$ | $R_{B1}$ | $R_{B2}$ | S | $L_{A43535}$ | $R_{B6}$ | $R_{A34}$ | $NCH_3$ |
| $L_{A43476}$ | $R_{B1}$ | $R_{B3}$ | S | $L_{A43536}$ | $R_{B6}$ | $R_{A52}$ | $NCH_3$ |
| $L_{A43477}$ | $R_{B1}$ | $R_{B4}$ | S | $L_{A43537}$ | $R_{B6}$ | H | $C(CH_3)_2$ |
| $L_{A43478}$ | $R_{B1}$ | $R_{B5}$ | S | $L_{A43538}$ | $R_{B6}$ | $R_{B1}$ | $C(CH_3)_2$ |
| $L_{A43479}$ | $R_{B1}$ | $R_{A34}$ | S | $L_{A43539}$ | $R_{B6}$ | $R_{B2}$ | $C(CH_3)_2$ |
| $L_{A43480}$ | $R_{B1}$ | $R_{A52}$ | S | $L_{A43540}$ | $R_{B6}$ | $R_{B3}$ | $C(CH_3)_2$ |
| $L_{A43481}$ | $R_{B1}$ | H | O | $L_{A43541}$ | $R_{B6}$ | $R_{B4}$ | $C(CH_3)_2$ |
| $L_{A43482}$ | $R_{B1}$ | $R_{B1}$ | O | $L_{A43542}$ | $R_{B6}$ | $R_{B5}$ | $C(CH_3)_2$ |
| $L_{A43483}$ | $R_{B1}$ | $R_{B2}$ | O | $L_{A43543}$ | $R_{B6}$ | $R_{A34}$ | $C(CH_3)_2$ |
| $L_{A43484}$ | $R_{B1}$ | $R_{B3}$ | O | $L_{A43544}$ | $R_{B6}$ | $R_{A52}$ | $C(CH_3)_2$ |
| $L_{A43485}$ | $R_{B1}$ | $R_{B4}$ | O | $L_{A43545}$ | $R_{B6}$ | H | $Si(CH_3)_2$ |
| $L_{A43486}$ | $R_{B1}$ | $R_{B5}$ | O | $L_{A43546}$ | $R_{B6}$ | $R_{B1}$ | $Si(CH_3)_2$ |
| $L_{A43487}$ | $R_{B1}$ | $R_{A34}$ | O | $L_{A43547}$ | $R_{B6}$ | $R_{B2}$ | $Si(CH_3)_2$ |
| $L_{A43488}$ | $R_{B1}$ | $R_{A52}$ | O | $L_{A43548}$ | $R_{B6}$ | $R_{B3}$ | $Si(CH_3)_2$ |
| $L_{A43489}$ | $R_{B1}$ | H | $NCH_3$ | $L_{A43549}$ | $R_{B6}$ | $R_{B4}$ | $Si(CH_3)_2$ |
| $L_{A43490}$ | $R_{B1}$ | $R_{B1}$ | $NCH_3$ | $L_{A43550}$ | $R_{B6}$ | $R_{B5}$ | $Si(CH_3)_2$ |
| $L_{A43491}$ | $R_{B1}$ | $R_{B2}$ | $NCH_3$ | $L_{A43551}$ | $R_{B6}$ | $R_{A34}$ | $Si(CH_3)_2$ |
| $L_{A43492}$ | $R_{B1}$ | $R_{B3}$ | $NCH_3$ | $L_{A43552}$ | $R_{B6}$ | $R_{A52}$ | $Si(CH_3)_2$ |

wherein $L_{A43553}$ through $L_{A43648}$ have a structure of Formula XXV:

Formula XXV

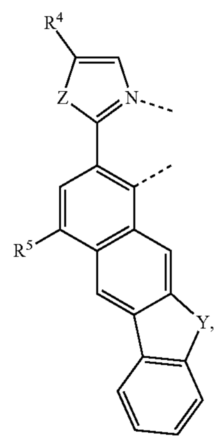

wherein $R^4$, $R^5$, Y, and Z are defined as provided below:

| Ligand | $R^5$ | $R^4$ | Y | Z | Ligand | $R^5$ | $R^4$ | Y | Z |
|---|---|---|---|---|---|---|---|---|---|
| $L_{A43553}$ | H | H | S | S | $L_{A43601}$ | $R_{B6}$ | H | S | S |
| $L_{A43554}$ | H | $R_{B1}$ | S | S | $L_{A43602}$ | $R_{B6}$ | $R_{B1}$ | S | S |
| $L_{A43555}$ | H | $R_{B3}$ | S | S | $L_{A43603}$ | $R_{B6}$ | $R_{B3}$ | S | S |
| $L_{A43556}$ | H | $R_{B4}$ | S | S | $L_{A43604}$ | $R_{B6}$ | $R_{B4}$ | S | S |
| $L_{A43557}$ | H | $R_{B7}$ | S | S | $L_{A43605}$ | $R_{B6}$ | $R_{B7}$ | S | S |
| $L_{A43558}$ | H | $R_{B10}$ | S | S | $L_{A43606}$ | $R_{B6}$ | $R_{B10}$ | S | S |
| $L_{A43559}$ | H | $R_{A3}$ | S | S | $L_{A43607}$ | $R_{B6}$ | $R_{A3}$ | S | S |
| $L_{A43560}$ | H | $R_{A34}$ | S | S | $L_{A43608}$ | $R_{B6}$ | $R_{A34}$ | S | S |

-continued

| Ligand | $R^5$ | $R^4$ | Y | Z | Ligand | $R^5$ | $R^4$ | Y | Z |
|---|---|---|---|---|---|---|---|---|---|
| $L_{A3561}$ | H | H | S | O | $L_{A3609}$ | $R_{B6}$ | H | S | O |
| $L_{A3562}$ | H | $R_{B1}$ | S | O | $L_{A3610}$ | $R_{B6}$ | $R_{B1}$ | S | O |
| $L_{A3563}$ | H | $R_{B3}$ | S | O | $L_{A3611}$ | $R_{B6}$ | $R_{B3}$ | S | O |
| $L_{A3564}$ | H | $R_{B4}$ | S | O | $L_{A3612}$ | $R_{B6}$ | $R_{B4}$ | S | O |
| $L_{A3565}$ | H | $R_{B7}$ | S | O | $L_{A3613}$ | $R_{B6}$ | $R_{B7}$ | S | O |
| $L_{A3566}$ | H | $R_{B10}$ | S | O | $L_{A3614}$ | $R_{B6}$ | $R_{B10}$ | S | O |
| $L_{A3567}$ | H | $R_{A3}$ | S | O | $L_{A3615}$ | $R_{B6}$ | $R_{A3}$ | S | O |
| $L_{A3568}$ | H | $R_{A34}$ | S | O | $L_{A3616}$ | $R_{B6}$ | $R_{A34}$ | S | O |
| $L_{A3569}$ | H | H | S | $NCH_3$ | $L_{A3617}$ | $R_{B6}$ | H | S | $NCH_3$ |
| $L_{A3570}$ | H | $R_{B1}$ | S | $NCH_3$ | $L_{A3618}$ | $R_{B6}$ | $R_{B1}$ | S | $NCH_3$ |
| $L_{A3571}$ | H | $R_{B3}$ | S | $NCH_3$ | $L_{A3619}$ | $R_{B6}$ | $R_{B3}$ | S | $NCH_3$ |
| $L_{A3572}$ | H | $R_{B4}$ | S | $NCH_3$ | $L_{A3620}$ | $R_{B6}$ | $R_{B4}$ | S | $NCH_3$ |
| $L_{A3573}$ | H | $R_{B7}$ | S | $NCH_3$ | $L_{A3621}$ | $R_{B6}$ | $R_{B7}$ | S | $NCH_3$ |
| $L_{A3574}$ | H | $R_{B10}$ | S | $NCH_3$ | $L_{A3622}$ | $R_{B6}$ | $R_{B10}$ | S | $NCH_3$ |
| $L_{A3575}$ | H | $R_{A3}$ | S | $NCH_3$ | $L_{A3623}$ | $R_{B6}$ | $R_{A3}$ | S | $NCH_3$ |
| $L_{A3576}$ | H | $R_{A34}$ | S | $NCH_3$ | $L_{A3624}$ | $R_{B6}$ | $R_{A34}$ | S | $NCH_3$ |
| $L_{A3577}$ | H | H | O | S | $L_{A3625}$ | $R_{B6}$ | H | O | S |
| $L_{A3578}$ | H | $R_{B1}$ | O | S | $L_{A3626}$ | $R_{B6}$ | $R_{B1}$ | O | S |
| $L_{A3579}$ | H | $R_{B3}$ | O | S | $L_{A3627}$ | $R_{B6}$ | $R_{B3}$ | O | S |
| $L_{A3580}$ | H | $R_{B4}$ | O | S | $L_{A3628}$ | $R_{B6}$ | $R_{B4}$ | O | S |
| $L_{A3581}$ | H | $R_{B7}$ | O | S | $L_{A3629}$ | $R_{B6}$ | $R_{B7}$ | O | S |
| $L_{A3582}$ | H | $R_{B10}$ | O | S | $L_{A3630}$ | $R_{B6}$ | $R_{B10}$ | O | S |
| $L_{A3583}$ | H | $R_{A3}$ | O | S | $L_{A3631}$ | $R_{B6}$ | $R_{A3}$ | O | S |
| $L_{A3584}$ | H | $R_{A34}$ | O | S | $L_{A3632}$ | $R_{B6}$ | $R_{A34}$ | O | S |
| $L_{A3585}$ | H | H | O | O | $L_{A3633}$ | $R_{B6}$ | H | O | O |
| $L_{A3586}$ | H | $R_{B1}$ | O | O | $L_{A3634}$ | $R_{B6}$ | $R_{B1}$ | O | O |
| $L_{A3587}$ | H | $R_{B3}$ | O | O | $L_{A3635}$ | $R_{B6}$ | $R_{B3}$ | O | O |
| $L_{A3588}$ | H | $R_{B4}$ | O | O | $L_{A3636}$ | $R_{B6}$ | $R_{B4}$ | O | O |
| $L_{A3589}$ | H | $R_{B7}$ | O | O | $L_{A3637}$ | $R_{B6}$ | $R_{B7}$ | O | O |
| $L_{A3590}$ | H | $R_{B10}$ | O | O | $L_{A3638}$ | $R_{B6}$ | $R_{B10}$ | O | O |
| $L_{A3591}$ | H | $R_{A3}$ | O | O | $L_{A3639}$ | $R_{B6}$ | $R_{A3}$ | O | O |
| $L_{A3592}$ | H | $R_{A34}$ | O | O | $L_{A3640}$ | $R_{B6}$ | $R_{A34}$ | O | O |
| $L_{A3593}$ | H | H | O | $NCH_3$ | $L_{A3641}$ | $R_{B6}$ | H | O | $NCH_3$ |
| $L_{A3594}$ | H | $R_{B1}$ | O | $NCH_3$ | $L_{A3642}$ | $R_{B6}$ | $R_{B1}$ | O | $NCH_3$ |
| $L_{A3595}$ | H | $R_{B3}$ | O | $NCH_3$ | $L_{A3643}$ | $R_{B6}$ | $R_{B3}$ | O | $NCH_3$ |
| $L_{A3596}$ | H | $R_{B4}$ | O | $NCH_3$ | $L_{A3644}$ | $R_{B6}$ | $R_{B4}$ | O | $NCH_3$ |
| $L_{A3597}$ | H | $R_{B7}$ | O | $NCH_3$ | $L_{A3645}$ | $R_{B6}$ | $R_{B7}$ | O | $NCH_3$ |
| $L_{A3598}$ | H | $R_{B10}$ | O | $NCH_3$ | $L_{A3646}$ | $R_{B6}$ | $R_{B10}$ | O | $NCH_3$ |
| $L_{A3599}$ | H | $R_{A3}$ | O | $NCH_3$ | $L_{A3647}$ | $R_{B6}$ | $R_{A3}$ | O | $NCH_3$ |
| $L_{A3600}$ | H | $R_{A34}$ | O | $NCH_3$ | $L_{A3648}$ | $R_{B6}$ | $R_{A34}$ | O | $NCH_3$ |

wherein $L_{A3649}$ through $L_{A3888}$ have a structure of Formula XXVI:

Formula XXVI

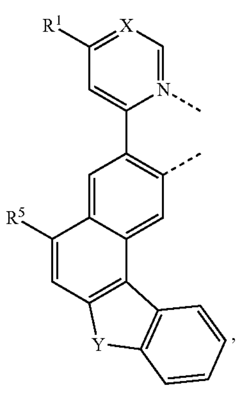

wherein $R^1$, $R^5$, X, and Y are defined as provided below:

| Ligand | $R^1$ | $R^5$ | X | Y | Ligand | $R^1$ | $R^5$ | X | Y |
|---|---|---|---|---|---|---|---|---|---|
| $L_{A3649}$ | H | H | C | S | $L_{A3769}$ | H | H | N | S |
| $L_{A3650}$ | $R_{B1}$ | H | C | S | $L_{A3770}$ | $R_{B1}$ | H | N | S |
| $L_{A3651}$ | $R_{B3}$ | H | C | S | $L_{A3771}$ | $R_{B3}$ | H | N | S |
| $L_{A3652}$ | $R_{B4}$ | H | C | S | $L_{A3772}$ | $R_{B4}$ | H | N | S |
| $L_{A3653}$ | $R_{B7}$ | H | C | S | $L_{A3773}$ | $R_{B7}$ | H | N | S |

-continued

| Ligand | $R^1$ | $R^5$ | X | Y | Ligand | $R^1$ | $R^5$ | X | Y |
|---|---|---|---|---|---|---|---|---|---|
| $L_{A3654}$ | $R_{B10}$ | H | C | S | $L_{A3774}$ | $R_{B10}$ | H | N | S |
| $L_{A3655}$ | $R_{A3}$ | H | C | S | $L_{A3775}$ | $R_{A3}$ | H | N | S |
| $L_{A3656}$ | $R_{A34}$ | H | C | S | $L_{A3776}$ | $R_{A34}$ | H | N | S |
| $L_{A3657}$ | H | H | C | O | $L_{A3777}$ | H | H | N | O |
| $L_{A3658}$ | $R_{B1}$ | H | C | O | $L_{A3778}$ | $R_{B1}$ | H | N | O |
| $L_{A3659}$ | $R_{B3}$ | H | C | O | $L_{A3779}$ | $R_{B3}$ | H | N | O |
| $L_{A3660}$ | $R_{B4}$ | H | C | O | $L_{A3780}$ | $R_{B4}$ | H | N | O |
| $L_{A3661}$ | $R_{B7}$ | H | C | O | $L_{A3781}$ | $R_{B7}$ | H | N | O |
| $L_{A3662}$ | $R_{B10}$ | H | C | O | $L_{A3782}$ | $R_{B10}$ | H | N | O |
| $L_{A3663}$ | $R_{A3}$ | H | C | O | $L_{A3783}$ | $R_{A3}$ | H | N | O |
| $L_{A3664}$ | $R_{A34}$ | H | C | O | $L_{A3784}$ | $R_{A34}$ | H | N | O |
| $L_{A3665}$ | H | H | C | $NCH_3$ | $L_{A3785}$ | H | H | N | $NCH_3$ |
| $L_{A3666}$ | $R_{B1}$ | H | C | $NCH_3$ | $L_{A3786}$ | $R_{B1}$ | H | N | $NCH_3$ |
| $L_{A3667}$ | $R_{B3}$ | H | C | $NCH_3$ | $L_{A3787}$ | $R_{B3}$ | H | N | $NCH_3$ |
| $L_{A3668}$ | $R_{B4}$ | H | C | $NCH_3$ | $L_{A3788}$ | $R_{B4}$ | H | N | $NCH_3$ |
| $L_{A3669}$ | $R_{B7}$ | H | C | $NCH_3$ | $L_{A3789}$ | $R_{B7}$ | H | N | $NCH_3$ |
| $L_{A3670}$ | $R_{B10}$ | H | C | $NCH_3$ | $L_{A3790}$ | $R_{B10}$ | H | N | $NCH_3$ |
| $L_{A3671}$ | $R_{A3}$ | H | C | $NCH_3$ | $L_{A3791}$ | $R_{A3}$ | H | N | $NCH_3$ |
| $L_{A3672}$ | $R_{A34}$ | H | C | $NCH_3$ | $L_{A3792}$ | $R_{A34}$ | H | N | $NCH_3$ |
| $L_{A3673}$ | H | H | C | $C(CH_3)_2$ | $L_{A3793}$ | H | H | N | $C(CH_3)_2$ |
| $L_{A3674}$ | $R_{B1}$ | H | C | $C(CH_3)_2$ | $L_{A3794}$ | $R_{B1}$ | H | N | $C(CH_3)_2$ |
| $L_{A3675}$ | $R_{B3}$ | H | C | $C(CH_3)_2$ | $L_{A3795}$ | $R_{B3}$ | H | N | $C(CH_3)_2$ |
| $L_{A3676}$ | $R_{B4}$ | H | C | $C(CH_3)_2$ | $L_{A3796}$ | $R_{B4}$ | H | N | $C(CH_3)_2$ |
| $L_{A3677}$ | $R_{B7}$ | H | C | $C(CH_3)_2$ | $L_{A3797}$ | $R_{B7}$ | H | N | $C(CH_3)_2$ |
| $L_{A3678}$ | $R_{B10}$ | H | C | $C(CH_3)_2$ | $L_{A3798}$ | $R_{B10}$ | H | N | $C(CH_3)_2$ |
| $L_{A3679}$ | $R_{A3}$ | H | C | $C(CH_3)_2$ | $L_{A3799}$ | $R_{A3}$ | H | N | $C(CH_3)_2$ |
| $L_{A3680}$ | $R_{A34}$ | H | C | $C(CH_3)_2$ | $L_{A3800}$ | $R_{A34}$ | H | N | $C(CH_3)_2$ |
| $L_{A3681}$ | H | H | C | $Si(CH_3)_2$ | $L_{A3801}$ | H | H | N | $Si(CH_3)_2$ |
| $L_{A3682}$ | $R_{B1}$ | H | C | $Si(CH_3)_2$ | $L_{A3802}$ | $R_{B1}$ | H | N | $Si(CH_3)_2$ |
| $L_{A3683}$ | $R_{B3}$ | H | C | $Si(CH_3)_2$ | $L_{A3803}$ | $R_{B3}$ | H | N | $Si(CH_3)_2$ |
| $L_{A3684}$ | $R_{B4}$ | H | C | $Si(CH_3)_2$ | $L_{A3804}$ | $R_{B4}$ | H | N | $Si(CH_3)_2$ |
| $L_{A3685}$ | $R_{B7}$ | H | C | $Si(CH_3)_2$ | $L_{A3805}$ | $R_{B7}$ | H | N | $Si(CH_3)_2$ |
| $L_{A3686}$ | $R_{B10}$ | H | C | $Si(CH_3)_2$ | $L_{A3806}$ | $R_{B10}$ | H | N | $Si(CH_3)_2$ |
| $L_{A3687}$ | $R_{A3}$ | H | C | $Si(CH_3)_2$ | $L_{A3807}$ | $R_{A3}$ | H | N | $Si(CH_3)_2$ |
| $L_{A3688}$ | $R_{A34}$ | H | C | $Si(CH_3)_2$ | $L_{A3808}$ | $R_{A34}$ | H | N | $Si(CH_3)_2$ |
| $L_{A3689}$ | H | $R_{B1}$ | C | S | $L_{A3809}$ | H | $R_{B1}$ | N | S |
| $L_{A3690}$ | $R_{B1}$ | $R_{B1}$ | C | S | $L_{A3810}$ | $R_{B1}$ | $R_{B1}$ | N | S |
| $L_{A3691}$ | $R_{B3}$ | $R_{B1}$ | C | S | $L_{A3811}$ | $R_{B3}$ | $R_{B1}$ | N | S |
| $L_{A3692}$ | $R_{B4}$ | $R_{B1}$ | C | S | $L_{A3812}$ | $R_{B4}$ | $R_{B1}$ | N | S |
| $L_{A3693}$ | $R_{B7}$ | $R_{B1}$ | C | S | $L_{A3813}$ | $R_{B7}$ | $R_{B1}$ | N | S |
| $L_{A3694}$ | $R_{B10}$ | $R_{B1}$ | C | S | $L_{A3814}$ | $R_{B10}$ | $R_{B1}$ | N | S |
| $L_{A3695}$ | $R_{A3}$ | $R_{B1}$ | C | S | $L_{A3815}$ | $R_{A3}$ | $R_{B1}$ | N | S |
| $L_{A3696}$ | $R_{A34}$ | $R_{B1}$ | C | S | $L_{A3816}$ | $R_{A34}$ | $R_{B1}$ | N | S |
| $L_{A3697}$ | H | $R_{B1}$ | C | O | $L_{A3817}$ | H | $R_{B1}$ | N | O |
| $L_{A3698}$ | $R_{B1}$ | $R_{B1}$ | C | O | $L_{A3818}$ | $R_{B1}$ | $R_{B1}$ | N | O |
| $L_{A3699}$ | $R_{B3}$ | $R_{B1}$ | C | O | $L_{A3819}$ | $R_{B3}$ | $R_{B1}$ | N | O |
| $L_{A3700}$ | $R_{B4}$ | $R_{B1}$ | C | O | $L_{A3820}$ | $R_{B4}$ | $R_{B1}$ | N | O |
| $L_{A3701}$ | $R_{B7}$ | $R_{B1}$ | C | O | $L_{A3821}$ | $R_{B7}$ | $R_{B1}$ | N | O |
| $L_{A3702}$ | $R_{B10}$ | $R_{B1}$ | C | O | $L_{A3822}$ | $R_{B10}$ | $R_{B1}$ | N | O |
| $L_{A3703}$ | $R_{A3}$ | $R_{B1}$ | C | O | $L_{A3823}$ | $R_{A3}$ | $R_{B1}$ | N | O |
| $L_{A3704}$ | $R_{A34}$ | $R_{B1}$ | C | O | $L_{A3824}$ | $R_{A34}$ | $R_{B1}$ | N | O |
| $L_{A3705}$ | H | $R_{B1}$ | C | $NCH_3$ | $L_{A3825}$ | H | $R_{B1}$ | N | $NCH_3$ |
| $L_{A3706}$ | $R_{B1}$ | $R_{B1}$ | C | $NCH_3$ | $L_{A3826}$ | $R_{B1}$ | $R_{B1}$ | N | $NCH_3$ |
| $L_{A3707}$ | $R_{B3}$ | $R_{B1}$ | C | $NCH_3$ | $L_{A3827}$ | $R_{B3}$ | $R_{B1}$ | N | $NCH_3$ |
| $L_{A3708}$ | $R_{B4}$ | $R_{B1}$ | C | $NCH_3$ | $L_{A3828}$ | $R_{B4}$ | $R_{B1}$ | N | $NCH_3$ |
| $L_{A3709}$ | $R_{B7}$ | $R_{B1}$ | C | $NCH_3$ | $L_{A3829}$ | $R_{B7}$ | $R_{B1}$ | N | $NCH_3$ |
| $L_{A3710}$ | $R_{B10}$ | $R_{B1}$ | C | $NCH_3$ | $L_{A3830}$ | $R_{B10}$ | $R_{B1}$ | N | $NCH_3$ |
| $L_{A3711}$ | $R_{A3}$ | $R_{B1}$ | C | $NCH_3$ | $L_{A3831}$ | $R_{A3}$ | $R_{B1}$ | N | $NCH_3$ |
| $L_{A3712}$ | $R_{A34}$ | $R_{B1}$ | C | $NCH_3$ | $L_{A3832}$ | $R_{A34}$ | $R_{B1}$ | N | $NCH_3$ |
| $L_{A3713}$ | H | $R_{B1}$ | C | $C(CH_3)_2$ | $L_{A3833}$ | H | $R_{B1}$ | N | $C(CH_3)_2$ |
| $L_{A3714}$ | $R_{B1}$ | $R_{B1}$ | C | $C(CH_3)_2$ | $L_{A3834}$ | $R_{B1}$ | $R_{B1}$ | N | $C(CH_3)_2$ |
| $L_{A3715}$ | $R_{B3}$ | $R_{B1}$ | C | $C(CH_3)_2$ | $L_{A3835}$ | $R_{B3}$ | $R_{B1}$ | N | $C(CH_3)_2$ |
| $L_{A3716}$ | $R_{B4}$ | $R_{B1}$ | C | $C(CH_3)_2$ | $L_{A3836}$ | $R_{B4}$ | $R_{B1}$ | N | $C(CH_3)_2$ |
| $L_{A3717}$ | $R_{B7}$ | $R_{B1}$ | C | $C(CH_3)_2$ | $L_{A3837}$ | $R_{B7}$ | $R_{B1}$ | N | $C(CH_3)_2$ |
| $L_{A3718}$ | $R_{B10}$ | $R_{B1}$ | C | $C(CH_3)_2$ | $L_{A3838}$ | $R_{B10}$ | $R_{B1}$ | N | $C(CH_3)_2$ |
| $L_{A3719}$ | $R_{A3}$ | $R_{B1}$ | C | $C(CH_3)_2$ | $L_{A3839}$ | $R_{A3}$ | $R_{B1}$ | N | $C(CH_3)_2$ |
| $L_{A3720}$ | $R_{A34}$ | $R_{B1}$ | C | $C(CH_3)_2$ | $L_{A3840}$ | $R_{A34}$ | $R_{B1}$ | N | $C(CH_3)_2$ |
| $L_{A3721}$ | H | $R_{B1}$ | C | $Si(CH_3)_2$ | $L_{A3841}$ | H | $R_{B1}$ | N | $Si(CH_3)_2$ |
| $L_{A3722}$ | $R_{B1}$ | $R_{B1}$ | C | $Si(CH_3)_2$ | $L_{A3842}$ | $R_{B1}$ | $R_{B1}$ | N | $Si(CH_3)_2$ |
| $L_{A3723}$ | $R_{B3}$ | $R_{B1}$ | C | $Si(CH_3)_2$ | $L_{A3843}$ | $R_{B3}$ | $R_{B1}$ | N | $Si(CH_3)_2$ |
| $L_{A3724}$ | $R_{B4}$ | $R_{B1}$ | C | $Si(CH_3)_2$ | $L_{A3844}$ | $R_{B4}$ | $R_{B1}$ | N | $Si(CH_3)_2$ |
| $L_{A3725}$ | $R_{B7}$ | $R_{B1}$ | C | $Si(CH_3)_2$ | $L_{A3845}$ | $R_{B7}$ | $R_{B1}$ | N | $Si(CH_3)_2$ |
| $L_{A3726}$ | $R_{B10}$ | $R_{B1}$ | C | $Si(CH_3)_2$ | $L_{A3846}$ | $R_{B10}$ | $R_{B1}$ | N | $Si(CH_3)_2$ |
| $L_{A3727}$ | $R_{A3}$ | $R_{B1}$ | C | $Si(CH_3)_2$ | $L_{A3847}$ | $R_{A3}$ | $R_{B1}$ | N | $Si(CH_3)_2$ |
| $L_{A3728}$ | $R_{A34}$ | $R_{B1}$ | C | $Si(CH_3)_2$ | $L_{A3848}$ | $R_{A34}$ | $R_{B1}$ | N | $Si(CH_3)_2$ |
| $L_{A3729}$ | H | $R_{B6}$ | C | S | $L_{A3849}$ | H | $R_{B6}$ | N | S |
| $L_{A3730}$ | $R_{B1}$ | $R_{B6}$ | C | S | $L_{A3850}$ | $R_{B1}$ | $R_{B6}$ | N | S |

-continued

| Ligand | $R^1$ | $R^5$ | X | Y | Ligand | $R^1$ | $R^5$ | X | Y |
|---|---|---|---|---|---|---|---|---|---|
| $L_{A3731}$ | $R_{B3}$ | $R_{B6}$ | C | S | $L_{A3851}$ | $R_{B3}$ | $R_{B6}$ | N | S |
| $L_{A3732}$ | $R_{B4}$ | $R_{B6}$ | C | S | $L_{A3852}$ | $R_{B4}$ | $R_{B6}$ | N | S |
| $L_{A3733}$ | $R_{B7}$ | $R_{B6}$ | C | S | $L_{A3853}$ | $R_{B7}$ | $R_{B6}$ | N | S |
| $L_{A3734}$ | $R_{B10}$ | $R_{B6}$ | C | S | $L_{A3854}$ | $R_{B10}$ | $R_{B6}$ | N | S |
| $L_{A3735}$ | $R_{A3}$ | $R_{B6}$ | C | S | $L_{A3855}$ | $R_{A3}$ | $R_{B6}$ | N | S |
| $L_{A3736}$ | $R_{A34}$ | $R_{B6}$ | C | S | $L_{A3856}$ | $R_{A34}$ | $R_{B6}$ | N | S |
| $L_{A3737}$ | H | $R_{B6}$ | C | O | $L_{A3857}$ | H | $R_{B6}$ | N | O |
| $L_{A3738}$ | $R_{B1}$ | $R_{B6}$ | C | O | $L_{A3858}$ | $R_{B1}$ | $R_{B6}$ | N | O |
| $L_{A3739}$ | $R_{B3}$ | $R_{B6}$ | C | O | $L_{A3859}$ | $R_{B3}$ | $R_{B6}$ | N | O |
| $L_{A3740}$ | $R_{B4}$ | $R_{B6}$ | C | O | $L_{A3860}$ | $R_{B4}$ | $R_{B6}$ | N | O |
| $L_{A3741}$ | $R_{B7}$ | $R_{B6}$ | C | O | $L_{A3861}$ | $R_{B7}$ | $R_{B6}$ | N | O |
| $L_{A3742}$ | $R_{B10}$ | $R_{B6}$ | C | O | $L_{A3862}$ | $R_{B10}$ | $R_{B6}$ | N | O |
| $L_{A3743}$ | $R_{A3}$ | $R_{B6}$ | C | O | $L_{A3863}$ | $R_{A3}$ | $R_{B6}$ | N | O |
| $L_{A3744}$ | $R_{A34}$ | $R_{B6}$ | C | O | $L_{A3864}$ | $R_{A34}$ | $R_{B6}$ | N | O |
| $L_{A3745}$ | H | $R_{B6}$ | C | $NCH_3$ | $L_{A3865}$ | H | $R_{B6}$ | N | $NCH_3$ |
| $L_{A3746}$ | $R_{B1}$ | $R_{B6}$ | C | $NCH_3$ | $L_{A3866}$ | $R_{B1}$ | $R_{B6}$ | N | $NCH_3$ |
| $L_{A3747}$ | $R_{B3}$ | $R_{B6}$ | C | $NCH_3$ | $L_{A3867}$ | $R_{B3}$ | $R_{B6}$ | N | $NCH_3$ |
| $L_{A3748}$ | $R_{B4}$ | $R_{B6}$ | C | $NCH_3$ | $L_{A3868}$ | $R_{B4}$ | $R_{B6}$ | N | $NCH_3$ |
| $L_{A3749}$ | $R_{B7}$ | $R_{B6}$ | C | $NCH_3$ | $L_{A3869}$ | $R_{B7}$ | $R_{B6}$ | N | $NCH_3$ |
| $L_{A3750}$ | $R_{B10}$ | $R_{B6}$ | C | $NCH_3$ | $L_{A3870}$ | $R_{B10}$ | $R_{B6}$ | N | $NCH_3$ |
| $L_{A3751}$ | $R_{A3}$ | $R_{B6}$ | C | $NCH_3$ | $L_{A3871}$ | $R_{A3}$ | $R_{B6}$ | N | $NCH_3$ |
| $L_{A3752}$ | $R_{A34}$ | $R_{B6}$ | C | $NCH_3$ | $L_{A3872}$ | $R_{A34}$ | $R_{B6}$ | N | $NCH_3$ |
| $L_{A3753}$ | H | $R_{B6}$ | C | $C(CH_3)_2$ | $L_{A3873}$ | H | $R_{B6}$ | N | $C(CH_3)_2$ |
| $L_{A3754}$ | $R_{B1}$ | $R_{B6}$ | C | $C(CH_3)_2$ | $L_{A3874}$ | $R_{B1}$ | $R_{B6}$ | N | $C(CH_3)_2$ |
| $L_{A3755}$ | $R_{B3}$ | $R_{B6}$ | C | $C(CH_3)_2$ | $L_{A3875}$ | $R_{B3}$ | $R_{B6}$ | N | $C(CH_3)_2$ |
| $L_{A3756}$ | $R_{B4}$ | $R_{B6}$ | C | $C(CH_3)_2$ | $L_{A3876}$ | $R_{B4}$ | $R_{B6}$ | N | $C(CH_3)_2$ |
| $L_{A3757}$ | $R_{B7}$ | $R_{B6}$ | C | $C(CH_3)_2$ | $L_{A3877}$ | $R_{B7}$ | $R_{B6}$ | N | $C(CH_3)_2$ |
| $L_{A3758}$ | $R_{B10}$ | $R_{B6}$ | C | $C(CH_3)_2$ | $L_{A3878}$ | $R_{B10}$ | $R_{B6}$ | N | $C(CH_3)_2$ |
| $L_{A3759}$ | $R_{A3}$ | $R_{B6}$ | C | $C(CH_3)_2$ | $L_{A3879}$ | $R_{A3}$ | $R_{B6}$ | N | $C(CH_3)_2$ |
| $L_{A3760}$ | $R_{A34}$ | $R_{B6}$ | C | $C(CH_3)_2$ | $L_{A3880}$ | $R_{A34}$ | $R_{B6}$ | N | $C(CH_3)_2$ |
| $L_{A3761}$ | H | $R_{B6}$ | C | $Si(CH_3)_2$ | $L_{A3881}$ | H | $R_{B6}$ | N | $Si(CH_3)_2$ |
| $L_{A3762}$ | $R_{B1}$ | $R_{B6}$ | C | $Si(CH_3)_2$ | $L_{A3882}$ | $R_{B1}$ | $R_{B6}$ | N | $Si(CH_3)_2$ |
| $L_{A3763}$ | $R_{B3}$ | $R_{B6}$ | C | $Si(CH_3)_2$ | $L_{A3883}$ | $R_{B3}$ | $R_{B6}$ | N | $Si(CH_3)_2$ |
| $L_{A3764}$ | $R_{B4}$ | $R_{B6}$ | C | $Si(CH_3)_2$ | $L_{A3884}$ | $R_{B4}$ | $R_{B6}$ | N | $Si(CH_3)_2$ |
| $L_{A3765}$ | $R_{B7}$ | $R_{B6}$ | C | $Si(CH_3)_2$ | $L_{A3885}$ | $R_{B7}$ | $R_{B6}$ | N | $Si(CH_3)_2$ |
| $L_{A3766}$ | $R_{B10}$ | $R_{B6}$ | C | $Si(CH_3)_2$ | $L_{A3886}$ | $R_{B10}$ | $R_{B6}$ | N | $Si(CH_3)_2$ |
| $L_{A3767}$ | $R_{A3}$ | $R_{B6}$ | C | $Si(CH_3)_2$ | $L_{A3887}$ | $R_{A3}$ | $R_{B6}$ | N | $Si(CH_3)_2$ |
| $L_{A3768}$ | $R_{A34}$ | $R_{B6}$ | C | $Si(CH_3)_2$ | $L_{A3888}$ | $R_{A34}$ | $R_{B6}$ | N | $Si(CH_3)_2$ |

wherein $L_{A3889}$ through $L_{A4008}$ have a structure of Formula XXVII:

Formula XXVII

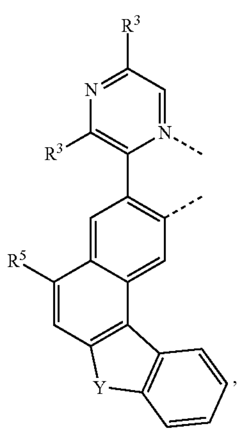

wherein $R^3$, $R^5$, and Y are defined as provided below:

| Ligand | $R^5$ | $R^3$ | Y | Ligand | $R^5$ | $R^3$ | Y |
|---|---|---|---|---|---|---|---|
| $L_{A3889}$ | H | H | S | $L_{A3949}$ | $R_{B1}$ | $R_{B4}$ | $NCH_3$ |
| $L_{A3890}$ | H | $R_{B1}$ | S | $L_{A3950}$ | $R_{B1}$ | $R_{B5}$ | $NCH_3$ |
| $L_{A3891}$ | H | $R_{B2}$ | S | $L_{A3951}$ | $R_{B1}$ | $R_{A34}$ | $NCH_3$ |
| $L_{A3892}$ | H | $R_{B3}$ | S | $L_{A3952}$ | $R_{B1}$ | $R_{A52}$ | $NCH_3$ |
| $L_{A3893}$ | H | $R_{B4}$ | S | $L_{A3953}$ | $R_{B1}$ | H | $C(CH_3)_2$ |
| $L_{A3894}$ | H | $R_{B5}$ | S | $L_{A3954}$ | $R_{B1}$ | $R_{B1}$ | $C(CH_3)_2$ |
| $L_{A3895}$ | H | $R_{A34}$ | S | $L_{A3955}$ | $R_{B1}$ | $R_{B2}$ | $C(CH_3)_2$ |
| $L_{A3896}$ | H | $R_{A52}$ | S | $L_{A3956}$ | $R_{B1}$ | $R_{B3}$ | $C(CH_3)_2$ |
| $L_{A3897}$ | H | H | O | $L_{A3957}$ | $R_{B1}$ | $R_{B4}$ | $C(CH_3)_2$ |
| $L_{A3898}$ | H | $R_{B1}$ | O | $L_{A3958}$ | $R_{B1}$ | $R_{B5}$ | $C(CH_3)_2$ |
| $L_{A3899}$ | H | $R_{B2}$ | O | $L_{A3959}$ | $R_{B1}$ | $R_{A34}$ | $C(CH_3)_2$ |
| $L_{A3900}$ | H | $R_{B3}$ | O | $L_{A3960}$ | $R_{B1}$ | $R_{A52}$ | $C(CH_3)_2$ |
| $L_{A3901}$ | H | $R_{B4}$ | O | $L_{A3961}$ | $R_{B1}$ | H | $Si(CH_3)_2$ |
| $L_{A3902}$ | H | $R_{B5}$ | O | $L_{A3962}$ | $R_{B1}$ | $R_{B1}$ | $Si(CH_3)_2$ |
| $L_{A3903}$ | H | $R_{A34}$ | O | $L_{A3963}$ | $R_{B1}$ | $R_{B2}$ | $Si(CH_3)_2$ |
| $L_{A3904}$ | H | $R_{A52}$ | O | $L_{A3964}$ | $R_{B1}$ | $R_{B3}$ | $Si(CH_3)_2$ |
| $L_{A3905}$ | H | H | $NCH_3$ | $L_{A3965}$ | $R_{B1}$ | $R_{B4}$ | $Si(CH_3)_2$ |
| $L_{A3906}$ | H | $R_{B1}$ | $NCH_3$ | $L_{A3966}$ | $R_{B1}$ | $R_{B5}$ | $Si(CH_3)_2$ |
| $L_{A3907}$ | H | $R_{B2}$ | $NCH_3$ | $L_{A3967}$ | $R_{B1}$ | $R_{A34}$ | $Si(CH_3)_2$ |
| $L_{A3908}$ | H | $R_{B3}$ | $NCH_3$ | $L_{A3968}$ | $R_{B1}$ | $R_{A52}$ | $Si(CH_3)_2$ |
| $L_{A3909}$ | H | $R_{B4}$ | $NCH_3$ | $L_{A3969}$ | $R_{B6}$ | H | S |
| $L_{A3910}$ | H | $R_{B5}$ | $NCH_3$ | $L_{A3970}$ | $R_{B6}$ | $R_{B1}$ | S |
| $L_{A3911}$ | H | $R_{A34}$ | $NCH_3$ | $L_{A3971}$ | $R_{B6}$ | $R_{B2}$ | S |
| $L_{A3912}$ | H | $R_{A52}$ | $NCH_3$ | $L_{A3972}$ | $R_{B6}$ | $R_{B3}$ | S |
| $L_{A3913}$ | H | H | $C(CH_3)_2$ | $L_{A3973}$ | $R_{B6}$ | $R_{B4}$ | S |
| $L_{A3914}$ | H | $R_{B1}$ | $C(CH_3)_2$ | $L_{A3974}$ | $R_{B6}$ | $R_{B5}$ | S |
| $L_{A3915}$ | H | $R_{B2}$ | $C(CH_3)_2$ | $L_{A3975}$ | $R_{B6}$ | $R_{A34}$ | S |
| $L_{A3916}$ | H | $R_{B3}$ | $C(CH_3)_2$ | $L_{A3976}$ | $R_{B6}$ | $R_{A52}$ | S |
| $L_{A3917}$ | H | $R_{B4}$ | $C(CH_3)_2$ | $L_{A3977}$ | $R_{B6}$ | H | O |
| $L_{A3918}$ | H | $R_{B5}$ | $C(CH_3)_2$ | $L_{A3978}$ | $R_{B6}$ | $R_{B1}$ | O |
| $L_{A3919}$ | H | $R_{A34}$ | $C(CH_3)_2$ | $L_{A3979}$ | $R_{B6}$ | $R_{B2}$ | O |
| $L_{A3920}$ | H | $R_{A52}$ | $C(CH_3)_2$ | $L_{A3980}$ | $R_{B6}$ | $R_{B3}$ | O |
| $L_{A3921}$ | H | H | $Si(CH_3)_2$ | $L_{A3981}$ | $R_{B6}$ | $R_{B4}$ | O |
| $L_{A3922}$ | H | $R_{B1}$ | $Si(CH_3)_2$ | $L_{A3982}$ | $R_{B6}$ | $R_{B5}$ | O |
| $L_{A3923}$ | H | $R_{B2}$ | $Si(CH_3)_2$ | $L_{A3983}$ | $R_{B6}$ | $R_{A34}$ | O |
| $L_{A3924}$ | H | $R_{B3}$ | $Si(CH_3)_2$ | $L_{A3984}$ | $R_{B6}$ | $R_{A52}$ | O |
| $L_{A3925}$ | H | $R_{B4}$ | $Si(CH_3)_2$ | $L_{A3985}$ | $R_{B6}$ | H | $NCH_3$ |
| $L_{A3926}$ | H | $R_{B5}$ | $Si(CH_3)_2$ | $L_{A3986}$ | $R_{B6}$ | $R_{B1}$ | $NCH_3$ |
| $L_{A3927}$ | H | $R_{A34}$ | $Si(CH_3)_2$ | $L_{A3987}$ | $R_{B6}$ | $R_{B2}$ | $NCH_3$ |
| $L_{A3928}$ | H | $R_{A52}$ | $Si(CH_3)_2$ | $L_{A3988}$ | $R_{B6}$ | $R_{B3}$ | $NCH_3$ |
| $L_{A3929}$ | $R_{B1}$ | H | S | $L_{A3989}$ | $R_{B6}$ | $R_{B4}$ | $NCH_3$ |
| $L_{A3930}$ | $R_{B1}$ | $R_{B1}$ | S | $L_{A3990}$ | $R_{B6}$ | $R_{B5}$ | $NCH_3$ |
| $L_{A3931}$ | $R_{B1}$ | $R_{B2}$ | S | $L_{A3991}$ | $R_{B6}$ | $R_{A34}$ | $NCH_3$ |
| $L_{A3932}$ | $R_{B1}$ | $R_{B3}$ | S | $L_{A3992}$ | $R_{B6}$ | $R_{A52}$ | $NCH_3$ |
| $L_{A3933}$ | $R_{B1}$ | $R_{B4}$ | S | $L_{A3993}$ | $R_{B6}$ | H | $C(CH_3)_2$ |
| $L_{A3934}$ | $R_{B1}$ | $R_{B5}$ | S | $L_{A3994}$ | $R_{B6}$ | $R_{B1}$ | $C(CH_3)_2$ |
| $L_{A3935}$ | $R_{B1}$ | $R_{A34}$ | S | $L_{A3995}$ | $R_{B6}$ | $R_{B2}$ | $C(CH_3)_2$ |
| $L_{A3936}$ | $R_{B1}$ | $R_{A52}$ | S | $L_{A3996}$ | $R_{B6}$ | $R_{B3}$ | $C(CH_3)_2$ |
| $L_{A3937}$ | $R_{B1}$ | H | O | $L_{A3997}$ | $R_{B6}$ | $R_{B4}$ | $C(CH_3)_2$ |
| $L_{A3938}$ | $R_{B1}$ | $R_{B1}$ | O | $L_{A3998}$ | $R_{B6}$ | $R_{B5}$ | $C(CH_3)_2$ |
| $L_{A3939}$ | $R_{B1}$ | $R_{B2}$ | O | $L_{A3999}$ | $R_{B6}$ | $R_{A34}$ | $C(CH_3)_2$ |
| $L_{A3940}$ | $R_{B1}$ | $R_{B3}$ | O | $L_{A4000}$ | $R_{B6}$ | $R_{A52}$ | $C(CH_3)_2$ |
| $L_{A3941}$ | $R_{B1}$ | $R_{B4}$ | O | $L_{A4001}$ | $R_{B6}$ | H | $Si(CH_3)_2$ |
| $L_{A3942}$ | $R_{B1}$ | $R_{B5}$ | O | $L_{A4002}$ | $R_{B6}$ | $R_{B1}$ | $Si(CH_3)_2$ |
| $L_{A3943}$ | $R_{B1}$ | $R_{A34}$ | O | $L_{A4003}$ | $R_{B6}$ | $R_{B2}$ | $Si(CH_3)_2$ |
| $L_{A3944}$ | $R_{B1}$ | $R_{A52}$ | O | $L_{A4004}$ | $R_{B6}$ | $R_{B3}$ | $Si(CH_3)_2$ |
| $L_{A3945}$ | $R_{B1}$ | H | $NCH_3$ | $L_{A4005}$ | $R_{B6}$ | $R_{B4}$ | $Si(CH_3)_2$ |
| $L_{A3946}$ | $R_{B1}$ | $R_{B1}$ | $NCH_3$ | $L_{A4006}$ | $R_{B6}$ | $R_{B5}$ | $Si(CH_3)_2$ |
| $L_{A3947}$ | $R_{B1}$ | $R_{B2}$ | $NCH_3$ | $L_{A4007}$ | $R_{B6}$ | $R_{A34}$ | $Si(CH_3)_2$ |
| $L_{A3948}$ | $R_{B1}$ | $R_{B3}$ | $NCH_3$ | $L_{A4008}$ | $R_{B6}$ | $R_{A52}$ | $Si(CH_3)_2$ |

wherein $L_{A4009}$ through $L_{A4104}$ have a structure of Formula XXVIII:

Formula XXVIII

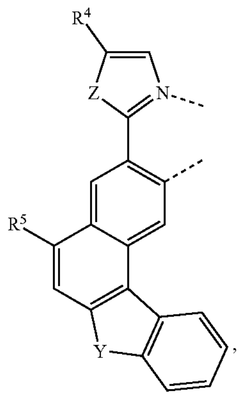

wherein $R^4$, $R^5$, Y, and Z are defined as provided below:

| Ligand | $R^5$ | $R^4$ | Y | Z | Ligand | $R^5$ | $R^4$ | Y | Z |
|---|---|---|---|---|---|---|---|---|---|
| $L_{A4009}$ | H | H | S | S | $L_{A4057}$ | $R_{B6}$ | H | S | S |
| $L_{A4010}$ | H | $R_{B1}$ | S | S | $L_{A4058}$ | $R_{B6}$ | $R_{B1}$ | S | S |
| $L_{A4011}$ | H | $R_{B3}$ | S | S | $L_{A4059}$ | $R_{B6}$ | $R_{B3}$ | S | S |
| $L_{A4012}$ | H | $R_{B4}$ | S | S | $L_{A4060}$ | $R_{B6}$ | $R_{B4}$ | S | S |
| $L_{A4013}$ | H | $R_{B7}$ | S | S | $L_{A4061}$ | $R_{B6}$ | $R_{B7}$ | S | S |
| $L_{A4014}$ | H | $R_{B10}$ | S | S | $L_{A4062}$ | $R_{B6}$ | $R_{B10}$ | S | S |
| $L_{A4015}$ | H | $R_{A3}$ | S | S | $L_{A4063}$ | $R_{B6}$ | $R_{A3}$ | S | S |
| $L_{A4016}$ | H | $R_{A34}$ | S | S | $L_{A4064}$ | $R_{B6}$ | $R_{A34}$ | S | S |
| $L_{A4017}$ | H | H | S | O | $L_{A4065}$ | $R_{B6}$ | H | S | O |
| $L_{A4018}$ | H | $R_{B1}$ | S | O | $L_{A4066}$ | $R_{B6}$ | $R_{B1}$ | S | O |
| $L_{A4019}$ | H | $R_{B3}$ | S | O | $L_{A4067}$ | $R_{B6}$ | $R_{B3}$ | S | O |
| $L_{A4020}$ | H | $R_{B4}$ | S | O | $L_{A4068}$ | $R_{B6}$ | $R_{B4}$ | S | O |
| $L_{A4021}$ | H | $R_{B7}$ | S | O | $L_{A4069}$ | $R_{B6}$ | $R_{B7}$ | S | O |
| $L_{A4022}$ | H | $R_{B10}$ | S | O | $L_{A4070}$ | $R_{B6}$ | $R_{B10}$ | S | O |
| $L_{A4023}$ | H | $R_{A3}$ | S | O | $L_{A4071}$ | $R_{B6}$ | $R_{A3}$ | S | O |
| $L_{A4024}$ | H | $R_{A34}$ | S | O | $L_{A4072}$ | $R_{B6}$ | $R_{A34}$ | S | O |
| $L_{A4025}$ | H | H | S | $NCH_3$ | $L_{A4073}$ | $R_{B6}$ | H | S | $NCH_3$ |
| $L_{A4026}$ | H | $R_{B1}$ | S | $NCH_3$ | $L_{A4074}$ | $R_{B6}$ | $R_{B1}$ | S | $NCH_3$ |
| $L_{A4027}$ | H | $R_{B3}$ | S | $NCH_3$ | $L_{A4075}$ | $R_{B6}$ | $R_{B3}$ | S | $NCH_3$ |
| $L_{A4028}$ | H | $R_{B4}$ | S | $NCH_3$ | $L_{A4076}$ | $R_{B6}$ | $R_{B4}$ | S | $NCH_3$ |
| $L_{A4029}$ | H | $R_{B7}$ | S | $NCH_3$ | $L_{A4077}$ | $R_{B6}$ | $R_{B7}$ | S | $NCH_3$ |
| $L_{A4030}$ | H | $R_{B10}$ | S | $NCH_3$ | $L_{A4078}$ | $R_{B6}$ | $R_{B10}$ | S | $NCH_3$ |
| $L_{A4031}$ | H | $R_{A3}$ | S | $NCH_3$ | $L_{A4079}$ | $R_{B6}$ | $R_{A3}$ | S | $NCH_3$ |
| $L_{A4032}$ | H | $R_{A34}$ | S | $NCH_3$ | $L_{A4080}$ | $R_{B6}$ | $R_{A34}$ | S | $NCH_3$ |
| $L_{A4033}$ | H | H | O | S | $L_{A4081}$ | $R_{B6}$ | H | O | S |
| $L_{A4034}$ | H | $R_{B1}$ | O | S | $L_{A4082}$ | $R_{B6}$ | $R_{B1}$ | O | S |
| $L_{A4035}$ | H | $R_{B3}$ | O | S | $L_{A4083}$ | $R_{B6}$ | $R_{B3}$ | O | S |
| $L_{A4036}$ | H | $R_{B4}$ | O | S | $L_{A4084}$ | $R_{B6}$ | $R_{B4}$ | O | S |
| $L_{A4037}$ | H | $R_{B7}$ | O | S | $L_{A4085}$ | $R_{B6}$ | $R_{B7}$ | O | S |
| $L_{A4038}$ | H | $R_{B10}$ | O | S | $L_{A4086}$ | $R_{B6}$ | $R_{B10}$ | O | S |
| $L_{A4039}$ | H | $R_{A3}$ | O | S | $L_{A4087}$ | $R_{B6}$ | $R_{A3}$ | O | S |
| $L_{A4040}$ | H | $R_{A34}$ | O | S | $L_{A4088}$ | $R_{B6}$ | $R_{A34}$ | O | S |
| $L_{A4041}$ | H | H | O | O | $L_{A4089}$ | $R_{B6}$ | H | O | O |
| $L_{A4042}$ | H | $R_{B1}$ | O | O | $L_{A4090}$ | $R_{B6}$ | $R_{B1}$ | O | O |
| $L_{A4043}$ | H | $R_{B3}$ | O | O | $L_{A4091}$ | $R_{B6}$ | $R_{B3}$ | O | O |
| $L_{A4044}$ | H | $R_{B4}$ | O | O | $L_{A4092}$ | $R_{B6}$ | $R_{B4}$ | O | O |
| $L_{A4045}$ | H | $R_{B7}$ | O | O | $L_{A4093}$ | $R_{B6}$ | $R_{B7}$ | O | O |
| $L_{A4046}$ | H | $R_{B10}$ | O | O | $L_{A4094}$ | $R_{B6}$ | $R_{B10}$ | O | O |
| $L_{A4047}$ | H | $R_{A3}$ | O | O | $L_{A4095}$ | $R_{B6}$ | $R_{A3}$ | O | O |
| $L_{A4048}$ | H | $R_{A34}$ | O | O | $L_{A4096}$ | $R_{B6}$ | $R_{A34}$ | O | O |
| $L_{A4049}$ | H | H | O | $NCH_3$ | $L_{A4097}$ | $R_{B6}$ | H | O | $NCH_3$ |
| $L_{A4050}$ | H | $R_{B1}$ | O | $NCH_3$ | $L_{A4098}$ | $R_{B6}$ | $R_{B1}$ | O | $NCH_3$ |
| $L_{A4051}$ | H | $R_{B3}$ | O | $NCH_3$ | $L_{A4099}$ | $R_{B6}$ | $R_{B3}$ | O | $NCH_3$ |
| $L_{A4052}$ | H | $R_{B4}$ | O | $NCH_3$ | $L_{A4100}$ | $R_{B6}$ | $R_{B4}$ | O | $NCH_3$ |
| $L_{A4053}$ | H | $R_{B7}$ | O | $NCH_3$ | $L_{A4101}$ | $R_{B6}$ | $R_{B7}$ | O | $NCH_3$ |
| $L_{A4054}$ | H | $R_{B10}$ | O | $NCH_3$ | $L_{A4102}$ | $R_{B6}$ | $R_{B10}$ | O | $NCH_3$ |
| $L_{A4055}$ | H | $R_{A3}$ | O | $NCH_3$ | $L_{A4103}$ | $R_{B6}$ | $R_{A3}$ | O | $NCH_3$ |
| $L_{A4056}$ | H | $R_{A34}$ | O | $NCH_3$ | $L_{A4104}$ | $R_{B6}$ | $R_{A34}$ | O | $NCH_3$ |

wherein $L_{A4225}$ through $L_{A4344}$ have a structure of Formula XXIX:

Formula XXIX

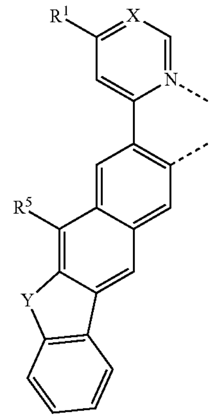

wherein $R^1$, $R^5$, X, and Y are defined as provided below:

| Ligand | $R^1$ | $R^5$ | X | Y |
|---|---|---|---|---|
| $L_{A4225}$ | H | H | N | S |
| $L_{A4226}$ | $R_{B1}$ | H | N | S |
| $L_{A4227}$ | $R_{B3}$ | H | N | S |
| $L_{A4228}$ | $R_{B4}$ | H | N | S |
| $L_{A4229}$ | $R_{B7}$ | H | N | S |
| $L_{A4230}$ | $R_{B10}$ | H | N | S |
| $L_{A4231}$ | $R_{A3}$ | H | N | S |
| $L_{A4232}$ | $R_{A34}$ | H | N | S |
| $L_{A4233}$ | H | H | N | O |
| $L_{A4234}$ | $R_{B1}$ | H | N | O |
| $L_{A4235}$ | $R_{B3}$ | H | N | O |
| $L_{A4236}$ | $R_{B4}$ | H | N | O |
| $L_{A4237}$ | $R_{B7}$ | H | N | O |
| $L_{A4238}$ | $R_{B10}$ | H | N | O |
| $L_{A4239}$ | $R_{A3}$ | H | N | O |
| $L_{A4240}$ | $R_{A34}$ | H | N | O |
| $L_{A4241}$ | H | H | N | $NCH_3$ |
| $L_{A4242}$ | $R_{B1}$ | H | N | $NCH_3$ |
| $L_{A4243}$ | $R_{B3}$ | H | N | $NCH_3$ |
| $L_{A4244}$ | $R_{B4}$ | H | N | $NCH_3$ |
| $L_{A4245}$ | $R_{B7}$ | H | N | $NCH_3$ |
| $L_{A4246}$ | $R_{B10}$ | H | N | $NCH_3$ |
| $L_{A4247}$ | $R_{A3}$ | H | N | $NCH_3$ |
| $L_{A4248}$ | $R_{A34}$ | H | N | $NCH_3$ |
| $L_{A4249}$ | H | H | N | $C(CH_3)_2$ |
| $L_{A4250}$ | $R_{B1}$ | H | N | $C(CH_3)_2$ |
| $L_{A4251}$ | $R_{B3}$ | H | N | $C(CH_3)_2$ |
| $L_{A4252}$ | $R_{B4}$ | H | N | $C(CH_3)_2$ |
| $L_{A4253}$ | $R_{B7}$ | H | N | $C(CH_3)_2$ |
| $L_{A4254}$ | $R_{B10}$ | H | N | $C(CH_3)_2$ |
| $L_{A4255}$ | $R_{A3}$ | H | N | $C(CH_3)_2$ |
| $L_{A4256}$ | $R_{A34}$ | H | N | $C(CH_3)_2$ |
| $L_{A4257}$ | H | H | N | $Si(CH_3)_2$ |
| $L_{A4258}$ | $R_{B1}$ | H | N | $Si(CH_3)_2$ |
| $L_{A4259}$ | $R_{B3}$ | H | N | $Si(CH_3)_2$ |
| $L_{A4260}$ | $R_{B4}$ | H | N | $Si(CH_3)_2$ |
| $L_{A4261}$ | $R_{B7}$ | H | N | $Si(CH_3)_2$ |
| $L_{A4262}$ | $R_{B10}$ | H | N | $Si(CH_3)_2$ |
| $L_{A4263}$ | $R_{A3}$ | H | N | $Si(CH_3)_2$ |
| $L_{A4264}$ | $R_{A34}$ | H | N | $Si(CH_3)_2$ |
| $L_{A4265}$ | H | $R_{B1}$ | N | S |
| $L_{A4266}$ | $R_{B1}$ | $R_{B1}$ | N | S |
| $L_{A4267}$ | $R_{B3}$ | $R_{B1}$ | N | S |
| $L_{A4268}$ | $R_{B4}$ | $R_{B1}$ | N | S |
| $L_{A4269}$ | $R_{B7}$ | $R_{B1}$ | N | S |
| $L_{A4270}$ | $R_{B10}$ | $R_{B1}$ | N | S |
| $L_{A4271}$ | $R_{A3}$ | $R_{B1}$ | N | S |
| $L_{A4272}$ | $R_{A34}$ | $R_{B1}$ | N | S |
| $L_{A4273}$ | H | $R_{B1}$ | N | O |

-continued

| Ligand | $R^1$ | $R^5$ | X | Y |
|---|---|---|---|---|
| $L_{A4274}$ | $R_{B1}$ | $R_{B1}$ | N | O |
| $L_{A4275}$ | $R_{B3}$ | $R_{B1}$ | N | O |
| $L_{A4276}$ | $R_{B4}$ | $R_{B1}$ | N | O |
| $L_{A4277}$ | $R_{B7}$ | $R_{B1}$ | N | O |
| $L_{A4278}$ | $R_{B10}$ | $R_{B1}$ | N | O |
| $L_{A4279}$ | $R_{A3}$ | $R_{B1}$ | N | O |
| $L_{A4280}$ | $R_{A34}$ | $R_{B1}$ | N | O |
| $L_{A4281}$ | H | $R_{B1}$ | N | $NCH_3$ |
| $L_{A4282}$ | $R_{B1}$ | $R_{B1}$ | N | $NCH_3$ |
| $L_{A4283}$ | $R_{B3}$ | $R_{B1}$ | N | $NCH_3$ |
| $L_{A4284}$ | $R_{B4}$ | $R_{B1}$ | N | $NCH_3$ |
| $L_{A4285}$ | $R_{B7}$ | $R_{B1}$ | N | $NCH_3$ |
| $L_{A4286}$ | $R_{B10}$ | $R_{B1}$ | N | $NCH_3$ |
| $L_{A4287}$ | $R_{A3}$ | $R_{B1}$ | N | $NCH_3$ |
| $L_{A4288}$ | $R_{A34}$ | $R_{B1}$ | N | $NCH_3$ |
| $L_{A4289}$ | H | $R_{B1}$ | N | $C(CH_3)_2$ |
| $L_{A4290}$ | $R_{B1}$ | $R_{B1}$ | N | $C(CH_3)_2$ |
| $L_{A4291}$ | $R_{B3}$ | $R_{B1}$ | N | $C(CH_3)_2$ |
| $L_{A4292}$ | $R_{B4}$ | $R_{B1}$ | N | $C(CH_3)_2$ |
| $L_{A4293}$ | $R_{B7}$ | $R_{B1}$ | N | $C(CH_3)_2$ |
| $L_{A4294}$ | $R_{B10}$ | $R_{B1}$ | N | $C(CH_3)_2$ |
| $L_{A4295}$ | $R_{A3}$ | $R_{B1}$ | N | $C(CH_3)_2$ |
| $L_{A4296}$ | $R_{A34}$ | $R_{B1}$ | N | $C(CH_3)_2$ |
| $L_{A4297}$ | H | $R_{B1}$ | N | $Si(CH_3)_2$ |
| $L_{A4298}$ | $R_{B1}$ | $R_{B1}$ | N | $Si(CH_3)_2$ |
| $L_{A4299}$ | $R_{B3}$ | $R_{B1}$ | N | $Si(CH_3)_2$ |
| $L_{A4300}$ | $R_{B4}$ | $R_{B1}$ | N | $Si(CH_3)_2$ |
| $L_{A4301}$ | $R_{B7}$ | $R_{B1}$ | N | $Si(CH_3)_2$ |
| $L_{A4302}$ | $R_{B10}$ | $R_{B1}$ | N | $Si(CH_3)_2$ |
| $L_{A4303}$ | $R_{A3}$ | $R_{B1}$ | N | $Si(CH_3)_2$ |
| $L_{A4304}$ | $R_{A34}$ | $R_{B1}$ | N | $Si(CH_3)_2$ |
| $L_{A4305}$ | H | $R_{B6}$ | N | S |
| $L_{A4306}$ | $R_{B1}$ | $R_{B6}$ | N | S |
| $L_{A4307}$ | $R_{B3}$ | $R_{B6}$ | N | S |
| $L_{A4308}$ | $R_{B4}$ | $R_{B6}$ | N | S |
| $L_{A4309}$ | $R_{B7}$ | $R_{B6}$ | N | S |
| $L_{A4310}$ | $R_{B10}$ | $R_{B6}$ | N | S |
| $L_{A4311}$ | $R_{A3}$ | $R_{B6}$ | N | S |
| $L_{A4312}$ | $R_{A34}$ | $R_{B6}$ | N | S |
| $L_{A4313}$ | H | $R_{B6}$ | N | O |
| $L_{A4314}$ | $R_{B1}$ | $R_{B6}$ | N | O |
| $L_{A4315}$ | $R_{B3}$ | $R_{B6}$ | N | O |
| $L_{A4316}$ | $R_{B4}$ | $R_{B6}$ | N | O |
| $L_{A4317}$ | $R_{B7}$ | $R_{B6}$ | N | O |
| $L_{A4318}$ | $R_{B10}$ | $R_{B6}$ | N | O |
| $L_{A4319}$ | $R_{A3}$ | $R_{B6}$ | N | O |
| $L_{A4320}$ | $R_{A34}$ | $R_{B6}$ | N | O |
| $L_{A4321}$ | H | $R_{B6}$ | N | $NCH_3$ |
| $L_{A4322}$ | $R_{B1}$ | $R_{B6}$ | N | $NCH_3$ |
| $L_{A4323}$ | $R_{B3}$ | $R_{B6}$ | N | $NCH_3$ |
| $L_{A4324}$ | $R_{B4}$ | $R_{B6}$ | N | $NCH_3$ |
| $L_{A4325}$ | $R_{B7}$ | $R_{B6}$ | N | $NCH_3$ |
| $L_{A4326}$ | $R_{B10}$ | $R_{B6}$ | N | $NCH_3$ |
| $L_{A4327}$ | $R_{A3}$ | $R_{B6}$ | N | $NCH_3$ |
| $L_{A4328}$ | $R_{A34}$ | $R_{B6}$ | N | $NCH_3$ |
| $L_{A4329}$ | H | $R_{B6}$ | N | $C(CH_3)_2$ |
| $L_{A4330}$ | $R_{B1}$ | $R_{B6}$ | N | $C(CH_3)_2$ |
| $L_{A4331}$ | $R_{B3}$ | $R_{B6}$ | N | $C(CH_3)_2$ |
| $L_{A4332}$ | $R_{B4}$ | $R_{B6}$ | N | $C(CH_3)_2$ |
| $L_{A4333}$ | $R_{B7}$ | $R_{B6}$ | N | $C(CH_3)_2$ |
| $L_{A4334}$ | $R_{B10}$ | $R_{B6}$ | N | $C(CH_3)_2$ |
| $L_{A4335}$ | $R_{A3}$ | $R_{B6}$ | N | $C(CH_3)_2$ |
| $L_{A4336}$ | $R_{A34}$ | $R_{B6}$ | N | $C(CH_3)_2$ |
| $L_{A4337}$ | H | $R_{B6}$ | N | $Si(CH_3)_2$ |
| $L_{A4338}$ | $R_{B1}$ | $R_{B6}$ | N | $Si(CH_3)_2$ |
| $L_{A4339}$ | $R_{B3}$ | $R_{B6}$ | N | $Si(CH_3)_2$ |
| $L_{A4340}$ | $R_{B4}$ | $R_{B6}$ | N | $Si(CH_3)_2$ |
| $L_{A4341}$ | $R_{B7}$ | $R_{B6}$ | N | $Si(CH_3)_2$ |
| $L_{A4342}$ | $R_{B10}$ | $R_{B6}$ | N | $Si(CH_3)_2$ |
| $L_{A4343}$ | $R_{A3}$ | $R_{B6}$ | N | $Si(CH_3)_2$ |
| $L_{A4344}$ | $R_{A34}$ | $R_{B6}$ | N | $Si(CH_3)_2$ |

wherein $L_{A4345}$ through $L_{A4464}$ have a structure of Formula XXX:

Formula XXX

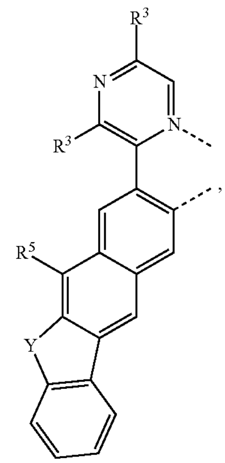

wherein $R^3$, $R^5$, and Y are defined as provided below:

| Ligand | $R^5$ | $R^3$ | Y | Ligand | $R^5$ | $R^3$ | Y |
|---|---|---|---|---|---|---|---|
| $L_{A4345}$ | H | H | S | $L_{A4405}$ | $R_{B1}$ | $R_{B4}$ | $NCH_3$ |
| $L_{A4346}$ | H | $R_{B1}$ | S | $L_{A4406}$ | $R_{B1}$ | $R_{B5}$ | $NCH_3$ |
| $L_{A4347}$ | H | $R_{B2}$ | S | $L_{A4407}$ | $R_{B1}$ | $R_{A34}$ | $NCH_3$ |
| $L_{A4348}$ | H | $R_{B3}$ | S | $L_{A4408}$ | $R_{B1}$ | $R_{A52}$ | $NCH_3$ |
| $L_{A4349}$ | H | $R_{B4}$ | S | $L_{A4409}$ | $R_{B1}$ | H | $C(CH_3)_2$ |
| $L_{A4350}$ | H | $R_{B5}$ | S | $L_{A4410}$ | $R_{B1}$ | $R_{B1}$ | $C(CH_3)_2$ |
| $L_{A4351}$ | H | $R_{A34}$ | S | $L_{A4411}$ | $R_{B1}$ | $R_{B2}$ | $C(CH_3)_2$ |
| $L_{A4352}$ | H | $R_{A52}$ | S | $L_{A4412}$ | $R_{B1}$ | $R_{B3}$ | $C(CH_3)_2$ |
| $L_{A4353}$ | H | H | O | $L_{A4413}$ | $R_{B1}$ | $R_{B4}$ | $C(CH_3)_2$ |
| $L_{A4354}$ | H | $R_{B1}$ | O | $L_{A4414}$ | $R_{B1}$ | $R_{B5}$ | $C(CH_3)_2$ |
| $L_{A4355}$ | H | $R_{B2}$ | O | $L_{A4415}$ | $R_{B1}$ | $R_{A34}$ | $C(CH_3)_2$ |
| $L_{A4356}$ | H | $R_{B3}$ | O | $L_{A4416}$ | $R_{B1}$ | $R_{A52}$ | $C(CH_3)_2$ |
| $L_{A4357}$ | H | $R_{B4}$ | O | $L_{A4417}$ | $R_{B1}$ | H | $Si(CH_3)_2$ |
| $L_{A4358}$ | H | $R_{B5}$ | O | $L_{A4418}$ | $R_{B1}$ | $R_{B1}$ | $Si(CH_3)_2$ |
| $L_{A4359}$ | H | $R_{A34}$ | O | $L_{A4419}$ | $R_{B1}$ | $R_{B2}$ | $Si(CH_3)_2$ |
| $L_{A4360}$ | H | $R_{A52}$ | O | $L_{A4420}$ | $R_{B1}$ | $R_{B3}$ | $Si(CH_3)_2$ |
| $L_{A4361}$ | H | H | $NCH_3$ | $L_{A4421}$ | $R_{B1}$ | $R_{B4}$ | $Si(CH_3)_2$ |
| $L_{A4362}$ | H | $R_{B1}$ | $NCH_3$ | $L_{A4422}$ | $R_{B1}$ | $R_{B5}$ | $Si(CH_3)_2$ |
| $L_{A4363}$ | H | $R_{B2}$ | $NCH_3$ | $L_{A4423}$ | $R_{B1}$ | $R_{A34}$ | $Si(CH_3)_2$ |
| $L_{A4364}$ | H | $R_{B3}$ | $NCH_3$ | $L_{A4424}$ | $R_{B1}$ | $R_{A52}$ | $Si(CH_3)_2$ |
| $L_{A4365}$ | H | $R_{B4}$ | $NCH_3$ | $L_{A4425}$ | $R_{B6}$ | H | S |
| $L_{A4366}$ | H | $R_{B5}$ | $NCH_3$ | $L_{A4426}$ | $R_{B6}$ | $R_{B1}$ | S |
| $L_{A4367}$ | H | $R_{A34}$ | $NCH_3$ | $L_{A4427}$ | $R_{B6}$ | $R_{B2}$ | S |
| $L_{A4368}$ | H | $R_{A52}$ | $NCH_3$ | $L_{A4428}$ | $R_{B6}$ | $R_{B3}$ | S |
| $L_{A4369}$ | H | H | $C(CH_3)_2$ | $L_{A4429}$ | $R_{B6}$ | $R_{B4}$ | S |
| $L_{A4370}$ | H | $R_{B1}$ | $C(CH_3)_2$ | $L_{A4430}$ | $R_{B6}$ | $R_{B5}$ | S |
| $L_{A4371}$ | H | $R_{B2}$ | $C(CH_3)_2$ | $L_{A4431}$ | $R_{B6}$ | $R_{A34}$ | S |
| $L_{A4372}$ | H | $R_{B3}$ | $C(CH_3)_2$ | $L_{A4432}$ | $R_{B6}$ | $R_{A52}$ | S |
| $L_{A4373}$ | H | $R_{B4}$ | $C(CH_3)_2$ | $L_{A4433}$ | $R_{B6}$ | H | O |
| $L_{A4374}$ | H | $R_{B5}$ | $C(CH_3)_2$ | $L_{A4434}$ | $R_{B6}$ | $R_{B1}$ | O |
| $L_{A4375}$ | H | $R_{A34}$ | $C(CH_3)_2$ | $L_{A4435}$ | $R_{B6}$ | $R_{B2}$ | O |
| $L_{A4376}$ | H | $R_{A52}$ | $C(CH_3)_2$ | $L_{A4436}$ | $R_{B6}$ | $R_{B3}$ | O |
| $L_{A4377}$ | H | H | $Si(CH_3)_2$ | $L_{A4437}$ | $R_{B6}$ | $R_{B4}$ | O |
| $L_{A4378}$ | H | $R_{B1}$ | $Si(CH_3)_2$ | $L_{A4438}$ | $R_{B6}$ | $R_{B5}$ | O |
| $L_{A4379}$ | H | $R_{B2}$ | $Si(CH_3)_2$ | $L_{A4439}$ | $R_{B6}$ | $R_{A34}$ | O |
| $L_{A4380}$ | H | $R_{B3}$ | $Si(CH_3)_2$ | $L_{A4440}$ | $R_{B6}$ | $R_{A52}$ | O |
| $L_{A4381}$ | H | $R_{B4}$ | $Si(CH_3)_2$ | $L_{A4441}$ | $R_{B6}$ | H | $NCH_3$ |
| $L_{A4382}$ | H | $R_{B5}$ | $Si(CH_3)_2$ | $L_{A4442}$ | $R_{B6}$ | $R_{B1}$ | $NCH_3$ |
| $L_{A4383}$ | H | $R_{A34}$ | $Si(CH_3)_2$ | $L_{A4443}$ | $R_{B6}$ | $R_{B2}$ | $NCH_3$ |
| $L_{A4384}$ | H | $R_{A52}$ | $Si(CH_3)_2$ | $L_{A4444}$ | $R_{B6}$ | $R_{B3}$ | $NCH_3$ |
| $L_{A4385}$ | $R_{B1}$ | H | S | $L_{A4445}$ | $R_{B6}$ | $R_{B4}$ | $NCH_3$ |
| $L_{A4386}$ | $R_{B1}$ | $R_{B1}$ | S | $L_{A4446}$ | $R_{B6}$ | $R_{B5}$ | $NCH_3$ |
| $L_{A4387}$ | $R_{B1}$ | $R_{B2}$ | S | $L_{A4447}$ | $R_{B6}$ | $R_{A34}$ | $NCH_3$ |
| $L_{A4388}$ | $R_{B1}$ | $R_{B3}$ | S | $L_{A4448}$ | $R_{B6}$ | $R_{A52}$ | $NCH_3$ |
| $L_{A4389}$ | $R_{B1}$ | $R_{B4}$ | S | $L_{A4449}$ | $R_{B6}$ | H | $C(CH_3)_2$ |
| $L_{A4390}$ | $R_{B1}$ | $R_{B5}$ | S | $L_{A4450}$ | $R_{B6}$ | $R_{B1}$ | $C(CH_3)_2$ |
| $L_{A4391}$ | $R_{B1}$ | $R_{A34}$ | S | $L_{A4451}$ | $R_{B6}$ | $R_{B2}$ | $C(CH_3)_2$ |

-continued

| Ligand | $R^5$ | $R^3$ | Y | Ligand | $R^5$ | $R^3$ | Y |
|---|---|---|---|---|---|---|---|
| $L_{A4392}$ | $R_{B1}$ | $R_{A52}$ | S | $L_{A4452}$ | $R_{B6}$ | $R_{B3}$ | $C(CH_3)_2$ |
| $L_{A4393}$ | $R_{B1}$ | H | O | $L_{A4453}$ | $R_{B6}$ | $R_{B4}$ | $C(CH_3)_2$ |
| $L_{A4394}$ | $R_{B1}$ | $R_{B1}$ | O | $L_{A4454}$ | $R_{B6}$ | $R_{B5}$ | $C(CH_3)_2$ |
| $L_{A4395}$ | $R_{B1}$ | $R_{B2}$ | O | $L_{A4455}$ | $R_{B6}$ | $R_{A34}$ | $C(CH_3)_2$ |
| $L_{A4396}$ | $R_{B1}$ | $R_{B3}$ | O | $L_{A4456}$ | $R_{B6}$ | $R_{A52}$ | $C(CH_3)_2$ |
| $L_{A4397}$ | $R_{B1}$ | $R_{B4}$ | O | $L_{A4457}$ | $R_{B6}$ | H | $Si(CH_3)_2$ |
| $L_{A4398}$ | $R_{B1}$ | $R_{B5}$ | O | $L_{A4458}$ | $R_{B6}$ | $R_{B1}$ | $Si(CH_3)_2$ |
| $L_{A4399}$ | $R_{B1}$ | $R_{A34}$ | O | $L_{A4459}$ | $R_{B6}$ | $R_{B2}$ | $Si(CH_3)_2$ |
| $L_{A4400}$ | $R_{B1}$ | $R_{A52}$ | O | $L_{A4460}$ | $R_{B6}$ | $R_{B3}$ | $Si(CH_3)_2$ |
| $L_{A4401}$ | $R_{B1}$ | H | $NCH_3$ | $L_{A4461}$ | $R_{B6}$ | $R_{B4}$ | $Si(CH_3)_2$ |
| $L_{A4402}$ | $R_{B1}$ | $R_{B1}$ | $NCH_3$ | $L_{A4462}$ | $R_{B6}$ | $R_{B5}$ | $Si(CH_3)_2$ |
| $L_{A4403}$ | $R_{B1}$ | $R_{B2}$ | $NCH_3$ | $L_{A4463}$ | $R_{B6}$ | $R_{A34}$ | $Si(CH_3)_2$ |
| $L_{A4404}$ | $R_{B1}$ | $R_{B3}$ | $NCH_3$ | $L_{A4464}$ | $R_{B6}$ | $R_{A52}$ | $Si(CH_3)_2$ |

wherein $L_{A4465}$ through $L_{A4560}$ have a structure of Formula XXXI:

Formula XXXI

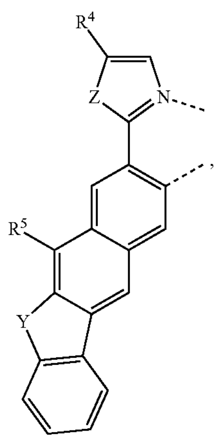

wherein $R^4$, $R^5$, Y, and Z are defined as provided below:

| Ligand | $R^5$ | $R^4$ | Y | Z | Ligand | $R^5$ | $R^4$ | Y | Z |
|---|---|---|---|---|---|---|---|---|---|
| $L_{A4465}$ | H | H | S | S | $L_{A4513}$ | $R_{B6}$ | H | S | S |
| $L_{A4466}$ | H | $R_{B1}$ | S | S | $L_{A4514}$ | $R_{B6}$ | $R_{B1}$ | S | S |
| $L_{A4467}$ | H | $R_{B3}$ | S | S | $L_{A4515}$ | $R_{B6}$ | $R_{B3}$ | S | S |
| $L_{A4468}$ | H | $R_{B4}$ | S | S | $L_{A4516}$ | $R_{B6}$ | $R_{B4}$ | S | S |
| $L_{A4469}$ | H | $R_{B7}$ | S | S | $L_{A4517}$ | $R_{B6}$ | $R_{B7}$ | S | S |
| $L_{A4470}$ | H | $R_{B10}$ | S | S | $L_{A4518}$ | $R_{B6}$ | $R_{B10}$ | S | S |
| $L_{A4471}$ | H | $R_{A3}$ | S | S | $L_{A4519}$ | $R_{B6}$ | $R_{A3}$ | S | S |
| $L_{A4472}$ | H | $R_{A34}$ | S | S | $L_{A4520}$ | $R_{B6}$ | $R_{A34}$ | S | S |
| $L_{A4473}$ | H | H | S | O | $L_{A4521}$ | $R_{B6}$ | H | S | O |
| $L_{A4474}$ | H | $R_{B1}$ | S | O | $L_{A4522}$ | $R_{B6}$ | $R_{B1}$ | S | O |
| $L_{A4475}$ | H | $R_{B3}$ | S | O | $L_{A4523}$ | $R_{B6}$ | $R_{B3}$ | S | O |
| $L_{A4476}$ | H | $R_{B4}$ | S | O | $L_{A4524}$ | $R_{B6}$ | $R_{B4}$ | S | O |
| $L_{A4477}$ | H | $R_{B7}$ | S | O | $L_{A4525}$ | $R_{B6}$ | $R_{B7}$ | S | O |
| $L_{A4478}$ | H | $R_{B10}$ | S | O | $L_{A4526}$ | $R_{B6}$ | $R_{B10}$ | S | O |
| $L_{A4479}$ | H | $R_{A3}$ | S | O | $L_{A4527}$ | $R_{B6}$ | $R_{A3}$ | S | O |
| $L_{A4480}$ | H | $R_{A34}$ | S | O | $L_{A4528}$ | $R_{B6}$ | $R_{A34}$ | S | O |
| $L_{A4481}$ | H | H | S | $NCH_3$ | $L_{A4529}$ | $R_{B6}$ | H | S | $NCH_3$ |
| $L_{A4482}$ | H | $R_{B1}$ | S | $NCH_3$ | $L_{A4530}$ | $R_{B6}$ | $R_{B1}$ | S | $NCH_3$ |
| $L_{A4483}$ | H | $R_{B3}$ | S | $NCH_3$ | $L_{A4531}$ | $R_{B6}$ | $R_{B3}$ | S | $NCH_3$ |
| $L_{A4484}$ | H | $R_{B4}$ | S | $NCH_3$ | $L_{A4532}$ | $R_{B6}$ | $R_{B4}$ | S | $NCH_3$ |
| $L_{A4485}$ | H | $R_{B7}$ | S | $NCH_3$ | $L_{A4533}$ | $R_{B6}$ | $R_{B7}$ | S | $NCH_3$ |
| $L_{A4486}$ | H | $R_{B10}$ | S | $NCH_3$ | $L_{A4534}$ | $R_{B6}$ | $R_{B10}$ | S | $NCH_3$ |
| $L_{A4487}$ | H | $R_{A3}$ | S | $NCH_3$ | $L_{A4535}$ | $R_{B6}$ | $R_{A3}$ | S | $NCH_3$ |
| $L_{A4488}$ | H | $R_{A34}$ | S | $NCH_3$ | $L_{A4536}$ | $R_{B6}$ | $R_{A34}$ | S | $NCH_3$ |
| $L_{A4489}$ | H | H | O | S | $L_{A4537}$ | $R_{B6}$ | H | O | S |
| $L_{A4490}$ | H | $R_{B1}$ | O | S | $L_{A4538}$ | $R_{B6}$ | $R_{B1}$ | O | S |
| $L_{A4491}$ | H | $R_{B3}$ | O | S | $L_{A4539}$ | $R_{B6}$ | $R_{B3}$ | O | S |
| $L_{A4492}$ | H | $R_{B4}$ | O | S | $L_{A4540}$ | $R_{B6}$ | $R_{B4}$ | O | S |
| $L_{A4493}$ | H | $R_{B7}$ | O | S | $L_{A4541}$ | $R_{B6}$ | $R_{B7}$ | O | S |

-continued

| Ligand | $R^5$ | $R^4$ | Y | Z | Ligand | $R^5$ | $R^4$ | Y | Z |
|---|---|---|---|---|---|---|---|---|---|
| $L_{A4494}$ | H | $R_{B10}$ | O | S | $L_{A4542}$ | $R_{B6}$ | $R_{B10}$ | O | S |
| $L_{A4495}$ | H | $R_{A3}$ | O | S | $L_{A4543}$ | $R_{B6}$ | $R_{A3}$ | O | S |
| $L_{A4496}$ | H | $R_{A34}$ | O | S | $L_{A4544}$ | $R_{B6}$ | $R_{A34}$ | O | S |
| $L_{A4497}$ | H | H | O | O | $L_{A4545}$ | $R_{B6}$ | H | O | O |
| $L_{A4498}$ | H | $R_{B1}$ | O | O | $L_{A4546}$ | $R_{B6}$ | $R_{B1}$ | O | O |
| $L_{A4499}$ | H | $R_{B3}$ | O | O | $L_{A4547}$ | $R_{B6}$ | $R_{B3}$ | O | O |
| $L_{A4500}$ | H | $R_{B4}$ | O | O | $L_{A4548}$ | $R_{B6}$ | $R_{B4}$ | O | O |
| $L_{A4501}$ | H | $R_{B7}$ | O | O | $L_{A4549}$ | $R_{B6}$ | $R_{B7}$ | O | O |
| $L_{A4502}$ | H | $R_{B10}$ | O | O | $L_{A4550}$ | $R_{B6}$ | $R_{B10}$ | O | O |
| $L_{A4503}$ | H | $R_{A3}$ | O | O | $L_{A4551}$ | $R_{B6}$ | $R_{A3}$ | O | O |
| $L_{A4504}$ | H | $R_{A34}$ | O | O | $L_{A4552}$ | $R_{B6}$ | $R_{A34}$ | O | O |
| $L_{A4505}$ | H | H | O | $NCH_3$ | $L_{A4553}$ | $R_{B6}$ | H | O | $NCH_3$ |
| $L_{A4506}$ | H | $R_{B1}$ | O | $NCH_3$ | $L_{A4554}$ | $R_{B6}$ | $R_{B1}$ | O | $NCH_3$ |
| $L_{A4507}$ | H | $R_{B3}$ | O | $NCH_3$ | $L_{A4555}$ | $R_{B6}$ | $R_{B3}$ | O | $NCH_3$ |
| $L_{A4508}$ | H | $R_{B4}$ | O | $NCH_3$ | $L_{A4556}$ | $R_{B6}$ | $R_{B4}$ | O | $NCH_3$ |
| $L_{A4509}$ | H | $R_{B7}$ | O | $NCH_3$ | $L_{A4557}$ | $R_{B6}$ | $R_{B7}$ | O | $NCH_3$ |
| $L_{A4510}$ | H | $R_{B10}$ | O | $NCH_3$ | $L_{A4558}$ | $R_{B6}$ | $R_{B10}$ | O | $NCH_3$ |
| $L_{A4511}$ | H | $R_{A3}$ | O | $NCH_3$ | $L_{A4559}$ | $R_{B6}$ | $R_{A3}$ | O | $NCH_3$ |
| $L_{A4512}$ | H | $R_{A34}$ | O | $NCH_3$ | $L_{A4560}$ | $R_{B6}$ | $R_{A34}$ | O | $NCH_3$ |

wherein $L_{A4561}$ through $L_{A4780}$ have a structure of Formula XXXII:

Formula XXXII

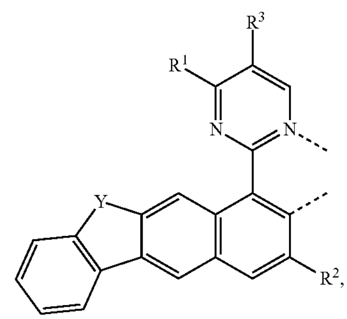

wherein $R^1$, $R^2$, $R^3$, and Y are defined as provided below:

| Ligand | $R^1$ | $R^3$ | $R^2$ | Y | Ligand | $R^1$ | $R^3$ | $R^2$ | Y |
|---|---|---|---|---|---|---|---|---|---|
| $L_{A4561}$ | H | H | H | O | $L_{A4671}$ | H | H | $R_{B1}$ | O |
| $L_{A4562}$ | $R_{B1}$ | $R_{B1}$ | H | O | $L_{A4672}$ | $R_{B1}$ | $R_{B1}$ | $R_{B1}$ | O |
| $L_{A4563}$ | $R_{B3}$ | $R_{B3}$ | H | O | $L_{A4673}$ | $R_{B3}$ | $R_{B3}$ | $R_{B1}$ | O |
| $L_{A4564}$ | $R_{B4}$ | $R_{B4}$ | H | O | $L_{A4674}$ | $R_{B4}$ | $R_{B4}$ | $R_{B1}$ | O |
| $L_{A4565}$ | $R_{B7}$ | $R_{B7}$ | H | O | $L_{A4675}$ | $R_{B7}$ | $R_{B7}$ | $R_{B1}$ | O |
| $L_{A4566}$ | $R_{B10}$ | $R_{B10}$ | H | O | $L_{A4676}$ | $R_{B10}$ | $R_{B10}$ | $R_{B1}$ | O |
| $L_{A4567}$ | $R_{A3}$ | $R_{A3}$ | H | O | $L_{A4677}$ | $R_{A3}$ | $R_{A3}$ | $R_{B1}$ | O |
| $L_{A4568}$ | $R_{A34}$ | $R_{A34}$ | H | O | $L_{A4678}$ | $R_{A34}$ | $R_{A34}$ | $R_{B1}$ | O |
| $L_{A4569}$ | $R_{B1}$ | H | H | O | $L_{A4679}$ | $R_{B1}$ | H | $R_{B1}$ | O |
| $L_{A4570}$ | $R_{B3}$ | H | H | O | $L_{A4680}$ | $R_{B3}$ | H | $R_{B1}$ | O |
| $L_{A4571}$ | $R_{B4}$ | H | H | O | $L_{A4681}$ | $R_{B4}$ | H | $R_{B1}$ | O |
| $L_{A4572}$ | $R_{B7}$ | H | H | O | $L_{A4682}$ | $R_{B7}$ | H | $R_{B1}$ | O |
| $L_{A4573}$ | $R_{B10}$ | H | H | O | $L_{A4683}$ | $R_{B10}$ | H | $R_{B1}$ | O |
| $L_{A4574}$ | $R_{A3}$ | H | H | O | $L_{A4684}$ | $R_{A3}$ | H | $R_{B1}$ | O |
| $L_{A4575}$ | $R_{A34}$ | H | H | O | $L_{A4685}$ | $R_{A34}$ | H | $R_{B1}$ | O |
| $L_{A4576}$ | H | $R_{B1}$ | H | O | $L_{A4686}$ | H | $R_{B1}$ | $R_{B1}$ | O |
| $L_{A4577}$ | H | $R_{B3}$ | H | O | $L_{A4687}$ | H | $R_{B3}$ | $R_{B1}$ | O |
| $L_{A4578}$ | H | $R_{B4}$ | H | O | $L_{A4688}$ | H | $R_{B4}$ | $R_{B1}$ | O |
| $L_{A4579}$ | H | $R_{B7}$ | H | O | $L_{A4689}$ | H | $R_{B7}$ | $R_{B1}$ | O |
| $L_{A4580}$ | H | $R_{B10}$ | H | O | $L_{A4690}$ | H | $R_{B10}$ | $R_{B1}$ | O |
| $L_{A4581}$ | H | $R_{A3}$ | H | O | $L_{A4691}$ | H | $R_{A3}$ | $R_{B1}$ | O |
| $L_{A4582}$ | H | $R_{A34}$ | H | O | $L_{A4692}$ | H | $R_{A34}$ | $R_{B1}$ | O |
| $L_{A4583}$ | H | H | H | S | $L_{A4693}$ | H | H | $R_{B1}$ | S |

-continued

| Ligand | $R^1$ | $R^3$ | $R^2$ | Y | Ligand | $R^1$ | $R^3$ | $R^2$ | Y |
|---|---|---|---|---|---|---|---|---|---|
| $L_{A44584}$ | $R_{B1}$ | $R_{B1}$ | H | S | $L_{A44694}$ | $R_{B1}$ | $R_{B1}$ | $R_{B1}$ | S |
| $L_{A44585}$ | $R_{B3}$ | $R_{B3}$ | H | S | $L_{A44695}$ | $R_{B3}$ | $R_{B3}$ | $R_{B1}$ | S |
| $L_{A44586}$ | $R_{B4}$ | $R_{B4}$ | H | S | $L_{A44696}$ | $R_{B4}$ | $R_{B4}$ | $R_{B1}$ | S |
| $L_{A44587}$ | $R_{B7}$ | $R_{B7}$ | H | S | $L_{A44697}$ | $R_{B7}$ | $R_{B7}$ | $R_{B1}$ | S |
| $L_{A44588}$ | $R_{B10}$ | $R_{B10}$ | H | S | $L_{A44698}$ | $R_{B10}$ | $R_{B10}$ | $R_{B1}$ | S |
| $L_{A44589}$ | $R_{A3}$ | $R_{A3}$ | H | S | $L_{A44699}$ | $R_{A3}$ | $R_{A3}$ | $R_{B1}$ | S |
| $L_{A44590}$ | $R_{A434}$ | $R_{A434}$ | H | S | $L_{A44700}$ | $R_{A434}$ | $R_{A434}$ | $R_{B1}$ | S |
| $L_{A44591}$ | $R_{B1}$ | H | H | S | $L_{A44701}$ | $R_{B1}$ | H | $R_{B1}$ | S |
| $L_{A44592}$ | $R_{B3}$ | H | H | S | $L_{A44702}$ | $R_{B3}$ | H | $R_{B1}$ | S |
| $L_{A44593}$ | $R_{B4}$ | H | H | S | $L_{A44703}$ | $R_{B4}$ | H | $R_{B1}$ | S |
| $L_{A44594}$ | $R_{B7}$ | H | H | S | $L_{A44704}$ | $R_{B7}$ | H | $R_{B1}$ | S |
| $L_{A44595}$ | $R_{B10}$ | H | H | S | $L_{A44705}$ | $R_{B10}$ | H | $R_{B1}$ | S |
| $L_{A44596}$ | $R_{A3}$ | H | H | S | $L_{A44706}$ | $R_{A3}$ | H | $R_{B1}$ | S |
| $L_{A44597}$ | $R_{A434}$ | H | H | S | $L_{A44707}$ | $R_{A434}$ | H | $R_{B1}$ | S |
| $L_{A44598}$ | H | $R_{B1}$ | H | S | $L_{A44708}$ | H | $R_{B1}$ | $R_{B1}$ | S |
| $L_{A44599}$ | H | $R_{B3}$ | H | S | $L_{A44709}$ | H | $R_{B3}$ | $R_{B1}$ | S |
| $L_{A44600}$ | H | $R_{B4}$ | H | S | $L_{A44710}$ | H | $R_{B4}$ | $R_{B1}$ | S |
| $L_{A44601}$ | H | $R_{B7}$ | H | S | $L_{A44711}$ | H | $R_{B7}$ | $R_{B1}$ | S |
| $L_{A44602}$ | H | $R_{B10}$ | H | S | $L_{A44712}$ | H | $R_{B10}$ | $R_{B1}$ | S |
| $L_{A44603}$ | H | $R_{A3}$ | H | S | $L_{A44713}$ | H | $R_{A3}$ | $R_{B1}$ | S |
| $L_{A44604}$ | H | $R_{A434}$ | H | S | $L_{A44714}$ | H | $R_{A434}$ | $R_{B1}$ | S |
| $L_{A44605}$ | H | H | H | $NCH_3$ | $L_{A44715}$ | H | H | $R_{B1}$ | $NCH_3$ |
| $L_{A44606}$ | $R_{B1}$ | $R_{B1}$ | H | $NCH_3$ | $L_{A44716}$ | $R_{B1}$ | $R_{B1}$ | $R_{B1}$ | $NCH_3$ |
| $L_{A44607}$ | $R_{B3}$ | $R_{B3}$ | H | $NCH_3$ | $L_{A44717}$ | $R_{B3}$ | $R_{B3}$ | $R_{B1}$ | $NCH_3$ |
| $L_{A44608}$ | $R_{B4}$ | $R_{B4}$ | H | $NCH_3$ | $L_{A44718}$ | $R_{B4}$ | $R_{B4}$ | $R_{B1}$ | $NCH_3$ |
| $L_{A44609}$ | $R_{B7}$ | $R_{B7}$ | H | $NCH_3$ | $L_{A44719}$ | $R_{B7}$ | $R_{B7}$ | $R_{B1}$ | $NCH_3$ |
| $L_{A44610}$ | $R_{B10}$ | $R_{B10}$ | H | $NCH_3$ | $L_{A44720}$ | $R_{B10}$ | $R_{B10}$ | $R_{B1}$ | $NCH_3$ |
| $L_{A44611}$ | $R_{A3}$ | $R_{A3}$ | H | $NCH_3$ | $L_{A44721}$ | $R_{A3}$ | $R_{A3}$ | $R_{B1}$ | $NCH_3$ |
| $L_{A44612}$ | $R_{A434}$ | $R_{A434}$ | H | $NCH_3$ | $L_{A44722}$ | $R_{A434}$ | $R_{A434}$ | $R_{B1}$ | $NCH_3$ |
| $L_{A44613}$ | $R_{B1}$ | H | H | $NCH_3$ | $L_{A44723}$ | $R_{B1}$ | H | $R_{B1}$ | $NCH_3$ |
| $L_{A44614}$ | $R_{B3}$ | H | H | $NCH_3$ | $L_{A44724}$ | $R_{B3}$ | H | $R_{B1}$ | $NCH_3$ |
| $L_{A44615}$ | $R_{B4}$ | H | H | $NCH_3$ | $L_{A44725}$ | $R_{B4}$ | H | $R_{B1}$ | $NCH_3$ |
| $L_{A44616}$ | $R_{B7}$ | H | H | $NCH_3$ | $L_{A44726}$ | $R_{B7}$ | H | $R_{B1}$ | $NCH_3$ |
| $L_{A44617}$ | $R_{B10}$ | H | H | $NCH_3$ | $L_{A44727}$ | $R_{B10}$ | H | $R_{B1}$ | $NCH_3$ |
| $L_{A44618}$ | $R_{A3}$ | H | H | $NCH_3$ | $L_{A44728}$ | $R_{A3}$ | H | $R_{B1}$ | $NCH_3$ |
| $L_{A44619}$ | $R_{A434}$ | H | H | $NCH_3$ | $L_{A44729}$ | $R_{A434}$ | H | $R_{B1}$ | $NCH_3$ |
| $L_{A44620}$ | H | $R_{B1}$ | H | $NCH_3$ | $L_{A44730}$ | H | $R_{B1}$ | $R_{B1}$ | $NCH_3$ |
| $L_{A44621}$ | H | $R_{B3}$ | H | $NCH_3$ | $L_{A44731}$ | H | $R_{B3}$ | $R_{B1}$ | $NCH_3$ |
| $L_{A44622}$ | H | $R_{B4}$ | H | $NCH_3$ | $L_{A44732}$ | H | $R_{B4}$ | $R_{B1}$ | $NCH_3$ |
| $L_{A44623}$ | H | $R_{B7}$ | H | $NCH_3$ | $L_{A44733}$ | H | $R_{B7}$ | $R_{B1}$ | $NCH_3$ |
| $L_{A44624}$ | H | $R_{B10}$ | H | $NCH_3$ | $L_{A44734}$ | H | $R_{B10}$ | $R_{B1}$ | $NCH_3$ |
| $L_{A44625}$ | H | $R_{A3}$ | H | $NCH_3$ | $L_{A44735}$ | H | $R_{A3}$ | $R_{B1}$ | $NCH_3$ |
| $L_{A44626}$ | H | $R_{A434}$ | H | $NCH_3$ | $L_{A44736}$ | H | $R_{A434}$ | $R_{B1}$ | $NCH_3$ |
| $L_{A44627}$ | H | H | H | $C(CH_3)_2$ | $L_{A44737}$ | H | H | $R_{B1}$ | $C(CH_3)_2$ |
| $L_{A44628}$ | $R_{B1}$ | $R_{B1}$ | H | $C(CH_3)_2$ | $L_{A44738}$ | $R_{B1}$ | $R_{B1}$ | $R_{B1}$ | $C(CH_3)_2$ |
| $L_{A44629}$ | $R_{B3}$ | $R_{B3}$ | H | $C(CH_3)_2$ | $L_{A44739}$ | $R_{B3}$ | $R_{B3}$ | $R_{B1}$ | $C(CH_3)_2$ |
| $L_{A44630}$ | $R_{B4}$ | $R_{B4}$ | H | $C(CH_3)_2$ | $L_{A44740}$ | $R_{B4}$ | $R_{B4}$ | $R_{B1}$ | $C(CH_3)_2$ |
| $L_{A44631}$ | $R_{B7}$ | $R_{B7}$ | H | $C(CH_3)_2$ | $L_{A44741}$ | $R_{B7}$ | $R_{B7}$ | $R_{B1}$ | $C(CH_3)_2$ |
| $L_{A44632}$ | $R_{B10}$ | $R_{B10}$ | H | $C(CH_3)_2$ | $L_{A44742}$ | $R_{B10}$ | $R_{B10}$ | $R_{B1}$ | $C(CH_3)_2$ |
| $L_{A44633}$ | $R_{A3}$ | $R_{A3}$ | H | $C(CH_3)_2$ | $L_{A44743}$ | $R_{A3}$ | $R_{A3}$ | $R_{B1}$ | $C(CH_3)_2$ |
| $L_{A44634}$ | $R_{A434}$ | $R_{A434}$ | H | $C(CH_3)_2$ | $L_{A44744}$ | $R_{A434}$ | $R_{A434}$ | $R_{B1}$ | $C(CH_3)_2$ |
| $L_{A44635}$ | $R_{B1}$ | H | H | $C(CH_3)_2$ | $L_{A44745}$ | $R_{B1}$ | H | $R_{B1}$ | $C(CH_3)_2$ |
| $L_{A44636}$ | $R_{B3}$ | H | H | $C(CH_3)_2$ | $L_{A44746}$ | $R_{B3}$ | H | $R_{B1}$ | $C(CH_3)_2$ |
| $L_{A44637}$ | $R_{B4}$ | H | H | $C(CH_3)_2$ | $L_{A44747}$ | $R_{B4}$ | H | $R_{B1}$ | $C(CH_3)_2$ |
| $L_{A44638}$ | $R_{B7}$ | H | H | $C(CH_3)_2$ | $L_{A44748}$ | $R_{B7}$ | H | $R_{B1}$ | $C(CH_3)_2$ |
| $L_{A44639}$ | $R_{B10}$ | H | H | $C(CH_3)_2$ | $L_{A44749}$ | $R_{B10}$ | H | $R_{B1}$ | $C(CH_3)_2$ |
| $L_{A44640}$ | $R_{A3}$ | H | H | $C(CH_3)_2$ | $L_{A44750}$ | $R_{A3}$ | H | $R_{B1}$ | $C(CH_3)_2$ |
| $L_{A44641}$ | $R_{A434}$ | H | H | $C(CH_3)_2$ | $L_{A44751}$ | $R_{A434}$ | H | $R_{B1}$ | $C(CH_3)_2$ |
| $L_{A44642}$ | H | $R_{B1}$ | H | $C(CH_3)_2$ | $L_{A44752}$ | H | $R_{B1}$ | $R_{B1}$ | $C(CH_3)_2$ |
| $L_{A44643}$ | H | $R_{B3}$ | H | $C(CH_3)_2$ | $L_{A44753}$ | H | $R_{B3}$ | $R_{B1}$ | $C(CH_3)_2$ |
| $L_{A44644}$ | H | $R_{B4}$ | H | $C(CH_3)_2$ | $L_{A44754}$ | H | $R_{B4}$ | $R_{B1}$ | $C(CH_3)_2$ |

-continued

| Ligand | $R^1$ | $R^3$ | $R^2$ | Y | Ligand | $R^1$ | $R^3$ | $R^2$ | Y |
|---|---|---|---|---|---|---|---|---|---|
| $L_{A44645}$ | H | $R_{B7}$ | H | $C(CH_3)_2$ | $L_{A44755}$ | H | $R_{B7}$ | $R_{B1}$ | $C(CH_3)_2$ |
| $L_{A44646}$ | H | $R_{B10}$ | H | $C(CH_3)_2$ | $L_{A44756}$ | H | $R_{B10}$ | $R_{B1}$ | $C(CH_3)_2$ |
| $L_{A44647}$ | H | $R_{A3}$ | H | $C(CH_3)_2$ | $L_{A44757}$ | H | $R_{A3}$ | $R_{B1}$ | $C(CH_3)_2$ |
| $L_{A44648}$ | H | $R_{A434}$ | H | $C(CH_3)_2$ | $L_{A44758}$ | H | $R_{A434}$ | $R_{B1}$ | $C(CH_3)_2$ |
| $L_{A44649}$ | H | H | H | $Si(CH_3)_2$ | $L_{A44759}$ | H | H | $R_{B1}$ | $Si(CH_3)_2$ |
| $L_{A44650}$ | $R_{B1}$ | $R_{B1}$ | H | $Si(CH_3)_2$ | $L_{A44760}$ | $R_{B1}$ | $R_{B1}$ | $R_{B1}$ | $Si(CH_3)_2$ |
| $L_{A44651}$ | $R_{B3}$ | $R_{B3}$ | H | $Si(CH_3)_2$ | $L_{A44761}$ | $R_{B3}$ | $R_{B3}$ | $R_{B1}$ | $Si(CH_3)_2$ |
| $L_{A44652}$ | $R_{B4}$ | $R_{B4}$ | H | $Si(CH_3)_2$ | $L_{A44762}$ | $R_{B4}$ | $R_{B4}$ | $R_{B1}$ | $Si(CH_3)_2$ |
| $L_{A44653}$ | $R_{B7}$ | $R_{B7}$ | H | $Si(CH_3)_2$ | $L_{A44763}$ | $R_{B7}$ | $R_{B7}$ | $R_{B1}$ | $Si(CH_3)_2$ |
| $L_{A44654}$ | $R_{B10}$ | $R_{B10}$ | H | $Si(CH_3)_2$ | $L_{A44764}$ | $R_{B10}$ | $R_{B10}$ | $R_{B1}$ | $Si(CH_3)_2$ |
| $L_{A44655}$ | $R_{A3}$ | $R_{A3}$ | H | $Si(CH_3)_2$ | $L_{A44765}$ | $R_{A3}$ | $R_{A3}$ | $R_{B1}$ | $Si(CH_3)_2$ |
| $L_{A44656}$ | $R_{A434}$ | $R_{A434}$ | H | $Si(CH_3)_2$ | $L_{A44766}$ | $R_{A434}$ | $R_{A434}$ | $R_{B1}$ | $Si(CH_3)_2$ |
| $L_{A44657}$ | $R_{B1}$ | H | H | $Si(CH_3)_2$ | $L_{A44767}$ | $R_{B1}$ | H | $R_{B1}$ | $Si(CH_3)_2$ |
| $L_{A44658}$ | $R_{B3}$ | H | H | $Si(CH_3)_2$ | $L_{A44768}$ | $R_{B3}$ | H | $R_{B1}$ | $Si(CH_3)_2$ |
| $L_{A44659}$ | $R_{B4}$ | H | H | $Si(CH_3)_2$ | $L_{A44769}$ | $R_{B4}$ | H | $R_{B1}$ | $Si(CH_3)_2$ |
| $L_{A44660}$ | $R_{B7}$ | H | H | $Si(CH_3)_2$ | $L_{A44770}$ | $R_{B7}$ | H | $R_{B1}$ | $Si(CH_3)_2$ |
| $L_{A44661}$ | $R_{B10}$ | H | H | $Si(CH_3)_2$ | $L_{A44771}$ | $R_{B10}$ | H | $R_{B1}$ | $Si(CH_3)_2$ |
| $L_{A44662}$ | $R_{A3}$ | H | H | $Si(CH_3)_2$ | $L_{A44772}$ | $R_{A3}$ | H | $R_{B1}$ | $Si(CH_3)_2$ |
| $L_{A44663}$ | $R_{A434}$ | H | H | $Si(CH_3)_2$ | $L_{A44773}$ | $R_{A434}$ | H | $R_{B1}$ | $Si(CH_3)_2$ |
| $L_{A44664}$ | H | $R_{B1}$ | H | $Si(CH_3)_2$ | $L_{A44774}$ | H | $R_{B1}$ | $R_{B1}$ | $Si(CH_3)_2$ |
| $L_{A44665}$ | H | $R_{B3}$ | H | $Si(CH_3)_2$ | $L_{A44775}$ | H | $R_{B3}$ | $R_{B1}$ | $Si(CH_3)_2$ |
| $L_{A44666}$ | H | $R_{B4}$ | H | $Si(CH_3)_2$ | $L_{A44776}$ | H | $R_{B4}$ | $R_{B1}$ | $Si(CH_3)_2$ |
| $L_{A44667}$ | H | $R_{B7}$ | H | $Si(CH_3)_2$ | $L_{A44777}$ | H | $R_{B7}$ | $R_{B1}$ | $Si(CH_3)_2$ |
| $L_{A44668}$ | H | $R_{B10}$ | H | $Si(CH_3)_2$ | $L_{A44778}$ | H | $R_{B10}$ | $R_{B1}$ | $Si(CH_3)_2$ |
| $L_{A44669}$ | H | $R_{A3}$ | H | $Si(CH_3)_2$ | $L_{A44779}$ | H | $R_{A3}$ | $R_{B1}$ | $Si(CH_3)_2$ |
| $L_{A44670}$ | H | $R_{A434}$ | H | $Si(CH_3)_2$ | $L_{A44780}$ | H | $R_{A434}$ | $R_{B1}$ | $Si(CH_3)_2$ |

wherein $R_{B1}$ to $R_{B23}$ have the following structures:

$R_{B1}$

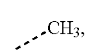

$R_{B2}$

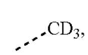

$R_{B3}$

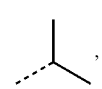

$R_{B4}$

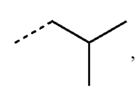

$R_{B5}$

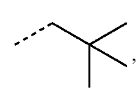

$R_{B6}$

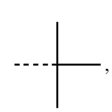

-continued
$R_{B7}$
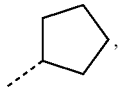
$R_{B8}$
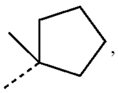
$R_{B9}$
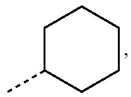
$R_{B10}$
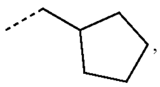
$R_{B11}$
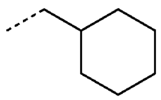
$R_{B12}$
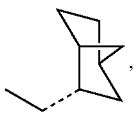
$R_{B13}$
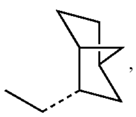
$R_{B14}$
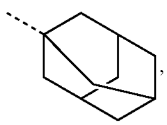
$R_{B15}$
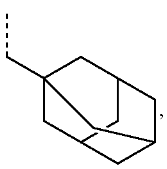
$R_{B16}$
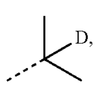
$R_{B17}$
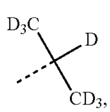
$R_{B18}$
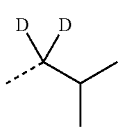
$R_{B19}$
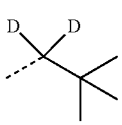
-continued
$R_{B20}$
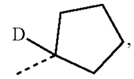
$R_{B21}$
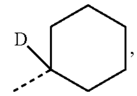
$R_{B22}$
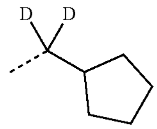
and
$R_{B23}$
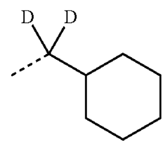
and
wherein $R_{A1}$ to $R_{A51}$ have the following structures:
$R_{A1}$
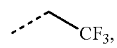
$R_{A2}$
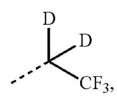
$R_{A3}$
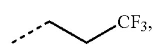
$R_{A4}$
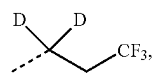
$R_{A5}$
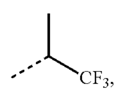
$R_{A6}$
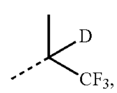
$R_{A7}$
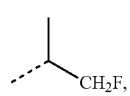
$R_{A8}$
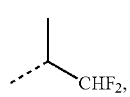
$R_{A9}$
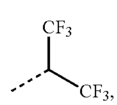
$R_{A10}$
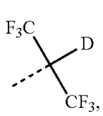

-continued
$R_{A11}$
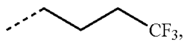
$R_{A12}$
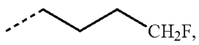
$R_{A13}$
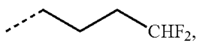
$R_{A14}$
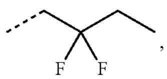
$R_{A15}$
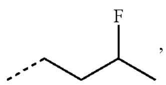
$R_{A16}$
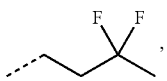
$R_{A17}$
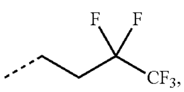
$R_{A18}$
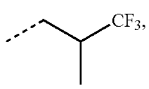
$R_{A19}$
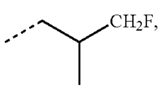
$R_{A20}$
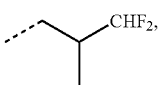
$R_{A21}$
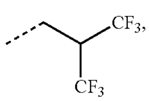
$R_{A22}$
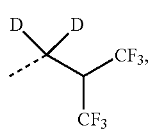
$R_{A23}$
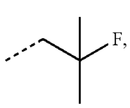
$R_{A24}$
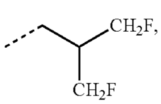
$R_{A25}$
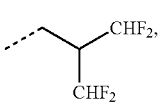
$R_{A26}$
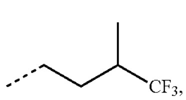
-continued
$R_{A27}$
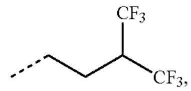
$R_{A28}$
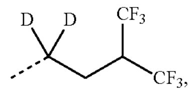
$R_{A29}$
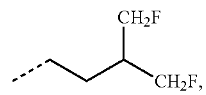
$R_{A30}$
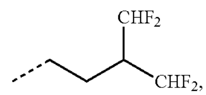
$R_{A31}$
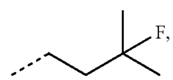
$R_{A32}$
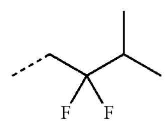
$R_{A33}$
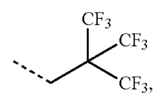
$R_{A34}$
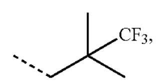
$R_{A35}$
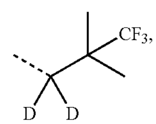
$R_{A36}$
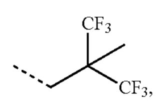
$R_{A37}$
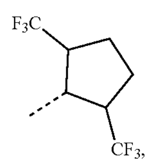
$R_{A38}$
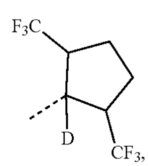
$R_{A39}$
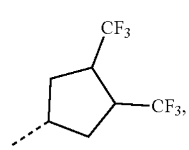

$R_{A40}$

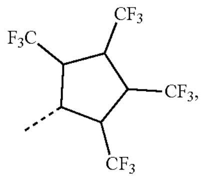

$R_{A41}$

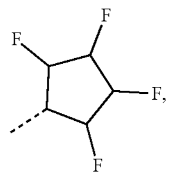

$R_{A42}$

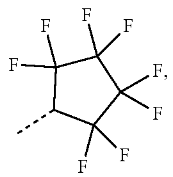

$R_{A43}$

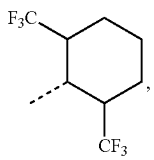

$R_{A44}$

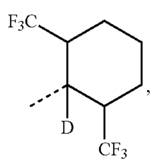

$R_{A45}$

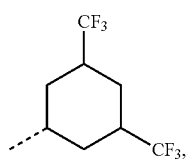

$R_{A46}$

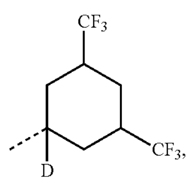

$R_{A47}$

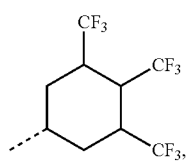

$R_{A48}$

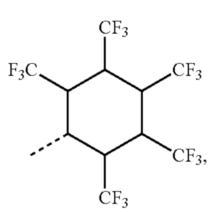

$R_{A49}$

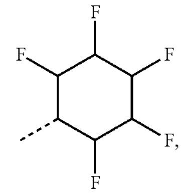

$R_{A50}$

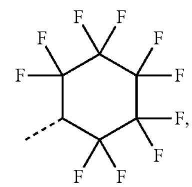

$R_{A51}$

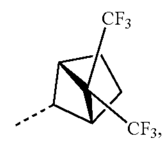

and $R_{A52}$

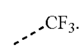

10. The compound of claim 9, wherein the compound has a formula of $M(L_A)_x(L_B)_y(L_C)_z$ wherein $L_B$ and $L_C$ are each a bidentate ligand; and wherein x is 1, 2, or 3; y is 0, 1, or 2; z is 0, 1, or 2; and x+y+z is the oxidation state of the metal M.

11. The compound of claim 10, wherein the compound has a formula selected from the group consisting of $Ir(L_A)_3$, $Ir(L_A)(L_B)_2$, $Ir(L_A)_2(L_B)$, $Ir(L_A)_2(L_C)$, and $Ir(L_A)(L_B)(L_C)$; and wherein $L_A$, $L_B$, and $L_C$ are different from each other.

12. The compound of claim 10, wherein $L_B$ and $L_C$ are each independently selected from the group consisting of:

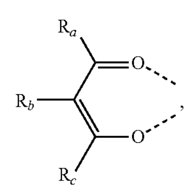

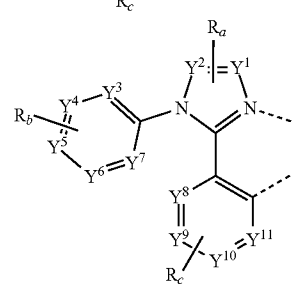

-continued
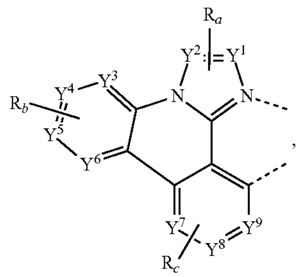
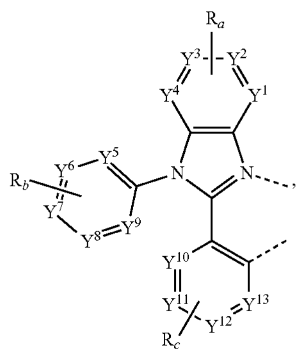
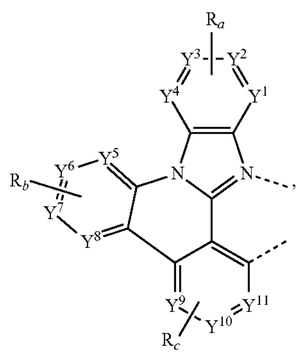
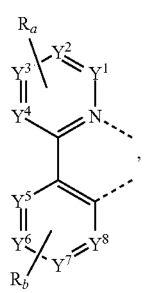
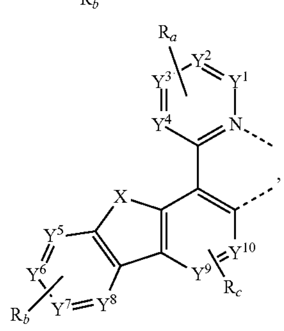
-continued
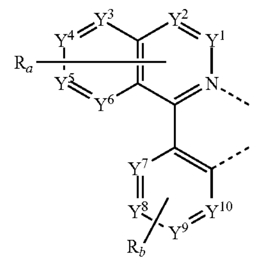
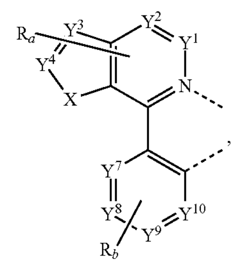
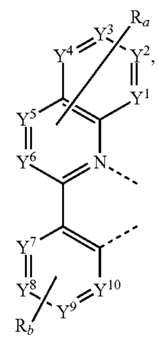
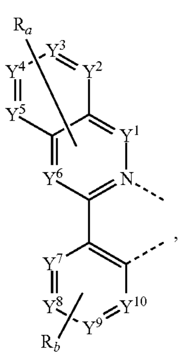
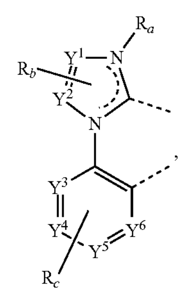

-continued

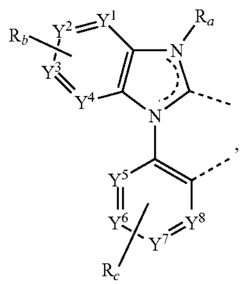

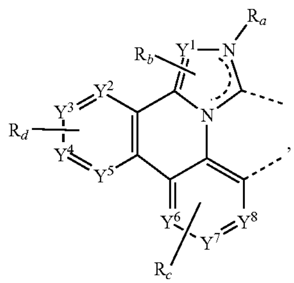

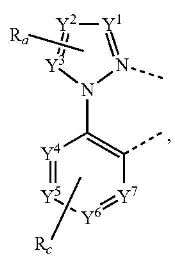

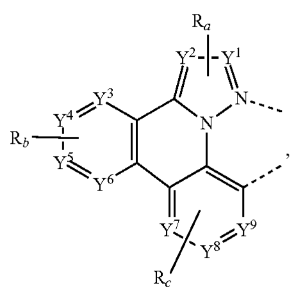

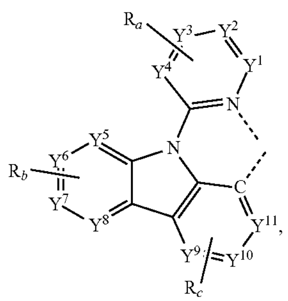

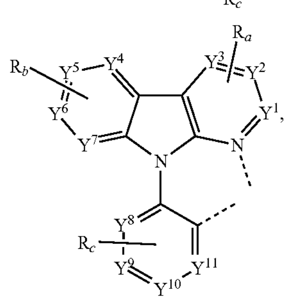

and

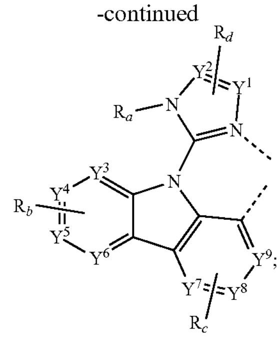

wherein each $Y^1$ to $Y^{13}$ is independently selected from the group consisting of carbon and nitrogen;

wherein X is selected from the group consisting of BR', NR', PR', O, S, Se, C═O, S═O, $SO_2$, $CR^1R^2$, $SiR^1R^2$, and $GeR^1R^2$;

wherein $R^1$ and $R^2$ are optionally fused or joined to form a ring;

wherein each $R_a$, $R_b$, $R_c$, and $R_d$ may represent from mono substitution to the possible maximum number of substitution, or no substitution;

wherein R', $R^1$, $R^2$, $R_a$, $R_b$, $R_c$, and $R_d$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein any two adjacent substituents of $R_a$, $R_b$, $R_c$, and $R_d$ are optionally fused or joined to form a ring or form a multidentate ligand.

13. The compound of claim 11, wherein the compound is selected from the group consisting of Compound Ax having the formula $Ir(L_{Ai})_3$, Compound By having the formula $Ir(L_{Ai})(L_{Bk})_2$; and Compound Cz having the formula $Ir(L_{Ai})_2(L_{Cj})$; wherein x=i, y=468i+k−468, and z=1260i+j−1260; wherein i is an integer from 121 to 456, 577 to 2736, 2857 to 4104, or 4225 to 4780; wherein k is an integer from 1 to 468; wherein j is an integer from 1 to 1260;

wherein $L_{Bk}$ has the following structures:

$L_{B1}$

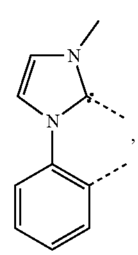

$L_{B2}$

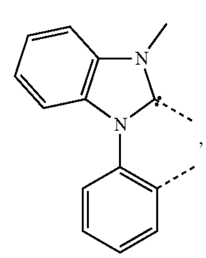

-continued
$L_{B3}$
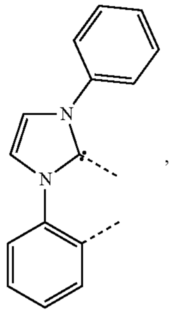
$L_{B4}$
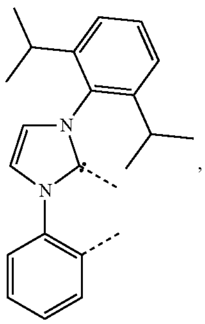
$L_{B5}$
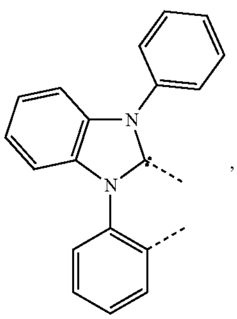
$L_{B6}$
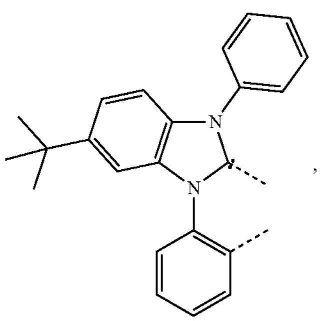
$L_{B7}$
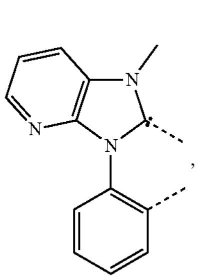
-continued
$L_{B8}$
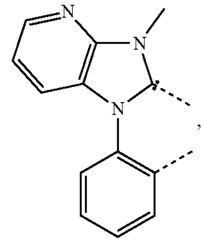
$L_{B9}$
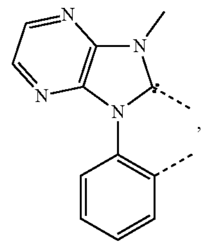
$L_{B10}$
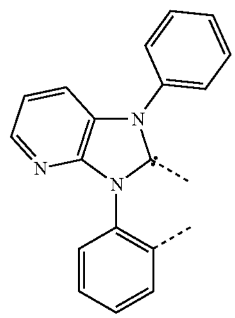
$L_{B11}$
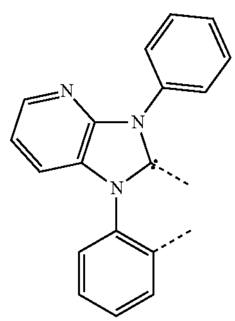
$L_{B12}$
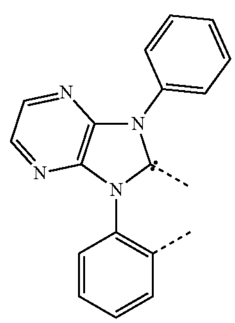

-continued
$L_{B13}$
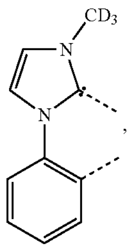
$L_{B14}$
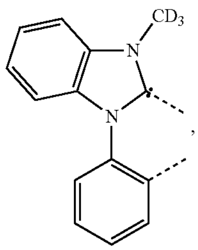
$L_{B15}$
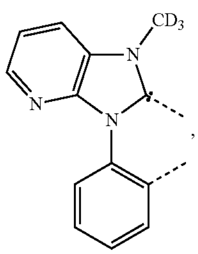
$L_{B16}$
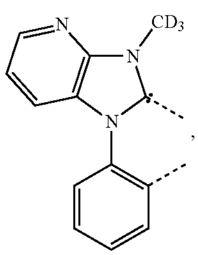
$L_{B17}$
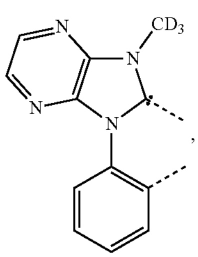
$L_{B18}$
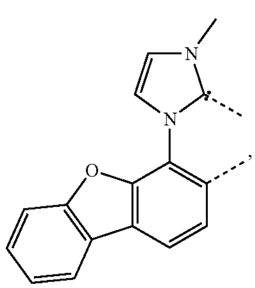
-continued
$L_{B19}$
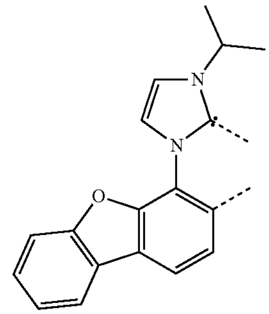
$L_{B20}$
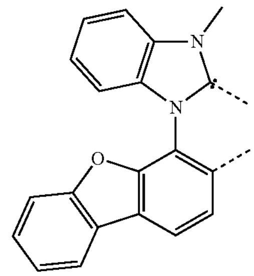
$L_{B21}$
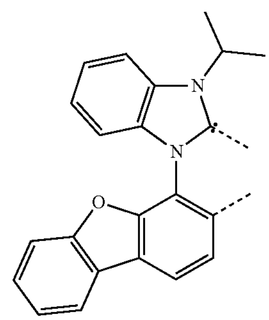
$L_{B22}$
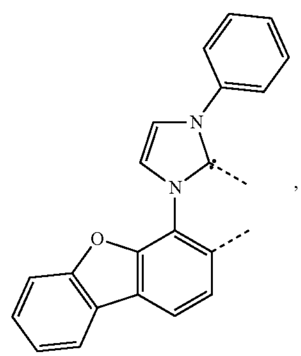
$L_{B23}$
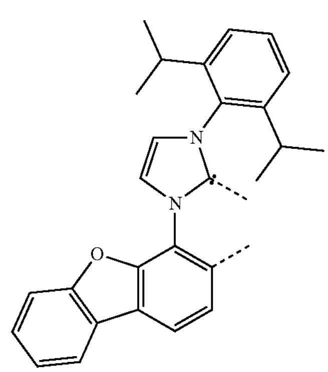

$L_{B24}$
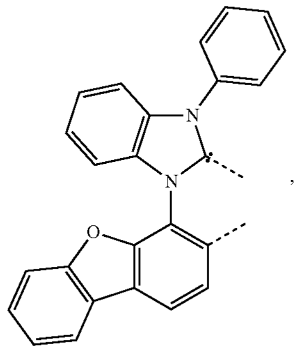
$L_{B25}$
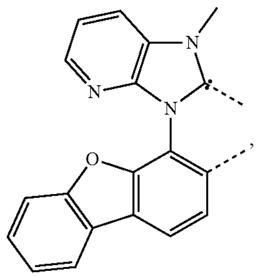
$L_{B26}$
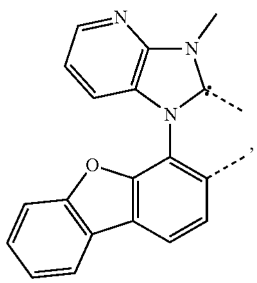
$L_{B27}$
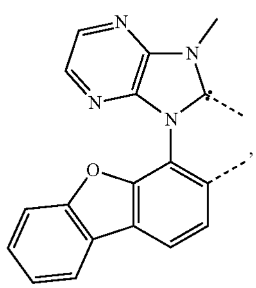
$L_{B28}$
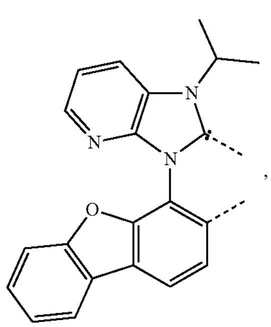
$L_{B29}$
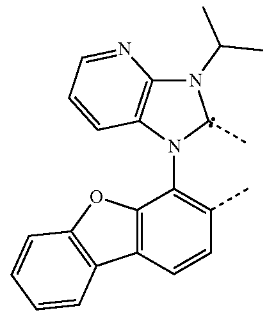
$L_{B30}$
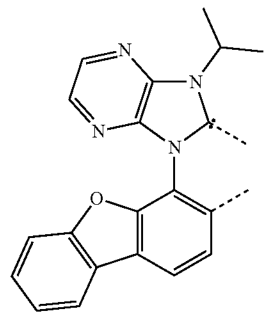
$L_{B31}$
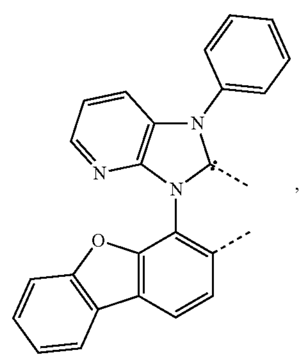
$L_{B32}$
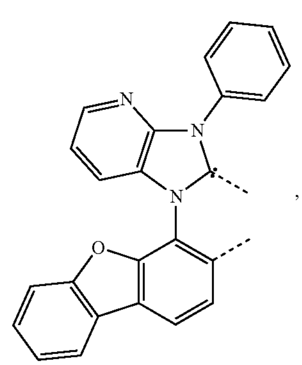

-continued
$L_{B33}$
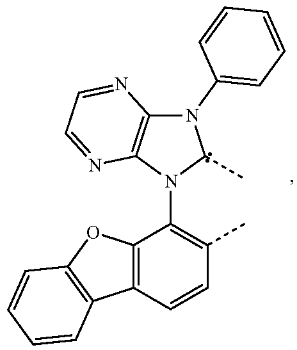
$L_{B34}$
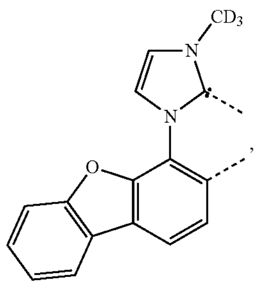
$L_{B35}$
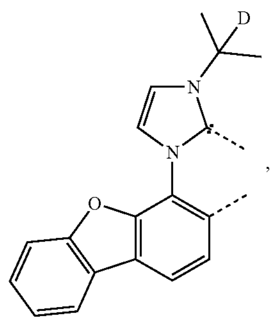
$L_{B36}$
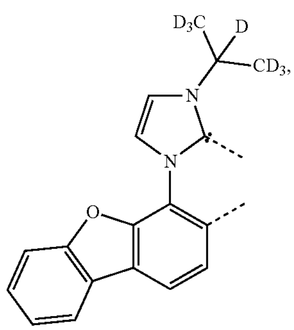
$L_{B37}$
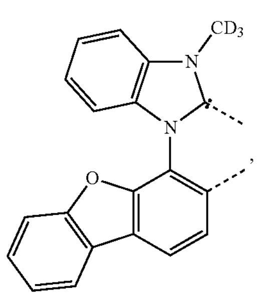
-continued
$L_{B38}$
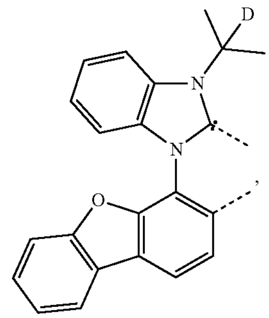
$L_{B39}$
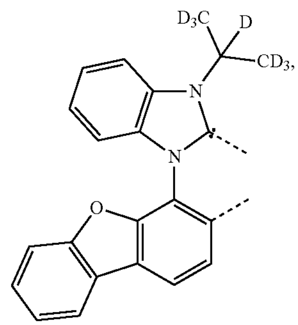
$L_{B40}$
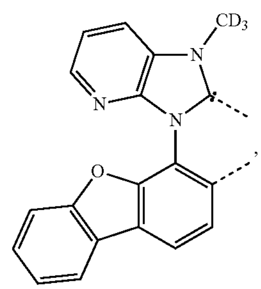
$L_{B41}$
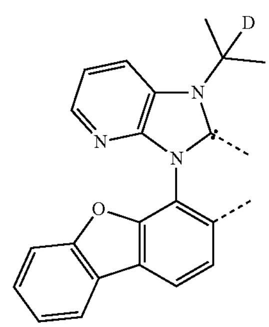
$L_{B42}$
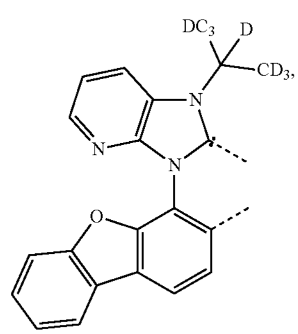

$L_{B43}$
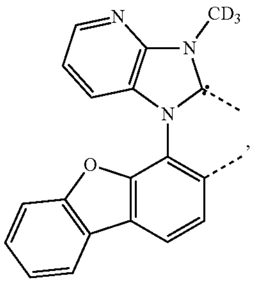
$L_{B44}$
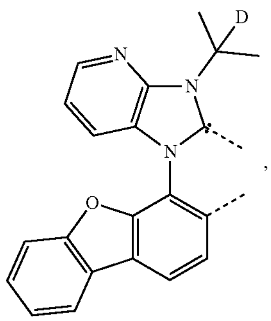
$L_{B45}$
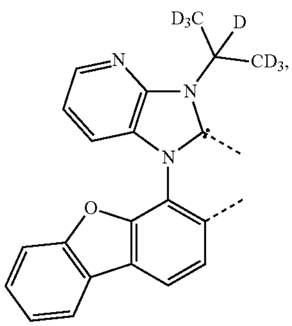
$L_{B46}$
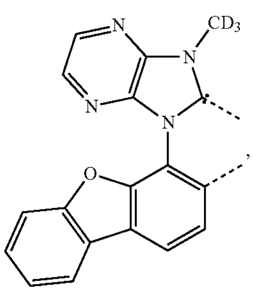
$L_{B47}$
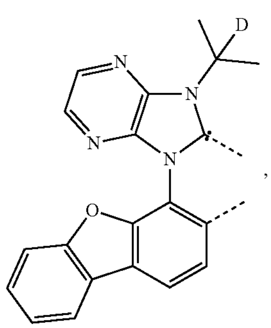
$L_{B48}$
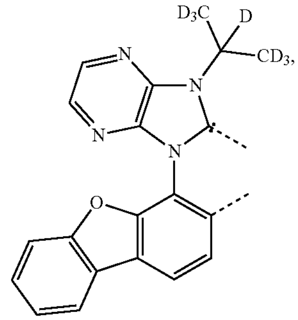
$L_{B49}$
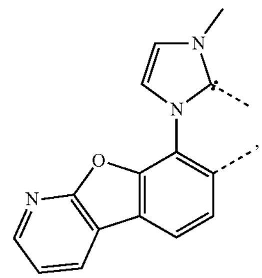
$L_{B50}$
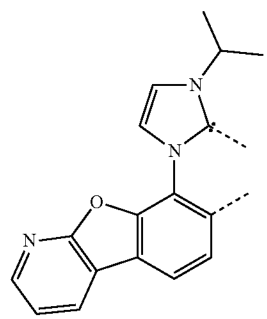
$L_{B51}$
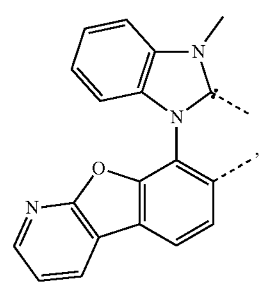
$L_{B52}$
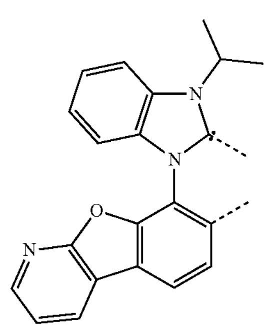

-continued
$L_{B53}$
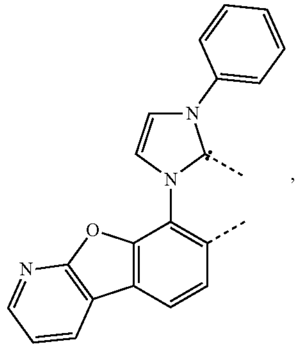
$L_{B54}$
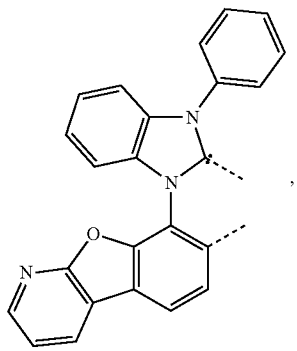
$L_{B55}$
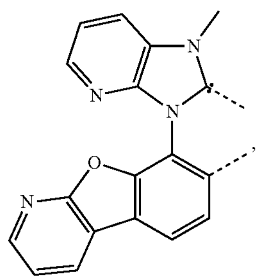
$L_{B56}$
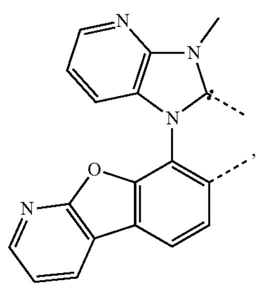
$L_{B57}$
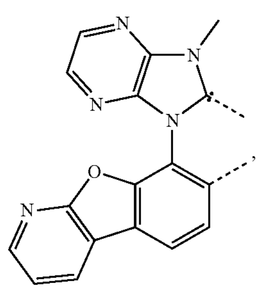
-continued
$L_{B58}$
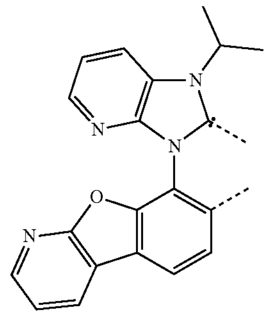
$L_{B59}$
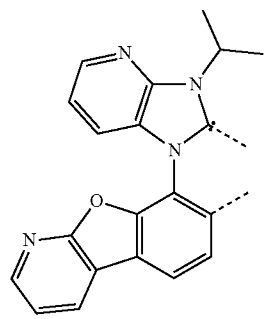
$L_{B60}$
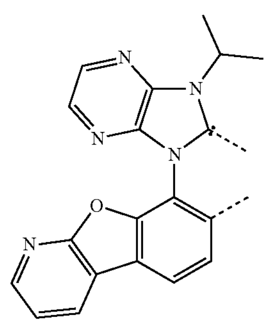
$L_{B61}$
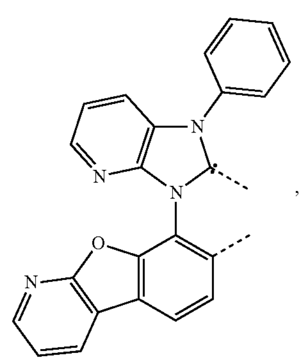

$L_{B62}$
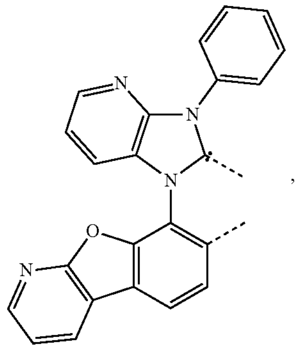
$L_{B63}$
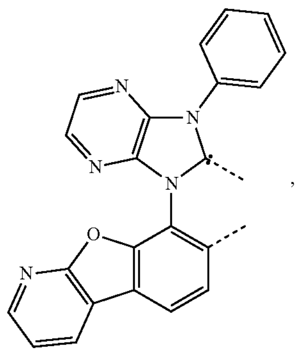
$L_{B64}$
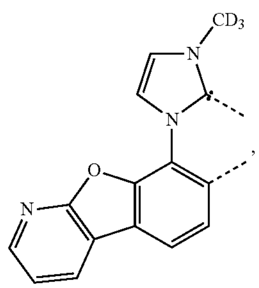
$L_{B65}$
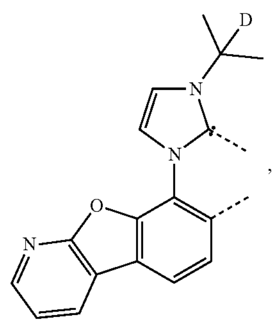
$L_{B66}$
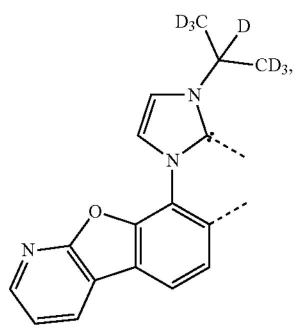
$L_{B67}$
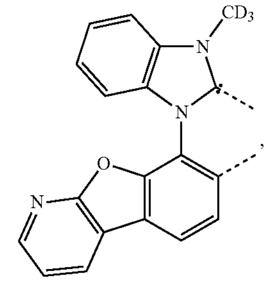
$L_{B68}$
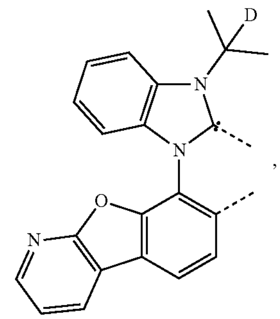
$L_{B69}$
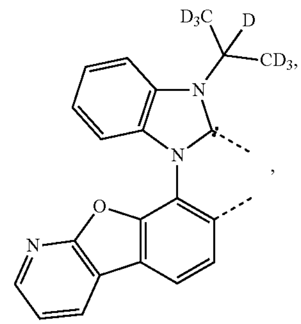
$L_{B70}$
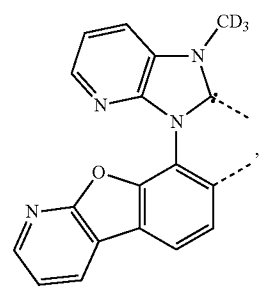
$L_{B71}$
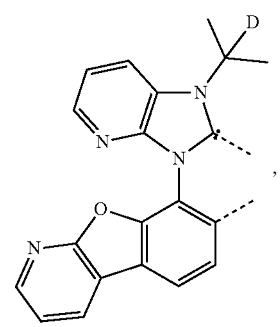

$L_{B72}$
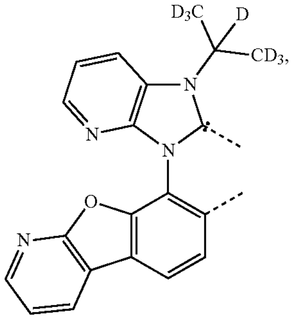
$L_{B73}$
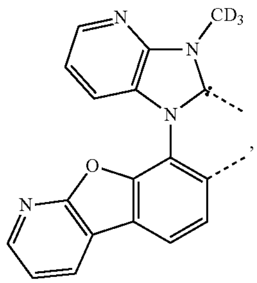
$L_{B74}$
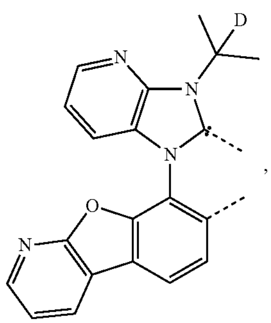
$L_{B75}$
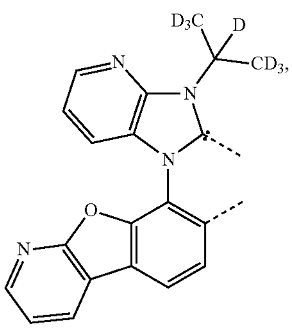
$L_{B76}$
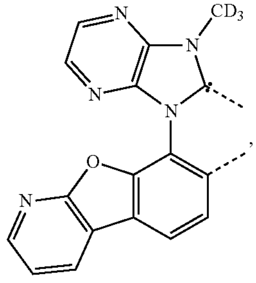
$L_{B77}$
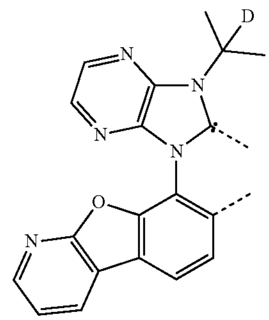
$L_{B78}$
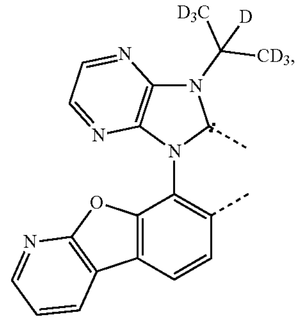
$L_{B79}$
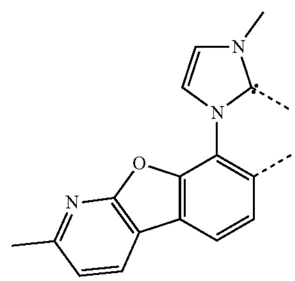
$L_{B80}$
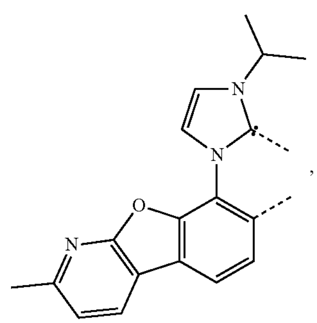
$L_{B81}$
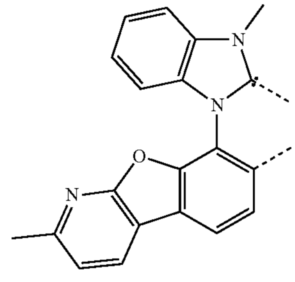

-continued
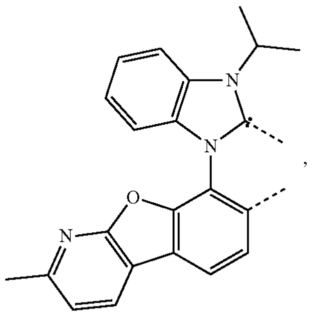
$L_{B82}$
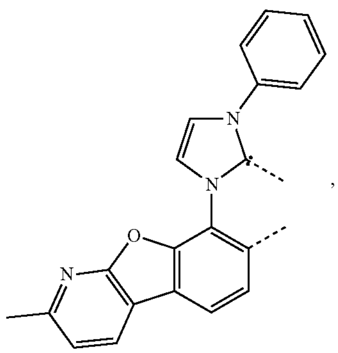
$L_{B83}$
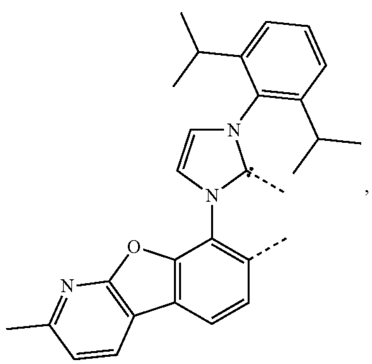
$L_{B84}$
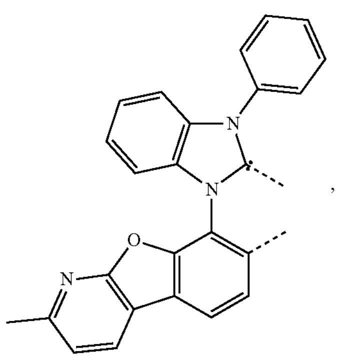
$L_{B85}$
-continued
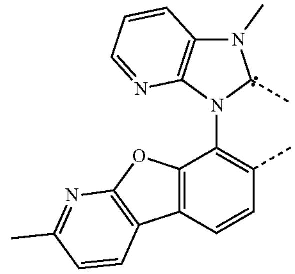
$L_{B86}$
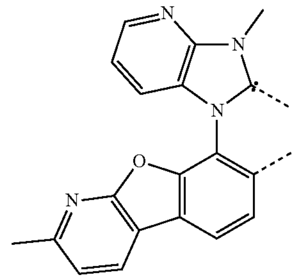
$L_{B87}$
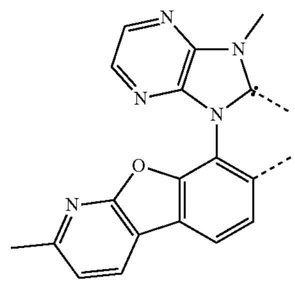
$L_{B88}$
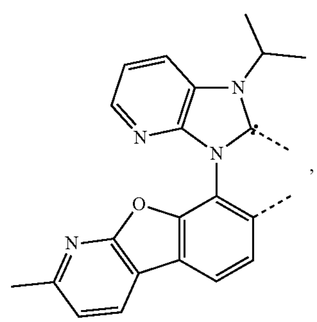
$L_{B89}$
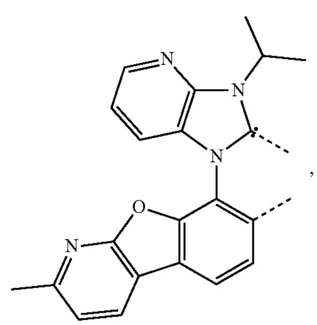
$L_{B90}$ -continued
$L_{B91}$
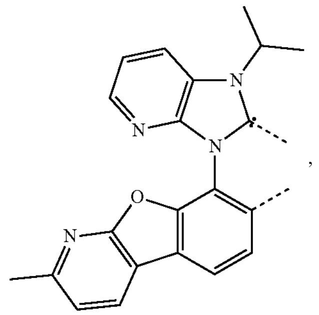
$L_{B92}$
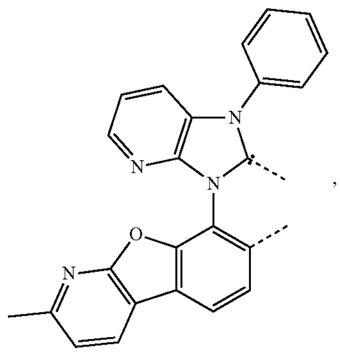
$L_{B93}$
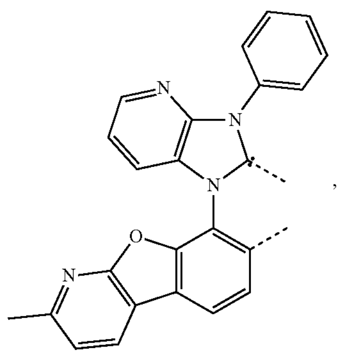
$L_{B94}$
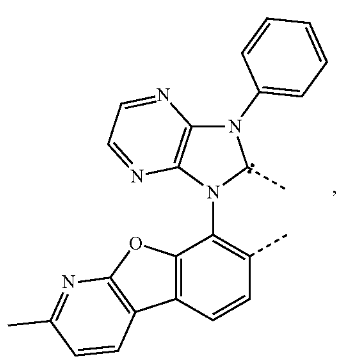
-continued
$L_{B95}$
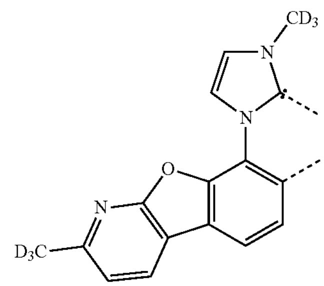
$L_{B96}$
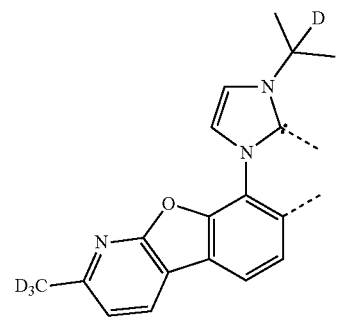
$L_{B97}$
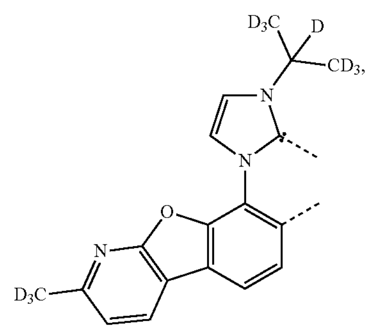
$L_{B98}$
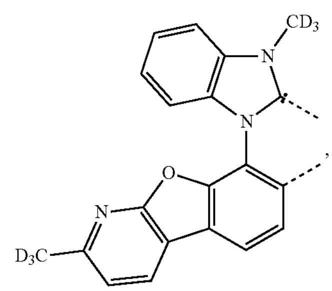
$L_{B99}$
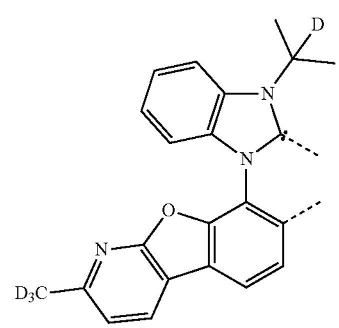

-continued
$L_{B100}$
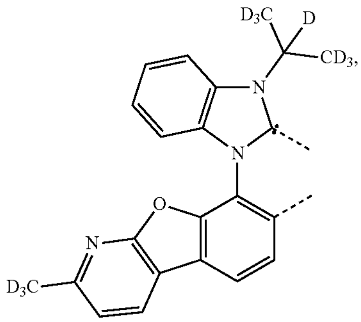
$L_{B101}$
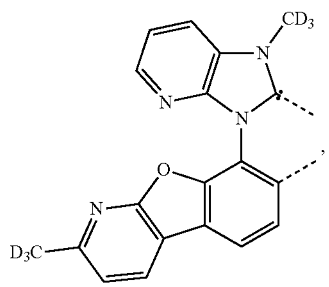
$L_{B102}$
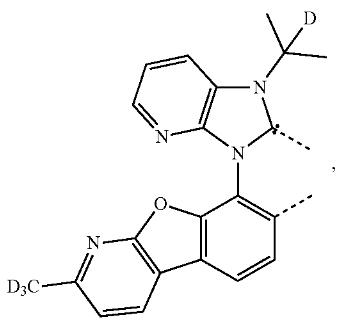
$L_{B103}$
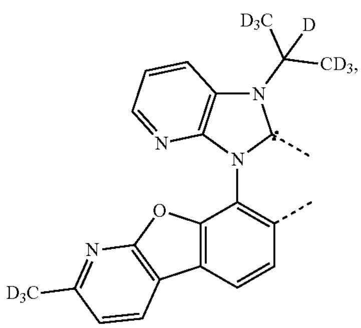
$L_{B104}$
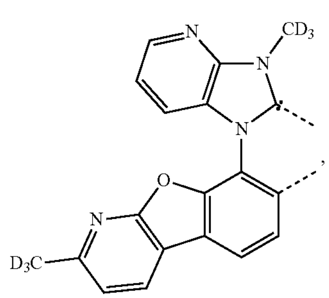
-continued
$L_{B105}$
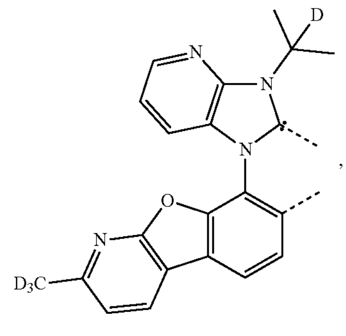
$L_{B106}$
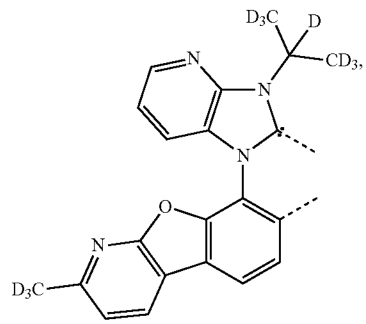
$L_{B107}$
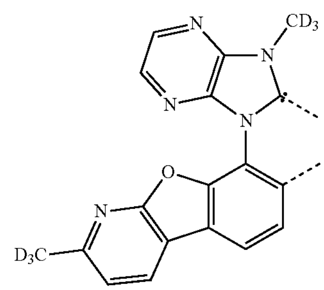
$L_{B108}$
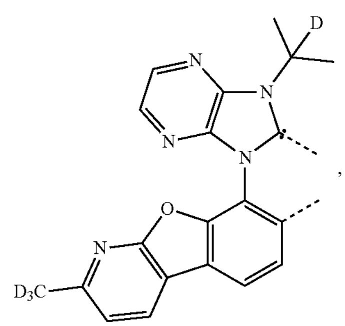
$L_{B109}$
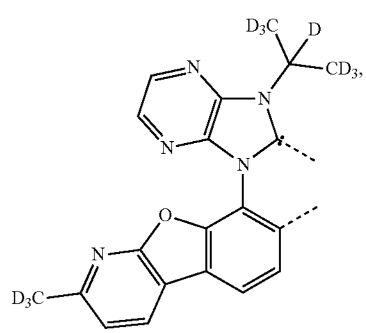

-continued
$L_{B110}$
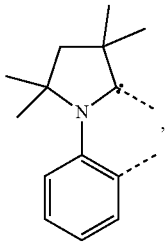
$L_{B111}$
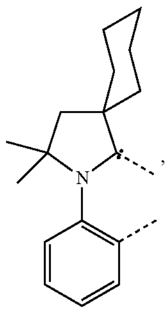
$L_{B112}$
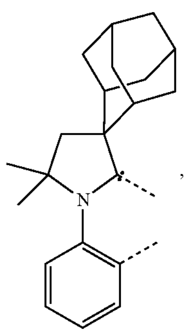
$L_{B113}$
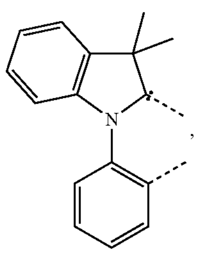
$L_{B114}$
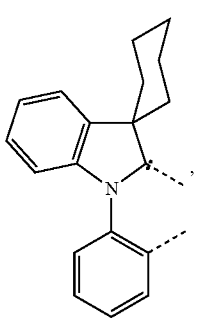
-continued
$L_{B115}$
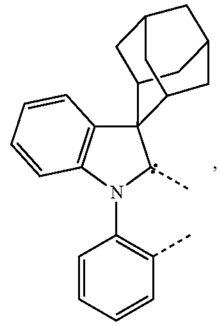
$L_{B116}$
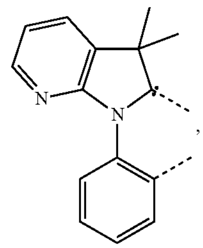
$L_{B117}$
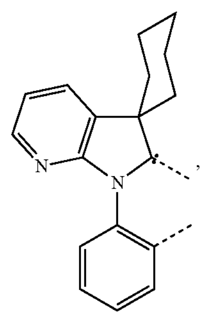
$L_{B118}$
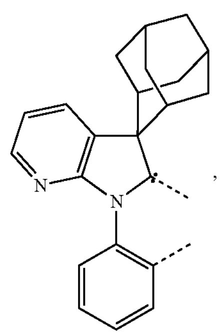
$L_{B119}$
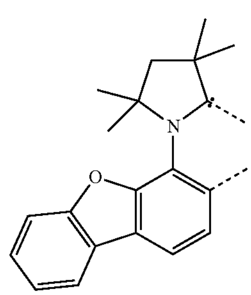

-continued
$L_{B120}$
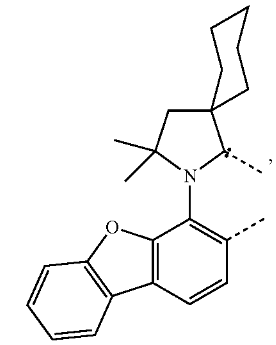
$L_{B121}$
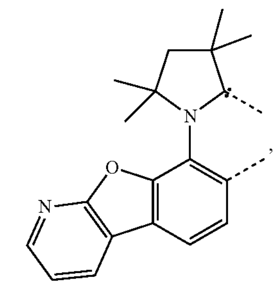
$L_{B122}$
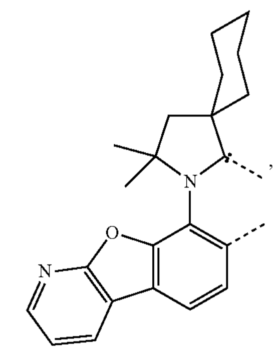
$L_{B123}$
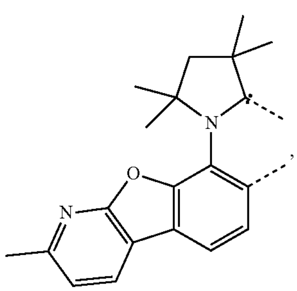
$L_{B124}$
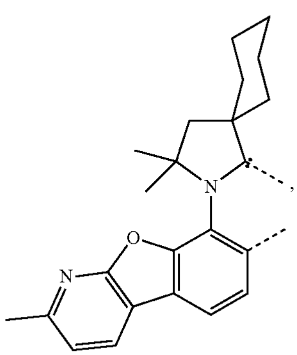
-continued
$L_{B125}$
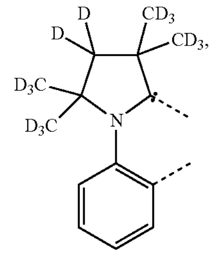
$L_{B126}$
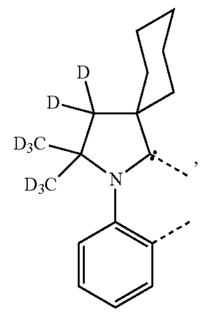
$L_{B127}$
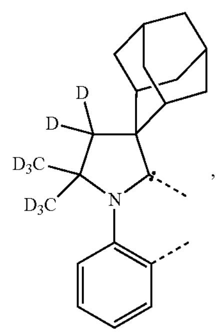
$L_{B128}$
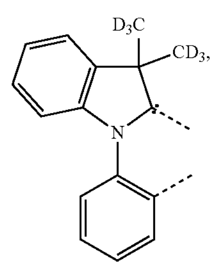
$L_{B129}$
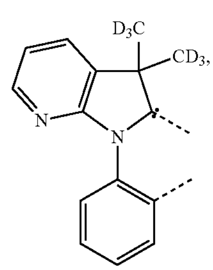

-continued
$L_{B130}$
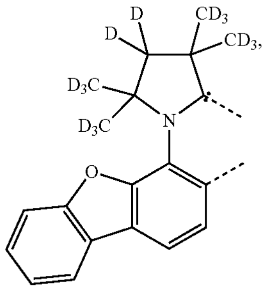
$L_{B131}$
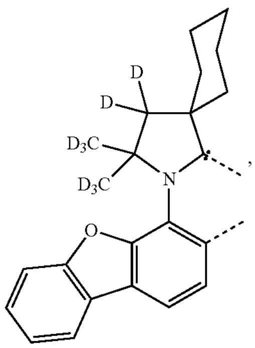
$L_{B132}$
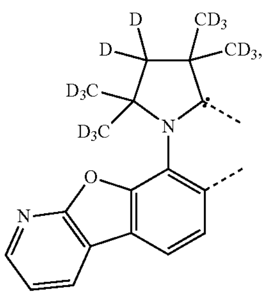
$L_{B133}$
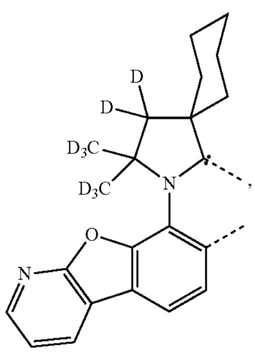
$L_{B134}$
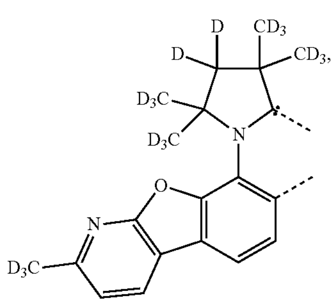
-continued
$L_{B135}$
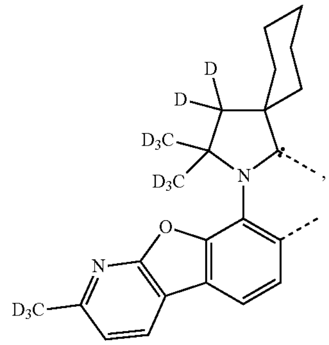
$L_{B136}$
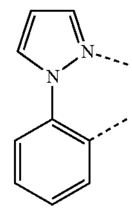
$L_{B137}$
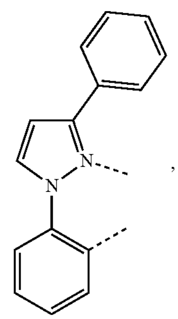
$L_{B138}$
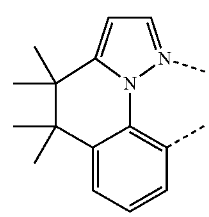
$L_{B139}$
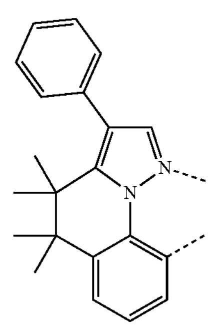

-continued
$L_{B140}$
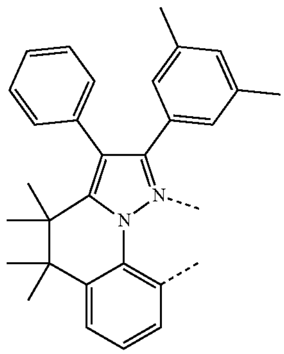
$L_{B141}$
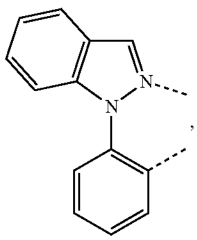
$L_{B142}$
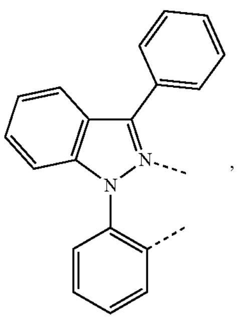
$L_{B143}$
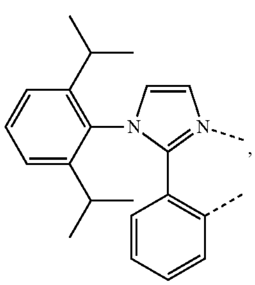
$L_{B144}$
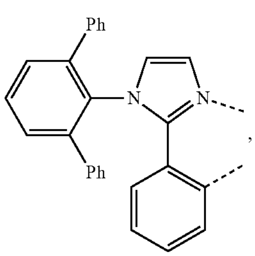
-continued
$L_{B145}$
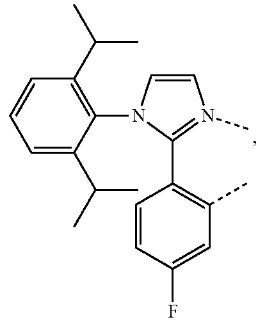
$L_{B146}$
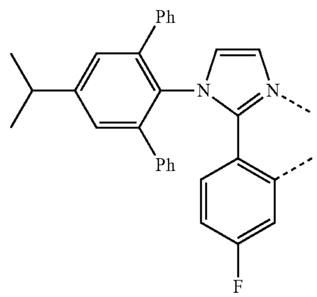
$L_{B147}$
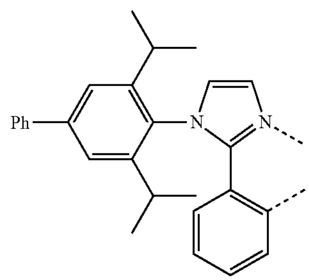
$L_{B148}$
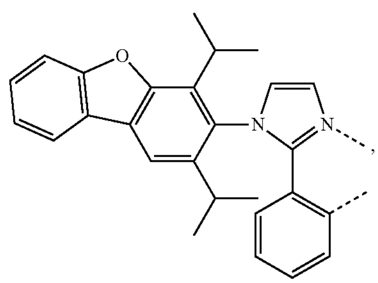
$L_{B149}$
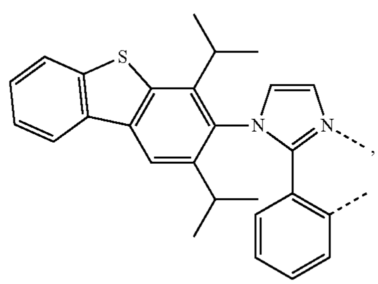

-continued
$L_{B150}$
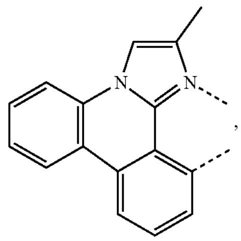
$L_{B151}$
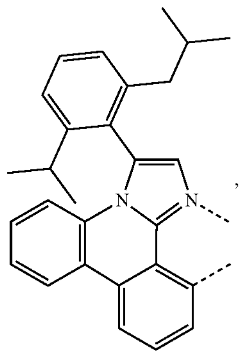
$L_{B152}$
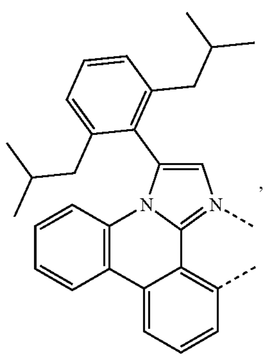
$L_{B153}$
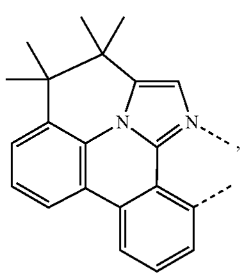
$L_{B154}$
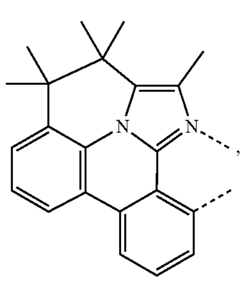
-continued
$L_{B155}$
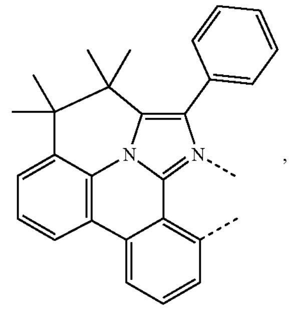
$L_{B156}$
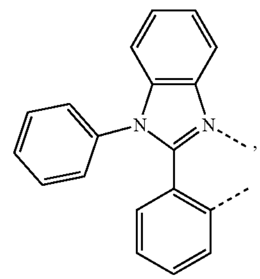
$L_{B157}$
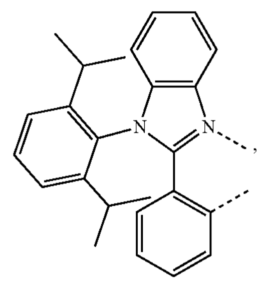
$L_{B158}$
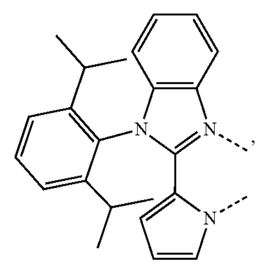
$L_{B159}$
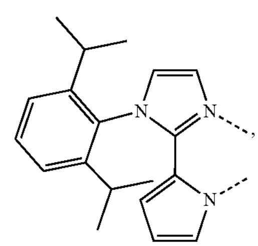
$L_{B160}$
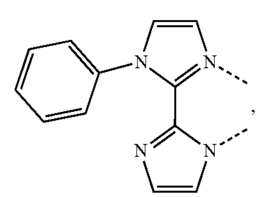

-continued
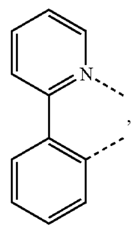
$L_{B161}$
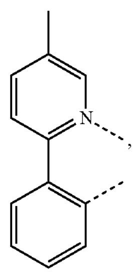
$L_{B162}$
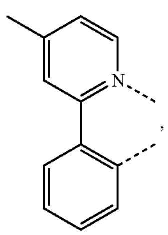
$L_{B163}$
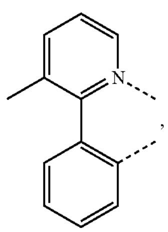
$L_{B164}$
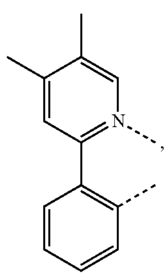
$L_{B165}$
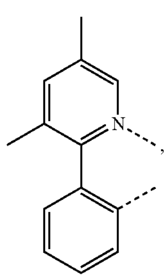
$L_{B166}$
-continued
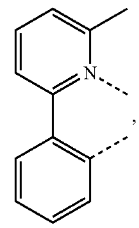
$L_{B167}$
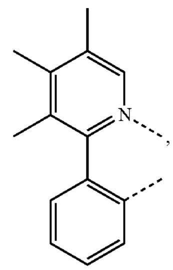
$L_{B168}$
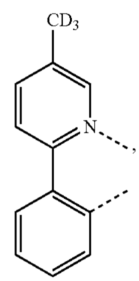
$L_{B169}$
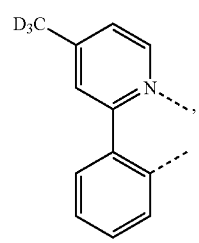
$L_{B170}$
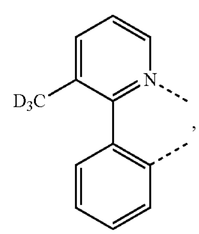
$L_{B171}$
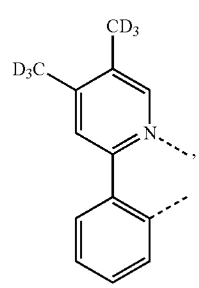
$L_{B172}$ -continued
$L_{B173}$
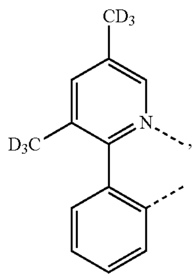
$L_{B174}$
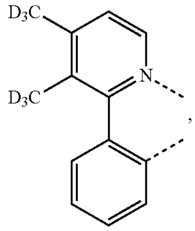
$L_{B175}$
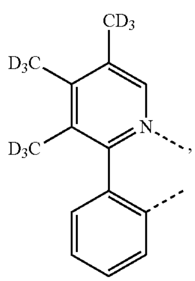
$L_{B176}$
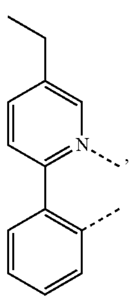
$L_{B177}$
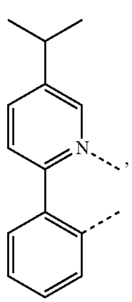
-continued
$L_{B178}$
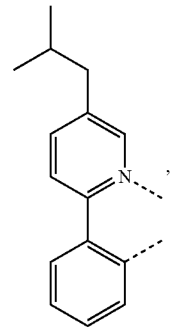
$L_{B179}$
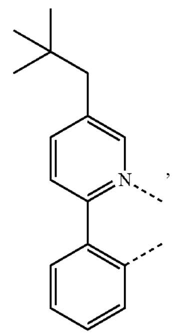
$L_{B180}$
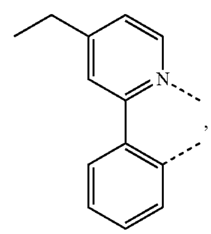
$L_{B181}$
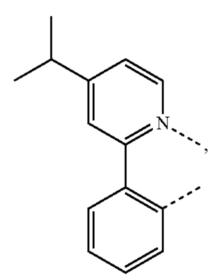
$L_{B182}$
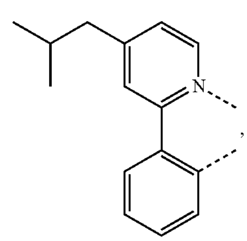

-continued
$L_{B183}$
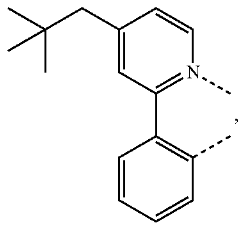
$L_{B184}$
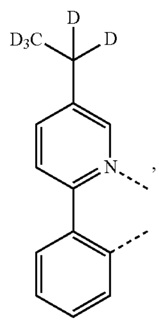
$L_{B185}$
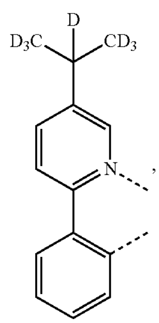
$L_{B186}$
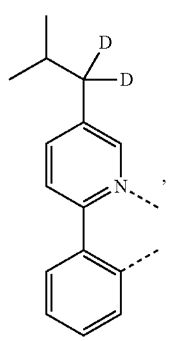
$L_{B187}$
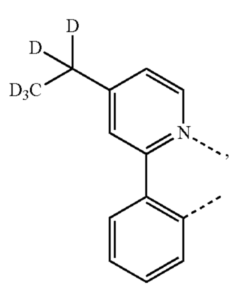
-continued
$L_{B188}$
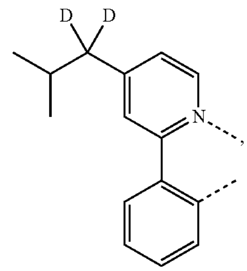
$L_{B189}$
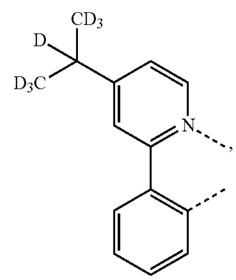
$L_{B190}$
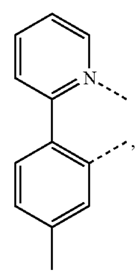
$L_{B191}$
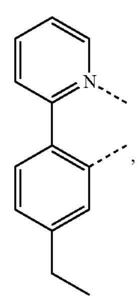
$L_{B192}$
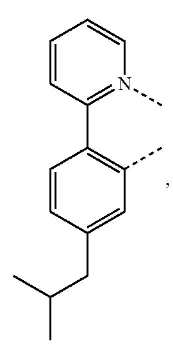

-continued
$L_{B193}$
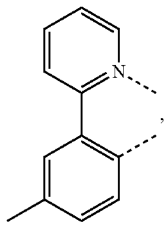
$L_{B194}$
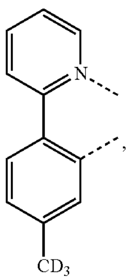
$L_{B195}$
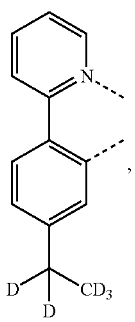
$L_{B196}$
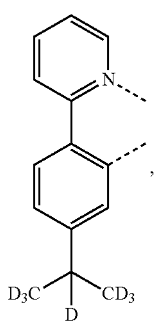
$L_{B197}$
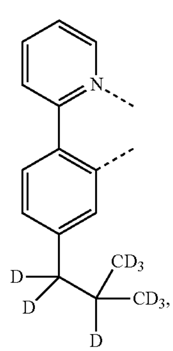
-continued
$L_{B198}$
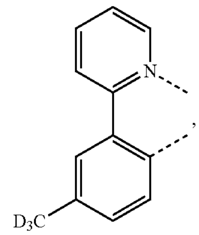
$L_{B199}$
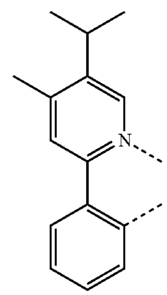
$L_{B200}$
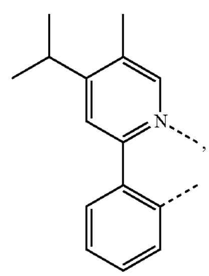
$L_{B201}$
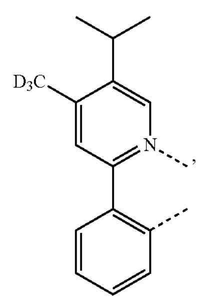
$L_{B202}$
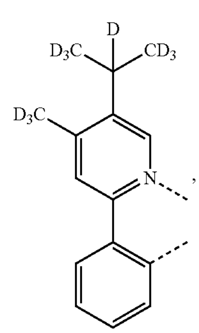

-continued
L$_{B203}$
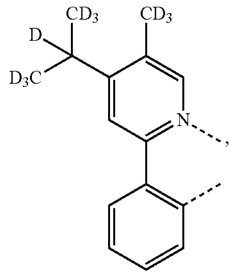
L$_{B204}$
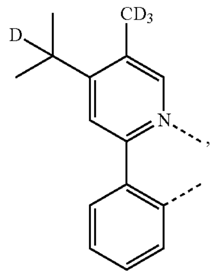
L$_{B205}$
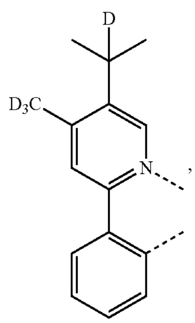
L$_{B206}$
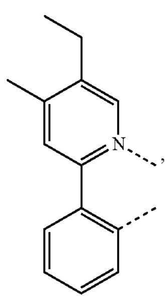
L$_{B207}$
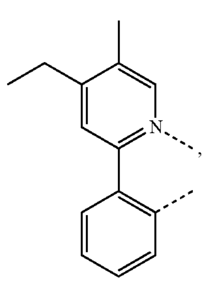
-continued
L$_{B208}$
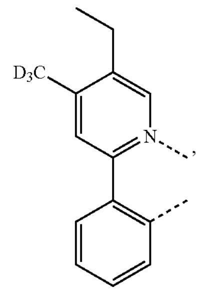
L$_{B209}$
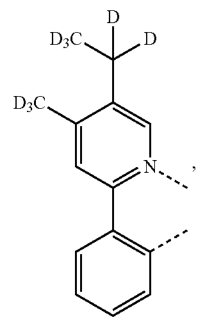
L$_{B210}$
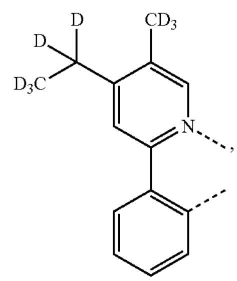
L$_{B211}$
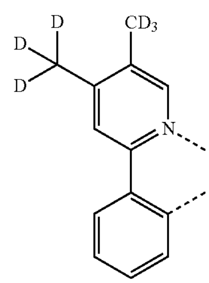
L$_{B212}$
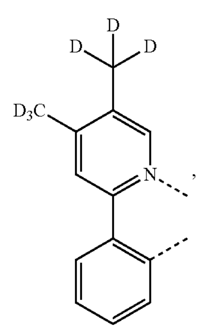

-continued
$L_{B213}$
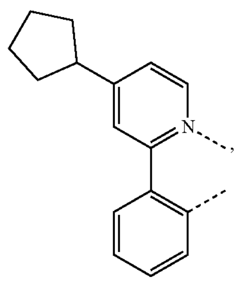
$L_{B214}$
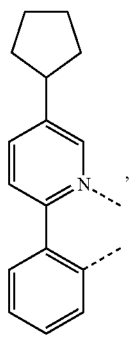
$L_{B215}$
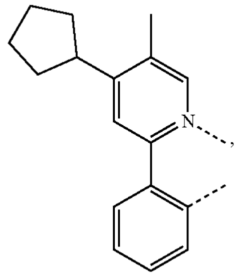
$L_{B216}$
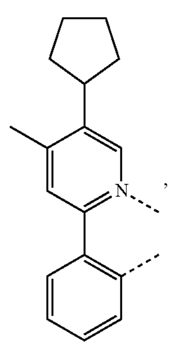
$L_{B217}$
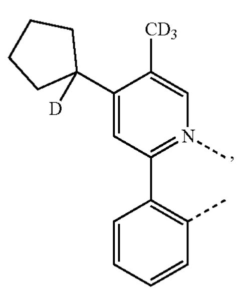
-continued
$L_{B218}$
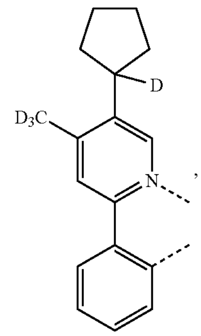
$L_{B219}$
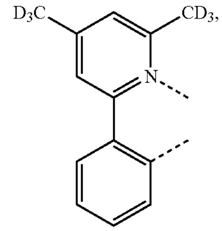
$L_{B220}$
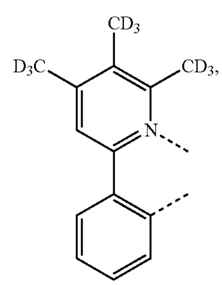
$L_{B221}$
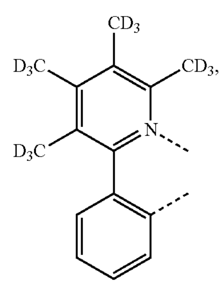
$L_{B222}$
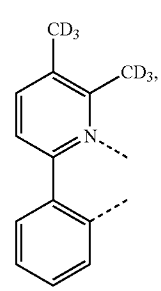

-continued
$L_{B223}$
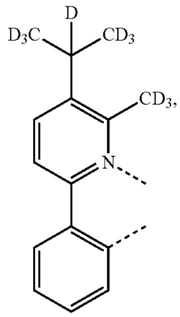
$L_{B224}$
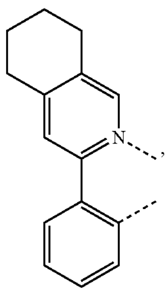
$L_{B225}$
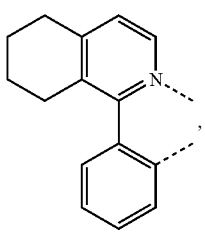
$L_{B226}$
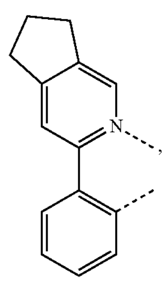
$L_{B227}$
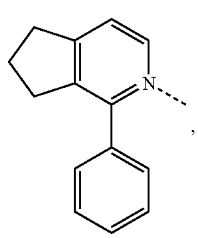
-continued
$L_{B228}$
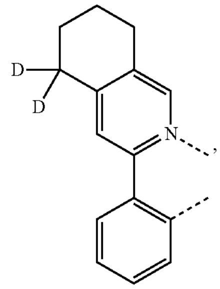
$L_{B229}$
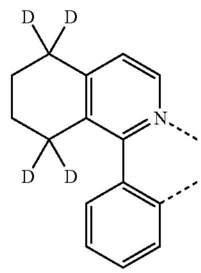
$L_{B230}$
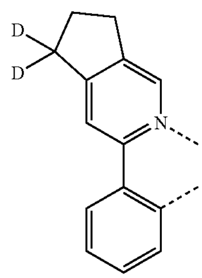
$L_{B231}$
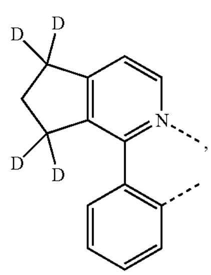
$L_{B232}$
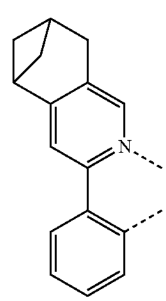

-continued
$L_{B233}$
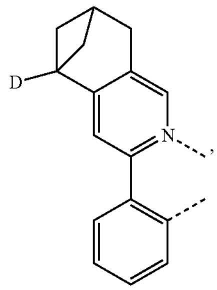
$L_{B234}$
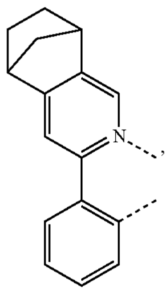
$L_{B235}$
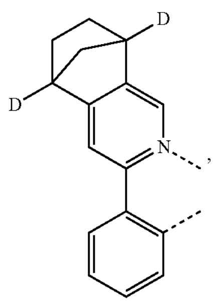
$L_{B236}$
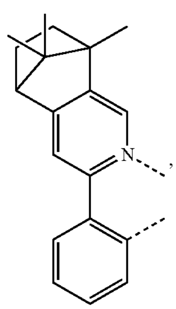
$L_{B237}$
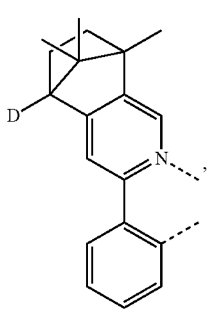
-continued
$L_{B238}$
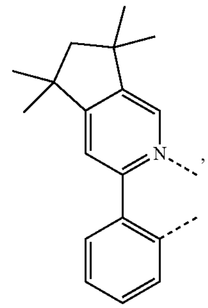
$L_{B239}$
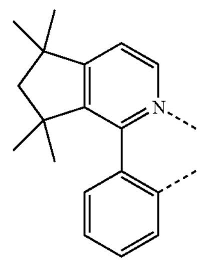
$L_{B240}$
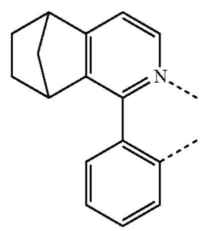
$L_{B241}$
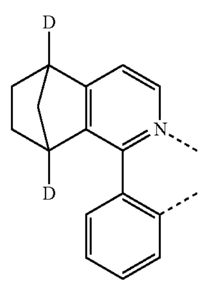
$L_{B242}$
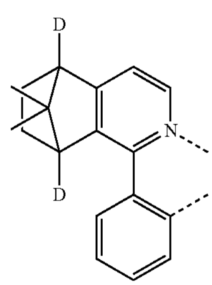

-continued
$L_{B243}$
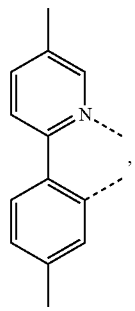
$L_{B244}$
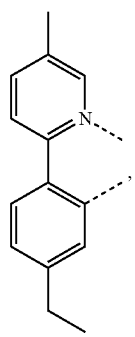
$L_{B245}$
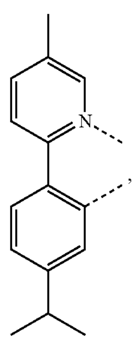
$L_{B246}$
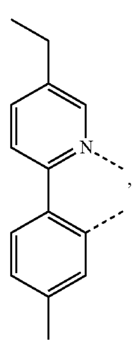
-continued
$L_{B247}$
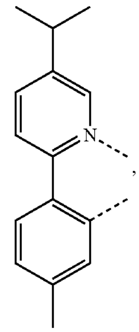
$L_{B248}$
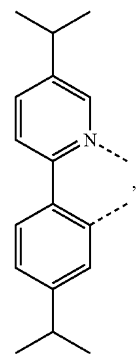
$L_{B249}$
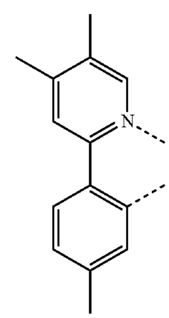
$L_{B250}$
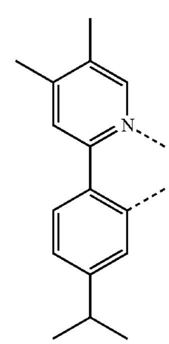

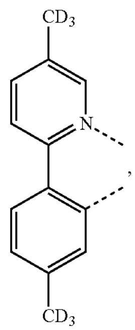
$L_{B251}$
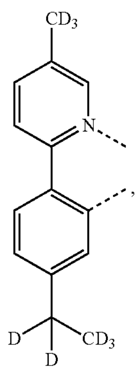
$L_{B252}$
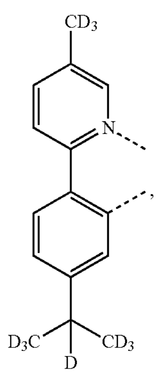
$L_{B253}$
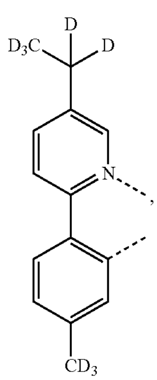
$L_{B254}$
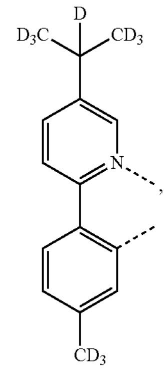
$L_{B255}$
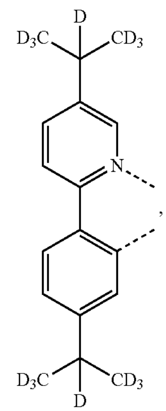
$L_{B256}$
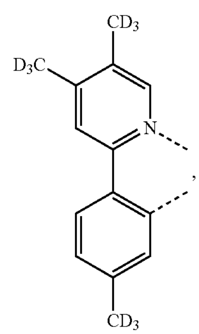
$L_{B257}$
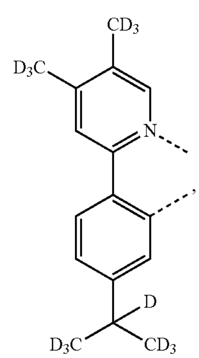
$L_{B258}$ -continued
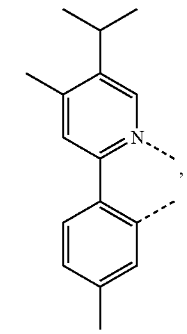
$L_{B259}$
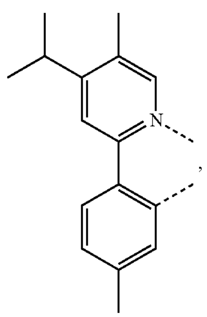
$L_{B260}$
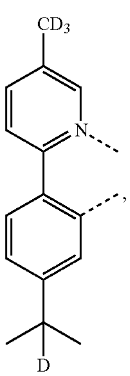
$L_{B261}$
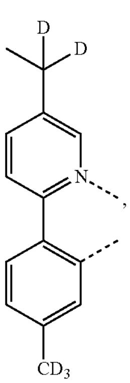
$L_{B262}$
-continued
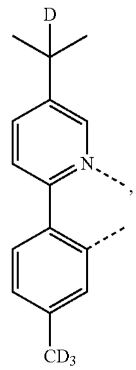
$L_{B263}$
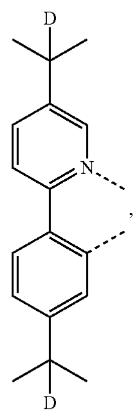
$L_{B264}$
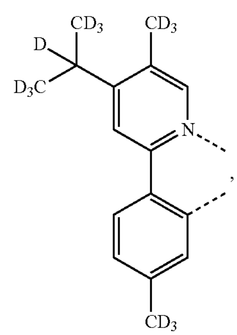
$L_{B265}$
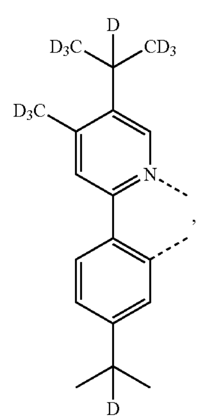
$L_{B266}$ $L_{B267}$
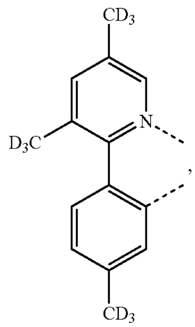
$L_{B268}$
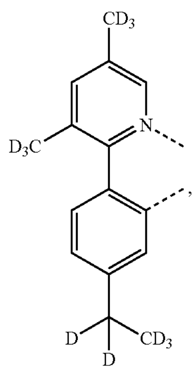
$L_{B269}$
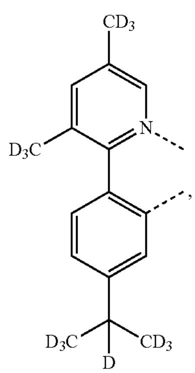
$L_{B270}$
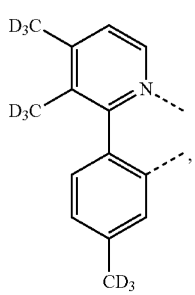
$L_{B271}$
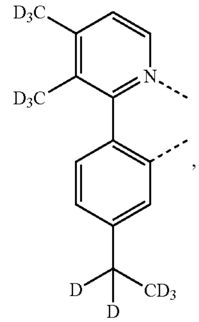
$L_{B272}$
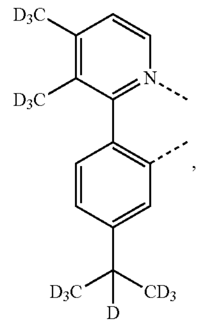
$L_{B273}$
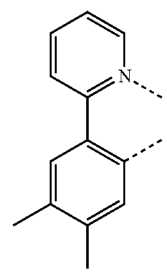
$L_{B274}$
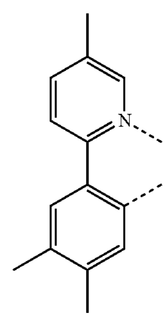
$L_{B275}$
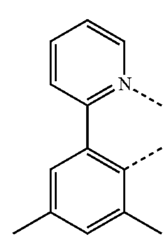

-continued
$L_{B276}$
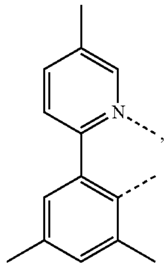
$L_{B277}$
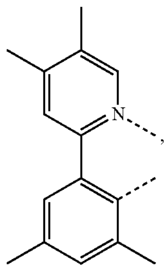
$L_{B278}$
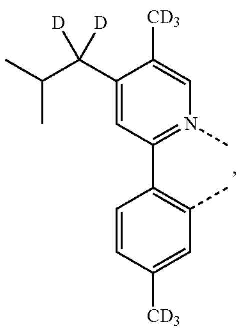
$L_{B279}$
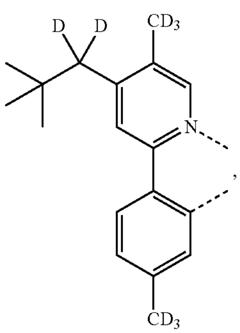
$L_{B280}$
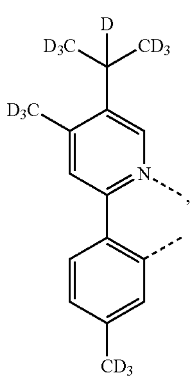
-continued
$L_{B281}$
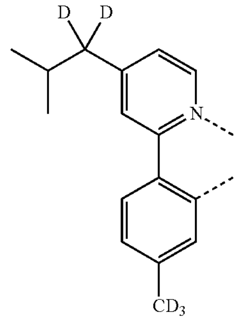
$L_{B282}$
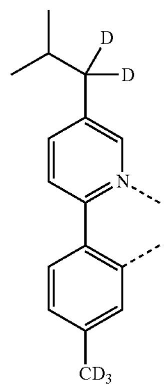
$L_{B283}$
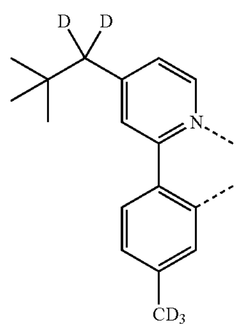
$L_{B284}$
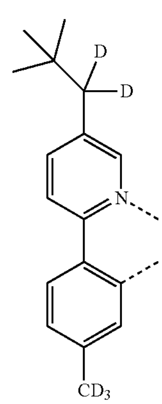

-continued
$L_{B285}$
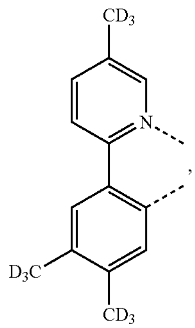
$L_{B286}$
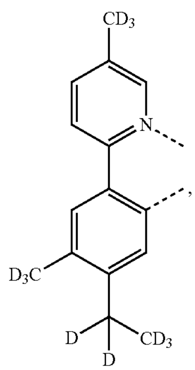
$L_{B287}$
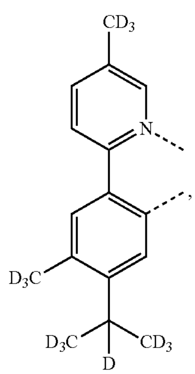
$L_{B288}$
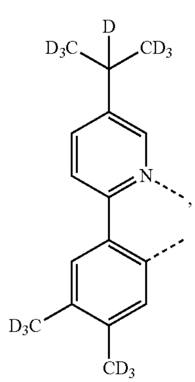
-continued
$L_{B289}$
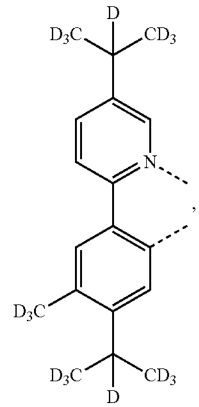
$L_{B290}$
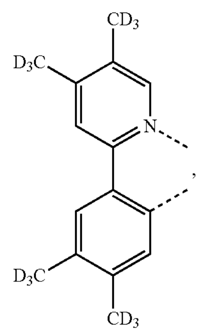
$L_{B291}$
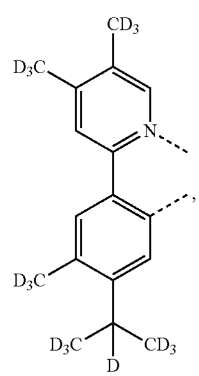
$L_{B292}$
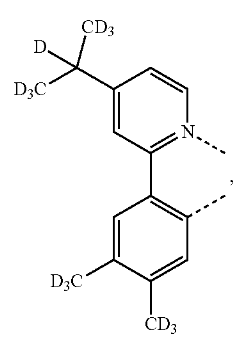

$L_{B293}$
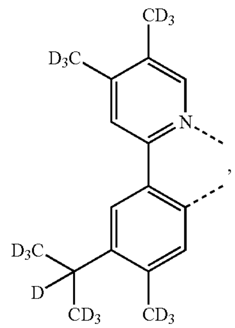
$L_{B294}$
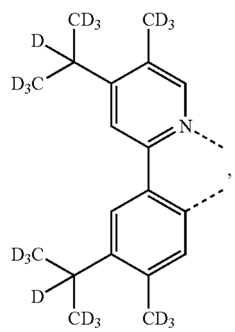
$L_{B295}$
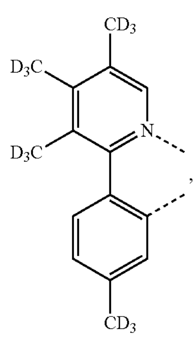
$L_{B296}$
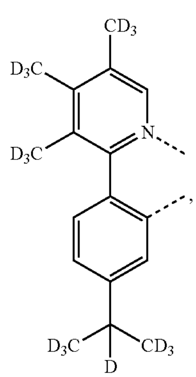
$L_{B297}$
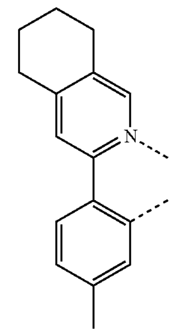
$L_{B298}$
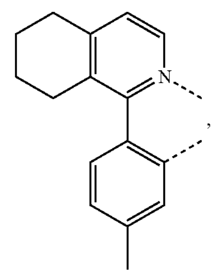
$L_{B299}$
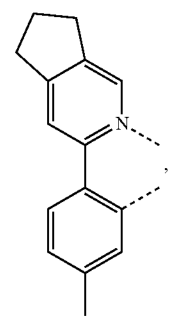
$L_{B300}$
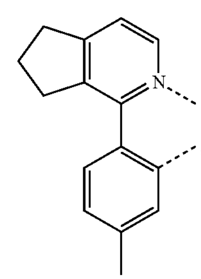
$L_{B301}$
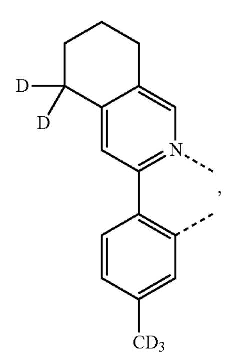

-continued
$L_{B302}$
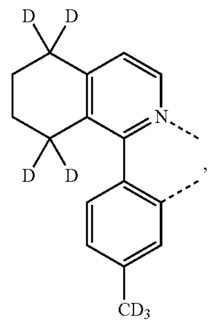
$L_{B303}$
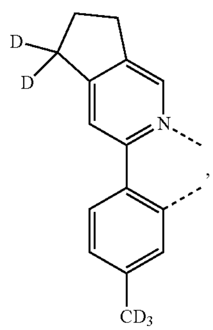
$L_{B304}$
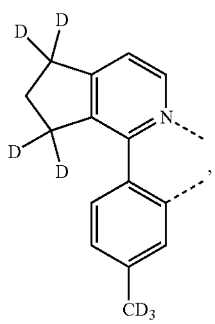
$L_{B305}$
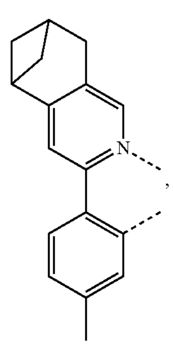
-continued
$L_{B306}$
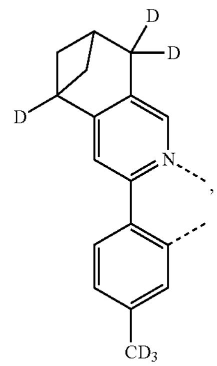
$L_{B307}$
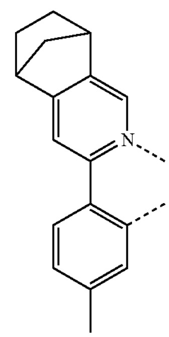
$L_{B308}$
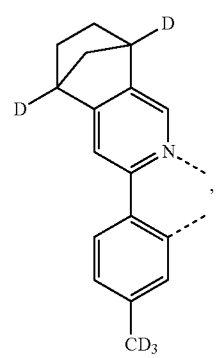
$L_{B309}$
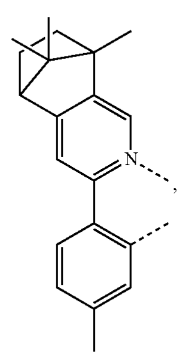

-continued
$L_{B310}$
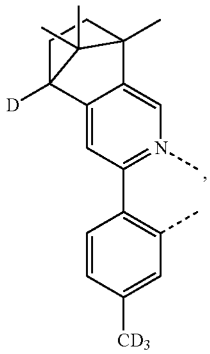
$L_{B311}$
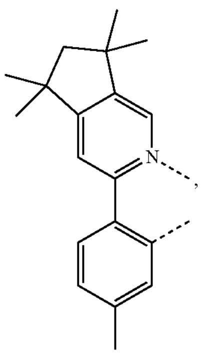
$L_{B312}$
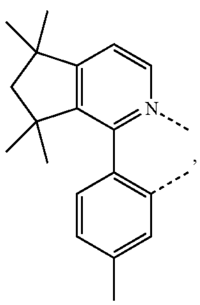
$L_{B312}$
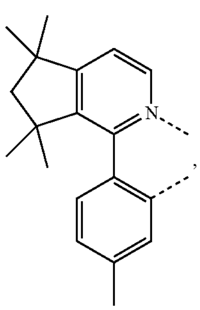
$L_{B313}$
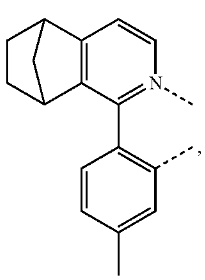
-continued
$L_{B314}$
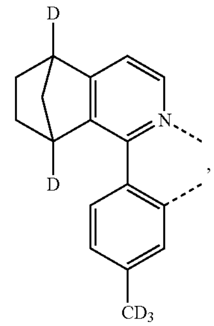
$L_{B315}$
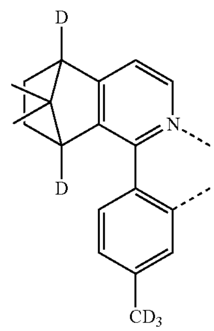
$L_{B316}$
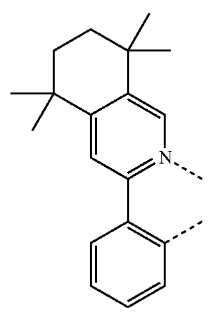
$L_{B317}$
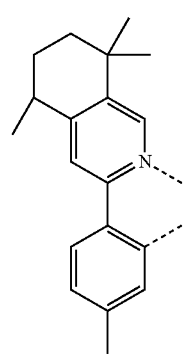

-continued
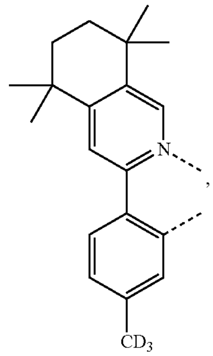
$L_{B318}$
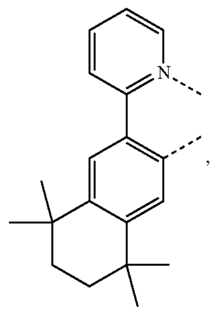
$L_{B319}$
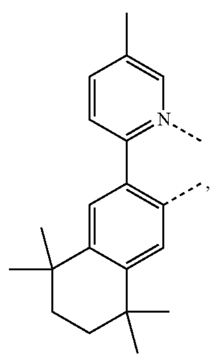
$L_{B320}$
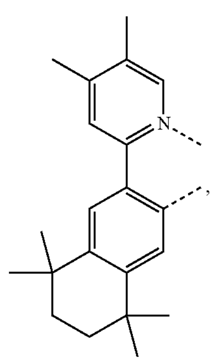
$L_{B321}$
-continued
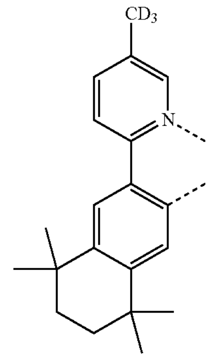
$L_{B322}$
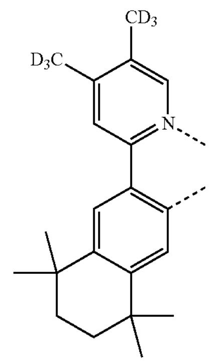
$L_{B323}$
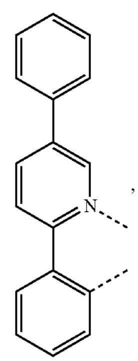
$L_{B324}$
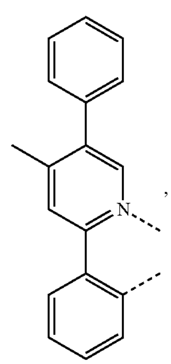
$L_{B325}$ -continued
$L_{B326}$
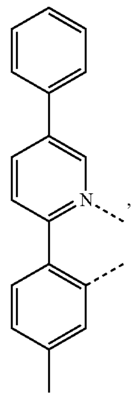
$L_{B327}$
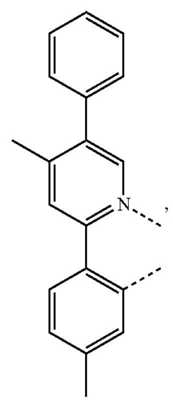
$L_{B328}$
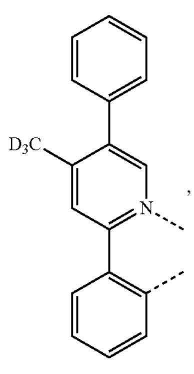
$L_{B329}$
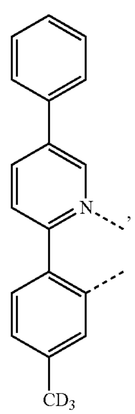
-continued
$L_{B330}$
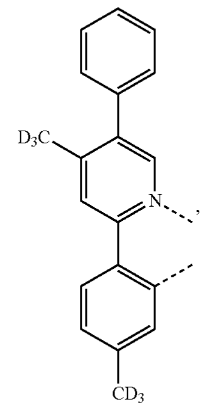
$L_{B331}$
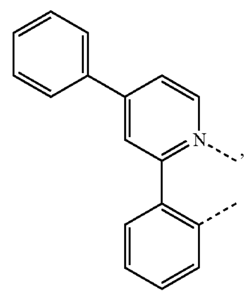
$L_{B332}$
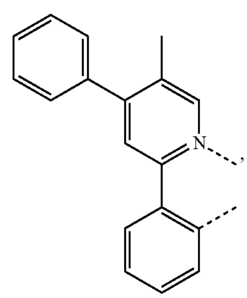
$L_{B333}$
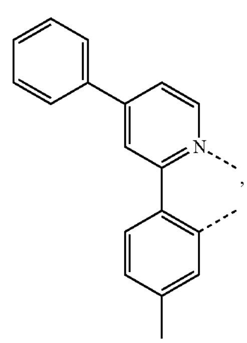

-continued
$L_{B334}$
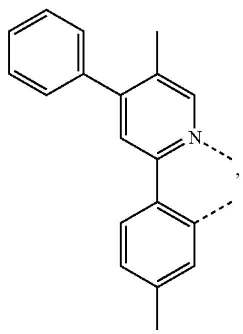
$L_{B335}$
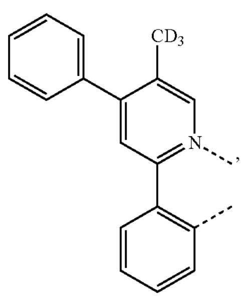
$L_{B336}$
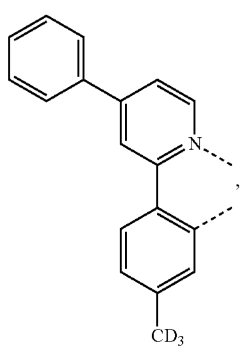
$L_{B337}$
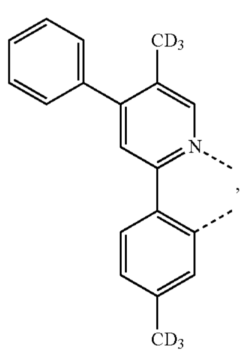
-continued
$L_{B338}$
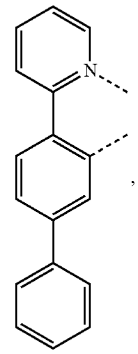
$L_{B339}$
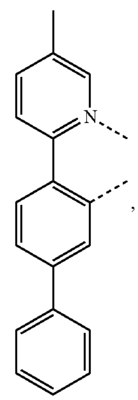
$L_{B340}$
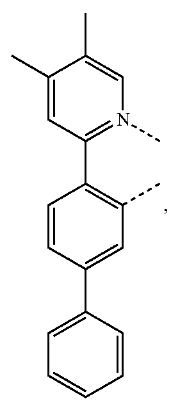
$L_{B341}$
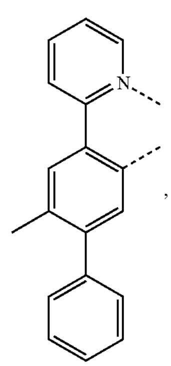

-continued
$L_{B342}$
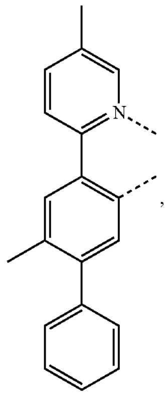
$L_{B343}$
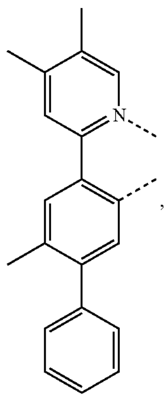
$L_{B344}$
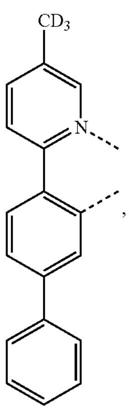
$L_{B345}$
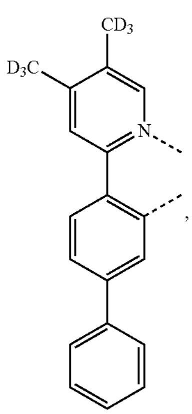
-continued
$L_{B346}$
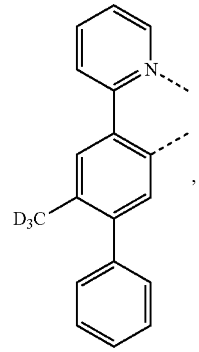
$L_{B347}$
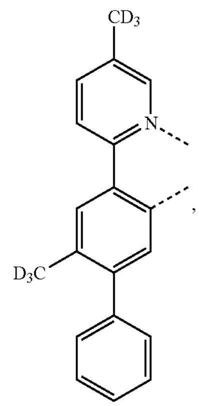
$L_{B348}$
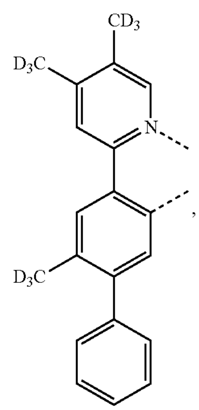
$L_{B349}$
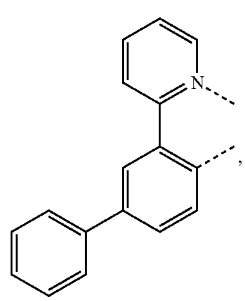

-continued
$L_{B350}$
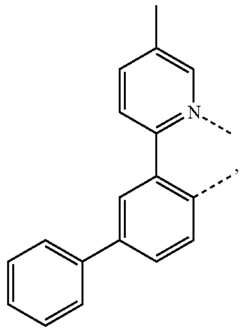
$L_{B351}$
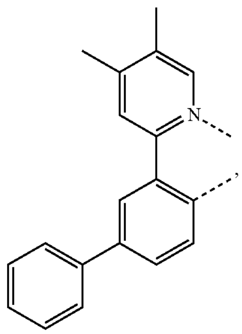
$L_{B352}$
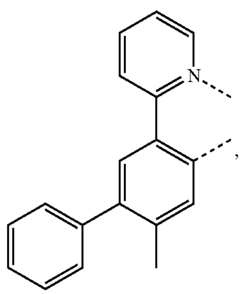
$L_{B353}$
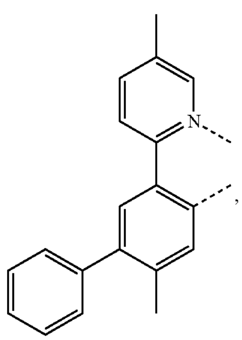
$L_{B354}$
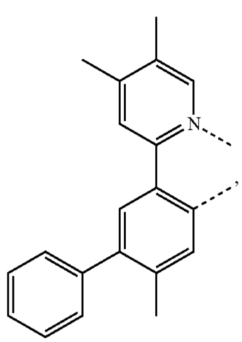
-continued
$L_{B355}$
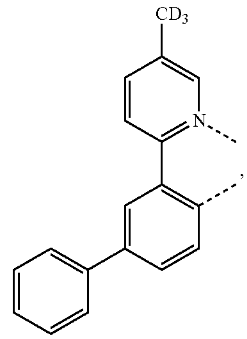
$L_{B356}$
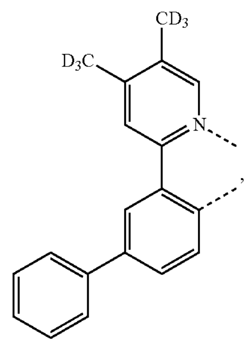
$L_{B357}$
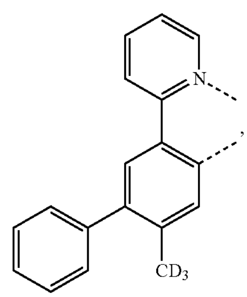
$L_{B358}$
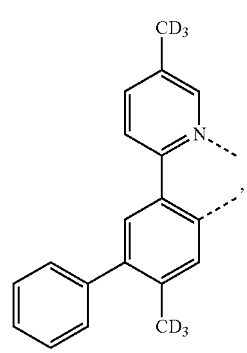

-continued
$L_{B359}$
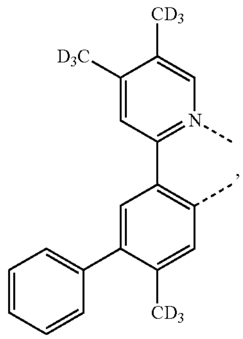
$L_{B360}$
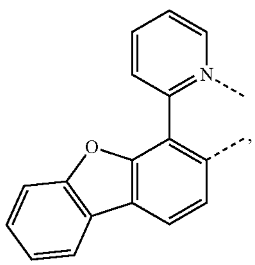
$L_{B361}$
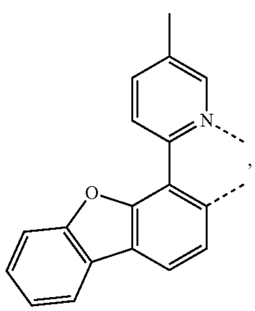
$L_{B362}$
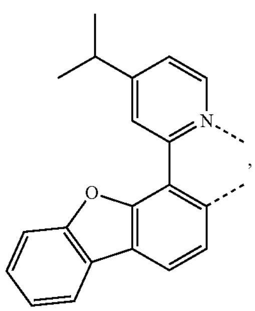
$L_{B363}$
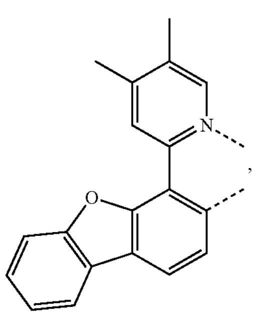
-continued
$L_{B364}$
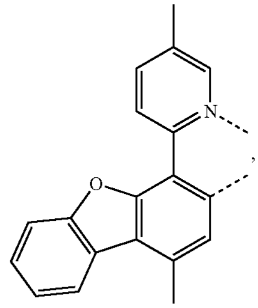
$L_{B365}$
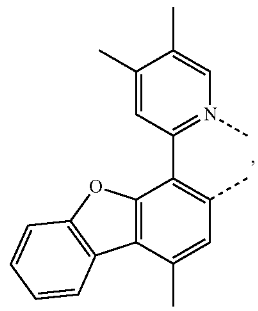
$L_{B366}$
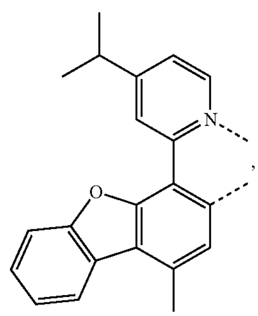
$L_{B367}$
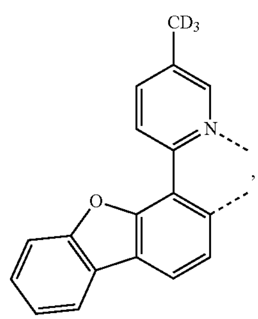
$L_{B368}$
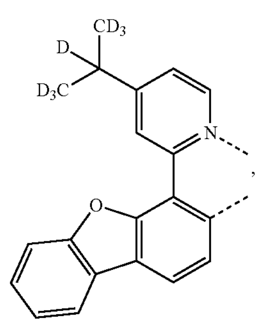

-continued
$L_{B369}$
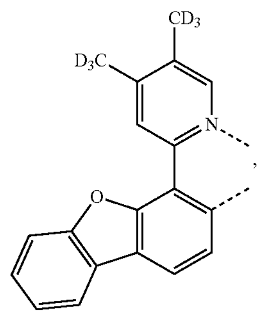
$L_{B370}$
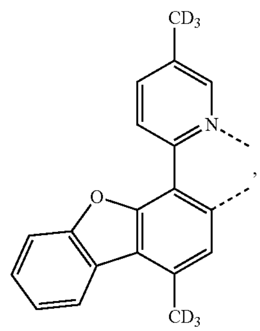
$L_{B371}$
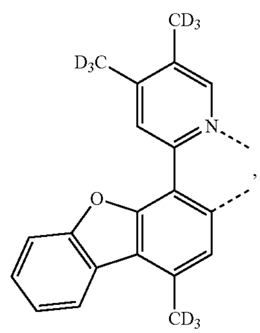
$L_{B372}$
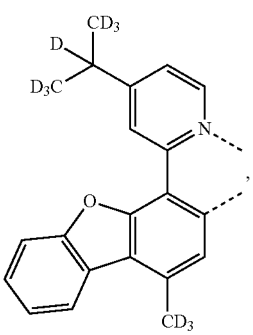
$L_{B373}$
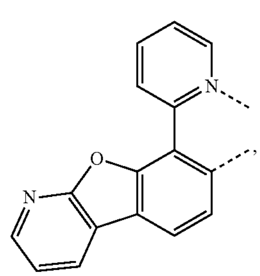
-continued
$L_{B374}$
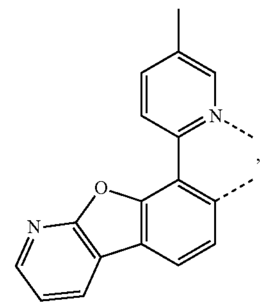
$L_{B375}$
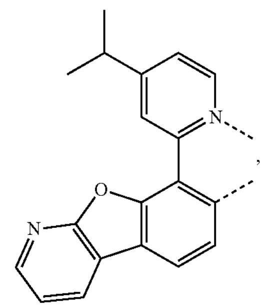
$L_{B376}$
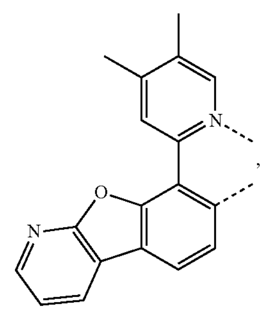
$L_{B377}$
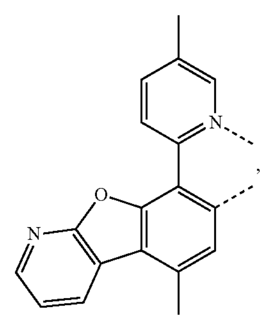
$L_{B378}$
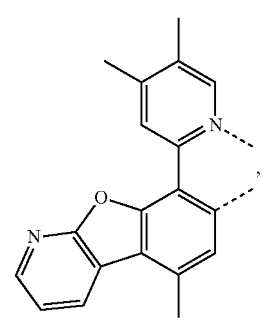

$L_{B379}$
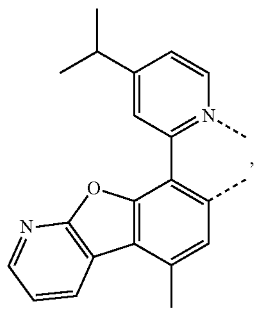
$L_{B380}$
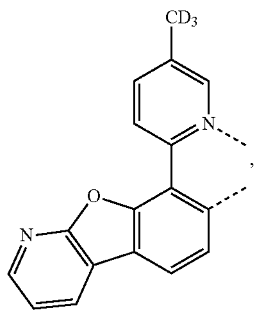
$L_{B381}$
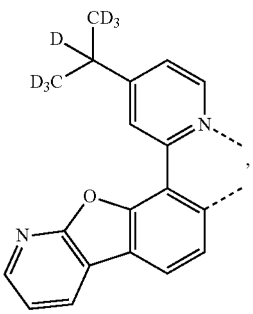
$L_{B382}$
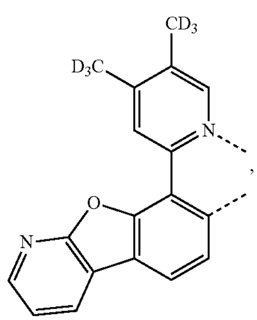
$L_{B383}$
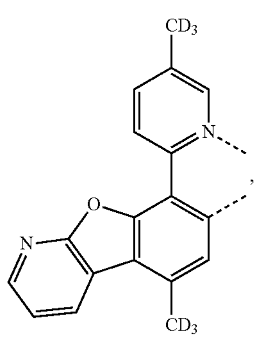
$L_{B384}$
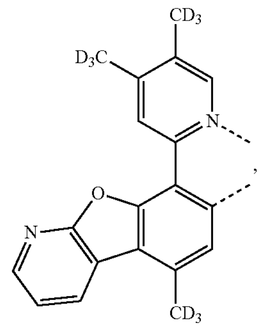
$L_{B385}$
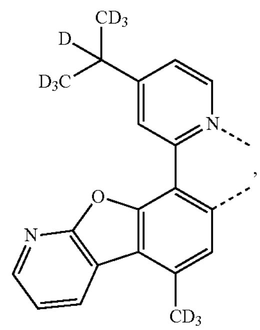
$L_{B386}$
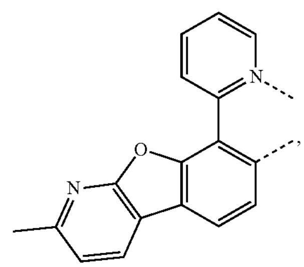
$L_{B387}$
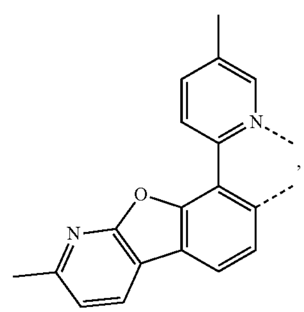
$L_{B388}$
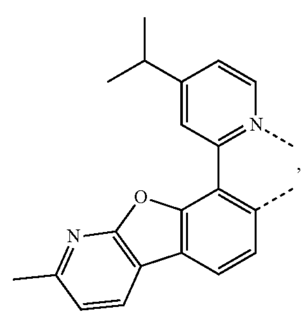

$L_{B389}$
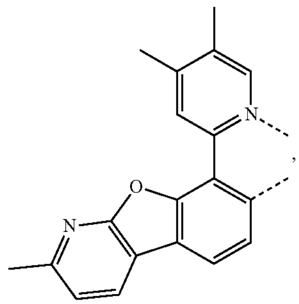
$L_{B390}$
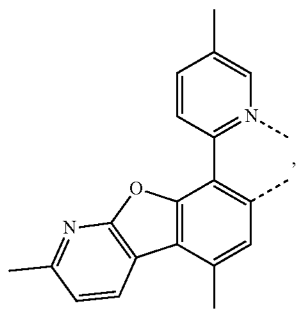
$L_{B391}$
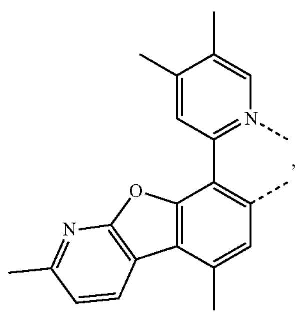
$L_{B392}$
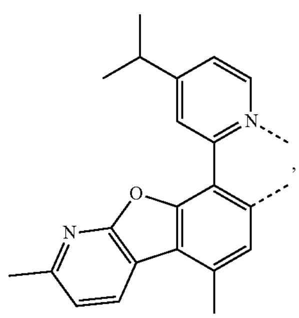
$L_{B393}$
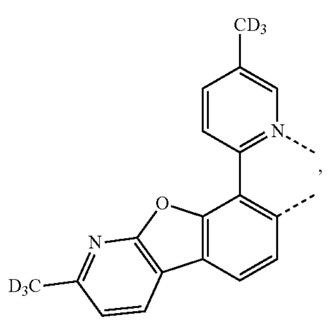
$L_{B394}$
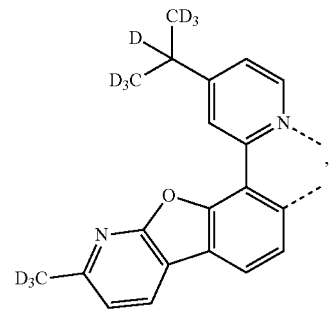
$L_{B395}$
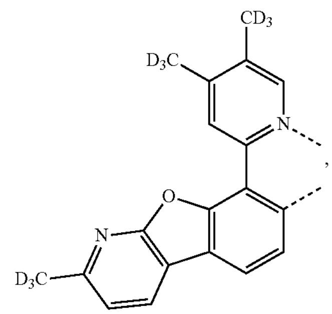
$L_{B396}$
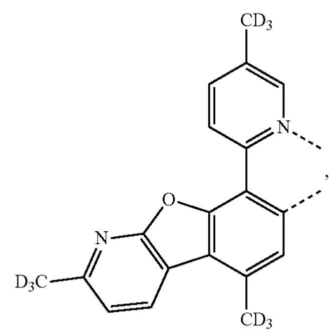
$L_{B397}$
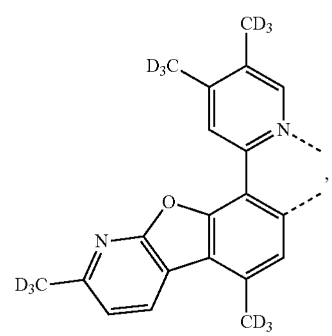
$L_{B398}$
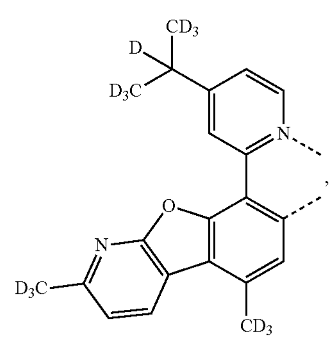

-continued
$L_{B399}$
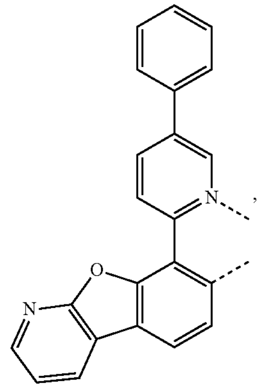
$L_{B400}$
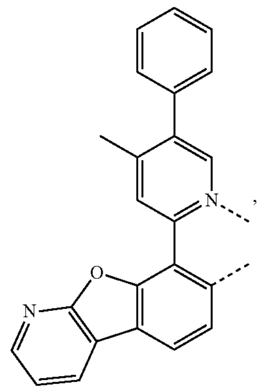
$L_{B401}$
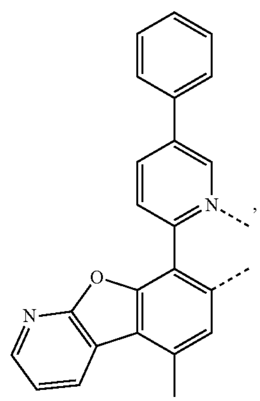
$L_{B402}$
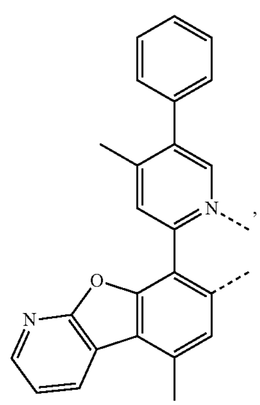
-continued
$L_{B403}$
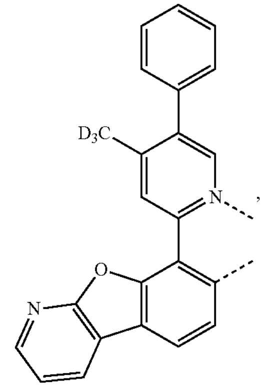
$L_{B404}$
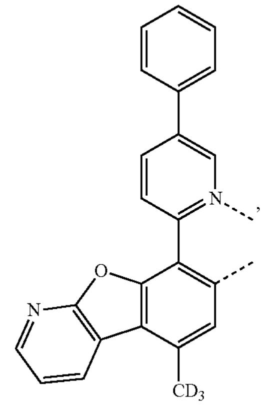
$L_{B405}$
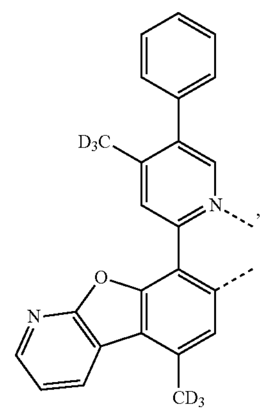
$L_{B406}$
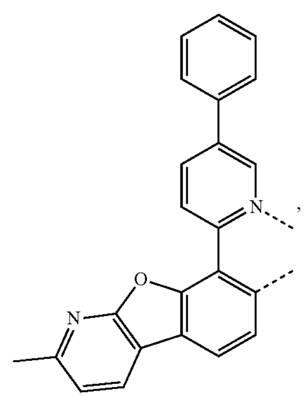

-continued
$L_{B407}$
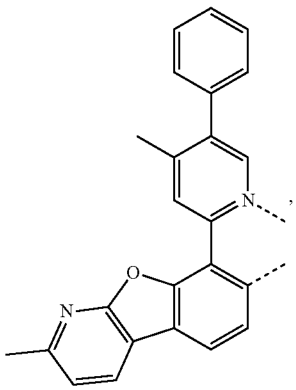
$L_{B408}$
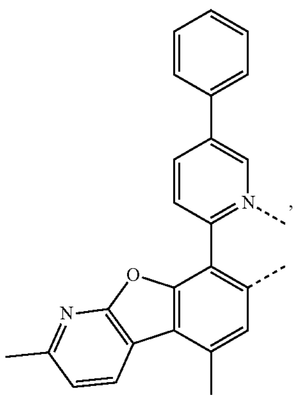
$L_{B409}$
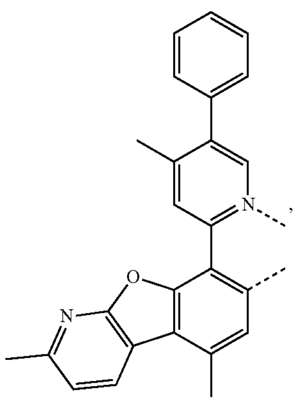
$L_{B410}$
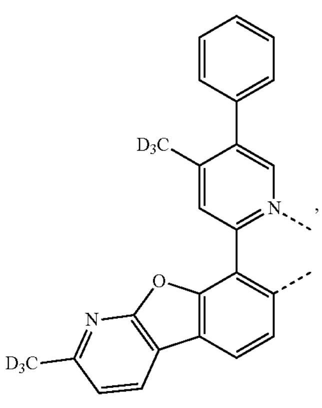
-continued
$L_{B411}$
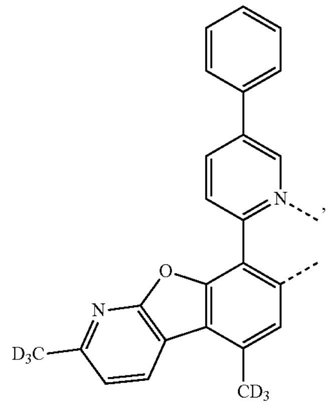
$L_{B412}$
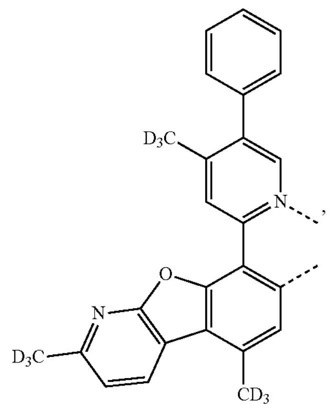
$L_{B413}$
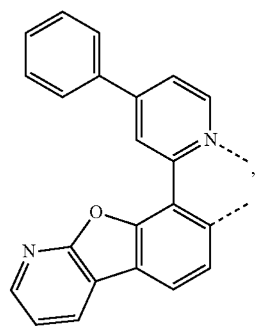
$L_{B414}$
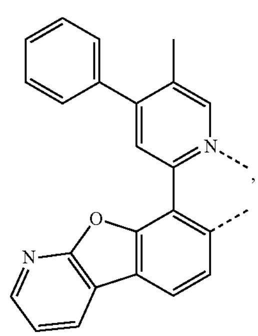

-continued
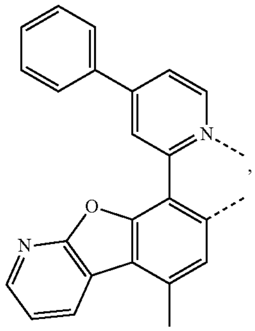
$L_{B415}$
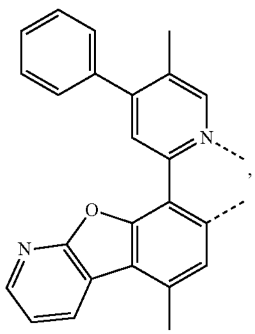
$L_{B416}$
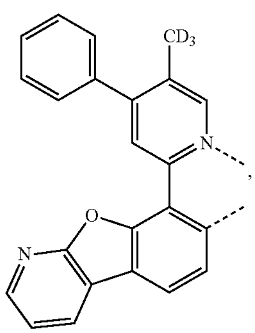
$L_{B417}$
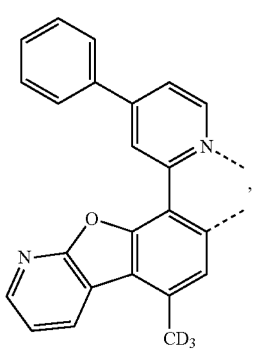
$L_{B418}$
-continued
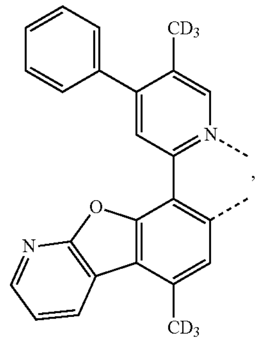
$L_{B419}$
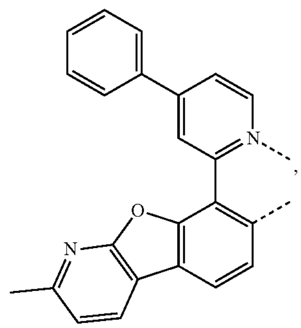
$L_{B420}$
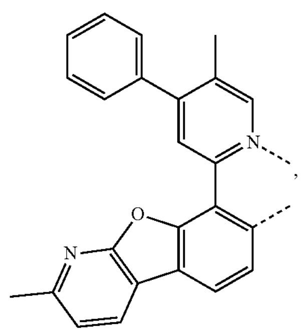
$L_{B421}$
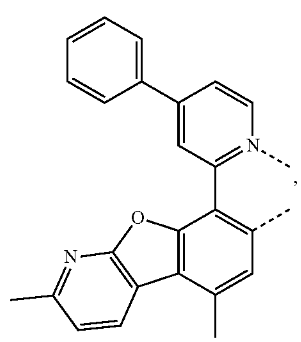
$L_{B422}$ -continued
$L_{B423}$
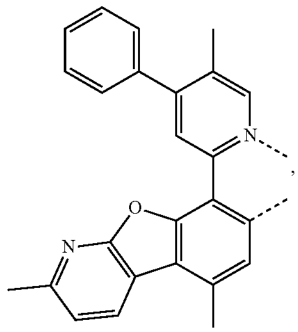
$L_{B424}$
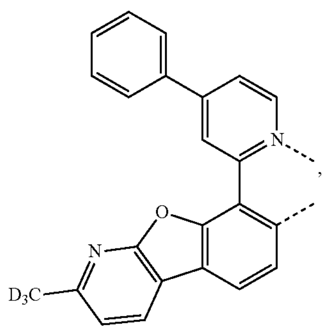
$L_{B425}$
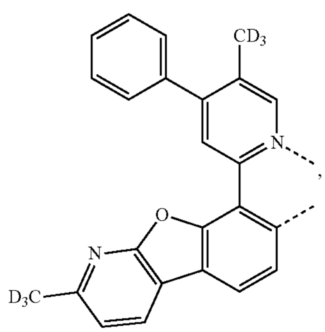
$L_{B426}$
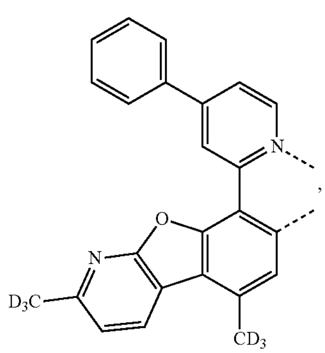
-continued
$L_{B427}$
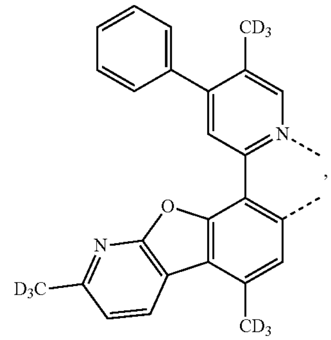
$L_{B428}$
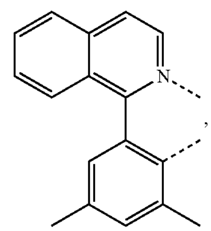
$L_{B429}$
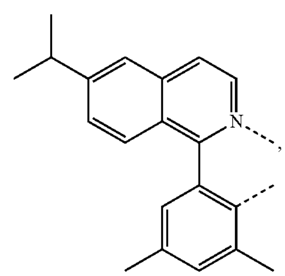
$L_{B430}$
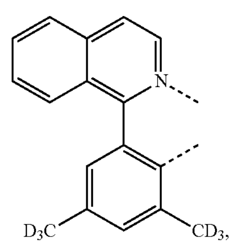
$L_{B431}$
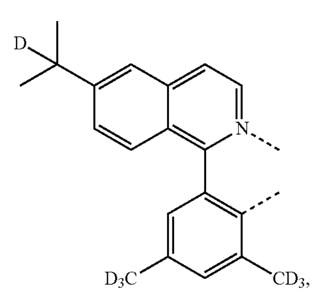

$L_{B432}$
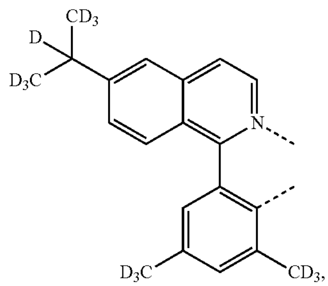
$L_{B433}$
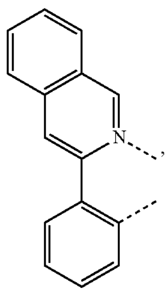
$L_{B434}$
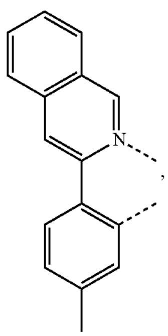
$L_{B435}$
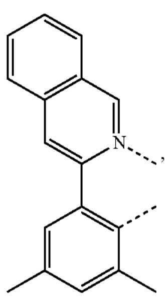
$L_{B436}$
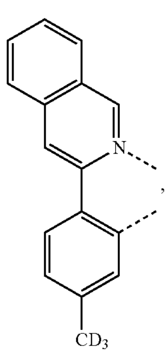
$L_{B437}$
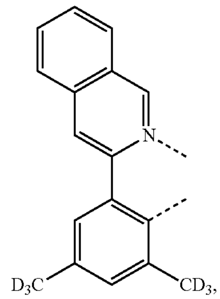
$L_{B438}$
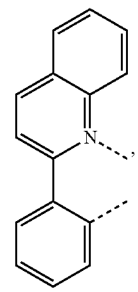
$L_{B439}$
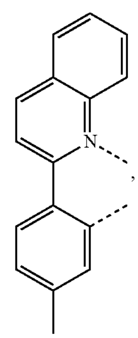
$L_{B440}$
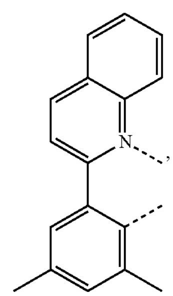
$L_{B441}$
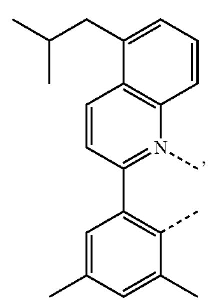

$L_{B442}$
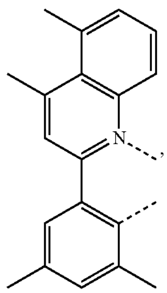
$L_{B443}$
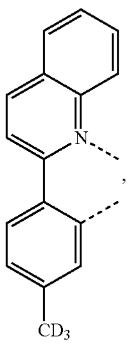
$L_{B444}$
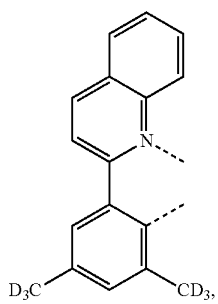
$L_{B445}$
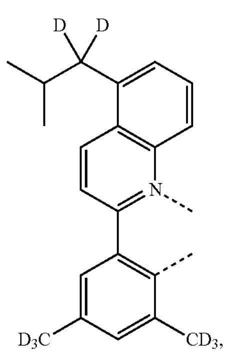
$L_{B446}$
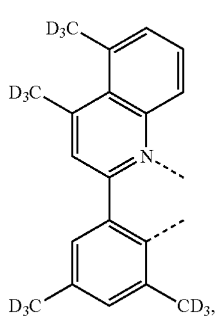
$L_{B447}$
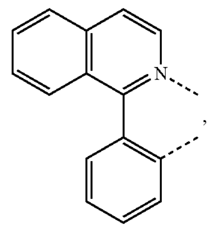
$L_{B448}$
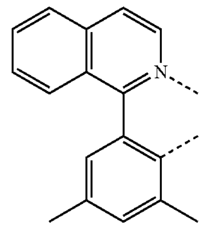
$L_{B449}$
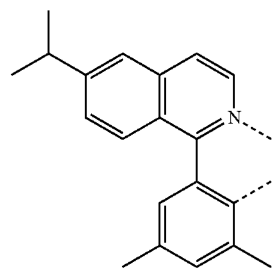
$L_{B450}$
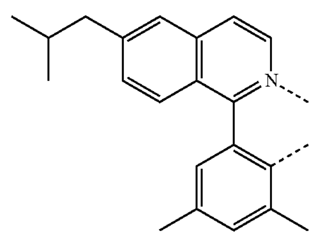
$L_{B451}$
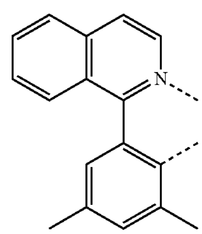
$L_{B452}$
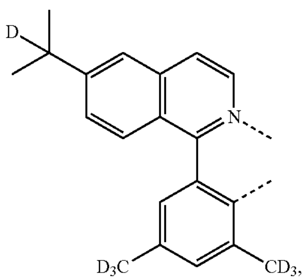

-continued
$L_{B453}$
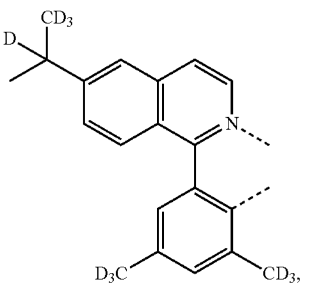
$L_{B454}$
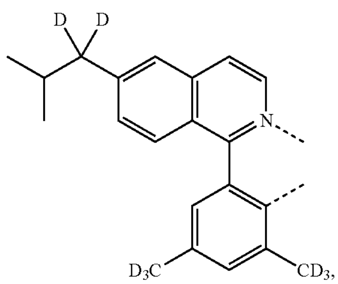
$L_{B455}$
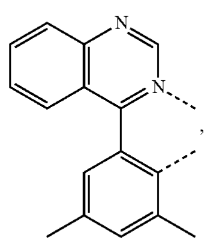
$L_{B456}$
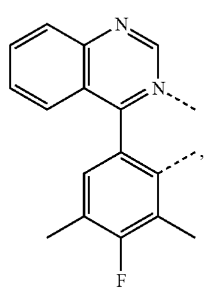
$L_{B457}$
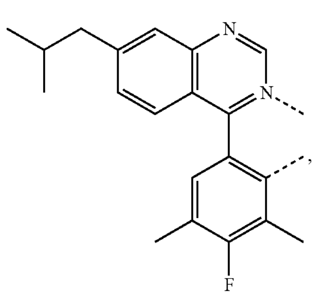
-continued
$L_{B458}$
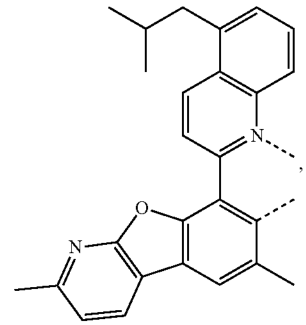
$L_{B459}$
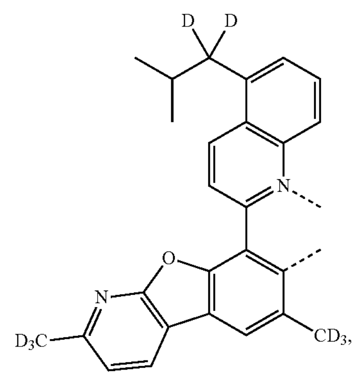
$L_{B460}$
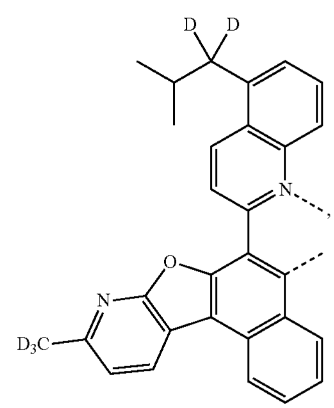
$L_{B461}$
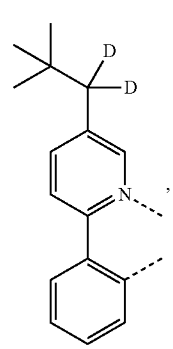

-continued
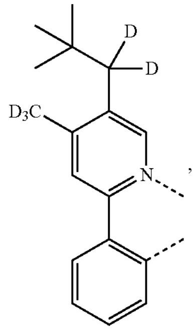
$L_{B462}$
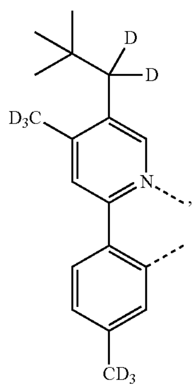
$L_{B463}$
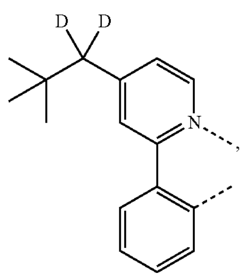
$L_{B464}$
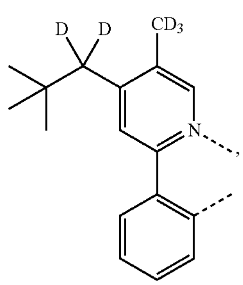
$L_{B465}$
-continued
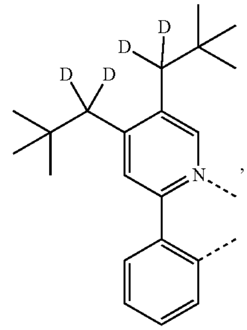
$L_{B466}$
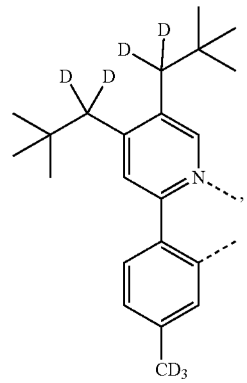
$L_{B467}$
and
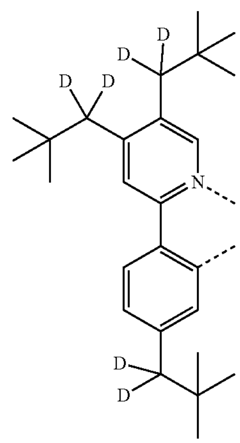
$L_{B468}$
and
wherein $L_{Cj}$ is selected from the group consisting of the following structures:
$L_{C1}$ through $L_{C1260}$ are based on a structure of Formula X,
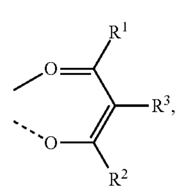

in which $R^1$, $R^2$, and $R^3$ are defined as:

| Ligand | $R^1$ | $R^2$ | $R^3$ | Ligand | $R^1$ | $R^2$ | $R^3$ | Ligand | $R^1$ | $R^2$ | $R^3$ |
|---|---|---|---|---|---|---|---|---|---|---|---|
| $L_{C1}$ | $R^{D1}$ | $R^{D1}$ | H | $L_{C421}$ | $R^{D26}$ | $R^{D21}$ | H | $L_{C841}$ | $R^{D7}$ | $R^{D14}$ | $R^{D1}$ |
| $L_{C2}$ | $R^{D2}$ | $R^{D2}$ | H | $L_{C422}$ | $R^{D26}$ | $R^{D23}$ | H | $L_{C842}$ | $R^{D7}$ | $R^{D15}$ | $R^{D1}$ |
| $L_{C3}$ | $R^{D3}$ | $R^{D3}$ | H | $L_{C423}$ | $R^{D26}$ | $R^{D24}$ | H | $L_{C843}$ | $R^{D7}$ | $R^{D16}$ | $R^{D1}$ |
| $L_{C4}$ | $R^{D4}$ | $R^{D4}$ | H | $L_{C424}$ | $R^{D26}$ | $R^{D25}$ | H | $L_{C844}$ | $R^{D7}$ | $R^{D17}$ | $R^{D1}$ |
| $L_{C5}$ | $R^{D5}$ | $R^{D5}$ | H | $L_{C425}$ | $R^{D26}$ | $R^{D27}$ | H | $L_{C845}$ | $R^{D7}$ | $R^{D18}$ | $R^{D1}$ |
| $L_{C6}$ | $R^{D6}$ | $R^{D6}$ | H | $L_{C426}$ | $R^{D26}$ | $R^{D28}$ | H | $L_{C846}$ | $R^{D7}$ | $R^{D19}$ | $R^{D1}$ |
| $L_{C7}$ | $R^{D7}$ | $R^{D7}$ | H | $L_{C427}$ | $R^{D26}$ | $R^{D29}$ | H | $L_{C847}$ | $R^{D7}$ | $R^{D20}$ | $R^{D1}$ |
| $L_{C8}$ | $R^{D8}$ | $R^{D8}$ | H | $L_{C428}$ | $R^{D26}$ | $R^{D30}$ | H | $L_{C848}$ | $R^{D7}$ | $R^{D21}$ | $R^{D1}$ |
| $L_{C9}$ | $R^{D9}$ | $R^{D9}$ | H | $L_{C429}$ | $R^{D26}$ | $R^{D31}$ | H | $L_{C849}$ | $R^{D7}$ | $R^{D22}$ | $R^{D1}$ |
| $L_{C10}$ | $R^{D10}$ | $R^{D10}$ | H | $L_{C430}$ | $R^{D26}$ | $R^{D32}$ | H | $L_{C850}$ | $R^{D7}$ | $R^{D23}$ | $R^{D1}$ |
| $L_{C11}$ | $R^{D11}$ | $R^{D11}$ | H | $L_{C431}$ | $R^{D26}$ | $R^{D33}$ | H | $L_{C851}$ | $R^{D7}$ | $R^{D24}$ | $R^{D1}$ |
| $L_{C12}$ | $R^{D12}$ | $R^{D12}$ | H | $L_{C432}$ | $R^{D26}$ | $R^{D34}$ | H | $L_{C852}$ | $R^{D7}$ | $R^{D25}$ | $R^{D1}$ |
| $L_{C13}$ | $R^{D13}$ | $R^{D13}$ | H | $L_{C433}$ | $R^{D26}$ | $R^{D35}$ | H | $L_{C853}$ | $R^{D7}$ | $R^{D26}$ | $R^{D1}$ |
| $L_{C14}$ | $R^{D14}$ | $R^{D14}$ | H | $L_{C434}$ | $R^{D26}$ | $R^{D40}$ | H | $L_{C854}$ | $R^{D7}$ | $R^{D27}$ | $R^{D1}$ |
| $L_{C15}$ | $R^{D15}$ | $R^{D15}$ | H | $L_{C435}$ | $R^{D26}$ | $R^{D41}$ | H | $L_{C855}$ | $R^{D7}$ | $R^{D28}$ | $R^{D1}$ |
| $L_{C16}$ | $R^{D16}$ | $R^{D16}$ | H | $L_{C436}$ | $R^{D26}$ | $R^{D42}$ | H | $L_{C856}$ | $R^{D7}$ | $R^{D29}$ | $R^{D1}$ |
| $L_{C17}$ | $R^{D17}$ | $R^{D17}$ | H | $L_{C437}$ | $R^{D26}$ | $R^{D64}$ | H | $L_{C857}$ | $R^{D7}$ | $R^{D30}$ | $R^{D1}$ |
| $L_{C18}$ | $R^{D18}$ | $R^{D18}$ | H | $L_{C438}$ | $R^{D26}$ | $R^{D66}$ | H | $L_{C858}$ | $R^{D7}$ | $R^{D31}$ | $R^{D1}$ |
| $L_{C19}$ | $R^{D19}$ | $R^{D19}$ | H | $L_{C439}$ | $R^{D26}$ | $R^{D68}$ | H | $L_{C859}$ | $R^{D7}$ | $R^{D32}$ | $R^{D1}$ |
| $L_{C20}$ | $R^{D20}$ | $R^{D20}$ | H | $L_{C440}$ | $R^{D26}$ | $R^{D76}$ | H | $L_{C860}$ | $R^{D7}$ | $R^{D33}$ | $R^{D1}$ |
| $L_{C21}$ | $R^{D21}$ | $R^{D21}$ | H | $L_{C441}$ | $R^{D35}$ | $R^{D5}$ | H | $L_{C861}$ | $R^{D7}$ | $R^{D34}$ | $R^{D1}$ |
| $L_{C22}$ | $R^{D22}$ | $R^{D22}$ | H | $L_{C442}$ | $R^{D35}$ | $R^{D6}$ | H | $L_{C862}$ | $R^{D7}$ | $R^{D35}$ | $R^{D1}$ |
| $L_{C23}$ | $R^{D23}$ | $R^{D23}$ | H | $L_{C443}$ | $R^{D35}$ | $R^{D9}$ | H | $L_{C863}$ | $R^{D7}$ | $R^{D40}$ | $R^{D1}$ |
| $L_{C24}$ | $R^{D24}$ | $R^{D24}$ | H | $L_{C444}$ | $R^{D35}$ | $R^{D10}$ | H | $L_{C864}$ | $R^{D7}$ | $R^{D41}$ | $R^{D1}$ |
| $L_{C25}$ | $R^{D25}$ | $R^{D25}$ | H | $L_{C445}$ | $R^{D35}$ | $R^{D12}$ | H | $L_{C865}$ | $R^{D7}$ | $R^{D42}$ | $R^{D1}$ |
| $L_{C26}$ | $R^{D26}$ | $R^{D26}$ | H | $L_{C446}$ | $R^{D35}$ | $R^{D15}$ | H | $L_{C866}$ | $R^{D7}$ | $R^{D64}$ | $R^{D1}$ |
| $L_{C27}$ | $R^{D27}$ | $R^{D27}$ | H | $L_{C447}$ | $R^{D35}$ | $R^{D16}$ | H | $L_{C867}$ | $R^{D7}$ | $R^{D66}$ | $R^{D1}$ |
| $L_{C28}$ | $R^{D28}$ | $R^{D28}$ | H | $L_{C448}$ | $R^{D35}$ | $R^{D17}$ | H | $L_{C868}$ | $R^{D7}$ | $R^{D68}$ | $R^{D1}$ |
| $L_{C29}$ | $R^{D29}$ | $R^{D29}$ | H | $L_{C449}$ | $R^{D35}$ | $R^{D18}$ | H | $L_{C869}$ | $R^{D7}$ | $R^{D76}$ | $R^{D1}$ |
| $L_{C30}$ | $R^{D30}$ | $R^{D30}$ | H | $L_{C450}$ | $R^{D35}$ | $R^{D19}$ | H | $L_{C870}$ | $R^{D8}$ | $R^{D5}$ | $R^{D1}$ |
| $L_{C31}$ | $R^{D31}$ | $R^{D31}$ | H | $L_{C451}$ | $R^{D35}$ | $R^{D20}$ | H | $L_{C871}$ | $R^{D8}$ | $R^{D6}$ | $R^{D1}$ |
| $L_{C32}$ | $R^{D32}$ | $R^{D32}$ | H | $L_{C452}$ | $R^{D35}$ | $R^{D21}$ | H | $L_{C872}$ | $R^{D8}$ | $R^{D9}$ | $R^{D1}$ |
| $L_{C33}$ | $R^{D33}$ | $R^{D33}$ | H | $L_{C453}$ | $R^{D35}$ | $R^{D23}$ | H | $L_{C873}$ | $R^{D8}$ | $R^{D10}$ | $R^{D1}$ |
| $L_{C34}$ | $R^{D34}$ | $R^{D34}$ | H | $L_{C454}$ | $R^{D35}$ | $R^{D24}$ | H | $L_{C874}$ | $R^{D8}$ | $R^{D11}$ | $R^{D1}$ |
| $L_{C35}$ | $R^{D35}$ | $R^{D35}$ | H | $L_{C455}$ | $R^{D35}$ | $R^{D25}$ | H | $L_{C875}$ | $R^{D8}$ | $R^{D12}$ | $R^{D1}$ |
| $L_{C36}$ | $R^{D40}$ | $R^{D40}$ | H | $L_{C456}$ | $R^{D35}$ | $R^{D27}$ | H | $L_{C876}$ | $R^{D8}$ | $R^{D13}$ | $R^{D1}$ |
| $L_{C37}$ | $R^{D41}$ | $R^{D41}$ | H | $L_{C457}$ | $R^{D35}$ | $R^{D28}$ | H | $L_{C877}$ | $R^{D8}$ | $R^{D14}$ | $R^{D1}$ |
| $L_{C38}$ | $R^{D42}$ | $R^{D42}$ | H | $L_{C458}$ | $R^{D35}$ | $R^{D29}$ | H | $L_{C878}$ | $R^{D8}$ | $R^{D15}$ | $R^{D1}$ |
| $L_{C39}$ | $R^{D64}$ | $R^{D64}$ | H | $L_{C459}$ | $R^{D35}$ | $R^{D30}$ | H | $L_{C879}$ | $R^{D8}$ | $R^{D16}$ | $R^{D1}$ |
| $L_{C40}$ | $R^{D66}$ | $R^{D66}$ | H | $L_{C460}$ | $R^{D35}$ | $R^{D31}$ | H | $L_{C880}$ | $R^{D8}$ | $R^{D17}$ | $R^{D1}$ |
| $L_{C41}$ | $R^{D68}$ | $R^{D68}$ | H | $L_{C461}$ | $R^{D35}$ | $R^{D32}$ | H | $L_{C881}$ | $R^{D8}$ | $R^{D18}$ | $R^{D1}$ |
| $L_{C42}$ | $R^{D76}$ | $R^{D76}$ | H | $L_{C462}$ | $R^{D35}$ | $R^{D33}$ | H | $L_{C882}$ | $R^{D8}$ | $R^{D19}$ | $R^{D1}$ |
| $L_{C43}$ | $R^{D1}$ | $R^{D2}$ | H | $L_{C463}$ | $R^{D35}$ | $R^{D34}$ | H | $L_{C883}$ | $R^{D8}$ | $R^{D20}$ | $R^{D1}$ |
| $L_{C44}$ | $R^{D1}$ | $R^{D3}$ | H | $L_{C464}$ | $R^{D35}$ | $R^{D40}$ | H | $L_{C884}$ | $R^{D8}$ | $R^{D21}$ | $R^{D1}$ |
| $L_{C45}$ | $R^{D1}$ | $R^{D4}$ | H | $L_{C465}$ | $R^{D35}$ | $R^{D41}$ | H | $L_{C885}$ | $R^{D8}$ | $R^{D22}$ | $R^{D1}$ |
| $L_{C46}$ | $R^{D1}$ | $R^{D5}$ | H | $L_{C466}$ | $R^{D35}$ | $R^{D42}$ | H | $L_{C886}$ | $R^{D8}$ | $R^{D23}$ | $R^{D1}$ |
| $L_{C47}$ | $R^{D1}$ | $R^{D6}$ | H | $L_{C467}$ | $R^{D35}$ | $R^{D64}$ | H | $L_{C887}$ | $R^{D8}$ | $R^{D24}$ | $R^{D1}$ |
| $L_{C48}$ | $R^{D1}$ | $R^{D7}$ | H | $L_{C468}$ | $R^{D35}$ | $R^{D66}$ | H | $L_{C888}$ | $R^{D8}$ | $R^{D25}$ | $R^{D1}$ |
| $L_{C49}$ | $R^{D1}$ | $R^{D8}$ | H | $L_{C469}$ | $R^{D35}$ | $R^{D68}$ | H | $L_{C889}$ | $R^{D8}$ | $R^{D26}$ | $R^{D1}$ |
| $L_{C50}$ | $R^{D1}$ | $R^{D9}$ | H | $L_{C470}$ | $R^{D35}$ | $R^{D76}$ | H | $L_{C890}$ | $R^{D8}$ | $R^{D27}$ | $R^{D1}$ |
| $L_{C51}$ | $R^{D1}$ | $R^{D10}$ | H | $L_{C471}$ | $R^{D40}$ | $R^{D5}$ | H | $L_{C891}$ | $R^{D8}$ | $R^{D28}$ | $R^{D1}$ |
| $L_{C52}$ | $R^{D1}$ | $R^{D11}$ | H | $L_{C472}$ | $R^{D40}$ | $R^{D6}$ | H | $L_{C892}$ | $R^{D8}$ | $R^{D29}$ | $R^{D1}$ |
| $L_{C53}$ | $R^{D1}$ | $R^{D12}$ | H | $L_{C473}$ | $R^{D40}$ | $R^{D9}$ | H | $L_{C893}$ | $R^{D8}$ | $R^{D30}$ | $R^{D1}$ |
| $L_{C54}$ | $R^{D1}$ | $R^{D13}$ | H | $L_{C474}$ | $R^{D40}$ | $R^{D10}$ | H | $L_{C894}$ | $R^{D8}$ | $R^{D31}$ | $R^{D1}$ |
| $L_{C55}$ | $R^{D1}$ | $R^{D14}$ | H | $L_{C475}$ | $R^{D40}$ | $R^{D12}$ | H | $L_{C895}$ | $R^{D8}$ | $R^{D32}$ | $R^{D1}$ |
| $L_{C56}$ | $R^{D1}$ | $R^{D15}$ | H | $L_{C476}$ | $R^{D40}$ | $R^{D15}$ | H | $L_{C896}$ | $R^{D8}$ | $R^{D33}$ | $R^{D1}$ |
| $L_{C57}$ | $R^{D1}$ | $R^{D16}$ | H | $L_{C477}$ | $R^{D40}$ | $R^{D16}$ | H | $L_{C897}$ | $R^{D8}$ | $R^{D34}$ | $R^{D1}$ |
| $L_{C58}$ | $R^{D1}$ | $R^{D17}$ | H | $L_{C478}$ | $R^{D40}$ | $R^{D17}$ | H | $L_{C898}$ | $R^{D8}$ | $R^{D35}$ | $R^{D1}$ |
| $L_{C59}$ | $R^{D1}$ | $R^{D18}$ | H | $L_{C479}$ | $R^{D40}$ | $R^{D18}$ | H | $L_{C899}$ | $R^{D8}$ | $R^{D40}$ | $R^{D1}$ |
| $L_{C60}$ | $R^{D1}$ | $R^{D19}$ | H | $L_{C480}$ | $R^{D40}$ | $R^{D19}$ | H | $L_{C900}$ | $R^{D8}$ | $R^{D41}$ | $R^{D1}$ |
| $L_{C61}$ | $R^{D1}$ | $R^{D20}$ | H | $L_{C481}$ | $R^{D40}$ | $R^{D20}$ | H | $L_{C901}$ | $R^{D8}$ | $R^{D42}$ | $R^{D1}$ |
| $L_{C62}$ | $R^{D1}$ | $R^{D21}$ | H | $L_{C482}$ | $R^{D40}$ | $R^{D21}$ | H | $L_{C902}$ | $R^{D8}$ | $R^{D64}$ | $R^{D1}$ |
| $L_{C63}$ | $R^{D1}$ | $R^{D22}$ | H | $L_{C483}$ | $R^{D40}$ | $R^{D23}$ | H | $L_{C903}$ | $R^{D8}$ | $R^{D66}$ | $R^{D1}$ |
| $L_{C64}$ | $R^{D1}$ | $R^{D23}$ | H | $L_{C484}$ | $R^{D40}$ | $R^{D24}$ | H | $L_{C904}$ | $R^{D8}$ | $R^{D68}$ | $R^{D1}$ |
| $L_{C65}$ | $R^{D1}$ | $R^{D24}$ | H | $L_{C485}$ | $R^{D40}$ | $R^{D25}$ | H | $L_{C905}$ | $R^{D8}$ | $R^{D76}$ | $R^{D1}$ |
| $L_{C66}$ | $R^{D1}$ | $R^{D25}$ | H | $L_{C486}$ | $R^{D40}$ | $R^{D27}$ | H | $L_{C906}$ | $R^{D11}$ | $R^{D5}$ | $R^{D1}$ |
| $L_{C67}$ | $R^{D1}$ | $R^{D26}$ | H | $L_{C487}$ | $R^{D40}$ | $R^{D28}$ | H | $L_{C907}$ | $R^{D11}$ | $R^{D6}$ | $R^{D1}$ |
| $L_{C68}$ | $R^{D1}$ | $R^{D27}$ | H | $L_{C488}$ | $R^{D40}$ | $R^{D29}$ | H | $L_{C908}$ | $R^{D11}$ | $R^{D9}$ | $R^{D1}$ |
| $L_{C69}$ | $R^{D1}$ | $R^{D28}$ | H | $L_{C489}$ | $R^{D40}$ | $R^{D30}$ | H | $L_{C909}$ | $R^{D11}$ | $R^{D10}$ | $R^{D1}$ |
| $L_{C70}$ | $R^{D1}$ | $R^{D29}$ | H | $L_{C490}$ | $R^{D40}$ | $R^{D31}$ | H | $L_{C910}$ | $R^{D11}$ | $R^{D12}$ | $R^{D1}$ |
| $L_{C71}$ | $R^{D1}$ | $R^{D30}$ | H | $L_{C491}$ | $R^{D40}$ | $R^{D32}$ | H | $L_{C911}$ | $R^{D11}$ | $R^{D13}$ | $R^{D1}$ |
| $L_{C72}$ | $R^{D1}$ | $R^{D31}$ | H | $L_{C492}$ | $R^{D40}$ | $R^{D33}$ | H | $L_{C912}$ | $R^{D11}$ | $R^{D14}$ | $R^{D1}$ |
| $L_{C73}$ | $R^{D1}$ | $R^{D32}$ | H | $L_{C493}$ | $R^{D40}$ | $R^{D34}$ | H | $L_{C913}$ | $R^{D11}$ | $R^{D15}$ | $R^{D1}$ |
| $L_{C74}$ | $R^{D1}$ | $R^{D33}$ | H | $L_{C494}$ | $R^{D40}$ | $R^{D41}$ | H | $L_{C914}$ | $R^{D11}$ | $R^{D16}$ | $R^{D1}$ |
| $L_{C75}$ | $R^{D1}$ | $R^{D34}$ | H | $L_{C495}$ | $R^{D40}$ | $R^{D42}$ | H | $L_{C915}$ | $R^{D11}$ | $R^{D17}$ | $R^{D1}$ |
| $L_{C76}$ | $R^{D1}$ | $R^{D35}$ | H | $L_{C496}$ | $R^{D40}$ | $R^{D64}$ | H | $L_{C916}$ | $R^{D11}$ | $R^{D18}$ | $R^{D1}$ |
| $L_{C77}$ | $R^{D1}$ | $R^{D40}$ | H | $L_{C497}$ | $R^{D40}$ | $R^{D66}$ | H | $L_{C917}$ | $R^{D11}$ | $R^{D19}$ | $R^{D1}$ |

-continued

| Ligand | $R^1$ | $R^2$ | $R^3$ | Ligand | $R^1$ | $R^2$ | $R^3$ | Ligand | $R^1$ | $R^2$ | $R^3$ |
|---|---|---|---|---|---|---|---|---|---|---|---|
| $L_{C78}$ | $R^{D1}$ | $R^{D41}$ | H | $L_{C498}$ | $R^{D40}$ | $R^{D68}$ | H | $L_{C918}$ | $R^{D11}$ | $R^{D20}$ | $R^{D1}$ |
| $L_{C79}$ | $R^{D1}$ | $R^{D42}$ | H | $L_{C499}$ | $R^{D40}$ | $R^{D76}$ | H | $L_{C919}$ | $R^{D11}$ | $R^{D21}$ | $R^{D1}$ |
| $L_{C80}$ | $R^{D1}$ | $R^{D64}$ | H | $L_{C500}$ | $R^{D41}$ | $R^{D5}$ | H | $L_{C920}$ | $R^{D11}$ | $R^{D22}$ | $R^{D1}$ |
| $L_{C81}$ | $R^{D1}$ | $R^{D66}$ | H | $L_{C501}$ | $R^{D41}$ | $R^{D6}$ | H | $L_{C921}$ | $R^{D11}$ | $R^{D23}$ | $R^{D1}$ |
| $L_{C82}$ | $R^{D1}$ | $R^{D68}$ | H | $L_{C502}$ | $R^{D41}$ | $R^{D9}$ | H | $L_{C922}$ | $R^{D11}$ | $R^{D24}$ | $R^{D1}$ |
| $L_{C83}$ | $R^{D1}$ | $R^{D76}$ | H | $L_{C503}$ | $R^{D41}$ | $R^{D10}$ | H | $L_{C923}$ | $R^{D11}$ | $R^{D25}$ | $R^{D1}$ |
| $L_{C84}$ | $R^{D2}$ | $R^{D1}$ | H | $L_{C504}$ | $R^{D41}$ | $R^{D12}$ | H | $L_{C924}$ | $R^{D11}$ | $R^{D26}$ | $R^{D1}$ |
| $L_{C85}$ | $R^{D2}$ | $R^{D3}$ | H | $L_{C505}$ | $R^{D41}$ | $R^{D15}$ | H | $L_{C925}$ | $R^{D11}$ | $R^{D27}$ | $R^{D1}$ |
| $L_{C86}$ | $R^{D2}$ | $R^{D4}$ | H | $L_{C506}$ | $R^{D41}$ | $R^{D16}$ | H | $L_{C926}$ | $R^{D11}$ | $R^{D28}$ | $R^{D1}$ |
| $L_{C87}$ | $R^{D2}$ | $R^{D5}$ | H | $L_{C507}$ | $R^{D41}$ | $R^{D17}$ | H | $L_{C927}$ | $R^{D11}$ | $R^{D29}$ | $R^{D1}$ |
| $L_{C88}$ | $R^{D2}$ | $R^{D6}$ | H | $L_{C508}$ | $R^{D41}$ | $R^{D18}$ | H | $L_{C928}$ | $R^{D11}$ | $R^{D30}$ | $R^{D1}$ |
| $L_{C89}$ | $R^{D2}$ | $R^{D7}$ | H | $L_{C509}$ | $R^{D41}$ | $R^{D19}$ | H | $L_{C929}$ | $R^{D11}$ | $R^{D31}$ | $R^{D1}$ |
| $L_{C90}$ | $R^{D2}$ | $R^{D8}$ | H | $L_{C510}$ | $R^{D41}$ | $R^{D20}$ | H | $L_{C930}$ | $R^{D11}$ | $R^{D32}$ | $R^{D1}$ |
| $L_{C91}$ | $R^{D2}$ | $R^{D9}$ | H | $L_{C511}$ | $R^{D41}$ | $R^{D21}$ | H | $L_{C931}$ | $R^{D11}$ | $R^{D33}$ | $R^{D1}$ |
| $L_{C92}$ | $R^{D2}$ | $R^{D10}$ | H | $L_{C512}$ | $R^{D41}$ | $R^{D23}$ | H | $L_{C932}$ | $R^{D11}$ | $R^{D34}$ | $R^{D1}$ |
| $L_{C93}$ | $R^{D2}$ | $R^{D11}$ | H | $L_{C513}$ | $R^{D41}$ | $R^{D24}$ | H | $L_{C933}$ | $R^{D11}$ | $R^{D35}$ | $R^{D1}$ |
| $L_{C94}$ | $R^{D2}$ | $R^{D12}$ | H | $L_{C514}$ | $R^{D41}$ | $R^{D25}$ | H | $L_{C934}$ | $R^{D11}$ | $R^{D40}$ | $R^{D1}$ |
| $L_{C95}$ | $R^{D2}$ | $R^{D13}$ | H | $L_{C515}$ | $R^{D41}$ | $R^{D27}$ | H | $L_{C935}$ | $R^{D11}$ | $R^{D41}$ | $R^{D1}$ |
| $L_{C96}$ | $R^{D2}$ | $R^{D14}$ | H | $L_{C516}$ | $R^{D41}$ | $R^{D28}$ | H | $L_{C936}$ | $R^{D11}$ | $R^{D42}$ | $R^{D1}$ |
| $L_{C97}$ | $R^{D2}$ | $R^{D15}$ | H | $L_{C517}$ | $R^{D41}$ | $R^{D29}$ | H | $L_{C937}$ | $R^{D11}$ | $R^{D64}$ | $R^{D1}$ |
| $L_{C98}$ | $R^{D2}$ | $R^{D16}$ | H | $L_{C518}$ | $R^{D41}$ | $R^{D30}$ | H | $L_{C938}$ | $R^{D11}$ | $R^{D66}$ | $R^{D1}$ |
| $L_{C99}$ | $R^{D2}$ | $R^{D17}$ | H | $L_{C519}$ | $R^{D41}$ | $R^{D31}$ | H | $L_{C939}$ | $R^{D11}$ | $R^{D68}$ | $R^{D1}$ |
| $L_{C100}$ | $R^{D2}$ | $R^{D18}$ | H | $L_{C520}$ | $R^{D41}$ | $R^{D32}$ | H | $L_{C940}$ | $R^{D11}$ | $R^{D76}$ | $R^{D1}$ |
| $L_{C101}$ | $R^{D2}$ | $R^{D19}$ | H | $L_{C521}$ | $R^{D41}$ | $R^{D33}$ | H | $L_{C941}$ | $R^{D13}$ | $R^{D5}$ | $R^{D1}$ |
| $L_{C102}$ | $R^{D2}$ | $R^{D20}$ | H | $L_{C522}$ | $R^{D41}$ | $R^{D34}$ | H | $L_{C942}$ | $R^{D13}$ | $R^{D6}$ | $R^{D1}$ |
| $L_{C103}$ | $R^{D2}$ | $R^{D21}$ | H | $L_{C523}$ | $R^{D41}$ | $R^{D42}$ | H | $L_{C943}$ | $R^{D13}$ | $R^{D9}$ | $R^{D1}$ |
| $L_{C104}$ | $R^{D2}$ | $R^{D22}$ | H | $L_{C524}$ | $R^{D41}$ | $R^{D64}$ | H | $L_{C944}$ | $R^{D13}$ | $R^{D10}$ | $R^{D1}$ |
| $L_{C105}$ | $R^{D2}$ | $R^{D23}$ | H | $L_{C525}$ | $R^{D41}$ | $R^{D66}$ | H | $L_{C945}$ | $R^{D13}$ | $R^{D12}$ | $R^{D1}$ |
| $L_{C106}$ | $R^{D2}$ | $R^{D24}$ | H | $L_{C526}$ | $R^{D41}$ | $R^{D68}$ | H | $L_{C946}$ | $R^{D13}$ | $R^{D14}$ | $R^{D1}$ |
| $L_{C107}$ | $R^{D2}$ | $R^{D25}$ | H | $L_{C527}$ | $R^{D41}$ | $R^{D76}$ | H | $L_{C947}$ | $R^{D13}$ | $R^{D15}$ | $R^{D1}$ |
| $L_{C108}$ | $R^{D2}$ | $R^{D26}$ | H | $L_{C528}$ | $R^{D64}$ | $R^{D5}$ | H | $L_{C948}$ | $R^{D13}$ | $R^{D16}$ | $R^{D1}$ |
| $L_{C109}$ | $R^{D2}$ | $R^{D27}$ | H | $L_{C529}$ | $R^{D64}$ | $R^{D6}$ | H | $L_{C949}$ | $R^{D13}$ | $R^{D17}$ | $R^{D1}$ |
| $L_{C110}$ | $R^{D2}$ | $R^{D28}$ | H | $L_{C530}$ | $R^{D64}$ | $R^{D9}$ | H | $L_{C950}$ | $R^{D13}$ | $R^{D18}$ | $R^{D1}$ |
| $L_{C111}$ | $R^{D2}$ | $R^{D29}$ | H | $L_{C531}$ | $R^{D64}$ | $R^{D10}$ | H | $L_{C951}$ | $R^{D13}$ | $R^{D19}$ | $R^{D1}$ |
| $L_{C112}$ | $R^{D2}$ | $R^{D30}$ | H | $L_{C532}$ | $R^{D64}$ | $R^{D12}$ | H | $L_{C952}$ | $R^{D13}$ | $R^{D20}$ | $R^{D1}$ |
| $L_{C113}$ | $R^{D2}$ | $R^{D31}$ | H | $L_{C533}$ | $R^{D64}$ | $R^{D15}$ | H | $L_{C953}$ | $R^{D13}$ | $R^{D21}$ | $R^{D1}$ |
| $L_{C114}$ | $R^{D2}$ | $R^{D32}$ | H | $L_{C534}$ | $R^{D64}$ | $R^{D16}$ | H | $L_{C954}$ | $R^{D13}$ | $R^{D22}$ | $R^{D1}$ |
| $L_{C115}$ | $R^{D2}$ | $R^{D33}$ | H | $L_{C535}$ | $R^{D64}$ | $R^{D17}$ | H | $L_{C955}$ | $R^{D13}$ | $R^{D23}$ | $R^{D1}$ |
| $L_{C116}$ | $R^{D2}$ | $R^{D34}$ | H | $L_{C536}$ | $R^{D64}$ | $R^{D18}$ | H | $L_{C956}$ | $R^{D13}$ | $R^{D24}$ | $R^{D1}$ |
| $L_{C117}$ | $R^{D2}$ | $R^{D35}$ | H | $L_{C537}$ | $R^{D64}$ | $R^{D19}$ | H | $L_{C957}$ | $R^{D13}$ | $R^{D25}$ | $R^{D1}$ |
| $L_{C118}$ | $R^{D2}$ | $R^{D40}$ | H | $L_{C538}$ | $R^{D64}$ | $R^{D20}$ | H | $L_{C958}$ | $R^{D13}$ | $R^{D26}$ | $R^{D1}$ |
| $L_{C119}$ | $R^{D2}$ | $R^{D41}$ | H | $L_{C539}$ | $R^{D64}$ | $R^{D21}$ | H | $L_{C959}$ | $R^{D13}$ | $R^{D27}$ | $R^{D1}$ |
| $L_{C120}$ | $R^{D2}$ | $R^{D42}$ | H | $L_{C540}$ | $R^{D64}$ | $R^{D23}$ | H | $L_{C960}$ | $R^{D13}$ | $R^{D28}$ | $R^{D1}$ |
| $L_{C121}$ | $R^{D2}$ | $R^{D64}$ | H | $L_{C541}$ | $R^{D64}$ | $R^{D24}$ | H | $L_{C961}$ | $R^{D13}$ | $R^{D29}$ | $R^{D1}$ |
| $L_{C122}$ | $R^{D2}$ | $R^{D66}$ | H | $L_{C542}$ | $R^{D64}$ | $R^{D25}$ | H | $L_{C962}$ | $R^{D13}$ | $R^{D30}$ | $R^{D1}$ |
| $L_{C123}$ | $R^{D2}$ | $R^{D68}$ | H | $L_{C543}$ | $R^{D64}$ | $R^{D27}$ | H | $L_{C963}$ | $R^{D13}$ | $R^{D31}$ | $R^{D1}$ |
| $L_{C124}$ | $R^{D2}$ | $R^{D76}$ | H | $L_{C544}$ | $R^{D64}$ | $R^{D28}$ | H | $L_{C964}$ | $R^{D13}$ | $R^{D32}$ | $R^{D1}$ |
| $L_{C125}$ | $R^{D3}$ | $R^{D4}$ | H | $L_{C545}$ | $R^{D64}$ | $R^{D29}$ | H | $L_{C965}$ | $R^{D13}$ | $R^{D33}$ | $R^{D1}$ |
| $L_{C126}$ | $R^{D3}$ | $R^{D5}$ | H | $L_{C546}$ | $R^{D64}$ | $R^{D30}$ | H | $L_{C966}$ | $R^{D13}$ | $R^{D34}$ | $R^{D1}$ |
| $L_{C127}$ | $R^{D3}$ | $R^{D6}$ | H | $L_{C547}$ | $R^{D64}$ | $R^{D31}$ | H | $L_{C967}$ | $R^{D13}$ | $R^{D35}$ | $R^{D1}$ |
| $L_{C128}$ | $R^{D3}$ | $R^{D7}$ | H | $L_{C548}$ | $R^{D64}$ | $R^{D32}$ | H | $L_{C968}$ | $R^{D13}$ | $R^{D40}$ | $R^{D1}$ |
| $L_{C129}$ | $R^{D3}$ | $R^{D8}$ | H | $L_{C549}$ | $R^{D64}$ | $R^{D33}$ | H | $L_{C969}$ | $R^{D13}$ | $R^{D41}$ | $R^{D1}$ |
| $L_{C130}$ | $R^{D3}$ | $R^{D9}$ | H | $L_{C550}$ | $R^{D64}$ | $R^{D34}$ | H | $L_{C970}$ | $R^{D13}$ | $R^{D42}$ | $R^{D1}$ |
| $L_{C131}$ | $R^{D3}$ | $R^{D10}$ | H | $L_{C551}$ | $R^{D64}$ | $R^{D42}$ | H | $L_{C971}$ | $R^{D13}$ | $R^{D64}$ | $R^{D1}$ |
| $L_{C132}$ | $R^{D3}$ | $R^{D11}$ | H | $L_{C552}$ | $R^{D64}$ | $R^{D64}$ | H | $L_{C972}$ | $R^{D13}$ | $R^{D66}$ | $R^{D1}$ |
| $L_{C133}$ | $R^{D3}$ | $R^{D12}$ | H | $L_{C553}$ | $R^{D64}$ | $R^{D66}$ | H | $L_{C973}$ | $R^{D13}$ | $R^{D68}$ | $R^{D1}$ |
| $L_{C134}$ | $R^{D3}$ | $R^{D13}$ | H | $L_{C554}$ | $R^{D64}$ | $R^{D68}$ | H | $L_{C974}$ | $R^{D13}$ | $R^{D76}$ | $R^{D1}$ |
| $L_{C135}$ | $R^{D3}$ | $R^{D14}$ | H | $L_{C555}$ | $R^{D64}$ | $R^{D76}$ | H | $L_{C975}$ | $R^{D14}$ | $R^{D5}$ | $R^{D1}$ |
| $L_{C136}$ | $R^{D3}$ | $R^{D15}$ | H | $L_{C556}$ | $R^{D66}$ | $R^{D5}$ | H | $L_{C976}$ | $R^{D14}$ | $R^{D6}$ | $R^{D1}$ |
| $L_{C137}$ | $R^{D3}$ | $R^{D16}$ | H | $L_{C557}$ | $R^{D66}$ | $R^{D6}$ | H | $L_{C977}$ | $R^{D14}$ | $R^{D9}$ | $R^{D1}$ |
| $L_{C138}$ | $R^{D3}$ | $R^{D17}$ | H | $L_{C558}$ | $R^{D66}$ | $R^{D9}$ | H | $L_{C978}$ | $R^{D14}$ | $R^{D10}$ | $R^{D1}$ |
| $L_{C139}$ | $R^{D3}$ | $R^{D18}$ | H | $L_{C559}$ | $R^{D66}$ | $R^{D10}$ | H | $L_{C979}$ | $R^{D14}$ | $R^{D12}$ | $R^{D1}$ |
| $L_{C140}$ | $R^{D3}$ | $R^{D19}$ | H | $L_{C560}$ | $R^{D66}$ | $R^{D12}$ | H | $L_{C980}$ | $R^{D14}$ | $R^{D15}$ | $R^{D1}$ |
| $L_{C141}$ | $R^{D3}$ | $R^{D20}$ | H | $L_{C561}$ | $R^{D66}$ | $R^{D15}$ | H | $L_{C981}$ | $R^{D14}$ | $R^{D16}$ | $R^{D1}$ |
| $L_{C142}$ | $R^{D3}$ | $R^{D21}$ | H | $L_{C562}$ | $R^{D66}$ | $R^{D16}$ | H | $L_{C982}$ | $R^{D14}$ | $R^{D17}$ | $R^{D1}$ |
| $L_{C143}$ | $R^{D3}$ | $R^{D22}$ | H | $L_{C563}$ | $R^{D66}$ | $R^{D17}$ | H | $L_{C983}$ | $R^{D14}$ | $R^{D18}$ | $R^{D1}$ |
| $L_{C144}$ | $R^{D3}$ | $R^{D23}$ | H | $L_{C564}$ | $R^{D66}$ | $R^{D18}$ | H | $L_{C984}$ | $R^{D14}$ | $R^{D19}$ | $R^{D1}$ |
| $L_{C145}$ | $R^{D3}$ | $R^{D24}$ | H | $L_{C565}$ | $R^{D66}$ | $R^{D19}$ | H | $L_{C985}$ | $R^{D14}$ | $R^{D20}$ | $R^{D1}$ |
| $L_{C146}$ | $R^{D3}$ | $R^{D25}$ | H | $L_{C566}$ | $R^{D66}$ | $R^{D20}$ | H | $L_{C986}$ | $R^{D14}$ | $R^{D21}$ | $R^{D1}$ |
| $L_{C147}$ | $R^{D3}$ | $R^{D26}$ | H | $L_{C567}$ | $R^{D66}$ | $R^{D21}$ | H | $L_{C987}$ | $R^{D14}$ | $R^{D22}$ | $R^{D1}$ |
| $L_{C148}$ | $R^{D3}$ | $R^{D27}$ | H | $L_{C568}$ | $R^{D66}$ | $R^{D23}$ | H | $L_{C988}$ | $R^{D14}$ | $R^{D23}$ | $R^{D1}$ |
| $L_{C149}$ | $R^{D3}$ | $R^{D28}$ | H | $L_{C569}$ | $R^{D66}$ | $R^{D24}$ | H | $L_{C989}$ | $R^{D14}$ | $R^{D24}$ | $R^{D1}$ |
| $L_{C150}$ | $R^{D3}$ | $R^{D29}$ | H | $L_{C570}$ | $R^{D66}$ | $R^{D25}$ | H | $L_{C990}$ | $R^{D14}$ | $R^{D25}$ | $R^{D1}$ |
| $L_{C151}$ | $R^{D3}$ | $R^{D30}$ | H | $L_{C571}$ | $R^{D66}$ | $R^{D27}$ | H | $L_{C991}$ | $R^{D14}$ | $R^{D26}$ | $R^{D1}$ |
| $L_{C152}$ | $R^{D3}$ | $R^{D31}$ | H | $L_{C572}$ | $R^{D66}$ | $R^{D28}$ | H | $L_{C992}$ | $R^{D14}$ | $R^{D27}$ | $R^{D1}$ |
| $L_{C153}$ | $R^{D3}$ | $R^{D32}$ | H | $L_{C573}$ | $R^{D66}$ | $R^{D29}$ | H | $L_{C993}$ | $R^{D14}$ | $R^{D28}$ | $R^{D1}$ |
| $L_{C154}$ | $R^{D3}$ | $R^{D33}$ | H | $L_{C574}$ | $R^{D66}$ | $R^{D30}$ | H | $L_{C994}$ | $R^{D14}$ | $R^{D29}$ | $R^{D1}$ |

-continued

| Ligand | $R^1$ | $R^2$ | $R^3$ | Ligand | $R^1$ | $R^2$ | $R^3$ | Ligand | $R^1$ | $R^2$ | $R^3$ |
|---|---|---|---|---|---|---|---|---|---|---|---|
| $L_{C155}$ | $R^{D3}$ | $R^{D34}$ | H | $L_{C575}$ | $R^{D66}$ | $R^{D31}$ | H | $L_{C995}$ | $R^{D14}$ | $R^{D30}$ | $R^{D1}$ |
| $L_{C156}$ | $R^{D3}$ | $R^{D35}$ | H | $L_{C576}$ | $R^{D66}$ | $R^{D32}$ | H | $L_{C996}$ | $R^{D14}$ | $R^{D31}$ | $R^{D1}$ |
| $L_{C157}$ | $R^{D3}$ | $R^{D40}$ | H | $L_{C577}$ | $R^{D66}$ | $R^{D33}$ | H | $L_{C997}$ | $R^{D14}$ | $R^{D32}$ | $R^{D1}$ |
| $L_{C158}$ | $R^{D3}$ | $R^{D41}$ | H | $L_{C578}$ | $R^{D66}$ | $R^{D34}$ | H | $L_{C998}$ | $R^{D14}$ | $R^{D33}$ | $R^{D1}$ |
| $L_{C159}$ | $R^{D3}$ | $R^{D42}$ | H | $L_{C579}$ | $R^{D66}$ | $R^{D42}$ | H | $L_{C999}$ | $R^{D14}$ | $R^{D34}$ | $R^{D1}$ |
| $L_{C160}$ | $R^{D3}$ | $R^{D64}$ | H | $L_{C580}$ | $R^{D66}$ | $R^{D64}$ | H | $L_{C1000}$ | $R^{D14}$ | $R^{D35}$ | $R^{D1}$ |
| $L_{C161}$ | $R^{D3}$ | $R^{D66}$ | H | $L_{C581}$ | $R^{D66}$ | $R^{D66}$ | H | $L_{C1001}$ | $R^{D14}$ | $R^{D40}$ | $R^{D1}$ |
| $L_{C162}$ | $R^{D3}$ | $R^{D68}$ | H | $L_{C582}$ | $R^{D68}$ | $R^{D5}$ | H | $L_{C1002}$ | $R^{D14}$ | $R^{D41}$ | $R^{D1}$ |
| $L_{C163}$ | $R^{D3}$ | $R^{D76}$ | H | $L_{C583}$ | $R^{D68}$ | $R^{D6}$ | H | $L_{C1003}$ | $R^{D14}$ | $R^{D42}$ | $R^{D1}$ |
| $L_{C164}$ | $R^{D4}$ | $R^{D5}$ | H | $L_{C584}$ | $R^{D68}$ | $R^{D9}$ | H | $L_{C1004}$ | $R^{D14}$ | $R^{D64}$ | $R^{D1}$ |
| $L_{C165}$ | $R^{D4}$ | $R^{D6}$ | H | $L_{C585}$ | $R^{D68}$ | $R^{D10}$ | H | $L_{C1005}$ | $R^{D14}$ | $R^{D66}$ | $R^{D1}$ |
| $L_{C166}$ | $R^{D4}$ | $R^{D7}$ | H | $L_{C586}$ | $R^{D68}$ | $R^{D12}$ | H | $L_{C1006}$ | $R^{D14}$ | $R^{D68}$ | $R^{D1}$ |
| $L_{C167}$ | $R^{D4}$ | $R^{D8}$ | H | $L_{C587}$ | $R^{D68}$ | $R^{D15}$ | H | $L_{C1007}$ | $R^{D14}$ | $R^{D76}$ | $R^{D1}$ |
| $L_{C168}$ | $R^{D4}$ | $R^{D9}$ | H | $L_{C588}$ | $R^{D68}$ | $R^{D16}$ | H | $L_{C1008}$ | $R^{D22}$ | $R^{D5}$ | $R^{D1}$ |
| $L_{C169}$ | $R^{D4}$ | $R^{D10}$ | H | $L_{C589}$ | $R^{D68}$ | $R^{D17}$ | H | $L_{C1009}$ | $R^{D22}$ | $R^{D6}$ | $R^{D1}$ |
| $L_{C170}$ | $R^{D4}$ | $R^{D11}$ | H | $L_{C590}$ | $R^{D68}$ | $R^{D18}$ | H | $L_{C1010}$ | $R^{D22}$ | $R^{D9}$ | $R^{D1}$ |
| $L_{C171}$ | $R^{D4}$ | $R^{D12}$ | H | $L_{C591}$ | $R^{D68}$ | $R^{D19}$ | H | $L_{C1011}$ | $R^{D22}$ | $R^{D10}$ | $R^{D1}$ |
| $L_{C172}$ | $R^{D4}$ | $R^{D13}$ | H | $L_{C592}$ | $R^{D68}$ | $R^{D20}$ | H | $L_{C1012}$ | $R^{D22}$ | $R^{D12}$ | $R^{D1}$ |
| $L_{C173}$ | $R^{D4}$ | $R^{D14}$ | H | $L_{C593}$ | $R^{D68}$ | $R^{D21}$ | H | $L_{C1013}$ | $R^{D22}$ | $R^{D15}$ | $R^{D1}$ |
| $L_{C174}$ | $R^{D4}$ | $R^{D15}$ | H | $L_{C594}$ | $R^{D68}$ | $R^{D23}$ | H | $L_{C1014}$ | $R^{D22}$ | $R^{D16}$ | $R^{D1}$ |
| $L_{C175}$ | $R^{D4}$ | $R^{D16}$ | H | $L_{C595}$ | $R^{D68}$ | $R^{D24}$ | H | $L_{C1015}$ | $R^{D22}$ | $R^{D17}$ | $R^{D1}$ |
| $L_{C176}$ | $R^{D4}$ | $R^{D17}$ | H | $L_{C596}$ | $R^{D68}$ | $R^{D25}$ | H | $L_{C1016}$ | $R^{D22}$ | $R^{D18}$ | $R^{D1}$ |
| $L_{C177}$ | $R^{D4}$ | $R^{D18}$ | H | $L_{C597}$ | $R^{D68}$ | $R^{D27}$ | H | $L_{C1017}$ | $R^{D22}$ | $R^{D19}$ | $R^{D1}$ |
| $L_{C178}$ | $R^{D4}$ | $R^{D19}$ | H | $L_{C598}$ | $R^{D68}$ | $R^{D28}$ | H | $L_{C1018}$ | $R^{D22}$ | $R^{D20}$ | $R^{D1}$ |
| $L_{C179}$ | $R^{D4}$ | $R^{D20}$ | H | $L_{C599}$ | $R^{D68}$ | $R^{D29}$ | H | $L_{C1019}$ | $R^{D22}$ | $R^{D21}$ | $R^{D1}$ |
| $L_{C180}$ | $R^{D4}$ | $R^{D21}$ | H | $L_{C600}$ | $R^{D68}$ | $R^{D30}$ | H | $L_{C1020}$ | $R^{D22}$ | $R^{D23}$ | $R^{D1}$ |
| $L_{C181}$ | $R^{D4}$ | $R^{D22}$ | H | $L_{C601}$ | $R^{D68}$ | $R^{D31}$ | H | $L_{C1021}$ | $R^{D22}$ | $R^{D24}$ | $R^{D1}$ |
| $L_{C182}$ | $R^{D4}$ | $R^{D23}$ | H | $L_{C602}$ | $R^{D68}$ | $R^{D32}$ | H | $L_{C1022}$ | $R^{D22}$ | $R^{D25}$ | $R^{D1}$ |
| $L_{C183}$ | $R^{D4}$ | $R^{D24}$ | H | $L_{C603}$ | $R^{D68}$ | $R^{D33}$ | H | $L_{C1023}$ | $R^{D22}$ | $R^{D26}$ | $R^{D1}$ |
| $L_{C184}$ | $R^{D4}$ | $R^{D25}$ | H | $L_{C604}$ | $R^{D68}$ | $R^{D34}$ | H | $L_{C1024}$ | $R^{D22}$ | $R^{D27}$ | $R^{D1}$ |
| $L_{C185}$ | $R^{D4}$ | $R^{D26}$ | H | $L_{C605}$ | $R^{D68}$ | $R^{D42}$ | H | $L_{C1025}$ | $R^{D22}$ | $R^{D28}$ | $R^{D1}$ |
| $L_{C186}$ | $R^{D4}$ | $R^{D27}$ | H | $L_{C606}$ | $R^{D68}$ | $R^{D76}$ | H | $L_{C1026}$ | $R^{D22}$ | $R^{D29}$ | $R^{D1}$ |
| $L_{C187}$ | $R^{D4}$ | $R^{D28}$ | H | $L_{C607}$ | $R^{D68}$ | $R^{D5}$ | H | $L_{C1027}$ | $R^{D22}$ | $R^{D30}$ | $R^{D1}$ |
| $L_{C188}$ | $R^{D4}$ | $R^{D29}$ | H | $L_{C608}$ | $R^{D76}$ | $R^{D6}$ | H | $L_{C1028}$ | $R^{D22}$ | $R^{D31}$ | $R^{D1}$ |
| $L_{C189}$ | $R^{D4}$ | $R^{D30}$ | H | $L_{C609}$ | $R^{D76}$ | $R^{D9}$ | H | $L_{C1029}$ | $R^{D22}$ | $R^{D32}$ | $R^{D1}$ |
| $L_{C190}$ | $R^{D4}$ | $R^{D31}$ | H | $L_{C610}$ | $R^{D76}$ | $R^{D10}$ | H | $L_{C1030}$ | $R^{D22}$ | $R^{D33}$ | $R^{D1}$ |
| $L_{C191}$ | $R^{D4}$ | $R^{D32}$ | H | $L_{C611}$ | $R^{D76}$ | $R^{D12}$ | H | $L_{C1031}$ | $R^{D22}$ | $R^{D34}$ | $R^{D1}$ |
| $L_{C192}$ | $R^{D4}$ | $R^{D33}$ | H | $L_{C612}$ | $R^{D76}$ | $R^{D15}$ | H | $L_{C1032}$ | $R^{D22}$ | $R^{D35}$ | $R^{D1}$ |
| $L_{C193}$ | $R^{D4}$ | $R^{D34}$ | H | $L_{C613}$ | $R^{D76}$ | $R^{D16}$ | H | $L_{C1033}$ | $R^{D22}$ | $R^{D40}$ | $R^{D1}$ |
| $L_{C194}$ | $R^{D4}$ | $R^{D35}$ | H | $L_{C614}$ | $R^{D76}$ | $R^{D17}$ | H | $L_{C1034}$ | $R^{D22}$ | $R^{D41}$ | $R^{D1}$ |
| $L_{C195}$ | $R^{D4}$ | $R^{D40}$ | H | $L_{C615}$ | $R^{D76}$ | $R^{D18}$ | H | $L_{C1035}$ | $R^{D22}$ | $R^{D42}$ | $R^{D1}$ |
| $L_{C196}$ | $R^{D4}$ | $R^{D41}$ | H | $L_{C616}$ | $R^{D76}$ | $R^{D19}$ | H | $L_{C1036}$ | $R^{D22}$ | $R^{D64}$ | $R^{D1}$ |
| $L_{C197}$ | $R^{D4}$ | $R^{D42}$ | H | $L_{C617}$ | $R^{D76}$ | $R^{D20}$ | H | $L_{C1037}$ | $R^{D22}$ | $R^{D66}$ | $R^{D1}$ |
| $L_{C198}$ | $R^{D4}$ | $R^{D64}$ | H | $L_{C618}$ | $R^{D76}$ | $R^{D21}$ | H | $L_{C1038}$ | $R^{D22}$ | $R^{D68}$ | $R^{D1}$ |
| $L_{C199}$ | $R^{D4}$ | $R^{D66}$ | H | $L_{C619}$ | $R^{D76}$ | $R^{D23}$ | H | $L_{C1039}$ | $R^{D22}$ | $R^{D76}$ | $R^{D1}$ |
| $L_{C200}$ | $R^{D4}$ | $R^{D68}$ | H | $L_{C620}$ | $R^{D76}$ | $R^{D24}$ | H | $L_{C1040}$ | $R^{D26}$ | $R^{D5}$ | $R^{D1}$ |
| $L_{C201}$ | $R^{D4}$ | $R^{D76}$ | H | $L_{C621}$ | $R^{D76}$ | $R^{D25}$ | H | $L_{C1041}$ | $R^{D26}$ | $R^{D6}$ | $R^{D1}$ |
| $L_{C202}$ | $R^{D4}$ | $R^{D1}$ | H | $L_{C622}$ | $R^{D76}$ | $R^{D27}$ | H | $L_{C1042}$ | $R^{D26}$ | $R^{D9}$ | $R^{D1}$ |
| $L_{C203}$ | $R^{D7}$ | $R^{D5}$ | H | $L_{C623}$ | $R^{D76}$ | $R^{D28}$ | H | $L_{C1043}$ | $R^{D26}$ | $R^{D10}$ | $R^{D1}$ |
| $L_{C204}$ | $R^{D7}$ | $R^{D6}$ | H | $L_{C624}$ | $R^{D76}$ | $R^{D29}$ | H | $L_{C1044}$ | $R^{D26}$ | $R^{D12}$ | $R^{D1}$ |
| $L_{C205}$ | $R^{D7}$ | $R^{D8}$ | H | $L_{C625}$ | $R^{D76}$ | $R^{D30}$ | H | $L_{C1045}$ | $R^{D26}$ | $R^{D15}$ | $R^{D1}$ |
| $L_{C206}$ | $R^{D7}$ | $R^{D9}$ | H | $L_{C626}$ | $R^{D76}$ | $R^{D31}$ | H | $L_{C1046}$ | $R^{D26}$ | $R^{D16}$ | $R^{D1}$ |
| $L_{C207}$ | $R^{D7}$ | $R^{D10}$ | H | $L_{C627}$ | $R^{D76}$ | $R^{D32}$ | H | $L_{C1047}$ | $R^{D26}$ | $R^{D17}$ | $R^{D1}$ |
| $L_{C208}$ | $R^{D7}$ | $R^{D11}$ | H | $L_{C628}$ | $R^{D76}$ | $R^{D33}$ | H | $L_{C1048}$ | $R^{D26}$ | $R^{D18}$ | $R^{D1}$ |
| $L_{C209}$ | $R^{D7}$ | $R^{D12}$ | H | $L_{C629}$ | $R^{D76}$ | $R^{D34}$ | H | $L_{C1049}$ | $R^{D26}$ | $R^{D19}$ | $R^{D1}$ |
| $L_{C210}$ | $R^{D7}$ | $R^{D13}$ | H | $L_{C630}$ | $R^{D76}$ | $R^{D42}$ | H | $L_{C1050}$ | $R^{D26}$ | $R^{D20}$ | $R^{D1}$ |
| $L_{C211}$ | $R^{D7}$ | $R^{D14}$ | H | $L_{C631}$ | $R^{D1}$ | $R^{D1}$ | $R^{D1}$ | $L_{C1051}$ | $R^{D26}$ | $R^{D21}$ | $R^{D1}$ |
| $L_{C212}$ | $R^{D7}$ | $R^{D15}$ | H | $L_{C632}$ | $R^{D2}$ | $R^{D2}$ | $R^{D1}$ | $L_{C1052}$ | $R^{D26}$ | $R^{D23}$ | $R^{D1}$ |
| $L_{C213}$ | $R^{D7}$ | $R^{D16}$ | H | $L_{C633}$ | $R^{D3}$ | $R^{D3}$ | $R^{D1}$ | $L_{C1053}$ | $R^{D26}$ | $R^{D24}$ | $R^{D1}$ |
| $L_{C214}$ | $R^{D7}$ | $R^{D17}$ | H | $L_{C634}$ | $R^{D4}$ | $R^{D4}$ | $R^{D1}$ | $L_{C1054}$ | $R^{D26}$ | $R^{D25}$ | $R^{D1}$ |
| $L_{C215}$ | $R^{D7}$ | $R^{D18}$ | H | $L_{C635}$ | $R^{D5}$ | $R^{D5}$ | $R^{D1}$ | $L_{C1055}$ | $R^{D26}$ | $R^{D27}$ | $R^{D1}$ |
| $L_{C216}$ | $R^{D7}$ | $R^{D19}$ | H | $L_{C636}$ | $R^{D6}$ | $R^{D6}$ | $R^{D1}$ | $L_{C1056}$ | $R^{D26}$ | $R^{D28}$ | $R^{D1}$ |
| $L_{C217}$ | $R^{D7}$ | $R^{D20}$ | H | $L_{C637}$ | $R^{D7}$ | $R^{D7}$ | $R^{D1}$ | $L_{C1057}$ | $R^{D26}$ | $R^{D29}$ | $R^{D1}$ |
| $L_{C218}$ | $R^{D7}$ | $R^{D21}$ | H | $L_{C638}$ | $R^{D8}$ | $R^{D8}$ | $R^{D1}$ | $L_{C1058}$ | $R^{D26}$ | $R^{D30}$ | $R^{D1}$ |
| $L_{C219}$ | $R^{D7}$ | $R^{D22}$ | H | $L_{C639}$ | $R^{D9}$ | $R^{D9}$ | $R^{D1}$ | $L_{C1059}$ | $R^{D26}$ | $R^{D31}$ | $R^{D1}$ |
| $L_{C220}$ | $R^{D7}$ | $R^{D23}$ | H | $L_{C640}$ | $R^{D10}$ | $R^{D10}$ | $R^{D1}$ | $L_{C1060}$ | $R^{D26}$ | $R^{D32}$ | $R^{D1}$ |
| $L_{C221}$ | $R^{D7}$ | $R^{D24}$ | H | $L_{C641}$ | $R^{D11}$ | $R^{D11}$ | $R^{D1}$ | $L_{C1061}$ | $R^{D26}$ | $R^{D33}$ | $R^{D1}$ |
| $L_{C222}$ | $R^{D7}$ | $R^{D25}$ | H | $L_{C642}$ | $R^{D12}$ | $R^{D12}$ | $R^{D1}$ | $L_{C1062}$ | $R^{D26}$ | $R^{D34}$ | $R^{D1}$ |
| $L_{C223}$ | $R^{D7}$ | $R^{D26}$ | H | $L_{C643}$ | $R^{D13}$ | $R^{D13}$ | $R^{D1}$ | $L_{C1063}$ | $R^{D26}$ | $R^{D35}$ | $R^{D1}$ |
| $L_{C224}$ | $R^{D7}$ | $R^{D27}$ | H | $L_{C644}$ | $R^{D14}$ | $R^{D14}$ | $R^{D1}$ | $L_{C1064}$ | $R^{D26}$ | $R^{D40}$ | $R^{D1}$ |
| $L_{C225}$ | $R^{D7}$ | $R^{D28}$ | H | $L_{C645}$ | $R^{D15}$ | $R^{D15}$ | $R^{D1}$ | $L_{C1065}$ | $R^{D26}$ | $R^{D41}$ | $R^{D1}$ |
| $L_{C226}$ | $R^{D7}$ | $R^{D29}$ | H | $L_{C646}$ | $R^{D16}$ | $R^{D16}$ | $R^{D1}$ | $L_{C1066}$ | $R^{D26}$ | $R^{D42}$ | $R^{D1}$ |
| $L_{C227}$ | $R^{D7}$ | $R^{D30}$ | H | $L_{C647}$ | $R^{D17}$ | $R^{D17}$ | $R^{D1}$ | $L_{C1067}$ | $R^{D26}$ | $R^{D64}$ | $R^{D1}$ |
| $L_{C228}$ | $R^{D7}$ | $R^{D31}$ | H | $L_{C648}$ | $R^{D18}$ | $R^{D18}$ | $R^{D1}$ | $L_{C1068}$ | $R^{D26}$ | $R^{D66}$ | $R^{D1}$ |
| $L_{C229}$ | $R^{D7}$ | $R^{D32}$ | H | $L_{C649}$ | $R^{D19}$ | $R^{D19}$ | $R^{D1}$ | $L_{C1069}$ | $R^{D26}$ | $R^{D68}$ | $R^{D1}$ |
| $L_{C230}$ | $R^{D7}$ | $R^{D33}$ | H | $L_{C650}$ | $R^{D20}$ | $R^{D20}$ | $R^{D1}$ | $L_{C1070}$ | $R^{D26}$ | $R^{D76}$ | $R^{D1}$ |
| $L_{C231}$ | $R^{D7}$ | $R^{D34}$ | H | $L_{C651}$ | $R^{D21}$ | $R^{D21}$ | $R^{D1}$ | $L_{C1071}$ | $R^{D35}$ | $R^{D5}$ | $R^{D1}$ |

-continued

| Ligand | $R^1$ | $R^2$ | $R^3$ | Ligand | $R^1$ | $R^2$ | $R^3$ | Ligand | $R^1$ | $R^2$ | $R^3$ |
|---|---|---|---|---|---|---|---|---|---|---|---|
| $L_{C232}$ | $R^{D7}$ | $R^{D35}$ | H | $L_{C652}$ | $R^{D22}$ | $R^{D22}$ | $R^{D1}$ | $L_{C1072}$ | $R^{D35}$ | $R^{D6}$ | $R^{D1}$ |
| $L_{C233}$ | $R^{D7}$ | $R^{D40}$ | H | $L_{C653}$ | $R^{D23}$ | $R^{D23}$ | $R^{D1}$ | $L_{C1073}$ | $R^{D35}$ | $R^{D9}$ | $R^{D1}$ |
| $L_{C234}$ | $R^{D7}$ | $R^{D41}$ | H | $L_{C654}$ | $R^{D24}$ | $R^{D24}$ | $R^{D1}$ | $L_{C1074}$ | $R^{D35}$ | $R^{D10}$ | $R^{D1}$ |
| $L_{C235}$ | $R^{D7}$ | $R^{D42}$ | H | $L_{C655}$ | $R^{D25}$ | $R^{D25}$ | $R^{D1}$ | $L_{C1075}$ | $R^{D35}$ | $R^{D12}$ | $R^{D1}$ |
| $L_{C236}$ | $R^{D7}$ | $R^{D64}$ | H | $L_{C656}$ | $R^{D26}$ | $R^{D26}$ | $R^{D1}$ | $L_{C1076}$ | $R^{D35}$ | $R^{D15}$ | $R^{D1}$ |
| $L_{C237}$ | $R^{D7}$ | $R^{D66}$ | H | $L_{C657}$ | $R^{D27}$ | $R^{D27}$ | $R^{D1}$ | $L_{C1077}$ | $R^{D35}$ | $R^{D16}$ | $R^{D1}$ |
| $L_{C238}$ | $R^{D7}$ | $R^{D68}$ | H | $L_{C658}$ | $R^{D28}$ | $R^{D28}$ | $R^{D1}$ | $L_{C1078}$ | $R^{D35}$ | $R^{D17}$ | $R^{D1}$ |
| $L_{C239}$ | $R^{D7}$ | $R^{D76}$ | H | $L_{C659}$ | $R^{D29}$ | $R^{D29}$ | $R^{D1}$ | $L_{C1079}$ | $R^{D35}$ | $R^{D18}$ | $R^{D1}$ |
| $L_{C240}$ | $R^{D8}$ | $R^{D5}$ | H | $L_{C660}$ | $R^{D30}$ | $R^{D30}$ | $R^{D1}$ | $L_{C1080}$ | $R^{D35}$ | $R^{D19}$ | $R^{D1}$ |
| $L_{C241}$ | $R^{D8}$ | $R^{D6}$ | H | $L_{C661}$ | $R^{D31}$ | $R^{D31}$ | $R^{D1}$ | $L_{C1081}$ | $R^{D35}$ | $R^{D20}$ | $R^{D1}$ |
| $L_{C242}$ | $R^{D8}$ | $R^{D9}$ | H | $L_{C662}$ | $R^{D32}$ | $R^{D32}$ | $R^{D1}$ | $L_{C1082}$ | $R^{D35}$ | $R^{D21}$ | $R^{D1}$ |
| $L_{C243}$ | $R^{D8}$ | $R^{D10}$ | H | $L_{C663}$ | $R^{D33}$ | $R^{D33}$ | $R^{D1}$ | $L_{C1083}$ | $R^{D35}$ | $R^{D23}$ | $R^{D1}$ |
| $L_{C244}$ | $R^{D8}$ | $R^{D11}$ | H | $L_{C664}$ | $R^{D34}$ | $R^{D34}$ | $R^{D1}$ | $L_{C1084}$ | $R^{D35}$ | $R^{D24}$ | $R^{D1}$ |
| $L_{C245}$ | $R^{D8}$ | $R^{D12}$ | H | $L_{C665}$ | $R^{D35}$ | $R^{D35}$ | $R^{D1}$ | $L_{C1085}$ | $R^{D35}$ | $R^{D25}$ | $R^{D1}$ |
| $L_{C246}$ | $R^{D8}$ | $R^{D13}$ | H | $L_{C666}$ | $R^{D40}$ | $R^{D40}$ | $R^{D1}$ | $L_{C1086}$ | $R^{D35}$ | $R^{D27}$ | $R^{D1}$ |
| $L_{C247}$ | $R^{D8}$ | $R^{D14}$ | H | $L_{C667}$ | $R^{D41}$ | $R^{D41}$ | $R^{D1}$ | $L_{C1087}$ | $R^{D35}$ | $R^{D28}$ | $R^{D1}$ |
| $L_{C248}$ | $R^{D8}$ | $R^{D15}$ | H | $L_{C668}$ | $R^{D42}$ | $R^{D42}$ | $R^{D1}$ | $L_{C1088}$ | $R^{D35}$ | $R^{D29}$ | $R^{D1}$ |
| $L_{C249}$ | $R^{D8}$ | $R^{D16}$ | H | $L_{C669}$ | $R^{D64}$ | $R^{D64}$ | $R^{D1}$ | $L_{C1089}$ | $R^{D35}$ | $R^{D30}$ | $R^{D1}$ |
| $L_{C250}$ | $R^{D8}$ | $R^{D17}$ | H | $L_{C670}$ | $R^{D66}$ | $R^{D66}$ | $R^{D1}$ | $L_{C1090}$ | $R^{D35}$ | $R^{D31}$ | $R^{D1}$ |
| $L_{C251}$ | $R^{D8}$ | $R^{D18}$ | H | $L_{C671}$ | $R^{D68}$ | $R^{D68}$ | $R^{D1}$ | $L_{C1091}$ | $R^{D35}$ | $R^{D32}$ | $R^{D1}$ |
| $L_{C252}$ | $R^{D8}$ | $R^{D19}$ | H | $L_{C672}$ | $R^{D76}$ | $R^{D76}$ | $R^{D1}$ | $L_{C1092}$ | $R^{D35}$ | $R^{D33}$ | $R^{D1}$ |
| $L_{C253}$ | $R^{D8}$ | $R^{D20}$ | H | $L_{C673}$ | $R^{D1}$ | $R^{D2}$ | $R^{D1}$ | $L_{C1093}$ | $R^{D35}$ | $R^{D34}$ | $R^{D1}$ |
| $L_{C254}$ | $R^{D8}$ | $R^{D21}$ | H | $L_{C674}$ | $R^{D1}$ | $R^{D3}$ | $R^{D1}$ | $L_{C1094}$ | $R^{D35}$ | $R^{D40}$ | $R^{D1}$ |
| $L_{C255}$ | $R^{D8}$ | $R^{D22}$ | H | $L_{C675}$ | $R^{D1}$ | $R^{D4}$ | $R^{D1}$ | $L_{C1095}$ | $R^{D35}$ | $R^{D41}$ | $R^{D1}$ |
| $L_{C256}$ | $R^{D8}$ | $R^{D23}$ | H | $L_{C676}$ | $R^{D1}$ | $R^{D5}$ | $R^{D1}$ | $L_{C1096}$ | $R^{D35}$ | $R^{D42}$ | $R^{D1}$ |
| $L_{C257}$ | $R^{D8}$ | $R^{D24}$ | H | $L_{C677}$ | $R^{D1}$ | $R^{D6}$ | $R^{D1}$ | $L_{C1097}$ | $R^{D35}$ | $R^{D64}$ | $R^{D1}$ |
| $L_{C258}$ | $R^{D8}$ | $R^{D25}$ | H | $L_{C678}$ | $R^{D1}$ | $R^{D7}$ | $R^{D1}$ | $L_{C1098}$ | $R^{D35}$ | $R^{D66}$ | $R^{D1}$ |
| $L_{C259}$ | $R^{D8}$ | $R^{D26}$ | H | $L_{C679}$ | $R^{D1}$ | $R^{D8}$ | $R^{D1}$ | $L_{C1099}$ | $R^{D35}$ | $R^{D68}$ | $R^{D1}$ |
| $L_{C260}$ | $R^{D8}$ | $R^{D27}$ | H | $L_{C680}$ | $R^{D1}$ | $R^{D9}$ | $R^{D1}$ | $L_{C1100}$ | $R^{D35}$ | $R^{D76}$ | $R^{D1}$ |
| $L_{C261}$ | $R^{D8}$ | $R^{D28}$ | H | $L_{C681}$ | $R^{D1}$ | $R^{D10}$ | $R^{D1}$ | $L_{C1101}$ | $R^{D40}$ | $R^{D5}$ | $R^{D1}$ |
| $L_{C262}$ | $R^{D8}$ | $R^{D29}$ | H | $L_{C682}$ | $R^{D1}$ | $R^{D11}$ | $R^{D1}$ | $L_{C1102}$ | $R^{D40}$ | $R^{D6}$ | $R^{D1}$ |
| $L_{C263}$ | $R^{D8}$ | $R^{D30}$ | H | $L_{C683}$ | $R^{D1}$ | $R^{D12}$ | $R^{D1}$ | $L_{C1103}$ | $R^{D40}$ | $R^{D9}$ | $R^{D1}$ |
| $L_{C264}$ | $R^{D8}$ | $R^{D31}$ | H | $L_{C684}$ | $R^{D1}$ | $R^{D13}$ | $R^{D1}$ | $L_{C1104}$ | $R^{D40}$ | $R^{D10}$ | $R^{D1}$ |
| $L_{C265}$ | $R^{D8}$ | $R^{D32}$ | H | $L_{C685}$ | $R^{D1}$ | $R^{D14}$ | $R^{D1}$ | $L_{C1105}$ | $R^{D40}$ | $R^{D12}$ | $R^{D1}$ |
| $L_{C266}$ | $R^{D8}$ | $R^{D33}$ | H | $L_{C686}$ | $R^{D1}$ | $R^{D15}$ | $R^{D1}$ | $L_{C1106}$ | $R^{D40}$ | $R^{D15}$ | $R^{D1}$ |
| $L_{C267}$ | $R^{D8}$ | $R^{D34}$ | H | $L_{C687}$ | $R^{D1}$ | $R^{D16}$ | $R^{D1}$ | $L_{C1107}$ | $R^{D40}$ | $R^{D16}$ | $R^{D1}$ |
| $L_{C268}$ | $R^{D8}$ | $R^{D35}$ | H | $L_{C688}$ | $R^{D1}$ | $R^{D17}$ | $R^{D1}$ | $L_{C1108}$ | $R^{D40}$ | $R^{D17}$ | $R^{D1}$ |
| $L_{C269}$ | $R^{D8}$ | $R^{D40}$ | H | $L_{C689}$ | $R^{D1}$ | $R^{D18}$ | $R^{D1}$ | $L_{C1109}$ | $R^{D40}$ | $R^{D18}$ | $R^{D1}$ |
| $L_{C270}$ | $R^{D8}$ | $R^{D41}$ | H | $L_{C690}$ | $R^{D1}$ | $R^{D19}$ | $R^{D1}$ | $L_{C1110}$ | $R^{D40}$ | $R^{D19}$ | $R^{D1}$ |
| $L_{C271}$ | $R^{D8}$ | $R^{D42}$ | H | $L_{C691}$ | $R^{D1}$ | $R^{D20}$ | $R^{D1}$ | $L_{C1111}$ | $R^{D40}$ | $R^{D20}$ | $R^{D1}$ |
| $L_{C272}$ | $R^{D8}$ | $R^{D64}$ | H | $L_{C692}$ | $R^{D1}$ | $R^{D21}$ | $R^{D1}$ | $L_{C1112}$ | $R^{D40}$ | $R^{D21}$ | $R^{D1}$ |
| $L_{C273}$ | $R^{D8}$ | $R^{D66}$ | H | $L_{C693}$ | $R^{D1}$ | $R^{D22}$ | $R^{D1}$ | $L_{C1113}$ | $R^{D40}$ | $R^{D23}$ | $R^{D1}$ |
| $L_{C274}$ | $R^{D8}$ | $R^{D68}$ | H | $L_{C694}$ | $R^{D1}$ | $R^{D23}$ | $R^{D1}$ | $L_{C1114}$ | $R^{D40}$ | $R^{D24}$ | $R^{D1}$ |
| $L_{C275}$ | $R^{D8}$ | $R^{D76}$ | H | $L_{C695}$ | $R^{D1}$ | $R^{D24}$ | $R^{D1}$ | $L_{C1115}$ | $R^{D40}$ | $R^{D25}$ | $R^{D1}$ |
| $L_{C276}$ | $R^{D11}$ | $R^{D5}$ | H | $L_{C696}$ | $R^{D1}$ | $R^{D25}$ | $R^{D1}$ | $L_{C1116}$ | $R^{D40}$ | $R^{D27}$ | $R^{D1}$ |
| $L_{C277}$ | $R^{D11}$ | $R^{D6}$ | H | $L_{C697}$ | $R^{D1}$ | $R^{D26}$ | $R^{D1}$ | $L_{C1117}$ | $R^{D40}$ | $R^{D28}$ | $R^{D1}$ |
| $L_{C278}$ | $R^{D11}$ | $R^{D9}$ | H | $L_{C698}$ | $R^{D1}$ | $R^{D27}$ | $R^{D1}$ | $L_{C1118}$ | $R^{D40}$ | $R^{D29}$ | $R^{D1}$ |
| $L_{C279}$ | $R^{D11}$ | $R^{D10}$ | H | $L_{C699}$ | $R^{D1}$ | $R^{D28}$ | $R^{D1}$ | $L_{C1119}$ | $R^{D40}$ | $R^{D30}$ | $R^{D1}$ |
| $L_{C280}$ | $R^{D11}$ | $R^{D12}$ | H | $L_{C700}$ | $R^{D1}$ | $R^{D29}$ | $R^{D1}$ | $L_{C1120}$ | $R^{D40}$ | $R^{D31}$ | $R^{D1}$ |
| $L_{C281}$ | $R^{D11}$ | $R^{D13}$ | H | $L_{C701}$ | $R^{D1}$ | $R^{D30}$ | $R^{D1}$ | $L_{C1121}$ | $R^{D40}$ | $R^{D32}$ | $R^{D1}$ |
| $L_{C282}$ | $R^{D11}$ | $R^{D14}$ | H | $L_{C702}$ | $R^{D1}$ | $R^{D31}$ | $R^{D1}$ | $L_{C1122}$ | $R^{D40}$ | $R^{D33}$ | $R^{D1}$ |
| $L_{C283}$ | $R^{D11}$ | $R^{D15}$ | H | $L_{C703}$ | $R^{D1}$ | $R^{D32}$ | $R^{D1}$ | $L_{C1123}$ | $R^{D40}$ | $R^{D34}$ | $R^{D1}$ |
| $L_{C284}$ | $R^{D11}$ | $R^{D16}$ | H | $L_{C704}$ | $R^{D1}$ | $R^{D33}$ | $R^{D1}$ | $L_{C1124}$ | $R^{D40}$ | $R^{D41}$ | $R^{D1}$ |
| $L_{C285}$ | $R^{D11}$ | $R^{D17}$ | H | $L_{C705}$ | $R^{D1}$ | $R^{D34}$ | $R^{D1}$ | $L_{C1125}$ | $R^{D40}$ | $R^{D42}$ | $R^{D1}$ |
| $L_{C286}$ | $R^{D11}$ | $R^{D18}$ | H | $L_{C706}$ | $R^{D1}$ | $R^{D35}$ | $R^{D1}$ | $L_{C1126}$ | $R^{D40}$ | $R^{D64}$ | $R^{D1}$ |
| $L_{C287}$ | $R^{D11}$ | $R^{D19}$ | H | $L_{C707}$ | $R^{D1}$ | $R^{D40}$ | $R^{D1}$ | $L_{C1127}$ | $R^{D40}$ | $R^{D66}$ | $R^{D1}$ |
| $L_{C288}$ | $R^{D11}$ | $R^{D20}$ | H | $L_{C708}$ | $R^{D1}$ | $R^{D41}$ | $R^{D1}$ | $L_{C1128}$ | $R^{D40}$ | $R^{D68}$ | $R^{D1}$ |
| $L_{C289}$ | $R^{D11}$ | $R^{D21}$ | H | $L_{C709}$ | $R^{D1}$ | $R^{D42}$ | $R^{D1}$ | $L_{C1129}$ | $R^{D40}$ | $R^{D76}$ | $R^{D1}$ |
| $L_{C290}$ | $R^{D11}$ | $R^{D22}$ | H | $L_{C710}$ | $R^{D1}$ | $R^{D64}$ | $R^{D1}$ | $L_{C1130}$ | $R^{D41}$ | $R^{D5}$ | $R^{D1}$ |
| $L_{C291}$ | $R^{D11}$ | $R^{D23}$ | H | $L_{C711}$ | $R^{D1}$ | $R^{D66}$ | $R^{D1}$ | $L_{C1131}$ | $R^{D41}$ | $R^{D6}$ | $R^{D1}$ |
| $L_{C292}$ | $R^{D11}$ | $R^{D24}$ | H | $L_{C712}$ | $R^{D1}$ | $R^{D68}$ | $R^{D1}$ | $L_{C1132}$ | $R^{D41}$ | $R^{D9}$ | $R^{D1}$ |
| $L_{C293}$ | $R^{D11}$ | $R^{D25}$ | H | $L_{C713}$ | $R^{D1}$ | $R^{D76}$ | $R^{D1}$ | $L_{C1133}$ | $R^{D41}$ | $R^{D10}$ | $R^{D1}$ |
| $L_{C294}$ | $R^{D11}$ | $R^{D26}$ | H | $L_{C714}$ | $R^{D2}$ | $R^{D1}$ | $R^{D1}$ | $L_{C1134}$ | $R^{D41}$ | $R^{D12}$ | $R^{D1}$ |
| $L_{C295}$ | $R^{D11}$ | $R^{D27}$ | H | $L_{C715}$ | $R^{D2}$ | $R^{D3}$ | $R^{D1}$ | $L_{C1135}$ | $R^{D41}$ | $R^{D15}$ | $R^{D1}$ |
| $L_{C296}$ | $R^{D11}$ | $R^{D28}$ | H | $L_{C716}$ | $R^{D2}$ | $R^{D4}$ | $R^{D1}$ | $L_{C1136}$ | $R^{D41}$ | $R^{D16}$ | $R^{D1}$ |
| $L_{C297}$ | $R^{D11}$ | $R^{D29}$ | H | $L_{C717}$ | $R^{D2}$ | $R^{D5}$ | $R^{D1}$ | $L_{C1137}$ | $R^{D41}$ | $R^{D17}$ | $R^{D1}$ |
| $L_{C298}$ | $R^{D11}$ | $R^{D30}$ | H | $L_{C718}$ | $R^{D2}$ | $R^{D6}$ | $R^{D1}$ | $L_{C1138}$ | $R^{D41}$ | $R^{D18}$ | $R^{D1}$ |
| $L_{C299}$ | $R^{D11}$ | $R^{D31}$ | H | $L_{C719}$ | $R^{D2}$ | $R^{D7}$ | $R^{D1}$ | $L_{C1139}$ | $R^{D41}$ | $R^{D19}$ | $R^{D1}$ |
| $L_{C300}$ | $R^{D11}$ | $R^{D32}$ | H | $L_{C720}$ | $R^{D2}$ | $R^{D8}$ | $R^{D1}$ | $L_{C1140}$ | $R^{D41}$ | $R^{D20}$ | $R^{D1}$ |
| $L_{C301}$ | $R^{D11}$ | $R^{D33}$ | H | $L_{C721}$ | $R^{D2}$ | $R^{D9}$ | $R^{D1}$ | $L_{C1141}$ | $R^{D41}$ | $R^{D21}$ | $R^{D1}$ |
| $L_{C302}$ | $R^{D11}$ | $R^{D34}$ | H | $L_{C722}$ | $R^{D2}$ | $R^{D10}$ | $R^{D1}$ | $L_{C1142}$ | $R^{D41}$ | $R^{D23}$ | $R^{D1}$ |
| $L_{C303}$ | $R^{D11}$ | $R^{D35}$ | H | $L_{C723}$ | $R^{D2}$ | $R^{D11}$ | $R^{D1}$ | $L_{C1143}$ | $R^{D41}$ | $R^{D24}$ | $R^{D1}$ |
| $L_{C304}$ | $R^{D11}$ | $R^{D40}$ | H | $L_{C724}$ | $R^{D2}$ | $R^{D12}$ | $R^{D1}$ | $L_{C1144}$ | $R^{D41}$ | $R^{D25}$ | $R^{D1}$ |
| $L_{C305}$ | $R^{D11}$ | $R^{D41}$ | H | $L_{C725}$ | $R^{D2}$ | $R^{D13}$ | $R^{D1}$ | $L_{C1145}$ | $R^{D41}$ | $R^{D27}$ | $R^{D1}$ |
| $L_{C306}$ | $R^{D11}$ | $R^{D42}$ | H | $L_{C726}$ | $R^{D2}$ | $R^{D14}$ | $R^{D1}$ | $L_{C1146}$ | $R^{D41}$ | $R^{D28}$ | $R^{D1}$ |
| $L_{C307}$ | $R^{D11}$ | $R^{D64}$ | H | $L_{C727}$ | $R^{D2}$ | $R^{D15}$ | $R^{D1}$ | $L_{C1147}$ | $R^{D41}$ | $R^{D29}$ | $R^{D1}$ |
| $L_{C308}$ | $R^{D11}$ | $R^{D66}$ | H | $L_{C728}$ | $R^{D2}$ | $R^{D16}$ | $R^{D1}$ | $L_{C1148}$ | $R^{D41}$ | $R^{D30}$ | $R^{D1}$ |

-continued

| Ligand | $R^1$ | $R^2$ | $R^3$ | Ligand | $R^1$ | $R^2$ | $R^3$ | Ligand | $R^1$ | $R^2$ | $R^3$ |
|---|---|---|---|---|---|---|---|---|---|---|---|
| $L_{C309}$ | $R^{D11}$ | $R^{D68}$ | H | $L_{C729}$ | $R^{D2}$ | $R^{D17}$ | $R^{D1}$ | $L_{C1149}$ | $R^{D41}$ | $R^{D31}$ | $R^{D1}$ |
| $L_{C310}$ | $R^{D11}$ | $R^{D76}$ | H | $L_{C730}$ | $R^{D2}$ | $R^{D18}$ | $R^{D1}$ | $L_{C1150}$ | $R^{D41}$ | $R^{D32}$ | $R^{D1}$ |
| $L_{C311}$ | $R^{D13}$ | $R^{D5}$ | H | $L_{C731}$ | $R^{D2}$ | $R^{D19}$ | $R^{D1}$ | $L_{C1151}$ | $R^{D41}$ | $R^{D33}$ | $R^{D1}$ |
| $L_{C312}$ | $R^{D13}$ | $R^{D6}$ | H | $L_{C732}$ | $R^{D2}$ | $R^{D20}$ | $R^{D1}$ | $L_{C1152}$ | $R^{D41}$ | $R^{D34}$ | $R^{D1}$ |
| $L_{C313}$ | $R^{D13}$ | $R^{D9}$ | H | $L_{C733}$ | $R^{D2}$ | $R^{D21}$ | $R^{D1}$ | $L_{C1153}$ | $R^{D41}$ | $R^{D42}$ | $R^{D1}$ |
| $L_{C314}$ | $R^{D13}$ | $R^{D10}$ | H | $L_{C734}$ | $R^{D2}$ | $R^{D22}$ | $R^{D1}$ | $L_{C1154}$ | $R^{D41}$ | $R^{D64}$ | $R^{D1}$ |
| $L_{C315}$ | $R^{D13}$ | $R^{D12}$ | H | $L_{C735}$ | $R^{D2}$ | $R^{D23}$ | $R^{D1}$ | $L_{C1155}$ | $R^{D41}$ | $R^{D66}$ | $R^{D1}$ |
| $L_{C316}$ | $R^{D13}$ | $R^{D14}$ | H | $L_{C736}$ | $R^{D2}$ | $R^{D24}$ | $R^{D1}$ | $L_{C1156}$ | $R^{D41}$ | $R^{D68}$ | $R^{D1}$ |
| $L_{C317}$ | $R^{D13}$ | $R^{D15}$ | H | $L_{C737}$ | $R^{D2}$ | $R^{D25}$ | $R^{D1}$ | $L_{C1157}$ | $R^{D41}$ | $R^{D76}$ | $R^{D1}$ |
| $L_{C318}$ | $R^{D13}$ | $R^{D16}$ | H | $L_{C738}$ | $R^{D2}$ | $R^{D26}$ | $R^{D1}$ | $L_{C1158}$ | $R^{D64}$ | $R^{D5}$ | $R^{D1}$ |
| $L_{C319}$ | $R^{D13}$ | $R^{D17}$ | H | $L_{C739}$ | $R^{D2}$ | $R^{D27}$ | $R^{D1}$ | $L_{C1159}$ | $R^{D64}$ | $R^{D6}$ | $R^{D1}$ |
| $L_{C320}$ | $R^{D13}$ | $R^{D18}$ | H | $L_{C740}$ | $R^{D2}$ | $R^{D28}$ | $R^{D1}$ | $L_{C1160}$ | $R^{D64}$ | $R^{D9}$ | $R^{D1}$ |
| $L_{C321}$ | $R^{D13}$ | $R^{D19}$ | H | $L_{C741}$ | $R^{D2}$ | $R^{D29}$ | $R^{D1}$ | $L_{C1161}$ | $R^{D64}$ | $R^{D10}$ | $R^{D1}$ |
| $L_{C322}$ | $R^{D13}$ | $R^{D20}$ | H | $L_{C742}$ | $R^{D2}$ | $R^{D30}$ | $R^{D1}$ | $L_{C1162}$ | $R^{D64}$ | $R^{D12}$ | $R^{D1}$ |
| $L_{C323}$ | $R^{D13}$ | $R^{D21}$ | H | $L_{C743}$ | $R^{D2}$ | $R^{D31}$ | $R^{D1}$ | $L_{C1163}$ | $R^{D64}$ | $R^{D15}$ | $R^{D1}$ |
| $L_{C324}$ | $R^{D13}$ | $R^{D22}$ | H | $L_{C744}$ | $R^{D2}$ | $R^{D32}$ | $R^{D1}$ | $L_{C1164}$ | $R^{D64}$ | $R^{D16}$ | $R^{D1}$ |
| $L_{C325}$ | $R^{D13}$ | $R^{D23}$ | H | $L_{C745}$ | $R^{D2}$ | $R^{D33}$ | $R^{D1}$ | $L_{C1165}$ | $R^{D64}$ | $R^{D17}$ | $R^{D1}$ |
| $L_{C326}$ | $R^{D13}$ | $R^{D24}$ | H | $L_{C746}$ | $R^{D2}$ | $R^{D34}$ | $R^{D1}$ | $L_{C1166}$ | $R^{D64}$ | $R^{D18}$ | $R^{D1}$ |
| $L_{C327}$ | $R^{D13}$ | $R^{D25}$ | H | $L_{C747}$ | $R^{D2}$ | $R^{D35}$ | $R^{D1}$ | $L_{C1167}$ | $R^{D64}$ | $R^{D19}$ | $R^{D1}$ |
| $L_{C328}$ | $R^{D13}$ | $R^{D26}$ | H | $L_{C748}$ | $R^{D2}$ | $R^{D40}$ | $R^{D1}$ | $L_{C1168}$ | $R^{D64}$ | $R^{D20}$ | $R^{D1}$ |
| $L_{C329}$ | $R^{D13}$ | $R^{D27}$ | H | $L_{C749}$ | $R^{D2}$ | $R^{D41}$ | $R^{D1}$ | $L_{C1169}$ | $R^{D64}$ | $R^{D21}$ | $R^{D1}$ |
| $L_{C330}$ | $R^{D13}$ | $R^{D28}$ | H | $L_{C750}$ | $R^{D2}$ | $R^{D42}$ | $R^{D1}$ | $L_{C1170}$ | $R^{D64}$ | $R^{D23}$ | $R^{D1}$ |
| $L_{C331}$ | $R^{D13}$ | $R^{D29}$ | H | $L_{C751}$ | $R^{D2}$ | $R^{D64}$ | $R^{D1}$ | $L_{C1171}$ | $R^{D64}$ | $R^{D24}$ | $R^{D1}$ |
| $L_{C332}$ | $R^{D13}$ | $R^{D30}$ | H | $L_{C752}$ | $R^{D2}$ | $R^{D66}$ | $R^{D1}$ | $L_{C1172}$ | $R^{D64}$ | $R^{D25}$ | $R^{D1}$ |
| $L_{C333}$ | $R^{D13}$ | $R^{D31}$ | H | $L_{C753}$ | $R^{D2}$ | $R^{D68}$ | $R^{D1}$ | $L_{C1173}$ | $R^{D64}$ | $R^{D27}$ | $R^{D1}$ |
| $L_{C334}$ | $R^{D13}$ | $R^{D32}$ | H | $L_{C754}$ | $R^{D2}$ | $R^{D76}$ | $R^{D1}$ | $L_{C1174}$ | $R^{D64}$ | $R^{D28}$ | $R^{D1}$ |
| $L_{C335}$ | $R^{D13}$ | $R^{D33}$ | H | $L_{C755}$ | $R^{D3}$ | $R^{D4}$ | $R^{D1}$ | $L_{C1175}$ | $R^{D64}$ | $R^{D29}$ | $R^{D1}$ |
| $L_{C336}$ | $R^{D13}$ | $R^{D34}$ | H | $L_{C756}$ | $R^{D3}$ | $R^{D5}$ | $R^{D1}$ | $L_{C1176}$ | $R^{D64}$ | $R^{D30}$ | $R^{D1}$ |
| $L_{C337}$ | $R^{D13}$ | $R^{D35}$ | H | $L_{C757}$ | $R^{D3}$ | $R^{D6}$ | $R^{D1}$ | $L_{C1177}$ | $R^{D64}$ | $R^{D31}$ | $R^{D1}$ |
| $L_{C338}$ | $R^{D13}$ | $R^{D40}$ | H | $L_{C758}$ | $R^{D3}$ | $R^{D7}$ | $R^{D1}$ | $L_{C1180}$ | $R^{D64}$ | $R^{D32}$ | $R^{D1}$ |
| $L_{C339}$ | $R^{D13}$ | $R^{D41}$ | H | $L_{C759}$ | $R^{D3}$ | $R^{D8}$ | $R^{D1}$ | $L_{C1179}$ | $R^{D64}$ | $R^{D33}$ | $R^{D1}$ |
| $L_{C340}$ | $R^{D13}$ | $R^{D42}$ | H | $L_{C760}$ | $R^{D3}$ | $R^{D9}$ | $R^{D1}$ | $L_{C1180}$ | $R^{D64}$ | $R^{D34}$ | $R^{D1}$ |
| $L_{C341}$ | $R^{D13}$ | $R^{D64}$ | H | $L_{C761}$ | $R^{D3}$ | $R^{D10}$ | $R^{D1}$ | $L_{C1181}$ | $R^{D64}$ | $R^{D42}$ | $R^{D1}$ |
| $L_{C342}$ | $R^{D13}$ | $R^{D66}$ | H | $L_{C762}$ | $R^{D3}$ | $R^{D11}$ | $R^{D1}$ | $L_{C1182}$ | $R^{D64}$ | $R^{D64}$ | $R^{D1}$ |
| $L_{C343}$ | $R^{D13}$ | $R^{D68}$ | H | $L_{C763}$ | $R^{D3}$ | $R^{D12}$ | $R^{D1}$ | $L_{C1183}$ | $R^{D64}$ | $R^{D66}$ | $R^{D1}$ |
| $L_{C344}$ | $R^{D13}$ | $R^{D76}$ | H | $L_{C764}$ | $R^{D3}$ | $R^{D13}$ | $R^{D1}$ | $L_{C1184}$ | $R^{D64}$ | $R^{D68}$ | $R^{D1}$ |
| $L_{C345}$ | $R^{D14}$ | $R^{D5}$ | H | $L_{C765}$ | $R^{D3}$ | $R^{D14}$ | $R^{D1}$ | $L_{C1185}$ | $R^{D64}$ | $R^{D76}$ | $R^{D1}$ |
| $L_{C346}$ | $R^{D14}$ | $R^{D6}$ | H | $L_{C766}$ | $R^{D3}$ | $R^{D15}$ | $R^{D1}$ | $L_{C1186}$ | $R^{D66}$ | $R^{D5}$ | $R^{D1}$ |
| $L_{C347}$ | $R^{D14}$ | $R^{D9}$ | H | $L_{C767}$ | $R^{D3}$ | $R^{D16}$ | $R^{D1}$ | $L_{C1187}$ | $R^{D66}$ | $R^{D6}$ | $R^{D1}$ |
| $L_{C348}$ | $R^{D14}$ | $R^{D10}$ | H | $L_{C768}$ | $R^{D3}$ | $R^{D17}$ | $R^{D1}$ | $L_{C1188}$ | $R^{D66}$ | $R^{D9}$ | $R^{D1}$ |
| $L_{C349}$ | $R^{D14}$ | $R^{D12}$ | H | $L_{C769}$ | $R^{D3}$ | $R^{D18}$ | $R^{D1}$ | $L_{C1189}$ | $R^{D66}$ | $R^{D10}$ | $R^{D1}$ |
| $L_{C350}$ | $R^{D14}$ | $R^{D15}$ | H | $L_{C770}$ | $R^{D3}$ | $R^{D19}$ | $R^{D1}$ | $L_{C1190}$ | $R^{D66}$ | $R^{D12}$ | $R^{D1}$ |
| $L_{C351}$ | $R^{D14}$ | $R^{D16}$ | H | $L_{C771}$ | $R^{D3}$ | $R^{D20}$ | $R^{D1}$ | $L_{C1191}$ | $R^{D66}$ | $R^{D15}$ | $R^{D1}$ |
| $L_{C352}$ | $R^{D14}$ | $R^{D17}$ | H | $L_{C772}$ | $R^{D3}$ | $R^{D21}$ | $R^{D1}$ | $L_{C1192}$ | $R^{D66}$ | $R^{D16}$ | $R^{D1}$ |
| $L_{C353}$ | $R^{D14}$ | $R^{D18}$ | H | $L_{C773}$ | $R^{D3}$ | $R^{D22}$ | $R^{D1}$ | $L_{C1193}$ | $R^{D66}$ | $R^{D17}$ | $R^{D1}$ |
| $L_{C354}$ | $R^{D14}$ | $R^{D19}$ | H | $L_{C774}$ | $R^{D3}$ | $R^{D23}$ | $R^{D1}$ | $L_{C1194}$ | $R^{D66}$ | $R^{D18}$ | $R^{D1}$ |
| $L_{C355}$ | $R^{D14}$ | $R^{D20}$ | H | $L_{C775}$ | $R^{D3}$ | $R^{D24}$ | $R^{D1}$ | $L_{C1195}$ | $R^{D66}$ | $R^{D19}$ | $R^{D1}$ |
| $L_{C356}$ | $R^{D14}$ | $R^{D21}$ | H | $L_{C776}$ | $R^{D3}$ | $R^{D25}$ | $R^{D1}$ | $L_{C1196}$ | $R^{D66}$ | $R^{D20}$ | $R^{D1}$ |
| $L_{C357}$ | $R^{D14}$ | $R^{D22}$ | H | $L_{C777}$ | $R^{D3}$ | $R^{D26}$ | $R^{D1}$ | $L_{C1197}$ | $R^{D66}$ | $R^{D21}$ | $R^{D1}$ |
| $L_{C358}$ | $R^{D14}$ | $R^{D23}$ | H | $L_{C778}$ | $R^{D3}$ | $R^{D27}$ | $R^{D1}$ | $L_{C1198}$ | $R^{D66}$ | $R^{D23}$ | $R^{D1}$ |
| $L_{C359}$ | $R^{D14}$ | $R^{D24}$ | H | $L_{C779}$ | $R^{D3}$ | $R^{D28}$ | $R^{D1}$ | $L_{C1199}$ | $R^{D66}$ | $R^{D24}$ | $R^{D1}$ |
| $L_{C360}$ | $R^{D14}$ | $R^{D25}$ | H | $L_{C780}$ | $R^{D3}$ | $R^{D29}$ | $R^{D1}$ | $L_{C1200}$ | $R^{D66}$ | $R^{D25}$ | $R^{D1}$ |
| $L_{C361}$ | $R^{D14}$ | $R^{D26}$ | H | $L_{C781}$ | $R^{D3}$ | $R^{D30}$ | $R^{D1}$ | $L_{C1201}$ | $R^{D66}$ | $R^{D27}$ | $R^{D1}$ |
| $L_{C362}$ | $R^{D14}$ | $R^{D27}$ | H | $L_{C782}$ | $R^{D3}$ | $R^{D31}$ | $R^{D1}$ | $L_{C1202}$ | $R^{D66}$ | $R^{D28}$ | $R^{D1}$ |
| $L_{C363}$ | $R^{D14}$ | $R^{D28}$ | H | $L_{C783}$ | $R^{D3}$ | $R^{D32}$ | $R^{D1}$ | $L_{C1203}$ | $R^{D66}$ | $R^{D29}$ | $R^{D1}$ |
| $L_{C364}$ | $R^{D14}$ | $R^{D29}$ | H | $L_{C784}$ | $R^{D3}$ | $R^{D33}$ | $R^{D1}$ | $L_{C1204}$ | $R^{D66}$ | $R^{D30}$ | $R^{D1}$ |
| $L_{C365}$ | $R^{D14}$ | $R^{D30}$ | H | $L_{C785}$ | $R^{D3}$ | $R^{D34}$ | $R^{D1}$ | $L_{C1205}$ | $R^{D66}$ | $R^{D31}$ | $R^{D1}$ |
| $L_{C366}$ | $R^{D14}$ | $R^{D31}$ | H | $L_{C786}$ | $R^{D3}$ | $R^{D35}$ | $R^{D1}$ | $L_{C1206}$ | $R^{D66}$ | $R^{D32}$ | $R^{D1}$ |
| $L_{C367}$ | $R^{D14}$ | $R^{D32}$ | H | $L_{C787}$ | $R^{D3}$ | $R^{D40}$ | $R^{D1}$ | $L_{C1207}$ | $R^{D66}$ | $R^{D33}$ | $R^{D1}$ |
| $L_{C368}$ | $R^{D14}$ | $R^{D33}$ | H | $L_{C788}$ | $R^{D3}$ | $R^{D41}$ | $R^{D1}$ | $L_{C1208}$ | $R^{D66}$ | $R^{D34}$ | $R^{D1}$ |
| $L_{C369}$ | $R^{D14}$ | $R^{D34}$ | H | $L_{C789}$ | $R^{D3}$ | $R^{D42}$ | $R^{D1}$ | $L_{C1209}$ | $R^{D66}$ | $R^{D42}$ | $R^{D1}$ |
| $L_{C370}$ | $R^{D14}$ | $R^{D35}$ | H | $L_{C790}$ | $R^{D3}$ | $R^{D64}$ | $R^{D1}$ | $L_{C1210}$ | $R^{D66}$ | $R^{D68}$ | $R^{D1}$ |
| $L_{C371}$ | $R^{D14}$ | $R^{D40}$ | H | $L_{C791}$ | $R^{D3}$ | $R^{D66}$ | $R^{D1}$ | $L_{C1211}$ | $R^{D66}$ | $R^{D76}$ | $R^{D1}$ |
| $L_{C372}$ | $R^{D14}$ | $R^{D41}$ | H | $L_{C792}$ | $R^{D3}$ | $R^{D68}$ | $R^{D1}$ | $L_{C1212}$ | $R^{D68}$ | $R^{D5}$ | $R^{D1}$ |
| $L_{C373}$ | $R^{D14}$ | $R^{D42}$ | H | $L_{C793}$ | $R^{D3}$ | $R^{D76}$ | $R^{D1}$ | $L_{C1213}$ | $R^{D68}$ | $R^{D6}$ | $R^{D1}$ |
| $L_{C374}$ | $R^{D14}$ | $R^{D64}$ | H | $L_{C794}$ | $R^{D4}$ | $R^{D5}$ | $R^{D1}$ | $L_{C1214}$ | $R^{D68}$ | $R^{D9}$ | $R^{D1}$ |
| $L_{C375}$ | $R^{D14}$ | $R^{D66}$ | H | $L_{C795}$ | $R^{D4}$ | $R^{D6}$ | $R^{D1}$ | $L_{C1215}$ | $R^{D68}$ | $R^{D10}$ | $R^{D1}$ |
| $L_{C376}$ | $R^{D14}$ | $R^{D68}$ | H | $L_{C796}$ | $R^{D4}$ | $R^{D7}$ | $R^{D1}$ | $L_{C1216}$ | $R^{D68}$ | $R^{D12}$ | $R^{D1}$ |
| $L_{C377}$ | $R^{D14}$ | $R^{D76}$ | H | $L_{C797}$ | $R^{D4}$ | $R^{D8}$ | $R^{D1}$ | $L_{C1217}$ | $R^{D68}$ | $R^{D15}$ | $R^{D1}$ |
| $L_{C378}$ | $R^{D22}$ | $R^{D5}$ | H | $L_{C798}$ | $R^{D4}$ | $R^{D9}$ | $R^{D1}$ | $L_{C1218}$ | $R^{D68}$ | $R^{D16}$ | $R^{D1}$ |
| $L_{C379}$ | $R^{D22}$ | $R^{D6}$ | H | $L_{C799}$ | $R^{D4}$ | $R^{D10}$ | $R^{D1}$ | $L_{C1219}$ | $R^{D68}$ | $R^{D17}$ | $R^{D1}$ |
| $L_{C380}$ | $R^{D22}$ | $R^{D9}$ | H | $L_{C800}$ | $R^{D4}$ | $R^{D11}$ | $R^{D1}$ | $L_{C1220}$ | $R^{D68}$ | $R^{D18}$ | $R^{D1}$ |
| $L_{C381}$ | $R^{D22}$ | $R^{D10}$ | H | $L_{C801}$ | $R^{D4}$ | $R^{D12}$ | $R^{D1}$ | $L_{C1221}$ | $R^{D68}$ | $R^{D19}$ | $R^{D1}$ |
| $L_{C382}$ | $R^{D22}$ | $R^{D12}$ | H | $L_{C802}$ | $R^{D4}$ | $R^{D13}$ | $R^{D1}$ | $L_{C1222}$ | $R^{D68}$ | $R^{D20}$ | $R^{D1}$ |
| $L_{C383}$ | $R^{D22}$ | $R^{D15}$ | H | $L_{C803}$ | $R^{D4}$ | $R^{D14}$ | $R^{D1}$ | $L_{C1223}$ | $R^{D68}$ | $R^{D21}$ | $R^{D1}$ |
| $L_{C384}$ | $R^{D22}$ | $R^{D16}$ | H | $L_{C804}$ | $R^{D4}$ | $R^{D15}$ | $R^{D1}$ | $L_{C1224}$ | $R^{D68}$ | $R^{D23}$ | $R^{D1}$ |
| $L_{C385}$ | $R^{D22}$ | $R^{D17}$ | H | $L_{C805}$ | $R^{D4}$ | $R^{D16}$ | $R^{D1}$ | $L_{C1225}$ | $R^{D68}$ | $R^{D24}$ | $R^{D1}$ |

-continued

| Ligand | $R^1$ | $R^2$ | $R^3$ | Ligand | $R^1$ | $R^2$ | $R^3$ | Ligand | $R^1$ | $R^2$ | $R^3$ |
|---|---|---|---|---|---|---|---|---|---|---|---|
| $L_{C386}$ | $R^{D22}$ | $R^{D18}$ | H | $L_{C806}$ | $R^{D4}$ | $R^{D17}$ | $R^{D1}$ | $L_{C1226}$ | $R^{D68}$ | $R^{D25}$ | $R^{D1}$ |
| $L_{C387}$ | $R^{D22}$ | $R^{D19}$ | H | $L_{C807}$ | $R^{D4}$ | $R^{D18}$ | $R^{D1}$ | $L_{C1227}$ | $R^{D68}$ | $R^{D27}$ | $R^{D1}$ |
| $L_{C388}$ | $R^{D22}$ | $R^{D20}$ | H | $L_{C808}$ | $R^{D4}$ | $R^{D19}$ | $R^{D1}$ | $L_{C1228}$ | $R^{D68}$ | $R^{D28}$ | $R^{D1}$ |
| $L_{C389}$ | $R^{D22}$ | $R^{D21}$ | H | $L_{C809}$ | $R^{D4}$ | $R^{D20}$ | $R^{D1}$ | $L_{C1229}$ | $R^{D68}$ | $R^{D29}$ | $R^{D1}$ |
| $L_{C390}$ | $R^{D22}$ | $R^{D23}$ | H | $L_{C810}$ | $R^{D4}$ | $R^{D21}$ | $R^{D1}$ | $L_{C1230}$ | $R^{D68}$ | $R^{D30}$ | $R^{D1}$ |
| $L_{C391}$ | $R^{D22}$ | $R^{D24}$ | H | $L_{C811}$ | $R^{D4}$ | $R^{D22}$ | $R^{D1}$ | $L_{C1231}$ | $R^{D68}$ | $R^{D31}$ | $R^{D1}$ |
| $L_{C392}$ | $R^{D22}$ | $R^{D25}$ | H | $L_{C812}$ | $R^{D4}$ | $R^{D23}$ | $R^{D1}$ | $L_{C1232}$ | $R^{D68}$ | $R^{D32}$ | $R^{D1}$ |
| $L_{C393}$ | $R^{D22}$ | $R^{D26}$ | H | $L_{C813}$ | $R^{D4}$ | $R^{D24}$ | $R^{D1}$ | $L_{C1233}$ | $R^{D68}$ | $R^{D33}$ | $R^{D1}$ |
| $L_{C394}$ | $R^{D22}$ | $R^{D27}$ | H | $L_{C814}$ | $R^{D4}$ | $R^{D25}$ | $R^{D1}$ | $L_{C1234}$ | $R^{D68}$ | $R^{D34}$ | $R^{D1}$ |
| $L_{C395}$ | $R^{D22}$ | $R^{D28}$ | H | $L_{C815}$ | $R^{D4}$ | $R^{D26}$ | $R^{D1}$ | $L_{C1235}$ | $R^{D68}$ | $R^{D42}$ | $R^{D1}$ |
| $L_{C396}$ | $R^{D22}$ | $R^{D29}$ | H | $L_{C816}$ | $R^{D4}$ | $R^{D27}$ | $R^{D1}$ | $L_{C1236}$ | $R^{D68}$ | $R^{D76}$ | $R^{D1}$ |
| $L_{C397}$ | $R^{D22}$ | $R^{D30}$ | H | $L_{C817}$ | $R^{D4}$ | $R^{D28}$ | $R^{D1}$ | $L_{C1237}$ | $R^{D76}$ | $R^{D5}$ | $R^{D1}$ |
| $L_{C398}$ | $R^{D22}$ | $R^{D31}$ | H | $L_{C818}$ | $R^{D4}$ | $R^{D29}$ | $R^{D1}$ | $L_{C1238}$ | $R^{D76}$ | $R^{D6}$ | $R^{D1}$ |
| $L_{C399}$ | $R^{D22}$ | $R^{D32}$ | H | $L_{C819}$ | $R^{D4}$ | $R^{D30}$ | $R^{D1}$ | $L_{C1239}$ | $R^{D76}$ | $R^{D9}$ | $R^{D1}$ |
| $L_{C400}$ | $R^{D22}$ | $R^{D33}$ | H | $L_{C820}$ | $R^{D4}$ | $R^{D31}$ | $R^{D1}$ | $L_{C1240}$ | $R^{D76}$ | $R^{D10}$ | $R^{D1}$ |
| $L_{C401}$ | $R^{D22}$ | $R^{D34}$ | H | $L_{C821}$ | $R^{D4}$ | $R^{D32}$ | $R^{D1}$ | $L_{C1241}$ | $R^{D76}$ | $R^{D12}$ | $R^{D1}$ |
| $L_{C402}$ | $R^{D22}$ | $R^{D35}$ | H | $L_{C822}$ | $R^{D4}$ | $R^{D33}$ | $R^{D1}$ | $L_{C1242}$ | $R^{D76}$ | $R^{D15}$ | $R^{D1}$ |
| $L_{C403}$ | $R^{D22}$ | $R^{D40}$ | H | $L_{C823}$ | $R^{D4}$ | $R^{D34}$ | $R^{D1}$ | $L_{C1243}$ | $R^{D76}$ | $R^{D16}$ | $R^{D1}$ |
| $L_{C404}$ | $R^{D22}$ | $R^{D41}$ | H | $L_{C824}$ | $R^{D4}$ | $R^{D35}$ | $R^{D1}$ | $L_{C1244}$ | $R^{D76}$ | $R^{D17}$ | $R^{D1}$ |
| $L_{C405}$ | $R^{D22}$ | $R^{D42}$ | H | $L_{C825}$ | $R^{D4}$ | $R^{D40}$ | $R^{D1}$ | $L_{C1245}$ | $R^{D76}$ | $R^{D18}$ | $R^{D1}$ |
| $L_{C406}$ | $R^{D22}$ | $R^{D64}$ | H | $L_{C826}$ | $R^{D4}$ | $R^{D41}$ | $R^{D1}$ | $L_{C1246}$ | $R^{D76}$ | $R^{D19}$ | $R^{D1}$ |
| $L_{C407}$ | $R^{D22}$ | $R^{D66}$ | H | $L_{C827}$ | $R^{D4}$ | $R^{D42}$ | $R^{D1}$ | $L_{C1247}$ | $R^{D76}$ | $R^{D20}$ | $R^{D1}$ |
| $L_{C408}$ | $R^{D22}$ | $R^{D68}$ | H | $L_{C828}$ | $R^{D4}$ | $R^{D64}$ | $R^{D1}$ | $L_{C1248}$ | $R^{D76}$ | $R^{D21}$ | $R^{D1}$ |
| $L_{C409}$ | $R^{D22}$ | $R^{D76}$ | H | $L_{C829}$ | $R^{D4}$ | $R^{D66}$ | $R^{D1}$ | $L_{C1249}$ | $R^{D76}$ | $R^{D23}$ | $R^{D1}$ |
| $L_{C410}$ | $R^{D26}$ | $R^{D5}$ | H | $L_{C830}$ | $R^{D4}$ | $R^{D68}$ | $R^{D1}$ | $L_{C1250}$ | $R^{D76}$ | $R^{D24}$ | $R^{D1}$ |
| $L_{C411}$ | $R^{D26}$ | $R^{D6}$ | H | $L_{C831}$ | $R^{D4}$ | $R^{D76}$ | $R^{D1}$ | $L_{C1251}$ | $R^{D76}$ | $R^{D25}$ | $R^{D1}$ |
| $L_{C412}$ | $R^{D26}$ | $R^{D9}$ | H | $L_{C832}$ | $R^{D4}$ | $R^{D1}$ | $R^{D1}$ | $L_{C1252}$ | $R^{D76}$ | $R^{D27}$ | $R^{D1}$ |
| $L_{C413}$ | $R^{D26}$ | $R^{D10}$ | H | $L_{C833}$ | $R^{D7}$ | $R^{D5}$ | $R^{D1}$ | $L_{C1253}$ | $R^{D76}$ | $R^{D28}$ | $R^{D1}$ |
| $L_{C414}$ | $R^{D26}$ | $R^{D12}$ | H | $L_{C834}$ | $R^{D7}$ | $R^{D6}$ | $R^{D1}$ | $L_{C1254}$ | $R^{D76}$ | $R^{D29}$ | $R^{D1}$ |
| $L_{C415}$ | $R^{D26}$ | $R^{D15}$ | H | $L_{C835}$ | $R^{D7}$ | $R^{D8}$ | $R^{D1}$ | $L_{C1255}$ | $R^{D76}$ | $R^{D30}$ | $R^{D1}$ |
| $L_{C416}$ | $R^{D26}$ | $R^{D16}$ | H | $L_{C836}$ | $R^{D7}$ | $R^{D9}$ | $R^{D1}$ | $L_{C1256}$ | $R^{D76}$ | $R^{D31}$ | $R^{D1}$ |
| $L_{C417}$ | $R^{D26}$ | $R^{D17}$ | H | $L_{C837}$ | $R^{D7}$ | $R^{D10}$ | $R^{D1}$ | $L_{C1257}$ | $R^{D76}$ | $R^{D32}$ | $R^{D1}$ |
| $L_{C418}$ | $R^{D26}$ | $R^{D18}$ | H | $L_{C838}$ | $R^{D7}$ | $R^{D11}$ | $R^{D1}$ | $L_{C1258}$ | $R^{D76}$ | $R^{D33}$ | $R^{D1}$ |
| $L_{C419}$ | $R^{D26}$ | $R^{D19}$ | H | $L_{C839}$ | $R^{D7}$ | $R^{D12}$ | $R^{D1}$ | $L_{C1259}$ | $R^{D76}$ | $R^{D34}$ | $R^{D1}$ |
| $L_{C420}$ | $R^{D26}$ | $R^{D20}$ | H | $L_{C840}$ | $R^{D7}$ | $R^{D13}$ | $R^{D1}$ | $L_{C1260}$ | $R^{D76}$ | $R^{D42}$ | $R^{D1}$ |

and wherein $R^{D1}$ to $R^{D81}$ has the following structures:

$R^{D1}$

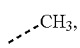

$R^{D2}$

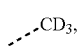

$R^{D3}$

$R^{D4}$

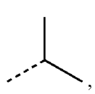

$R^{D5}$

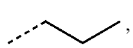

$R^{D6}$

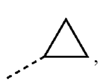

$R^{D7}$

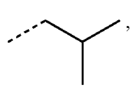

$R^{D8}$

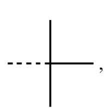

-continued $R^{D9}$

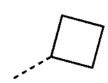

$R^{D10}$

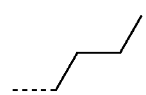

$R^{D11}$

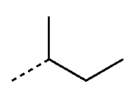

$R^{D12}$

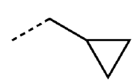

$R^{D13}$

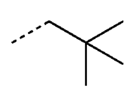

$R^{D14}$

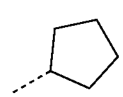

$R^{D15}$

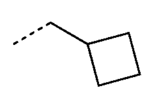

$R^{D16}$
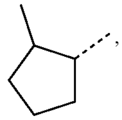
$R^{D17}$
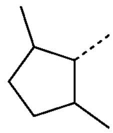
$R^{D18}$
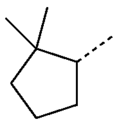
$R^{D19}$
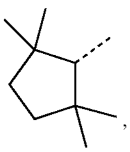
$R^{D20}$
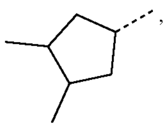
$R^{D21}$
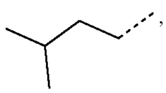
$R^{D22}$
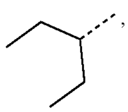
$R^{D23}$
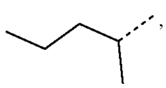
$R^{D24}$
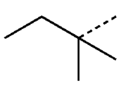
$R^{D25}$
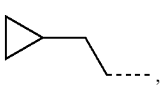
$R^{D26}$
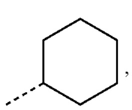
$R^{D27}$
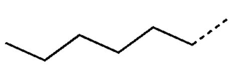
$R^{D28}$
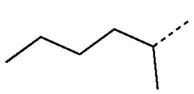
$R^{D29}$
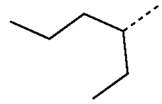
$R^{D30}$
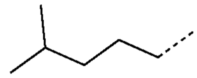
$R^{D31}$
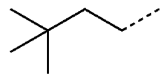
$R^{D32}$
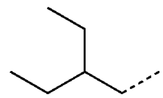
$R^{D33}$
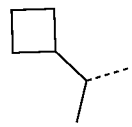
$R^{D34}$
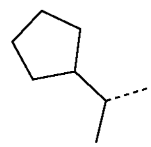
$R^{D35}$
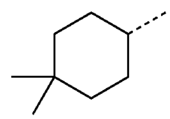
$R^{D36}$
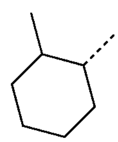
$R^{D37}$
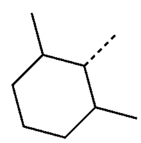
$R^{D38}$
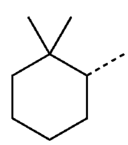
$R^{D39}$
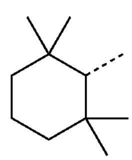
$R^{D40}$
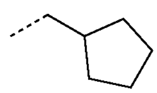

-continued
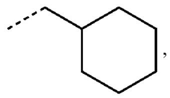
$R^{D41}$
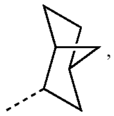
$R^{D42}$
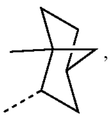
$R^{D43}$
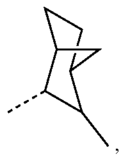
$R^{D44}$
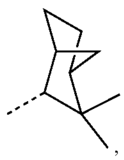
$R^{D45}$
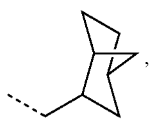
$R^{D46}$
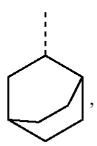
$R^{D47}$
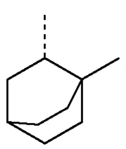
$R^{D48}$
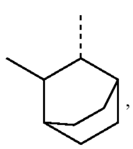
$R^{D49}$
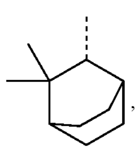
$R^{D50}$
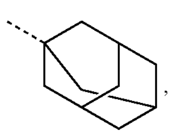
$R^{D51}$
-continued
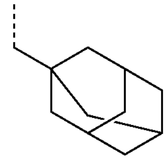
$R^{D52}$
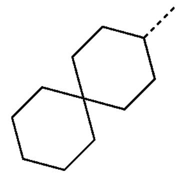
$R^{D53}$
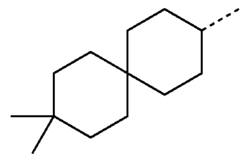
$R^{D54}$
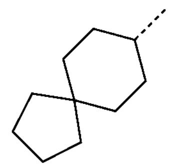
$R^{D55}$
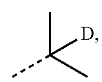
$R^{D56}$
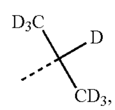
$R^{D57}$
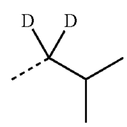
$R^{D58}$
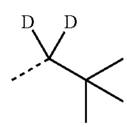
$R^{D59}$
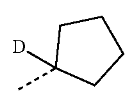
$R^{D60}$
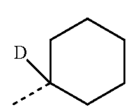
$R^{D61}$
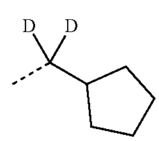
$R^{D62}$ -continued $R^{D63}$

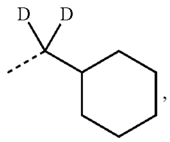

$R^{D64}$

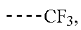

$R^{D65}$

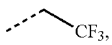

$R^{D66}$

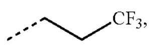

$R^{D67}$

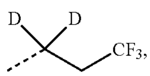

$R^{D68}$

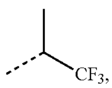

$R^{D69}$

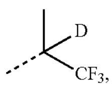

$R^{D70}$

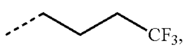

$R^{D71}$

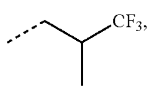

$R^{D72}$

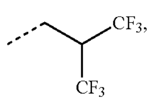

$R^{D73}$

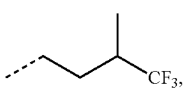

$R^{D74}$

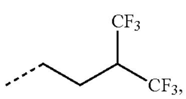

$R^{D75}$

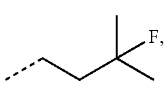

$R^{D76}$

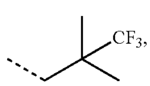

$R^{D77}$

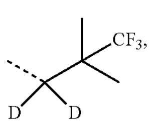

$R^{D78}$

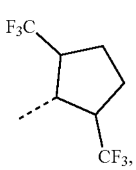

-continued $R^{D79}$

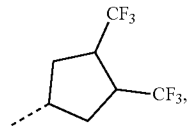

$R^{D80}$

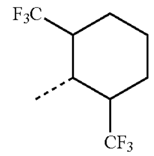

and $R^{D81}$

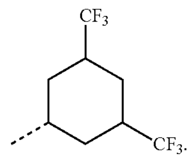

14. An organic light emitting device (OLED) comprising:

an anode;

a cathode; and an organic layer, disposed between the anode and the cathode, comprising a compound comprising a first ligand $L_A$ having the Formula selected from the group consisting of:

Formula IA

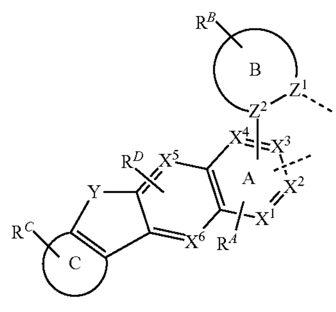

Formula IB

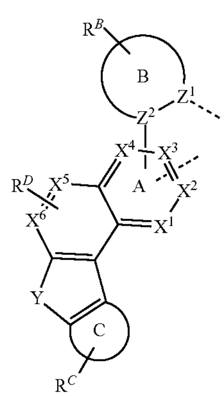

and

-continued

Formula IC

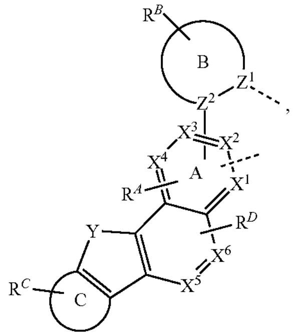

wherein ring B and C are each independently a 5-membered or 6-membered aromatic or heteroaromatic ring;

wherein $R^A$, $R^B$, $R^C$, and $R^D$ each independently represent mono to the maximum possible number of substituents, or no substituent;

wherein $Z^1$ and $Z^2$ are each independently selected from the group consisting of C and N;

wherein $X^1$, $X^2$, $X^3$, $X^4$, $X^5$, and $X^6$ are each C;

wherein when the first ligand $L_A$ has the Formula of Formula IA, ring B is a 5-membered ring or ring B contains two nitrogen atoms;

wherein Y is selected from the group consisting of CRR', NR', O, S, SiRR', and Se;

wherein when ring B is phenyl in Formula IB, Y is selected from the group consisting of NR', S, SiRR', and Se;

wherein R, R', $R^A$, $R^B$, $R^C$, and $R^D$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two substituents are optionally joined or fused into a ring;

wherein the ligand $L_A$ is coordinated to a metal M by the dashed lines to form a 5-membered chelate ring;

wherein M does not form a direct bond to $X^1$ in Formula IB;

wherein M does not form a direct bond to $X^4$ in Formula IC;

wherein the metal M can be coordinated to other ligands; and wherein the ligand $L_A$ is optionally linked with other ligands to comprise a tridentate, tetradentate, pentadentate or hexadentate ligand.

15. The OLED of claim 14, wherein the organic layer is an emissive layer and the compound is an emissive dopant or a non-emissive dopant.

16. The OLED of claim 14, wherein the organic layer further comprises a host, wherein host comprises at least one chemical group selected from the group consisting of a metal complex, triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

17. The OLED of claim 16, wherein the host is selected from the group consisting of:

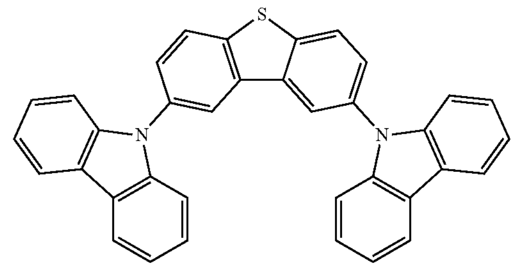

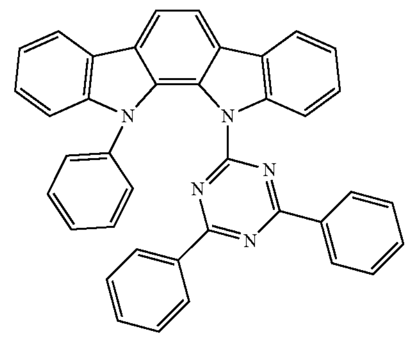

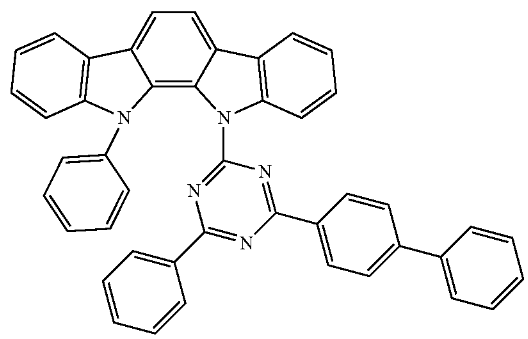

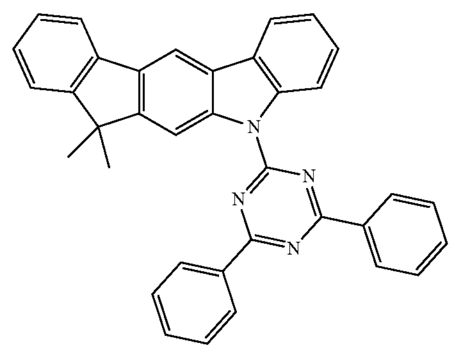

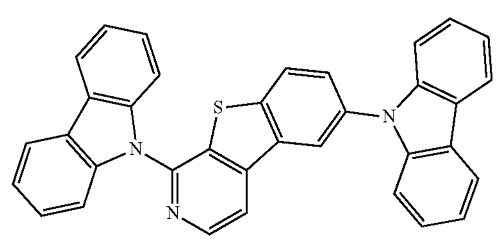

-continued
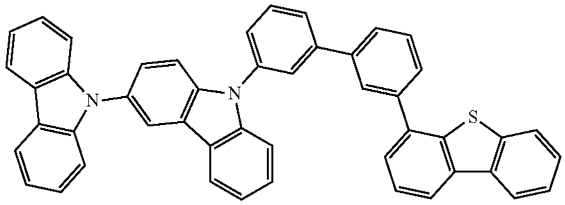
,
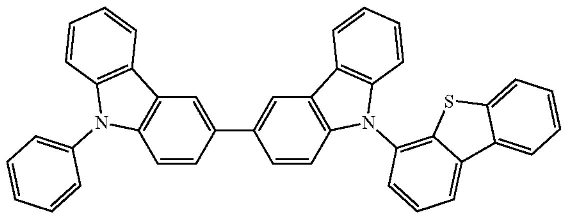
,
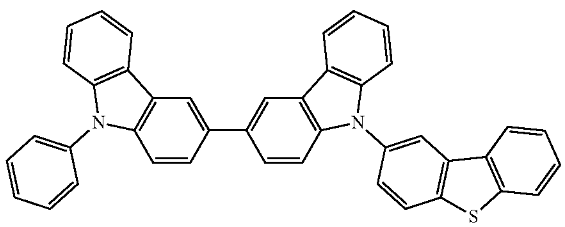
,
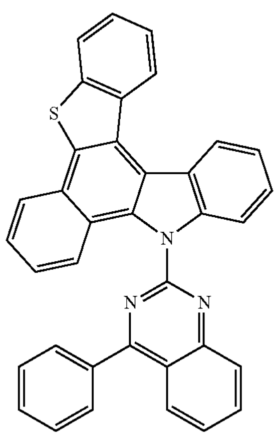
,
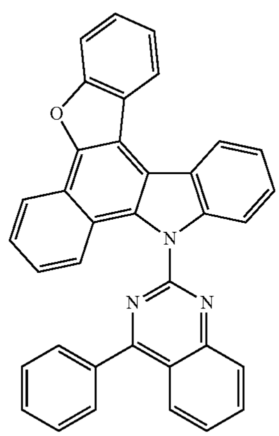
,
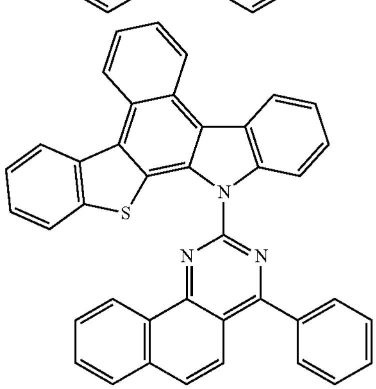
,
-continued
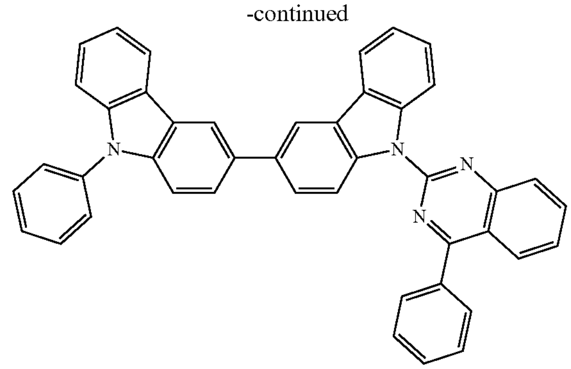
,
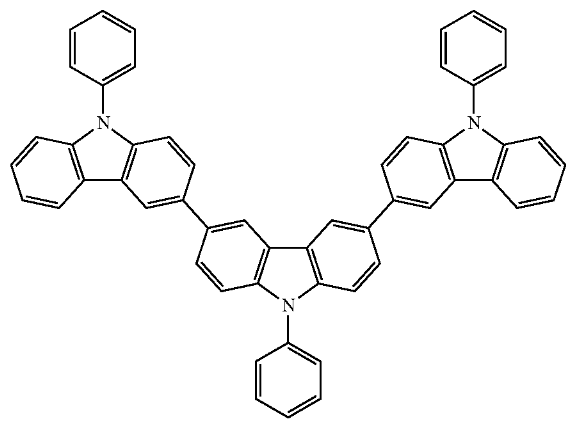
,
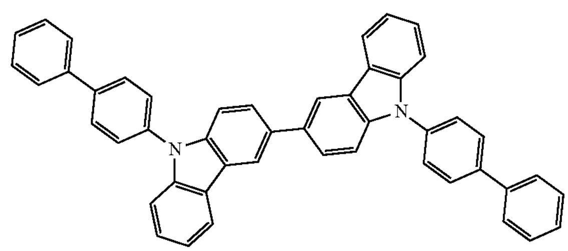
,
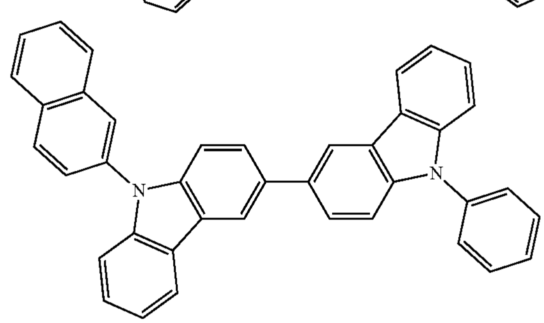
,
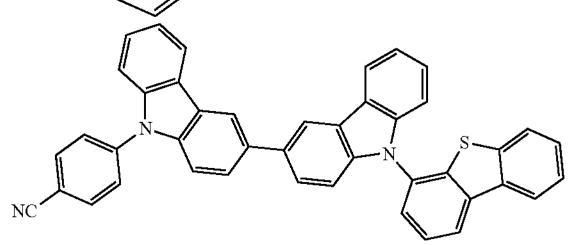
, -continued
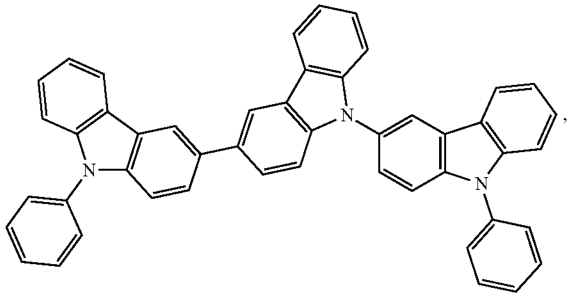
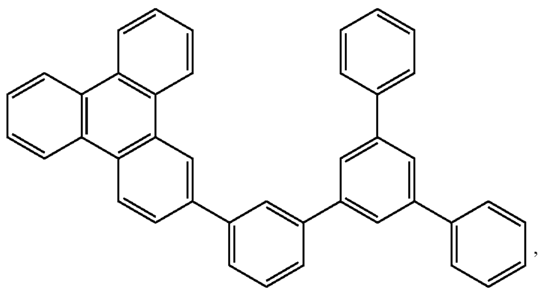
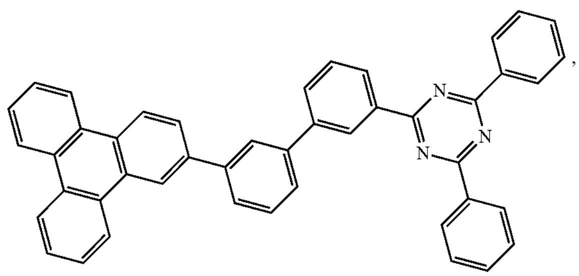
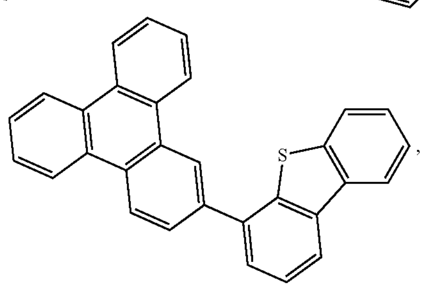
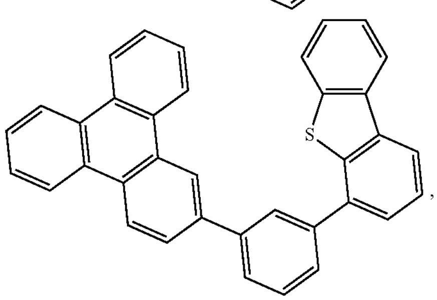
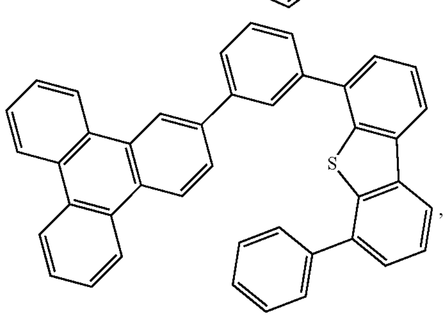
-continued
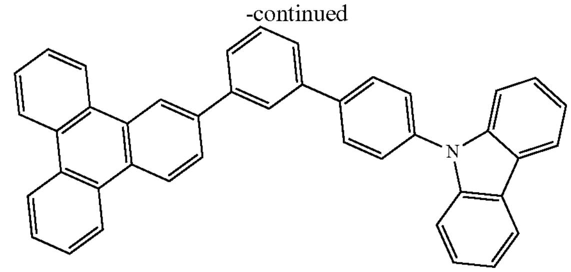
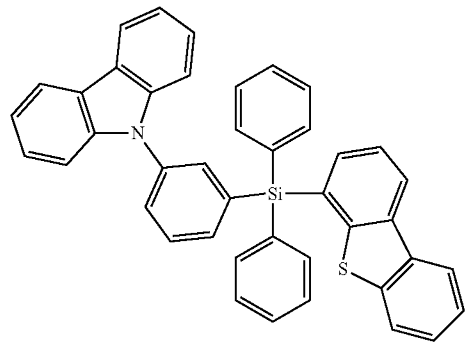
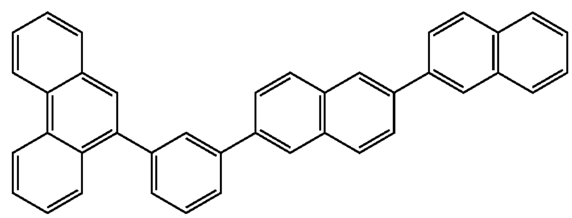
and combinations thereof.
18. A consumer product comprising an organic light-emitting device (OLED) comprising:
an anode;
a cathode; and
an organic layer, disposed between the anode and the cathode, comprising a compound comprising a first ligand $L_A$ having the Formula selected from the group consisting of:
Formula IA
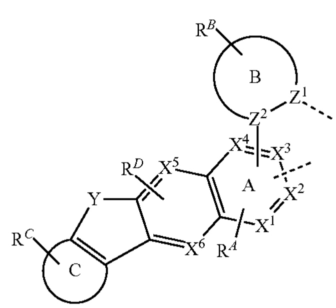

-continued

Formula IB

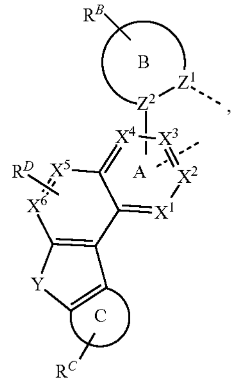

and

Formula IC

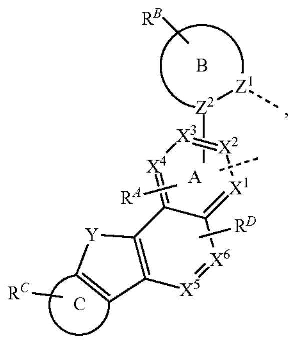

wherein ring B and C are each independently a 5-membered or 6-membered aromatic or heteroaromatic ring;

wherein $R^A$, $R^B$, $R^C$, and $R^D$ each independently represent mono to the maximum possible number of substituents, or no substituent;

wherein $Z^1$ and $Z^2$ are each independently selected from the group consisting of C and N;

wherein $X^1$, $X^2$, $X^3$, $X^4$, $X^5$, and $X^6$ are each C;

wherein when the first ligand $L_A$ has the Formula of Formula IA, ring B is a 5-membered ring or ring B contains two nitrogen atoms;

wherein Y is selected from the group consisting of CRR', NR', O, S, SiRR', and Se;

wherein when ring B is phenyl in Formula IB, Y is selected from the group consisting of NR', S, SiRR', and Se;

wherein R, R', $R^A$, $R^B$, $R^C$, and $R^D$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two substituents are optionally joined or fused into a ring;

wherein the ligand $L_A$ is coordinated to a metal M by the dashed lines to form a 5-membered chelate ring;

wherein M does not form a direct bond to $X^1$ in Formula IB;

wherein M does not form a direct bond to $X^4$ in Formula IC;

wherein the metal M can be coordinated to other ligands;

wherein the ligand $L_A$ is optionally linked with other ligands to comprise a tridentate, tetradentate, pentadentate or hexadentate ligand; and wherein the consumer product is one of a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, or a sign.

19. A formulation comprising the compound of claim 1.

* * * * *